US012176902B2

(12) United States Patent
Lee et al.

(10) Patent No.: US 12,176,902 B2
(45) Date of Patent: Dec. 24, 2024

(54) LOGIC DRIVE WITH BRAIN-LIKE ELASTICITY AND INTEGRALITY BASED ON STANDARD COMMODITY FPGA IC CHIPS USING NON-VOLATILE MEMORY CELLS

(71) Applicant: iCometrue Company Ltd., Zhubei (TW)

(72) Inventors: Jin-Yuan Lee, Hsinchu (TW); Mou-Shiung Lin, Hsinchu (TW)

(73) Assignee: iCometrue Company Ltd., Hsinchu County (TW)

( * ) Notice: Subject to any disclaimer, the term of this patent is extended or adjusted under 35 U.S.C. 154(b) by 131 days.

(21) Appl. No.: 17/835,960

(22) Filed: Jun. 9, 2022

(65) Prior Publication Data

US 2022/0329244 A1 Oct. 13, 2022

Related U.S. Application Data

(63) Continuation of application No. 17/008,605, filed on Aug. 31, 2020, now Pat. No. 11,368,157, which is a (Continued)

(51) Int. Cl.
*H03K 19/1776* (2020.01)
*H01L 23/00* (2006.01)
(Continued)

(52) U.S. Cl.
CPC ..... *H03K 19/1776* (2013.01); *H01L 23/5386* (2013.01); *H01L 24/13* (2013.01);
(Continued)

(58) Field of Classification Search
CPC ........... H03K 19/1776; H03K 19/1737; H03K 19/17728; H03K 19/20; H03K 19/21;
(Continued)

(56) References Cited

U.S. PATENT DOCUMENTS 4,870,302 A 9/1989 Freeman
5,272,368 A 12/1993 Turner et al.
(Continued)

FOREIGN PATENT DOCUMENTS

CN 100365734 C * 1/2008 ............. G11C 11/16
CN 101960530 A * 1/2011 ............. B82Y 25/00
(Continued)

OTHER PUBLICATIONS

English translation of CN-100365734-C (Year: 2008).*
(Continued)

*Primary Examiner* — Daniel D Chang

(57) ABSTRACT

A chip package comprises an interposer; an FPGA IC chip over the interposer, wherein the FPGA IC chip comprises a programmable logic block configured to perform a logic operation on its inputs, wherein the programmable logic block comprises a look-up table configured to be provided with multiple resulting values of the logic operation on multiple combinations of the inputs of the programmable logic block respectively, wherein the programmable logic block is configured to select, in accordance with one of the combinations of its inputs, one from the resulting values into its output, and multiple non-volatile memory cells configured to save the resulting values respectively; multiple first metal bumps between the interposer and the FPGA IC chip; and an underfill between the interposer and the FPGA IC chip, wherein the underfill encloses the first metal bumps.

26 Claims, 274 Drawing Sheets

Related U.S. Application Data continuation of application No. 16/791,524, filed on Feb. 14, 2020, now Pat. No. 10,819,345, which is a continuation of application No. 16/125,784, filed on Sep. 10, 2018, now Pat. No. 10,630,296.

(60) Provisional application No. 62/675,785, filed on May 24, 2018, provisional application No. 62/630,369, filed on Feb. 14, 2018, provisional application No. 62/557,727, filed on Sep. 12, 2017.

(51) Int. Cl.

| | |
|---|---|
| ***H01L 23/538*** | (2006.01) |
| ***H01L 25/18*** | (2023.01) |
| ***H03K 19/173*** | (2006.01) |
| ***H03K 19/17728*** | (2020.01) |
| ***H03K 19/20*** | (2006.01) |
| ***H03K 19/21*** | (2006.01) |
| ***H10B 41/00*** | (2023.01) |
| ***H10B 63/00*** | (2023.01) |

(52) U.S. Cl.

CPC ............. *H01L 24/16* (2013.01); *H01L 25/18* (2013.01); *H03K 19/1737* (2013.01); *H03K 19/17728* (2013.01); *H10B 41/00* (2023.02); *H10B 63/00* (2023.02); *H01L 24/03* (2013.01); *H01L 24/05* (2013.01); *H01L 24/11* (2013.01); *H01L 24/19* (2013.01); *H01L 24/20* (2013.01); *H01L 24/81* (2013.01); *H01L 2224/0231* (2013.01); *H01L 2224/0235* (2013.01); *H01L 2224/02381* (2013.01); *H01L 2224/0345* (2013.01); *H01L 2224/03452* (2013.01); *H01L 2224/03912* (2013.01); *H01L 2224/11462* (2013.01); *H01L 2224/1147* (2013.01); *H01L 2224/11849* (2013.01); *H01L 2224/13013* (2013.01); *H01L 2224/13014* (2013.01); *H01L 2224/13023* (2013.01); *H01L 2224/13082* (2013.01); *H01L 2224/13147* (2013.01); *H01L 2224/16227* (2013.01); *H01L 2224/16238* (2013.01); *H01L 2224/18* (2013.01); *H01L 2224/73204* (2013.01); *H01L 2224/73259* (2013.01); *H01L 2224/81191* (2013.01); *H01L 2224/83104* (2013.01); *H01L 2224/83862* (2013.01); *H01L 2224/92225* (2013.01); *H01L 2224/94* (2013.01); *H01L 2924/1431* (2013.01); *H01L 2924/1432* (2013.01); *H01L 2924/1436* (2013.01); *H01L 2924/1437* (2013.01); *H01L 2924/1443* (2013.01); *H01L 2924/18161* (2013.01); *H03K 19/20* (2013.01); *H03K 19/21* (2013.01)

(58) Field of Classification Search

CPC ..... H01L 23/5386; H01L 24/13; H01L 24/16; H01L 25/18; H01L 24/03; H01L 24/05; H01L 24/11; H01L 24/19; H01L 24/20; H01L 24/81; H01L 2224/0231; H01L 2224/0235; H01L 2224/02381; H01L 2224/0345; H01L 2224/03452; H01L 2224/03912; H01L 2224/11462; H01L 2224/1147; H01L 2224/11849; H01L 2224/13013; H01L 2224/13014; H01L 2224/13023; H01L 2224/13082; H01L 2224/13147; H01L 2224/16227; H01L 2224/16238; H01L 2224/18; H01L 2224/73204; H01L 2224/73259; H01L 2224/81191; H01L 2224/83104; H01L 2224/83862; H01L 2224/92225; H01L 2224/94; H01L 2924/1431; H01L 2924/1432; H01L 2924/1436; H01L 2924/1437; H01L 2924/1443; H01L 2924/18161; H01L 29/7883; H01L 23/3677; H01L 23/49816; H01L 23/50; H01L 25/03; H01L 2224/05124; H01L 2224/05147; H01L 2224/05166; H01L 2224/05184; H01L 2224/05186; H01L 2224/05199; H01L 2224/053; H01L 2224/05647; H01L 2224/13109; H01L 2224/13111; H01L 2224/13113; H01L 2224/13118; H01L 2224/1312; H01L 2224/13139; H01L 2224/292; H01L 2224/2929; H01L 2224/293; H01L 2224/29647; H01L 2224/29666; H01L 2224/29684; H01L 2224/29686; H01L 2224/83447; H01L 23/49811; H01L 23/5383; H01L 23/5389; H01L 25/105; H01L 29/785; H01L 2224/05008; H01L 2224/05569; H01L 2224/05572; H01L 2224/0558; H01L 2224/13022; H01L 2225/1035; H01L 2225/1041; H01L 2225/1058; H01L 23/5384; H01L 25/0652; H01L 25/0655; H10B 41/00; H10B 63/00; H10B 41/70

See application file for complete search history.

(56) References Cited

U.S. PATENT DOCUMENTS

| | | | |
|---|---|---|---|
| 5,587,603 | A | 12/1996 | Kowshik |
| 5,592,102 | A | 1/1997 | Lane et al. |
| 5,689,195 | A | 11/1997 | Cliff et al. |
| 5,796,662 | A | 8/1998 | Kalter et al. |
| 6,020,633 | A | 2/2000 | Erikson |
| 6,034,542 | A | 3/2000 | Ridgeway |
| 6,167,558 | A | 12/2000 | Trimberger |
| 6,356,478 | B1 | 3/2002 | McCollum |
| 6,388,466 | B1 | 5/2002 | Wittig et al. |
| 6,404,226 | B1 | 6/2002 | Schadt |
| 6,687,167 | B2 | 2/2004 | Guaitini et al. |
| 6,798,240 | B1 | 9/2004 | Pedersen |
| 6,812,086 | B2 | 11/2004 | Murthy et al. |
| 6,828,823 | B1 | 12/2004 | Tsui |
| 6,943,580 | B2 | 9/2005 | Lewis et al. |
| 6,998,872 | B1 | 2/2006 | Chirania et al. |
| 7,030,652 | B1 | 4/2006 | Lewis et al. |
| 7,061,271 | B1 | 6/2006 | Young et al. |
| 7,126,214 | B2 | 10/2006 | Huppenthal et al. |
| 7,190,190 | B1 | 3/2007 | Camarota et al. |
| 7,193,433 | B1 | 3/2007 | Young |
| 7,219,237 | B1 | 5/2007 | Trimberger |
| 7,366,306 | B1 | 4/2008 | Trimberger |
| 7,385,417 | B1 | 6/2008 | Agrawal et al. |
| 7,420,390 | B1 | 9/2008 | Hutton et al. |
| 7,550,994 | B1 | 6/2009 | Camarota |
| 7,579,681 | B2 | 8/2009 | Chia et al. |
| 7,598,555 | B1 | 10/2009 | Papworth Parkin |
| 7,653,891 | B1 | 1/2010 | Anderson et al. |
| 7,747,025 | B1 | 6/2010 | Trimberger |
| 7,853,799 | B1 | 12/2010 | Trimberger |
| 7,933,140 | B2 | 4/2011 | Wang et al. |
| 7,944,231 | B2 | 5/2011 | Javerliac |
| 7,948,266 | B2 | 5/2011 | Schmit et al. |
| 7,973,556 | B1 | 7/2011 | Noguera Serra et al. |
| 7,977,783 | B1 | 7/2011 | Park et al. |
| 8,064,224 | B2 | 11/2011 | Mahajan et al. |
| 8,081,079 | B1 | 12/2011 | Camarota |
| 8,159,268 | B1 | 4/2012 | Madurawe |
| 8,243,527 | B2 | 8/2012 | Hung et al. |
| 8,354,297 | B2 | 1/2013 | Pagaila et al. |
| 8,378,407 | B2 | 2/2013 | Audzeyeu et al. |

(56) References Cited

U.S. PATENT DOCUMENTS

| | | | |
|---|---|---|---|
| 8,531,032 | B2 | 9/2013 | Yu et al. |
| 8,546,955 | B1 | 10/2013 | Wu |
| 8,592,886 | B2 | 11/2013 | Hsu et al. |
| 8,709,865 | B2 | 4/2014 | Hu et al. |
| 8,742,579 | B2 | 6/2014 | Pagaila et al. |
| 8,786,060 | B2 | 7/2014 | Yen et al. |
| 8,796,137 | B2 | 8/2014 | Pagaila et al. |
| 8,866,292 | B2 | 10/2014 | Beer et al. |
| 8,872,349 | B2 | 10/2014 | Chiu et al. |
| 8,878,360 | B2 | 11/2014 | Meyer et al. |
| 8,883,561 | B2 | 11/2014 | Park et al. |
| 8,885,334 | B1 | 11/2014 | Baxter |
| 8,895,440 | B2 | 11/2014 | Choi et al. |
| 8,912,822 | B2 | 12/2014 | Yasuda |
| 8,916,421 | B2 | 12/2014 | Gong et al. |
| 8,941,230 | B2 | 1/2015 | Kyozuka et al. |
| 8,952,489 | B2 | 2/2015 | Elian et al. |
| 8,952,521 | B2 | 2/2015 | Wojnowski et al. |
| 8,987,918 | B2 | 3/2015 | Razdan et al. |
| 8,993,377 | B2 | 3/2015 | Koo et al. |
| 9,003,221 | B1 | 4/2015 | Abugharbieh et al. |
| 9,082,806 | B2 | 7/2015 | Lin et al. |
| 9,106,229 | B1 | 8/2015 | Hutton |
| 9,135,185 | B2 | 9/2015 | Loh et al. |
| 9,147,638 | B2 | 9/2015 | Liu et al. |
| 9,224,647 | B2 | 12/2015 | Koo et al. |
| 9,225,512 | B1 | 12/2015 | Trimberger |
| 9,252,127 | B1 | 2/2016 | Shen et al. |
| 9,263,370 | B2 | 2/2016 | Shenoy et al. |
| 9,281,292 | B2 | 3/2016 | Hu et al. |
| 9,324,672 | B2 | 4/2016 | Pagaila et al. |
| 9,331,060 | B2 | 5/2016 | Otremba et al. |
| 9,343,442 | B2 | 5/2016 | Chen et al. |
| 9,349,703 | B2 | 5/2016 | Chiu et al. |
| 9,349,713 | B2 | 5/2016 | Kim et al. |
| 9,362,187 | B2 | 6/2016 | Ossimitz |
| 9,368,458 | B2 | 6/2016 | Wu et al. |
| 9,385,006 | B2 | 7/2016 | Lin |
| 9,385,009 | B2 | 7/2016 | Lin et al. |
| 9,385,105 | B2 | 7/2016 | Meyer et al. |
| 9,396,998 | B2 | 7/2016 | Kurita et al. |
| 9,397,050 | B2 | 7/2016 | Shin et al. |
| 9,406,619 | B2 | 8/2016 | Pagaila et al. |
| 9,406,658 | B2 | 8/2016 | Lee et al. |
| 9,437,260 | B2 | 9/2016 | Prenat et al. |
| 9,449,930 | B2 | 9/2016 | Kim et al. |
| 9,455,218 | B2 | 9/2016 | Ooi et al. |
| 9,508,626 | B2 | 11/2016 | Pagaila et al. |
| 9,524,955 | B2 | 12/2016 | Huang et al. |
| 9,543,276 | B2 | 1/2017 | Jee et al. |
| 9,583,431 | B1 | 2/2017 | Rahman |
| 9,593,009 | B2 | 3/2017 | Fuergut et al. |
| 9,601,471 | B2 | 3/2017 | Zhai et al. |
| 9,607,967 | B1 | 3/2017 | Shih |
| 9,627,365 | B1 | 4/2017 | Yu et al. |
| 9,640,259 | B2 | 5/2017 | Li et al. |
| 9,679,863 | B2 | 6/2017 | Lin et al. |
| 9,704,843 | B2 | 7/2017 | Kilger et al. |
| 9,722,584 | B1 | 8/2017 | Chang et al. |
| 9,735,113 | B2 | 8/2017 | Chi et al. |
| 9,763,329 | B1 | 9/2017 | Mason |
| 9,773,757 | B2 | 9/2017 | Yu et al. |
| 9,806,058 | B2 | 10/2017 | Wei et al. |
| 9,812,337 | B2 | 11/2017 | Chen et al. |
| 9,818,720 | B2 | 11/2017 | Wei et al. |
| 9,831,148 | B2 | 11/2017 | Yu et al. |
| 9,859,896 | B1 | 1/2018 | Gaide et al. |
| 9,881,850 | B2 | 1/2018 | Yu et al. |
| 9,887,206 | B2 | 2/2018 | Su et al. |
| 9,893,732 | B1 | 2/2018 | Lewis |
| 9,899,248 | B2 | 2/2018 | Yu et al. |
| 9,899,355 | B2 | 2/2018 | Yuan et al. |
| 9,935,113 | B2 | 4/2018 | Wu et al. |
| 9,966,325 | B2 | 5/2018 | Beyne |
| 9,997,464 | B2 | 6/2018 | Hsieh et al. |
| 10,015,916 | B1 | 7/2018 | Karp |
| 10,026,681 | B2 | 7/2018 | Ko et al. |
| 10,033,383 | B1 | 7/2018 | Richter et al. |
| 10,037,963 | B2 | 7/2018 | Chen et al. |
| 10,038,647 | B1 | 7/2018 | Lesea |
| 10,043,768 | B2 | 8/2018 | Meyer et al. |
| 10,056,351 | B2 | 8/2018 | Yu et al. |
| 10,056,907 | B1 | 8/2018 | Asnaashari |
| 10,062,648 | B2 | 8/2018 | Hsieh et al. |
| 10,062,651 | B2 | 8/2018 | Liang et al. |
| 10,079,243 | B2 | 9/2018 | Ramkumar |
| 10,109,559 | B2 | 10/2018 | Lin et al. |
| 10,109,588 | B2 | 10/2018 | Jeong et al. |
| 10,109,617 | B2 | 11/2018 | Sugiyama et al. |
| 10,153,222 | B2 | 12/2018 | Yu et al. |
| 10,153,239 | B2 | 12/2018 | Wang et al. |
| 10,157,828 | B2 | 12/2018 | Hsu et al. |
| 10,157,849 | B2 | 12/2018 | Huang et al. |
| 10,162,139 | B1 | 12/2018 | Wang et al. |
| 10,163,798 | B1 | 12/2018 | Alur et al. |
| 10,163,802 | B2 | 12/2018 | Lin et al. |
| 10,177,188 | B2 | 1/2019 | Kang et al. |
| 10,204,684 | B2 | 2/2019 | Widjaja |
| 10,211,070 | B2 | 2/2019 | Lee et al. |
| 10,211,182 | B2 | 2/2019 | Meyer et al. |
| 10,256,219 | B2 | 4/2019 | Chew |
| 10,276,382 | B2 | 4/2019 | Hunt et al. |
| 10,290,611 | B2 | 5/2019 | Yu et al. |
| 10,325,882 | B2 | 6/2019 | Kang et al. |
| 10,333,623 | B1 | 6/2019 | Liao et al. |
| 10,340,249 | B1 | 7/2019 | Yu et al. |
| 10,347,606 | B2 | 7/2019 | Yu et al. |
| 10,373,885 | B2 | 8/2019 | Yu et al. |
| 10,419,001 | B2 | 9/2019 | Jo et al. |
| 10,431,536 | B2 | 10/2019 | Kim et al. |
| 10,447,274 | B2 | 10/2019 | Lee et al. |
| 10,476,505 | B2 | 11/2019 | Ngai |
| 10,490,521 | B2 | 11/2019 | Hu et al. |
| 10,490,540 | B2 | 11/2019 | Yu et al. |
| 10,504,835 | B1 | 12/2019 | Wang et al. |
| 10,510,634 | B2 | 12/2019 | Lin et al. |
| 10,510,650 | B2 | 12/2019 | Yu et al. |
| 10,522,449 | B2 | 12/2019 | Chen et al. |
| 10,541,227 | B2 | 1/2020 | Yeh et al. |
| 10,541,228 | B2 | 1/2020 | Chen et al. |
| 10,622,321 | B2 | 4/2020 | Yu et al. |
| 10,741,537 | B2 | 8/2020 | Lu et al. |
| 10,784,248 | B2 | 9/2020 | Yu et al. |
| 10,797,031 | B2 | 10/2020 | Liao et al. |
| 10,867,965 | B2 | 12/2020 | Shih et al. |
| 10,892,011 | B2 | 1/2021 | Lin et al. |
| 10,892,291 | B2 | 1/2021 | Chhun et al. |
| 10,943,869 | B2 | 3/2021 | Zhai et al. |
| 11,056,463 | B2 | 7/2021 | Takahashi et al. |
| 11,114,408 | B2 | 9/2021 | Shen et al. |
| 11,211,334 | B2 | 12/2021 | Lin et al. |
| 11,217,368 | B2 | 1/2022 | Choa et al. |
| 11,276,661 | B2 | 3/2022 | Fang |
| 2001/0045844 | A1 | 11/2001 | New et al. |
| 2001/0051426 | A1 | 12/2001 | Pozder et al. |
| 2002/0092307 | A1 | 7/2002 | Ghoshal |
| 2003/0122578 | A1 | 7/2003 | Masui et al. |
| 2004/0041584 | A1 | 3/2004 | Sunaga et al. |
| 2004/0145850 | A1 | 7/2004 | Fukumoto et al. |
| 2004/0222817 | A1 | 11/2004 | Madurawe |
| 2005/0046002 | A1 | 3/2005 | Lee et al. |
| 2005/0185457 | A1 | 8/2005 | Kim et al. |
| 2005/0218929 | A1 | 10/2005 | Wang et al. |
| 2006/0138509 | A1 | 6/2006 | Lee et al. |
| 2007/0037379 | A1 | 2/2007 | Enquist et al. |
| 2007/0164279 | A1 | 7/2007 | Lin et al. |
| 2007/0166912 | A1 | 7/2007 | Fenigstein et al. |
| 2007/0279987 | A1 | 12/2007 | Fang et al. |
| 2009/0114971 | A1 | 5/2009 | Cai et al. |
| 2009/0243650 | A1 | 10/2009 | Madurawe |
| 2009/0243652 | A1 | 10/2009 | Dorairaj et al. |
| 2009/0267238 | A1 | 10/2009 | Joseph |
| 2010/0039136 | A1 | 2/2010 | Chua-Eoan et al. |
| 2010/0133704 | A1 | 6/2010 | Marimuthu et al. |

(56) References Cited

U.S. PATENT DOCUMENTS

2010/0157669 A1 6/2010 Audzeyeu
2010/0283085 A1 11/2010 Bemanian
2011/0026232 A1 2/2011 Lin et al.
2011/0221470 A1 9/2011 Javerliac et al.
2012/0193785 A1 8/2012 Lin et al.
2012/0217549 A1 8/2012 Widjaja
2013/0082399 A1 4/2013 Kim et al.
2013/0257477 A1 10/2013 Yasuda et al.
2013/0285253 A1 10/2013 Aoki et al.
2014/0017882 A1 1/2014 Lei
2014/0070380 A1 3/2014 Chiu et al.
2014/0070403 A1 3/2014 Pan et al.
2014/0131858 A1 5/2014 Pan et al.
2014/0183731 A1 7/2014 Lin et al.
2014/0185264 A1 7/2014 Chen et al.
2014/0203412 A1 7/2014 Wang et al.
2014/0210097 A1 7/2014 Chen
2014/0254232 A1 9/2014 Wu
2014/0302659 A1 10/2014 Phatak
2014/0339692 A1 11/2014 Kim et al.
2015/0008957 A1 1/2015 Olgiati et al.
2015/0014844 A1 1/2015 Wu et al.
2015/0085560 A1 3/2015 Candelier et al.
2015/0116965 A1 4/2015 Kim et al.
2015/0227662 A1 8/2015 Lepercq
2015/0287672 A1 10/2015 Yazdani
2015/0327367 A1 11/2015 Shen
2016/0028396 A1* 1/2016 Gaillardon ....... H03K 19/17728 326/38
2016/0079205 A1 3/2016 Lin et al.
2016/0118390 A1 4/2016 Liaw
2016/0133571 A1 5/2016 Lee et al.
2016/0141228 A1 5/2016 Leobandung
2016/0173101 A1 6/2016 Gao et al.
2016/0190113 A1 6/2016 Sharan et al.
2016/0217835 A1 7/2016 Blott et al.
2016/0351626 A1 12/2016 McCollum
2016/0372449 A1 12/2016 Rusu et al.
2017/0063378 A1* 3/2017 Tate ................. H03K 19/17736
2017/0071552 A1 3/2017 Harpe et al.
2017/0117263 A1 4/2017 Yeh et al.
2017/0301650 A1 10/2017 Yu
2017/0358557 A1 12/2017 Chen et al.
2018/0053730 A1 2/2018 Shao
2018/0061742 A1 3/2018 Ananiev
2018/0068937 A1 3/2018 Marimuthu et al.
2018/0076179 A1 3/2018 Hsu et al.
2018/0102776 A1 4/2018 Chandrasekar et al.
2018/0150667 A1 5/2018 Yu et al.
2018/0151477 A1 5/2018 Yu et al.
2018/0151501 A1 5/2018 Yu et al.
2018/0158746 A1 6/2018 Lin
2018/0165396 A1 6/2018 Lin et al.
2018/0174865 A1 6/2018 Yu et al.
2018/0204810 A1 7/2018 Yu et al.
2018/0204828 A1 7/2018 Yu et al.
2018/0210799 A1 7/2018 Gao
2018/0226349 A1 8/2018 Yu et al.
2018/0226371 A1 8/2018 Enquist
2018/0247905 A1 8/2018 Yu et al.
2018/0269188 A1 9/2018 Yu et al.
2018/0275193 A1 9/2018 Rouge et al.
2018/0284186 A1 10/2018 Chadha
2018/0286776 A1 10/2018 Yu et al.
2018/0301351 A1 10/2018 Yu et al.
2018/0301376 A1 10/2018 Shih et al.
2018/0350629 A1 12/2018 Liu et al.
2018/0350763 A1 12/2018 Yu et al.
2018/0358312 A1 12/2018 Yu et al.
2018/0374824 A1 12/2018 Yu et al.
2019/0013276 A1 1/2019 Lee et al.
2019/0019756 A1 1/2019 Yu et al.
2019/0020343 A1 1/2019 Lin et al.
2019/0051641 A1 2/2019 Lin et al.
2019/0057931 A1 2/2019 Hsu et al.
2019/0057932 A1 2/2019 Wu et al.
2019/0067152 A1 2/2019 Wuu et al.
2019/0097304 A1 3/2019 Hsiao et al.
2019/0129817 A1 5/2019 Zhuo
2019/0164834 A1 5/2019 Or-Bach et al.
2019/0221547 A1 7/2019 Drab et al.
2019/0238134 A1 8/2019 Lin et al.
2019/0238135 A1 8/2019 Lin et al.
2019/0245543 A1 8/2019 Lin et al.
2019/0253056 A1 8/2019 Lin et al.
2019/0304803 A1 10/2019 Hu et al.
2019/0333871 A1 10/2019 Chen et al.
2019/0347790 A1 11/2019 Lin et al.
2019/0363715 A1 11/2019 Lin et al.
2019/0371763 A1 12/2019 Agarwal et al.
2019/0372574 A1 12/2019 Lin et al.
2020/0006274 A1 1/2020 Chiang et al.
2020/0058617 A1 2/2020 Wu et al.
2020/0058626 A1 2/2020 Tai et al.
2020/0082885 A1 3/2020 Lin et al.
2020/0111734 A1 4/2020 Lin et al.
2020/0144224 A1 5/2020 Lin et al.
2020/0161242 A1 5/2020 Lin et al.
2020/0243422 A1 7/2020 Kim et al.
2020/0373215 A1 11/2020 Wu et al.
2020/0395350 A1 12/2020 Wu et al.
2021/0005592 A1 1/2021 Lin et al.
2021/0043557 A1 2/2021 Lin et al.
2021/0050300 A1 2/2021 Lin et al.
2021/0090983 A1 3/2021 Lin et al.
2021/0159180 A1 5/2021 Zhai et al.
2021/0217702 A1 7/2021 Dabral et al.
2021/0232744 A1 7/2021 Lin et al.
2022/0013504 A1 1/2022 Dabral et al.
2022/0020729 A1 1/2022 Gao et al.
2023/0352439 A1 11/2023 Chen et al.

FOREIGN PATENT DOCUMENTS

CN 103681367 3/2014
CN 104078453 10/2014
CN 104282650 1/2015
CN 105745752 7/2016
CN 104064556 4/2019
TW 200623398 7/2006
TW 201413842 4/2014
WO WO00/36748 6/2000
WO WO2005010976 2/2005
WO WO2016160063 10/2016
WO WO2018004092 1/2018

OTHER PUBLICATIONS

English translation of CN-101960530-A (Year: 2011).*
"A Comparison between Battery Backed NV SRAMs and NOVRAMS", Sep. 5, 2003, maxim integrated, 3 pages. (Year: 2003).*

* cited by examiner

650

700

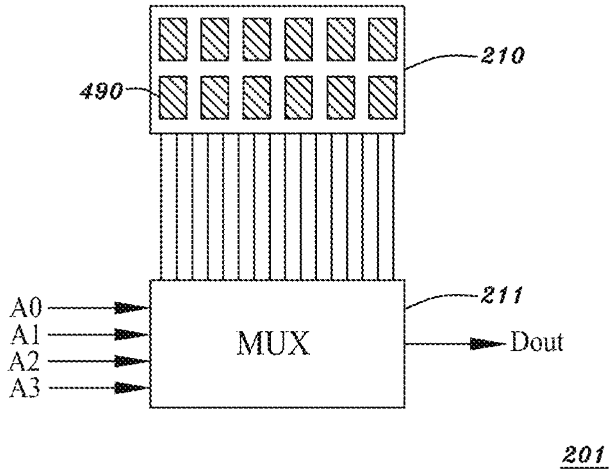
Fig. 14A
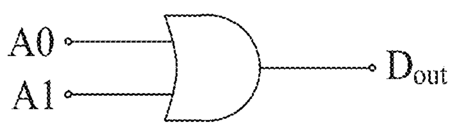
Fig. 14B
| A0 | A1 | Dout | |
|---|---|---|---|
| 0 | 0 | 0 | D0 |
| 0 | 1 | 1 | D1 |
| 1 | 0 | 1 | D2 |
| 1 | 1 | 1 | D3 |
Fig. 14C

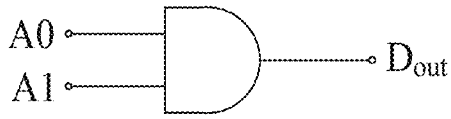
Fig. 14D
| A0 | A1 | Dout | |
|---|---|---|---|
| 0 | 0 | 0 | D0 |
| 0 | 1 | 0 | D1 |
| 1 | 0 | 0 | D2 |
| 1 | 1 | 1 | D3 |
Fig. 14E
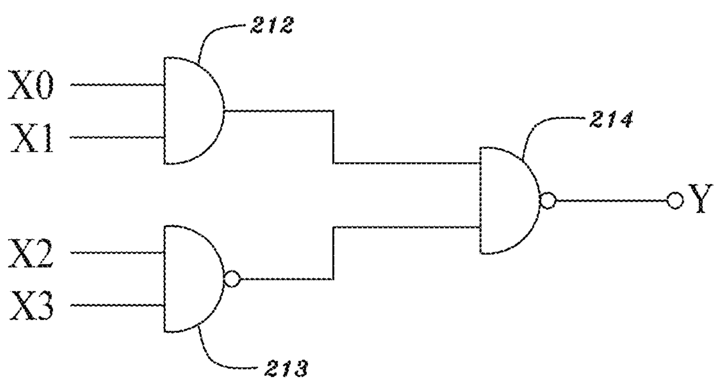
Fig. 14F

| Input | | | | Onput | |
|---|---|---|---|---|---|
| A0 | A1 | A2 | A3 | Dout | |
| 0 | 0 | 0 | 0 | 1 | D0 |
| 0 | 0 | 0 | 1 | 1 | D1 |
| 0 | 0 | 1 | 0 | 1 | D2 |
| 0 | 0 | 1 | 1 | 1 | D3 |
| 0 | 1 | 0 | 0 | 1 | D4 |
| 0 | 1 | 0 | 1 | 1 | D5 |
| 0 | 1 | 1 | 0 | 1 | D6 |
| 0 | 1 | 1 | 1 | 1 | D7 |
| 1 | 0 | 0 | 0 | 1 | D8 |
| 1 | 0 | 0 | 1 | 1 | D9 |
| 1 | 0 | 1 | 0 | 1 | D10 |
| 1 | 0 | 1 | 1 | 1 | D11 |
| 1 | 1 | 0 | 0 | 0 | D12 |
| 1 | 1 | 0 | 1 | 0 | D13 |
| 1 | 1 | 1 | 0 | 0 | D14 |
| 1 | 1 | 1 | 1 | 1 | D15 |

| Input | | | | Output | | | | |
|---|---|---|---|---|---|---|---|---|
| A1 | A0 x | A3 | A2 | Dout C3 | C2 | C1 | C0 | |
| 0 | 0 | 0 | 0 | 0 | 0 | 0 | 0 | D0 |
| 0 | 0 | 0 | 1 | 0 | 0 | 0 | 0 | D1 |
| 0 | 0 | 1 | 0 | 0 | 0 | 0 | 0 | D2 |
| 0 | 0 | 1 | 1 | 0 | 0 | 0 | 0 | D3 |
| 0 | 1 | 0 | 0 | 0 | 0 | 0 | 0 | D4 |
| 0 | 1 | 0 | 1 | 0 | 0 | 0 | 1 | D5 |
| 0 | 1 | 1 | 0 | 0 | 0 | 1 | 0 | D6 |
| 0 | 1 | 1 | 1 | 0 | 0 | 1 | 1 | D7 |
| 1 | 0 | 0 | 0 | 0 | 0 | 0 | 0 | D8 |
| 1 | 0 | 0 | 1 | 0 | 0 | 1 | 0 | D9 |
| 1 | 0 | 1 | 0 | 0 | 1 | 0 | 0 | D10 |
| 1 | 0 | 1 | 1 | 0 | 1 | 1 | 0 | D11 |
| 1 | 1 | 0 | 0 | 0 | 0 | 0 | 0 | D12 |
| 1 | 1 | 0 | 1 | 0 | 0 | 1 | 1 | D13 |
| 1 | 1 | 1 | 0 | 0 | 1 | 1 | 0 | D14 |
| 1 | 1 | 1 | 1 | 1 | 0 | 0 | 1 | D15 |

Fig. 14I

LOGIC DRIVE WITH BRAIN-LIKE ELASTICITY AND INTEGRALITY BASED ON STANDARD COMMODITY FPGA IC CHIPS USING NON-VOLATILE MEMORY CELLS

PRIORITY CLAIM

This application is a continuation of application Ser. No. 17/008,605, filed Aug. 30, 2020, now U.S. Pat. No. 11,368, 157, which is a continuation of application Ser. No. 16/791, 524, filed Feb. 14, 2020, now U.S. Pat. No. 10,819,345, which is a continuation of application Ser. No. 16/125,784, filed Sep. 10, 2018, now U.S. Pat. No. 10,630,296, which claims priority benefits from U.S. provisional application No. 62/557,727, filed on Sep. 12, 2017 and entitled "LOGIC DRIVE BASED ON STANDARD COMMODITY FPGA IC CHIPS USING NON-VOLATILE MEMORY CELLS"; U.S. provisional application No. 62/630,369, filed on Feb. 14, 2018 and entitled "LOGIC DRIVE WITH BRAIN-LIKE PLASTICITY AND INTEGRALITY"; and U.S. provisional application No. 62/675,785, filed on May 24, 2018 and entitled "LOGIC DRIVE WITH BRAIN-LIKE ELASTICITY AND INTEGRALITY". The present application incorporates the foregoing disclosures herein by reference.

BACKGROUND OF THE DISCLOSURE

Field of the Disclosure

The present invention relates to a logic package, logic package drive, logic device, logic module, logic drive, logic disk, logic disk drive, logic solid-state disk, logic solid-state drive, Field Programmable Gate Array (FPGA) logic disk, or FPGA logic drive (to be abbreviated as "logic drive" below, that is when "logic drive" is mentioned below, it means and reads as "logic package, logic package drive, logic device, logic module, logic drive, logic disk, logic disk drive, logic solid-state disk, logic solid-state drive, FPGA logic disk, or FPGA logic drive") comprising plural FPGA IC chips, and more particularly to a standardized commodity logic drive formed by using plural standardized commodity FPGA IC chips. The logic drive is to be used for different specific applications when field programmed.

Brief Description of the Related Art

The Field Programmable Gate Array (FPGA) semiconductor integrated circuit (IC) has been used for development of new or innovated applications, or for small volume applications or business demands. When an application or business demand expands to a certain volume and extend to a certain time period, the semiconductor IC suppliers may usually switch to implement the application in an Application Specific IC (ASIC) chip, or a Customer-Owned Tooling (COT) IC chip. The switch from the FPGA design to the ASIC or COT design is because the current FPGA IC chip, for a given application and compared with an ASIC or COT chip, (1) has a larger semiconductor chip size, lower fabrication yield, and higher fabrication cost, (2) consumes more power, (3) gives lower performance. When the semiconductor technology nodes or generations migrates, following the Moore's Law, to advanced nodes or generations (for example below 20 nm), the Non-Recurring Engineering (NRE) cost for designing an ASIC or COT chip increases greatly (more than US $5M or even exceeding US $10M, US $20M, US $50M or US $100M). The cost of a photo mask set for an ASIC or COT chip at the 16 nm technology node or generation may be over US $2M, US $5M, or US $10M. The high NRE cost in implementing the innovation or application using the advanced IC technology nodes or generations slows down or even stops the innovation or application using advanced and useful semiconductor technology nodes or generations. A new approach or technology is needed to inspire the continuing innovation and to lower down the barrier for implementing the innovation in the semiconductor IC chips.

SUMMARY OF THE DISCLOSURE

One aspect of the disclosure provides a standardized commodity logic drive in a multi-chip package comprising plural standardized commodity FPGA IC chips for use in different applications requiring logic, computing and/or processing functions by field programming. Uses of the standardized commodity logic drive is analogues to uses of a standardized commodity data storage solid-state disk (drive), data storage hard disk (drive), data storage floppy disk, Universal Serial Bus (USB) flash drive, USB drive, USB stick, flash-disk, or USB memory, and differs in that the latter has memory functions for data storage, while the former has logic functions for processing and/or computing. Uses of the standardized commodity FPGA IC chips is analogues to uses of a standardized commodity data storage memory IC chips, for example, standard commodity DRAM chips or standard commodity NAND flash chips, and differs in that the latter has memory functions for data storage, while the former has logic functions for processing and/or computing.

Another aspect of the disclosure provides a method to reduce Non-Recurring Engineering (NRE) expenses for implementing an innovation and/or an application in semiconductor IC chips by using the standardized commodity logic drive comprising plural standardized commodity FPGA IC chips. A person, user, or developer with an innovation and/or an application concept or idea needs to purchase the standardized commodity logic drive and develops or writes software codes or programs to load into the standardized commodity logic drive to implement his/her innovation and/or application concept or idea; wherein said innovation and/or application (maybe abbreviated as innovation) comprises (i) innovative algorithms and/or architectures of computing, processing, learning and/or inferencing, and/or (ii) innovative and/or specific applications. Compared to the implementation by developing a logic ASIC or COT IC chip, the NRE cost may be reduced by a factor of larger than 2, 5, 10, 30, 50 or 100 using the disclosed standardized commodity logic drive. For advanced semiconductor technology nodes or generations (for example more advanced than or below 20 nm), the NRE cost for designing an ASIC or COT chip increases greatly, more than US $5M or even exceeding US $10M, US $20M, US $50M, or US $100M. The cost of a photo mask set for an ASIC or COT chip at the 16 nm technology node or generation may be over US $2M, US $5M, or US $10M. Implementing the same or similar innovation and/or application using the logic drive may reduce the NRE cost down to smaller than US $10M or even less than US $5M, US $3M, US $2M or US $1M. The aspect of the disclosure inspires the innovation and lowers the barrier for implementing the innovation in IC chips designed and fabricated using an advanced IC technology node or generation, for example, a technology node or generation more advanced than or below 20 nm or 10 nm.

Another aspect of the disclosure provides a "public innovation platform" for innovators to easily and cheaply implement or realize their innovation in semiconductor IC chips using advanced IC technology nodes more advanced than 20 nm, and for example, using a technology node of 16 nm, 10 nm, 7 nm, 5 nm or 3 nm, by using logic drives; wherein said innovation comprises (i) innovative algorithms or architectures of computing, processing, learning and/or inferencing, and/or (ii) innovative and/or specific applications. In years of 1990's, innovators could implement their innovation by designing IC chips and fabricating the IC chips in a semiconductor manufacturing foundry fab using technology nodes at 1 μm, 0.8 μm, 0.5 μm, 0.35 μm, 0.18 μm or 0.13 μm, at a cost of about several hundred thousand US dollars. The semiconductor manufacturing foundry companies are productless companies and own semiconductor manufacturing fabs. They provide manufacturing services to their customers. The customers are fabless companies, which include (i) IC chip design companies designing and owning the IC chips, (ii) system companies designing and owning the systems, (iii) IC chip designing individuals designing and owning IC chips. The IC manufacturing foundry fab then was the "public innovation platform". However, when IC technology nodes migrate to a technology node more advanced than 20 nm, and for example to the technology node of 16 nm, 10 nm, 7 nm, 5 nm or 3 nm IC technology nodes, only a few giant system or IC design companies, not the public innovators, can afford to use the semiconductor IC manufacturing foundry fab. It costs about or over 10 million US dollars to develop and implement an IC chip using these advanced technology nodes. The semiconductor IC manufacturing foundry fab is now not the "public innovation platform" anymore, they are becoming a "club innovation platform" for club innovators. The disclosed logic drives, comprising standard commodity FPGA IC chips, provides public innovators the "public innovation platform" back to semiconductor IC industry again just as in 1990's. The innovators can implement or realize their innovation (algorithms, architectures and/or applications) by using the standard commodity of logic drives and writing software programs using common programing languages, for example, C, Java, C++, C#, Scala, Swift, Matlab, Assembly Language, Pascal, Python, Visual Basic, PL/SQL or JavaScript languages, at cost of less than 500K or 300K US dollars. The innovators can use their own commodity logic drives or they can rent logic drives in data centers or clouds through networks.

Another aspect of the disclosure provides an innovation platform for an innovator, comprising: multiple logic drives in a data center or a cloud, wherein multiple logic drives comprise multiple standard commodity FPGA IC chips fabricated using a semiconductor IC process technology node more advanced than 20 nm technology node; an innovator's device and multiple users' devices communicating with the multiple logic drives in the data center or the cloud through an internet or a network, wherein the innovator develops and writes software programs to implement his innovation (algorithms, architectures and/or applications) in a common programing language to program, through the internet or the network, the multiple logic drives in the data center or the cloud, wherein the common programing language comprises Java, C++, C#, Scala, Swift, Matlab, Assembly Language, Pascal, Python, Visual Basic, PL/SQL or JavaScript language; after programming the logic drives, the innovator or the multiple users may use the programed logic drives for his or their innovations (algorithms, architectures and/or applications) through the internet or the network; wherein said innovations comprise (i) innovative algorithms or architectures of computing, processing, learning and/or inferencing, and/or (ii) innovative and/or specific applications.

Another aspect of the disclosure provides a method to change the current logic ASIC or COT IC chip business into a commodity logic IC chip business, like the current commodity DRAM, or commodity flash memory IC chip business, by using the standardized commodity logic drive. Since the performance, power consumption, and engineering and manufacturing costs of the standardized commodity logic drive may be better or equal to that of the ASIC or COT IC chip for a same innovation (algorithms, architectures and/or applications), the standardized commodity logic drive may be used as an alternative for designing an ASIC or COT IC chip. The current logic ASIC or COT IC chip design, manufacturing and/or product companies (including fabless IC design and product companies, or IC foundry or contracted manufacturers (may be product-less), and/or vertically-integrated IC design, manufacturing and product (IDM) companies) may become companies like the current commodity DRAM, or flash memory IC chip design, manufacturing, and/or product companies; or like the current DRAM module design, manufacturing, and/or product companies; or like the current flash memory module, flash USB stick or drive, or flash solid-state drive or disk drive design, manufacturing, and/or product companies. The current logic ASIC or COT IC chip design and/or manufacturing companies (including fabless IC design and product companies, IC foundry or contracted manufacturers (may be product-less), vertically-integrated IC design, manufacturing and product companies) may become companies in the following business models: (1) designing, manufacturing, and/or selling the standard commodity FPGA IC chips; and/or (2) designing, manufacturing, and/or selling the standard commodity logic drives. The business model is similar to the current commodity DRAM or flash memory chip and module business. A person, user, customer, or software developer, or algorithm/architecture/application developer may purchase the standardized commodity logic drive and write software codes to program them for his/her desired algorithms, architectures and/or applications, for example, in algorithms, architectures and/or applications of Artificial Intelligence (AI), machine learning, deep learning, big data, Internet Of Things (IOT), industry computers, Virtual Reality (VR), Augmented Reality (AR), self-drive or driver-less car, Graphic Processing (GP), Digital Signal Processing (DSP), Micro Controlling (MC), and/or Central Processing (CP). The logic drive may be programed to perform functions like a graphic chip, or a baseband chip, or an Ethernet chip, or a wireless (for example, 802.11ac) chip, or an AI chip. The logic drive may be alternatively programmed to perform functions of all or any combinations of functions of Artificial Intelligence (AI), machine learning, deep learning, big data, Internet Of Things (IOT), industry computers, Virtual Reality (VR), Augmented Reality (AR), car electronics, Graphic Processing (GP), Digital Signal Processing (DSP), Micro Controlling (MC), and/or Central Processing (CP). The logic drive may be field programmed as an accelerator for, for example, the AI functions, in the user-end, data center or cloud, in the algorithms, architectures and/or applications of training and/or inferring of the AI functions.

Another aspect of the disclosure provides a method to change the current logic ASIC or COT IC chip hardware business into a software business by using the standardized commodity logic drive. Since the performance, power consumption, and engineering and manufacturing costs of the standardized commodity logic drive may be better or equal to that of the ASIC or COT IC chip for a same innovation (algorithms, architectures and/or applications), the standardized commodity logic drive may be used as an alternative for designing an ASIC or COT IC chip. The current ASIC or COT IC chip design companies or suppliers may become software developers or suppliers; they may adapt the following business models: (1) become software companies to develop and sell software for their innovation (algorithms, architectures and/or applications), and let their customers or users to install software in the customers' or users' own standard commodity logic drive; and/or (2) still hardware companies by selling hardware without performing ASIC or COT IC chip design and/or production. In the case (2), they may install their in-house developed software for the innovation (algorithms, architectures and/or applications) in the purchased standard commodity logic drive; and sell the program-installed logic drive to their customers or users. In both cases (1) and (2), either the customers/users or developers/companies may write software codes into the standard commodity logic drive (that is, loading the software codes in the standardized commodity logic drive) for their desired algorithms, architectures and/or applications, for example, in algorithms, architectures and/or applications of Artificial Intelligence (AI), machine learning, deep learning, big data, Internet Of Things (IOT), industry computers, car electronics, Virtual Reality (VR), Augmented Reality (AR), Graphic Processing, Digital Signal Processing, micro controlling, and/or Central Processing. The logic drive may be programed to perform functions like a graphic chip, or a baseband chip, or an Ethernet chip, or a wireless (for example, 802.11ac) chip, or an AI chip. The logic drive may be alternatively programmed to perform functions of all or any combinations of functions of Artificial Intelligence (AI), machine learning, deep learning, big data, Internet Of Things (IOT), industry computers, car electronics, Virtual Reality (VR), Augmented Reality (AR), car electronics, Graphic Processing (GP), Digital Signal Processing (DSP), Micro Controlling (MC), and/or Central Processing (CP).

Another aspect of the disclosure provides a method to change the current system design, manufactures and/or product business into a commodity system/product business, like current commodity DRAM, or flash memory business, by using the standardized commodity logic drive. The system, computer, processor, smart-phone, or electronic equipment or device may become a standard commodity hardware comprises mainly a memory drive and a logic drive. The memory drive may be a hard disk drive, a flash drive, and/or a solid-state drive. The logic drive in the aspect of the disclosure may have big enough or adequate number of inputs/outputs (I/Os) to support I/O ports for used for programming all or most applications. The logic drive may have I/Os to support required I/O ports for programming, for example, to perform all or any combinations of functions of Artificial Intelligence (AI), machine learning, deep learning, big data, Internet Of Things (IOT), industry computers, Virtual Reality (VR), Augmented Reality (AR), car electronics, Graphic Processing (GP), Digital Signal Processing (DSP), Micro Controlling (MC), and/or Central Processing (CP), and etc. The logic drive may comprise (1) programing or configuration I/Os for software, algorithm, architecture and/or application developers to load algorithm, architecture and/or application software or program codes to program or configure the logic drive, through I/O ports or connectors connecting or coupling to the I/Os of the logic drive; and (2) operation, execution or user I/Os for the users to operate, execute and perform their instructions, through I/O ports or connectors connecting or coupling to the I/Os of the logic drive; for example, generating a Microsoft Word file, or a PowerPoint presentation file, or an Excel file. The I/O ports or connectors connecting or coupling to the corresponding I/Os of the logic drive may comprise one or multiple (2, 3, 4, or more than 4) Universal Serial Bus (USB) ports, one or more IEEE 1394 ports, one or more Ethernet ports, one or more audio ports or serial ports, for example, RS-232 or COM (communication) ports, wireless transceiver I/Os, and/or Bluetooth transceiver I/Os, and etc. The I/O ports or connectors connecting or coupling to the corresponding I/Os of the logic drive may also comprise Serial Advanced Technology Attachment (SATA) ports, or Peripheral Components Interconnect express (PCIe) ports for communicating, connecting or coupling with or to the memory drive. The I/O ports or connectors may be placed, located, assembled, or connected on or to a substrate, film or board; for example, a Printed Circuit Board (PCB), a silicon substrate with interconnection schemes, a metal substrate with interconnection schemes, a glass substrate with interconnection schemes, a ceramic substrate with interconnection schemes, a flexible film with interconnection schemes. The logic drive is assembled on the substrate, film or board using solder bumps, or copper pillars or bumps, on or of the logic drive, similar to the flip-chip assembly of the chip packaging technology, or the Chip-On-Film (COF) assembly technology used in the LCD driver packaging technology. The system, computer, processor, smart-phone, or electronic equipment or device design, manufacturing, and/or product companies may become companies to (1) design, manufacturing and/or sell the standard commodity hardware comprising a memory drive and a logic drive; in this case, the companies are still hardware companies; (2) develop system and algorithm, architecture and/or application software for users to install in the users' own standard commodity hardware; in this case, the companies become software companies; (3) install the third party's developed system and algorithm, architecture and/or application software or programs in the standard commodity hardware and sell the software-loaded hardware; and in this case, the companies are still hardware companies.

Another aspect of the disclosure provides a standard commodity FPGA IC chip for use in the standard commodity logic drive. The standard commodity FPGA IC chip is designed, implemented and fabricated using an advanced semiconductor technology node or generation, for example more advanced than or equal to, or below or equal to 20 nm or 10 nm, such as 16 nm, 14 nm, 12 nm, 10 nm, 7 nm, 5 nm or 3 nm; with a chip size and manufacturing yield optimized for the minimum manufacturing cost for the used semiconductor technology node or generation. The standard commodity FPGA IC chip may have an area between 400 $mm^2$ and 9 $mm^2$, 144 $mm^2$ and 16 $mm^2$, 75 $mm^2$ and 16 $mm^2$, or 50 $mm^2$ and 16 $mm^2$. Transistors used in the advanced semiconductor technology node or generation may be a FIN Field-Effect-Transistor (FINFET), a FINFET on Silicon-On-Insulator (FINFET SOI), a Fully Depleted Silicon-On-Insulator (FDSOI) MOSFET, a Partially Depleted Silicon-On-Insulator (PDSOI) MOSFET or a conventional MOSFET. The standard commodity FPGA IC chip may only communicate directly with other chips in or of the logic drive only; its I/O circuits may require only small I/O drivers or receivers, and small or none Electrostatic Discharge (ESD) devices. The driving capability, loading, output capacitance, or input capacitance of the small I/O drivers or receivers, or I/O circuits may be between 0.1 pF and 2 pF or 0.1 pF and 1 pF. The size of the small ESD device may be between 0.05 pF and 2 pF or 0.05 pF and 1 pF. For example, a bi-directional (or tri-state) I/O pad or circuit may comprise an ESD circuit, a receiver, and a driver, and has an input capacitance or output capacitance between 0.1 pF and 2 pF or 0.1 pF and 1 pF. All or most control and/or Input/Output (I/O) circuits or units (for example, the off-logic-drive I/O circuits, i.e., large I/O circuits, communicating with circuits or components external or outside of the logic drive) are outside of, or not included in, the standard commodity FPGA IC chip, but are included in another dedicated control chip, dedicated I/O chip, or dedicated control and I/O chip, packaged in the same logic drive. None or minimal area of the standard commodity FPGA IC chip is used for the control or I/O circuits, for example, less than 15%, 10%, 5% or 1% area is used for the control or IO circuits; or, none or minimal transistors of the standard commodity FPGA IC chip are used for the control or I/O circuits, for example, less than 15%, 10%, 5%, or 1% of the total number of transistors are used for the control or I/O circuits; or all or most area of the standard commodity FPGA IC chip is used for (i) logic blocks or functions comprising logic gate arrays, computing units or operators, and/or Look-Up-Tables (LUTs) and multiplexers, and/or (ii) programmable interconnection. For example, greater than 85%, 90%, 95% or 99% area is used for logic blocks/functions, and/or programmable interconnection; or, all or most transistors of the standard commodity FPGA IC chip are used for logic blocks/functions, and/or programmable interconnection, for example, greater than 85%, 90%, 95% or 99% of the total number of transistors are used for logic blocks/functions, and/or programmable interconnection.

Another aspect of the disclosure provides a Floating-Gate CMOS Non-Volatile Memory cell, abbreviated as "FGCMOS Non-Volatile Memory" cell or "FGCMOS NVM" cell. The FGCMOS NVM cell may be used in the standard commodity FPGA IC chip for programmable interconnection and/or for data storage of the LUTs. As an example, a first type of a FGCMOS NVM cell comprises a floating-gate P-MOS (FG P-MOS) transistor and a floating-gate N-MOS (FG N-MOS) transistor, with the floating gates of the FG P-MOS and the FG N-MOS connected, and the drains of the FG P-MOS and the FG N-MOS connected or coupled. The FG P-MOS and FG N-MOS share a same connected floating gate. The FG P-MOS transistor is smaller than the FG N-MOS transistor, that is, for example, the gate capacitance of the FG N-MOS transistor is 2 or greater than 2 times larger than or equal to the gate capacitance of the FG P-MOS transistor. The data stored in the FGCMOS NVM cell is erased by electron tunneling through the gate oxide (or insulator) between the floating gate and source/well of the FG P-MOS by (i) biased or coupled the source/well of the FG P-MOS with an erase voltage $V_{Er}$, (ii) biased or coupled the source/substrate of the FG N-MOS with a ground voltage $V_{ss}$, and (iii) the connected or coupled drains are disconnected. Since the gate capacitance of the FG P-MOS transistor is smaller than that of the FG N-MOS transistor, the voltage of $V_{Er}$ is dropped largely across the gate oxide of the FG P-MOS transistor; that means the voltage difference between the floating gate and the source/well terminal of the FG P-MOS is large enough to cause the electron tunneling. Therefore, the electrons trapped in the floating gate are tunneling through the gate oxide of the FG P-MOS transistor. The FGCMOS NVM cell after erase is at a logic state of "1". The data is stored or programmed in the NVM cell by hot electron injection through the gate oxide (or insulator) between the floating gate and the channel/drain of the FG N-MOS by (i) biased or coupled the connected or coupled drains with a programming (write) voltage $V_{Pr}$, (ii) biased or coupled the source/well of the FG P-MOS with the programming voltage $V_{Pr}$, and (iii) biased or coupled the source/substrate of the FG N-MOS with a ground voltage $V_{ss}$. The electrons are injected to and trapped in the floating gate by the hot carrier injection through the gate oxide of the FG N-MOS. The FGCMOS NVM cell after programming (write) is at a logic state of "0". The first type of FGCMOS NVM cell uses electron tunneling for erasing and hot electron injection for programming (write). The data stored in the FGCMOS NVM cell may be read or accessed through the connected or coupled drains with the source/well of the FG P-MOS biased at the read, access, or operation voltage $V_{cc}$, and the source/substrate of the FG N-MOS biased at the ground voltage $V_{ss}$. For the read, access or operation process or mode, when the floating gate is at a logic level of "1", the FG P-MOS transistor may be turned off and the FG N-MOS transistor may be turned on, and therefore, the ground voltage $V_{ss}$ at the source of the FG N-MOS is coupled to the output (the connected drain) of the FGCMOS NVM cell through a channel of the FG N-MOS transistor. Thereby, the output of the FGCMOS NVM cell may be at a logic level of "0". When the floating gate is at a logic level of "0", the FG P-MOS transistor may be turned on and the FG N-MOS transistor may be turned off, and therefore, the power supply voltage of $V_{cc}$ at the source of the FG P-MOS is coupled to the output (the connected drain) of the FGCMOS NVM cell through a channel of the FG P-MOS transistor. Thereby, the output of the FGCMOS NVM cell may be at a logic level of "1".

As another example, a second type of a FGCMOS NVM cell uses electron tunneling for both erasing and programming. The second type of a FGCMOS NVM cell comprises a floating-gate P-MOS (FG P-MOS) transistor and a floating-gate N-MOS (FG N-MOS) transistor, with the floating gates of the FG P-MOS and the FG N-MOS connected, and the drains of the FG P-MOS and the FG N-MOS connected or coupled. The FG P-MOS and FG N-MOS share a same connected floating gate. The FG N-MOS transistor is smaller than the FG P-MOS transistor, that is, the gate capacitance of the FG P-MOS transistor is 2 or greater than 2 times larger than or equal to the gate capacitance of the FG N-MOS transistor. The data stored in the FGCMOS NVM cell is erased by electron tunneling through the gate oxide (or insulator) between the floating gate and the source of the FG N-MOS by (i) biased or coupled the source of the FG N-MOS with an erase voltage $V_{Er}$, (ii) biased the source/well of the FG P-MOS with a ground voltage $V_{ss}$, and (iii) the drain of the FG N-MOS are disconnected. Since the capacitance between the floating gate and the source junction of the FG N-MOS transistor is much smaller than that of the sum of the gate capacitances of the FG P-MOS transistor and the FG N-MOS transistor, the voltage of $V_{Er}$ is dropped largely across the gate oxide between the floating gate and the source junction of the FG N-MOS transistor; that means the voltage difference between the floating gate and the source terminal of the FG N-MOS is large enough to cause the electron tunneling. Therefore, the electrons trapped in the floating gate are tunneling through the gate oxide between the floating gate and the source junction of the FG N-MOS transistor. The FGCMOS NVM cell after erase is at a logic state of "1". The data is stored or programmed in the FGCMOS NVM cell by electron tunneling through the gate oxide (or insulator) between the floating gate and the channel/source of the FG N-MOS by (i) biased or coupled the source/well of the FG P-MOS with a programming voltage $V_{Pr}$, (ii) biased or coupled the source/substrate of the FG N-MOS with the ground voltage $V_{ss}$, and (iii) the drain of the FG N-MOS is disconnected. Since the gate capacitance of the FG N-MOS transistor is smaller than that of the FG P-MOS transistor, the voltage of $V_{Pr}$ is dropped largely across the gate oxide of the FG N-MOS transistor; that means the voltage difference between the floating gate and the source/channel terminal of the FG N-MOS is large enough to cause the electron tunneling. Therefore, the electrons at the source/channel of the FG N-MOS transistor may tunnel through the gate oxide to the floating gate and be trapped in the floating gate. Thereby, the floating gate may be programmed to a logic level of "0". The "read", "access" or "operation" process or mode for the second type FGCMOS NVM cell is the same as that of the first type.

As another example, a third type of a FGCMOS NVM cell uses electron tunneling for both erasing and programming as in the above second type of the FGCMOS NVM cell. The third type of a FGCMOS NVM cell comprises an additional floating-gate P-MOS (AD FG P-MOS) transistor in addition to the floating-gate P-MOS (FG P-MOS) transistor and the floating-gate N-MOS (FG N-MOS) transistor in the above second type of the FGCMOS NVM cell. The floating gates of the FG P-MOS, the FG N-MOS and the AD FG P-MOS are connected, and the drains of the FG P-MOS and the FG N-MOS connected. The source, drain and well of the AD P-MOS are connected, so the AD FG P-MOS is functioning like a MOS capacitor. The sizes of the FG N-MOS transistor, the FG P-MOS transistor and the AD FG P-MOS may be designed such that the functions of erase, programing (write) and read of the third type of the FGCMOS NVM cell can be performed with a certain voltage biases at each of terminals. That is, the gate capacitances of the FG N-MOS transistor, the FG P-MOS transistor and the AD FG P-MOS may be designed for erase, write and read functions. In the following example, the sizes of the FG N-MOS transistor, the FG P-MOS transistor and the AD FG P-MOS are assumed the same; that is, the gate capacitances of the FG N-MOS transistor, the FG P-MOS transistor and the AD FG P-MOS are assumed the same. The data stored in the FGCMOS NVM cell is erased by electron tunneling through the gate oxide (or insulator) between the floating gate and the connected source/drain/well of the AD FG P-MOS by (i) biased or coupled the connected source/drain/well of the AD FG P-MOS with an erase voltage $V_{Er}$, (ii) biased or coupled the source/well of the FG P-MOS with a ground voltage $V_{ss}$, and (iii) biased or coupled the source/substrate of the FG N-MOS at a ground voltage $V_{ss}$, and (iv) the connected drains of the FG P-MOS and the FG N-MOS are disconnected. Since the capacitance between the floating gate and the connected source/drain/well of the AD FG P-MOS is smaller than that of the sum of the gate capacitances of the FG P-MOS transistor and the FG N-MOS transistor, the voltage $V_{Er}$ is dropped largely across the gate oxide between the floating gate and the connected source/drain/well of the AD FG P-MOS; that means the voltage difference between floating gate and source/drain/well connected terminal of the AD FG P-MOS is large enough to cause the electron tunneling. Therefore, the electrons trapped in the floating gate are tunneling through the gate oxide between the floating gate and the connected source/drain/well of the AD FG P-MOS. The FGCMOS NVM cell after erase is at a logic state of "1". The data is stored or programmed in the FGCMOS NVM cell by electron tunneling through the gate oxide (or insulator) between the floating gate and the channel/source of the FG N-MOS by (i) biased or coupled the source/well of the FG P-MOS, and the connected source/drain/well of the AD FG P-MOS with a programming voltage $V_{Pr}$, (ii) biased or coupled the source/substrate of the FG N-MOS with the ground voltage $V_{ss}$, and (iii) the drain of the FG N-MOS is disconnected. Since the gate capacitance of the FG N-MOS transistor is smaller than the sum of the gate capacitances of the FG P-MOS transistor and the AD FG P-MOS, the voltage $V_{Pr}$ is dropped largely across the gate oxide of the FG N-MOS transistor; that means the voltage difference between floating gate and source/channel terminal of the FG N-MOS is large enough to cause the electron tunneling. Therefore, the electrons at the source/channel of the FG N-MOS transistor may tunnel through the gate oxide to the floating gate and be trapped in the floating gate. Thereby, the floating gate may be programmed to a logic level of "0". The "read", "access" or "operation" process or mode for the third type FGCMOS NVM cell is the same as that of the first type using the FG P-MOS transistor and the FG N-MOS transistor, except that the connected source/drain/well of the AD FG P-MOS may be biased or coupled to either $V_{cc}$ or $V_{ss}$ or a given voltage between $V_{cc}$ and $V_{ss}$.

Another aspect of the disclosure provides a FGCMOS NVM cell, comprising a FGCMOS cell (the first, second or third types of the FGCMOS cells) as described and specified above, a latched circuit and a set/set-bar circuit for use in the standard commodity FPGA IC chip for programmable interconnection and/or for data storage of the LUTs. This type of FGCMOS NVM cell may be named as a Latched FGCMOS NVM cell, abbreviated as L-FGCMOS NVM. As an example, the latched circuit comprising two inverters as in the latched 4T circuit in the 6T SRAM cell. A drain of the P-MOS of a first inverter in the latched 4T circuit is connected or coupled to the source of the FG P-MOS (in the FGCMOS NVM), and a drain of the N-MOS of the first inverter in the latched 4T circuit is connected or coupled to the source of the FG N-MOS (in the FGCMOS NVM). The Bit-bar node of the latched 4T circuit is connected or coupled to (i) the connected or coupled drains of the FG P-MOS and FG N-MOS of the L-FGCMOS NVM cell, and (ii) the connected gates of the P-MOS and N-MOS of a second inverter of the latched 4T circuit. The Bit node of the latched 4T circuit is connected or coupled to (i) the connected drains of the P-MOS and N-MOS of the second inverter of the latched 4T circuit, and (ii) the connected gates of the P-MOS and N-MOS of the first inverter. A drain of Set-bar P-MOS transistor is connected to the source of the FG P-MOS, and a drain of Set N-MOS transistor is connected to the source of the FG N-MOS. In the programming or write process, the first type of FGCMOS NVM described and specified above is used here as an example: (i) to write Bit of '1", the voltage biases at nodes or terminals are: (a) the gate of the Set-bar P-MOS is connected or coupled to a low operation voltage ($V_{ss}$), and the gate of the Set N-MOS is connected or coupled to a high operation voltage ($V_{cc}$); (b) the source of Set-bar P-MOS and the N-well of the FG P-MOS are connected or coupled to the programming voltage ($V_{Pr}$), and the source of Set N-MOS is connected or coupled to the low operation or ground voltage ($V_{ss}$); (c) the connected or coupled drains (Bit-bar node) of FGCMOS are connected or coupled with a programming (write) voltage $V_{Pr}$, and (d) the common sources of P-MOS's and N-MOS's in the 4T latched circuit are disconnected. The hot electrons are injected to and trapped in the floating gate by the hot carrier injection through the gate oxide of the FG N-MOS, and the FG NVM cell after programming (write) is at a logic state of '0' at the Bit-bar node and at logic state of "1" at the Bit node; (ii) to write Bit of '0", or to erase the electrons in the floating gate, (a) the gate of the Set-bar P-MOS is connected or coupled to a low operation voltage ($V_{ss}$), and the gate of the Set N-MOS is connected or coupled to a high operation voltage ($V_{cc}$); (b) the source of Set-bar P-MOS and the N-well of the FG P-MOS are connected or coupled to the erase voltage ($V_{Er}$), and the source of Set N-MOS is connected or coupled to the low operation or ground voltage ($V_{ss}$); and (c) the connected or coupled drains of the FG CMOS (Bit-bar node) are disconnected. The electrons trapped in the floating gate are tunneling through the gate oxide of the FG P-MOS transistor, and the FG NVM cell after erase is at a logic state of '0' at the Bit-bar node and at logic state of "1" at the Bit node.

The L-FGCMOS NVM provides correction, recovery capability when the device or the FPGA IC chip is turned on, to prevent data errors caused by charge leakage during the time when the device or the FPGA chip is turn off. The data stored in the Bit-bar and Bit nodes are recovered to the correct states after the initiation process. In the initiation process after the device or the FPGA IC chip is turned on: (i) the gate of the Set-bar P-MOS is connected or coupled to a low operation or ground voltage ($V_{ss}$), and the gate of the Set N-MOS is connected or coupled to a high operation voltage ($V_{cc}$); the source of the Set-bar P-MOS is connected or coupled to the high operation voltage ($V_{cc}$), and the source of the Set N-MOS is connected or coupled to the low operation or ground voltage ($V_{ss}$); (ii) the common sources of P-MOS's in the 4T latched circuit are connected or coupled to the high operation voltage ($V_{cc}$), and the common sources of N-MOS's in the 4T latched circuit are connected or coupled to the low operation or ground voltage ($V_{ss}$). After the initiation process, the data stored in the Bit-bar and Bit nodes are recovered to the correct states. In the read operation process, the information stored in the FGCMOS NVM cells may be read. In the read operation process: (i) the gate of the Set-bar P-MOS is connected or coupled to a high operation voltage ($V_{cc}$), and the gate of the Set N-MOS is connected or coupled to a low operation voltage ($V_{ss}$); the source of the Set-bar P-MOS and the source of the Set N-MOS may be disconnected; (ii) the common sources of P-MOS's in the 4T latched circuit is connected or coupled to the high operation voltage ($V_{cc}$), and the common sources of N-MOS's in the 4T latched circuit is connected or coupled to the low operation or ground voltage ($V_{ss}$). The Bit and/or Bit-bar data of the L-FGCMOS NVM is used for programming the interconnection in the FPGA IC chips, or for the data storage for the LUT operation process.

Another aspect of the disclosure provides a Magnetoresistive Random Access Memory cell, abbreviated as "MRAM" cell, for use in the standard commodity FPGA IC chip for programmable interconnection and/or for data storage of the LUTs. The MRAM cell is based on the interaction between the electron spin and the magnetic field of the magnetic layers in a Magnetoresistive Tunneling Junction (MTJ) of the MRAM cell. The MRAM cell uses a spin-polarized current to switch the spin of electrons, the so-called Spin Transfer Torque MRAM, STT-MRAM. The MRAM cell mainly comprises four stacked thin layers: (i) a free magnetic layer, comprising, for example, $Co_2Fe_6B_2$. The free layer has a thickness between 0.5 nm and 3.5 nm, or 1 nm and 3 nm; (ii) a tunneling barrier layer, comprising for example, MgO. The tunneling barrier layer has a thickness between 0.3 nm and 2.5 nm, or 0.5 nm and 1.5 nm; (iii) a pinned or fixed magnetic layer comprising, for example, $Co_2Fe_6B_2$. The pinned layer has a thickness between 0.5 nm and 3.5 nm, or 1 nm and 3 nm. The pinned layer may have a similar material as that of the free layer; and (iv) a pinning layer; comprising, for example, an anti-ferromagnetic (AF) layer. The AF layer may be a synthetic layer comprising, for example, $Co/[CoPt]_4$. The direction of the magnetization of the pinned layer is pinned or fixed by the neighboring pinning layer of the AF layer. The stacked layers of the MTJ may be formed by the Physical Vapor Deposition (PVD) method using a multi-cathode PVD chamber or sputter, followed by etching to form a mesa structure of MTJ. The direction of the magnetization of the free layer or the pinned (fixed layer) may be (i) in-plane with the free or pined (fixed) layer (iMTJ) or (ii) perpendicular to the plane of the free or pinned (fixed) layer (pMTJ). The direction of magnetization of the pinned (fixed) layer is fixed by the bi-layers structure of pinned/pinning layers. The interfacing of the ferromagnetic pinned (fixed) layer and the AF pinning layer results in that the direction of ferromagnetic pinned (fixed) layer is in a fixed direction (for example, up or down in the pMTJ), and becomes harder to change or flip in external electromagnetic force or field. While the direction of ferromagnetic free layer (for example, up or down in the pMTJ) is easier to change or flip in external electromagnetic force or field. The change or flip the direction of the ferromagnetic free layer is used for programming the MTJ MRAM cell. The state "0" is defined when the magnetization direction of the free layer is in-parallel with or in the same direction of that of the pinned (fixed) layer; and the state "1" is defined when the magnetization direction of the free layer is anti-parallel with or in the reverse direction of that of the pinned (fixed) layer. To write "0", electrons are tunneling from the pinned layer to the free layer. When electrons flow through the pinned or fixed layer, the electron spins will be aligned in-parallel with the magnetization direction of the pinned (fixed) layer. When the tunneling electrons with aligned spins flowing in the free layer, (i) the tunneling electrons may be passing through the free layer if the aligned spins of the tunneling electrons are in-parallel with that of the free layer, (ii) the tunneling electrons may flip or change the direction of the magnetization of the free layer to a direction in-parallel with the fixed layer using the spin torque of the electrons if the aligned spins of the tunneling electrons are not in-parallel with that of the free layer. After writing "0", the direction of the magnetization of the free layer is in-parallel with that of the fixed layer. To write "1" from the original "0", electrons are tunneling from the free layer to the pinned (fixed) layer. Since the directions of the magnetizations of the free layer and the pinned (fixed) layer are the same, the electrons with majority of spin polarity (in-parallel with the magnetization direction of the pinned layer) may flow and pass the pinned (fixed) layer; only electrons with minority spin polarity (not in-parallel with the magnetization direction of the pinned layer) may be reflected from pinned (fixed) layer and back to the free layer. The spin polarity of reflected electrons is in the reverse direction of the magnetization of the free layer, and may flip or change the direction of the magnetization of the free layer to a direction reverse-parallel to the fixed layer using the spin torque of the electrons. After writing "1", the direction of the magnetization of the free layer is anti-parallel to that of the fixed layer. Since write "1" is using the minority spin polarity electrons, a larger current flow through MTJ is required as compared to write "0".

Based on the magnetoresistance theory, the resistance of a MTJ is at low resistance state (LR), the "0" state, when the direction of the magnetization of the free layer is in-parallel with the direction of that of the fixed layer; while at high resistance state (HR), the "1" state, when the direction of the magnetization of the free layer is anti-parallel with the direction of that of the fixed layer. The two states of resistance may be used in read the MTJ MRAM cell.

Another aspect of the disclosure provides a MRAM cell, comprising two complementary MTJs for use in the standard commodity FPGA IC chip for programmable interconnection and/or for data storage of the LUTs. This type of MRAM cell may be named as a Complementary MRAM cell, abbreviated as CMRAM. The two MTJs are formed by stacks comprising pinning/pinned/barrier/free layers, from top to the bottom as the FPGA IC chips are facing up (with transistors and the metal interconnection structures on or over the silicon substrate). Atop electrode of the First MTJ (F-MTJ) may be connected or coupled to a top electrode of the Second MTJ (S-MTJ). Alternatively, a bottom electrode of the First MTJ (F-MTJ) may be connected or coupled to a bottom electrode of the Second MTJ (S-MTJ). In other alternative, the two MTJs are formed by stacks comprising free/barrier/pinned/pinning layers, from top to the bottom as the FPGA IC chips are facing up (with transistors and the metal interconnection structures on or over the silicon substrate). Atop electrode of the First MTJ (F-MTJ) may be connected or coupled to a top electrode of the Second MTJ (S-MTJ). Alternatively, a bottom electrode of the First MTJ (F-MTJ) may be connected or coupled to a bottom electrode of the Second MTJ (S-MTJ). The node or terminal connected or coupled to the electrode of the pinning layer is the node P of a MTJ, and the node or terminal connected or coupled to the electrode of the free layer is the node F of the MTJ. The CMRAM may be programmed or written for the F-MTJ and the S-MTJ as described above for a single MTJ. The F-MTJ and S-MTJ in the CMRAM cell (a type of MRAM cell) are in anti-polarity; that is, when F-MTJ is at the HR state, the S-MTJ is at LR state, and when F-MTJ is at the LR state, the S-MTJ is at the HR state. For example, in the case if the connected node is the connected or coupled electrodes of the free layers for the F-MTJ and the S-MTJ, the CMRAM cell may be written "0", by connecting the P node of the F-MTJ to a programming voltage ($V_P$) and the P node of the S-MTJ to $V_{ss}$. The S-MTJ is programmed at the LR state, and the F-MTJ is programmed at the HR state. The CMRAM is at the [1,0] state, defined as the "0" state of the CMRAM. The CMRAM cell may be written"1", by connecting the P node of the S-MTJ to a programming voltage ($V_P$) and the P node of the F-MTJ to $V_{ss}$. The S-MTJ is programmed at the HR state, and the F-MTJ is programmed at the LR state. That is, the CMRAM is at the [0,1] state, defined as the "1" state of the CMRAM. To read the data, the P node of the F-MTJ is connected to $V_{cc}$, the P-node of the S-MTJ is connected to $V_{ss}$, and the F nodes of the F-MTJ and the S-MTJ are electrically connected.

Another aspect of the disclosure provides a MRAM cell, comprising a CMRAM, a latched circuit and a set/set-bar circuit for use in the standard commodity FPGA IC chip for programmable interconnection and/or for data storage of the LUTs. This type of MRAM cell may be named as a Latched MRAM cell, abbreviated as LMRAM. As an example, the latched circuit comprising two inverters as in the latched 4T circuit of the 6T SRAM cell. A drain of the P-MOS of a first inverter of the latched 4T circuit is connected or coupled to the P node of the F-TWJ, and a drain of the N-MOS of the first inverter of the latched 4T circuit is connected or coupled to the P node of the S-TWJ. The Bit-bar node of the latched 4T circuit is connected or coupled to (i) the connected or coupled nodes (the F nodes of the F-TWJ and the S-TWJ) of the CMRAM cell, and (ii) the connected gates of the P-MOS and N-MOS of a second inverter of the latched 4T circuit. The Bit node of the latched 4T circuit is connected or coupled to (i) the connected drains of the P-MOS and N-MOS of the second inverter of the latched 4T circuit, and (ii) the connected gates of the P-MOS and N-MOS of the first inverter. A Set-bar P-MOS transistor of the set/set-bar circuit is connected to the P node of the F-TWJ, and a Set N-MOS transistor of the set/set-bar circuit is connected to the P node of the S-TWJ. In the programming or write process, the gate of the Set-bar P-MOS is connected or coupled to a low operation or ground voltage ($V_{ss}$), and the gate of the Set N-MOS is connected or coupled to a high operation voltage ($V_{cc}$), with the common sources of P-MOS's and N-MOS's in the 4T latched circuit disconnected. When the source of the Set-Bar P-MOS is connected or coupled to the programming voltage ($V_P$), and the source of the Set N-MOS is connected or coupled to the low operation or ground voltage ($V_{ss}$), F-TWJ is at the HR state, and the S-TWJ is at the LR state, the Bit-bar node is "0", and the another latched node, the Bit node, is at "1". When the source of the Set-bar P-MOS is connected or coupled to the low or ground voltage ($V_{ss}$), and the source of the Set N-MOS is connected or coupled to the programming voltage ($V_P$), F-TWJ is at the LR state, and the S-TWJ is at the HR state, the Bit-bar node is "1", and the another latched node, the Bit node, is at "0".

The LMRAM provides correction, recovery capability when the device or the FPGA IC chip is turned on, to prevent the data errors caused by the charge leakage during the time when device or the FPGA chip is turn off. The data stored in the Bit-bar and Bit are recovered to the correct state after the initiation process. In the initiation process after the device or the FPGA IC chip is turned on: (i) the gate of the Set-bar P-MOS is connected or coupled to a low operation or ground voltage ($V_{ss}$), and the gate of the Set N-MOS is connected or coupled to a high operation voltage ($V_{cc}$); the source of the Set P-MOS is connected or coupled to the high operation voltage ($V_{cc}$), and the source of the Set N-MOS is connected or coupled to the low operation or ground voltage ($V_{ss}$), (ii) the common sources of P-MOS's in the 4T latched circuit is connected or coupled to the high operation voltage ($V_{cc}$), and the common sources of N-MOS's in the 4T latched circuit is connected or coupled to the low operation or ground voltage ($V_{ss}$). After the initiation process, the data stored in the Bit-bar and Bit nodes are recovered to the correct states. In the read operation process, the information stored in the non-volatile MRAM cells or the TWJs may be read. In the read operation process: (i) the gate of the Set-bar P-MOS is connected or coupled to a high operation voltage ($V_{cc}$), and the gate of the Set N-MOS is connected or coupled to a low operation or ground voltage ($V_{ss}$); the source of the Set-bar P-MOS and the source of the Set N-MOS may be disconnected, (ii) the common sources of P-MOS's in the 4T latched circuit is connected or coupled to the high operation voltage ($V_{cc}$), and the common sources of N-MOS's in the 4T latched circuit is connected or coupled to the low operation or ground voltage ($V_{ss}$). The Bit and/or Bit-bar data of the LMRAM is used for programming the interconnection in the FPGA IC chips, or for the data storage of the LUTs.

Another aspect of the disclosure provides a Resistive Random Access Memory cell, abbreviated as "RRAM" cell, for use in the standard commodity FPGA IC chip for programmable interconnection and/or for data storage of the LUTs. The RRAM cell is based on the nano-morphological modifications associated with the formation of oxygen vacancies ($V_o$). The RRAM is based on oxidation-reduction (redox) electrochemical processes of a solid electrolyte. In the electroforming process of oxide-based RRAM devices, the oxide layer undergoes certain nano-morphological modifications associated with the formation of oxygen vacancies ($V_o$). The RRAM cell is switched by the presence or absence of conductive filaments or paths in the oxide layer, depending on the applied electric voltages. The RRAM cell comprises a Metal/Insulator/Metal (MIM) device or structure, and mainly comprises four stacked thin layers: (i) a first metal electrode layer, for example, the metal may comprise titanium nitride (TiN) or tantalum nitride (TaN); (ii) an oxygen reservoir layer which may capture the oxygen atoms from an oxide layer. The oxygen reservoir layer may be a layer of metal comprising titanium (Ti), or tantalum (Ta). Both Ti or Ta material may capture the oxygen atoms to form $TiO_x$ or $TaO_x$. The thickness of Ti layer may be 2 nm, 7 nm, or 12 nm; or, between 1 nm and 25 nm or 3 nm and 15 nm. The oxygen reservoir layer may be formed by Atomic Layer Deposition (ALD) methods; (iii) an oxide layer or an insulator layer, in which conductive filaments or paths may be formed depending on the applied electric voltages. The oxide layer may comprise, for example, hafnium oxide ($HfO_2$) or Tantalum Oxide $Ta_2O_5$. The thickness of $HfO_2$ may be 5 nm, 10 nm, or 15 nm; or, between 1 nm and 30 nm, 3 nm and 20 nm, or 5 nm and 15 nm. The oxide layer may be formed by Atomic Layer Deposition (ALD) methods; (iv) a second metal electrode layer, for example, the metal may comprise titanium nitride (TiN) or tantalum nitride (TaN). The RRAM cell is a kind of memristors (memory resistors). In the forming process stage, the first electrode of a MIM device (RRAM cell) is biased, connected or coupled to a forming voltage ($V_F$), and the second electrode is biased, connected or coupled to a low operation or ground voltage ($V_{ss}$). The forming voltage will drive or pull oxygen ions from the oxide layer (for example, $HfO_2$) to the oxygen reservoir layer (for example, Ti), to form $TiO_x$. Vacancies in the original oxygen sites in the oxide or insulating layer are created and forming one or more conductive filaments or paths in the oxide or insulting layer. The oxide or insulating layer becomes conductive with the presence of the one or more conductive filaments or paths, and the RRAM cell is at a low resistance state (LR). After the forming process, the RRAM cell is activated as a NVM cell for use. The state "0" is defined when the RRAM is at LR state. To reset or write the RRAM cell to a "I" state (HR), the second electrode of a MIM device (RRAM cell) is biased, connected or coupled to a reset voltage ($V_{Rset}$), and the first electrode is biased, connected or coupled to a low operation or ground voltage ($V_{ss}$). The reset voltage ($V_{Rset}$) will drive or pull oxygen ions out from the oxygen reservoir layer (for example, Ti) and the oxygen ions are hopping or flowing to the oxide or insulating layer. The vacancies in the original oxygen sites are re-occupied by the oxygen ions and the one or more conductive filaments or paths in the oxide or insulting layer are broken or disrupted. The oxide or insulating layer is less-conductive and the RRAM cell is at a high resistance state (HR), and therefore at "1" state. To set or write the RRAM cell to a "0" state (LR), the first electrode of a MIM device (RRAM cell) is biased, connected or coupled to a set voltage ($V_{Set}$), and the second electrode is biased, connected or coupled to a low operation or ground voltage ($V_{ss}$). The set voltage ($V_{Set}$) will drive or pull oxygen atoms or ions from the oxide or insulting layer (for example, $HfO_2$) to the oxygen reservoir layer (for example, Ti), to form $TiO_x$. The vacancies in the original oxygen sites in the oxide or insulating layer are created and forming one or more conductive filaments or paths in the oxide or insulting layer. The oxide or insulating layer becomes conductive and the RRAM cell is at the "0" state (LR).

Based on the conductive filament theory, the resistance of a MIM is at low resistance state (LR), the "0" state, when the set voltage is biased, connected or coupled to the first electrode; while the resistance of a MIM is at high resistance state (HR), the "1" state, when the reset voltage is biased, connected or coupled to the second electrode. The two states of resistance may be used in read the MIM RRAM cell.

Another aspect of the disclosure provides a RRAM cell in the standard commodity FPGA IC chip, comprising two complementary MIMs (Two single-RRAM cells as described and specified) for use in the FPGA IC chip for programmable interconnection and/or for data storage of the LUTs. This type of RRAM cell may be named as a Complementary RRAM cell, abbreviated as CRRAM. The two MIMs each is formed by stacks comprising first electrode/oxygen reservoir/oxide/second electrode layers, from top to the bottom as the FPGA IC chips are facing up (with transistors and the metal interconnection structures on or over the silicon substrate). A first (top) electrode of the First MIM (F-MIM) may be connected or coupled to a first (top) electrode of that of the Second MIM (S-MIM). Alternatively, a second (bottom) electrode of the First MIM (F-MIM) may be connected or coupled to a second (bottom) electrode of that of the Second MIM (S-MIM). In other alternative, the two MIMs each is formed by stacks comprising second electrode/oxide/oxygen reservoir/first electrode layers, from top to the bottom as the FPGA IC chips are facing up (with transistors and the metal interconnection structures on or over the silicon substrate). A first (bottom) electrode of the First MIM (F-MIM) may be connected or coupled to a first (bottom) electrode of that of the Second MIM (S-MIM). Alternatively, a second (top) electrode of the First MIM (F-MIM) may be connected or coupled to a second (top) electrode of that of the Second MIM (S-MIM). The node or terminal connected or coupled to the first electrode is the node F of a MIM, and the node or terminal connected or coupled to the second electrode is the node S of the MIM. The CRRAM may be programmed or written for the F-MIM and the S-MIM as described above for a single MIM. The F-MIM and S-MIM in the CRRAM (a type of RRAM cell) cell are in anti-polarity, that is when F-MIM is at the HR state, the S-MIM is at LR state, and when F-MIM is at the LR state, the S-MIM is at the HR state. For example, in a case if the connected node is the connected or coupled electrodes of the first electrodes (F nodes) for the F-MIM and the S-MIM, the CRRAM cell may be written "0", by connecting the S node of the F-MIM to a programming voltage ($V_P$) and the S node of the S-MIM to $V_{ss}$, the S-MIM is programmed at the LR state, and the F-MIM is programmed at the HR state. The CRRAM is at the [1,0] state, defined as the "0" state of the CRRAM. The CRRAM cell may be programmed or written "1", by connecting the S node of the S-MIM to the programming voltage ($V_P$) and the S node of the F-MIM to $V_{ss}$, the S-MIM is programmed at the HR state, and the F-MIM is programmed at the LR state. That is the CRRAM is at the [0,1] state, defined as the "1" state of the CRRAM.

Another aspect of the disclosure provides a RRAM cell, comprising a CRRAM, a latched circuit and a set/set-bar circuit for use in the standard commodity FPGA IC chip for programmable interconnection and/or for data storage of the LUTs. This type of RRAM cell may be named as a Latched RRAM cell, abbreviated as LRRAM. As an example, the latched circuit comprising two inverters as in the latched 4T circuit of the 6T SRAM cell. A drain of the P-MOS of a first inverter in the 4T latched circuit is connected or coupled to the S node of the F-MIM, and a drain of the N-MOS of the first inverter is connected or coupled to the S node of the S-MIM. The Bit-bar node of the 4T latched circuit is connected or coupled to (i) the connected or coupled node (the connected or coupled F nodes of the F-MIM and the S-MIM) of the CRRAM cell; (ii) the connected gates of P-MOS and N-MOS in a second inverter of the 4T latched circuit. The another latched node, the Bit node, of the 4T latched circuit is connected or coupled to (i) the connected drains of P-MOS and N-MOS in the second inverter of the 4T latched circuit; (ii) the connected gates of P-MOS and N-MOS in the first inverter of the 4T latched circuit. A Set-bar P-MOS transistor is connected to the S node of the F-MIM, and a Set N-MOS transistor is connected to the S node of the S-MIM. In the programming or write process, the gate of the Set-bar P-MOS is connected or coupled to a low operation or ground voltage ($V_{ss}$), and the gate of the Set N-MOS is connected or coupled to a high operation voltage ($V_{cc}$), with the common sources of P-MOS's and N-MOS's in the 4T latched circuit disconnected. When the source of the Set-Bar P-MOS is connected or coupled to the programming voltage ($V_P$), and the source of the Set N-MOS is connected or coupled to the low operation or ground voltage ($V_{ss}$), F-MIM is at the HR state, and the S-MIM is at the LR state, the Bit-bar is at "0", and the Bit node is at "1". When the source of the Set-bar P-MOS is connected or coupled to the low operation or ground voltage ($V_{ss}$), and the source of the Set N-MOS is connected or coupled to the programming voltage ($V_P$), F-MIM is at the LR state, and the S-MIM is at the HR state, the Bit-bar is at "1", and the Bit node is at "0".

The LRRAM provides correction, recovery capability when the device or the FPGA IC chip is turned on, to prevent data errors caused by the charge leakage during the time when the device or the FPGA chip is turn off. The data stored in the Bit-bar and Bit are recovered to the correct states after the initiation process. In the initiation process after the device or the FPGA IC chip is turned on: (i) the gate of the Set-bar P-MOS is connected or coupled to a low operation or ground voltage ($V_{cc}$), and the gate of the Set N-MOS is connected or coupled to a high operation voltage ($V_{cc}$); the source of the Set-bar P-MOS is connected or coupled to the high operation voltage ($V_{cc}$), and the source of the Set N-MOS is connected or coupled to the low operation or ground voltage ($V_{ss}$), (ii) the common sources of P-MOS's in the 4T latched circuit is connected or coupled to the high operation voltage ($V_{cc}$), and the common sources of N-MOS's in the 4T latched circuit is connected or coupled to the low operation or ground voltage ($V_{ss}$). After the initiation process, the data stored in the Bit-bar and Bit nodes are recovered to the correct states. In the read operation process, the information stored in the non-volatile RRAM cells or the MIMs may be read. In the read operation process: (i) the gate of the Set-bar P-MOS is connected or coupled to a high operation voltage ($V_{cc}$), and the gate of the Set N-MOS is connected or coupled to a low operation or ground voltage ($V_{ss}$); the source of the Set-bar P-MOS and the source of the Set N-MOS may be disconnected, (ii) the common sources of P-MOS's in the 4T latched circuit is connected or coupled to the high operation voltage ($V_{cc}$), and the common sources of N-MOS's in the 4T latched circuit is connected or coupled to the low operation voltage ($V_{ss}$). The Bit and/or Bit-bar data of the LRRAM are used for programming the interconnection in the FPGA IC chips, or for the data storage in the LUTs.

Another aspect of the disclosure provides a standard commodity FPGA IC chip for use in the standard commodity logic drive. The standard commodity FPGA chip comprises logic blocks. The logic blocks comprise (i) logic gate arrays comprising Boolean logic operators, for example, NAND, NOR, AND, and/or OR circuits; (ii) registers or shift registers; (iii) computing units comprising, for examples, adder, multiplication, and/or division circuits; (iv) Look-Up-Tables (LUTs) and multiplexers. Alternatively, the Boolean operators, the functions of logic gates, or a certain computing, operation or process may be carried out using, for example, Look-Up-Tables (LUTs) and/or multiplexers. The LUTs store or memorize the processing or computing results of logic gates, computing results of calculations, decisions of decision-making processes, or results of operations, events or activities. The LUTs comprise memory cells for storing or memorizing data or results in, for example, the FGCMOS NVM cells, the MRAM cells or the RRAM cells, wherein the FGCMOS NVM cells comprise FGCMOS NVM cells or latched FGCMOS cells as described and specified above; the MRAM cells comprise MRAM cells, Complementary MRAM (CMRAM) cells or latched MRAM (LMRAM) cells, as described and specified above; the RRAM cells comprise RRAM cells, Complementary RRAM (CRRAM) cells or latched RRAM (LRRAM) cells, as described and specified above. The FGCMOS NVM cells, the MRAM cells or the RRAM cells may be distributed over all locations in the FPGA chip, and are nearby or close to their corresponding multiplexers in the logic blocks. Alternatively, the FGCMOS NVM cells, the MRAM cells or the RRAM cells may be located in a FGCMOS NVM, MRAM or RRAM cell array, in a certain area or location of the FPGA chip; wherein the FGCMOS NVM, MRAM or RRAM cell array aggregates or comprises multiple of the FGCMOS NVM, MRAM or RRAM cells of LUTs for the selection multiplexers in logic blocks in the distributed locations. Alternatively, the FGCMOS NVM, MRAM or RRAM cells may be located in one of multiple FGCMOS NVM, MRAM or RRAM cell arrays, in multiple certain areas of the FPGA chip; each of the FGCMOS NVM, MRAM or RRAM cell arrays aggregates or comprises multiple of the FGCMOS NVM, MRAM or RRAM cells of LUTs for the selection multiplexers in logic blocks in the distributed locations. The data stored in each of FGCMOS NVM, MRAM or RRAM cells are input to the multiplexer for selection. The output of the FGCMOS NVM, MRAM or RRAM cell is connected or coupled to the multiplexer. The stored data in the FGCMOS NVM, MRAM or RRAM cell is used for LUTs. When inputting a set of instruction or control data, requests or conditions, a multiplexer is using the control or instruction data to select the corresponding data (or results) stored or memorized in the LUTs, based on the inputted set of control or instructing data, requests or conditions. As an example, a 4-input NAND gate may be implemented using an operator comprising LUTs and multiplexers as described below: There are 4 inputs for a 4-input NAND gate, and 16 ($2^4$) possible corresponding outputs (results) of the 4-input NAND gate. To carry out the same function of the 4-input NAND operation using LUTs and multiplexers, it may require circuits comprising: (i) a LUT for storing and memorizing the 16 possible corresponding outputs (results), (ii) a multiplexer designed and used for selecting the right (corresponding) output, based on a given 4-input control or instruction data set (for example, 1, 0, 0, 1); that is there are 16 input data (the memory stored data) and 4 control or instruction data for the multiplexer. An output is selected by the multiplexer from the 16 stored data based on 4 control or instruction data. In general, for a LUT and a multiplexer to carry out the same function as an operator NAND comprises n inputs, the LUT may be storing or memorizing $2^n$ corresponding data or results, and using the multiplexer to select a right (corresponding) output from the memorized $2^n$ corresponding data or results based on a given n-input control or instruction data set. The memorized $2^n$ corresponding data or results are memorized or stored in the $2^n$ memory cells, for example, $2^n$ memory cells of the FGCMOS NVM, MRAM or RRAM cells.

The programmable interconnections of the standard commodity FPGA chip comprise cross-point switches, each in the middle of interconnection metal lines or traces. For example, n metal lines or traces are connected to the input terminals of a cross-point switch, and m metal lines or traces are connected to the output terminals of the cross-point switch, and the cross-point switch is located between the n metal lines or traces and the m metal lines and traces. The cross-point switch is designed such that each of the n metal lines or traces may be programed to connect to anyone of the m metal lines or traces. The cross-point switch may comprise, for example, a pass/no-pass circuit comprising a n-type and a p-type transistor, in pair, wherein one of the n metal lines or traces are connected to the source terminal of the n-type and p-type transistor pairs in the pass-no-pass circuit, while one of the m metal lines and traces are connected to the drain terminal of the n-type and p-type transistor pairs in the pass-no-pass circuit. The connection or disconnection (pass or no pass) of the cross-point switch is controlled by the data (0 or 1) stored in a FGCMOS NVM, MRAM or RRAM cell. The FGCMOS NVM cells, the MRAM cells or the RRAM cells are as described and specified above, wherein the FGCMOS NVM cells comprise FGCMOS NVM cells or latched FGCMOS cells as described and specified above; the MRAM cells comprise MRAM cells, Complementary MRAM (CMRAM) cells or latched MRAM (LMRAM) cells, as described and specified above; the RRAM cells comprise RRAM cells, Complementary RRAM (CRRAM) cells or latched RRAM (LRRAM) cells, as described and specified above. The FGCMOS NVM, MRAM or RRAM cell may be distributed over all locations in the FPGA chip, and is nearby or close to the corresponding switch. Alternatively, the FGCMOS NVM, MRAM or RRAM cell may be located in a FGCMOS NVM, MRAM or RRAM cell array, in a certain area or location of the FPGA chip; wherein the FGCMOS NVM, MRAM or RRAM cell array aggregates or comprises multiple of the FGCMOS NVM, MRAM or RRAM cells for controlling their corresponding cross-point switches in the distributed locations. Alternatively, the FGCMOS NVM, MRAM or RRAM cell may be located in one of multiple FGCMOS NVM, MRAM or RRAM cell arrays in multiple certain areas or locations of the FPGA chip; each of the FGCMOS NVM, MRAM or RRAM cell arrays aggregates or comprises multiple of the FGCMOS NVM, MRAM or RRAM cells for controlling cross-point switches in the distributed locations. The (control) gates of both n-type and p-type transistors in the cross-point switch are connected or coupled to the output (Bit) and its inverse (Bit-bar), respectively, of the FGCMOS NVM, MRAM or RRAM cell. The output (Bit) of the FGCMOS NVM, MRAM or RRAM cell are connected or coupled to the gate of the n-type transistor in the pass-no-pass switch circuit and the output (Bit) of the FGCMOS NVM, MRAM or RRAM cell is connected or coupled to the gate of the p-type transistor in the pass-no-pass switch circuit with an inverter in between. The stored (programming) data in the FGCMOS NVM, MRAM or RRAM cell is used to program the connection or not-connection of the two metal lines or traces connected to the terminals of the cross-point switch. When the data stored in the FGCMOS NVM, MRAM or RRAM cell is programmed at 1, the output (Bit) of 1 is connected to the gate of the n-type transistor, and its inverse 0 (Bit-bar) is connected to the gate of the p-type transistor; therefore, the pass/no-pass circuit is on, and the two metal lines or traces connected to the two terminals of the pass-no-pass switch circuit are connected. While the data stored in the FGCMOS NVM, MRAM or RRAM cell is programmed at 0, its output (Bit) of 0 is connected to the gate of the n-type transistor, and its inverse 1 (Bit-bar) is connected to the gate of the p-type transistor; therefore, the pass/no-pass switch circuit is off, and the two metal lines or traces connected to the two terminals of the pass/no-pass switch circuit are dis-connected. Since the standard commodity FPGA IC chip comprises mainly the regular and repeated gate arrays or blocks, LUTs and multiplexers, or programmable interconnection, just like standard commodity DRAM, or NAND flash IC chips, the manufacturing yield may be very high, for example, greater than 80%, 90% or 95% for a chip area greater than, for example, 50 $mm^2$.

Alternatively, each of the cross-point switches may comprise, for example, a pass/no-pass circuit comprising a two-stages of inverters (buffer) wherein one of the n metal lines or traces is connected to the common gate terminal of input-stage of buffer in the pass-no-pass circuit, while one of the m metal lines and traces is connected to the common drain terminal of output-stage of buffer in the pass-no-pass circuit. The output-stage inverter is stacked with a control P-MOS at the top (between $V_{cc}$ and the source of the P-MOS of the output-stage inverter) and a control N-MOS at the bottom (between $V_{ss}$ and the source of the N-MOS of the output-stage inverter). The connection or disconnection (pass or no pass) of the cross-point switch is controlled by the data (0 or 1) stored in a FGCMOS NVM, MRAM or RRAM cell. The FGCMOS NVM, MRAM or RRAM cells may be distributed over all locations in the FPGA chip, and each of the FGCMOS NVM, MRAM or RRAM cells is nearby or close to its corresponding cross-point switch. Alternatively, the FGCMOS NVM, MRAM or RRAM cell may be located in a FGCMOS NVM, MRAM or RRAM cell array, in a certain area or location of the FPGA chip; wherein the FGCMOS NVM, MRAM or RRAM cell array aggregates or comprises multiple of the FGCMOS NVM, MRAM or RRAM cells for controlling their corresponding cross-point switches in the distributed locations. Alternatively, the FGCMOS NVM, MRAM or RRAM cell may be located in one of multiple FGCMOS NVM, MRAM or RRAM cell arrays, in multiple certain areas or locations of the FPGA chip; each of the FGCMOS NVM, MRAM or RRAM cell arrays aggregates or comprises multiple of the FGCMOS NVM, MRAM or RRAM cells for controlling their cross-point switches in the distributed locations. The gates of both control N-MOS and the control P-MOS transistors in the cross-point switch are connected or coupled to the output (Bit) and its inverse (Bit-bar), respectively, of the FGCMOS NVM, MRAM or RRAM cell. The output (Bit) of the FGCMOS NVM, MRAM or RRAM cell is connected or coupled to the gate of the control N-MOS transistor in the pass-no-pass switch circuit and the output (Bit) of the FGCMOS NVM, MRAM or RRAM cell is connected or coupled to the gate of the control P-MOS transistor in the pass-no-pass switch circuit with an inverter in between. The stored (programming) data in the FGCMOS NVM, MRAM or RRAM cell is used to program the connection or not-connection of the two metal lines or traces connected to the terminals of the cross-point switch. When the data stored in the FGCMOS NVM, MRAM or RRAM cell is programmed at 1, the output (Bit) of 1 is connected to the gate of the control N-MOS transistor, and its inverse 0 is connected to the gate of the control P-MOS transistor; therefore, the pass/no-pass circuit passes the data from input to the output. In other words, the two metal lines or traces connected to the two terminals of the pass-no-pass switch circuit are (virtually) connected. While the data stored in the FGCMOS NVM, MRAM or RRAM cell is programmed at 0, the output (Bit) of 0 is connected to the gate of the control N-MOS transistor, and its inverse 1 is connected to the gate of the control P-MOS transistor; therefore, both the control N-MOS and control P-MOS transistors are off. The data cannot be transferred from the input to the output, and the two metal lines or traces connected to the two terminals of the pass/no-pass switch circuit are dis-connected.

Alternatively, the cross-point switches may comprise, for example, multiplexers and switch buffers. A multiplexer of a cross-point switch selects one of the n inputting data from the n inputting metal lines based on the data stored in the FGCMOS NVM, MRAM or RRAM cells; and outputs the selected one of inputs to a switch buffer. The switch buffer passes or does not pass the output data from the multiplexer to one metal line connected to the output of the switch buffer based on the data stored in the FGCMOS NVM, MRAM or RRAM cells. The switch buffer comprises a two-stages of inverters (buffer) wherein the selected data from the multiplexer is connected to the common gate terminal of input-stage of the buffer, while said one metal line or trace is connected to the common drain terminal of output-stage of the buffer. The output-stage inverter is stacked with a control P-MOS at the top (between Vcc and the source of the P-MOS of the output-stage inverter) and a control N-MOS at the bottom (between $V_{ss}$ and the source of the N-MOS of the output-stage inverter). The connection or disconnection of the switch buffer is controlled by the data (0 or 1) stored in a FGCMOS NVM, MRAM or RRAM cell. The output (Bit) of the FGCMOS NVM, MRAM or RRAM cell is connected or coupled to the gate of the control N-MOS transistor in the switch buffer circuit, and is also connected or coupled to the gate of the control P-MOS transistor in the switch buffer circuit with an inverter in between. For example, two metal lines A and B are crossed at a point, and segmenting metal line A into two segments, $A_1$ and $A_2$, and metal line B into two segments, $B_1$ and $B_2$. The cross-point switch is located at the cross point. The cross-point switches comprise 4 pairs of multiplexers and switch buffers. Each of the multiplexer has 3 inputs and 1 output, that is, each multiplexer selects one from the 3 inputs as the output, based on 2 bits of data stored in 2 FGCMOS NVM, MRAM or RRAM cells. Each of the switch buffers receives the output data from the corresponding multiplexer and decides to pass or not to pass the selected data, based on the $3^{rd}$ bit of data stored in the $3^{rd}$ FGCMOS NVM, MRAM or RRAM cell. The cross-point switch is located between segments $A_1$, $A_2$, $B_1$ and $B_2$, and comprises 4 pairs of multiplexers/switch buffers: (1) The 3 inputs of a first multiplexer may be $A_1$, $B_1$ and $B_2$. If the 2 bits stored in the FGCMOS NVM, MRAM or RRAM cells are 0 and 0 for the multiplexer, the $A_1$ segment is selected by the first multiplexer. The $A_1$ segment is connected to the input of a first switch buffer. If the data bit stored in the FGCMOS NVM, MRAM or RRAM cell is 1 for the first switch buffer, the data of $A_1$ segment is passing to the $A_2$ segment. If the data bit stored in the FGCMOS NVM, MRAM or RRAM cell is 0 for the first switch buffer, the data of $A_1$ segment is not passing to the $A_2$ segment. If the 2 bits stored in the FGCMOS NVM, MRAM or RRAM cells are 1 and 0 for the first multiplexer, the $B_1$ segment is selected by the first multiplexer. The $B_1$ segment is connected to the input of the first switch buffer. If the data bit stored in the FGCMOS NVM, MRAM or RRAM cell is 1 for the first switch buffer, the data of $B_1$ segment is passing to the $A_2$ segment. If the data bit stored in the FGCMOS NVM, MRAM or RRAM cell is 0 for the first switch buffer, the data of $B_1$ segment is not passing to the $A_2$ segment. If the 2 bits stored in the FGCMOS NVM, MRAM or RRAM cells are 0 and 1 for the first multiplexer, the $B_2$ segment is selected by the first multiplexer. The $B_2$ segment is connected to the input of the first switch buffer. If the data bit stored in the FGCMOS NVM, MRAM or RRAM cell is 1 for the first switch buffer, the data of $B_2$ segment is passing to the $A_2$ segment. If the data bit stored in the FGCMOS NVM, MRAM or RRAM cell is 0 for the first switch buffer, the data of $B_2$ segment is not passing to the $A_2$ segment. (2) The 3 inputs of a second multiplexer may be $A_2$, $B_1$ and $B_2$. If the 2 bits stored in the FGCMOS NVM, MRAM or RRAM cells are 0 and 0 for the second multiplexer, the $A_2$ segment is selected by the second multiplexer. The $A_2$ segment is connected to the input of a second switch buffer. If the data bit stored in the FGCMOS NVM, MRAM or RRAM cell is 1 for the second switch buffer, the data of $A_2$ segment is passing to the $A_1$ segment. If the data bit stored in the FGCMOS NVM, MRAM or RRAM cell is 0 for the second switch buffer, the data of $A_2$ segment is not passing to the $A_1$ metal segment. If the 2 bits stored in the FGCMOS NVM, MRAM or RRAM, MRAM or RRAM cells are 1 and 0 for the second multiplexer, the $B_1$ segment is selected by the second multiplexer. The $B_1$ segment is connected to the input of the second switch buffer. If the data bit stored in the FGCMOS NVM, MRAM or RRAM cell is 1 for the second switch buffer, the data of $B_1$ segment is passing to the $A_1$ segment. If the data bit stored in the FGCMOS NVM, MRAM or RRAM cell is 0 for the second switch buffer, the data of $B_1$ segment is not passing to the $A_1$ metal segment. If the 2 bits stored in the FGCMOS NVM, MRAM or RRAM cells are 0 and 1 for the second multiplexer, the $B_2$ segment is selected by the second multiplexer. The $B_2$ segment is connected to the input of the second switch buffer. If the data bit stored in the FGCMOS NVM, MRAM or RRAM cell is 1 for the second switch buffer, the data of $B_2$ segment is passing to the $A_1$ segment. If the data bit stored in the FGCMOS NVM, MRAM or RRAM cell is 0 for the second switch buffer, the data of $B_2$ segment is not passing to the $A_1$ metal segment. (3) The 3 inputs of a third multiplexer may be $A_1$, $A_2$ and $B_2$. If the 2 bits stored in the FGCMOS NVM, MRAM or RRAM cells are 0 and 0 for the third multiplexer, the $A_1$ segment is selected by the third multiplexer. The $A_1$ segment is connected to the input of a third switch buffer. If the data bit stored in the FGCMOS NVM, MRAM or RRAM cell is 1 for the third switch buffer, the data of $A_1$ segment is passing to the $B_1$ segment. If the data bit stored in the FGCMOS NVM, MRAM or RRAM cell is 0 for the third switch buffer, the data of $A_1$ segment is not passing to the $B_1$ segment. If the 2 bits stored in the FGCMOS NVM, MRAM or RRAM cells are 1 and 0 for the third multiplexer, the $A_2$ segment is selected by the third multiplexer. The $A_2$ segment is connected to the input of the third switch buffer. If the data bit stored in the FGCMOS NVM, MRAM or RRAM cell is 1 for the third switch buffer, the data of $A_2$ segment is passing to the $B_1$ segment. If the data bit stored in the FGCMOS NVM, MRAM or RRAM cell is 0 for the third switch buffer, the data of $A_2$ segment is not passing to the $B_1$ segment. If the 2 bits stored in the FGCMOS NVM, MRAM or RRAM cells are 0 and 1 for the third multiplexer, the $B_2$ segment is selected by the third multiplexer. The $B_2$ segment is connected to the input of the third switch buffer. If the data bit stored in the FGCMOS NVM, MRAM or RRAM cell is 1 for the third switch buffer, the data of $B_2$ segment is passing to the $B_1$ segment. If the data bit stored in the FGCMOS NVM, MRAM or RRAM cell is 0 for the third switch buffer, the data of $B_2$ segment is not passing to the $B_1$ segment. (4) The 3 inputs of a fourth multiplexer may be $A_1$, $A_2$ and $B_1$. If the 2 bits stored in the FGCMOS NVM, MRAM or RRAM cells are 0 and 0 for the fourth multiplexer, the $A_1$ segment is selected by the fourth multiplexer. The $A_1$ segment is connected to the input of a fourth switch buffer. If the data bit stored in the FGCMOS NVM, MRAM or RRAM cell is 1 for the fourth switch buffer, the data of $A_1$ segment is passing to the $B_2$ segment. If the data bit stored in the FGCMOS NVM, MRAM or RRAM cell is 0 for the fourth switch buffer, the data of $A_1$ segment is not passing to the $B_2$ segment. If the 2 bits stored in the FGCMOS NVM, MRAM or RRAM cells are 1 and 0 for the fourth multiplexer, the $A_2$ segment is selected by the fourth multiplexer. The $A_2$ segment is connected to the input of the fourth switch buffer. If the data bit stored in the FGCMOS NVM, MRAM or RRAM cell is 1 for the fourth switch buffer, the data of $A_2$ segment is passing to the $B_2$ segment. If the data bit stored in the FGCMOS NVM, MRAM or RRAM cell is 0 for the fourth switch buffer, the data of $A_2$ segment is not passing to the $B_2$ segment. If the 2 bits stored in the FGCMOS NVM, MRAM or RRAM cells are 0 and 1 for the fourth multiplexer, the $B_1$ segment is selected by the fourth multiplexer. The $B_1$ segment is connected to the input of the fourth switch buffer. If the data bit stored in the FGCMOS NVM, MRAM or RRAM cell is 1 for the fourth switch buffer, the data of $B_1$ segment is passing to the $B_2$ segment. If the data bit stored in the FGCMOS NVM, MRAM or RRAM cell is 0 for the fourth switch buffer, the data of $B_1$ segment is not passing to the $B_2$ segment. In this case, the cross-point switch is bi-directional; there are 4 pairs of multiplexers/switch buffers, each pair of the multiplexers/switch buffers is controlled by 3 bits of the FGCMOS NVM, MRAM or RRAM cells. Totally, 12 bits of the FGCMOS NVM, MRAM or RRAM cells are required for the cross-point switch. The FGCMOS NVM, MRAM or RRAM cells may be distributed over all locations in the FPGA chip, and each of the FGCMOS NVM, MRAM or RRAM cells is nearby or close to its corresponding multiplexers and/or switch buffers. Alternatively, the FGCMOS NVM, MRAM or RRAM cell may be located in a FGCMOS NVM, MRAM or RRAM cell array, in a certain area or location of the FPGA chip; wherein the FGCMOS NVM, MRAM or RRAM cell array aggregates or comprises multiple of the FGCMOS NVM, MRAM or RRAM cells for controlling their corresponding multiplexers and/or switch buffers of the cross-point switches in the distributed locations. Alternatively, the FGCMOS NVM, MRAM or RRAM cell may be located in one of multiple FGCMOS NVM, MRAM or RRAM cell arrays, in multiple certain areas or locations of the FPGA chip; each of the FGCMOS NVM, MRAM or RRAM cell arrays aggregates or comprises multiple of the FGCMOS NVM, MRAM or RRAM cells for controlling multiplexers and/or switch buffers of the cross-point switches in the distributed locations.

The programmable interconnections of the standard commodity FPGA chip comprise a multiplexer in the middle of interconnection metal lines or traces. The multiplexer selects from n metal interconnection lines connected to the n inputs of the multiplexer, and coupled or connected to one metal interconnection line connected to the output of the multiplexer, based on the data stored or programmed in the FGCMOS NVM, MRAM or RRAM cells. For example, n=16, 4 bits of the FGCMOS NVM, MRAM or RRAM cells are required to select any one of the 16 metal interconnection lines connected to the 16 inputs of the multiplexer, and couple or connect the selected one to one metal interconnection line connected to the output of the multiplexer. The data from the selected one of 16 inputs is therefore coupled, passed, or connected to the metal line connected to the output of the multiplexer.

Another aspect of the disclosure provides the standard commodity logic drive in a multi-chip package comprising the standard commodity plural FPGA IC chips, for use in different algorithms, architectures and/or applications requiring logic, computing and/or processing functions by field programming, wherein the standard commodity plural FPGA IC chips, each is in a bare-die format or in a single-chip or multi-chip package. Each of standard commodity plural FPGA IC chips may have standard common features, counts or specifications: (1) logic blocks including (i) system gates with the count greater than or equal to 2M, 10M, 20M, 50M or 100M, (ii) logic cells or elements with the count greater than or equal to 64K, 128K, 512K, 1M, 4M or 8M, (iii) hard macros, for example DSP slices, microcontroller macros, multiplexer macros, fixed-wired adders, and/or fixed-wired multipliers and/or (iv) blocks of memory with the bit count equal to or greater than 1M, 10M, 50M, 100M, 200M or 500M bits; (2) the number of inputs to each of the logic blocks or operators: the number of inputs to each of the logic block or operator may be greater or equal to 4, 8, 16, 32, 64, 128, or 256; (3) the power supply voltage: the voltage may be between 0.1V and 2.5V, 0.1V and 2V, 0.1V and 1.5V or 0.1V and 1V; (4) the I/O pads, in terms of layout, location, number and function. Since the FPGA chips are standard commodity IC chips, the number of FPGA chip designs or products is reduced to a small number, therefore, the expensive photo masks or mask sets for fabricating the FPGA chips using advanced semiconductor nodes or generations are reduced to a few mask sets. For example, reduced down to between 3 and 20 mask sets, 3 and 10 mask sets, or 3 and 5 mask sets for a specific technology node or generation. The NRE and production expenses are therefore greatly reduced. With the few designs and products, the manufacturing processes may be tuned or optimized for the few chip designs or products, and resulting in very high manufacturing chip yields. This is similar to the current advanced standard commodity DRAM or NAND flash memory design and production. Furthermore, the chip inventory management becomes easy, efficient and effective; therefore, resulting in a shorter FPGA chip delivery time and becoming very cost-effective.

Another aspect of the disclosure provides the standard commodity logic drive in a multi-chip package comprising the plural standard commodity FPGA IC chips for use in different algorithms, architectures and/or applications requiring logic, computing and/or processing functions by field programming, wherein the plural standard commodity FPGA IC chips, each is in a bare-die format or in a single-chip or multi-chip package. Each of the plural standard commodity FPGA IC chips may have standard common features or specifications as described and specified above. Similar to the standard DRAM IC chips for use in a DRAM module, the standard commodity FPGA IC chips, each chip may further comprise some additional (common, standard) I/O pins or pads, for example: (1) one chip enable pin, (2) one input enable pin, (3) one output enable pin, (4) two input selection pins and/or (5) two output selection pins. Each of the plural standard commodity FPGA IC chips may comprise as a standard I/O ports, for example, 4 I/O ports, and each I/O port may comprise 64 bi-directional I/O circuits.

Another aspect of the disclosure provides the standard commodity logic drive in a multi-chip package comprising plural standard commodity FPGA IC chips, for use in different algorithms, architectures and/or applications requiring logic, computing and/or processing functions by field programming, wherein the plural standard commodity FPGA IC chips, each is in a bare-die format or in a single-chip or multi-chip package format. The standard commodity logic drive may have standard common features, counts or specifications: (1) logic blocks including (i) system gates with the count greater than or equal to 8M, 40M, 80M, 200M or 400M, (ii) logic cells or elements with the count greater than or equal to 256K, 512K, 2M, 4M, 16M or 32M, (iii) hard macros, for example DSP slices, microcontroller macros, multiplexer macros, fixed-wired adders, and/or fixed-wired multipliers and/or (iv) blocks of memory with the bit count equal to or greater than 4M, 40M, 200M, 400M, 800M or 2G bits; (2) the power supply voltage: the voltage may be between 0.1V and 12V, 0.1V and 7V, 0.1V and 3V, 0.1V and 2V, 0.1V and 1.5V, or 0.1V and 1V; (3) the I/O pads in the multi-chip package of the standard commodity logic drive, in terms of layout, location, number and function; wherein the logic drive may comprise the I/O pads, metal pillars or bumps connecting or coupling to one or multiple (2, 3, 4, or more than 4) Universal Serial Bus (USB) ports, one or more IEEE 1394 ports, one or more Ethernet ports, one or more audio ports or serial ports, for example, RS-232 or COM (communication) ports, wireless transceiver I/Os, and/or Bluetooth transceiver I/Os, and etc. The logic drive may also comprise the I/O pads, metal pillars or bumps connecting or coupling to Serial Advanced Technology Attachment (SATA) ports, or Peripheral Components Interconnect express (PCIe) ports for communicating, connecting or coupling with the memory drive. Since the logic drives are standard commodity products, the product inventory management becomes easy, efficient and effective, therefore resulting in a shorter logic drive delivery time and becoming cost-effective.

Another aspect of the disclosure provides the standard commodity logic drive in a multi-chip package further comprising a dedicated control chip. The dedicated control chip is designed, implemented and fabricated using varieties of semiconductor technology nodes or generations, including old or matured technology nodes or generations, for example, less advanced than or equal to, or more mature than 20 nm or 30 nm, and for example using the technology node of 22 nm, 28 nm, 40 nm, 90 nm, 130 nm, 180 nm, 250 nm, 350 nm or 500 nm. The semiconductor technology node or generation used in the dedicated control chip is 1, 2, 3, 4, 5 or greater than 5 nodes or generations older, more matured or less advanced than that used in the standard commodity FPGA IC chips packaged in the same logic drive. Transistors used in the dedicated control chip may be a FINFET, a Fully Depleted Silicon-on-insulator (FDSOI) MOSFET, a Partially Depleted Silicon-on-insulator (PDSOI) MOSFET or a conventional MOSFET. Transistors used in the dedicated control chip may be different from that used in the standard commodity FPGA IC chips packaged in the same logic drive; for example, the dedicated control chip may use the conventional MOSFET, while the standard commodity FPGA IC chips packaged in the same logic drive may use the FINFET; or the dedicated control chip may use the Fully Depleted Silicon-on-insulator (FDSOI) MOSFET, while the standard commodity FPGA IC chips packaged in the same logic drive may use the FINFET. The dedicated control chip provides control functions of: (1) downloading programing codes from outside (of the logic drive) to the FGCMOS NVM, MRAM or RRAM cells of the programmable interconnection or LUTs on the standard commodity FPGA chips. Alternatively, the programming codes from outside of the logic drive may go through a buffer or driver in or of the dedicated control chip before getting into the FGCMOS NVM, MRAM or RRAM cells of the programmable interconnection or LUTs on the standard commodity FPGA chips. The buffer in or of the dedicated control chip may latch the data from the outside of the logic drive and increase the bit-width of the data. For example, the data bit-width (in a SATA standard) from the outside of the logic drive is 1 bit, the buffer may latch the 1 bit data in each of the multiple SRAM cells in the buffer, and output the data stored or latched in the multiple SRAM cells in parallel and simultaneously to increase the data bit-width; for example, equal to or greater than 4, 8, 16, 32, or 64 data bit-width. For another example, the data bit-width (in a PCIe standard) from the outside of the logic drive is 32 bit, the buffer may increase the data bit-width to equal to or greater than 64, 128, or 256 data bit-width. The driver in or of the dedicated control chip may amplify the data signals from the outside of the logic drive; (2) inputting/outputting signals for a user's algorithm, architecture and/or application; (3) power management.

Another aspect of the disclosure provides the standard commodity logic drive in a multi-chip package further comprising a dedicated I/O chip. The dedicated I/O chip is designed, implemented and fabricated using varieties of semiconductor technology nodes or generations, including old or matured technology nodes or generations, for example, a semiconductor node or generation less advanced than or equal to, or more mature than 20 nm or 30 nm, and for example using the technology node of 22 nm, 28 nm, 40 nm, 90 nm, 130 nm, 180 nm, 250 nm, 350 nm or 500 nm. The semiconductor technology node or generation used in the dedicated I/O chip is 1, 2, 3, 4, 5 or greater than 5 nodes or generations older, more matured or less advanced than that used in the standard commodity FPGA IC chips packaged in the same logic drive. Transistors used in the dedicated I/O chip may be a Fully Depleted Silicon-on-insulator (FDSOI) MOSFET, a Partially Depleted Silicon-on-insulator (PDSOI) MOSFET or a conventional MOSFET. Transistors used in the dedicated I/O chip may be different from that used in the standard commodity FPGA IC chips packaged in the same logic drive; for example, the dedicated I/O chip may use the conventional MOSFET, while the standard commodity FPGA IC chips packaged in the same logic drive may use the FINFET; or the dedicated I/O chip may use the Fully Depleted Silicon-on-insulator (FDSOI) MOSFET, while the standard commodity FPGA IC chips packaged in the same logic drive may use the FINFET. The power supply voltage used in the dedicated I/O chip may be greater than or equal to 1.5V, 2.0 V, 2.5V, 3 V, 3.5V, 4V, or 5V, while the power supply voltage used in the standard commodity FPGA IC chips packaged in the same logic drive may be smaller than or equal to 2.5V, 2V, 1.8V, 1.5V, or 1 V. The power supply voltage used in the dedicated I/O chip may be different from that used in the standard commodity FPGA IC chips packaged in the same logic drive; for example, the dedicated I/O chip may use a power supply of 4V, while the standard commodity FPGA IC chips packaged in the same logic drive may use a power supply voltage of 1.5V; or the dedicated I/O chip may use a power supply of 2.5V, while the standard commodity FPGA IC chips packaged in the same logic drive may use a power supply of 0.75V. The gate oxide (physical) thickness of the FETs used in the dedicated I/O chip may be thicker than or equal to 5 nm, 6 nm, 7.5 nm, 10 nm, 12.5 nm, or 15 nm, while the gate oxide (physical) thickness of FETs used in the standard commodity FPGA IC chips packaged in the same logic drive may be thinner than 4.5 nm, 4 nm, 3 nm or 2 nm. The gate oxide (physical) thickness of FETs used in the dedicated I/O chip may be different from that used in the standard commodity FPGA IC chips packaged in the same logic drive; for example, the dedicated I/O chip may use a gate oxide (physical) thickness of FETs of 10 nm, while the standard commodity FPGA IC chips packaged in the same logic drive may use a gate oxide (physical) thickness of FETs of 3 nm; or the dedicated I/O chip may use a gate oxide (physical) thickness of FETs of 7.5 nm, while the standard commodity FPGA IC chips packaged in the same logic drive may use a gate oxide (physical) thickness of FETs of 2 nm. The dedicated I/O chip provides inputs and outputs, and ESD protection for the logic drive. The dedicated I/O chip provides (i) large drivers or receivers, or I/O circuits for communicating with external or outside (of the logic drive), and (ii) small drivers or receivers, or I/O circuits for communicating with chips in or of the logic drive. The large drivers or receivers, or I/O circuits for communicating with external or outside (of the logic drive) have driving capability, loading, output capacitance or input capacitance lager or bigger than that of the small drivers or receivers, or I/O circuits for communicating with chips in or of the logic drive. The driving capability, loading, output capacitance, or input capacitance of the large I/O drivers or receivers, or I/O circuits for communicating with external or outside (of the logic drive) may be between 3 pF and 100 pF, 3 pF and 30 pF, 3 pF and 15 pF, or 3 pF and 10 pF. The driving capability, loading, output capacitance, or input capacitance of the small I/O drivers or receivers, or I/O circuits for communicating with chips in or of the logic drive may be between 0.1 pF and 2 pF or 0.1 pF and 1 pF. The size of ESD protection device on the dedicated I/O chip is larger than that on other standard commodity FPGA IC chips in the same logic drive. The size of the ESD device in the large I/O circuits may be between 0.5 pF and 15 pF, 0.5 pF and 10 pF or 0.5 pF and 5 pF. For example, a bi-directional (or tri-state) I/O pad or circuit may be used for the large I/O drivers or receivers, or I/O circuits for communicating with external or outside (of the logic drive), and may comprise an ESD circuit, a receiver, and a driver, and may have an input capacitance or output capacitance between 3 pF and 100 pF, 3 pF and 30 pF, 3 pF and 15 pF, or 3 pF and 10 pF. For example, a bi-directional (or tri-state) I/O pad or circuit may be used for the small I/O drivers or receivers, or I/O circuits for communicating with chips in or of the logic drive, and may comprise an ESD circuit, a receiver, and a driver, and may have an input capacitance or output capacitance between 0.1 pF and 2 pF or 0.1 pF and 1 pF.

The dedicated I/O chip (or chips) in the multi-chip package of the standard commodity logic drive may comprise a buffer and/or driver circuits for downloading the programing codes from the outside of the logic drive to the FGCMOS NVM, MRAM or RRAM cells of the programmable interconnection or LUTs on the standard commodity FPGA chips. The programming codes from the outside of the logic drive may go through a buffer or driver in or of the dedicated I/O chip before getting into the FGCMOS NVM, MRAM or RRAM cells of the programmable interconnection or LUTs on the standard commodity FPGA chips. The buffer in or of the dedicated I/O chip may latch the data from the outside of the logic drive and increase the bit-width of the data. For example, the data bit-width (in a SATA standard) from the outside of the logic drive is 1 bit, the buffer may latch the 1 bit data in each of the multiple SRAM cells in the buffer, and output the data stored or latched in the multiple SRAM cells in parallel and simultaneously to increase the data bit-width; for example, equal to or greater than 4, 8, 16, 32, or 64 data bit-width. For another example, the data bit-width (in a PCIe standard) from the outside of the logic drive is 32 bit, the buffer may increase the data bit-width to equal to or greater than 64, 128, or 256 data bit-width. The driver in or of the dedicated I/O chip may amplify the data signals from the outside of the logic drive.

The dedicated I/O chip (or chips) in the multi-chip package of the standard commodity logic drive may comprise I/O circuits or pads (or micro copper pillars or bumps) for connecting or coupling to one or multiple (2, 3, 4, or more than 4) Universal Serial Bus (USB) ports, one or more IEEE 1394 ports, one or more Ethernet ports, one or more audio ports or serial ports, for example, RS-232 or COM (communication) ports, wireless transceiver I/Os, and/or Bluetooth transceiver I/Os, and etc. The dedicated I/O chip may also comprise I/O circuits or pads (or micro copper pillars or bumps) for connecting or coupling to Serial Advanced Technology Attachment (SATA) ports, or Peripheral Components Interconnect express (PCIe) ports for communicating, connecting or coupling with the memory drive.

Another aspect of the disclosure provides the standard commodity logic drive in a multi-chip package comprising the plural standard commodity FPGA IC chips, the dedicated I/O chip, and the dedicated control chip, for use in different algorithms, architectures and/or applications requiring logic, computing and/or processing functions by field programming. The dedicated I/O chip, and the dedicated control chip are as described and specified above. The communication between the chips of the logic drive and the communication between each chip of the logic drive and the external or outside (of the logic drive) are described as follows: (1) the dedicated I/O chip communicates directly with the other chip or chips of the logic drive, and also communicates directly with the external or outside (circuits) (of the logic drive). The dedicated I/O chip comprises two types of I/O circuits; one type having large driving capability, loading, output capacitance or input capacitance for communicating with the external or outside of the logic drive, and the other type having small driving capability, loading, output capacitance or input capacitance for communicating directly with the other chip or chips of the logic drive; (2) each of the plural FPGA IC chips only communicates directly with the other chip or chips of the logic drive, but does not communicate directly and/or does not communicate with the external or outside (of the logic drive); wherein an I/O circuit of one of the plural FPGA IC chips may communicate indirectly with the external or outside (of the logic drive) by going through an I/O circuit of the dedicated I/O chip; wherein the driving capability, loading, output capacitance or input capacitance of the I/O circuit of the dedicated I/O chip is significantly larger or bigger than that of the I/O circuit of the one of the plural FPGA IC chips, wherein the I/O circuit (for example, the input or output capacitance is smaller than 2 pF) of the one of the plural FPGA IC chips is connected or coupled to the large or big I/O circuit (for example, the input or output capacitance is larger than 3 pF) of the dedicated I/O chip for communicating with the external or outside circuits of the logic drive; (3) the dedicated control chip only communicates directly with the other chip or chips of the logic drive, but does not communicate directly and/or does not communicate with the external or outside (of the logic drive); wherein an I/O circuit of the dedicated control chip may communicate indirectly with the external or outside (of the logic drive) by going through an I/O circuit of the dedicated I/O chip; wherein the driving capability, loading, output capacitance or input capacitance of the I/O circuit of the dedicated I/O chip is significantly larger or bigger than that of the I/O circuit of the dedicated control chip. Alternatively, wherein the dedicated control chip may communicate directly with the other chip or chips of the logic drive, and may also communicate directly with the external or outside (of the logic drive). In the above, "Object X communicates directly with Object Y" means the Object X (for example, a first chip of the logic drive) communicates or couples electrically and directly with the Object Y without going through or passing through any other chip or chips of the logic drive. In the above, "Object X does not communicate directly with Object Y" means the Object X (for example, a first chip of or in the logic drive) does not communicate or couple electrically and directly with the Object Y without going through or passing through any other chip or chips of the logic drive, while the Object X may communicate or couple electrically but indirectly with the Object Y by going through or passing through any other chip or chips of the logic drive. "Object X does not communicate with Object Y" means the Object X (for example, a first chip of the logic drive) does not communicate or couple electrically and directly, and does not communicate or couple electrically and indirectly with the Object Y.

Another aspect of the disclosure provides the standard commodity logic drive in a multi-chip package further comprising a dedicated control and I/O chip. The dedicated control and I/O chip provides the functions of the dedicated control chip and the dedicated I/O chip, as described in the above paragraphs, in one chip. The dedicated control and I/O chip is designed, implemented and fabricated using varieties of semiconductor technology nodes or generations, including old or matured technology nodes or generations, for example, a semiconductor node or generation less advanced than or equal to, or more mature than 20 nm or 30 nm, and for example using the technology node of 22 nm, 28 nm, 40 nm, 90 nm, 130 nm, 180 nm, 250 nm, 350 nm or 500 nm. The semiconductor technology node or generation used in the dedicated control and I/O chip is 1, 2, 3, 4, 5 or greater than 5 nodes or generations older, more matured or less advanced than that used in the standard commodity FPGA IC chips packaged in the same logic drive. Transistors used in the dedicated control and I/O chip may be a FINFET, a Fully Depleted Silicon-on-insulator (FDSOI) MOSFET, a Partially Depleted Silicon-on-insulator (PDSOI) MOSFET or a conventional MOSFET. Transistors used in the dedicated control and I/O chip may be different from that used in the standard commodity FPGA IC chips packaged in the same logic drive; for example, the dedicated control and I/O chip may use the conventional MOSFET, while the standard commodity FPGA IC chips packaged in the same logic drive may use the FINFET; or the dedicated control and I/O chip may use the Fully Depleted Silicon-on-insulator (FDSOI) MOSFET, while the standard commodity FPGA IC chips packaged in the same logic drive may use the FINFET. The above-mentioned specification for the small I/O circuits, (i.e., small driver or receiver), and the large I/O circuits, (i.e., large driver or receiver), in the dedicated I/O chip may be applied to that in the dedicated control and I/O chip.

The communication between the chips of the logic drive and the communication between each chip of the logic drive and the external or outside (of the logic drive) are described as follows: (1) the dedicated control and I/O chip communicates directly with the other chip or chips of the logic drive, and also communicates directly with the external or outside (circuits) (of the logic drive); The dedicated control and I/O chip comprises two types of I/O circuits; one type having large driving capability, loading, output capacitance or input capacitance for communicating with the external or outside of the logic drive, and the other type having small driving capability, loading, output capacitance or input capacitance for communicating directly with the other chip or chips of the logic drive; (2) each of the plural FPGA IC chips only communicates directly with the other chip or chips of the logic drive, but does not communicate directly and/or does not communicate with the external or outside (of the logic drive); wherein an I/O circuit of one of the plural FPGA IC chips may communicate indirectly with the external or outside (of the logic drive) by going through an I/O circuit of the dedicated control and I/O chip; wherein the driving capability, loading, output capacitance or input capacitance of the I/O circuit of the dedicated control and I/O chip is significantly larger or bigger than that of the I/O circuit of the one of the plural FPGA IC chips. The wordings "Object X communicates directly with Object Y", "Object X does not communicate directly with Object Y", and "Object X does not communicate with Object Y" have the same meanings as defined in the previous paragraph.

Another aspect of the disclosure provides a development kit or tool for a user or developer to implement an innovation and/or an application using the standard commodity logic drive. The user or developer with innovation and/or application concept or idea may purchase the standard commodity logic drive and use the corresponding development kit or tool to develop or to write software codes or programs to load into the FGCMOS NVM, MRAM or RRAM cells of the standard commodity logic drive for implementing his/her innovation and/or application concept or idea.

Another aspect of the disclosure provides a logic drive in a multi-chip package format further comprising an Innovated ASIC or COT (abbreviated as IAC below) chip for Intellectual Property (IP) circuits, Application Specific (AS) circuits, analog circuits, mixed-mode signal circuits, Radio-Frequency (RF) circuits, and/or transmitter, receiver, transceiver circuits, etc. The IAC chip is designed, implemented and fabricated using varieties of semiconductor technology nodes or generations, including old or matured technology nodes or generations, for example, less advanced than or equal to, or more mature than 20 nm or 30 nm, and for example using the technology node of 22 nm, 28 nm, 40 nm, 90 nm, 130 nm, 180 nm, 250 nm, 350 nm or 500 nm. The semiconductor technology node or generation used in the IAC chip is 1, 2, 3, 4, 5 or greater than 5 nodes or generations older, more matured or less advanced than that used in the standard commodity FPGA IC chips packaged in the same logic drive. Transistors used in the IAC chip may be a FINFET, a Fully Depleted Silicon-on-insulator (FDSOI) MOSFET, a Partially Depleted Silicon-on-insulator (PDSOI) MOSFET or a conventional MOSFET. Transistors used in the IAC chip may be different from that used in the standard commodity FPGA IC chips packaged in the same logic drive; for example, the IAC chip may use the conventional MOSFET, while the standard commodity FPGA IC chips packaged in the same logic drive may use the FINFET;

or the IAC chip may use the Fully Depleted Silicon-on-insulator (FDSOI) MOSFET, while the standard commodity FPGA IC chips packaged in the same logic drive may use the FINFET. Since the IAC chip in this aspect of disclosure may be designed and fabricated using older or less advanced technology nodes or generations, for example, less advanced than or equal to, or more mature than, 20 nm or 30 nm, and for example using the technology node of 22 nm, 28 nm, 40 nm, 90 nm, 130 nm, 180 nm, 250 nm, 350 nm, or 500 nm, its NRE cost is cheaper than or less than that of the current or conventional ASIC or COT chip designed and fabricated using an advanced IC technology node or generation, for example, more advanced than or below 20 nm or 10 nm, and for example using the technology node of 16 nm, 14 nm, 12 nm, 10 nm, 7 nm, 5 nm or 3 nm. The NRE cost for designing a current or conventional ASIC or COT chip using an advanced IC technology node or generation, for example, more advanced than or below 20 nm or 10 nm, may be more than US $5M, US $10M, US $20M or even exceeding US $50M, or US $100M. The cost of a photo mask set for an ASIC or COT chip at the 16 nm technology node or generation is over US $2M, US $5M, or US $10M. Implementing the same or similar innovation and/or application using the logic drive including the IAC chip designed and fabricated using older or less advanced technology nodes or generations may reduce NRE cost down to less than US $10M, US $7M, US $5M, US $3M or US $1M. Compared to the implementation by developing the current conventional logic ASIC or COT IC chip, the NRE cost of developing the IAC chip for the same or similar innovation and/or application may be reduced by a factor of larger than 2, 5, 10, 20, or 30. The innovators therefor can cheaperly and easily implement their innovation by (i) designing the IAC chip using older and more mature technology nodes, for example, 40 nm or more mature than or equal to 20 nm; and (ii) using standard commodity FPGA IC chips packaged in a same logic drive, wherein the standard commodity FPGA IC chips are fabricated using advanced technology nodes, for example, 7 nm node, more advanced than 20 nm or more advanced than 7 nm.

Another aspect of the disclosure provides the logic drive in a multi-chip package format may comprises a dedicated control and IAC (abbreviated as DCIAC below) chip by combining the functions of the dedicated control chip and the IAC chip, as described in the above paragraphs, in one single chip. The DCIAC chip now comprises the control circuits, Intellectual Property (IP) circuits, Application Specific (AS) circuits, analog circuits, mixed-mode signal circuits, Radio-Frequency (RF) circuits, and/or transmitter, receiver, transceiver circuits, and etc. The DCIAC chip is designed, implemented and fabricated using varieties of semiconductor technology nodes or generations, including old or matured technology nodes or generations, for example, less advanced than or equal to, or more mature than 20 nm or 30 nm, and for example using the technology node of 22 nm, 28 nm, 40 nm, 90 nm, 130 nm, 180 nm, 250 nm, 350 nm or 500 nm. Alternatively, the advanced semiconductor technology nodes or generations, such as more advanced than or equal to, or below or equal to 20 nm or 10 nm, may be used for the DCIAC chip. The semiconductor technology node or generation used in the DCIAC chip is 1, 2, 3, 4, 5 or greater than 5 nodes or generations older, more matured or less advanced than that used in the standard commodity FPGA IC chips packaged in the same logic drive. Transistors used in the DCIAC chip may be a FINFET, a Fully Depleted Silicon-on-insulator (FDSOI) MOSFET, a Partially Depleted Silicon-on-insulator (PDSOI) MOSFET or a conventional MOSFET. Transistors used in the DCIAC chip may be different from that used in the standard commodity FPGA IC chips packaged in the same logic drive; for example, the DCIAC chip may use the conventional MOSFET, while the standard commodity FPGA IC chips packaged in the same logic drive may use the FINFET; or the DCIAC chip may use the Fully Depleted Silicon-on-insulator (FDSOI) MOSFET, while the standard commodity FPGA IC chips packaged in the same logic drive may use the FINFET. Since the DCIAC chip in this aspect of disclosure may be designed and fabricated using older or less advanced technology nodes or generations, for example, less advanced than or equal to, or more mature than 20 nm or 30 nm, and for example using the technology node of 22 nm, 28 nm, 40 nm, 90 nm, 130 nm, 180 nm, 250 nm, 350 nm or 500 nm, its NRE cost is cheaper than or less than that of the current or conventional ASIC or COT chip designed and fabricated using an advanced IC technology node or generation, for example, more advanced than or below 20 nm or 10 nm, and for example using the technology node of 16 nm, 14 nm, 12 nm, 10 nm, 7 nm, 5 nm or 3 nm. The NRE cost for designing a current or conventional ASIC or COT chip using an advanced IC technology node or generation, for example, more advanced than or below 20 nm or 10 nm, may be more than US $5M, US $10M, US $20M or even exceeding US $50M, or US $100M. The cost of a photo mask set for an ASIC or COT chip at the 16 nm technology node or generation is over US $2M, US $5M or US $10M. Implementing the same or similar innovation and/or application using the logic drive including the DCIAC chip designed and fabricated using older or less advanced technology nodes or generations, may reduce NRE cost down to less than US $10M, US $7M, US $5M, US $3M or US $1M. Compared to the implementation by developing a logic ASIC or COT IC chip, the NRE cost of developing the DCIAC chip for the same or similar innovation and/or application may be reduced by a factor of larger than 2, 5, 10, 20, or 30. The innovators therefor can cheaperly and easily implement their innovation by (i) designing the DCIAC chip using older and more mature technology nodes, for example, 40 nm or more mature than or equal to 20 nm; and (ii) using standard commodity FPGA IC chips packaged in a same logic drive, wherein the standard commodity FPGA IC chips are fabricated using advanced technology nodes, for example, 7 nm node, more advanced than 20 nm or more advanced than 7 nm.

Another aspect of the disclosure provides the logic drive in a multi-chip package further comprising a dedicated control, dedicated I/O, and IAC (abbreviated as DCDI/OIAC below) chip by combining the functions of the dedicated control chip, the dedicated I/O chip and the IAC chip, as described in the above paragraphs, in one single chip. The DCDI/OIAC chip comprises the control circuits, I/O circuits, Intellectual Property (IP) circuits, Application Specific (AS) circuits, analog circuits, mixed-mode signal circuits, Radio-Frequency (RF) circuits, and/or transmitter, receiver, transceiver circuits, and etc. The DCDI/OIAC chip is designed, implemented and fabricated using varieties of semiconductor technology nodes or generations, including old or matured technology nodes or generations, for example, less advanced than or equal to, or more mature than 20 nm or 30 nm, and for example using the technology node of 22 nm, 28 nm, 40 nm, 90 nm, 130 nm, 180 nm, 250 nm, 350 nm or 500 nm. The semiconductor technology node or generation used in the DCDI/OIAC chip is 1, 2, 3, 4, 5 or greater than 5 nodes or generations older, more matured or less advanced than that used in the standard commodity FPGA IC chips packaged in the same logic drive. Transistors used in the DCDI/OIAC chip may be a Fully Depleted Silicon-on-insulator (FDSOI) MOSFET, a Partially Depleted Silicon-on-insulator (PDSOI) MOSFET or a conventional MOSFET. Transistors used in the DCDI/OIAC chip may be different from that used in the standard commodity FPGA IC chips packaged in the same logic drive; for example, the DCDI/OIAC chip may use the conventional MOSFET, while the standard commodity FPGA IC chips packaged in the same logic drive may use the FINFET; or the DCDI/OIAC chip may use the Fully Depleted Silicon-on-insulator (FDSOI) MOSFET, while the standard commodity FPGA IC chips packaged in the same logic drive may use the FINFET. Since the DCDI/OIAC chip in this aspect of disclosure may be designed and fabricated using older or less advanced technology nodes or generations, for example, less advanced than or equal to, or more mature than 20 nm or 30 nm, and for example using the technology node of 22 nm, 28 nm, 40 nm, 90 nm, 130 nm, 180 nm, 250 nm, 350 nm or 500 nm, its NRE cost is cheaper than or less than that of the current or conventional ASIC or COT chip designed and fabricated using an advanced IC technology node or generation, for example, more advanced than or below 20 nm or 10 nm, and for example using the technology node of 16 nm, 14 nm, 12 nm, 10 nm, 7 nm, 5 nm or 3 nm. The NRE cost for designing an current or conventional ASIC or COT chip using an advanced IC technology node or generation, for example, more advanced than or below 20 nm or 10 nm may be more than US $5M, US $10M, US $20M or even exceeding US $50M, or US $100M. The cost of a photo mask set for an ASIC or COT chip at the 16 nm technology node or generation is over US$2M, US $5M or US $10M. Implementing the same or similar innovation and/or application using the logic drive including the DCDI/OIAC chip designed and fabricated using older or less advanced technology nodes or generations, may reduce NRE cost down to less than US $10M, US $7M, US $5M, US $3M or US $1M. Compared to the implementation by developing a logic ASIC or COT IC chip, the NRE cost of developing the DCDI/OIAC chip for the same or similar innovation and/or application may be reduced by a factor of larger than 2, 5, 10, 20, or 30.

Another aspect of the disclosure provides a method to change the logic ASIC or COT IC chip hardware business into a mainly software business by using the logic drive. Since the performance, power consumption and engineering and manufacturing costs of the logic drive may be better or equal to the current conventional ASIC or COT IC chip for a same or similar innovation and/or application, the current ASIC or COT IC chip design companies or suppliers may become software developers, while only designing the IAC chip, the DCIAC chip, or the DCDI/OIAC chip, as described above, using older or less advanced semiconductor technology nodes or generations. In this aspect of disclosure, they may (1) design and own the IAC chip, the DCIAC chip, or the DCDI/OIAC chip; (2) purchase from a third party the standard commodity FPGA chips in the bare-die or packaged format; (3) design and fabricate (may outsource the manufacturing to a third party of the manufacturing provider) the logic drive including their own IAC, DCIAC, or DCI/OIAC chip, and the purchased third party's standard commodity FPGA chips; (3) install in-house developed software for the innovation and/or application in the FGCMOS NVM, MRAM or RRAM cells in the logic drive; and/or (4) sell the program-installed logic drive to their customers. In this case, they still sell hardware without performing the conventional expensive ASIC or COT IC chip design and production using advanced semiconductor technology nodes, for example, nodes or generations more advanced than or below 20 nm or 10 nm. They may write software codes to program the logic drive comprising the plural of standard commodity FPGA chips for their desired algorithms, architectures and/or applications, for example, in algorithms, architectures and/or applications of Artificial Intelligence (AI), machine learning, deep learning, big data, Internet Of Things (IOT), industry computing, Virtual Reality (VR), Augmented Reality (AR), car electronics, Graphic Processing (GP), Digital Signal Processing (DSP), Micro Controlling (MC), and/or Central Processing (CP).

Another aspect of the disclosure provides the logic drive in a multi-chip package comprising plural standard commodity FPGA IC chips, further comprising processing and/or computing IC chips, for example, one or more Central Processing Unit (CPU) chips, one or more Graphic Processing Unit (GPU) chips, one or more Digital Signal Processing (DSP) chips, one or more Tensor Processing Unit (TPU) chips, and/or one or more Application Processing Unit (APU) chips, designed, implemented and fabricated using an advanced semiconductor technology node or generation, for example more advanced than or equal to, or below or equal to 30 nm, 20 nm or 10 nm, and for example using the technology node of 28 nm, 22 nm, 16 nm, 14 nm, 12 nm, 10 nm, 7 nm, 5 nm or 3 nm, which may be the same as, one or two generations or nodes less advanced than, or one or two generations or nodes more advanced than that used for the FPGA IC chips in the same logic drive. Alternatively, the processing and/or computing IC chip may be a System-On-a-Chip (SOC) chip, comprising: (1) CPU and DSP unit, (2) CPU and GPU, (3) DSP and GPU or (4) CPU, GPU and DSP unit. Transistors used in the processing and/or computing IC chip may be a FIN Field-Effect-Transistor (FINFET), a FINFET on Silicon-On-Insulator (FINFET SOI), a Fully Depleted Silicon-On-Insulator (FDSOI) MOSFET, a Partially Depleted Silicon-On-Insulator (PDSOI) MOSFET or a conventional MOSFET. Alternatively, a plurality of the processing and/or computing IC chips may be included, packaged, or incorporated in the logic drive. Alternatively, two processing and/or computing IC chips are included, packaged or incorporated in the logic drive, the combination for the two processing and/or computing IC chips is as below: (1) one of the two processing and/or computing IC chips may be a Central Processing Unit (CPU) chip, and the other one of the two processing and/or computing IC chips may be a Graphic Processing unit (GPU); (2) one of the two processing and/or computing IC chips may be a Central Processing Unit (CPU), and the other one of the two processing and/or computing IC chips may be a Digital Signal Processing (DSP) unit; (3) one of the two processing and/or computing IC chips may be a Central Processing Unit (CPU), and the other one of the two processing and/or computing IC chips may be a Tensor Processing Unit (TPU); (4) one of the two processing and/or computing IC chips may be a Graphic Processing Unit (GPU), and the other one of the two processing and/or computing IC chips may be a Digital Signal Processing (DSP) unit; (5) one of the two processing and/or computing IC chips may be a Graphic Processing Unit (GPU), and the other one of the two processing and/or computing IC chips may be a Tensor Processing Unit (TPU); (6) one of the two processing and/or computing IC chips may be a Digital Signal Processing (DSP) unit, and the other one of the two processing and/or computing IC chips may be a Tensor Processing Unit (TPU). Alternatively, three processing and/or computing IC chips are incorporated in the logic drive, the combination for the three processing and/or computing IC chips is as below: (1) one of the three processing and/or computing IC chips may be a Central Processing Unit (CPU), another one of the three processing and/or computing IC chips may be a graphic Processing Unit (GPU), and the other one of the three processing and/or computing IC chips may be a Digital Signal Processing (DSP) unit; (2) one of the three processing and/or computing IC chips may be a Central Processing Unit (CPU), another one of the three processing and/or computing IC chips may be a Graphic Processing Unit (GPU), and the other one of the three processing and/or computing IC chips may be a Tensor Processing Unit (TPU); (3) one of the three processing and/or computing IC chips may be a Central Processing Unit (CPU), another one of the three processing and/or computing IC chips may be a Digital Signal Processing (DSP) unit, and the other one of the three processing and/or computing IC chips may be a Tensor Processing Unit (TPU); (4) one of the three processing and/or computing IC chips may be a Graphic processing unit (GPU), another one of the three processing and/or computing IC chips may be a Digital Signal Processing (DSP) unit, and the other one of the three processing and/or computing IC chips may be a Tensor Processing Unit (TPU). Alternatively, the combination for the multiple processing and/or computing IC chips may comprise: (1) multiple GPU chips, for example 2, 3, 4 or more than 4 GPU chips, (2) one or more CPU chips and/or one or more GPU chips, (3) one or more CPU chips and/or one or more DSP chips, (3) one or more CPU chips, one or more GPU chips and/or one or more DSP chips, (4) one or more CPU chips and/or one or more TPU chips, or, (5) one or more CPU chips, one or more DSP chips and/or one or more TPU chips. In all of the above alternatives, the logic drive may comprise one or more of the processing and/or computing IC chips, and one or more high speed, wide bit-width and high bandwidth cache SRAM chips or DRAM IC chips for high speed parallel processing and/or computing. For example, the logic drive may comprise multiple GPU chips, for example 2, 3, 4 or more than 4 GPU chips, and multiple high speed, wide bit-width and high bandwidth cache SRAM chips or DRAM IC chips. The communication between one of GPU chips and one of SRAM or DRAM IC chips may be with data bit-width of equal or greater than 64, 128, 256, 512, 1024, 2048, 4096, 8K, or 16K. For another example, the logic drive may comprise multiple TPU chips, for example 2, 3, 4 or more than 4 TPU chips, and multiple high speed, wide bit-width and high bandwidth cache SRAM chips or DRAM IC chips. The communication between one of TPU chips and one of SRAM or DRAM IC chips may be with data bit-width of equal or greater than 64, 128, 256, 512, 1024, 2048, 4096, 8K, or 16K.

The communication, connection, or coupling between one of logic, processing and/or computing chips (for example, FPGA, CPU, GPU, DSP, APU, TPU, and/or ASIC chips) and one of high speed, wide bit-width and high bandwidth SRAM, DRAM or NVM chips through the FISIP and/or SISIP of the interposer to be described and specified below, may be the same or similar as that between internal circuits in a same chip. Alternatively, the communication, connection, or coupling between one of logic, processing and/or computing chips (for example, FPGA, CPU, GPU, DSP, APU, TPU, and/or ASIC chips) and one of high speed, wide bit-width and high bandwidth SRAM, DRAM or NVM chips through the FISIP and/or SISIP of the interposer, may be using small I/O drivers and/or receivers. The driving capability, loading, output capacitance, or input capacitance of the small I/O drivers or receivers, or I/O circuits may be between 0.1 pF and 2 pF or 0.1 pF and 1 pF. For example, a bi-directional (or tri-state) I/O pad or circuit may be used for the small I/O drivers or receivers, or I/O circuits for communicating between high speed, wide bit-width and high bandwidth logic and memory chips in the logic drive, and may comprise an ESD circuit, a receiver, and a driver, and may have an input capacitance or output capacitance between 0.1 pF and 2 pF or 0.1 pF and 1 pF.

The processing and/or computing IC chip or chips in the logic drive provide fixed-metal-line (non-field-programmable) interconnects for (non-field-programmable) functions, processors and operations. The standard commodity FPGA IC chips provide (1) programmable-metal-line (field-programmable) interconnects for (field-programmable) logic functions, processors and operations and (2) fixed-metal-line (non-field-programmable) interconnects for (non-field-programmable) logic functions, processors and operations. Once the programmable-metal-line interconnects in or of the FPGA IC chips are programmed, the programmed interconnects together with the fixed interconnects in or of the FPGA chips provide some specific functions for some given algorithms, architectures and/or applications. The operational FPGA chips may operate together with the processing and/or computing IC chip or chips in the same logic drive to provide powerful functions and operations in algorithms, architectures and/or applications, for example, Artificial Intelligence (AI), machine learning, deep learning, big data, Internet Of Things (IOT), industry computing, Virtual Reality (VR), Augmented Reality (AR), driverless car electronics, Graphic Processing (GP), Digital Signal Processing (DSP), Micro Controlling (MC), and/or Central Processing (CP).

Another aspect of the disclosure provides the logic drive in a multi-chip package further comprising a high-speed DRAM chip or chips for fast access of data for processing and/or computing. The DRAM chip or chips may be fabricated using a technology generation or node equal to or more advanced than 40 nm, for example, 40 nm, 30 nm, 20 nm, 15 nm or 10 nm. The density of the DRAM chip may be equal to or greater than 64 M-bits (Mb), for example, 64 Mb, 128 Mb, 256 Mb, 1 Gb, 4 Gb, 8 Gb, 16 Gb, 32 Gb, 128 Gb, 256 Gb, or 512 Gb. The data needed in the processing or computing may be taken or accessed from the data stored in the DRAM chip or chips, and the resulting data from the processing or computing may be stored in the DRAM chip or chips.

Another aspect of the disclosure provides the standard commodity FPGA IC chip for use in the logic drive. The standard commodity FPGA chip is designed, implemented and fabricated using an advanced semiconductor technology node or generation, for example more advanced than or equal to, or below or equal to 20 nm or 10 nm, and for example using the technology node of 16 nm, 14 nm, 12 nm, 10 nm, 7 nm, 5 nm or 3 nm. The standard commodity FPGA IC chips are fabricated by the process steps described in the following paragraphs:

(1) Providing a semiconductor substrate (for example, a silicon substrate), or a Silicon-On-Insulator (SOI) substrate, with the substrate in the wafer form, and with a wafer size, for example 8", 12" or 18" in the diameter. Transistors are formed in the substrate, and/or on or at the surface of the substrate by a wafer process. Transistors formed using the advanced semiconductor technology node or generation may be a FINFET, a FINFET on Silicon-on-insulator (FINFET SOI), a Fully Depleted Silicon-on-insulator (FDSOI) MOSFET, a Partially Depleted Silicon-on-insulator (PDSOI) MOS- FET or a conventional MOSFET. The process for the transistor formation can be used for the MOSFET transistors (for use in, for example, logic gates, multiplexers, control circuits, and etc.) and for the FG NMOS and FG PMOS in the FGCMOS NVM cells. Alternatively, a thicker oxide of dual gate oxide process may be formed for the high voltages of the programming and erase control circuits for the FG NMOS and FG PMOS in the FGCMOS NVM cells;

(2) Forming a First Interconnection Scheme in, on or of the Chip (FISC) over the substrate and on or over the layer comprising transistors, by a wafer process. The FISC comprises multiple interconnection metal layers, with an inter-metal dielectric layer between each of the multiple interconnection metal layers. The FISC structure may be formed by performing a single damascene copper process and/or a double damascene copper process. As an example, the metal lines and traces of an interconnection metal layer in the multiple interconnection metal layers may be formed by process comprising the single damascene copper process as follows: (1) providing a first insulating dielectric layer (may be an inter-metal dielectric layer with the top surfaces of vias or metal pads, lines or traces exposed and formed therein). The top-most layer of the first insulting dielectric layer may be, for example, a low k dielectric layer, for an example, a SiOC layer; (2) depositing, for example, by Chemical Vapor Deposition (CVD) methods, a second insulting dielectric layer on or over the whole wafer, including on or over the first insulating dielectric layer, and on or over the exposed vias or metal pads in the first insulating dielectric layer. The second insulting dielectric layer is formed by (a) depositing a bottom differentiate etch-stop layer, for example, a Silicon Carbon Nitride layer (SiCN), on or over the top-most layer of the first insulting dielectric layer and on the exposed top surfaces of the vias or metal pads in the first insulating dielectric layer; (b) then depositing a low k dielectric layer, for example, a SiOC layer, on or over the bottom differentiate etch-stop layer. The low k dielectric material has a dielectric constant smaller than that of the $SiO_2$ material. The SiCN and SiOC layers may be deposited by CVD methods. The material used for the first and second insulating dielectric layers of the FISC comprises inorganic material, or material compounds comprising silicon, nitrogen, carbon, and/or oxygen; (3) then forming trenches or openings in the second insulting dielectric layer by (a) coating, exposing, developing a photoresist layer to form trenches or openings in the photoresist layer, and then (b) forming trenches or openings in the second insulating dielectric layer by etching methods, and then removing the photoresist layer; (4) followed by depositing an adhesion layer on or over the whole wafer including in the trenches or openings in the second insulating dielectric layer, for example, sputtering or Chemical Vapor Depositing (CVD) a titanium (Ti) or titanium nitride (TiN) layer (with thickness for example, between 1 nm and 50 nm); (5) then depositing an electroplating seed layer on or over the adhesion layer, for example, sputtering or CVD depositing a copper seed layer (with a thickness, for example, between 3 nm and 200 nm); (6) then electroplating a copper layer (with a thickness, for example, between 10 nm and 3,000 nm, 10 nm and 1,000 nm or 10 nm and 500 nm) on or over the copper seed layer; (7) then applying a Chemical-Mechanical Process (CMP) to remove the un-wanted metals (Ti or TiN)/Seed Cu/electroplated Cu) outside the trenches or openings in the second insulating dielectric layer, until the top surface of the second insulating dielectric layer is exposed. The metals left or remained in trenches or openings in or of the second insulating dielectric layer are used as metal vias, lines or traces for the interconnection metal layer of the FISC.

The processes for forming metal lines or traces of the interconnection metal layer and vias in the inter-metal dielectric layer using the single damascene copper process or the double damascene copper process may be repeated multiple times to form metal lines or traces of multiple interconnection metal layers and vias in inter-metal dielectric layers of the FISC. The double damascene process is similar to the single damascene process except that: bottom openings (for forming metal vias) are formed in a bottom insulating dielectric layer, and top openings (for forming metal lines, traces or pads) are formed in a top insulating dielectric layer. The damascene metal electroplating and CMP processes (as described above) are then performed to form metal vias in the bottom insulating dielectric layer, and metal lines, traces or pads in the top insulating dielectric layer. Alternatively, bottom openings (for forming metal lines, traces or pads) are formed in a bottom insulating dielectric layer, and top openings (for forming metal vias) are formed in a top insulating dielectric layer. The damascene metal electroplating and CMP processes (as described above) are then performed to form metal lines, traces or pads in the bottom insulating dielectric layer, and metal vias in the top insulating dielectric layer. The FISC may comprise 4 to 15 layers, or 6 to 12 layers of interconnection metal layers.

The metal lines or traces in the FISC are coupled or connected to the underlying transistors. The thickness of the metal lines or traces of the FISC, either formed by the single-damascene process or by the double-damascene process, is, for example, between 3 nm and 1,000 nm, or between 10 nm and 500 nm, or, thinner than or equal to 5 nm, 10 nm, 30 nm, 50 nm, 100 nm, 200 nm, 300 nm, 500 nm, or 1,000 nm. The width of the metal lines or traces of the FISC is, for example, between 3 nm and 1000 nm, or between 10 nm and 500 nm, or, narrower than 5 nm, 10 nm, 20 nm, 30 nm, 70 nm, 100 nm, 300 nm, 500 nm or 1,000 nm. The thickness of the inter-metal dielectric layer has a thickness, for example, between 3 nm and 1000 nm, or between 10 nm and 500 nm, or thinner than 5 nm, 10 nm, 30 nm, 50 nm, 100 nm, 200 nm, 300 nm, 500 nm or 1,000 nm. The metal lines or traces of the FISC may be used for the programmable interconnection.

The MRAM cells or the RRAM cells may be formed in the FISC. The MRAM cells or RRAM cells may be inserted between a layer metal vias (at the bottom) and a layer of metal lines, traces or pads (at the top). That is: the process steps described above for forming MRAM cells or RRAM cells may be performed after a layer metal vias (at the bottom) is already formed and before a layer of metal lines, traces or pads (at the top) to be formed. Alternatively, the MRAM cells or RRAM cells may be inserted between a layer of metal lines, traces or pads (at the bottom), and a layer metal vias (at the top). That is: the process steps described above for forming MRAM cells or RRAM cells may be performed after a layer of metal lines, traces or pads (at the bottom) is already formed, and before a layer metal vias (at the top) is to be formed.

(3) Depositing a passivation layer on or over the whole wafer and on or over the FISC structure. The passivation is used for protecting the transistors and the FISC structure from water moisture or contamination from the external environment, for example, sodium mobile ions. The passivation comprises a mobile ion-catching layer or layers, for example, SiN, SiON, and/or SiCN layer or layers. The total thickness of the mobile ion catching layer or layers is thicker than or equal to 100 nm, 150 nm, 200 nm, 300 nm, 450 nm, or 500 nm. Openings in the passivation layer may be formed to expose the top surface of the top-most interconnection metal layer of the FISC, and for forming metal vias in the passivation openings in the following processes later.

(4) Forming a Second Interconnection Scheme in, on or of the Chip (SISC) on or over the FISC structure. The SISC comprises multiple interconnection metal layers, with an inter-metal dielectric layer between each of the multiple interconnection metal layers, and may optionally comprise an insulating dielectric layer on or over the passivation layer, and between the bottom-most interconnection metal layer of the SISC and the passivation layer. The insulating dielectric layer is then deposited on or over the whole wafer, including passivation layer and in the passivation openings. The insulating dielectric layer may use a polymer material. The polymer material may be, for example, polyimide, BenzoCycloButene (BCB), parylene, epoxy-based material or compound, photo epoxy SU-8, elastomer or silicone. The polymer material used for SISC comprises organic material, for example, a polymer, or material compounds comprising carbon. A layer of the polymer material may be deposited by methods of spin-on coating, screen-printing, dispensing, or molding. The polymer material may be photosensitive, and may be used as photoresist as well for patterning openings in it for forming metal vias in it by following processes to be performed later; that is, the photosensitive polymer layer is coated, and exposed to light through a photomask, and then developed and etched to form openings in it. The opening in the photosensitive insulating dielectric layer overlaps the opening in the passivation layer, exposing the top surfaces of the top-most metal layer of the FISC. In some applications or designs, the size of opening in the polymer layer is larger than that of the opening in the passivation layer, and the top surface of the passivation layer is exposed in the opening of the polymer layer. The photosensitive polymer layer (the insulating dielectric layer) is then cured at a temperature, for example, equal to or higher than 100° C., 125° C., 150° C., 175° C., 200° C., 225° C., 250° C., 275° C. or 300° C. A copper emboss process is then performed on or over the cured polymer layer and on or over the exposed top surfaces of the top-most interconnection metal layer of the FISC in openings in the cured polymer layer, or, on or over the exposed surface of the passivation layer in the openings of the cured polymer layer for some cases: (a) first depositing the whole wafer an adhesion layer on or over the cured polymer layer and on or over the exposed top surfaces of the top-most interconnection metal layer of the FISC in openings in the cured polymer layer, or, on or over the exposed surface of the passivation layer in the openings of the cured polymer layer for some cases, for example, sputtering or CVD depositing a titanium (Ti) or titanium nitride (TiN) layer (with a thickness, for example, between 1 nm and 50 nm); (b) then depositing an electroplating seed layer on or over the adhesion layer, for example, sputtering or CVD depositing a copper seed layer (with a thickness, for example, between 3 nm and 200 nm); (c) coating, exposing and developing a photoresist layer on or over the copper seed layer; forming trenches or openings in the photoresist layer for forming metal lines or traces of the interconnection metal layer of SISC by following processes to be performed later, wherein portion of the trench (opening) in the photoresist layer may overlap the whole area of opening in the cured polymer layer for forming vias in the openings of the cured polymer layer by following processes to be performed later; exposing the copper seed layer at the bottom of the trenches or openings; (d) then electroplating a copper layer (with a thickness, for example, between 0.3 μm and 20 μm, 0.5 μm and 5 μm, 1 μm and 10 μm, or 2 μm and 10 μm) on or over the copper seed layer at the bottom of the patterned trenches or openings in the photoresist layer; (e) removing the remained photoresist; (f) removing or etching the copper seed layer and the adhesion layer not under the electroplated copper. The emboss metals (Ti (or TiN)/seed Cu/electroplated Cu) left or remained in the openings of the cured polymer layer are used for vias in the insulating dielectric layer and vias in the passivation layer; and the emboss metals (Ti (or TiN)/seed Cu/electroplated Cu) left or remained in the locations of trenches or openings in the photoresist, (noted: the photoresist is removed after copper electroplating) are used for the metal lines, traces or pads of the interconnection metal layer. The processes of forming the insulating dielectric layer and openings in it, and the emboss copper processes for forming the vias in the insulting dielectric layer and the metal lines or traces of the interconnection metal layer, may be repeated to form multiple interconnection metal layers in or of the SISC; wherein the insulating dielectric layer is used as the inter-metal dielectric layer between two interconnection metal layers of the SISC, and the vias in the insulating dielectric layer (now in the inter-metal dielectric layer) are used for connecting or coupling metal lines or traces of the two interconnection metal layers. The top-most interconnection metal layer of the SISC is covered with a top-most insulating dielectric layer of SISC. The top-most insulating dielectric layer has openings in it to expose top surface of the top-most interconnection metal layer. The SISC may comprise 2 to 6, or 3 to 5 layers of interconnection metal layers. The metal lines or traces of the interconnection metal layers of the SISC have the adhesion layer (Ti or TiN, for example) and the copper seed layer only at the bottom, but not at the sidewalls of the metal lines or traces. The metal lines or traces of the interconnection metal layers of FISC have the adhesion layer (Ti or TiN, for example) and the copper seed layer at both the bottom and the sidewalls of the metal lines or traces.

The SISC interconnection metal lines or traces are coupled or connected to the FSIC interconnection metal lines or traces, or to transistors in the chip, through vias in openings of the passivation layer. The thickness of the metal lines or traces of SISC is between, for example, 0.3 μm and 20 μm, 0.5 μm and 10 μm, 1 μm and 5 μm, 1 μm and 10 μm, or 2 μm and 10 μm; or thicker than or equal to 0.3 μm, 0.5 μm, 0.7 μm, 1 μm, 1.5 μm, 2 μm or 3 μm. The width of the metal lines or traces of SISC is between, for example, 0.3 μm and 20 μm, 0.5 μm and 10 μm, 1 μm and 5 μm, 1 μm and 10 μm, or 2 μm and 10 μm; or wider than or equal to 0.3 μm, 0.5 μm, 0.7 μm, 1 μm, 1.5 μm, 2 μm or 3 μm. The thickness of the inter-metal dielectric layer has a thickness between, for example, 0.3 μm and 20 μm, 0.5 μm and 10 μm, 1 μm and 5 μm, or 1 μm and 10 μm; or thicker than or equal to 0.3 μm, 0.5 μm, 0.7 μm, 1 μm, 1.5 μm, 2 μm or 3 μm. The metal lines or traces of SISC may be used for the programmable interconnection.

(5) Forming micro copper pillars or bumps (i) on the top surface of the top-most interconnection metal layer of SISC, exposed in openings in the insulating dielectric layer of the SISC, and/or (ii) on or over the top-most insulating dielectric layer of the SISC. An emboss copper process, as described in above paragraphs, is performed to form the micro copper pillars or bumps. The copper micro pillars or bumps are coupled or connected to the SISC and FISC interconnection metal lines or traces, and to transistors in or of the chip, through vias in openings in the top-most insulating dielectric layer of the SISC. The height of the micro pillars or bumps is between, for example, 3 μm and 60 μm, 5 μm and 50 μm, 5 μm and 40 μm, 5 μm and 30 μm, 5 μm and 20 μm, 5 μm and 15 μm, or 3 μm and 10 μm, or greater than or equal to 30 μm, 20 μm, 15 μm, 5 μm or 3 μm. The largest dimension in a cross-section of the micro pillars or bumps (for example, the diameter of a circle shape, or the diagonal length of a square or rectangle shape) is between, for example, 3 μm and 60 μm, 5 μm and 50 μm, 5 μm and 40 μm, 5 μm and 30 μm, 5 μm and 20 μm, 5 μm and 15 μm, or 3 μm and 10 μm, or smaller than or equal to 60 μm, 50 μm, 40 μm, 30 μm, 20 μm, 15 μm or 10 μm. The space between a micro pillar or bump to its nearest neighboring pillar or bump is between, for example, 3 μm and 60 μm, 5 μm and 50 μm, 5 μm and 40 μm, 5 μm and 30 μm, 5 μm and 20 μm, 5 μm and 15 μm, or 3 μm and 10 μm, or smaller than or equal to 60 μm, 50 μm, 40 μm, 30 μm, 20 μm, 15 μm or 10 μm.

(6) Cutting or dicing the wafer to obtain separated standard commodity FPGA chips. The standard commodity FPGA chips comprise, from bottom to top: (i) a layer comprising transistors, (ii) the FISC, (iii) a passivation layer, (iv) the SISC and (v) micro copper pillars or bumps, above a level of the top surface of the top-most insulating dielectric layer of the SISC by a height of, for example, between 3 μm and 60 μm, 5 μm and 50 μm, 5 μm and 40 μm, 5 μm and 30 μm, 5 μm and 20 μm, 5 μm and 15 μm, or 3 μm and 10 μm, or greater than or equal to 30 μm, 20 μm, 15 μm, 5 μm or 3 μm.

Another aspect of the disclosure provides an interposer for flip-chip assembly or packaging in forming the multi-chip package of the logic drive. The multi-chip package is based on multiple-Chips-On-an-InterPoser (COIP) flip-chip packaging method. The interposer in the COIP multi-chip package comprises: (1) high density interconnects for fan-out and interconnection between IC chips flip-chip-assembled, bonded or packaged on or over the substrate of interposer, (2) micro metal pads, bumps or pillars on or over the high density interconnects, (3) deep vias or shallow vias in the substrate of the interposer. The IC chips or packages to be flip-chip assembled, bonded or packaged, to the interposer include the chips or packages mentioned, described and specified above: the standard commodity FPGA chips, the dedicated control chip, the dedicated I/O chip, the dedicated control and I/O chip, IAC, DCIAC, DCDI/OIAC chip, and/or processing and/or computing IC chip or chips, for example CPU, GPU, DSP, TPU, or APU chip or chips. The process steps for forming the interposer of the logic drive are as follows:

(1) Providing a substrate. The substrate may be in a wafer format (with 8", 12" or 18" in diameter), or, in a panel format in the square or rectangle format (with a width or a length greater than or equal to 20 cm, 30 cm, 50 cm, 75 cm, 100 cm, 150 cm, 200 cm or 300 cm). The material of the substrate may be silicon, metal, ceramics, glass, steel, plastics, polymer, epoxy-based polymer, or epoxy-based compound. As an example, a silicon wafer may be used as a substrate in forming a silicon interposer.

(2) forming through vias in the substrate. Silicon wafer is used as an example in forming the metal vias in the substrate. The bottom surface metal vias in the silicon wafer are exposed in the final product of the logic drive, therefore, the metal vias become through vias, and the through vias are the Trough-Silicon-Vias (TSVs). The metal vias in the substrate are formed by the following process steps: (a) depositing a masking insulting layer on the silicon wafer, for example, a thermally grown silicon oxide SiO2 and/or a CVD silicon nitride Si3N4; (b) photoresist depositing, patterning and then etching the masking insulating layer to form holes or openings in it; (c) using the masking insulting layer as an etching mask to etch the silicon wafer and forming holes or openings in the silicon wafer at the locations of holes or openings in the masking insulating layer. Two types of holes are formed. One type is a deep hole with the depth of hole between 30 μm and 150 μm, or 50 μm and 100 μm; and with a diameter or size of the hole between 5 μm and 50 μm, or 5 μm and 15 μm. The other type is a shallow hole with the depth of via between 5 μm and 50 μm, or 5 μm and 30 μm; and with a diameter or size of the hole between 20 μm and 150 μm, or 30 μm and 80 μm; (d) removing the remaining masking insulating layer, then forming an insulating lining layer on the sidewall of the hole. The insulating lining layer may be, for example, a thermally grown silicon oxide SiO2 and/or a CVD silicon nitride Si3N4; (e) forming metal via by filling the hole with metal. The damascene copper process, as mentioned above, is used to form the deep via in the deep hole, while the embossing copper process, as mentioned above, is used to form the shallow via in the shallow hole. In the damascene copper process for forming the deep vias, an adhesion metal layer is deposited, followed by depositing an electroplating seed layer, and then electroplating a copper layer. The electroplating copper process is performed on the whole wafer until the deep hole is completely filled. The un-wanted metal stack of electroplating copper, seed layer and adhesion layer outside the via is then removed by a CMP process. The processes and materials in the damascene process for forming the deep vias are the same as described and specified in the above. In the emboss copper process for forming the shallow vias, an adhesion metal layer is deposited, followed by depositing an electroplating seed layer, and then coating and patterning a photoresist layer on or over the electroplating seed layer, forming holes in the photoresist layer to expose the seed layer on the sidewall and bottom of the shallow hole and/or a ring of area along the edge of the hole. Then the electroplating copper process is performed in the holes in the photoresist layer until the shallow hole in the silicon substrate is completely filled. The remained photoresist is then removed. The metals stack of seed layer and adhesion layer outside the via is then removed by a dry or wet etching process or by a CMP process. The process and materials in the embossing process for forming the shallow vias are the same as described and specified in the above.

(3) Forming a First Interconnection Scheme on or of the Interposer (FISIP). The metal lines or traces and the metal vias of the FISIP are formed by the single damascene copper processes or the double damascene copper processes as described or specified above in forming the metal lines or traces and metal vias in the FISC of FPGA IC chips. The processes and materials for forming (a) metal lines or traces of the interconnection metal layer, (b) the inter-metal dielectric layer and (c) metal vias in the inter-metal dielectric layer in or of the FISIP are the same as described and specified in forming the FISC of FPGA IC chips The processes for forming metal lines or traces of the interconnection metal layer and vias in the inter-metal dielectric layer using the single damascene copper process or the double damascene copper process may be repeated multiple times to form metal lines or traces of multiple interconnection metal layers and vias in inter-metal dielectric layers of the FISIP. The FISIP may comprise 2 to 10 layers, or 3 to 6 layers of interconnection metal layers. The metal lines or traces of the interconnection metal layers of FISIP have the adhesion layer (Ti or TiN, for example) and the copper seed layer at both the bottom and the sidewalls of the metal lines or traces.

The metal lines or traces in the FISIP are coupled or connected to the micro copper bumps or pillars of the IC chips in or of the logic drive, and coupled or connected to the TSVs in the substrate of the interposer. The thickness of the metal lines or traces of the FISIP, either formed by the single-damascene process or by the double-damascene process, is, for example, between 10 nm and 2,000 nm or between 10 nm and 1,000 nm, or between 20 nm and 500 nm, or, thinner than or equal to 50 nm, 100 nm, 200 nm, 300 nm, 500 nm, 1,000 nm, 1,500 nm or 2,000 nm. The minimum width of the metal lines or traces of the FISIP is, for example, equal to or smaller than 50 nm, 100 nm, 150 nm, 200 nm, 300 nm, 500 nm, 1,000 nm, 1,500 nm or 2,000 nm. The minimum space between two neighboring metal lines or traces of the FISIP is, for example, equal to or smaller than 50 nm, 100 nm, 150 nm, 200 nm, 300 nm, 500 nm, 1,000 nm, 1,500 nm or 2,000 nm. The minimum pitch of the metal lines or traces of the FISIP is, for example, equal to or smaller than 100 nm, 200 nm, 300 nm, 400 nm, 600 nm, 1,000 nm, 3,000 nm or 4,000 nm. The thickness of the inter-metal dielectric layer has a thickness, for example, between 10 nm and 500 nm, between 10 nm and 1,000 nm, or between 10 nm and 2,000 nm, or, thinner than or equal to 50 nm, 100 nm, 200 nm, 300 nm, 500 nm, 1,000 nm or 2,000 nm. The metal lines or traces of the FISIP may be used as the programmable interconnection.

(4) Forming a Second Interconnection Scheme of the Interposer (SISIP) on or over the FISIP structure. The SISIP comprises multiple interconnection metal layers, with an inter-metal dielectric layer between each of the multiple interconnection metal layers. The metal lines or traces and the metal vias are formed by the emboss copper processes as described or specified above in forming the metal lines or traces and metal vias in the SISC of FPGA IC chips. The processes and materials for forming (a) metal lines or traces of the interconnection metal layer, (b) the inter-metal dielectric layer and (c) metal vias in the inter-metal dielectric layer are the same as described and specified in forming the SISC of FPGA IC chips The processes for forming metal lines or traces of the interconnection metal layer and vias in the inter-metal dielectric layer using the emboss copper process may be repeated multiple times to form metal lines or traces of multiple interconnection metal layers and vias in inter-metal dielectric layers of the SISIP. The SISIP may comprise 1 to 5 layers, or 1 to 3 layers of interconnection metal layers. Alternatively, the SISIP on or of the interposer may be omitted, and the COIP only has FISIP interconnection scheme on the substrate of the interposer. Alternatively, the FISIP on or of the interposer may be omitted, and the COIP only has SISIP interconnection scheme on the substrate of the interposer.

The thickness of the metal lines or traces of SISIP is between, for example, 0.3 μm and 20 μm, 0.5 μm and 10 μm, 1 μm and 5 μm, 1 μm and 10 μm, or 2 μm and 10 μm; or thicker than or equal to 0.3 μm, 0.5 μm, 0.7 μm, 1 μm, 1.5 μm, 2 μm or 3 μm. The width of the metal lines or traces of SISIP is between, for example, 0.3 μm and 20 μm, 0.5 μm and 10 μm, 1 μm and 5 μm, 1 μm and 10 μm, or 2 μm and 10 μm; or wider than or equal to 0.3 μm, 0.5 μm, 0.7 μm, 1 μm, 1.5 μm, 2 μm or 3 μm. The thickness of the inter-metal dielectric layer has a thickness between, for example, 0.3 μm and 20 μm, 0.5 μm and 10 μm, 1 μm and 5 μm, or 1 μm and 10 μm; or thicker than or equal to 0.3 μm, 0.5 μm, 0.7 μm, 1 μm, 1.5 μm, 2 μm or 3 μm. The metal lines or traces of SISIP may be used as the programmable interconnection.

(5) Forming micro copper pads, pillars or bumps (i) on the top surface of the top-most interconnection metal layer of SISIP, exposed in openings in the topmost insulating dielectric layer of the SISIP, or (ii) on the top surface of the top-most interconnection metal layer of FISIP, exposed in openings in the topmost insulating dielectric layer of the FISIP in the case wherein the SISIP is omitted. An emboss copper process, as described and specified in above paragraphs, is performed to form the micro copper pillars or bumps on or over the interposer.

The height of the micro pads, pillars or bumps on or over the interposer is between, for example, 2 μm and 60 μm, 5 μm and 50 μm, 5 μm and 40 μm, 5 μm and 30 μm, 5 μm and 20 μm, 2 μm and 15 μm, or 2 μm and 10 μm, or smaller than or equal to 60 μm, 50 μm, 40 μm, 30 μm, 20 μm, 15 μm, 10 μm or 5 μm. The largest dimension in a cross-section of the micro pillars or bumps (for example, the diameter of a circle shape, or the diagonal length of a square or rectangle shape) is between, for example, 2 μm and 60 μm, 5 μm and 50 μm, 5 μm and 40 μm, 5 μm and 30 μm, 5 μm and 20 μm, 2 μm and 15 μm, or 2 μm and 10 μm, or smaller than or equal to 60 μm, 50 μm, 40 μm, 30 μm, 20 μm, 15 μm, 10 μm or 5 μm. The space between a micro pillar or bump to its nearest neighboring pillar or bump is between, for example, 2 μm and 60 μm, 5 μm and 50 μm, 5 μm and 40 μm, 5 μm and 30 μm, 5 μm and 20 μm, 2 μm and 15 μm, or 2 μm and 10 μm, or smaller than or equal to 60 μm, 50 μm, 40 μm, 30 μm, 20 μm, 15 μm, 10 μm or 5 μm.

Another aspect of the disclosure provides a method for forming the logic drive in a COIP multi-chip package using an interposer comprising the FISIP, the SISIP, micro copper bumps or pillars and TSVs based on a flip-chip assembled multi-chip packaging technology and process. The process steps for forming the COIP multi-chip packaged logic drive are described as below:

(1) Performing flip-chip assembling, bonding or packaging: (a) First providing the interposer comprising the FISIP, the SISIP, micro copper bumps or pillars and TSVs, and IC chips or packages; then flip-chip assembling, bonding or packaging the IC chips or packages to and on the interposer. The interposer is formed as described and specified above. The IC chips or packages to be assembled, bonded or packaged to the interposer include the chips or packages mentioned, described and specified above: the standard commodity FPGA chips, the dedicated control chip, the dedicated I/O chip, the dedicated control and I/O chip, IAC, DCIAC, DCDI/OIAC chip and/or computing and/or processing IC chips, for example, CPU, GPU, DSP, TPU. APU chips. All chips to be flip-chip packaged in the logic drives comprise micro copper pillars or bumps with solder caps on the top surface of the micro copper pillars or bumps. The top surfaces of micro copper pillars or bumps with solder caps are at a level above the level of the top surface of the top-most insulating dielectric layer of the chips with a height of, for example, between 3 μm and 60 μm, 5 μm and 50 μm, 5 μm and 40 μm, 5 μm and 30 μm, 5 μm and 20 μm, 5 μm and 15 μm, or 3 μm and 10 μm, or greater than or equal to 30 μm, 20 μm, 15 μm, 5 μm or 3 μm; (b) The chips are flip-chip assembled, bonded or packaged on or to corresponding micro copper pads, bumps or pillar on or of the interposer with the side or surface of the chip with transistors faced down. The backside of the silicon substrate of the chips (the side or surface without transistors) is faced up; (c) Filling the gaps between the interposer and the IC chips (and between micro copper bumps or pillars of the IC chips and the interposer) with an underfill material by, for example, a dispensing method using a dispenser. The underfill material comprises epoxy resins or compounds, and can be cured at temperature equal to or above 100° C., 120° C., or 150° C.

(2) Applying a material, resin, or compound to fill the gaps between chips and cover the backside surfaces of chips by methods, for example, spin-on coating, screen-printing, dispensing or molding in the wafer or panel format. The molding method includes the compress molding (using top and bottom pieces of molds) or the casting molding (using a dispenser). The material, resin, or compound used may be a polymer material includes, for example, polyimide, BenzoCycloButene (BCB), parylene, epoxy-based material or compound, photo epoxy SU-8, elastomer, or silicone. The polymer may be, for example, photosensitive polyimide/PBO PIMEL™ supplied by Asahi Kasei Corporation, Japan; or epoxy-based molding compounds, resins or sealants provided by Nagase ChemteX Corporation, Japan. The material, resin or compound is applied (by coating, printing, dispensing or molding) on or over the interposer and on or over the backside of the chips to a level to: (i) fill gaps between chips, (ii) cover the top-most backside surface of the chips. The material, resin or compound may be cured or cross-linked by raising a temperature to a certain temperature degree, for example, equal to or higher than or equal to 50° C., 70° C., 90° C., 100° C., 125° C., 150° C., 175° C., 200° C., 225° C., 250° C., 275° C. or 300° C. The material may be polymer or molding compound. Applying a CMP, polishing or grinding process to planarize the surface of the applied material, resin or compound. Optionally, the CMP, or grinding process is performed until a level where the backside surfaces of all IC chips are fully exposed.

(3) Thinning the interposer to expose the surfaces of the metal silicon through vias (TSVs) at the backside of the interposer. A wafer or panel thinning process, for example, a CMP process, a polishing process or a wafer backside grinding process, may be performed to remove portion of the wafer or panel to make the wafer or panel thinner, in a wafer or panel process, to expose the surfaces of the metal through vias (TSVs) at the backside of the interposer.

The interconnection metal lines or traces of the FISIP and/or SISIP of the interposer for the logic drive may: (a) comprise an interconnection net or scheme of metal lines or traces in or of the FISIP and/or SISIP of the logic drive for connecting or coupling the transistors, the FISC, the SISC and/or the micro copper pillars or bumps of an FPGA IC chip of the logic drive to the transistors, the FISC, the SISC and/or the micro copper pillars or bumps of another FPGA IC chip packaged in the same logic drive. This interconnection net or scheme of metal lines or traces in or of the FISIP and/or SISIP may be connected to the circuits or components outside or external to the logic drive through TSVs in the substrate of the interposer. This interconnection net or scheme of metal lines or traces in or of the FISIP and/or SISIP may be a net or scheme for signals, or the power or ground supply; (b) comprise an interconnection net or scheme of metal lines or traces in or of the FISIP and/or SISIP of the logic drive connecting to multiple micro copper pillars or bumps of an IC chip in or of the logic drive. This interconnection net or scheme of metal lines or traces in or of the FISIP and/or SISIP may be connected to the circuits or components outside or external to the logic drive through the TSVs in the substrate of the interposer. This interconnection net or scheme of metal lines or traces in or of the FISIP and/or SISIP may be a net or scheme for signals, or the power or ground supply; (c) comprise interconnection metal lines or traces in or of the FISIP and/or SISIP of the logic drive for connecting or coupling to the circuits or components outside or external to the logic drive, through one or more of the TSVs in the substrate of the interposer. The interconnection metal lines or traces in or of the FISIP and/or SISIP may be used for signals, power or ground supplies. In this case, for example, the one or more of the TSVs in the substrate of the interposer may be connected to the I/O circuits of, for example, the dedicated I/O chip of the logic drive. The I/O circuits in this case may be a large I/O circuit, for example, a bi-directional (or tri-state) I/O pad or circuit, comprising an ESD circuit, a receiver, and a driver, and may have an input capacitance or output capacitance between 3 pF and 100 pF, 3 pF and 30 pF, 3 pF and 15 pF, or 3 pF and 10 pF; (d) comprise an interconnection net or scheme of metal lines or traces in or of the FISIP and/or SISIP of the logic drive used for connecting the transistors, the FISC, the SISC and/or the micro copper pillars or bumps of an FPGA IC chip of the logic drive to the transistors, the FISC, the SISC and/or the micro copper pillars or bumps of another FPGA IC chip packaged in the logic drive; but not connected to the circuits or components outside or external to the logic drive. That is, no TSV in the substrate of the interposer of the logic drive is connected to the interconnection net or scheme of metal lines or traces in or of the FISIP and/or SISIP. In this case, the interconnection net or scheme of metal lines or traces in or of the FISIP and/or SISIP may be connected or coupled to the off-chip I/O circuits of the FPGA chips packaged in the logic drive. The I/O circuit in this case may be a small I/O circuit, for example, a bi-directional (or tri-state) I/O pad or circuit, comprising an ESD circuit, a receiver, and/or a driver, and may have an input capacitance or output capacitance between 0.1 pF and 2 pF or 0.1 pF and 1 pF; (e) comprise an interconnection net or scheme of metal lines or traces in or of the FISIP and/or SISIP of the logic drive used for connecting or coupling to multiple micro copper pillars or bumps of an IC chip in or of the logic drive; but not connecting to the circuits or components outside or external to the logic drive. That is, no TSV in the substrate of the interposer of the logic drive is connected to the interconnection net or scheme of metal lines or traces in or of the FISIP and/or SISIP. In this case, the interconnection net or scheme of metal lines or traces in or of the FISIP and/or SISIP may be connected or coupled to the transistors, the FISC, the SISC and/or the micro copper pillars or bumps of the FPGA IC chip of the logic drive, without going through any I/O circuit of the FPGA IC chip.

(4) Forming solder bumps on or under the exposed bottom surfaces of the TSVs. For the shallow TSVs, the areas of the exposed bottom surfaces are large enough for use as bases to form solder bumps on or under the exposed copper surfaces. For the deep TSVs, the areas of the exposed bottom surfaces may not be large enough for use as bases to form solder bumps on or under the exposed copper surfaces; therefore, an emboss copper process may be performed to form copper pads as bases for forming the solder bumps on or under them. For the description purpose, the wafer or panel for the interposer is turned upside down, with the interposer at the top and the IC chips at the bottom. The frontside (the side with the transistors) of IC chips are now facing up, the molding compound and the backside of the IC chips are now at the bottom. The base copper pads are formed by performing an emboss copper process in the following process steps: (a) depositing and patterning an insulating layer, for example, a polymer layer, on the whole wafer or panel, and exposing the surfaces of the TSVs in the openings or holes of the insulating layer; (b) depositing an adhesion layer on or over the insulating layer, and the exposed surfaces of the TSVs in openings or holes of the insulating layer, for example, sputtering or CVD depositing a titanium (Ti) or titanium nitride (TiN) layer (with a thickness, for example, between 1 nm and 200 nm, or 5 nm and 50 nm); (c) then depositing an electroplating seed layer on or over the adhesion layer, for example, sputtering or CVD depositing a copper seed layer (with a thickness, for example, between 3 nm and 400 nm, or 10 nm and 200 nm); (d) depositing a photoresist layer, patterning openings or holes in the photoresist layer for forming the copper pads later, by coating, exposing and developing the photoresist layer, exposing the copper seed layer at the bottom of the openings or holes in the photoresist layer. The opening or hole in the photoresist layer overlaps the opening in the insulating layer; and extends out of the opening of the insulating layer, to an area (where the copper pads are to be formed) around the opening in the insulating layer; (e) then electroplating a copper layer (with a thickness, for example, between 1 μm and 50 μm, 1 μm and 40 μm, 1 μm and 30 μm, 1 μm and 20 μm, 1 μm and 10 μm, 1 μm and 5 μm, or 1 μm and 3 μm) on or over the copper seed layer in the openings of the photoresist layer; (f) removing the remained photoresist; (g) removing or etching the copper seed layer and the adhesion layer not under the electroplated copper layer. The remained stacks of adhesion layer/seed layer/electroplated copper layer are used as the copper pads. The solder bumps may be formed by screen printing methods or by solder ball mounting methods, and then followed by the solder reflow process on either the exposed surfaces of TSVs for shallow TSVs, or, the electroplated copper pads for deep TSVs. The material used for forming the solder bumps may be lead free solder. The lead-free solders in commercial use may contain tin, copper, silver, bismuth, indium, zinc, antimony, and traces of other metals. For example, the lead-free solder may be Sn—Ag—Cu (SAC) solder, Sn—Ag solder, or Sn—Ag—Cu—Zn solder. The solder bumps are used for connecting or coupling the IC chips, for example, the dedicated I/O chip, of the logic drive to the external circuits or components external or outside of the logic drive, through micro copper pillars or bumps of the IC chips and through the FISIP, the SISIP and TSVs of the interposer or substrate. The height of the solder bumps is, for example, between 5 μm and 150 μm, 5 μm and 120 μm, 10 μm and 100 μm, 10 μm and 60 μm, 10 μm and 40 μm, or 10 μm and 30 μm, or greater or taller than or equal to 75 μm, 50 μm, 30 μm, 20 μm, 15 μm, or 10 μm. The largest dimension in cross-sections of the solder bumps (for example, the diameter of a circle shape or the diagonal length of a square or rectangle shape) is, for example, between 5 μm and 200 μm, 5 μm and 150 μm, 5 μm and 120 μm, 10 μm and 100 μm, 10 μm and 60 μm, 10 μm and 40 μm, or 10 μm and 30 μm; or greater than or equal to 100 μm, 60 μm, 50 μm, 40 μm, 30 μm, 20 μm, 15 μm, or 10 μm. The smallest space between a solder bump and its nearest neighboring solder bump is, for example, between 5 μm and 150 μm, 5 μm and 120 μm, 10 μm and 100 μm, 10 μm and 60 μm, 10 μm and 40 μm, or 10 μm and 30 μm; or greater than or equal to 60 μm, 50 μm, 40 μm, 30 μm, 20 μm, 15 μm or 10 μm. The solder bumps may be used for flip-package assembling the logic drive on or to a substrate, film or board, similar to the flip-chip assembly of the chip packaging technology, or the Chip-On-Film (COF) assembly technology used in the LCD driver packaging technology. The solder bump assembly process may comprise a solder flow or reflow process using solder flux or without using solder flux. The substrate, film or board used may be, for example, a Printed Circuit Board (PCB), a silicon substrate with interconnection schemes, a metal substrate with interconnection schemes, a glass substrate with interconnection schemes, a ceramic substrate with interconnection schemes, or a flexible film with interconnection schemes. The solder bumps may be located at the frontside (top) surface of the logic drive package with a layout in a Ball-Grid-Array (BGA) with the solder bumps at the peripheral area used for the signal I/Os, and the solder bumps at or near the central area used for the Power/Ground (P/G) I/Os. The signal bumps at the peripheral area may form ring or rings at the peripheral area near the edges of the logic drive package, with 1 ring, or 2, 3, 4, 5, 6 rings. The pitches of the signal I/Os at the peripheral area may be smaller than that of the P/G I/Os at or near the central area of the logic drive package.

Alternatively, copper pillars or bumps may be formed on or under the exposed bottom surfaces of the TSVs. For the description purpose, the wafer or panel is turned upside down, with the interposer at the top and the IC chips at the bottom. The frontside (the side with the transistors) of IC chips are now facing up, the molding compound and the backside of the IC chips are now at the bottom. The copper pillars or bumps are formed (for both cases of shallow and deep TSVs) by performing an emboss copper process in the following process steps: (a) depositing and patterning an insulating layer, for example, a polymer layer, on the whole wafer or panel, and exposing the surfaces of the TSVs in the openings or holes of the insulating layer; (b) depositing an adhesion layer on or over the insulating layer, and the exposed surfaces of the TSVs in openings or holes of the insulating layer, for example, sputtering or CVD depositing a titanium (Ti) or titanium nitride (TiN) layer (with a thickness, for example, between 1 nm and 200 nm, or 5 nm and 50 nm); (c) then depositing an electroplating seed layer on or over the adhesion layer, for example, sputtering or CVD depositing a copper seed layer (with a thickness, for example, between 3 nm and 400 nm, or 10 nm and 200 nm); (d) depositing a photoresist layer, patterning openings or holes in the photoresist layer for forming the copper pillars or bumps later, by coating, exposing and developing the photoresist layer, exposing the copper seed layer at the bottom of the openings or holes in the photoresist layer. The opening or hole in the photoresist layer overlaps the opening or hole in the insulating layer; and extends out of the opening or hole of the insulating layer, to an area (where the copper pillars or bumps are to be formed) around the opening or hole in the insulating layer; (e) then electroplating a copper layer (with a thickness, for example, between 5 μm and 120 μm, 10 μm and 100 μm, 10 μm and 60 μm, 10 μm and 40 μm, or 10 μm and 30 μm) on or over the copper seed layer in the patterned openings or holes in the photoresist layer; (f) removing the remained photoresist; (g) removing or etching the copper seed layer and the adhesion layer not under the electroplated copper. The metals left or remained are used as the copper pillars or bumps. The copper pillars or bumps are used for connecting or coupling the chips, for example the dedicated I/O chip, of the logic drive to the external circuits or components external or outside of the logic drive. The height of the copper pillars or bumps is, for example, between 5 μm and 120 μm, 10 μm and 100 μm, 10 μm and 60 μm, 10 μm and 40 μm, or 10 μm and 30 μm, or greater or taller than or equal to 50 μm, 30 μm, 20 μm, 15 μm, or 5 μm. The largest dimension in a cross-section of the copper pillars or bumps (for example, the diameter of a circle shape or the diagonal length of a square or rectangle shape) is, for example, between 5 μm and 120 μm, 10 μm and 100 μm, 10 μm and 60 μm, 10 μm and 40 μm, or 10 μm and 30 μm; or greater than or equal to 60 μm, 50 μm, 40 μm, 30 μm, 20 μm, 15 μm, or 10 μm. The smallest space between a copper pillar or bump and its nearest neighboring copper pillar or bump is, for example, between 5 μm and 120 μm, 10 μm and 100 μm, 10 μm and 60 μm, 10 μm and 40 μm, or 10 μm and 30 μm; or greater than or equal to 60 μm, 50 μm, 40 μm, 30 μm, 20 μm, 15 μm or 10 μm. The copper bumps or pillars may be used for flip-package assembling the logic drive on or to a substrate, film or board, similar to the flip-chip assembly of the chip packaging technology, or similar to the Chip-On-Film (COF) assembly technology used in the LCD driver packaging technology. The substrate, film or board used may be, for example, a Printed Circuit Board (PCB), a silicon substrate with interconnection schemes, a metal substrate with interconnection schemes, a glass substrate with interconnection schemes, a ceramic substrate with interconnection schemes, or a flexible film with interconnection schemes. The substrate, film or board may comprise metal bonding pads or bumps at its surface; and the metal bonding pads or bumps may have a layer of solder on their top surface for use in the solder reflow or thermal compressing bonding process for bonding to the copper pillars or bumps on or of the logic drive package. The copper pillars or bumps may be located at the frontside (top) surface of the logic drive package with a layout of Bump or Pillar Grid-Array, with the copper pillars or bumps at the peripheral area used for the signal I/Os, and the pillars or bumps at or near the central area used for the Power/Ground (P/G) I/Os. The signal pillars or bumps at the peripheral area may form 1 ring, or 2, 3, 4, 5, or 6 rings along the edges of the logic drive package. The pitches of the signal I/Os at the peripheral area may be smaller than that of the P/G I/Os at or near the central area of the logic drive package.

(5) Separating, cutting or dicing the finished wafer or panel, including separating, cutting or dicing through materials or structures between two neighboring logic drives. The material (for example, polymer) filling gaps between chips of two neighboring logic drives is separated, cut or diced to from individual unit of logic drives.

Another aspect of the disclosure provides the standard commodity COIP multi-chips packaged logic drive. The standard commodity COIP logic drive may be in a shape of square or rectangle, with a certain widths, lengths and thicknesses. An industry standard may be set for the shape and dimensions of the logic drive. For example, the standard shape of the COIP-multi-chip packaged logic drive may be a square, with a width greater than or equal to 4 mm, 7 mm, 10 mm, 12 mm, 15 mm, 20 mm, 25 mm, 30 mm, 35 mm or 40 mm, and having a thickness greater than or equal to 0.03 mm, 0.05 mm, 0.1 mm, 0.3 mm, 0.5 mm, 1 mm, 2 mm, 3 mm, 4 mm, or 5 mm. Alternatively, the standard shape of the COIP-multi-chip packaged logic drive may be a rectangle, with a width greater than or equal to 3 mm, 5 mm, 7 mm, 10 mm, 12 mm, 15 mm, 20 mm, 25 mm, 30 mm, 35 mm or 40 mm, and a length greater than or equal to 5 mm, 7 mm, 10 mm, 12 mm, 15 mm, 20 mm, 25 mm, 30 mm, 35 mm, 40 mm, 45 mm or 50 mm; and having a thickness greater than or equal to 0.03 mm, 0.05 mm, 0.1 mm, 0.3 mm, 0.5 mm, 1 mm, 2 mm, 3 mm, 4 mm, or 5 mm. Furthermore, the metal bumps or pillars on or under the interposer in the logic drive may be in a standard footprint, for example, in an area array of M×N with a standard dimension of pitch and space between neighboring two metal bumps or pillars. The location of each metal bumps or pillars is also at a standard location. The function of each metal bumps or pillars is also a standard function.

Another aspect of the disclosure provides the logic drive comprising plural single-layer-packaged logic drives; and each of single-layer-packaged logic drives in a multiple-chip package is as described and specified above. The multiple single-layer-packaged logic drives, for example, 2, 3, 4, 5, 6, 7, 8 or greater than 8 single-layer-packaged logic drives, may be, for example, (1) flip-package assembled on a printed circuit board (PCB), high-density fine-line PCB, Ball-Grid-Array (BGA) substrate, or flexible circuit film or tape; or (2) stack assembled using the Package-on-Package (POP) assembling technology; that is assembling one single-layer-packaged logic drive on top of the other single-layer-packaged logic drive. The POP assembling technology may apply, for example, the Surface Mount Technology (SMT).

Another aspect of the disclosure provides a method for a single-layer-packaged logic drive suitable for the stacked POP assembling technology. The single-layer-packaged logic drive for use in the POP package assembling are fabricated as the same as the process steps and specifications of the COIP multi-chip packaged logic drive as described in the above paragraphs, except for forming Through-Package-Vias, or Through Polymer Vias (TPVs) in the gaps between chips in or of the logic drive, and/or in the peripheral area of the logic drive package and outside the edges of chips in or of the logic drive. The TPVs are used for connecting or coupling circuits or components at the frontside (bottom) of the logic drive to that at the backside (top) of the logic drive package, the frontside is the side with the interposer or substrate, wherein the chips with the side having transistors are faced down. The single-layer-packaged logic drive with TPVs for use in the stacked logic drive may be in a standard format or having standard sizes. For example, the single-layer-packaged logic drive may be in a shape of square or rectangle, with a certain widths, lengths and thicknesses. An industry standard may be set for the shape and dimensions of the single-layer-packaged logic drive. For example, the standard shape of the single-layer-packaged logic drive may be a square, with a width greater than or equal to 4 mm, 7 mm, 10 mm, 12 mm, 15 mm, 20 mm, 25 mm, 30 mm, 35 mm or 40 mm, and having a thickness greater than or equal to 0.03 mm, 0.05 mm, 0.1 mm, 0.3 mm, 0.5 mm, 1 mm, 2 mm, 3 mm, 4 mm, or 5 mm. Alternatively, the standard shape of the single-layer-packaged logic drive may be a rectangle, with a width greater than or equal to 3 mm, 5 mm, 7 mm, 10 mm, 12 mm, 15 mm, 20 mm, 25 mm, 30 mm, 35 mm or 40 mm, and a length greater than or equal to 5 mm, 7 mm, 10 mm, 12 mm, 15 mm, 20 mm, 25 mm, 30 mm, 35 mm, 40 mm, 45 mm or 50 mm; and having a thickness greater than or equal to 0.03 mm, 0.05 mm, 0.1 mm, 0.3 mm, 0.5 mm, 1 mm, 2 mm, 3 mm, 4 mm, or 5 mm. The logic drive with TPVs is formed by forming another set of copper pillars or bumps on or of the interposer, with the height of copper bump or pillar taller than that of the micro copper pad, bump or pillar on the SISIP and/or FISIP used for the flip-chip assembly (flip-chip micro copper pads, pillars or bumps) on or of the interposer. The process steps of forming the flip-chip micro copper pads, bumps or pillars are described or specified above. Here, the process steps of forming the flip-chip micro copper pads, bumps or pillars are described again, and followed by process steps of forming the TPVs (a) on or over the top surfaces of the top-most interconnection metal layer of SISIP, exposed in openings in the top-most insulating dielectric layer of the SISIP, or (b) on or over the top surfaces of the top-most interconnection metal layer of FISIP, exposed in openings in the top-most insulating dielectric layer of the FISIP, in the case when the SISIP is omitted. Performing a double emboss copper process to form (a) the micro copper pads, pillars or bumps for use in the flip-chip (IC chips) assembly, and (b) TPVs on or of the interposer as described below: (i) depositing whole wafer or panel an adhesion layer on or over the top-most insulting dielectric layer (of SISIP or FISIP) and the exposed top surfaces of the top-most interconnection layer of SISIP or FISIP at the bottom of the openings in top-most insulating layer, for example, sputtering or CVD depositing a titanium (Ti) or titanium nitride (TiN) layer (with a thickness, for example, between 1 nm and 200 nm, or 5 nm and 50 nm); (ii) then depositing an electroplating seed layer on or over the adhesion layer, for example, sputtering or CVD depositing a copper seed layer (with a thickness, for example, between 3 nm and 300 nm, or 10 nm and 120 nm); (iii) depositing a first photoresist layer and patterning openings or holes in the first photoresist layer, for forming the flip-chip micro copper pads, pillars or bumps later, by coating, exposing and developing the first photoresist layer, exposing the copper seed layer at the bottom of the openings or holes in the first photoresist layer. The first photoresist layer has a thickness, for example, between 2 μm and 60 μm, 5 μm and 50 μm, 5 μm and 40 μm, 5 μm and 30 μm, 5 μm and 20 μm, 2 μm and 15 μm, or 2 μm and 10 μm, or smaller than or equal to 60 μm, 30 μm, 20 μm, 15 μm, 10 μm or 5 μm. The opening or hole in the first photoresist layer overlaps the opening or hole in the top-most insulating layer; and may extend out of the opening or hole of the insulating dielectric layer, to an area or a ring of the insulating dielectric layer around the opening or hole in the insulating dielectric layer; (iv) then electroplating a copper layer (with a thickness, for example, between 2 μm and 60 μm, 5 μm and 50 μm, 5 μm and 40 μm, 5 μm and 30 μm, 5 μm and 20 μm, 2 μm and 15 μm, or 2 μm and 10 μm, or smaller than or equal to 60 μm, 30 μm, 20 μm, 15 μm, 10 μm or 5 μm) on or over the copper seed layer in the patterned openings or holes of the first photoresist layer; (v) removing the remained first photoresist, and exposed the surfaces of electroplated copper seed layer; (vi) depositing a second photoresist layer and patterning openings or holes in the second photoresist layer for forming the TPVs later by coating, exposing and developing the second photoresist layer, exposing the copper seed layer at the bottom of the openings or holes in the second photoresist layer. The second photoresist layer has a thickness, for example, between 5 μm and 300 μm, 5 μm and 200 μm, 5 μm and 150 μm, 5 μm and 120 μm, 10 μm and 100 μm, 10 μm and 60 μm, 10 μm and 40 μm, or 10 μm and 30 μm). The locations of the openings or holes in the second photoresist layer are in the gaps between chips in or of the logic drive, and/or in peripheral area of the logic drive package and outside the edges of chips in or of the logic drive, (the chips are to be flip-chip bonded to the flip-chip micro copper pads, pillars or bumps in latter processes). The top surfaces of the micro copper pads, pillars or bumps are not exposed by openings in the second photoresist layer; (vii) then electroplating a copper layer (with a thickness, for example, between 5 μm and 300 μm, 5 μm and 200 μm, 5 μm and 150 μm, 5 μm and 120 μm, 10 μm and 100 μm, 10 μm and 60 μm, 10 μm and 40 μm, or 10 μm and 30 μm) on or over the copper seed layer in the patterned openings or holes of the second photoresist layer; (viii) removing the remained second photoresist to expose the copper seed layer; (ix) removing or etching the copper seed layer and the adhesion layer not under the electroplated coppers for both TPVs and flip-chip micro copper pads, pillars or bumps. Alternatively, the micro copper pads, pillars or bumps may also be formed at the locations of TPVs while forming the flip-chip micro copper pads, pillars or bumps, process steps (i) to (v). In this case, in the process step (vi), in depositing a second photoresist layer and patterning openings or holes in the second photoresist layer for forming the TPVs later by coating, exposing and developing the second photoresist layer, the top surfaces of the micro copper pads, pillars or bumps at the locations of TPVs are exposed, and the top surfaces of the flip-chip micro copper pads, pillars or bumps are not exposed; and, in the process step (vii), electroplating a copper layer starts from the top surfaces of the micro copper pads, pillars or bumps on the exposed top surfaces of flip-chip micro copper pads, pillars or bumps in the openings or holes in the second photoresist layer. The height of TPVs (from the level of top surface of the top-most insulating layer to the level of the top surface of the copper pillars or bumps) is between, for example, 5 μm and 300 μm, 5 μm and 200 μm, 5 μm and 150 μm, 5 μm and 120 μm, 10 μm and 100 μm, 10 μm and 60 μm, 10 μm and 40 μm, or 10 μm and 30 μm, or greater than or taller than or equal to 50 μm, 30 μm, 20 μm, 15 μm, or 5 μm. The largest dimension in a cross-section of the TPVs (for example, the diameter of a circle shape or the diagonal length of a square or rectangle shape) is between, for example, 5 μm and 300 μm, 5 μm and 200 μm, 5 μm and 150 μm, and 120 μm, 10 μm and 100 μm, 10 μm and 60 μm, 10 μm and 40 μm, or 10 μm and 30 μm; or greater than or equal to 150 μm, 100 μm, 60 μm, 50 μm, 40 μm, 30 μm, 20 μm, 15 μm, or 10 μm. The smallest space between a TPV and its nearest neighboring TPV is between, for example, 5 μm and 300 μm, 5 μm and 200 μm, 5 μm and 150 μm, 5 μm and 120 μm, 10 μm and 100 μm, 10 μm and 60 μm, 10 μm and 40 μm, or 10 μm and 30 μm; or greater than or equal to 150 μm, 100 μm, 60 μm, 50 μm, 40 μm, 30 μm, 20 μm, 15 μm, or 10 μm.

The wafer or panel of the interposer, with the FISIP, SISIP, flip-chip micro copper pads, pillars and the tall copper pillars or bumps (TPVs), are then used for flip-chip assembling or bonding the IC chips to the flip-chip micro copper pads, pillars or bumps on or of the interposer for forming a logic drive. The process steps for forming the logic drive with TPVs are the same as described and specified above, including the process steps of flip-chip assembly or bonding, underfill, molding, molding compound planarization, silicon interposer thinning and formation of metal pads, pillars or bumps on or under the interposer. Some process steps are mentioned again below. In the Process Step (1) for forming the logic drive described above: Since there are TPVs between IC chips, a clearness of space is needed for the dispenser to perform the underfill dispensing. That is there are no TPVs in the path for dispensing underfill. In the Process Step (2) for forming the logic drive described above: A material, resin, or compound is applied to (i) fill gaps between chips, (ii) cover the backside surfaces of chips (with IC chips faced down), (iii) filling gaps between copper pillars or bumps (TPVs) on, over or of the interposer, (iv) cover the top surfaces of the copper pillars or bumps (TPVs) on or over the wafer or panel. Applying a CMP process, polishing process or grinding process to planarize the surface of the applied material, resin or compound to a level where (i) all top surfaces of copper pillars or bumps (TPVs) on or over the wafer or panel, are fully exposed. The exposed top surfaces of the TPVs may be used as metal pads for bonding other electronic components (on the top side of the logic drive, the IC chips are facing down) on the logic drive using the POP packaging method. Alternatively, solder bumps may be formed on the exposed top surfaces of the TPVs by the methods of screen printing or solder ball mounting. The solder bumps are used for connecting or assembly the logic drive to other electronic components on the top side of the logic drive (IC chips are facing down).

Another aspect of the disclosure provides a method for forming a stacked logic drive, for an example, by the following process steps: (i) providing a first single-layer-packaged logic drive, either separated or still in the wafer or panel format, with its copper pillars or bumps, or solder bumps faced down, and with the exposed copper pads of TPVs faced up (IC chips are facing down); (ii) Package-On-Package (POP) stacking assembling, by surface-mounting and/or flip-package methods, a second separated single-layer-packaged logic drive on top of the provided first single-layer-packaged logic drive. The surface-mounting process is similar to the Surface-Mount Technology (SMT) used in the assembly of components on or to the Printed Circuit Boards (PCB), by first printing solder or solder cream, or flux on the copper pads (top surfaces) of the TPVs, and then flip-package assembling, connecting or coupling the copper pillars or bumps, or solder bumps on or of the second separated single-layer-packaged logic drive to the solder or solder cream or flux printed copper pads of TPVs of the first single-layer-packaged logic drive. The flip-package process is performed, similar to the Package-On-Package technology (POP) used in the IC stacking-package technology, by flip-package assembling, connecting or coupling the copper pillars or bumps, solder bumps on or of the second separated single-layer-packaged logic drive to the copper pads of TPVs of the first single-layer-packaged logic drive. An underfill material may be filled in the gaps between the first and second single-layer-packaged logic drives. A third separated single-layer-packaged logic drive may be flip-package assembled, connected or coupled to the exposed copper pads of TPVs of the second single-layer-packaged logic drive. The Package-On-Package stacking assembling process may be repeated for assembling more separated single-layer-packaged logic drives (for example, up to more than or equal to a nth separated single-layer-packaged logic drive, wherein n is greater than or equal to 2, 3, 4, 5, 6, 7, 8) to form the finished stacking logic drive. When the first single-layer-packaged logic drives are in the separated format, they may be first flip-package assembled to a carrier or substrate, for example a PCB, or a BGA (Ball-Grid-Array) substrate, and then performing the POP processes, in the carrier or substrate format, to form stacked logic drives, and then cutting, dicing the carrier or substrate to obtain the separated finished stacked logic drives. When the first single-layer-packaged logic drives are still in the wafer or panel format, the wafer or panel may be used directly as the carrier or substrate for performing POP stacking processes, in the wafer or panel format, for forming the stacked logic drive. The wafer or panel is then cut or diced to obtain the separated stacked finished logic drives.

Another aspect of the disclosure provides a method for a single-layer-packaged logic drive suitable for the stacked POP assembling technology. The single-layer-packaged logic drive for use in the POP package assembling are fabricated as the same process steps and specifications of the COIP multi-chip packages described in the above paragraphs, except for forming a Backside metal Interconnection Scheme at the backside of the single-layer-packaged logic drive (abbreviated as BISD in below) and Through-Package-Vias, or Through Polymer Vias (TPVs) in the gaps between chips in or of the logic drive, and/or in the peripheral area of the logic drive package and outside the edges of chips in or of the logic drive (the side with transistors of the IC chips are facing down). The BISD may comprise metal lines, traces, or planes in multiple interconnection metal layers, and is formed on or over the backside of the IC chips (the side of IC chips with the transistors are facing down), the molding compound after the process step of planarization of the molding compound, and the exposed top surfaces of the TPVs. The BISD provides additional interconnection metal layer or layers at the backside of the logic drive package, and provides copper pads, copper pillars or solder bumps in an area array at the backside of the single-layer-packaged logic drive, including at locations directly and vertically over the IC chips of the logic drive (IC chips with the transistors side faced down). The TPVs are used for connecting or coupling circuits or components (for example, the FISIP and/or SISIP) of the interposer of the logic drive to that (for example, the BISD) at the backside of the logic drive package. The single-layer-packaged logic drive with TPVs and BISD for use in the stacked logic drive may be in a standard format or having standard sizes. For example, the single-layer-packaged logic drive may be in a shape of square or rectangle, with a certain widths, lengths and thicknesses; and/or with a standard layout of the locations of the copper pads, copper pillars or solder bumps on or over the BISD. An industry standard may be set for the shape and dimensions of the single-layer-packaged logic drive. For example, the standard shape of the single-layer-packaged logic drive may be a square, with a width greater than or equal to 4 mm, 7 mm, 10 mm, 12 mm, 15 mm, 20 mm, 25 mm, 30 mm, 35 mm or 40 mm, and having a thickness greater than or equal to 0.03 mm, 0.05 mm, 0.1 mm, 0.3 mm, 0.5 mm, 1 mm, 2 mm, 3 mm, 4 mm, or 5 mm. Alternatively, the standard shape of the single-layer-packaged logic drive may be a rectangle, with a width greater than or equal to 3 mm, 5 mm, 7 mm, 10 mm, 12 mm, 15 mm, 20 mm, 25 mm, 30 mm, 35 mm or 40 mm, and a length greater than or equal to 5 mm, 7 mm, 10 mm, 12 mm, 15 mm, 20 mm, 25 mm, 30 mm, 35 mm, 40 mm, 45 mm or 50 mm; and having a thickness greater than or equal to 0.03 mm, 0.05 mm, 0.1 mm, 0.3 mm, 0.5 mm, 1 mm, 2 mm, 3 mm, 4 mm, or 5 mm. The logic drive with the BISD is formed by forming metal lines, traces, or planes on multiple interconnection metal layers on or over the backside of the IC chips (the side of IC chips with the transistors are faced down), the molding compound, and the exposed top surfaces of the TPVs, after the process step of planarization of the molding compound. The process steps for forming the BISD are: (a) depositing a bottom-most insulting dielectric layer, whole wafer or panel, on or over the exposed backside of the IC chips, molding compound and the exposed top surfaces of the TPVs. The bottom-most insulting dielectric layer may be a polymer material includes, for example, polyimide, BenzoCycloButene (BCB), parylene, epoxy-based material or compound, photo epoxy SU-8, elastomer, or silicone. The bottom-most polymer insulating dielectric layer may be deposited by methods of spin-on coating, screen-printing, dispensing, or molding. The polymer material may be photosensitive, and may be used as photoresist as well for patterning openings in it for forming metal vias in it by following processes to be performed later; that is, the photosensitive polymer layer is coated, and exposed to light through a photomask, and then developed and etched to form openings in it. The openings in the bottom-most insulating dielectric layer expose the top surfaces of the TPVs. The bottom-most polymer layer (the insulating dielectric layer) is then cured at a temperature, for example, equal to or higher than 100° C., 125° C., 150° C., 175° C., 200° C., 225° C., 250° C., 275° C. or 300° C. The thickness of the cured bottom-most polymer is between, for example, 3 μm and 50 μm, 3 μm and 30 μm, 3 μm and 20 μm, or 3 μm and 15 μm; or thicker than or equal to 3 μm, 5 μm, 10 μm, 20 μm, or 30 μm; (b) performing an emboss copper process to form the metal vias in the openings of the cured bottom-most polymer insulating dielectric layer, and to form metal lines, traces or planes of a bottom-most interconnection metal layer of the BISD: (i) depositing whole wafer or panel an adhesion layer on or over the bottom-most insulting dielectric layer and the exposed top surfaces of TPVs at the bottom of the openings in the cured bottom-most polymer layer, for example, sputtering or CVD depositing a titanium (Ti) or titanium nitride (TiN) layer (with a thickness, for example, between 1 nm and 200 nm, or 5 nm and 50 nm); (ii) then depositing an electroplating seed layer on or over the adhesion layer, for example, sputtering or CVD depositing a copper seed layer (with a thickness, for example, between 3 nm and 300 nm, or 10 nm and 120 nm); (iii) patterning trenches, openings or holes in a photoresist layer for forming metal lines, traces or planes of the bottom-most interconnection metal layer later by coating, exposing and developing the photoresist layer, exposing the copper seed layer at the bottom of the trenches, openings or holes in the photoresist layer. The trench, opening or hole in the photoresist layer overlaps the opening in the bottom-most insulating dielectric layer; and may extend out of the opening of the bottom-most insulating dielectric layer; (iv) then electroplating a copper layer (with a thickness, for example, between 3 μm and 80 μm, 5 μm and 50 μm, 5 μm and 40 μm, 5 μm and 30 μm, 3 μm and 20 μm, 3 μm and 15 μm, or 3 μm and 10 μm) on or over the copper seed layer in the patterned trenches, openings or holes of the photoresist layer; (v) removing the remained photoresist; (vi) removing or etching the copper seed layer and the adhesion layer not under the electroplated copper. The metals (Ti (or TiN)/seed Cu/electroplated Cu) left or remained in the locations of trenches, openings or holes in the photoresist layer (note that the photoresist is removed now) are used as the metal lines, traces or planes of the bottom-most interconnection metal layer of the BISD; and the metals (Ti (or TiN)/seed Cu/electroplated Cu) left or remained in the openings of the bottom-most insulting dielectric layer are used as the metal vias in the bottom-most insulating dielectric layer of the BISD. The processes of forming the bottom-most insulating dielectric layer and openings in it; and the emboss copper processes for forming the metal vias in the bottom-most insulting dielectric layer and the metal lines, traces, or planes of the bottom-most interconnection metal layer, may be repeated to form a metal layer of multiple interconnection metal layers in or of the BISD; wherein the repeated bottom-most insulating dielectric layer is used as the inter-metal dielectric layer between two interconnection metal layers of the BISD, and the metal vias in the bottom-most insulating dielectric layer (now in the inter-metal dielectric layer) are used for connecting or coupling metal lines, traces, or planes of the two interconnection metal layers, above and below the metal vias, of the BISD. The top-most interconnection metal layer of the BISD is covered with a top-most insulating dielectric layer of the BISD. Forming copper pads, solder bumps, copper pillars on or over the top-most metal layer of BISD exposed in openings in the top-most insulating dielectric layer of BISD using emboss copper process as described and specifies in above. The locations of the copper pads, copper pillars or solder bumps are on or over: (a) the gaps between chips in or of the logic drive; (b) peripheral area of the logic drive package and outside the edges of chips in or of the logic drive; (c) and/or directly and vertically over the backside of the IC chips. The BISD may comprise 1 to 6 layers, or 2 to 5 layers of interconnection metal layers. The interconnection metal lines, traces or planes of the BISD have the adhesion layer (Ti or TiN, for example) and the copper seed layer only at the bottom, but not at the sidewalls of the metal lines or traces. The interconnection metal lines or traces of FISC and FISIP have the adhesion layer (Ti or TiN, for example) and the copper seed layer at both the bottom and the sidewalls of the metal lines or traces.

The thickness of the metal lines, traces or planes of the BISD is between, for example, 0.3 μm and 40 μm, 0.5 μm and 30 μm, 1 μm and 20 μm, 1 μm and 15 μm, 1 μm and 10 μm, or 0.5 μm and 5 μm, or thicker than or equal to 0.3 μm, 0.7 μm, 1 μm, 2 μm, 3 μm, 5 μm, 7 μm or 10 μm. The width of the metal lines or traces of the BISD is between, for example, 0.3 μm and 40 μm, 0.5 μm and 30 μm, 1 μm and 20 μm, 1 μm and 15 μm, 1 μm and 10 μm, or 0.5 μm and 5 μm, or wider than or equal to 0.3 μm, 0.7 μm, 1 μm, 2 μm, 3 μm, 5 μm, 7 μm or 10 μm. The thickness of the inter-metal dielectric layer of the BISD is between, for example, 0.3 μm and 50 μm, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm. The planes in a metal layer of interconnection metal layers of the BISD may be used for the power, ground planes of a power supply, and/or used as heat dissipaters or spreaders for the heat dissipation or spreading; wherein the metal thickness may be thicker, for example, between 5 μm and 50 μm, 5 μm and 30 μm, 5 μm and 20 μm, or 5 μm and 15 μm; or thicker than or equal to 5 μm, 10 μm, 20 μm, or 30 μm. The power, ground plane, and/or heat dissipater or spreader may be layout as interlaced or interleaved shaped structures in a plane of an interconnection metal layer of the BISD; or may be layout in a fork shape.

The BISD interconnection metal lines or traces of the single-layer-packaged logic drive are used: (a) for connecting or coupling the copper pads, copper pillars or solder bumps at the backside (top side, with the side having transistors of IC chips faced down) surface of the single-layer-packaged logic drive to their corresponding TPVs; and through the corresponding TPVs, the copper pads, copper pillars or solder bumps at the backside surface of the single-layer-packaged logic drive are connected or coupled to the metal lines or traces of the FISIP and/or SISIP of the interposer; and further through the micro copper pillars or bumps, the SISC, and the FISC of the IC chips for connecting or coupling to the transistors; (b) for connecting or coupling the copper pads, copper pillars or solder bumps at the backside (top side, with the side having transistors of IC chips faced down) surface of the single-layer-packaged logic drive to their corresponding TPVs; and through the corresponding TPVs, the copper pads, copper pillars or solder bumps at the backside surface of the single-layer-packaged logic drive are connected or coupled to the metal lines or traces of the FISIP and/or SISIP of the interposer, and are further through TSVs for connecting or coupling to copper pads, metal bumps or pillars, for example, solder bumps, copper pillars or bumps at the frontside (bottom side, with the side having transistors of IC chips faced down) surface of the single-layer-packaged logic drive. Therefore, the copper pads, copper pillars or solder bumps at the backside (top side, with the side having transistors of IC chips faced down) of the single-layer-packaged logic drive are connected or coupled to the copper pads, metal pillars or bumps at the frontside (bottom side, with the side having transistors of IC chips faced down) of the single-layer-packaged logic drive; (c) for connecting or coupling copper pads, copper pillars or solder bumps directly and vertically over a backside of a first FPGA chip (top side, with the side having transistors of the first FPGA chip faced down) of the single-layer-packaged logic drive to copper pads, copper pillars or solder bumps directly and vertically over a second FPGA chip (top side, with the side having transistors of the second FPGA chip faced down) of the single-layer-packaged logic drive by using an interconnection net or scheme of metal lines or traces in or of the BISD. The interconnection net or scheme may be connected or coupled to TPVs of the single-layer-packaged logic drive; (d) for connecting or coupling a copper pad, copper pillars or solder bumps directly and vertically over a FPGA chip of the single-layer-packaged logic drive to another copper pad, copper pillars or solder bumps, or multiple other copper pads, copper pillars or solder bumps directly and vertically over the same FPGA chip by using an interconnection net or scheme of metal lines or traces in or of the BISD. The interconnection net or scheme may be connected or coupled to the TPVs of the single-layer-packaged logic drive; (e) for the power or ground planes and/or heat dissipaters or spreaders.

Another aspect of the disclosure provides a method for forming a stacked logic drive using the single-layer-packaged logic drive with the BISD and TPVs. The stacked logic drive may be formed using the same or similar process steps, as described and specified above; for an example, by the following process steps: (i) providing a first single-layer-packaged logic drive with both TPVs and the BISD, either separated or still in the wafer or panel format, and with its copper pillars or bumps, or solder bumps, on or under the TSVs, faced down, and with the exposed copper pads, copper pillars, or solder bumps, on or over the BISD, on its upside; (ii) Package-On-Package (POP) stacking assembling, by surface-mounting and/or flip-package methods, a second separated single-layer-packaged logic drive (also with both TPVs and the BISD) on top of the provided first single-layer-packaged logic drive. The surface-mounting process is similar to the Surface-Mount Technology (SMT) used in the assembly of components on or to the Printed Circuit Boards (PCB), by, for example, first printing solder or solder cream, or flux on the surfaces of the exposed copper pads, and then flip-package assembling, connecting or coupling the copper pillars or bumps, or solder bumps, on or of the second separated single-layer-packaged logic drive to the solder or solder cream or flux printed surfaces of the exposed copper pads of the first single-layer-packaged logic drive. The flip-package process is performed, similar to the Package-On-Package technology (POP) used in the IC stacking-package technology, by flip-package assembling, connecting or coupling the copper pillars or bumps, or solder bumps on or of the second separated single-layer-packaged logic drive to the surfaces of copper pads of the first single-layer-packaged logic drive. Note that the copper pillars or bumps, or solder bumps on or of the second separated single-layer-packaged logic drive bonded to the surfaces of copper pads of the first single-layer-packaged logic drive may be located directly and vertically over or above locations where IC chips are placed in the first single-layer-packaged logic drive; and that the copper pillars or bumps, or solder bumps on or of the second separated single-layer-packaged logic drive bonded to the surfaces of copper pads of the first single-layer-packaged logic drive may be located directly and vertically under or below locations where IC chips are placed in the second single-layer-packaged logic drive. An underfill material may be filled in the gaps between the first and the second single-layer-packaged logic drives. A third separated single-layer-packaged logic drive (also with both TPVs and the BISD) may be flip-package assembled, connected or coupled to the copper pads (on or over the BISD) of the second single-layer-packaged logic drive. The Package-On-Package stacking assembling process may be repeated for assembling more separated single-layer-packaged logic drives (for example, up to more than or equal to a nth separated single-layer-packaged logic drive, wherein n is greater than or equal to 2, 3, 4, 5, 6, 7, 8) to form the finished stacking logic drive. When the first single-layer-packaged logic drives are in the separated format, they may be first flip-package assembled to a carrier or substrate, for example a PCB, or a BGA (Ball-Grid-Array) substrate, and then performing the POP processes, in the carrier or substrate format, to form stacked logic drives, and then cutting, dicing the carrier or substrate to obtain the separated finished stacked logic drives. When the first single-layer-packaged logic drives are still in the wafer or panel format, the wafer or panel may be used directly as the carrier or substrate for performing POP stacking processes, in the wafer or panel format, for forming the stacked logic drives. The wafer or panel is then cut or diced to obtain the separated stacked finished logic drives.

Another aspect of the disclosure provides varieties of interconnection alternatives for the TPVs of a single-layer-packaged logic drive: (a) the TPV may be designed and formed as a through via by stacking the TPV directly over the stacked metal layers/vias of SISIP and/or FISIP and directly over the TSV in the interposer or substrate. The TSV is now used as a through via for connecting a single-layer-packaged logic drive above the single-layer-packaged logic drive, and a single-layer-packaged logic drive below the single-layer-packaged logic drive; without connecting or coupled to the FISIP, the SISIP or micro copper pillars or bumps on or of any IC chip of the single-layer-packaged logic drive. In this case, a stacked structure is formed, from top to bottom: (i) copper pad, copper pillar or solder bump; (ii) stacked interconnection layers and metal vias in the dielectric layer of the BISD; (iii) the TPV; (iv) stacked interconnection layers and metal vias in the dielectric layer of the FISIP and/or SISIP; (v) TSV in the interposer or substrate; (vi) copper pad, metal bump, solder bump, copper pillar on or under bottom surface of the TSV. Alternatively, the stacked TPV/metal layers and vias/TSV may be used as a thermal conduction via; (b) the TPV is stacked as a through TPV as in (a), but is connected or coupled to the FISIP, the SISIP and/or micro copper pillars or bumps on or of one or more IC chips of the single-layer-packaged logic drive, through the metal lines or traces of the FISIP and/or FISIP; (c) the TPV is only stacked at the top portion, but not at the bottom portion. In this case, a structure for the TPV connection is formed, from top to bottom: (i) copper pad, copper pillar or solder bump; (ii) stacked interconnection layers and metal vias in the dielectric layer of the BISD; (iii) the TPV; (iv) the bottom of the TPV is connected or coupled to the FISIP, the SISIP or micro copper pillars or bumps on or of one or more IC chips of the single-layer-packaged logic drive, through the interconnection metal layers and metal vias in the dielectric layer of the SISIP and/or FISIP. Wherein (1) a copper pad, metal bump, solder bumps, or copper pillar, directly under the bottom of the TPV, is not connected or coupled to the TPV; (2) a copper pad, metal bump, solder bump, or copper pillar on and under the interposer connected or coupled to the bottom of the TPV (through FISIP and/or SISIP) is at a location not directly and vertically under the bottom of the TPV; (d) a structure for the TPV connection is formed, from top to bottom: (i) a copper pad, copper pillar or solder bump (on the BISD) connected or coupled to the top surface of the TPV, and may be at a location directly and vertically over the backside of the IC chips; (ii) the copper pad, copper pillar or solder bump (on the BISD) is connected or coupled to the top surface of the TPV (which is located between the gaps of chips or at the peripheral area where no chip is placed) through the interconnection metal layers and metal vias in the dielectric layer of the BISD; (iii) the TPV; (iv) the bottom of the TPV is connected or coupled to the FISIP, the SISIP, or the micro copper pillars or bumps on or of one or more IC chips of the single-layer-packaged logic drive through the interconnection metal layers and metal vias in the dielectric layer of the SISIP and/or FISIP; (v) TSV (in the interposer or substrate) and a metal pad, pillar or bump (on or under the TSV) connected or coupled to the bottom of the TPV, wherein the TSV or the metal pad, bump or pillar may be at a location not directly under the bottom of the TPV; (e) a structure for the TPV connection is formed, from top to bottom: (i) a copper pad, copper pillar or solder bump (on the BISD) directly or vertically over the backside of an IC chip of the single-layer-packaged logic drive; (ii) the copper pad, copper pillar or solder bump on the BISD is connected or coupled to the top surface of the TPV (which is located between the gaps of chips or at the peripheral area where no chip is placed) through the interconnection metal layers and metal vias in the dielectric layer of the BISD; (iii) the TPV; (iv) the bottom of the TPV is connected or coupled to the FISIP, the SISIP of interposer, and/or micro copper pillars or bumps, SISC, or FISC on or of one or more IC chips of the single-layer-packaged logic drive through the interconnection metal layers and metal vias in the dielectric layer of the CISIP and/or FISIP. Wherein no TSV (in the interposer or substrate) and no metal pad, pillar or bump (on or under the TSV) are connected or coupled to the bottom of the TPV.

Another aspect of the disclosure provides an interconnection net or scheme of metal lines or traces in or of the FISIP and/or SISIP of the single-layer-packaged logic drive used for connecting or coupling the transistors, the FISC, the SISC and/or the micro copper pillars or bumps of an FPGA IC chip or multiple FPGA IC chips packaged in the single-layer-packaged logic drive, but the interconnection net or scheme is not connected or coupled to the circuits or components outside or external to the single-layer-packaged logic drive. That is, no metal pads, pillars or bumps (copper pads, pillars or bumps, or solder bumps) on or under the interposer of the single-layer-packaged logic drive is connected to the interconnection net or scheme of metal lines or traces in or of the FISIP and/or SISIP, and no copper pads, copper pillars or solder bumps on or over the BISD is connected or coupled to the interconnection net or scheme of metal lines or traces in or of the FISIP and/or SISIP.

Another aspect of the disclosure provides the logic drive in a multi-chip package format further comprising one or plural dedicated programmable NVM (DPNVM) chip or chips, i.e. dedicated programmable interconnection IC (DPIIC) chip or chips. The DPNVM chip comprises FGCMOS NVM, MRAM or RRAM cells and cross-point switches, and is used for programming the interconnection between circuits or interconnections of the chips in or of the logic drive, for example, the standard commodity FPGA chips. The programmable interconnections comprise interconnection metal lines or traces on, over or of the interposer (the FISIP and/or SISIP) between the chips, for example, the standard commodity FPGA chips, with cross-point switch circuits in the middle of interconnection metal lines or traces of the FISIP and/or SISIP. For example, n metal lines or traces of the FISIP and/or SISIP are input to a cross-point switch circuit, and m metal lines or traces of the FISIP and/or SISIP are output from the cross-point switch circuit. The cross-point switch circuit is designed such that each of the n metal lines or traces of the FISIP and/or SISIP can be programed to connect to anyone of the m metal lines or traces of the FISIP and/or SISIP. The cross-point switch circuit may be controlled by the programming code stored in, for example, FGCMOS NVM, MRAM or RRAM cells in or of the DPNVM chip. The stored (programming) data in the FGCMOS NVM, MRAM or RRAM cells are used to program the connection or not-connection of metal lines or traces of the FISIP and/or SISIP. The cross-point switches are the same as that described in the standard commodity FPGA IC chips. The details of various types of cross-point switches are as specified or described in the paragraphs of FPGA IC chips. The cross-point switches may comprise: (1) n-type and p-type transistor pair circuits; or (2) multiplexers and switch buffers. In Case (1), when the data stored in the FGCMOS NVM, MRAM or RRAM cell is programmed at 1, a pass/no-pass circuit comprising a n-type and p-type transistor pair is on, and the two metal lines or traces of the FISIP and/or SISIP connected to two terminals of the pass-no-pass circuit (the source and drain of the transistor pair, respectively), are connected; while the data stored in the FGCMOS NVM, MRAM or RRAM cell is programmed at 0, a pass/no-pass circuit comprising a n-type and p-type transistor pair circuit is off, and the two metal lines or traces of the FISIP and/or SISIP connected to two terminals of the pass/no-pass circuit (the source and drain of the transistor pair, respectively), are dis-connected. In Case (2), the multiplexer selects one from n inputs as its output, and then input its output to the switch buffer. When the data stored in the FGCMOS NVM, MRAM or RRAM cell is programmed at 1, the control N-MOS transistor and the control P-MOS transistor in the switch buffer are on, the data on the input metal line is passing to the output metal line of the cross-point switch, and the two metal lines or traces of the FISIP and/or SISIP connected to two terminals of the cross-point switch are coupled or connected; while the data stored in the FGCMOS NVM, MRAM or RRAM cell is programmed at 0, the control N-MOS transistor and the control P-MOS transistor in the switch buffer are off, the data on the input metal line is not passing to the output metal line of the cross-point switch, and the two metal lines or traces of the FISIP and/or SISIP connected to two terminals of the cross-point switch are not coupled or dis-connected. The DPNVM chip comprises FGCMOS NVM, MRAM or RRAM cells and cross-point switches used for programmable interconnection of metal lines or traces of the FISIP and/or SISIP between the standard commodity FPGA chips in the logic drive.

Alternatively, the DPNVM chip comprising FGCMOS NVM, MRAM or RRAM cells and cross-point switches may be used for programmable interconnection of metal lines or traces of the FISIP and/or SISIP between the standard commodity FPGA chips and the TPVs (for example, the bottom surfaces of the TPVs) in the logic drive, in the same or similar method as described above. The stored (programming) data in the FGCMOS NVM, MRAM or RRAM cell is used to program the connection or not-connection between (i) a first metal line, trace, or net of the FISIP and/or SISIP, connecting to one or more micro copper pillars or bumps on or over one or more the IC chips of the logic drive, and/or to one or more metal pads, pillars or bumps on or under the TSVs of the interposer, and (ii) a second metal line, trace or net of the FISIP and/or SISIP, connecting or coupling to a TPV (for example, the bottom surface of the TPV), in a same or similar method described above. With this aspect of disclosure, TPVs are programmable; in other words, this aspect of disclosure provides programmable TPVs. The programmable TPVs may, alternatively, use the programmable interconnection, comprising FGCMOS NVM, MRAM or RRAM cells and cross-point switches, on or of the FPGA chips in or of the logic drive. The programmable TPV may be, by (software) programming, (i) connected or coupled to one or more micro copper pillars or bumps of one or more IC chips (therefor to the metal lines or traces of the SISC and/or the FISC, and/or the transistors) of the logic drive, and/or (ii) connected or coupled to one or more metal pads, pillars or bumps on or under TSVs of the interposer of the logic drive.

When a metal pad, bump or pillar (on or over the BISD) at the backside of the logic drive is connected to the programmable TPV, the metal pad, bump or pillar (on or over the BISD) becomes a programmable metal bump or pillar (on or over the BISD) based on FGCMOS NVM, MRAM or RRAM cells and cross-point switches on the DPNVM chip. The programmable metal pad, bump or pillar (on or over the BISD) at the backside of the logic drive may be connected or coupled to, by programming and through the programmable TPV, (i) one or more micro copper pillars or bumps of one or more IC chips (therefor to the metal lines or traces of the SISC and/or the FISC, and/or the transistors) at the frontside (the side with the transistors) of the one or more IC chips of the logic drive, and/or (ii) one or more metal pads, pillars or bumps on or under the TSVs of the interposer of the logic drive. Alternatively, the programmable metal bump or pillar on or over the BISD may use the programmable interconnection, comprising FGCMOS NVM, MRAM or RRAM cells and cross-point switches, on or of the FPGA chips in or of the logic drive.

The DPNVM chip comprises FGCMOS NVM, MRAM or RRAM cells and cross-point switches may be used for programmable interconnection of metal lines or traces of the FISIP and/or SISIP between the metal pads, pillars or bumps (copper pads, copper pillars or bumps, or solder bumps) on or under the TSVs of the interposer of the logic drive and one or more micro copper pillars or bumps on or of one or more IC chips of the logic drive, in a same or similar method as described above. The stored (programming) data in the FGCMOS NVM, MRAM or RRAM cell on the DPNVM chip is used to program the connection or not-connection between (i) a first metal line, trace or net of the FISIP and/or SISIP, connecting to one or more micro copper pillars or bumps on or of one or more IC chips of the logic drive, and (ii) a second metal line, trace or net of the FISIP and/or SISIP, connecting or coupling to the metal pad, pillar or bump on or under the TSVs of the interposer, in a same or similar method described above. With this aspect of disclosure, metal pads, pillars or bumps on or under the TSVs of the interposer are programmable; in other words, this aspect of disclosure provides programmable metal pads, pillars or bumps on or under the TSVs of the interposer. The programmable metal pad, pillar or bump on or under the TSVs of the interposer may, alternatively, use the programmable interconnection, comprising FGCMOS NVM, MRAM or RRAM cells and cross-point switches, on or of the FPGA chips in or of the logic drive. The programmable metal pad, pillar or bump on or under the interposer may be connected or coupled, by programming, to one or more micro copper pillars or bumps of one or more IC chips (therefor to the metal lines or traces of the SISC and/or the FISC, and/or the transistors) of the logic drive.

The DPNVM chip is designed, implemented and fabricated using varieties of semiconductor technology nodes or generations, including old or matured technology nodes or generations, for example, a semiconductor node or generation less advanced than or equal to, or more mature than 20 nm or 30 nm, and for example using the technology node of 22 nm, 28 nm, 40 nm, 90 nm, 130 nm, 180 nm, 250 nm, 350 nm or 500 nm. The semiconductor technology node or generation used in the DPNVM chip is 1, 2, 3, 4, 5 or greater than 5 nodes or generations older, more matured or less advanced than that used in the standard commodity FPGA IC chips packaged in the same logic drive. Transistors used in the DPNVM chip may be a FINFET, a Fully Depleted Silicon-on-insulator (FDSOI) MOSFET, a Partially Depleted Silicon-on-insulator (PDSOI) MOSFET or a conventional MOSFET. Transistors used in the DPNVM chip may be different from that used in the standard commodity FPGA IC chips packaged in the same logic drive; for example, the DPNVM chip may use the conventional MOSFET, while the standard commodity FPGA IC chips packaged in the same logic drive may use the FINFET; or the DPNVM chip may use the Fully Depleted Silicon-On-Insulator (FDSOI) MOSFET, while the standard commodity FPGA IC chips packaged in the same logic drive may use the FINFET.

Another aspect of the disclosure provides a standardized interposer, in the wafer form or panel form in the stock or in the inventory for use in the later processing in forming the standard commodity logic drive, as described and specified above. The standardized interposer comprises a fixed physical layout or design of the TSVs in the interposer; and a fixed design and layout of the TPVs on or over the interposer if included in the interposer. The locations or coordinates of the TSVs and the TPVs in or on the interposer are the same or of certain types of standards of layouts and designs for the standard interposers. For example, connection schemes between TSVs and the TPVs, are the same for each of the standard commodity interposers. Furthermore, the design or interconnection of the FISIP and/or SISIP, and the layout or coordinates of the micro copper pads, pillars or bumps on or over the SISIP and/or FISIP are the same or of certain types of standards of layouts and designs for the standard interposers. The standard commodity interposer in the stock or inventory is then used for forming the standard commodity logic drive by the process described and specified above, including process steps: (1) flip-chip assembling or bonding the IC chips on or to the standard interposer with the side or surface of the chip with transistors faced down; (2) Applying a material, resin, or compound to fill the gaps between chips and cover the backside surfaces of IC chips by methods, for example, spin-on coating, screen-printing, dispensing or molding in the wafer or panel format. Applying a CMP process, polishing process, or backside grinding process to planarize the surface of the applied material, resin or compound to a level where the top surfaces of all bumps or pillars (TPVs) on or of the interposers and the backside of IC chips are fully exposed; (3) forming the BISD; and (4) forming the metal pads, pillars or bumps on or over the BISD. The standard commodity interposer or substrates with a fixed layout or design may be used and customized, by software coding or programming, using the programmable TPVs, programmable metal pads, pillars or bumps on or under the TSVs of the interposer (programmable TSVs) and/or programmable metal pads, pillars or bumps on or over the BISD, as described and specified above, for different algorithms, architectures and/or applications. As described above, the data installed or programed in the FGCMOS NVM, MRAM or RRAM cells of the DPNVM chips may be used for programmable TPVs, programmable metal pads, pillars or bumps (programmable TSVs) and/or programmable metal pads, pillars or bumps on or over the BISD. The data installed or programed in the FGCMOS NVM, MRAM or RRAM cells of the FPGA chips may be alternatively used for programmable TPVs and/or programmable metal pads, pillars or bumps on or under the interposer (programmable TSVs) and/or programmable metal pads, pillars or bumps on or over the BISD.

Another aspect of the disclosure provides the standardized commodity logic drive (for example, the single-layer-packaged logic drive) with a fixed design, layout or footprint of (i) the metal pads, pillars or bumps (copper pillars or bumps, or solder bumps) on or under the TSVs of the interposer, and (ii) copper pads, copper pillars or solder bumps (on or over the BISD) on the backside (top side, the side with the transistors of IC chips are faced down) of the standard commodity logic drive. The standardized commodity logic drive may be used, customized for different algorithms, architectures and/or applications by software coding or programming, using the programmable metal pads, pillars or bumps on or under the TSVs of the interposer, and/or using programmable copper pads, copper pillars or bumps, or solder bumps on or over the BISD (through programmable TPVs), as described and specified above, for different algorithms, architectures and/or applications. As described above, the codes of the software programs are loaded, installed or programed in the FGCMOS NVM, MRAM or RRAM cells of the DPNVM chip for controlling cross-point switches of the same DPNVM chip in or of the standard commodity logic drive for different varieties of algorithms, architectures and/or applications. Alternatively, the codes of the software programs are loaded, installed or programed in the FGCMOS NVM, MRAM or RRAM cells of one of the FPGA IC chips, in or of the logic drive in or of the standard commodity logic drive, for controlling cross-point switches of the same one FPGA IC chip for different varieties of algorithms, architectures and/or applications. Each of the standard commodity logic drives with the same design, layout or footprint of the metal pads, pillars or bumps on or under the TSVs of the interposer, and the copper pads, copper pillars or bumps, or solder bumps on or over the BISD may be used for different algorithms, architectures and/or applications, purposes or functions, by software coding or programming, using the programmable metal pads, pillars or bumps on or under the TSVs of the interposer, and/or programmable copper pads, copper pillars or bumps, or solder bumps on or over the BISD (through programmable TPVs) of the logic drive.

Another aspect of the disclosure provides the logic drive, either in the single-layer-packaged or in a stacked format, comprising IC chips, logic blocks (comprising LUTs, cross-point switches, multiplexers, switch buffers, logic circuits, switch buffers, logic gates, and/or computing circuits) and/or memory cells or arrays, immersing in a super-rich interconnection scheme or environment. The logic blocks (comprising LUTs, cross-point switches, multiplexers, logic circuits, logic gates, and/or computing circuits) and/or memory cells or arrays of each of the multiple standard commodity FPGA IC chips (and/or other IC chips in the single-layer-packaged or in a stacked logic drive) are immersed in a programmable 3D Immersive IC Interconnection Environment (IIIE). The programmable 3D IIIE on, in, or of the logic drive package provides the super-rich interconnection scheme or environment, comprising (1) the FISC, the SISC and micro copper pillars or bumps on, in or of the IC chips, (2) the FISIP and/or SISIP, TPVs, micro copper pillars or bumps, and TSVs of the interposer or substrate, (3) metal pads, pillars or bumps on or under the TSVs of the interposer, (4) the BISD, and (5) copper pads, copper pillars or bumps, or solder bumps on or over the BISD. The programmable 3D IIIE provides a programmable 3-Dimension (3D) super-rich interconnection scheme or system: (1) the FISC, the SISC, the FISIP and/or SISIP, and/or the BISD provide the interconnection scheme or system in the x-y directions for interconnecting or coupling the logic blocks and/or memory cells or arrays in or of a same FPGA IC chip, or in or of different FPGA chips in or of the single-layer-packaged logic drive. The interconnection of metal lines or traces in the interconnection scheme or system in the x-y directions is programmable; (2) The metal structures including (i) metal vias in the FISC and SISC, (ii) micro pillars or bumps on the SISC, (iii) metal vias in the FISIP and SISIP, (iv) micro pillars or bumps on the SISIP, (v) TSVs, (vi) metal pads, pillars or bumps on or under the TSVs of the interposer, (vii) TPVs, (viii) metal vias in the BISD, and/or (ix) copper pads, copper pillars or bumps, or solder bumps on or over the BISD, provide the interconnection scheme or system in the z direction for interconnecting or coupling the logic blocks, and/or memory cells or arrays in or of different FPGA chips in or of different single-layer-packaged logic drives stacking-packaged in the stacked logic drive. The interconnection of the metal structures in the interconnection scheme or system in the z direction is also programmable. The programmable 3D IIIE provides an almost unlimited number of the transistors or logic blocks, interconnection metal lines or traces, and memory cells/switches at an extremely low cost. The programmable 3D IIIE similar or analogous to the human brain: (i) transistors and/or logic blocks (comprising logic gates, logic circuits, computing operators, computing circuits, LUTs, and/or cross-point switches) are similar or analogous to the neurons (cell bodies) or the nerve cells; (ii) the metal lines or traces of the FISC and/or the SISC are similar or analogous to the dendrites connecting to the neurons (cell bodies) or nerve cells. The micro pillars or bumps connecting to the receivers for the inputs of the logic blocks (comprising, for example, logic gates, logic circuits, computing operators, computing circuits, LUTs, and/or cross-point switches) in or of the FPGA IC chips are similar or analogous to the post-synaptic cells at the ends of the dendrites; (iii) the long distance connects formed by metal lines or traces of the FISC, the SISC, the FISIP and/or SISIP, and/or the BISD, and the metal vias, metal pads, pillars or bumps, including the micro copper pillars or bumps on the SISC, TSVs, metal pads, pillars or bumps on or under the TSVs of the interposer, TPVs, and/or copper pads, copper pads, pillars or bumps, or solder bumps on or over the BISD, are similar or analogous to the axons connecting to the neurons (cell bodies) or nerve cells. The micro pillars or bumps connecting the drivers or transmitters for the outputs of the logic blocks (comprising, for example, logic gates, logic circuits, computing operators, computing circuits, LUTs, and/or cross-point switches) in or of the FPGA IC chips are similar or analogous to the pre-synaptic cells at the axons' terminals.

Another aspect of the disclosure provides the programmable 3D IIIE with similar or analogous connections, interconnection and/or functions of a human brain: (1) transistors and/or logic blocks (comprising, for example, logic gates, logic circuits, computing operators, computing circuits, LUTs, and/or cross-point switches) are similar or analogous to the neurons (cell bodies) or the nerve cells; (2) The interconnection schemes and/or structures of the logic drives are similar or analogous to the axons or dendrites connecting or coupling to the neurons (cell bodies) or the nerve cells. The interconnection schemes and/or structures of the logic drives comprise (i) metal lines or traces of the FISC, the SISC, the FISIP and/or SISIP, and/or BISD and/or (ii) the micro copper pillars or bumps on the SISC, TSVs, metal pads, pillars or bumps on or under the TSVs of the interposer or substrate, TPVs, and/or copper pads, copper pillars or bumps, or solder bumps on or over the BISD. An axon-like interconnection scheme and/or structure of the logic drive is connected to the driving or transmitting output (a driver) of a logic unit or operator; and having a scheme or structure like a tree, comprising: (i) a trunk or stem connecting to the logic unit or operator; (ii) multiple branches branching from the stem, and the terminal of each branch may be connected or coupled to other logic units or operators. Programmable cross-point switches (FGCMOS NVM, MRAM or RRAM cells/switches of the FPGA IC chips and/or of the DPNVM chips) are used to control the connection or not-connection between the stem and each of the branches; (iii) sub-branches branching form the branches, and the terminal of each sub-branch may be connected or coupled to other logic units or operators. Programmable cross-point switches (FGCMOS NVM, MRAM or RRAM cells/switches of the FPGA IC chips and/or of the DPNVM chips) are used to control the connection or not-connection between a branch and each of its sub-branches. A dendrite-like interconnection scheme and/or structure of the logic drive is connected to the receiving or sensing input (a receiver) of a logic unit or operator; and having a scheme or structure like a shrub or bush comprising: (i) a short stem connecting to the logic unit or operator; (ii) multiple branches branching from the stem. Programmable switches (FGCMOS NVM, MRAM or RRAM cells/switches of the FPGA IC chips and/or of the DPNVM chips) are used to control the connection or not-connection between the stem and each of its branches. There are multiple dendrite-like interconnection scheme or structures connecting or coupling to the logic unit or operator. The end of each branch of the dendrite-like interconnection scheme or structure is connected or coupled to the terminal of a branch or sub-branch of the axon-like interconnection scheme or structure. The dendrite-like interconnection scheme and/or structure of the logic drive may comprise the FISCs and SISCs of the FPGA IC chips.

Another aspect of the disclosure provides a reconfigurable plastic (elastic) and/or integral architecture for system/machine computing or processing using integral and alterable memory units and logic units, in addition to the sequential, parallel, pipelined or Von Neumann computing or processing system architecture and/or algorithm. The disclosure provides a programmable logic device (the logic drive) with plasticity (or elasticity) and integrality, comprising integral and alterable memory units and logic units, to alter or reconfigure logic functions and/or computing (or processing) architecture (or algorithm), and/or the memories (data or information) in the memory units. The properties of the plasticity (or elasticity) and integrality of the logic drive is similar or analogous to that of a human brain. The brain or nerves have plasticity (or elasticity) and integrality. Many aspects of brain or nerves can be altered (or are "plastic" or "elastic") and reconfigured through adulthood. The logic drives (or FPGA IC chips) described and specified above provide capabilities to alter or reconfigure the logic functions and/or computing (or processing) architecture (or algorithm) for a given fixed hardware using the memories (data or information) stored in the near-by Programing Memory cells (PM). In the logic drive (or FPGA IC chips), the memories (data or information) stored in the memory cells of PM are used for altering or reconfiguring the logic functions and/or computing/processing architecture (or algorithm), while some other memories stored in the memory cells are just used for data or information (Data Memory cells, DM).

The plasticity (or elasticity) and integrality of the logic drive are based on events. For the nth Event ($E_n$), the nth state ($S_n$) of the nth integral unit ($IU_n$) after the nth Event of the logic drive comprises the logic, PM and DM at the nth states, $L_n$, $PM_n$ and $DM_n$, wherein n is a positive integer, 1, 2, 3, . . . . $S_n$ is a function of $IU_n$, $L_n$, $PM_n$ and $DM_n$, that is $S_n$ ($IU_n$, $L_n$, $PM_n$, DM). The nth integral unit $IU_n$ may comprise various logic blocks, various PM memory cells (in terms of number, quantity and address/location) with various memories (in terms of content, data or information), and various DM memory cells (in terms of number, quantity and address/location) with various memories (in terms of content, data or information) for a specific logic function, a specific set of PM and DM, different from other integral units. The nth state ($S_n$) and the nth integral unit ($IU_n$) are generated based on previous events occurred before the nth event ($E_n$).

Some events may be with great magnitude of impact and are categorized as Grand Events (GE). If the nth event is characterized as a GE, the nth state $S_n$ ($IU_n$, $L_n$, $PM_n$, $DM_n$) may be reconfigured into a new state $S_{n+1}$($IU_{n+1}$, $L_{n+1}$, $PM_{n+1}$, $DM_{n+1}$), just like the human brain reconfigures the brain during the deep sleep. The newly generated states may become long term memories. The new $(n+1)^{th}$ state ($S_{n+1}$) for a new $(n+1)^{th}$ integral unit ($IU_{n+1}$) are generated based on algorithm and criteria for a grand reconfiguration after a Grand Event. As an example, the algorithm and criteria are described as follows: When the Event n ($E_n$) is quite different in magnitude from previous n−1 events, the $E_n$ is categorized as a Grand Event, and resulted in a $(n+1)^{th}$ state $S_{n+1}(IU_n+, L_{n+1}, PM_{n+1}, DM_{n+1})$ from the nth state $S_n$ ($IU_n$, $L_n$, $PM_n$, $DM_n$). After the Grand Event $E_n$, the machine/system perform a Grand Reconfiguration with some certain given criteria. The Grand Reconfiguration comprises condense or concise processes and learning processes:

I. Condense or Concise Processes:

A) DM reconfiguration: (1) The machine/system checks the $DM_n$ to find identical memories, and then keeping only one memory of all identical memories, deleting all other identical memories; and (2) The machine/system checks the $DM_n$ to find similar memories (similarity within a given percentage x %, for example, is equal to or smaller than 2%, 3%, 5% or 10%), and keeping only one or two memories of all similar memories, deleting all other similar memories; alternatively, a representative memory (data or information, having a specific range) of all similar memories may be generated and kept, while deleting all similar memories.

(B) Logic reconfiguration: (1) The machine/system checks the $PM_n$ for corresponding logic functions to find identical logics (PMs), and keeping only one logic (PMs) of all identical logics (PMs), deleting all other identical logics (PMs); (2) The machine/system checks the $PM_n$ for corresponding logic functions to find similar logics (PMs) (similarity with a given percentage x %, for example, x is equal to or smaller than 2%, 3%, 5% or 10%), and keeping only one or two logics (PMs) of all similar logics (PMs), deleting all other similar logics (PMs). Alternatively, a representative logic (PMs) (data or information in PM for the corresponding representative logic, having a specific range) of all similar logics (PMs) may be generated and kept, while deleting all similar logics (PMs).

II. Learning Processes:

Based on $S_n$ ($IU_n$, $L_n$, $PM_n$, $DM_n$), performing a logarithm to select or screen (memorize) useful, significant and important integral units, logics, PMs and DMs, and delete (forget) non-useful, non-significant or non-important integral units, logics, PMs or DMs. The selection or screening algorithm may be based on a given statistical method, for example, based on the frequency of use of integral units, logics, PMs and or DMs in the previous n events. Another example, the Bayesian inference may be used for generating $S_{n+1}(IU_{n+1}$, $L_{n+1}$, $PM_{n+1}$, $DM_{n+1})$.

The algorithm and criteria provide learning processes for the system/machine states after events. The plasticity (or elasticity) and integrality of the logic drive provide capabilities suitable for algorithms, architectures and/or applications in machine learning and artificial intelligence.

Another aspect of the disclosure provides a standard commodity memory drive, package, package drive, device, module, disk, disk drive, solid-state disk, or solid-state drive (to be abbreviated as "drive" below, that is when "drive" is mentioned below, it means and reads as "drive, package, package drive, device, module, disk, disk drive, solid-state disk, or solid-state drive"), in a multi-chip package comprising plural standard commodity non-volatile memory IC chips for use in data storage. The data stored in the standard commodity non-volatile memory drive are kept even if the power supply of the drive is turned off. The plural non-volatile memory IC chips comprise NAND flash chips, in a bare-die format or in a package format. Alternatively, the plural non-volatile memory IC chips may comprise Non-Volatile Radom-Access-Memory (NVRAM) IC chips, in a bare-die format or in a package format. The NVRAM may be a Ferroelectric RAM (FRAM), Magnetoresistive RAM (MRAM), Resistive RAM (RRAM), or Phase-change RAM (PRAM). The standard commodity memory drive is formed by the COIP packaging, using same or similar process steps of the COIP packaging in forming the standard commodity logic drive, as described and specified in the above paragraphs. The process steps of the COIP packaging are highlighted below: (1) Providing non-volatile memory IC chips, for example, standard commodity NAND flash IC chips, and an interposer; and then flip-chip assembling or bonding the IC chips to and on the interposer. Each of the plural NAND flash chips may have a standard memory density, capacity or size of greater than or equal to 64 Mb, 512 Mb, 1 Gb, 4 Gb, 16 Gb, 64 Gb, 128 Gb, 256 Gb, or 512 Gb, wherein "b" is bits. The NAND flash chip may be designed and fabricated using advanced NAND flash technology nodes or generations, for example, more advanced than or equal to 40 nm, 28 nm, 20 nm, 16 nm, and/or 10 nm, wherein the advanced NAND flash technology may comprise Single Level Cells (SLC) or multiple level cells (MLC) (for example, Double Level Cells DLC, or triple Level cells TLC), and in a 2D-NAND or a 3D NAND structure. The 3D NAND structures may comprise multiple stacked layers or levels of NAND cells, for example, greater than or equal to 4, 8, 16, 32 stacked layers or levels of NAND cells. Each of the plural NAND flash chips to be packaged in the memory drives may comprise micro copper pillars or bumps on the top surfaces of the chips. The top surfaces of micro copper pillars or bumps are at a level above the level of the top surface of the top-most insulating dielectric layer of the chips with a height of, for example, between 3 μm and 60 μm, 5 μm and 50 μm, 5 μm and 40 μm, 5 μm and 30 μm, 5 μm and 20 μm, 5 μm and 15 μm, or 3 μm and 10 μm, or greater than or equal to 30 μm, 20 μm, 15 μm, 5 μm or 3 μm. The chips are flip-chip assembled or bonded on or to the interposer with the side or surface of the chip with transistors faced down; (2) Applying a material, resin, or compound to fill the gaps between chips and cover the backside surfaces of chips, and the top surfaces of the TPVs, if exist, by methods, for example, spin-on coating, screen-printing, dispensing or molding in the wafer or panel format. Applying a CMP, polishing or grinding process to planarize the surface of the applied material, resin or compound to a level where the top surfaces of all backsides of the IC chips and top surfaces of TPVs are fully exposed; (3) Forming a Backside Interconnection Scheme in, on or of the memory drive (BISD) on or over the planarized material, resin or compound and on or over the exposed top surfaces of the TPVs by a wafer or panel processing; (4) Forming copper pads, pillars or bumps, or solder bumps on or over the BISD, (5) Forming copper pads, pillars or bumps, or solder bumps on or under the TSVs of the interposer; (6) Separating, cutting or dicing the finished wafer or panel, including separating, cutting or dicing through the material, resin or compound between two neighboring memory drives. The material, resin or compound (for example, polymer) filling gaps between chips of two neighboring memory drives is separated, cut or diced to from individual unit of memory drives.

Another aspect of the disclosure provides a standard commodity memory drive in a multi-chip package comprising plural standard commodity non-volatile memory IC chips may be further comprising the dedicated control chip, the dedicated I/O chip, or the dedicated control and I/O chip; for use in data storage. The data stored in the standard commodity non-volatile memory drive are kept even if the power supply of the drive is turned off. The plural non-volatile memory IC chips comprise NAND flash chips, in a bare-die format or in a package format. Alternatively, the plural non-volatile memory IC chips may comprise Non-Volatile Radom-Access-Memory (NVRAM) IC chips, in a bare-die format or in a package format. The NVRAM may be a Ferroelectric RAM (FRAM), Magnetoresistive RAM (MRAM), Resistive RAM (RRAM), or Phase-change RAM (PRAM). The functions of the dedicated control chip, the dedicated I/O chip, or the dedicated control and I/O chip are for the memory control and/or inputs/outputs, and are the same or similar to that described and specified in the above paragraphs for the logic drive. The communication, connection or coupling between the non-volatile memory IC chips, for example the NAND flash chips, and the dedicated control chip, the dedicated I/O chip, or the dedicated control and I/O chip in a same memory drive is the same or similar to that described and specified in the above paragraphs for the logic drive. The standard commodity NAND flash IC chips may be fabricated using an IC manufacturing technology node or generation different from that used for manufacturing the dedicated control chip, the dedicated I/O chip, or the dedicated control and I/O chip used in the same memory drive. The standard commodity NAND flash IC chips comprise small I/O circuits, while the dedicated control chip, the dedicated I/O chip, or the dedicated control and I/O chip used in the memory drive may comprise large I/O circuits, as descried and specified for the logic drive. The standard commodity memory drive comprising the dedicated control chip, the dedicated I/O chip, or the dedicated control and I/O chip is formed by the COIP, using same or similar process steps of the COIP in forming the logic drive, as described and specified in the above paragraphs.

Another aspect of the disclosure provides the stacked non-volatile (for example, NAND flash) memory drive comprising plural single-layer-packaged non-volatile memory drives, as described and specified above, each in a multiple-chip package. The single-layer-packaged non-volatile memory drive with TPVs and/or BISD for use in the stacked non-volatile memory drive may be in a standard format or having standard sizes. For example, the single-layer-packaged non-volatile memory drive may be in a shape of square or rectangle, with a certain widths, lengths and thicknesses. An industry standard may be set for the shape and dimensions of the single-layer-packaged non-volatile memory drive. For example, the standard shape of the single-layer-packaged non-volatile memory drive may be a square, with a width greater than or equal to 4 mm, 7 mm, 10 mm, 12 mm, 15 mm, 20 mm, 25 mm, 30 mm, 35 mm or 40 mm, and having a thickness greater than or equal to 0.03 mm, 0.05 mm, 0.1 mm, 0.3 mm, 0.5 mm, 1 mm, 2 mm, 3 mm, 4 mm, or 5 mm. Alternatively, the standard shape of the non-volatile memory drive may be a rectangle, with a width greater than or equal to 3 mm, 5 mm, 7 mm, 10 mm, 12 mm, 15 mm, 20 mm, 25 mm, 30 mm, 35 mm or 40 mm, and a length greater than or equal to 5 mm, 7 mm, 10 mm, 12 mm, 15 mm, 20 mm, 25 mm, 30 mm, 35 mm, 40 mm, 45 mm or 50 mm; and having a thickness greater than or equal to 0.03 mm, 0.05 mm, 0.1 mm, 0.3 mm, 0.5 mm, 1 mm, 2 mm, 3 mm, 4 mm, or 5 mm. The stacked non-volatile memory drive may comprise, for example 2, 3, 4, 5, 6, 7, 8 or greater than 8 single-layer-packaged non-volatile memory drives, and may be formed by the similar or the same process steps as described and specified in forming the stacked logic drive. The single-layer-packaged non-volatile memory drives comprise TPVs and/or BISD for the stacking assembly purpose. The process steps for forming TPVs and/or BISD, and the specifications of TPVs and/or BISD are as described and specified in the above paragraphs for use in the stacked logic drive. The stacking methods (for example, POP) using TPVs and/or BISD are as described and specified in above paragraphs for the stacked logic drive.

Another aspect of the disclosure provides a standard commodity memory drive in a multi-chip package comprising plural standard commodity volatile memory IC chips for use in data storage; wherein the plural volatile memory IC chips comprise DRAM chips, in a bare-die format or in a package format. The standard commodity DRAM memory drive is formed by the COIP packaging, using same or similar process steps of the COIP packaging in forming the logic drive, as described and specified in the above paragraphs. The process steps are highlighted below: (1) Providing standard commodity DRAM IC chips, and an interposer; and then flip-chip assembling or bonding the IC chips to and on the interposer. Each of the plural DRAM chips may have a standard memory density, capacity or size of greater than or equal to 64 Mb, 512 Mb, 1 Gb, 4 Gb, 16 Gb, 64 Gb, 128 Gb, 256 Gb, or 512 Gb, wherein "b" is bits. The DRAM chip may be designed and fabricated using advanced DRAM technology nodes or generations, for example, more advanced than or equal to 40 nm, 28 nm, 20 nm, 16 nm, and/or 10 nm. All DRAM chips to be packaged in the memory drives may comprise micro copper pillars or bumps on the top surfaces of the chips. The top surfaces of micro copper pillars or bumps are at a level above the level of the top surface of the top-most insulating dielectric layer of the chips with a height of, for example, between 3 μm and 60 μm, 5 μm and 50 μm, 5 μm and 40 μm, 5 μm and 30 μm, 5 μm and 20 μm, 5 μm and 15 μm, or 3 μm and 10 μm, or greater than or equal to 30 μm, 20 μm, 15 μm, 5 μm or 3 μm. The chips are flip-chip assembled or bonded on or to the interposer with the side or surface of the chip with transistors faced down; (2) Applying a material, resin, or compound to fill the gaps between chips and cover the backside surfaces of chips and the top surfaces of the TPVs, if exist, by methods, for example, spin-on coating, screen-printing, dispensing or molding in the wafer or panel format. Applying a CMP, polishing or grinding process to planarize the surface of the applied material, resin or compound to a level where the backside surfaces of all the chips and the top surfaces of the all TPVs are fully exposed; (3) Forming a Backside Interconnection Scheme in, on or of the memory drive (BISD) on or over the planarized material, resin or compound and on or over the exposed top surfaces of the TPVs by a wafer or panel processing; (4) Forming copper pads, pillars or bumps, or solder bumps on or over the BISD, (5) Forming copper pads, pillars or bumps, or solder bumps on or under the TSVs of the interposer; (6) Separating, cutting or dicing the finished wafer or panel, including separating, cutting or dicing through the material, resin or compound between two neighboring memory drives. The material, resin or compound (for example, polymer) filling gaps between chips of two neighboring memory drives is separated, cut or diced to from individual unit of memory drives.

Another aspect of the disclosure provides a standard commodity memory drive in a multi-chip package comprising plural standard commodity volatile IC chips may further comprise the dedicated control chip, the dedicated I/O chip, or the dedicated control and I/O chip; for use in data storage;

wherein the plural volatile memory IC chips comprise DRAM chips, in a bare-die format or in a DRAM package format. The functions of the dedicated control chip, the dedicated I/O chip, or the dedicated control and I/O chip used in the memory driver are for the memory control and/or inputs/outputs, and are the same or similar to that described and specified in the above paragraphs for the logic drive. The communication, connection or coupling between the DRAM chips and the dedicated control chip, the dedicated I/O chip, or the dedicated control and I/O chip in a same memory drive is the same or similar to that described and specified in the above paragraphs for the logic drive. The standard commodity DRAM IC chips may be fabricated using an IC manufacturing technology node or generation different from that used for manufacturing the dedicated control chip, the dedicated I/O chip, or the dedicated control and I/O chip. The standard commodity DRAM chips comprise small I/O circuits, while the dedicated control chip, the dedicated I/O chip, or the dedicated control and I/O chip used in the memory drive may comprise large I/O circuits, as descried and specified above for the logic drive. The standard commodity memory drive is formed by the same or similar process steps as that in forming the logic drive, as described and specified in the above paragraphs.

Another aspect of the disclosure provides the stacked volatile (for example, DRAM) memory drive comprising plural single-layer-packaged volatile memory drives, as described and specified above, each in a multiple-chip package. The single-layer-packaged volatile memory drive with TPVs and/or BISD for use in the stacked volatile memory drive may be in a standard format or having standard sizes. For example, the single-layer-packaged volatile memory drive may be in a shape of square or rectangle, with a certain widths, lengths and thicknesses. An industry standard may be set for the shape and dimensions of the single-layer-packaged volatile memory drive. For example, the standard shape of the single-layer-packaged volatile memory drive may be a square, with a width greater than or equal to 4 mm, 7 mm, 10 mm, 12 mm, 15 mm, 20 mm, 25 mm, 30 mm, 35 mm or 40 mm, and having a thickness greater than or equal to 0.03 mm, 0.05 mm, 0.1 mm, 0.3 mm, 0.5 mm, 1 mm, 2 mm, 3 mm, 4 mm, or 5 mm. Alternatively, the standard shape of the volatile memory drive may be a rectangle, with a width greater than or equal to 3 mm, 5 mm, 7 mm, 10 mm, 12 mm, 15 mm, 20 mm, 25 mm, 30 mm, 35 mm or 40 mm, and a length greater than or equal to 5 mm, 7 mm, 10 mm, 12 mm, 15 mm, 20 mm, 25 mm, 30 mm, 35 mm, 40 mm, 45 mm or 50 mm; and having a thickness greater than or equal to 0.03 mm, 0.05 mm, 0.1 mm, 0.3 mm, 0.5 mm, 1 mm, 2 mm, 3 mm, 4 mm, or 5 mm. The stacked volatile memory drive may comprise, for example 2, 3, 4, 5, 6, 7, 8 or greater than 8 single-layer-packaged volatile memory drives, and may be formed by the similar or the same process steps as described and specified in forming the stacked logic drive. The single-layer-packaged volatile memory drives may comprise TPVs and/or BISD for the stacking assembly purpose. The process steps for forming TPVs and/or BISD, and the specifications of TPVs and/or BISD are described and specified in the above paragraphs for use in the stacked logic drive. The stacking methods (for example, POP) using TPVs and/or BISD are as described and specified in above paragraphs for the stacked logic drive.

Another aspect of the disclosure provides the stacked logic and volatile (for example, DRAM) memory drive comprising plural single-layer-packaged logic drives and plural single-layer-packaged volatile memory drives, each in a multiple-chip package, as described and specified above. Each of plural single-layer-packaged logic drives and each of plural single-layer-packaged volatile memory drives may be in a same standard format or having a same standard shape, size and dimension, may have the same standard footprints of the metal pads, pillars or bumps on the top surface, and the same standard footprints of the metal pads, pillars or bumps at the bottom surface, as described and specified in above. The stacked logic and volatile-memory drive may comprise, for example 2, 3, 4, 5, 6, 7, 8 or greater than 8 single-layer-packaged logic drives or volatile-memory drives (in total), and may be formed by the similar or the same process steps as described and specified in forming the stacked logic drive. The stacking sequence, from bottom to top, may be: (a) all single-layer-packaged logic drives at the bottom and all single-layer-packaged volatile memory drives at the top, or (b) single-layer-packaged logic drives and single-layer-packaged volatile drives are stacked interlaced or interleaved layer over layer, from bottom to top, in sequence: (i) single-layer-packaged logic drive, (ii) single-layer-packaged volatile memory drive, (iii) single-layer-packaged logic drive, (iv) single-layer-packaged volatile memory, and so on. The single-layer-packaged logic drives and single-layer-packaged volatile memory drives used in the stacked logic and volatile-memory drives, each comprises TPVs and/or BISD for the stacking assembly purpose. The process steps for forming TPVs and/or BISD, and the specifications of TPVs and/or BISD are described and specified in the above paragraphs. The stacking methods (POP) using TPVs and/or BISD are as described and specified in above paragraphs.

Another aspect of the disclosure provides the stacked non-volatile (for example, NAND flash) and volatile (for example, DRAM) memory drive comprising plural single-layer-packaged non-volatile drives and plural single-layer-packaged volatile memory drives, each in a multiple-chip package, as described and specified in above paragraphs. Each of plural single-layer-packaged non-volatile drives and each of plural single-layer-packaged volatile memory drives may be in a same standard format or having a same standard shape, size and dimension, and have standard footprints of metal pads, pillars or bumps on the top surface and at the bottom surface, as described and specified above. The stacked non-volatile and volatile-memory drive may comprise, for example 2, 3, 4, 5, 6, 7, 8 or greater than 8 single-layer-packaged non-volatile memory drives or single-layer-packaged volatile-memory drives (in total), and may be formed by the similar or the same process steps as described and specified in forming the stacked logic drive. The stacking sequence, from bottom to top, may be: (a) all single-layer-packaged volatile memory drives at the bottom and all single-layer-packaged non-volatile memory drives at the top, (b) all single-layer-packaged non-volatile memory drives at the bottom and all single-layer-packaged volatile memory drives at the top, or (c) single-layer-packaged non-volatile memory drives and single-layer-packaged volatile drives are stacked interlaced or interleaved layer over layer, from bottom to top, in sequence: (i) single-layer-packaged volatile memory drive, (ii) single-layer-packaged non-volatile memory drive, (iii) single-layer-packaged volatile memory drive, (iv) single-layer-packaged non-volatile memory, and so on. The single-layer-packaged non-volatile drives and single-layer-packaged volatile memory drives used in the stacked non-volatile and volatile-memory drives, each comprises TPVs and/or BISD for the stacking assembly purpose. The process steps for forming TPVs and/or BISD, and the specifications of TPVs and/or BISD are described and specified in the above paragraphs for use in the stacked logic drive. The stacking methods (POP) using TPVs and/or BISD are as described and specified in above paragraphs for forming the stacked logic drive.

Another aspect of the disclosure provides the stacked logic, non-volatile (for example, NAND flash) memory and volatile (for example, DRAM) memory drive comprising plural single-layer-packaged logic drives, plural single-layer-packaged non-volatile memory drives and plural single-layer-packaged volatile memory drives, each in a multiple-chip package, as described and specified above. Each of plural single-layer-packaged logic drives, each of plural single-layer-packaged non-volatile memory drives and each of plural single-layer-packaged volatile memory drives may be in a same standard format or having a same standard shape, size and dimension, and have standard footprints of metal pads, pillars or bumps on the top surface and at the bottom surface, as described and specified above. The stacked logic, non-volatile (flash) memory and volatile (DRAM) memory drive may comprise, for example 2, 3, 4, 5, 6, 7, 8 or greater than 8 single-layer-packaged logic drives, single-layer-packaged non-volatile-memory drives or single-layer-packaged volatile-memory drives (in total), and may be formed by the similar or the same process steps as described and specified in forming the stacked logic drive. The stacking sequence is, from bottom to top, for example: (a) all single-layer-packaged logic drives at the bottom, all single-layer-packaged volatile memory drives in the middle, and all single-layer-packaged non-volatile memory drives at the top, or, (b) single-layer-packaged logic drives, single-layer-packaged volatile memory drives, and single-layer-packaged non-volatile memory drives are stacked interlaced or interleaved layer over layer, from bottom to top, in sequence: (i) single-layer-packaged logic drive, (ii) single-layer-packaged volatile memory drive, (iii) single-layer-packaged non-volatile memory drive, (iv) single-layer-packaged logic drive, (v) single-layer-packaged volatile memory, (vi) single-layer-packaged non-volatile memory drive, and so on. The single-layer-packaged logic drives, single-layer-packaged volatile memory drives, and single-layer-packaged volatile memory drives used in the stacked logic, non-volatile-memory and volatile-memory drives, each comprises TPVs and/or BISD for the stacking assembly purpose. The process steps for forming TPVs and/or BISD, and the specifications of TPVs and/or BISD are described and specified in the above paragraphs for use in the stacked logic drive. The stacking methods (POP) using TPVs and/or BISD are as described and specified in above paragraphs for forming the stacked logic drive.

Another aspect of the disclosure provides a system, hardware, electronic device, computer, processor, mobile phone, communication equipment, and/or robot comprising the logic drive, the non-volatile (for example, NAND flash) memory drive, and/or the volatile (for example, DRAM) memory drive. The logic drive may be the single-layer-packaged logic drive or the stacked logic drive, as described and specified above; the non-volatile flash memory drive may be the single-layer-packaged non-volatile flash memory drive or the stacked non-volatile flash memory drive as described and specified above; and the volatile DRAM memory drive may be the single-layer-packaged DRAM memory drive or the stacked volatile DRAM memory drive as described and specified above. The logic drive, the non-volatile flash memory drive, and/or the volatile DRAM memory drive are flip-package assembled on a Printed Circuit Board (PCB), a Ball-Grid-Array (BGA) substrate, a flexible circuit film or tape, or a ceramic circuit substrate.

Another aspect of the disclosure provides a stacked package or device comprising the single-layer-packaged logic drive and the single-layer-packaged memory drive. The single-layer-packaged logic drive is as described and specified above, and is comprising one or more FPGA chips, the DPNVMs, dedicated control chip, the dedicated I/O chip, and/or the dedicated control and I/O chip. The single-layer-packaged logic drive may be further comprising one or more of the processing and/or computing IC chips, for example, one or more CPU chips, GPU chips, DSP chips, and/or TPU chips. The single-layer-packaged memory drive is as described and specified above, and is comprising one or more high speed, high bandwidth and high bitwidth cache SRAM chips, one or more DRAM chips, or one or more NVM chips for high speed parallel processing and/or computing. The one or more high speed, high bandwidth and high bitwidth NVMs may comprise MRAM, RRAM or PRAM. The single-layer-packaged logic drive, as described and specified above, is formed using the interposer comprising FISIP and/or SISIP, TPVs, TSVs and metal pads, pillars or bumps on or under the TSVs. For high speed, high bandwidth and high bitwidth communications with the memory chips of the single-layer-packaged memory drive, stacked vias (in or of the FISIP and/or SISIP) directly and vertically on or over the TSVs are formed, and micro copper pads, pillars or bumps on or over the SISIP and/or FISIP are formed directly and vertically on or over the stacked vias. Multiple stacked structures, each for a bit data of the high speed, wide bit-width buses, are formed, from top to the bottom, comprise, (1) micro copper pads, pillars or bumps on or of the SISIP and/or FISIP; (2) stacked vias by stacking metal vias and metal layers of the SISIP and/or FISIP; (3) TSVs; and (4) copper pads, metal pillars or bumps on or under the TSVs. The micro copper/solder pillars or bumps on or of the IC chips are then flip-chip assembled or bonded on or to the micro copper pads, pillars or bumps (on or over the SISIP and/or FISIP) of the stacked structures. The number of stacked structures for each IC chip (that is the data bit-width between each logic chip and each high speed, high bandwidth and high bitwidth memory chip) is equal or greater than 64, 128, 256, 512, 1024, 2048, 4096, 8K, or 16K for high speed, high bandwidth parallel processing and/or computing. Similarly, multiple stacked structures are formed in the single-layer-packaged memory drive. The single-layer-packaged logic drive (with the stacked vias) is then flip-package assembled or packaged on or to the single-layer-packaged memory drive (also with the stacked vias), with the side with transistor of IC chips in the logic drive faced down, and the side with transistor of IC chips in the memory drive faced up. Therefore, a micro copper/solder pillar or bump on or of a FPGA, CPU, GPU, DSP and/or TPU chip can be connected or coupled, with the shortest distance, to a micro copper/solder pillar or bump on a memory chip, for example, DRAM, SRAM or NVM, through: (1) micro copper pads, pillars or bumps on or of the SISIP and/or FISIP of the logic drive; (2) stacked vias by stacking metal vias and metal layers of the SISIP and/or FISIP of the logic drive; (3) TSVs of the logic drive; and (4) copper pads, metal pillars or bumps on or under the TSVs of the logic drive; (5) copper pads, metal pillars or bumps on or over the TSVs of the memory drive; (6) TSVs of the memory drive; (7) stacked vias by stacking metal vias and metal layers of the SISIP and/or FISIP of the memory drive; (8) micro copper pads, pillars or bumps on or under the SISIP and/or FISIP of the memory drive. With the TPVs and/or BISDs for both the single-layer-packaged logic drive and the single-layer-packaged memory drive, the stacked logic and memory drive or device can communicate, connect or couple to the external circuits or components from the top side (the backside of the single-layer-packaged logic drive, with the side with transistor of IC chips in the logic drive faced down) and the bottom side (the backside of the single-layer-packaged memory drive, the side with transistor of IC chips in the memory drive faced up) of the stacked logic and memory drive or device. Alternatively, the TPVs and/or BISDs for the single-layer-packaged logic drive may be omitted; and the stacked logic and memory drive or device can communicate, connect or couple to the external circuits or components from the bottom side (the backside of the single-layer-packaged memory drive, the side with transistor of IC chips in the memory drive faced up) of the stacked the stacked logic and memory drive or device, through the TPVs and/or BISD of the memory drive. Alternatively, the TPVs and/or BISDs for the single-layer-packaged memory drive may be omitted; and the stacked logic and memory drive or device can communicate, connect or couple to the external circuits or components from the top side (the backside of the single-layer-packaged logic drive, the side with transistor of IC chips in the logic drive faced up) of the stacked logic and memory drive or device, through the TPVs and/or BISD of the logic drive.

In all of the above alternatives for the logic and memory drive or device, the single-layer-packaged logic drive may comprise one or more of the processing and/or computing IC chips, and the single-layer-packaged memory drive may comprise one or more high speed, high bandwidth and high bitwidth cache SRAM chips, DRAM chips, or NVM chips (for example, MRAM, RRAM or PRAM) for high speed parallel processing and/or computing. For example, the single-layer-packaged logic drive may comprise multiple GPU chips, for example 2, 3, 4 or more than 4 GPU chips, and the single-layer-packaged memory drive may comprise multiple high speed, high bandwidth and high bitwidth cache SRAM chips, DRAM chips, or NVM chips. The communication between one of GPU chips and one of SRAM, DRAM or NVM chips, through the stacked structures described and specified above, may be with data bit-width equal or greater than 64, 128, 256, 512, 1024, 2048, 4096, 8K, or 16K. For another example, the logic drive may comprise multiple TPU chips, for example 2, 3, 4 or more than 4 TPU chips, and the single-layer-packaged memory drive may comprise multiple high speed, high bandwidth and high bitwidth cache SRAM chips, DRAM chips or NVM chips. The communication between one of TPU chips and one of SRAM or DRAM chips, through the stacked structures described and specified above, may be with data bit-width equal or greater than 64, 128, 256, 512, 1024, 2048, 4096, 8K, or 16K.

The communication, connection, or coupling between one of logic, processing and/or computing chips (for example, FPGA, CPU, GPU, DSP, APU, TPU, and/or ASIC chips) and one of high speed, high bandwidth and high bitwidth SRAM, DRAM or NVM chips, through the stacked structures described and specified above, may be the same or similar as that between internal circuits in a same chip. Alternatively, the communication, connection, or coupling between one of logic, processing and/or computing chips (for example, FPGA, CPU, GPU, DSP, APU, TPU, and/or ASIC chips) and one of high speed, high bandwidth and high bitwidth SRAM, DRAM or NVM chips, through the stacked structures described and specified above, may be using small I/O drivers and/or receivers. The driving capability, loading, output capacitance, or input capacitance of the small I/O drivers or receivers, or I/O circuits may be between 0.1 pF and 2 pF or 0.1 pF and 1 pF. For example, a bi-directional (or tri-state) I/O pad or circuit may be used for the small I/O drivers or receivers, or I/O circuits for communicating between high speed, high bandwidth and high bitwidth logic and memory chips in the logic and memory stacked drive, and may comprise an ESD circuit, a receiver, and a driver, and may have an input capacitance or output capacitance between 0.1 pF and 2 pF or 0.1 pF and 1 pF.

These, as well as other components, steps, features, benefits, and advantages of the present application, will now become clear from a review of the following detailed description of illustrative embodiments, the accompanying drawings, and the claims.

BRIEF DESCRIPTION OF THE DRAWINGS

The drawings disclose illustrative embodiments of the present application. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same reference number or reference indicator appears in different drawings, it may refer to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings:

FIG. 14A is a schematic view showing a block diagram of a programmable logic block in accordance with an embodiment of the present application.

FIG. 14B shows an OR gate in accordance with the present application.

FIG. 14C shows a look-up table configured for achieving an OR gate in accordance with the present application.

FIG. 14D shows an AND gate in accordance with the present application.

FIG. 14E shows a look-up table configured for achieving an AND gate in accordance with the present application.

FIG. 14F is a circuit diagram of a logic operator in accordance with an embodiment of the present application.

FIG. 14G shows a look-up table for a logic operator in FIG. 14G.

FIG. 14I shows a look-up table for a computation operator in FIG. 14J.

Figure 1A:
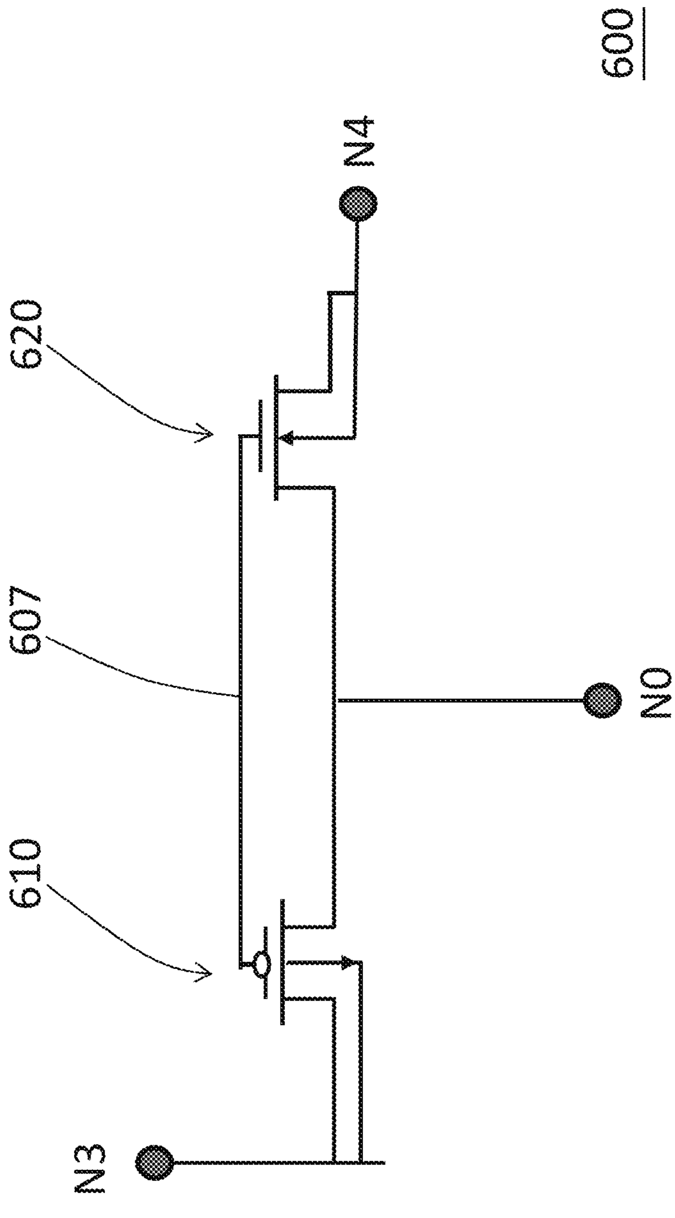
FIGS. 1A and 1D-1H are circuit diagrams illustrating a first type of non-volatile memory cells in accordance with an embodiment of the present application.

While certain embodiments are depicted in the drawings, one skilled in the art will appreciate that the embodiments depicted are illustrative and that variations of those shown, as well as other embodiments described herein, may be envisioned and practiced within the scope of the present application.

DETAILED DESCRIPTION OF THE DISCLOSURE

Illustrative embodiments are now described. Other embodiments may be used in addition or instead. Details that may be apparent or unnecessary may be omitted to save space or for a more effective presentation. Conversely, some embodiments may be practiced without all of the details that are disclosed.

Figure 1B:
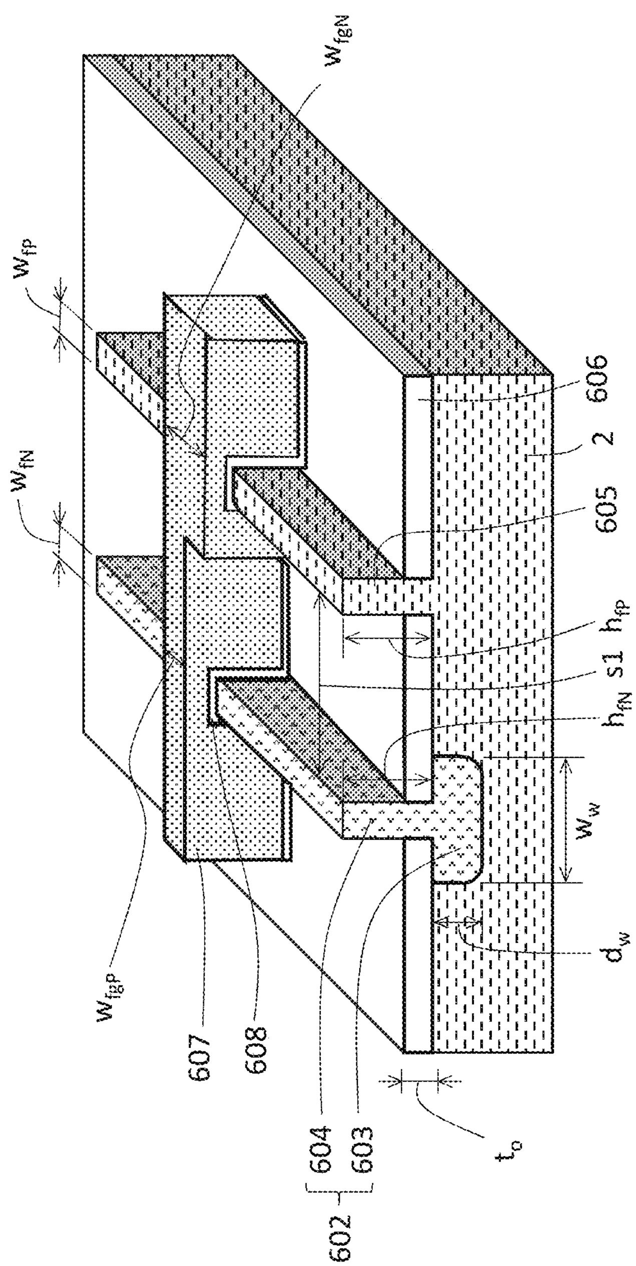
FIGS. 1B and 1C are schematically perspective views showing various structures of a first type of non-volatile memory cell in FIG. 1A in accordance with an embodiment of the present application.

Specification for Non-Volatile Memory (NVM) Cells (1) First Type of Non-Volatile Memory (NVM) Cells FIG. 1A is a circuit diagram illustrating a first type of non-volatile memory cell in accordance with an embodiment of the present application. FIG. 1B is a schematically perspective view showing a structure of a first type of non-volatile memory cell in accordance with an embodiment of the present application. Referring to FIGS. 1A and 1B, a first type of non-volatile memory cell 600, i.e., floating-gate (FG) CMOS NVM cells, maybe formed on a P-type or N-type semiconductor substrate 2, e.g., silicon substrate. In this case, a P-type silicon substrate 2 coupling a voltage Vss of ground reference is provided for the non-volatile memory cell 600. The first type of non-volatile memory cell 600 may include:

(1) an N-type stripe 602 formed with an N-type well 603 in the P-type silicon substrate 2 and an N-type fin 604 vertically protruding from the a top surface of the N-type well 603, wherein the N-type well 603 may have a depth $d_w$ between 0.3 and 5 micrometers and a width $w_w$ between 50 nanometers and 1 micrometer, and the N-type fin 604 may have a height $h_{fN}$ between 10 and 200 nanometers and a width $w_{fN}$ between 1 and 100 nanometers;

(2) a P-type fin 605 vertically protruding from the P-type silicon substrate 2, wherein the P-type fin 605 may have a height $h_{fP}$ between 10 and 200 nanometers and a width $w_{fP}$ between 1 and 100 nanometers, wherein a space s1 between the N-type fin 604 and P-type fin 605 may range from 100 to 2,000 nanometers;

(3) a field oxide 606, such as silicon oxide, on the P-type silicon substrate 2, wherein the field oxide 606 may have a thickness $t_o$ between 20 and 500 nanometers;

(4) a floating gate 607, such as polysilicon, tungsten, tungsten nitride, titanium, titanium nitride, tantalum, tantalum nitride, copper-containing metal, aluminum-containing metal, or other conductive metals, transversely extending over the field oxide 606 and from the N-type fin 604 to the P-type fin 605, wherein the floating gate 607 may have a width $w_{fgN}$ over the P-type fin 605, which may be greater than or equal to a width $w_{fgP}$ thereof over the N-type fin 604, and the width $w_{fgN}$ over the P-type fin 605 may be equal to between 1 and 10 times or between 1.5 and 5 times of the width $w_{fgP}$ over the N-type fin 604 and, for example, equal to 2 times of the width $w_{fgP}$ over the N-type fin 604, wherein the width $w_{fgP}$ over the N-type fin 604 may range from 1 to 25 nanometers, and the width $w_{fgN}$ over the P-type fin 605 may range from 1 to 25 nanometers; and (5) a gate oxide 608, such as silicon oxide, hafnium-containing oxide, zirconium-containing oxide or titanium-containing oxide, transversely extending on the field oxide 606 and from the N-type fin 604 to the P-type fin 605 to be provided between the floating gate 607 and the N-type fin 604, between the floating gate 607 and the P-type fin 605 and between the floating gate 607 and the field oxide 606, wherein the gate oxide 608 may have a thickness between 1 and 5 nanometers.

Figure 1C:
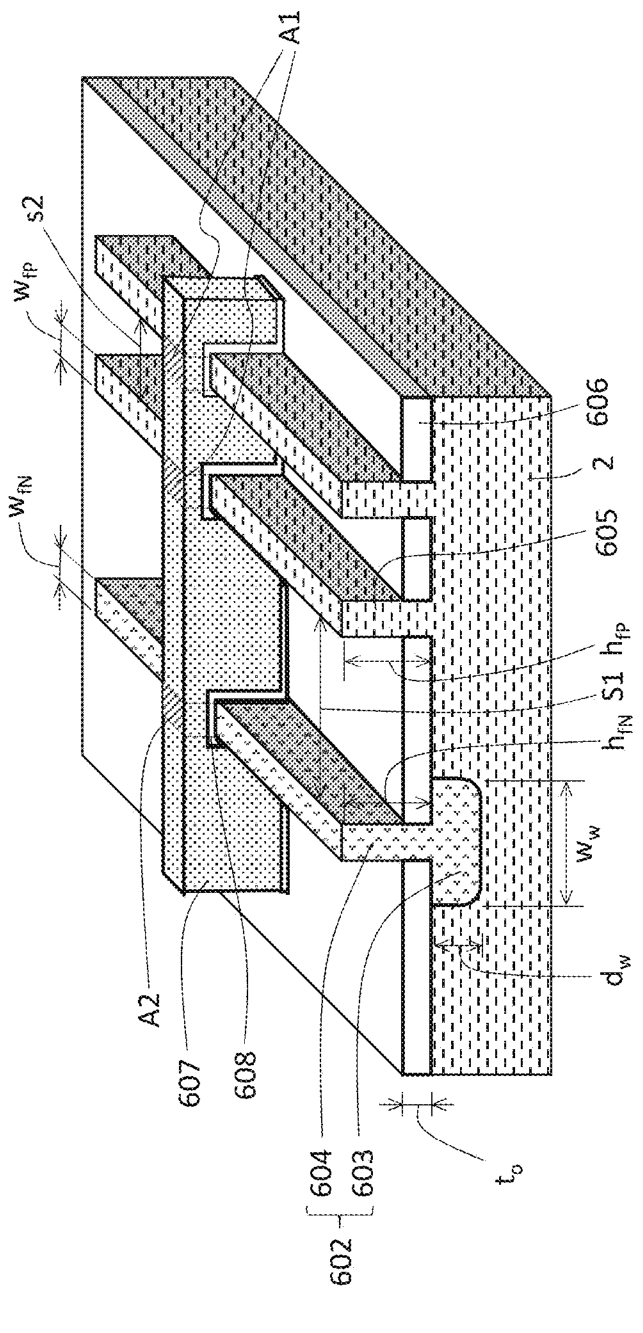

Alternatively, FIG. 1C is a schematically perspective view showing a structure of a first type of non-volatile memory cell in accordance with an embodiment of the present application. For an element indicated by the same reference number shown in FIGS. 1B and 1C, the specification of the element as seen in FIG. 1C may be referred to that of the element as illustrated in FIG. 1B. The difference between the circuits illustrated in FIG. 1B and the circuits illustrated in FIG. 1C is mentioned as below. Referring to FIG. 1C, a plurality of the P-type fin 605 arranged in parallel to each other or one another may be formed to vertically protrude from the P-type silicon substrate 2, wherein each of the one or more P-type fins 605 may have substantially the same height $h_{fP}$ between 10 and 200 nanometers and substantially the same width $w_{fP}$ between 1 and 100 nanometers, wherein a combination of the P-type fins 605 may be made for an N-type fin field-effect transistor (FinFET). The space s1 between the N-type fin 604 and the P-type fin 605 next to the N-type fin 604 may range from 100 to 2000 nanometers. A space s2 between neighboring two of the P-type fins 605 may range from 2 to 200 nanometers. The P-type fins 605 may have the number between 1 and 10 and for example the number of two in this case. The floating gate 607 may transversely extend over the field oxide 606 and from the N-type fin 604 to the P-type fins 605, wherein the floating gate 607 may have a first total area A1 vertically over the P-type fins 605, which may be greater than or equal to a second total area A2 thereof vertically over the N-type fin 604, wherein the first total area A1 may be equal to between 1 and 10 times or between 1.5 and 5 times of the second total area A2 and, for example, equal to 2 times of the second total area A2, wherein the first total area A1 may range from 1 to 2,500 square nanometers, and the second total area A2 may range from 1 to 2,500 square nanometers.

Referring to FIGS. 1A-1C, the N-type fin 604 may be doped with P-type atoms, such as boron atoms, so as to form two $P^+$ portions in the N-type fin 604 at two opposite sides of the gate oxide 608, composing two respective ends of a channel of a P-type metal-oxide-semiconductor (MOS) transistor 610, wherein the boron atoms in the N-type fin 604 may have a concentration greater than those in the P-type silicon substrate 2. Each of the one or more P-type fins 605 may be doped with N-type atoms, such as arsenic atoms, so as to form two $N^+$ portions in said each of the one or more P-type fins 605 at two opposite sides of the gate oxide 608, composing two respective ends of a channel of a N-type metal-oxide-semiconductor (MOS) transistor 620 as seen in FIG. 1A. Alternatively, the multiple $N^+$ portions in the one or more P-type fins 605 at one side of the gate oxide 608 as seen in FIG. 1C may couple to each other or one another to compose an end of a channel of a N-type metal-oxide-semiconductor (MOS) transistor 620 as seen in FIG. 1A, and the multiple $N^+$ portions in the one or more P-type fins 605 at the other side of the gate oxide 608 as seen in FIG. 1C may couple to each other or one another to compose the other end of the channel of the N-type metal-oxide-semiconductor (MOS) transistor 620 as seen in FIG. 1A. The arsenic atoms in said each of the one or more P-type fins 605 may have a concentration greater than those in the N-type well 603. Thereby, the N-type MOS transistor 620 may have a capacitance greater than or equal to that of the P-type MOS transistor 610. The capacitance of the N-type MOS transistor 620 may be equal to between 1 and 10 times or between 1.5 and 5 times of the capacitance of the P-type MOS transistor 610 and, for example, equal to 2 times of the capacitance of the P-type MOS transistor 610. The capacitance of the N-type MOS transistor 620 may range from 0.1 aF to 10 fF and the capacitance of the P-type MOS transistor 610 may range from 0.1 aF to 10 fF.

Referring to FIGS. 1A-1C, the floating gate 607 coupling a gate terminal of the P-type MOS transistor 610, i.e., FG P-MOS, and a gate terminal of the N-type MOS transistor 620, i.e., FG N-MOS, with each other is configured to catch electrons therein. The P-type transistor 610 is configured to form the channel with one of its ends coupling to a node N3 coupling to the N-type stripe 602 and the other of its ends coupling to a node N0. The N-type transistor 620 is configured to form the channel with one of its ends coupling to a node N4 coupling to the P-type silicon substrate 2 and the other of its ends coupling to the node N0.

Referring to FIGS. 1A-1C, when the floating gate 607 is being erased, (1) the node N3 may couple to the N-type stripe 602 switched to couple to an erasing voltage $V_{Er}$, (2) the node N4 may couple to the P-type silicon substrate 2 at the voltage Vss of ground reference and (3) the node N0 may be switched to be floating. Since the gate capacitance of the P-type MOS transistor 610 is smaller than that of the N-type MOS transistor 620, the voltage difference between the floating gate 607 and the node N3 is large enough to cause electron tunneling. Accordingly, electrons trapped in the floating gate 607 may tunnel through the gate oxide 608 to the node N3. Thereby, the floating gate 607 may be erased to a logic level of "1".

Referring to FIGS. 1A-1C, after the first type of non-volatile memory cell 600 is erased, the floating gate 607 may be charged to a logic level of "1" to turn on the N-type MOS transistor 620 and off the P-type MOS transistor 610. In this situation, when the floating gate 607 is being programmed, (1) the nodes N3 may couple to the N-type stripe 602 switched to couple to a programming voltage $V_{Pr}$, (2) the node N0 may be switched to couple to the programming voltage $V_{Pr}$ and (3) the node N4 may couple to the P-type silicon substrate 2 at the voltage Vss of ground reference. Accordingly, electrons may pass from the node N4 to the node N0 through the channel of the N-type MOS transistor 620, in which some hot electrons may jump or inject from these electrons to the floating gate 607 through the gate oxide 608 to be trapped in the floating gate 607. Thereby, the floating gate 607 may be programmed to a logic level of "0".

Referring to FIGS. 1A-1C, for operation of the non-volatile memory cell 600, (1) the node N3 may couple to the N-type stripe 602 switched to couple to the voltage Vcc of power supply, (2) the node N4 may couple to the P-type silicon substrate 2 at the voltage Vss of ground reference and (3) the node N0 may be switched to act as an output of the non-volatile memory cell 650 of the first type. When the floating gate 607 is charged to a logic level of "1", the P-type MOS transistor 610 may be turned off and the N-type MOS transistor 620 may be turned on to couple the node N4 coupling to the P-type silicon substrate 2 at the voltage Vss of ground reference to the node N0 switched to act as the output of the non-volatile memory cell 600 through the channel of the N-type MOS transistor 620. Thereby, the output of the non-volatile memory cell 600 at the node N0 may be at a logic level of "0". When the floating gate 607 is discharged to a logic level of "0", the P-type MOS transistor 610 may be turned on and the N-type MOS transistor 620 may be turned off to couple the node N3 coupling to the N-type stripe 602 switched to couple to the voltage Vcc of power supply to the node N0 switched to act as the output of the non-volatile memory cell 600 through the channel of the P-type MOS transistor 610. Thereby, the output of the non-volatile memory cell 600 at the node N0 may be at a logic level of "1".

Figure 1D:
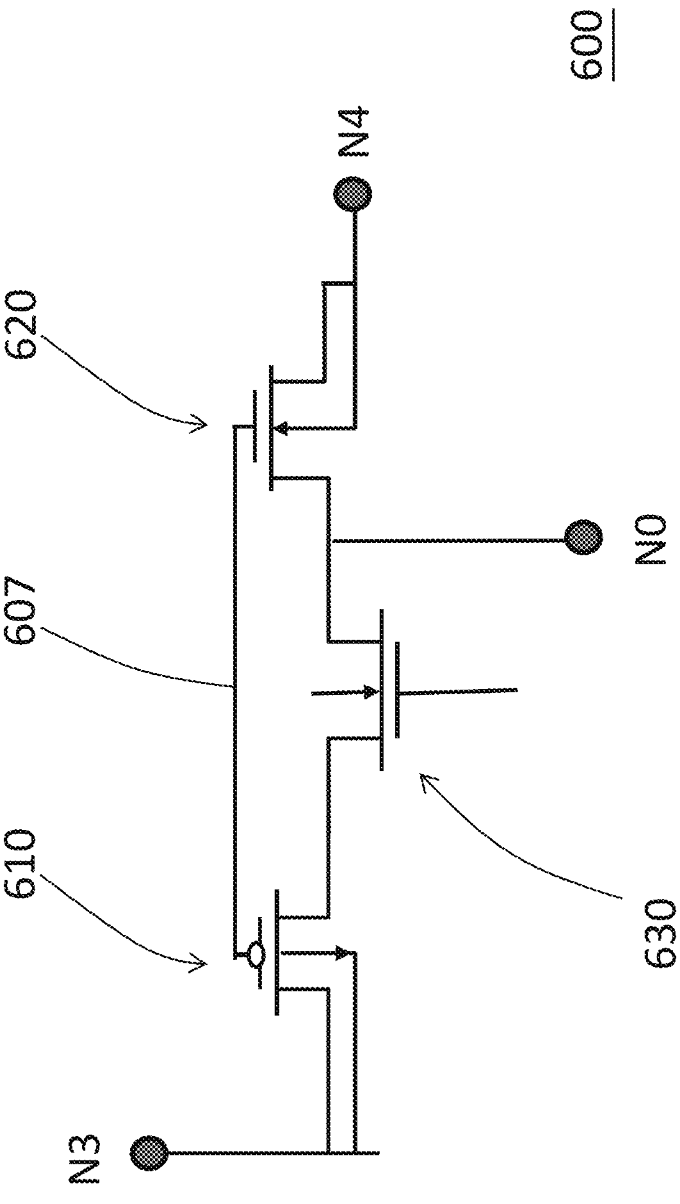

Alternatively, FIG. 1D is a circuit diagram illustrating a first type of non-volatile memory cell in accordance with an embodiment of the present application. The erasing, programming and operation of the non-volatile memory cell of the first type as seen in FIG. 1D may be referred to those as illustrated in FIGS. 1A-1C. For an element indicated by the same reference number shown in FIGS. 1A-1D, the specification of the element as seen in FIG. 1D may be referred to that of the element as illustrated in FIGS. 1A-1C. The difference therebetween is mentioned as below. Referring to FIG. 1D, the first type of non-volatile memory cell 600 may further include a switch 630, such as N-type MOS transistor, between the drain terminal, in operation, of the P-type MOS transistor 610 and the node N0. The N-type MOS transistor 630 may be configured to form a channel with an end coupling to the drain terminal, in operation, of the P-type MOS transistor 610 and the other end coupling to the node N0. When the first type of non-volatile memory cell 600 is being erased, the N-type MOS transistor 630 may have a gate terminal switched to couple to the voltage Vss of ground reference to turn off its channel to disconnect the drain terminal, in operation, of the P-type MOS transistor 610 from the node N0. Accordingly, a current flow may be prevented from being leaked from the drain terminal, in operation, of the P-type MOS transistor 610 to the node N0. When the first type of non-volatile memory cell 600 is being programed, the gate terminal of the N-type MOS transistor 630 may be switched to couple to the programming voltage $V_{Pr}$ to turn on its channel to couple the drain terminal, in operation, of the P-type MOS transistor 610 to the node N0, wherein the node N0 is switched to couple to the programming voltage $V_{Pr}$. When the first type of non-volatile memory cell 600 is being operated, the gate terminal of the N-type MOS transistor 630 may be switched to couple to the voltage Vcc of power supply to turn on its channel to couple the drain terminal, in operation, of the P-type MOS transistor 610 to the node N0 acting as the output of the non-volatile memory cell 600 of the first type.

Alternatively, referring to FIG. 1D, the switch 630 may be a P-type MOS transistor configured to form a channel with an end coupling to the drain terminal, in operation, of the P-type MOS transistor 610 and the other end coupling to the node N0. When the first type of non-volatile memory cell 600 is being erased, the P-type MOS transistor 630 may have a gate terminal switched to couple to the erasing voltage $V_{Er}$ to turn off its channel to disconnect the drain terminal, in operation, of the P-type MOS transistor 610 from the node N0. Accordingly, a current flow may be prevented from being leaked from the drain terminal, in operation, of the P-type MOS transistor 610 to the node N0. When the first type of non-volatile memory cell 600 is being programed, the gate terminal of the P-type MOS transistor 630 may be switched to couple to the voltage Vss of ground reference to turn on its channel to couple the drain terminal, in operation, of the P-type MOS transistor 610 to the node N0, wherein the node N0 is switched to couple to the programming voltage $V_{Pr}$. When the first type of non-volatile memory cell 600 is being operated, the gate terminal of the P-type MOS transistor 630 may be switched to couple to the voltage Vss of ground reference to turn on its channel to couple the drain terminal, in operation, of the P-type MOS transistor 610 to the node N0 acting as the output of the non-volatile memory cell 600 of the first type.

Figure 1E:
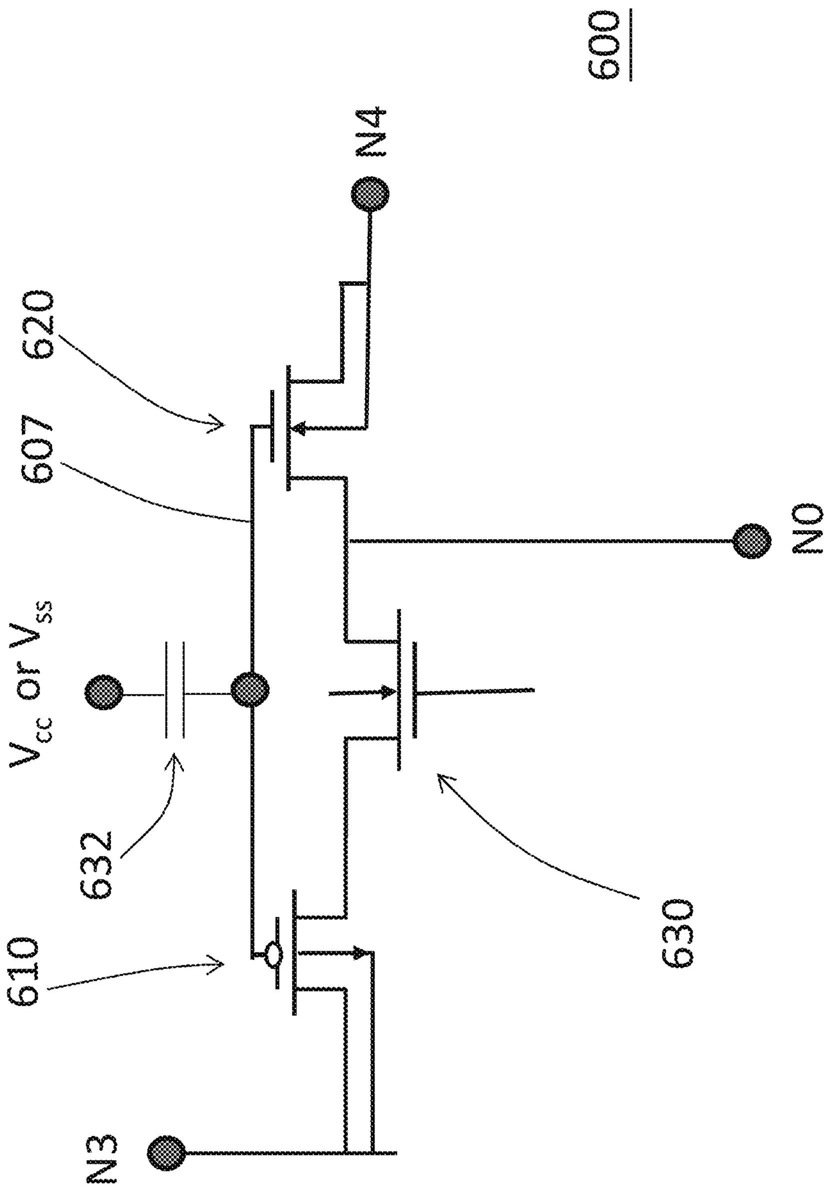

Alternatively, FIG. 1E is a circuit diagram illustrating a first type of non-volatile memory cell in accordance with an embodiment of the present application. The erasing, programming and operation of the non-volatile memory cell of the first type as seen in FIG. 1E may be referred to those as illustrated in FIGS. 1A-1D. For an element indicated by the same reference number shown in FIGS. 1A-1E, the specification of the element as seen in FIG. 1E may be referred to that of the element as illustrated in FIGS. 1A-1D. The difference therebetween is mentioned as below. Referring to FIG. 1E, the first type of non-volatile memory cell 600 may further include a parasitic capacitor 632 having a first terminal coupling to the floating gate 607 and a second terminal coupling to the voltage Vcc of power supply or to the voltage Vss of ground reference. The parasitic capacitor 632 may have a capacitance greater than a gate capacitance of the P-type MOS transistor 610 and greater than a gate capacitance of the N-type MOS transistor 620. For example, the capacitance of the parasitic capacitor 632 may be equal to between 1 and 10,000 times of the gate capacitance of the P-type MOS transistor 610 and to between 1 and 10,000 times of the gate capacitance of the N-type MOS transistor 620. The capacitance of the parasitic capacitor 632 may range from 0.1 aF to 1 pF. Thereby, more electric charges or electrons may be stored in the floating gate 607.

Figure 1F:
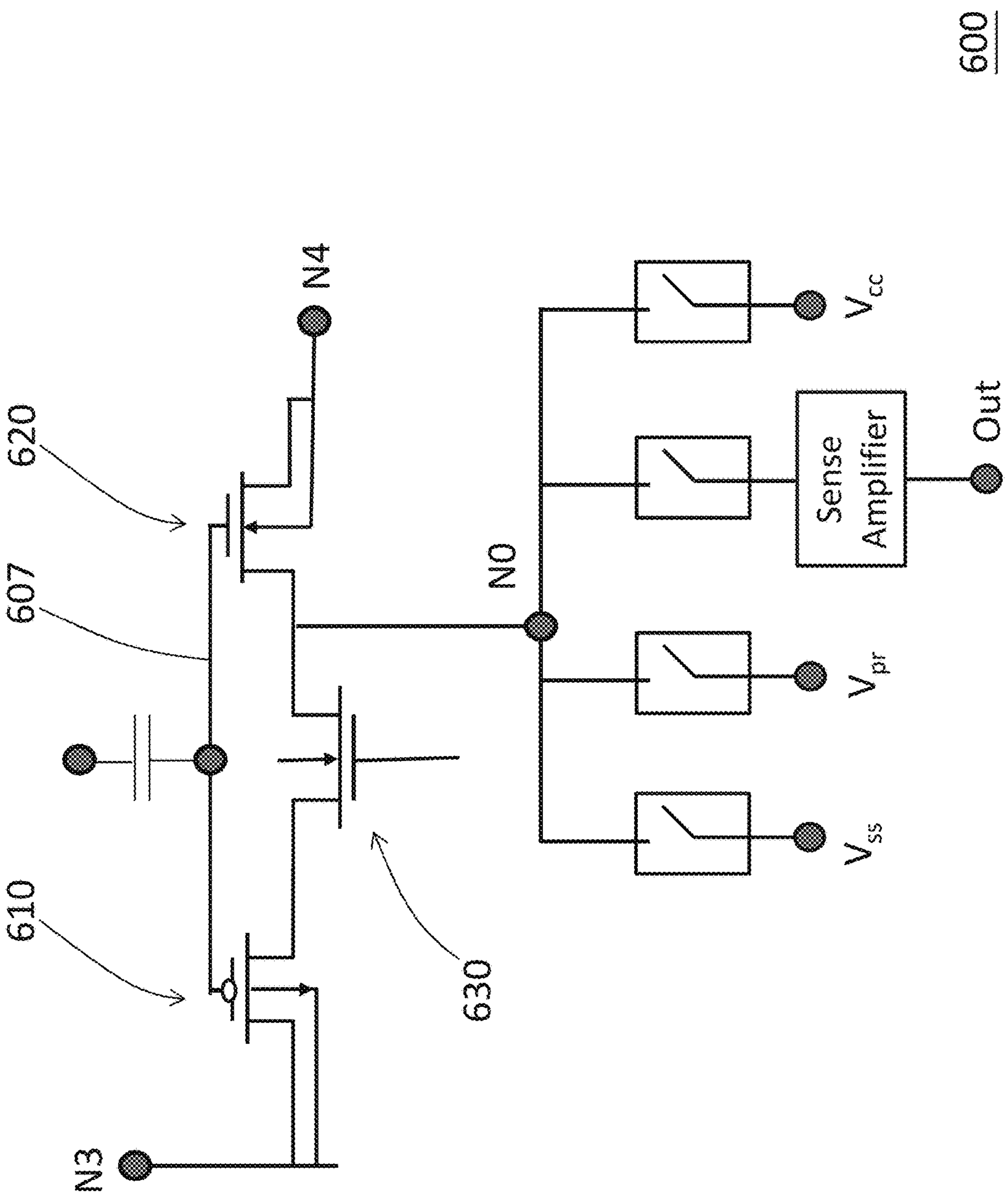

Alternatively, FIG. 1F is a circuit diagram illustrating a first type of non-volatile memory cell in accordance with an embodiment of the present application. For an element indicated by the same reference number shown in FIGS. 1B, 1C and 1F, the specification of the element as seen in FIG. 1F may be referred to that of the element as illustrated in FIGS. 1B and 1C. The difference therebetween is mentioned as below. Referring to FIG. 1F, for the first type of non-volatile memory cell 600, its P-type MOS transistor 610 is configured to form a channel with two ends coupling to the node N3. The first type of non-volatile memory cell 600 may further include a switch 630, such as N-type MOS transistor, between the nodes N3 and N0. The N-type MOS transistor 630 may be configured to form a channel with an end coupling to the node N3 and the other end coupling to the node N0 that may be switched to be floating or couple to the voltage Vss of ground reference, the programming voltage VPr, the voltage Vcc of power supply or a sense amplifier 666. In operation, (1) the node N0 is switched to couple to a first node of the sense amplifier 666, (2) the sense amplifier 666 has a second node switched to couple to a reference line and (3) the sense amplifier 666 has multiple nodes SAENb switched to couple to the voltage Vss of ground reference to enable the sense amplifier 666. The sense amplifier 666 may compare a voltage at the first node and a voltage at the second node into a compared data and then generate an output "Out" of the non-volatile memory cell 600 based on the compared data.

Referring to FIG. 1F, when the floating gate 607 is being erased, (1) the node N3 may couple to the N-type stripe 602 switched to couple to the erasing voltage $V_{Er}$, (2) the node N4 may couple to the P-type silicon substrate 2 at the voltage Vss of ground reference and (3) the node N0 may be switched to be floating or to couple to the voltage Vss of ground reference. The N-type MOS transistor 630 may have a gate terminal switched to couple to the voltage Vss of ground reference to turn off its channel to disconnect the node N3 from the node N0. Since the gate capacitance of the P-type MOS transistor 610 is smaller than that of the N-type MOS transistor 620, the voltage difference between the floating gate 607 and the node N3 is large enough to cause electron tunneling. Accordingly, electrons trapped in the floating gate 607 may tunnel through the gate oxide 608 to the node N3. The floating gate 607 may be erased to a logic level of "1".

Referring to FIG. 1F, after the first type of non-volatile memory cell 600 is erased, the floating gate 607 may be charged to a logic level of "1" to turn on the N-type MOS transistor 620 and off the P-type MOS transistor 610. In this situation, when the floating gate 607 is being programmed, (1) the nodes N3 may couple to the N-type stripe 602 switched to couple to the programming voltage $V_{Pr}$, (2) the node N4 may couple to the P-type silicon substrate 2 at the voltage Vss of ground reference and (3) the node N0 may be switched to couple to the programming voltage $V_{Pr}$. The gate terminal of the N-type MOS transistor 630 may be switched to couple to the programming voltage $V_{Pr}$ to turn on its channel to couple the node N3 to the node N0. Thereby, electrons may pass from the node N4 to the nodes N0 and N3 through the channel of the N-type MOS transistor 620, in which some hot electrons may be induced from these electrons to jump or inject to the floating gate 607 through the gate oxide 608 to be trapped in the floating gate 607. The floating gate 607 may be programmed to a logic level of "0".

Referring to FIG. 1F, for operation of the non-volatile memory cell 600 of the first type, (1) the node N3 may couple to the N-type stripe 602 switched to couple to the voltage Vcc of power supply and (2) the node N4 may couple to the P-type silicon substrate 2 at the voltage Vss of ground reference. The gate terminal of the N-type MOS transistor 630 may be switched to couple to the voltage Vss of ground reference to turn off its channel to disconnect the node N3 from the node N0. The node N0 is first switched to couple to the voltage Vcc of power supply to be pre-charged to a logic level of "1" in advance. When the floating gate 607 is charged to a logic level of "1", the N-type MOS transistor 620 may turn on its channel to couple the node N4 at the voltage Vss of ground reference to the node N0 such that the logic level at the node N0 may be changed from "1" to "0". When the floating gate 607 is discharged to a logic level of "0", the N-type MOS transistor 620 may turn off its channel to disconnect the node N4 at the voltage Vss of ground reference from the node N0 such that the voltage level at the node N0 may be kept at "1". Next, the node N0 is switched to couple to the first node of the sense amplifier 666. The sense amplifier 666 may compare a voltage at the node N0, i.e., at the first node, and a voltage at the reference line, i.e., at the second node, into a compared data and then generate the output "Out" of the non-volatile memory cell 600 based on the compared data. For example, when the voltage at the first node at a logic level of "0" is compared by the sense amplifier 666 to be smaller than the voltage at the second node, the sense amplifier 666 may generate the output "Out" at a logic level of "0". When the voltage at the first node at a logic level of "1" is compared by the sense amplifier 666 to be greater than the voltage at the second node, the sense amplifier 666 may generate the output "Out" at a logic level of "1".

Alternatively, referring to FIG. 1F, the switch 630 may be a P-type MOS transistor configured to form a channel with an end coupling to the node N3 and the other end coupling to the node N0. The erasing, programming and operation of the non-volatile memory cell 600 of the first type as above illustrated for FIG. 1F may be referred herein. The difference therebetween is mentioned as below. When the first type of non-volatile memory cell 600 is being erased, the P-type MOS transistor 630 may have a gate terminal switched to couple to the erasing voltage $V_{Er}$ to turn off its channel to disconnect the node N3 and the node N0. When the first type of non-volatile memory cell 600 is being programed, the gate terminal of the P-type MOS transistor 630 may be switched to couple to the voltage Vss of ground reference to turn on its channel to couple the node N3 to the node N0, wherein the node N0 is switched to couple to the programming voltage $V_{Pr}$. When the first type of non-volatile memory cell 600 is being operated, the gate terminal of the P-type MOS transistor 630 may be switched to couple to the voltage Vcc of power supply to turn off its channel to disconnect the node N3 from the node N0.

Figure 1G:
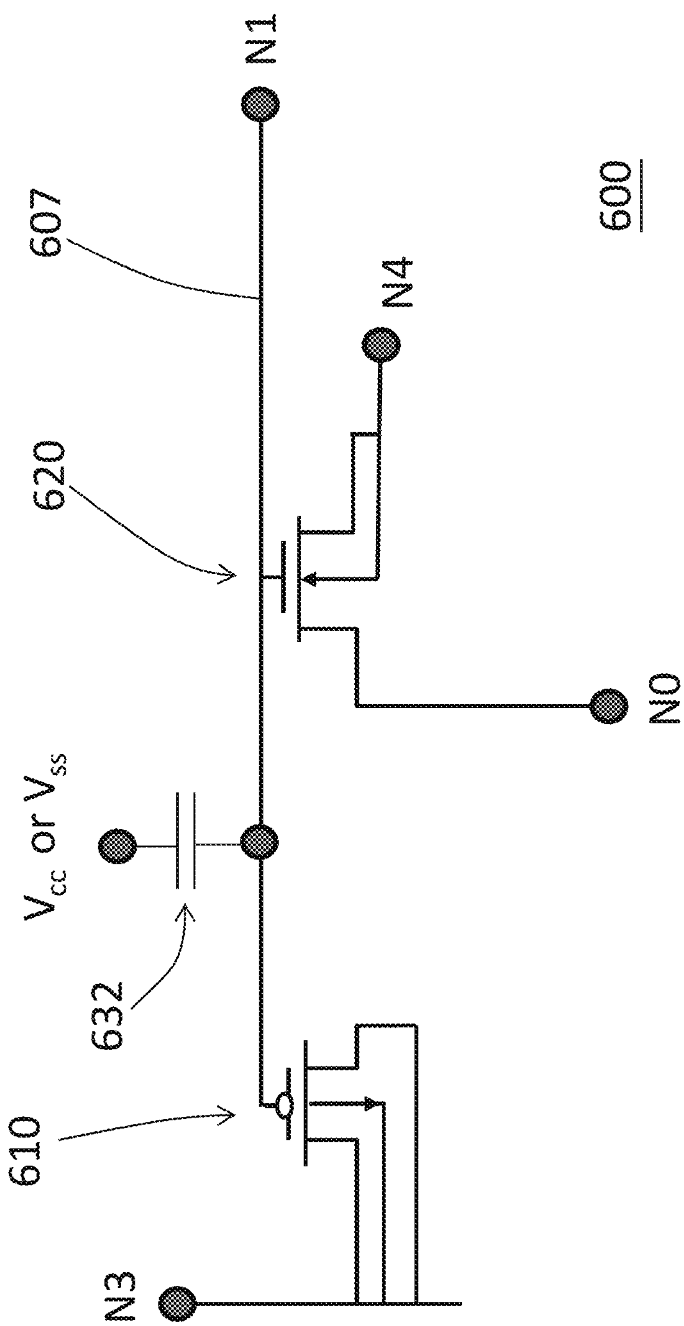

Alternatively, FIG. 1G is a circuit diagram illustrating a first type of non-volatile memory cell in accordance with an embodiment of the present application. For an element indicated by the same reference number shown in FIGS. 1A-1C, 1E and 1G, the specification of the element as seen in FIG. 1G may be referred to that of the element as illustrated in FIGS. 1A-1C and 1E. The difference between the circuits illustrated in FIG. 1E and the circuits illustrated in FIG. 1G is mentioned as below. Referring to FIG. 1G, the first type of non-volatile memory cell 600 may have its floating gate 607 configured to act as its output at a node N1 in operation, its P-type MOS transistor 610 configured to form a channel with two ends coupling to the node N3, wherein the N-type stripe 602 may couple to the node N3, and its N-type MOS transistor 620 configured to form a channel with an end coupling to the node N0 and the other end coupling to the node N4. In this case, no physical conductive path may be formed between the node N0 and the node N3.

Referring to FIG. 1G, when the floating gate 607 is being erased, (1) the node N3 may couple to the N-type stripe 602 switched to couple to the erasing voltage $V_{Er}$, (2) the node N4 may couple to the P-type silicon substrate 2 at the voltage Vss of ground reference and (3) the node N0 may be switched to be floating or to couple to the voltage Vss of ground reference. Since the gate capacitance of the P-type MOS transistor 610 is smaller than that of the N-type MOS transistor 620, the voltage difference between the floating gate 607 and the node N3 is large enough to cause electron tunneling. Accordingly, electrons trapped in the floating gate 607 may tunnel through the gate oxide 608 to the node N3. Thereby, the floating gate 607 may be erased to a logic level of "1" as the output of the non-volatile memory cell 600 at the node N1 in operation.

Referring to FIG. 1G, after the first type of non-volatile memory cell 600 is erased, the floating gate 607 may be charged to a logic level of "1" to turn on the N-type MOS transistor 620 and off the P-type MOS transistor 610. In this situation, when the floating gate 607 is being programmed, (1) the node N3 may couple to the N-type stripe 602 switched to couple to the programming voltage $V_{Pr}$, (2) the node N0 may be switched to couple to the programming voltage $V_{Pr}$ and (3) the node N4 may couple to the P-type silicon substrate 2 at the voltage Vss of ground reference. Thereby, electrons may pass from the node N4 to the node N0 through the channel of the N-type MOS transistor 620, in which some hot electrons may be induced from these electrons to jump or inject to the floating gate 607 through the gate oxide 608 to be trapped in the floating gate 607. Thereby, the floating gate 607 may be programmed to a logic level of "0" as the output of the non-volatile memory cell 600 at the node N1 in operation.

Figure 1H:
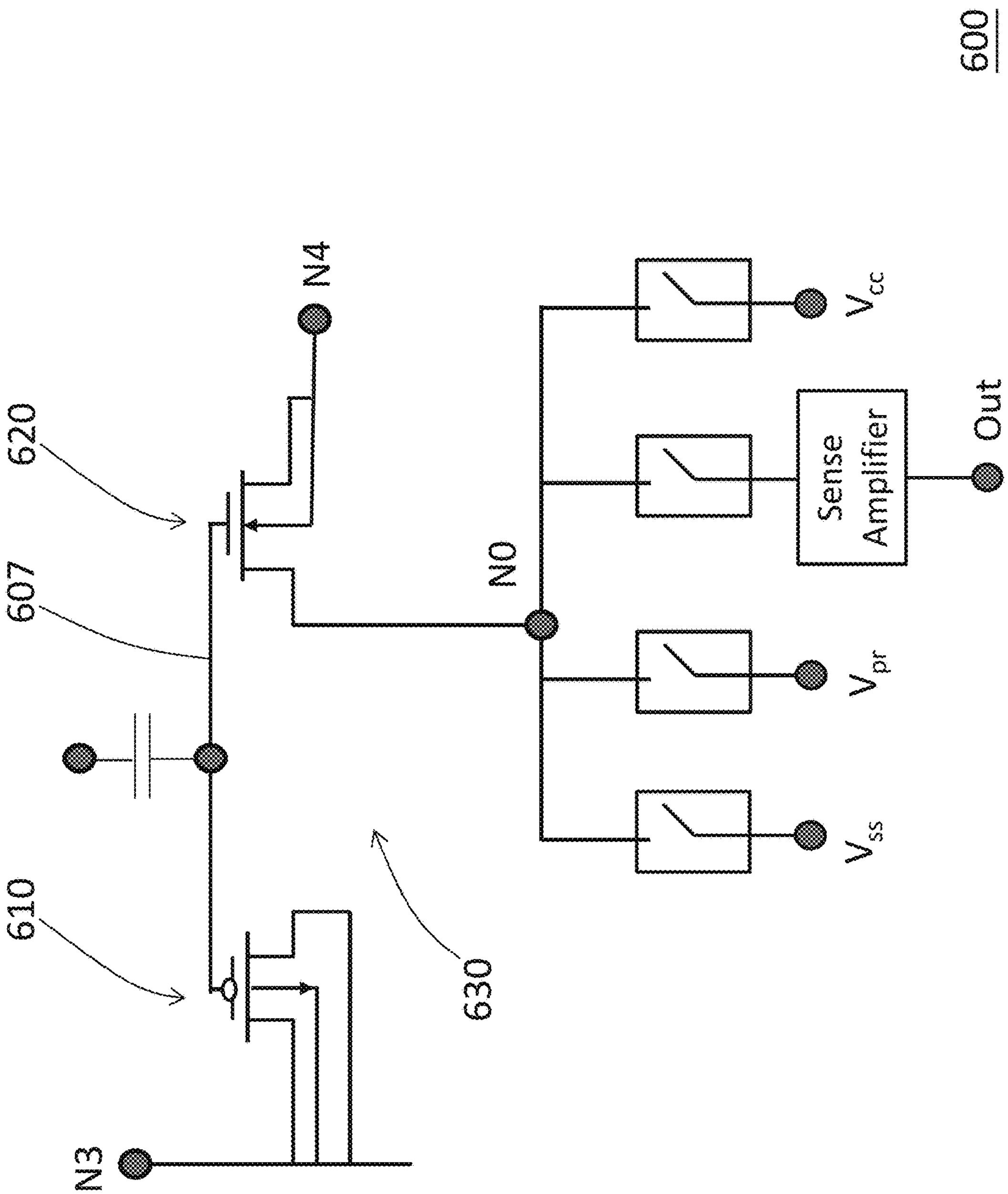

Alternatively, FIG. 1H is a circuit diagram illustrating a first type of non-volatile memory cell in accordance with an embodiment of the present application. For an element indicated by the same reference number shown in FIGS. 1A-1C, 1E and 1H, the specification of the element as seen in FIG. 1H may be referred to that of the element as illustrated in FIGS. 1A-1C and 1E. The difference between the circuits illustrated in FIG. 1E and the circuits illustrated in FIG. 1H is mentioned as below. Referring to FIG. 1H, the first type of non-volatile memory cell 600 may have its P-type MOS transistor 610 configured to form a channel with two ends coupling to the node N3, wherein the N-type stripe 602 may couple to the node N3, and its N-type MOS transistor 620 configured to form a channel with an end coupling to the node N4 and the other end coupling to the node N0. In this case, no physical conductive path may be formed between the node N0 and the node N3. The P-type silicon substrate 2 may couple to the node N4. The node N0 may be switched to be floating or to couple to the voltage Vss of ground reference, the programming voltage $V_{Pr}$, the voltage Vcc of power supply or the sense amplifier 666. In operation, (1) the node N0 is switched to couple to a first node of the sense amplifier 666, (2) the sense amplifier 666 has a second node switched to couple to a reference line and (3) the sense amplifier 666 has multiple nodes SAENb switched to couple to the voltage Vss of ground reference to enable the sense amplifier 666. The sense amplifier 666 may compare a voltage at the first node and a voltage at the second node into a compared data and then generate an output "Out" of the non-volatile memory cell 600 based on the compared data.

Referring to FIG. 1H, when the floating gate 607 is being erased, (1) the node N3 may couple to the N-type stripe 602 switched to couple to the erasing voltage $V_{Er}$, (2) the node N4 may couple to the P-type silicon substrate 2 at the voltage Vss of ground reference and (3) the node N0 may be switched to be floating or to couple to the voltage Vss of ground reference. Since the gate capacitance of the P-type MOS transistor 610 is smaller than that of the N-type MOS transistor 620, the voltage difference between the floating gate 607 and the node N3 is large enough to cause electron tunneling. Thereby, electrons trapped in the floating gate 607 may tunnel through the gate oxide 608 to the node N3. The floating gate 607 may be erased to a logic level of "1".

Referring to FIG. 1H, after the first type of non-volatile memory cell 600 is erased, the floating gate 607 may be charged to a logic level of "1" to turn on the N-type MOS transistor 620 and off the P-type MOS transistor 610. In this situation, when the floating gate 607 is being programmed, (1) the node N3 may couple to the N-type stripe 602 switched to couple to the programming voltage $V_{Pr}$, (2) the node N0 may be switched to couple to the programming voltage $V_{Pr}$ and (3) the node N4 may couple to the P-type silicon substrate 2 at the voltage Vss of ground reference. Thereby, electrons may pass from the node N4 to the node N0 through the channel of the N-type MOS transistor 620, in which some hot electrons may be induced from these electrons to jump or inject to the floating gate 607 through the gate oxide 608 to be trapped in the floating gate 607. The floating gate 607 may be programmed to a logic level of "0".

Referring to FIG. 1H, for operation of the non-volatile memory cell 600 of the first type, (1) the node N3 may couple to the N-type stripe 602 switched to couple to the voltage Vcc of power supply and (2) the node N4 may couple to the P-type silicon substrate 2 at the voltage Vss of ground reference. The node N0 may be switched to couple to the voltage Vcc of power supply to be pre-charged to a logic level of "1" in advance. When the floating gate 607 is charged to a logic level of "1", the N-type MOS transistor 620 may turn on its channel to couple the node N4 at the voltage Vss of ground reference to the node N0 such that the logic level at the node N0 may be changed from "1" to "0". When the floating gate 607 is discharged to a logic level of "0", the N-type MOS transistor 620 may turn off its channel to disconnect the node N4 at the voltage Vss of ground reference from the node N0 such that the logic level at the node N0 may be kept at "1". Next, the node N0 is switched to couple to the first node of the sense amplifier 666. The sense amplifier 666 may compare a voltage at the node N0, i.e., at the first node, and a voltage at the reference line, i.e., at the second node, into a compared data and then generate the output "Out" of the non-volatile memory cell 600 based on the compared data. For example, when the voltage at the first node at a logic level of "0" is compared by the sense amplifier 666 to be smaller than the voltage at the second node, the sense amplifier 666 may generate the output "Out" at a logic level of "0". When the voltage at the first node at a logic level of "1" is compared by the sense amplifier 666 to be greater than the voltage at the second node, the sense amplifier 666 may generate the output "Out" at a logic level of "1".

For the first type of non-volatile memory cells 600 as illustrated in FIGS. 1A-1H, the erasing voltage $V_{Er}$ may be greater than or equal to the programming voltage $V_{Pr}$ that may be greater than or equal to the voltage Vcc of power supply. The erasing voltage $V_{Er}$ may range from 5 volts to 0.25 volts, the programming voltage $V_{Pr}$ may range from 5 volts to 0.25 volts, and the voltage Vcc of power supply may range from 3.5 volts to 0.25 volts, such as 0.75 volts or 3.3 volts.

(2) Second Type of Non-Volatile Memory Cells

Figure 2A:
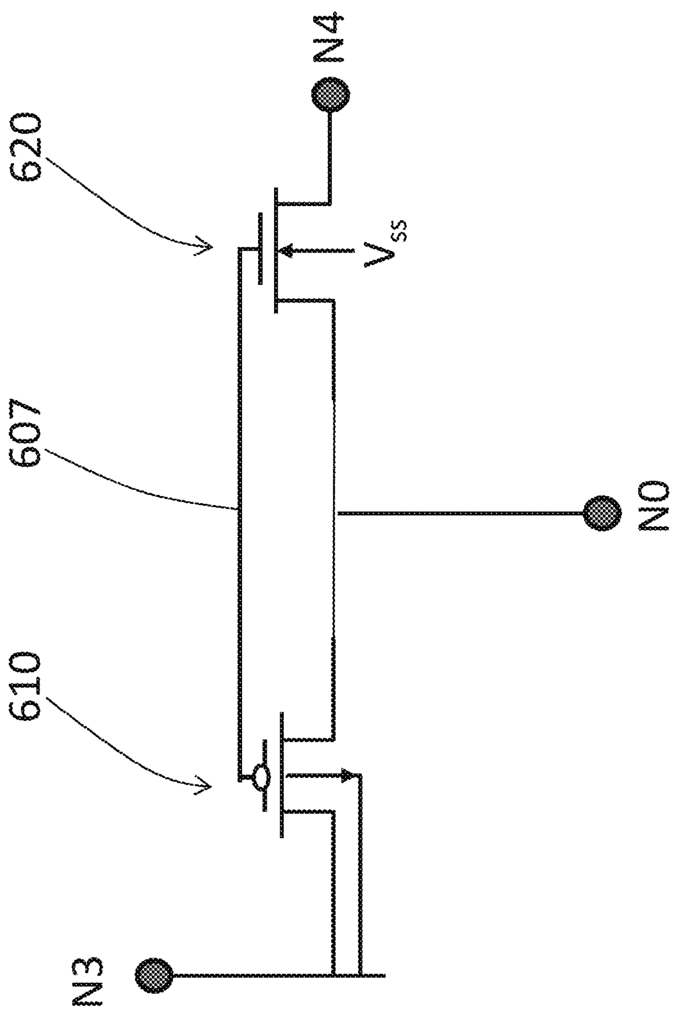
FIGS. 2A, 2D and 2E are circuit diagrams illustrating a second type of non-volatile memory cells in accordance with an embodiment of the present application.
Figure 2B:
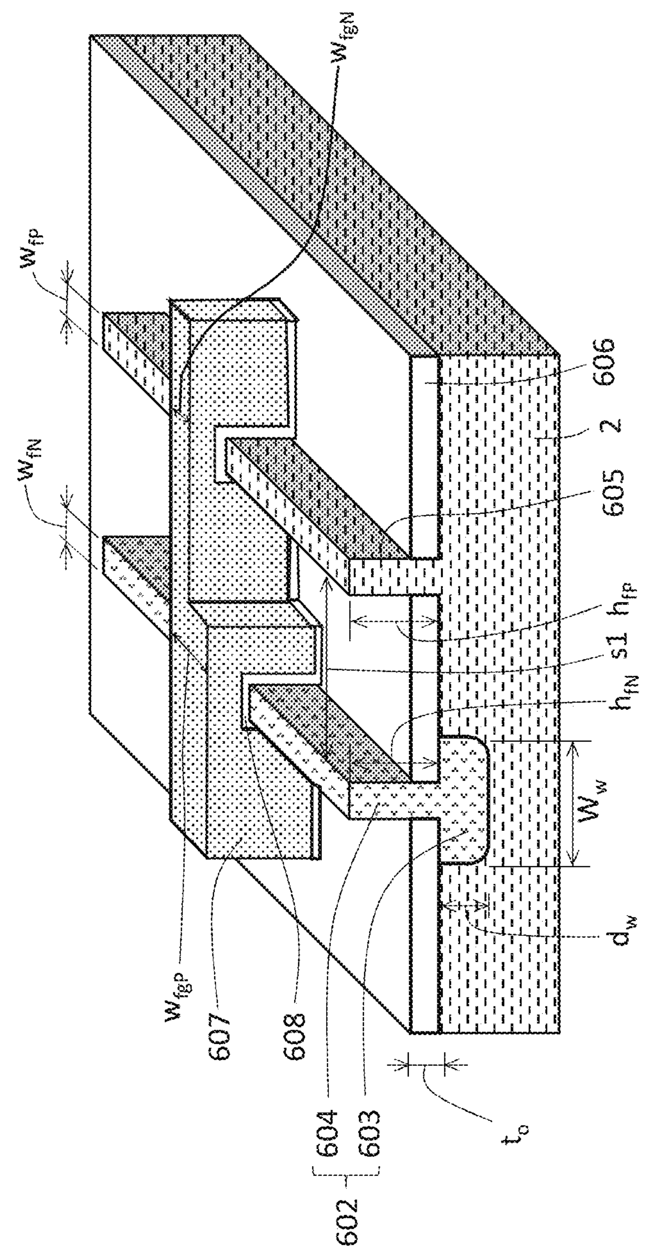
FIGS. 2B and 2C are schematically perspective views showing various structures of a second type of non-volatile memory cell in FIG. 2A in accordance with an embodiment of the present application.

Alternatively, FIG. 2A is a circuit diagram illustrating a second type of non-volatile memory cell in accordance with an embodiment of the present application. FIG. 2B is a schematically perspective view showing a structure of a second type of non-volatile memory cell, i.e., floating-gate (FG) CMOS NVM cells, in accordance with an embodiment of the present application. In this case, the scheme of the non-volatile memory cell 650 of the second type as seen in FIGS. 2A and 2B is similar to that of the first type of non-volatile memory cell 600 as seen in FIGS. 1A and 1B and can be referred to the illustration for FIGS. 1A and 1B, but the difference between the scheme of the non-volatile memory cell 650 of the second type as seen in FIGS. 2A and 2B and the scheme of the non-volatile memory cell 600 of the first type as seen in FIGS. 1A and 1B is mentioned as below. Referring to FIGS. 2A and 2B, the width $w_{fgN}$ of the floating gate 607 may be smaller than or equal to the width $w_{fgP}$ of the floating gate 607. For an element indicated by the same reference number shown in FIGS. 1B and 2B, the specification of the element as seen in FIG. 2B may be referred to that of the element as illustrated in FIG. 1B. Referring to FIG. 2B, the width $w_{fgP}$ over the N-type fin 604 may be equal to between 1 and 10 times or between 1.5 and 5 times of the width $w_{fgN}$ over the P-type fin 605 and, for example, equal to 2 times of the width $w_{fgN}$ over the P-type fin 605, wherein the width $w_{fgP}$ over the N-type fin 604 may range from 1 to 25 nanometers, and the width $w_{fgN}$ over the P-type fin 605 may range from 1 to 25 nanometers.

Figure 2C:
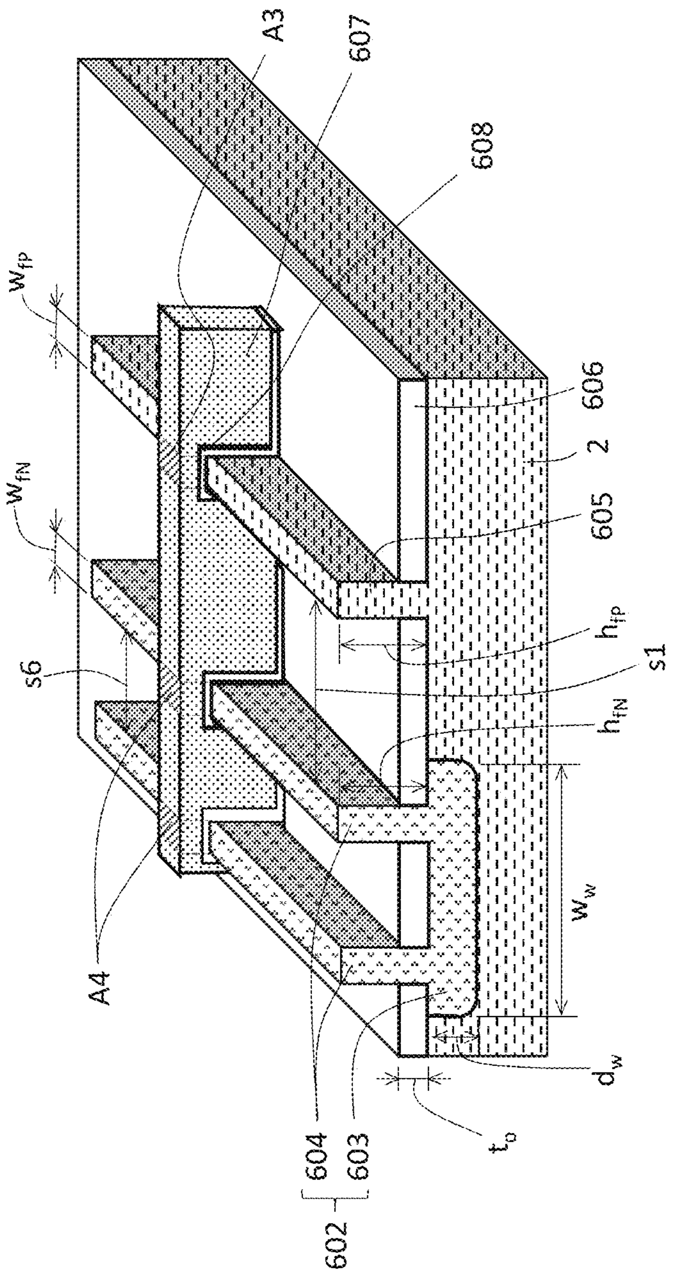

Alternatively, a plurality of the N-type fin 604 arranged in parallel to each other or one another may be formed to vertically protrude from the N-type well 603, as seen in FIG. 2C, wherein each of the one or more N-type fins 604 may have substantially the same height $h_{fN}$ between 10 and 200 nanometers and substantially the same width $w_{fN}$ between 1 and 100 nanometers, wherein the combination of the N-type fins 604 may be made for a P-type fin field-effect transistor (FinFET). FIG. 2C is a schematically perspective view showing a structure of a second type of non-volatile memory cell in accordance with an embodiment of the present application. For an element indicated by the same reference number shown in FIGS. 1B, 1C and 2C, the specification of the element as seen in FIG. 2C may be referred to that of the element as illustrated in FIGS. 1B and 1C. The difference therebetween is mentioned as below. Referring to FIG. 2C, a space s6 between neighboring two of the N-type fins 604 may range from 2 to 200 nanometers. The N-type fins 604 may have the number between 1 and 10 and for example the number of two in this case. The floating gate 607 may transversely extend over the field oxide 606 and from the N-type fins 604 to the P-type fin 605, wherein the floating gate 607 may have a third total area A3 vertically over the P-type fin 605, which may be smaller than or equal to a fourth total area A4 thereof vertically over the N-type fins 604, wherein the fourth total area A4 may be equal to between 1 and 10 times or between 1.5 and 5 times of the third total area A3 and, for example, equal to 2 times of the third total area A3, wherein the third total area A3 may range from 1 to 2,500 square nanometers, and the fourth total area A4 may range from 1 to 2,500 square nanometers. Each of the one or more N-type fins 604 may be doped with P-type atoms, such as boron atoms, so as to form two $P^+$ portions in said each of the one or more N-type fins 604 at two opposite sides of the gate oxide 608, composing two respective ends of a channel of a P-type metal-oxide-semiconductor (MOS) transistor 610 as seen in FIG. 2A. Alternatively, the multiple $P^+$ portions in the one or more N-type fins 604 at one side of the gate oxide 608 as seen in FIG. 2C may couple to each other or one another to compose an end of a channel of a P-type metal-oxide-semiconductor (MOS) transistor 610, i.e., FG P-MOS, as seen in FIG. 2A and the multiple $P^+$ portions in the one or more N-type fins 604 at the other side of the gate oxide 608 may couple to each other or one another to compose the other end of the channel of the P-type metal-oxide-semiconductor (MOS) transistor 610 as seen in FIG. 2A. The boron atoms in each of the one or more N-type fins 604 may have a concentration greater than those in the P-type silicon substrate 2. The P-type fin 605 may be doped with N-type atoms, such as arsenic atoms, so as to form two $N^+$ portions in the P-type fin 605 at two opposite sides of the gate oxide 608, composing two respective ends of a channel of a N-type metal-oxide-semiconductor (MOS) transistor 620, i.e., FG N-MOS, wherein the arsenic atoms in each of the one or more P-type fins 605 may have a concentration greater than those in the N-type well 603. Thereby, the P-type MOS transistor 610 may have a capacitance greater than or equal to that of the N-type MOS transistor 620. The capacitance of the P-type MOS transistor 610 may be equal to between 1 and 10 times or between 1.5 and 5 times of the capacitance of the N-type MOS transistor 620 and, for example, equal to 2 times of the capacitance of the N-type MOS transistor 620. The capacitance of the N-type MOS transistor 620 may range from 0.1 aF to 10 fF and the capacitance of the P-type MOS transistor 610 may range from 0.1 aF to 10 fF.

Referring to FIGS. 2A-2C, for a first aspect, when the floating gate 607 is being erased, (1) the node N4 may be switched to couple to the erasing voltage $V_{Er}$, (2) the node N3 may couple to the N-type stripe 602 switched to couple to the voltage Vss of ground reference and (3) the node N0 may be switched to be floating. Since the gate capacitance of the N-type MOS transistor 620 is smaller than that of the P-type MOS transistor 610, the voltage difference between the floating gate 607 and the node N4 is large enough to cause electron tunneling. Accordingly, electrons trapped in the floating gate 607 may tunnel through the gate oxide 608 to the node N4. Thereby, the floating gate 607 may be erased to a logic level of "1".

For a second aspect, when the floating gate 607 is being erased, (1) the node N0 may be switched to couple to the erasing voltage $V_{Er}$, (2) the node N3 may couple to the N-type stripe 602 switched to couple to the voltage Vss of ground reference and (3) the node N4 may be switched to be floating. Since the gate capacitance of the N-type MOS transistor 620 is smaller than that of the P-type MOS transistor 610, the voltage difference between the floating gate 607 and the node N0 is large enough to cause electron tunneling. Accordingly, electrons trapped in the floating gate 607 may tunnel through the gate oxide 608 to the node N0. Thereby, the floating gate 607 may be erased to a logic level of "1".

For a third aspect, when the floating gate 607 is being erased, (1) the nodes N0 and N4 may be switched to couple to the erasing voltage $V_{Er}$ and (2) the node N3 may couple to the N-type stripe 602 switched to couple to the voltage Vss of ground reference. Since the gate capacitance of the N-type MOS transistor 620 is smaller than that of the P-type MOS transistor 610, the voltage difference between the floating gate 607 and the node N0 is large enough to cause electron tunneling. Accordingly, electrons trapped in the floating gate 607 may tunnel through the gate oxide 608 to the node(s) N0 and/or N4. Thereby, the floating gate 607 may be erased to a logic level of "1".

Referring to FIGS. 2A-2C, after the non-volatile memory cell 650 is erased, the floating gate 607 may be charged to a logic level of "1" to turn on the N-type MOS transistor 620 and off the P-type MOS transistor 610. In this situation, for a first aspect, when the floating gate 607 is being programmed, (1) the node N3 may couple to the N-type stripe 602 switched to couple to the programming voltage $V_{Pr}$, (2) the node N4 may be switched to couple to the voltage Vss of ground reference and (3) the node N0 may be switched to be floating. Since the gate capacitance of the N-type MOS transistor 620 is smaller than that of the P-type MOS transistor 610, the voltage difference between the floating gate 607 and the node N4 is large enough to cause electron tunneling. Accordingly, electrons at the node N4 may tunnel through the gate oxide 608 to the floating gate 607 to be trapped in the floating gate 607. Thereby, the floating gate 607 may be programmed to a logic level of "0".

For a second aspect, when the floating gate 607 is being programmed, (1) the node N3 may couple to the N-type stripe 602 switched to couple to the programming voltage $V_{Pr}$, (2) the node N0 may be switched to couple to the voltage Vss of ground reference and (3) the node N4 may be switched to be floating. Since the gate capacitance of the N-type MOS transistor 620 is smaller than that of the P-type MOS transistor 610, the voltage difference between the floating gate 607 and the node N0 is large enough to cause electron tunneling. Accordingly, electrons at the node N0 may tunnel through the gate oxide 608 to the floating gate 607 to be trapped in the floating gate 607. Thereby, the floating gate 607 may be programmed to a logic level of "0".

For a third aspect, when the floating gate 607 is being programmed, (1) the node N3 may couple to the N-type stripe 602 switched to couple to the programming voltage $V_{Pr}$ and (2) the nodes N0 and N4 may be switched to couple to the voltage Vss of ground reference. Since the gate capacitance of the N-type MOS transistor 620 is smaller than that of the P-type MOS transistor 610, the voltage difference between the floating gate 607 and the node N0 and/or between the floating gate 607 and the node N4 is large enough to cause electron tunneling. Accordingly, electrons at the node(s) N0 and/or N4 may tunnel through the gate oxide 608 to the floating gate 607 to be trapped in the floating gate 607. Thereby, the floating gate 607 may be programmed to a logic level of "0".

Referring to FIGS. 2A-2C, for operation of the non-volatile memory cell 650, (1) the node N3 may couple to the N-type stripe 602 switched to couple to the voltage Vcc of power supply, (2) the node N4 may be switched to couple to the voltage Vss of ground reference and (3) the node N0 may be switched to act as an output of the non-volatile memory cell 650 of the second type. When the floating gate 607 is charged to a logic level of "1", the P-type MOS transistor 610 may be turned off and the N-type MOS transistor 620 may be turned on to couple the node N4 at the voltage Vss of ground reference to the node N0 switched to act as the output of the non-volatile memory cell 650 through the channel of the N-type MOS transistor 620. Thereby, the output of the non-volatile memory cell 650 of the second type may be at a logic level of "0". When the floating gate 607 is discharged to a logic level of "0", the P-type MOS transistor 610 may be turned on and the N-type MOS transistor 620 may be turned off to couple the node N3 at the voltage Vcc of power supply to the node N0 switched to act as the output of the non-volatile memory cell 650 through the channel of the P-type MOS transistor 610. Thereby, the output of the non-volatile memory cell 650 of the second type may be at a logic level of "1".

Figure 2D:
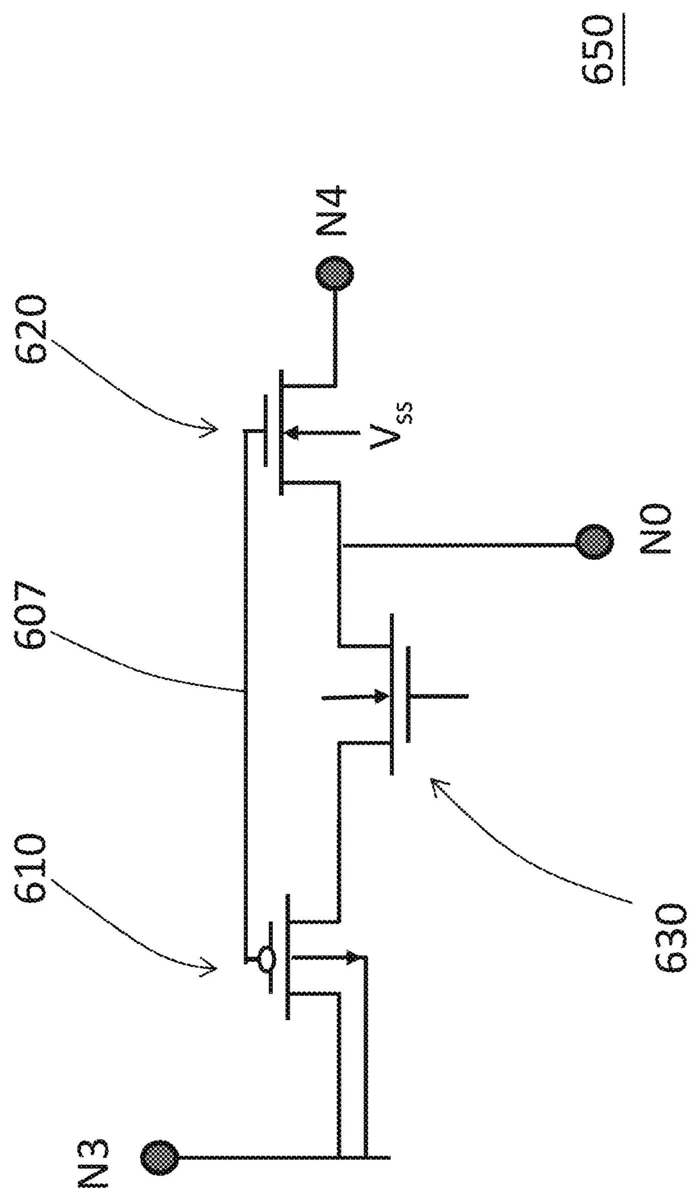

Alternatively, FIG. 2D is a circuit diagram illustrating a second type of non-volatile memory cell in accordance with an embodiment of the present application. The erasing, programming and operation of the non-volatile memory cell of the second type as seen in FIG. 2D may be referred to those as illustrated in FIGS. 2A-2C. For an element indicated by the same reference number shown in FIGS. 2A-2D, the specification of the element as seen in FIG. 2D may be referred to that of the element as illustrated in FIGS. 2A-2C. The difference therebetween is mentioned as below. Referring to FIG. 2D, the second type of non-volatile memory cell 650 may further include the switch 630, such as N-type MOS transistor, between the drain terminal, in operation, of the P-type MOS transistor 610 and the node N0. The N-type MOS transistor 630 may be configured to form a channel with an end coupling to the drain terminal, in operation, of the P-type MOS transistor 610 and the other end coupling to the node N0. When the second type of non-volatile memory cell 650 is being erased for the first, second and third aspects, the N-type MOS transistor 630 may have a gate terminal switched to couple to the voltage Vss of ground reference to turn off its channel to disconnect the drain terminal, in operation, of the P-type MOS transistor 610 from the node N0. Accordingly, a current flow may be prevented from being leaked from the node N0 to the node N3 through the channel of the P-type MOS transistor 610 and/or from the node N4 to the node N3 through the channel of the N-type MOS transistor 620 and the channel of the P-type MOS transistor 610. When the second type of non-volatile memory cell 650 is being programed for the first, second and third aspects, the gate terminal of the N-type MOS transistor 630 may be switched to couple to the voltage Vss of ground reference to turn off its channel to disconnect the drain terminal, in operation, of the P-type MOS transistor 610 from the node N0. Accordingly, a current flow may be prevented from being leaked from the node N3 to the node N0 through the channel of the P-type MOS transistor 610 and/or from the node N3 to the node N4 through the channel of the P-type MOS transistor 610 and the channel of the N-type MOS transistor 620. When the second type of non-volatile memory cell 650 is being operated, the gate terminal of the N-type MOS transistor 630 may be switched to couple to the voltage Vcc of power supply to turn on its channel to couple the drain terminal, in operation, of the P-type MOS transistor 610 to the node N0.

Alternatively, referring to FIG. 2D, the switch 630 may be a P-type MOS transistor configured to form a channel with an end coupling to the drain terminal, in operation, of the P-type MOS transistor 610 and the other end coupling to the node N0. When the second type of non-volatile memory cell 650 is being erased for the first, second and third aspects, the P-type MOS transistor 630 may have a gate terminal switched to couple to the erasing voltage $V_{Er}$ to turn off its channel to disconnect the drain terminal, in operation, of the P-type MOS transistor 610 from the node N0. Accordingly, a current flow may be prevented from being leaked from the node N0 to the node N3 through the channel of the P-type MOS transistor 610 and/or from the node N4 to the node N3 through the channel of the N-type MOS transistor 620 and the channel of the P-type MOS transistor 610. When the second type of non-volatile memory cell 650 is being programed for the first, second and third aspects, the gate terminal of the P-type MOS transistor 630 may be switched to couple to the programming voltage $V_{Pr}$ to turn off its channel to disconnect the drain terminal, in operation, of the P-type MOS transistor 610 from the node N0. Accordingly, a current flow may be prevented from being leaked from the node N3 to the node N0 through the channel of the P-type MOS transistor 610 and/or from the node N3 to the node N4 through the channel of the P-type MOS transistor 610 and the channel of the N-type MOS transistor 620. When the second type of non-volatile memory cell 650 is being operated, the gate terminal of the P-type MOS transistor 630 may be switched to couple to the voltage Vss of ground reference to turn on its channel to couple the drain terminal, in operation, of the P-type MOS transistor 610 to the node N0.

Figure 2E:
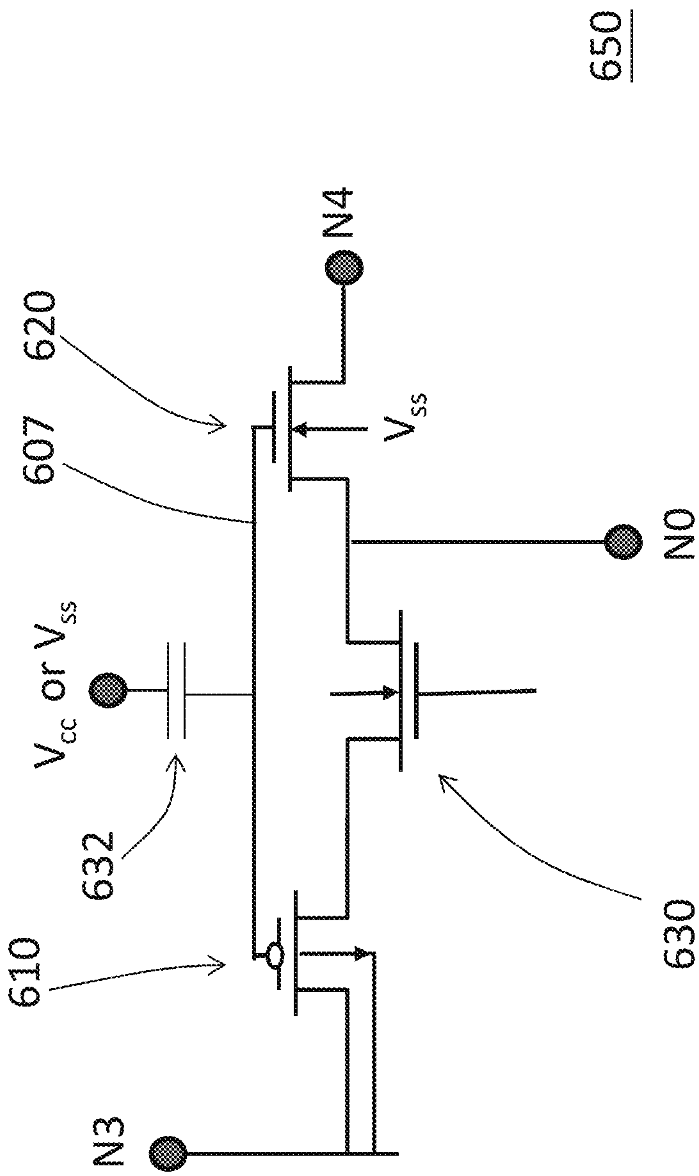

Alternatively, FIG. 2E is a circuit diagram illustrating a second type of non-volatile memory cell in accordance with an embodiment of the present application. The erasing, programming and operation of the non-volatile memory cell of the second type as seen in FIG. 2E may be referred to those as illustrated in FIGS. 2A-2D. For an element indicated by the same reference number shown in FIGS. 2A-2E, the specification of the element as seen in FIG. 2E may be referred to that of the element as illustrated in FIGS. 2A-2D. The difference therebetween is mentioned as below. Referring to FIG. 2E, the second type of non-volatile memory cell 650 may further include the parasitic capacitor 632 having a first terminal coupling to the floating gate 607 and a second terminal coupling to the voltage Vcc of power supply voltage or to the voltage Vss of ground reference. The parasitic capacitor 632 may have a capacitance greater than a gate capacitance of the P-type MOS transistor 610 and than a gate capacitance of the N-type MOS transistor 620. For example, the capacitance of the parasitic capacitor 632 may be equal to between 1 and 10,000 times of the gate capacitance of the P-type MOS transistor 610 and to between 1 and 10,000 times of the gate capacitance of the N-type MOS transistor 620. The capacitance of the parasitic capacitor 632 may range from 0.1 aF to 1 pF. Thereby, more electric charges or electrons may be stored in the floating gate 607.

For the second type of non-volatile memory cells 650 as illustrated in FIGS. 2A-2E, the erasing voltage $V_{Er}$ may be greater than or equal to the programming voltage $V_{Pr}$ that may be greater than or equal to the voltage Vcc of power supply. The erasing voltage $V_{Er}$ may range from 5 volts to 0.25 volts, the programming voltage $V_{Pr}$ may range from 5 volts to 0.25 volts, and the voltage Vcc of power supply may range from 3.5 volts to 0.25 volts, such as 0.75 volts or 3.3 volts.

(3) Third Type of Non-Volatile Memory Cells

Figure 3A:
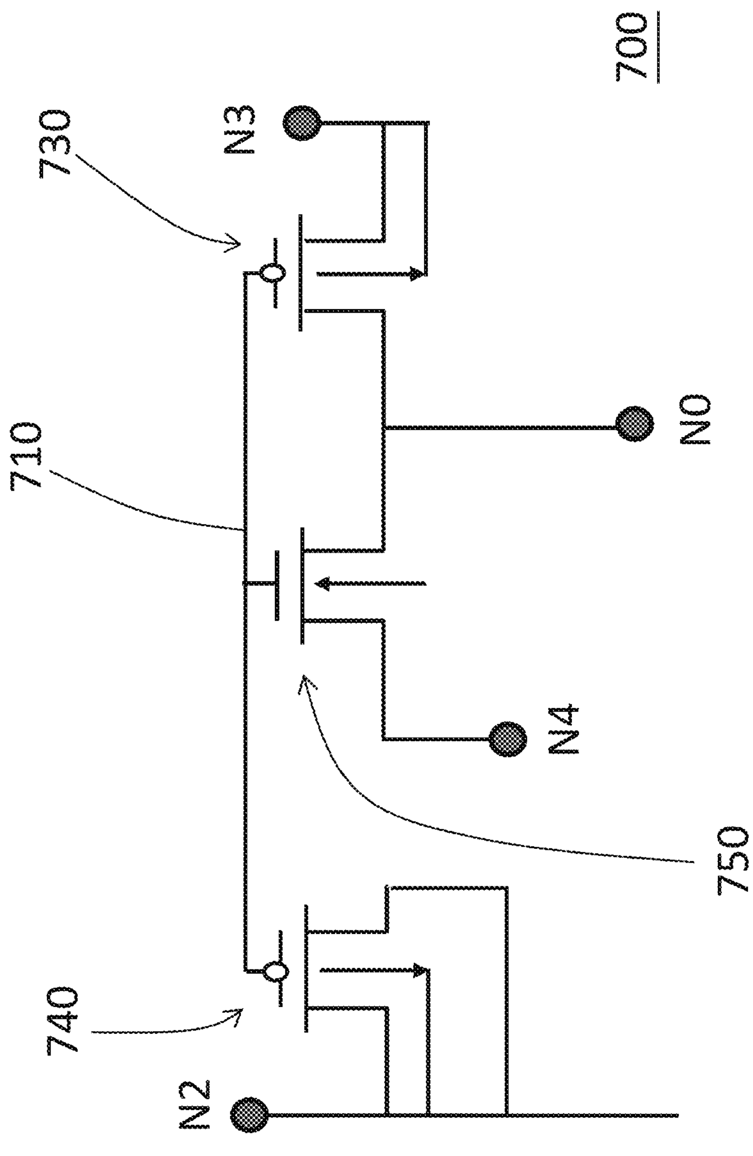
FIGS. 3A and 3D-3U are circuit diagrams illustrating a third type of non-volatile memory cells in accordance with an embodiment of the present application.
Figure 3B:
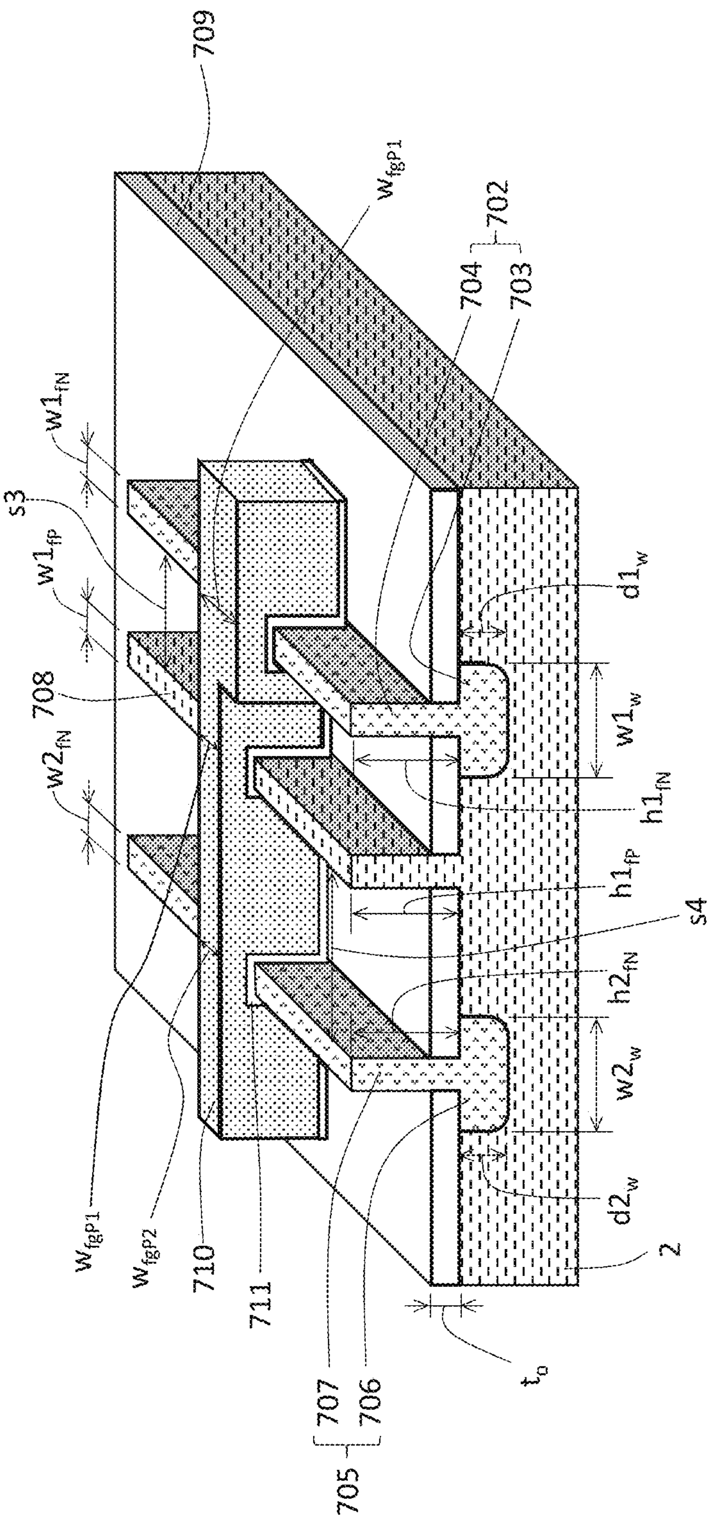
FIGS. 3B and 3C are schematically perspective views showing various structures of a third type of non-volatile memory cell in FIG. 3A in accordance with an embodiment of the present application.

FIG. 3A is a circuit diagram illustrating a third type of non-volatile memory cell in accordance with an embodiment of the present application. FIG. 3B is a schematically perspective view showing a structure of a third type of non-volatile memory cell in accordance with an embodiment of the present application. Referring to FIGS. 3A and 3B, a third type of non-volatile memory cell 700, i.e. FGCMOS NVM cell, maybe formed on a P-type or N-type semiconductor substrate 2, e.g., silicon substrate. In this case, a P-type silicon substrate 2 coupling the voltage Vss of ground reference is provided for the non-volatile memory cell 700. The third type of non-volatile memory cell 700 may include:

(1) a first N-type stripe 702 formed with an N-type well 703 in the P-type silicon substrate 2 and an N-type fin 704 vertically protruding from the a top surface of the N-type well 703, wherein the N-type well 703 may have a depth $d1_w$ between 0.3 and 5 micrometers and a width $w1_w$ between 50 nanometers and 1 micrometer, and the N-type fin 704 may have a height $h1_{fN}$ between 10 and 200 nanometers and a width $w1_{fN}$ between 1 and 100 nanometers;

(2) a second N-type stripe 705 formed with an N-type well 706 in the P-type silicon substrate 2 and an N-type fin 707 vertically protruding from a top surface of the N-type well 706, wherein the N-type well 706 may have a depth $d2_w$ between 0.3 and 5 micrometers and a width $w2_w$ between 50 nanometers and 1 micrometer, and the N-type fin 707 may have a height $h2_{fN}$ between 10 and 200 nanometers and a width $w2_{fN}$ between 1 and 100 nanometers;

(3) a P-type fin 708 vertically protruding from the P-type silicon substrate 2, wherein the P-type fin 708 may have a height $h1_{fP}$ between 10 and 200 nanometers and a width $w1_{fP}$ between 1 and 100 nanometers, wherein a space s3 between the N-type fin 704 and P-type fin 708 may range from 100 to 2,000 nanometers and a space s4 between the N-type fin 707 and P-type fin 708 may range from 100 to 2,000 nanometers;

(4) a field oxide 709, such as silicon oxide, on the P-type silicon substrate 2, wherein the field oxide 709 may have a thickness $t_o$ between 20 and 500 nanometers;

(5) a floating gate 710, such as polysilicon, tungsten, tungsten nitride, titanium, titanium nitride, tantalum, tantalum nitride, copper-containing metal, aluminum-containing metal, or other conductive metals, transversely extending over the field oxide 709 and from the N-type fin 704 of the first N-type stripe 702 to the N-type fin 707 of the second N-type stripe 705 across over the P-type fin 708, wherein the floating gate 710 may have a width $w_{fgP1}$ over the N-type fin 704 of the first N-type stripe 702, which may be greater than or equal to a width $w_{fgN1}$ thereof over the P-type fin 708 and greater than or equal to a width $w_{fgP2}$ thereof over the N-type fin 707 of the second N-type stripe 705, wherein the width $w_{fgP1}$ over the N-type fin 704 of the first N-type stripe 702 may be equal to between 1 and 10 times or between 1.5 and 5 times of the width $w_{fgN1}$ over the P-type fin 708 and, for example, equal to 2 times of the width $w_{fgN1}$ over the P-type fin 708, and the width $w_{fgP1}$ over the N-type fin 704 of the first N-type stripe 702 may be equal to between 1 and 10 times or between 1.5 and 5 times of the width $w_{fgP2}$ over the N-type fin 707 of the second N-type stripe 705 and, for example, equal to 2 times of the width $w_{fgP2}$ over the N-type fin 707 of the second N-type stripe 705, wherein the width $w_{fgP1}$ over the N-type fin 704 of the first N-type stripe 702 may range from 1 to 25 nanometers, the width $w_{fgP2}$ over the N-type fin 707 of the second N-type stripe 705 may range from 1 to 25 nanometers, and the width $w_{fgN1}$ over the P-type fin 708 may range from 1 to 25 nanometers; and (6) a gate oxide 711, such as silicon oxide, hafnium-containing oxide, zirconium-containing oxide or titanium-containing oxide, transversely extending on the field oxide 709 and from the N-type fin 704 of the first N-type stripe 702 to the N-type fin 707 of the second N-type stripe 705 across over the P-type fin 708 to be provided between the floating gate 710 and the N-type fin 704, between the floating gate 710 and the N-type fin 707, between the floating gate 710 and the P-type fin 708 and between the floating gate 710 and the field oxide 709, wherein the gate oxide 711 may have a thickness between 1 and 5 nanometers.

Figure 3C:
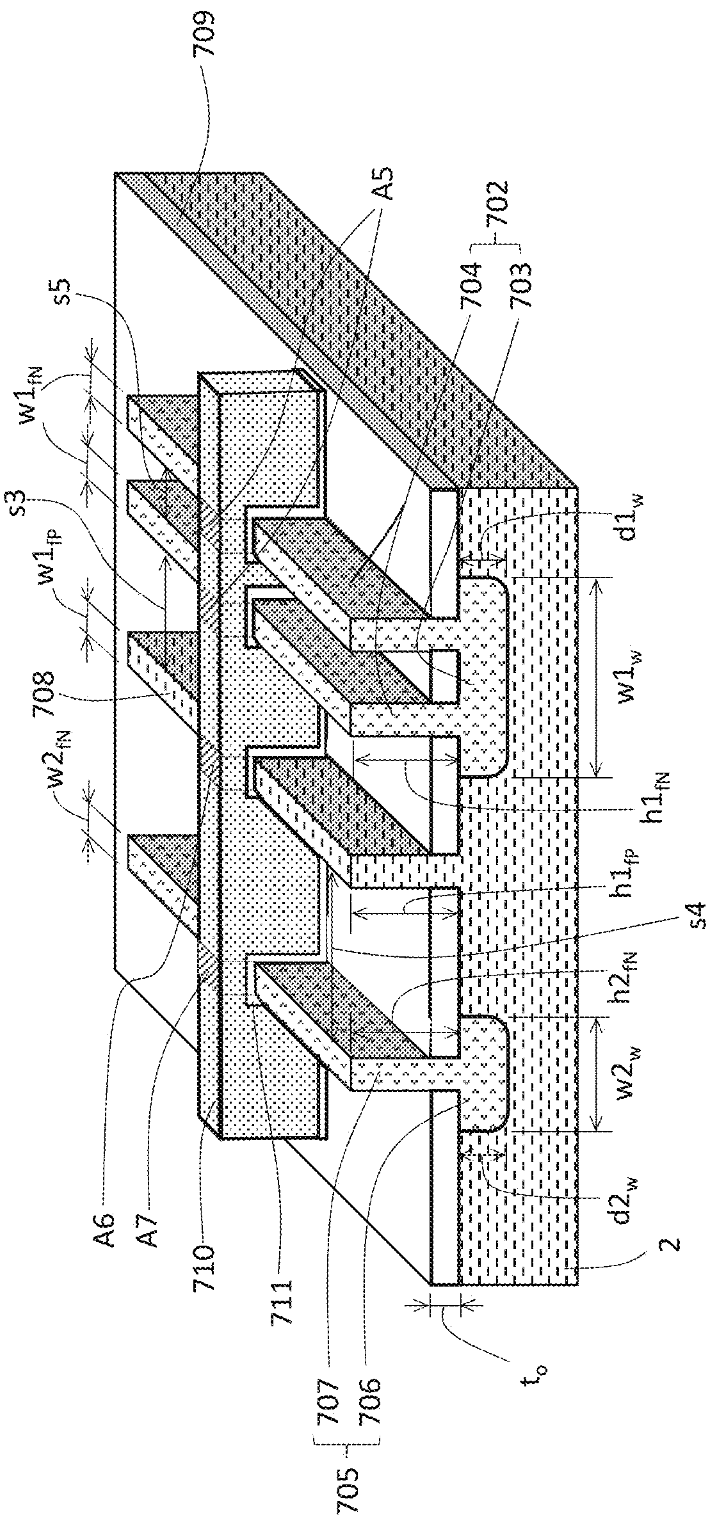

Alternatively, FIG. 3C is a schematically perspective view showing a structure of a third type of non-volatile memory cell in accordance with an embodiment of the present application. For an element indicated by the same reference number shown in FIGS. 3B and 3C, the specification of the element as seen in FIG. 3C may be referred to that of the element as illustrated in FIG. 3B. The difference between the scheme illustrated in FIG. 3B and the scheme illustrated in FIG. 3C is mentioned as below. Referring to FIG. 3C, a plurality of the N-type fin 704 arranged in parallel to each other or one another may be formed to vertically protrude from the N-type well 703, wherein each of the one or more N-type fins 704 may have substantially the same height $h1_{fN}$ between 10 and 200 nanometers and substantially the same width $w1_{fN}$ between 1 and 100 nanometers, wherein the combination of the N-type fins 704 may be made for a P-type fin field-effect transistor (FinFET). The space s3 between the P-type fin 708 and one of the N-type fins 704 next to the P-type fin 708 may range from 100 to 2,000 nanometers. A space s5 between neighboring two of the N-type fins 704 may range from 2 to 200 nanometers. The N-type fins 704 may have the number between 1 and 10 and for example the number of two in this case. The floating gate 710 may transversely extend over the field oxide 709 and from the N-type fins 704 to the N-type fin 707 across over the P-type fin 708, wherein the floating gate 710 may have a fifth total area A5 vertically over the N-type fins 704, which may be greater than or equal to a sixth total area A6 thereof vertically over the P-type fin 705 and greater than or equal to a seventh total area A7 thereof vertically over the N-type fin 707, wherein the fifth total area A5 may be equal to between 1 and 10 times or between 1.5 and 5 times of the sixth total area A6 and, for example, equal to 2 times of the sixth total area A6, and the fifth total area A5 may be equal to between 1 and 10 times or between 1.5 and 5 times of the seventh total area A7 and, for example, equal to 2 times of the seventh total area A7, wherein the fifth total area A5 may range from 1 to 2,500 square nanometers, the sixth total area A6 may range from 1 to 2,500 square nanometers and the seventh total area A7 may range from 1 to 2,500 square nanometers.

Referring to FIGS. 3A-3C, each of the one or more N-type fins 704 may be doped with P-type atoms, such as boron atoms, so as to form two $P^+$ portions in said each of the one or more N-type fins 704 at two opposite sides of the gate oxide 711, composing two respective ends of a channel of a P-type metal-oxide-semiconductor (MOS) transistor 730 as seen in FIG. 2A. Alternatively, the multiple $P^+$ portions in the one or more N-type fins 704 at one side of the gate oxide 711 as seen in FIG. 3C may couple to each other or one another to compose an end of a channel of a first P-type metal-oxide-semiconductor (MOS) transistor 730, i.e., FG P-MOS, as seen in FIG. 3A and the multiple $P^+$ portions in the one or more N-type fins 704 at the other side of the gate oxide 711 as seen in FIG. 3C may couple to each other or one another to compose the other end of the channel of the first P-type metal-oxide-semiconductor (MOS) transistor 730 as seen in FIG. 3A. The boron atoms in the one or more N-type fins 704 may have a concentration greater than those in the P-type silicon substrate 2. The N-type fin 707 may be doped with P-type atoms, such as boron atoms, so as to form two $P^+$ portions in the N-type fin 707 at two opposite sides of the gate oxide 711, composing two respective ends of a channel of a second P-type metal-oxide-semiconductor (MOS) transistor 740, i.e., AD FG P-MOS, wherein the boron atoms in the N-type fin 707 may have a concentration greater than those in the P-type silicon substrate 2. The P-type fin 708 may be doped with N-type atoms, such as arsenic atoms, so as to form two $N^+$ portions in the P-type fin 708 at two opposite sides of the gate oxide 711, composing two respective ends of a channel of a N-type metal-oxide-semiconductor (MOS) transistor 750, i.e., FG N-MOS, wherein the arsenic atoms in the P-type fin 708 may have a concentration greater than those in the N-type well 703 and than those in the N-type well 706. Thereby, the first P-type MOS transistor 730 may have a capacitance greater than or equal to that of the second P-type MOS transistor 740 and greater than or equal to that of the N-type MOS transistor 750. The capacitance of the first P-type MOS transistor 730 may be equal to between 1 and 10 times or between 1.5 and 5 times of the capacitance of the second P-type MOS transistor 740 and, for example, equal to 2 times of the capacitance of the second P-type MOS transistor 740. The capacitance of the first P-type MOS transistor 730 may be equal to between 1 and 10 times or between 1.5 and 5 times of the capacitance of the N-type MOS transistor 750 and, for example, equal to 2 times of the capacitance of the N-type MOS transistor 750. The capacitance of the N-type MOS transistor 750 may range from 0.1 aF to 10 fF, the capacitance of the first P-type MOS transistor 730 may range from 0.1 aF to 10 fF, and the capacitance of the second P-type MOS transistor 740 may range from 0.1 aF to 10 fF.

Referring to FIGS. 3A-3C, the floating gate 710 coupling a gate terminal of the first P-type MOS transistor 730, a gate terminal of the second P-type MOS transistor 740 and a gate terminal of the N-type MOS transistor 750 with one another is configured to catch electrons therein. The first P-type transistor 730 is configured to form the channel with one of its two ends coupling to a node N3 coupling to the first N-type stripe 702 and the other of its two ends coupling to a node N0. The second P-type transistor 740 is configured to form the channel with its two ends coupling to a node N2 coupling to the N-type stripe 705. The N-type transistor 620 is configured to form the channel with one of its two ends coupling to a node N4 and the other of its two ends coupling to the node N0.

Referring to FIGS. 3A-3C, when the floating gate 710 is being erased, (1) the node N2 may couple to the second N-type stripe 705 switched to couple to an erasing voltage $V_{Er}$, (2) the node N4 may be switched to couple to the voltage Vss of ground reference, (3) the node N3 may couple to the first N-type stripe 702 switched to couple to the voltage Vss of ground reference and (4) the node N0 may be switched to be floating or to couple to the voltage Vss of ground reference. Since the gate capacitance of the second P-type MOS transistor 740 is smaller than the sum of the gate capacitances of the first P-type MOS transistor 730 and the N-type MOS transistor 750, the voltage difference between the floating gate 710 and the node N2 is large enough to cause electron tunneling. Accordingly, electrons trapped in the floating gate 710 may tunnel through the gate oxide 711 to the node N2. Thereby, the floating gate 710 may be erased to a logic level of "1".

Referring to FIGS. 3A-3C, after the third type of non-volatile memory cell 700 is erased, the floating gate 710 may be charged to a logic level of "1" to turn on the N-type MOS transistor 750 and off the first and second P-type MOS transistors 730 and 740. In this situation, when the floating gate 710 is being programmed, (1) the node N2 may couple to the second N-type stripe 705 switched to couple to a programming voltage $V_{Pr}$, (2) the node N4 may be switched to couple to the voltage Vss of ground reference, (3) the node N3 may couple to the first N-type stripe 702 switched to couple to the programming voltage $V_{Pr}$ and (4) the node N0 may be switched to be floating. Since the gate capacitance of the N-type MOS transistor 750 is smaller than the sum of the gate capacitances of the first and second P-type MOS transistor 730 and 740, the voltage difference between the floating gate 710 and the node N4 is large enough to cause electron tunneling. Accordingly, electrons may tunnel through the gate oxide 711 from the node N4 to the floating gate 710 to be trapped in the floating gate 710. Thereby, the floating gate 710 may be programmed to a logic level of "0".

Referring to FIGS. 3A-3C, for operation of the non-volatile memory cell 700, (1) the node N2 may couple to the second N-type stripe 705 switched to couple to a voltage between the voltage Vcc of power supply and the voltage Vss of ground reference, such as the voltage Vcc of power supply, the voltage Vss of ground reference or an half of the voltage Vcc of power supply, or switched to be floating, (2) the node N4 may be switched to couple to the voltage Vss of ground reference, (3) the node N3 may couple to the first N-type stripe 702 switched to couple to the voltage Vcc of power supply and (4) the node N0 may be switched to act as an output of the non-volatile memory cell 700. When the floating gate 710 is charged to a logic level of "1", the first P-type MOS transistor 730 may be turned off and the N-type MOS transistor 750 may be turned on to couple the node N4 switched to couple to the voltage Vss of ground reference to the node N0 switched to act as the output of the non-volatile memory cell 700 through the channel of the N-type MOS transistor 750. Thereby, the output of the non-volatile memory cell 700 at the node N0 may be at a logic level of "0". When the floating gate 710 is discharged to a logic level of "0", the first P-type MOS transistor 730 may be turned on and the N-type MOS transistor 750 may be turned off to couple the node N3 switched to couple to the voltage Vcc of power supply to the node N0 switched to act as the output of the non-volatile memory cell 700 through the channel of the first P-type MOS transistor 730. Thereby, the output of the non-volatile memory cell 700 at the node N0 may be at a logic level of "1".

Figure 3D:
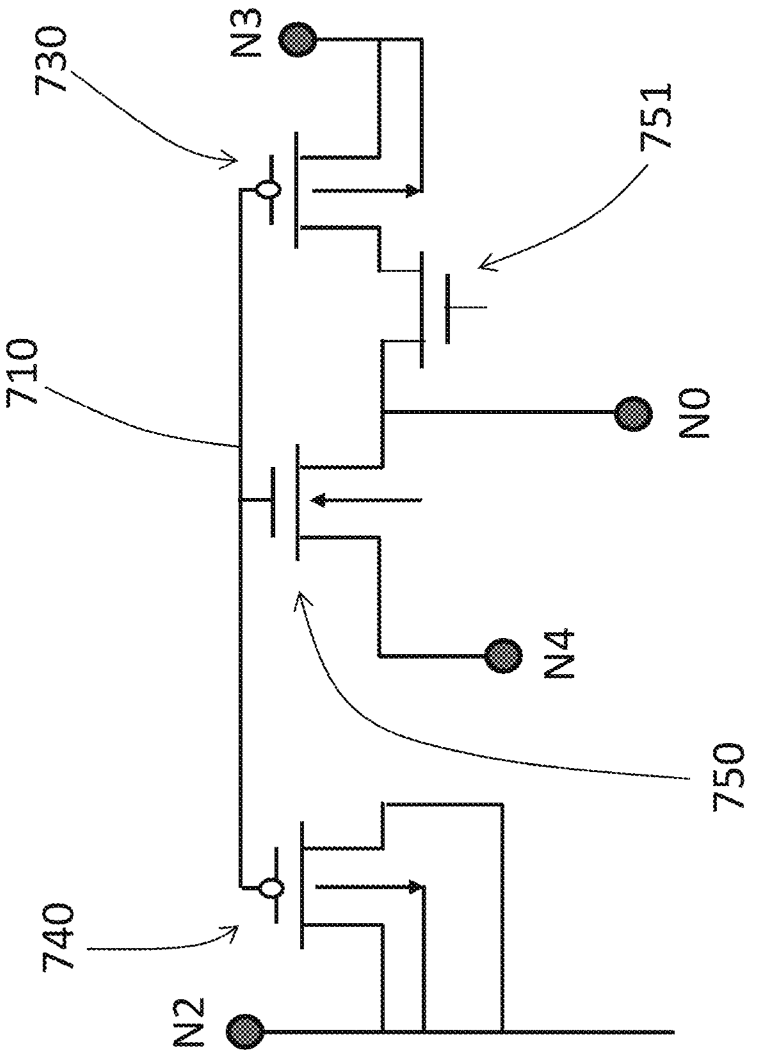

Alternatively, FIG. 3D is a circuit diagram illustrating a third type of non-volatile memory cell in accordance with an embodiment of the present application. The erasing, programming and operation of the non-volatile memory cell of the third type as seen in FIG. 3D may be referred to those as illustrated in FIGS. 3A-3C. For an element indicated by the same reference number shown in FIGS. 3A-3D, the specification of the element as seen in FIG. 3D may be referred to that of the element as illustrated in FIGS. 3A-3C. The difference therebetween is mentioned as below. Referring to FIG. 3D, the third type of non-volatile memory cell 700 may further include a switch 751, such as N-type MOS transistor, between the drain terminal, in operation, of the first P-type MOS transistor 730 and the node N0. The N-type MOS transistor 751 may be configured to form a channel with an end coupling to the drain terminal, in operation, of the first P-type MOS transistor 730 and the other end coupling to the node N0. When the third type of non-volatile memory cell 700 is being erased, the N-type MOS transistor 751 may have a gate terminal switched (1) to couple to the voltage Vss of ground reference to turn off its channel to disconnect the drain terminal, in operation, of the first P-type MOS transistor 730 from the node N0, (2) to couple to the erasing voltage $V_{Er}$ to turn on its channel to couple the drain terminal, in operation, of the first P-type MOS transistor 730 to the node N0 or (3) to be floating. When the third type of non-volatile memory cell 700 is being programmed, the gate terminal of the N-type MOS transistor 751 may be switched to couple to the voltage Vss of ground reference to turn off its channel to disconnect the drain terminal, in operation, of the first P-type MOS transistor 730 from the node N0. Accordingly, a current flow may be prevented from being leaked from the node N3 to the node N4. Alternatively, when the third type of non-volatile memory cell 700 is being programmed, the gate terminal of the N-type MOS transistor 751 may be switched to couple to the programming voltage $V_{Pr}$ to turn on its channel to couple the drain terminal, in operation, of the first P-type MOS transistor 730 to the node N0 or to be floating. When the third type of non-volatile memory cell 700 is being operated, the gate terminal of the N-type MOS transistor 751 may be switched to couple to the voltage Vcc of power supply to turn on its channel to couple the drain terminal, in operation, of the first P-type MOS transistor 730 to the node N0.

Alternatively, referring to FIG. 3D, the switch 751 may be a P-type MOS transistor configured to form a channel with an end coupling to the drain terminal, in operation, of the first P-type MOS transistor 730 and the other end coupling to the node N0. When the third type of non-volatile memory cell 700 is being erased, the P-type MOS transistor 751 may have a gate terminal switched (1) to couple to the erasing voltage $V_{Er}$ to turn off its channel to disconnect the drain terminal, in operation, of the first P-type MOS transistor 730 from the node N0, (2) to couple to the voltage Vss of ground reference to turn on its channel to couple the drain terminal, in operation, of the first P-type MOS transistor 730 to the node N0 or (3) to be floating. When the third type of non-volatile memory cell 700 is being programmed, the gate terminal of the P-type MOS transistor 751 may be switched to couple to the programming voltage $V_{Pr}$ to turn off its channel to disconnect the drain terminal, in operation, of the first P-type MOS transistor 730 from the node N0. Accordingly, a current flow may be prevented from being leaked from the node N3 to the node N4. Alternatively, when the third type of non-volatile memory cell 700 is being programmed, the gate terminal of the P-type MOS transistor 751 may be switched to be floating. When the third type of non-volatile memory cell 700 is being operated, the gate terminal of the N-type MOS transistor 751 may be switched to couple to the voltage Vss of ground reference to turn on its channel to couple the drain terminal, in operation, of the first P-type MOS transistor 730 to the node N0.

Figure 3E:
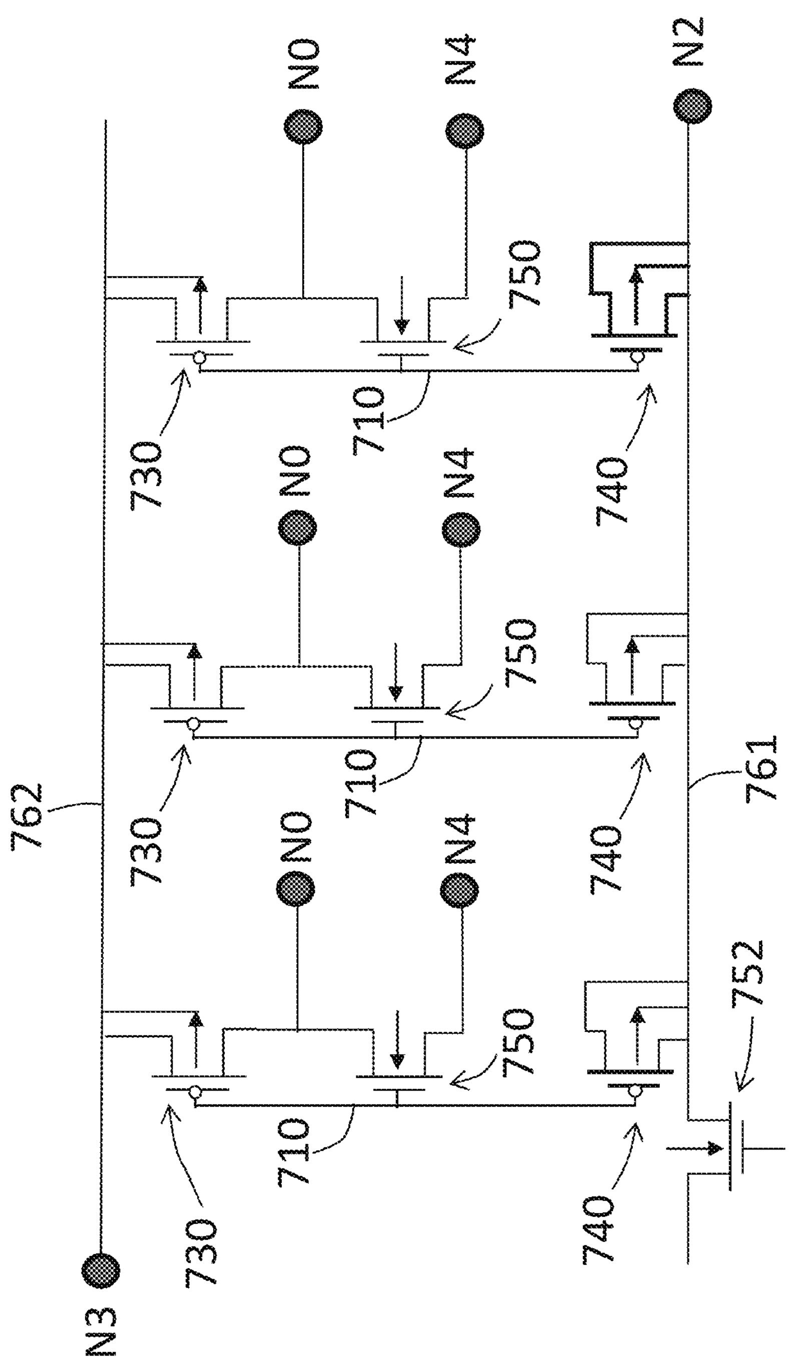
FIGS. 3V and 3W are schematically perspective views showing various structures of a third type of non-volatile memory cell in FIG. 3U in accordance with an embodiment of the present application.

Alternatively, FIG. 3E is a circuit diagram illustrating a third type of non-volatile memory cell in accordance with an embodiment of the present application. The erasing, programming and operation of the non-volatile memory cell of the third type as seen in FIG. 3E may be referred to those as illustrated in FIGS. 3A-3C. For an element indicated by the same reference number shown in FIGS. 3A-3C and 3E, the specification of the element as seen in FIG. 3E may be referred to that of the element as illustrated in FIGS. 3A-3C. The difference therebetween is mentioned as below. Referring to FIGS. 3A-3C and 3E, a plurality of the non-volatile memory cell 700 of the third type may have its nodes N2 coupling in parallel to each other or one another and to a switch 752, such as N-type MOS transistor, via a word line 761 and its nodes N3 coupling in parallel to each other or one another via a word line 762. The N-type MOS transistor 752 may be configured to form a channel with an end coupling to the node N2 of each of the non-volatile memory cells 700 and the other end configured switched to couple to the erasing voltage $V_{Er}$, the programming voltage $V_{Pr}$ or a voltage between the voltage Vcc of power supply and the voltage Vss of ground reference. When the third type of non-volatile memory cells 700 are being erased, the N-type MOS transistor 752 may have a gate terminal switched to couple to the erasing voltage $V_{Er}$ to turn on its channel to couple the node N2 of each of the non-volatile memory cells 700 to the erasing voltage $V_{Er}$. When the third type of non-volatile memory cells 700 are being programmed, the gate terminal of the N-type MOS transistor 752 may be switched to couple to the programming voltage $V_{Pr}$ to turn on its channel to couple the node N2 of each of the non-volatile memory cells 700 to the programming voltage $V_{Pr}$. When the third type of non-volatile memory cells 700 are being operated, (1) the gate terminal of the N-type MOS transistor 752 may be switched to couple to the voltage Vss of ground reference to turn off its channel to lead the node N2 of each of the non-volatile memory cells 700 to be floating, or (2) the gate terminal of the N-type MOS transistor 752 may be switched to couple to the voltage Vcc of power supply to turn on its channel to couple the node N2 of each of the non-volatile memory cells 700 to a voltage between the voltage Vcc of power supply and the voltage Vss of ground reference. When the third type of non-volatile memory cells 700 are being in a power saving mode, the gate terminal of the N-type MOS transistor 752 may be switched to couple to the voltage Vss of ground reference to turn off its channel to lead the node N2 of each of the non-volatile memory cells 700 to be floating.

Alternatively, referring to FIGS. 3A-3C and 3E, the switch 752 may be a P-type MOS transistor configured to form a channel with an end coupling to the node N2 of each of the non-volatile memory cells 700 and the other end configured switched to couple to the erasing voltage $V_{Er}$, the programming voltage $V_{Pr}$ or a voltage between the voltage Vcc of power supply and the voltage Vss of ground reference. When the third type of non-volatile memory cells 700 are being erased, the P-type MOS transistor 752 may have a gate terminal switched to couple to the voltage Vss of ground reference to turn on its channel to couple the node N2 of each of the non-volatile memory cells 700 to the erasing voltage $V_{Er}$. When the third type of non-volatile memory cells 700 are being programmed, the gate terminal of the P-type MOS transistor 752 may be switched to couple to the voltage Vss of ground reference to turn on its channel to couple the node N2 of each of the non-volatile memory cells 700 to the programming voltage $V_{Pr}$. When the third type of non-volatile memory cells 700 are being operated, (1) the gate terminal of the P-type MOS transistor 752 may be switched to couple to the voltage Vcc of power supply to turn off its channel to lead the node N2 of each of the non-volatile memory cells 700 to be floating, or (2) the gate terminal of the P-type MOS transistor 752 may be switched to couple to the voltage Vss of ground reference to turn on its channel to couple the node N2 of each of the non-volatile memory cells 700 to a voltage between the voltage Vcc of power supply and the voltage Vss of ground reference. When the third type of non-volatile memory cells 700 are being in a power saving mode, the gate terminal of the N-type MOS transistor 752 may be switched to couple to the voltage Vcc of power supply to turn off its channel to lead the node N2 of each of the non-volatile memory cells 700 to be floating.

Figure 3F:
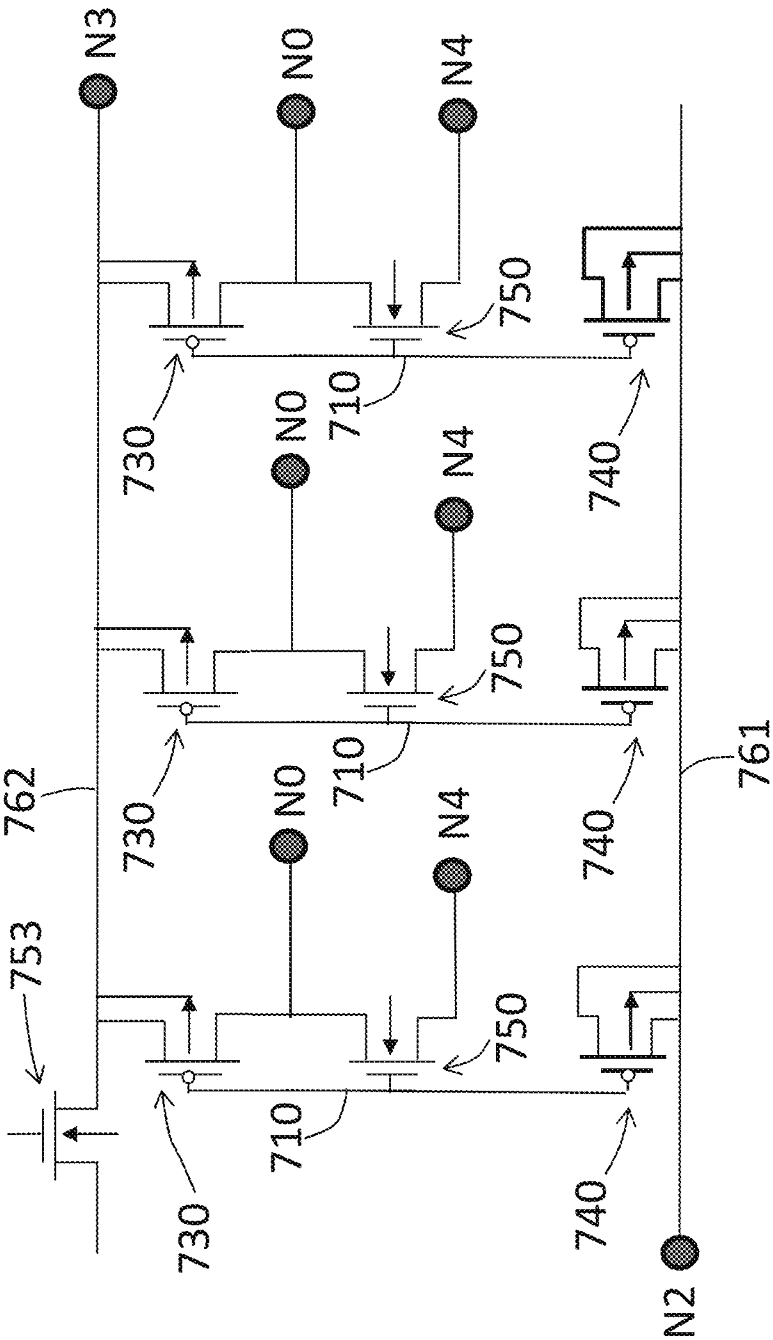

Alternatively, FIG. 3F is a circuit diagram illustrating a third type of non-volatile memory cell in accordance with an embodiment of the present application. The erasing, programming and operation of the non-volatile memory cell of the third type as seen in FIG. 3F may be referred to those as illustrated in FIGS. 3A-3C. For an element indicated by the same reference number shown in FIGS. 3A-3C and 3F, the specification of the element as seen in FIG. 3F may be referred to that of the element as illustrated in FIGS. 3A-3C. The difference therebetween is mentioned as below. Referring to FIGS. 3A and 3F, a plurality of the non-volatile memory cell 700 of the third type may have its nodes N2 coupling in parallel to each other or one another via the word line 761 and its nodes N3 coupling in parallel to each other or one another and to a switch 753, such as N-type MOS transistor, via the word line 762. The N-type MOS transistor 753 may be configured to form a channel with an end coupling to the node N3 of each of the non-volatile memory cells 700 and the other end configured switched to couple to the voltage Vss of ground reference, the programming voltage $V_{Pr}$ or the voltage Vcc of power supply. When the third type of non-volatile memory cells 700 are being erased, the N-type MOS transistor 753 may have a gate terminal switched to couple to the erasing voltage $V_{Er}$ to turn on its channel to couple the node N3 of each of the non-volatile memory cells 700 to the voltage Vss of ground reference. When the third type of non-volatile memory cells 700 are being programmed, the gate terminal of the N-type MOS transistor 753 may be switched to couple to the programming voltage $V_{Pr}$ to turn on its channel to couple the node N3 of each of the non-volatile memory cells 700 to the programming voltage $V_{Pr}$. When the third type of non-volatile memory cells 700 are being operated, the gate terminal of the N-type MOS transistor 753 may be switched to couple to the voltage Vcc of power supply to turn on its channel to couple the node N3 of each of the non-volatile memory cells 700 to the voltage Vcc of power supply. When the third type of non-volatile memory cells 700 are being in a power saving mode, the gate terminal of the N-type MOS transistor 753 may be switched to couple to the voltage Vss of ground reference to turn off its channel to lead the node N3 of each of the non-volatile memory cells 700 to be floating.

Alternatively, referring to FIGS. 3B, 3C and 3F, the switch 753 may be a P-type MOS transistor configured to form a channel with an end coupling to the node N3 of each of the non-volatile memory cells 700 and the other end configured switched to couple to the voltage Vss of ground reference, the programming voltage $V_{Pr}$ or the voltage Vcc of power supply. When the third type of non-volatile memory cells 700 are being erased, the P-type MOS transistor 753 may have a gate terminal switched to couple to the voltage Vss of ground reference to turn on its channel to couple the node N3 of each of the non-volatile memory cells 700 to the voltage Vss of ground reference. When the third type of non-volatile memory cells 700 are being programmed, the gate terminal of the P-type MOS transistor 753 may be switched to couple to the voltage Vss of ground reference to turn on its channel to couple the node N3 of each of the non-volatile memory cells 700 to the programming voltage $V_{Pr}$. When the third type of non-volatile memory cells 700 are being operated, the gate terminal of the P-type MOS transistor 753 may be switched to couple to the voltage Vss of ground reference to turn on its channel to couple the node N3 of each of the non-volatile memory cells 700 to the voltage Vcc of power supply. When the third type of non-volatile memory cells 700 are being in a power saving mode, the gate terminal of the P-type MOS transistor 753 may be switched to couple to the voltage Vcc of power supply to turn off its channel to lead the node N3 of each of the non-volatile memory cells 700 to be floating.

Figure 3G:
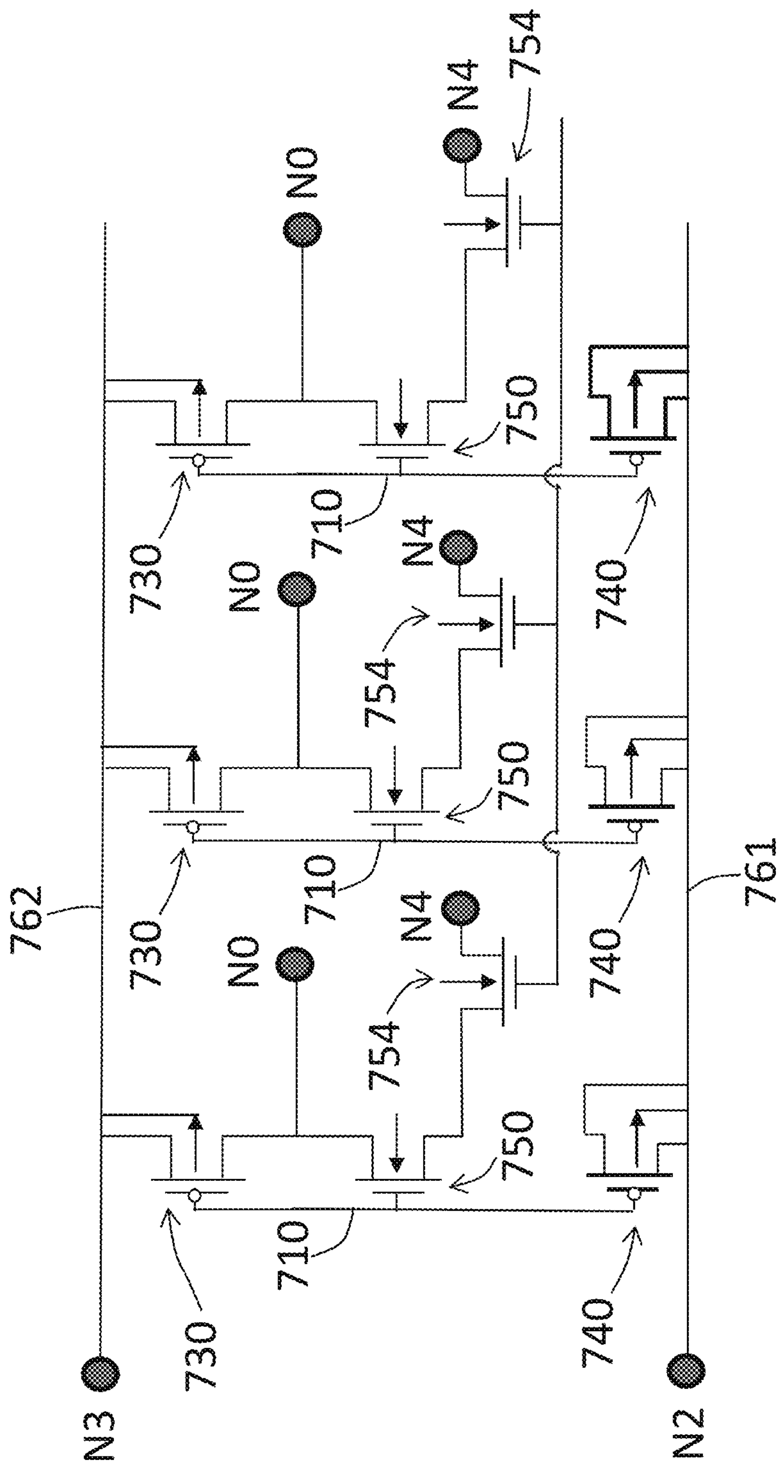

Alternatively, FIG. 3G is a circuit diagram illustrating a third type of non-volatile memory cell in accordance with an embodiment of the present application. The erasing, programming and operation of the non-volatile memory cell of the third type as seen in FIG. 3G may be referred to those as illustrated in FIGS. 3A-3C. For an element indicated by the same reference number shown in FIGS. 3A-3C and 3G, the specification of the element as seen in FIG. 3G may be referred to that of the element as illustrated in FIGS. 3A-3C. The difference therebetween is mentioned as below. Referring to FIGS. 3A-3C and 3G, a plurality of the non-volatile memory cell 700 of the third type may have its nodes N2 coupling in parallel to each other or one another via the word line 761 and its nodes N3 coupling in parallel to each other or one another via the word line 762. Each of the non-volatile memory cells 700 may further include a switch 754, such as N-type MOS transistor, configured to form a channel with an end coupling to the source terminal, in operation, of its N-type MOS transistor 750 and the other end coupling to its node N4. The N-type MOS transistors 754 of the plurality of the non-volatile memory cell 700 may have gate terminals coupling to each other or one another via a word line 763. When each of the non-volatile memory cells 700 is being erased, the word line 763 may be switched to couple to the erasing voltage $V_{Er}$ to turn on the channel of its N-type MOS transistor 754 to couple the source terminal, in operation, of its N-type MOS transistor 750 to its node N4 After the plurality of the non-volatile memory cell 700 is erased, each of the non-volatile memory cells 700 may be selected to be programmed or not to be programmed. For example, a leftmost one of the non-volatile memory cells 700 has its floating gate 710 selected to be programmed to a logic level of "0", but a rightmost one of the non-volatile memory cells 700 has its floating gate 710 selected not to be programmed to a logic level of "0" but kept at a logic level of "1". When the leftmost one of the non-volatile memory cells 700 is being programmed and the rightmost one of the non-volatile memory cells 700 is not being programmed, the word line 763 may be switched to couple to the programming voltage $V_{Pr}$ to turn on the channels of their N-type MOS transistors 754 respectively to couple the source terminals, in operation, of their N-type MOS transistors 750 to their nodes N4 respectively. The leftmost one of the non-volatile memory cells 700 may have its node N4 switched to couple to the voltage Vss of ground reference such that electrons may tunnel through its gate oxide 711 from its node N4 to its floating gate 710 to be trapped in its floating gate 710, and thereby its floating gate 710 may be programmed to a logic level of "0". The rightmost one of the non-volatile memory cells 700 may have its node N4 switched to couple to the programming voltage $V_{Pr}$ such that no electrons may tunnel through its gate oxide 711 from its node N4 to its floating gate 710, and thereby its floating gate 710 may be kept at a logic level of "1". When each of the non-volatile memory cells 700 of the third type is being operated, the word line 763 may be switched to couple to the voltage Vcc of power supply to turn on the channel of its N-type MOS transistor 754 to couple the source terminal, in operation, of its N-type MOS transistor 750 to its node N4. When each of the non-volatile memory cells 700 of the third type is being in a power saving mode, the word line 763 may be switched to couple to the voltage Vss of ground reference to turn off the channel of its N-type MOS transistor 754 to disconnect the source terminal, in operation, of its N-type MOS transistor 750 from its node N4.

Alternatively, referring to FIG. 3G, for each of the non-volatile memory cells 700, the switch 754 may be a P-type MOS transistor configured to form a channel with an end coupling to the source terminal, in operation, of its N-type MOS transistor 750 and the other end coupling to its node N4. The P-type MOS transistors 754 of the plurality of the non-volatile memory cell 700 may have gate terminals coupling to each other or one another via the word line 763. When each of the non-volatile memory cells 700 is being erased, the word line 763 may be switched to couple to the voltage Vss of ground reference to turn on the channel of its P-type MOS transistor 754 to couple the source terminal, in operation, of its N-type MOS transistor 750 to its node N4 When the leftmost one of the non-volatile memory cells 700 is being programmed and the rightmost one of the non-volatile memory cells 700 is not being programmed, the word line 763 may be switched to couple to the voltage Vss of ground reference to turn on the channels of their N-type MOS transistors 754 respectively to couple the source terminals, in operation, of their N-type MOS transistors 750 to their nodes N4 respectively. When each of the non-volatile memory cells 700 of the third type is being operated, the word line 763 may be switched to couple to the voltage Vss of ground reference to turn on the channel of its P-type MOS transistor 754 to couple the source terminal, in operation, of its N-type MOS transistor 750 to its node N4. When each of the non-volatile memory cells 700 of the third type is being in a power saving mode, the word line 763 may be switched to couple to the voltage Vcc of power supply to turn off the channel of its N-type MOS transistor 754 to disconnect the source terminal, in operation, of its N-type MOS transistor 750 from its node N4.

Figure 3H:
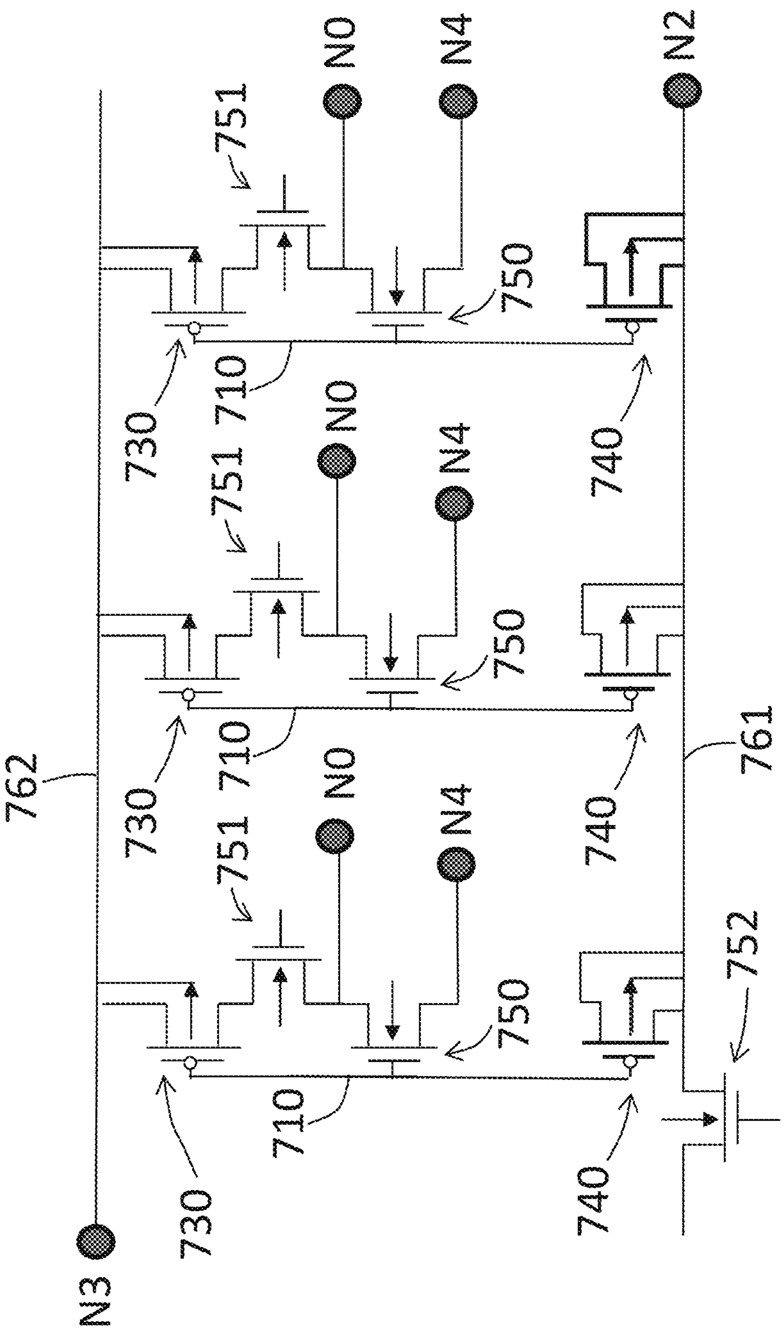
Figure 3I:
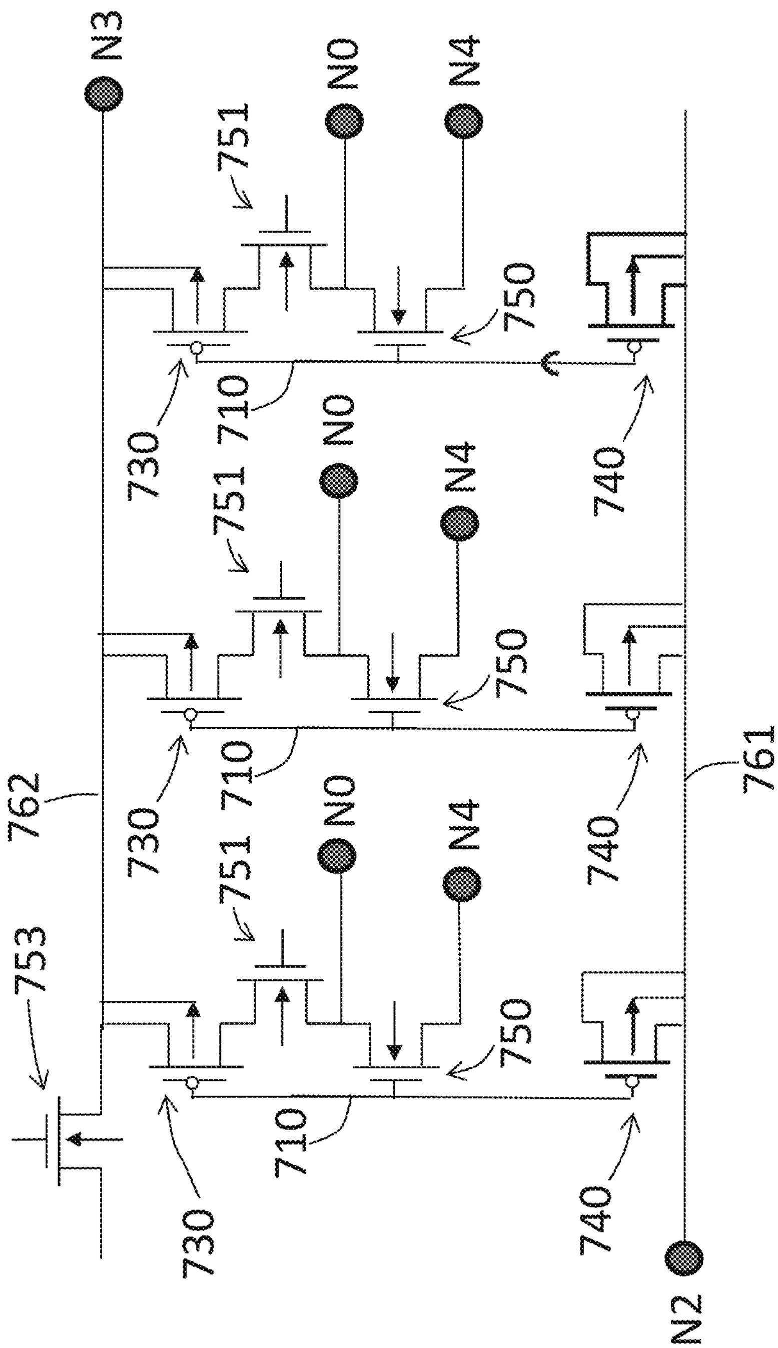
Figure 3J:
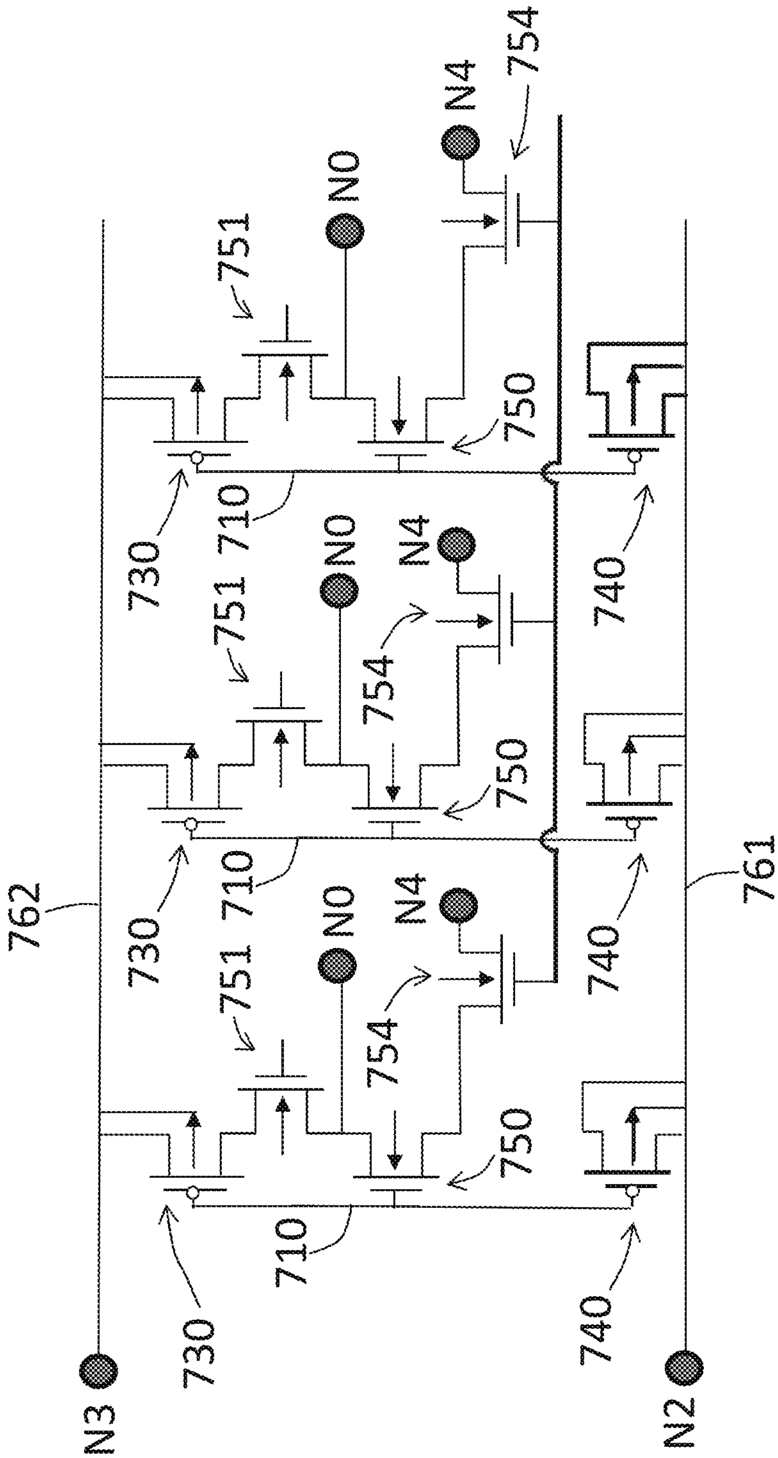
Figure 3K:
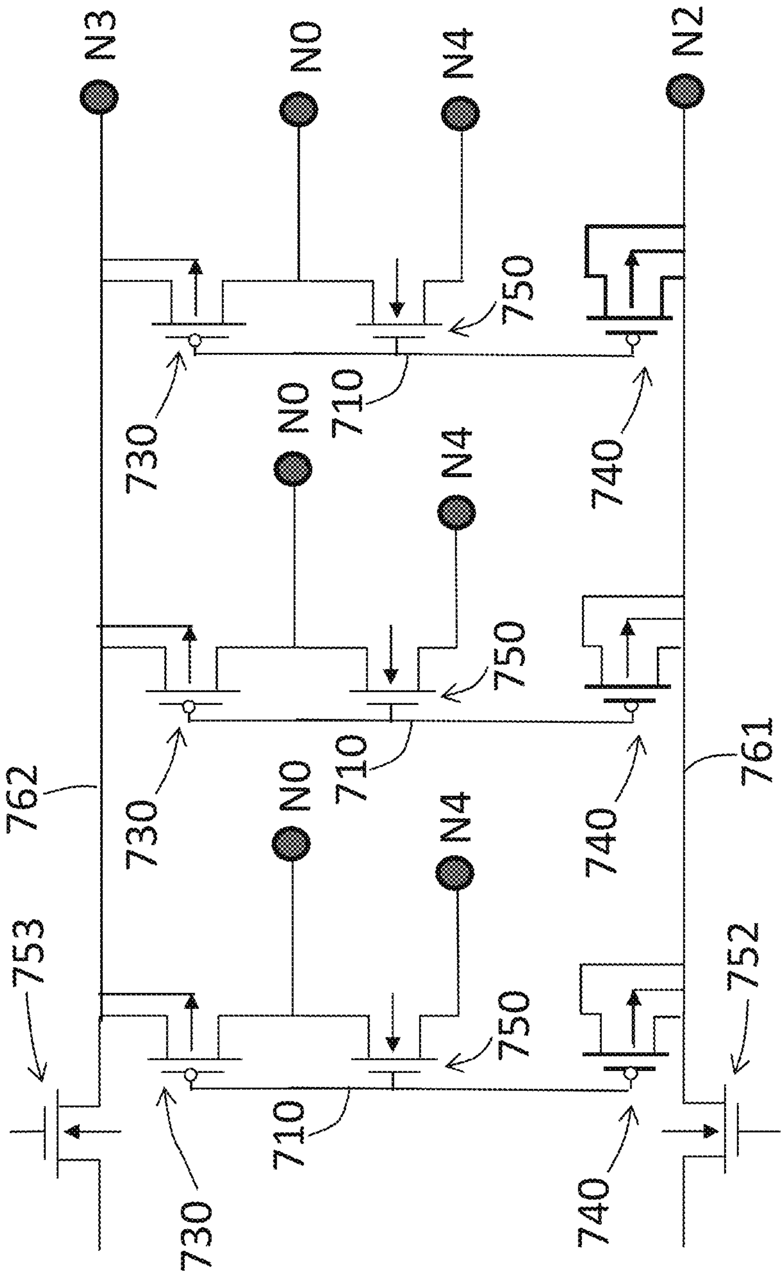
Figure 3L:
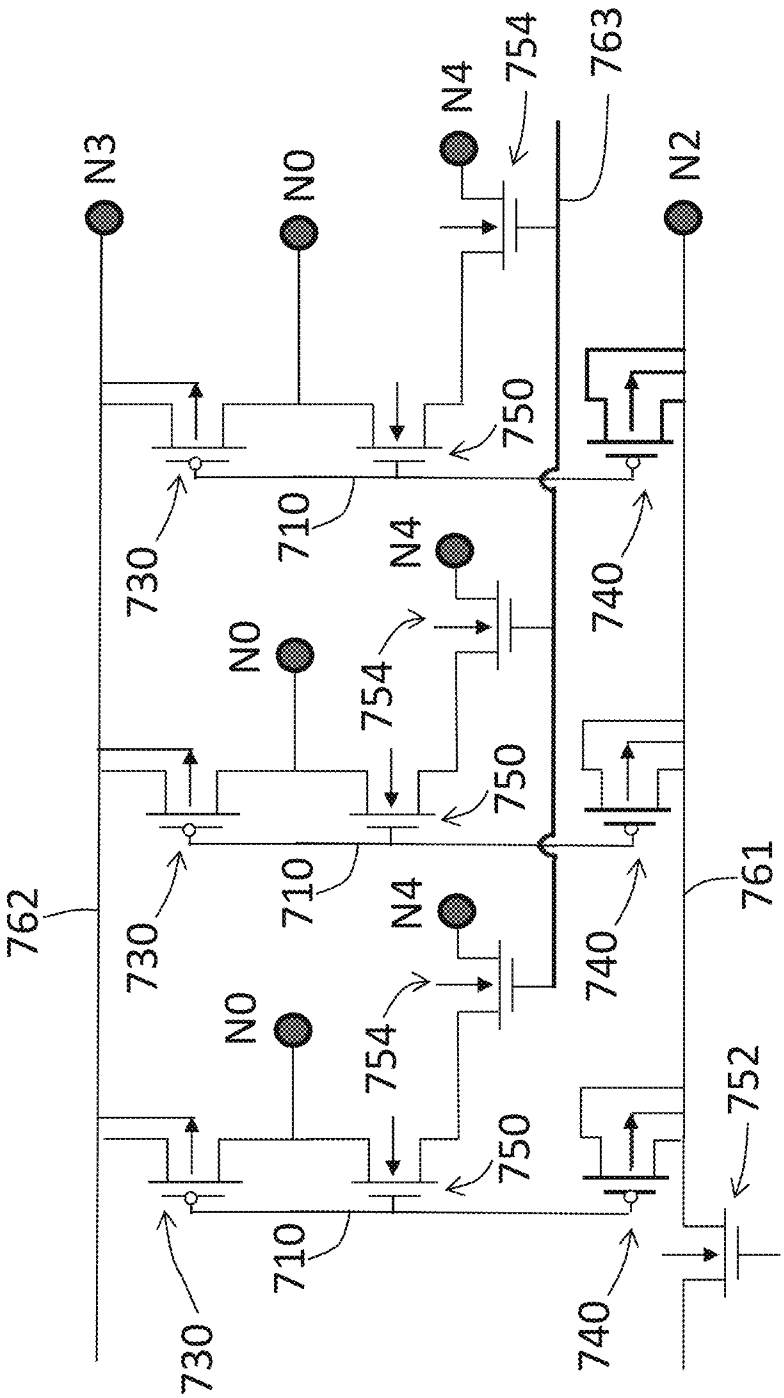
Figure 3M:
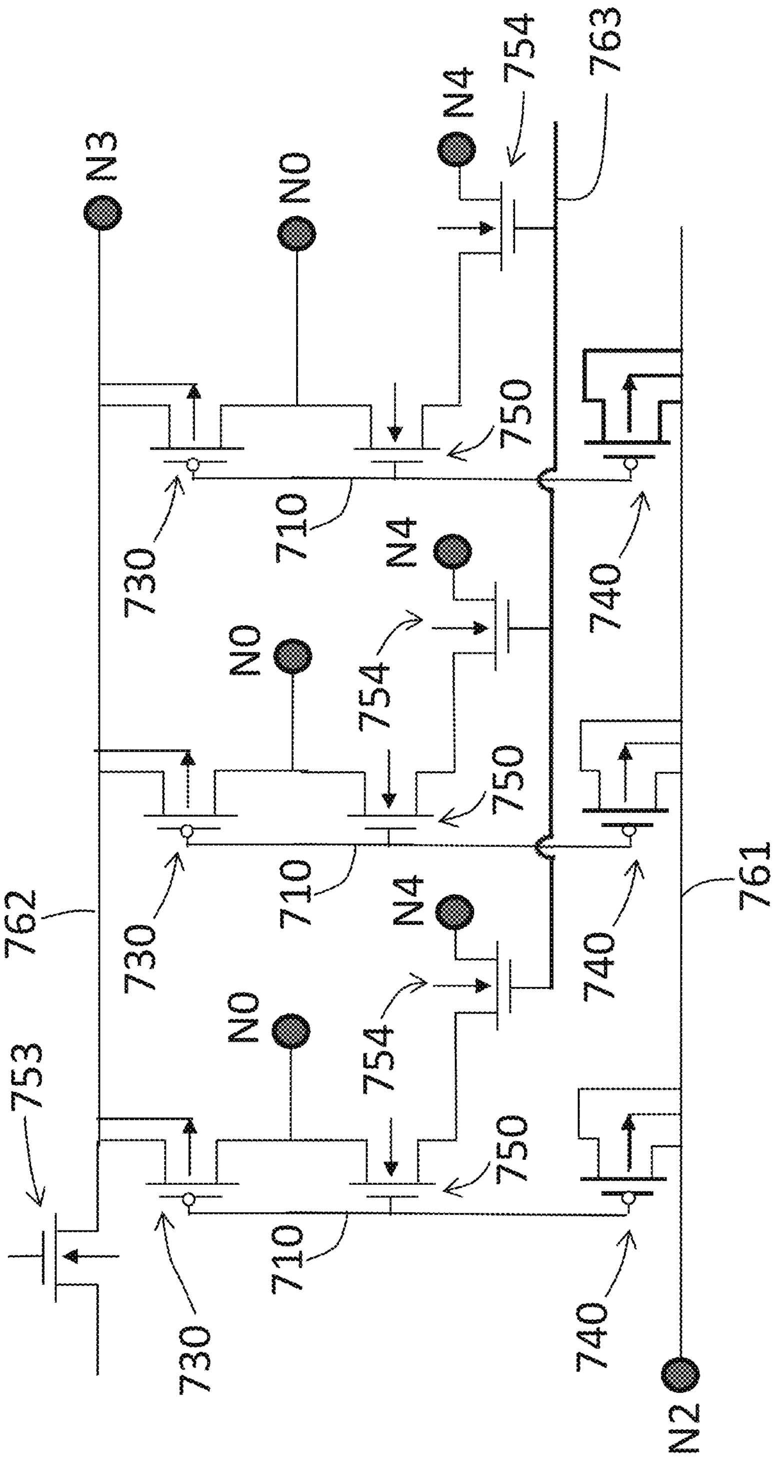
Figure 3N:
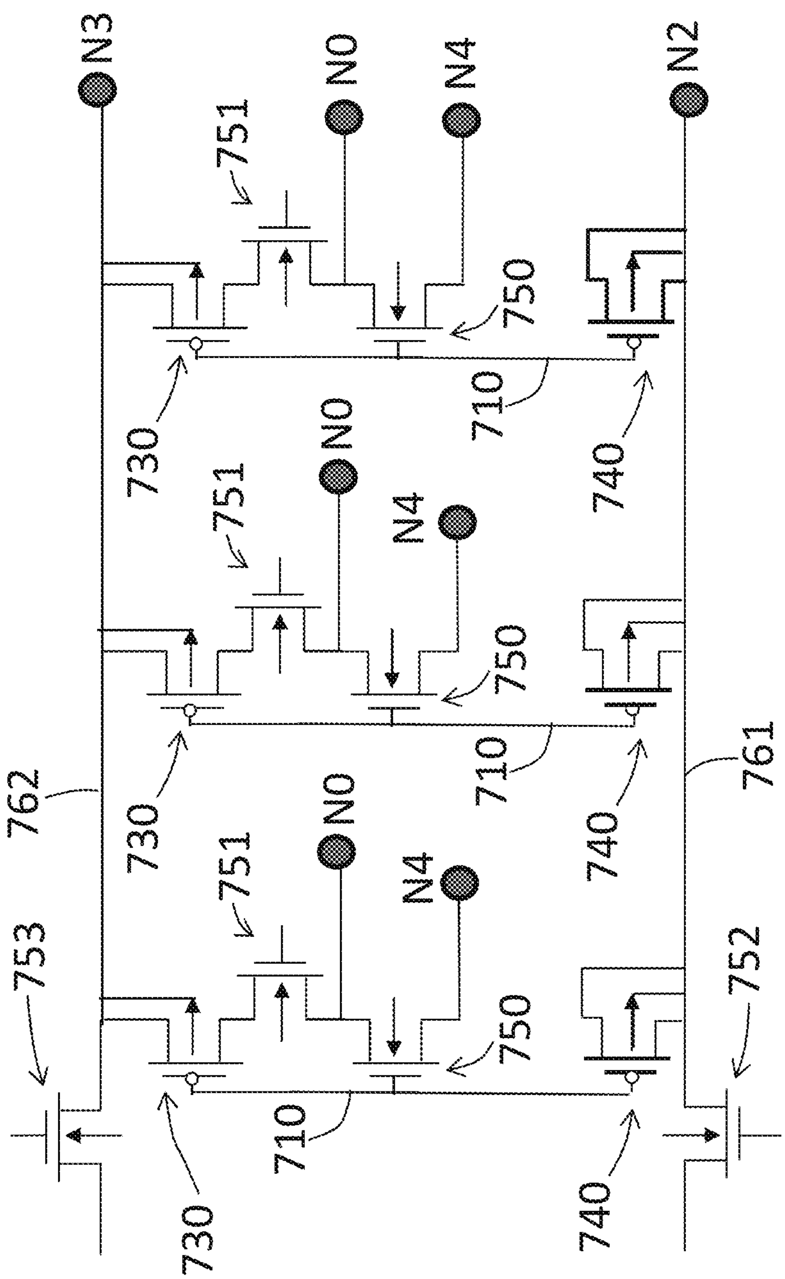
Figure 30:
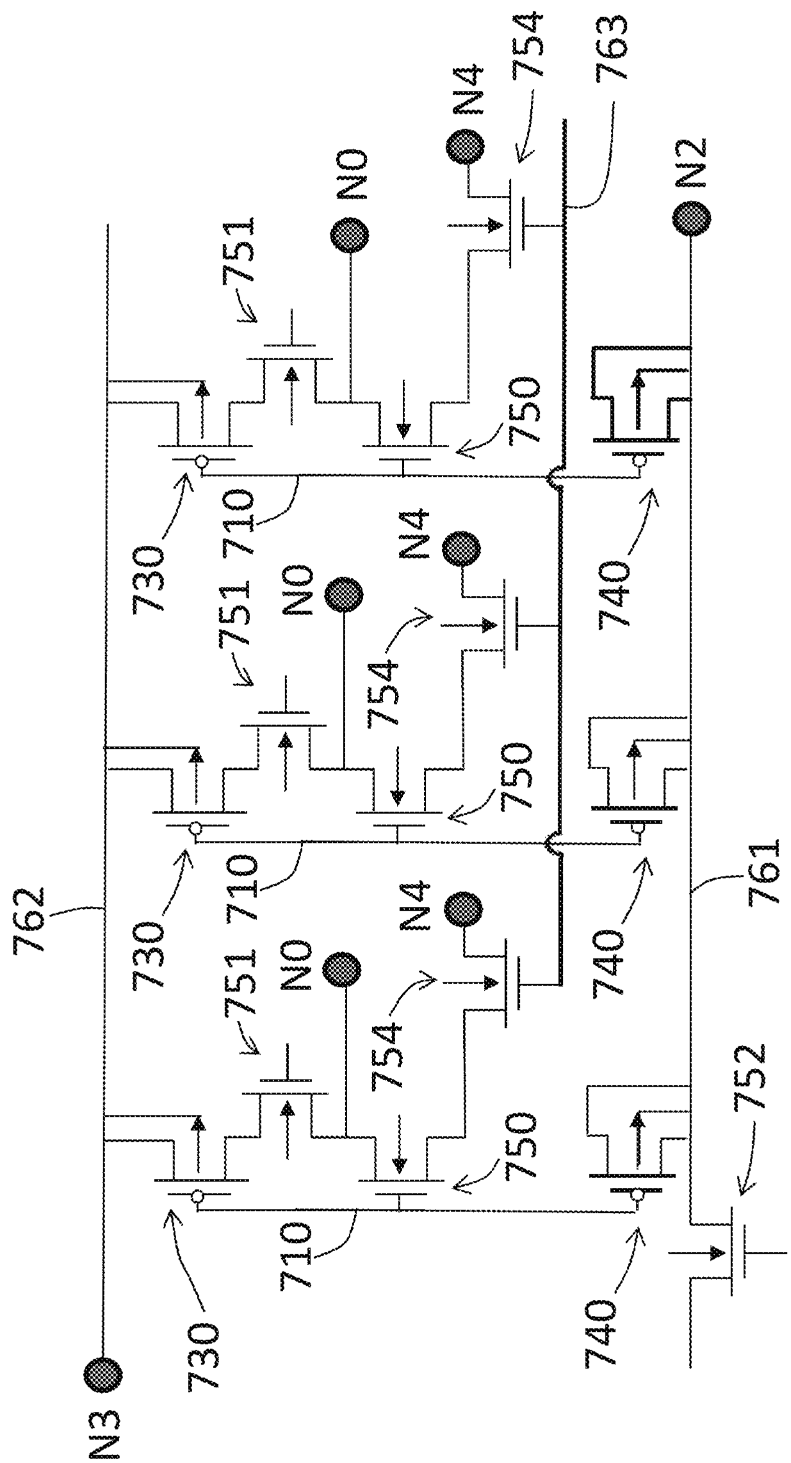
FIGS. 30A-30C are cross-sectional views showing a process for forming a multi-chip-on-interposer (COIP) logic drive with multiple through package vias in accordance with the present application.
Figure 3P:
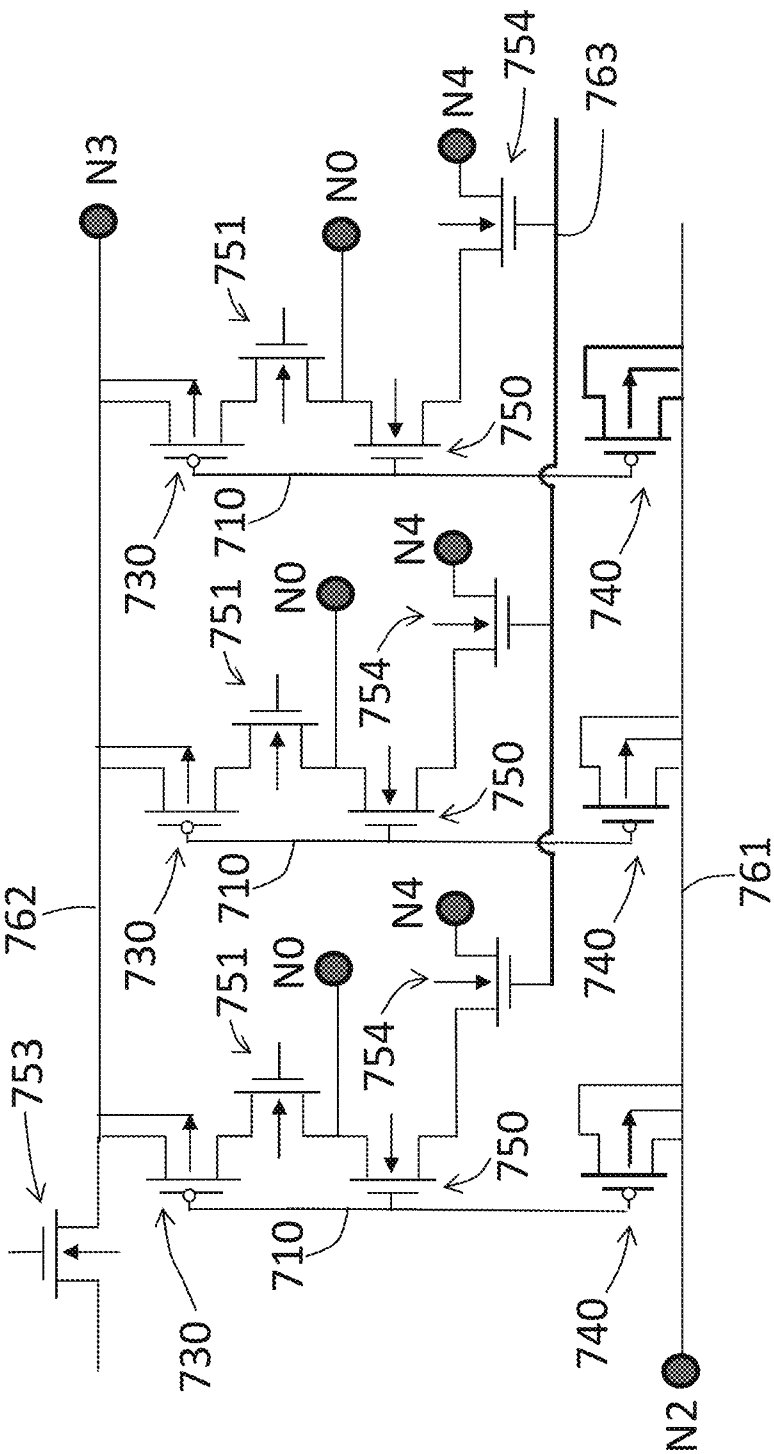
Figure 3Q:
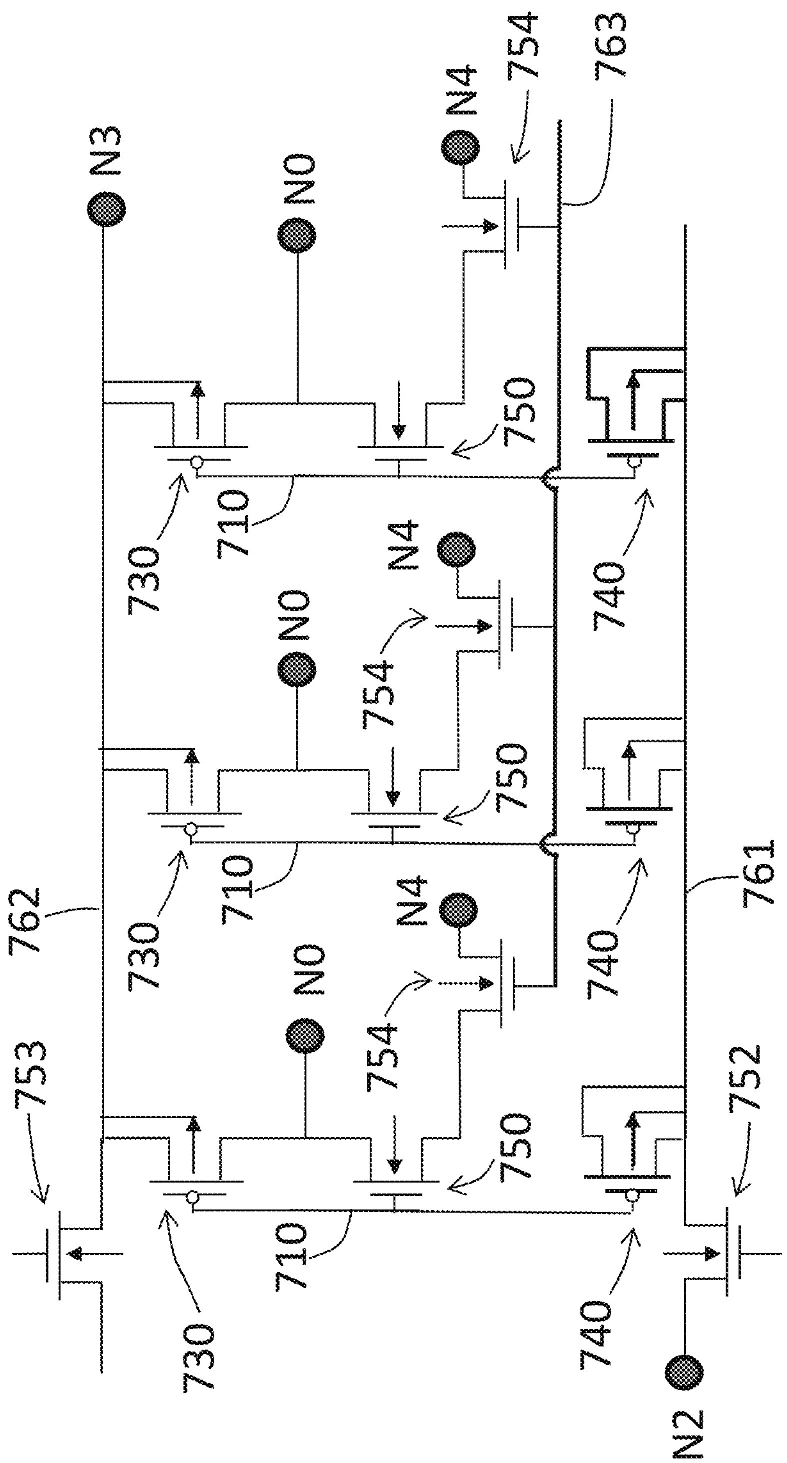
Figure 3R:
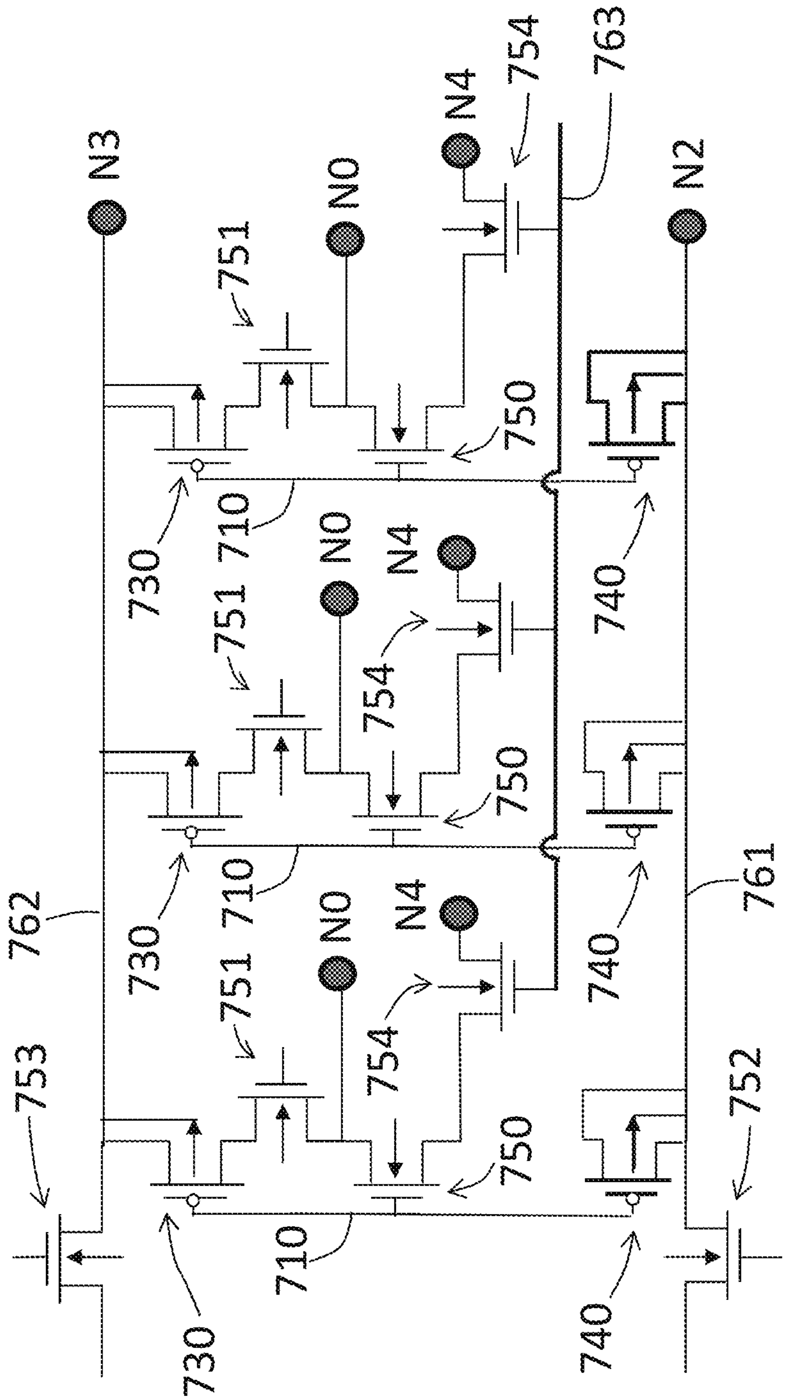

Alternatively, FIGS. 3H-3R are circuit diagrams illustrating multiple non-volatile memory cells of a third type in accordance with an embodiment of the present application. The erasing, programming and operation of the non-volatile memory cell of the third type as seen in FIGS. 3H-3R may be referred to those as illustrated in FIGS. 3A-3G. For an element indicated by the same reference number shown in FIGS. 3A-3R, the specification of the element as seen in FIGS. 3H-3R may be referred to that of the element as illustrated in FIGS. 3A-3G. The more elaboration is mentioned as below. Referring to FIG. 3H, the switches 751 and 752 may be incorporated for the third type of non-volatile memory cell 700. When the third type of non-volatile memory cells 700 are being erased, programed or operated, the switches 751 and 752 are switched as illustrated in FIGS. 3D and 3E. Referring to FIG. 3I, the switches 751 and 753 may be incorporated for the third type of non-volatile memory cell 700. When the third type of non-volatile memory cells 700 are being erased, programed or operated, the switches 751 and 753 are switched as illustrated in FIGS. 3D and 3F. Referring to FIG. 3J, the switches 751 and 754 may be incorporated for the third type of non-volatile memory cell 700. When the third type of non-volatile memory cells 700 are being erased, programed or operated, the switches 751 and 754 are switched as illustrated in FIGS. 3D and 3G. Referring to FIG. 3K, the switches 752 and 753 may be incorporated for the third type of non-volatile memory cell 700. When the third type of non-volatile memory cells 700 are being erased, programed or operated, the switches 752 and 753 are switched as illustrated in FIGS. 3E and 3F. Referring to FIG. 3L, the switches 752 and 754 may be incorporated for the third type of non-volatile memory cell 700. When the third type of non-volatile memory cells 700 are being erased, programed or operated, the switches 752 and 754 are switched as illustrated in FIGS. 3E and 3G. Referring to FIG. 3M, the switches 753 and 754 may be incorporated for the third type of non-volatile memory cell 700. When the third type of non-volatile memory cells 700 are being erased, programed or operated, the switches 753 and 754 are switched as illustrated in FIGS. 3F and 3G. Referring to FIG. 3N, the switches 751, 752 and 753 may be incorporated for the third type of non-volatile memory cell 700. When the third type of non-volatile memory cells 700 are being erased, programed or operated, the switches 751, 752 and 753 are switched as illustrated in FIGS. 3D-3F. Referring to FIG. 3O, the switches 751, 752 and 754 may be incorporated for the third type of non-volatile memory cell 700. When the third type of non-volatile memory cells 700 are being erased, programed or operated, the switches 751, 752 and 754 are switched as illustrated in FIGS. 3D, 3E and 3G. Referring to FIG. 3P, the switches 751, 753 and 754 may be incorporated for the third type of non-volatile memory cell 700. When the third type of non-volatile memory cells 700 are being erased, programed or operated, the switches 751, 753 and 754 are switched as illustrated in FIGS. 3D, 3F and 3G. Referring to FIG. 3Q, the switches 752, 753 and 754 may be incorporated for the third type of non-volatile memory cell 700. When the third type of non-volatile memory cells 700 are being erased, programed or operated, the switches 752, 753 and 754 are switched as illustrated in FIGS. 3E-3G. Referring to FIG. 3R, the switches 751, 752, 753 and 754 may be incorporated for the third type of non-volatile memory cell 700. When the third type of non-volatile memory cells 700 are being erased, programed or operated, the switches 751, 752, 753 and 754 are switched as illustrated in FIGS. 3D-3G.

Figure 3S:
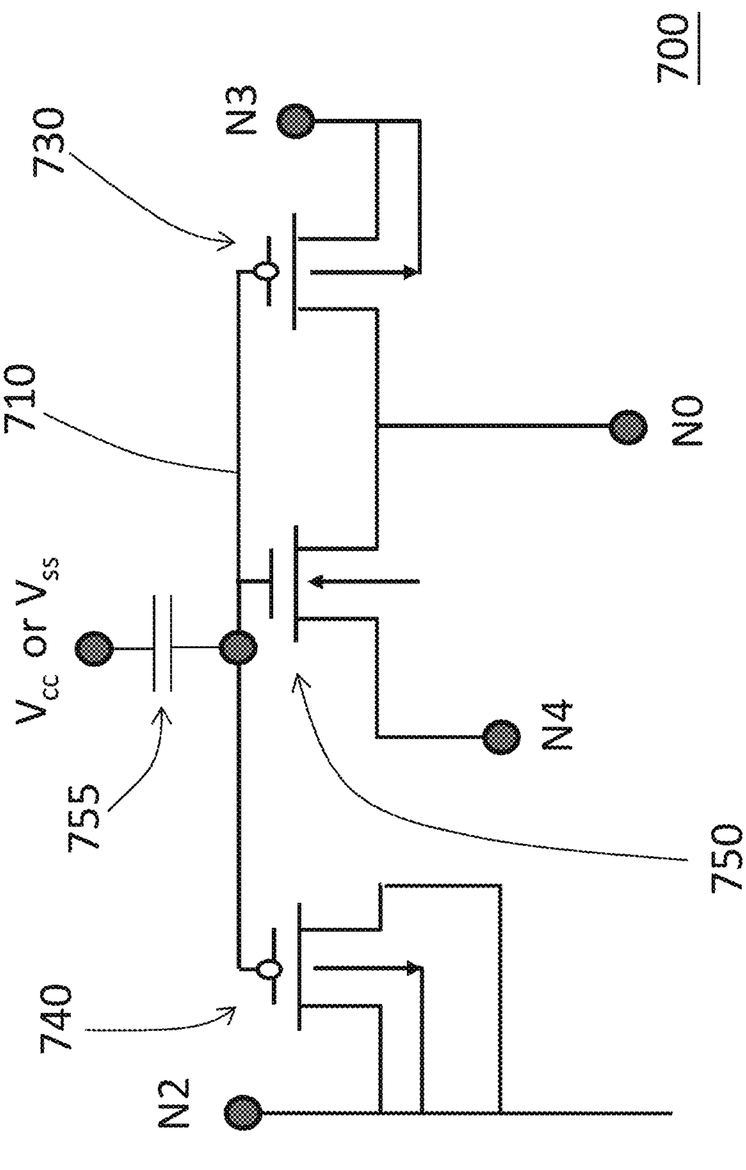

Alternatively, FIG. 3S is a circuit diagram illustrating a third type of non-volatile memory cell in accordance with an embodiment of the present application. The erasing, programming and operation of the non-volatile memory cell of the third type as seen in FIG. 3S may be referred to those as illustrated in FIGS. 3A-3C. For an element indicated by the same reference number shown in FIGS. 3A-3C and 3S, the specification of the element as seen in FIG. 3S may be referred to that of the element as illustrated in FIGS. 3A-3C. The difference therebetween is mentioned as below. Each of the non-volatile memory cell 700 as illustrated in FIGS. 3A-3R may further include a parasitic capacitor 755 having a first terminal coupling to the floating gate 710 and a second terminal coupling to the voltage Vcc of power supply or to the voltage Vss of ground reference. The structure as illustrated in FIG. 3A is taken as an example herein to be incorporated with the parasitic capacitor 755. The parasitic capacitor 755 may have a capacitance greater than a gate capacitance of the first P-type MOS transistor 730, than a gate capacitance of the second P-type MOS transistor 740 and than a gate capacitance of the N-type MOS transistor 750. For example, the capacitance of the parasitic capacitor 755 may be equal to between 1 and 10,000 times of the gate capacitance of the first P-type MOS transistor 730, between 1 and 10,000 times of the gate capacitance of the second P-type MOS transistor 740 and to between 1 and 10,000 times of the gate capacitance of the N-type MOS transistor 750. The capacitance of the parasitic capacitor 755 may range from 0.1 aF to 1 pF. Thereby, more electric charges or electrons may be stored in the floating gate 710.

Figure 3T:
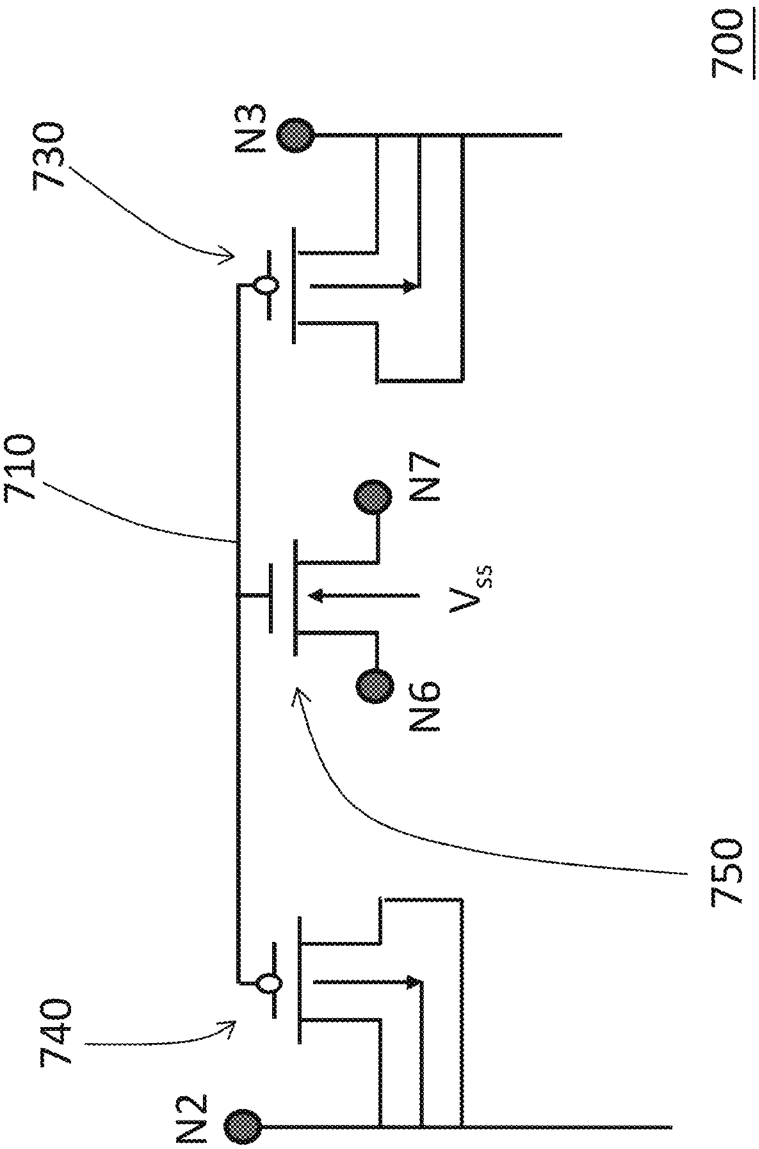

Alternatively, FIG. 3T is a circuit diagram illustrating a third type of non-volatile memory cell in accordance with an embodiment of the present application. For an element indicated by the same reference number shown in FIGS. 3A-3C and 3T, the specification of the element as seen in FIG. 3T may be referred to that of the element as illustrated in FIGS. 3A-3C. The difference between the circuits illustrated in FIG. 3A and the circuits illustrated in FIG. 3T is mentioned as below. Referring to FIG. 3T, the third type of non-volatile memory cell 700 may have its N-type MOS transistor 750 used for a pass/no-pass switch switched by the floating gate 710 to turn on or off the connection between nodes N6 and N7. The N-type MOS transistor 750 may be configured to form a channel with two ends coupling to the nodes N6 and N7 respectively. The third type of non-volatile memory cell 700 may have its first P-type MOS transistor 730 configured to form a channel with two ends coupling to the node N3 coupling to the first N-type stripe 702.

Referring to FIGS. 3B, 3C and 3T, when the floating gate 710 is being erased, (1) the node N2 may couple to the second N-type stripe 705 switched to couple to the erasing voltage $V_{Er}$, (2) the node N3 may couple to the first N-type stripe 702 switched to couple to the voltage Vss of ground reference and (3) the nodes N6 and N7 may be switched to couple to the voltage Vss of ground reference or to be floating. Since the gate capacitance of the second P-type MOS transistor 740 is smaller than the sum of the gate capacitances of the first P-type MOS transistor 730 and the N-type MOS transistor 750, the voltage difference between the floating gate 710 and the node N2 is large enough to cause electron tunneling. Accordingly, electrons trapped in the floating gate 710 may tunnel through the gate oxide 711 to the node N2. Thereby, the floating gate 710 may be erased to a logic level of "1".

Referring to FIGS. 3A-3C and 3T, after the third type of non-volatile memory cell 700 is erased, the floating gate 710 may be charged to a logic level of "1" to turn on the N-type MOS transistor 750 and off the first and second P-type MOS transistors 730 and 740. In this situation, when the floating gate 710 is being programmed, (1) the node N2 may couple to the second N-type stripe 705 switched to couple to the programming voltage $V_{Pr}$, (2) the node N3 may couple to the first N-type stripe 702 switched to couple to the programming voltage $V_{Pr}$ and (3) the nodes N6 and N7 may be switched to couple to the voltage Vss of ground reference or to be floating. Since the gate capacitance of the N-type MOS transistor 750 is smaller than the sum of the gate capacitances of the first and second P-type MOS transistor 730 and 740, the voltage difference between the floating gate 710 and the node N6 or N7 or P-type silicon substrate 2 is large enough to cause electron tunneling. Accordingly, electrons may tunnel through the gate oxide 711 from the node N6 or N7 or P-type silicon substrate 2 to the floating gate 710 to be trapped in the floating gate 710. Thereby, the floating gate 710 may be programmed to a logic level of "0".

Referring to FIGS. 3A-3C and 3T, for operation of the non-volatile memory cell 700, (1) the node N2 may couple to the second N-type stripe 705 switched to couple to a voltage between the voltage Vcc of power supply and the voltage Vss of ground reference or to be floating, (2) the node N3 may couple to the first N-type stripe 702 switched to couple to a voltage between the voltage Vcc of power supply and the voltage Vss of ground reference or to be floating and (3) the nodes N6 and N7 may be switched to couple to two programmable interconnects respectively. When the floating gate 710 is charged to a logic level of "1", the N-type MOS transistor 750 may be turned on to couple the nodes N6 and N7. When the floating gate 710 is discharged to a logic level of "0", the N-type MOS transistor 750 may be turned off to disconnect the node N6 from the node N7.

Figure 3U:
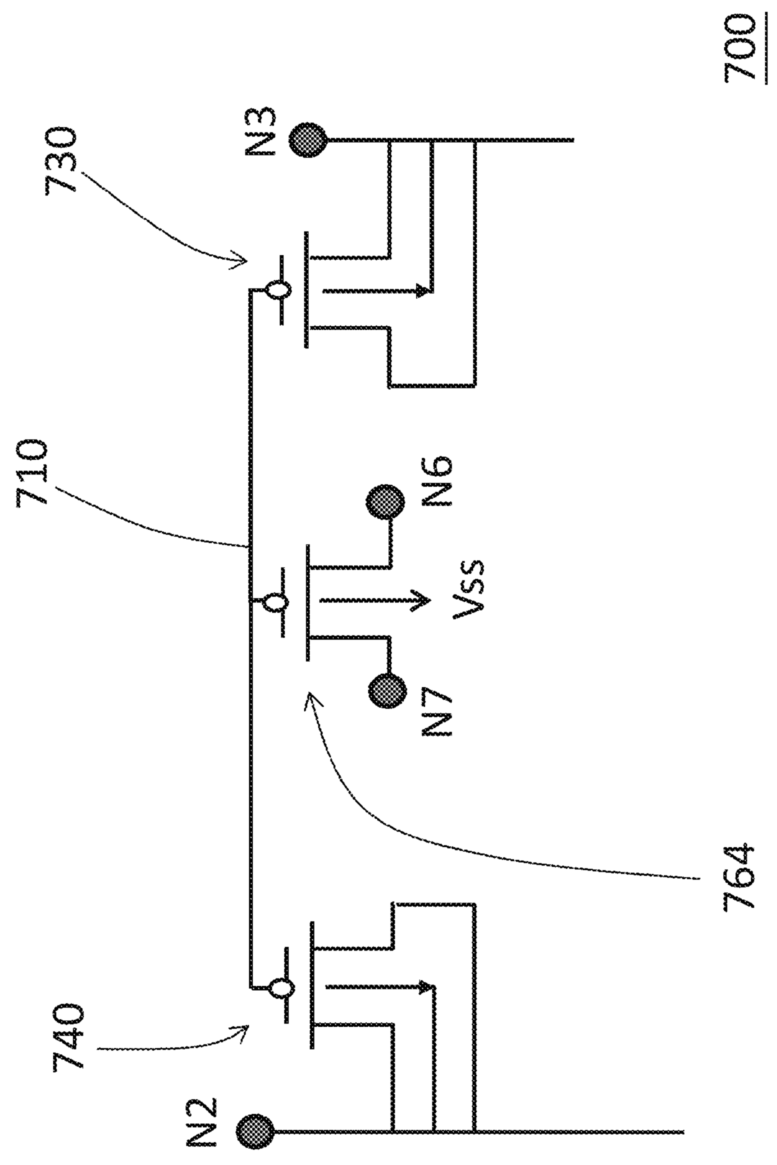
Figure 3V:
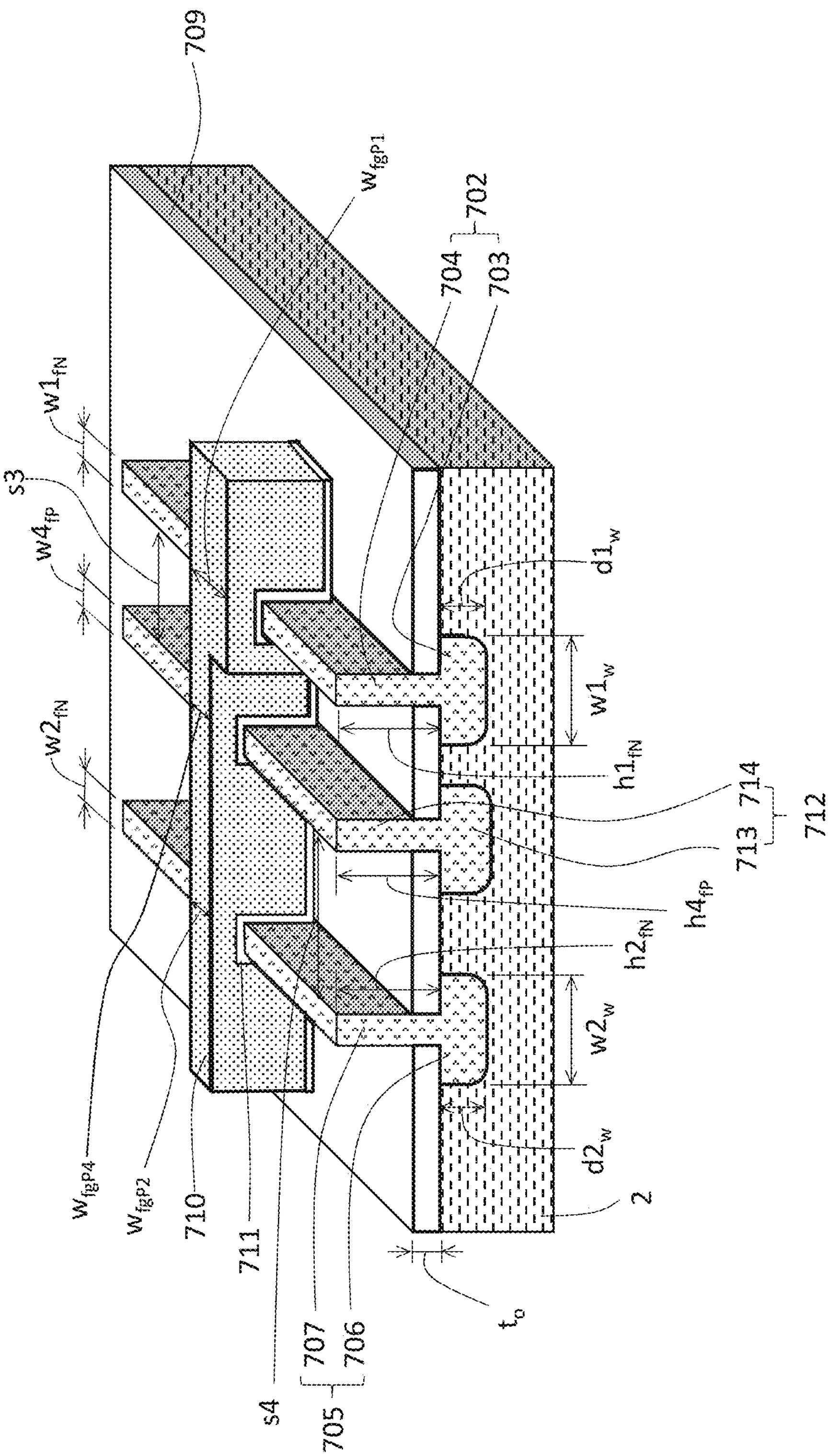

Alternatively, FIG. 3U is a circuit diagram illustrating a third type of non-volatile memory cell in accordance with an embodiment of the present application. FIG. 3V is a schematically perspective view showing a structure of a third type of non-volatile memory cell in accordance with an embodiment of the present application. For an element indicated by the same reference number shown in FIGS. 3A-3C and 3T-3V, the specification of the element as seen in FIGS. 3U and 3V may be referred to that of the element as illustrated in FIGS. 3A-3C and 3T. The difference between the circuits illustrated in FIGS. 3U and 3V and the circuits illustrated in FIG. 3T is mentioned as below. Referring to FIGS. 3U and 3V, the N-type MOS transistor 750 as seen in FIG. 3T may be replaced with a third P-type MOS transistor 764 used for a pass/no-pass switch switched by the floating gate 710 to turn on or off the connection between the nodes N6 and N7. The P-type fin 708 for the N-type MOS transistor 750 as seen in FIGS. 3B and 3C may be replaced with an N-type fin 714 of a third N-type stripe 712 for the third P-type MOS transistor 764 vertically protruding from a top surface of an N-type well 713 of the third N-type stripe 712 for the third P-type MOS transistor 764. The N-type well 713 may have a depth $d4_w$ between 0.3 and 5 micrometers and a width $w4_w$ between 50 nanometers and 1 micrometer, and the N-type fin 707 may have a height $h4_{fN}$ between 10 and 200 nanometers and a width $w4_{fN}$ between 1 and 100 nanometers. The floating gate 710 may extend from the N-type fin(s) 704 of the first N-type stripe 702 to the N-type fin 707 of the second N-type stripe 705 across over the N-type fin 714 of the third N-type stripe 712. Referring to FIG. 3U, for the case of the third N-type stripe 712 replacing the P-type fin 708 in FIG. 3B, a space s3 between the N-type fin 704 and the N-type fin 714 of the third N-type stripe 712 may range from 100 to 2,000 nanometers and a space s4 between the N-type fin 707 and the N-type fin 714 of the third N-type stripe 712 may range from 100 to 2,000 nanometers; the width $w_{fgP1}$ may be greater than or equal to a width $w_{fgP4}$ of the floating gate 710 over the N-type fin 714 of the third N-type stripe 712 and greater than or equal to the width $w_{fgP2}$; the width $w_{fgP1}$ may be equal to between 1 and 10 times or between 1.5 and 5 times of the width $w_{fgP3}$ and, for example, equal to 2 times of the width $w_{fgP4}$; the width $w_{fgP4}$ may range from 1 to 25 nanometers.

Figure 3W:
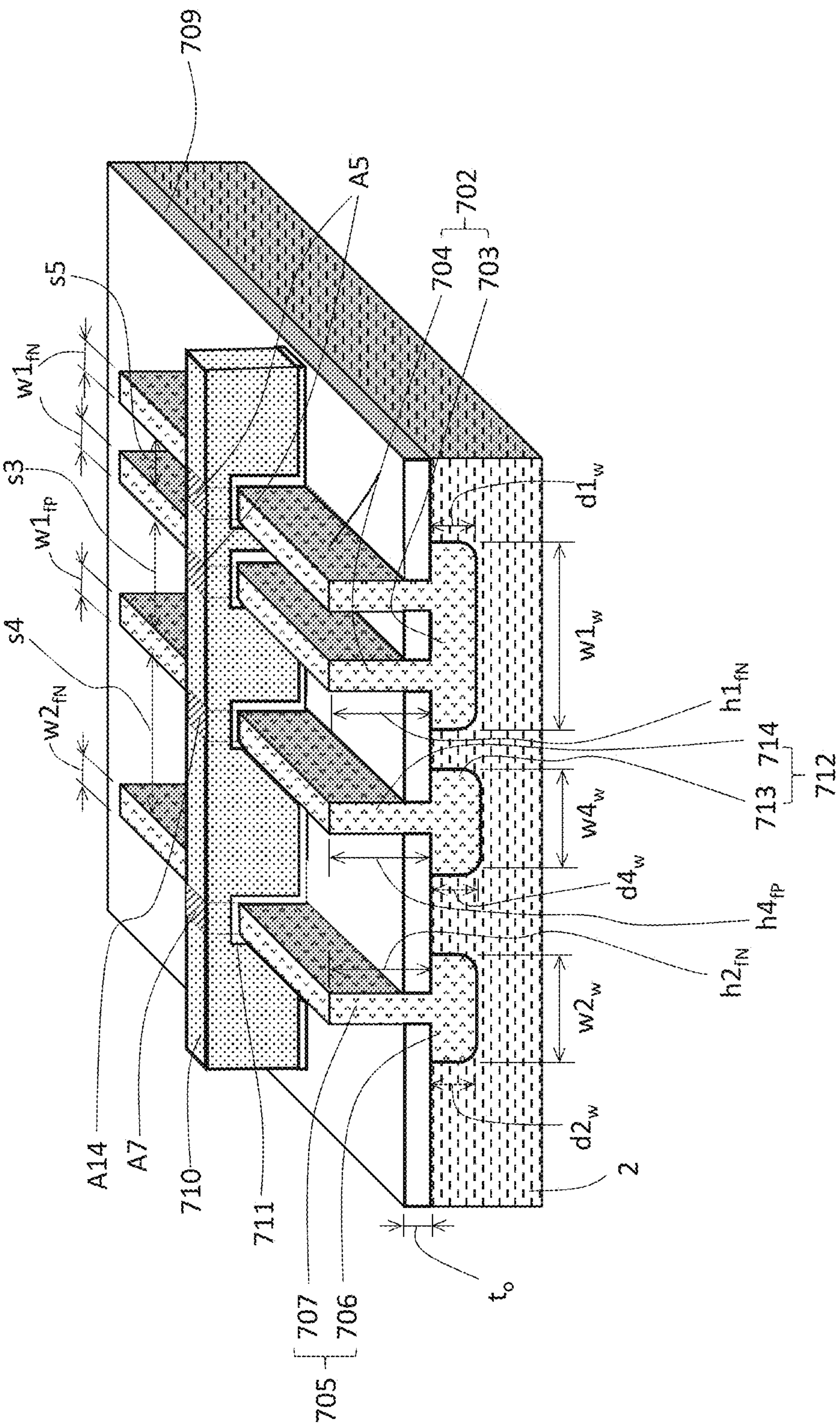

Alternatively, FIG. 3W is a schematically perspective view showing a structure of a third type of non-volatile memory cell in accordance with an embodiment of the present application. For an element indicated by the same reference number shown in FIGS. 3A-3C and 3T-3W, the specification of the element as seen in FIG. 3W may be referred to that of the element as illustrated in FIGS. 3A-3C and 3T-3V. The difference between the circuits illustrated in FIG. 3W and the circuits illustrated in FIG. 3V is mentioned as below. Referring to FIG. 3W, for the case of the third N-type stripe 712 replacing the P-type fin 708 in FIG. 3C, a space s3 between the N-type fin 714 of the third N-type stripe 712 and one of the N-type fins 704 next to the N-type fin 714 may range from 100 to 2,000 nanometers; the fifth total area A5 may be greater than or equal to a total area A14 of the floating gate 710 vertically over the N-type fin 714 and greater than or equal to the seventh total area A7; the fifth total area A5 may be equal to between 1 and 10 times or between 1.5 and 5 times of the total area A14 and, for example, equal to 2 times of the total area A14; the total area A14 may range from 1 to 2,500 square nanometers. The third P-type MOS transistor 764 may be configured to form a channel with two ends coupling to the nodes N6 and N7 respectively.

Referring to FIGS. 3U-3W, when the floating gate 710 is being erased, (1) the node N2 may couple to the second N-type stripe 705 switched to couple to the erasing voltage $V_{Er}$, (2) the node N3 may couple to the first N-type stripe 702 switched to couple to the voltage Vss of ground reference and (3) the nodes N6 and N7 may be switched to couple to the voltage Vss of ground reference or to be floating. Since the gate capacitance of the second P-type MOS transistor 740 is smaller than the sum of the gate capacitances of the first and third P-type MOS transistors 730 and 764, the voltage difference between the floating gate 710 and the node N2 is large enough to cause electron tunneling. Accordingly, electrons trapped in the floating gate 710 may tunnel through the gate oxide 711 to the node N2. Thereby, the floating gate 710 may be erased to a logic level of "1".

Referring to FIGS. 3U-3W, after the third type of non-volatile memory cell 700 is erased, the floating gate 710 may be charged to a logic level of "1" to turn off the first, second and third P-type MOS transistors 730, 740 and 764. In this situation, when the floating gate 710 is being programmed, (1) the node N2 may couple to the second N-type stripe 705 switched to couple to the programming voltage $V_{Pr}$, (2) the node N3 may couple to the first N-type stripe 702 switched to couple to the programming voltage $V_{Pr}$ and (3) the nodes N6 and N7 may be switched to couple to the voltage Vss of ground reference or switched to be floating. Since the gate capacitance of the third P-type MOS transistor 764 is smaller than the sum of the gate capacitances of the first and second P-type MOS transistor 730 and 740, the voltage difference between the floating gate 710 and the node N6 or N7 or third N-type stripe 712 is large enough to cause electron tunneling. Accordingly, electrons may tunnel through the gate oxide 711 from the node N6 or N7 or third N-type stripe 712 to the floating gate 710 to be trapped in the floating gate 710. Thereby, the floating gate 710 may be programmed to a logic level of "0". Alternatively, when the floating gate 710 is being programmed, (1) the node N2 may couple to the second N-type stripe 705 switched to couple to the voltage Vss of ground reference, (2) the node N3 may couple to the first N-type stripe 702 switched to couple to the programming voltage $V_{Pr}$ and (3) the nodes N6 and N7 may be switched to be floating. Since the gate capacitance of the second P-type MOS transistor 730 is smaller than the sum of the gate capacitances of the second and third P-type MOS transistors 740 and 764, the voltage difference between the floating gate 710 and the node N2 is large enough to cause electron tunneling. Accordingly, electrons may tunnel through the gate oxide 711 from the node N2 to the floating gate 710 to be trapped in the floating gate 710. Thereby, the floating gate 710 may be programmed to a logic level of "0".

Referring to FIGS. 3U-3W, for operation of the non-volatile memory cell 700, (1) the node N2 may couple to the second N-type stripe 705 switched to couple to a voltage between the voltage Vcc of power supply and the voltage Vss of ground reference or switched to be floating, (2) the node N3 may couple to the first N-type stripe 702 switched to couple to a voltage between the voltage Vcc of power supply and the voltage Vss of ground reference or switched to be floating and (3) the nodes N6 and N7 may be switched to couple to two programmable interconnects respectively. When the floating gate 710 is discharged to a logic level of "0", the third P-type MOS transistor 764 may be turned on to couple the nodes N6 and N7. When the floating gate 710 is charged to a logic level of "1", the third P-type MOS transistor 764 may be turned off to disconnect the node N6 from the node N7.

For the third type of non-volatile memory cells 700 as illustrated in FIGS. 3A-3W, the erasing voltage $V_{Er}$ may be greater than or equal to the programming voltage $V_{Pr}$ that may be greater than or equal to the voltage Vcc of power supply. The erasing voltage $V_{Er}$ may range from 5 volts to 0.25 volts, the programming voltage $V_{Pr}$ may range from 5 volts to 0.25 volts, and the voltage Vcc of power supply may range from 3.5 volts to 0.25 volts, such as 0.75 volts or 3.3 volts.

(4) Fourth Type of Non-Volatile Memory Cells

Figure 4A:
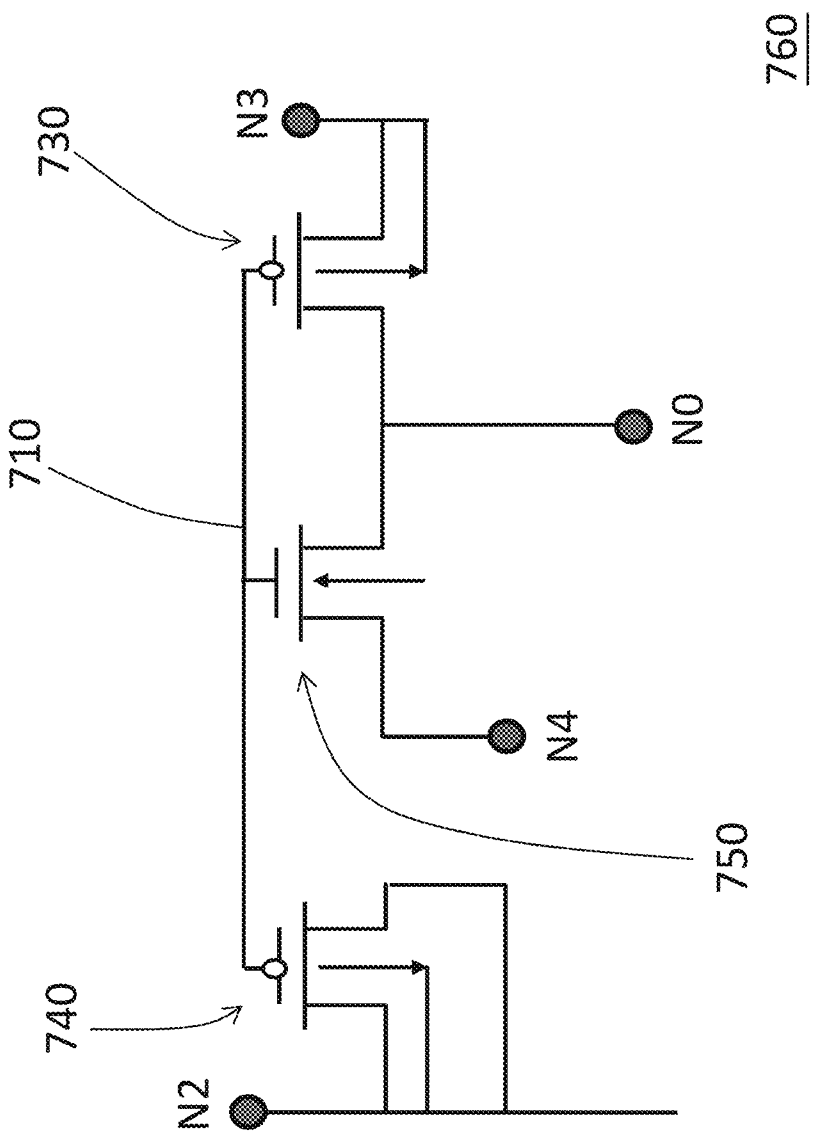
FIGS. 4A and 4D-4S are circuit diagrams illustrating a fourth type of non-volatile memory cells in accordance with an embodiment of the present application.
Figure 4B:
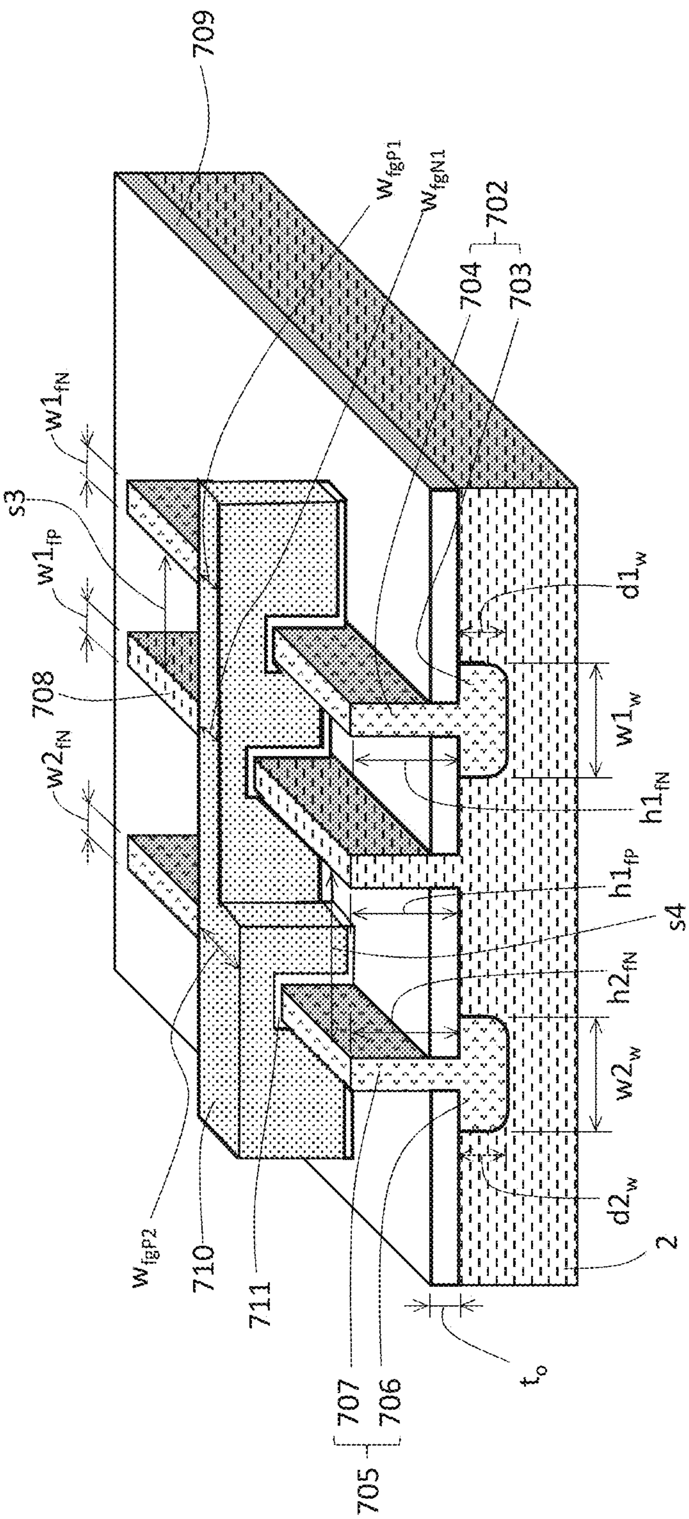
FIGS. 4B and 4C are schematically perspective views showing various structures of a fourth type of non-volatile memory cell in FIG. 4A in accordance with an embodiment of the present application.

Alternatively, FIG. 4A is a circuit diagram illustrating a fourth type of non-volatile memory cell in accordance with an embodiment of the present application. FIG. 4B is a schematically perspective view showing a structure of a non-volatile memory cell of a fourth type in accordance with an embodiment of the present application. In this case, the scheme of the non-volatile memory cell 760 of the fourth type as seen in FIGS. 4A and 4B is similar to that of the non-volatile memory cell 700 of the third type as seen in FIGS. 3A and 3B and can be referred to the illustration for FIGS. 3A and 3B, but the difference between the scheme of the non-volatile memory cell 760 of the fourth type as seen in FIGS. 4A and 4B and the non-volatile memory cell 700 of the third type as seen in FIGS. 3A and 3B is mentioned as below. Referring to FIGS. 4A and 4B, the width $w_{fgP2}$ of the floating gate 710 may be greater than or equal to the width $w_{fgP1}$ of the floating gate 710 and greater than or equal to the width $w_{fgN1}$ of the floating gate 710. For an element indicated by the same reference number shown in FIGS. 3B and 4B, the specification of the element as seen in FIG. 4B may be referred to that of the element as illustrated in FIG. 3B. Referring to FIG. 4B, the width $w_{fgP2}$ over the N-type fin 707 may be equal to between 1 and 10 times or between 1.5 and 5 times of the width $w_{fgN1}$ over the P-type fin 708 and, for example, equal to 2 times of the width $w_{fgN1}$ over the P-type fin 708, and the width $w_{fgP2}$ over the N-type fin 707 may be equal to between 1 and 10 times or between 1.5 and 5 times of the width $w_{fgP1}$ over the N-type fin 704 and, for example, equal to 2 times of the width $w_{fgP1}$ over the N-type fin 704, wherein the width $w_{fgP1}$ over the N-type fin 704 may range from 1 to 25 nanometers, the width $w_{fgN1}$ over the P-type fin 708 may range from 1 to 25 nanometers, and the width $w_{fgP2}$ over the N-type fin 707 may range from 1 to 25 nanometers.

Figure 4C:
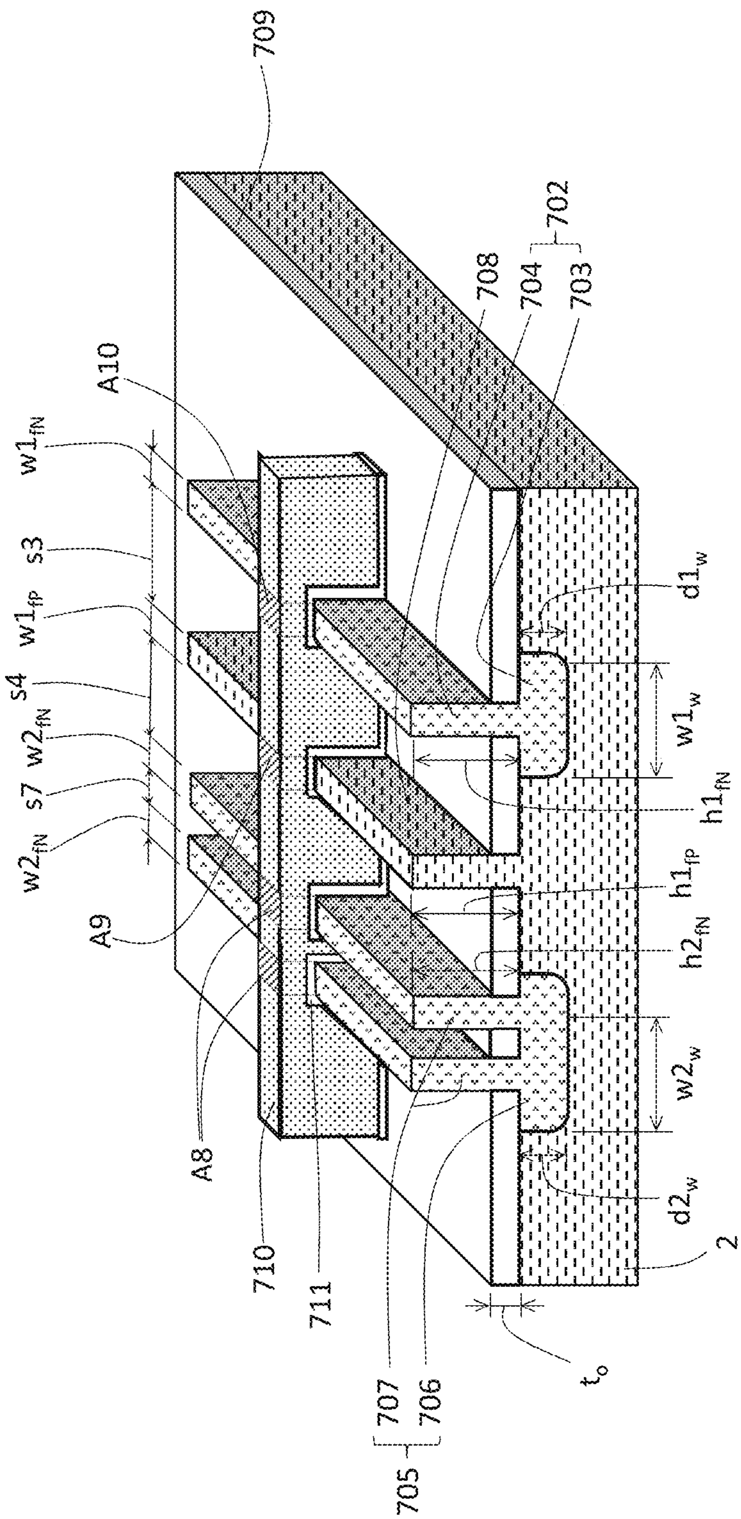

Alternatively, a plurality of the N-type fin 707 arranged in parallel to each other or one another may be formed to vertically protrude from the N-type well 706, wherein each of the one or more N-type fins 707 may have substantially the same height $h2_{fN}$ between 10 and 200 nanometers and substantially the same width $w2_{fN}$ between 1 and 100 nanometers, wherein the combination of the N-type fins 707 may be made for a P-type fin field-effect transistor (FinFET), as seen in FIG. 4C. FIG. 4C is a schematically perspective view showing a structure of a non-volatile memory cell of a fourth type in accordance with an embodiment of the present application. The space s4 between the P-type fin 708 and one of the N-type fins 707 next to the P-type fin 708 may range from 100 to 2,000 nanometers. A space s7 between neighboring two of the N-type fins 707 may range from 2 to 200 nanometers. The N-type fins 707 may have the number between 1 and 10 and for example the number of two in this case. The floating gate 710 may transversely extend over the field oxide 709 and from the N-type fin 704 to the N-type fins 707 across over the P-type fin 708, wherein the floating gate 710 may have an eighth total area A8 vertically over the N-type fins 707, which may be greater than or equal to a ninth total area A9 vertically over the P-type fin 705 and greater than or equal to a tenth total area A10 vertically over the N-type fin 704, wherein the eighth total area A8 may be equal to between 1 and 10 times or between 1.5 and 5 times of the ninth total area A9 and, for example, equal to 2 times of the ninth total area A9, and the eighth total area A8 may be equal to between 1 and 10 times or between 1.5 and 5 times of the tenth total area A10 and, for example, equal to 2 times of the tenth total area A10, wherein the eighth total area A8 may range from 1 to 2,500 square nanometers, the ninth total area A9 may range from 1 to 2,500 square nanometers and the tenth total area A10 may range from 1 to 2,500 square nanometers. Each of the one or more N-type fins 707 may be doped with P-type atoms, such as boron atoms, so as to form two $P^+$ portions in said each of the one or more N-type fins 707 at two opposite sides of the gate oxide 711, composing two respective ends of a channel of a P-type metal-oxide-semiconductor (MOS) transistor 740 as seen in FIG. 4A. Alternatively, the multiple $P^+$ portions in the one or more N-type fins 707 at one side of the gate oxide 711 as seen in FIG. 4C may couple to each other or one another to compose an end of a channel of the second P-type metal-oxide-semiconductor (MOS) transistor 740 as seen in FIG. 4A, and the multiple $P^+$ portions in the one or more N-type fins 707 at the other side of the gate oxide 711 as seen in FIG. 4C may couple to each other or one another to compose the other end of the channel of the second P-type metal-oxide-semiconductor (MOS) transistor 740 as seen in FIG. 4A. The boron atoms in the one or more N-type fins 707 may have a concentration greater than those in the P-type silicon substrate 2. The N-type fin 704 may be doped with P-type atoms, such as boron atoms, so as to form two $P^+$ portions in the N-type fin 704 at two opposite sides of the gate oxide 711, acting as source and drain terminals of the first P-type metal-oxide-semiconductor (MOS) transistor 730 respectively, wherein the boron atoms in the N-type fin 704 may have a concentration greater than those in the P-type silicon substrate 2. The P-type fin 708 may be doped with N-type atoms, such as arsenic atoms, so as to form two $N^+$ portions in the P-type fin 708 at two opposite sides of the gate oxide 711, acting as source and drain terminals of the N-type metal-oxide-semiconductor (MOS) transistor 750 respectively, wherein the arsenic atoms in the P-type fin 708 may have a concentration greater than those in the N-type well 703 and than those in the N-type well 706. Thereby, the second P-type MOS transistor 740 may have a capacitance greater than or equal to that of the first P-type MOS transistor 730 and greater than or equal to that of the N-type MOS transistor 750. The capacitance of the second P-type MOS transistor 740 may be equal to between 1 and 10 times or between 1.5 and 5 times of the capacitance of the first P-type MOS transistor 730 and, for example, equal to 2 times of the capacitance of the first P-type MOS transistor 730. The capacitance of the second P-type MOS transistor 740 may be equal to between 1 and 10 times or between 1.5 and 5 times of the capacitance of the N-type MOS transistor 750 and, for example, equal to 2 times of the capacitance of the N-type MOS transistor 750. The capacitance of the N-type MOS transistor 750 may range from 0.1 aF to 10 fF, the capacitance of the first P-type MOS transistor 730 may range from 0.1 aF to 10 fF, and the capacitance of the second P-type MOS transistor 740 may range from 0.1 aF to 10 fF.

Referring to FIGS. 4A-4C, when the floating gate 710 is being erased, (1) the node N2 may couple to the second N-type stripe 705 switched to couple to the voltage Vss of ground reference, (2) the node N4 may be switched to couple to the voltage Vss of ground reference, (3) the node N3 may couple to the first N-type stripe 702 switched to couple to the erasing voltage $V_{Er}$ and (4) the node N0 may be switched to be floating. Since the gate capacitance of the first P-type MOS transistor 730 is smaller than the sum of the gate capacitances of the second P-type MOS transistor 740 and the N-type MOS transistor 750, the voltage difference between the floating gate 710 and the node N3 is large enough to cause electron tunneling. Accordingly, electrons trapped in the floating gate 710 may tunnel through the gate oxide 711 to the node N3. Thereby, the floating gate 710 may be erased to a logic level of "1".

Referring to FIGS. 4A-4C, after the fourth type of non-volatile memory cell 760 is erased, the floating gate 710 may be charged to a logic level of "1" to turn on the N-type MOS transistor 750 and off the first and second P-type MOS transistors 730 and 740. In this situation, when the floating gate 710 is being programmed, (1) the node N2 may couple to the second N-type stripe 705 switched to couple to the programming voltage $V_{Pr}$, (2) the node N4 may be switched to couple to the voltage Vss of ground reference, (3) the node N3 may couple to the first N-type stripe 702 switched to couple to the programming voltage $V_{Pr}$ and (4) the node N0 may be switched to be floating. Since the gate capacitance of the N-type MOS transistor 750 is smaller than the sum of the gate capacitances of the first and second P-type MOS transistor 730 and 740, the voltage difference between the floating gate 710 and the node N4 is large enough to cause electron tunneling. Accordingly, electrons may tunnel through the gate oxide 711 from the node N4 to the floating gate 710 to be trapped in the floating gate 710. Thereby, the floating gate 710 may be programmed to a logic level of "0".

Referring to FIGS. 4A-4C, for operation of the non-volatile memory cell 760 of the fourth type, (1) the node N2 may couple to the second N-type stripe 705 switched to couple to a voltage between the voltage Vcc of power supply and the voltage Vss of ground reference, such as the voltage Vcc of power supply, the voltage Vss of ground reference or an half of the voltage Vcc of power supply, or switched to be floating, (2) the node N4 may be switched to couple to the voltage Vss of ground reference, (3) the node N3 may couple to the first N-type stripe 702 switched to couple to the voltage Vcc of power supply and (4) the node N0 may be switched to act as an output of the non-volatile memory cell 760. When the floating gate 710 is charged to a logic level of "1", the first P-type MOS transistor 730 may be turned off and the N-type MOS transistor 750 may be turned on to couple the node N4 switched to couple to the voltage Vss of ground reference to the node N0 switched to act as the output of the non-volatile memory cell 760 through the channel of the N-type MOS transistor 750. Thereby, the output of the fourth type of non-volatile memory cell 760 at the node N0 may be at a logic level of "0". When the floating gate 710 is discharged to a logic level of "0", the first P-type MOS transistor 730 may be turned on and the N-type MOS transistor 750 may be turned off to couple the node N3 coupling to the first N-type stripe 702 switched to couple to the voltage Vcc of power supply to the node N0 switched to act as the output of the non-volatile memory cell 760 through the channel of the first P-type MOS transistor 730. Thereby, the output of the fourth type of non-volatile memory cell 760 at the node N0 may be at a logic level of "1".

Figure 4D:
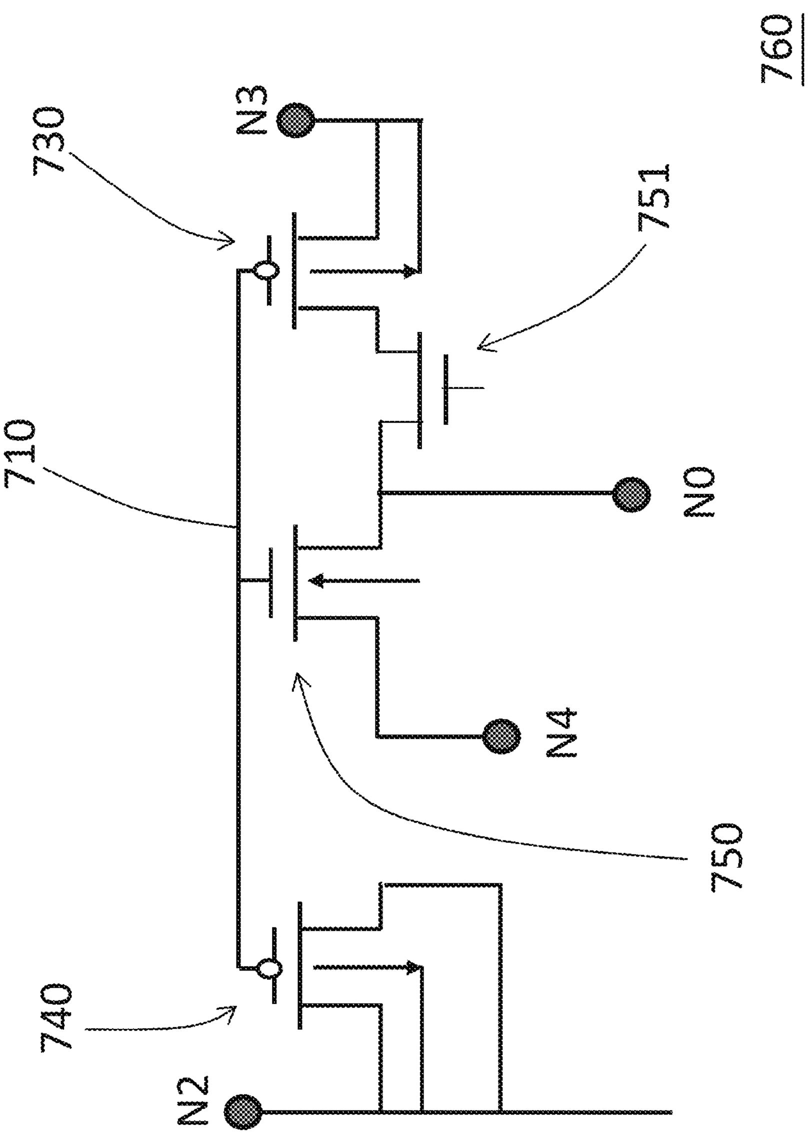

Alternatively, FIG. 4D is a circuit diagram illustrating a fourth type of non-volatile memory cell in accordance with an embodiment of the present application. The erasing, programming and operation of the non-volatile memory cell of the fourth type as seen in FIG. 4D may be referred to those as illustrated in FIGS. 4A-4C. For an element indicated by the same reference number shown in FIGS. 4A-4D, the specification of the element as seen in FIG. 4D may be referred to that of the element as illustrated in FIGS. 4A-4C. The difference therebetween is mentioned as below. Referring to FIG. 4D, the fourth type of non-volatile memory cell 760 may further include a switch 751, such as N-type MOS transistor, between the drain terminal, in operation, of the first P-type MOS transistor 730 and the node N0. The N-type MOS transistor 751 may be configured to form a channel with an end coupling to the drain terminal, in operation, of the first P-type MOS transistor 730 and the node N0. When the fourth type of non-volatile memory cell 760 is being erased, the N-type MOS transistor 751 may have a gate terminal switched to couple to the voltage Vss of ground reference to turn off its channel to disconnect the drain terminal, in operation, of the first P-type MOS transistor 730 from the node N0. In this case, the node N0 may be alternatively switched to couple to the voltage Vss of ground reference. Accordingly, a current flow may be prevented from being leaked from the node N3 to the node N4 or N0. Alternatively, when the fourth type of non-volatile memory cell 760 is being erased, the gate terminal of the N-type MOS transistor 751 may be switched (1) to couple to the erasing voltage $V_{Er}$ to turn on its channel to couple the drain terminal, in operation, of the first P-type MOS transistor 730 to the node N0 or (2) to be floating. When the fourth type of non-volatile memory cell 760 is being programmed, the gate terminal of the N-type MOS transistor 751 may be switched to couple to the voltage Vss of ground reference to turn off its channel to disconnect the drain terminal, in operation, of the first P-type MOS transistor 730 from the node N0. In this case, the node N0 may be alternatively switched to couple to the voltage Vss of ground reference. Accordingly, a current flow may be prevented from being leaked from the node N3 to the node N4 or N0. Alternatively, when the fourth type of non-volatile memory cell 760 is being programmed, the gate terminal of the N-type MOS transistor 751 may be switched (1) to couple to the programming voltage $V_{Pr}$ to turn on its channel to couple the drain terminal, in operation, of the first P-type MOS transistor 730 to the node N0 or (2) to be floating. When the fourth type of non-volatile memory cell 760 is being operated, the gate terminal of the N-type MOS transistor 751 may be switched to couple to the voltage Vcc of power supply to turn on its channel to couple the drain terminal, in operation, of the first P-type MOS transistor 730 to the node N0.

Alternatively, referring to FIG. 4D, the switch 751 may be a P-type MOS transistor configured to form a channel with an end coupling to the drain terminal, in operation, of the first P-type MOS transistor 730 and the other end coupling to the node N0. When the fourth type of non-volatile memory cell 760 is being erased, the P-type MOS transistor 751 may have a gate terminal switched to couple to the erasing voltage $V_{Er}$ to turn off its channel to disconnect the drain terminal, in operation, of the first P-type MOS transistor 730 from the node N0. Accordingly, a current flow may be prevented from being leaked from the node N3 to the node N0. Alternatively, when the fourth type of non-volatile memory cell 760 is being erased, the gate terminal of the P-type MOS transistor 751 may be switched (1) to couple to the voltage Vss of ground reference to turn on its channel to couple the drain terminal, in operation, of the first P-type MOS transistor 730 to the node N0 or (2) to be floating. When the fourth type of non-volatile memory cell 760 is being programmed, the gate terminal of the P-type MOS transistor 751 may be switched to couple to the programming voltage $V_{Pr}$ to turn off its channel to disconnect the drain terminal, in operation, of the first P-type MOS transistor 730 from the node N0. Accordingly, a current flow may be prevented from being leaked from the node N3 to the node N4. Alternatively, when the fourth type of non-volatile memory cell 760 is being programmed, the gate terminal of the N-type MOS transistor 751 may be switched (1) to couple to the voltage Vss of ground reference to turn on its channel to couple the drain terminal, in operation, of the first P-type MOS transistor 730 to the node N0 or (2) to be floating. When the fourth type of non-volatile memory cell 760 is being operated, the gate terminal of the P-type MOS transistor 751 may be switched to couple to the voltage Vss of ground reference to turn on its channel to couple the drain terminal, in operation, of the first P-type MOS transistor 730 to the node N0.

Figure 4E:
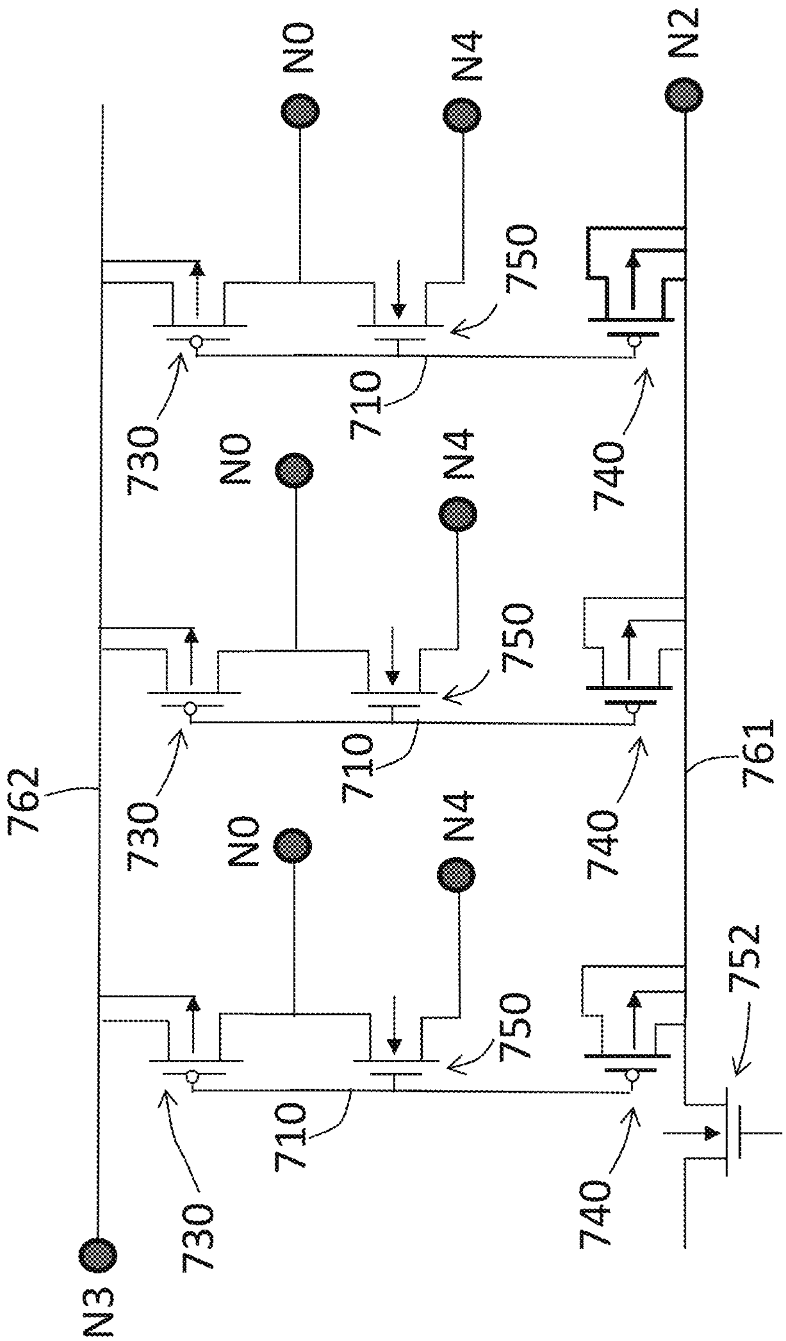

Alternatively, FIG. 4E is a circuit diagram illustrating a fourth type of non-volatile memory cell in accordance with an embodiment of the present application. The erasing, programming and operation of the non-volatile memory cell of the fourth type as seen in FIG. 4E may be referred to those as illustrated in FIGS. 4A-4C. For an element indicated by the same reference number shown in FIGS. 4A-4C and 4E, the specification of the element as seen in FIG. 4E may be referred to that of the element as illustrated in FIGS. 4A-4C. The difference therebetween is mentioned as below. Referring to FIGS. 4A-4C and 4E, a plurality of the non-volatile memory cell 760 of the fourth type may have its nodes N2 coupling in parallel to each other or one another and to a switch 752, such as N-type MOS transistor, via a word line 761 and its nodes N3 coupling in parallel to each other or one another via a word line 762. The N-type MOS transistor 752 may be configured to form a channel with an end coupling to the node N2 of each of the non-volatile memory cells 760 of the fourth type and the other end configured switched to couple to the voltage Vss of ground reference, the programming voltage $V_{Pr}$ or a voltage between the voltage Vcc of power supply and the voltage Vss of ground reference. When the fourth type of non-volatile memory cells 760 are being erased, the N-type MOS transistor 752 may have a gate terminal switched to couple to the erasing voltage $V_{Er}$ to turn on its channel to couple the node N2 of each of the non-volatile memory cells 760 to the voltage Vss of ground reference. When the fourth type of non-volatile memory cells 760 are being programmed, the gate terminal of the N-type MOS transistor 752 may be switched to couple to the programming voltage $V_{Pr}$ to turn on its channel to couple the node N2 of each of the non-volatile memory cells 760 to the programming voltage $V_{Pr}$. When the fourth type of non-volatile memory cells 760 are being operated, (1) the gate terminal of the N-type MOS transistor 752 may be switched to couple to the voltage Vss of ground reference to turn off its channel to lead the node N2 of each of the non-volatile memory cells 760 to be floating, or (2) the gate terminal of the N-type MOS transistor 752 may be switched to couple to the voltage Vcc of power supply to turn on its channel to couple the node N2 of each of the non-volatile memory cells 760 to a voltage between the voltage Vcc of power supply and the voltage Vss of ground reference. When the fourth type of non-volatile memory cells 760 are being in a power saving mode, the gate terminal of the N-type MOS transistor 752 may be switched to couple to the voltage Vss of ground reference to turn off its channel to lead the node N2 of each of the non-volatile memory cells 760 to be floating.

Alternatively, referring to FIGS. 4A-4C and 4E, the switch 752 may be a P-type MOS transistor configured to form a channel with an end coupling to the node N2 of each of the non-volatile memory cells 760 and the other end configured switched to couple to the voltage Vss of ground reference, the programming voltage $V_{Pr}$ or a voltage between the voltage Vcc of power supply and the voltage Vss of ground reference. When the fourth type of non-volatile memory cells 760 are being erased, the P-type MOS transistor 752 may have a gate terminal switched to couple to the voltage Vss of ground reference to turn on its channel to couple the node N2 of each of the non-volatile memory cells 760 to the voltage Vss of ground reference. When the fourth type of non-volatile memory cells 760 are being programmed, the gate terminal of the P-type MOS transistor 752 may be switched to couple to the voltage Vss of ground reference to turn on its channel to couple the node N2 of each of the non-volatile memory cells 760 to the programming voltage $V_{Pr}$. When the fourth type of non-volatile memory cells 760 are being operated, (1) the gate terminal of the P-type MOS transistor 752 may be switched to couple to the voltage Vcc of power supply to turn off its channel to lead the node N2 of each of the non-volatile memory cells 760 to be floating, or (2) the gate terminal of the P-type MOS transistor 752 may be switched to couple to the voltage Vss of ground reference to turn on its channel to couple the node N2 of each of the non-volatile memory cells 760 to a voltage between the voltage Vcc of power supply and the voltage Vss of ground reference. When the fourth type of non-volatile memory cells 760 are being in a power saving mode, the gate terminal of the N-type MOS transistor 752 may be switched to couple to the voltage Vcc of power supply to turn off its channel to lead the node N2 of each of the non-volatile memory cells 760 to be floating.

Figure 4F:
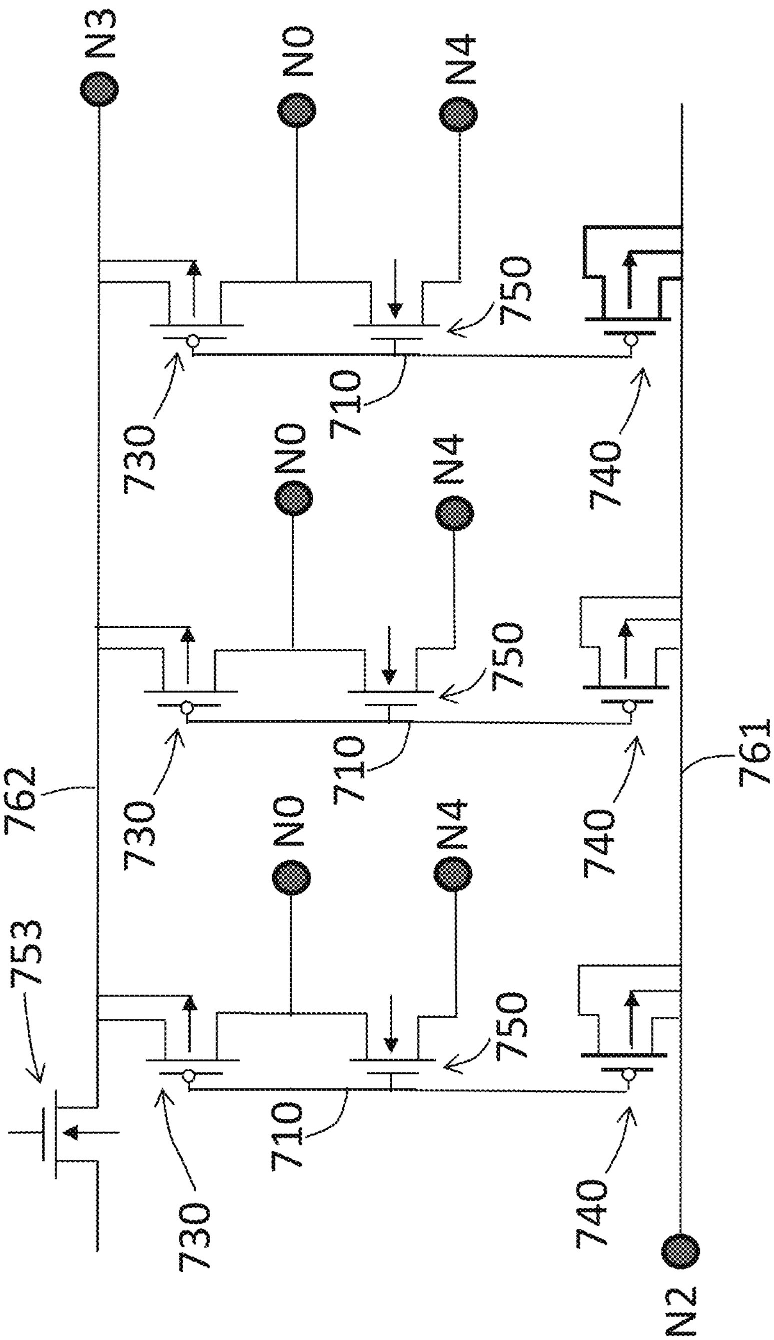

Alternatively, FIG. 4F is a circuit diagram illustrating a fourth type of non-volatile memory cell in accordance with an embodiment of the present application. The erasing, programming and operation of the non-volatile memory cell of the fourth type as seen in FIG. 4F may be referred to those as illustrated in FIGS. 4A-4C. For an element indicated by the same reference number shown in FIGS. 4A-4C and 4F, the specification of the element as seen in FIG. 4F may be referred to that of the element as illustrated in FIGS. 4A-4C. The difference therebetween is mentioned as below. Referring to FIGS. 4A-4C and 4F, a plurality of the non-volatile memory cell 760 of the fourth type may have its nodes N2 coupling in parallel to each other or one another via the word line 761 and its nodes N3 coupling in parallel to each other or one another and to a switch 753, such as N-type MOS transistor, via the word line 762. The N-type MOS transistor 752 may be configured to form a channel with an end coupling to the node N3 of each of the non-volatile memory cells 760 and the other end configured to couple to the erasing voltage $V_{Er}$, the programming voltage $V_{Pr}$ or the voltage Vcc of power supply. When the fourth type of non-volatile memory cells 760 are being erased, the N-type MOS transistor 753 may have a gate terminal switched to couple to the erasing voltage $V_{Er}$ to turn on its channel to couple the node N3 of each of the non-volatile memory cells 760 to the erasing voltage $V_{Er}$. When the fourth type of non-volatile memory cells 760 are being programmed, the gate terminal of the N-type MOS transistor 753 may be switched to couple to the programming voltage $V_{Pr}$ to turn on its channel to couple the node N3 of each of the non-volatile memory cells 760 to the programming voltage $V_{Pr}$. When the fourth type of non-volatile memory cells 760 are being operated, the gate terminal of the N-type MOS transistor 753 may be switched to couple to the voltage Vcc of power supply to turn on its channel to couple the node N3 of each of the non-volatile memory cells 760 to the voltage Vcc of power supply. When the fourth type of non-volatile memory cells 760 are being in a power saving mode, the gate terminal of the N-type MOS transistor 753 may be switched to couple to the voltage Vss of ground reference to turn off its channel to lead the node N3 of each of the non-volatile memory cells 760 to be floating.

Alternatively, referring to FIGS. 4A-4C and 4F, the switch 753 may be a P-type MOS transistor configured to form a channel with an end coupling to the node N3 of each of the non-volatile memory cells 760 and the other end configured switched to couple to the erasing voltage $V_{Er}$, the programming voltage $V_{Pr}$ or the voltage Vcc of power supply. When the fourth type of non-volatile memory cells 760 are being erased, the P-type MOS transistor 753 may have a gate terminal switched to couple to the ground reference of Vss to turn on its channel to couple the node N3 of each of the non-volatile memory cells 760 to the erasing voltage $V_{Er}$. When the fourth type of non-volatile memory cells 760 are being programmed, the gate terminal of the P-type MOS transistor 753 may be switched to couple to the ground reference of Vss to turn on its channel to couple the node N3 of each of the non-volatile memory cells 760 to the programming voltage $V_{Pr}$. When the fourth type of non-volatile memory cells 760 are being operated, the gate terminal of the P-type MOS transistor 753 may be switched to couple to the voltage Vss of ground reference to turn on its channel to couple the node N3 of each of the non-volatile memory cells 760 to the voltage Vcc of power supply. When the fourth type of non-volatile memory cells 760 are being in a power saving mode, the gate terminal of the P-type MOS transistor 753 may be switched to couple to the voltage Vcc of power supply to turn off its channel to lead the node N3 of each of the fourth type of non-volatile memory cells 760 to be floating.

Figure 4G:
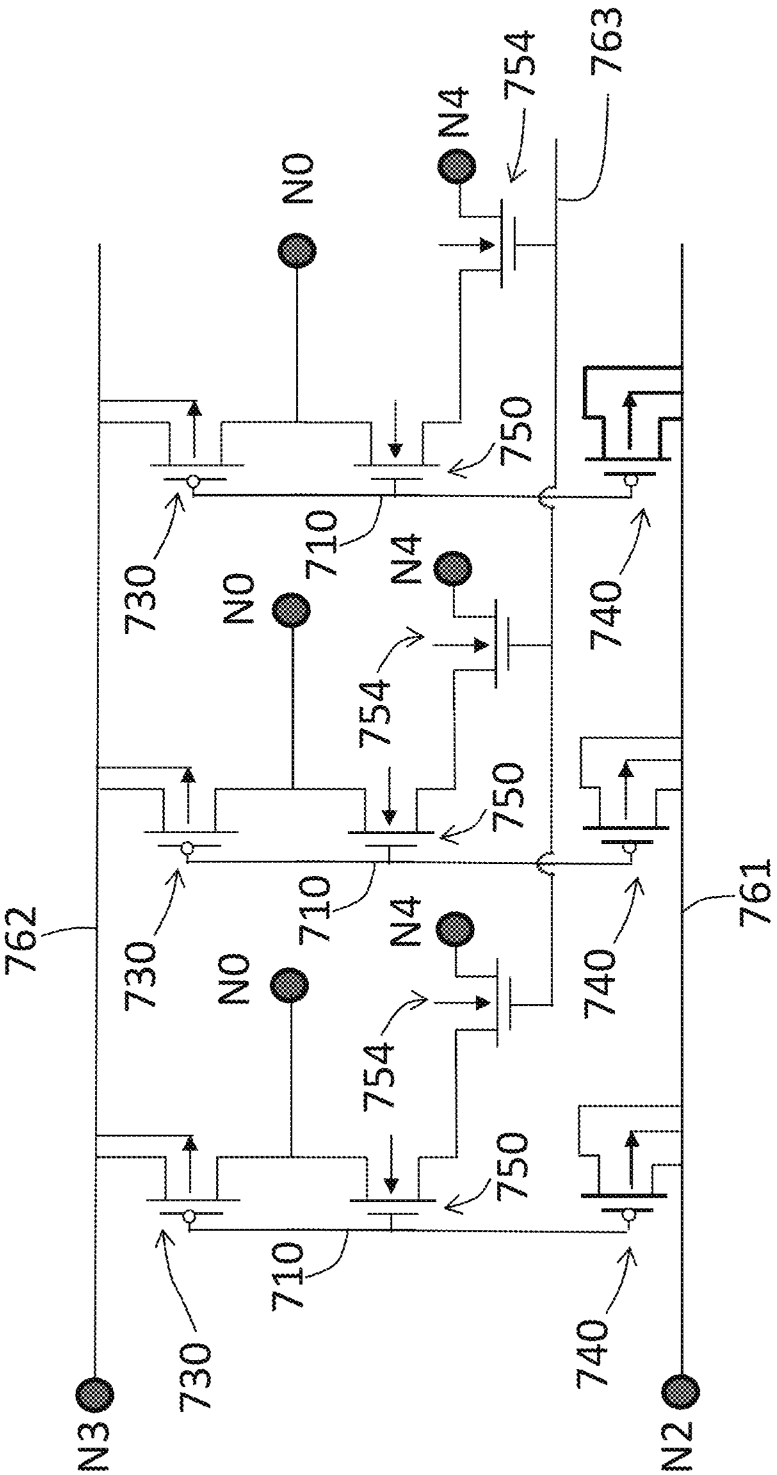

Alternatively, FIG. 4G is a circuit diagram illustrating a fourth type of non-volatile memory cell in accordance with an embodiment of the present application. The erasing, programming and operation of the non-volatile memory cell of the fourth type as seen in FIG. 4G may be referred to those as illustrated in FIGS. 4A-4C. For an element indicated by the same reference number shown in FIGS. 4A-4C and 4G, the specification of the element as seen in FIG. 4G may be referred to that of the element as illustrated in FIGS. 4A-4C. The difference therebetween is mentioned as below. Referring to FIGS. 4A-4C and 4G, a plurality of the non-volatile memory cell 760 of the fourth type may have its nodes N2 coupling in parallel to each other or one another via the word line 761 and its nodes N3 coupling in parallel to each other or one another via the word line 762. Each of the non-volatile memory cells 760 may further include a switch 754, such as N-type MOS transistor, configured to form a channel with an end coupling to the source terminal, in operation, of the N-type MOS transistor 750 of said each of the non-volatile memory cells 760 and the other end configured to couple to the node N4. The N-type MOS transistors 754 of the plurality of the non-volatile memory cell 760 may have gate terminals coupling to each other or one another via a word line 763. When each of the non-volatile memory cells 760 is being erased, the word line 763 may be switched to couple to the erasing voltage $V_{Er}$ to turn on the channel of its N-type MOS transistor 754 to couple the source terminal, in operation, of its N-type MOS transistor 750 to its node N4 After the plurality of the non-volatile memory cell 760 is erased, each of the non-volatile memory cells 760 may be selected to be programmed or not to be programmed. For example, a leftmost one of the non-volatile memory cells 760 has its floating gate 710 selected to be programmed to a logic level of "0", but a rightmost one of the non-volatile memory cells 760 has its floating gate 710 selected not to be programmed to a logic level of "0" but kept at a logic level of "1". When the leftmost one of the non-volatile memory cells 760 is being programmed and the rightmost one of the non-volatile memory cells 760 is not being programmed, the word line 763 may be switched to couple to the programming voltage $V_{Pr}$ to turn on the channels of their N-type MOS transistors 754 respectively to couple the source terminal, in operation, of their N-type MOS transistors 750 to their nodes N4 respectively. The leftmost one of the non-volatile memory cells 760 may have its node N4 switched to couple to the voltage Vss of ground reference such that electrons may tunnel through its gate oxide 711 from its node N4 to its floating gate 710 to be trapped in its floating gate 710, and thereby its floating gate 710 may be programmed to a logic level of "0". The rightmost one of the non-volatile memory cells 760 may have its node N4 switched to couple to the programming voltage $V_{Pr}$ such that no electrons may tunnel through its gate oxide 711 from its node N4 to its floating gate 710, and thereby its floating gate 710 may be kept at a logic level of "1". When each of the non-volatile memory cell 760 of the fourth type is being operated, the word line 763 may be switched to couple to the voltage Vcc of power supply to turn on the channel of its N-type MOS transistor 754 to couple the source terminal, in operation, of its N-type MOS transistor 750 to its node N4. When each of the non-volatile memory cells 760 of the fourth type is being in a power saving mode, the word line 763 may be switched to couple to the voltage Vss of ground reference to turn off the channel of its N-type MOS transistor 754 to disconnect the source terminal, in operation, of its N-type MOS transistor 750 from its node N4.

Alternatively, referring to FIG. 4G, for each of the non-volatile memory cells 760, the switch 754 may be a P-type MOS transistor configured to form a channel with an end coupling to the source terminal, in operation, of its N-type MOS transistor 750 and the other end coupling to its node N4. The P-type MOS transistors 754 of the plurality of the non-volatile memory cell 760 may have gate terminals coupling to each other or one another via the word line 763.

When each of the non-volatile memory cells 760 is being erased, the word line 763 may be switched to couple to the voltage Vss of ground reference to turn on the channel of its P-type MOS transistor 754 to couple the source terminal, in operation, of its N-type MOS transistor 750 to its node N4 When the leftmost one of the non-volatile memory cells 760 is being programmed and the rightmost one of the non-volatile memory cells 760 is not being programmed, the word line 763 may be switched to couple to the voltage Vss of ground reference to turn on the channels of their N-type MOS transistors 754 respectively to couple the source terminals, in operation, of their N-type MOS transistors 750 to their nodes N4 respectively. When each of the non-volatile memory cells 760 of the fourth type is being operated, the word line 763 may be switched to couple to the voltage Vss of ground reference to turn on the channel of its P-type MOS transistor 754 to couple the source terminal, in operation, of its N-type MOS transistor 750 to its node N4. When each of the non-volatile memory cells 760 of the fourth type is being in a power saving mode, the word line 763 may be switched to couple to the voltage Vcc of power supply to turn off the channel of its N-type MOS transistor 754 to disconnect the source terminal, in operation, of its N-type MOS transistor 750 from its node N4.

Figure 4H:
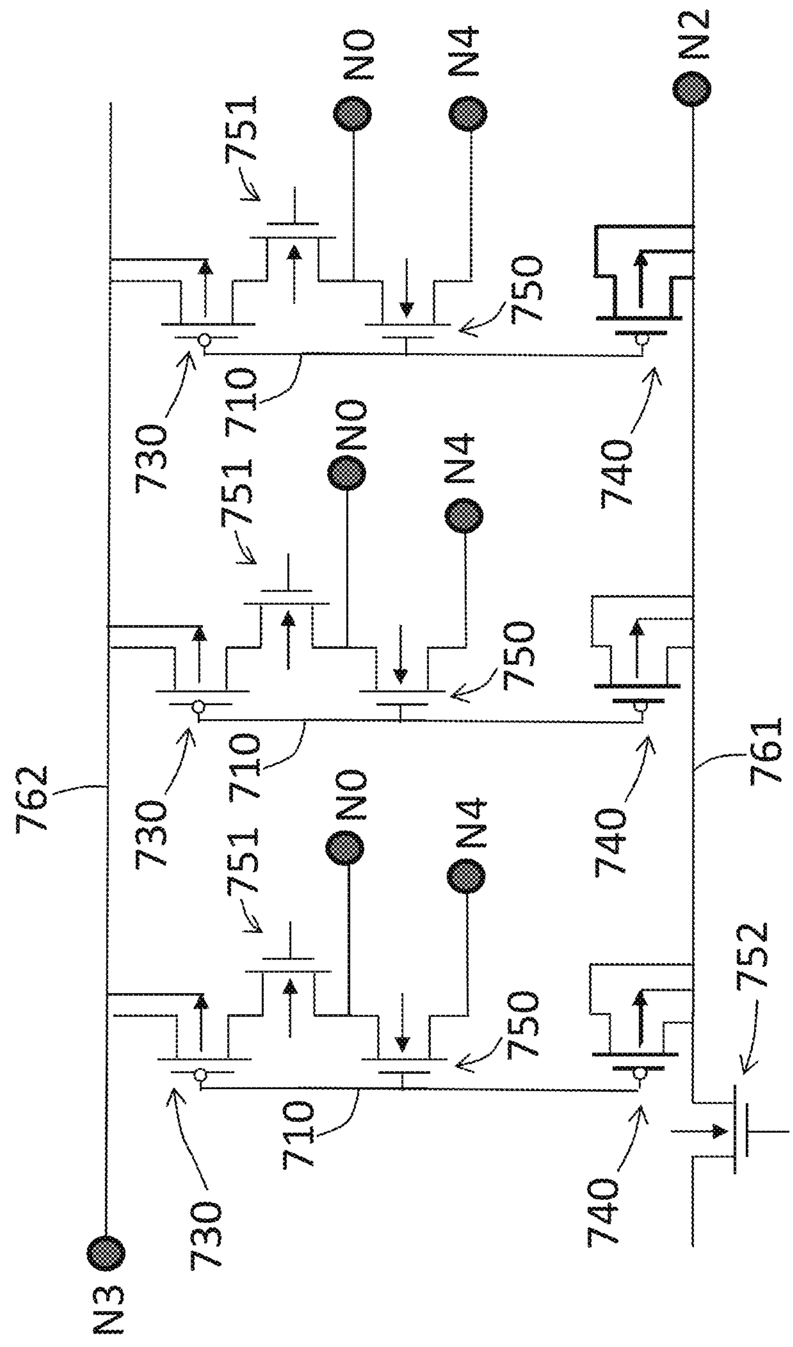
Figure 4I:
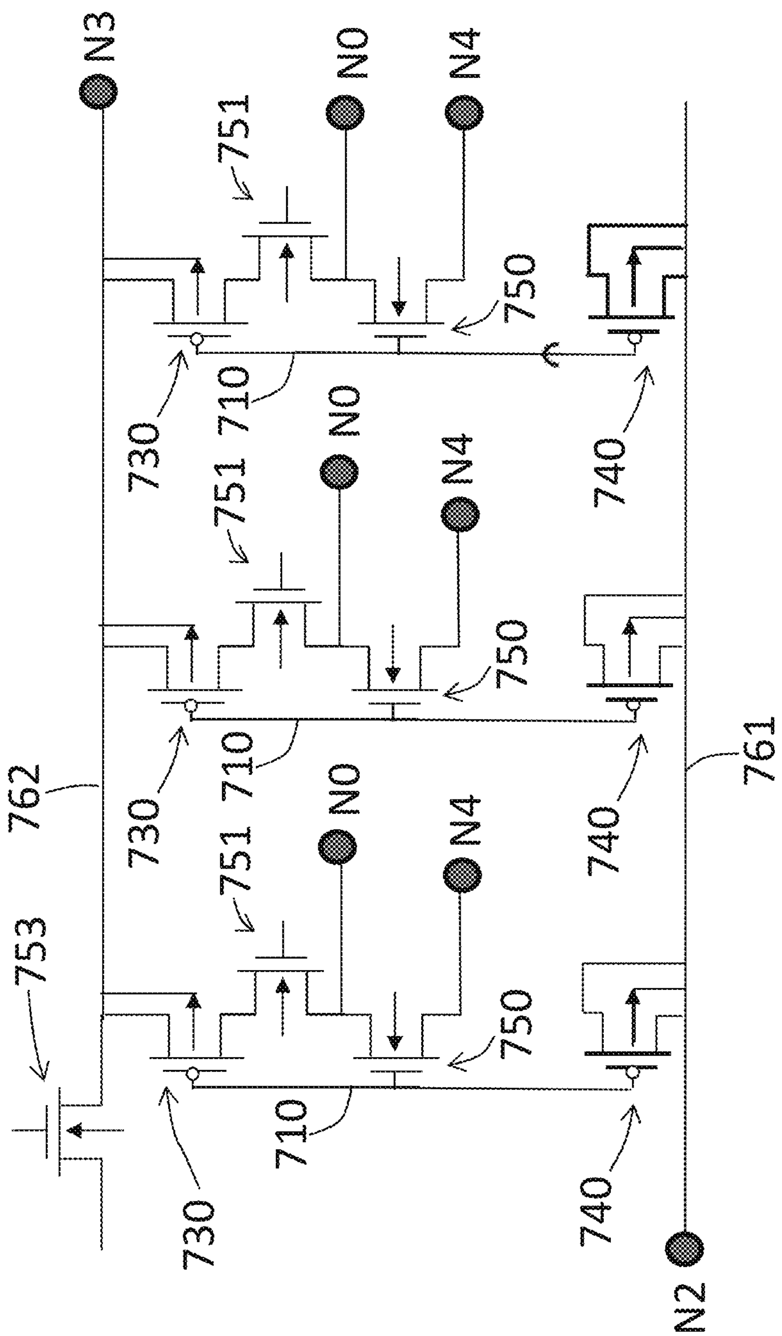
Figure 4J:
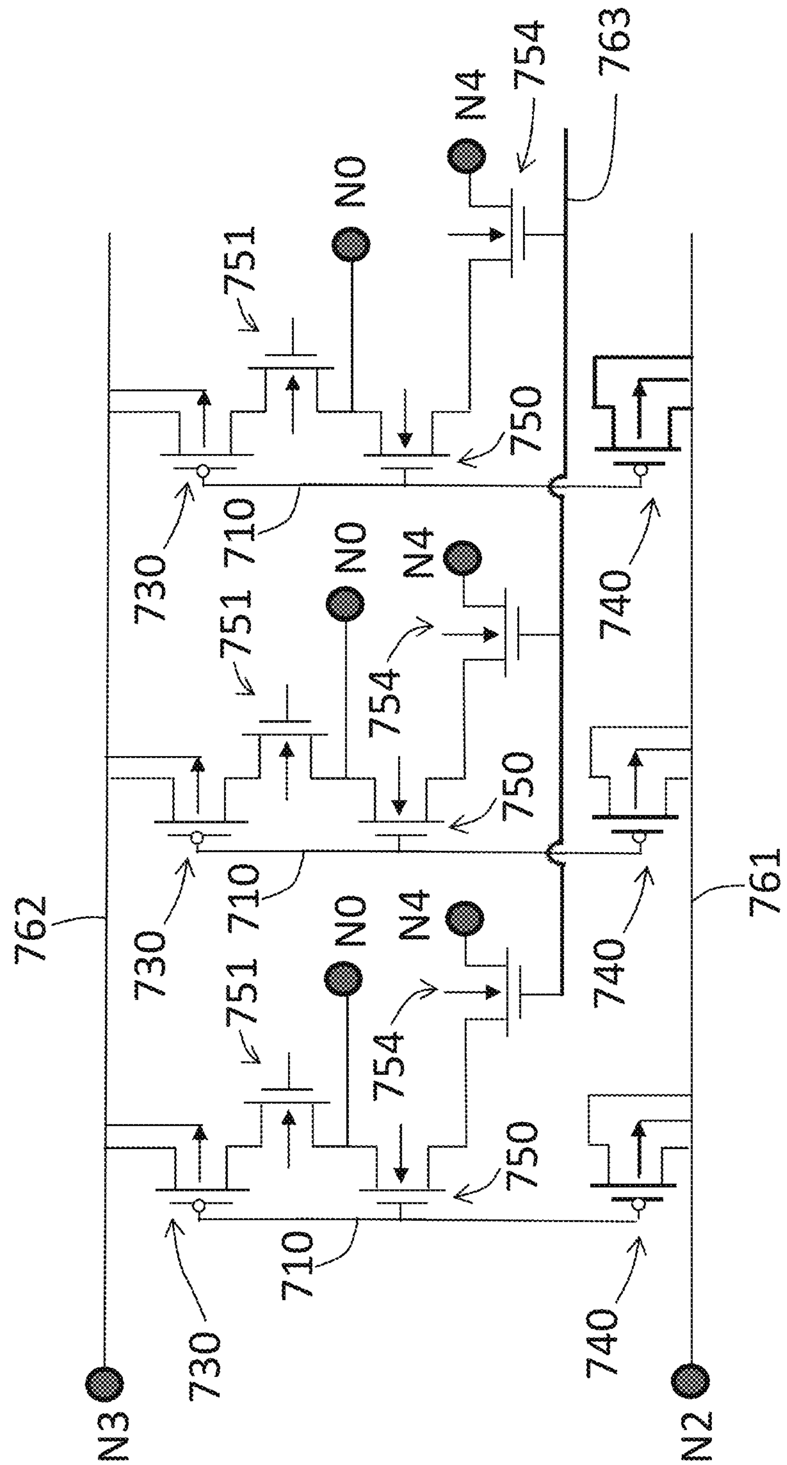
Figure 4K:
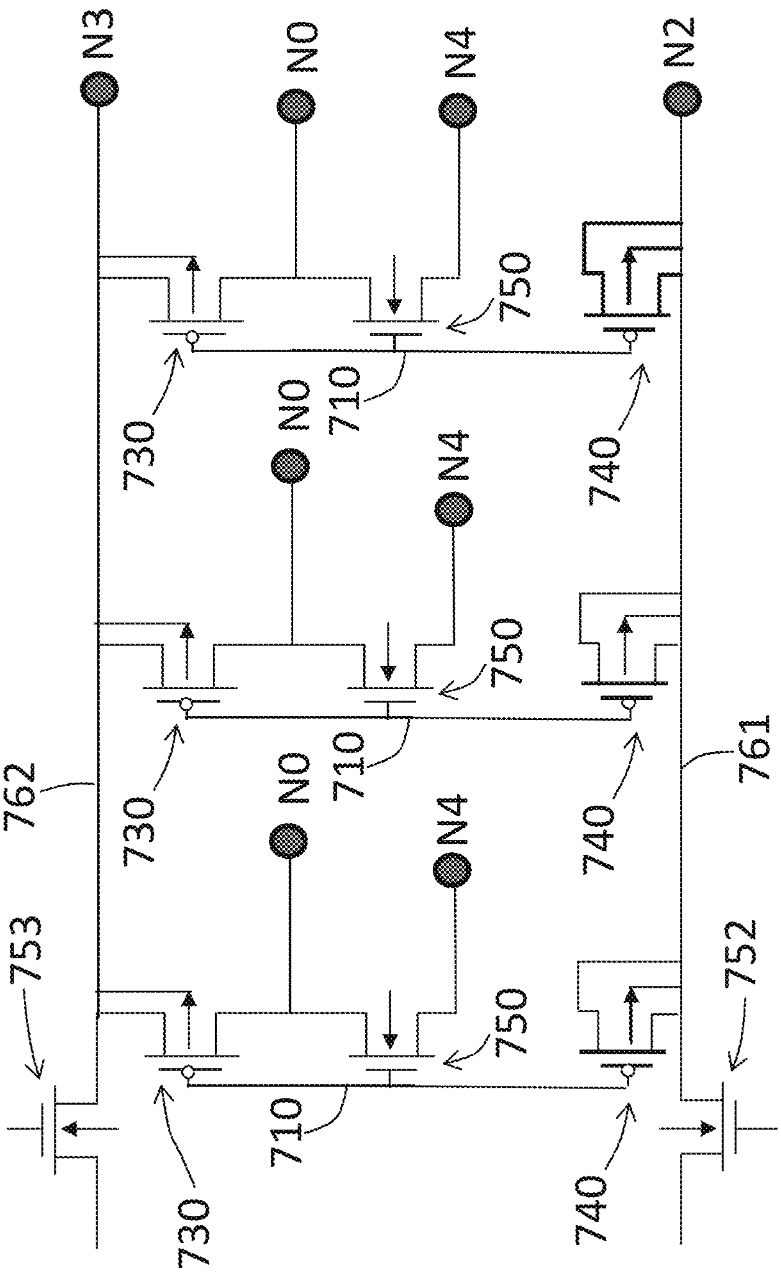
Figure 4L:
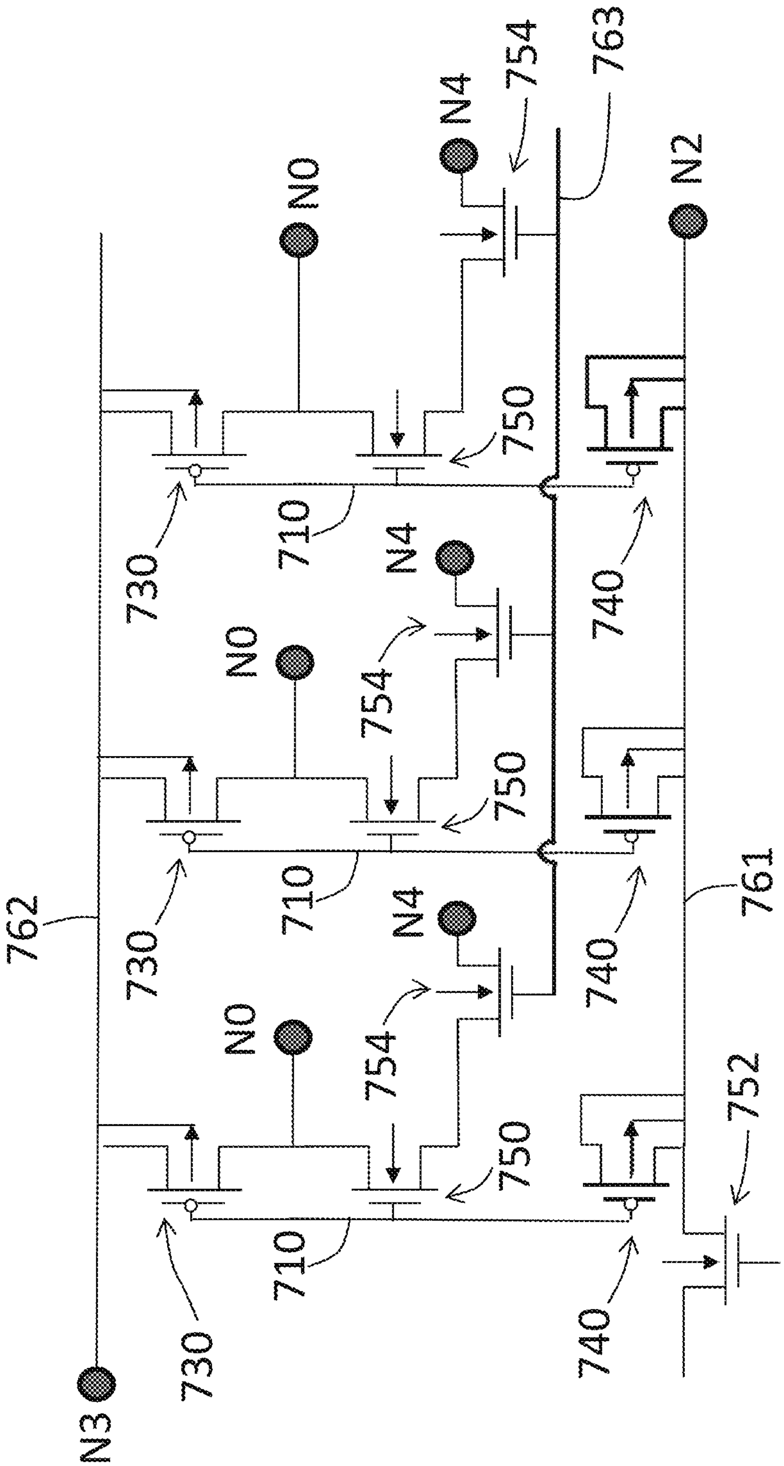
Figure 4M:
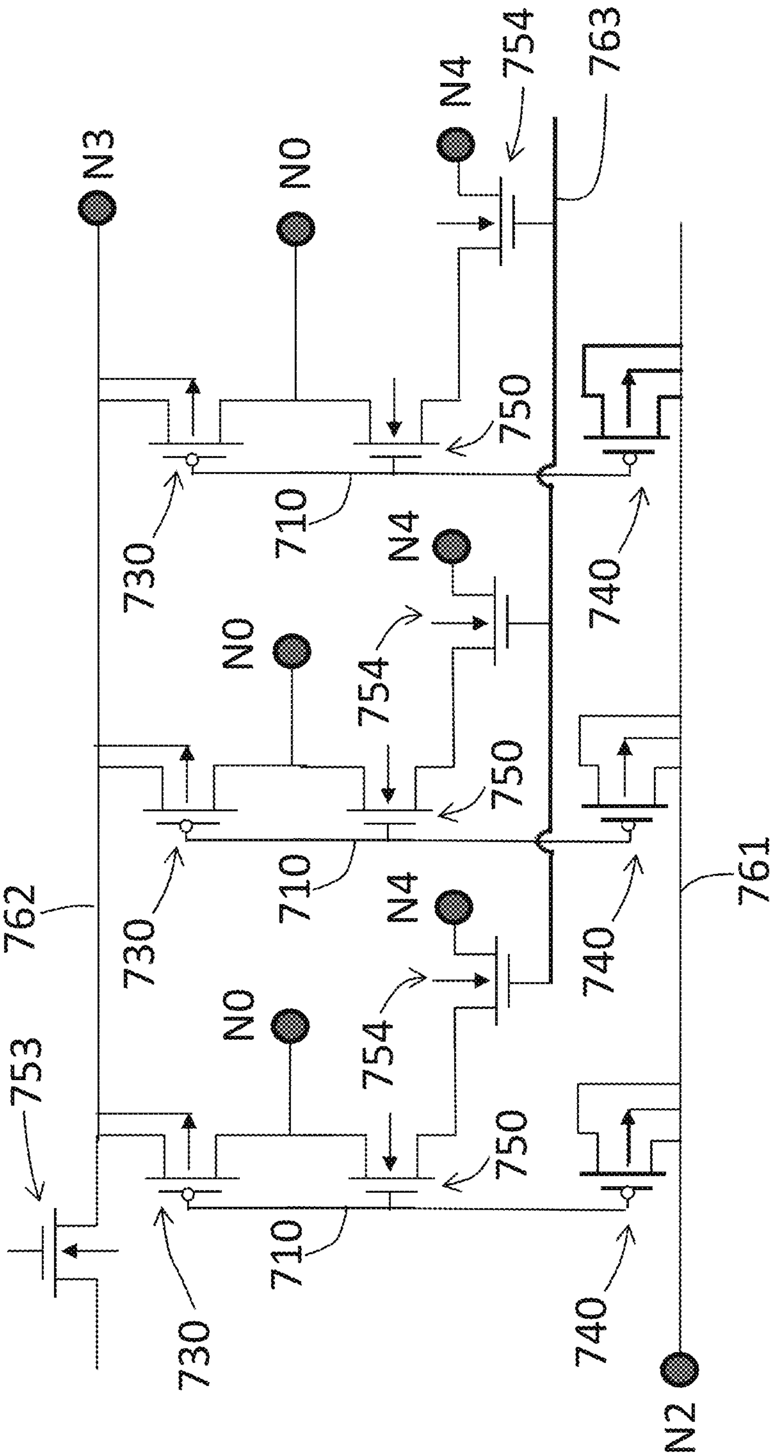
Figure 4N:
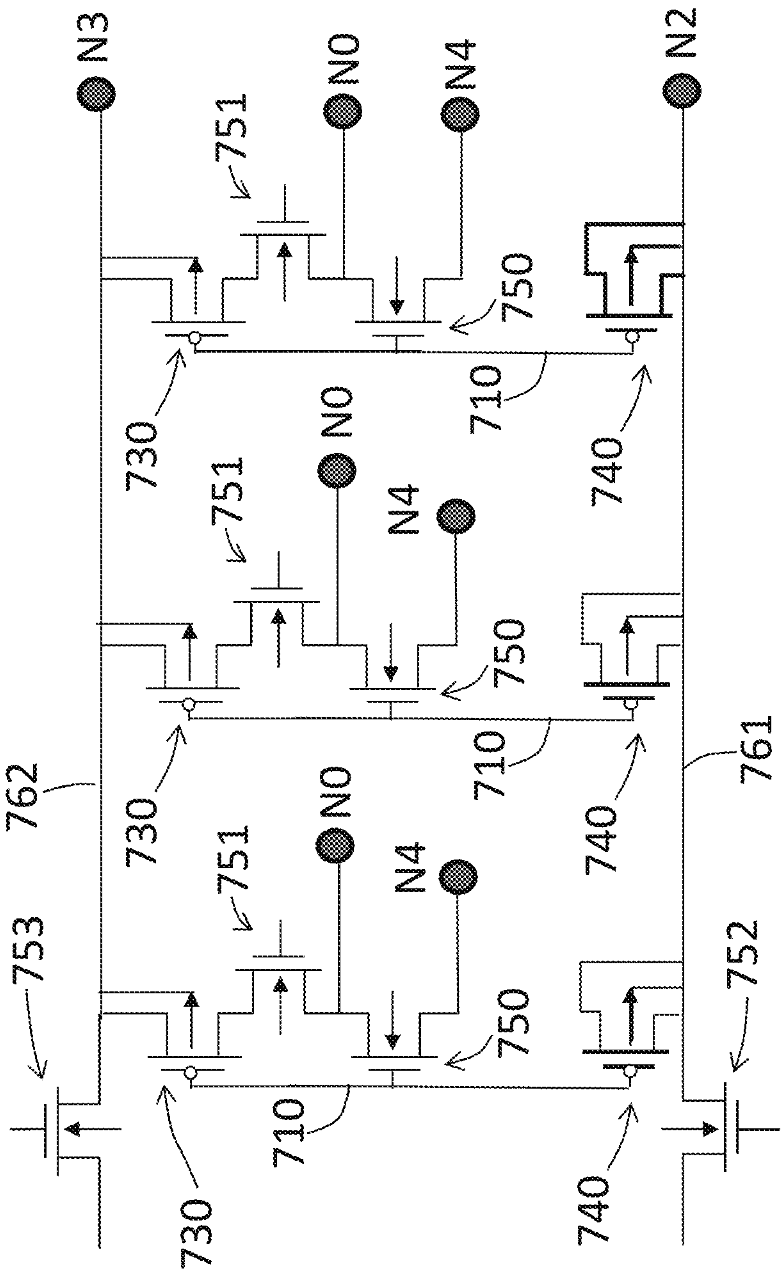
Figure 4O:
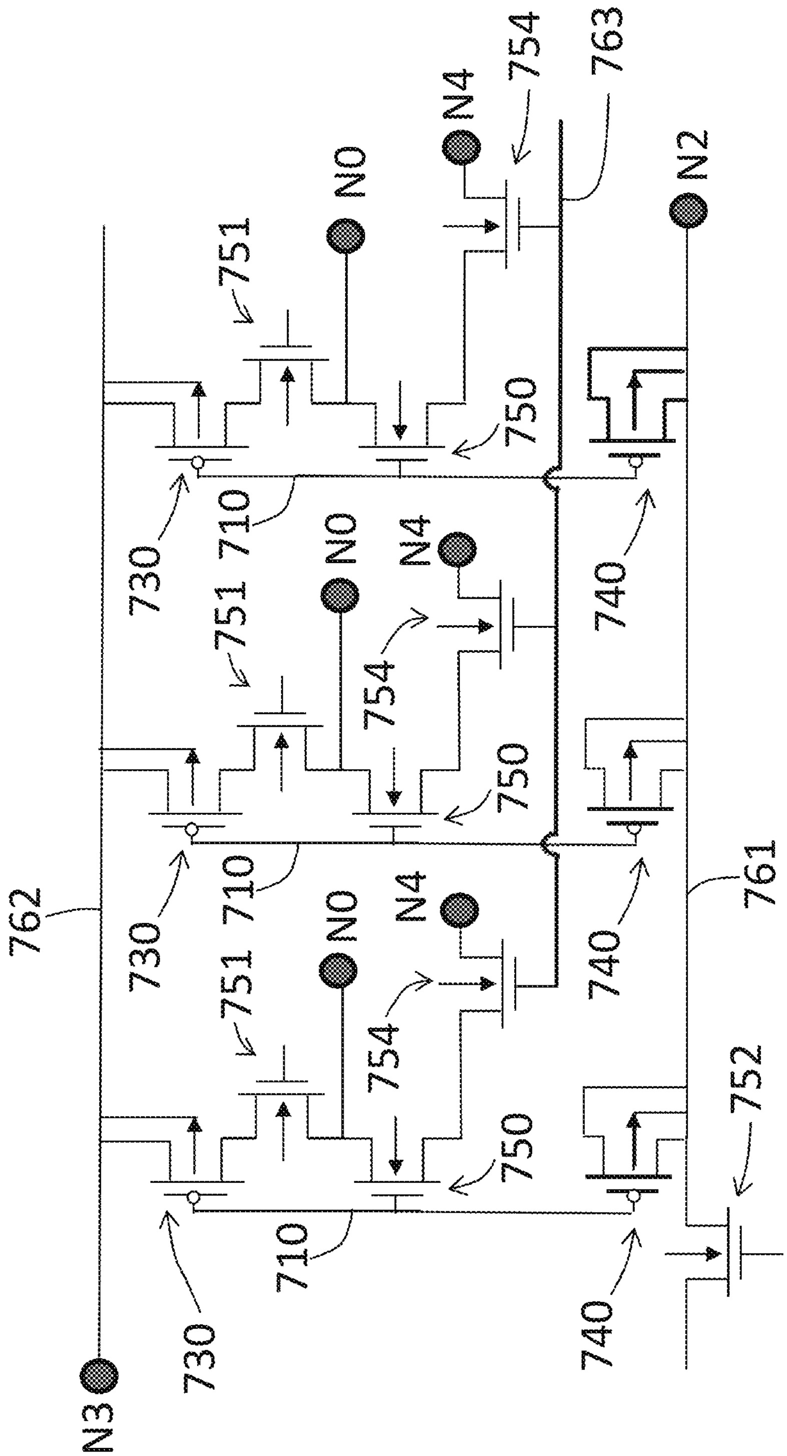
Figure 4P:
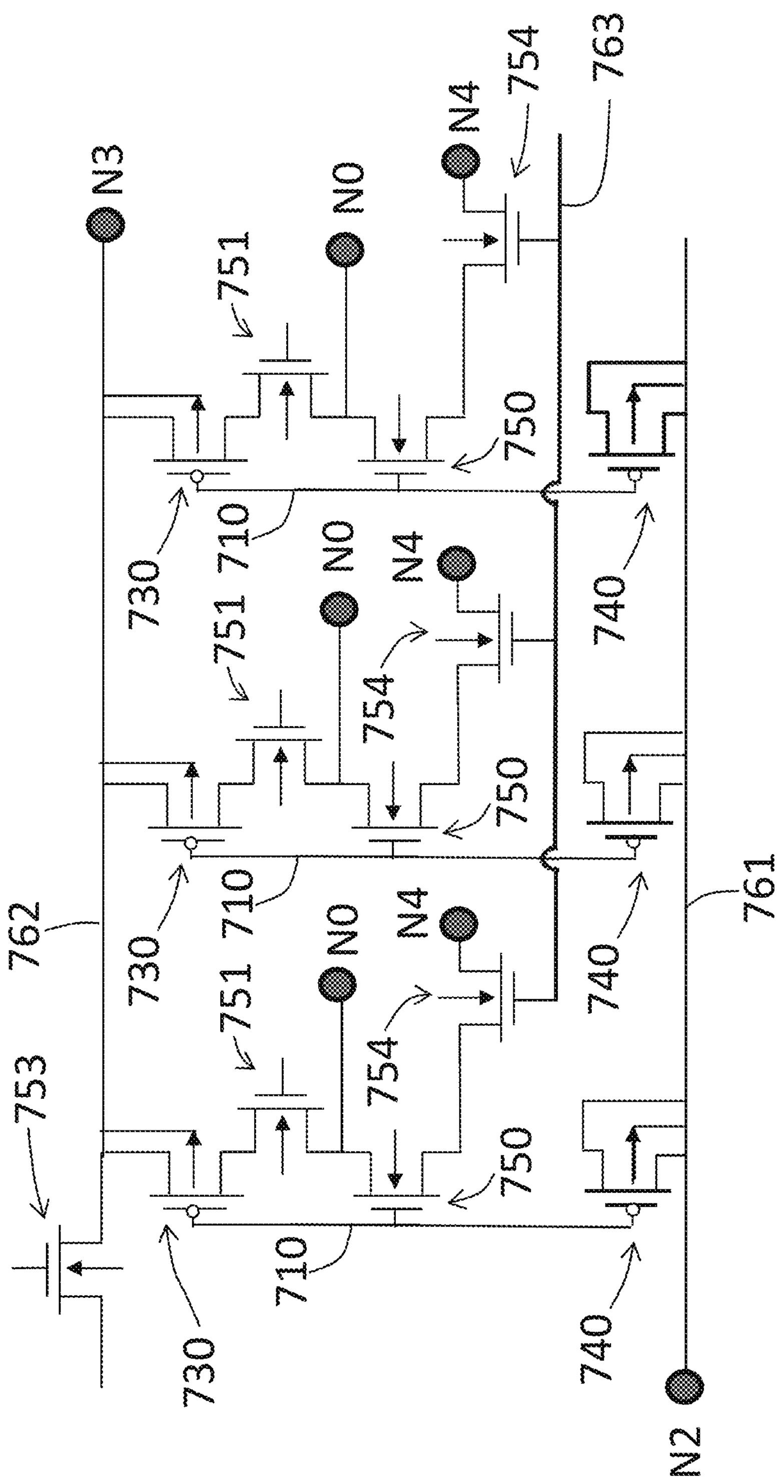
Figure 4Q:
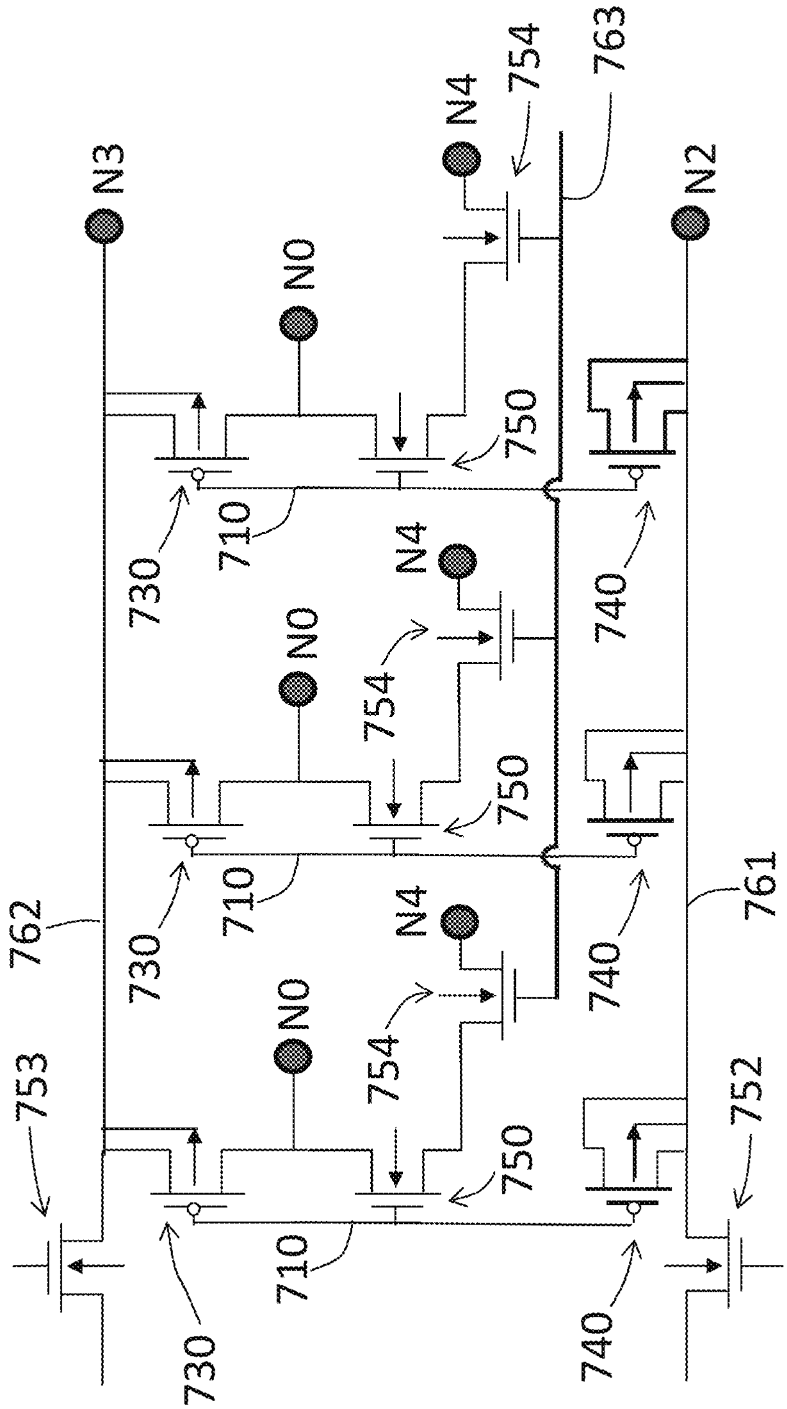
Figure 4R:
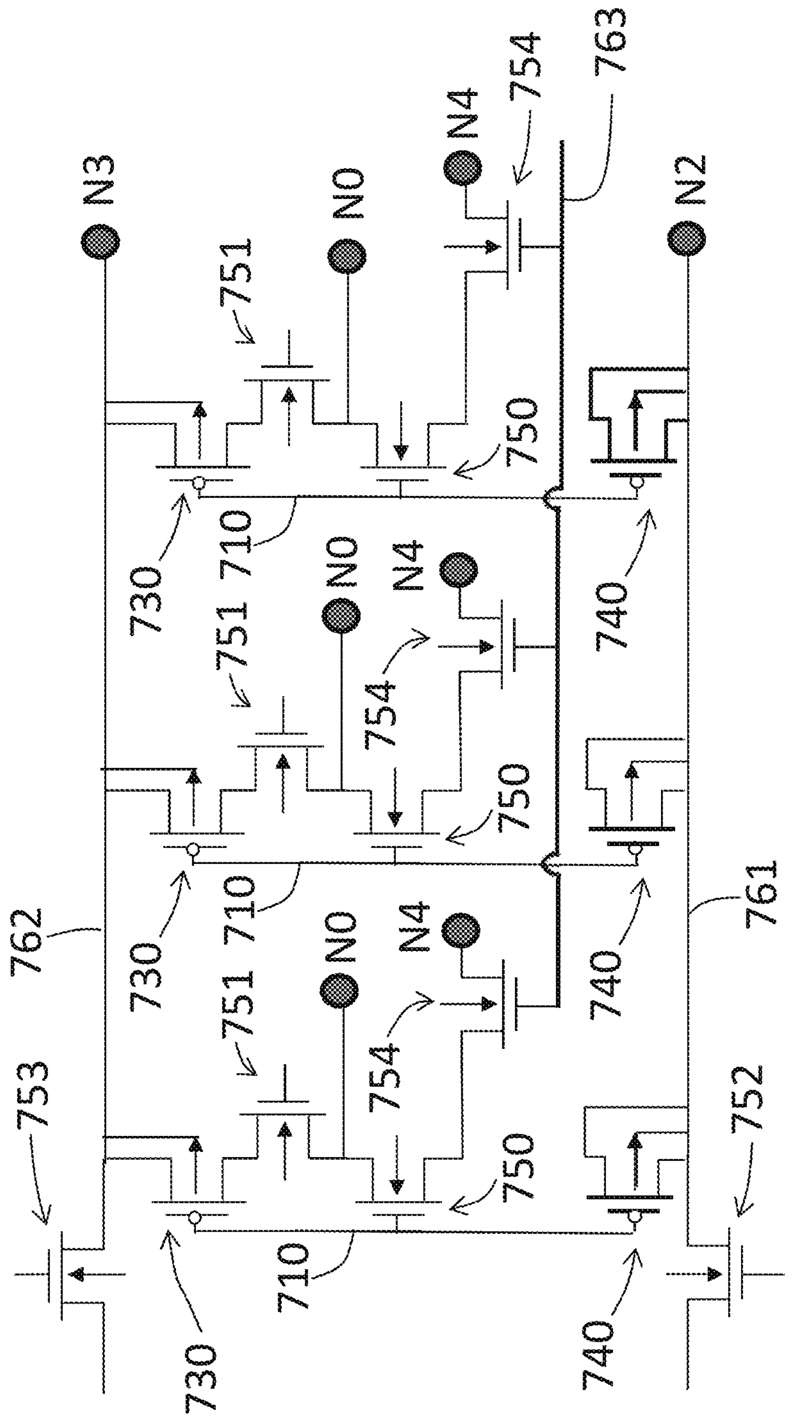

Alternatively, FIGS. 4H-4R are circuit diagrams illustrating multiple non-volatile memory cells of a fourth type in accordance with an embodiment of the present application. The erasing, programming and operation of the non-volatile memory cell of the fourth type as seen in FIGS. 4H-4R may be referred to those as illustrated in FIGS. 4A-4G. For an element indicated by the same reference number shown in FIGS. 4A-4R, the specification of the element as seen in FIGS. 4H-4R may be referred to that of the element as illustrated in FIGS. 4A-4G. The more elaboration is mentioned as below. Referring to FIG. 4H, the switches 751 and 752 may be incorporated for the fourth type of non-volatile memory cell 760. When the fourth type of non-volatile memory cells 760 are being erased, programed or operated, the switches 751 and 752 are switched as illustrated in FIGS. 4D and 4E. Referring to FIG. 4I, the switches 751 and 753 may be incorporated for the fourth type of non-volatile memory cell 760. When the fourth type of non-volatile memory cells 760 are being erased, programed or operated, the switches 751 and 753 are switched as illustrated in FIGS. 4D and 4F. Referring to FIG. 4J, the switches 751 and 754 may be incorporated for the fourth type of non-volatile memory cell 760. When the fourth type of non-volatile memory cells 760 are being erased, programed or operated, the switches 751 and 754 are switched as illustrated in FIGS. 4D and 4G. Referring to FIG. 4K, the switches 752 and 753 may be incorporated for the fourth type of non-volatile memory cell 760. When the fourth type of non-volatile memory cells 760 are being erased, programed or operated, the switches 752 and 753 are switched as illustrated in FIGS. 4E and 4F. Referring to FIG. 4L, the switches 752 and 754 may be incorporated for the fourth type of non-volatile memory cell 760. When the fourth type of non-volatile memory cells 760 are being erased, programed or operated, the switches 752 and 754 are switched as illustrated in FIGS. 4E and 4G. Referring to FIG. 4M, the switches 753 and 754 may be incorporated for the fourth type of non-volatile memory cell 760. When the fourth type of non-volatile memory cells 760 are being erased, programed or operated, the switches 753 and 754 are switched as illustrated in FIGS. 4F and 4G. Referring to FIG. 4N, the switches 751, 752 and 753 may be incorporated for the fourth type of non-volatile memory cell 760. When the fourth type of non-volatile memory cells 760 are being erased, programed or operated, the switches 751, 752 and 753 are switched as illustrated in FIGS. 4D-4F. Referring to FIG. 4O, the switches 751, 752 and 754 may be incorporated for the fourth type of non-volatile memory cell 760. When the fourth type of non-volatile memory cells 760 are being erased, programed or operated, the switches 751, 752 and 754 are switched as illustrated in FIGS. 4D, 4E and 4G. Referring to FIG. 4P, the switches 751, 753 and 754 may be incorporated for the fourth type of non-volatile memory cell 760. When the fourth type of non-volatile memory cells 760 are being erased, programed or operated, the switches 751, 753 and 754 are switched as illustrated in FIGS. 4D, 4F and 4G. Referring to FIG. 4Q, the switches 752, 753 and 754 may be incorporated for the fourth type of non-volatile memory cell 760. When the fourth type of non-volatile memory cells 760 are being erased, programed or operated, the switches 752, 753 and 754 are switched as illustrated in FIGS. 4E-4G. Referring to FIG. 4R, the switches 751, 752, 753 and 754 may be incorporated for the fourth type of non-volatile memory cell 760. When the fourth type of non-volatile memory cells 760 are being erased, programed or operated, the switches 751, 752, 753 and 754 are switched as illustrated in FIGS. 4D-4G.

Figure 4S:
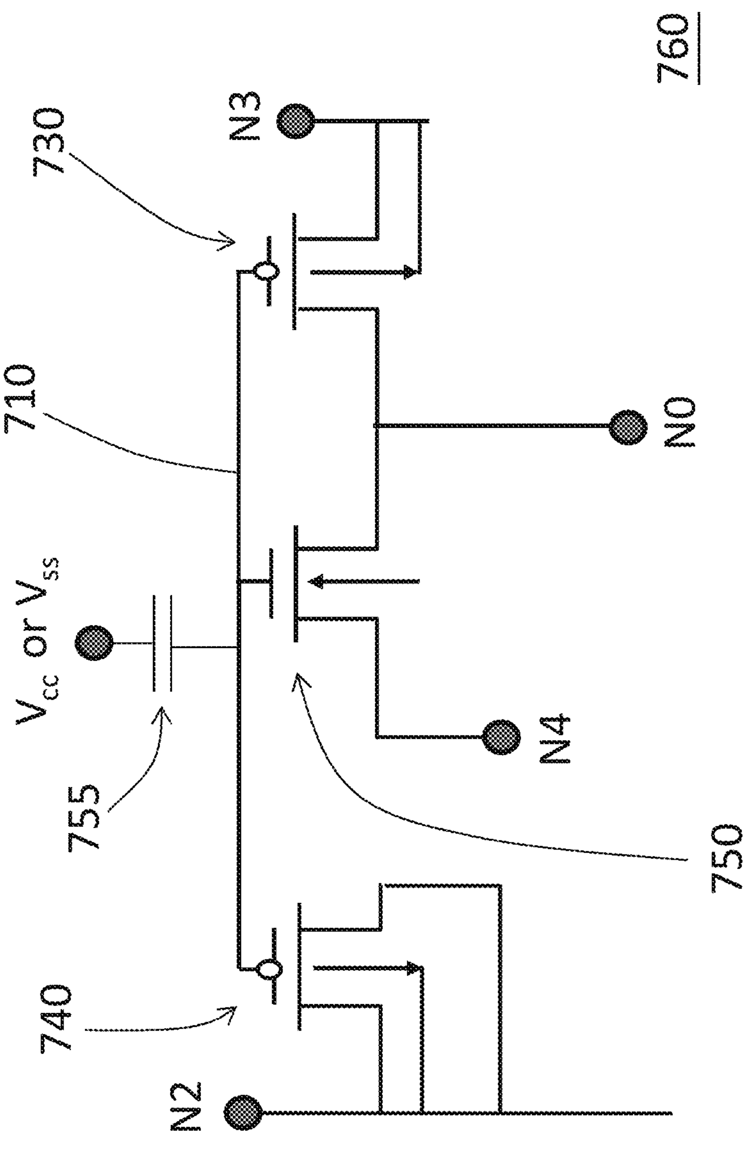

Alternatively, FIG. 4S is a circuit diagram illustrating a fourth type of non-volatile memory cell in accordance with an embodiment of the present application. The erasing, programming and operation of the non-volatile memory cell of the fourth type as seen in FIG. 4S may be referred to those as illustrated in FIGS. 4A-4C. For an element indicated by the same reference number shown in FIGS. 4A-4C and 4S, the specification of the element as seen in FIG. 4S may be referred to that of the element as illustrated in FIGS. 4A-4C. The difference therebetween is mentioned as below. Each of the non-volatile memory cell 760 as illustrated in FIGS. 4A-4R may further include a parasitic capacitor 755 having a first terminal coupling to the floating gate 710 and a second terminal coupling to the voltage Vcc of power supply or to the voltage Vss of ground reference. The structure as illustrated in FIG. 4A is taken as an example herein to be incorporated with the parasitic capacitor 755. The parasitic capacitor 755 may have a capacitance greater than a gate capacitance of the first P-type MOS transistor 730, than a gate capacitance of the second P-type MOS transistor 740 and than a gate capacitance of the N-type MOS transistor 750. For example, the capacitance of the parasitic capacitor 755 may be equal to between 1 and 10,000 times of the gate capacitance of the first P-type MOS transistor 730, between 1 and 10,000 times of the gate capacitance of the second P-type MOS transistor 740 and to between 1 and 10,000 times of the gate capacitance of the N-type MOS transistor 750. The capacitance of the parasitic capacitor 755 may range from 0.1 aF to 1 pF. Thereby, more electric charges or electrons may be stored in the floating gate 710.

For the fourth type of non-volatile memory cells 760 as illustrated in FIGS. 4A-4R, the erasing voltage $V_{Er}$ may be greater than or equal to the programming voltage $V_{Pr}$ that may be greater than or equal to the voltage Vcc of power supply. The erasing voltage $V_{Er}$ may range from 5 volts to 0.25 volts, the programming voltage $V_{Pr}$ may range from 5 volts to 0.25 volts, and the voltage Vcc of power supply may range from 3.5 volts to 0.25 volts, such as 0.75 volts or 3.3 volts.

(5) Fifth Type of Non-Volatile Memory Cells

Figure 5A:
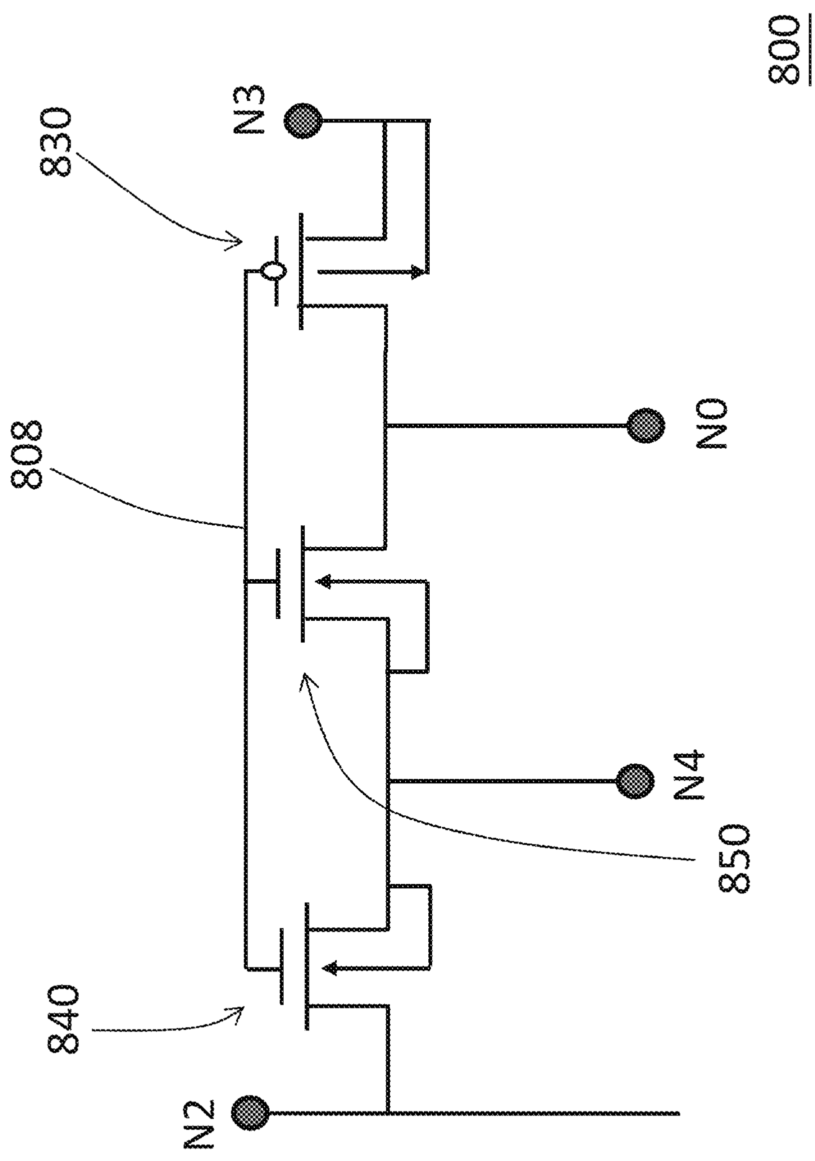
FIGS. 5A, 5E and 5F are circuit diagrams illustrating a fifth type of non-volatile memory cells in accordance with an embodiment of the present application.
Figure 5B:
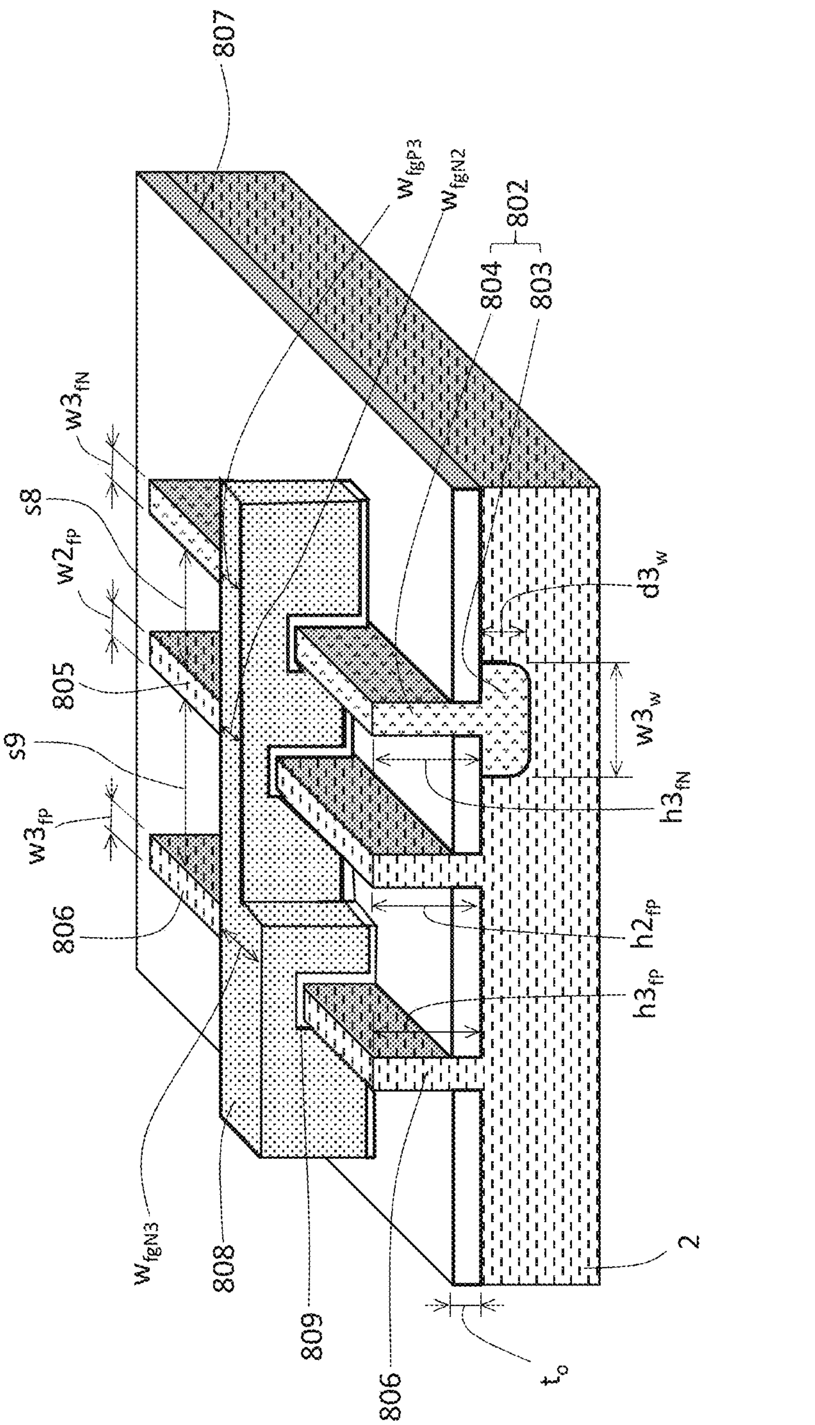
FIGS. 5B-5D are schematically perspective views showing various structures of a fifth type of non-volatile memory cell in FIG. 5A in accordance with an embodiment of the present application.

FIG. 5A is a circuit diagram illustrating a fifth type of non-volatile memory cell in accordance with an embodiment of the present application. FIG. 5B is a schematically perspective view showing a structure of a fifth type of non-volatile memory cell in accordance with an embodiment of the present application. Referring to FIGS. 5A and 5B, the fifth type of non-volatile memory cell 800 may be formed on a P-type or N-type semiconductor substrate 2, e.g., silicon substrate. In this case, a P-type silicon substrate 2 coupling the voltage Vss of ground reference is provided for the fifth type of non-volatile memory cell 800. The fifth type of non-volatile memory cell 800 may include:

(1) a N-type stripe 802 formed with an N-type well 803 in the P-type silicon substrate 2 and an N-type fin 804 vertically protruding from the a top surface of the N-type well 803, wherein the N-type well 803 may have a depth $d3_w$ between 0.3 and 5 micrometers and a width $w3_w$ between 50 nanometers and 1 micrometer, and the N-type fin 804 may have a height $h3_{fN}$ between 10 and 200 nanometers and a width $w3_{fN}$ between 1 and 100 nanometers;

(2) a first P-type fin 805 vertically protruding from the P-type silicon substrate 2, wherein the first P-type fin 805 may have a height $h2_{fP}$ between 10 and 200 and a width $w2_E$ between 1 and 100 nanometers, wherein a space s8 between the N-type fin 804 and first P-type fin 805 may range from 100 to 2,000 nanometers;

(3) a second P-type fin 806 vertically protruding from the P-type silicon substrate 2, wherein the second P-type fin 806 may have a height $h3_{fP}$ between 10 and 200 and a width $w3_{fP}$ between 1 and 100 nanometers, wherein a space s9 between the first and second P-type fins 805 and 806 may range from 100 to 2,000 nanometers;

(4) a field oxide 807, such as silicon oxide, on the P-type silicon substrate 2, wherein the field oxide 807 may have a thickness $t_o$ between 20 and 500 nanometers;

(5) a floating gate 808, such as polysilicon, tungsten, tungsten nitride, titanium, titanium nitride, tantalum, tantalum nitride, copper-containing metal, aluminum-containing metal, or other conductive metals, transversely extending over the field oxide 807 and from the N-type fin 804 of the N-type stripe 802 to the second P-type fin 806 across over the first P-type fin 805, wherein the floating gate 808 may have a width $w_{fgN3}$ over the second P-type fin 806, which may be greater than a width $w_{fgN2}$ thereof over the first P-type fin 805 and greater than a width $w_{fgP3}$ thereof over the N-type fin 804 of the N-type stripe 802, wherein the width $w_{fgN3}$ over the second P-type fin 806 may be equal to between 1 and 10 times or between 1.5 and 5 times of the width $w_{fgN2}$ over the first P-type fin 805 and, for example, equal to 2 times of the width $w_{fgN2}$ over the first P-type fin 805, and the width $w_{fgN3}$ over the second P-type fin 806 may be equal to between 1 and 10 times or between 1.5 and 5 times of the width $w_{fgP3}$ over the N-type fin 804 of the N-type stripe 802 and, for example, equal to 2 times of the width $w_{fgP3}$ over the N-type fin 804 of the N-type stripe 802, wherein the width $w_{fgP3}$ over the N-type fin 804 of the N-type stripe 802 may range from 1 to 25 nanometers, the width $w_{fgN2}$ over the first P-type fin 805 may range from 1 to 25 nanometers, and the width $w_{fgN3}$ over the second P-type fin 806 may range from 1 to 25 nanometers; and (6) a gate oxide 809, such as silicon oxide, hafnium-containing oxide, zirconium-containing oxide or titanium-containing oxide, transversely extending on the field oxide 807 and from the N-type fin 804 of the N-type stripe 802 to the second P-type fin 806 across over the first P-type fin 805 to be provided between the floating gate 808 and the N-type fin 804, between the floating gate 808 and the first P-type fin 805, between the floating gate 808 and the second P-type fin 806 and between the floating gate 808 and the field oxide 807, wherein the gate oxide 809 may have a thickness between 1 and 5 nanometers.

Figure 5C:
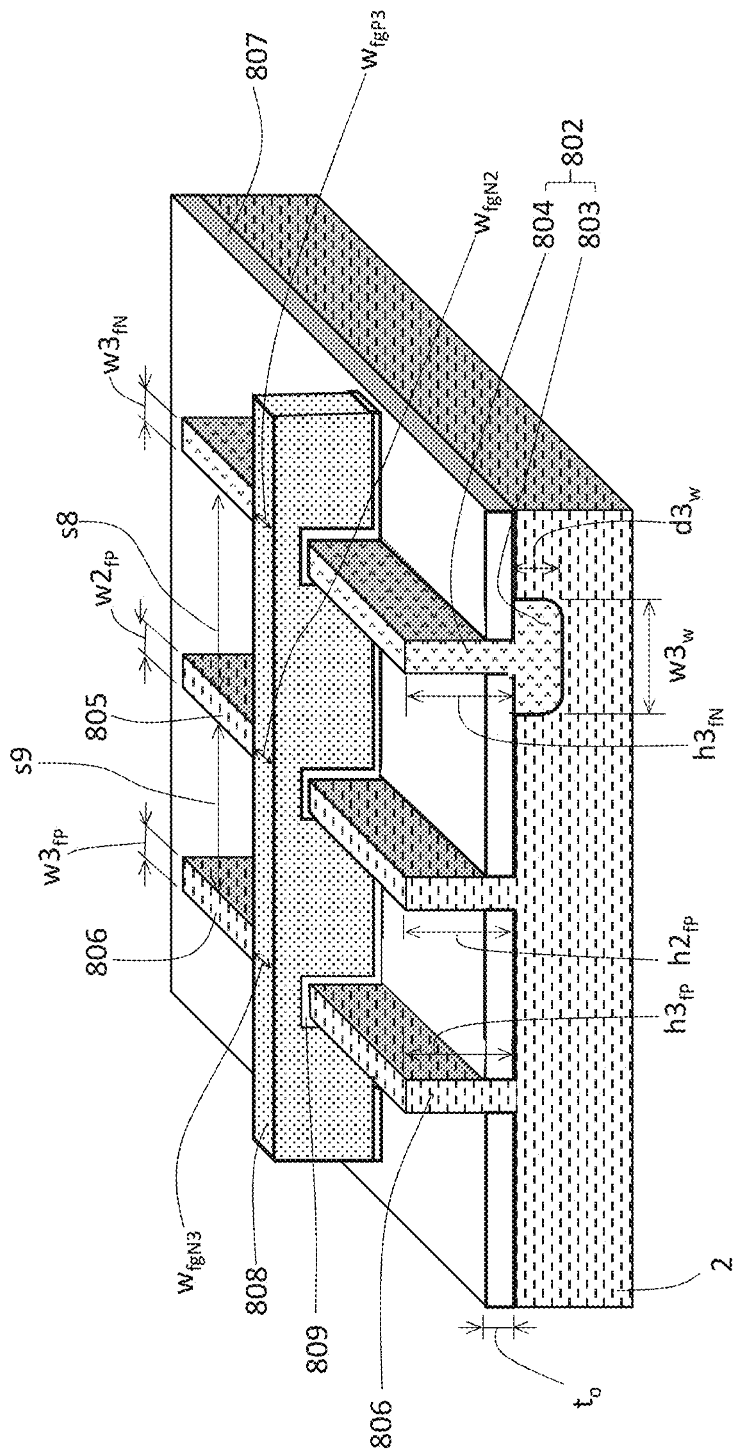

Alternatively, FIG. 5C is a schematically perspective view showing a structure of a fifth type of non-volatile memory cell in accordance with an embodiment of the present application. For an element indicated by the same reference number shown in FIGS. 5B and 5C, the specification of the element as seen in FIG. 5C may be referred to that of the element as illustrated in FIG. 5B. The difference between the circuits illustrated in FIG. 5B and the circuits illustrated in FIG. 5C is mentioned as below. Referring to FIG. 5C, the width $w_{fgN3}$ of the floating gate 808 over the second P-type fin 806 may be substantially equal to the width $w_{fgN2}$ of the floating gate 808 over the first P-type fin 805 and to the width $w_{fgP3}$ of the floating gate 808 over the N-type fin 804 of the N-type stripe 802. The width $w_{fgP3}$ over the N-type fin 804 of the N-type stripe 802 may range from 1 to 25 nanometers, the width $w_{fgN2}$ over the first P-type fin 805 may range from 1 to 25 nanometers, and the width $w_{fgN3}$ over the second P-type fin 806 may range from 1 to 25 nanometers.

Figure 5D:
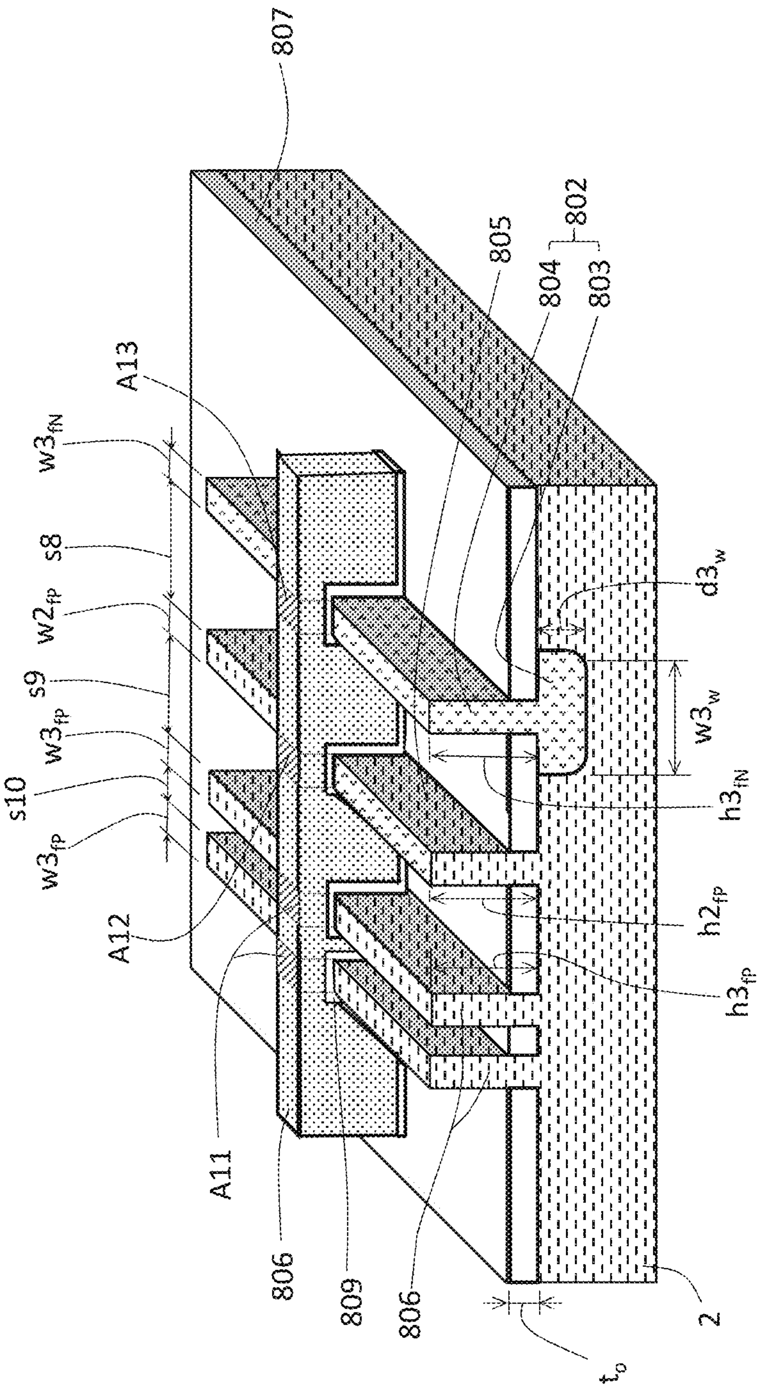

Alternatively, FIG. 5D is a schematically perspective view showing a structure of a fifth type of non-volatile memory cell in accordance with an embodiment of the present application. For an element indicated by the same reference number shown in FIGS. 5B and 5D, the specification of the element as seen in FIG. 5D may be referred to that of the element as illustrated in FIG. 5B. The difference between the circuits illustrated in FIG. 5B and the circuits illustrated in FIG. 5D is mentioned as below. Referring to FIG. 5D, a plurality of the second P-type fin 806 arranged in parallel to each other or one another may be formed to vertically protrude from the P-type substrate 2, wherein each of the second P-type fins 806 may have substantially the same height $h3_{fP}$ between 10 and 200 nanometers and substantially the same width $w3_{fP}$ between 1 and 100 nanometers, wherein the combination of the second P-type fins 806 may be made for a N-type fin field-effect transistor (FinFET). The space s9 between the first P-type fin 805 and one of the second P-type fins 806 next to the first P-type fin 805 may range from 100 to 2,000 nanometers. A space s10 between neighboring two of the second P-type fins 806 may range from 2 to 200 nanometers. The second P-type fins 806 may have the number between 1 and 10 and for example the number of two in this case. The floating gate 808 may transversely extend over the field oxide 807 and from the N-type fin 804 to the second N-type fins 806 across over the first P-type fin 805, wherein the floating gate 808 may have an eleventh total area A11 vertically over the second P-type fins 806, which may be greater than or equal to a twelfth total area A12 thereof vertically over the first P-type fin 805 and greater than or equal to a thirteenth total area A13 thereof vertically over the N-type fin 804, wherein the eleventh total area A11 may be equal to between 1 and 10 times or between 1.5 and 5 times of the twelfth total area A12 and, for example, equal to 2 times of the twelfth total area A12, and the eleventh total area A11 may be equal to between 1 and 10 times or between 1.5 and 5 times of the thirteenth total area A13 and, for example, equal to 2 times of the thirteenth total area A13, wherein the eleventh total area A11 may range from 1 to 2,500 square nanometers, the twelfth total area A12 may range from 1 to 2,500 square nanometers and the thirteenth total area A13 may range from 1 to 2,500 square nanometers.

Referring to FIGS. 5A-5D, the N-type fin 804 may be doped with P-type atoms, such as boron atoms, so as to form two $P^+$ portions in the N-type fin 804 at two opposite sides of the gate oxide 809, acting as source and drain terminals of a P-type metal-oxide-semiconductor (MOS) transistor 830 respectively, wherein the boron atoms in the N-type fin 804 may have a concentration greater than those in the P-type silicon substrate 2. The first P-type fin 805 may be doped with N-type atoms, such as arsenic atoms, so as to form two $N^+$ portions in the first P-type fin 805 at two opposite sides of the gate oxide 809, composing two respective ends of a channel of a first N-type metal-oxide-semiconductor (MOS) transistor 850, wherein the arsenic atoms in the first P-type fin 805 may have a concentration greater than those in the N-type well 803. Each of the one or more second P-type fins 806 may be doped with N-type atoms, such as arsenic atoms, so as to form two $N^+$ portions in said each of the one or more second P-type fins 806 at two opposite sides of the gate oxide 809, composing two respective ends of a channel of a second N-type metal-oxide-semiconductor (MOS) transistor 840. Alternatively, the multiple $N^+$ portions in the multiple second P-type fins 806 at one side of the gate oxide 809 as seen in FIG. 5D may couple to each other or one another to compose an end of a channel of a second N-type metal-oxide-semiconductor (MOS) transistor 840 as seen in FIG. 5A, and the multiple $N^+$ portions in the multiple second P-type fins 806 at the other side of the gate oxide 809 as seen in FIG. 5D may couple to each other or one another to compose the other end of the channel of the second N-type metal-oxide-semiconductor (MOS) transistor 840 as seen in FIG. 5A. The arsenic atoms in the second P-type fins 806 may have a concentration greater than those in the N-type well 803. Thereby, the second N-type MOS transistor 840 may have a capacitance greater than or equal to that of the first N-type MOS transistor 850 and greater than or equal to that of the P-type MOS transistor 830. The capacitance of the second N-type MOS transistor 840 may be equal to between 1 and 10 times or between 1.5 and 5 times of the capacitance of the first N-type MOS transistor 850 and, for example, equal to 2 times of the capacitance of the P-type MOS transistor 830. The capacitance of the second N-type MOS transistor 840 may be equal to between 1 and 10 times or between 1.5 and 5 times of the capacitance of the P-type MOS transistor 830 and, for example, equal to 2 times of the capacitance of the P-type MOS transistor 830. The capacitance of the first N-type MOS transistor 850 may range from 0.1 aF to 10 fF, the capacitance of the second N-type MOS transistor 840 may range from 0.1 aF to 10 fF, and the capacitance of the P-type MOS transistor 830 may range from 0.1 aF to 10 fF.

Referring to FIGS. 5A-5D, the floating gate 808 coupling a gate terminal of the first N-type MOS transistor 850, a gate terminal of the second N-type MOS transistor 840 and a gate terminal of the P-type MOS transistor 830 with one another is configured to catch electrons therein. The P-type transistor 830 is configured to form the channel with one of its two ends coupling to a node N3 coupling to the N-type stripe 802 and the other of its two ends coupling to a node N0. The first N-type transistor 850 is configured to form the channel with one of its two ends coupling to a node N4 coupling to the P-type silicon substrate 2 and the other of its two ends coupling to the node N0. The second N-type transistor 840 is configured to form the channel with one of its two ends coupling to the node N4 coupling to the P-type silicon substrate 2 and the other of its two ends coupling to a node N2.

Referring to FIGS. 5A-5D, when the floating gate 808 is being erased, (1) the node N3 may couple to the N-type stripe 802 switched to couple to the erasing voltage $V_{Er}$, (2) the node N2 may be switched to couple to the voltage Vss of ground reference, (3) the node N4 may couple to the P-type silicon substrate 2 at the voltage Vss of ground reference and (4) the node N0 may be switched to be floating. Since the gate capacitance of the P-type MOS transistor 830 is smaller than the sum of the gate capacitances of the first and second N-type MOS transistors 850 and 840, the voltage difference between the floating gate 808 and the node N3 is large enough to cause electron tunneling. Accordingly, electrons trapped in the floating gate 808 may tunnel through the gate oxide 809 to the node N3. Thereby, the floating gate 808 may be erased to a logic level of “1”.

Referring to FIGS. 5A-5D, after the fifth type of non-volatile memory cell 800 is erased, the floating gate 808 may be charged to a logic level of “1” to turn on the first and second N-type MOS transistors 850 and 840 and off the P-type MOS transistor 830. In this situation, when the floating gate 808 is being programmed, (1) the node N3 may couple to the N-type stripe 802 switched to couple to the programming voltage $V_{Pr}$, (2) the node N2 may be switched to couple to the programming voltage $V_{Pr}$, (3) the node N4 may couple to the P-type silicon substrate 2 at the voltage Vss of ground reference and (4) the node N0 may be switched to be floating. Accordingly, electrons may pass from the node N4 to the node N2 through the channel of the second N-type MOS transistor 840, in which some hot electrons may be induced from these electrons to jump or inject to the floating gate 808 through the gate oxide 809 to be trapped in the floating gate 808. Thereby, the floating gate 808 may be programmed to a logic level of “0”.

Referring to FIGS. 5A-5D, for operation of the non-volatile memory cell 800, (1) the node N2 may be switched to be floating, (2) the node N4 may couple to the P-type silicon substrate 2 at the voltage Vss of ground reference, (3) the node N3 may couple to the N-type stripe 802 switched to couple to the voltage Vcc of power supply and (4) the node N0 may be switched to act as an output of the non-volatile memory cell 800. When the floating gate 808 is charged to a logic level of “A”, the P-type MOS transistor 830 may be turned off and the first N-type MOS transistor 850 may be turned on to couple the node N4 coupling to the voltage Vss of ground reference to the node N0 switched to act as the output of the non-volatile memory cell 800 through the channel of the first N-type MOS transistor 850. Thereby, the output of the non-volatile memory cell 800 at the node N0 may be at a logic level of “0”. When the floating gate 808 is discharged to a logic level of “0”, the first P-type MOS transistor 830 may be turned on and the first N-type MOS transistor 850 may be turned off to couple the node N3 switched to couple to the voltage Vcc of power supply to the node N0 switched to act as the output of the non-volatile memory cell 800 through the channel of the P-type MOS transistor 830. Thereby, the output of the non-volatile memory cell 800 at the node N0 may be at a logic level of “A”.

Figure 5E:
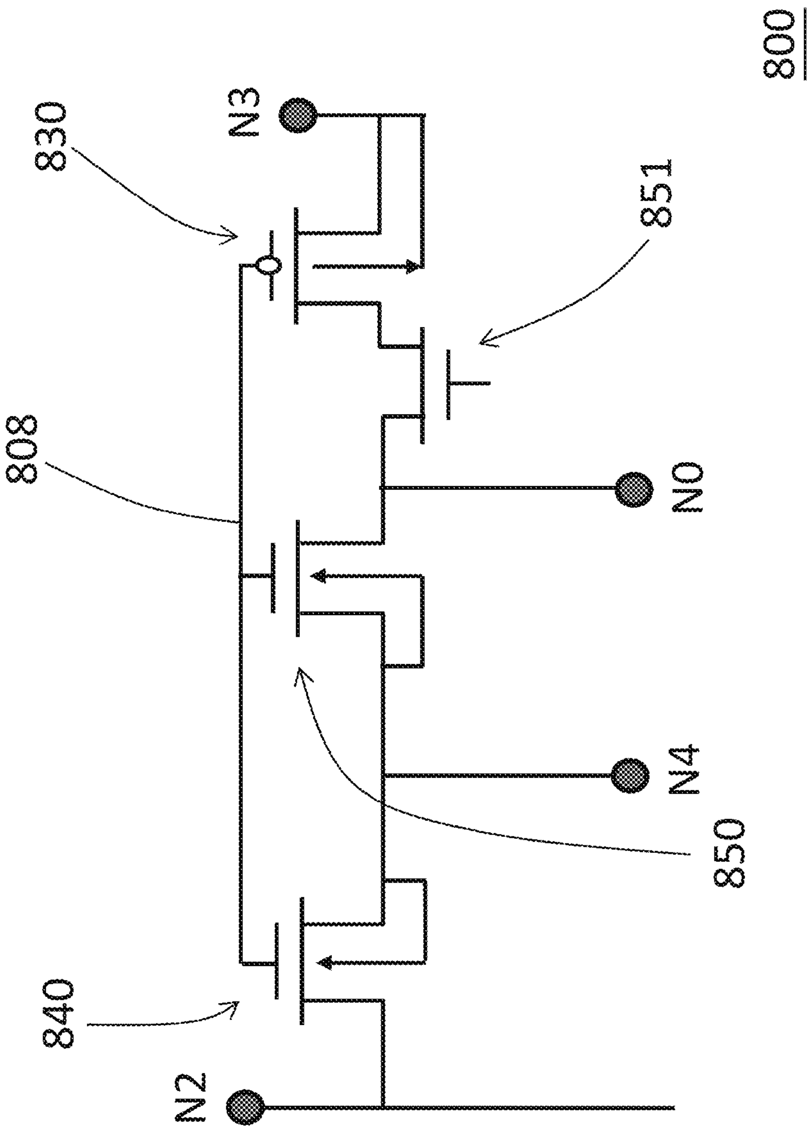

Alternatively, FIG. 5E is a circuit diagram illustrating a fifth type of non-volatile memory cell in accordance with an embodiment of the present application. The erasing, programming and operation of the non-volatile memory cell of the fifth type as seen in FIG. 5E may be referred to those as illustrated in FIGS. 5A-5D. For an element indicated by the same reference number shown in FIGS. 5A-5E, the specification of the element as seen in FIG. 5E may be referred to that of the element as illustrated in FIGS. 5A-5D. The difference therebetween is mentioned as below. Referring to FIG. 5E, the fifth type of non-volatile memory cell 800 may further include a switch 851, such as N-type MOS transistor, between the drain terminal, in operation, of the P-type MOS transistor 830 and the node N0. The N-type MOS transistor 851 may be configured to form a channel with an end coupling to the drain terminal, in operation, of the P-type MOS transistor 830 and the other end coupling to the node N0. When the fifth type of non-volatile memory cell 800 is being erased, the N-type MOS transistor 851 may have a gate terminal switched to couple to the voltage Vss of ground reference to turn off its channel to disconnect the drain terminal, in operation, of the P-type MOS transistor 830 from the node N0. In this case, the node N0 may be alternatively switched to couple to the voltage Vss of ground reference. Accordingly, a current flow may be prevented from being leaked from the node N3 to the node N4. When the fifth type of non-volatile memory cell 800 is being programmed, the gate terminal of the N-type MOS transistor 851 may be switched to couple to the voltage Vss of ground reference to turn off its channel to disconnect the drain terminal, in operation, of the P-type MOS transistor 830 from the node N0. Accordingly, a current flow may be prevented from being leaked from the node N3 to the node N4. When the fifth type of non-volatile memory cell 800 is being operated, the gate terminal of the N-type MOS transistor 851 may be switched to couple to the voltage Vcc of power supply to turn on its channel to couple the drain terminal, in operation, of the P-type MOS transistor 830 to the node N0.

Alternatively, referring to FIG. 5E, the switch 851 may be a P-type MOS transistor configured to form a channel with an end coupling to the drain terminal, in operation, of the P-type MOS transistor 830 and the other end coupling to the node N0. When the fifth type of non-volatile memory cell 800 is being erased, the P-type MOS transistor 851 may have a gate terminal switched to couple to the erasing voltage $V_{Er}$ to turn off its channel to disconnect the drain terminal, in operation, of the P-type MOS transistor 830 from the node N0. Accordingly, a current flow may be prevented from being leaked from the node N3 to the node N4. When the fifth type of non-volatile memory cell 800 is being operated, the gate terminal of the P-type MOS transistor 851 may be switched to couple to the voltage Vss of ground reference to turn on its channel to couple the drain terminal, in operation, of the P-type MOS transistor 830 to the node N0.

Figure 5F:
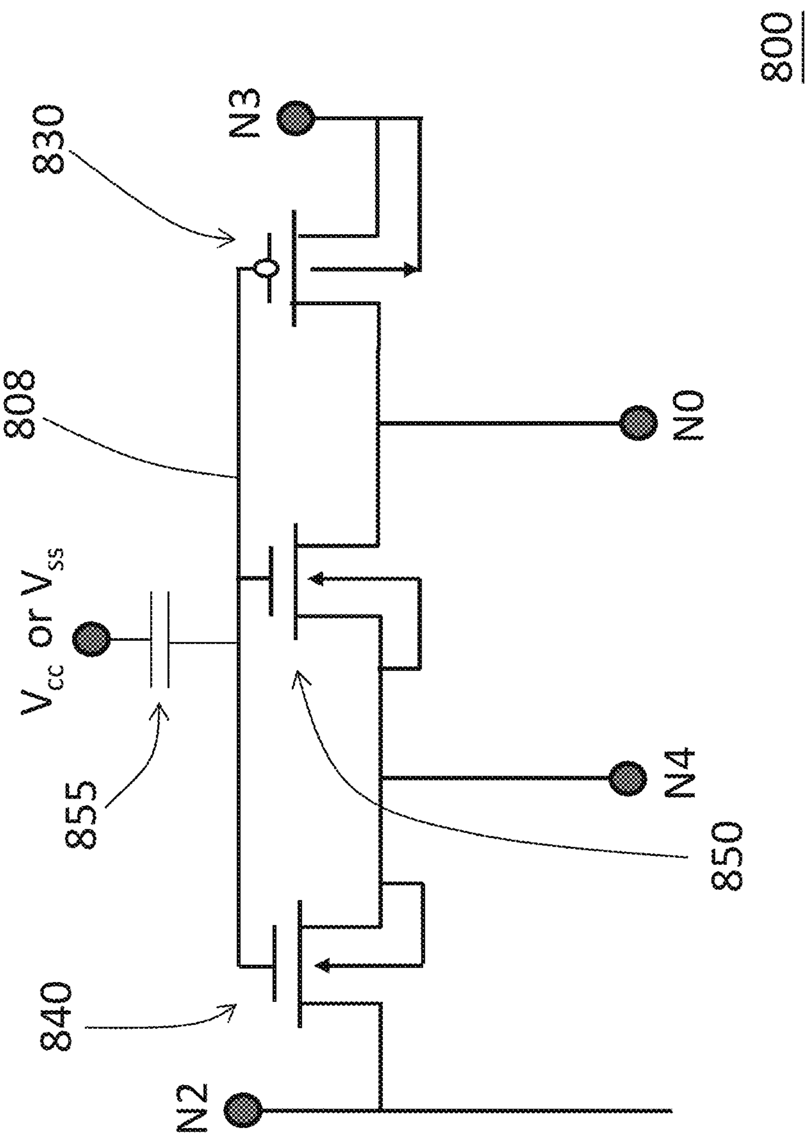

Alternatively, FIG. 5F is a circuit diagram illustrating a fifth type of non-volatile memory cell in accordance with an embodiment of the present application. The erasing, programming and operation of the non-volatile memory cell of the fifth type as seen in FIG. 5F may be referred to those as illustrated in FIGS. 5A-5D. For an element indicated by the same reference number shown in FIGS. 5A-5D and 5F, the specification of the element as seen in FIG. 5F may be referred to that of the element as illustrated in FIGS. 5A-5D. The difference therebetween is mentioned as below. Referring to FIG. 5F, the fifth type of non-volatile memory cell 800 as illustrated in FIGS. 5A-5E may further include a parasitic capacitor 855 having a first terminal coupling to the floating gate 808 and a second terminal coupling to the voltage Vcc of power supply or to the voltage Vss of ground reference. The structures as illustrated in FIG. 5A are taken as an example herein to be incorporated with the parasitic capacitor 855. Referring to FIG. 5F, the parasitic capacitor 855 may have a capacitance greater than a gate capacitance of the P-type MOS transistor 830, than a gate capacitance of the first N-type MOS transistor 850 and than a gate capacitance of the second N-type MOS transistor 840. For example, the capacitance of the parasitic capacitor 855 may be equal to between 1 and 10,000 times of the gate capacitance of the P-type MOS transistor 830, between 1 and 10,000 times of the gate capacitance of the second N-type MOS transistor 840 and to between 1 and 10,000 times of the gate capacitance of the first N-type MOS transistor 850. The capacitance of the parasitic capacitor 855 may range from 0.1 aF to 1 pF. Thereby, more electric charges or electrons may be stored in the floating gate 808.

For the fifth type of non-volatile memory cells 800 as illustrated in FIGS. 5A-5F, the erasing voltage $V_{Er}$ may be greater than or equal to the programming voltage $V_{Pr}$ that may be greater than or equal to the voltage Vcc of power supply. The erasing voltage $V_{Er}$ may range from 5 volts to 0.25 volts, the programming voltage $V_{Pr}$ may range from 5 volts to 0.25 volts, and the voltage Vcc of power supply may range from 3.5 volts to 0.25 volts, such as 0.75 volts or 3.3 volts.

(6) Sixth Type of Non-Volatile Memory Cells

Figure 6A:
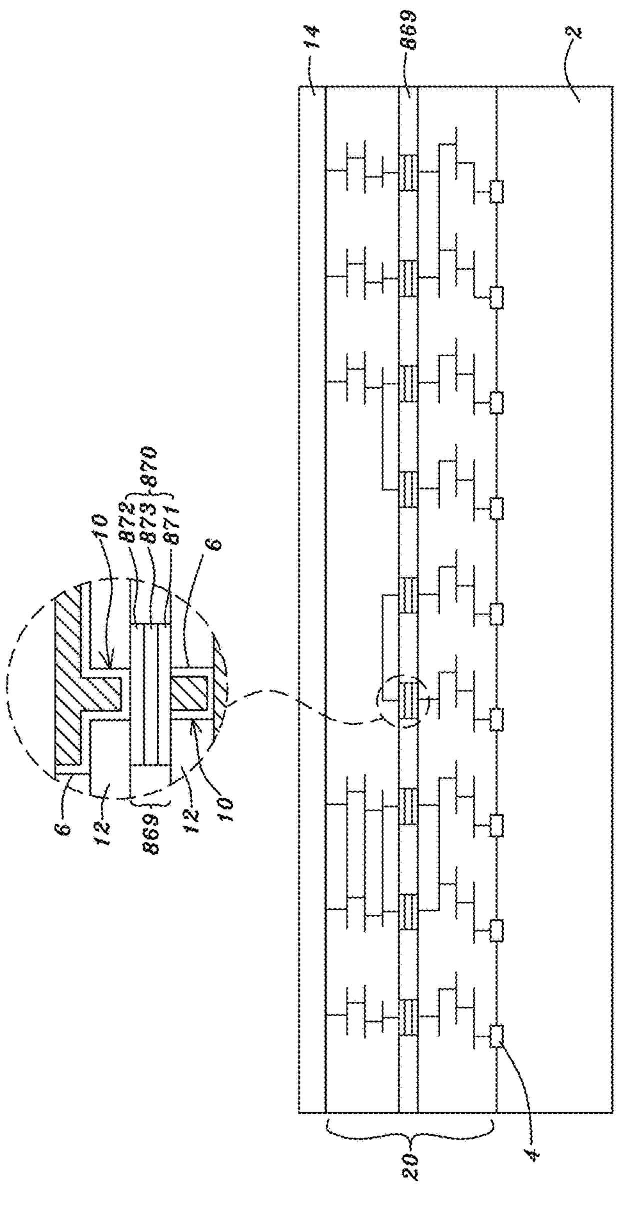
FIGS. 6A-6C are schematically cross-sectional views showing various structures of a resistive random access memory (RRAM) in accordance with an embodiment of the present application.
Figure 6C:
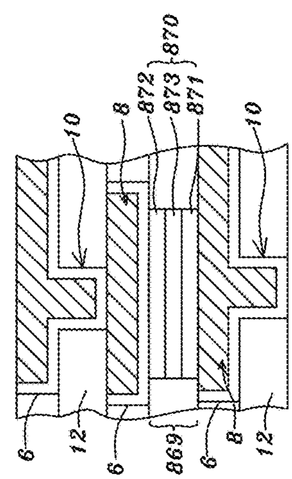
Figure 6B:
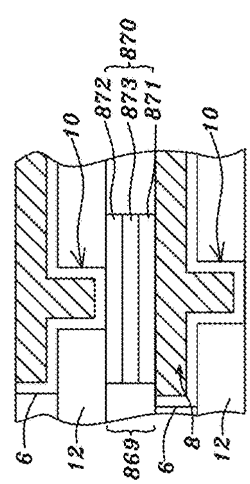

FIGS. 6A-6C are schematically cross-sectional views showing various structures of non-volatile memory cells of a sixth type for a semiconductor chip in accordance with an embodiment of the present application. The sixth type of non-volatile memory cells may be resistive random access memories (RRAM), i.e., programmable resistors. Referring to FIG. 6A, a semiconductor chip 100, used for the FPGA IC chip 200 for example, may include multiple resistive random access memories 870 formed in an RRAM layer 869 thereof over a semiconductor substrate 2 thereof, in a first interconnection scheme 20 for the semiconductor chip 100 (FISC) and under a passivation layer 14 thereof. Multiple interconnection metal layers 6 in the FISC 20 and between the RRAM layer 869 and semiconductor substrate 2 may couple the resistive random access memories 870 to multiple semiconductor devices 4 on the semiconductor substrate 2. Multiple interconnection metal layers 6 in the FISC 20 and between the RRAM layer 869 and passivation layer 14 may couple the resistive random access memories 870 to external circuits outside the semiconductor chip 100 and may have a line pitch less than 0.5 micrometers. Each of the interconnection metal layers 6 in the FISC 20 and over the RRAM layer 869 may have a thickness greater than each of the interconnection metal layers 6 in the FISC 20 and under the RRAM layer 869. The details for the semiconductor substrate 2, semiconductor devices 4, interconnection metal layers 6, FISC 20 and passivation layer 14 may be referred to the illustration in FIGS. 22A-22Q.

Referring to FIG. 6A, each of the resistive random access memories 870 may have (i) a bottom electrode 871 made of titanium nitride, tantalum nitride, copper or an aluminum alloy having a thickness between 1 and 20 nanometers, (ii) a top electrode 872 made of titanium nitride, tantalum nitride, copper or an aluminum alloy having a thickness between 1 and 20 nanometers, and (iii) a resistive layer 873 having a thickness between 1 and 20 nanometers between the bottom and top electrodes 871 and 872, wherein the resistive layer 873 may be composed of composite layers of various materials including a colossal magnetoresistance (CMR) material such as $La_{1-x}Ca_xMnO_3$ (0<x<1), $La_{1-x}Sr_xMnO_3$ (0<x<1) or $Pr_{0.7}Ca_{0.3}MnO_3$, a polymer material such as poly(vinylidene fluoride trifluoroethylene), i.e., P(VDF-TrFE), a conductive-bridging random-access-memory (CBRAM) material such as Ag—GeSe based material, a doped metal oxide such as Nb-doped $SrZrO_3$, or a binary metal oxide such as WOx (0<x<1), NiO, $TiO_2$ or $HfO_2$, or a metal such as titanium.

For example, referring to FIG. 6A, the resistive layer 873 may include an oxide layer on the bottom electrode 871, in which conductive filaments or paths may be formed depending on the applied electric voltages. The oxide layer of the resistive layer 873 may comprise, for example, hafnium oxide ($HfO_2$) or tantalum oxide $Ta_2O_5$ having a thickness of 5 nm, 10 nm or 15 nm or between 1 nm and 30 nm, 3 nm and 20 nm, or 5 nm and 15 nm. The oxide layer of the resistive layer 873 may be formed by atomic-layer-deposition (ALD) methods. The resistive layer 873 may further include an oxygen reservoir layer, which may capture the oxygen atoms from the oxide layer, on its oxide layer. The oxygen reservoir layer may comprise titanium (Ti) or tantalum (Ta) to capture the oxygen atoms from the oxide layer to form $TiO_x$ or $TaO_x$. The oxygen reservoir layer may have a thickness between 1 nm and 25 nm, or 3 nm and 15 nm, such as 2 nm, 7 nm or 12 nm. The oxygen reservoir layer may be formed by atomic-layer-deposition (ALD) methods. The top electrode 872 is formed on the oxygen reservoir layer of the resistive layer 873.

For example, referring to FIG. 6A, the resistive layer 873 may include a layer of $HfO_2$ having a thickness between 1 and 20 nanometers on the bottom electrode 871, a layer of titanium dioxide having a thickness between 1 and 20 nanometers on the layer of $HfO_2$ and a titanium layer having a thickness between 1 and 20 nanometers on the layer of titanium dioxide. The top electrode 872 is formed on the titanium layer of the resistive layer 873.

Figure 22A:
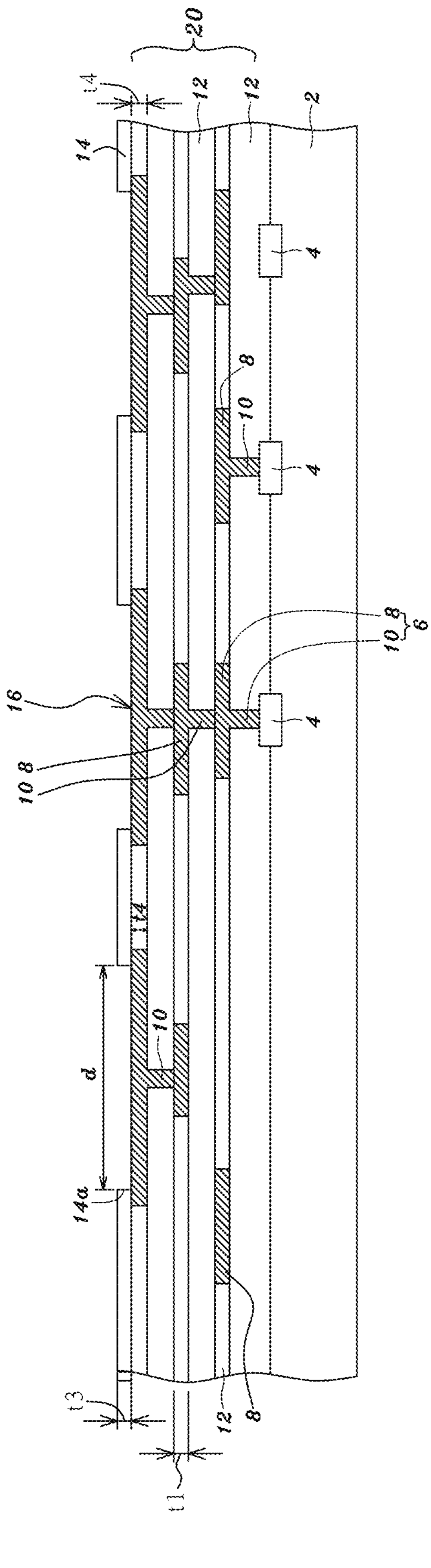
FIG. 22A is a cross-sectional view of a semiconductor wafer in accordance with an embodiment of the present application.
Figure 22B:
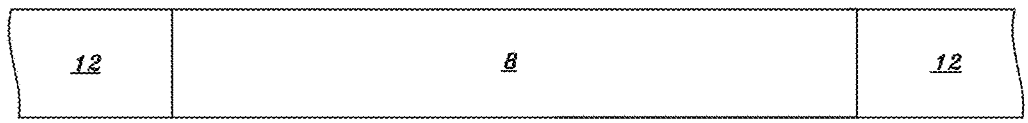
FIGS. 22B-22H are cross-sectional views showing a single damascene process is performed to form a first interconnection scheme in accordance with an embodiment of the present application.
Figure 22C:
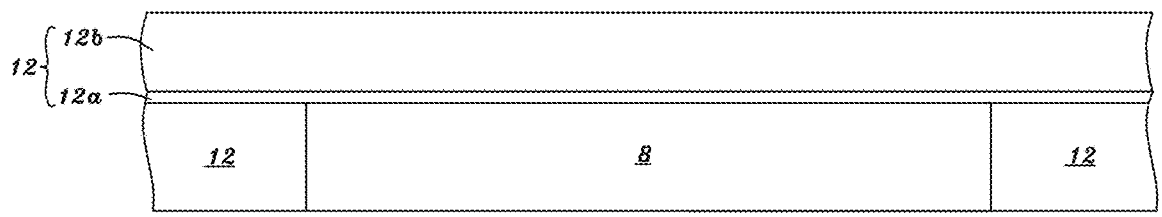
Figure 22D:
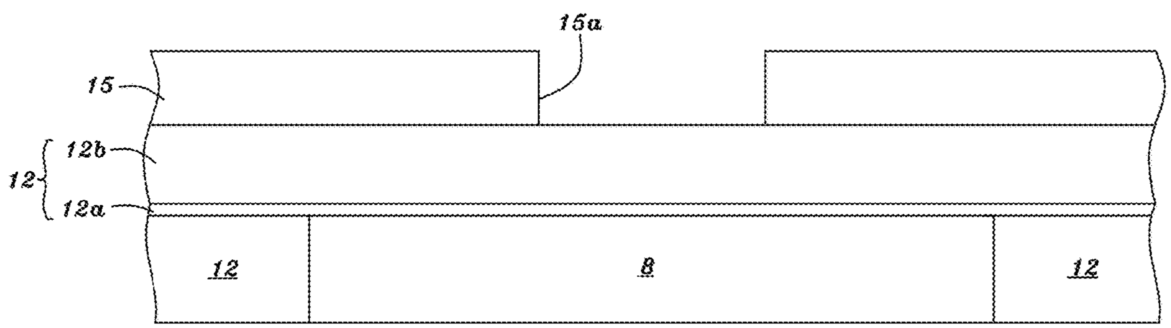
Figure 22E:
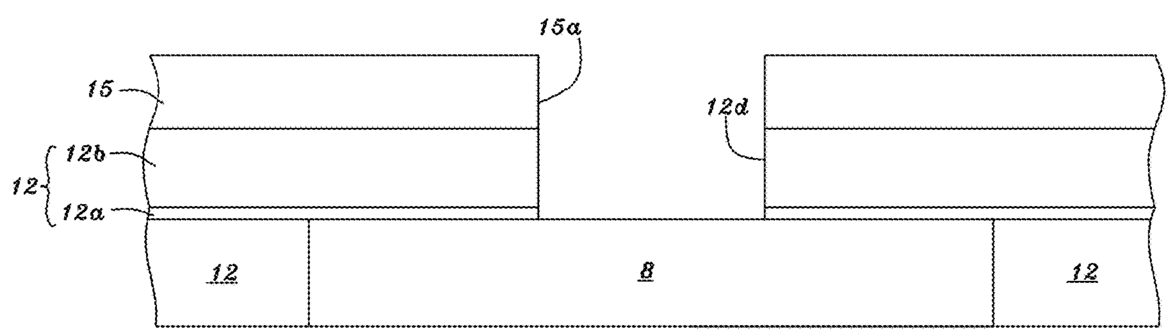
Figure 22F:
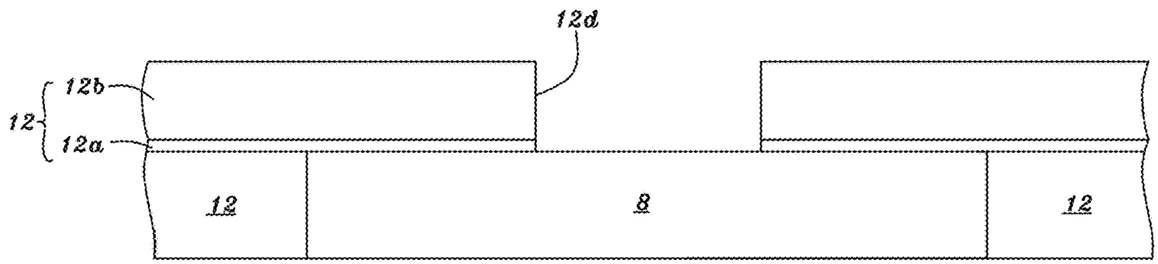
Figure 22G:
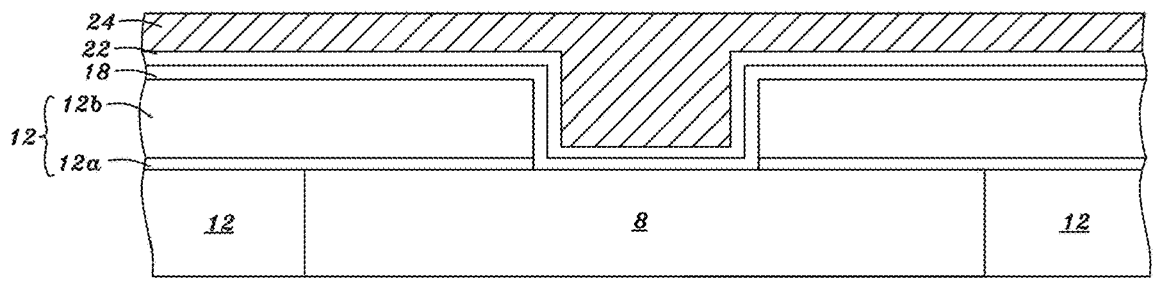
Figure 22H:
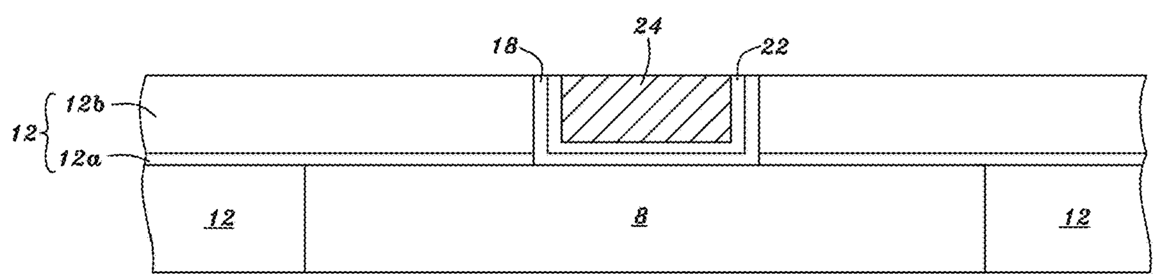
Figure 22I:
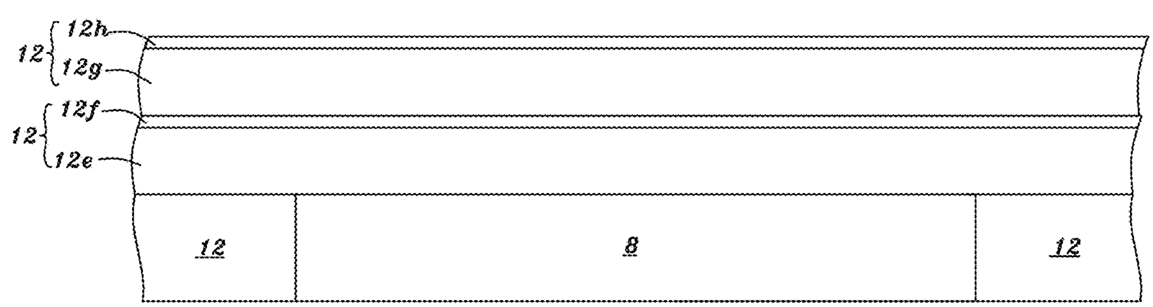
FIGS. 22I-22Q are cross-sectional views showing a double damascene process is performed to form a first interconnection scheme in accordance with an embodiment of the present application.
Figure 22J:
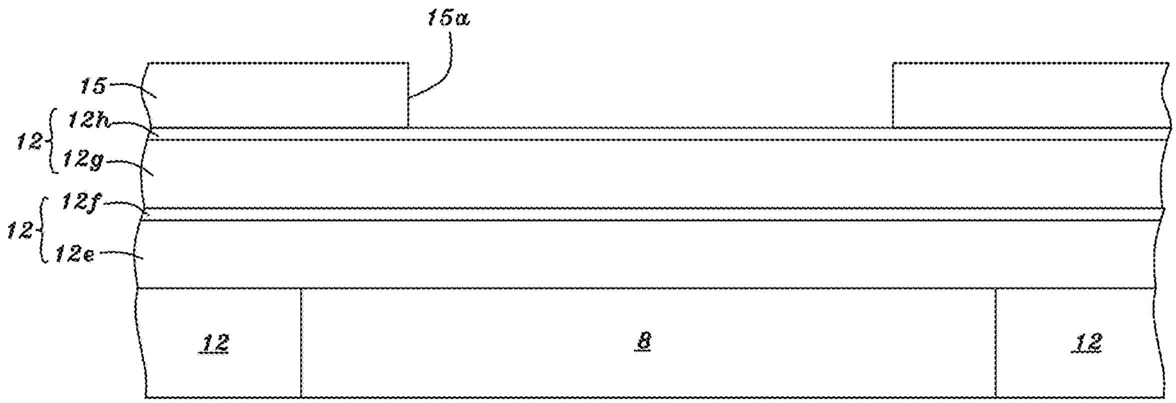
Figure 22K:
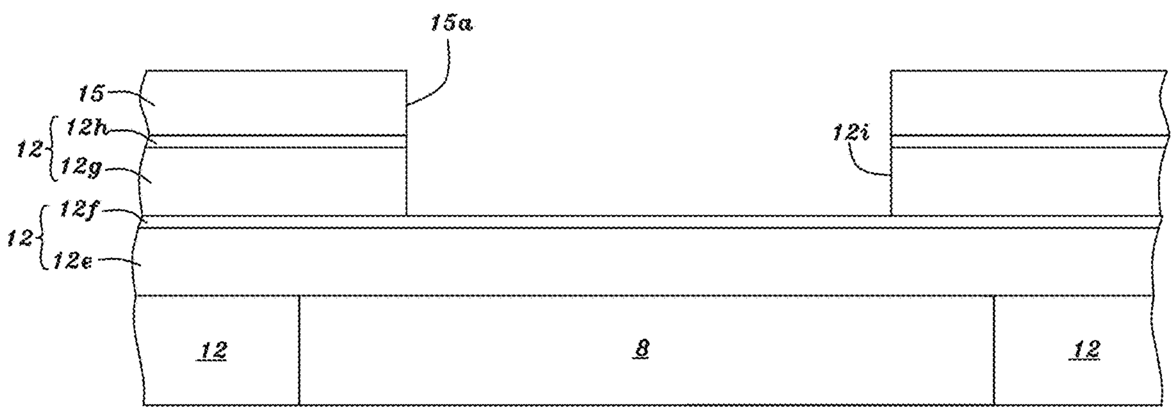
Figure 22L:
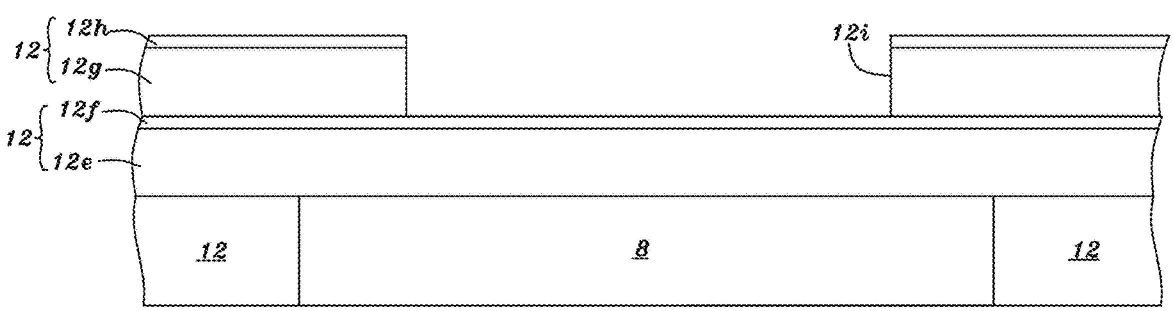
Figure 22M:
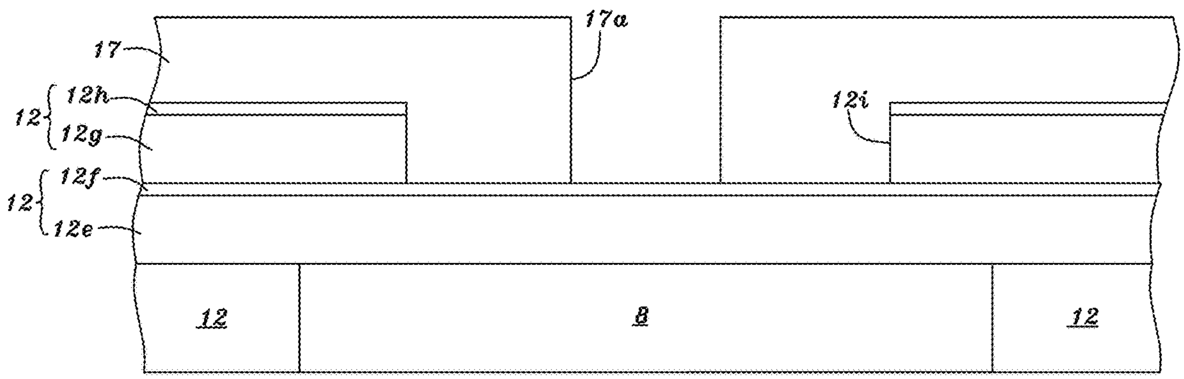
Figure 22N:
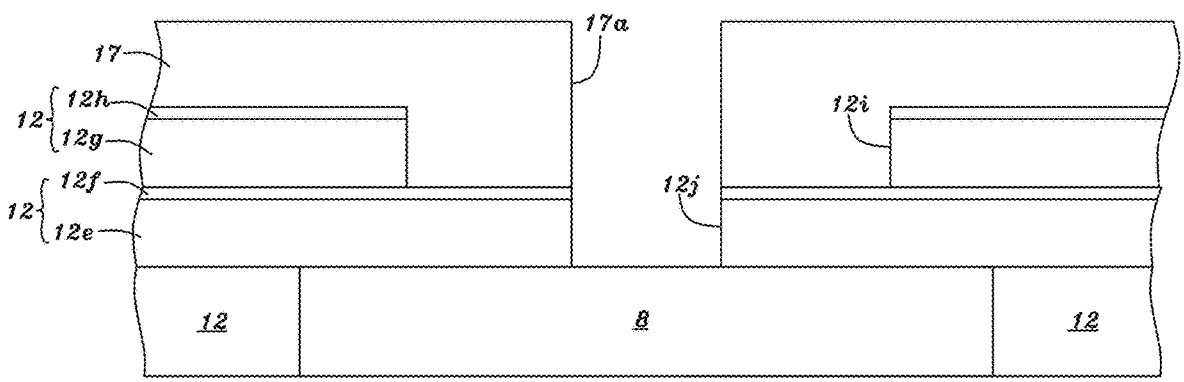
Figure 22O:
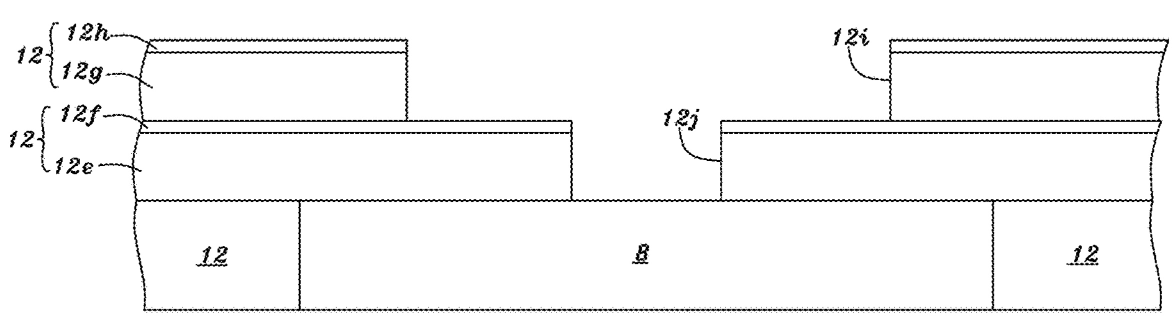
Figure 22P:
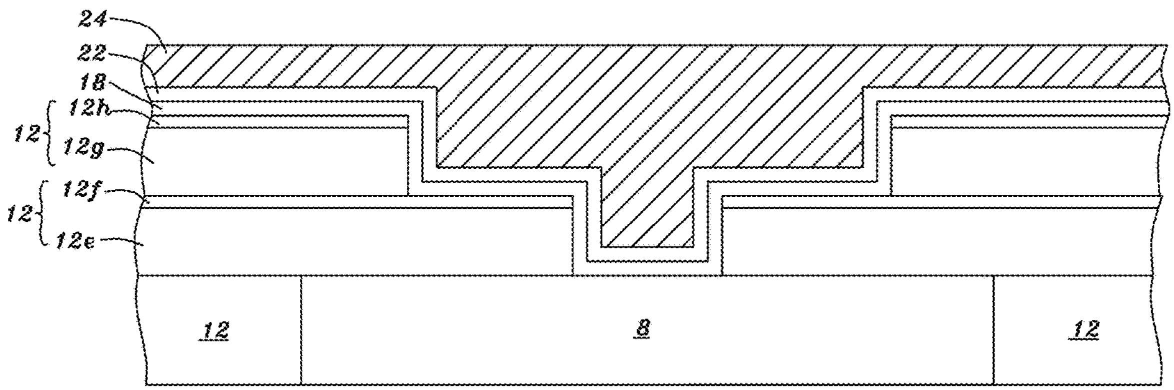
Figure 22Q:
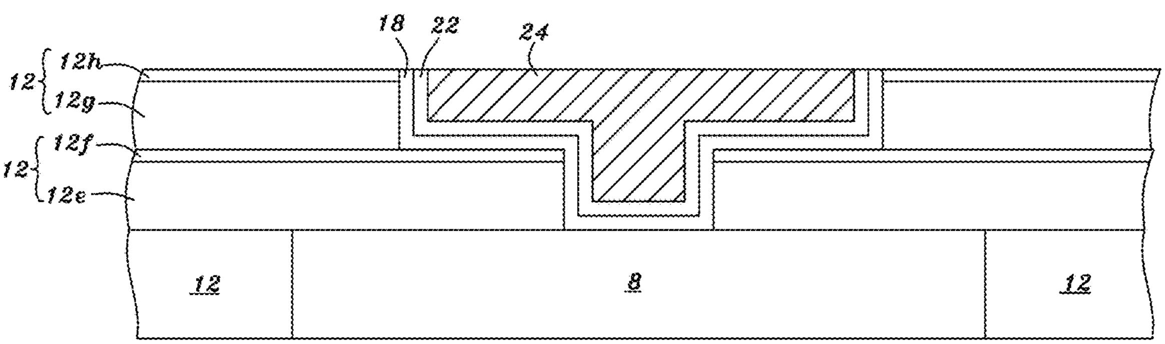

Referring to FIG. 6A, each of the resistive random access memories 870 may have its bottom electrode 871 formed on a top surface of one of the lower metal vias 10 of a lower one of the interconnection metal layers 6 as illustrated in FIGS. 22A-22Q and on a top surface of a lower one of the dielectric layers 12 as illustrated in FIGS. 22A-22Q. An upper one of the dielectric layers 12 as illustrated in FIGS. 22A-22Q may be formed on the top electrode 872 of said one of the resistive random access memories 870 and an upper one of the interconnection metal layers 6 as illustrated in FIGS. 22A-22Q may have the upper metal vias 10 each formed in the upper one of the dielectric layers 12 and on the top electrode 872 of one of the resistive random access memories 870.

Alternatively, referring to FIG. 6B, each of the resistive random access memories 870 may have its bottom electrode 871 formed on a top surface of one of the lower metal pads 8 of a lower one of the interconnection metal layers 6 as illustrated in FIGS. 22A-22Q. An upper one of the dielectric layers 12 as illustrated in FIGS. 22A-22Q may be formed on the top electrode 872 of said one of the resistive random access memories 870 and an upper one of the interconnection metal layers 6 as illustrated in FIGS. 22A-22Q may have the upper metal vias 10 each formed in the upper one of the dielectric layers 12 and on the top electrode 872 of one of the resistive random access memories 870.

Alternatively, referring to FIG. 6C, each of the resistive random access memories 870 may have its bottom electrode 871 formed on a top surface of one of the lower metal pads 8 of a lower one of the interconnection metal layers 6 as illustrated in FIGS. 22A-22Q. An upper one of the interconnection metal layers 6 as illustrated in FIGS. 22A-22Q may have the upper metal pads 8 each formed in an upper one of the dielectric layers 12 and on the top electrode 872 of one of the resistive random access memories 870.

Figure 6D:
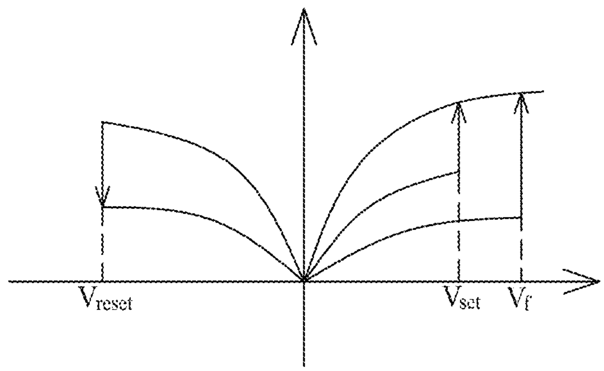
FIG. 6D is a plot showing various states of a resistive random access memory in accordance with an embodiment of the present application.

FIG. 6D is a plot showing various states of a resistive random access memory in accordance with an embodiment of the present application, wherein the x-axis indicates a voltage of a resistive random access memory and the y-axis indicates a log value of a current of a resistive random access memory. Referring to FIGS. 6A and 6B, when the resistive random access memories 870 start to be first used before a resetting or setting step as illustrated in the following paragraphs, a forming step is performed to each of the resistive random access memories 870 to form vacancies in its resistive layer 873 for electrons capable of moving between its bottom and top electrodes 871 and 872 in a low resistant manner. When each of the resistive random access memories 870 is being formed, a forming voltage $V_f$ ranging from 0.25 to 3.3 volts is applied to its top electrode 872, and a voltage Vss of ground reference is applied to its bottom electrode 871 such that said each of the resistive random access memories 870 may be formed with a low resistance between 100 and 100,000 ohms.

Referring to FIG. 6D, after the resistive random access memories 870 are formed in the forming step, a resetting step may be performed to one of the resistive random access memories 870. When said one of the resistive random access memories 870 is being reset, a resetting voltage $V_f$ ranging from 0.25 to 3.3 volts may be applied to its bottom electrode 871, and a voltage Vss of ground reference is applied to its top electrode 872 such that said one of the resistive random access memories 870 may be reset with a high resistance between 1,000 and 100,000,000,000 ohms. The forming voltage $V_f$ is greater than the resetting voltage $V_{RE}$.

Referring to FIG. 6D, after the resistive random access memories 870 are reset with the high resistance, a setting step may be performed to one of the resistive random access memories 870. When said one of the resistive random access memories 870 is being set, a setting voltage $V_{SE}$ ranging from 0.25 to 3.3 volts may applied to its top electrode 872, and a voltage Vss of ground reference may be applied to its bottom electrode 871 such that said one of the resistive random access memories 870 may be set with a low resistance between 100 and 100,000 ohms. The forming voltage $V_f$ is greater than the setting voltage $V_{SE}$.

Figure 6E:
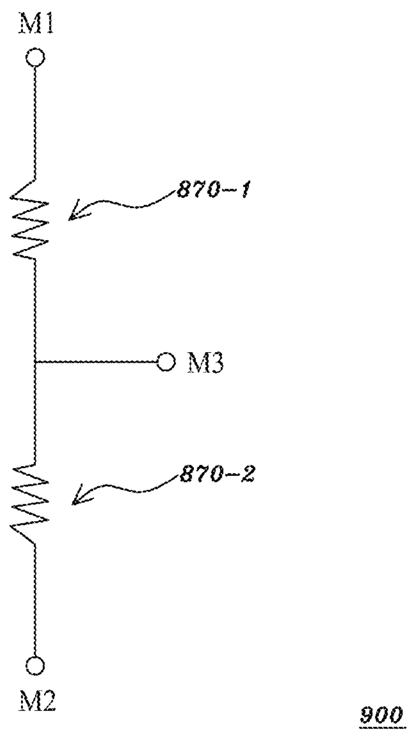
FIG. 6E is a circuit diagram illustrating a first alternative for a sixth type of non-volatile memory cell in accordance with an embodiment of the present application.
Figure 6F:
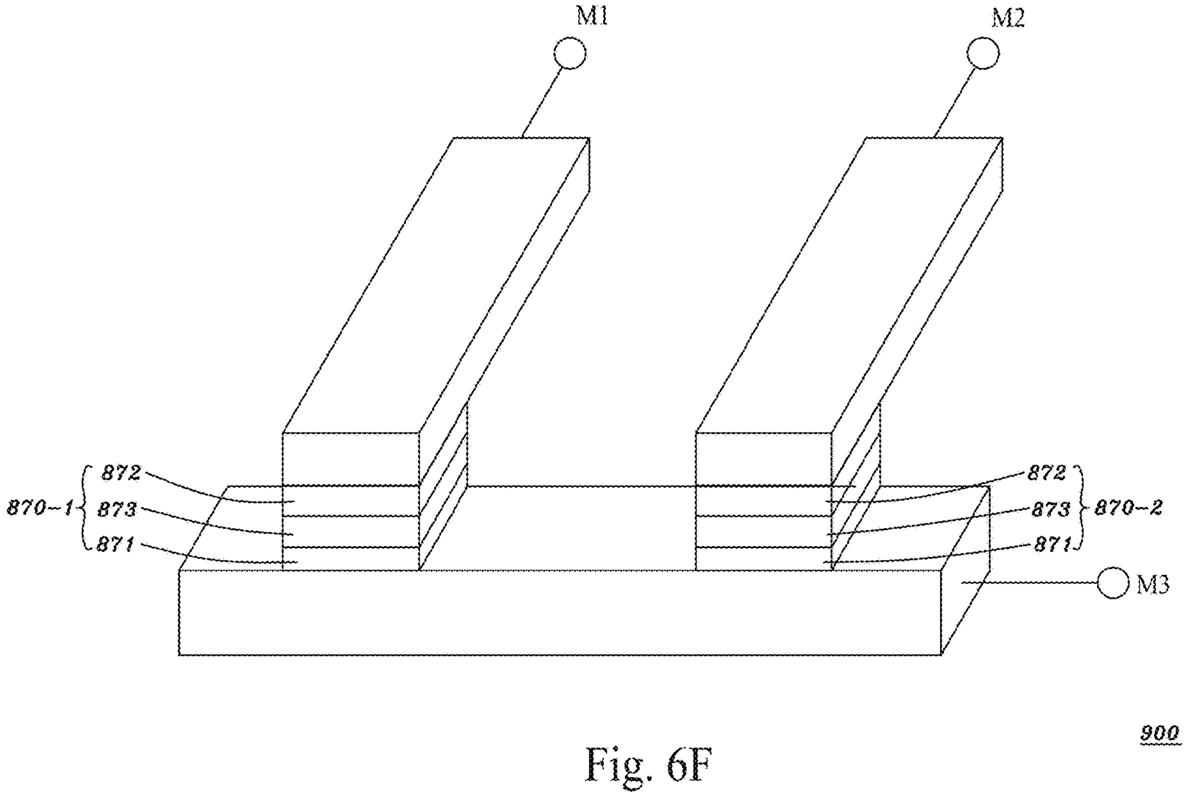
FIG. 6F is a schematically perspective view showing a structure of a sixth type of non-volatile memory cell in accordance with an embodiment of the present application.

FIG. 6E is a circuit diagram illustrating a sixth type of non-volatile memory cell in accordance with an embodiment of the present application. FIG. 6F is a schematically perspective view showing a structure of a sixth type of non-volatile memory cell in accordance with an embodiment of the present application. Referring to FIGS. 6E and 6F, two of the resistive random access memories 870, called as 870-1 and 870-2 hereinafter, may be provided for the non-volatile memory cell 900 of the sixth type, i.e., complementary RRAM cell, abbreviated as CRRAM. The resistive random access memory 870-1 may have its bottom electrode 871 coupling to the bottom electrode 871 of the resistive random access memory 870-2 and to a node M3 of the non-volatile memory cell 900 of the sixth type. The resistive random access memory 870-1 may have its top electrode 872 coupling to a node M1, and the resistive random access memory 870-2 may have its top electrode 872 coupling to a node M2.

Referring to FIGS. 6E and 6F, when the forming step is performed to the resistive random access memories 870-1 and 870-2, (1) the nodes M1 and M2 may be switched to couple to the forming voltage $V_f$ between 0.25 and 3.3 volts, greater than a voltage Vcc of power supply, and (2) the node M3 may be switched to couple to the voltage Vss of ground reference. Thereby, an electrical current may pass from the top electrode 872 of the resistive random access memory 870-1 to the bottom electrode 871 of the resistive random access memory 870-1 in a first forward direction to form vacancies in the resistive layer 873 of the resistive random access memory 870-1 and thus the resistive random access memory 870-1 may be formed with a first low resistance between 100 and 100,000 ohms. An electrical current may pass from the top electrode 872 of the resistive random access memory 870-2 to the bottom electrode 871 of the resistive random access memory 870-2 in a second forward direction to form vacancies in the resistive layer 873 of the resistive random access memory 870-2 and thus the resistive random access memory 870-2 may be formed with a second low resistance between 100 and 100,000 ohms. The second low resistance may be equal to or nearly equal to the first low resistance. Alternatively, a ratio value of a difference between the first and second low resistances to a greater one of the first and second low resistances may be less than 50%.

In a first condition, referring to FIGS. 6E and 6F, a resetting step may be performed to the resistive random access memory 870-2 after formed in the forming step. In the resetting step for the resistive random access memory 870-2, (1) the node M1 may be switched to couple to a programming voltage $V_{Pr}$, between 0.25 and 3.3 volts, equal to or greater than the resetting voltage $V_{RE}$ of the resistive random access memory 870-2 and greater than the voltage Vcc of power supply, (2) the node M2 may be switched to couple to the voltage Vss of ground reference and (3) the node M3 may be switched to be floating. Thereby, an electrical current may pass from the bottom electrode 871 of the resistive random access memory 870-2 to the top electrode 872 of the resistive random access memory 870-2 in a second backward direction opposite to the second forward direction to reduce the vacancies in the resistive layer 873 of the resistive random access memory 870-2 and thus the resistive random access memory 870-2 may be reset with a first high resistance between 1,000 and 100,000,000,000 ohms in the resetting step. The resistive random access memory 870-1 is kept in the first low resistance. The first high resistance may be equal to between 1.5 and 10,000,000 times of the first low resistance. Thereby, the sixth type of non-volatile memory cell 900 may have the voltage at the node M3 to be programmed with a logic level of "1", wherein the node M3 in operation may act as an output of the non-volatile memory cell 900 of the sixth type.

In a second condition, referring to FIGS. 6E and 6F, a resetting step may be performed to the resistive random access memory 870-1 after formed in the forming step. In the resetting step for the resistive random access memory 870-1, (1) the node M2 may be switched to couple to the programming voltage $V_{Pr}$, between 0.25 and 3.3 volts, equal to or greater than the resetting voltage $V_R$ of the resistive random access memory 870-1 and greater than the voltage Vcc of power supply, (2) the node M1 may be switched to couple to the voltage Vss of ground reference and (3) the node M3 may be switched to be floating. Thereby, an electrical current may reversely pass from the bottom electrode 871 of the resistive random access memory 870-1 to the top electrode 872 of the resistive random access memory 870-1 in a first backward direction opposite to the first forward direction to form relatively few vacancies in the resistive layer 873 of the resistive random access memory 870-1 and thus the resistive random access memory 870-1 may be reset with a second high resistance between 1,000 and 100,000,000,000 ohms in the resetting step. The resistive random access memory 870-2 is kept in the second low resistance. The second high resistance may be equal to between 1.5 and 10,000,000 times of the second low resistance. Thereby, the sixth type of non-volatile memory cell 900 may have the voltage at the node M3 to be programmed with a logic level of "0", wherein the node M3 in operation may act as an output of the non-volatile memory cell 900 of the sixth type.

Referring to FIGS. 6E and 6F, after the sixth type of non-volatile memory cell 900 is programmed with a logic level of "1" as illustrated in the first condition, the sixth type of non-volatile memory cell 900 may be programmed with a logic level of "0" for a third condition. In the third condition, the resistive random access memory 870-1 may be reset with a third high resistance in a resetting step, and the resistive random access memory 870-2 may be set with a third low resistance in a setting step. In the resetting step for the resistive random access memory 870-1 and the setting step for the resistive random access memory 870-2, (1) the node M2 may be switched to couple to the programming voltage $V_{Pr}$, between 0.25 and 3.3 volts, equal to or greater than the resetting voltage $V_{RE}$ of the resistive random access memory 870-1, equal to or greater than the setting voltage $V_{SE}$ of the resistive random access memory 870-2 and greater than the voltage Vcc of power supply, (2) the node M1 may be switched to couple to the voltage Vss of ground reference and (3) the node M3 may be switched to be floating. Thereby, an electrical current may pass from the top electrode 872 of the resistive random access memory 870-2 to the bottom electrode 871 of the resistive random access memory 870-2 in the second forward direction to form more vacancies in the resistive layer 873 of the resistive random access memory 870-2 and thus the resistive random access memory 870-2 may be set with the third low resistance between 100 and 100,000 ohms in the setting step. The electrical current may then pass from the bottom electrode 871 of the resistive random access memory 870-1 to the top electrode 872 of the resistive random access memory 870-1 in the first backward direction to reduce the vacancies in the resistive layer 873 of the resistive random access memory 870-1 and thus the resistive random access memory 870-1 may be reset with the third high resistance between 1,000 and 100,000,000,000 ohms in the resetting step. The third high resistance may be equal to between 1.5 and 10,000,000 times of the third low resistance. Thereby, the sixth type of non-volatile memory cell 900 may have the voltage of the node M3 to be programmed with a logic level of "0", wherein the node M3 in operation may act as an output of the non-volatile memory cell 900 of the sixth type.

Referring to FIGS. 6E and 6F, after the sixth type of non-volatile memory cell 900 is programmed with a logic level of "0" as illustrated in the second condition, the sixth type of non-volatile memory cell 900 may be programmed with a logic level of "1" for a fourth condition. In the fourth condition, the resistive random access memory 870-2 may be reset with a fourth high resistance in the resetting step, and the resistive random access memory 870-1 may be set with a fourth low resistance in the setting step. In the resetting step for the resistive random access memory 870-2 and the setting step for the resistive random access memory 870-1, the node M1 may be switched to couple to a voltage, between 0.25 and 3.3 volts, equal to or greater than the resetting voltage $V_{RE}$ of the resistive random access memory 870-2, equal to or greater than the setting voltage $V_{SE}$ of the resistive random access memory 870-1 and greater than the voltage Vcc of power supply, the node M2 may be switched to couple to the voltage Vss of ground reference and the node M3 may be switched to be floating. Thereby, an electrical current may pass from the top electrode 872 of the resistive random access memory 870-1 to the bottom electrode 871 of the resistive random access memory 870-1 in the first forward direction to form more vacancies in the resistive layer 873 of the resistive random access memory 870-1 and thus the resistive random access memory 870-1 may be set with the fourth low resistance between 100 and 100,000 ohms in the setting step. The electrical current may then pass from the bottom electrode 871 of the resistive random access memory 870-2 to the top electrode 872 of the resistive random access memory 870-2 in the second backward direction to form relatively few vacancies in the resistive layer 873 of the resistive random access memory 870-2 and thus the resistive random access memory 870-2 may be reset with the fourth high resistance between 1,000 and 100,000,000,000 ohms in the resetting step. The fourth high resistance may be equal to between 1.5 and 10,000,000 times of the fourth low resistance. Thereby, the sixth type of non-volatile memory cell 900 may have the voltage of the node M3 to be programmed with a logic level of "1", wherein the node M3 in operation may act as an output of the non-volatile memory cell 900 of the sixth type.

In operation, referring to FIGS. 6E and 6F, (1) the node M1 may be switched to couple to the voltage Vcc of power supply, (2) the node M2 may be switched to couple to the voltage Vss of ground reference and (3) the node M3 may be switched to act as an output of the non-volatile memory cell 900 of the sixth type. When the resistive random access memory 870-1 is reset with the first or third high resistance and the resistive random access memory 870-2 is formed or set with the second or third low resistance, the sixth type of non-volatile memory cell 900 may generate an output at the node M3 to be at a voltage between the voltage Vss of ground reference and an half of the voltage Vcc of power supply, defined as the logic level of "0". When the resistive random access memory 870-1 is formed or set with the first or fourth low resistance and the resistive random access memory 870-2 is reset with the second or fourth high resistance, the sixth type of non-volatile memory cell 900 may generate an output at the node M3 to be at a voltage between an half of the voltage Vcc of power supply and the voltage Vcc of power supply, defined as the logic level of "1".

Figure 6G:
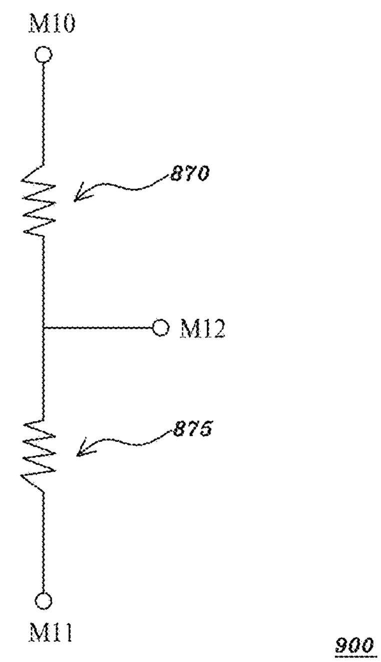
FIG. 6G is a circuit diagram illustrating a second alternative for a sixth type of non-volatile memory cell in accordance with an embodiment of the present application.

Alternatively, the sixth type of non-volatile memory cell 900 may be composed of the resistive random access memory 870 for a programmable resistor and of a non-programmable resistor 875, as seen in FIG. 6G. FIG. 6G is a circuit diagram illustrating a sixth type of non-volatile memory cell in accordance with an embodiment of the present application. The resistive random access memory 870 may have its bottom electrode 871 coupling to a first end of the non-programmable resistor 875 and to a node M12 of the non-volatile memory cell 900 of the sixth type. The resistive random access memory 870 may have its top electrode 872 coupling to a node M10, and the non-programmable resistor 875 may have a second end, opposite to its first end, coupling to a node M11.

Referring to FIG. 6G, when the forming step is performed to the resistive random access memories 870, (1) the nodes M10 may be switched to couple to the forming voltage $V_f$ between 0.25 and 3.3 volts, greater than a voltage Vcc of power supply, (2) the node M3 may be switched to couple to the voltage Vss of ground reference, and (3) the node M11 may be switched to be floating. Thereby, an electrical current may pass from the top electrode 872 of the resistive random access memory 870 to the bottom electrode 871 of the resistive random access memory 870 in a forward direction to form vacancies in the resistive layer 873 of the resistive random access memory 870 and thus the resistive random access memory 870 may be formed with a fifth low resistance, between 100 and 100,000 ohms, lower than the resistance of the non-programmable resistor 875. The resistance of the non-programmable resistor 875 may be equal to between 1.5 and 10,000,000 times of the fifth low resistance.

Referring to FIG. 6G, a resetting step may be performed to the resistive random access memory 870 after formed in the forming step. In the resetting step for the resistive random access memory 870, (1) the node M11 may be switched to couple to the programming voltage $V_{Pr}$, between 0.25 and 3.3 volts, equal to or greater than the resetting voltage $V_{RE}$ of the resistive random access memory 870 and greater than the voltage Vcc of power supply, (2) the node M10 may be switched to couple to the voltage Vss of ground reference and (3) the node M12 may be switched to be floating. Thereby, an electrical current may reversely pass from the bottom electrode 871 of the resistive random access memory 870 to the top electrode 872 of the resistive random access memory 870 in a backward direction opposite to the forward direction to form relatively few vacancies in the resistive layer 873 of the resistive random access memory 870 and thus the resistive random access memory 870 may be reset with a fifth high resistance, between 1,000 and 100,000,000,000 ohms, greater than the resistance of the non-programmable resistor 875 in the resetting step. The fifth high resistance may be equal to between 1.5 and 10,000,000 times of the resistance of the non-programmable resistor 875. Thereby, the sixth type of non-volatile memory cell 900 may have the voltage at the node M12 to be programmed with a logic level of "0", wherein the node M12 in operation may act as an output of the non-volatile memory cell 900 of the sixth type.

Referring to FIG. 6G, after the sixth type of non-volatile memory cell 900 is programmed with a logic level of "0", the sixth type of non-volatile memory cell 900 may be programmed with a logic level of "1". The resistive random access memory 870 may be set with a sixth low resistance in the setting step. In the setting step for the resistive random access memory 870, (1) the node M10 may be switched to couple to a voltage, between 0.25 and 3.3 volts, equal to or greater than the setting voltage $V_{SE}$ of the resistive random access memory 870 and greater than the voltage Vcc of power supply, (2) the node M11 may be switched to couple to the voltage Vss of ground reference and (3) the node M12 may be switched to be floating. Thereby, an electrical current may pass from the top electrode 872 of the resistive random access memory 870 to the bottom electrode 871 of the resistive random access memory 870 in the forward direction to form more vacancies in the resistive layer 873 of the resistive random access memory 870 and thus the resistive random access memory 870 may be set with the sixth low resistance, between 100 and 100,000 ohms, lower than the resistance of the non-programmable resistor 875 in the setting step. The resistance of the non-programmable resistor 875 may be equal to between 1.5 and 10,000,000 times of the sixth low resistance. Thereby, the sixth type of non-volatile memory cell 900 may have the voltage of the node M12 to be programmed with a logic level of "1", wherein the node M12 in operation may act as an output of the non-volatile memory cell 900 of the sixth type.

In operation, referring to FIG. 6G, (1) the node M10 may be switched to couple to the voltage Vcc of power supply, (2) the node M11 may be switched to couple to the voltage Vss of ground reference and (3) the node M12 may be switched to act as an output of the non-volatile memory cell 900 of the sixth type. When the resistive random access memory 870 is reset with the fifth high resistance, the sixth type of non-volatile memory cell 900 may generate an output at the node M12 to be at a voltage between the voltage Vss of ground reference and an half of the voltage Vcc of power supply, defined as the logic level of "0". When the resistive random access memory 870 is formed or set with the fifth or sixth low resistance, the sixth type of non-volatile memory cell 900 may generate an output at the node M3 to be at a voltage between an half of the voltage Vcc of power supply and the voltage Vcc of power supply, defined as the logic level of "1".

(7) Seventh Type of Non-Volatile Memory Cells

Figure 7A:
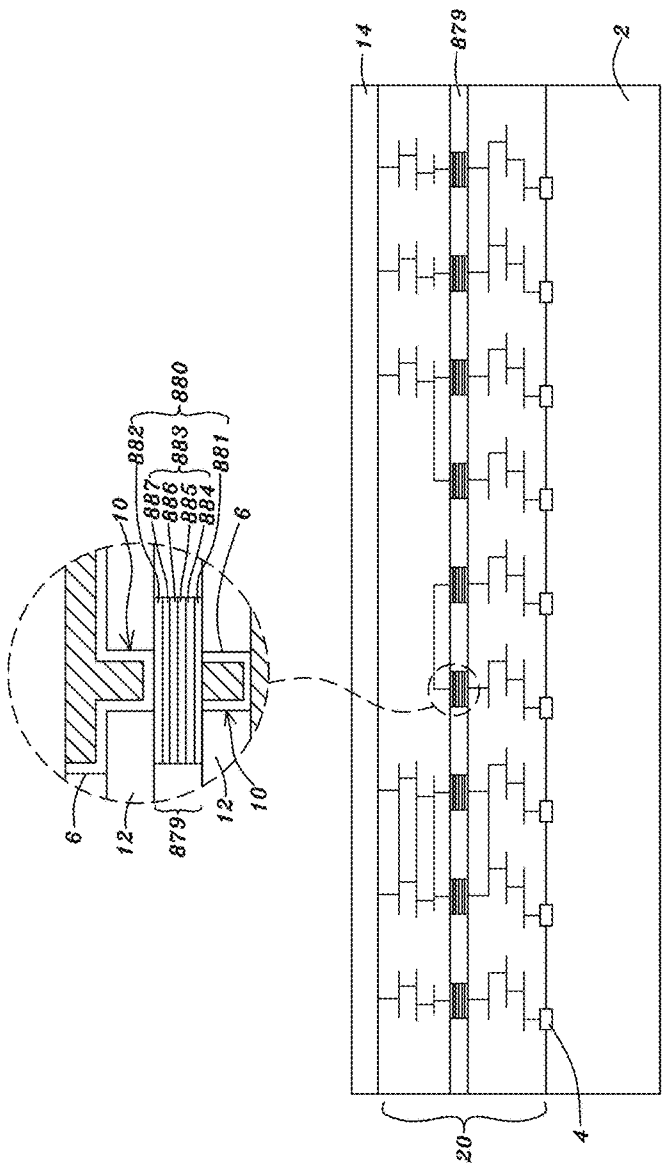
FIGS. 7A-7D are schematically cross-sectional views showing various structures of a magnetoresistive random access memory (MRAM) in accordance with an embodiment of the present application.
Figure 7B:
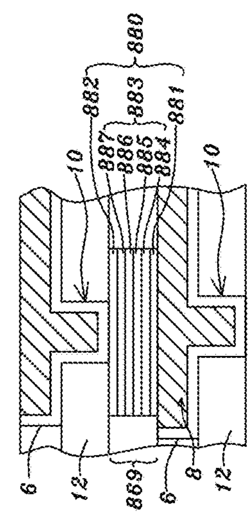
Figure 7C:
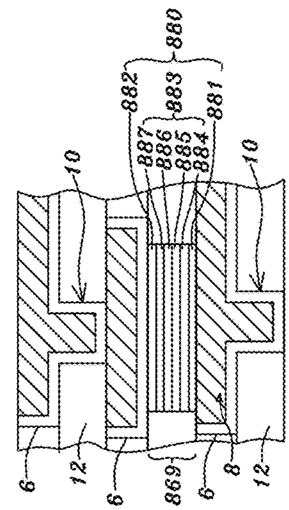

FIGS. 7A-7C are schematically cross-sectional views showing various structures of non-volatile memory cells of a seventh type for a semiconductor chip in accordance with an embodiment of the present application. The seventh type of non-volatile memory cells may be magnetoresistive random access memories (MRAM), i.e., programmable resistors. Referring to FIG. 7A, a semiconductor chip 100, used for the FPGA IC chip 200 for example, may include multiple magnetoresistive random access memories 880 formed in an MRAM layer 879 thereof over a semiconductor substrate 2 thereof, in a first interconnection scheme 20 for the semiconductor chip 100 (FISC) and under a passivation layer 14 thereof. Multiple interconnection metal layers 6 in the FISC 20 and between the MRAM layer 879 and semiconductor substrate 2 may couple the magnetoresistive random access memories 880 to multiple semiconductor devices 4 on the semiconductor substrate 2. Multiple interconnection metal layers 6 in the FISC 20 and between the MRAM layer 879 and passivation layer 14 may couple the magnetoresistive random access memories 880 to external circuits outside the semiconductor chip 100 and may have a line pitch less than 0.5 micrometers. Each of the interconnection metal layers 6 in the FISC 20 and over the MRAM layer 879 may have a thickness greater than each of the interconnection metal layers 6 in the FISC 20 and under the MRAM layer 879. The details for the semiconductor substrate 2, semiconductor devices, interconnection metal layers 6, FISC 20 and passivation layer 14 may be referred to the illustration in FIGS. 22A-22Q.

Referring to FIG. 7A, each of the magnetoresistive random access memories 880 may have a bottom electrode 881 made of titanium nitride, copper or an aluminum alloy having a thickness between 1 and 20 nanometers, a top electrode 882 made of titanium nitride, copper or an aluminum alloy having a thickness between 1 and 20 nanometers, and a magnetoresistive layer 883 having a thickness between 1 and 35 nanometers between the bottom and top electrodes 881 and 882. For a first alternative, the magnetoresistive layer 883 may be composed of (1) an antiferromagnetic (AF) layer 884, i.e., pinning layer, such as Cr, Fe—Mn alloy, NiO, FeS, Co/$[CoPt]_4$, having a thickness between 1 and 10 nanometers on the bottom electrode 881, (2) a pinned magnetic layer 885, such as a FeCoB alloy or $Co_2Fe_6B_2$, having a thickness between 1 and 10 nanometers, between 0.5 and 3.5 nanometers, or between 1 and 3 nanometers on the antiferromagnetic layer 884, (3) a tunneling oxide layer 886, i.e., tunneling barrier layer, such as MgO, having a thickness between 0.5 and 5 nanometers, between 0.3 and 2.5 nanometers or between 0.5 and 1.5 nanometers on the pinned magnetic layer 885 and (4) a free magnetic layer 887, such as a FeCoB alloy or $Co_2Fe_6B_2$, having a thickness between 1 and 10 nanometers, between 0.5 and 3.5 nanometers, or between 1 and 3 nanometers on the tunneling oxide layer 886. The top electrode 882 is formed on the free magnetic layer 887 of the magnetoresistive layer 883. The pinned magnetic layer 885 may have the same material as the free magnetic layer 887.

Referring to FIG. 7A, each of the magnetoresistive random access memories 880 may have its bottom electrode 881 formed on a top surface of one of the lower metal vias 10 of a lower one of the interconnection metal layers 6 as illustrated in FIGS. 22A-22Q and on a top surface of a lower one of the dielectric layers 12 as illustrated in FIGS. 22A-22Q. An upper one of the dielectric layers 12 as illustrated in FIGS. 22A-22Q may be formed on the top electrode 882 of said one of the magnetoresistive random access memories 880 and an upper one of the interconnection metal layers 6 as illustrated in FIGS. 22A-22Q may have the upper metal vias 10 each formed in the upper one of the dielectric layers 12 and on the top electrode 882 of one of the magnetoresistive random access memories 880.

Alternatively, referring to FIG. 7B, each of the magnetoresistive random access memories 880 may have its bottom electrode 881 formed on a top surface of one of the lower metal pads 8 of a lower one of the interconnection metal layers 6 as illustrated in FIGS. 22A-22Q. An upper one of the dielectric layers 12 as illustrated in FIGS. 22A-22Q may be formed on the top electrode 882 of said one of the magnetoresistive random access memories 880 and an upper one of the interconnection metal layers 6 as illustrated in FIGS. 22A-22Q may have the upper metal vias 10 each formed in the upper one of the dielectric layers 12 and on the top electrode 882 of one of the magnetoresistive random access memories 880.

Alternatively, referring to FIG. 7C, each of the magnetoresistive random access memories 880 may have its bottom electrode 881 formed on a top surface of one of the lower metal pads 8 of a lower one of the interconnection metal layers 6 as illustrated in FIGS. 22A-22Q. An upper one of the interconnection metal layers 6 as illustrated in FIGS. 22A-22Q may have the upper metal pads 8 each formed in an upper one of the dielectric layers 12 and on the top electrode 882 of one of the magnetoresistive random access memories 880.

Figure 7D:
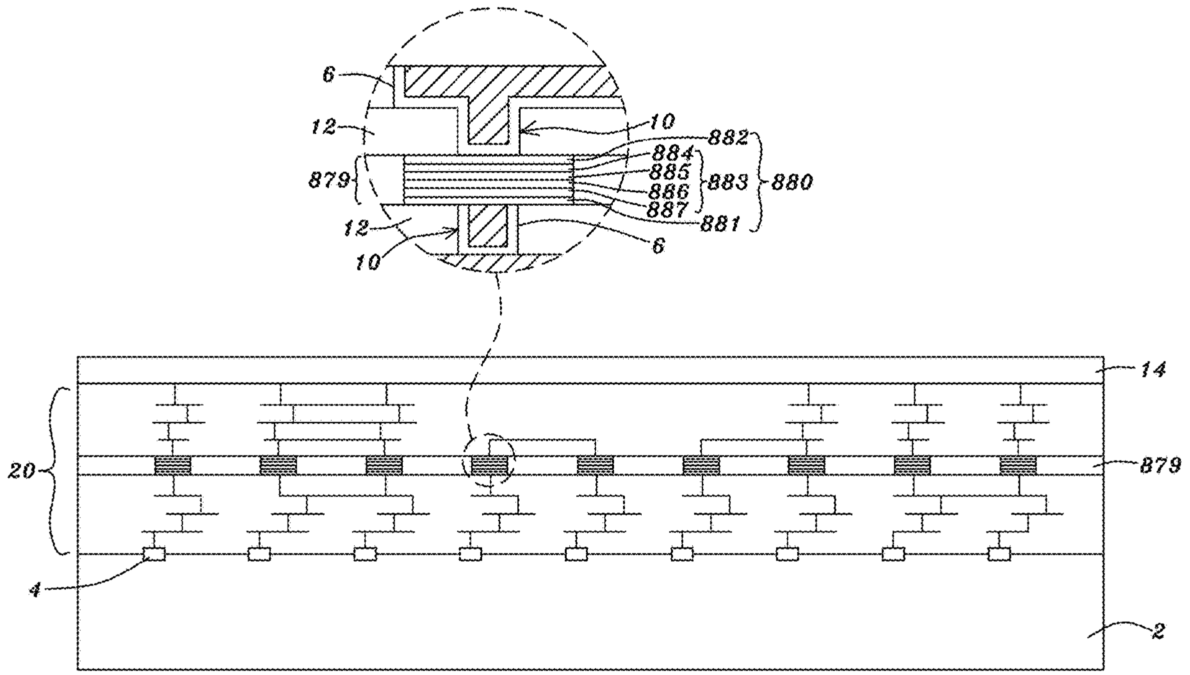

For a second alternative, FIG. 7D is a schematically cross-sectional view showing a structure of a seventh type of non-volatile memory cell for a semiconductor chip in accordance with an embodiment of the present application. The scheme of the semiconductor chip as illustrated in FIG. 7D is similar to that as illustrated in FIG. 7A except for the composition of the magnetoresistive layer 883. Referring to FIG. 7D, the magnetoresistive layer 883 may be composed of the free magnetic layer 887 on the bottom electrode 881, the tunneling oxide layer 886 on the free magnetic layer 887, the pinned magnetic layer 885 on the tunneling oxide layer 886 and the antiferromagnetic layer 884 on the pinned magnetic layer 885. The top electrode 882 is formed on the antiferromagnetic layer 884. The materials and thicknesses of the free magnetic layer 887, tunneling oxide layer 886, pinned magnetic layer 885 and antiferromagnetic layer 884 for the second alternative may be referred to those for the first alternative. The magnetoresistive random access memories 880 for the second alternative may have its bottom electrode 881 formed on a top surface of one of the lower metal vias 10 of a lower one of the interconnection metal layers 6 as illustrated in FIGS. 22A-22Q and on a top surface of a lower one of the dielectric layers 12 as illustrated in FIGS. 22A-22Q. An upper one of the dielectric layers 12 as illustrated in FIGS. 22A-22Q may be formed on the top electrode 882 of said one of the magnetoresistive random access memories 880 and an upper one of the interconnection metal layers 6 as illustrated in FIGS. 22A-22Q may have the upper metal vias 10 each formed in the upper one of the dielectric layers 12 and on the top electrode 882 of one of the magnetoresistive random access memories 880 for the second alternative.

Alternatively, the magnetoresistive random access memories 880 for the second alternative in FIG. 7D may be provided between a lower metal pad 8 and an upper metal via 10 as seen in FIG. 7B. Referring to FIGS. 7B and 7D, each of the magnetoresistive random access memories 880 for the second alternative may have its bottom electrode 881 formed on a top surface of one of the lower metal pads 8 of a lower one of the interconnection metal layers 6 as illustrated in FIGS. 22A-22Q. An upper one of the dielectric layers 12 as illustrated in FIGS. 22A-22Q may be formed on the top electrode 882 of said one of the magnetoresistive random access memories 880 and an upper one of the interconnection metal layers 6 as illustrated in FIGS. 22A-22Q may have the upper metal vias 10 each formed in the upper one of the dielectric layers 12 and on the top electrode 882 of one of the magnetoresistive random access memories 880 for the second alternative.

Alternatively, the magnetoresistive random access memories 880 for the second alternative in FIG. 7D may be provided between a lower metal pad 8 and an upper metal pad 8 as seen in FIG. 7C. Referring to FIGS. 7C and 7D, each of the magnetoresistive random access memories 880 for the second alternative may have its bottom electrode 881 formed on a top surface of one of the lower metal pads 8 of a lower one of the interconnection metal layers 6 as illustrated in FIGS. 22A-22Q. An upper one of the interconnection metal layers 6 as illustrated in FIGS. 22A-22Q may have the upper metal pads 8 each formed in an upper one of the dielectric layers 12 and on the top electrode 882 of one of the magnetoresistive random access memories 880 for the second alternative.

Referring to FIGS. 7A-7D, the pinned magnetic layer 885 may have domains each provided with a magnetic field in a direction pinned by the antiferromagnetic layer 884, that is, hardly changed by a spin-transfer torque induced by an electron flow passing through the pinned magnetic layer 885. The free magnetic layer 887 may have domains each provided with a magnetic field in a direction easily changed by a spin-transfer torque induced by an electron flow passing through the free magnetic layer 887.

Referring to FIGS. 7A-7C, in a setting step for one of the magnetoresistive random access memories 880 for the first alternative, when a voltage $V_{MSE}$ ranging from 0.25 to 3.3 volts is applied to its top electrode 882 and a voltage Vss of ground reference is applied to its bottom electrode 881, electrons may flow from its pinned magnetic layer 885 to its free magnetic layer 887 through its tunneling oxide layer 886 such that the direction of the magnetic fields in each of the domains of its free magnetic layer 887 may be set to be the same as that in each of the domains of its pinned magnetic layer 885 by a spin-transfer torque (STT) effect induced by the electrons. Thus, said one of the magnetoresistive random access memories 880 may be set with a low resistance between 10 and 100,000,000,000 ohms. In a resetting step for said one of the magnetoresistive random access memories 880 for the first alternative, when a voltage $V_{MRE}$ ranging from 0.25 to 3.3 volts is applied to its bottom electrode 881 and the voltage Vss of ground reference is applied to its top electrode 882, electrons may flow from its free magnetic layer 887 to its pinned magnetic layer 885 through its tunneling oxide layer 886 such that the direction of the magnetic fields in each of the domains of its free magnetic layer 887 may be reset to be opposite to that in each of the domains of its pinned magnetic layer 885. Thus, said one of the magnetoresistive random access memories 880 may be reset with a high resistance between 15 and 500,000,000,000 ohms.

Referring to FIG. 7D, in a setting step for one of the magnetoresistive random access memories 880 for the second alternative, when a voltage $V_{MSE}$ ranging from 0.25 to 3.3 volts is applied to its bottom electrode 881 and a voltage Vss of ground reference is applied to its top electrode 882, electrons may flow from its pinned magnetic layer 885 to its free magnetic layer 887 through its tunneling oxide layer 886 such that the direction of the magnetic fields in each of the domains of its free magnetic layer 887 may be set to be the same as that in each of the domains of its pinned magnetic layer 885 by a spin-transfer torque (STT) effect induced by the electrons. Thus, said one of the magnetoresistive random access memories 880 may be set with a low resistance between 10 and 100,000,000,000 ohms. In a resetting step for said one of the magnetoresistive random access memories 880 for the second alternative, when a voltage $V_{MRE}$ ranging from 0.25 to 3.3 volts is applied to its top electrode 882 and the voltage Vss of ground reference is applied to its bottom electrode 881, electrons may flow from its free magnetic layer 887 to its pinned magnetic layer 885 through its tunneling oxide layer 886 such that the direction of the magnetic fields in each of the domains of its free magnetic layer 887 may be reset to be opposite to that in each of the domains of its pinned magnetic layer 885. Thus, said one of the magnetoresistive random access memories 880 may be reset with a high resistance between 15 and 500,000,000,000 ohms.

Figure 7E:
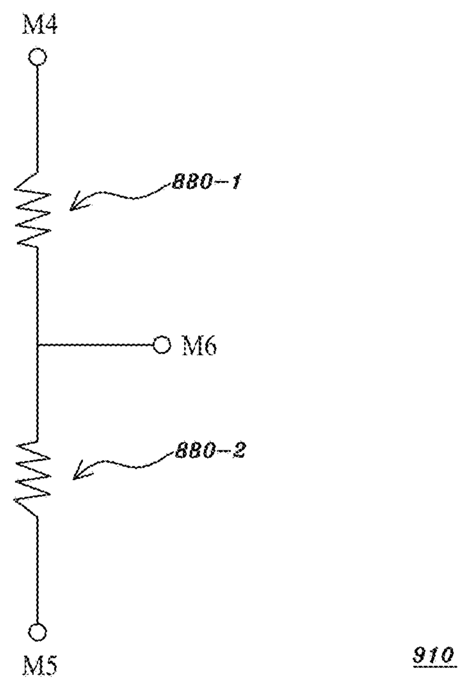
FIG. 7E is a circuit diagram illustrating a first alternative for a seventh type of non-volatile memory cell in accordance with an embodiment of the present application.
Figure 7F:
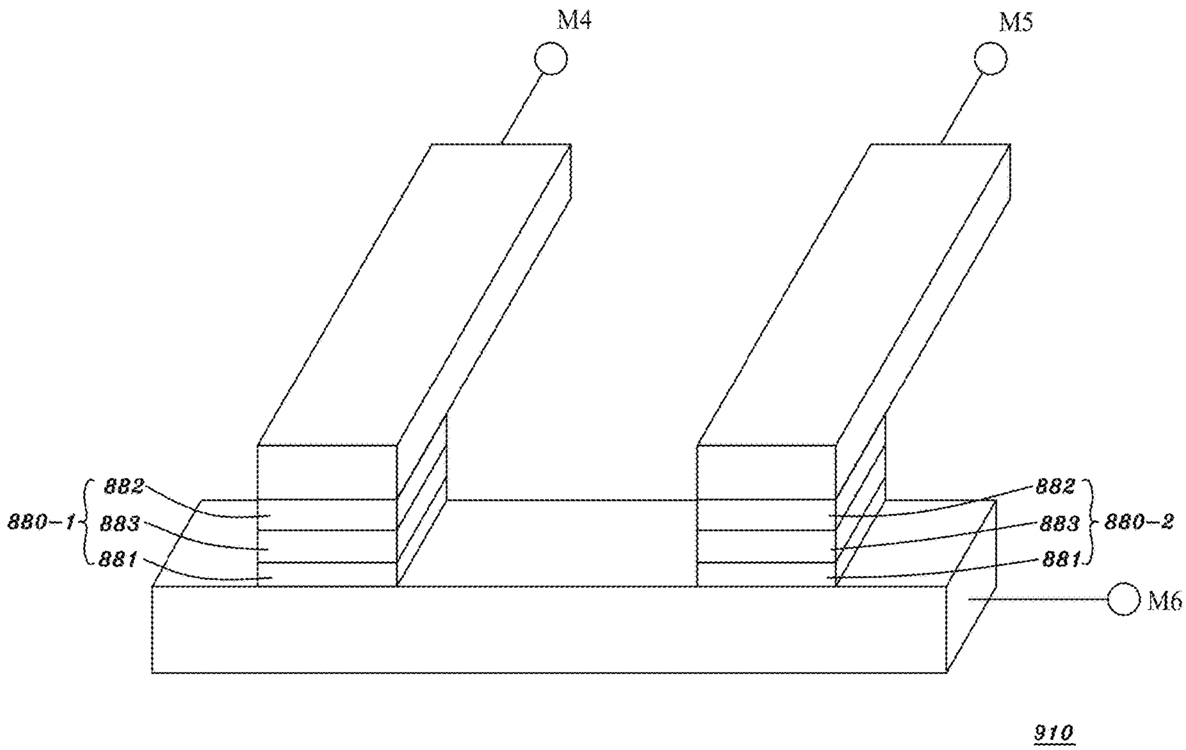
FIG. 7F is a schematically perspective view showing a structure of a seventh type of non-volatile memory cell in accordance with an embodiment of the present application.

(7.1) Seventh Type of Non-Volatile Memory Cell Composed of MRAMs for First Alternative FIG. 7E is a circuit diagram illustrating a seventh type of non-volatile memory cell in accordance with an embodiment of the present application. FIG. 7F is a schematically perspective view showing a structure of a seventh type of non-volatile memory cell in accordance with an embodiment of the present application. Referring to FIGS. 7E and 7F, two of the magnetoresistive random access memories 880 for the first alternative, called as 880-1 and 880-2 hereinafter, may be provided for the non-volatile memory cell 910 of the seventh type, i.e., complementary MRAM cell, abbreviated as CMRAM. The magnetoresistive random access memory 880-1 may have its bottom electrode 881 coupling to the bottom electrode 881 of the magnetoresistive random access memory 880-2 and to a node M6 of the non-volatile memory cell 910 of the seventh type. The magnetoresistive random access memory 880-1 may have its top electrode 882 coupling to a node M4, and the magnetoresistive random access memory 880-2 may have its top electrode 872 coupling to a node M5.

In a first condition, referring to FIGS. 7E and 7F, the magnetoresistive random access memory 880-2 may be reset with a first high resistance in the resetting step, and the magnetoresistive random access memory 880-1 may be set with a first low resistance in the setting step. In the resetting step for the magnetoresistive random access memory 880-2 and the setting step for the magnetoresistive random access memory 880-1, (1) the node M4 may be switched to couple to a programming voltage $V_{Pr}$, between 0.25 and 3.3 volts, equal to or greater than the voltage $V_{MRE}$ of the magnetoresistive random access memory 880-2, equal to or greater than the voltage $V_{MSE}$ of the magnetoresistive random access memory 880-1 and greater than the voltage Vcc of power supply, (2) the node M5 may be switched to couple to the voltage Vss of ground reference and (3) the node M6 may be switched to be floating. Thereby, an electron current may pass from the top electrode 882 of the magnetoresistive random access memory 880-2 to the bottom electrode 881 of the magnetoresistive random access memory 880-2 to reset the direction of the magnetic field in each domain of the free magnetic layer 887 of the magnetoresistive random access memory 880-2 to be opposite to that in each domain of the pinned magnetic layer 885 of the magnetoresistive random access memory 880-2. Thus, the magnetoresistive random access memory 880-2 may be reset with the first high resistance between 15 and 500,000,000,000 ohms in the resetting step. Further, the electron current may then pass from the bottom electrode 881 of the magnetoresistive random access memory 880-1 to the top electrode 882 of the magnetoresistive random access memory 880-1 to set the direction of the magnetic field in each domain of the free magnetic layer 887 of the magnetoresistive random access memory 880-1 to be the same as that in each domain of the pinned magnetic layer 885 of the magnetoresistive random access memory 880-1. Thus, the magnetoresistive random access memory 880-1 may be set with the first low resistance between 10 and 100,000,000,000 ohms in the setting step. The first high resistance may be equal to between 1.5 and 10 times of the first low resistance. Thereby, the seventh type of non-volatile memory cell 910 may have a voltage at the node M6 to be programmed with a logic level of "1", wherein the node M6 in operation may act as an output of the non-volatile memory cell 910 of the seventh type.

In a second condition, referring to FIGS. 7E and 7F, the magnetoresistive random access memory 880-1 may be reset with a second high resistance in the resetting step, and the magnetoresistive random access memory 880-2 may be set with a second low resistance in the setting step. In the resetting step for the magnetoresistive random access memory 880-1 and the setting step for the magnetoresistive random access memory 880-2, (1) the node M5 may be switched to couple to the programming voltage $V_{Pr}$, between 0.25 and 3.3 volts, equal to or greater than the voltage $V_{MRE}$ of the magnetoresistive random access memory 880-1, equal to or greater than the voltage $V_{MSE}$ of the magnetoresistive random access memory 880-2 and greater than the voltage Vcc of power supply, (2) the node M4 may be switched to couple to the voltage Vss of ground reference and (3) the node M6 may be switched to be floating. Thereby, an electron current may pass from the top electrode 882 of the magnetoresistive random access memory 880-1 to the bottom electrode 881 of the magnetoresistive random access memory 880-1 to reset the direction of the magnetic field in each domain of the free magnetic layer 887 of the magnetoresistive random access memory 880-1 to be opposite to that in each domain of the pinned magnetic layer 885 of the magnetoresistive random access memory 880-1. Thus, the magnetoresistive random access memory 880-1 may be reset with the second high resistance between 15 and 500,000,000,000 ohms in the resetting step. Further, the electron current may then pass from the bottom electrode 881 of the magnetoresistive random access memory 880-2 to the top electrode 882 of the magnetoresistive random access memory 880-2 to set the direction of the magnetic field in each domain of the free magnetic layer 887 of the magnetoresistive random access memory 880-2 to be the same as that in each domain of the pinned magnetic layer 885 of the magnetoresistive random access memory 880-2. Thus, the magnetoresistive random access memory 880-2 may be set with the second low resistance between 10 and 100,000,000,000 ohms in the setting step. The second high resistance may be equal to between 1.5 and 10 times of the second low resistance. Thereby, the seventh type of non-volatile memory cell 910 may have a voltage of the node M6 to be programmed with a logic level of "0", wherein the node M6 in operation may act as an output of the non-volatile memory cell 910 of the seventh type.

In operation, referring to FIGS. 7E and 7F, (1) the node M4 may be switched to couple to the voltage Vcc of power supply, (2) the node M5 may be switched to couple to the voltage Vss of ground reference and (3) the node M6 may be switched to act as an output of the non-volatile memory cell 910 of the seventh type. When the magnetoresistive random access memory 880-1 is reset with the second high resistance and the magnetoresistive random access memory 880-2 is set with the second low resistance, the seventh type of non-volatile memory cell 910 may generate an output at the node M6 at a voltage level between the voltage Vss of ground reference and an half of the voltage Vcc of power supply, defined as a logic level of "0". When the magnetoresistive random access memory 880-1 is set with the first low resistance and the magnetoresistive random access memory 880-2 is reset with the first high resistance, the seventh type of non-volatile memory cell 910 may generate an output at the node M6 at a voltage level between an half of the voltage Vcc of power supply and the voltage Vcc of power supply, defined as the logic level of "1".

Figure 7G:
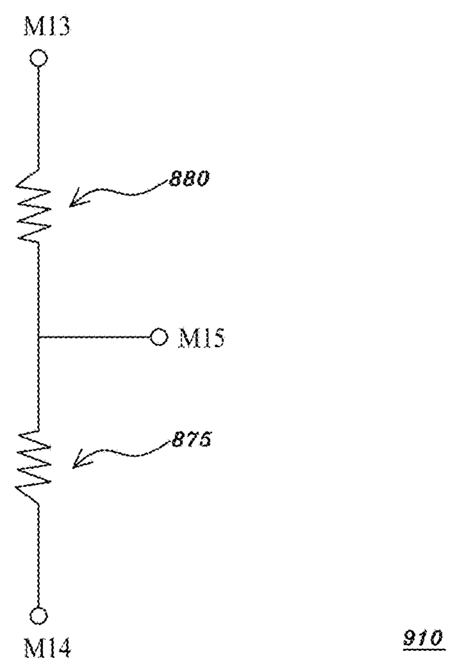
FIG. 7G is a circuit diagram illustrating a second alternative for a seventh type of non-volatile memory cell in accordance with an embodiment of the present application.

Alternatively, the seventh type of non-volatile memory cell 910 may be composed of the magnetoresistive random access memory 880 for the first alternative and of a non-programmable resistor 875, as seen in FIG. 7G. FIG. 7G is a circuit diagram illustrating a seventh type of non-volatile memory cell in accordance with an embodiment of the present application. The resistive random access memory 880 for the first alternative may have its bottom electrode 881 coupling to a first end of the non-programmable resistor 875 and to a node M15 of the non-volatile memory cell 910 of the seventh type. The magnetoresistive random access memory 880 for the first alternative may have its top electrode 882 coupling to a node M13, and the non-programmable resistor 875 may have a second end, opposite to its first end, coupling to a node M14.

In a third condition, referring to FIG. 7G, the magnetoresistive random access memory 880 may be set with a seventh low resistance in the setting step. In the setting step for the magnetoresistive random access memory 880, (1) the node M13 may be switched to couple to a programming voltage $V_{Pr}$, between 0.25 and 3.3 volts, equal to or greater than the voltage $V_{MSE}$ of the magnetoresistive random access memory 880 and greater than the voltage Vcc of power supply, (2) the node M14 may be switched to couple to the voltage Vss of ground reference and (3) the node M15 may be switched to be floating. Thereby, an electron current may pass from the bottom electrode 881 of the magnetoresistive random access memory 880 to the top electrode 882 of the magnetoresistive random access memory 880 to set the direction of the magnetic field in each domain of the free magnetic layer 887 of the magnetoresistive random access memory 880 to be the same as that in each domain of the pinned magnetic layer 885 of the magnetoresistive random access memory 880. Thus, the magnetoresistive random access memory 880-1 may be set with the seventh low resistance, between 10 and 100,000,000,000 ohms, lower than the resistance of the non-programmable resistor 875. The resistance of the non-programmable resistor 875 may be equal to between 1.5 and 10,000,000 times of the seventh low resistance. Thereby, the seventh type of non-volatile memory cell 910 may have a voltage at the node M15 to be programmed with a logic level of "1", wherein the node M15 in operation may act as an output of the non-volatile memory cell 910 of the seventh type.

In a fourth condition, referring to FIG. 7G, the magnetoresistive random access memory 880 may be reset with a seventh high resistance in the resetting step. In the resetting step for the magnetoresistive random access memory 880, (1) the node M14 may be switched to couple to the programming voltage $V_{Pr}$, between 0.25 and 3.3 volts, equal to or greater than the voltage $V_{MRE}$ of the magnetoresistive random access memory 880 and greater than the voltage Vcc of power supply, (2) the node M13 may be switched to couple to the voltage Vss of ground reference and (3) the node M15 may be switched to be floating. Thereby, an electron current may pass from the top electrode 882 of the magnetoresistive random access memory 880 to the bottom electrode 881 of the magnetoresistive random access memory 880 to reset the direction of the magnetic field in each domain of the free magnetic layer 887 of the magnetoresistive random access memory 880 to be opposite to that in each domain of the pinned magnetic layer 885 of the magnetoresistive random access memory 880. Thus, the magnetoresistive random access memory 880 may be reset with the seventh high resistance, between 15 and 500,000,000,000 ohms, greater than the resistance of the non-programmable resistor 875 in the resetting step The resistance of the non-programmable resistor 875 may be equal to between 1.5 and 10,000,000 times of the seventh low resistance. The seventh high resistance may be equal to between 1.5 and 10 times of the resistance of the non-programmable resistor 875. Thereby, the seventh type of non-volatile memory cell 910 may have a voltage of the node M15 to be programmed with a logic level of “0”, wherein the node M15 in operation may act as an output of the non-volatile memory cell 910 of the seventh type.

In operation, referring to FIG. 7G, (1) the node M13 may be switched to couple to the voltage Vcc of power supply, (2) the node M14 may be switched to couple to the voltage Vss of ground reference and (3) the node M15 may be switched to act as an output of the non-volatile memory cell 910 of the seventh type. When the magnetoresistive random access memory 880 is reset with the seventh high resistance, the seventh type of non-volatile memory cell 910 may generate an output at the node M15 at a voltage level between the voltage Vss of ground reference and an half of the voltage Vcc of power supply, defined as a logic level of “0”. When the magnetoresistive random access memory 880 is set with the seventh low resistance, the seventh type of non-volatile memory cell 910 may generate an output at the node M15 at a voltage level between an half of the voltage Vcc of power supply and the voltage Vcc of power supply, defined as the logic level of “1”.

Figure 7H:
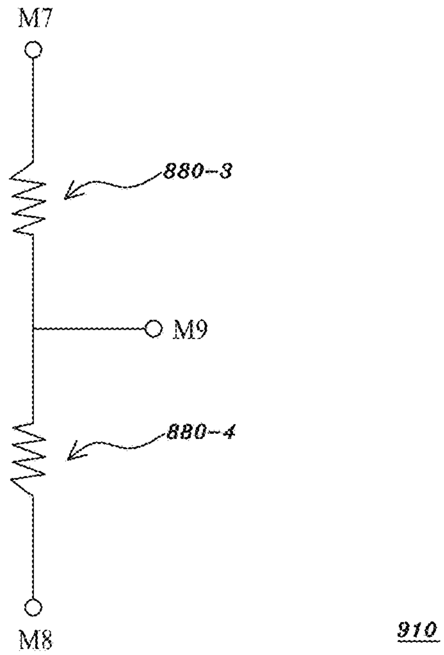
FIG. 7H is a circuit diagram illustrating a third alternative for a seventh type of non-volatile memory cell in accordance with an embodiment of the present application.
Figure 7I:
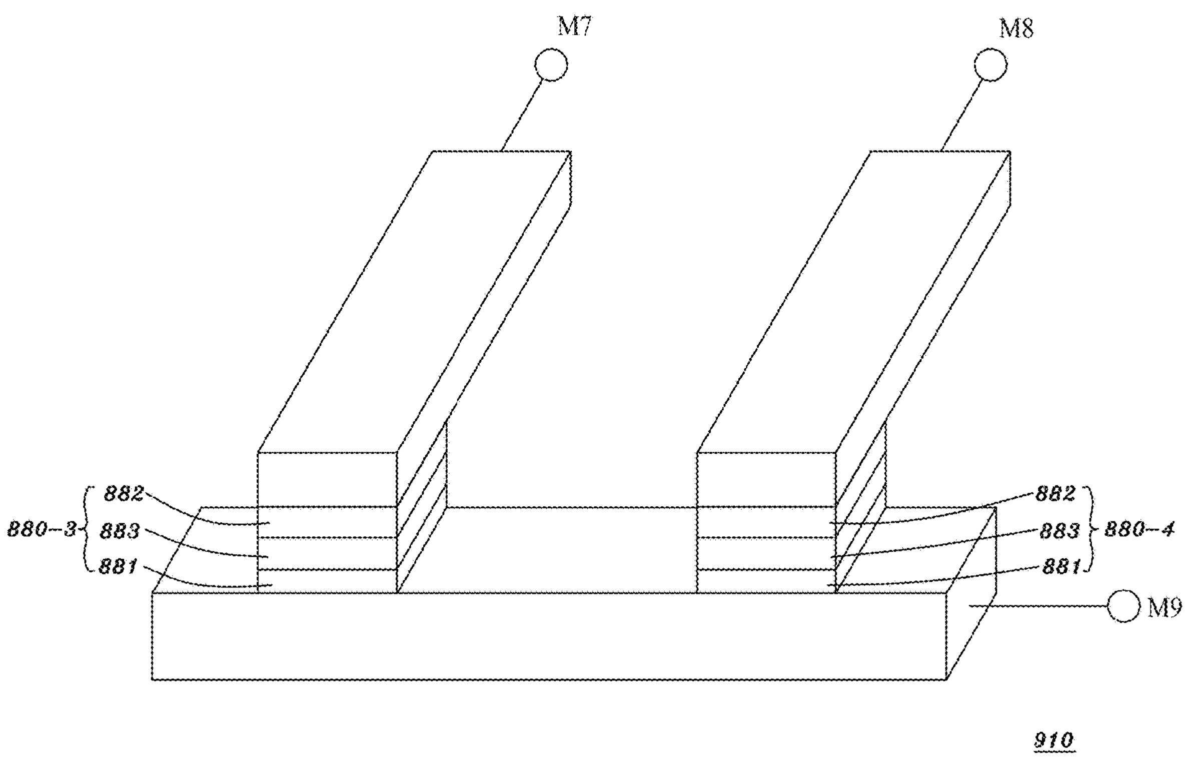
FIG. 7I is a schematically perspective view showing a structure of a seventh type of non-volatile memory cell in accordance with an embodiment of the present application.

(7.2) Seventh Type of Non-Volatile Memory Cell Composed of MRAMs for Second Alternative FIG. 7H is a circuit diagram illustrating a seventh type of non-volatile memory cell in accordance with an embodiment of the present application. FIG. 7I is a schematically perspective view showing a structure of a seventh type of non-volatile memory cell in accordance with an embodiment of the present application. Referring to FIGS. 7H and 7I, two of the magnetoresistive random access memories 880 for the second alternative, called as 880-3 and 880-4 hereinafter, may be provided for the non-volatile memory cell 910 of the seventh type. The magnetoresistive random access memory 880-3 may have its bottom electrode 881 coupling to the bottom electrode 881 of the magnetoresistive random access memory 880-4 and to a node M9 of the non-volatile memory cell 910 of the seventh type. The magnetoresistive random access memory 880-3 may have its top electrode 882 coupling to a node M7, and the magnetoresistive random access memory 880-4 may have its top electrode 872 coupling to a node M8.

In a first condition, referring to FIGS. 7H and 7I, the magnetoresistive random access memory 880-3 may be reset with a third high resistance in the resetting step, and the magnetoresistive random access memory 880-4 may be set with a third low resistance in the setting step. In the resetting step for the magnetoresistive random access memory 880-3 and the setting step for the magnetoresistive random access memory 880-4, (1) the node M7 may be switched to couple to a programming voltage VPr, between 0.25 and 3.3 volts, equal to or greater than the voltage VMRE of the magnetoresistive random access memory 880-4, equal to or greater than the voltage VMSE of the magnetoresistive random access memory 880-3 and greater than the voltage Vcc of power supply, (2) the node M8 may be switched to couple to the voltage Vss of ground reference and (3) the node M9 may be switched to be floating. Thereby, an electron current may pass from the top electrode 882 of the magnetoresistive random access memory 880-4 to the bottom electrode 881 of the magnetoresistive random access memory 880-4 to set the direction of the magnetic field in each domain of the free magnetic layer 887 of the magnetoresistive random access memory 880-4 to be the same as that in each domain of the pinned magnetic layer 885 of the magnetoresistive random access memory 880-4. Thus, the magnetoresistive random access memory 880-4 may be set with the third low resistance between 10 and 100,000,000,000 ohms in the setting step. Further, the electron current may then pass from the bottom electrode 881 of the magnetoresistive random access memory 880-3 to the top electrode 882 of the magnetoresistive random access memory 880-3 to reset the direction of the magnetic field in each domain of the free magnetic layer 887 of the magnetoresistive random access memory 880-3 to be opposite to that in each domain of the pinned magnetic layer 885 of the magnetoresistive random access memory 880-3. Thus, the magnetoresistive random access memory 880-3 may be reset with the third high resistance between 15 and 500,000,000,000 ohms in the resetting step. The third high resistance may be equal to between 1.5 and 10 times of the third low resistance. Thereby, the seventh type of non-volatile memory cell 910 may have a voltage at the node M9 to be programmed with a logic level of “0”, wherein the node M9 in operation may act as an output of the non-volatile memory cell 910 of the seventh type.

In a second condition, referring to FIGS. 7H and 7I, the magnetoresistive random access memory 880-3 may be set with a fourth low resistance in the setting step, and the magnetoresistive random access memory 880-4 may be reset with a fourth high resistance in the resetting step. In the resetting step for the magnetoresistive random access memory 880-4 and the setting step for the magnetoresistive random access memory 880-3, (1) the node M8 may be switched to couple to a voltage, between 0.25 and 3.3 volts, equal to or greater than the voltage $V_{MRE}$ of the magnetoresistive random access memory 880-4, equal to or greater than the voltage $V_{MSE}$ of the magnetoresistive random access memory 880-3 and greater than the voltage Vcc of power supply, (2) the node M7 may be switched to couple to the voltage Vss of ground reference and (3) the node M9 may be switched to be floating. Thereby, an electron current may pass from the top electrode 882 of the magnetoresistive random access memory 880-3 to the bottom electrode 881 of the magnetoresistive random access memory 880-3 to set the direction of the magnetic field in each domain of the free magnetic layer 887 of the magnetoresistive random access memory 880-3 to be the same as that in each domain of the pinned magnetic layer 885 of the magnetoresistive random access memory 880-3. Thus, the magnetoresistive random access memory 880-3 may be set with the fourth low resistance between 10 and 100,000,000,000 ohms in the setting step. Further, the electron current may then pass from the bottom electrode 881 of the magnetoresistive random access memory 880-4 to the top electrode 882 of the magnetoresistive random access memory 880-4 to reset the direction of the magnetic field in each domain of the free magnetic layer 887 of the magnetoresistive random access memory 880-4 to be opposite to that in each domain of the pinned magnetic layer 885 of the magnetoresistive random access memory 880-4. Thus, the magnetoresistive random access memory 880-4 may be reset with the fourth high resistance between 15 and 500,000,000,000 ohms in the resetting step. The fourth high resistance may be equal to between 1.5 and 10 times of the fourth low resistance. Thereby, the seventh type of non-volatile memory cell 910 may have a voltage at the node M9 to be programmed with a logic level of "1", wherein the node M9 in operation may act as an output of the non-volatile memory cell 910 of the seventh type.

In operation, referring to FIGS. 7H and 7I, (1) the node M7 may be switched to couple to the voltage Vcc of power supply, (2) the node M8 may be switched to couple to the voltage Vss of ground reference and (3) the node M9 may be switched to act as an output of the non-volatile memory cell 910 of the seventh type. When the magnetoresistive random access memory 880-3 is reset with the fourth high resistance and the magnetoresistive random access memory 880-4 is set with the fourth low resistance, the seventh type of non-volatile memory cell 910 may generate an output at the node M9 at a voltage level between the voltage Vss of ground reference and an half of the voltage Vcc of power supply, defined as a logic level of "0". When the magnetoresistive random access memory 880-3 is set with the fourth low resistance and the magnetoresistive random access memory 880-4 is reset with the fourth high resistance, the seventh type of non-volatile memory cell 910 may generate an output at the node M9 at a voltage level between an half of the voltage Vcc of power supply and the voltage Vcc of power supply, defined as the logic level of "1".

Figure 7J:
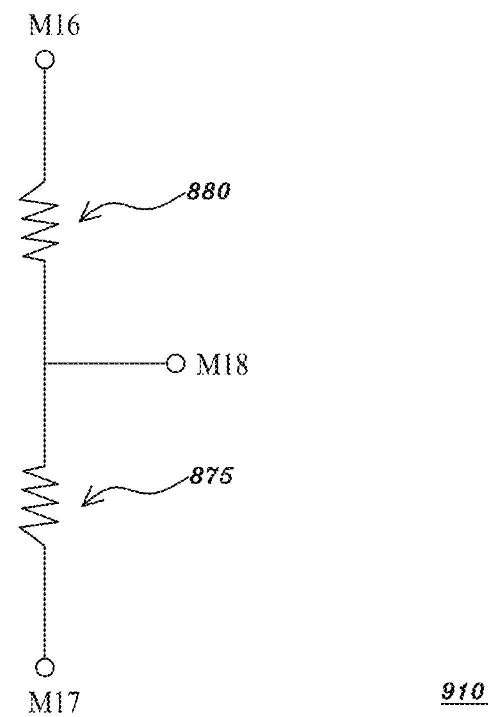
FIG. 7J is a circuit diagram illustrating a fourth alternative for a seventh type of non-volatile memory cell in accordance with an embodiment of the present application.

Alternatively, the seventh type of non-volatile memory cell 910 may be composed of the magnetoresistive random access memory 880 for the second alternative and of a non-programmable resistor 875, as seen in FIG. 7J. FIG. 7J is a circuit diagram illustrating a seventh type of non-volatile memory cell in accordance with an embodiment of the present application. The resistive random access memory 880 for the second alternative may have its bottom electrode 881 coupling to a first end of the non-programmable resistor 875 and to a node M18 of the non-volatile memory cell 910 of the seventh type. The magnetoresistive random access memory 880 for the second alternative may have its top electrode 882 coupling to a node M16, and the non-programmable resistor 875 may have a second end, opposite to its first end, coupling to a node M17.

In a third condition, referring to FIG. 7J, the magnetoresistive random access memory 880 may be reset with an eighth high resistance in the resetting step. In the resetting step for the magnetoresistive random access memory 880, (1) the node M16 may be switched to couple to a programming voltage $V_{Pr}$, between 0.25 and 3.3 volts, equal to or greater than the voltage $V_{MSE}$ of the magnetoresistive random access memory 880 and greater than the voltage Vcc of power supply, (2) the node M17 may be switched to couple to the voltage Vss of ground reference and (3) the node M18 may be switched to be floating. Thereby, an electron current may pass from the bottom electrode 881 of the magnetoresistive random access memory 880 to the top electrode 882 of the magnetoresistive random access memory 880 to reset the direction of the magnetic field in each domain of the free magnetic layer 887 of the magnetoresistive random access memory 880 to be opposite to that in each domain of the pinned magnetic layer 885 of the magnetoresistive random access memory 880. Thus, the magnetoresistive random access memory 880 may be reset with the eighth high resistance, between 15 and 500,000,000,000 ohms, greater than the resistance of the non-programmable resistor 875 in the resetting step. The eighth high resistance may be equal to between 1.5 and 10 times of the resistance of the non-programmable resistor 875. Thereby, the seventh type of non-volatile memory cell 910 may have a voltage at the node M18 to be programmed with a logic level of "0", wherein the node M18 in operation may act as an output of the non-volatile memory cell 910 of the seventh type.

In a fourth condition, referring to FIG. 7J, the magnetoresistive random access memory 880 may be set with an eighth low resistance in the setting step. In the setting step for the magnetoresistive random access memory 880, (1) the node M17 may be switched to couple to a voltage, between 0.25 and 3.3 volts, equal to or greater than the voltage $V_{MSE}$ of the magnetoresistive random access memory 880 and greater than the voltage Vcc of power supply, (2) the node M16 may be switched to couple to the voltage Vss of ground reference and (3) the node M18 may be switched to be floating. Thereby, an electron current may pass from the top electrode 882 of the magnetoresistive random access memory 880 to the bottom electrode 881 of the magnetoresistive random access memory 880 to set the direction of the magnetic field in each domain of the free magnetic layer 887 of the magnetoresistive random access memory 880-3 to be the same as that in each domain of the pinned magnetic layer 885 of the magnetoresistive random access memory 880. Thus, the magnetoresistive random access memory 880 may be set with the eighth low resistance, between 10 and 100,000,000,000 ohms, lower than the resistance of the non-programmable resistor 875 in the resetting step in the setting step. The resistance of the non-programmable resistor 875 may be equal to between 1.5 and 10,000,000 times of the eighth low resistance. Thereby, the seventh type of non-volatile memory cell 910 may have a voltage at the node M18 to be programmed with a logic level of "1", wherein the node M18 in operation may act as an output of the non-volatile memory cell 910 of the seventh type.

In operation, referring to FIG. 7J, (1) the node M16 may be switched to couple to the voltage Vcc of power supply, (2) the node M17 may be switched to couple to the voltage Vss of ground reference and (3) the node M18 may be switched to act as an output of the non-volatile memory cell 910 of the seventh type. When the magnetoresistive random access memory 880 is reset with the eighth high resistance, the seventh type of non-volatile memory cell 910 may generate an output at the node M18 at a voltage level between the voltage Vss of ground reference and an half of the voltage Vcc of power supply, defined as a logic level of "0". When the magnetoresistive random access memory 880 is set with the eighth low resistance, the seventh type of non-volatile memory cell 910 may generate an output at the node M18 at a voltage level between an half of the voltage Vcc of power supply and the voltage Vcc of power supply, defined as the logic level of "1".

Specification for Static Random-Access Memory (SRAM) Cells

Figure 8:
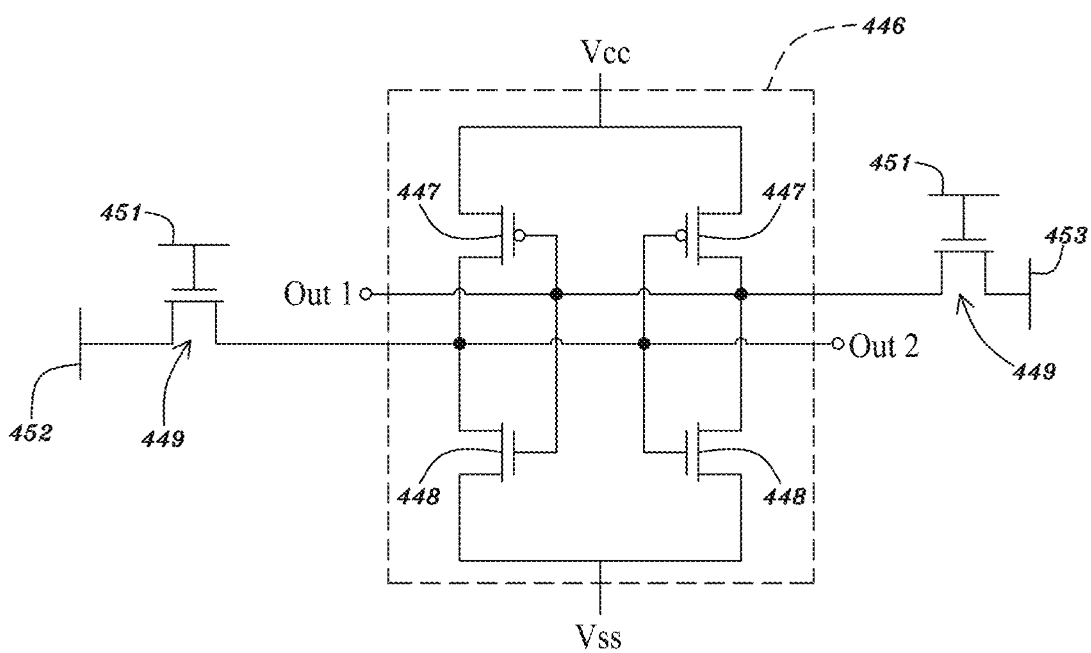
FIG. 8 is a circuit diagram illustrating a 6T SRAM cell in accordance with an embodiment of the present application.

FIG. 8 is a circuit diagram illustrating a 6T SRAM cell in accordance with an embodiment of the present application. Referring to FIG. 8, a first type of static random-access memory (SRAM) cell 398, i.e., 6T SRAM cell, may have a memory unit 446 composed of 4 data-latch transistors 447 and 448, that is, two pairs of a P-type MOS transistor 447 and N-type MOS transistor 448 both having respective drain terminals coupled to each other, respective gate terminals coupled to each other and respective source terminals coupled to the voltage Vcc of power supply and to the voltage Vss of ground reference. The gate terminals of the P-type and N-type MOS transistors 447 and 448 in the left pair are coupled to the drain terminals of the P-type and N-type MOS transistors 447 and 448 in the right pair, acting as an output Out1 of the memory unit 446. The gate terminals of the P-type and N-type MOS transistors 447 and 448 in the right pair are coupled to the drain terminals of the P-type and N-type MOS transistors 447 and 448 in the left pair, acting as an output Out2 of the memory unit 446.

Referring to FIG. 8, the first type of SRAM cell 398 may further include two switches or transfer (write) transistor 449, such as N-type or P-type MOS transistors, a first one of which has a gate terminal coupled to a word line 451 and a channel having a terminal coupled to a bit line 452 and another terminal coupled to the drain terminals of the P-type and N-type MOS transistors 447 and 448 in the left pair and the gate terminals of the P-type and N-type MOS transistors 447 and 448 in the right pair, and a second one of which has a gate terminal coupled to the word line 451 and a channel having a terminal coupled to a bit-bar line 453 and another terminal coupled to the drain terminals of the P-type and N-type MOS transistors 447 and 448 in the right pair and the gate terminals of the P-type and N-type MOS transistors 447 and 448 in the left pair. A logic level on the bit line 452 is opposite a logic level on the bit-bar line 453. The switch 449 may be considered as a programming transistor for writing a programing code or data into storage nodes of the 4 data-latch transistors 447 and 448, i.e., at the drains and gates of the 4 data-latch transistors 447 and 448. The switches 449 may be controlled via the word line 451 to turn on connection from the bit line 452 to the drain terminals of the P-type and N-type MOS transistors 447 and 448 in the left pair and the gate terminals of the P-type and N-type MOS transistors 447 and 448 in the right pair via the channel of the first one of the switches 449, and thereby the logic level on the bit line 452 may be reloaded into the conductive line between the gate terminals of the P-type and N-type MOS transistors 447 and 448 in the right pair and the conductive line between the drain terminals of the P-type and N-type MOS transistors 447 and 448 in the left pair. Further, the bit-bar line 453 may be coupled to the drain terminals of the P-type and N-type MOS transistors 447 and 448 in the right pair and the gate terminals of the P-type and N-type MOS transistors 447 and 448 in the left pair via the channel of the second one of the switches 449, and thereby the logic level on the [bit]] bit-bar line 453 may be reloaded into the conductive line between the gate terminals of the P-type and N-type MOS transistors 447 and 448 in the left pair and the conductive line between the drain terminals of the P-type and N-type MOS transistors 447 and 448 in the right pair. Thus, the logic level on the bit line 452 may be registered or latched in the conductive line between the gate terminals of the P-type and N-type MOS transistors 447 and 448 in the right pair and in the conductive line between the drain terminals of the P-type and N-type MOS transistors 447 and 448 in the left pair; a logic level on the bit-bar line 453 may be registered or latched in the conductive line between the gate terminals of the P-type and N-type MOS transistors 447 and 448 in the left pair and in the conductive line between the drain terminals of the P-type and N-type MOS transistors 447 and 448 in the right pair.

Specification for First Type of Latched Non-Volatile Memory Cells

Figure 9A:
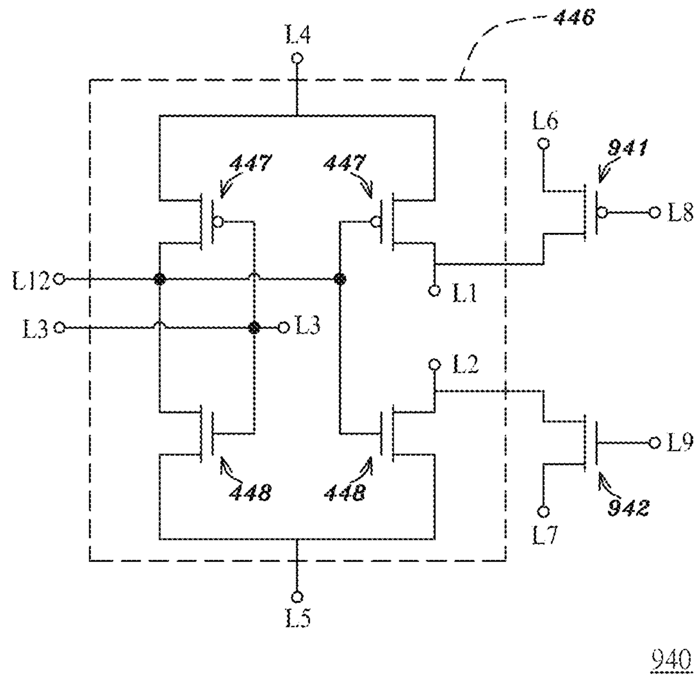
FIG. 9A is a circuit diagram illustrating a first type of latched non-volatile memory cell in accordance with an embodiment of the present application.

FIG. 9A is a circuit diagram illustrating a first type of latched non-volatile memory cell in accordance with an embodiment of the present application. FIGS. 9C-9E are schematically perspective views showing a structure of a first type of latched non-volatile memory cell in FIG. 9A in combination of a sixth or seventh type of non-volatile memory cell in accordance with an embodiment of the present application.

Referring to FIG. 9A, a first type of latched non-volatile memory cell 940 may include a memory unit 446 as illustrated in FIG. 8 for the 6T SRAM cell 398 and the non-volatile memory cell 600, 650, 700, 760, 800, 900 or 910 of one of the first through seventh types. In the memory unit 446, a left pair of the P-type MOS transistor 447 and N-type MOS transistor 448 may have respective drain terminals, in operation, coupling to each other, respective gate terminals coupling to each other and to a node L3 and respective source terminals, in operation, coupling to nodes L4 and L5 respectively. A right pair of the P-type MOS transistor 447 and N-type MOS transistor 448 may have respective drain terminals, in operation, coupling to nodes L1 and L2 respectively, respective gate terminals coupling to each other and respective source terminals, in operation, coupling to the nodes L4 and L5 respectively. The gate terminals of the P-type and N-type MOS transistors 447 and 448 in the right pair may couple to the drain terminals, in operation, of the P-type and N-type MOS transistors 447 and 448 in the left pair and to a node L12. The first type of latched non-volatile memory cell 940 may further include a switch 941, such as P-type or N-type MOS transistor, configured to form a channel with an end coupling to the node L1 and the other end coupling to the node L6 and a switch 942, such as N-type or P-type MOS transistor, configured to form a channel with an end coupling to the node L2 and the other end coupling to the node L7. Anode L8 couples to agate terminal of the P-type or N-type MOS transistor 941, and anode L9 couples to a gate terminal of the P-type or N-type MOS transistor 942. In this case, the switch 941 is a P-type MOS transistor, and the switch 942 is an N-type MOS transistor.

The first type of latched non-volatile memory cell 940 as seen in FIG. 9A may be realized by fin field-effect transistors as seen in FIGS. 9C-9E. In this case, a P-type silicon substrate 2 coupling a voltage Vss of ground reference is provided for the first type of latched non-volatile memory cell 940. The first type of latched non-volatile memory cell 940 may include:

(1) an N-type stripe 901 formed with an N-type well 902 in the P-type silicon substrate 2 and an N-type fin 903 vertically protruding from the a top surface of the N-type well 902, wherein the N-type well 902 may have a depth $d5_w$ between 0.3 and 5 micrometers and a width $w5_w$ between 50 nanometers and 1 micrometer, and the N-type fin 903 may have a height $h5_{fN}$ between 10 and 200 nanometers and a width $w5_m$ between 1 and 100 nanometers;

(2) a P-type fin 904 vertically protruding from the P-type silicon substrate 2, wherein the P-type fin 904 may have a height $h5_{fP}$ between 10 and 200 nanometers and a width $w5_{fP}$ between 1 and 100 nanometers, wherein a space s11 between the N-type fin 903 and P-type fin 904 may range from 100 to 2,000 nanometers;

(3) a field oxide 905, such as silicon oxide, on the P-type silicon substrate 2, wherein the field oxide 905 may have a thickness $t_o$ between 20 and 500 nanometers;

(4) a gate layer 907, such as polysilicon, tungsten, tungsten nitride, titanium, titanium nitride, tantalum, tantalum nitride, copper-containing metal, aluminum-containing metal, or other conductive metals, over the field oxide 905, wherein the gate layer 907 may be patterned with multiple longitudinal gates across over the N-type fin 903, P-type fin 904 or both of the N-type fin 903 and P-type fin 904. Each of the longitudinal gates of the gate layer 907 may have a width between 1 and 25 nanometers; and (5) a gate oxide 906, such as silicon oxide, hafnium-containing oxide, zirconium-containing oxide or titanium-containing oxide, between the gate layer 907 and the N-type fin 903, between the gate layer 907 and the P-type fin 904 and between the gate layer 907 and the field oxide 905, wherein the gate oxide 906 may have a thickness between 1 and 5 nanometers.

Referring to FIGS. 9A and 9C-9E, the N-type fin 903 may be doped with P-type atoms, such as boron atoms, so as to form two $P^+$ portions in the N-type fin 903 at two opposite sides of the gate oxide 906, composing two respective ends of a channel of a P-type metal-oxide-semiconductor (MOS) transistor T1, T3 or T5, wherein the boron atoms in the N-type fin 903 may have a concentration greater than those in the P-type silicon substrate 2. The P-type fin 904 may be doped with N-type atoms, such as arsenic atoms, so as to form two $N^+$ portions in the P-type fin 904 at two opposite sides of the gate oxide 906, composing two respective ends of a channel of an N-type metal-oxide-semiconductor (MOS) transistor T2, T4 or T6, wherein the arsenic atoms in the P-type fin 904 may have a concentration greater than those in the N-type well 902. The P-type and N-type metal-oxide-semiconductor (MOS) transistors 447 and 448 in the left pair as seen in FIG. 9A may have the structures T1 and T2 respectively as seen in FIGS. 9C-9E. The P-type and N-type metal-oxide-semiconductor (MOS) transistors 447 and 448 in the right pair as seen in FIG. 9A may have the structures T3 and T4 respectively as seen in FIGS. 9C-9E. The P-type and N-type metal-oxide-semiconductor (MOS) transistors 491 and 492 as seen in FIG. 9A may have the structures T5 and T6 respectively as seen in FIGS. 9C-9E.

Referring to FIGS. 9C-9E, the first type of latched non-volatile memory cell 940 is shown to be arranged with the non-volatile memory cell 900 or 910 of the sixth or seventh type, for example. The first type of latched non-volatile memory cell 940 may be arranged with two random access memories R1 and R2 as seen in FIG. 9C. For example, the random access memories R1 and R2 may be the respective resistive random access memories (RRAM) 870-1 and 870-2 as seen in FIGS. 6E and 6F having the respective bottom electrodes 871 formed on a lower one of the interconnection metal layers 6 provided for a metal interconnect 908 of the latched non-volatile memory cell 940 of the first type, wherein the metal interconnect 908 connects the bottom electrodes 871 of the resistive random access memories (RRAM) 870-1 and 870-2 to each other, to the gate terminals of the P-type and N-type MOS transistors T1 and T2 and to the node L3, and the respective top electrodes 872 formed under and in contact with an upper one of the interconnection metal layers 6 provided for two respective metal interconnects 911 and 912 of the latched non-volatile memory cell 940 of the first type, wherein the metal interconnect 911 connects the top electrode 872 of the resistive random access memories (RRAM) 870-1 to the drain terminals, in operation, of the P-type MOS transistors T3 and T5 and to the node L1, and the metal interconnect 912 connects the top electrode 872 of the resistive random access memories (RRAM) 870-2 to the drain terminals, in operation, of the N-type MOS transistors T4 and T6 and to the node L2.

Alternatively, the random access memories R1 and R2 may be the respective magnetoresistive random access memories (MRAM) 880-1 and 880-2 as seen in FIGS. 7E and 7F having the respective bottom electrodes 881 formed on a lower one of the interconnection metal layers 6 provided for the metal interconnect 908 of the latched non-volatile memory cell 940 of the first type, wherein the metal interconnect 908 connects the bottom electrodes 881 of the magnetoresistive random access memories (MRAM) 880-1 and 880-2 to each other, to the gate terminals of the P-type and N-type MOS transistors T1 and T2 and to the node L3, and the respective top electrodes 882 formed under and in contact with an upper one of the interconnection metal layers 6 provided for the two respective metal interconnects 911 and 912 of the latched non-volatile memory cell 940 of the first type, wherein the metal interconnect 911 connects the top electrode 882 of the magnetoresistive random access memories (MRAM) 880-1 to the drain terminals, in operation, of the P-type MOS transistors T3 and T5 and to the node L1, and the metal interconnect 912 connects the top electrode 882 of the magnetoresistive random access memories (MRAM) 880-2 to the drain terminals, in operation, of the N-type MOS transistors T4 and T6 and to the node L2.

Alternatively, the random access memories R1 and R2 may be the respective magnetoresistive random access memories (MRAM) 880-3 and 880-4 as seen in FIGS. 7H and 7I having the respective bottom electrodes 881 formed on a lower one of the interconnection metal layers 6 provided for the metal interconnect 908 of the latched non-volatile memory cell 940 of the first type, wherein the metal interconnect 908 connects the bottom electrodes 881 of the magnetoresistive random access memories (MRAM) 880-3 and 880-4 to each other, to the gate terminals of the P-type and N-type MOS transistors T1 and T2 and to the node L3, and the respective top electrodes 882 formed under and in contact with an upper one of the interconnection metal layers 6 provided for the two respective metal interconnects 911 and 912 of the latched non-volatile memory cell 940 of the first type, wherein the metal interconnect 911 connects the top electrode 882 of the magnetoresistive random access memories (MRAM) 880-3 to the drain terminals, in operation, of the P-type MOS transistors T3 and T5 and to the node L1, and the metal interconnect 912 connects the top electrode 882 of the magnetoresistive random access memories (MRAM) 880-4 to the drain terminals, in operation, of the N-type MOS transistors T4 and T6 and to the node L2. Referring to FIG. 9D, the first type of latched non-volatile memory cell 940 may further include a metal interconnect 913 coupling the node L12 to the drain terminals, in operation, of the P-type and N-type MOS transistors T1 and T2 and to the gate terminals of the P-type and N-type MOS transistors T3 and T4.

Referring to FIG. 9E, the first type of latched non-volatile memory cell 940 may further include a metal interconnect 914 coupling the node L4 to the source terminal, in operation, of the P-type MOS transistor T3, a metal interconnect 915 coupling the node L5 to the source terminal, in operation, of the N-type MOS transistor T4, a metal interconnect

916 coupling the node L6 to the source terminal, in operation, of the P-type MOS transistor T5, a metal interconnect 917 coupling the node L7 to the source terminal, in operation, of the N-type MOS transistor T6, a metal interconnect 918 coupling the node L8 to the gate terminal of the P-type MOS transistor T5, and a metal interconnect 919 coupling the node L9 to the gate terminal of the N-type MOS transistor T6.

(1) First Scenario for First Type of Latched Non-Volatile Memory Cell

For a first scenario, referring to FIGS. 1A-1H and 9A, each of the non-volatile memory cells 600 of the first type as seen in FIGS. 1A-1H may be arranged to have its node N3 coupling to the node L1 of the memory unit 446, its node N4 coupling to the node L2 of the memory unit 446 and its node N0 coupling to the node L3 of the memory unit 446. When the floating gate 607 of said each of the non-volatile memory cells 600 is being erased, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the erasing voltage $V_{Er}$ to turn on the channel of the N-type MOS transistor 942 to couple the node L7 to the node L2, (5) the node L6 may be switched to couple to the erasing voltage $V_{Er}$, (6) the node L7 may be switched to couple to the voltage Vss of ground reference and (7) the node L3 may be switched to be floating. Thereby, the floating gate 607 of said each of the non-volatile memory cells 600 may be erased to a logic level of "1" as illustrated in FIGS. 1A-1E.

For the first scenario, referring to FIGS. 1A-1E and 9A, when the floating gate 607 of said each of the non-volatile memory cells 600 is being programmed, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the programming voltage $V_{Pr}$, (6) the node L7 may be switched to couple to the voltage Vss of ground reference and (7) the node L3 may be switched to couple to the programming voltage $V_{Pr}$. Thereby, the floating gate 607 of said each of the non-volatile memory cells 600 may be programmed to a logic level of "0" as illustrated in FIGS. 1A-1E.

For the first scenario, referring to FIGS. 1A-1E and 9A, in an initial stage when the latched non-volatile memory cell 940 is initialized to operate, (1) the node L4 may be switched to the voltage Vcc of power supply, (2) the node L5 may be switched to the voltage Vss of ground reference, (3) the node L8 may be switched to couple to the voltage Vss of ground reference to turn on the channel of the P-type MOS transistor 941 to couple the node L6 to the node L1, (4) the node L9 may be switched to couple to the voltage Vcc of power supply to turn on the channel of the N-type MOS transistor 942 to couple the node L7 to the node L2, (5) the node L6 may be switched to couple to the voltage Vcc of power supply and (6) the node L7 may be switched to couple to the voltage Vss of ground reference. Thereby, said each of the non-volatile memory cells 600 may have its output N0 coupling to the node L3 of the memory unit 446 to latch in the memory unit 446 the logic level at the output N0 of said each of the non-volatile memory cells 600. A conductive line connecting the gate terminals of the P-type and N-type MOS transistor 447 and 448 in the left pair may latch a logic level that is the same as that at the node N0 of said each of the non-volatile memory cells 600. A conductive line connecting the gate terminals of the P-type and N-type MOS transistor 447 and 448 in the right pair may latch a logic level that is opposite to that at the node N0 of said each of the non-volatile memory cells 600.

For the first scenario, referring to FIGS. 1A-1E and 9A, for operation of the latched non-volatile memory cell 940 after the initialization to operate, (1) the node L4 may be switched to the voltage Vcc of power supply, (2) the node L5 may be switched to the voltage Vss of ground reference, (3) the node L8 may be switched to couple to the voltage Vcc of power supply to turn off the channel of the P-type MOS transistor 941 to disconnect the node L6 from the node L1 and (4) the node L9 may be switched to couple to the voltage Vss of ground reference to turn off the channel of the N-type MOS transistor 942 to disconnect the node L7 from the node L2. Thereby, the latched non-volatile memory cell 940 may generate an output at the node L3 or L12 associated with the logic level stored in the floating gate 607 of said each of the non-volatile memory cells 600.

(2) Second Scenario for First Type of Latched Non-Volatile Memory Cell

For a second scenario, referring to FIGS. 2A-2E and 9A, each of the non-volatile memory cells 650 of the second type as seen in FIGS. 2A-2E may be arranged to have its node N3 coupling to the node L1 of the memory unit 446, its node N4 coupling to the node L2 of the memory unit 446 and its node N0 coupling to the node L3 of the memory unit 446. When the floating gate 607 of said each of the non-volatile memory cells 650 is being erased, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the erasing voltage $V_{Er}$ to turn on the channel of the N-type MOS transistor 942 to couple the node L7 to the node L2, (5) the node L6 may be switched to couple to the voltage Vss of ground reference, (6) the node L7 may be switched (i) to couple to the erasing voltage $V_{Er}$ for the first and third aspects as illustrated in FIGS. 2A-2E or (ii) to be floating for the second aspect as illustrated in FIGS. 2A-2E and (7) the node L3 may be switched (i) to be floating for the first aspect as illustrated in FIGS. 2A-2E or (ii) to couple to the erasing voltage $V_{Er}$ for the second and third aspects as illustrated in FIGS. 2A-2E. Thereby, the floating gate 607 of said each of the non-volatile memory cells 650 may be erased to a logic level of "1" as illustrated in FIGS. 2A-2E.

For the second scenario, referring to FIGS. 2A-2E and 9A, when the floating gate 607 of said each of the non-volatile memory cells 650 is being programmed, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the programming voltage $V_{Pr}$, (6) the node L7 may be switched (i) to couple to the voltage Vss of ground reference for the first and third aspects as illustrated in FIGS. 2A-2E or (ii) to be floating for the second aspect as illustrated in FIGS. 2A-2E and (7) the node L3 may be switched (i) to be floating for the first aspect as illustrated in FIGS. 2A-2E or (ii) to couple to the voltage Vss of ground reference for the second and third aspects as illustrated in FIGS. 2A-2E. Thereby, the floating gate 607 of said each of the non-volatile memory cells 650 may be programmed to a logic level of "0" as illustrated in FIGS. 2A-2E.

For the second scenario, referring to FIGS. 2A-2E and 9A, in an initial stage when the latched non-volatile memory cell 940 is initialized to operate, (1) the node L4 may be switched to the voltage Vcc of power supply, (2) the node L5 may be switched to the voltage Vss of ground reference, (3) the node L8 may be switched to couple to the voltage Vss of ground reference to turn on the channel of the P-type MOS transistor 941 to couple the node L6 to the node L1, (4) the node L9 may be switched to couple to the voltage Vcc of power supply to turn on the channel of the N-type MOS transistor 942 to couple the node L7 to the node L2, (5) the node L6 may be switched to couple to the voltage Vcc of power supply and (6) the node L7 may be switched to couple to the voltage Vss of ground reference. Thereby, said each of the non-volatile memory cells 650 may have its output N0 coupling to the node L3 of the memory unit 446 to latch in the memory unit 446 the logic level at the output N0 of said each of the non-volatile memory cells 650. A conductive line connecting the gate terminals of the P-type and N-type MOS transistor 447 and 448 in the left pair may latch a logic level that is the same as that at the node N0 of said each of the non-volatile memory cells 650. A conductive line connecting the gate terminals of the P-type and N-type MOS transistor 447 and 448 in the right pair may latch a logic level that is opposite to that at the node N0 of said each of the non-volatile memory cells 650.

For the second scenario, referring to FIGS. 2A-2E and 9A, for operation of the latched non-volatile memory cell 940 after the initialization to operate, (1) the node L4 may be switched to the voltage Vcc of power supply, (2) the node L5 may be switched to the voltage Vss of ground reference, (3) the node L8 may be switched to couple to the voltage Vcc of power supply to turn off the channel of the P-type MOS transistor 941 to disconnect the node L6 from the node L1 and (4) the node L9 may be switched to couple to the voltage Vss of ground reference to turn off the channel of the N-type MOS transistor 942 to disconnect the node L7 from the node L2. Thereby, the latched non-volatile memory cell 940 may generate an output at the node L3 or L12 associated with the logic level stored in the floating gate 607 of said each of the non-volatile memory cells 650.

(3) Third Scenario for First Type of Latched Non-Volatile Memory Cell

For a third scenario, referring to FIGS. 3A-3D, 3S and 9A, each of the non-volatile memory cells 700 of the third type as seen in FIGS. 3A-3D and 3S may be arranged to have its node N3 coupling to the node L1 of the memory unit 446, its node N4 coupling to the node L2 of the memory unit 446 and its node N0 coupling to the node L3 of the memory unit 446. When the floating gate 710 of said each of the non-volatile memory cells 700 is being erased, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the erasing voltage $V_{Er}$ to turn on the channel of the N-type MOS transistor 942 to couple the node L7 to the node L2, (5) the node L6 may be switched to couple to the voltage Vss of ground reference, (6) the node L7 may be switched to couple to the voltage Vss of ground reference and (7) the node L3 may be switched to be floating. Thereby, the floating gate 710 of said each of the non-volatile memory cells 700 may be erased to a logic level of "1" as illustrated in FIGS. 3A-3D and 3S.

For the third scenario, referring to FIGS. 3A-3D, 3S and 9A, when the floating gate 710 of said each of the non-volatile memory cells 700 is being programmed, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the programming voltage $V_{Pr}$, (6) the node L7 may be switched to couple to the voltage Vss of ground reference and (7) the node L3 may be switched to couple to the programming voltage $V_{Pr}$. Thereby, the floating gate 710 of said each of the non-volatile memory cells 700 may be programmed to a logic level of "0" as illustrated in FIGS. 3A-3D and 3S.

For the third scenario, referring to FIGS. 3A-3D, 3S and 9A, in an initial stage when the latched non-volatile memory cell 940 is initialized to operate, (1) the node L4 may be switched to the voltage Vcc of power supply, (2) the node L5 may be switched to the voltage Vss of ground reference, (3) the node L8 may be switched to couple to the voltage Vss of ground reference to turn on the channel of the P-type MOS transistor 941 to couple the node L6 to the node L1, (4) the node L9 may be switched to couple to the voltage Vcc of power supply to turn on the channel of the N-type MOS transistor 942 to couple the node L7 to the node L2, (5) the node L6 may be switched to couple to the voltage Vcc of power supply and (6) the node L7 may be switched to couple to the voltage Vss of ground reference. Thereby, said each of the non-volatile memory cells 700 may have its output N0 coupling to the node L3 of the memory unit 446 to latch in the memory unit 446 the logic level at the output N0 of said each of the non-volatile memory cells 700. A conductive line connecting the gate terminals of the P-type and N-type MOS transistor 447 and 448 in the left pair may latch a logic level that is the same as that at the node N0 of said each of the non-volatile memory cells 700. A conductive line connecting the gate terminals of the P-type and N-type MOS transistor 447 and 448 in the right pair may latch a logic level that is opposite to that at the node N0 of said each of the non-volatile memory cells 700.

For the third scenario, referring to FIGS. 3A-3D, 3S and 9A, for operation of the latched non-volatile memory cell 940 after the initialization to operate, (1) the node L4 may be switched to the voltage Vcc of power supply, (2) the node L5 may be switched to the voltage Vss of ground reference, (3) the node L8 may be switched to couple to the voltage Vcc of power supply to turn off the channel of the P-type MOS transistor 941 to disconnect the node L6 from the node L1 and (4) the node L9 may be switched to couple to the voltage Vss of ground reference to turn off the channel of the N-type MOS transistor 942 to disconnect the node L7 from the node L2. Thereby, the latched non-volatile memory cell 940 may generate an output at the node L3 or L12 associated with the logic level stored in the floating gate 710 of said each of the non-volatile memory cells 700.

(4) Fourth Scenario for First Type of Latched Non-Volatile Memory Cell

For a fourth scenario, referring to FIGS. 4A-4D, 4S and 9A, each of the non-volatile memory cells 760 of the fourth type as seen in FIGS. 4A-4D and 4S may be arranged to have its node N3 coupling to the node L1 of the memory unit 446, its node N4 coupling to the node L2 of the memory unit 446 and its node N0 coupling to the node L3 of the memory unit 446. When the floating gate 710 of said each of the non-volatile memory cells 760 is being erased, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the erasing voltage $V_{Er}$ to turn on the channel of the N-type MOS transistor 942 to couple the node L7 to the node L2, (5) the node L6 may be switched to couple to the erasing voltage $V_{Er}$, (6) the node L7 may be switched to couple to the voltage Vss of ground reference and (7) the node L3 may be switched (i) to be floating for said each of the non-volatile memory cells 760 as illustrated in FIGS. 4A-4D and 4S or (ii) to couple to the voltage Vss of ground reference for said each of the non-volatile memory cells 760 as illustrated in FIG. 4D. Thereby, the floating gate 710 of said each of the non-volatile memory cells 760 may be erased to a logic level of "1" as illustrated in FIGS. 4A-4D and 4S.

For the fourth scenario, referring to FIGS. 4A-4D, 4S and 9A, when the floating gate 710 of said each of the non-volatile memory cells 700 is being programmed, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the programming voltage $V_{Pr}$, (6) the node L7 may be switched to couple to the voltage Vss of ground reference and (7) the node L3 may be switched to be floating for said each of the non-volatile memory cells 760 as illustrated in FIGS. 4A-4D and 4S or (ii) to couple to the voltage Vss of ground reference for said each of the non-volatile memory cells 760 as illustrated in FIG. 4D. Thereby, the floating gate 710 of said each of the non-volatile memory cells 760 may be programmed to a logic level of "0" as illustrated in FIGS. 4A-4D and 4S.

For the fourth scenario, referring to FIGS. 4A-4D, 4S and 9A, in an initial stage when the latched non-volatile memory cell 940 is initialized to operate, (1) the node L4 may be switched to the voltage Vcc of power supply, (2) the node L5 may be switched to the voltage Vss of ground reference, (3) the node L8 may be switched to couple to the voltage Vss of ground reference to turn on the channel of the P-type MOS transistor 941 to couple the node L6 to the node L1, (4) the node L9 may be switched to couple to the voltage Vcc of power supply to turn on the channel of the N-type MOS transistor 942 to couple the node L7 to the node L2, (5) the node L6 may be switched to couple to the voltage Vcc of power supply and (6) the node L7 may be switched to couple to the voltage Vss of ground reference. Thereby, said each of the non-volatile memory cells 760 may have its output N0 coupling to the node L3 of the memory unit 446 to latch in the memory unit 446 the logic level at the output N0 of said each of the non-volatile memory cells 760. A conductive line connecting the gate terminals of the P-type and N-type MOS transistor 447 and 448 in the left pair may latch a logic level that is the same as that at the node N0 of said each of the non-volatile memory cells 760. A conductive line connecting the gate terminals of the P-type and N-type MOS transistor 447 and 448 in the right pair may latch a logic level that is opposite to that at the node N0 of said each of the non-volatile memory cells 760.

For the fourth scenario, referring to FIGS. 4A-4D, 4S and 9A, for operation of the latched non-volatile memory cell 940 after the initialization to operate, (1) the node L4 may be switched to the voltage Vcc of power supply, (2) the node L5 may be switched to the voltage Vss of ground reference, (3) the node L8 may be switched to couple to the voltage Vcc of power supply to turn off the channel of the P-type MOS transistor 941 to disconnect the node L6 from the node L1 and (4) the node L9 may be switched to couple to the voltage Vss of ground reference to turn off the channel of the N-type MOS transistor 942 to disconnect the node L7 from the node L2. Thereby, the latched non-volatile memory cell 940 may generate an output at the node L3 or L12 associated with the logic level stored in the floating gate 710 of said each of the non-volatile memory cells 760.

(5) Fifth Scenario for First Type of Latched Non-volatile Memory Cell

For a fifth scenario, referring to FIGS. 5A-5F and 9A, each of the non-volatile memory cells 800 of the fifth type as seen in FIGS. 5A-5F may be arranged to have its node N3 coupling to the node L1 of the memory unit 446, its node N4 coupling to the node L2 of the memory unit 446 and its node N0 coupling to the node L3 of the memory unit 446. When the floating gate 808 of said each of the non-volatile memory cells 800 is being erased, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the erasing voltage $V_{Er}$ to turn on the channel of the N-type MOS transistor 942 to couple the node L7 to the node L2, (5) the node L6 may be switched to couple to the erasing voltage $V_{Er}$, (6) the node L7 may be switched to couple to the voltage Vss of ground reference and (7) the node L3 may be switched (i) to be floating for said each of the non-volatile memory cells 800 as illustrated in FIGS. 5A-5F or (ii) to couple to the voltage Vss of ground reference for said each of the non-volatile memory cells 800 as illustrated in FIG. 5E. Thereby, the floating gate 808 of said each of the non-volatile memory cells 800 may be erased to a logic level of "1" as illustrated in FIGS. 5A-5F.

For the fifth scenario, referring to FIGS. 5A-5F and 9A, when the floating gate 710 of said each of the non-volatile memory cells 800 is being programmed, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the programming voltage $V_{Pr}$, (6) the node L7 may be switched to couple to the voltage Vss of ground reference and (7) the node L3 may be switched to be floating. Thereby, the floating gate 808 of said each of the non-volatile memory cells 800 may be programmed to a logic level of "0" as illustrated in FIGS. 5A-5F.

For the fifth scenario, referring to FIGS. 5A-5F and 9A, in an initial stage when the latched non-volatile memory cell 940 is initialized to operate, (1) the node L4 may be switched to the voltage Vcc of power supply, (2) the node L5 may be switched to the voltage Vss of ground reference, (3) the node L8 may be switched to couple to the voltage Vss of ground reference to turn on the channel of the P-type MOS transistor 941 to couple the node L6 to the node L1, (4) the node L9 may be switched to couple to the voltage Vcc of power supply to turn on the channel of the N-type MOS transistor 942 to couple the node L7 to the node L2, (5) the node L6 may be switched to couple to the voltage Vcc of power supply and (6) the node L7 may be switched to couple to the voltage Vss of ground reference. Thereby, said each of the non-volatile memory cells 800 may have its output N0 coupling to the node L3 of the memory unit 446 to latch in the memory unit 446 the logic level at the output N0 of said each of the non-volatile memory cells 800. A conductive line connecting the gate terminals of the P-type and N-type MOS transistor 447 and 448 in the left pair may latch a logic level that is the same as that at the node N0 of said each of the non-volatile memory cells 800. A conductive line connecting the gate terminals of the P-type and N-type MOS transistor 447 and 448 in the right pair may latch a logic level that is opposite to that at the node N0 of said each of the non-volatile memory cells 800.

For the fifth scenario, referring to FIGS. 5A-5F and 9A, for operation of the latched non-volatile memory cell 940 after the initialization to operate, (1) the node L4 may be switched to the voltage Vcc of power supply, (2) the node L5 may be switched to the voltage Vss of ground reference, (3) the node L8 may be switched to couple to the voltage Vcc of power supply to turn off the channel of the P-type MOS transistor 941 to disconnect the node L6 from the node L1 and (4) the node L9 may be switched to couple to the voltage Vss of ground reference to turn off the channel of the N-type MOS transistor 942 to disconnect the node L7 from the node L2. Thereby, the latched non-volatile memory cell 940 may generate an output at the node L3 or L12 associated with the logic level stored in the floating gate 808 of said each of the non-volatile memory cells 800.

(6) Sixth Scenario for First Type of Latched Non-Volatile Memory Cell

For a sixth scenario, referring to FIGS. 6E, 6F and 9A, each of the non-volatile memory cells 900 of the sixth type as seen in FIGS. 6E and 6F may be arranged to have its node M1 coupling to the node L1 of the memory unit 446, its node M2 coupling to the node L2 of the memory unit 446 and its node M3 coupling to the node L3 of the memory unit 446. When said each of the non-volatile memory cells 900 is being in the forming step, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the forming voltage $V_f$ to turn on the channel of the N-type MOS transistor 942 to couple the node L7 to the node L2, (5) the node L6 may be switched to couple to the forming voltage $V_f$, (6) the node L7 may be switched to couple to the forming voltage $V_f$ and (7) the node L3 may be switched to the voltage Vss of ground reference. Thereby, the resistive random access memories 870-1 and 870-2 may be formed with the first and second low resistances as illustrated in FIGS. 6E and 6F.

For the sixth scenario, referring to FIGS. 6E, 6F and 9A, when the resistive random access memory 870-2 is being reset with the first high resistance as illustrated in the first condition, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the programming voltage $V_{Pr}$, (6) the node L7 may be switched to couple to the voltage Vss of ground reference and (7) the node L3 may be switched to be floating. Thereby, the resistive random access memory 870-2 may be reset with the first high resistance as illustrated in FIGS. 6E and 6F. The resistive random access memory 870-1 is kept in the first low resistance as illustrated in FIGS. 6E and 6F.

For the sixth scenario, referring to FIGS. 6E, 6F and 9A, when the resistive random access memory 870-1 is being reset with the second high resistance as illustrated in the second condition, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the voltage Vss of ground reference, (6) the node L7 may be switched to couple to the programming voltage $V_{Pr}$ and (7) the node L3 may be switched to be floating. Thereby, the resistive random access memory 870-1 may be reset with the second high resistance as illustrated in FIGS. 6E and 6F. The resistive random access memory 870-2 is kept in the second low resistance as illustrated in FIGS. 6E and 6F.

For the sixth scenario, referring to FIGS. 6E, 6F and 9A, when the resistive random access memory 870-1 is being reset with the third high resistance and the resistive random access memory 870-2 is being set with the third low resistance, as illustrated in the third condition, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the voltage Vss of ground reference, (6) the node L7 may be switched to couple to the programming voltage $V_{Pr}$ and (7) the node L3 may be switched to be floating. Thereby, the resistive random access memory 870-1 may be reset with the third high resistance and the resistive random access memory 870-2 may be set with the third low resistance as illustrated in FIGS. 6E and 6F.

For the sixth scenario, referring to FIGS. 6E, 6F and 9A, when the resistive random access memory 870-2 is being reset with the fourth high resistance and the resistive random access memory 870-1 is being set with the fourth low resistance, as illustrated in the fourth condition, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the programming voltage $V_{Pr}$, (6) the node L7 may be switched to couple to the voltage Vss of ground reference and (7) the node L3 may be switched to be floating. Thereby, the resistive random access memory 870-1 may be reset with the fourth low resistance and the resistive random access memory 870-2 may be set with the fourth high resistance as illustrated in FIGS. 6E and 6F.

For the sixth scenario, referring to FIGS. 6E, 6F and 9A, in an initial stage when the latched non-volatile memory cell 940 is initialized to operate, (1) the node L4 may be switched to the voltage Vcc of power supply, (2) the node L5 may be switched to the voltage Vss of ground reference, (3) the node L8 may be switched to couple to the voltage Vss of ground reference to turn on the channel of the P-type MOS transistor 941 to couple the node L6 to the node L1, (4) the node L9 may be switched to couple to the voltage Vcc of power supply to turn on the channel of the N-type MOS transistor 942 to couple the node L7 to the node L2, (5) the node L6 may be switched to couple to the voltage Vcc of power supply and (6) the node L7 may be switched to couple to the voltage Vss of ground reference. Thereby, said each of the non-volatile memory cells 900 may have its output M3 coupling to the node L3 of the memory unit 446 to latch in the memory unit 446 the logic level at the node M3 of said each of the non-volatile memory cells 900. A conductive line connecting the gate terminals of the P-type and N-type MOS transistor 447 and 448 in the left pair may latch a logic level that is the same as that at the node M3 of said each of the non-volatile memory cells 900. A conductive line connecting the gate terminals of the P-type and N-type MOS transistor 447 and 448 in the right pair may latch a logic level that is opposite to that at the node M3 of said each of the non-volatile memory cells 900.

For the sixth scenario, referring to FIGS. 6E, 6F and 9A, for operation of the latched non-volatile memory cell 940, (1) the node L4 may be switched to the voltage Vcc of power supply, (2) the node L5 may be switched to the voltage Vss of ground reference, (3) the node L8 may be switched to couple to the voltage Vcc of power supply to turn off the channel of the P-type MOS transistor 941 to disconnect the node L6 from the node L1 and (4) the node L9 may be switched to couple to the voltage Vss of ground reference to turn off the channel of the N-type MOS transistor 942 to disconnect the node L7 from the node L2. Thereby, the latched non-volatile memory cell 940 may generate an output at the node L3 or L12 associated with the logic level of the node M3 of said each of the non-volatile memory cells 900 determined by the resistances of the resistive random access memories 870-1 and 870-2.

Alternatively, for the sixth scenario, referring to FIGS. 6G and 9A, each of the non-volatile memory cells 900 of the sixth type as seen in FIG. 6G may be arranged to have its node M10 coupling to the node L1 of the memory unit 446, its node M11 coupling to the node L2 of the memory unit 446 and its node M12 coupling to the node L3 of the memory unit 446. When said each of the non-volatile memory cells 900 is being in the forming step, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the voltage Vss of ground reference to turn off the channel of the N-type MOS transistor 942 to disconnect the node L7 from the node L2, (5) the node L6 may be switched to couple to the forming voltage $V_f$ and (6) the node L3 may be switched to the voltage Vss of ground reference. Thereby, the resistive random access memory 870 may be formed with the fifth low resistance as illustrated in FIG. 6G.

For the sixth scenario, referring to FIGS. 6G and 9A, when the resistive random access memory 870 is being reset with the fifth high resistance, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the voltage Vss of ground reference, (6) the node L7 may be switched to couple to the programming voltage $V_{Pr}$ and (7) the node L3 may be switched to be floating. Thereby, the resistive random access memory 870 may be reset with the fifth high resistance as illustrated in FIG. 6G. The sixth type of non-volatile memory cell 900 is programmed with a logic level of "0".

For the sixth scenario, referring to FIGS. 6G and 9A, after the sixth type of non-volatile memory cell 900 is programmed with a logic level of "0", the sixth type of non-volatile memory cell 900 may be programmed with a logic level of "1" by setting the resistive random access memory 870 with the sixth low resistance. When the resistive random access memory 870 is being set with the sixth low resistance, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the programming voltage $V_{Pr}$, (6) the node L7 may be switched to couple to the voltage Vss of ground reference and (7) the node L3 may be switched to be floating. Thereby, the resistive random access memory 870 may be reset with the sixth low resistance as illustrated in FIG. 6G.

For the sixth scenario, referring to FIGS. 6G and 9A, in an initial stage when the latched non-volatile memory cell 940 is initialized to operate, (1) the node L4 may be switched to the voltage Vcc of power supply, (2) the node L5 may be switched to the voltage Vss of ground reference, (3) the node L8 may be switched to couple to the voltage Vss of ground reference to turn on the channel of the P-type MOS transistor 941 to couple the node L6 to the node L1, (4) the node L9 may be switched to couple to the voltage Vcc of power supply to turn on the channel of the N-type MOS transistor 942 to couple the node L7 to the node L2, (5) the node L6 may be switched to couple to the voltage Vcc of power supply and (6) the node L7 may be switched to couple to the voltage Vss of ground reference. Thereby, said each of the non-volatile memory cells 900 may have its output M12 coupling to the node L3 of the memory unit 446 to latch in the memory unit 446 the logic level at the node M12 of said each of the non-volatile memory cells 900. A conductive line connecting the gate terminals of the P-type and N-type MOS transistor 447 and 448 in the left pair may latch a logic level that is the same as that at the node M12 of said each of the non-volatile memory cells 900. A conductive line connecting the gate terminals of the P-type and N-type MOS transistor 447 and 448 in the right pair may latch a logic level that is opposite to that at the node M12 of said each of the non-volatile memory cells 900.

For the sixth scenario, referring to FIGS. 6G and 9A, for operation of the latched non-volatile memory cell 940, (1)

the node L4 may be switched to the voltage Vcc of power supply, (2) the node L5 may be switched to the voltage Vss of ground reference, (3) the node L8 may be switched to couple to the voltage Vcc of power supply to turn off the channel of the P-type MOS transistor 941 to disconnect the node L6 from the node L1 and (4) the node L9 may be switched to couple to the voltage Vss of ground reference to turn off the channel of the N-type MOS transistor 942 to disconnect the node L7 from the node L2. Thereby, the latched non-volatile memory cell 940 may generate an output at the node L3 or L12 associated with the logic level of the node M12 of said each of the non-volatile memory cells 900 determined by the resistances of the resistive random access memory 870.

(7) Seventh Scenario for First Type of Latched Non-Volatile Memory Cell

For a seventh scenario, referring to FIGS. 7E and 7F for the first alternative and FIG. 9A, each of the non-volatile memory cells 910 of the seventh type as seen in FIGS. 7E and 7F may be arranged to have its node M4 coupling to the node L1 of the memory unit 446, its node M5 coupling to the node L2 of the memory unit 446 and its node M6 coupling to the node L3 of the memory unit 446. When the magnetoresistive random access memory 880-2 is being reset with the first high resistance and the magnetoresistive random access memory 880-1 is being set with the first low resistance, as illustrated in the first condition, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the programming voltage $V_{Pr}$, (6) the node L7 may be switched to couple to the voltage Vss of ground reference and (7) the node L3 may be switched to be floating. Thereby, the magnetoresistive random access memory 880-2 may be reset with the first high resistance and the magnetoresistive random access memory 880-1 may be set with the first low resistance, as illustrated in FIGS. 7E and 7F.

For the seventh scenario, referring to FIGS. 7E and 7F for the first alternative and FIG. 9A, when the magnetoresistive random access memory 880-1 is being reset with the second high resistance and the magnetoresistive random access memory 880-2 is being set with the second low resistance, as illustrated in the second condition, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the voltage Vss of ground reference, (6) the node L7 may be switched to couple to the programming voltage $V_{Pr}$ and (7) the node L3 may be switched to be floating. Thereby, the magnetoresistive random access memory 880-1 may be reset with the second high resistance and the magnetoresistive random access memory 880-2 may be set with the second low resistance, as illustrated in FIGS. 7E and 7F.

For the seventh scenario, referring to FIGS. 7E and 7F for the first alternative and FIG. 9A, in an initial stage when the latched non-volatile memory cell 940 is initialized to operate, (1) the node L4 may be switched to the voltage Vcc of power supply, (2) the node L5 may be switched to the voltage Vss of ground reference, (3) the node L8 may be switched to couple to the voltage Vss of ground reference to turn on the channel of the P-type MOS transistor 941 to couple the node L6 to the node L1, (4) the node L9 may be switched to couple to the voltage Vcc of power supply to turn on the channel of the N-type MOS transistor 942 to couple the node L7 to the node L2, (5) the node L6 may be switched to couple to the voltage Vcc of power supply and (6) the node L7 may be switched to couple to the voltage Vss of ground reference. Thereby, said each of the non-volatile memory cells 910 may have its output M6 coupling to the node L3 of the memory unit 446 to latch in the memory unit 446 the logic level at the node M6 of said each of the non-volatile memory cells 910. A conductive line connecting the gate terminals of the P-type and N-type MOS transistor 447 and 448 in the left pair may latch a logic level that is the same as that at the node M6 of said each of the non-volatile memory cells 910. A conductive line connecting the gate terminals of the P-type and N-type MOS transistor 447 and 448 in the right pair may latch a logic level that is opposite to that at the node M6 of said each of the non-volatile memory cells 910.

For the seventh scenario, referring to FIGS. 7E and 7F for the first alternative and FIG. 9A, for operation of the latched non-volatile memory cell 940, (1) the node L4 may be switched to the voltage Vcc of power supply, (2) the node L5 may be switched to the voltage Vss of ground reference, (3) the node L8 may be switched to couple to the voltage Vcc of power supply to turn off the channel of the P-type MOS transistor 941 to disconnect the node L6 from the node L1 and (4) the node L9 may be switched to couple to the voltage Vss of ground reference to turn off the channel of the N-type MOS transistor 942 to disconnect the node L7 from the node L2. Thereby, the latched non-volatile memory cell 940 may generate an output at the node L3 or L12 associated with the logic level of the node M6 of said each of the non-volatile memory cells 910 determined by the resistances of the magnetoresistive random access memories 880-1 and 880-2.

For the seventh scenario, referring to FIG. 7G for the first alternative and FIG. 9A, each of the non-volatile memory cells 910 of the seventh type as seen in FIG. 7G may be arranged to have its node M13 coupling to the node L1 of the memory unit 446, its node M14 coupling to the node L2 of the memory unit 446 and its node M15 coupling to the node L3 of the memory unit 446. When the magnetoresistive random access memory 880 is being set with the seventh low resistance, as illustrated in the third condition, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the programming voltage $V_{Pr}$, (6) the node L7 may be switched to couple to the voltage Vss of ground reference and (7) the node L3 may be switched to be floating. Thereby, the magnetoresistive random access memory 880 may be set with the seventh low resistance, as illustrated in FIG. 7G.

For the seventh scenario, referring to FIG. 7G for the first alternative and FIG. 9A, when the magnetoresistive random access memory 880 is being reset with the seventh high resistance, as illustrated in the fourth condition, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the voltage Vss of ground reference, (6) the node L7 may be switched to couple to the programming voltage $V_{Pr}$ and (7) the node L3 may be switched to be floating. Thereby, the magnetoresistive random access memory 880 may be reset with the seventh high resistance, as illustrated in FIG. 7G.

For the seventh scenario, referring to FIG. 7G for the first alternative and FIG. 9A, in an initial stage when the latched non-volatile memory cell 940 is initialized to operate, (1) the node L4 may be switched to the voltage Vcc of power supply, (2) the node L5 may be switched to the voltage Vss of ground reference, (3) the node L8 may be switched to couple to the voltage Vss of ground reference to turn on the channel of the P-type MOS transistor 941 to couple the node L6 to the node L1, (4) the node L9 may be switched to couple to the voltage Vcc of power supply to turn on the channel of the N-type MOS transistor 942 to couple the node L7 to the node L2, (5) the node L6 may be switched to couple to the voltage Vcc of power supply and (6) the node L7 may be switched to couple to the voltage Vss of ground reference. Thereby, said each of the non-volatile memory cells 910 may have its output M15 coupling to the node L3 of the memory unit 446 to latch in the memory unit 446 the logic level at the node M15 of said each of the non-volatile memory cells 910. A conductive line connecting the gate terminals of the P-type and N-type MOS transistor 447 and 448 in the left pair may latch a logic level that is the same as that at the node M15 of said each of the non-volatile memory cells 910. A conductive line connecting the gate terminals of the P-type and N-type MOS transistor 447 and 448 in the right pair may latch a logic level that is opposite to that at the node M15 of said each of the non-volatile memory cells 910.

For the seventh scenario, referring to FIG. 7G for the first alternative and FIG. 9A, for operation of the latched non-volatile memory cell 940, (1) the node L4 may be switched to the voltage Vcc of power supply, (2) the node L5 may be switched to the voltage Vss of ground reference, (3) the node L8 may be switched to couple to the voltage Vcc of power supply to turn off the channel of the P-type MOS transistor 941 to disconnect the node L6 from the node L1 and (4) the node L9 may be switched to couple to the voltage Vss of ground reference to turn off the channel of the N-type MOS transistor 942 to disconnect the node L7 from the node L2. Thereby, the latched non-volatile memory cell 940 may generate an output at the node L3 or L12 associated with the logic level of the node M15 of said each of the non-volatile memory cells 910 determined by the resistance of the magnetoresistive random access memory 880.

For the seventh scenario, referring to FIGS. 7H and 7I for the second alternative and FIG. 9A, each of the non-volatile memory cells 910 of the seventh type as seen in FIGS. 7H and 7I may be arranged to have its node M7 coupling to the node L1 of the memory unit 446, its node M8 coupling to the node L2 of the memory unit 446 and its node M9 coupling to the node L3 of the memory unit 446. When the magnetoresistive random access memory 880-3 is being reset with the third high resistance and the magnetoresistive random access memory 880-4 is being set with the third low resistance, as illustrated in the first condition, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the programming voltage $V_{Pr}$, (6) the node L7 may be switched to couple to the voltage Vss of ground reference and (7) the node L3 may be switched to be floating. Thereby, the magnetoresistive random access memory 880-3 may be reset with the third high resistance and the magnetoresistive random access memory 880-4 may be set with the third low resistance, as illustrated in FIGS. 7H and 7I.

For the seventh scenario, referring to FIGS. 7H and 7I for the second alternative and FIG. 9A, when the magnetoresistive random access memory 880-4 is being reset with the fourth high resistance and the magnetoresistive random access memory 880-3 is being set with the fourth low resistance, as illustrated in the second condition, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the voltage Vss of ground reference, (6) the node L7 may be switched to couple to the programming voltage $V_{Pr}$ and (7) the node L3 may be switched to be floating. Thereby, the magnetoresistive random access memory 880-3 may be set with the fourth low resistance and the magnetoresistive random access memory 880-4 may be reset with the fourth high resistance, as illustrated in FIGS. 7H and 7I.

For the seventh scenario, referring to FIGS. 7H and 7I for the second alternative and FIG. 9A, in an initial stage when the latched non-volatile memory cell 940 is initialized to operate, (1) the node L4 may be switched to the voltage Vcc of power supply, (2) the node L5 may be switched to the voltage Vss of ground reference, (3) the node L8 may be switched to couple to the voltage Vss of ground reference to turn on the channel of the P-type MOS transistor 941 to couple the node L6 to the node L1, (4) the node L9 may be switched to couple to the voltage Vcc of power supply to turn on the channel of the N-type MOS transistor 942 to couple the node L7 to the node L2, (5) the node L6 may be switched to couple to the voltage Vcc of power supply and (6) the node L7 may be switched to couple to the voltage Vss of ground reference. Thereby, said each of the non-volatile memory cells 910 may have its output M9 coupling to the node L3 of the memory unit 446 to latch in the memory unit 446 the logic level at the node M9 of said each of the non-volatile memory cells 910. A conductive line connecting the gate terminals of the P-type and N-type MOS transistor 447 and 448 in the left pair may latch a logic level that is the same as that at the node M9 of said each of the non-volatile memory cells 910. A conductive line connecting the gate terminals of the P-type and N-type MOS transistor 447 and 448 in the right pair may latch a logic level that is opposite to that at the node M9 of said each of the non-volatile memory cells 910.

For the seventh scenario, referring to FIGS. 7H and 7I for the second alternative and FIG. 9A, for operation of the latched non-volatile memory cell 940, (1) the node L4 may be switched to the voltage Vcc of power supply, (2) the node L5 may be switched to the voltage Vss of ground reference, (3) the node L8 may be switched to couple to the voltage Vcc of power supply to turn off the channel of the P-type MOS transistor 941 to disconnect the node L6 from the node L1 and (4) the node L9 may be switched to couple to the voltage Vss of ground reference to turn off the channel of the N-type MOS transistor 942 to disconnect the node L7 from the node L2. Thereby, the latched non-volatile memory cell 940 may generate an output at the node L3 or L12 associated with the logic level of the node M9 of said each of the non-volatile memory cells 910 determined by the resistances of the magnetoresistive random access memories 880-3 and 880-4.

For the seventh scenario, referring to FIG. 7J for the second alternative and FIG. 9A, each of the non-volatile memory cells 910 of the seventh type as seen in FIG. 7J may be arranged to have its node M16 coupling to the node L1 of the memory unit 446, its node M17 coupling to the node L2 of the memory unit 446 and its node M18 coupling to the node L3 of the memory unit 446. When the magnetoresistive random access memory 880 is being reset with the eighth high resistance, as illustrated in the third condition, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the programming voltage $V_{Pr}$, (6) the node L7 may be switched to couple to the voltage Vss of ground reference and (7) the node L3 may be switched to be floating. Thereby, the magnetoresistive random access memory 880 may be reset with the eighth high resistance, as illustrated in FIG. 7J.

For the seventh scenario, referring to FIG. 7J for the second alternative and FIG. 9A, when the magnetoresistive random access memory 880 is being set with the eighth low resistance, as illustrated in the fourth condition, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the voltage Vss of ground reference, (6) the node L7 may be switched to couple to the programming voltage $V_{Pr}$ and (7) the node L3 may be switched to be floating. Thereby, the magnetoresistive random access memory 880-3 may be set with the eighth low resistance, as illustrated in FIG. 7J.

For the seventh scenario, referring to FIG. 7J for the second alternative and FIG. 9A, in an initial stage when the latched non-volatile memory cell 940 is initialized to operate, (1) the node L4 may be switched to the voltage Vcc of power supply, (2) the node L5 may be switched to the voltage Vss of ground reference, (3) the node L8 may be switched to couple to the voltage Vss of ground reference to turn on the channel of the P-type MOS transistor 941 to couple the node L6 to the node L1, (4) the node L9 may be switched to couple to the voltage Vcc of power supply to turn on the channel of the N-type MOS transistor 942 to couple the node L7 to the node L2, (5) the node L6 may be switched to couple to the voltage Vcc of power supply and (6) the node L7 may be switched to couple to the voltage Vss of ground reference. Thereby, said each of the non-volatile memory cells 910 may have its output M18 coupling to the node L3 of the memory unit 446 to latch in the memory unit 446 the logic level at the node M18 of said each of the non-volatile memory cells 910. A conductive line connecting the gate terminals of the P-type and N-type MOS transistor 447 and 448 in the left pair may latch a logic level that is the same as that at the node M18 of said each of the non-volatile memory cells 910. A conductive line connecting the gate terminals of the P-type and N-type MOS transistor 447 and 448 in the right pair may latch a logic level that is opposite to that at the node M18 of said each of the non-volatile memory cells 910.

For the seventh scenario, referring to FIG. 7J for the second alternative and FIG. 9A, for operation of the latched non-volatile memory cell 940, (1) the node L4 may be switched to the voltage Vcc of power supply, (2) the node L5 may be switched to the voltage Vss of ground reference, (3) the node L8 may be switched to couple to the voltage Vcc of power supply to turn off the channel of the P-type MOS transistor 941 to disconnect the node L6 from the node L1 and (4) the node L9 may be switched to couple to the voltage Vss of ground reference to turn off the channel of the N-type MOS transistor 942 to disconnect the node L7 from the node L2. Thereby, the latched non-volatile memory cell 940 may generate an output at the node L3 or L12 associated with the logic level of the node M18 of said each of the non-volatile memory cells 910 determined by the resistance of the magnetoresistive random access memory 880.

Specification for Second Type of Latched Non-Volatile Memory Cells

Figure 9B:
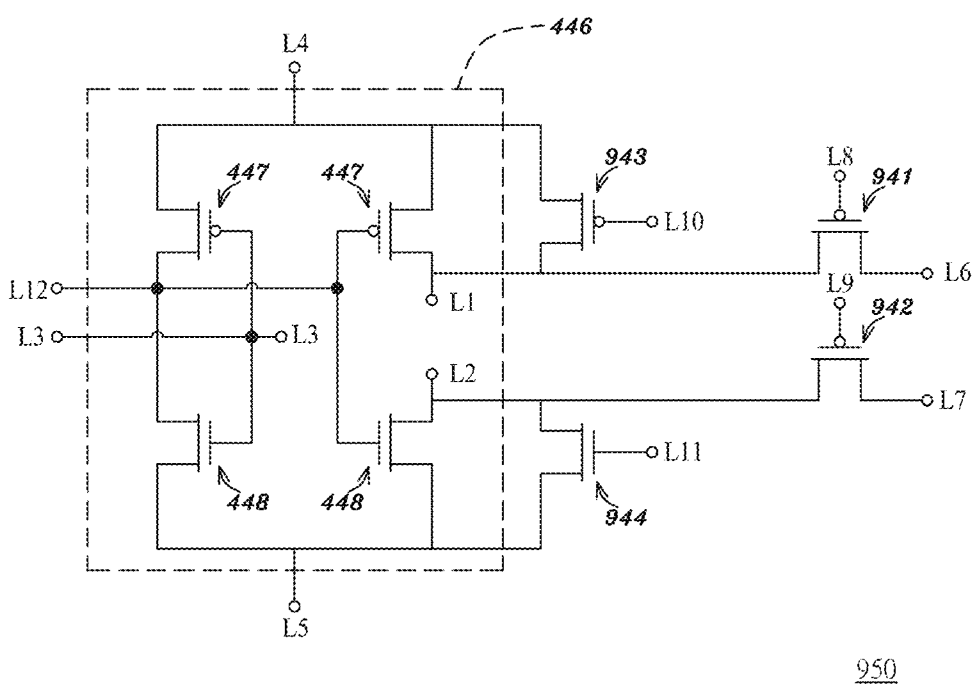
FIG. 9B is a circuit diagram illustrating a second type of latched non-volatile memory cell in accordance with an embodiment of the present application.
Figure 9C:
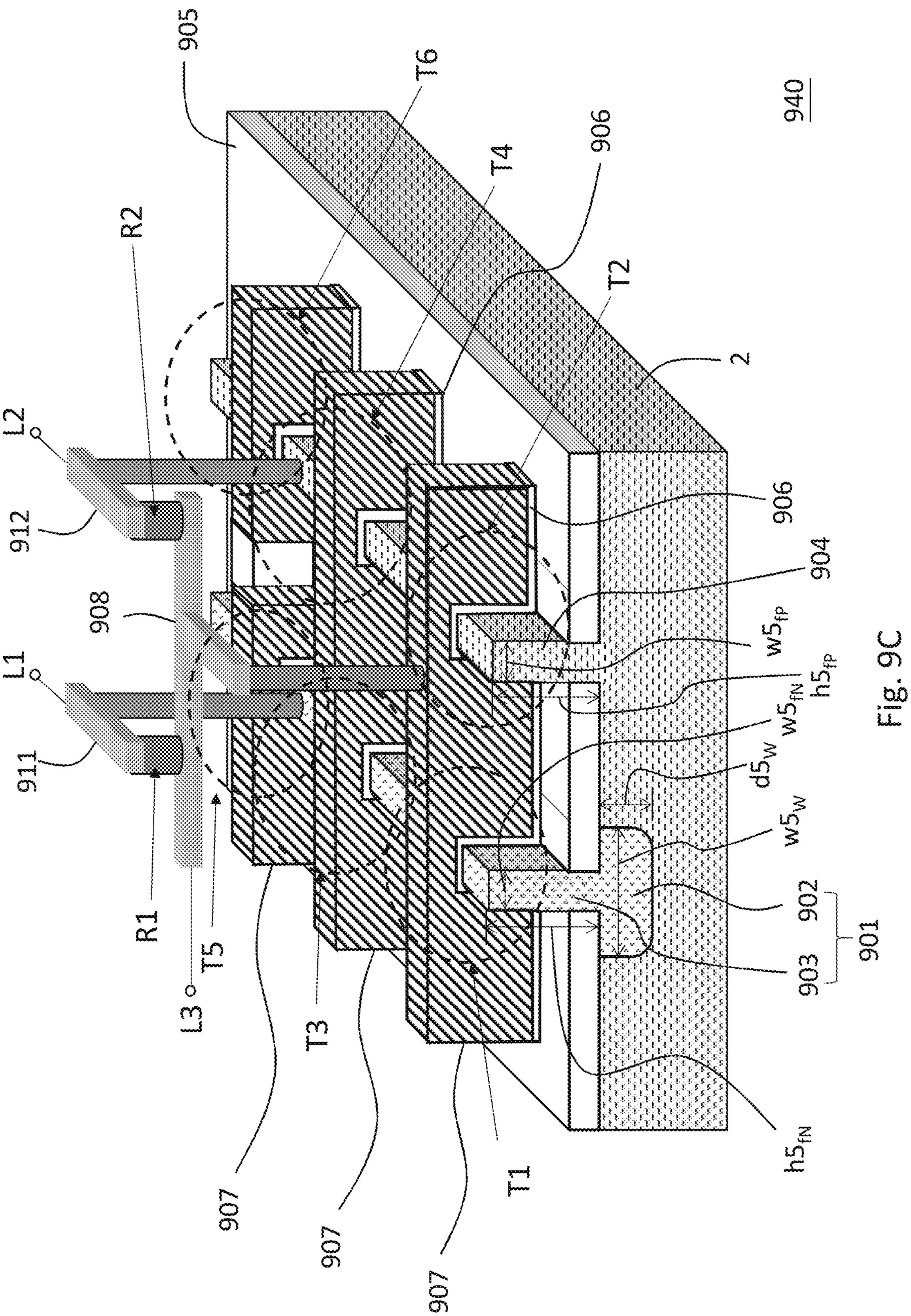
FIGS. 9C-9E are schematically perspective views showing a structure of a first type of latched non-volatile memory cell in FIG. 9A in combination of a sixth or seventh type of non-volatile memory cell in accordance with an embodiment of the present application.
Figure 9D:
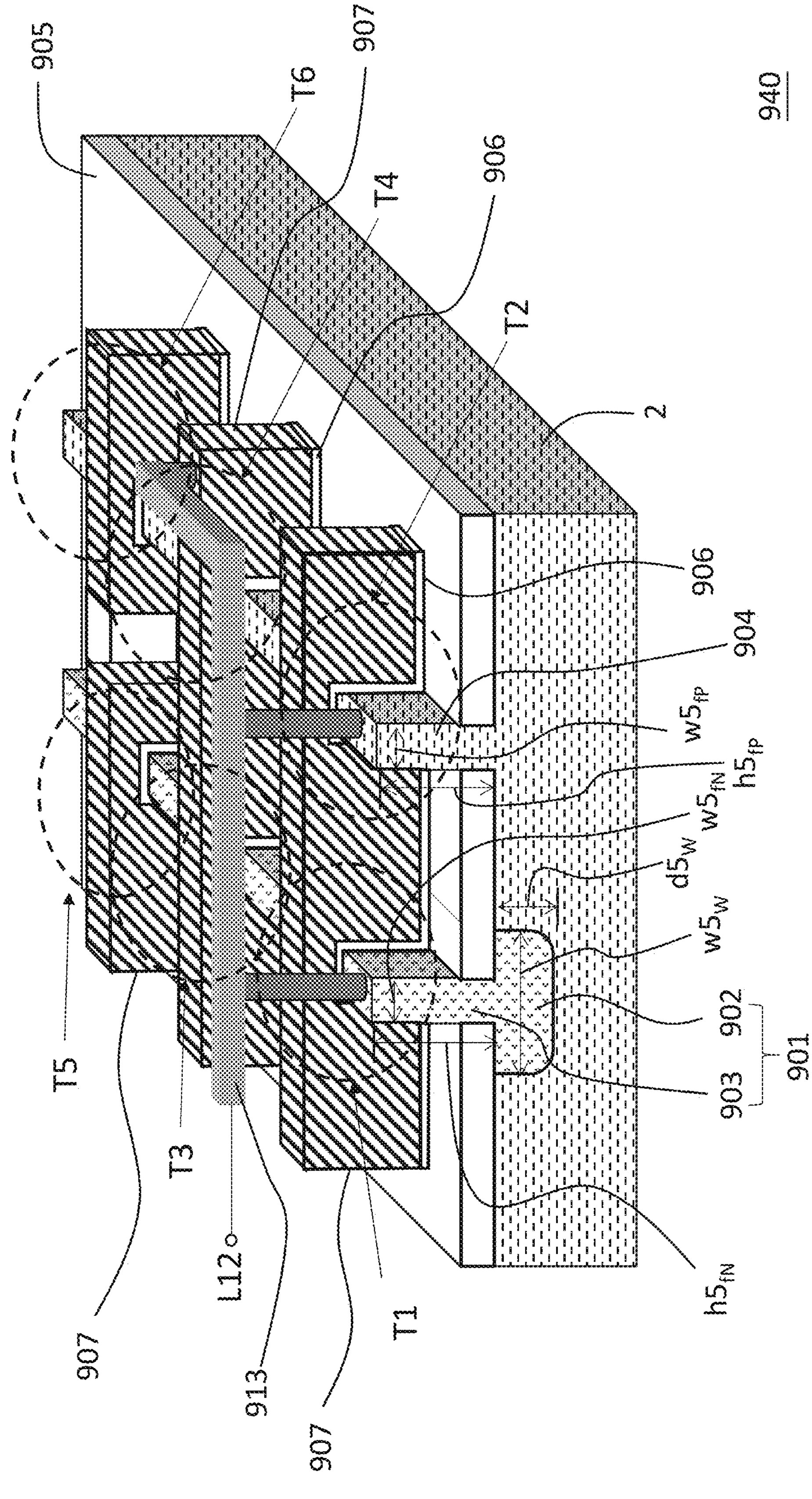
Figure 9E:
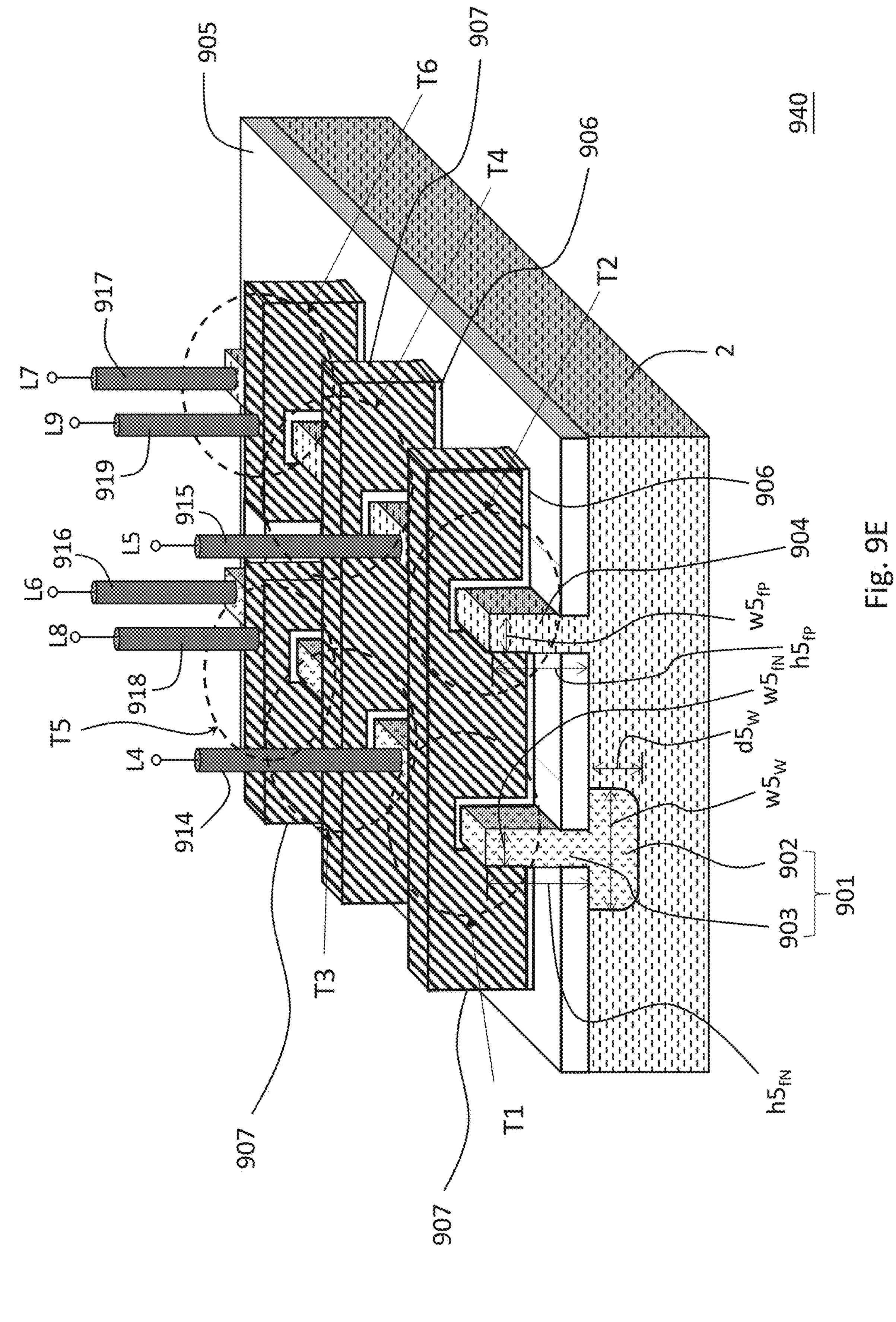

FIG. 9B is a circuit diagram illustrating a second type of latched non-volatile memory cell in accordance with an embodiment of the present application. Referring to FIG. 9B, the second type of latched non-volatile memory cell 950 is similar to the first type of latched non-volatile memory cell 950 as illustrated in FIG. 9A, but the difference therebetween is that the second type of latched non-volatile memory cell 950 further includes a switch 943, such as P-type or N-type MOS transistor, configured to form a channel with an end coupling to the node L1 and the other end coupling to the node L4 and a switch 944, such as N-type or P-type MOS transistor, configured to form a channel with an end coupling to the node L2 and the other end coupling to the node L5. A node L10 couples to a gate terminal of the P-type or N-type MOS transistor 943, and a node L11 couples to a gate terminal of the P-type or N-type MOS transistor 944. In this case, the switch 943 is a P-type MOS transistor, and the switch 944 is an N-type MOS transistor. For an element indicated by the same reference number shown in FIGS. 9A and 9B, the specification of the element as seen in FIG. 9B may be referred to that of the element as illustrated in FIG. 9A.

(1) First Scenario for Second Type of Latched Non-Volatile Memory Cell

For a first scenario, referring to FIGS. 1A-1E and 9B, each of the non-volatile memory cells 600 of the first type as seen in FIGS. 1A-1E may be arranged to have its node N3 coupling to the node L1 of the memory unit 446, its node N4 coupling to the node L2 of the memory unit 446 and its node N0 coupling to the node L3 of the memory unit 446. When the floating gate 607 of said each of the non-volatile memory cells 600 is being erased, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the erasing voltage $V_{Er}$ to turn on the channel of the N-type MOS transistor 942 to couple the node L7 to the node L2, (5) the node L6 may be switched to couple to the erasing voltage $V_{Er}$, (6) the node L7 may be switched to couple to the voltage Vss of ground reference, (7) the node L10 may be switched to couple to the erasing voltage $V_{Er}$ to turn off the channel of the P-type MOS transistor 943 to disconnect the node L4 from the node L1 through the channel of the P-type MOS transistor 943, (8) the node L11 may be switched to couple to the voltage Vss of ground reference to turn off the channel of the N-type MOS transistor 944 to disconnect the node L5 from the node L2 through the channel of the N-type MOS transistor 944 and (9) the node L3 may be switched to be floating. Thereby, the floating gate 607 of said each of the non-volatile memory cells 600 may be erased to a logic level of "1" as illustrated in FIGS. 1A-1E.

For the first scenario, referring to FIGS. 1A-1E and 9B, when the floating gate 607 of said each of the non-volatile memory cells 600 is being programmed, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the programming voltage $V_{Pr}$, (6) the node L7 may be switched to couple to the voltage Vss of ground reference, (7) the node L10 may be switched to couple to the programming voltage $V_{Pr}$ to turn off the channel of the P-type MOS transistor 943 to disconnect the node L4 from the node L1 through the channel of the P-type MOS transistor 943, (8) the node L11 may be switched to couple to the voltage Vss of ground reference to turn off the channel of the N-type MOS transistor 944 to disconnect the node L5 from the node L2 through the channel of the N-type MOS transistor 944 and (9) the node L3 may be switched to couple to the programming voltage $V_{Pr}$. Thereby, the floating gate 607 of said each of the non-volatile memory cells 600 may be programmed to a logic level of "0" as illustrated in FIGS. 1A-1E.

For the first scenario, referring to FIGS. 1A-1E and 9B, in an initial stage when the latched non-volatile memory cell 950 is initialized to operate, (1) the node L4 may be switched to the voltage Vcc of power supply, (2) the node L5 may be switched to the voltage Vss of ground reference, (3) the node L8 may be switched to couple to the voltage Vcc of power supply to turn off the channel of the P-type MOS transistor 941 to disconnect the node L6 from the node L1, (4) the node L9 may be switched to couple to the voltage Vss of ground reference to turn off the channel of the N-type MOS transistor 942 to disconnect the node L7 from the node L2, (5) the node L10 may be switched to couple to the voltage Vss of ground reference to turn on the channel of the P-type MOS transistor 943 to couple the node L4 to the node L1 through the channel of the P-type MOS transistor 943 and (6) the node L11 may be switched to couple to the voltage Vcc of power supply to turn on the channel of the N-type MOS transistor 944 to couple the node L5 to the node L2 through the channel of the N-type MOS transistor 944. Thereby, said each of the non-volatile memory cells 600 may have its output N0 coupling to the node L3 of the memory unit 446 to latch in the memory unit 446 the logic level at the output N0 of said each of the non-volatile memory cells 600. A conductive line connecting the gate terminals of the P-type and N-type MOS transistor 447 and 448 in the left pair may latch a logic level that is the same as that at the node N0 of said each of the non-volatile memory cells 600. A conductive line connecting the gate terminals of the P-type and N-type MOS transistor 447 and 448 in the right pair may latch a logic level that is opposite to that at the node N0 of said each of the non-volatile memory cells 600.

For the first scenario, referring to FIGS. 1A-1E and 9B, for operation of the latched non-volatile memory cell 950 after the initialization to operate, (1) the node L4 may be switched to the voltage Vcc of power supply, (2) the node L5 may be switched to the voltage Vss of ground reference, (3) the node L8 may be switched to couple to the voltage Vcc of power supply to turn off the channel of the P-type MOS transistor 941 to disconnect the node L6 from the node L1, (4) the node L9 may be switched to couple to the voltage Vss of ground reference to turn off the channel of the N-type MOS transistor 942 to disconnect the node L7 from the node L2, (5) the node L10 may be switched to couple to the voltage Vcc of power supply to turn off the channel of the P-type MOS transistor 943 to disconnect the node L4 from the node L1 through the channel of the P-type MOS transistor 943 and (6) the node L11 may be switched to couple to the voltage Vss of ground reference to turn off the channel of the N-type MOS transistor 944 to disconnect the node L5 from the node L2 through the channel of the N-type MOS transistor 944. Thereby, the latched non-volatile memory cell 950 may generate an output at the node L3 or L12 associated with the logic level stored in the floating gate 607 of said each of the non-volatile memory cells 600.

(2) Second Scenario for Second Type of Latched Non-Volatile Memory Cell

For a second scenario, referring to FIGS. 2A-2E and 9B, each of the non-volatile memory cells 650 of the second type as seen in FIGS. 2A-2E may be arranged to have its node N3 coupling to the node L1 of the memory unit 446, its node N4 coupling to the node L2 of the memory unit 446 and its node N0 coupling to the node L3 of the memory unit 446. When the floating gate 607 of said each of the non-volatile memory cells 650 is being erased, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the erasing voltage $V_{Er}$ to turn on the channel of the N-type MOS transistor 942 to couple the node L7 to the node L2, (5) the node L6 may be switched to couple to the voltage Vss of ground reference, (6) the node L7 may be switched (i) to couple to the erasing voltage $V_{Er}$ for the first and third aspects as illustrated in FIGS. 2A-2E or (ii) to be floating for the second aspect as illustrated in FIGS. 2A-2E, (7) the node L10 may be switched to couple to the erasing voltage $V_{Er}$ to turn off the channel of the P-type MOS transistor 943 to disconnect the node L4 from the node L1 through the channel of the P-type MOS transistor 943, (8) the node L11 may be switched to couple to the voltage Vss of ground reference to turn off the channel of the N-type MOS transistor 944 to disconnect the node L5 from the node L2 through the channel of the N-type MOS transistor 944 and (9) the node L3 may be switched (i) to be floating for the first aspect as illustrated in FIGS. 2A-2E or (ii) to couple to the erasing voltage $V_{Er}$ for the second and third aspects as illustrated in FIGS. 2A-2E. Thereby, the floating gate 607 of said each of the non-volatile memory cells 650 may be erased to a logic level of "1" as illustrated in FIGS. 2A-2E.

For the second scenario, referring to FIGS. 2A-2E and 9B, when the floating gate 607 of said each of the non-volatile memory cells 650 is being programmed, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the programming voltage $V_{Pr}$, (6) the node L7 may be switched (i) to couple to the voltage Vss of ground reference for the first and third aspects as illustrated in FIGS. 2A-2E or (ii) to be floating for the second aspect as illustrated in FIGS. 2A-2E, (7) the node L10 may be switched to couple to the programming voltage $V_{Pr}$ to turn off the channel of the P-type MOS transistor 943 to disconnect the node L4 from the node L1 through the channel of the P-type MOS transistor 943, (8) the node L11 may be switched to couple to the voltage Vss of ground reference to turn off the channel of the N-type MOS transistor 944 to disconnect the node L5 from the node L2 through the channel of the N-type MOS transistor 944 and (9) the node L3 may be switched (i) to be floating for the first aspect as illustrated in FIGS. 2A-2E or (ii) to couple to the voltage Vss of ground reference for the second and third aspects as illustrated in FIGS. 2A-2E. Thereby, the floating gate 607 of said each of the non-volatile memory cells 650 may be programmed to a logic level of "0" as illustrated in FIGS. 2A-2E.

For the second scenario, referring to FIGS. 2A-2E and 9B, in an initial stage when the latched non-volatile memory cell 950 is initialized to operate, (1) the node L4 may be switched to the voltage Vcc of power supply, (2) the node L5 may be switched to the voltage Vss of ground reference, (3) the node L8 may be switched to couple to the voltage Vcc of power supply to turn off the channel of the P-type MOS transistor 941 to disconnect the node L6 from the node L1, (4) the node L9 may be switched to couple to the voltage Vss of ground reference to turn off the channel of the N-type MOS transistor 942 to disconnect the node L7 from the node L2, (5) the node L10 may be switched to couple to the voltage Vss of ground reference to turn on the channel of the P-type MOS transistor 943 to couple the node L4 to the node L1 through the channel of the P-type MOS transistor 943 and (6) the node L11 may be switched to couple to the voltage Vcc of power supply to turn on the channel of the N-type MOS transistor 944 to couple the node L5 to the node L2 through the channel of the N-type MOS transistor 944. Thereby, said each of the non-volatile memory cells 650 may have its output N0 coupling to the node L3 of the memory unit 446 to latch in the memory unit 446 the logic level at the output N0 of said each of the non-volatile memory cells 650. A conductive line connecting the gate terminals of the P-type and N-type MOS transistor 447 and 448 in the left pair may latch a logic level that is the same as that at the node N0 of said each of the non-volatile memory cells 650. A conductive line connecting the gate terminals of the P-type and N-type MOS transistor 447 and 448 in the right pair may latch a logic level that is opposite to that at the node N0 of said each of the non-volatile memory cells 650.

For the second scenario, referring to FIGS. 2A-2E and 9B, for operation of the latched non-volatile memory cell 950 after the initialization to operate, (1) the node L4 may be switched to the voltage Vcc of power supply, (2) the node L5 may be switched to the voltage Vss of ground reference, (3) the node L8 may be switched to couple to the voltage Vcc of power supply to turn off the channel of the P-type MOS transistor 941 to disconnect the node L6 from the node L1, (4) the node L9 may be switched to couple to the voltage Vss of ground reference to turn off the channel of the N-type MOS transistor 942 to disconnect the node L7 from the node L2, (5) the node L10 may be switched to couple to the voltage Vcc of power supply to turn off the channel of the P-type MOS transistor 943 to disconnect the node L4 from the node L1 through the channel of the P-type MOS transistor 943 and (6) the node L11 may be switched to couple to the voltage Vss of ground reference to turn off the channel of the N-type MOS transistor 944 to disconnect the node L5 from the node L2 through the channel of the N-type MOS transistor 944. Thereby, the latched non-volatile memory cell 950 may generate an output at the node L3 or L12 associated with the logic level stored in the floating gate 607 of said each of the non-volatile memory cells 650.

(3) Third Scenario for Second Type of Latched Non-Volatile Memory Cell

For a third scenario, referring to FIGS. 3A-3D, 3S and 9B, each of the non-volatile memory cells 700 of the third type as seen in FIGS. 3A-3D and 3S may be arranged to have its node N3 coupling to the node L1 of the memory unit 446, its node N4 coupling to the node L2 of the memory unit 446 and its node N0 coupling to the node L3 of the memory unit 446. When the floating gate 710 of said each of the non-volatile memory cells 700 is being erased, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the erasing voltage $V_{Er}$ to turn on the channel of the N-type MOS transistor 942 to couple the node L7 to the node L2, (5) the node L6 may be switched to couple to the voltage Vss of ground reference, (6) the node L7 may be switched to couple to the voltage Vss of ground reference, (7) the node L10 may be switched to couple to the erasing voltage $V_{Er}$ to turn off the channel of the P-type MOS transistor 943 to disconnect the node L4 from the node L1 through the channel of the P-type MOS transistor 943, (8) the node L11 may be switched to couple to the voltage Vss of ground reference to turn off the channel of the N-type MOS transistor 944 to disconnect the node L5 from the node L2 through the channel of the N-type MOS transistor 944 and (9) the node L3 may be switched to be floating. Thereby, the floating gate 710 of said each of the non-volatile memory cells 700 may be erased to a logic level of "1" as illustrated in FIGS. 3A-3D and 3S.

For the third scenario, referring to FIGS. 3A-3D, 3S and 9B, when the floating gate 710 of said each of the non-volatile memory cells 700 is being programmed, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the programming voltage $V_{Pr}$, (6) the node L7 may be switched to couple to the voltage Vss of ground reference, (7) the node L10 may be switched to couple to the programming voltage $V_{Pr}$ to turn off the channel of the P-type MOS transistor 943 to disconnect the node L4 from the node L1 through the channel of the P-type MOS transistor 943, (8)

the node L11 may be switched to couple to the voltage Vss of ground reference to turn off the channel of the N-type MOS transistor 944 to disconnect the node L5 from the node L2 through the channel of the N-type MOS transistor 944 and (9) the node L3 may be switched to couple to the programming voltage $V_{Pr}$. Thereby, the floating gate 710 of said each of the non-volatile memory cells 700 may be programmed to a logic level of "0" as illustrated in FIGS. 3A-3D and 3S.

For the third scenario, referring to FIGS. 3A-3D, 3S and 9B, in an initial stage when the latched non-volatile memory cell 950 is initialized to operate, (1) the node L4 may be switched to the voltage Vcc of power supply, (2) the node L5 may be switched to the voltage Vss of ground reference, (3) the node L8 may be switched to couple to the voltage Vcc of power supply to turn off the channel of the P-type MOS transistor 941 to disconnect the node L6 from the node L1, (4) the node L9 may be switched to couple to the voltage Vss of ground reference to turn off the channel of the N-type MOS transistor 942 to disconnect the node L7 from the node L2, (5) the node L10 may be switched to couple to the voltage Vss of ground reference to turn on the channel of the P-type MOS transistor 943 to couple the node L4 to the node L1 through the channel of the P-type MOS transistor 943 and (6) the node L11 may be switched to couple to the voltage Vcc of power supply to turn on the channel of the N-type MOS transistor 944 to couple the node L5 to the node L2 through the channel of the N-type MOS transistor 944. Thereby, said each of the non-volatile memory cells 700 may have its output N0 coupling to the node L3 of the memory unit 446 to latch in the memory unit 446 the logic level at the output N0 of said each of the non-volatile memory cells 700. A conductive line connecting the gate terminals of the P-type and N-type MOS transistor 447 and 448 in the left pair may latch a logic level that is the same as that at the node N0 of said each of the non-volatile memory cells 700. A conductive line connecting the gate terminals of the P-type and N-type MOS transistor 447 and 448 in the right pair may latch a logic level that is opposite to that at the node N0 of said each of the non-volatile memory cells 700.

For the third scenario, referring to FIGS. 3A-3D, 3S and 9B, for operation of the latched non-volatile memory cell 950 after the initialization to operate, (1) the node L4 may be switched to the voltage Vcc of power supply, (2) the node L5 may be switched to the voltage Vss of ground reference, (3) the node L8 may be switched to couple to the voltage Vcc of power supply to turn off the channel of the P-type MOS transistor 941 to disconnect the node L6 from the node L1, (4) the node L9 may be switched to couple to the voltage Vss of ground reference to turn off the channel of the N-type MOS transistor 942 to disconnect the node L7 from the node L2, (5) the node L10 may be switched to couple to the voltage Vcc of power supply to turn off the channel of the P-type MOS transistor 943 to disconnect the node L4 from the node L1 through the channel of the P-type MOS transistor 943 and (6) the node L11 may be switched to couple to the voltage Vss of ground reference to turn off the channel of the N-type MOS transistor 944 to disconnect the node L5 from the node L2 through the channel of the N-type MOS transistor 944. Thereby, the latched non-volatile memory cell 950 may generate an output at the node L3 or L12 associated with the logic level stored in the floating gate 710 of said each of the non-volatile memory cells 700.

(4) Fourth Scenario for Second Type of Latched Non-Volatile Memory Cell

For a fourth scenario, referring to FIGS. 4A-4D, 4S and 9B, each of the non-volatile memory cells 760 of the fourth type as seen in FIGS. 4A-4D and 4S may be arranged to have its node N3 coupling to the node L1 of the memory unit 446, its node N4 coupling to the node L2 of the memory unit 446 and its node N0 coupling to the node L3 of the memory unit 446. When the floating gate 710 of said each of the non-volatile memory cells 760 is being erased, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the erasing voltage $V_{Er}$ to turn on the channel of the N-type MOS transistor 942 to couple the node L7 to the node L2, (5) the node L6 may be switched to couple to the erasing voltage $V_{Er}$, (6) the node L7 may be switched to couple to the voltage Vss of ground reference, (7) the node L10 may be switched to couple to the erasing voltage $V_{Er}$ to turn off the channel of the P-type MOS transistor 943 to disconnect the node L4 from the node L1 through the channel of the P-type MOS transistor 943, (8) the node L11 may be switched to couple to the voltage Vss of ground reference to turn off the channel of the N-type MOS transistor 944 to disconnect the node L5 from the node L2 through the channel of the N-type MOS transistor 944 and (9) the node L3 may be switched (i) to be floating for said each of the non-volatile memory cells 760 as illustrated in FIGS. 4A-4D and 4S or (ii) to couple to the voltage Vss of ground reference for said each of the non-volatile memory cells 760 as illustrated in FIG. 4D. Thereby, the floating gate 710 of said each of the non-volatile memory cells 760 may be erased to a logic level of "1" as illustrated in FIGS. 4A-4D and 4S.

For the fourth scenario, referring to FIGS. 4A-4D, 4S and 9B, when the floating gate 710 of said each of the non-volatile memory cells 700 is being programmed, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the programming voltage $V_{Pr}$, (6) the node L7 may be switched to couple to the voltage Vss of ground reference, (7) the node L10 may be switched to couple to the programming voltage $V_{Pr}$ to turn off the channel of the P-type MOS transistor 943 to disconnect the node L4 from the node L1 through the channel of the P-type MOS transistor 943, (8) the node L11 may be switched to couple to the voltage Vss of ground reference to turn off the channel of the N-type MOS transistor 944 to disconnect the node L5 from the node L2 through the channel of the N-type MOS transistor 944 and (9) the node L3 may be switched to be floating for said each of the non-volatile memory cells 760 as illustrated in FIGS. 4A-4D and 4S or (ii) to couple to the voltage Vss of ground reference for said each of the non-volatile memory cells 760 as illustrated in FIG. 4D. Thereby, the floating gate 710 of said each of the non-volatile memory cells 760 may be programmed to a logic level of "0" as illustrated in FIGS. 4A-4D and 4S.

For the fourth scenario, referring to FIGS. 4A-4D, 4S and 9B, in an initial stage when the latched non-volatile memory cell 950 is initialized to operate, (1) the node L4 may be switched to the voltage Vcc of power supply, (2) the node L5 may be switched to the voltage Vss of ground reference, (3) the node L8 may be switched to couple to the voltage Vcc of power supply to turn off the channel of the P-type MOS transistor 941 to disconnect the node L6 from the node L1, (4) the node L9 may be switched to couple to the voltage Vss of ground reference to turn off the channel of the N-type MOS transistor 942 to disconnect the node L7 from the node L2, (5) the node L10 may be switched to couple to the voltage Vss of ground reference to turn on the channel of the P-type MOS transistor 943 to couple the node L4 to the node L1 through the channel of the P-type MOS transistor 943 and (6) the node L11 may be switched to couple to the voltage Vcc of power supply to turn on the channel of the N-type MOS transistor 944 to couple the node L5 to the node L2 through the channel of the N-type MOS transistor 944. Thereby, said each of the non-volatile memory cells 760 may have its output N0 coupling to the node L3 of the memory unit 446 to latch in the memory unit 446 the logic level at the output N0 of said each of the non-volatile memory cells 760. A conductive line connecting the gate terminals of the P-type and N-type MOS transistor 447 and 448 in the left pair may latch a logic level that is the same as that at the node N0 of said each of the non-volatile memory cells 760. A conductive line connecting the gate terminals of the P-type and N-type MOS transistor 447 and 448 in the right pair may latch a logic level that is opposite to that at the node N0 of said each of the non-volatile memory cells 760.

For the fourth scenario, referring to FIGS. 4A-4D, 4S and 9B, for operation of the latched non-volatile memory cell 950 after the initialization to operate, (1) the node L4 may be switched to the voltage Vcc of power supply, (2) the node L5 may be switched to the voltage Vss of ground reference, (3) the node L8 may be switched to couple to the voltage Vcc of power supply to turn off the channel of the P-type MOS transistor 941 to disconnect the node L6 from the node L1, (4) the node L9 may be switched to couple to the voltage Vss of ground reference to turn off the channel of the N-type MOS transistor 942 to disconnect the node L7 from the node L2, (5) the node L10 may be switched to couple to the voltage Vcc of power supply to turn off the channel of the P-type MOS transistor 943 to disconnect the node L4 from the node L1 through the channel of the P-type MOS transistor 943 and (6) the node L11 may be switched to couple to the voltage Vss of ground reference to turn off the channel of the N-type MOS transistor 944 to disconnect the node L5 from the node L2 through the channel of the N-type MOS transistor 944. Thereby, the latched non-volatile memory cell 950 may generate an output at the node L3 or L12 associated with the logic level stored in the floating gate 710 of said each of the non-volatile memory cells 760.

(5) Fifth Scenario for Second Type of Latched Non-Volatile Memory Cell

For a fifth scenario, referring to FIGS. 5A-5F and 9B, each of the non-volatile memory cells 800 of the fifth type as seen in FIGS. 5A-5F may be arranged to have its node N3 coupling to the node L1 of the memory unit 446, its node N4 coupling to the node L2 of the memory unit 446 and its node N0 coupling to the node L3 of the memory unit 446. When the floating gate 808 of said each of the non-volatile memory cells 800 is being erased, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the erasing voltage $V_{Er}$ to turn on the channel of the N-type MOS transistor 942 to couple the node L7 to the node L2, (5) the node L6 may be switched to couple to the erasing voltage $V_{Er}$, (6) the node L7 may be switched to couple to the voltage Vss of ground reference, (7) the node L10 may be switched to couple to the erasing voltage $V_{Er}$ to turn off the channel of the P-type MOS transistor 943 to disconnect the node L4 from the node L1 through the channel of the P-type MOS transistor 943, (8) the node L11 may be switched to couple to the voltage Vss of ground reference to turn off the channel of the N-type MOS transistor 944 to disconnect the node L5 from the node L2 through the channel of the N-type MOS transistor 944 and (9) the node L3 may be switched (i) to be floating for said each of the non-volatile memory cells 800 as illustrated in FIGS. 5A-5F or (ii) to couple to the voltage Vss of ground reference for said each of the non-volatile memory cells 800 as illustrated in FIG. 5E. Thereby, the floating gate 808 of said each of the non-volatile memory cells 800 may be erased to a logic level of "1" as illustrated in FIGS. 5A-5F.

For the fifth scenario, referring to FIGS. 5A-5F and 9B, when the floating gate 710 of said each of the non-volatile memory cells 800 is being programmed, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the programming voltage $V_{Pr}$, (6) the node L7 may be switched to couple to the voltage Vss of ground reference, (7) the node L10 may be switched to couple to the programming voltage $V_{Pr}$ to turn off the channel of the P-type MOS transistor 943 to disconnect the node L4 from the node L1 through the channel of the P-type MOS transistor 943, (8) the node L11 may be switched to couple to the voltage Vss of ground reference to turn off the channel of the N-type MOS transistor 944 to disconnect the node L5 from the node L2 through the channel of the N-type MOS transistor 944 and (9) the node L3 may be switched to be floating. Thereby, the floating gate 808 of said each of the non-volatile memory cells 800 may be programmed to a logic level of "0" as illustrated in FIGS. 5A-5F.

For the fifth scenario, referring to FIGS. 5A-5F and 9B, in an initial stage when the latched non-volatile memory cell 950 is initialized to operate, (1) the node L4 may be switched to the voltage Vcc of power supply, (2) the node L5 may be switched to the voltage Vss of ground reference, (3) the node L8 may be switched to couple to the voltage Vcc of power supply to turn off the channel of the P-type MOS transistor 941 to disconnect the node L6 from the node L1, (4) the node L9 may be switched to couple to the voltage Vss of ground reference to turn off the channel of the N-type MOS transistor 942 to disconnect the node L7 from the node L2, (5) the node L10 may be switched to couple to the voltage Vss of ground reference to turn on the channel of the P-type MOS transistor 943 to couple the node L4 to the node L1 through the channel of the P-type MOS transistor 943 and (6) the node L11 may be switched to couple to the voltage Vcc of power supply to turn on the channel of the N-type MOS transistor 944 to couple the node L5 to the node L2 through the channel of the N-type MOS transistor 944. Thereby, said each of the non-volatile memory cells 800 may have its output N0 coupling to the node L3 of the memory unit 446 to latch in the memory unit 446 the logic level at the output N0 of said each of the non-volatile memory cells 800. A conductive line connecting the gate terminals of the P-type and N-type MOS transistor 447 and 448 in the left pair may latch a logic level that is the same as that at the node N0 of said each of the non-volatile memory cells 800. A conductive line connecting the gate terminals of the P-type and N-type MOS transistor 447 and 448 in the right pair may latch a logic level that is opposite to that at the node N0 of said each of the non-volatile memory cells 800.

For the fifth scenario, referring to FIGS. 5A-5F and 9B, for operation of the latched non-volatile memory cell 950 after the initialization to operate, (1) the node L4 may be switched to the voltage Vcc of power supply, (2) the node L5 may be switched to the voltage Vss of ground reference, (3) the node L8 may be switched to couple to the voltage Vcc of power supply to turn off the channel of the P-type MOS transistor 941 to disconnect the node L6 from the node L1, (4) the node L9 may be switched to couple to the voltage Vss of ground reference to turn off the channel of the N-type MOS transistor 942 to disconnect the node L7 from the node L2, (5) the node L10 may be switched to couple to the voltage Vcc of power supply to turn off the channel of the P-type MOS transistor 943 to disconnect the node L4 from the node L1 through the channel of the P-type MOS transistor 943 and (6) the node L11 may be switched to couple to the voltage Vss of ground reference to turn off the channel of the N-type MOS transistor 944 to disconnect the node L5 from the node L2 through the channel of the N-type MOS transistor 944. Thereby, the latched non-volatile memory cell 950 may generate an output at the node L3 or L12 associated with the logic level stored in the floating gate 808 of said each of the non-volatile memory cells 800.

(6) Sixth Scenario for Second Type of Latched Non-Volatile Memory Cell

For a sixth scenario, referring to FIGS. 6E, 6F and 9B, each of the non-volatile memory cells 900 of the sixth type as seen in FIGS. 6E and 6F may be arranged to have its node M1 coupling to the node L1 of the memory unit 446, its node M2 coupling to the node L2 of the memory unit 446 and its node M3 coupling to the node L3 of the memory unit 446. When said each of the non-volatile memory cells 900 is being in the forming step, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the forming voltage $V_f$ to turn on the channel of the N-type MOS transistor 942 to couple the node L7 to the node L2, (5) the node L6 may be switched to couple to the forming voltage $V_f$, (6) the node L7 may be switched to couple to the forming voltage $V_f$, (7) the node L10 may be switched to couple to the forming voltage $V_f$ to turn off the channel of the P-type MOS transistor 943 to disconnect the node L4 from the node L1 through the channel of the P-type MOS transistor 943, (8) the node L11 may be switched to couple to the voltage Vss of ground reference to turn off the channel of the N-type MOS transistor 944 to disconnect the node L5 from the node L2 through the channel of the N-type MOS transistor 944 and (9) the node L3 may be switched to the voltage Vss of ground reference. Thereby, the resistive random access memories 870-1 and 870-2 may be formed with the first and second low resistances as illustrated in FIGS. 6E and 6F.

For the sixth scenario, referring to FIGS. 6E, 6F and 9B, when the resistive random access memory 870-2 is being reset with the first high resistance as illustrated in the first condition, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the programming voltage $V_{Pr}$, (6) the node L7 may be switched to couple to the voltage Vss of ground reference, (7) the node L10 may be switched to couple to the programming voltage $V_{Pr}$ to turn off the channel of the P-type MOS transistor 943 to disconnect the node L4 from the node L1 through the channel of the P-type MOS transistor 943, (8) the node L11 may be switched to couple to the voltage Vss of ground reference to turn off the channel of the N-type MOS transistor 944 to disconnect the node L5 from the node L2 through the channel of the N-type MOS transistor 944 and (9) the node L3 may be switched to be floating. Thereby, the resistive random access memory 870-2 may be reset with the first high resistance as illustrated in FIGS. 6E and 6F. The resistive random access memory 870-1 is kept in the first low resistance as illustrated in FIGS. 6E and 6F.

For the sixth scenario, referring to FIGS. 6E, 6F and 9B, when the resistive random access memory 870-1 is being reset with the second high resistance as illustrated in the second condition, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the voltage Vss of ground reference, (6) the node L7 may be switched to couple to the programming voltage $V_{Pr}$, (7) the node L10 may be switched to couple to the programming voltage $V_{Pr}$ to turn off the channel of the P-type MOS transistor 943 to disconnect the node L4 from the node L1 through the channel of the P-type MOS transistor 943, (8) the node L11 may be switched to couple to the voltage Vss of ground reference to turn off the channel of the N-type MOS transistor 944 to disconnect the node L5 from the node L2 through the channel of the N-type MOS transistor 944 and (9) the node L3 may be switched to be floating. Thereby, the resistive random access memory 870-1 may be reset with the second high resistance as illustrated in FIGS. 6E and 6F. The resistive random access memory 870-2 is kept in the second low resistance as illustrated in FIGS. 6E and 6F.

For the sixth scenario, referring to FIGS. 6E, 6F and 9B, when the resistive random access memory 870-1 is being reset with the third high resistance and the resistive random access memory 870-2 is being set with the third low resistance, as illustrated in the third condition, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the voltage Vss of ground reference, (6) the node L7 may be switched to couple to the programming voltage $V_{Pr}$, (7) the node L10 may be switched to couple to the programming voltage $V_{Pr}$ to turn off the channel of the P-type MOS transistor 943 to disconnect the node L4 from the node L1 through the channel of the P-type MOS transistor 943, (8) the node L11 may be switched to couple to the voltage Vss of ground reference to turn off the channel of the N-type MOS transistor 944 to disconnect the node L5 from the node L2 through the channel of the N-type MOS transistor 944 and (9) the node L3 may be switched to be floating. Thereby, the resistive random access memory 870-1 may be reset with the third high resistance and the resistive random access memory 870-2 may be set with the third low resistance as illustrated in FIGS. 6E and 6F.

For the sixth scenario, referring to FIGS. 6E, 6F and 9B, when the resistive random access memory 870-2 is being reset with the fourth high resistance and the resistive random access memory 870-1 is being set with the fourth low resistance, as illustrated in the fourth condition, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the programming voltage $V_{Pr}$, (6) the node L7 may be switched to couple to the voltage Vss of ground reference, (7) the node L10 may be switched to couple to the programming voltage $V_{Pr}$ to turn off the channel of the P-type MOS transistor 943 to disconnect the node L4 from the node L1 through the channel of the P-type MOS transistor 943, (8) the node L11 may be switched to couple to the voltage Vss of ground reference to turn off the channel of the N-type MOS transistor 944 to disconnect the node L5 from the node L2 through the channel of the N-type MOS transistor 944 and (9) the node L3 may be switched to be floating. Thereby, the resistive random access memory 870-1 may be reset with the fourth low resistance and the resistive random access memory 870-2 may be set with the fourth high resistance as illustrated in FIGS. 6E and 6F.

For the sixth scenario, referring to FIGS. 6E, 6F and 9B, in an initial stage when the latched non-volatile memory cell 950 is initialized to operate, (1) the node L4 may be switched to the voltage Vcc of power supply, (2) the node L5 may be switched to the voltage Vss of ground reference, (3) the node L8 may be switched to couple to the voltage Vcc of power supply to turn off the channel of the P-type MOS transistor 941 to disconnect the node L6 from the node L1, (4) the node L9 may be switched to couple to the voltage Vss of ground reference to turn off the channel of the N-type MOS transistor 942 to disconnect the node L7 from the node L2, (5) the node L10 may be switched to couple to the voltage Vss of ground reference to turn on the channel of the P-type MOS transistor 943 to couple the node L4 to the node L1 through the channel of the P-type MOS transistor 943 and (6) the node L11 may be switched to couple to the voltage Vcc of power supply to turn on the channel of the N-type MOS transistor 944 to couple the node L5 to the node L2 through the channel of the N-type MOS transistor 944. Thereby, said each of the non-volatile memory cells 900 may have its output M3 coupling to the node L3 of the memory unit 446 to latch in the memory unit 446 the logic level at the node M3 of said each of the non-volatile memory cells 900. A conductive line connecting the gate terminals of the P-type and N-type MOS transistor 447 and 448 in the left pair may latch a logic level that is the same as that at the node M3 of said each of the non-volatile memory cells 900. A conductive line connecting the gate terminals of the P-type and N-type MOS transistor 447 and 448 in the right pair may latch a logic level that is opposite to that at the node M3 of said each of the non-volatile memory cells 900.

For the sixth scenario, referring to FIGS. 6E, 6F and 9B, for operation of the latched non-volatile memory cell 950, (1) the node L4 may be switched to the voltage Vcc of power supply, (2) the node L5 may be switched to the voltage Vss of ground reference, (3) the node L8 may be switched to couple to the voltage Vcc of power supply to turn off the channel of the P-type MOS transistor 941 to disconnect the node L6 from the node L1, (4) the node L9 may be switched to couple to the voltage Vss of ground reference to turn off the channel of the N-type MOS transistor 942 to disconnect the node L7 from the node L2, (5) the node L10 may be switched to couple to the voltage Vcc of power supply to turn off the channel of the P-type MOS transistor 943 to disconnect the node L4 from the node L1 through the channel of the P-type MOS transistor 943 and (6) the node L11 may be switched to couple to the voltage Vss of ground reference to turn off the channel of the N-type MOS transistor 944 to disconnect the node L5 from the node L2 through the channel of the N-type MOS transistor 944. Thereby, the latched non-volatile memory cell 950 may generate an output at the node L3 or L12 associated with the logic level of the node M3 of said each of the non-volatile memory cells 900 determined by the resistances of the resistive random access memories 870-1 and 870-2.

Alternatively, for the sixth scenario, referring to FIGS. 6G and 9B, each of the non-volatile memory cells 900 of the sixth type as seen in FIG. 6G may be arranged to have its node M10 coupling to the node L1 of the memory unit 446, its node M11 coupling to the node L2 of the memory unit 446 and its node M12 coupling to the node L3 of the memory unit 446. When said each of the non-volatile memory cells 900 is being in the forming step, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the voltage Vss of ground reference to turn off the channel of the N-type MOS transistor 942 to disconnect the node L7 from the node L2, (5) the node L6 may be switched to couple to the forming voltage $V_f$, (6) the node L10 may be switched to couple to the forming voltage $V_f$ to turn off the channel of the P-type MOS transistor 943 to disconnect the node L4 from the node L1 through the channel of the P-type MOS transistor 943, (7) the node L11 may be switched to couple to the voltage Vss of ground reference to turn off the channel of the N-type MOS transistor 944 to disconnect the node L5 from the node L2 through the channel of the N-type MOS transistor 944 and (8) the node L3 may be switched to the voltage Vss of ground reference. Thereby, the resistive random access memory 870 may be formed with the fifth low resistance as illustrated in FIG. 6G.

For the sixth scenario, referring to FIGS. 6G and 9B, when the resistive random access memory 870 is being reset with the fifth high resistance, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the voltage Vss of ground reference, (6) the node L7 may be switched to couple to the programming voltage $V_{Pr}$, (7) the node L10 may be switched to couple to the programming voltage $V_{Pr}$ to turn off the channel of the P-type MOS transistor 943 to disconnect the node L4 from the node L1 through the channel of the P-type MOS transistor 943, (8) the node L11 may be switched to couple to the voltage Vss of ground reference to turn off the channel of the N-type MOS transistor 944 to disconnect the node L5 from the node L2 through the channel of the N-type MOS transistor 944 and (9) the node L3 may be switched to be floating. Thereby, the resistive random access memory 870 may be reset with the fifth high resistance as illustrated in FIG. 6G. The sixth type of non-volatile memory cell 900 is programmed with a logic level of "0".

For the sixth scenario, referring to FIGS. 6G and 9B, after the sixth type of non-volatile memory cell 900 is programmed with a logic level of "0", the sixth type of non-volatile memory cell 900 may be programmed with a logic level of "1" by setting the resistive random access memory 870 with the sixth low resistance. When the resistive random access memory 870 is being set with the sixth low resistance, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the programming voltage $V_{Pr}$, (6) the node L7 may be switched to couple to the voltage Vss of ground reference, (7) the node L10 may be switched to couple to the programming voltage $V_{Pr}$ to turn off the channel of the P-type MOS transistor 943 to disconnect the node L4 from the node L1 through the channel of the P-type MOS transistor 943, (8) the node L11 may be switched to couple to the voltage Vss of ground reference to turn off the channel of the N-type MOS transistor 944 to disconnect the node L5 from the node L2 through the channel of the N-type MOS transistor 944 and (9) the node L3 may be switched to be floating. Thereby, the resistive random access memory 870 may be reset with the sixth low resistance as illustrated in FIG. 6G.

For the sixth scenario, referring to FIGS. 6G and 9B, in an initial stage when the latched non-volatile memory cell 950 is initialized to operate, (1) the node L4 may be switched to the voltage Vcc of power supply, (2) the node L5 may be switched to the voltage Vss of ground reference, (3) the node L8 may be switched to couple to the voltage Vcc of power supply to turn off the channel of the P-type MOS transistor 941 to disconnect the node L6 from the node L1, (4) the node L9 may be switched to couple to the voltage Vss of ground reference to turn off the channel of the N-type MOS transistor 942 to disconnect the node L7 from the node L2, (5) the node L10 may be switched to couple to the voltage Vss of ground reference to turn on the channel of the P-type MOS transistor 943 to couple the node L4 to the node L1 through the channel of the P-type MOS transistor 943 and (6) the node L11 may be switched to couple to the voltage Vcc of power supply to turn on the channel of the N-type MOS transistor 944 to couple the node L5 to the node L2 through the channel of the N-type MOS transistor 944. Thereby, said each of the non-volatile memory cells 900 may have its output M12 coupling to the node L3 of the memory unit 446 to latch in the memory unit 446 the logic level at the node M12 of said each of the non-volatile memory cells 900. A conductive line connecting the gate terminals of the P-type and N-type MOS transistor 447 and 448 in the left pair may latch a logic level that is the same as that at the node M12 of said each of the non-volatile memory cells 900. A conductive line connecting the gate terminals of the P-type and N-type MOS transistor 447 and 448 in the right pair may latch a logic level that is opposite to that at the node M12 of said each of the non-volatile memory cells 900.

For the sixth scenario, referring to FIGS. 6G and 9B, for operation of the latched non-volatile memory cell 950, (1) the node L4 may be switched to the voltage Vcc of power supply, (2) the node L5 may be switched to the voltage Vss of ground reference, (3) the node L8 may be switched to couple to the voltage Vcc of power supply to turn off the channel of the P-type MOS transistor 941 to disconnect the node L6 from the node L1, (4) the node L9 may be switched to couple to the voltage Vss of ground reference to turn off the channel of the N-type MOS transistor 942 to disconnect the node L7 from the node L2, (5) the node L10 may be switched to couple to the voltage Vcc of power supply to turn off the channel of the P-type MOS transistor 943 to disconnect the node L4 from the node L1 through the channel of the P-type MOS transistor 943 and (6) the node L11 may be switched to couple to the voltage Vss of ground reference to turn off the channel of the N-type MOS transistor 944 to disconnect the node L5 from the node L2 through the channel of the N-type MOS transistor 944. Thereby, the latched non-volatile memory cell 950 may generate an output at the node L3 or L12 associated with the logic level of the node M12 of said each of the non-volatile memory cells 900 determined by the resistances of the resistive random access memory 870.

(7) Seventh Scenario for Second Type of Latched Non-Volatile Memory Cell

For a seventh scenario, referring to FIGS. 7E and 7F for the first alternative and FIG. 9B, each of the non-volatile memory cells 910 of the seventh type as seen in FIGS. 7E and 7F may be arranged to have its node M4 coupling to the node L1 of the memory unit 446, its node M5 coupling to the node L2 of the memory unit 446 and its node M6 coupling to the node L3 of the memory unit 446. When the magnetoresistive random access memory 880-2 is being reset with the first high resistance and the magnetoresistive random access memory 880-1 is being set with the first low resistance, as illustrated in the first condition, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the programming voltage $V_{Pr}$, (6) the node L7 may be switched to couple to the voltage Vss of ground reference, (7) the node L10 may be switched to couple to the programming voltage $V_{Pr}$ to turn off the channel of the P-type MOS transistor 943 to disconnect the node L4 from the node L1 through the channel of the P-type MOS transistor 943, (8) the node L11 may be switched to couple to the voltage Vss of ground reference to turn off the channel of the N-type MOS transistor 944 to disconnect the node L5 from the node L2 through the channel of the N-type MOS transistor 944 and (9) the node L3 may be switched to be floating. Thereby, the magnetoresistive random access memory 880-2 may be reset with the first high resistance and the magnetoresistive random access memory 880-1 may be set with the first low resistance, as illustrated in FIGS. 7E and 7F.

For the seventh scenario, referring to FIGS. 7E and 7F for the first alternative and FIG. 9B, when the magnetoresistive random access memory 880-1 is being reset with the second high resistance and the magnetoresistive random access memory 880-2 is being set with the second low resistance, as illustrated in the second condition, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the voltage Vss of ground reference, (6) the node L7 may be switched to couple to the programming voltage $V_{Pr}$, (7) the node L10 may be switched to couple to the programming voltage $V_{Pr}$ to turn off the channel of the P-type MOS transistor 943 to disconnect the node L4 from the node L1 through the channel of the P-type MOS transistor 943, (8) the node L11 may be switched to couple to the voltage Vss of ground reference to turn off the channel of the N-type MOS transistor 944 to disconnect the node L5 from the node L2 through the channel of the N-type MOS transistor 944 and (9) the node L3 may be switched to be floating. Thereby, the magnetoresistive random access memory 880-1 may be reset with the second high resistance and the magnetoresistive random access memory 880-2 may be set with the second low resistance, as illustrated in FIGS. 7E and 7F.

For the seventh scenario, referring to FIGS. 7E and 7F for the first alternative and FIG. 9B, in an initial stage when the latched non-volatile memory cell 950 is initialized to operate, (1) the node L4 may be switched to the voltage Vcc of power supply, (2) the node L5 may be switched to the voltage Vss of ground reference, (3) the node L8 may be switched to couple to the voltage Vcc of power supply to turn off the channel of the P-type MOS transistor 941 to disconnect the node L6 from the node L1, (4) the node L9 may be switched to couple to the voltage Vss of ground reference to turn off the channel of the N-type MOS transistor 942 to disconnect the node L7 from the node L2, (5) the node L10 may be switched to couple to the voltage Vss of ground reference to turn on the channel of the P-type MOS transistor 943 to couple the node L4 to the node L1 through the channel of the P-type MOS transistor 943 and (6) the node L11 may be switched to couple to the voltage Vcc of power supply to turn on the channel of the N-type MOS transistor 944 to couple the node L5 to the node L2 through the channel of the N-type MOS transistor 944. Thereby, said each of the non-volatile memory cells 910 may have its output M6 coupling to the node L3 of the memory unit 446 to latch in the memory unit 446 the logic level at the node M6 of said each of the non-volatile memory cells 910. A conductive line connecting the gate terminals of the P-type and N-type MOS transistor 447 and 448 in the left pair may latch a logic level that is the same as that at the node M6 of said each of the non-volatile memory cells 910. A conductive line connecting the gate terminals of the P-type and N-type MOS transistor 447 and 448 in the right pair may latch a logic level that is opposite to that at the node M6 of said each of the non-volatile memory cells 910.

For the seventh scenario, referring to FIGS. 7E and 7F for the first alternative and FIG. 9B, for operation of the latched non-volatile memory cell 950, (1) the node L4 may be switched to the voltage Vcc of power supply, (2) the node L5 may be switched to the voltage Vss of ground reference, (3) the node L8 may be switched to couple to the voltage Vcc of power supply to turn off the channel of the P-type MOS transistor 941 to disconnect the node L6 from the node L1, (4) the node L9 may be switched to couple to the voltage Vss of ground reference to turn off the channel of the N-type MOS transistor 942 to disconnect the node L7 from the node L2, (5) the node L10 may be switched to couple to the voltage Vcc of power supply to turn off the channel of the P-type MOS transistor 943 to disconnect the node L4 from the node L1 through the channel of the P-type MOS transistor 943 and (6) the node L11 may be switched to couple to the voltage Vss of ground reference to turn off the channel of the N-type MOS transistor 944 to disconnect the node L5 from the node L2 through the channel of the N-type MOS transistor 944. Thereby, the latched non-volatile memory cell 950 may generate an output at the node L3 or L12 associated with the logic level of the node M6 of said each of the non-volatile memory cells 910 determined by the resistances of the magnetoresistive random access memories 880-1 and 880-2.

For the seventh scenario, referring to FIG. 7G for the first alternative and FIG. 9B, each of the non-volatile memory cells 910 of the seventh type as seen in FIG. 7G may be arranged to have its node M13 coupling to the node L1 of the memory unit 446, its node M14 coupling to the node L2 of the memory unit 446 and its node M15 coupling to the node L3 of the memory unit 446. When the magnetoresistive random access memory 880 is being set with the seventh low resistance, as illustrated in the third condition, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the programming voltage $V_{Pr}$, (6) the node L7 may be switched to couple to the voltage Vss of ground reference, (7) the node L10 may be switched to couple to the programming voltage $V_{Pr}$ to turn off the channel of the P-type MOS transistor 943 to disconnect the node L4 from the node L1 through the channel of the P-type MOS transistor 943, (8) the node L11 may be switched to couple to the voltage Vss of ground reference to turn off the channel of the N-type MOS transistor 944 to disconnect the node L5 from the node L2 through the channel of the N-type MOS transistor 944 and (9) the node L3 may be switched to be floating. Thereby, the magnetoresistive random access memory 880 may be set with the seventh low resistance, as illustrated in FIG. 7G.

For the seventh scenario, referring to FIG. 7G for the first alternative and FIG. 9B, when the magnetoresistive random access memory 880 is being reset with the seventh high resistance, as illustrated in the fourth condition, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the voltage Vss of ground reference, (6) the node L7 may be switched to couple to the programming voltage $V_{Pr}$, (7) the node L10 may be switched to couple to the programming voltage $V_{Pr}$ to turn off the channel of the P-type MOS transistor 943 to disconnect the node L4 from the node L1 through the channel of the P-type MOS transistor 943, (8) the node L11 may be switched to couple to the voltage Vss of ground reference to turn off the channel of the N-type MOS transistor 944 to disconnect the node L5 from the node L2 through the channel of the N-type MOS transistor 944 and (9) the node L3 may be switched to be floating. Thereby, the magnetoresistive random access memory 880 may be reset with the seventh high resistance, as illustrated in FIG. 7G.

For the seventh scenario, referring to FIG. 7G for the first alternative and FIG. 9B, in an initial stage when the latched non-volatile memory cell 950 is initialized to operate, (1) the node L4 may be switched to the voltage Vcc of power supply, (2) the node L5 may be switched to the voltage Vss of ground reference, (3) the node L8 may be switched to couple to the voltage Vcc of power supply to turn off the channel of the P-type MOS transistor 941 to disconnect the node L6 from the node L1, (4) the node L9 may be switched to couple to the voltage Vss of ground reference to turn off the channel of the N-type MOS transistor 942 to disconnect the node L7 from the node L2, (5) the node L10 may be switched to couple to the voltage Vss of ground reference to turn on the channel of the P-type MOS transistor 943 to couple the node L4 to the node L1 through the channel of the P-type MOS transistor 943 and (6) the node L11 may be switched to couple to the voltage Vcc of power supply to turn on the channel of the N-type MOS transistor 944 to couple the node L5 to the node L2 through the channel of the N-type MOS transistor 944. Thereby, said each of the non-volatile memory cells 910 may have its output M15 coupling to the node L3 of the memory unit 446 to latch in the memory unit 446 the logic level at the node M15 of said each of the non-volatile memory cells 910. A conductive line connecting the gate terminals of the P-type and N-type MOS transistor 447 and 448 in the left pair may latch a logic level that is the same as that at the node M15 of said each of the non-volatile memory cells 910. A conductive line connecting the gate terminals of the P-type and N-type MOS transistor 447 and 448 in the right pair may latch a logic level that is opposite to that at the node M15 of said each of the non-volatile memory cells 910.

For the seventh scenario, referring to FIG. 7G for the first alternative and FIG. 9B, for operation of the latched non-volatile memory cell 950, (1) the node L4 may be switched to the voltage Vcc of power supply, (2) the node L5 may be switched to the voltage Vss of ground reference, (3) the node L8 may be switched to couple to the voltage Vcc of power supply to turn off the channel of the P-type MOS transistor 941 to disconnect the node L6 from the node L1, (4) the node L9 may be switched to couple to the voltage Vss of ground reference to turn off the channel of the N-type MOS transistor 942 to disconnect the node L7 from the node L2, (5) the node L10 may be switched to couple to the voltage Vcc of power supply to turn off the channel of the P-type MOS transistor 943 to disconnect the node L4 from the node L1 through the channel of the P-type MOS transistor 943 and (6) the node L11 may be switched to couple to the voltage Vss of ground reference to turn off the channel of the N-type MOS transistor 944 to disconnect the node L5 from the node L2 through the channel of the N-type MOS transistor 944. Thereby, the latched non-volatile memory cell 950 may generate an output at the node L3 or L12 associated with the logic level of the node M15 of said each of the non-volatile memory cells 910 determined by the resistance of the magnetoresistive random access memory 880.

For the seventh scenario, referring to FIGS. 7H and 7I for the second alternative and FIG. 9B, each of the non-volatile memory cells 910 of the seventh type as seen in FIGS. 7H and 7I may be arranged to have its node M7 coupling to the node L1 of the memory unit 446, its node M8 coupling to the node L2 of the memory unit 446 and its node M9 coupling to the node L3 of the memory unit 446. When the magnetoresistive random access memory 880-3 is being reset with the third high resistance and the magnetoresistive random access memory 880-4 is being set with the third low resistance, as illustrated in the first condition, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the programming voltage $V_{Pr}$, (6) the node L7 may be switched to couple to the voltage Vss of ground reference, (7) the node L10 may be switched to couple to the programming voltage $V_{Pr}$ to turn off the channel of the P-type MOS transistor 943 to disconnect the node L4 from the node L1 through the channel of the P-type MOS transistor 943, (8) the node L11 may be switched to couple to the voltage Vss of ground reference to turn off the channel of the N-type MOS transistor 944 to disconnect the node L5 from the node L2 through the channel of the N-type MOS transistor 944 and (9) the node L3 may be switched to be floating. Thereby, the magnetoresistive random access memory 880-3 may be reset with the third high resistance and the magnetoresistive random access memory 880-4 may be set with the third low resistance, as illustrated in FIGS. 7H and 7I.

For the seventh scenario, referring to FIGS. 7H and 7I for the second alternative and FIG. 9B, when the magnetoresistive random access memory 880-4 is being reset with the fourth high resistance and the magnetoresistive random access memory 880-3 is being set with the fourth low resistance, as illustrated in the second condition, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the voltage Vss of ground reference, (6) the node L7 may be switched to couple to the programming voltage $V_{Pr}$, (7) the node L10 may be switched to couple to the programming voltage $V_{Pr}$ to turn off the channel of the P-type MOS transistor 943 to disconnect the node L4 from the node L1 through the channel of the P-type MOS transistor 943, (8) the node L11 may be switched to couple to the voltage Vss of ground reference to turn off the channel of the N-type MOS transistor 944 to disconnect the node L5 from the node L2 through the channel of the N-type MOS transistor 944 and (9) the node L3 may be switched to be floating. Thereby, the magnetoresistive random access memory 880-3 may be set with the fourth low resistance and the magnetoresistive random access memory 880-4 may be reset with the fourth high resistance, as illustrated in FIGS. 7H and 7I.

For the seventh scenario, referring to FIGS. 7H and 7I for the second alternative and FIG. 9B, in an initial stage when the latched non-volatile memory cell 950 is initialized to operate, (1) the node L4 may be switched to the voltage Vcc of power supply, (2) the node L5 may be switched to the voltage Vss of ground reference, (3) the node L8 may be switched to couple to the voltage Vcc of power supply to turn off the channel of the P-type MOS transistor 941 to disconnect the node L6 from the node L1, (4) the node L9 may be switched to couple to the voltage Vss of ground reference to turn off the channel of the N-type MOS transistor 942 to disconnect the node L7 from the node L2, (5) the node L10 may be switched to couple to the voltage Vss of ground reference to turn on the channel of the P-type MOS transistor 943 to couple the node L4 to the node L1 through the channel of the P-type MOS transistor 943 and (6) the node L11 may be switched to couple to the voltage Vcc of power supply to turn on the channel of the N-type MOS transistor 944 to couple the node L5 to the node L2 through the channel of the N-type MOS transistor 944. Thereby, said each of the non-volatile memory cells 910 may have its output M9 coupling to the node L3 of the memory unit 446 to latch in the memory unit 446 the logic level at the node M9 of said each of the non-volatile memory cells 910. A conductive line connecting the gate terminals of the P-type and N-type MOS transistor 447 and 448 in the left pair may latch a logic level that is the same as that at the node M9 of said each of the non-volatile memory cells 910. A conductive line connecting the gate terminals of the P-type and N-type MOS transistor 447 and 448 in the right pair may latch a logic level that is opposite to that at the node M9 of said each of the non-volatile memory cells 910.

For the seventh scenario, referring to FIGS. 7H and 7I for the second alternative and FIG. 9B, for operation of the latched non-volatile memory cell 950, (1) the node L4 may be switched to the voltage Vcc of power supply, (2) the node L5 may be switched to the voltage Vss of ground reference, (3) the node L8 may be switched to couple to the voltage Vcc of power supply to turn off the channel of the P-type MOS transistor 941 to disconnect the node L6 from the node L1, (4) the node L9 may be switched to couple to the voltage Vss of ground reference to turn off the channel of the N-type MOS transistor 942 to disconnect the node L7 from the node L2, (5) the node L10 may be switched to couple to the voltage Vcc of power supply to turn off the channel of the P-type MOS transistor 943 to disconnect the node L4 from the node L1 through the channel of the P-type MOS transistor 943 and (6) the node L11 may be switched to couple to the voltage Vss of ground reference to turn off the channel of the N-type MOS transistor 944 to disconnect the node L5 from the node L2 through the channel of the N-type MOS transistor 944. Thereby, the latched non-volatile memory cell 950 may generate an output at the node L3 or L12 associated with the logic level of the node M9 of said each of the non-volatile memory cells 910 determined by the resistances of the magnetoresistive random access memories 880-3 and 880-4.

For the seventh scenario, referring to FIG. 7J for the second alternative and FIG. 9B, each of the non-volatile memory cells 910 of the seventh type as seen in FIG. 7J may be arranged to have its node M16 coupling to the node L1 of the memory unit 446, its node M17 coupling to the node L2 of the memory unit 446 and its node M18 coupling to the node L3 of the memory unit 446. When the magnetoresistive random access memory 880 is being reset with the eighth high resistance, as illustrated in the third condition, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the programming voltage $V_{Pr}$, (6) the node L7 may be switched to couple to the voltage Vss of ground reference, (7) the node L10 may be switched to couple to the programming voltage $V_{Pr}$ to turn off the channel of the P-type MOS transistor 943 to disconnect the node L4 from the node L1 through the channel of the P-type MOS transistor 943, (8) the node L11 may be switched to couple to the voltage Vss of ground reference to turn off the channel of the N-type MOS transistor 944 to disconnect the node L5 from the node L2 through the channel of the N-type MOS transistor 944 and (9) the node L3 may be switched to be floating. Thereby, the magnetoresistive random access memory 880 may be reset with the eighth high resistance, as illustrated in FIG. 7J.

For the seventh scenario, referring to FIG. 7J for the second alternative and FIG. 9B, when the magnetoresistive random access memory 880 is being set with the eighth low resistance, as illustrated in the fourth condition, (1) the node L4 may be switched to be floating, (2) the node L5 may be switched to be floating, (3) the node L8 may be switched to couple to the voltage Vss of ground reference to turn on the channel of the P-type MOS transistor 941 to couple the node L6 to the node L1, (4) the node L9 may be switched to couple to the programming voltage $V_{Pr}$ to turn on the channel of the N-type MOS transistor 942 to couple the node L7 to the node L2, (5) the node L6 may be switched to couple to the voltage Vss of ground reference, (6) the node L7 may be switched to couple to the programming voltage $V_{Pr}$, (7) the node L10 may be switched to couple to the programming voltage $V_{Pr}$ to turn off the channel of the P-type MOS transistor 943 to disconnect the node L4 from the node L1 through the channel of the P-type MOS transistor 943, (8) the node L11 may be switched to couple to the voltage Vss of ground reference to turn off the channel of the N-type MOS transistor 944 to disconnect the node L5 from the node L2 through the channel of the N-type MOS transistor 944 and (9) the node L3 may be switched to be floating. Thereby, the magnetoresistive random access memory 880-3 may be set with the eighth low resistance, as illustrated in FIG. 7J.

For the seventh scenario, referring to FIG. 7J for the second alternative and FIG. 9B, in an initial stage when the latched non-volatile memory cell 950 is initialized to operate, (1) the node L4 may be switched to the voltage Vcc of power supply, (2) the node L5 may be switched to the voltage Vss of ground reference, (3) the node L8 may be switched to couple to the voltage Vcc of power supply to turn off the channel of the P-type MOS transistor 941 to disconnect the node L6 from the node L1, (4) the node L9 may be switched to couple to the voltage Vss of ground reference to turn off the channel of the N-type MOS transistor 942 to disconnect the node L7 from the node L2, (5) the node L10 may be switched to couple to the voltage Vss of ground reference to turn on the channel of the P-type MOS transistor 943 to couple the node L4 to the node L1 through the channel of the P-type MOS transistor 943 and (6) the node L11 may be switched to couple to the voltage Vcc of power supply to turn on the channel of the N-type MOS transistor 944 to couple the node L5 to the node L2 through the channel of the N-type MOS transistor 944. Thereby, said each of the non-volatile memory cells 910 may have its output M18 coupling to the node L3 of the memory unit 446 to latch in the memory unit 446 the logic level at the node M18 of said each of the non-volatile memory cells 910. A conductive line connecting the gate terminals of the P-type and N-type MOS transistor 447 and 448 in the left pair may latch a logic level that is the same as that at the node M18 of said each of the non-volatile memory cells 910. A conductive line connecting the gate terminals of the P-type and N-type MOS transistor 447 and 448 in the right pair may latch a logic level that is opposite to that at the node M18 of said each of the non-volatile memory cells 910.

For the seventh scenario, referring to FIG. 7J for the second alternative and FIG. 9B, for operation of the latched non-volatile memory cell 950, (1) the node L4 may be switched to the voltage Vcc of power supply, (2) the node L5 may be switched to the voltage Vss of ground reference, (3) the node L8 may be switched to couple to the voltage Vcc of power supply to turn off the channel of the P-type MOS transistor 941 to disconnect the node L6 from the node L1, (4) the node L9 may be switched to couple to the voltage Vss of ground reference to turn off the channel of the N-type MOS transistor 942 to disconnect the node L7 from the node L2, (5) the node L10 may be switched to couple to the voltage Vcc of power supply to turn off the channel of the P-type MOS transistor 943 to disconnect the node L4 from the node L1 through the channel of the P-type MOS transistor 943 and (6) the node L11 may be switched to couple to the voltage Vss of ground reference to turn off the channel of the N-type MOS transistor 944 to disconnect the node L5 from the node L2 through the channel of the N-type MOS transistor 944. Thereby, the latched non-volatile memory cell 950 may generate an output at the node L3 or L12 associated with the logic level of the node M18 of said each of the non-volatile memory cells 910 determined by the resistance of the magnetoresistive random access memory 880.

Specification for Pass/No-Pass Switches (1) First Type of Pass/No-Pass Switch

Figure 10A:
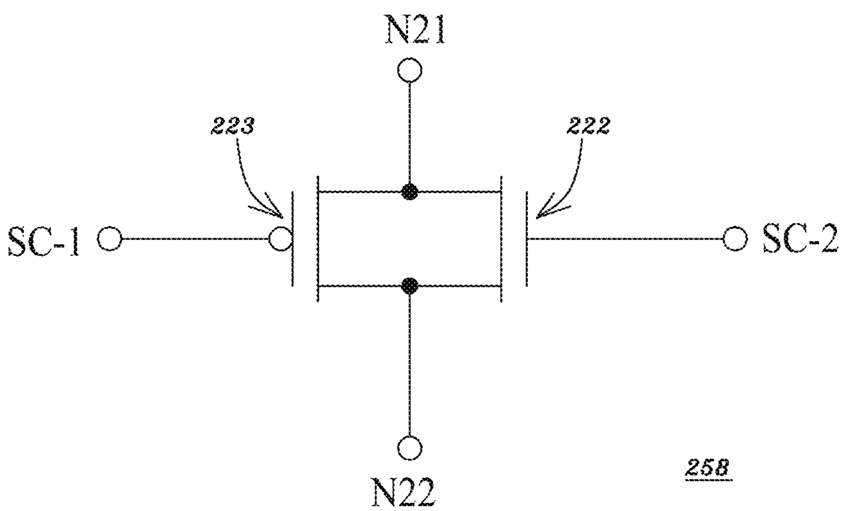
FIGS. 10A-10F are circuit diagrams illustrating various types of pass/no-pass switch in accordance with an embodiment of the present application.

FIG. 10A is a circuit diagram illustrating a first type of pass/no-pass switch in accordance with an embodiment of the present application. Referring to FIG. 10A, a first type of pass/no-pass switch 258 may include an N-type metal-oxide-semiconductor (MOS) transistor 222 and a P-type metal-oxide-semiconductor (MOS) transistor 223 coupling in parallel to each other. Each of the N-type and P-type metal-oxide-semiconductor (MOS) transistors 222 and 223 of the pass/no-pass switch 258 of the first type may be provided with a channel having an end coupling to a node N21 and the other opposite end coupling to a node N22. Thereby, the first type of pass/no-pass switch 258 may be set to turn on or off connection between the nodes N21 and N22. The P-type MOS transistor 223 of the pass/no-pass switch 258 of the first type may have a gate terminal coupling to a node SC-1. The N-type MOS transistor 222 of the pass/no-pass switch 258 of the first type may have a gate terminal coupling to a node SC-2.

(2) Second Type of Pass/No-Pass Switch

Figure 10B:
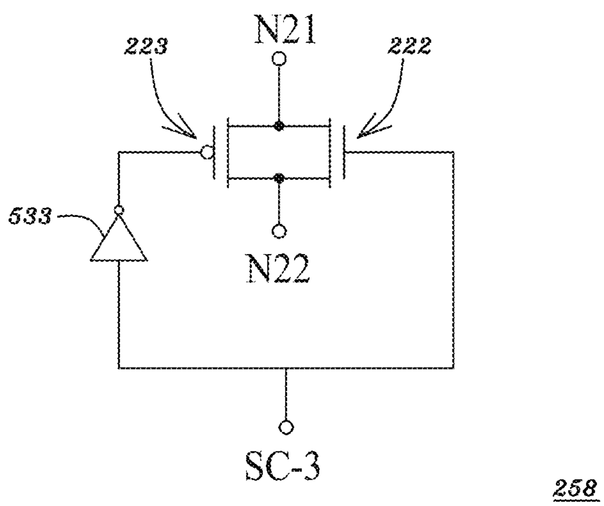

FIG. 10B is a circuit diagram illustrating a second type of pass/no-pass switch in accordance with an embodiment of the present application. Referring to FIG. 10B, a second type of pass/no-pass switch 258 may include the N-type MOS transistor 222 and the P-type MOS transistor 223 that are the same as those of the pass/no-pass switch 258 of the first type as illustrated in FIG. 10A. The second type of pass/no-pass switch 258 may further include an inverter 533 configured to invert its input coupling to a gate terminal of the N-type MOS transistor 222 and a node SC-3 into its output coupling to a gate terminal of the P-type MOS transistor 223.

(3) Third Type of Pass/No-Pass Switch

Figure 10D:
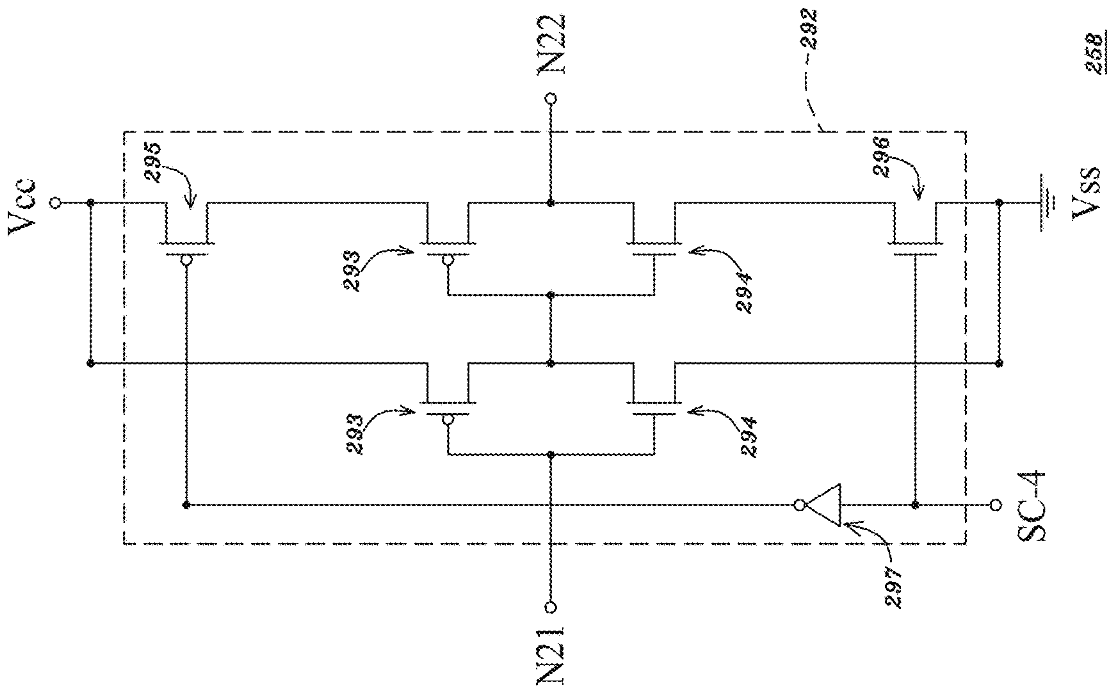
Figure 10C:
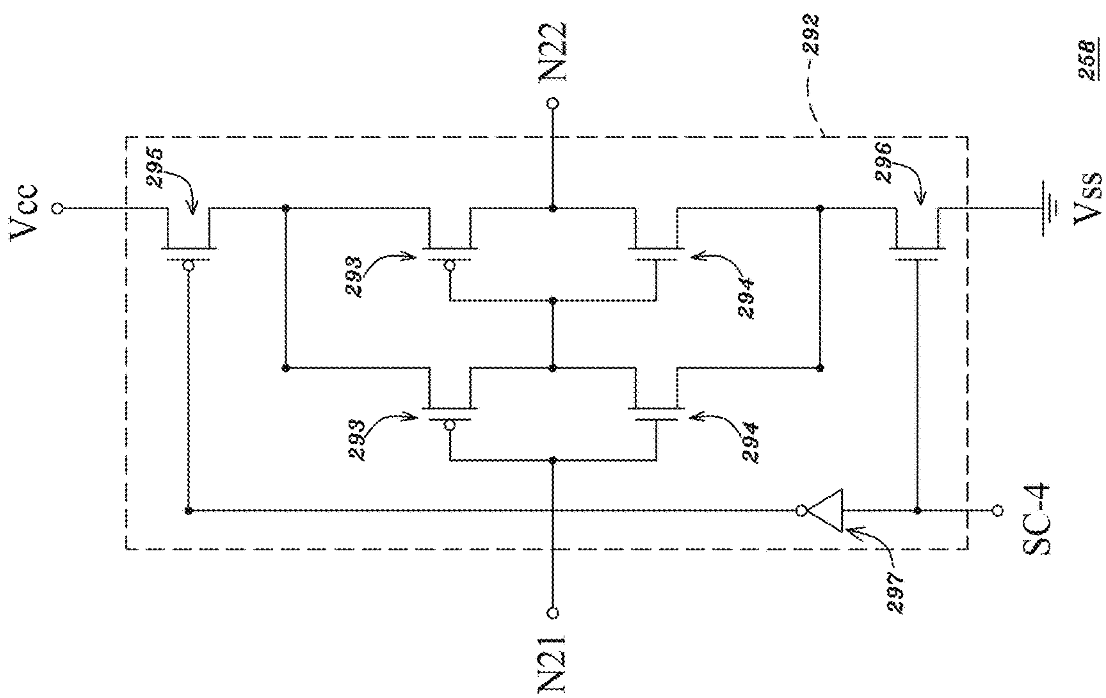

FIG. 10C is a circuit diagram illustrating a third type of pass/no-pass switch in accordance with an embodiment of the present application. Referring to FIG. 10C, a third type of pass/no-pass switch 258 may be a multi-stage tri-state buffer 292, i.e., switch buffer, having a pair of a P-type MOS transistor 293 and N-type MOS transistor 294 in each stage, both having respective drain terminals coupling to each other and respective source terminals configured to couple to the voltage Vcc of power supply and to the voltage Vss of ground reference. In this case, the multi-stage tri-state buffer 292 is two-stage tri-state buffer, i.e., two-stage inverter buffer, having two pairs of the P-type MOS transistor 293 and N-type MOS transistor 294 in the two respective stages, i.e., first and second stages. A node N21 may couple to gate terminals of the P-type MOS and N-type MOS transistors 293 and 294 in the pair in the first stage. The drain terminals of the P-type MOS and N-type MOS transistors 293 and 294 in the pair in the first stage may couple to gate terminals of the P-type MOS and N-type MOS transistors 293 and 294 in the pair in the second stage, i.e., output stage. The drain terminals of the P-type MOS and N-type MOS transistors 293 and 294 in the pair in the second stage, i.e., output stage, may couple to a node N22.

Referring to FIG. 10C, the multi-stage tri-state buffer 292 may further include a switching mechanism configured to enable or disable the multi-stage tri-state buffer 292, wherein the switching mechanism may be composed of (1) a control P-type MOS transistor 295 having a source terminal coupling to the voltage Vcc of power supply and a drain terminal coupling to the source terminals of the P-type MOS transistors 293 in the first and second stages, (2) a control N-type MOS transistor 296 having a source terminal coupling to the voltage Vss of ground reference and a drain terminal coupling to the source terminals of the N-type MOS transistors 294 in the first and second stages and (3) an inverter 297 configured to invert its input coupling to a gate terminal of the control N-type MOS transistor 296 and a node SC-4 into its output coupling to a gate terminal of the control P-type MOS transistor 295.

For example, referring to FIG. 10C, when a logic level of “1” couples to the node SC-4 to turn on the multi-stage tri-state buffer 292, a signal may be transmitted from the node N21 to the node N22. When a logic level of “0” couples to the node SC-4 to turn off the multi-stage tri-state buffer 292, no signal transmission may occur between the nodes N21 and N22.

(4) Fourth Type of Pass/No-Pass Switch

FIG. 10D is a circuit diagram illustrating a fourth type of pass/no-pass switch in accordance with an embodiment of the present application. Referring to FIG. 10D, a fourth type of pass/no-pass switch 258 may be a multi-stage tri-state buffer, i.e., switch buffer, that is similar to the one 292 as illustrated in FIG. 10C. For an element indicated by the same reference number shown in FIGS. 10C and 10D, the specification of the element as seen in FIG. 10D may be referred to that of the element as illustrated in FIG. 10C. The difference between the circuits illustrated in FIG. 10C and the circuits illustrated in FIG. 10D is mentioned as below. Referring to FIG. 10D, the drain terminal of the control P-type MOS transistor 295 may couple to the source terminal of the P-type MOS transistor 293 in the second stage, i.e., output stage, but does not couple to the source terminal of the P-type MOS transistor 293 in the first stage; the source terminal of the P-type MOS transistor 293 in the first stage may couple to the voltage Vcc of power supply and the source terminal of the control P-type MOS transistor 295. The drain terminal of the control N-type MOS transistor 296 may couple to the source terminal of the N-type MOS transistor 294 in the second stage, i.e., output stage, but does not couple to the source terminal of the N-type MOS transistor 294 in the first stage; the source terminal of the N-type MOS transistor 294 in the first stage may couple to the voltage Vss of ground reference and the source terminal of the control N-type MOS transistor 296.

(5) Fifth Type of Pass/No-Pass Switch

Figure 10E:
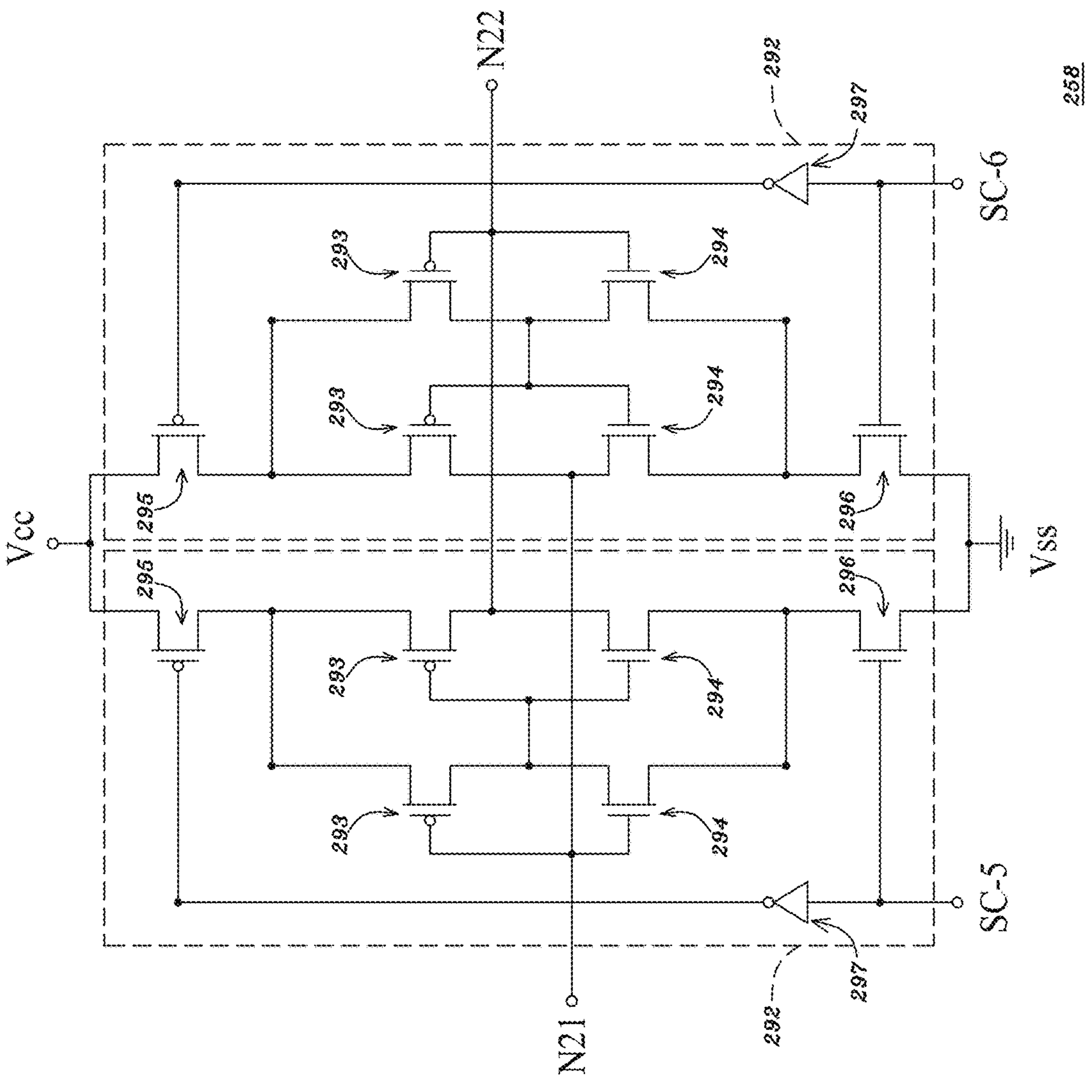

FIG. 10E is a circuit diagram illustrating a fifth type of pass/no-pass switch in accordance with an embodiment of the present application. For an element indicated by the same reference number shown in FIGS. 10C and 10E, the specification of the element as seen in FIG. 10E may be referred to that of the element as illustrated in FIG. 10C. Referring to FIG. 10E, a fifth type of pass/no-pass switch 258 may include a pair of the multi-stage tri-state buffers 292, i.e., switch buffers, as illustrated in FIG. 10C. The gate terminals of the P-type and N-type MOS transistors 293 and 294 in the first stage in the left one of the multi-stage tri-state buffers 292 in the pair may couple to the drain terminals of the P-type and N-type MOS transistors 293 and 294 in the second stage, i.e., output stage, in the right one of the multi-stage tri-state buffers 292 in the pair and to a node N21. The gate terminals of the P-type and N-type MOS transistors 293 and 294 in the first stage in the right one of the multi-stage tri-state buffers 292 in the pair may couple to the drain terminals of the P-type and N-type MOS transistors 293 and 294 in the second stage, i.e., output stage, in the left one of the multi-stage tri-state buffers 292 in the pair and to a node N22. For the left one of the multi-stage tri-state buffers 292 in the pair, its inverter 297 is configured to invert its input coupling to the gate terminal of its control N-type MOS transistor 296 and a node SC-5 into its output coupling to the gate terminal of its control P-type MOS transistor 295. For the right one of the multi-stage tri-state buffers 292 in the pair, its inverter 297 is configured to invert its input coupling to the gate terminal of its control N-type MOS transistor 296 and a node SC-6 into its output coupling to the gate terminal of its control P-type MOS transistor 295.

For example, referring to FIG. 10E, when a logic level of "1" couples to the node SC-5 to turn on the left one of the multi-stage tri-state buffers 292 in the pair and a logic level of "0" couples to the node SC-6 to turn off the right one of the multi-stage tri-state buffers 292 in the pair, a signal may be transmitted from the node N21 to the node N22. When a logic level of "0" couples to the node SC-5 to turn off the left one of the multi-stage tri-state buffers 292 in the pair and a logic level of "1" couples to the node SC-6 to turn on the right one of the multi-stage tri-state buffers 292 in the pair, a signal may be transmitted from the node N22 to the node N21. When a logic level of "0" couples to the node SC-5 to turn off the left one of the multi-stage tri-state buffers 292 in the pair and a logic level of "0" couples to the node SC-6 to turn off the right one of the multi-stage tri-state buffers 292 in the pair, no signal transmission may occur between the nodes N21 and N22. When a logic level of "1" couples to the node SC-5 to turn on the left one of the multi-stage tri-state buffers 292 in the pair and a logic level of "1" couples to the node SC-6 to turn on the right one of the multi-stage tri-state buffers 292 in the pair, signal transmission may occur in either of directions from the node N21 to the node N22 and from the node N22 to the node N21.

(6) Sixth Type of Pass/No-Pass Switch

Figure 10F:
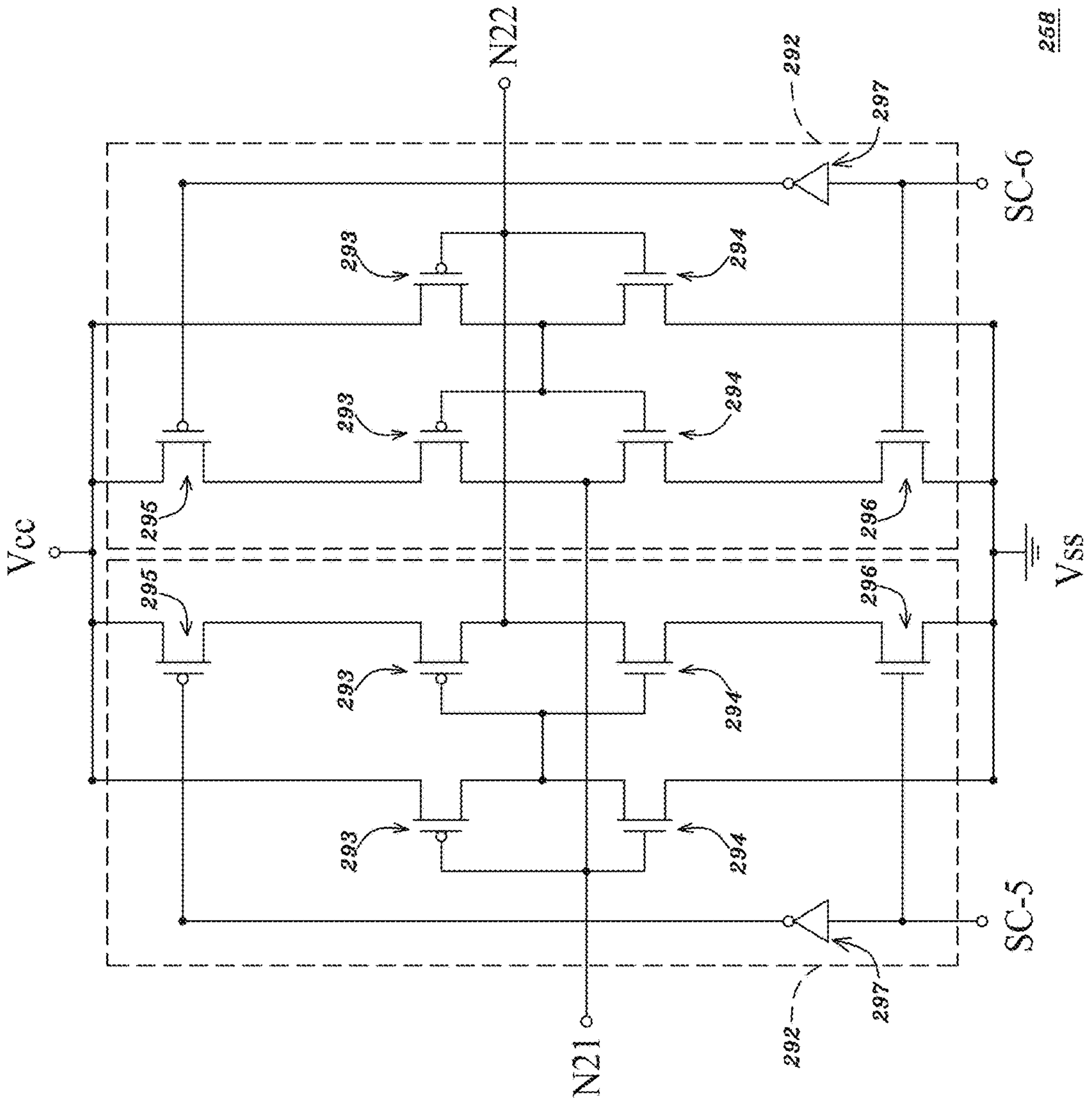

FIG. 10F is a circuit diagram illustrating a sixth type of pass/no-pass switch in accordance with an embodiment of the present application. Referring to FIG. 10F, a sixth type of pass/no-pass switch 258 may be composed of a pair of multi-stage tri-state buffers, i.e., switch buffers, which is similar to the ones 292 as illustrated in FIG. 10E. For an element indicated by the same reference number shown in FIGS. 10E and 10F, the specification of the element as seen in FIG. 10F may be referred to that of the element as illustrated in FIG. 10E. The difference between the circuits illustrated in FIG. 10E and the circuits illustrated in FIG. 10F is mentioned as below. Referring to FIG. 10F, for each of the multi-stage tri-state buffers 292 in the pair, the drain terminal of its control P-type MOS transistor 295 may couple to the source terminal of its P-type MOS transistor 293 in the second stage, i.e., output stage, but does not couple to the source terminal of its P-type MOS transistor 293 in the first stage; the source terminal of its P-type MOS transistor 293 in the first stage may couple to the voltage Vcc of power supply and the source terminal of its control P-type MOS transistor 295. For each of the multi-stage tri-state buffers 292 in the pair, the drain terminal of its control N-type MOS transistor 296 may couple to the source terminal of its N-type MOS transistor 294 in the second stage, i.e., output stage, but does not couple to the source terminal of its N-type MOS transistor 294 in the first stage; the source terminal of its N-type MOS transistor 294 in the first stage may couple to the voltage Vss of ground reference and the source terminal of its control N-type MOS transistor 296.

Figure 11A:
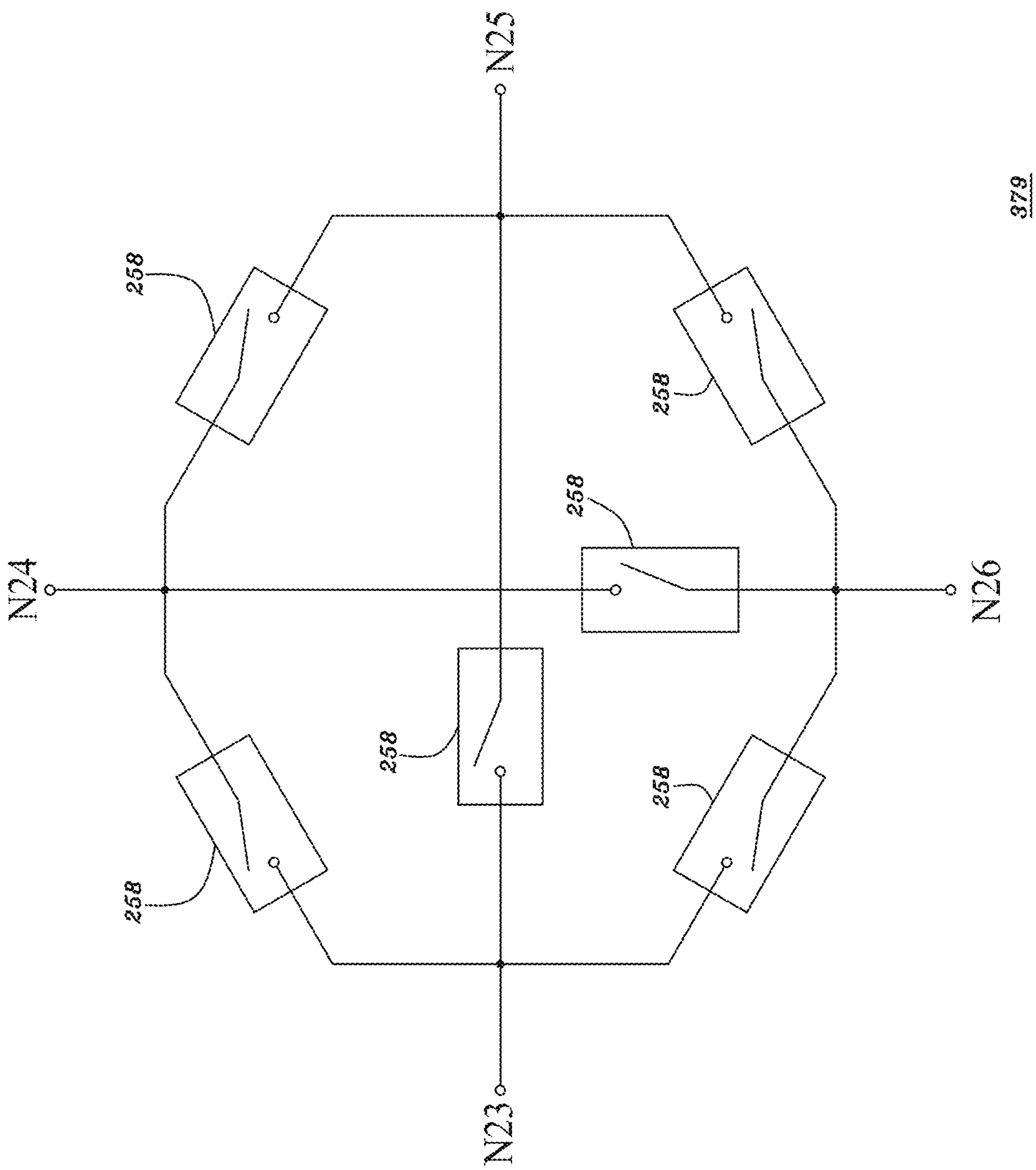
FIGS. 11A-11D are block diagrams illustrating various types of cross-point switches in accordance with an embodiment of the present application.

Specification for Cross-Point Switches Constructed from Pass/No-Pass Switches (1) First Type of Cross-Point Switch FIG. 11A is a circuit diagram illustrating a first type of cross-point switch composed of six pass/no-pass switches in accordance with an embodiment of the present application. Referring to FIG. 11A, six pass/no-pass switches 258, each of which may be any one of the first through sixth types of pass/no-pass switches as illustrated in FIGS. 10A-10F respectively, may compose a first type of cross-point switch 379. The first type of cross-point switch 379 may have four terminals N23-N26 each configured to be switched to couple to another one of its four terminals N23-N26 via one of its six pass/no-pass switches 258. One of the first through sixth types of pass/no-pass switches for said each of the pass/no-pass switches 258 may have one of its nodes N21 and N22 coupling to one of the four terminals N23-N26 and the other one of its nodes N21 and N22 coupling to another one of the four terminals N23-N26. For example, the first type of cross-point switch 379 may have its terminal N23 configured to be switched to couple to its terminal N24 via a first one of its six pass/no-pass switches 258 between its terminals N23 and N24, to its terminal N25 via a second one of its six pass/no-pass switches 258 between its terminals N23 and N25 and/or to its terminal N26 via a third one of its six pass/no-pass switches 258 between its terminals N23 and N26.

(2) Second Type of Cross-Point Switch

Figure 11B:
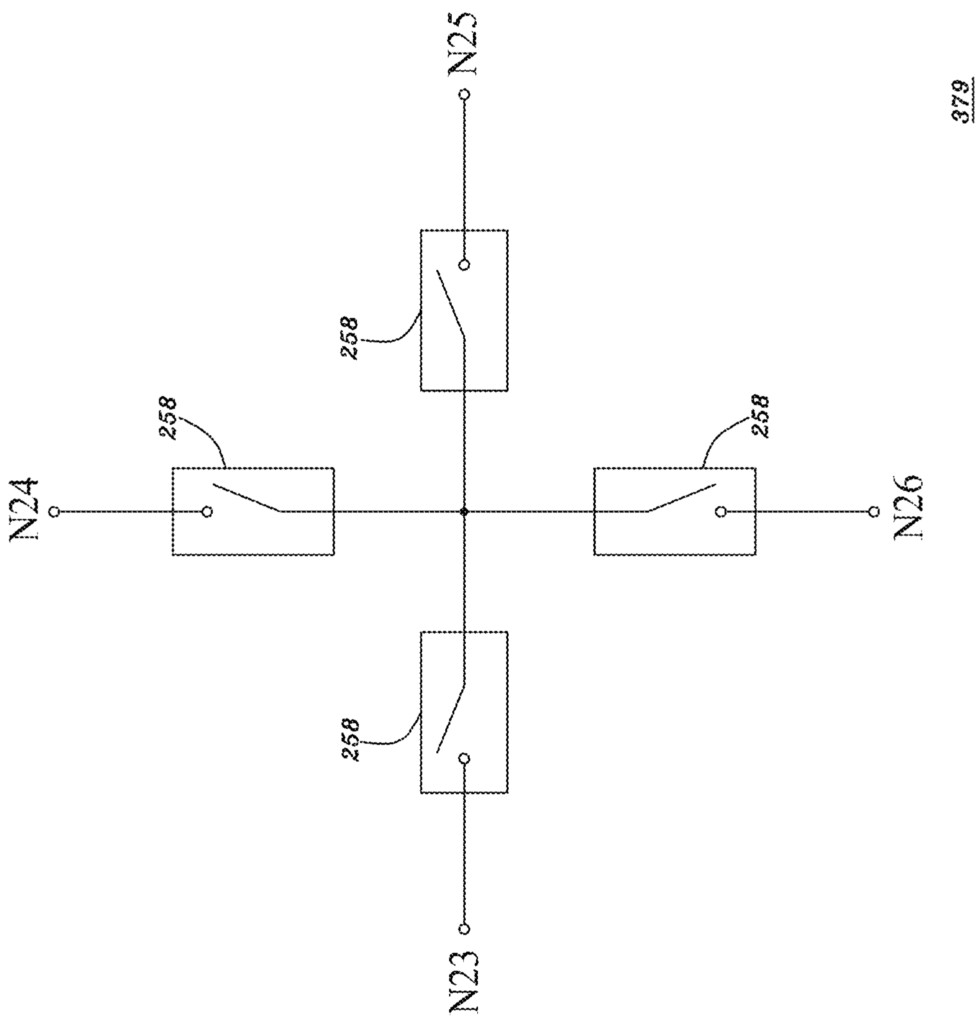

FIG. 11B is a circuit diagram illustrating a second type of cross-point switch composed of four pass/no-pass switches in accordance with an embodiment of the present application. Referring to FIG. 11B, four pass/no-pass switches 258, each of which may be any one of the first through sixth types of pass/no-pass switches as illustrated in FIGS. 10A-10F respectively, may compose a second type of cross-point switch 379. The second type of cross-point switch 379 may have four terminals N23-N26 each configured to be switched to couple to another one of its four terminals N23-N26 via two of its four pass/no-pass switches 258. The second type of cross-point switch 379 may have a central node configured to couple to its four terminals N23-N26 via its four respective pass/no-pass switches 258. One of the first through sixth types of pass/no-pass switches for said each of the pass/no-pass switches 258 may have one of its nodes N21 and N22 coupling to one of the four terminals N23-N26 and the other one of its nodes N21 and N22 coupling to the central node of the cross-point switch 379 of the second type. For example, the second type of cross-point switch 379 may have its terminal N23 configured to be switched to couple to its terminal N24 via left and top ones of its four pass/no-pass switches 258, to its terminal N25 via left and right ones of its four pass/no-pass switches 258 and/or to its terminal N26 via left and bottom ones of its four pass/no-pass switches 258.

Specification for Multiplexer (MUXER)

(1) First Type of Multiplexer

Figure 12A:
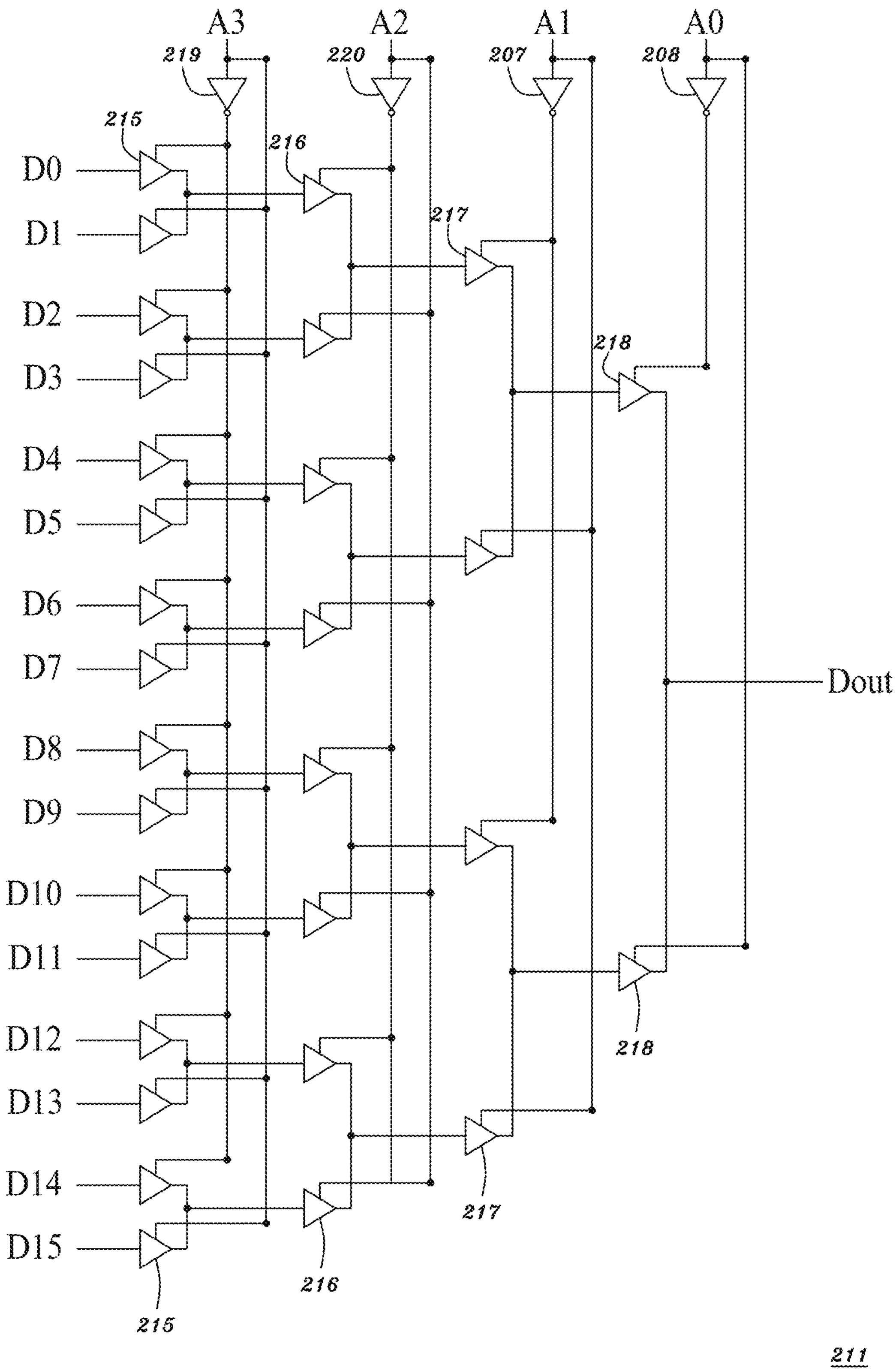
FIGS. 12A and 12C-12L are circuit diagrams illustrating various types of multiplexers in accordance with an embodiment of the present application.

FIG. 12A is a circuit diagram illustrating a first type of multiplexer in accordance with an embodiment of the present application. Referring to FIG. 12A, a first type of multiplexer (MUXER) 211 may select one from its first set of inputs arranged in parallel into its output based on a combination of its second set of inputs arranged in parallel. For example, the first type of multiplexer (MUXER) 211 may have sixteen inputs D0-D15 arranged in parallel to act as its first set of inputs and four inputs A0-A3 arranged in parallel to act as its second set of inputs. The first type of multiplexer (MUXER) 211 may select one from its first set of sixteen inputs D0-D15 into its output Dout based on a combination of its second set of four inputs A0-A3.

Referring to FIG. 12A, the first type of multiplexer 211 may include multiple stages of tri-state buffers, e.g., four stages of tri-state buffers 215, 216, 217 and 218, coupling to one another stage by stage. For more elaboration, the first type of multiplexer 211 may include sixteen tri-state buffers 215 in eight pairs in the first stage, arranged in parallel, each having a first input coupling to one of the sixteen inputs D0-D15 in the first set and a second input associated with the input A3 in the second set. Each of the sixteen tri-state buffers 215 in the first stage may be switched on or off to pass or not to pass its first input into its output in accordance with its second input. The first type of multiplexer 211 may include an inverter 219 configured to invert its input coupling to the input A3 in the second set into its output. One of the tri-state buffers 215 in each pair in the first stage may be switched on in accordance with its second input coupling to one of the input and output of the inverter 219 to pass its first input into its output; the other one of the tri-state buffers 215 in said each pair in the first stage may be switched off in accordance with its second input coupling to the other one of the input and output of the inverter 219 not to pass its first input into its output. The outputs of the tri-state buffers 215 in said each pair in the first stage may couple to each other. For example, a top one of the tri-state buffers 215 in a topmost pair in the first stage may have its first input coupling to the input D0 in the first set and its second input coupling to the output of the inverter 219; a bottom one of the tri-state buffers 215 in the topmost pair in the first stage may have its first input coupling to the input D1 in the first set and its second input coupling to the input of the inverter 219. The top one of the tri-state buffers 215 in the topmost pair in the first stage may be switched on in accordance with its second input to pass its first input into its output; the bottom one of the tri-state buffers 215 in the topmost pair in the first stage may be switched off in accordance with its second input not to pass its first input into its output. Thereby, each of the eight pairs of tri-state buffers 215 in the first stage may be switched in accordance with its two second inputs coupling to the input and output of the inverter 219 respectively to pass one of its two first inputs into its output coupling to a first input of one of the tri-state buffers 216 in the second stage.

Referring to FIG. 12A, the first type of multiplexer 211 may include eight tri-state buffers 216 in four pairs in the second stage, arranged in parallel, each having a first input coupling to the output of one of the eight pairs of tri-state buffers 215 in the first stage and a second input associated with the input A2 in the second set. Each of the eight tri-state buffers 216 in the second stage may be switched on or off to pass or not to pass its first input into its output in accordance with its second input. The first type of multiplexer 211 may include an inverter 220 configured to invert its input coupling to the input A2 in the second set into its output. One of the tri-state buffers 216 in each pair in the second stage may be switched on in accordance with its second input coupling to one of the input and output of the inverter 220 to pass its first input into its output; the other one of the tri-state buffers 216 in said each pair in the second stage may be switched off in accordance with its second input coupling to the other one of the input and output of the inverter 220 not to pass its first input into its output. The outputs of the tri-state buffers 216 in said each pair in the second stage may couple to each other. For example, a top one of the tri-state buffers 216 in a topmost pair in the second stage may have its first input coupling to the output of a topmost one of the eight pairs of tri-state buffers 215 in the first stage and its second input coupling to the output of the inverter 220; a bottom one of the tri-state buffers 216 in the topmost pair in the second stage may have its first input coupling to the output of a second top one of the eight pairs of tri-state buffers 215 in the first stage and its second input coupling to the input of the inverter 220. The top one of the tri-state buffers 216 in the topmost pair in the second stage may be switched on in accordance with its second input to pass its first input into its output; the bottom one of the tri-state buffers 216 in the topmost pair in the second stage may be switched off in accordance with its second input not to pass its first input into its output. Thereby, each of the four pairs of tri-state buffers 216 in the second stage may be switched in accordance with its two second inputs coupling to the input and output of the inverter 220 respectively to pass one of its two first inputs into its output coupling to a first input of one of the tri-state buffers 217 in the third stage.

Referring to FIG. 12A, the first type of multiplexer 211 may include four tri-state buffers 217 in two pairs in the third stage, arranged in parallel, each having a first input coupling to the output of one of the four pairs of tri-state buffers 216 in the second stage and a second input associated with the input A1 in the second set. Each of the four tri-state buffers 217 in the third stage may be switched on or off to pass or not to pass its first input into its output in accordance with its second input. The first type of multiplexer 211 may include an inverter 207 configured to invert its input coupling to the input A1 in the second set into its output. One of the tri-state buffers 217 in each pair in the third stage may be switched on in accordance with its second input coupling to one of the input and output of the inverter 207 to pass its first input into its output; the other one of the tri-state buffers 217 in said each pair in the third stage may be switched off in accordance with its second input coupling to the other one of the input and output of the inverter 207 not to pass its first input into its output. The outputs of the tri-state buffers 217 in said each pair in the third stage may couple to each other. For example, a top one of the tri-state buffers 217 in a top pair in the third stage may have its first input coupling to the output of a topmost one of the four pairs of tri-state buffers

216 in the second stage and its second input coupling to the output of the inverter 207; a bottom one of the tri-state buffers 217 in the top pair in the third stage may have its first input coupling to the output of a second top one of the four pairs of tri-state buffers 216 in the second stage and its second input coupling to the input of the inverter 207. The top one of the tri-state buffers 217 in the top pair in the third stage may be switched on in accordance with its second input to pass its first input into its output; the bottom one of the tri-state buffers 217 in the top pair in the third stage may be switched off in accordance with its second input not to pass its first input into its output. Thereby, each of the two pairs of tri-state buffers 217 in the third stage may be switched in accordance with its two second inputs coupling to the input and output of the inverter 207 respectively to pass one of its two first inputs into its output coupling to a first input of one of the tri-state buffers 218 in the fourth stage.

Referring to FIG. 12A, the first type of multiplexer 211 may include a pair of two tri-state buffers 218 in the fourth stage, i.e., output stage, arranged in parallel, each having a first input coupling to the output of one of the two pairs of tri-state buffers 217 in the third stage and a second input associated with the input A0 in the second set. Each of the two tri-state buffers 218 in the pair in the fourth stage, i.e., output stage, may be switched on or off to pass or not to pass its first input into its output in accordance with its second input. The first type of multiplexer 211 may include an inverter 208 configured to invert its input coupling to the input A0 in the second set into its output. One of the two tri-state buffers 218 in the pair in the fourth stage, i.e., output stage, may be switched on in accordance with its second input coupling to one of the input and output of the inverter 208 to pass its first input into its output; the other one of the two tri-state buffers 218 in the pair in the fourth stage, i.e., output stage, may be switched off in accordance with its second input coupling to the other one of the input and output of the inverter 208 not to pass its first input into its output. The outputs of the two tri-state buffers 218 in the pair in the fourth stage, i.e., output stage, may couple to each other. For example, a top one of the two tri-state buffers 218 in the pair in the fourth stage, i.e., output stage, may have its first input coupling to the output of a top one of the two pairs of tri-state buffers 217 in the third stage and its second input coupling to the output of the inverter 208; a bottom one of the two tri-state buffers 218 in the pair in the fourth stage, i.e., output stage, may have its first input coupling to the output of a bottom one of the two pairs of tri-state buffers 217 in the third stage and its second input coupling to the input of the inverter 208. The top one of the two tri-state buffers 218 in the pair in the fourth stage, i.e., output stage, may be switched on in accordance with its second input to pass its first input into its output; the bottom one of the two tri-state buffers 218 in the pair in the fourth stage, i.e., output stage, may be switched off in accordance with its second input not to pass its first input into its output. Thereby, the pair of the two tri-state buffers 218 in the fourth stage, i.e., output stage, may be switched in accordance with its two second inputs coupling to the input and output of the inverter 208 respectively to pass one of its two first inputs into its output acting as the output Dout of the multiplexer 211 of the first type.

Figure 12B:
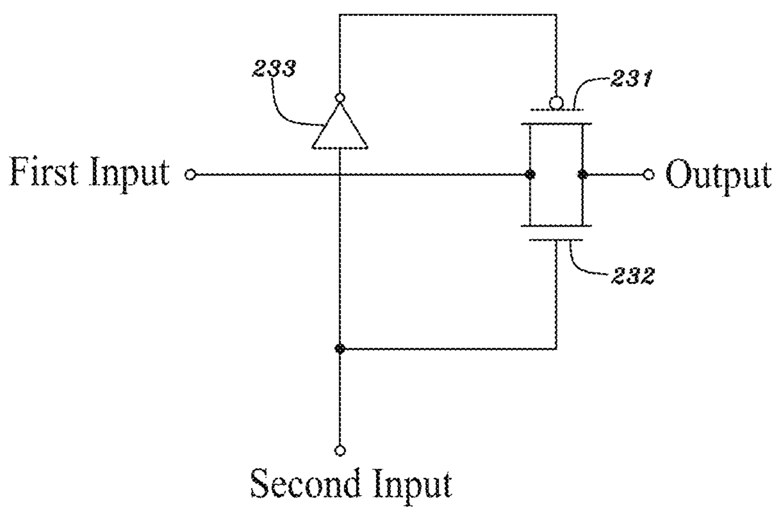
FIG. 12B is a circuit diagram illustrating a tri-state buffer of a multiplexer in accordance with an embodiment of the present application.

FIG. 12B is a circuit diagram illustrating a tri-state buffer of a multiplexer of a first type in accordance with an embodiment of the present application. Referring to FIGS. 12A and 12B, each of the tri-state buffers 215, 216, 217 and 218 may include (1) a P-type MOS transistor 231 configured to form a channel with an end at the first input of said each of the tri-state buffers 215, 216, 217 and 218 and the other opposite end at the output of said each of the tri-state buffers 215, 216, 217 and 218, (2) a N-type MOS transistor 232 configured to form a channel with an end at the first input of said each of the tri-state buffers 215, 216, 217 and 218 and the other opposite end at the output of said each of the tri-state buffers 215, 216, 217 and 218, and (3) an inverter 233 configured to invert its input, at the second input of said each of the tri-state buffers 215, 216, 217 and 218, coupling to a gate terminal of the N-type MOS transistor 232 into its output coupling to a gate terminal of the P-type MOS transistor 231. For each of the tri-state buffers 215, 216, 217 and 218, when its inverter 233 has its input at a logic level of "1", each of its P-type and N-type MOS transistors 231 and 232 may be switched on to pass its first input to its output via the channels of its P-type and N-type MOS transistors 231 and 232; when its inverter 233 has its input at a logic level of "0", each of its P-type and N-type MOS transistors 231 and 232 may be switched off not to form any channel therein such that its first input may not be passed to its output. For the two tri-state buffers 215 in each pair in the first stage, their two respective inverters 233 may have their two respective inputs coupling respectively to the output and input of the inverter 219, which are associated with the input A3 in the second set. For the two tri-state buffers 216 in each pair in the second stage, their two respective inverters 233 may have their two respective inputs coupling respectively to the output and input of the inverter 220, which are associated with the input A2 in the second set. For the two tri-state buffers 217 in each pair in the third stage, their two respective inverters 233 may have their two respective inputs coupling respectively to the output and input of the inverter 207, which are associated with the input A1 in the second set. For the two tri-state buffers 218 in the pair in the fourth stage, i.e., output stage, their two respective inverters 233 may have their two respective inputs coupling respectively to the output and input of the inverter 208, which are associated with the input A0 in the second set.

The first type of multiplexer (MUXER) 211 may select one from its first set of sixteen inputs D0-D15 into its output Dout based on a combination of its second set of four inputs A0-A3.

(2) Second Type of Multiplexer

Figure 12C:
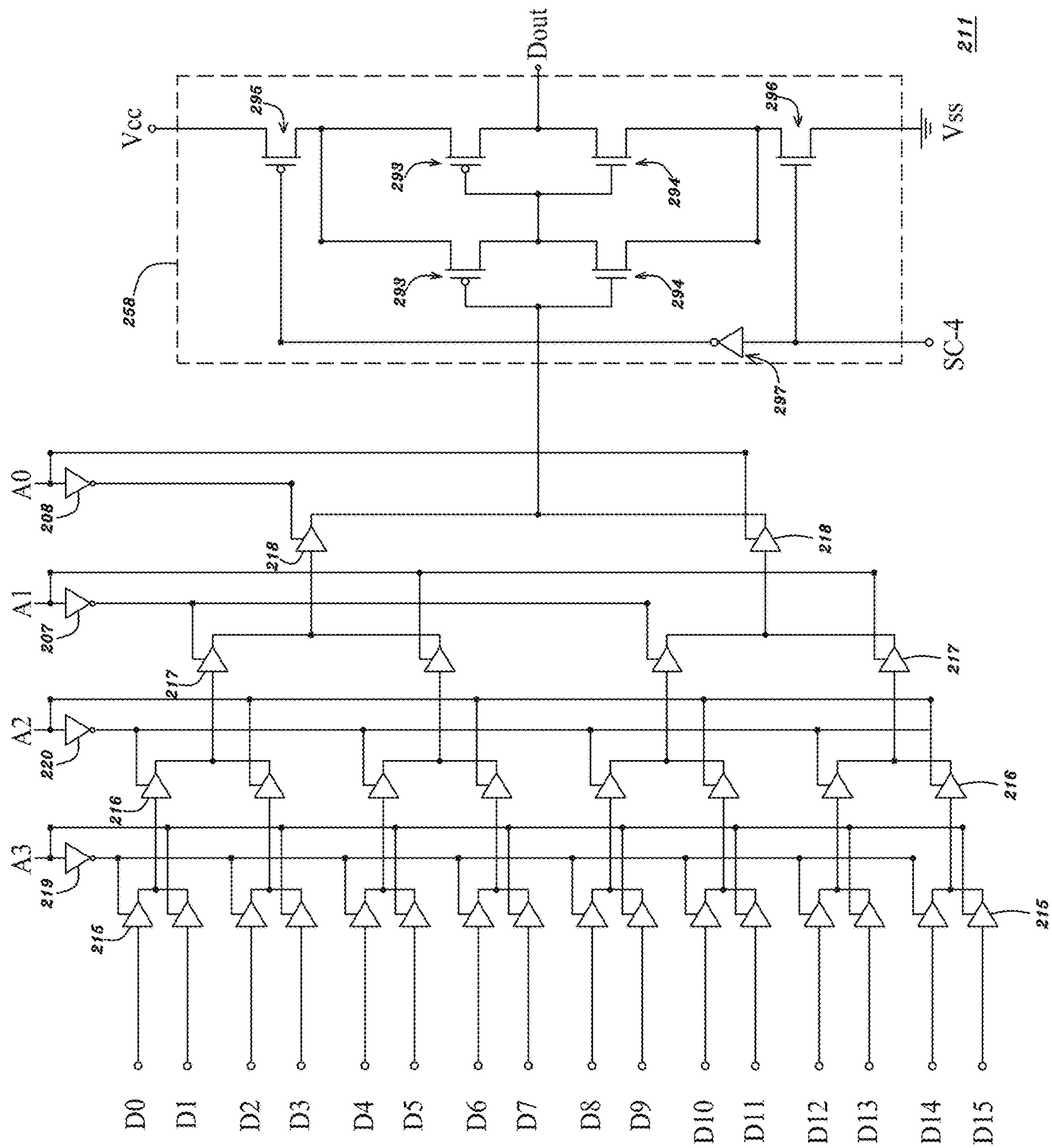

FIG. 12C is a circuit diagram of a second type of multiplexer in accordance with an embodiment of the present application. Referring to FIG. 12C, a second type of multiplexer 211 is similar to the first type of multiplexer 211 as illustrated in FIGS. 12A and 12B but may further include the third type of pass/no-pass switch or switch buffer 292 as seen in FIG. 10C having its input at the node N21 coupling to the output of the pair of tri-state buffers 218 in the last stage, e.g., in the fourth stage or output stage in this case. For an element indicated by the same reference number shown in FIGS. 10C, 12A, 12B and 12C, the specification of the element as seen in FIG. 12C may be referred to that of the element as illustrated in FIG. 10C, 12A or 12B. Accordingly, referring to FIG. 12C, the third type of pass/no-pass switch 292 may amplify its input at the node N21 into its output at the node N22 acting as an output Dout of the multiplexer 211 of the second type.

The second type of multiplexer (MUXER) 211 may select one from its first set of sixteen inputs D0-D15 into its output Dout based on a combination of its second set of four inputs A0-A3.

(3) Third Type of Multiplexer

Figure 12D:
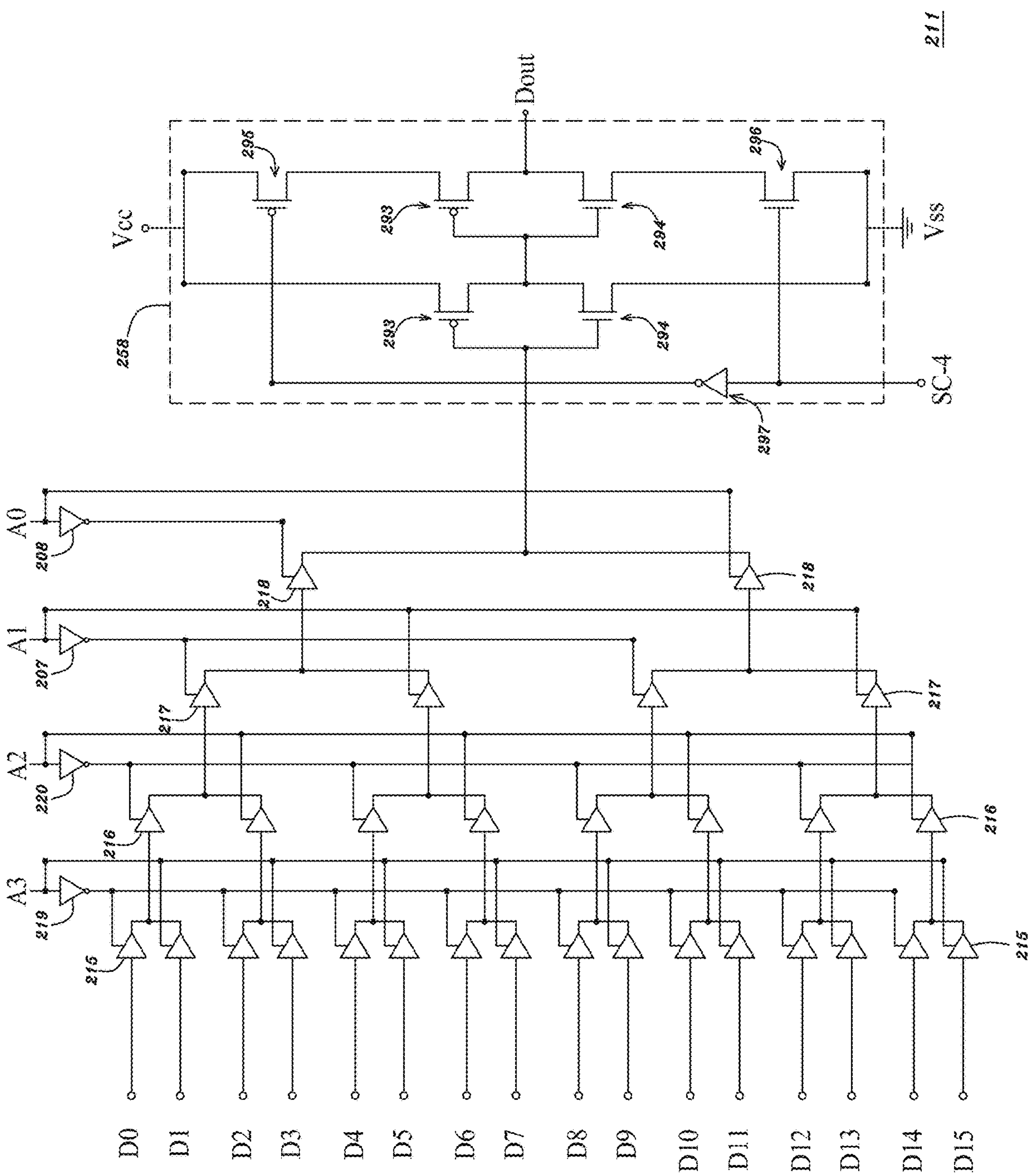

FIG. 12D is a circuit diagram of a third type of multiplexer in accordance with an embodiment of the present application. Referring to FIG. 12D, a third type of multiplexer 211 is similar to the first type of multiplexer 211 as illustrated in FIGS. 12A and 12B but may further include the fourth type of pass/no-pass switch 292 or switch buffer as seen in FIG. 10D having its input at the node N21 coupling to the output of the pair of tri-state buffers 218 in the last stage, e.g., in the fourth stage or output stage in this case. For an element indicated by the same reference number shown in FIGS. 10C, 10D, 12A, 12B, 12C and 12D, the specification of the element as seen in FIG. 12D may be referred to that of the element as illustrated in FIG. 10C, 10D, 12A, 12B or 12C. Accordingly, referring to FIG. 12D, the fourth type of pass/no-pass switch 292 may amplify its input at the node N21 into its output at the node N22 acting as an output Dout of the multiplexer 211 of the third type.

The third type of multiplexer (MUXER) 211 may select one from its first set of sixteen inputs D0-D15 into its output Dout based on a combination of its second set of four inputs A0-A3.

Figure 12E:
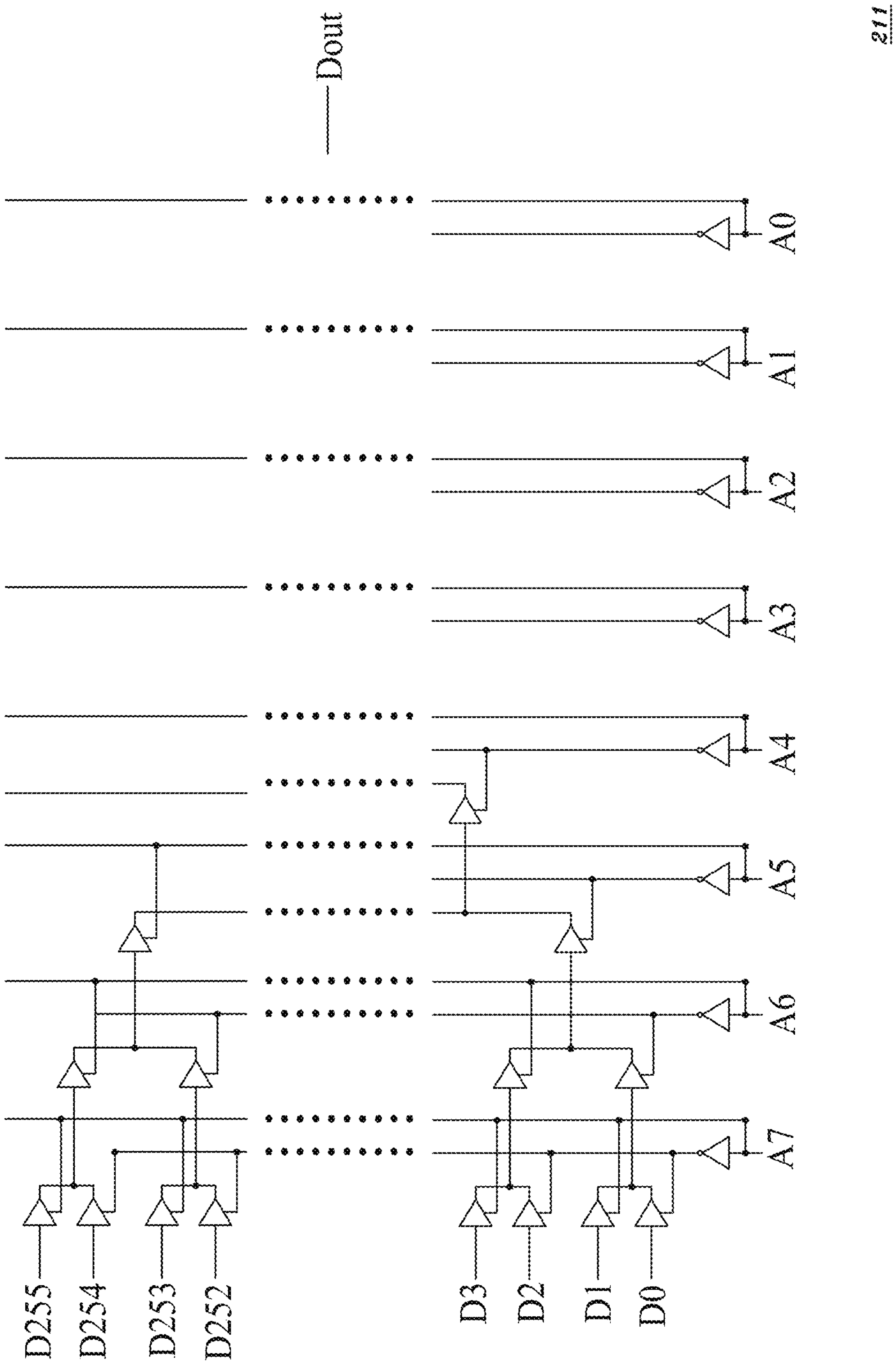

Alternatively, the first, second or third type of multiplexer (MUXER) 211 may have the first set of inputs, arranged in parallel, having the number of 2 to the power of n and the second set of inputs, arranged in parallel, having the number of n, wherein the number n may be any integer greater than or equal to 2, such as between 2 and 64. FIG. 12E is a schematic view showing a circuit diagram of a multiplexer in accordance with an embodiment of the present application. In this example, referring to FIG. 12E, each of the multiplexers 211 of the first through third types as illustrated in FIGS. 12A, 12C and 12D may be modified with its second set of inputs A0-A7, having the number of n equal to 8, and its first set of 256 inputs D0-D255, i.e. the resulting values or programming codes for all combinations of its second set of inputs A0-A7, having the number of 2 to the power of n equal to 8. Each of the multiplexers 211 of the first through third types may include eight stages of tri-state buffers or switch buffers, each having the same architecture as illustrated in FIG. 12B, coupling to one another stage by stage. The tri-state buffers or switch buffers in the first stage, arranged in parallel, may have the number of 256 each having its first input coupling to one of the 256 inputs D0-D255 of the first set of said each of the multiplexers 211 and each may be switched on or off to pass or not to pass its first input into its output in accordance with its second input associated with the input A7 of the second set of said each of the multiplexers 211. The tri-state buffers or switch buffers in each of the second through seventh stages, arranged in parallel, each may have its first input coupling to an output of one of multiple pairs of tri-state buffers or switch buffers in a stage previous to said each of the second through seventh stages and may be switched on or off to pass or not to pass its first input into its output in accordance with its second input associated with one of the respective inputs A6-A1 of the second set of said each of the multiplexers 211. Each of the tri-state buffers or switch buffers in a pair in the eighth stage, i.e., output stage, may have its first input coupling to an output of one of multiple pairs of tri-state buffers or switch buffers in the seventh stage and may be switched on or off to pass or not to pass its first input into its output, which may act as an output Dout of the multiplexer 211, in accordance with its second input associated with the input A0 of the second set of said each of the multiplexers 211. Alternatively, one of the pass/no-pass switches or switch buffers 292 as seen in FIGS. 12C and 12D may be incorporated to amplify its input coupling to the output of the tri-state buffers or switch buffers in the pair in the eighth stage, i.e., output stage, into its output Dout, which may act as an output of the multiplexer 211.

Figure 12F:
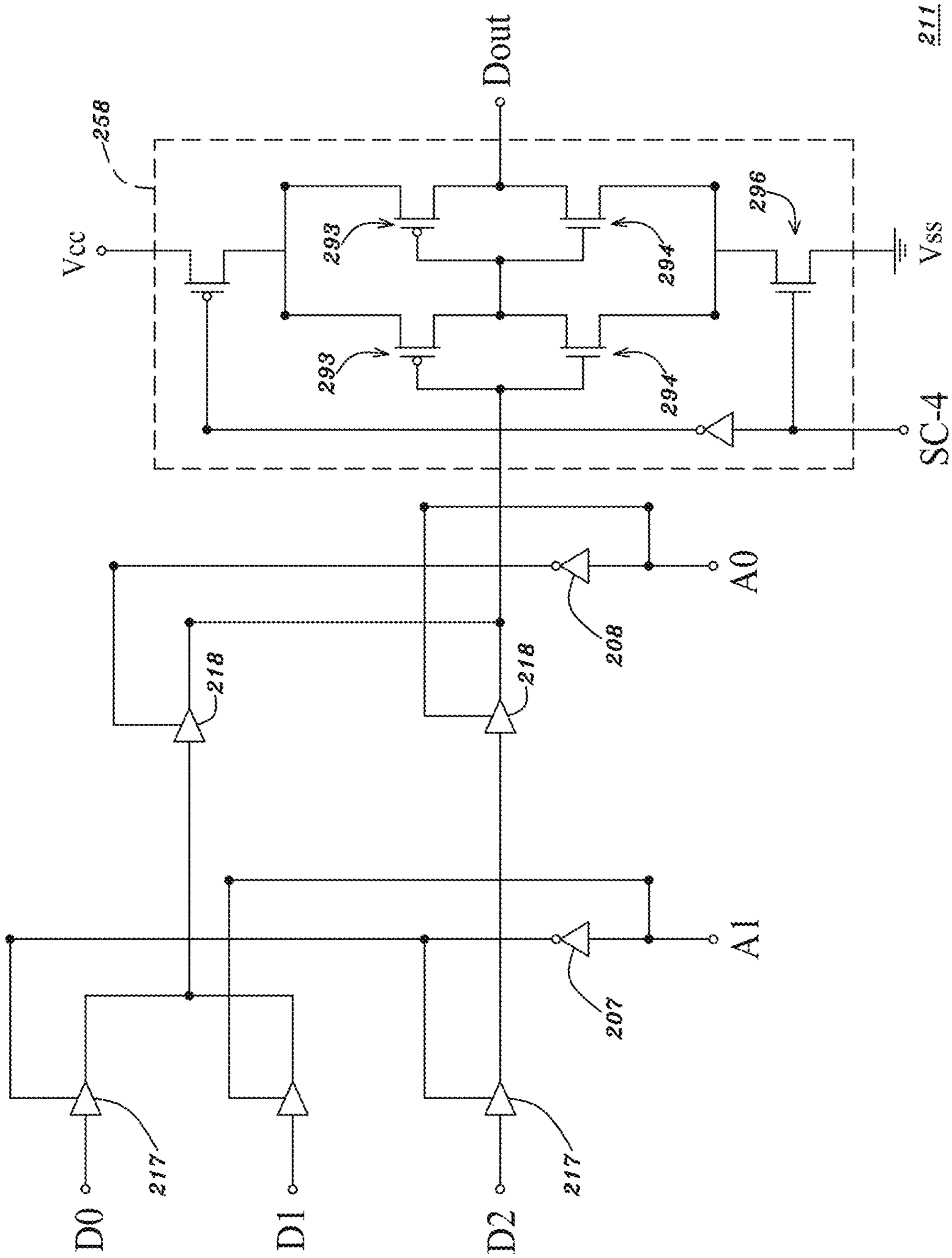

For example, FIG. 12F is a schematic view showing a circuit diagram of a multiplexer in accordance with an embodiment of the present application. Referring to FIG. 12F, the second type of multiplexer 211 may have the first set of inputs D0, D1 and D2 arranged in parallel and the second set of inputs A0 and A1 arranged in parallel. The second type of multiplexer 211 may include two stages of tri-state buffers 217 and 218 coupling to each other stage by stage. For more elaboration, the second type of multiplexer 211 may include third tri-state buffers 217 in the first stage, arranged in parallel, each having a first input coupling to one of the third inputs D0-D2 in the first set and a second input associated with the input A1 in the second set. Each of the three tri-state buffers 217 in the first stage may be switched on or off to pass or not to pass its first input into its output in accordance with its second input. The second type of multiplexer 211 may include the inverter 207 configured to invert its input coupling to the input A1 in the second set into its output. One of the top two tri-state buffers 217 in a pair in the first stage may be switched on in accordance with its second input coupling to one of the input and output of the inverter 207 to pass its first input into its output; the other one of the top two tri-state buffers 217 in the pair in the first stage may be switched off in accordance with its second input coupling to the other one of the input and output of the inverter 207 not to pass its first input into its output. The outputs of the top two tri-state buffers 217 in the pair in the first stage may couple to each other. Thereby, the pair of top two tri-state buffers 217 in the first stage may be switched in accordance with its two second inputs coupling to the input and output of the inverter 207 respectively to pass one of its two first inputs into its output coupling to a first input of one of the tri-state buffers 218 in the second stage. The bottom one of the tri-state buffers 217 in the first stage may be switched on or off in accordance with its second input coupling to the output of the inverter 207 to or not to pass its first input into its output coupling to a first input of the other one of the tri-state buffers 218 in the second stage, i.e., output stage.

Referring to FIG. 12F, the second type of multiplexer 211 may include a pair of two tri-state buffers 218 in the second stage or output stage, arranged in parallel, a top one of which has a first input coupling to the output of the pair of top two tri-state buffers 217 in the first stage and a second input associated with the input A0 in the second set, and a bottom one of which has a first input coupling to the output of the bottom one of the tri-state buffers 217 in the first stage and a second input associated with the input A0 in the second set. Each of the two tri-state buffers 218 in the pair in the second stage, i.e., output stage, may be switched on or off to pass or not to pass its first input into its output in accordance with its second input. The second type of multiplexer 211 may include the inverter 208 configured to invert its input coupling to the input A0 in the second set into its output. One of the two tri-state buffers 218 in the pair in the second stage, i.e., output stage, may be switched on in accordance with its second input coupling to one of the input and output of the inverter 208 to pass its first input into its output; the other one of the two tri-state buffers 218 in the pair in the second stage, i.e., output stage, may be switched off in accordance with its second input coupling to the other one of the input and output of the inverter 208 not to pass its first input into its output. The outputs of the two tri-state buffers 218 in the pair in the second stage, i.e., output stage, may couple to each other. Thereby, the pair of the two tri-state buffers 218 in the second stage, i.e., output stage, may be switched in accordance with its two second inputs coupling to the input and output of the inverter 208 respectively to pass one of its two first inputs into its output. The second type of multiplexer 211 may further include the third type of pass/no-pass switch 292 as seen in FIG. 10C having its input at the node N21 coupling to the output of the pair of tri-state buffers 218 in the second stage, i.e., output stage. The third type of pass/no-pass switch 292 may amplify its input at the node N21 into its output at the node N22 acting as an output Dout of the multiplexer 211 of the second type.

Figure 12G:
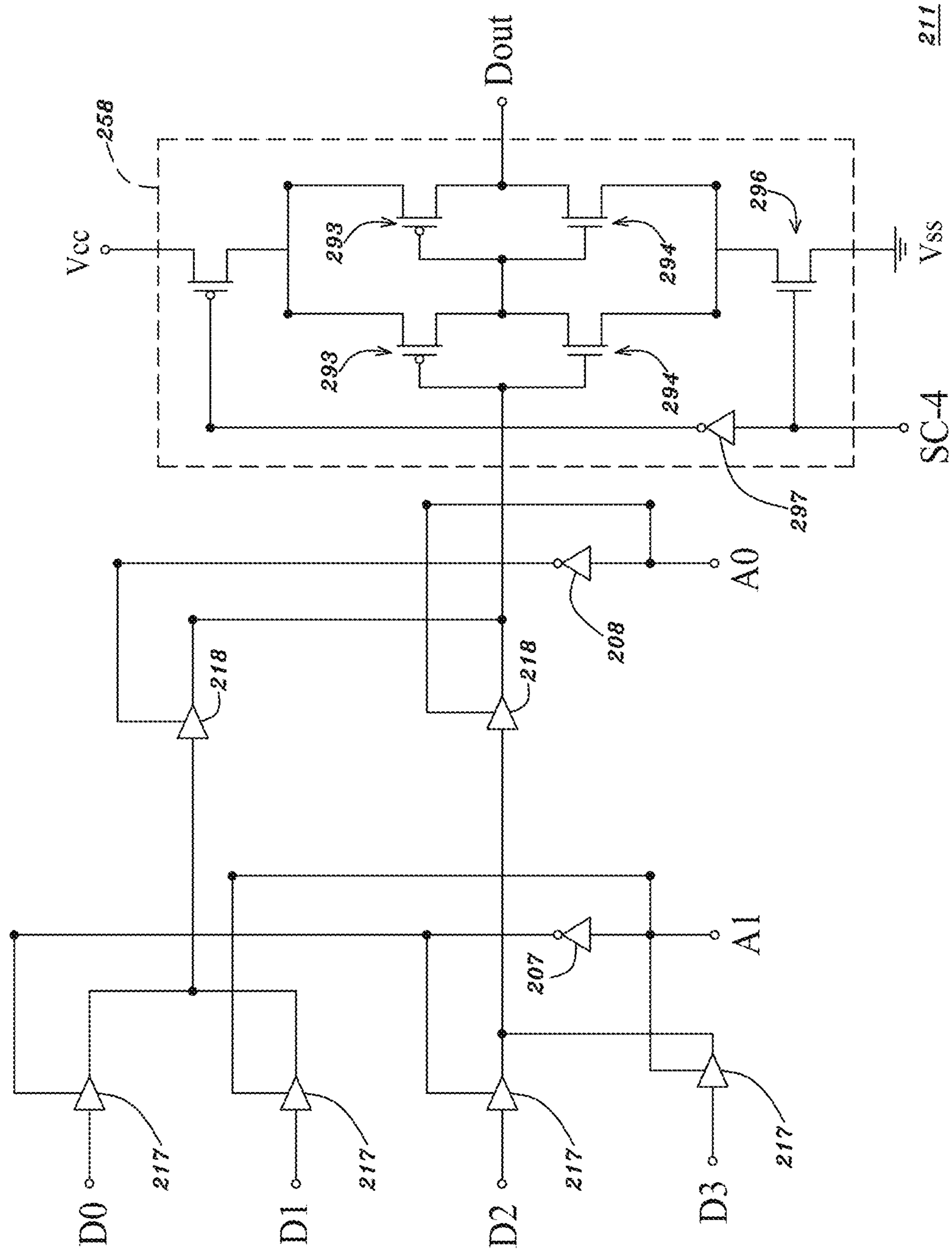

For example, FIG. 12G is a schematic view showing a circuit diagram of a multiplexer in accordance with an embodiment of the present application. Referring to FIG. 12G, the second type of multiplexer 211 may have the first set of inputs D0-D3 arranged in parallel and the second set of inputs A0 and A1 arranged in parallel. The second type of multiplexer 211 may include two stages of tri-state buffers 217 and 218 coupling to each other stage by stage. For more elaboration, the second type of multiplexer 211 may include third tri-state buffers 217 in the first stage, arranged in parallel, each having a first input coupling to one of the third inputs D0-D3 in the first set and a second input associated with the input A1 in the second set. Each of the four tri-state buffers 217 in the first stage may be switched on or off to pass or not to pass its first input into its output in accordance with its second input. The second type of multiplexer 211 may include the inverter 207 configured to invert its input coupling to the input A1 in the second set into its output. One of the top two tri-state buffers 217 in a pair in the first stage may be switched on in accordance with its second input coupling to one of the input and output of the inverter 207 to pass its first input into its output; the other one of the top two tri-state buffers 217 in the pair in the first stage may be switched off in accordance with its second input coupling to the other one of the input and output of the inverter 207 not to pass its first input into its output. The outputs of the top two tri-state buffers 217 in the pair in the first stage may couple to each other. Thereby, the pair of top two tri-state buffers 217 in the first stage may be switched in accordance with its two second inputs coupling to the input and output of the inverter 207 respectively to pass one of its two first inputs into its output coupling to a first input of one of the tri-state buffers 218 in the second stage, i.e., output stage. One of the bottom two tri-state buffers 217 in a pair in the first stage may be switched on in accordance with its second input coupling to one of the input and output of the inverter 207 to pass its first input into its output; the other one of the bottom two tri-state buffers 217 in the pair in the first stage may be switched off in accordance with its second input coupling to the other one of the input and output of the inverter 207 not to pass its first input into its output. The outputs of the bottom two tri-state buffers 217 in the pair in the first stage may couple to each other. Thereby, the pair of bottom two tri-state buffers 217 in the first stage may be switched in accordance with its two second inputs coupling to the input and output of the inverter 207 respectively to pass one of its two first inputs into its output coupling to a first input of the other one of the tri-state buffers 218 in the second stage, i.e., output stage.

Referring to FIG. 12G, the second type of multiplexer 211 may include a pair of two tri-state buffers 218 in the second stage or output stage, arranged in parallel, a top one of which has a first input coupling to the output of the pair of top two tri-state buffers 217 in the first stage and a second input associated with the input A0 in the second set, and a bottom one of which has a first input coupling to the output of the pair of bottom two tri-state buffers 217 in the first stage and a second input associated with the input A0 in the second set. Each of the two tri-state buffers 218 in the pair in the second stage, i.e., output stage, may be switched on or off to pass or not to pass its first input into its output in accordance with its second input. The second type of multiplexer 211 may include the inverter 208 configured to invert its input coupling to the input A0 in the second set into its output. One of the two tri-state buffers 218 in the pair in the second stage, i.e., output stage, may be switched on in accordance with its second input coupling to one of the input and output of the inverter 208 to pass its first input into its output; the other one of the two tri-state buffers 218 in the pair in the second stage, i.e., output stage, may be switched off in accordance with its second input coupling to the other one of the input and output of the inverter 208 not to pass its first input into its output. The outputs of the two tri-state buffers 218 in the pair in the second stage, i.e., output stage, may couple to each other. Thereby, the pair of the two tri-state buffers 218 in the second stage, i.e., output stage, may be switched in accordance with its two second inputs coupling to the input and output of the inverter 208 respectively to pass one of its two first inputs into its output. The second type of multiplexer 211 may further include the third type of pass/no-pass switch 292 as seen in FIG. 10C having its input at the node N21 coupling to the output of the pair of tri-state buffers 218 in the second stage, i.e., output stage. The third type of pass/no-pass switch 292 may amplify its input at the node N21 into its output at the node N22 acting as an output Dout of the multiplexer 211 of the second type.

Figure 12H:
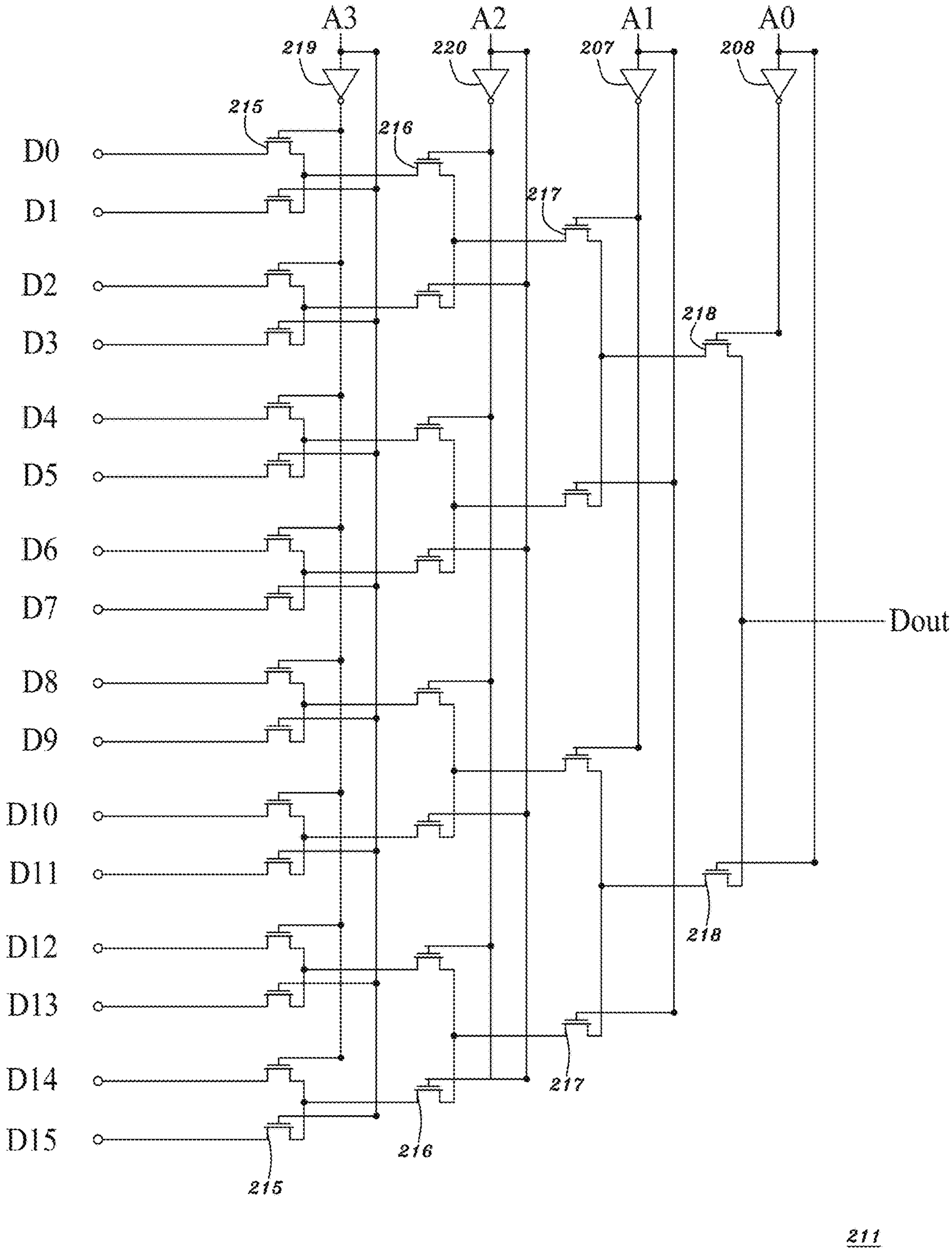
Figure 12I:
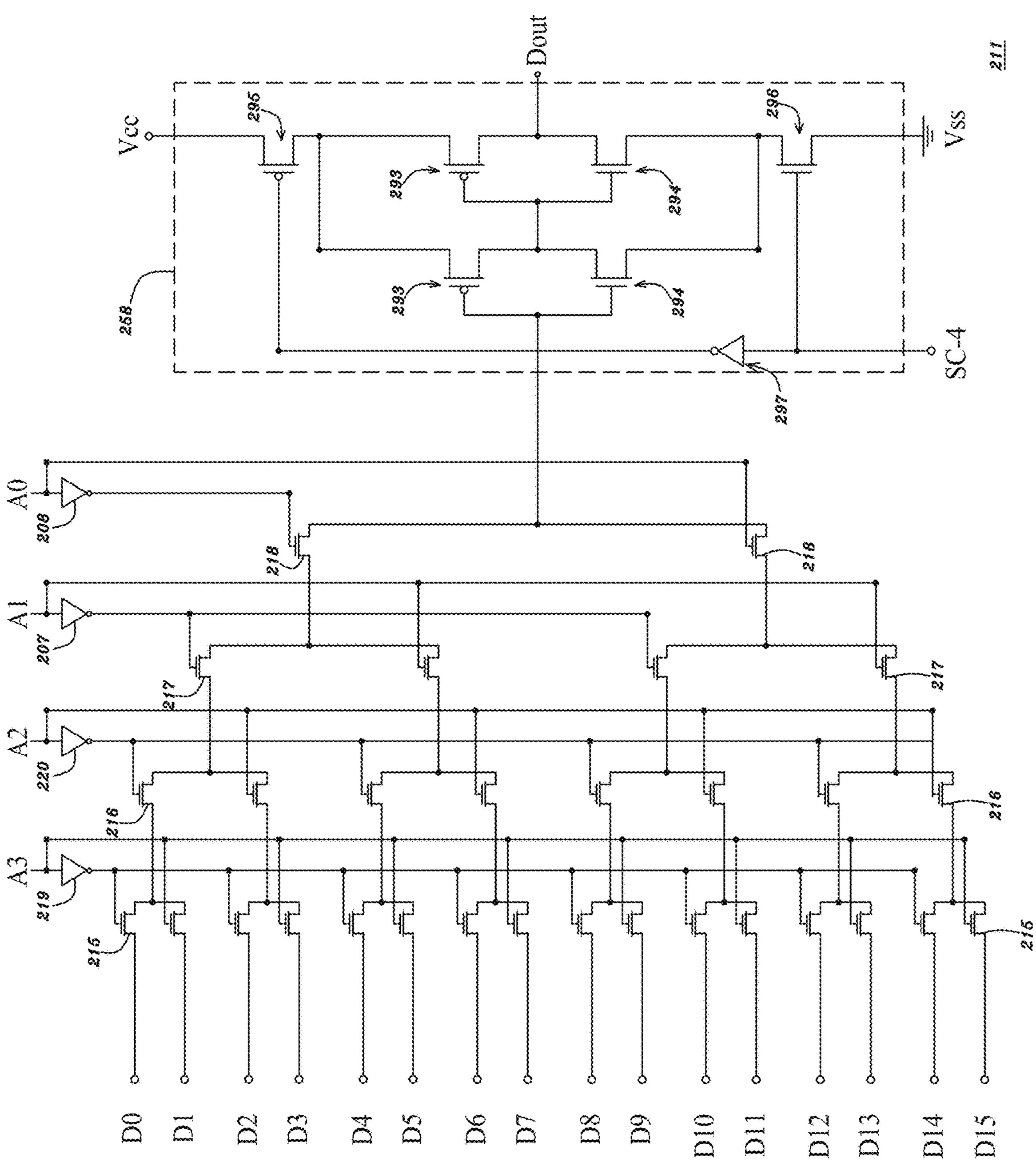
Figure 12J:
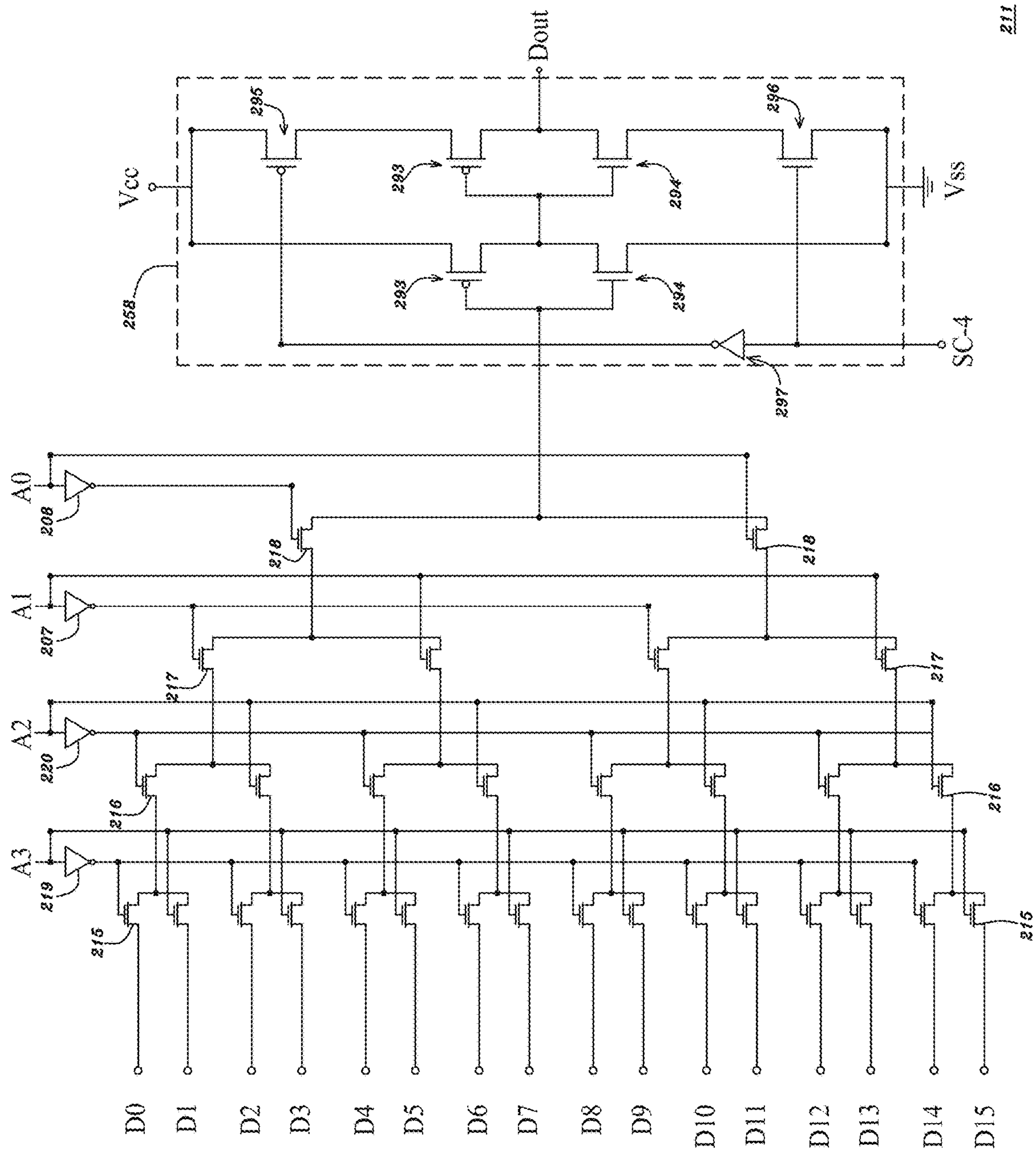
Figure 12K:
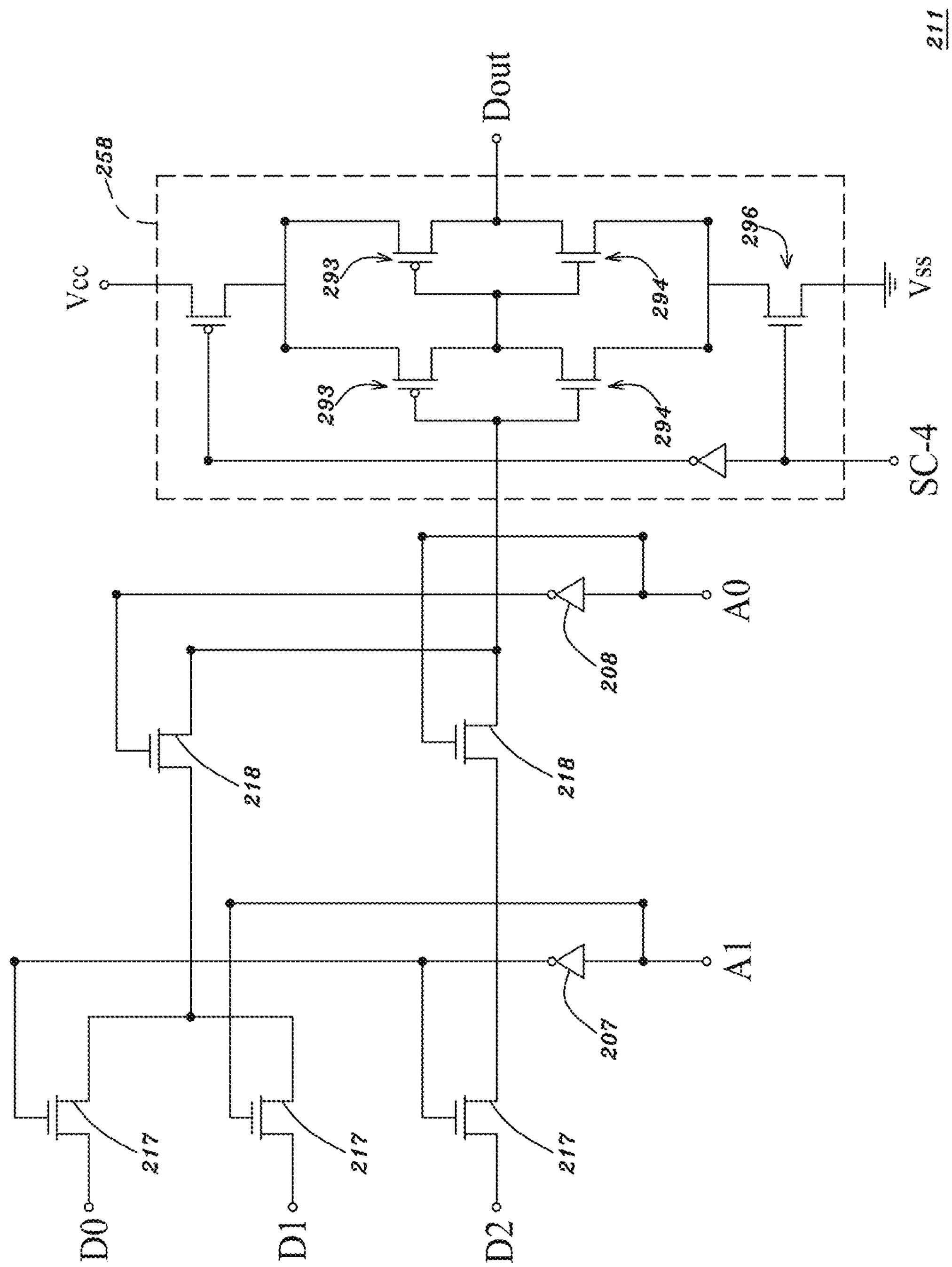
Figure 12L:
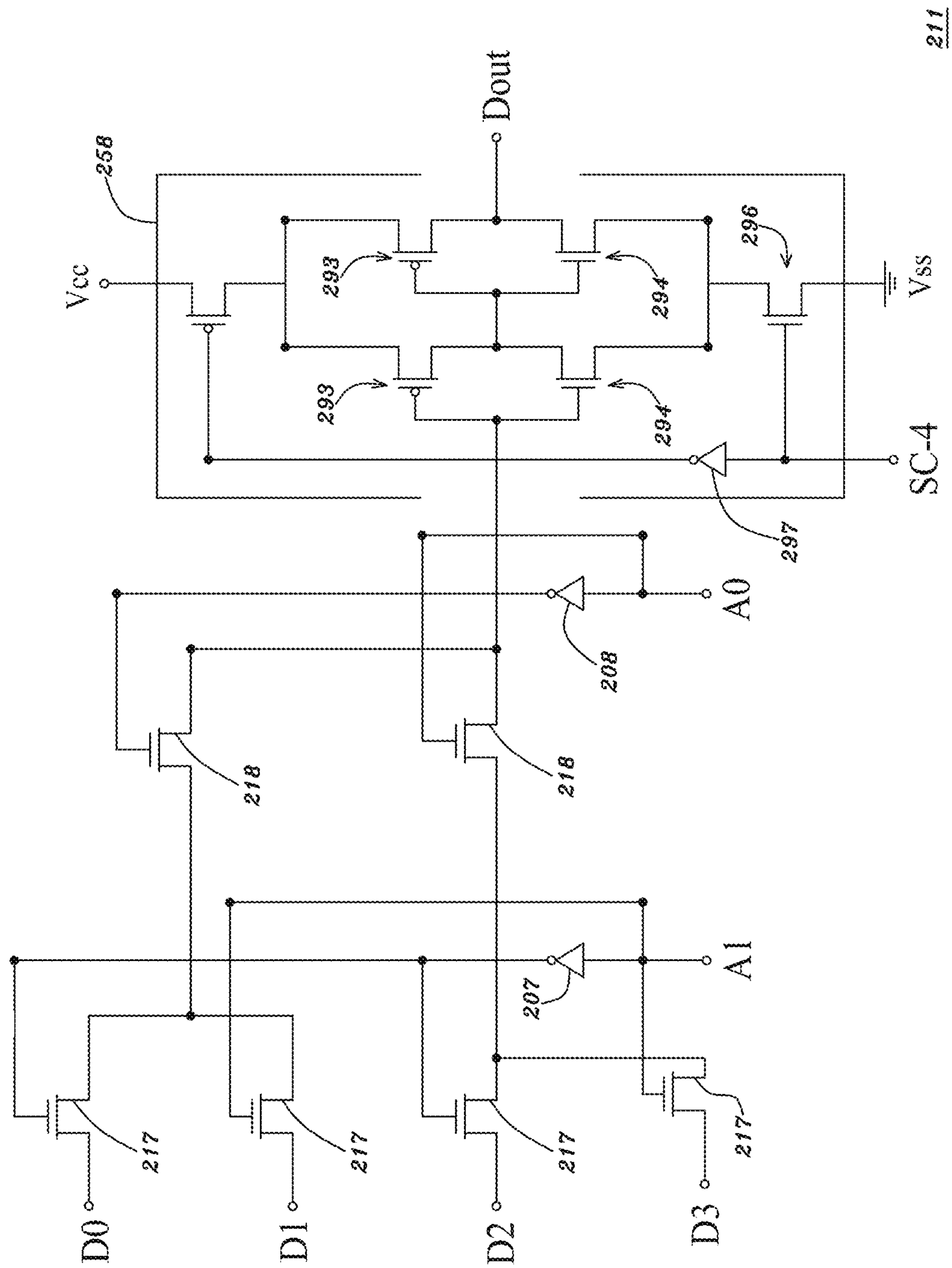

Alternatively, referring to FIGS. 12A-12G, each of the tri-state buffers 215, 216, 217 and 218 may be replaced with a transistor, such as N-type MOS transistor or P-type MOS transistor, as seen in FIGS. 12H-12L. FIGS. 12H-12L are schematic views showing circuit diagrams of multiplexers in accordance with an embodiment of the present application. For more elaboration, the first type of multiplexer 211 as seen in FIG. 12H is similar to that as seen in FIG. 12A, but the difference therebetween is that each of the tri-state buffers 215, 216, 217 and 218 is replaced with a transistor, such as N-type MOS transistor or P-type MOS transistor. The second type of multiplexer 211 as seen in FIG. 12I is similar to that as seen in FIG. 12C, but the difference therebetween is that each of the tri-state buffers 215, 216, 217 and 218 is replaced with a transistor, such as N-type MOS transistor or P-type MOS transistor. The third type of multiplexer 211 as seen in FIG. 12J is similar to that as seen in FIG. 12D, but the difference therebetween is that each of the tri-state buffers 215, 216, 217 and 218 is replaced with a transistor, such as N-type MOS transistor or P-type MOS transistor. The second type of multiplexer 211 as seen in FIG. 12K is similar to that as seen in FIG. 12F, but the difference therebetween is that each of the tri-state buffers 217 and 218 is replaced with a transistor, such as N-type MOS transistor or P-type MOS transistor. The second type of multiplexer 211 as seen in FIG. 12L is similar to that as seen in FIG. 12G, but the difference therebetween is that each of the tri-state buffers 217 and 218 is replaced with a transistor, such as N-type MOS transistor or P-type MOS transistor.

Referring to FIGS. 12H-12L, each of the transistors 215 may be configured to form a channel with an input terminal coupling to what the first input of replaced one of the tri-state buffers 215 seen in FIGS. 12A-12G couples, and an output terminal coupling to what the output of the replaced one of the tri-state buffers 215 seen in FIGS. 12A-12G couples, and may have a gate terminal coupling to what the second input of the replaced one of the tri-state buffers 215 seen in FIGS. 12A-12G couples. Each of the transistors 216 may be configured to form a channel with an input terminal coupling to what the first input of replaced one of the tri-state buffers 216 seen in FIGS. 12A-12G couples, and an output terminal coupling to what the output of the replaced one of the tri-state buffers 216 seen in FIGS. 12A-12G couples, and may have a gate terminal coupling to what the second input of the replaced one of the tri-state buffers 216 seen in FIGS. 12A-12G couples. Each of the transistors 217 may be configured to form a channel with an input terminal coupling to what the first input of replaced one of the tri-state buffers 217 seen in FIGS. 12A-12G couples, and an output terminal coupling to what the output of the replaced one of the tri-state buffers 217 seen in FIGS. 12A-12G couples, and may have a gate terminal coupling to what the second input of the replaced one of the tri-state buffers 217 seen in FIGS. 12A-12G couples. Each of the transistors 218 may be configured to form a channel with an input terminal coupling to what the first input of replaced one of the tri-state buffers 218 seen in FIGS. 12A-12G couples, and an output terminal coupling to what the output of the replaced one of the tri-state buffers 218 seen in FIGS. 12A-12G couples, and may have a gate terminal coupling to what the second input of the replaced one of the tri-state buffers 218 seen in FIGS. 12A-12G couples.

Specification for Cross-Point Switches Constructed from Multiplexers

The first and second types of cross-point switches 379 as illustrated in FIGS. 11A and 11B are fabricated from a plurality of the pass/no-pass switches 258 seen in FIGS. 10A-10F. Alternatively, cross-point switches 379 may be fabricated from either of the first through third types of multiplexers 211, mentioned as below.

(1) Third Type of Cross-Point Switch

Figure 11D:
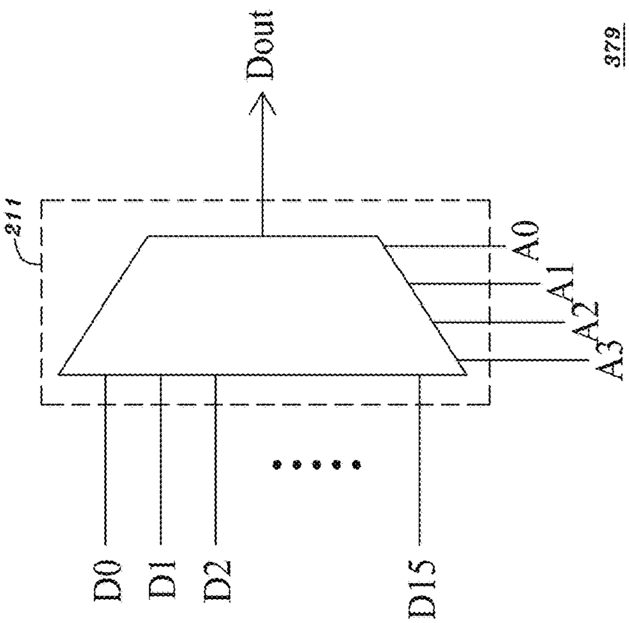
Figure 11C:
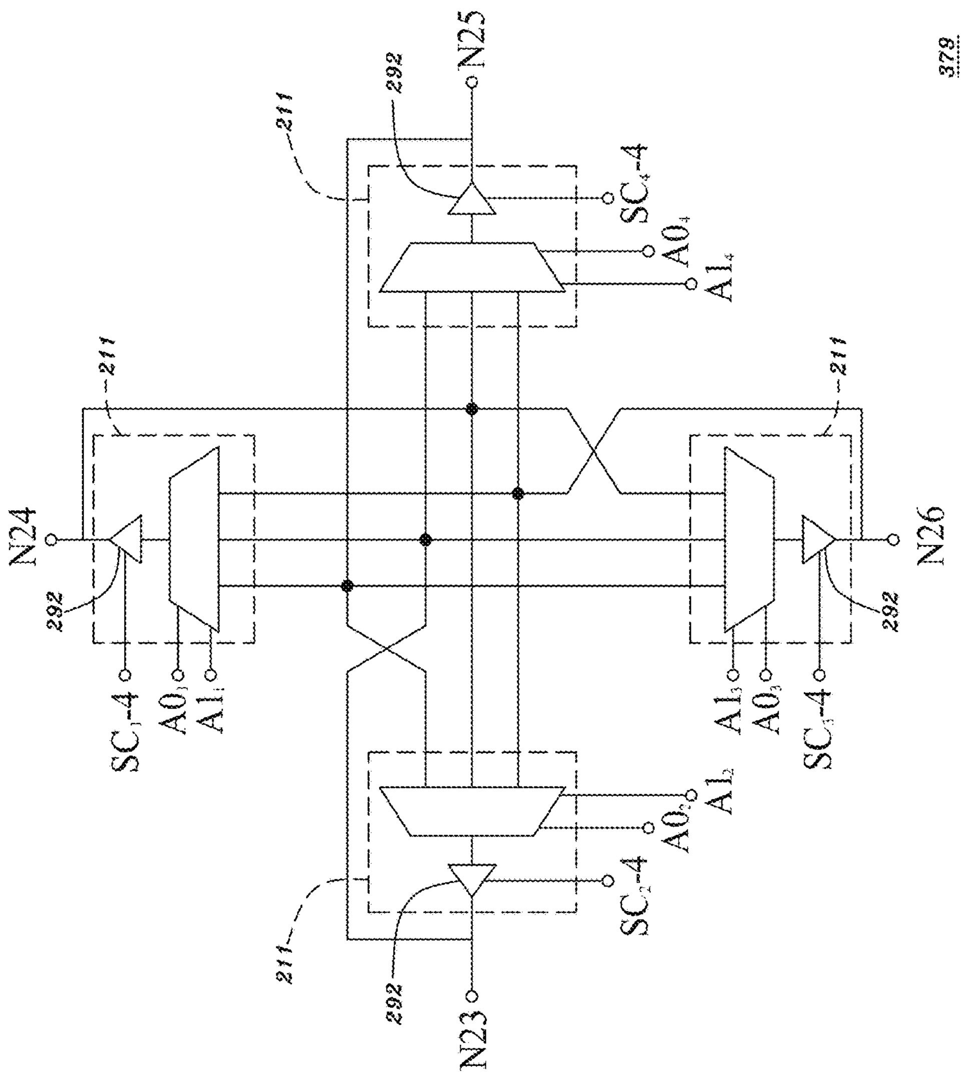

FIG. 11C is a circuit diagram illustrating a third type of cross-point switch composed of multiple multiplexers in accordance with an embodiment of the present application. Referring to FIG. 11C, the third type of cross-point switch 379 may include four multiplexers 211 of the first, second or third type as seen in FIGS. 12A-12L each having three inputs in the first set and two inputs in the second set and being configured to pass one of its three inputs in the first set into its output in accordance with a combination of its two inputs in the second set. Particularly, the second type of the multiplexer 211 employed in the third type of cross-point switch 379 may be referred to that illustrated in FIGS. 12F and 12K. Each of the three inputs D0-D2 of the first set of one of the four multiplexers 211 may couple to one of its three inputs D0-D2 of the first set of another two of the four multiplexers 211 and to an output Dout of the other one of the four multiplexers 211. Thereby, each of the four multiplexers 211 may pass one of its three inputs D0-D2 in the first set coupling to three respective metal lines extending in three different directions to the three outputs Dout of the other three of the four multiplexers 211 into its output Dout in accordance with a combination of its two inputs A0 and A1 in the second set. Each of the four multiplexers 211 may include the pass/no-pass switch or switch buffer 292 configured to be switched on or off in accordance with its input SC-4 to pass or not to pass one of its three inputs D0-D2 in the first set, passed in accordance with the second set of its inputs A0 and A1, into its output Dout. For example, the top one of the four multiplexers 211 may pass one of its three inputs in the first set coupling to the three outputs Dout at nodes N23, N26 and N25 of the left, bottom and right ones of the four multiplexers 211 into its output Dout at a node N24 in accordance with a combination of its two inputs A$0_1$ and A$1_1$ in the second set. The top one of the four multiplexers 211 may include the pass/no-pass switch or switch buffer 292 configured to be switched on or off in accordance with the second set of its input $SC_1$-4 to pass or not to pass one of its three inputs in the first set, passed in accordance with the second set of its inputs A$0_1$ and A$1_1$, into its output Dout at the node N24.

(2) Fourth Type of Cross-Point Switch

FIG. 1/D is a circuit diagram illustrating a fourth type of cross-point switch composed of a multiplexer in accordance with an embodiment of the present application. Referring to FIG. 1/D, the fourth type of cross-point switch 379 may be provided from any of the multiplexers 211 of the first through third types as illustrated in FIGS. 12A-12L. When the fourth type of cross-point switch 379 is provided by one of the multiplexers 211 as illustrated in FIGS. 12A, 12C, 12D and 12H-12J, it is configured to pass one of its 16 inputs D0-D15 in the first set into its output Dout in accordance with a combination of its four inputs A0-A3 in the second set.

Specification for Large I/O Circuits

Figure 13A:
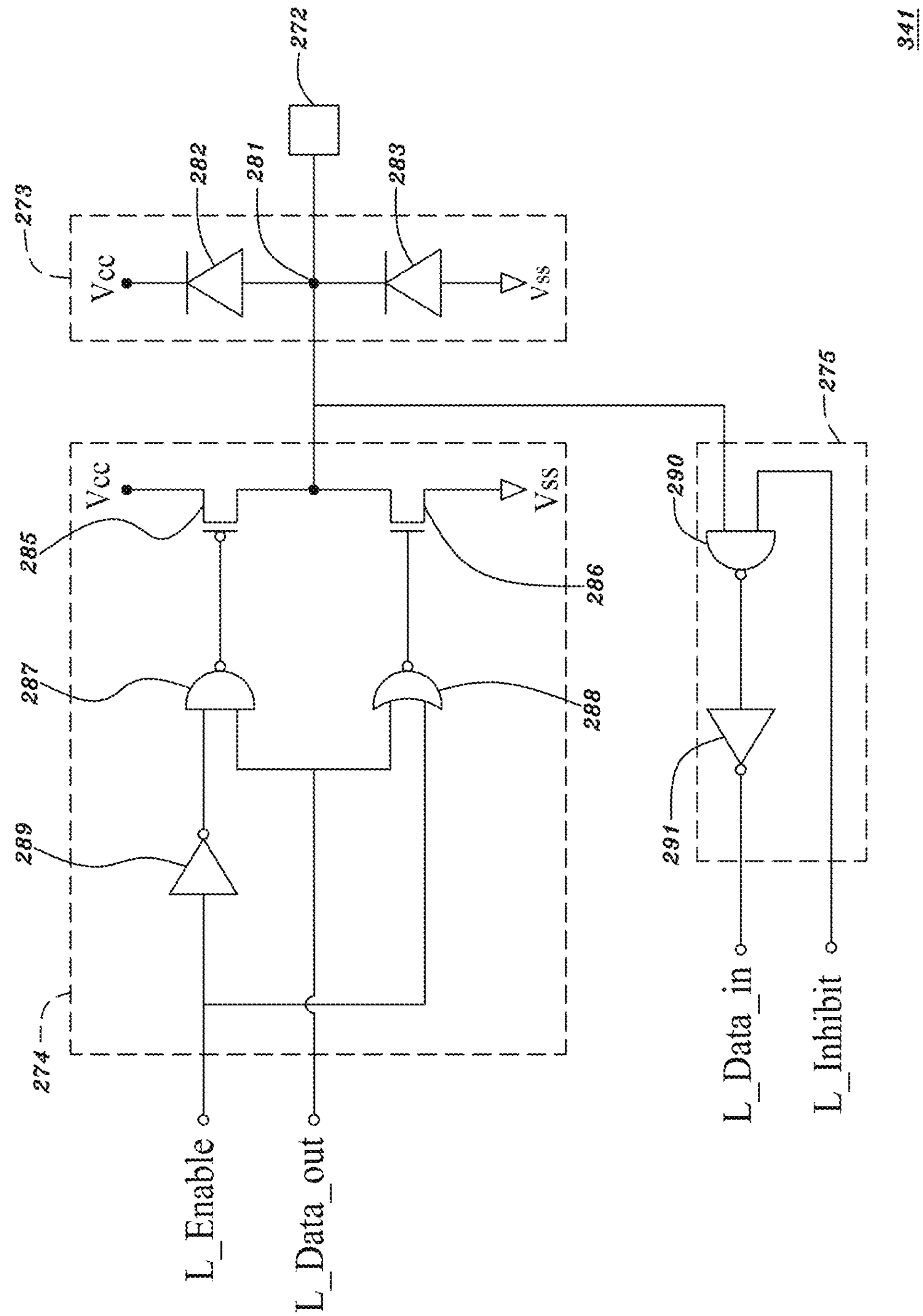
FIG. 13A is a circuit diagram of a large I/O circuit in accordance with an embodiment of the present application.

FIG. 13A is a circuit diagram of a large I/O circuit in accordance with an embodiment of the present application. Referring to FIG. 13A, a semiconductor chip may include multiple I/O pads 272 each coupling to its large ESD protection circuit or device 273, its large driver 274 and its large receiver 275. The large driver 274, large receiver 275 and large ESD protection circuit or device 273 may compose a large I/O circuit 341. The large ESD protection circuit or device 273 may include a diode 282 having a cathode coupling to the voltage Vcc of power supply and an anode coupling to a node 281 and a diode 283 having a cathode coupling to the node 281 and an anode coupling to the voltage Vss of ground reference. The node 281 couples to one of the I/O pads 272.

Referring to FIG. 13A, the large driver 274 may have a first input coupling to an L_Enable signal for enabling the large driver 274 and a second input coupling to data of L_Data_out for amplifying or driving the data of L_Data_out into its output at the node 281 to be transmitted to circuits outside the semiconductor chip through said one of the I/O pads 272. The large driver 274 may include a P-type MOS transistor 285 and N-type MOS transistor 286 both having respective drain terminals coupling to each other as its output at the node 281 and respective source terminals coupling to the voltage Vcc of power supply and to the voltage Vss of ground reference. The large driver 274 may have a NAND gate 287 having an output coupling to a gate terminal of the P-type MOS transistor 285 and a NOR gate 288 having an output coupling to a gate terminal of the N-type MOS transistor 286. The large driver 274 may include the NAND gate 287 having a first input coupling to an output of its inverter 289 and a second input coupling to the data of L_Data_out to perform a NAND operation on its first and second inputs into its output coupling to a gate terminal of its P-type MOS transistor 285. The large driver 274 may include the NOR gate 288 having a first input coupling to the data of L_Data_out and a second input coupling to the L_Enable signal to perform a NOR operation on its first and second inputs into its output coupling to a gate terminal of the N-type MOS transistor 286. The inverter 289 may be configured to invert its input coupling to the L_Enable signal into its output coupling to the first input of the NAND gate 287.

Referring to FIG. 13A, when the L_Enable signal is at a logic level of "1", the output of the NAND gate 287 is always at a logic level of "1" to turn off the P-type MOS transistor 285 and the output of the NOR gate 288 is always at a logic level of "0" to turn off the N-type MOS transistor 286. Thereby, the large driver 274 may be disabled by the L_Enable signal and the data of L_Data_out may not be passed to the output of the large driver 274 at the node 281.

Referring to FIG. 13A, the large driver 274 may be enabled when the L_Enable signal is at a logic level of "0". Meanwhile, if the data of L_Data_out is at a logic level of "0", the outputs of the NAND and NOR gates 287 and 288 are at logic level of "1" to turn off the P-type MOS transistor 285 and on the N-type MOS transistor 286, and thereby the output of the large driver 274 at the node 281 is at a logic level of "0" to be passed to said one of the I/O pads 272. If the data of L_Data_out is at a logic level of "1", the outputs of the NAND and NOR gates 287 and 288 are at logic level of "0" to turn on the P-type MOS transistor 285 and off the N-type MOS transistor 286, and thereby the output of the large driver 274 at the node 281 is at a logic level of "1" to be passed to said one of the I/O pads 272. Accordingly, the large driver 274 may be enabled by the L_Enable signal to amplify or drive the data of L_Data_out into its output at the node 281 coupling to one of the I/O pads 272.

Referring to FIG. 13A, the large receiver 275 may have a first input coupling to said one of the I/O pads 272 to be amplified or driven by the large receiver 275 into its output of L_Data_in and a second input coupling to an L_Inhibit signal to inhibit the large receiver 275 from generating its output of L_Data_in associated with data at its first input. The large receiver 275 may include a NAND gate 290 having a first input coupling to said one of the I/O pads 272 and a second input coupling to the L_Inhibit signal to perform a NAND operation on its first and second inputs into its output coupling to its inverter 291. The inverter 291 may be configured to invert its input coupling to the output of the NAND gate 290 into its output acting as the output of L_Data_in of the large receiver 275.

Referring to FIG. 13A, when the L_Inhibit signal is at a logic level of "0", the output of the NAND gate 290 is always at a logic level of "1" and the output L_Data_in of the large receiver 275 is always at a logic level of "0". Thereby, the large receiver 275 is inhibited from generating its output of L_Data_in associated with its first input at said one of the I/O pads 272.

Referring to FIG. 13A, the large receiver 275 may be activated when the L_Inhibit signal is at a logic level of "1". Meanwhile, if data from circuits outside the chip to said one of the I/O pads 272 is at a logic level of "1", the NAND gate 290 has its output at a logic level of "0", and thereby the large receiver 275 may have its output of L_Data_in at a logic level of "1". If data from circuits outside the chip to said one of the I/O pads 272 is at a logic level of "0", the NAND gate 290 has its output at a logic level of "1", and thereby the large receiver 275 may have its output of L_Data_in at a logic level of "0". Accordingly, the large receiver 275 may be activated by the L_Inhibit signal to amplify or drive data from circuits outside the chip to said one of the I/O pads 272 into its output of L_Data_in.

Referring to FIG. 13A, said one of the I/O pads 272 may have an input capacitance, provided by the large ESD protection circuit or device 273 and large receiver 275 for example, between 3 pF and 100 pF, 3 pF and 30 pF, 3 pF and 15 pF, or 3 pF and 10 pF. The large driver 274 may have an output capacitance or driving capability or loading, for example, between 3 pF and 100 pF, 3 pF and 30 pF, 3 pF and 15 pF, or 3 pF and 10 pF. The size of the large ESD protection circuit or device 273 may be between 0.5 pF and 15 pF, 0.5 pF and 10 pF or 0.5 pF and 5 pF.

Specification for Small I/O Circuits

Figure 13B:
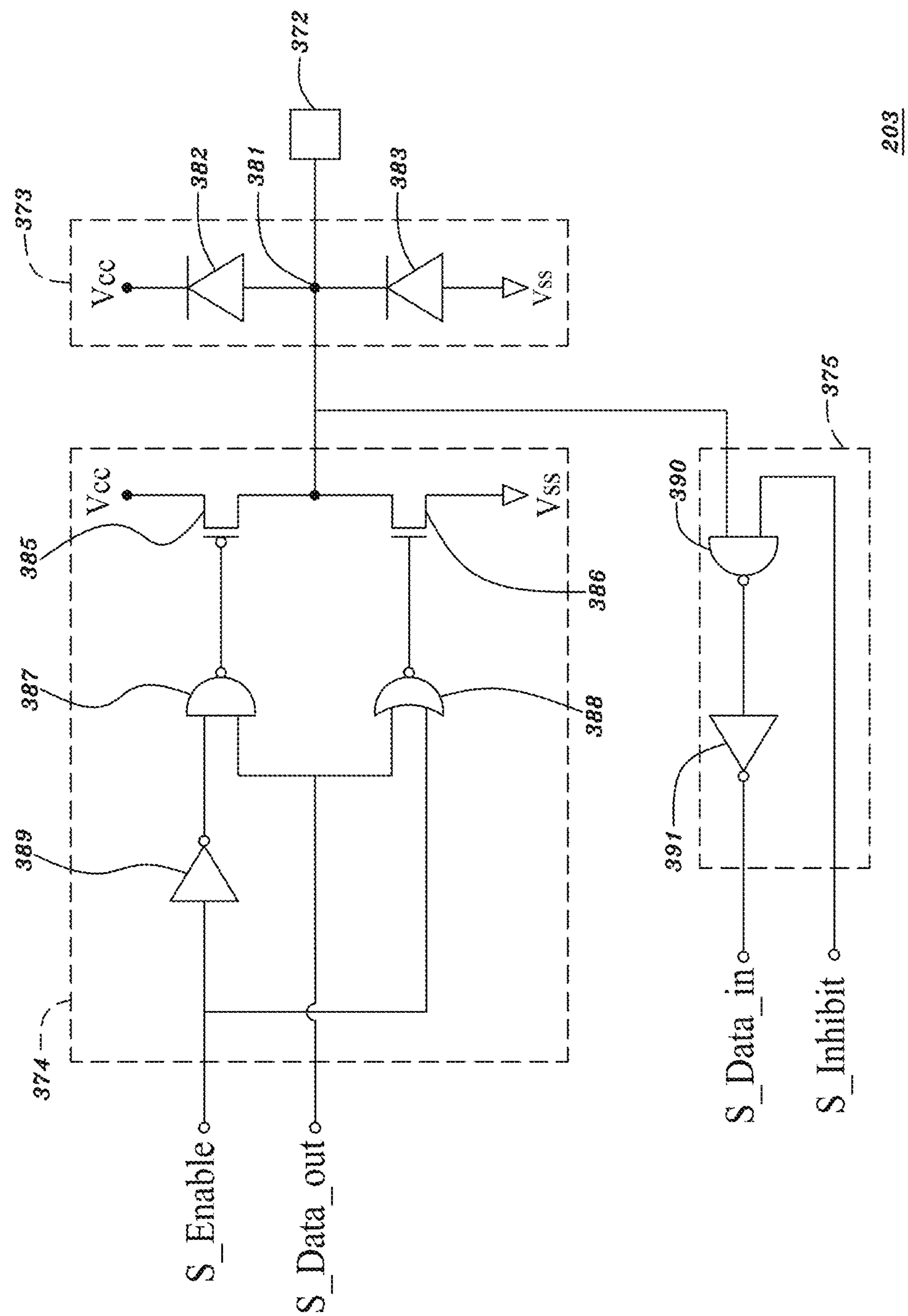
FIG. 13B is a circuit diagram of a small I/O circuit in accordance with an embodiment of the present application.

FIG. 13B is a circuit diagram of a small I/O circuit in accordance with an embodiment of the present application. Referring to FIG. 13B, a semiconductor chip may include multiple I/O pads 372 each coupling to its small ESD protection circuit or device 373, its small driver 374 and its small receiver 375. The small driver 374, small receiver 375 and small ESD protection circuit or device 373 may compose a small I/O circuit 203. The small ESD protection circuit or device 373 may include a diode 382 having a cathode coupling to the voltage Vcc of power supply and an anode coupling to a node 381 and a diode 383 having a cathode coupling to the node 381 and an anode coupling to the voltage Vss of ground reference. The node 381 couples to one of the I/O pads 372.

Referring to FIG. 13B, the small driver 374 may have a first input coupling to an S_Enable signal for enabling the small driver 374 and a second input coupling to data of S_Data_out for amplifying or driving the data of S_Data_out into its output at the node 381 to be transmitted to circuits outside the semiconductor chip through said one of the I/O pads 372. The small driver 374 may include a P-type MOS transistor 385 and N-type MOS transistor 386 both having respective drain terminals coupling to each other as its output at the node 381 and respective source terminals coupling to the voltage Vcc of power supply and to the voltage Vss of ground reference. The small driver 374 may have a NAND gate 387 having an output coupling to a gate terminal of the P-type MOS transistor 385 and a NOR gate 388 having an output coupling to a gate terminal of the N-type MOS transistor 386. The small driver 374 may include the NAND gate 387 having a first input coupling to an output of its inverter 389 and a second input coupling to the data of S_Data_out to perform a NAND operation on its first and second inputs into its output coupling to a gate terminal of its P-type MOS transistor 385. The small driver 374 may include the NOR gate 388 having a first input coupling to the data of S_Data_out and a second input coupling to the S_Enable signal to perform a NOR operation on its first and second inputs into its output coupling to a gate terminal of the N-type MOS transistor 386. The inverter 389 may be configured to invert its input coupling to the S_Enable signal into its output coupling to the first input of the NAND gate 387.

Referring to FIG. 13B, when the S_Enable signal is at a logic level of "1", the output of the NAND gate 387 is always at a logic level of "1" to turn off the P-type MOS transistor 385 and the output of the NOR gate 388 is always at a logic level of "0" to turn off the N-type MOS transistor 386. Thereby, the small driver 374 may be disabled by the S_Enable signal and the data of S_Data_out may not be passed to the output of the small driver 374 at the node 381.

Referring to FIG. 13B, the small driver 374 may be enabled when the S_Enable signal is at a logic level of "0". Meanwhile, if the data of S_Data_out is at a logic level of "0", the outputs of the NAND and NOR gates 387 and 388 are at logic level of "1" to turn off the P-type MOS transistor 385 and on the N-type MOS transistor 386, and thereby the output of the small driver 374 at the node 381 is at a logic level of "0" to be passed to said one of the I/O pads 372. If the data of S_Data_out is at a logic level of "1", the outputs of the NAND and NOR gates 387 and 388 are at logic level of "0" to turn on the P-type MOS transistor 385 and off the N-type MOS transistor 386, and thereby the output of the small driver 374 at the node 381 is at a logic level of "1" to be passed to said one of the I/O pads 372. Accordingly, the small driver 374 may be enabled by the S_Enable signal to amplify or drive the data of S_Data_out into its output at the node 381 coupling to one of the I/O pads 372.

Referring to FIG. 13B, the small receiver 375 may have a first input coupling to said one of the I/O pads 372 to be amplified or driven by the small receiver 375 into its output of S_Data_in and a second input coupling to an S_Inhibit signal to inhibit the small receiver 375 from generating its output of S_Data_in associated with its first input. The small receiver 375 may include a NAND gate 390 having a first input coupling to said one of the I/O pads 372 and a second input coupling to the S_Inhibit signal to perform a NAND operation on its first and second inputs into its output coupling to its inverter 391. The inverter 391 may be configured to invert its input coupling to the output of the NAND gate 390 into its output acting as the output of S_Data_in of the small receiver 375.

Referring to FIG. 13B, when the S_Inhibit signal is at a logic level of "0", the output of the NAND gate 390 is always at a logic level of "1" and the output S_Data_in of the small receiver 375 is always at a logic level of "0". Thereby, the small receiver 375 is inhibited from generating its output of S_Data_in associated with its first input at said one of the I/O pads 372.

Referring to FIG. 13B, the small receiver 375 may be activated when the S_Inhibit signal is at a logic level of "1". Meanwhile, if data from circuits outside the semiconductor chip to said one of the I/O pads 372 is at a logic level of "1", the NAND gate 390 has its output at a logic level of "0", and thereby the small receiver 375 may have its output of S_Data_in at a logic level of "1". If data from circuits outside the chip to said one of the I/O pads 372 is at a logic level of "0", the NAND gate 390 has its output at a logic level of "1", and thereby the small receiver 375 may have its output of S_Data_in at a logic level of "0". Accordingly, the small receiver 375 may be activated by the S_Inhibit signal to amplify or drive data from circuits outside the chip to said one of the I/O pads 372 into its output of S_Data_in.

Referring to FIG. 13B, said one of the I/O pads 372 may have an input capacitance, provided by the small ESD protection circuit or device 373 and small receiver 375 for example, between 0.1 pF and 2 pF or 0.1 pF and 1 pF. The small driver 374 may have an output capacitance or driving capability or loading, for example, between 0.1 pF and 2 pF or 0.1 pF and 1 pF. The size of the small ESD protection circuit or device 373 in a semiconductor chip may be between 0.05 pF and 2 pF or 0.05 pF and 1 pF, smaller than that of the large ESD protection circuit or device 273 therein.

Specification for Programmable Logic Blocks

FIG. 14A is a schematic view showing a block diagram of a programmable logic block in accordance with an embodiment of the present application. Referring to FIG. 14A, a programmable logic block (LB) 201 may be of various types, including a look-up table (LUT) 210 and a multiplexer 211 having its first set of inputs, e.g., D0-D15 as illustrated in FIG. 12A, 12C, 12D or 12H-12J or D0-D255 as illustrated in FIG. 12E, each coupling to one of resulting values or programming codes stored in the look-up table (LUT) 210 and its second set of inputs, e.g., four-digit inputs of A0-A3 as illustrated in FIG. 12A, 12C, 12D or 12H-12J or eight-digit inputs of A0-A7 as illustrated in FIG. 12E, configured to determine one of the inputs in its first set into its output, e.g., Dout as illustrated in FIG. 12A, 12C-12E or 12H-12J, acting as an output of the programmable logic block (LB) 201. The inputs, e.g., A0-A3 as illustrated in FIG. 12A, 12C, 12D or 12H-12J or A0-A7 as illustrated in FIG. 12E, of the second set of the multiplexer 211 may act as inputs of the programmable logic block (LB) 201.

Referring to FIG. 14A, the look-up table (LUT) 210 of the programmable logic block (LB) 201 may be composed of multiple memory cells 490 each configured to save or store one of the resulting values, i.e., programming codes. Each of the memory cells 490 may be referred to the non-volatile memory cell 600, 650, 700, 760, 800, 900 or 910 as illustrated in FIG. 1A-1H, 2A-2E, 3A-3W, 4A-4S, 5A-5F, 6A-6G or 7A-7J, or the latched non-volatile memory cell 940 or 950 as illustrated in FIG. 9A or 9B. Its multiplexer 211 may have its first set of inputs, e.g., D0-D15 as illustrated in FIG. 12A, 12C, 12D or 12H-12J or D0-D255 as illustrated in FIG. 12E, each coupling to one of the outputs of one of the memory cells 490, i.e., (1) the output N0 of the non-volatile memory cell 600, 650, 700, 760 or 800 as illustrated in FIG. 1A-1H, 2A-2E, 3A-3W, 4A-4S or 5A-5F for the look-up table (LUT) 210, (2) the output M3 or M12 of the non-volatile memory cell 900 as illustrated in FIG. 6E or 6G for the look-up table (LUT) 210, (3) the output M6, M15, M9 or M18 of the non-volatile memory cell 910 as illustrated in FIG. 7E, 7G, 7H or 7J for the look-up table (LUT) 210, or (4) the output L3 or L12 of the latched non-volatile memory cell 940 or 950 as illustrated in FIG. 9A or 9B for the look-up table (LUT) 210. Thus, each of the resulting values or programming codes stored in the respective memory cells 490 may couple to one of the inputs of the first set of the multiplexer 211 of the programmable logic block (LB) 201.

Furthermore, the programmable logic block (LB) 201 may be composed of another memory cell 490 configured to save or store a programming code, wherein the another memory cell 490 may have an output coupling to the input SC-4 of the multi-stage tri-state buffer 292 as seen in FIG. 12C, 12D, 12I or 12J of the multiplexer 211 of the second or third type for the programmable logic block (LB) 201. Each of the another memory cells 490 may be referred to the non-volatile memory cell 600, 650, 700, 760, 800, 900 or 910 as illustrated in FIG. 1A-1H, 2A-2E, 3A-3W, 4A-4S, 5A-5F, 6A-6G or 7A-7J, or the latched non-volatile memory cell 940 or 950 as illustrated in FIG. 9A or 9B. For the multiplexer 211 of the second or third type as seen in FIG. 12C, 12D, 12I or 12J for the programmable logic block (LB) 201, its multi-stage tri-state buffer 292 may have the input SC-4 coupling to one of the outputs of one of the memory cells 490, i.e., (1) the output N0 of the non-volatile memory cell 600, 650, 700, 760 or 800 as illustrated in FIG. 1A-1H, 2A-2E, 3A-3W, 4A-4S or 5A-5F for the look-up table (LUT) 210, (2) the output M3 or M12 of the non-volatile memory cell 900 as illustrated in FIG. 6E or 6G for the look-up table (LUT) 210, (3) the output M6, M15, M9 or M18 of the non-volatile memory cell 910 as illustrated in FIG. 7E, 7G, 7H or 7J for the look-up table (LUT) 210, or (4) the output L3 or L12 of the latched non-volatile memory cell 940 or 950 as illustrated in FIG. 9A or 9B for the look-up table (LUT) 210. Alternatively, for the multiplexer 211 of the second or third type as seen in FIG. 12C, 12D, 12I or 12J for the programmable logic block (LB) 201, its multi-stage tri-state buffer 292 may be provided with the control P-type and N-type MOS transistors 295 and 296 having gate terminals coupling respectively to (1) two inverted outputs associated with the output N0 of the non-volatile memory cell 600, 650, 700, 760 or 800 as illustrated in FIG. 1A-1H, 2A-2E, 3A-3W, 4A-4S or 5A-5F configured to save or store a programming code to switch on or off it, (2) two inverted outputs associated with the output M3 or M12 of the non-volatile memory cell 900 as illustrated in FIG. 6E or 6G configured to save or store a programming code to switch on or off it, (3) two inverted outputs associated with the output M6, M15, M9 or M18 of the non-volatile memory cell 910 as illustrated in FIG. 7E, 7G, 7H or 7J configured to save or store a programming code to switch on or off it, or (4) the two respective outputs L3 and L12 of the latched non-volatile memory cell 940 or 950 as illustrated in FIG. 9A or 9B configured to save or store a programming code to switch on or off it, wherein its inverter 297 as seen in FIG. 12C, 12D, 12I or 12J may be removed from it.

The programmable logic block 201 may include the look-up table 210 that may be programed to store or save the resulting values or programing codes for logic operation or Boolean operation, such as AND, NAND, OR, NOR operation or an operation combining the two or more of the above operations. For example, the look-up table 210 may be programed to lead the programmable logic block 201 to achieve the same logic operation as a logic operator, i.e., OR operator or gate, as shown in FIG. 14B performs. For this case, the programmable logic block 201 may have two inputs, e.g., A0 and A1, and an output, e.g., Dout. FIG. 14C shows the look-up table 210 configured for achieving the OR operator as illustrated in FIG. 14B performs. Referring to FIG. 14C, the look-up table 210 records or stores each of four resulting values or programming codes of the OR operator as illustrated in FIG. 14B that are generated respectively in accordance with four combinations of its inputs A0 and A1. The look-up table 210 may be programmed with the four resulting values or programming codes respectively stored in the four memory cells 490, each of which may be referred to (1) the non-volatile memory cell 600, 650, 700, 760, 800, 900 or 910 as illustrated in FIG. 1A-1H, 2A-2E, 3A-3W, 4A-4S or 5A-5F having its output N0 coupling to one of the four inputs D0-D3 of the first set of the multiplexer 211, as illustrated in FIG. 12G or 12L, for the programmable logic block (LB) 201, (2) the non-volatile memory cell as illustrated in FIG. 6E or 6G having its output M3 or M12 coupling to one of the four inputs D0-D3 of the first set of the multiplexer 211, as illustrated in FIG. 12G or 12L, for the programmable logic block (LB) 201, (3) the non-volatile memory cell as illustrated in FIG. 7E, 7G, 7H or 7J having its output M6, M15, M9 or M18 coupling to one of the four inputs D0-D3 of the first set of the multiplexer 211, as illustrated in FIG. 12G or 12L, for the programmable logic block (LB) 201, or (4) the latched non-volatile memory cell 940 or 950 as illustrated in FIG. 9A or 9B having its output L3 or L12 coupling to one of the four inputs D0-D3 of the first set of the multiplexer 211, as illustrated in FIG. 12G or 12L, for the programmable logic block (LB) 201. The multiplexer 211 may be configured to determine one of its four inputs, e.g., D0-D3, of the first set into its output, e.g., Dout as illustrated in FIG. 12G or 12L, in accordance with one of the combinations of its inputs A0 and A1 of the second set. The output Dout of the multiplexer 211 as seen in FIG. 14A may act as the output of the programmable logic block (LB) 201.

For example, the look-up table 210 may be programed to lead the programmable logic block 201 to achieve the same logic operation as a logic operator, i.e., AND gate or operator, as shown in FIG. 14D performs. For this case, the programmable logic block 201 may have two inputs, e.g., A0 and A1, and an output, e.g., Dout. FIG. 14E shows the look-up table 210 configured for achieving the AND operator as illustrated in FIG. 14D performs. Referring to FIG. 14E, the look-up table 210 records or stores each of four resulting values or programming codes of the AND operator as illustrated in FIG. 14B that are generated respectively in accordance with four combinations of its inputs A0 and A1. The look-up table 210 may be programmed with the four resulting values or programming codes respectively stored in the four memory cells 490, each of which may be referred to (1) the non-volatile memory cell 600, 650, 700, 760, 800, 900 or 910 as illustrated in FIG. 1A-1H, 2A-2E, 3A-3W, 4A-4S or 5A-5F having its output N0 coupling to one of the four inputs D0-D3 of the first set of the multiplexer 211, as illustrated in FIG. 12G or 12L, for the programmable logic block (LB) 201, (2) the non-volatile memory cell as illustrated in FIG. 6E or 6G having its output M3 or M12 coupling to one of the four inputs D0-D3 of the first set of the multiplexer 211, as illustrated in FIG. 12G or 12L, for the programmable logic block (LB) 201, (3) the non-volatile memory cell as illustrated in FIG. 7E, 7G, 7H or 7J having its output M6, M15, M9 or M18 coupling to one of the four inputs D0-D3 of the first set of the multiplexer 211, as illustrated in FIG. 12G or 12L, for the programmable logic block (LB) 201, or (4) the latched non-volatile memory cell 940 or 950 as illustrated in FIG. 9A or 9B having its output L3 or L12 coupling to one of the four inputs D0-D3 of the first set of the multiplexer 211, as illustrated in FIG. 12G or 12L, for the programmable logic block (LB) 201. The multiplexer 211 may be configured to determine one of its four inputs, e.g., D0-D3, of the first set into its output, e.g., Dout as illustrated in FIG. 12G or 12L, in accordance with one of the combinations of its inputs A0 and A1 of the second set. The output Dout of the multiplexer 211 as seen in FIG. 14A may act as the output of the programmable logic block (LB) 201.

For example, the look-up table 210 may be programed to lead the programmable logic block 201 to achieve the same logic operation as a logic operator as shown in FIG. 14F performs. Referring to FIG. 14F, the logic operator may be provided with an AND gate 212 and NAND gate 213 arranged in parallel, wherein the AND gate 212 is configured to perform an AND operation on its two inputs X0 and X1, i.e. two inputs of the logic operator, into its output and the NAND gate 213 is configured to perform an NAND operation on its two inputs X2 and X3, i.e. the other two inputs of the logic operator, into its output, and with an NAND gate 214 having two inputs coupling to the outputs of the AND gate 212 and NAND gate 213 respectively. The NAND gate 214 is configured to perform an NAND operation on its two inputs into its output Y acting as an output of the logic operator. The programmable logic block (LB) 201 as seen in FIG. 14A may achieve the same logic operation as the logic operator as illustrated in FIG. 14F performs. For this case, the programmable logic block 201 may have four inputs, e.g., A0-A3, a first one A0 of which may be equivalent to the input X0, a second one A1 of which may be equivalent to the input X1, a third one A2 of which may be equivalent to the input X2, and a fourth one A3 of which may be equivalent to the input X3. The programmable logic block 201 may have an output, e.g., Dout, which may be equivalent to the output Y of the logic operator.

FIG. 14G shows the look-up table 210 configured for achieving the same logic operation as the logic operator as illustrated in FIG. 14F performs. Referring to FIG. 14G, the look-up table 210 records or stores each of sixteen resulting values or programming codes of the logic operator as illustrated in FIG. 14F that are generated respectively in accordance with sixteen combinations of its inputs X0-X3. The look-up table 210 may be programmed with the sixteen resulting values or programming codes respectively stored in the sixteen memory cells 490, each of which may be referred to (1) the non-volatile memory cell 600, 650, 700, 760, 800, 900 or 910 as illustrated in FIG. 1A-1H, 2A-2E, 3A-3W, 4A-4S or 5A-5F having its output N0 coupling to one of the sixteen inputs D0-D15 of the first set of the multiplexer 211, as illustrated in FIG. 12A, 12C, 12D or 12H-12J, for the programmable logic block (LB) 201, (2) the non-volatile memory cell as illustrated in FIG. 6E or 6G having its output M3 or M12 coupling to one of the sixteen inputs D0-D15 of the first set of the multiplexer 211, as illustrated in FIG. 12A, 12C, 12D or 12H-12J, for the programmable logic block (LB) 201, (3) the non-volatile memory cell as illustrated in FIG. 7E, 7G, 7H or 7J having its output M6, M15, M9 or M18 coupling to one of the sixteen inputs D0-D15 of the first set of the multiplexer 211, as illustrated in FIG. 12A, 12C, 12D or 12H-12J, for the programmable logic block (LB) 201, or (4) the latched non-volatile memory cell 940 or 950 as illustrated in FIG. 9A or 9B having its output L3 or L12 coupling to one of the sixteen inputs D0-D15 of the first set of the multiplexer 211, as illustrated in FIG. 12A, 12C, 12D or 12H-12J, for the programmable logic block (LB) 201. The multiplexer 211 may be configured to determine one of its sixteen inputs, e.g., D0-D15, of the first set into its output, e.g., Dout as illustrated in FIG. 12A, 12C, 12D or 12H-12J, in accordance with one of the combinations of its inputs A0-A3 of the second set. The output Dout of the multiplexer 211 as seen in FIG. 14A may act as the output of the programmable logic block (LB) 201.

Alternatively, the programmable logic block 201 may be substituted with multiple programmable logic gates to be programmed to perform logic operation or Boolean operation as illustrated in FIG. 14B, 14D or 14F.

Figure 14H:
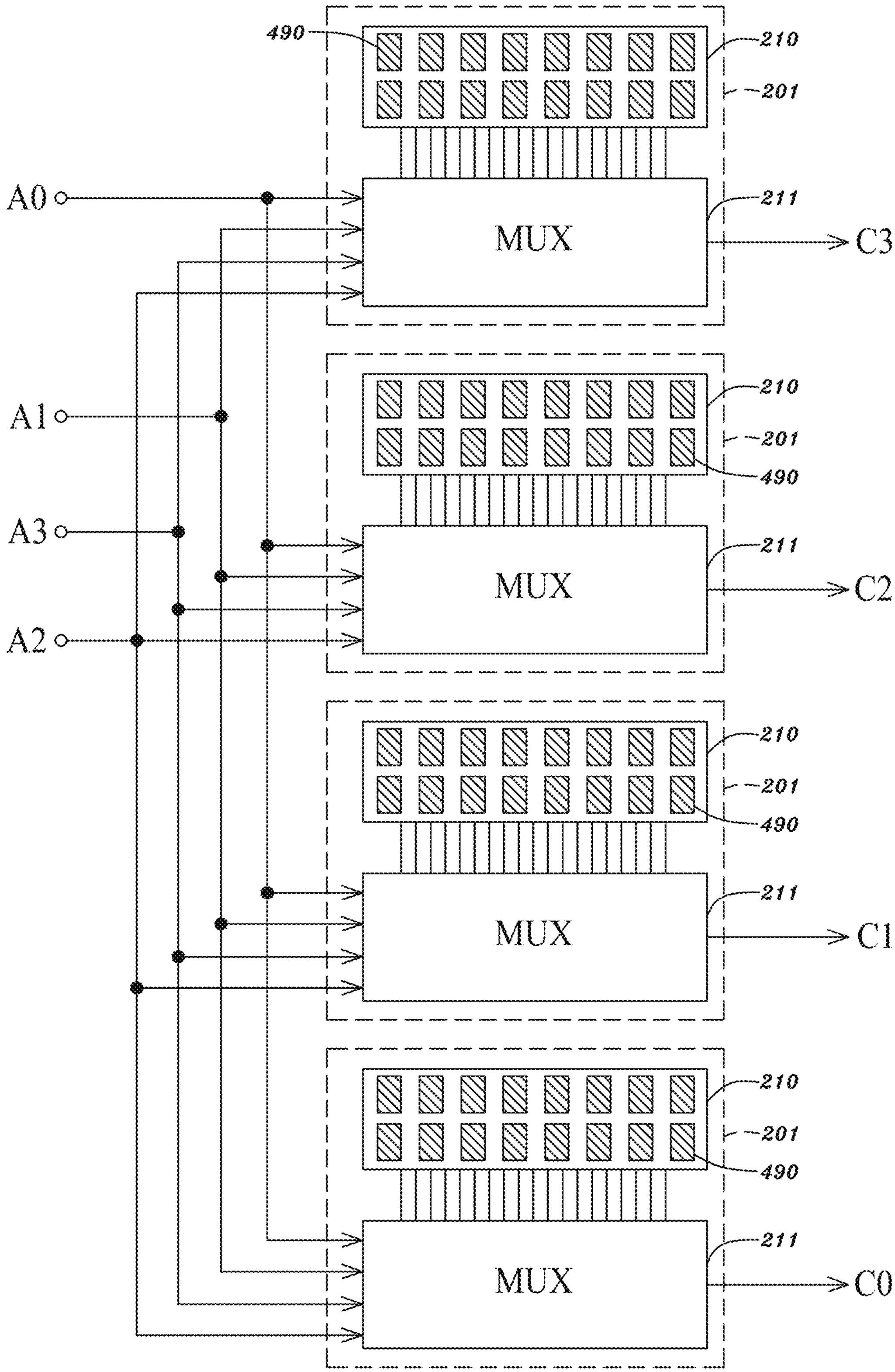
FIG. 14H is a block diagram illustrating a computation operator in accordance with an embodiment of the present application.

Alternatively, a plurality of the programmable logic block 201 may be programed to be integrated into a computation operator to perform computation operation, such as addition, subtraction, multiplication or division operation. The computation operator may be an adder, a multiplier, a multiplexer, a shift register, floating-point circuits and/or division circuits. FIG. 14H is a block diagram illustrating a computation operator in accordance with an embodiment of the present application. For example, the computation operator as seen in FIG. 14H may be configured to multiply two two-binary-digit numbers, i.e., [A1, A0] and [A3, A2], into a four-binary-digit output, i.e., [C3, C2, C1, C0], as seen in FIG. 14I. Referring to FIG. 14H, Four programmable logic blocks 201, each of which may be referred to one as illustrated in FIG. 14A, may be programed to be integrated into the computation operator. The computation operator may have its four inputs [A1, A0, A3, A2] coupling respectively to the four inputs of each of the four programmable logic blocks 201. Each of the programmable logic blocks 201 of the computation operator may generate its output Dout, i.e., one of the four binary digits C0-C3, based on a combination of its inputs [A1, A0, A3, A2]. In the multiplication of the two-binary-digit number, i.e., [A1, A0], by the two-binary-digit number, i.e., [A3, A2], the four programmable logic blocks 201 may generate their four respective outputs, i.e., the four binary digits C0-C3, based on a common combination of their inputs [A1, A0, A3, A2]. The four programmable logic blocks 201 may be programed with four respective look-up tables 210, i.e., Table-0, Table-1, Table-2 and Table-3.

For example, referring to FIGS. 14A, 14H and 14I, multiple of the memory cells 490, each of which may be referred to the non-volatile memory cell 600, 650, 700, 760, 800, 900 or 910 as illustrated in FIG. 1A-1H, 2A-2E, 3A-3W, 4A-4S, 5A-5F, 6A-6G or 7A-7J, or the latched non-volatile memory cell 940 or 950 as illustrated in FIG. 9A or 9B, may be composed for each of the four look-up tables 210, i.e., Table-0, Table-1, Table-2 and Table-3, and each of the memory cells 490 for said each of the four look-up tables may be configured to store one of the resulting values, i.e., programming codes, for one of the four binary digits C0-C3. A first one of the four programmable logic blocks 201 may have its multiplexer 211 provided with its first set of inputs, e.g., D0-D15, each coupling to the output of one of the memory cells 490 for the look-up table (LUT) of Table-0 and its second set of inputs, e.g., A0-A3, configured to determine one of its inputs, e.g., D0-D15, of the first set into its output, e.g., Dout, acting as an output C0 of the first one of the programmable logic block (LB) 201. A second one of the four programmable logic blocks 201 may have its multiplexer 211 provided with its first set of inputs, e.g., D0-D15, each coupling to the output of one of the memory cells 490 for the look-up table (LUT) of Table-1 and its second set of inputs, e.g., A0-A3, configured to determine one of its inputs, e.g., D0-D15, of the first set into its output, e.g., Dout, acting as an output C1 of the second one of the programmable logic block (LB) 201. A third one of the four programmable logic blocks 201 may have its multiplexer 211 provided with its first set of inputs, e.g., D0-D15, each coupling to the output of one of the memory cells 490 for the look-up table (LUT) of Table-2 and its second set of inputs, e.g., A0-A3, configured to determine one of its inputs, e.g., D0-D15, of the first set into its output, e.g., Dout, acting as an output C2 of the third one of the programmable logic block (LB) 201. A fourth one of the four programmable logic blocks 201 may have its multiplexer 211 provided with its first set of inputs, e.g., D0-D15, each coupling to the output of one of the memory cells 490 for the look-up table (LUT) of Table-3 and its second set of inputs, e.g., A0-A3, configured to determine one of its inputs, e.g., D0-D15, of the first set into its output, e.g., Dout, acting as an output C3 of the fourth one of the programmable logic block (LB) 201.

Thereby, referring to FIGS. 14H and 14I, the four programmable logic blocks 201 composing the computation operator may generate their four respective outputs, i.e., the four binary digits C0-C3, based on a common combination of their inputs [A1, A0, A3, A2]. In this case, the inputs A0-A3 of the four programmable logic blocks 201 may act as inputs of the computation operator and the outputs C0-C3 of the four programmable logic blocks 201 may act as an output of the computation operator. The computation operator may generate a four-binary-digit output, i.e., [C3, C2, C1, C0], based on a combination of its four-binary-digit input, i.e., [A1, A0, A3, A2].

Referring to FIGS. 14H and 14I, in a particular case for multiplication of 3 by 3, each of the four programmable logic blocks 201 may have a combination of its inputs, i.e., [A1, A0, A3, A2]=[1, 1, 1, 1], to determine one of the four binary digits, i.e., [C3, C2, C1, C0]=[1, 0, 0, 1]. The first one of the four programmable logic blocks 201 may generate the binary digit C0 at a logic level of "1" based on the combination of its inputs, i.e., [A1, A0, A3, A2]=[1, 1, 1, 1]; the second one of the four programmable logic blocks 201 may generate the binary digit C1 at a logic level of "0" based on the combination of its inputs, i.e., [A1, A0, A3, A2]=[1, 1, 1, 1]; the third one of the four programmable logic blocks 201 may generate the binary digit C2 at a logic level of "0" based on the combination of its inputs, i.e., [A1, A0, A3, A2]=[1, 1, 1, 1]; the fourth one of the four programmable logic blocks 201 may generate the binary digit C3 at a logic level of "1" based on the combination for its inputs, i.e., [A1, A0, A3, A2]=[1, 1, 1, 1].

Figure 14J:
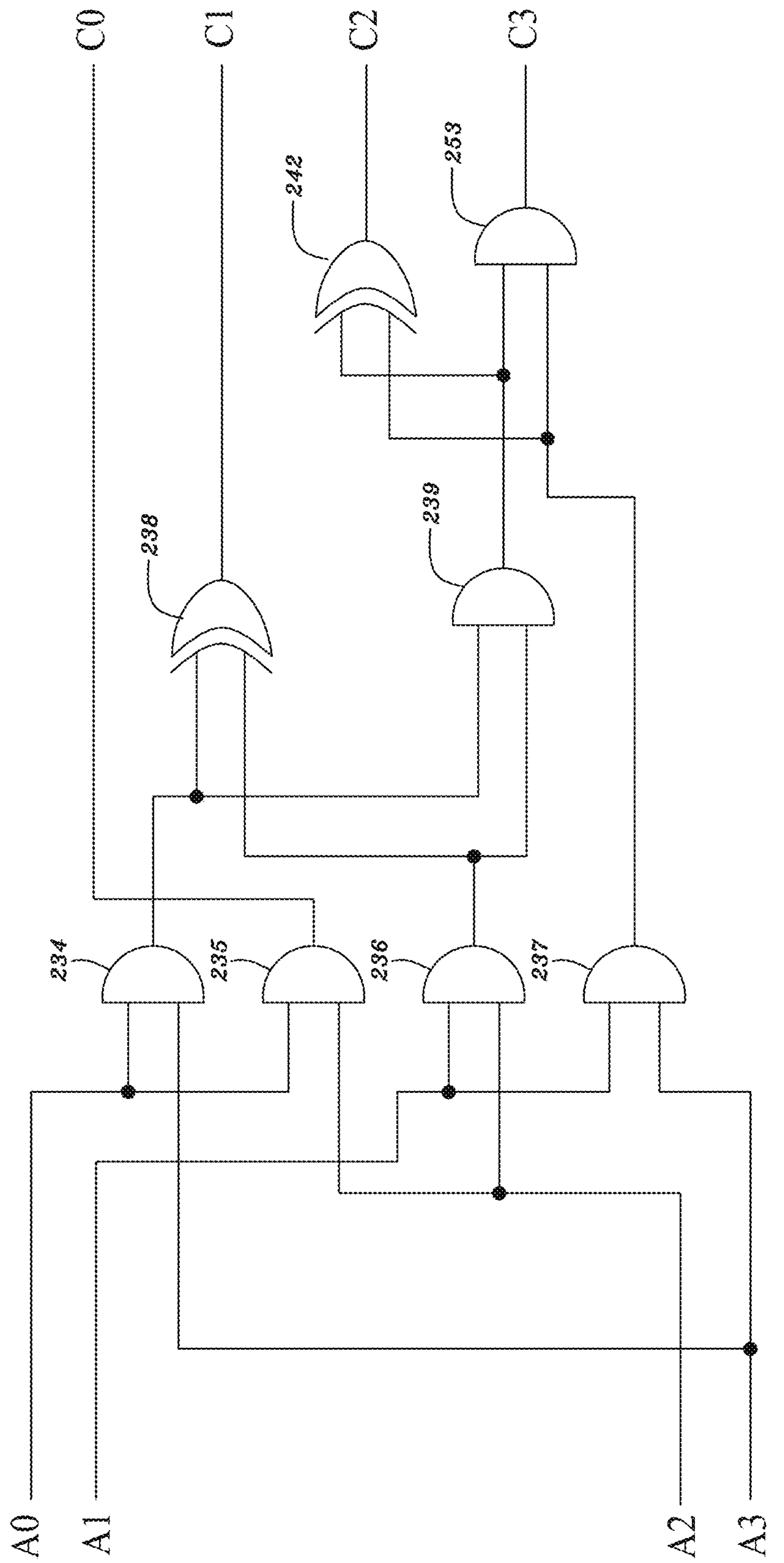
FIG. 14J is a circuit diagram of a computation operator in accordance with an embodiment of the present application.

Alternatively, the four programmable logic blocks 201 may be substituted with multiple programmable logic gates as illustrated in FIG. 14J to be programmed for a computation operator performing the same computation operation as the four programmable logic blocks 201. Referring to FIG. 14J, the computation operator may be programed to perform multiplication on two numbers each expressed by two binary digits, e.g., [A1, A0] and [A3, A2] as illustrated in FIGS. 14H and 14I, into a four-binary-digit output, e.g., [C3, C2, C1, C0] as illustrated in FIGS. 14H and 14I. The computation operator may be programed with an AND gate 234 configured to perform AND operation on its two inputs respectively at the inputs A0 and A3 of the computation operator into its output. The programmable logic gates may be programed with an AND gate 235 configured to perform AND operation on its two inputs respectively at the inputs A0 and A2 of the computation operator into its output acting as the output C0 of the computation operator. The computation operator may be programed with an AND gate 236 configured to perform AND operation on its two inputs respectively at the inputs A1 and A2 of the computation operator into its output. The computation operator may be programed with an AND gate 237 configured to perform AND operation on its two inputs respectively at the inputs A1 and A3 of the computation operator into its output. The computation operator may be programed with an ExOR gate 238 configured to perform Exclusive-OR operation on its two inputs coupling respectively to the outputs of the AND gates 234 and 236 into its output acting as the output C1 of the computation operator. The computation operator may be programed with an AND gate 239 configured to perform AND operation on its two inputs coupling respectively to the outputs of the AND gates 234 and 236 into its output. The computation operator may be programed with an ExOR gate 242 configured to perform Exclusive-OR operation on its two inputs coupling respectively to the outputs of the AND gates 239 and 237 into its output acting as the output C2 of the computation operator. The computation operator may be programed with an AND gate 253 configured to perform AND operation on its two inputs coupling respectively to the outputs of the AND gates 239 and 237 into its output acting as the output C3 of the computation operator.

To sum up, the programmable logic block 201 may be provided with the memory cells 490, having the number of 2 to the power of n, for the look-up table 210 to be programed respectively to store the resulting values or programming codes, having the number of 2 to the power of n, for each combination of its inputs having the number of n. For example, the number of n may be any integer greater than or equal to 2, such as between 2 and 64. For the example as illustrated in FIGS. 14A, 14G, 14H and 14I, each of the programmable logic blocks 201 may be provided with its inputs having the number of n equal to 4, and thus the number of resulting values or programming codes for all combinations of its inputs is 16, i.e., the number of 2 to the power of n equal to 4.

Accordingly, the programmable logic blocks (LB) 201 as seen in FIG. 14A may perform logic operation on its inputs into its output, wherein the logic operation may include Boolean operation such as AND, NAND, OR or NOR operation. Besides, the programmable logic blocks (LB) 201 as seen in FIG. 14A may perform computation operation on its inputs into its output, wherein the computation operation may include addition, subtraction, multiplication or division operation.

Specification for Programmable Interconnect

Figure 15A:
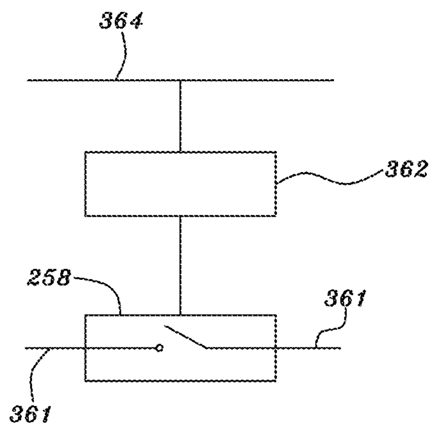
FIGS. 15A-15C are block diagrams illustrating programmable interconnects programmed by a pass/no-pass switch or cross-point switch in accordance with an embodiment of the present application.

FIG. 15A is a block diagram illustrating a programmable interconnect programmed by a pass/no-pass switch in accordance with an embodiment of the present application. Referring to FIG. 15A, two programmable interconnects 361 may be controlled, by the pass/no-pass switch 258 of either of the first through sixth types as seen in FIGS. 10A-10F, to couple to each other. One of the programmable interconnects 361 may couple to the node N21 of the pass/no-pass switch 258, and another of the programmable interconnects 361 may couple to the node N22 of the pass/no-pass switch 258. Accordingly, the pass/no-pass switch 258 may be switched on to connect said one of the programmable interconnects 361 to said another of the programmable interconnects 361; the pass/no-pass switch 258 may be switched off to disconnect said one of the programmable interconnects 361 from said another of the programmable interconnects 361.

Referring to FIG. 15A, a memory cell 362 may couple to the pass/no-pass switch 258 via a fixed interconnect 364, i.e., non-programmable interconnect, to turn on or off the pass/no-pass switch 258, wherein the memory cell 362 may be the non-volatile memory cell 600, 650, 700, 760, 800, 900 or 910 as illustrated in FIG. 1A-1H, 2A-2E, 3A-3W, 4A-4S, 5A-5F, 6A-6G or 7A-7J, or the latched non-volatile memory cell 940 or 950 as illustrated in FIG. 9A or 9B. For the first type of pass/no-pass switch 258 as illustrated in FIG. 10A used to program the programmable interconnects 361, the first type of pass/no-pass switch 258 may have its nodes SC-1 and SC-2 coupling to two inverted outputs of the memory cell 362, which may be referred to (1) two inverted outputs associated with the output N0 of the non-volatile memory cell 600, 650, 700, 760 or 800 as illustrated in FIG. 1A-1H, 2A-2E, 3A-3W, 4A-4S or 5A-5F, (2) two inverted outputs associated with the output M3 or M12 of the non-volatile memory cell 900 as illustrated in FIG. 6E or 6G, (3) two inverted outputs associated with the output M6, M15, M9 or M18 of the non-volatile memory cell 910 as illustrated in FIG. 7E, 7G, 7H or 7J, or (4) the two respective outputs L3 and L12 of the latched non-volatile memory cell 940 or 950 as illustrated in FIG. 9A or 9B, and accordingly receiving the two inverted outputs of the memory cell 362 associated with the programming code stored or saved in the memory cell 362 to switch on or off the first type of pass/no-pass switch 258 to couple or decouple two of the programmable interconnects 361 coupling to the two nodes N21 and N22 of the pass/no-pass switch 258 of the first type respectively.

For the second type of pass/no-pass switch 258 as illustrated in FIG. 10B used to program the programmable interconnects 361, the second type of pass/no-pass switch 258 may have its node SC-3 coupling to an output of the memory cell 362, which may be referred to (1) the output N0 of the non-volatile memory cell 600, 650, 700, 760 or 800 as illustrated in FIG. 1A-1H, 2A-2E, 3A-3W, 4A-4S or 5A-5F, (2) the output M3 or M12 of the non-volatile memory cell 900 as illustrated in FIG. 6E or 6G, (3) the output M6, M15, M9 or M18 of the non-volatile memory cell 910 as illustrated in FIG. 7E, 7G, 7H or 7J, or (4) the output L3 or L12 of the latched non-volatile memory cell 940 or 950 as illustrated in FIG. 9A or 9B, and accordingly receiving the output of the memory cell 362 associated with the programming code stored or saved in the memory cell 362 to switch on or off the second type of pass/no-pass switch 258 to couple or decouple two of the programmable interconnects 361 coupling to the two nodes N21 and N22 of the pass/no-pass switch 258 of the second type respectively.

For the third or fourth type of pass/no-pass switch 258 as illustrated in FIG. 10C or 10D used to program the programmable interconnects 361, the third or fourth type of pass/no-pass switch 258 may have its node SC-4 coupling to an output of the memory cell 362, which may be referred to (1) the output N0 of the non-volatile memory cell 600, 650, 700, 760 or 800 as illustrated in FIG. 1A-1H, 2A-2E, 3A-3W, 4A-4S or 5A-5F, (2) the output M3 or M12 of the non-volatile memory cell 900 as illustrated in FIG. 6E or 6G, (3) the output M6, M15, M9 or M18 of the non-volatile memory cell 910 as illustrated in FIG. 7E, 7G, 7H or 7J, or (4) the output L3 or L12 of the latched non-volatile memory cell 940 or 950 as illustrated in FIG. 9A or 9B, and accordingly receiving the output of the memory cell 362 associated with the programming code stored or saved in the memory cell 362 to switch on or off the third or fourth type of pass/no-pass switch 258 to couple or decouple two of the programmable interconnects 361 coupling to the two nodes N21 and N22 of the pass/no-pass switch 258 of the third or fourth type respectively. Alternatively, its control P-type and N-type MOS transistors 295 and 296 may have gate terminals coupling respectively to two inverted outputs of the memory cell 362, which may be referred to (1) two inverted outputs associated with the output N0 of the non-volatile memory cell 600, 650, 700, 760 or 800 as illustrated in FIG. 1A-1H, 2A-2E, 3A-3W, 4A-4S or 5A-5F, (2) two inverted outputs associated with the output M3 or M12 of the non-volatile memory cell 900 as illustrated in FIG. 6E or 6G, (3) two inverted outputs associated with the output M6, M15, M9 or M18 of the non-volatile memory cell 910 as illustrated in FIG. 7E, 7G, 7H or 7J, or (4) the two respective outputs L3 and L12 of the latched non-volatile memory cell 940 or 950 as illustrated in FIG. 9A or 9B, and accordingly receiving the two inverted outputs of the memory cell 362 associated with the programming code stored or saved in the memory cell 362 to switch on or off the third or fourth type of pass/no-pass switch 258 to couple or decouple two of the programmable interconnects 361 coupling to the two nodes N21 and N22 of the pass/no-pass switch 258 of the third or fourth type respectively, wherein its inverter 297 may be removed from the pass/no-pass switch 258 of the third or fourth type.

For the fifth or sixth type of pass/no-pass switch 258 as illustrated in FIG. 10E or 10F used to program the programmable interconnects 361, the fifth or sixth type of pass/no-pass switch 258 may have its nodes SC-5 and SC-6 coupling to the outputs of the respective two of the memory cells 362, each of which may be referred to (1) the output N0 of the non-volatile memory cell 600, 650, 700, 760 or 800 as illustrated in FIG. 1A-1H, 2A-2E, 3A-3W, 4A-4S or 5A-5F, (2) the output M3 or M12 of the non-volatile memory cell 900 as illustrated in FIG. 6E or 6G, (3) the output M6, M15, M9 or M18 of the non-volatile memory cell 910 as illustrated in FIG. 7E, 7G, 7H or 7J, or (4) the output L3 or L12 of the latched non-volatile memory cell 940 or 950 as illustrated in FIG. 9A or 9B, and accordingly receiving the outputs of the respective two of the memory cells 362 associated with two programming codes stored or saved in the two memory cells 362 respectively to switch on or off the fifth or sixth type of pass/no-pass switch 258 to couple or decouple two of the programmable interconnects 361 coupling to the two nodes N21 and N22 of the pass/no-pass switch 258 of the fifth or sixth type respectively. Alternatively, (1) its control P-type and N-type MOS transistors 295 and 296 at its left side may have gate terminals coupling respectively to two inverted outputs of one of the two memory cells 362, which may be referred to (1) two inverted outputs associated with the output N0 of the non-volatile memory cell 600, 650, 700, 760 or 800 as illustrated in FIG. 1A-1H, 2A-2E, 3A-3W, 4A-4S or 5A-5F, (2) two inverted outputs associated with the output M3 or M12 of the non-volatile memory cell 900 as illustrated in FIG. 6E or 6G, (3) two inverted outputs associated with the output M6, M15, M9 or M18 of the non-volatile memory cell 910 as illustrated in FIG. 7E, 7G, 7H or 7J, or (4) the two respective outputs L3 and L12 of the latched non-volatile memory cell 940 or 950 as illustrated in FIG. 9A or 9B, and accordingly receiving the two inverted outputs of said one of the two memory cells 362 associated with the programming code stored or saved in said one of the two memory cells 362, and (2) its control P-type and N-type MOS transistors 295 and 296 at its right side may have gate terminals coupling respectively to two inverted outputs of the other of the two memory cells 362, which may be referred to (1) two inverted outputs associated with the output N0 of the non-volatile memory cell 600, 650, 700, 760 or 800 as illustrated in FIG. 1A-1H, 2A-2E, 3A-3W, 4A-4S or 5A-5F, (2) two inverted outputs associated with the output M3 or M12 of the non-volatile memory cell 900 as illustrated in FIG. 6E or 6G, (3) two inverted outputs associated with the output M6, M15, M9 or M18 of the non-volatile memory cell 910 as illustrated in FIG. 7E, 7G, 7H or 7J, or (4) the two respective outputs L3 and L12 of the latched non-volatile memory cell 940 or 950 as illustrated in FIG. 9A or 9B, and accordingly receiving the two inverted outputs of said the other of the two memory cells 362 associated with the programming code stored or saved in said the other of the two memory cells 362, to switch on or off the fifth or sixth type of pass/no-pass switch 258 to couple or decouple two of the programmable interconnects 361 coupling to the two nodes N21 and N22 of the pass/no-pass switch 258 of the fifth or sixth type respectively, wherein its inverters 297 may be removed from the pass/no-pass switch 258 of the fifth or sixth type.

Before the memory cell(s) 362 are programmed or when the memory cell(s) 362 are being programmed, the programmable interconnects 361 may not be used for signal transmission. The memory cell(s) 362 may be programmed to have the pass/no-pass switch 258 switched on to couple the programmable interconnects 361 for signal transmission or to have the pass/no-pass switch 258 switched off to decouple the programmable interconnects 361. Similarly, each of the first and second types of cross-point switches 379 as seen in FIGS. 11A and 11B may be composed of a plurality of the pass/no-pass switch 258 of any type, wherein each of the pass/no-pass switches 258 may have the node(s) (SC-1 and SC-2), SC-3, SC-4 or (SC-5 and SC-6) coupling to the output(s) of the memory cell(s) 362 as mentioned above, and accordingly receiving the output(s) of the memory cell(s) 362 associated with the programming code(s) stored or saved in the memory cell(s) 362 to switch on or off said each of the pass/no-pass switches 258 to couple or decouple two of the programmable interconnects 361 coupling to the two nodes N21 and N22 of said each of the pass/no-pass switches 258 respectively.

Figure 15B:
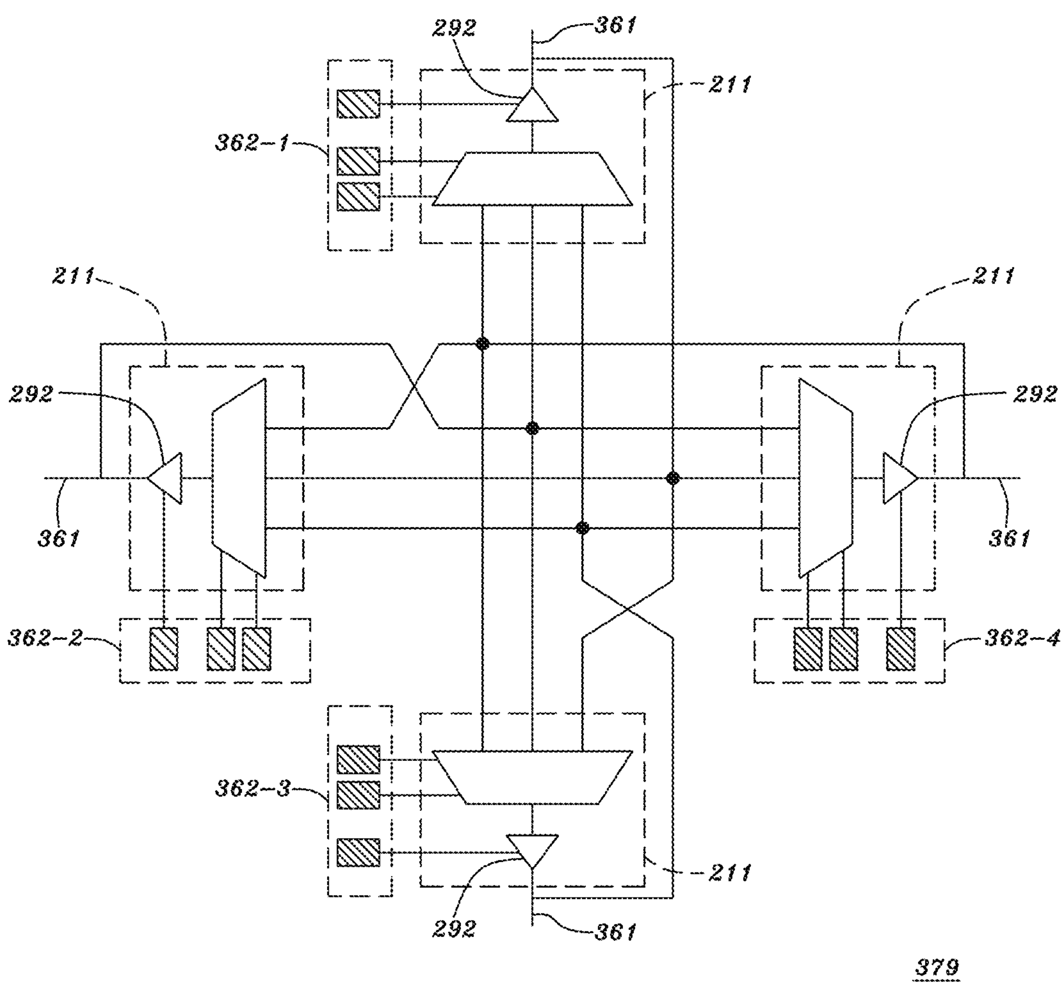

FIG. 15B is a circuit diagram illustrating programmable interconnects programmed by a cross-point switch in accordance with an embodiment of the present application. Referring to FIG. 15B, four programmable interconnects 361 may couple to the respective four nodes N23-N26 of the cross-point switch 379 of the third type as seen in FIG. 11C.

Thereby, one of the four programmable interconnects 361 may be switched by the cross-point switch 379 of the third type to couple to another one, two or three of the four programmable interconnects 361. For the cross-point switch 379 composed of four of the multiplexers 211 of the first type, each of the multiplexers 211 may have its second set of two inputs A0 and A1 coupling respectively to the outputs of two of the memory cells 362, each of which may be referred to (1) the output N0 of the non-volatile memory cell 600, 650, 700, 760 or 800 as illustrated in FIG. 1A-1H, 2A-2E, 3A-3W, 4A-4S or 5A-5F, (2) the output M3 or M12 of the non-volatile memory cell 900 as illustrated in FIG. 6E or 6G, (3) the output M6, M15, M9 or M18 of the non-volatile memory cell 910 as illustrated in FIG. 7E, 7G, 7H or 7J, or (4) the output L3 or L12 of the latched non-volatile memory cell 940 or 950 as illustrated in FIG. 9A or 9B, via multiple fixed interconnects 364, i.e., non-programmable interconnects. For the cross-point switch 379 composed of four of the multiplexers 211 of the second or third type as seen in FIG. 12F or 12K, each of the multiplexers 211 may have its second set of two inputs A0 and A1 coupling respectively to the outputs of two of the memory cells 362, each of which may be referred to (1) the output N0 of the non-volatile memory cell 600, 650, 700, 760 or 800 as illustrated in FIG. 1A-1H, 2A-2E, 3A-3W, 4A-4S or 5A-5F, (2) the output M3 or M12 of the non-volatile memory cell 900 as illustrated in FIG. 6E or 6G, (3) the output M6, M15, M9 or M18 of the non-volatile memory cell 910 as illustrated in FIG. 7E, 7G, 7H or 7J, or (4) the output L3 or L12 of the latched non-volatile memory cell 940 or 950 as illustrated in FIG. 9A or 9B, via multiple fixed interconnects 364, i.e., non-programmable interconnects, and its node SC-4 may couple to the output of another of the memory cells 362, which may be referred to (1) the output N0 of the non-volatile memory cell 600, 650, 700, 760 or 800 as illustrated in FIG. 1A-1H, 2A-2E, 3A-3W, 4A-4S or 5A-5F, (2) the output M3 or M12 of the non-volatile memory cell 900 as illustrated in FIG. 6E or 6G, (3) the output M6, M15, M9 or M18 of the non-volatile memory cell 910 as illustrated in FIG. 7E, 7G, 7H or 7J, or (4) the output L3 or L12 of the latched non-volatile memory cell 940 or 950 as illustrated in FIG. 9A or 9B, via another fixed interconnect 364, i.e., non-programmable interconnect. Alternatively, its control P-type and N-type MOS transistors 295 and 296 may have gate terminals coupling respectively to two inverted outputs of another of the memory cells 362, which may be referred to (1) two inverted outputs associated with the output N0 of the non-volatile memory cell 600, 650, 700, 760 or 800 as illustrated in FIG. 1A-1H, 2A-2E, 3A-3W, 4A-4S or 5A-5F, (2) two inverted outputs associated with the output M3 or M12 of the non-volatile memory cell 900 as illustrated in FIG. 6E or 6G, (3) two inverted outputs associated with the output M6, M15, M9 or M18 of the non-volatile memory cell 910 as illustrated in FIG. 7E, 7G, 7H or 7J, or (4) the two respective outputs L3 and L12 of the latched non-volatile memory cell 940 or 950 as illustrated in FIG. 9A or 9B, and accordingly receiving the two inverted outputs of said another of the memory cells 362 associated with the programming code stored or saved in the memory cell 362 to switch on or off its pass/no-pass switch 258 of the third or fourth type to couple or decouple the input and output Dout of its pass/no-pass switch 258 of the third or fourth type, wherein its inverter 297 may be removed from the pass/no-pass switch 258 of the third or fourth type. Accordingly, each of the multiplexers 211 may pass its first set of three inputs coupling to three of the four programmable interconnects 361 into its output coupling to the other one of the four programmable interconnects 361 in accordance with its second set of two inputs A0 and A1 and alternatively further in accordance with a logic level at the node SC-4 or logic levels at gate terminals of its control P-type and N-type MOS transistors 295 and 296.

For example, referring to FIGS. 11C and 15B, the following description takes the cross-point switch 379 composed of four of the multiplexers 211 of the second or third type as an example. For programming the programmable interconnects 361, the top one of the multiplexers 211 may have its second set of inputs $A0_1$, $A1_1$ and $SC_1$-4 coupling respectively to the outputs of the three memory cells 362-1, each of which may be referred to (1) the output N0 of the non-volatile memory cell 600, 650, 700, 760 or 800 as illustrated in FIG. 1A-1H, 2A-2E, 3A-3W, 4A-4S or 5A-5F, (2) the output M3 or M12 of the non-volatile memory cell 900 as illustrated in FIG. 6E or 6G, (3) the output M6, M15, M9 or M18 of the non-volatile memory cell 910 as illustrated in FIG. 7E, 7G, 7H or 7J, or (4) the output L3 or L12 of the latched non-volatile memory cell 940 or 950 as illustrated in FIG. 9A or 9B, the left one of the multiplexers 211 may have its second set of inputs $A0_2$, $A1_2$ and $SC_2$-4 coupling respectively to the outputs of the three memory cells 362-2, each of which may be referred to (1) the output N0 of the non-volatile memory cell 600, 650, 700, 760 or 800 as illustrated in FIG. 1A-1H, 2A-2E, 3A-3W, 4A-4S or 5A-5F, (2) the output M3 or M12 of the non-volatile memory cell 900 as illustrated in FIG. 6E or 6G, (3) the output M6, M15, M9 or M18 of the non-volatile memory cell 910 as illustrated in FIG. 7E, 7G, 7H or 7J, or (4) the output L3 or L12 of the latched non-volatile memory cell 940 or 950 as illustrated in FIG. 9A or 9B, the bottom one of the multiplexers 211 may have its second set of inputs $A0_3$, $A1_3$ and $SC_3$-4 coupling respectively to the outputs of the three memory cells 362-3, each of which may be referred to (1) the output N0 of the non-volatile memory cell 600, 650, 700, 760 or 800 as illustrated in FIG. 1A-1H, 2A-2E, 3A-3W, 4A-4S or 5A-5F, (2) the output M3 or M12 of the non-volatile memory cell 900 as illustrated in FIG. 6E or 6G, (3) the output M6, M15, M9 or M18 of the non-volatile memory cell 910 as illustrated in FIG. 7E, 7G, 7H or 7J, or (4) the output L3 or L12 of the latched non-volatile memory cell 940 or 950 as illustrated in FIG. 9A or 9B, and the right one of the multiplexers 211 may have its second set of inputs $A0_4$, $A1_4$ and $SC_4$-4 coupling respectively to the outputs of the three memory cells 362-4, each of which may be referred to (1) the output N0 of the non-volatile memory cell 600, 650, 700, 760 or 800 as illustrated in FIG. 1A-1H, 2A-2E, 3A-3W, 4A-4S or 5A-5F, (2) the output M3 or M12 of the non-volatile memory cell 900 as illustrated in FIG. 6E or 6G, (3) the output M6, M15, M9 or M18 of the non-volatile memory cell 910 as illustrated in FIG. 7E, 7G, 7H or 7J, or (4) the output L3 or L12 of the latched non-volatile memory cell 940 or 950 as illustrated in FIG. 9A or 9B. Before the memory cells 362-1, 362-2, 362-3 and 362-4 are programmed or when the memory cells 362-1, 362-2, 362-3 and 362-4 are being programmed, the four programmable interconnects 361 may not be used for signal transmission. The memory cells 362-1, 362-2, 362-3 and 362-4 may be programmed to have each of the multiplexers 211 of the second or third type pass one of its three inputs of the first set into its output such that one of the four programmable interconnects 361 may couple to another, another two or another three of the four programmable interconnects 361 for signal transmission in operation.

Figure 15C:
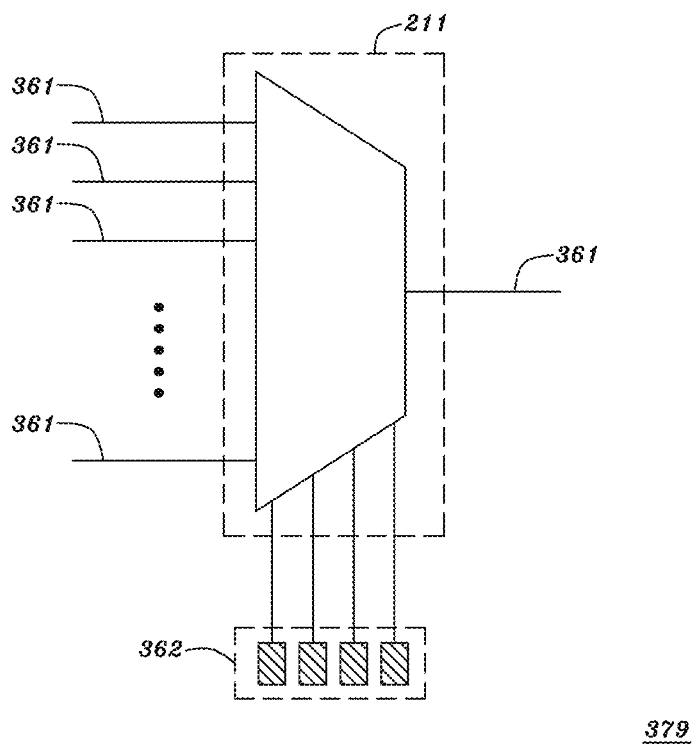

FIG. 15C is a circuit diagram illustrating a programmable interconnect programmed by a cross-point switch in accordance with an embodiment of the present application. Referring to FIG. 15C, the fourth type of cross-point switch 379 illustrated in FIG. 11D may have the first set of its inputs, e.g., 16 inputs D0-D15, coupling respectively to multiple of the programmable interconnects 361, e.g., sixteen of the programmable interconnects 361, and its output, e.g., Dout, coupling to another of the programmable interconnects 361. Thereby, said multiple of the programmable interconnects 361 may have one to be switched by the fourth type of cross-point switch 379 to associate with said another of the programmable interconnects 361. The fourth type of cross-point switch 379 may have its second set of multiple inputs A0-A3 coupling respectively to the outputs of four of the memory cells 362, each of which may be referred to (1) the output N0 of the non-volatile memory cell 600, 650, 700, 760 or 800 as illustrated in FIG. 1A-1H, 2A-2E, 3A-3W, 4A-4S or 5A-5F, (2) the output M3 or M12 of the non-volatile memory cell 900 as illustrated in FIG. 6E or 6G, (3) the output M6, M15, M9 or M18 of the non-volatile memory cell 910 as illustrated in FIG. 7E, 7G, 7H or 7J, or (4) the output L3 or L12 of the latched non-volatile memory cell 940 or 950 as illustrated in FIG. 9A or 9B, and accordingly receiving the outputs of the four respective memory cells 362 associated with the four programming codes stored or saved in the four respective memory cells 362 to pass one of its inputs of the first set, e.g., D0-D15 coupling to the sixteen of the programmable interconnects 361, into its output, e.g., Dout coupling to said another of the programmable interconnects 361. Before the memory cells 362 are programmed or when the memory cells 362 are being programmed, said multiple of the programmable interconnects 361 and said another of the programmable interconnects 361 may not be used for signal transmission. The memory cells 362 may be programmed to have the fourth type of cross-point switch 379 pass one of its inputs of the first set into its output such that one of said multiple of the programmable interconnects 361 may couple to said another of the programmable interconnects 361 for signal transmission in operation.

Referring to FIGS. 15A-15C, for the programmable interconnects 361, each of the memory cells 362 may be the non-volatile memory cell 600, 650, 700, 760, 800, 900 or 910 as illustrated in FIG. 1A-1H, 2A-2E, 3A-3W, 4A-4S, 5A-5F, 6A-6G or 7A-7J, or the latched non-volatile memory cell 940 or 950 as illustrated in FIG. 9A or 9B. For the programmable interconnect 361, before the non-volatile memory cell 362 is programmed or erased or when the non-volatile memory cell 362 is being programmed or erased, the programmable interconnects 361 may not be used for signal transmission. After the non-volatile memory cell 362 are programmed or erased, the programmable interconnects 361 may be used for signal transmission in operation when the pass/no-pass switch 258 is programmed to be switched on by the non-volatile memory cell 362, or the programmable interconnects 361 may not be used for signal transmission in operation when the pass/no-pass switch 258 is programmed to be switched off by the non-volatile memory cell 362.

Figure 15D:
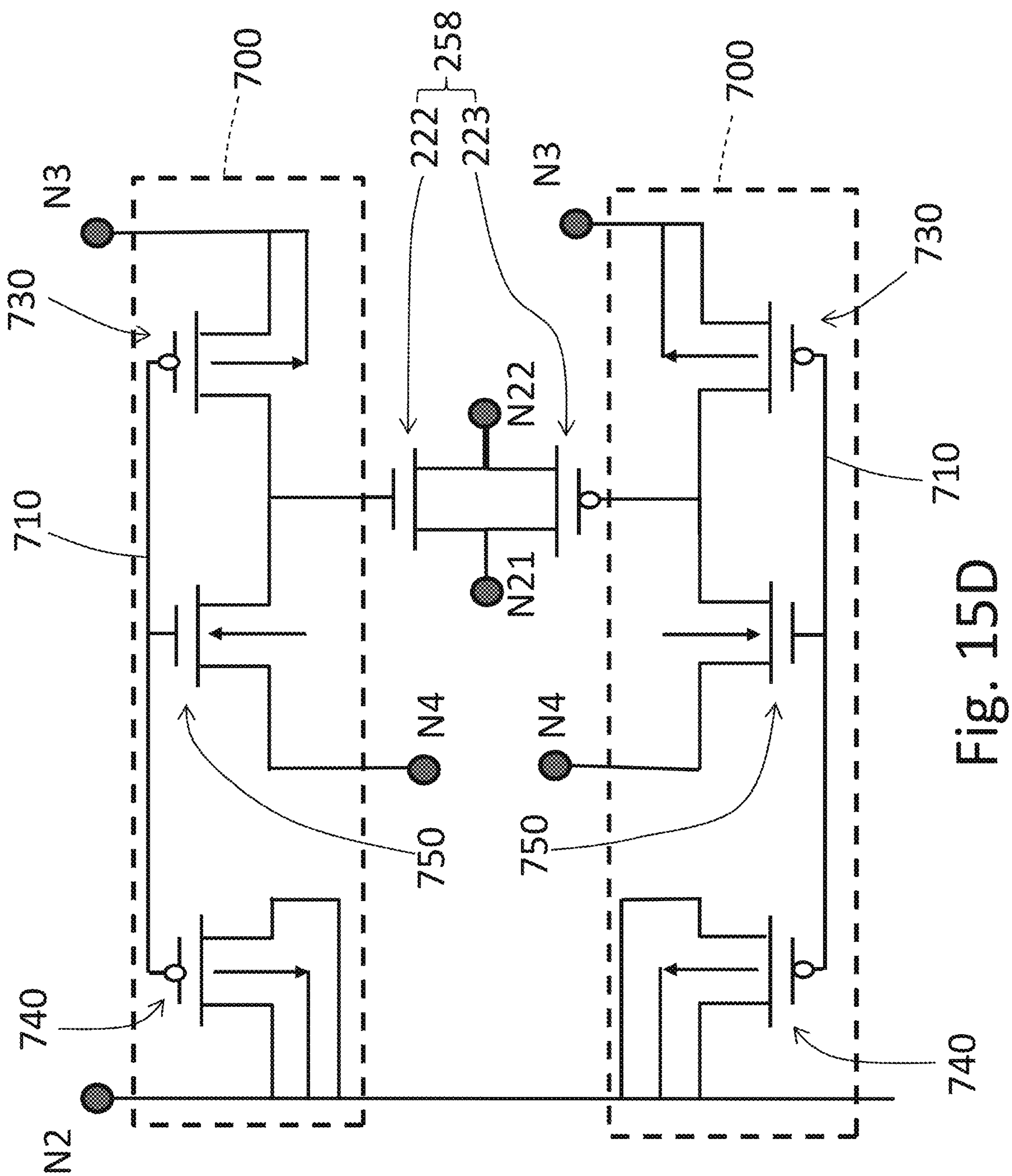
FIG. 15D is a circuit diagram showing a pair of the third type of non-volatile memory cells having output coupling to a pass/no-pass switch to switch on or off the pass/no-pass switch in accordance with an embodiment of the present application.

For example, FIG. 15D is a circuit diagram showing a pair of the third type of non-volatile memory cells having output coupling to a pass/no-pass switch to switch on or off the pass/no-pass switch in accordance with an embodiment of the present application. For an element indicated by the same reference number shown in FIGS. 3A, 3B, 3C and 15D, the specification of the element as seen in FIG. 15D may be referred to that of the element as illustrated in FIGS. 3A, 3B and 3C. Referring to FIG. 15D, a pair of the third type of non-volatile memory cells 700 may have two respective outputs, in operation, at their nodes N0 each coupling to a gate terminal of one of the N-type MOS transistor 222 and P-type MOS transistor 223 of the pass/no-pass switch 258 illustrated in FIG. 10A to establish or cut off the connection between the two nodes N21 and N22. Further, the third type of non-volatile memory cells 700 in the pair may have their nodes N2 coupling to each other.

Referring to FIG. 15D, in a first situation, when the pass/no-pass switch 258 is being programmed to be turned on, (1) the common node N2 of the non-volatile memory cells 700 in the pair may couple to their second N-type stripes 705 switched to couple to the erasing voltage $V_{Er}$ or the programming voltage $V_{Pr}$, (2) the node N3 of the top one of the non-volatile memory cells 700 in the pair may couple to its first N-type stripe 702 switched to couple to the programming voltage $V_{Pr}$, (3) the node N3 of the bottom one of the non-volatile memory cells 700 in the pair may couple to its first N-type stripe 702 switched to couple to the voltage Vss of ground reference, (4) the nodes N4 of the non-volatile memory cells 700 in the pair may be switched to couple to the voltage Vss of ground reference. Thereby, for the bottom one of the non-volatile memory cells 700, electrons trapped in its floating gate 710 may tunnel through the gate oxide 711 to its node N2, and thus its floating gate 710 may be erased to a logic level of "1" to turn off its first and second P-type MOS transistors 730 and 740 and on its N-type MOS transistor 750; for the top one of the third type of non-volatile memory cells 700, electrons may tunnel through its gate oxide 711 from its node N4 to its floating gate 710 to be trapped in its floating gate 710, and thus its floating gate 710 may be programmed to a logic level of "0" to turn on its first and second P-type MOS transistors 730 and 740 and off its N-type MOS transistor 750.

Referring to FIG. 15D, in a second situation, when the pass/no-pass switch 258 is being programmed to be turned off, (1) the common node N2 of the non-volatile memory cells 700 in the pair may couple to their second N-type stripes 705 switched to couple to the erasing voltage $V_{Er}$ or the programming voltage $V_p$r, (2) the node N3 of the top one of the non-volatile memory cells 700 in the pair may couple to its first N-type stripe 702 switched to couple to the voltage Vss of ground reference, (3) the node N3 of the bottom one of the non-volatile memory cells 700 in the pair may couple to its first N-type stripe 702 switched to couple to the programming voltage $V_p$r, (4) the nodes N4 of the non-volatile memory cells 700 in the pair may be switched to couple to the voltage Vss of ground reference. Thereby, for the top one of the non-volatile memory cells 700, electrons trapped in its floating gate 710 may tunnel through the gate oxide 711 to its node N2, and thus its floating gate 710 may be erased to a logic level of "1" to turn off its first and second P-type MOS transistors 730 and 740 and on its N-type MOS transistor 750; for the bottom one of the third type of non-volatile memory cells 700, electrons may tunnel through its gate oxide 711 from its node N4 to its floating gate 710 to be trapped in its floating gate 710, and thus its floating gate 710 may be programmed to a logic level of "0" to turn on its first and second P-type MOS transistors 730 and 740 and off its N-type MOS transistor 750.

Referring to FIG. 15D, after the third type of non-volatile memory cells 700 in the pair are programed and erased, the third type of non-volatile memory cells 700 in the pair may be operated. In operation, (1) the common node N2 of the non-volatile memory cells 700 in the pair may couple to their second N-type stripes 705 switched to couple to a voltage between the voltage Vcc of power supply and the voltage Vss of ground reference, such as the voltage Vcc of power supply, the voltage Vss of ground reference or an half of the voltage Vcc of power supply, or switched to be floating, (2) the nodes N4 of the non-volatile memory cells 700 in the pair may be switched to couple to the voltage Vss of ground reference and (3) the nodes N3 of the non-volatile memory cells 700 in the pair may couple to their first N-type stripes 702 switched to couple to the voltage Vcc of power supply. Accordingly, for the first situation, the gate terminal, i.e., SC-1 in FIG. 10A, of the P-type MOS transistor 223 of the pass/no-pass switch 258 may couple to the node N4 of the bottom one of the non-volatile memory cells 700 in the pair at the voltage Vss of ground reference through the channel of the N-type MOS transistor 750 thereof such that the P-type MOS transistor 223 of the pass/no-pass switch 258 may be turned on, and the gate terminal, i.e., SC-2 in FIG. 10A, of the N-type MOS transistor 222 of the pass/no-pass switch 258 may couple to the node N3 of the top one of the non-volatile memory cells 700 in the pair at the voltage Vcc of power supply through the channel of the first P-type MOS transistor 730 thereof such that the N-type MOS transistor 222 of the pass/no-pass switch 258 may be turned on. Thereby, connection between the nodes N21 and N22 may be established through the pass/no-pass switch 258. For the second situation, the gate terminal, i.e., SC-1 in FIG. 10A, of the P-type MOS transistor 223 of the pass/no-pass switch 258 may couple to the node N3 of the bottom one of the non-volatile memory cells 700 in the pair at the voltage Vcc of power supply through the channel of the first P-type MOS transistor 730 thereof such that the P-type MOS transistor 223 of the pass/no-pass switch 258 may be turned off, and the gate terminal, i.e., SC-2 in FIG. 10A, of the N-type MOS transistor 222 of the pass/no-pass switch may couple to the node N4 of the top one of the non-volatile memory cells 700 in the pair at the voltage Vss of ground reference through the channel of the N-type MOS transistor 750 thereof such that the N-type MOS transistor 222 of the pass/no-pass switch 258 may be turned off. Thereby, connection between the nodes N21 and N22 may be cut off by the pass/no-pass switch 258.

Figure 15E:
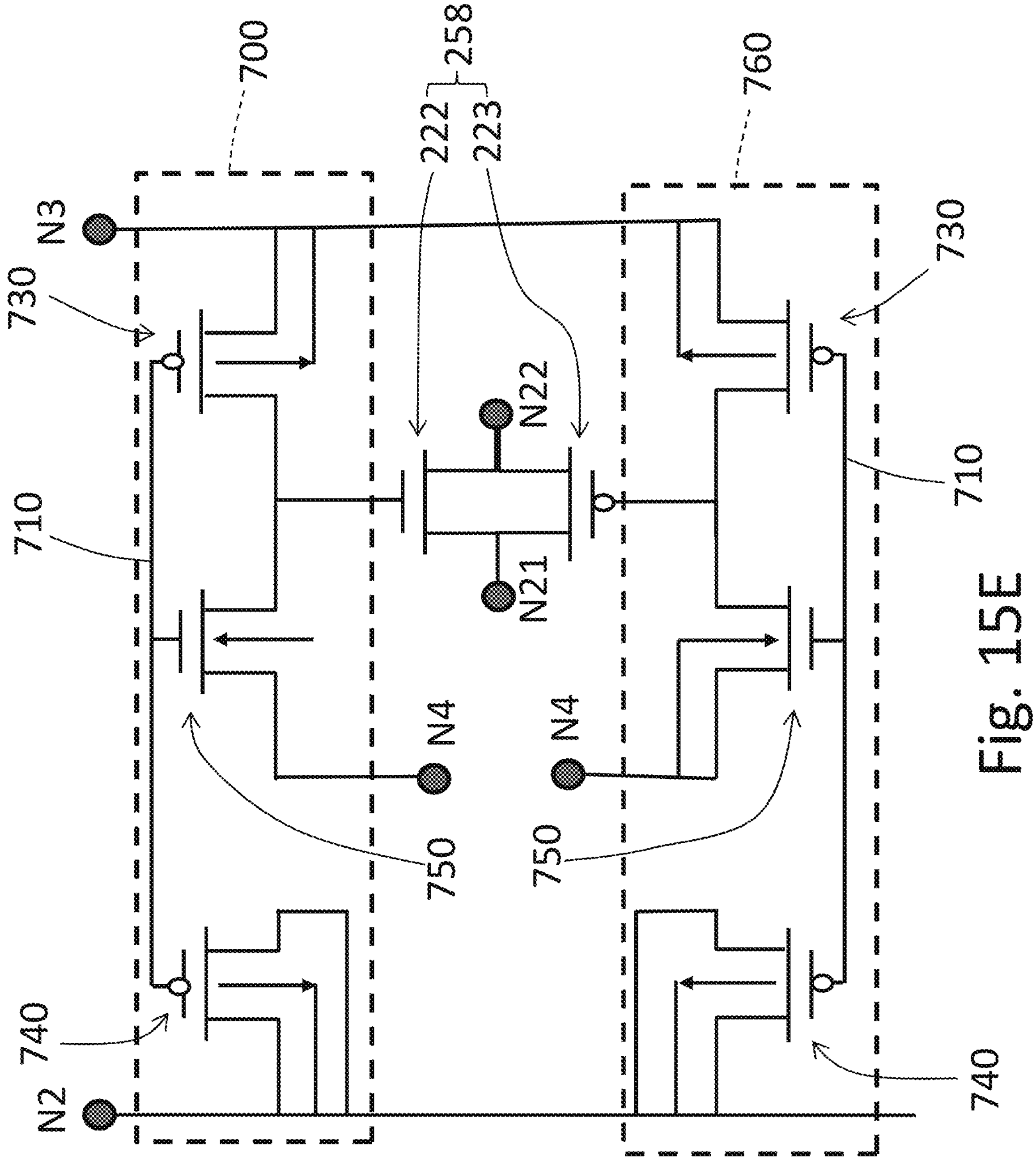
FIG. 15E is a circuit diagram showing a pair of the third and fourth types of non-volatile memory cells having output coupling to a pass/no-pass switch to switch on or off the pass/no-pass switch in accordance with an embodiment of the present application.

FIG. 15E is a circuit diagram showing a pair of the third and fourth types of non-volatile memory cells having output coupling to a pass/no-pass switch to switch on or off the pass/no-pass switch in accordance with an embodiment of the present application. For an element indicated by the same reference number shown in FIGS. 3A, 3B, 3C, 4A, 4B, 4C, 15D and 15E, the specification of the element as seen in FIG. 15E may be referred to that of the element as illustrated in FIGS. 3A, 3B, 3C, 4A, 4B, 4C and 15D. Referring to FIG. 15E, a pair of the third and fourth types of non-volatile memory cells 700 and 760 may have two respective outputs at their nodes N0 each coupling to the gate terminal of one of the N-type MOS transistor 222 and P-type MOS transistor 223 of the pass/no-pass switch 258 illustrated in FIG. 10A to establish or cut off the connection between the two nodes N21 and N22. Further, the third and fourth types of non-volatile memory cells 700 and 760 in the pair may have their nodes N2 coupling to each other. The third and fourth types of non-volatile memory cells 700 and 760 in the pair may have their nodes N3 coupling to each other.

Referring to FIG. 15E, in a preprogramming state, (1) the common node N2 of the non-volatile memory cells 700 and 760 in the pair may couple to their second N-type stripes 705 switched to couple to the programming voltage $V_p$, (2) the common node N3 of the non-volatile memory cells 700 and 760 in the pair may couple to their first N-type stripes 702 switched to couple to the programming voltage $V_{Pr}$ and (3) the nodes N4 of the non-volatile memory cells 700 and 760 in the pair may be switched to couple to the voltage Vss of ground reference. Thereby, for said each of the non-volatile memory cells 700 and 760 in the pair, electrons may tunnel through the gate oxide 711 from its node N4 to its floating gate 710 to be trapped in its floating gate 710, and thus its floating gate 710 may be programmed to a logic level of "0".

Referring to FIG. 15E, after the preprogramming state, for a first situation when the pass/no-pass switch 258 is being programmed to be turned on, (1) the common node N2 of the non-volatile memory cells 700 and 760 in the pair may couple to their second N-type stripes 705 switched to couple to the voltage Vss of ground reference, (2) the common node N3 of the non-volatile memory cells 700 and 760 in the pair may couple to their first N-type stripes 702 switched to couple to the erasing voltage $V_{Er}$ and (3) the nodes N4 of the non-volatile memory cells 700 and 760 in the pair may be switched to couple to the voltage Vss of ground reference. Thereby, for the non-volatile memory cell 760 in the pair, electrons trapped in its floating gate 710 may tunnel through the gate oxide 711 to its node N3, and thus its floating gate 710 may be erased to a logic level of "1" to turn off its first and second P-type MOS transistors 730 and 740 and on its N-type MOS transistor 750; for the non-volatile memory cell 700 in the pair, its floating gate 710 may retain at a logic level of "0" to turn on its first and second P-type MOS transistors 730 and 740 and off its N-type MOS transistor 750.

Referring to FIG. 15E, after the preprogramming state, for a second situation when the pass/no-pass switch 258 is being programmed to be turned off, (1) the common node N2 of the non-volatile memory cells 700 and 760 in the pair may couple to their second N-type stripes 705 switched to couple to the erasing voltage $V_E$r, (2) the common node N3 of the non-volatile memory cells 700 and 760 in the pair may couple to their first N-type stripes 702 switched to couple to the voltage Vss of ground reference and (3) the nodes N4 of the non-volatile memory cells 700 and 760 in the pair may be switched to couple to the voltage Vss of ground reference. Thereby, for the non-volatile memory cell 700 in the pair, electrons trapped in its floating gate 710 may tunnel through the gate oxide 711 to its node N2, and thus its floating gate 710 may be erased to a logic level of "1" to turn off its first and second P-type MOS transistors 730 and 740 and on its N-type MOS transistor 750; for the non-volatile memory cell 760 in the pair, its floating gate 710 may retain at a logic level of "0" to turn on its first and second P-type MOS transistors 730 and 740 and off its N-type MOS transistor 750.

Referring to FIG. 15E, after the non-volatile memory cells 700 and 760 in the pair are programed and erased, the non-volatile memory cells 700 and 760 in the pair may be operated. In operation, (1) the common node N2 of the non-volatile memory cells 700 and 760 in the pair may couple to their second N-type stripes 705 switched to couple to a voltage between the voltage Vcc of power supply and the voltage Vss of ground reference, such as the voltage Vcc of power supply, the voltage Vss of ground reference or an half of the voltage Vcc of power supply, or switched to be floating, (2) the nodes N4 of the non-volatile memory cells 700 and 760 in the pair may be switched to couple to the voltage Vss of ground reference and (3) the common node N3 of the non-volatile memory cells 700 and 760 in the pair may couple to their first N-type stripes 702 switched to couple to the voltage Vcc of power supply. Accordingly, for the first situation, the gate terminal, i.e., SC-1 in FIG. 10A, of the P-type MOS transistor 223 of the pass/no-pass switch 258 may couple to the node N4 of the non-volatile memory cell 760 in the pair at the voltage Vss of ground reference through the channel of the N-type MOS transistor 750 thereof such that the P-type MOS transistor 223 of the pass/no-pass switch 258 may be turned on, and the gate terminal, i.e., SC-2 in FIG. 10A, of the N-type MOS transistor 222 of the pass/no-pass switch 258 may couple to the node N3 of the non-volatile memory cell 700 in the pair at the voltage Vcc of power supply through the channel of the first P-type MOS transistor 730 thereof such that the N-type MOS transistor 222 of the pass/no-pass switch 258 may be turned on. Thereby, connection between the nodes N21 and N22 may be established through the pass/no-pass switch 258. For the second situation, the gate terminal, i.e., SC-1 in FIG. 10A, of the P-type MOS transistor 223 of the pass/no-pass switch 258 may couple to the node N3 of the non-volatile memory cell 760 in the pair at the voltage Vcc of power supply through the channel of the first P-type MOS transistor 730 thereof such that the P-type MOS transistor 223 of the pass/no-pass switch 258 may be turned off, and the gate terminal, i.e., SC-2 in FIG. 10A, of the N-type MOS transistor 222 of the pass/no-pass switch may couple to the node N4 of the non-volatile memory cell 700 in the pair at the voltage Vss of ground reference through the channel of the N-type MOS transistor 750 thereof such that the N-type MOS transistor 222 of the pass/no-pass switch 258 may be turned off. Thereby, connection between the nodes N21 and N22 may be cut off by the pass/no-pass switch 258.

Figure 15F:
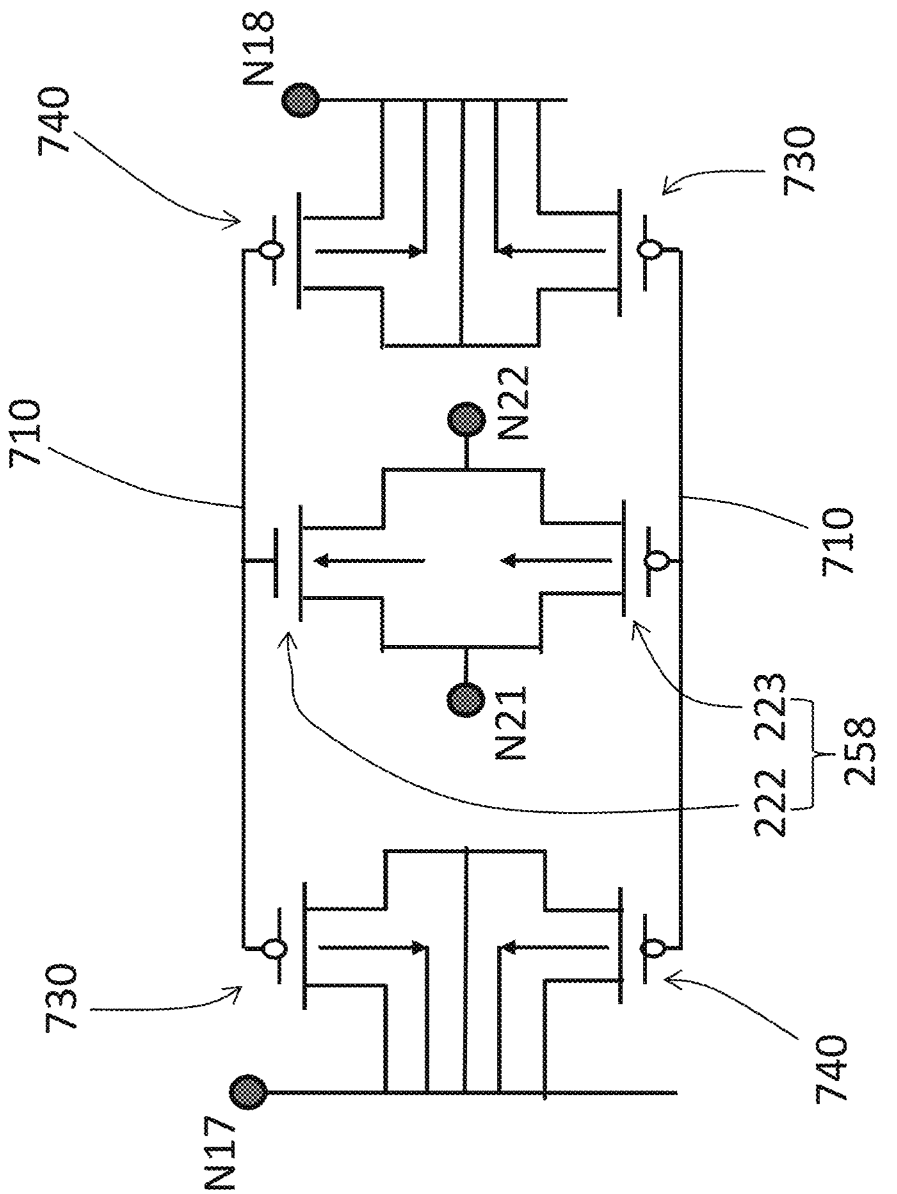
FIG. 15F is a circuit diagram showing a pair of the third type of non-volatile memory cells provides a pair of N-type and P-type MOS transistors for a pass/no-pass switch in accordance with an embodiment of the present application.

FIG. 15F is a circuit diagram showing a pair of the third type of non-volatile memory cells provides a pair of N-type and P-type MOS transistors for a pass/no-pass switch in accordance with an embodiment of the present application. For an element indicated by the same reference number shown in FIGS. 3A, 3B, 3C, 3T, 3U, 3V, 3W, 10A. 15A and 15F, the specification of the element as seen in FIG. 15F may be referred to that of the element as illustrated in FIGS. 3A, 3B, 3C, 3T, 3U, 3V, 3W, 10A and 15A. Referring to FIG. 15F, a top one of the non-volatile memory cell 700 of the third type may have the same structure as illustrated in FIG. 3T; a bottom one of the non-volatile memory cell 700 of the third type may have the same structure as illustrated in FIGS. 3U, 3V and 3W. The N-type MOS transistor 222 illustrated in FIG. 10A may be provided by the N-type MOS transistor 750 illustrated in FIG. 3T, and the P-type MOS transistor 223 illustrated in FIG. 10A may be provided by the P-type MOS transistor 764 illustrated in FIG. 3U. The N-type MOS transistor 750 illustrated in FIG. 3T may have its node N6 coupling to the node N6 of the P-type MOS transistor 764 illustrated in FIG. 3U so as to form the common node N21 of the pass/no-pass switch 258. The N-type MOS transistor 750 illustrated in FIG. 3T may have its node N7 coupling to the node N7 of the P-type MOS transistors 764 illustrated in FIG. 3U so as to form the common node N22 of the pass/no-pass switch 258.

Referring to FIGS. 15A and 15F, one of the programmable interconnects 361 may couple to the node N21 of the pass/no-pass switch 258, and another of the programmable interconnects 361 may couple to the node N22 of the pass/no-pass switch 258. The N-type MOS transistor 222 may have its node SC-2 coupling to the floating gate 710 of the non-volatile memory cell 700 of the third type illustrated in FIG. 3T, and the P-type MOS transistor 223 may have its node SC-1 coupling to the floating gate 710 of the non-volatile memory cell 700 of the third type illustrated in FIG. 3U. Further, referring to FIG. 15F, the top one of the non-volatile memory cells 700 as illustrated in FIG. 3T may have its node N2 coupling to the node N3 of the bottom one of the non-volatile memory cells 700 as illustrated in FIG. 3U, acting as a common node N17 herein. The top one of the non-volatile memory cells 700 as illustrated in FIG. 3T may have its node N3 coupling to the node N2 of the bottom one of the non-volatile memory cells 700 as illustrated in FIG. 3U, acting as a node N18 herein.

Referring to FIG. 15F, when the pass/no-pass switch 258 is being programmed to be turned on, (1) the common node N17 may be switched to couple to the erasing voltage $V_{Er}$ or the programming voltage $V_p$, and (2) the common node N18 may be switched to couple to the voltage Vss of ground reference. Thereby, for the top one of the non-volatile memory cells 700 in the pair, electrons trapped in its floating gate 710 may tunnel through the gate oxide 711 to the node N17, and thus its floating gate 710 may be erased to a logic level of "1" to turn on its N-type MOS transistor 222; for the bottom one of the non-volatile memory cells 700 in the pair, electrons may tunnel through its gate oxide 711 from the node 18 to its floating gate 710 to be trapped in its floating gate 710, and thus its floating gate 710 may be programmed to a logic level of "0" to turn on its third P-type MOS transistor 223. Thereby, the pass/no-pass switch 258 may be turned on and the connection between the nodes N21 and N22 may be established through the pass/no-pass switch 258.

Referring to FIG. 15F, when the pass/no-pass switch 258 is being programmed to be turned off, (1) the common node N18 may be switched to couple to the erasing voltage $V_{Er}$ or the programming voltage $V_p$, and (2) the common node N17 may be switched to couple to the voltage Vss of ground reference. Thereby, for the bottom one of the non-volatile memory cells 700 in the pair, electrons trapped in its floating gate 710 may tunnel through the gate oxide 711 to the node 18, and thus its floating gate 710 may be erased to a logic level of "1" to turn off its third P-type MOS transistor 223; for the top one of the non-volatile memory cells 700 in the pair, electrons may tunnel through its gate oxide 711 from the node 17 to its floating gate 710 to be trapped in its floating gate 710, and thus its floating gate 710 may be programmed to a logic level of "0" to turn off its N-type MOS transistor 222. Thereby, the pass/no-pass switch 258 may be turned off and the connection between the nodes N21 and N22 may be cut off by the pass/no-pass switch 258.

For elaborating the erasing, programming and operating steps for the above-mentioned all embodiments, the erasing voltage $V_{Er}$ may be greater than or equal to the programming voltage $V_p$, greater than or equal to the voltage Vcc of power supply greater than the voltage Vss of ground reference.

Specification for Fixed Interconnect

Before the memory cells 490 for the look-up table (LUT) 210 as seen in FIG. 14A or 14H and the memory cells 362 for the programmable interconnects 361 as seen in FIGS. 15A-15C are programmed or when the memory cells 490 for the look-up table (LUT) 210 and the memory cells 362 for the programmable interconnects 361 are being programmed, multiple fixed interconnects 364 that are not field programmable may be provided for signal transmission or power/ground delivery to (1) the memory cells 490 of the look-up table (LUT) 210 of the programmable logic block (LB) 201 as seen in FIG. 14A or 14H for programming the memory cells 490 and/or (2) the memory cells 362 as seen in FIGS. 15A-15C for the programmable interconnects 361 for programming the memory cells 362. After the memory cells 490 for the look-up table (LUT) 210 and the memory cells 362 for the programmable interconnects 361 are programmed, the fixed interconnects 364 may be used for signal transmission or power/ground delivery in operation.

Figure 16A:
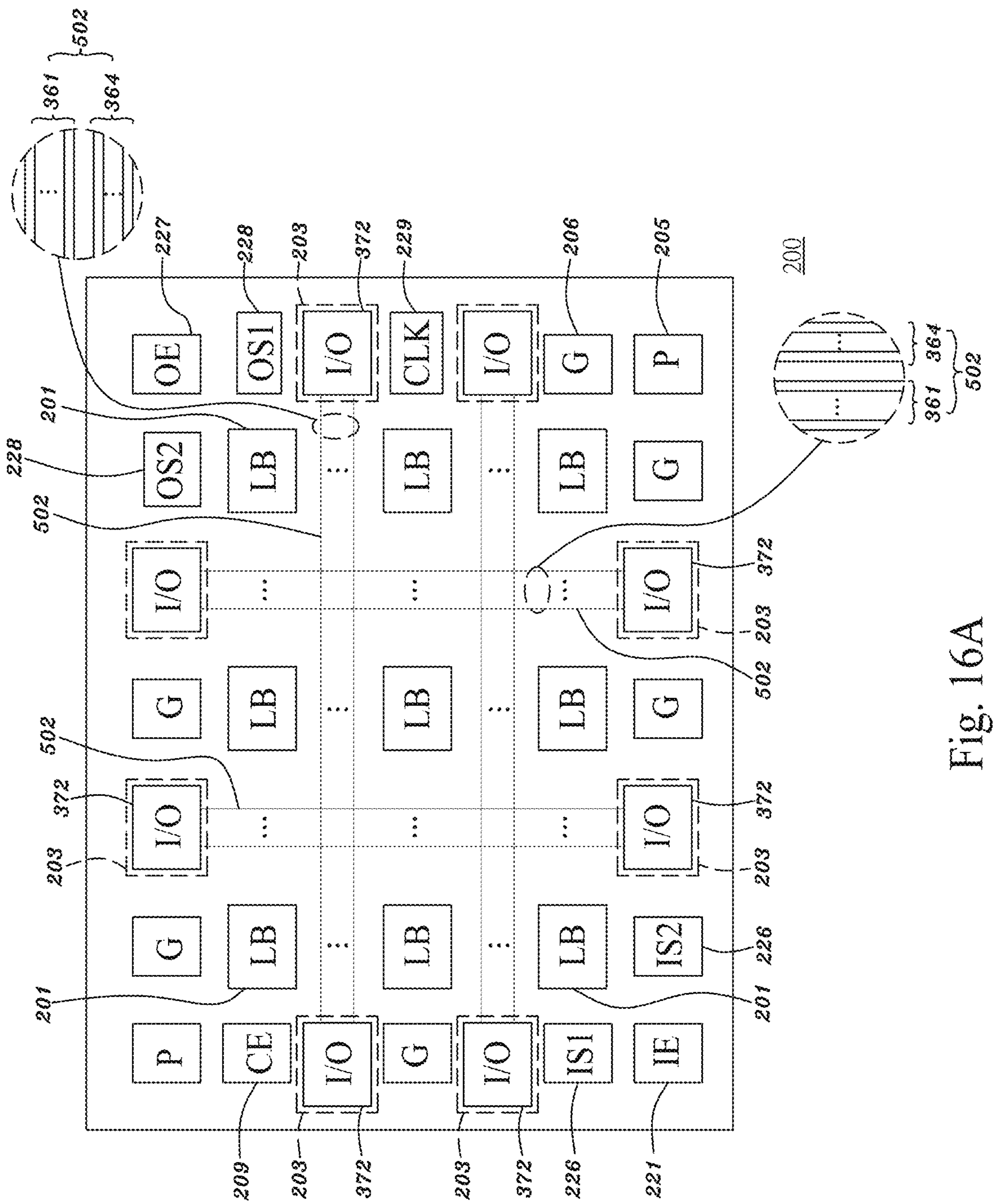
FIGS. 16A-16H are schematically top views showing various arrangements for a standard commodity FPGA IC chip in accordance with an embodiment of the present application.

Specification for Standard Commodity Field-Programmable-Gate-Array (FPGA) Integrated-Circuit (IC) Chip FIG. 16A is a schematically top view showing a block diagram of a standard commodity FPGA IC chip in accordance with an embodiment of the present application. Referring to FIG. 16A, a standard commodity FPGA IC chip 200 is designed, implemented and fabricated using an advanced semiconductor technology node or generation, for example more advanced than or equal to, or below or equal to 20 nm or 10 nm, and for example using the technology node of 16 nm, 14 nm, 12 nm, 10 nm, 7 nm, 5 nm or 3 nm; with a chip size and manufacturing yield optimized with the minimum manufacturing cost for the used semiconductor technology node or generation. The standard commodity FPGA IC chip 200 may have an area between 400 $mm^2$ and 9 $mm^2$, 144 $mm^2$ and 16 $mm^2$, 75 $mm^2$ and 16 $mm^2$, or 50 $mm^2$ and 16 $mm^2$. Transistors or semiconductor devices of the standard commodity FPGA IC chip 200 used in the advanced semiconductor technology node or generation may be a FIN Field-Effect-Transistor (FINFET), a FINFET on Silicon-On-Insulator (FINFET SOI), a Fully Depleted Silicon-On-Insulator (FDSOI) MOSFET, a Partially Depleted Silicon-On-Insulator (PDSOI) MOSFET or a conventional MOSFET. None or minimal area of the standard commodity FPGA IC chip 200 may be used for the control or I/O circuits, for example, less than 15%, 10%, 5%, 2% or 1% area may be used for the control or IO circuits; alternatively, none or minimal transistors of the standard commodity FPGA IC chip 200 may be used for the control or I/O circuits, for example, less than 15%, 10%, 5%, 2% or 1% of the total number of transistors may be used for the control or I/O circuits.

Referring to FIG. 16A, since the standard commodity FPGA IC chip 200 is a standard commodity IC chip, the number of types of products for the standard commodity FPGA IC chip 200 may be reduced to a small number, and therefore expensive photo masks or mask sets for fabricating the standard commodity FPGA IC chip 200 using advanced semiconductor nodes or generations may be reduced to a few mask sets. For example, the mask sets for a specific technology node or generation may be reduced down to between 3 and 20, 3 and 10, or 3 and 5. Its NRE and production expenses are therefore greatly reduced. With the few types of products for the standard commodity FPGA IC chip 200, the manufacturing processes may be optimized to achieve very high manufacturing chip yields. Furthermore, the chip inventory management becomes easy, efficient and effective, therefore resulting in a relatively short chip delivery time and becoming very cost-effective.

Referring to FIG. 16A, the standard commodity FPGA IC chip 200 may be of various types, including (1) multiple of the programmable logic blocks (LB) 201 as illustrated in FIG. 14A-14J arranged in an array in a central region thereof, (2) multiple cross-point switches 379 as illustrated in FIGS. 11A-11D and 15A-15F arranged around each of the programmable logic blocks (LB) 201, (3) multiple intra-chip interconnects 502 each extending over spaces between neighboring two of the programmable logic blocks 201, and (4) multiple of the small input/output (I/O) circuits 203, as illustrated in FIG. 13B, each having its output S_Data_in coupling to one or more of the intra-chip interconnects 502 and its input S_Data_out, S_Enable or S_Inhibit coupling to another one or more of intra-chip interconnects 502.

Referring to FIG. 16A, the intra-chip interconnects 502 may be divided into the programmable interconnects 361 and fixed interconnects 364 as illustrated in FIG. 15A-15C. For the standard commodity FPGA IC chip 200, each of the small input/output (I/O) circuits 203, as illustrated in FIG. 13B, may have its output S_Data_in coupling to one or more of the programmable interconnects 361 and/or one or more of the fixed interconnects 364 and its input S_Data_out, S_Enable or S_Inhibit coupling to another one or more of the programmable interconnects 361 and/or another one or more of the fixed interconnects 364.

Referring to FIG. 16A, each of the programmable logic blocks (LB) 201 as illustrated in FIG. 14A or 14H may have its inputs A0-A3 each coupling to one or more of the programmable interconnects 361 of the intra-chip interconnects 502 and/or one or more of the fixed interconnects 364 of the intra-chip interconnects 502 and may be configured to perform logic operation or computation operation on its inputs into its output Dout, C0, C1, C2 or C3 coupling to another one or more of the programmable interconnects 361 of the intra-chip interconnects 502 and/or another one or more of the fixed interconnects 364 of the intra-chip interconnects 502, wherein the computation operation may include an addition, subtraction, multiplication or division operation, and the logic operation may include a Boolean operation such as AND, NAND, OR or NOR operation. All or most area of the standard commodity FPGA IC chip 200 may be used for the programmable logic blocks (LB) 201 and programmable interconnection for the programmable interconnects 361. For example, greater than 85%, 90%, 95% or 99% area thereof is used for the programmable logic blocks (LB) 201 and programmable interconnection for the programmable interconnects 361; alternatively, all or most transistors of the standard commodity FPGA IC chip 200 may be used for the programmable logic blocks (LB) 201 and programmable interconnection for the programmable interconnects 361 and, for example, greater than 85%, 90%, 95% or 99% of the total number of transistors thereof may be used for the programmable logic blocks (LB) 201 and programmable interconnection for the programmable interconnects 361.

Referring to FIG. 16A, the standard commodity FPGA IC chip 200 may include multiple of the I/O pads 372 as seen in FIG. 13B, each vertically over one of its small input/output (I/O) circuits 203, coupling to the node 381 of said one of the small input/output (I/O) circuits 203. In a first clock, the output Dout, C0, C1, C2 or C3 of one of the programmable logic blocks 201 as illustrated in FIG. 14A or 14H may be transmitted to the input S_Data_out of the small driver 374 of one of the small input/output (I/O) circuits 203 through one or more of the programmable interconnects 361 and/or one or more of the cross-point switches 379 each between two of said one or more of the programmable interconnects 361 joining said each thereof, and then the small driver 374 of said one of the small input/output (I/O) circuits 203 may amplify its input S_Data_out to be transmitted to one of the I/O pads 372 vertically over said one of the small input/output (I/O) circuits 203 for external connection to circuits outside the standard commodity FPGA IC chip 200. In a second clock, a signal from circuits outside the standard commodity FPGA IC chip 200 may be transmitted to the small receiver 375 of said one of the small input/output (I/O) circuits 203 through said one of the I/O pads 372, and then the small receiver 375 of said one of the small input/output (I/O) circuits 203 may amplify the signal into its output S_Data_in to be transmitted to one of the inputs A0-A3 of another of the programmable logic blocks 201 as illustrated in FIG. 14A or 14H through another one or more of the programmable interconnects 361 and/or one or more of the cross-point switches 379 each between two of said another one or more of the programmable interconnects 361 joining said each thereof.

Referring to FIG. 16A, the standard commodity FPGA IC chip 200 may be provided with a plurality of the small input/output (I/O) circuit 203 as seen in FIG. 13B, having the number of $2^n$ where n may be an integer ranger from 2 to 8, arranged in parallel for each of multiple input/output (I/O) ports of the standard commodity FPGA IC chip 200. The I/O ports of the standard commodity FPGA IC chip 200 may have the number of $2^n$ where n may be an integer ranger from 1 to 5. For an example, the I/O ports of the standard commodity FPGA IC chip 200 may have the number of four and may be defined as first, second, third and fourth I/O ports respectively. Each of the first, second, third and fourth I/O ports of the standard commodity FPGA IC chip 200 may have sixty four small input/output (I/O) circuits 203, each of which may be referred to one as seen in FIG. 13B, for receiving or transmitting data in a bit width of 64 bits from or to the circuits outside of the standard commodity FPGA IC chip 200.

Referring to FIG. 16A, the standard commodity FPGA IC chip 200 may further include a chip-enable (CE) pad 209 configured for enabling or disabling the standard commodity FPGA IC chip 200. For example, when a logic level of "0" couples to the chip-enable (CE) pad 209, the standard commodity FPGA IC chip 200 may be enabled to process data and/or operate with circuits outside of the standard commodity FPGA IC chip 200; when a logic level of "1" couples to the chip-enable (CE) pad 209, the standard commodity FPGA IC chip 200 may be disabled not to process data and/or operate with circuits outside of the standard commodity FPGA IC chip 200.

Referring to FIG. 16A, for the standard commodity FPGA IC chip 200, it may further include (1) an input-enable (IE) pad 221 coupling to the first input of the small receiver 375 of each of its small input/output (I/O) circuits 203 as seen in FIG. 13B, configured for receiving the S_Inhibit signal from the circuits outside of it to activate or inhibit the small receiver 375 of each of its small input/output (I/O) circuits 203 for each of its I/O ports; and (2) multiple input selection (IS) pads 226 configured for selecting one from its I/O ports to receive data, i.e., S_Data_in illustrated in FIG. 13B, via the metal pads 372 of the selected one of its I/O ports from the circuits outside of it. For the example, for the standard commodity FPGA IC chip 200, its input selection (IS) pads 226 may have the number of two, e.g., IS1 and IS2 pads, for selecting one from its first, second, third and fourth I/O ports to receive data in the bit width of 64 bits, i.e., S_Data_in illustrated in FIG. 13B, via the 64 parallel metal pads 372 of the selected one of its first, second, third and fourth I/O ports from the circuits outside of it. Provided that (1) a logic level of "0" couples to the chip-enable (CE) pad 209, (2) a logic level of "1" couples to the input-enable (IE) pad 221, (3) a logic level of "0" couples to the IS1 pad 226 and (4) a logic level of "0" couples to the IS2 pad 226, the standard commodity FPGA IC chip 200 is enabled to activate the small receivers 375 of its small input/output (I/O) circuits 203 for its first, second, third and fourth I/O ports and to select its first one from its first, second, third and fourth I/O ports for receiving the data in the bit width of 64 bits via the 64 parallel metal pads 372 of its first I/O port from the circuits outside of the standard commodity FPGA IC chip 200, wherein its second, third and fourth I/O ports are not selected to receive the data from the circuits outside of the standard commodity FPGA IC chip 200. Provided that (1) a logic level of "0" couples to the chip-enable (CE) pad 209, (2) a logic level of "1" couples to the input-enable (IE) pad 221, (3) a logic level of "1" couples to the IS1 pad 226 and (4) a logic level of "0" couples to the IS2 pad 226, the standard commodity FPGA IC chip 200 is enabled to activate the small receivers 375 of its small input/output (I/O) circuits 203 for its first, second, third and fourth I/O ports and to select its second one from its first, second, third and fourth I/O ports for receiving the data in the bit width of 64 bits via the 64 parallel metal pads 372 of its second I/O port from the circuits outside of the standard commodity FPGA IC chip 200, wherein its first, third and fourth I/O ports are not selected to receive the data from the circuits outside of the standard commodity FPGA IC chip 200. Provided that (1) a logic level of "0" couples to the chip-enable (CE) pad 209, (2) a logic level of "1" couples to the input-enable (IE) pad 221, (3) a logic level of "0" couples to the IS1 pad 226 and (4) a logic level of "1" couples to the IS2 pad 226, the standard commodity FPGA IC chip 200 is enabled to activate the small receivers 375 of its small input/output (I/O) circuits 203 for its first, second, third and fourth I/O ports and to select its third one from its first, second, third and fourth I/O ports for receiving the data in the bit width of 64 bits via the 64 parallel metal pads 372 of its third I/O port from the circuits outside of the standard commodity FPGA IC chip 200, wherein its first, second and fourth I/O ports are not selected to receive the data from the circuits outside of the standard commodity FPGA IC chip 200. Provided that (1) a logic level of "0" couples to the chip-enable (CE) pad 209, (2) a logic level of "1" couples to the input-enable (IE) pad 221, (3) a logic level of "1" couples to the IS1 pad 226 and (4) a logic level of "1" couples to the IS2 pad 226, the standard commodity FPGA IC chip 200 is enabled to activate the small receivers 375 of its small input/output (I/O) circuits 203 for its first, second, third and fourth I/O ports and to select its fourth one from its first, second, third and fourth I/O ports for receiving the data in the bit width of 64 bits via the 64 parallel metal pads 372 of its fourth I/O port from the circuits outside of the standard commodity FPGA IC chip 200, wherein its first, second and third I/O ports are not selected to receive the data from the circuits outside of the standard commodity FPGA IC chip 200. Provided that (1) a logic level of "0" couples to the chip-enable (CE) pad 209, and (2) a logic level of "0" couples to the input-enable (IE) pad 221, the standard commodity FPGA IC chip 200 is enabled to inhibit the small receivers 375 of its small input/output (I/G) circuits 203 for its first, second, third and fourth I/G ports.

Referring to FIG. 16A, for the standard commodity FPGA IC chip 200, it may further include (1) an output-enable (OE) pad 227 coupling to the second input of the small driver 374 of each of its small input/output (I/G) circuits 203 as seen in FIG. 13B, configured for receiving the S_Enable signal from the circuits outside of it to enable or disable the small driver 374 of each of its small input/output (I/O) circuits 203 for each of its I/G ports; and (2) multiple output selection (OS) pads 228 configured for selecting one from its I/O ports to drive or pass data, i.e., S_Data_out illustrated in FIG. 13B, via the metal pads 372 of the selected one of its I/G ports to the circuits outside of it. For the example, for the standard commodity FPGA IC chip 200, its output selection (OS) pads 226 may have the number of two, e.g., OS1 and OS2 pads, for selecting one from its first, second, third and fourth I/O ports to drive or pass data in the bit width of 64 bits, i.e., S_Data_out illustrated in FIG. 13B, via the 64 parallel metal pads 372 of the selected one of its first, second, third and fourth I/G ports to the circuits outside of it. Provided that (1) a logic level of "0" couples to the chip-enable (CE) pad 209, (2) a logic level of "0" couples to the output-enable (OE) pad 227, (3) a logic level of "0" couples to the OS1 pad 228 and (4) a logic level of "0" couples to the OS2 pad 228, the standard commodity FPGA IC chip 200 is enabled to enable the small drivers 374 of its small input/output (I/G) circuits 203 for its first, second, third and fourth I/O ports and to select its first one from its first, second, third and fourth I/G ports for driving or passing the data in the bit width of 64 bits via the 64 parallel metal pads 372 of its first I/O port to the circuits outside of the standard commodity FPGA IC chip 200, wherein its second, third and fourth I/O ports are not selected to drive or pass the data to the circuits outside of the standard commodity FPGA IC chip 200. Provided that (1) a logic level of "0" couples to the chip-enable (CE) pad 209, (2) a logic level of "0" couples to the output-enable (OE) pad 227, (3) a logic level of "1" couples to the OS1 pad 228 and (4) a logic level of "0" couples to the OS2 pad 228, the standard commodity FPGA IC chip 200 is enabled to enable the small drivers 374 of its small input/output (I/O) circuits 203 for its first, second, third and fourth I/G ports and to select its second one from its first, second, third and fourth I/O ports for driving or passing the data in the bit width of 64 bits via the 64 parallel metal pads 372 of its second I/O port to the circuits outside of the standard commodity FPGA IC chip 200, wherein its first, third and fourth I/O ports are not selected to drive or pass the data to the circuits outside of the standard commodity FPGA IC chip 200. Provided that (1) a logic level of "0" couples to the chip-enable (CE) pad 209, (2) a logic level of "0" couples to the output-enable (OE) pad 227, (3) a logic level of "0" couples to the OS1 pad 228 and (4) a logic level of "1" couples to the OS2 pad 228, the standard commodity FPGA IC chip 200 is enabled to enable the small drivers 374 of its small input/output (I/O) circuits 203 for its first, second, third and fourth I/O ports and to select its third one from its first, second, third and fourth I/O ports for driving or passing the data in the bit width of 64 bits via the 64 parallel metal pads 372 of its third I/O port to the circuits outside of the standard commodity FPGA IC chip 200, wherein its first, second and fourth I/O ports are not selected to drive or pass the data to the circuits outside of the standard commodity FPGA IC chip 200. Provided that (1) a logic level of "0" couples to the chip-enable (CE) pad 209, (2) a logic level of "0" couples to the output-enable (OE) pad 227, (3) a logic level of "1" couples to the OS1 pad 228 and (4) a logic level of "1" couples to the OS2 pad 228, the standard commodity FPGA IC chip 200 is enabled to enable the small drivers 374 of its small input/output (I/O) circuits 203 for its first, second, third and fourth I/O ports and to select its fourth one from its first, second, third and fourth I/O ports for driving or passing the data in the bit width of 64 bits via the 64 parallel metal pads 372 of its fourth I/O port to the circuits outside of the standard commodity FPGA IC chip 200, wherein its first, second and third I/O ports are not selected to drive or pass the data to the circuits outside of the standard commodity FPGA IC chip 200. Provided that (1) a logic level of "0" couples to the chip-enable (CE) pad 209 and (2) a logic level of "1" couples to the output-enable (OE) pad 227, the standard commodity FPGA IC chip 200 is enabled to disable the small drivers 374 of its small input/output (I/O) circuits 203 for its first, second, third and fourth I/O ports.

Referring to FIG. 16A, the standard commodity FPGA IC chip 200 may further include (1) multiple power pads 205 for applying the voltage Vcc of power supply to the memory cells 490 configured for the look-up tables (LUT) 210 of the programmable logic blocks (LB) 201 as illustrated in FIG. 14A or 14H and/or the memory cells 362 for the cross-point switches 379 as illustrated in FIGS. 15A-15C through one or more of the fixed interconnects 364, wherein the voltage Vcc of power supply may be between 0.2V and 2.5V, between 0.2V and 2V, between 0.2V and 1.5V, between 0.1V and 1V, or between 0.2V and 1V, or, smaller or lower than or equal to 2.5V, 2V, 1.8V, 1.5V or 1V, and (2) multiple ground pads 206 configured for providing the voltage Vss of ground reference to the memory cells 490 for the look-up tables (LUT) 210 of the programmable logic blocks (LB) 201 as illustrated in FIG. 14A or 14H and/or the memory cells 362 for the cross-point switches 379 as illustrated in FIGS. 15A-15C through one or more of the fixed interconnects 364.

Referring to FIG. 16A, the standard commodity FPGA IC chip 200 may further include a clock pad 229 configured for receiving a clock signal from circuits outside of the standard commodity FPGA IC chip 200.

Referring to FIG. 16A, for the standard commodity FPGA IC chip 200, its programmable logic blocks 201 may be reconfigurable for artificial-intelligence (AI) application. For example, in a first clock, one of its programmable logic blocks 201 may have its look-up table (LUT) 201 to be programmed for OR operation as illustrated in FIGS. 14B and 14C; however, after one or more events happen, in a second clock said one of its programmable logic blocks 201 may have its look-up table (LUT) 201 to be programmed for AND operation as illustrated in FIGS. 14D and 14E for better A1 performance.

Since the standard commodity FPGA IC chip 200 may include mainly the look-up table (LUT) 210, i.e., programmable logic blocks (LB) 201, and programmable interconnection for the programmable interconnects 361, just like standard commodity DRAM, or NAND flash IC chips, the manufacturing yield thereof may be very high, for example, greater than 80%, 90% or 95% for the chip area thereof greater than, for example, 50 $mm^2$.

Figure 16B:
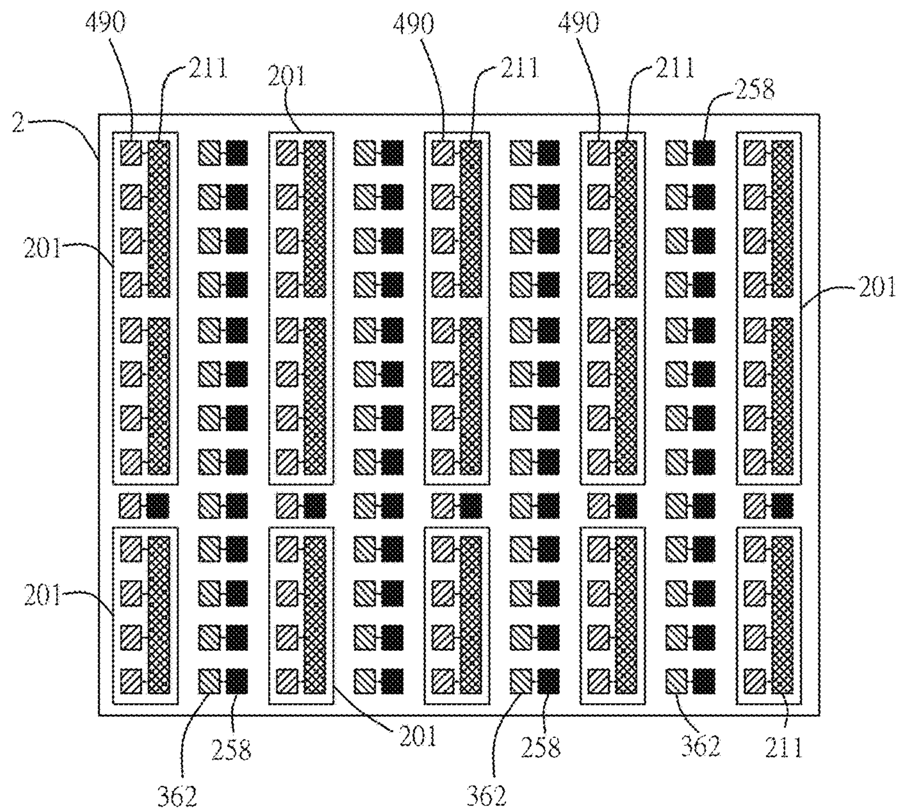

I. Arrangements for Memory Cells, Multiplexers and Pass/No-Pass Switches for Standard Commodity FPGA IC Chip FIGS. 16B-16E are schematic views showing various arrangements for (1) the memory cells 490, employed for the look-up tables 210, and the multiplexers 211 for the programmable logic blocks 201 and (2) the memory cells 362 and the pass/no-pass switches 258 for the programmable interconnects 361 in accordance with an embodiment of the present application. The pass/no-pass switches 258 may compose the first and second types of cross-point switches 379 as illustrated in FIGS. 11A and 11B respectively. The various arrangements are mentioned as below:

(1) First Arrangement for Memory Cells, Multiplexers and Pass/No-Pass Switches for Standard Commodity FPGA IC Chip Referring to FIG. 16B, for each of the programmable logic blocks 201 of the standard commodity FPGA IC chip 200, the memory cells 490 for one of its look-up tables 210 may be distributed on and/or over a first area of a semiconductor substrate 2 of the standard commodity FPGA IC chip 200, and one of its multiplexers 211 coupling to the memory cells 490 for said one of its look-up tables 210 may be distributed on and/or over a second area of the semiconductor substrate 2 of the standard commodity FPGA IC chip 200, wherein the first area is nearby or close to the second area. Each of the programmable logic blocks 201 may include one or more of multiplexers 211 and one or more groups of memory cells 490 employed for one or more of look-up tables 210 respectively and coupled to the first set of inputs, e.g., D0-D15, of said one or more of multiplexers 211 respectively, wherein each of the memory cells 490 in said one or more groups may store one of the resulting values or programming codes for said one or more of look-up tables 210 and may have an output coupling to one of the inputs of the first set, e.g., D0-D15, of said one or more of multiplexers 211.

Referring to FIG. 16B, a group of memory cells 362 employed for the programmable interconnects 361 as seen in FIG. 15A may be distributed in one or more lines between neighboring two of the programmable logic blocks 201. Also, a group of pass/no-pass switches 258 employed for the programmable interconnects 361 as seen in FIG. 15A may be distributed in one or more lines between said neighboring two of the programmable logic blocks 201. The group of pass/no-pass switches 258 and the group of memory cells 362 compose the cross-point switch 379 as seen in FIG. 11A or 11B. Each of the pass/no-pass switches 258 in the group may couple one or more of the memory cells 362 in the group.

Figure 16C:
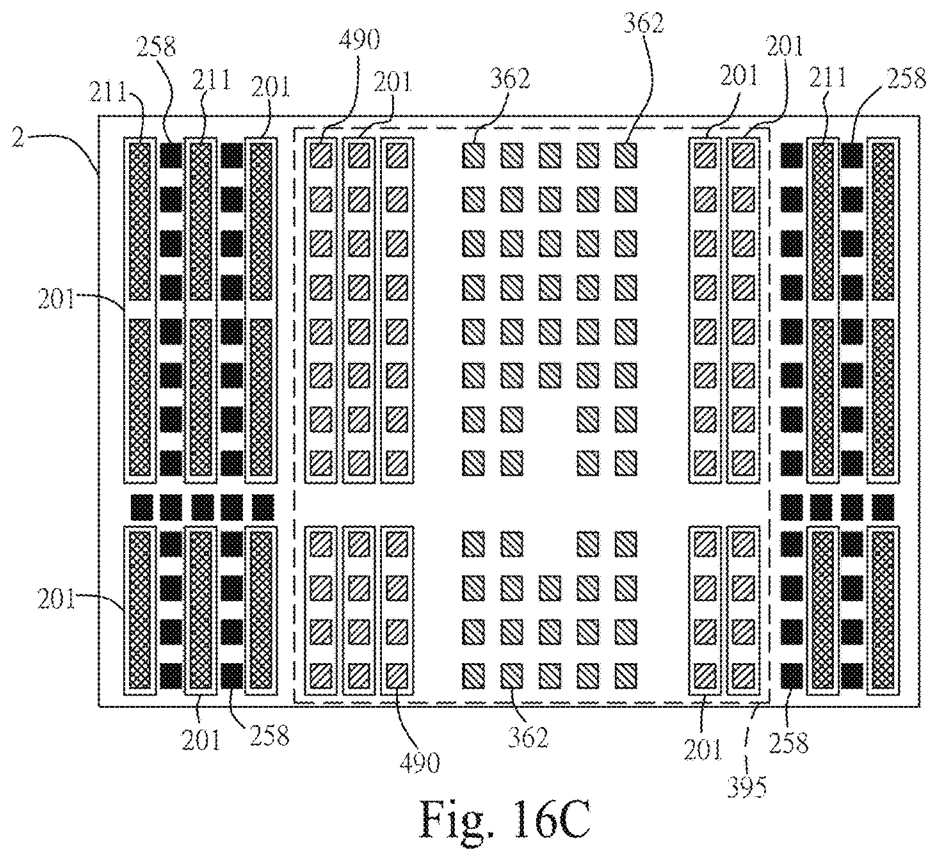

(2) Second Arrangement for Memory Cells, Multiplexers and Pass/No-Pass Switches for Standard Commodity FPGA IC Chip Referring to FIG. 16C, for the standard commodity FPGA IC chip 200, the memory cells 490 employed for all of its look-up tables 210 and the memory cells 362 employed for all of its programmable interconnects 361 may be aggregately distributed in a memory-array block 395 in a certain area of its semiconductor substrate 2. For more elaboration, for the same programmable logic block 201, the memory cells 490 employed for its one or more look-up tables (LUTs) 210 and its one or more multiplexers 211 may be arranged in two separate areas, in one of which are the memory cells 490 employed for its one or more look-up tables (LUTs) 210 and in the other one of which are its one or more multiplexers 211. The pass/no-pass switches 258 employed for programmable interconnects 361 may be distributed in one or more lines between the multiplexers 211 of neighboring two of the programmable logic blocks 201.

Figure 16D:
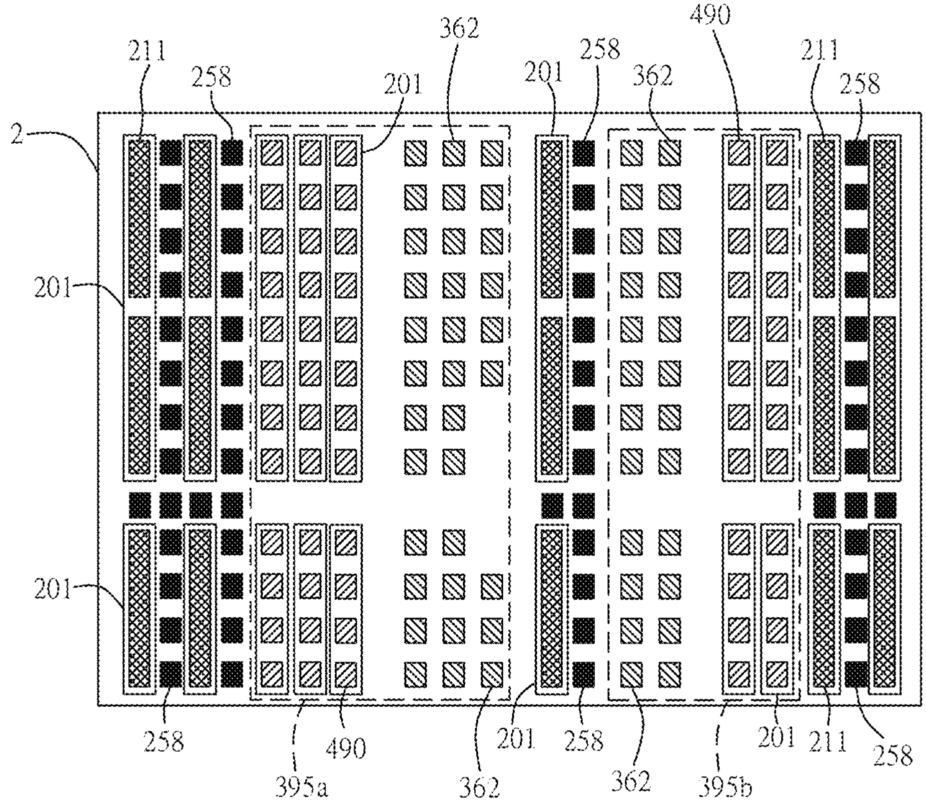

(3) Third Arrangement for Memory Cells, Multiplexers and Pass/No-Pass Switches for Standard Commodity FPGA IC Chip Referring to FIG. 16D, for the standard commodity FPGA IC chip 200, the memory cells 490 employed for all of its look-up tables 210 and the memory cells 362 employed for all of its programmable interconnects 361 may be aggregately distributed in multiple separate memory-array blocks 395*a* and 395*b* in multiple certain areas of its semiconductor substrate 2. For more elaboration, for the same programmable logic block 201, the memory cells 490 employed for its one or more look-up tables (LUTs) 210 and its one or more multiplexers 211 may be arranged in two separate areas, in one of which are the memory cells 490 employed for its one or more look-up tables (LUTs) 210 and in the other one of which are its one or more multiplexers 211. The pass/no-pass switches 258 employed for programmable interconnects 361 may be distributed in one or more lines between the multiplexers 211 of neighboring two of the programmable logic blocks 201. For the standard commodity FPGA IC chip 200, some of its multiplexers 211 and some of the pass/no-pass switches 258 may be arranged between the memory-array blocks 395*a* and 395*b*.

Figure 16E:
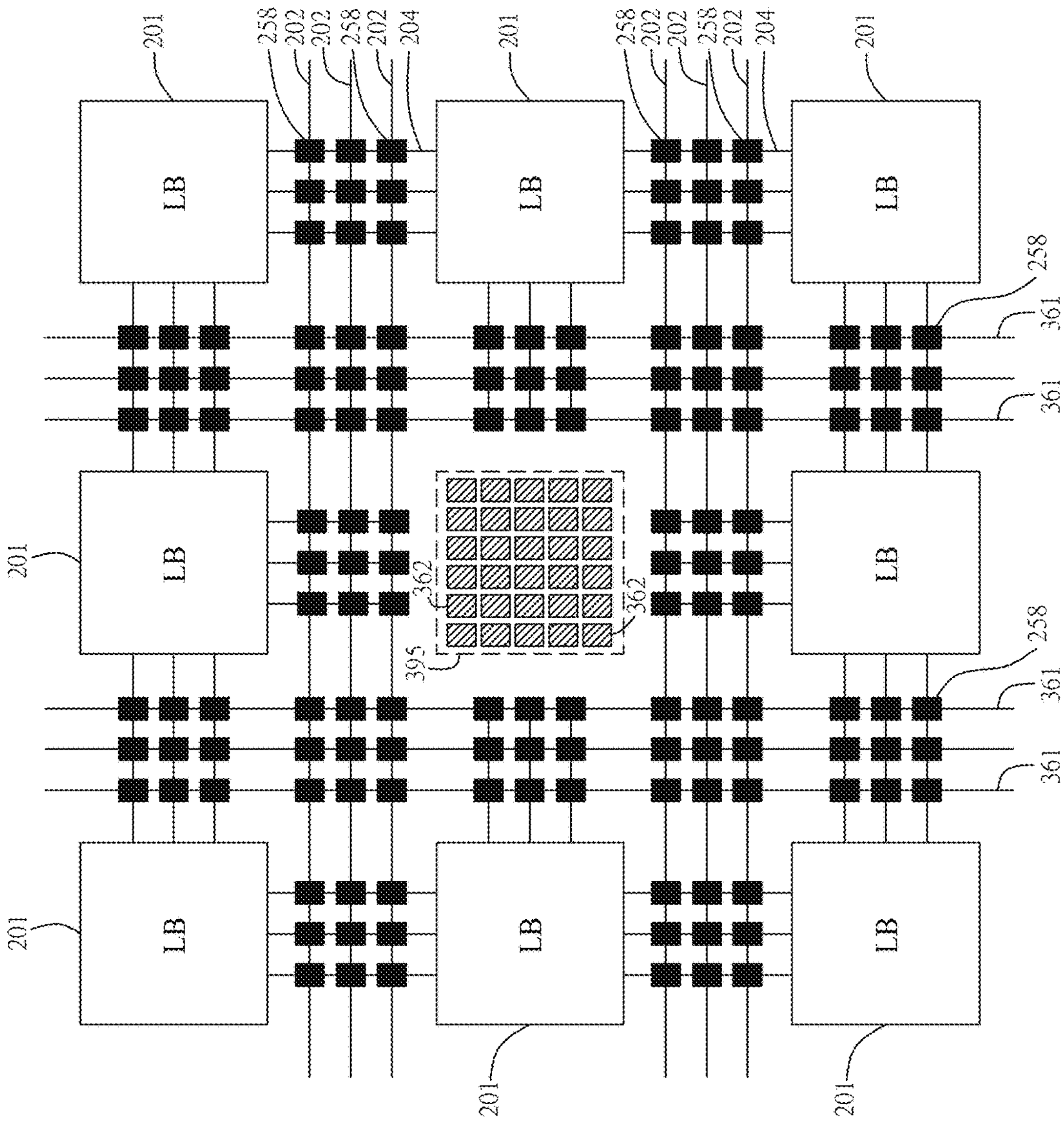

(4) Fourth Arrangement for Memory Cells, Multiplexers and Pass/No-Pass Switches for Standard Commodity FPGA IC Chip Referring to FIG. 16E, for the standard commodity FPGA IC chip 200, the memory cells 362 employed for its programmable interconnects 361 may be aggregately arranged in a memory-array block 395 in a certain area of the semiconductor substrate 2 and coupled to (1) multiple first groups of its pass/no-pass switches 258 arranged on or over its semiconductor substrate 2, wherein each of its pass/no-pass switches 258 in the first groups may be between neighboring two of its programmable logic blocks 201 in the same row or between the memory-array block 395 and one of its programmable logic blocks 201 in the same row, (2) multiple second groups of its pass/no-pass switches 258 arranged on or over its semiconductor substrate 2, wherein each of its pass/no-pass switches 258 in the second groups may be between neighboring two of its programmable logic blocks 201 in the same column or between the memory-array block 395 and one of its programmable logic blocks 201 in the same column, and (3) multiple third groups of the pass/no-pass switches 258 arranged on or over the semiconductor substrate 2, wherein each of its pass/no-pass switches 258 in the third groups may be between neighboring two of the first groups of the pass/no-pass switches 258 in the same column and between neighboring two of the second groups of the pass/no-pass switches 258 in the same row. For the standard commodity FPGA IC chip 200, each of its programmable logic blocks 201 may include one or more multiplexers 211 and one or more groups of memory cells 490 employed for one or more of look-up tables 210 respectively and coupled to the first set of inputs, e.g., D0-D15, of said one or more of multiplexers 211 respectively, as illustrated in FIG. 16B, wherein each of the memory cells 490 in said one or more groups may store one of the resulting values or programming codes for said one or more of look-up tables 210 and may have an output coupling to one of the inputs of the first set, e.g., D0-D15, of said one or more of multiplexers 211.

Figure 16F:
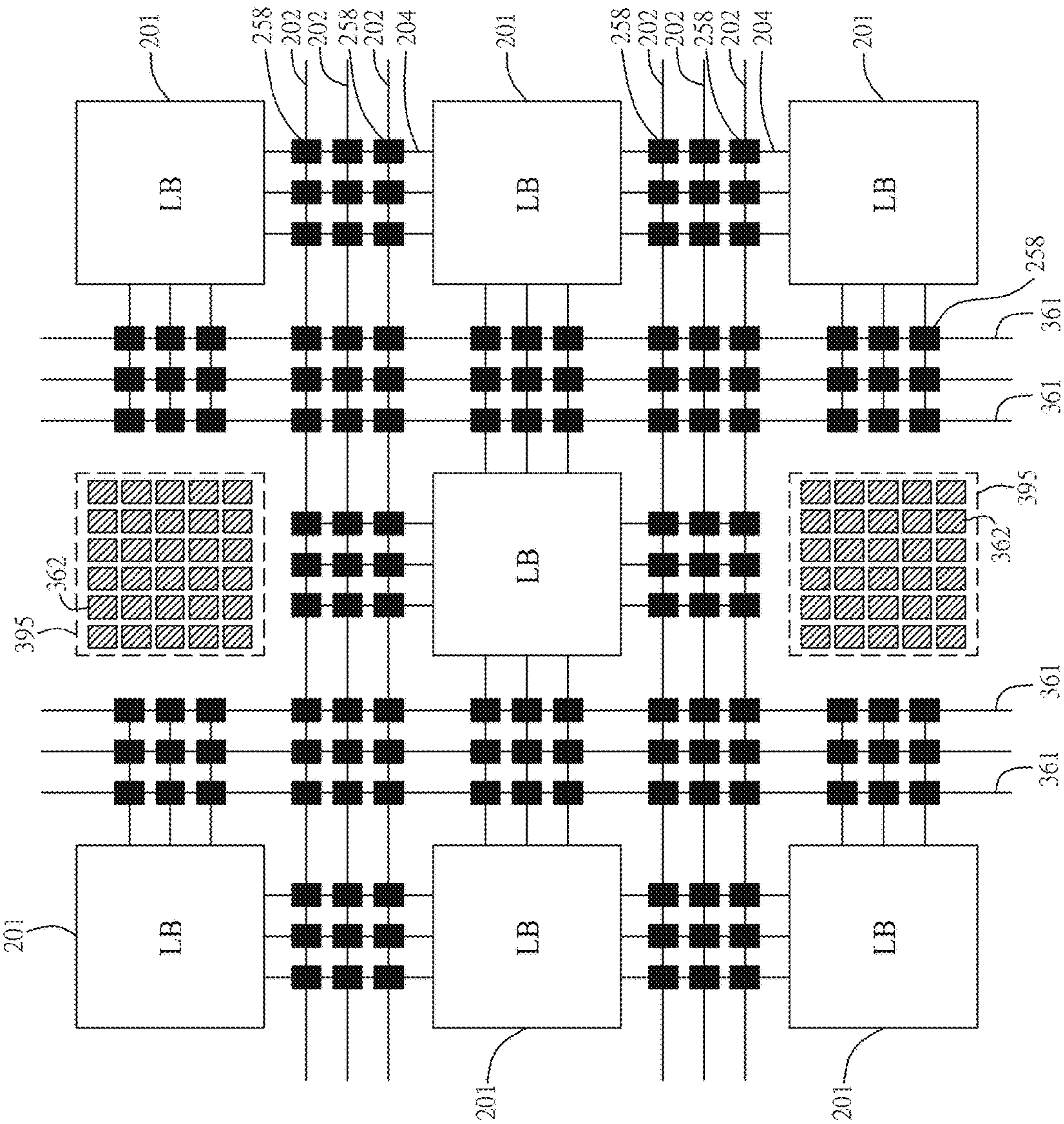

(5) Fifth Arrangement for Memory Cells, Multiplexers and Pass/No-Pass Switches for Standard Commodity FPGA IC Chip Referring to FIG. 16F, for the standard commodity FPGA IC chip 200, the memory cells 262 for the programmable interconnects 361 may be aggregately distributed in multiple memory-array blocks 395 on or over its semiconductor substrate 2 and coupled to (1) multiple first groups of its pass/no-pass switches 258 arranged on or over its semiconductor substrate 2, wherein each of its pass/no-pass switches 258 in the first groups may be between neighboring two of its programmable logic blocks 201 in the same row or between one of the memory-array blocks 395 and one of its programmable logic blocks 201 in the same row, (2) multiple second groups of its pass/no-pass switches 258 arranged on or over its semiconductor substrate 2, wherein each of its pass/no-pass switches 258 in the second groups may be between neighboring two of its programmable logic blocks 201 in the same column or between one of the memory-array blocks 395 and one of its programmable logic blocks 201 in the same column, and (3) multiple third groups of the pass/no-pass switches 258 arranged on or over the semiconductor substrate 2, wherein each of its pass/no-pass switches 258 in the third groups may be between neighboring two of the first groups of the pass/no-pass switches 258 in the same column and between neighboring two of the second groups of the pass/no-pass switches 258 in the same row. For the standard commodity FPGA IC chip 200, each of its programmable logic blocks 201 may include one or more multiplexers 211 and one or more groups of memory cells 490 employed for one or more of look-up tables 210 respectively, as illustrated in FIG. 16B, wherein each of the memory cells 490 in said one or more groups may store one of the resulting values or programming codes for said one or more of look-up tables 210 and may have an output coupling to one of the inputs of the first set, e.g., D0-D15, of said one or more of multiplexers 211. One or more of the programmable logic blocks 201 may be positioned between the memory-array blocks 395.

(6) Memory Cells for First Through Fifth Arrangements

Referring to FIGS. 16B-16F, for the standard commodity FPGA IC chip 200, each of the memory cells 490 for its look-up tables (LUTs) 210 may be (1) the non-volatile memory cell 600, 650, 700, 760 or 800 as illustrated in FIG. 1A-1H, 2A-2E, 3A-3W, 4A-4S or 5A-5F having the output N0 coupling to one of the inputs D0-D15 in the first set of the multiplexer 211 of its programmable logic block 201 as illustrated in FIG. 14A or 14H, (2) the non-volatile memory cell 900 as illustrated in FIG. 6E or 6G having the output M3 or M12 coupling to one of the inputs D0-D15 in the first set of the multiplexer 211 of its programmable logic block 201 as illustrated in FIG. 14A or 14H, (3) the non-volatile memory cell 910 as illustrated in FIG. 7E, 7G, 7H or 7J having the output M6, M15, M9 or M18 coupling to one of the inputs D0-D15 in the first set of the multiplexer 211 of its programmable logic block 201 as illustrated in FIG. 14A or 14H, or (4) the latched non-volatile memory cell 940 or 950 as illustrated in FIG. 9A or 9B having the output L3 or L12 coupling to one of the inputs D0-D15 in the first set of the multiplexer 211 of its programmable logic block 201 as illustrated in FIG. 14A or 14H. For the standard commodity FPGA IC chip 200, each of its memory cells 362 for its programmable interconnects 361 may be (1) the non-volatile memory cell 600, 650, 700, 760 or 800 as illustrated in FIG. 1A-1H, 2A-2E, 3A-3W, 4A-4S or 5A-5F having the output N0 coupling to one of its cross-point switches 379 as illustrated in FIGS. 15A-15F or one of the pass/no-pass switch 258 of its cross-point switches 379, (2) the non-volatile memory cell 900 as illustrated in FIG. 6E or 6G having the output M3 or M12 coupling to one of its cross-point switches 379 as illustrated in FIGS. 15A-15F or one of the pass/no-pass switch 258 of its cross-point switches 379, (3) the non-volatile memory cell 910 as illustrated in FIG. 7E, 7G, 7H or 7J having the output M6, M15, M9 or M18 coupling to one of its cross-point switches 379 as illustrated in FIGS. 15A-15F or one of the pass/no-pass switch 258 of its cross-point switches 379, or (4) the latched non-volatile memory cell 940 or 950 as illustrated in FIG. 9A or 9B having the output L3 or L12 coupling to one of its cross-point switches 379 as illustrated in FIGS. 15A-15F or one of the pass/no-pass switch 258 of its cross-point switches 379.

II. Arrangement for by-Pass Interconnects for Standard Commodity FPGA IC Chip

Figure 16G:
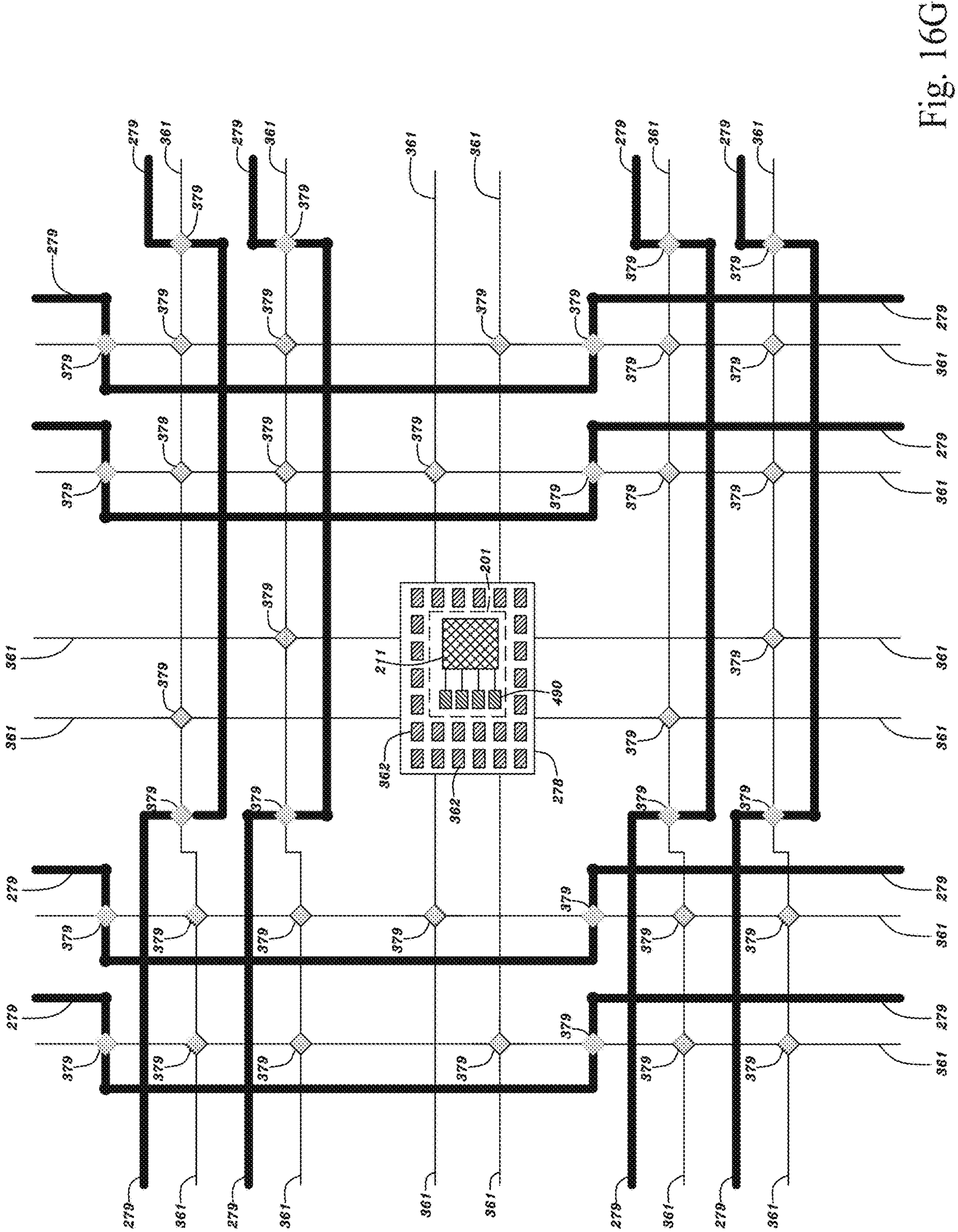

FIG. 16G is a top view showing programmable interconnects serving as by-pass interconnects in accordance with an embodiment of the present application. Referring to FIG. 16G, the standard commodity FPGA IC chip 200 may include (1) a first group of programmable interconnects 361 to serve as by-pass interconnects 279 each coupling one of the cross-point switches 379 to another far one of the cross-point switches 379 by-passing another one or more of the cross-point switches 379, each of which may be one of the cross-point switches 379 as illustrated in FIGS. 11A-11D, and (2) a second group of programmable interconnects 361 not by-passing any of the cross-point switches 379, but each of the by-pass interconnects 279 may be arranged in parallel with an aggregate of multiple of the programmable interconnects 361 in the second group configured to be coupled to each other or one another via one or more of the cross-point switches 379.

For connection between one of the by-pass interconnects 279 and one the programmable interconnects 361 in the second group, one of the cross-point switches 379 as seen in FIGS. 11A-11C may have the nodes N23 and N25 coupling respectively to two of the programmable interconnects 361 in the second group and the nodes N24 and N26 coupling respectively to two of the by-pass interconnects 279. Thereby, said one of the cross-point switches 379 may switch one selected from two of the programmable interconnects 361 in the second group and two of the by-pass interconnects 279 to be coupled to the other one or more selected from them. For example, said one of the cross-point switches 379 may switch the programmable interconnect 361 in the second group coupling to its node N23 to be coupled to the by-pass interconnect 279 coupling to its node N24. Alternatively, said one of the cross-point switches 379 may switch the programmable interconnect 361 in the second group coupling to its node N23 to be coupled to the programmable interconnect 361 in the second group coupling to its node N25. Alternatively, said one of the cross-point switches 379 may switch the by-pass interconnect 279 coupling to its node N24 to be coupled to the by-pass interconnect 279 coupling to its node N26.

For connection between two of the programmable interconnects 361 in the second group, one of the cross-point switches 379 as seen in FIGS. 11A-11C may have its four nodes N23-N26 coupling to four of the programmable interconnects 361 in the second group respectively. Thereby, said one of the cross-point switches 379 may switch one selected from said four of the programmable interconnects 361 in the second group to be coupled to another one selected from them.

Referring to FIG. 16G, for the standard commodity FPGA IC chip 200, multiple of its cross-point switches 379 surrounds a region 278, in which multiple of its memory cells 362 may be arranged, each of which may be referred to (1) the non-volatile memory cell 600, 650, 700, 760 or 800 as illustrated in FIG. 1A-1H, 2A-2E, 3A-3W, 4A-4S or 5A-5F having the output N0 coupling to one of said multiple of its cross-point switches 379 as illustrated in FIGS. 15A-15F or one of the pass/no-pass switches 258 of said one of its cross-point switches 379, (2) the non-volatile memory cell 900 as illustrated in FIG. 6E or 6G having the output M3 or M12 coupling to one of said multiple of its cross-point switches 379 as illustrated in FIGS. 15A-15F or one of the pass/no-pass switches 258 of said one of its cross-point switches 379, (3) the non-volatile memory cell 910 as illustrated in FIG. 7E, 7G, 7H or 7J having the output M6, M15, M9 or M18 coupling to one of said multiple of its cross-point switches 379 as illustrated in FIGS. 15A-15F or one of the pass/no-pass switches 258 of said one of its cross-point switches 379, or (4) the latched non-volatile memory cell 940 or 950 as illustrated in FIG. 9A or 9B having the output L3 or L12 coupling to one of said multiple of its cross-point switches 379 as illustrated in FIGS. 15A-15F or one of the pass/no-pass switches 258 of said one of its cross-point switches 379. For the standard commodity FPGA IC chip 200, in the region 278 are further multiple of its memory cells 490 for the look-up table (LUT) 210 of its programmable logic block 201, each of which may be referred to (1) the non-volatile memory cell 600, 650, 700, 760 or 800 as illustrated in FIG. 1A-1H, 2A-2E, 3A-3W, 4A-4S or 5A-5F having the output N0 coupling to one of the inputs D0-D15 in the first set of the multiplexer 211 of its programmable logic block 201 therein as illustrated in FIG. 14A or 14H, (2) the non-volatile memory cell 900 as illustrated in FIG. 6E or 6G having the output M3 or M12 coupling to one of the inputs D0-D15 in the first set of the multiplexer 211 of its programmable logic block 201 therein as illustrated in FIG. 14A or 14H, (3) the non-volatile memory cell 910 as illustrated in FIG. 7E, 7G, 7H or 7J having the output M6, M15, M9 or M18 coupling to one of the inputs D0-D15 in the first set of the multiplexer 211 of its programmable logic block 201 therein as illustrated in FIG. 14A or 14H, or (4) the latched non-volatile memory cell 940 or 950 as illustrated in FIG. 9A or 9B having the output L3 or L12 coupling to one of the inputs D0-D15 in the first set of the multiplexer 211 of its programmable logic block 201 therein as illustrated in FIG. 14A or 14H. The memory cells 362 for the cross-point switches 379 may be arranged in one or more rings around the programmable logic block 201. Multiple of the programmable interconnects 361 in the second group around the region 278 may couple the second set of inputs, e.g., A0-A3, of the multiplexer 211 of the programmable logic blocks 201 to multiple of the cross-point switches 379 around the region 278 respectively. One of the programmable interconnects 361 in the second group around the region 278 may couple the output, e.g., Dout, of the multiplexer 211 of the programmable logic blocks 201 to one of the cross-point switches 379 around the region 278.

Accordingly, referring to FIG. 16G, the output, e.g., Dout, of the multiplexer 211 of one of the programmable logic blocks 201 may (1) pass to one of the by-pass interconnects 279 alternately through one or more of the programmable interconnects 361 in the second group and one or more of the cross-point switches 379, (2) subsequently pass from said one of the by-pass interconnects 279 to another of the programmable interconnects 361 in the second group alternately through one or more of the cross-point switches 379 and one or more of the by-pass interconnects 279, and (3) finally pass from said another of the programmable interconnects 361 in the second group to one of the inputs in the second set, e.g., A0-A3, of the multiplexer 211 of another of the programmable logic blocks 201 alternately through one or more of the cross-point switches 379 and one or more of the programmable interconnects 361 in the second group.

III. Arrangement for Cross-Point Switches for Standard Commodity FPGA IC Chip

Figure 16H:
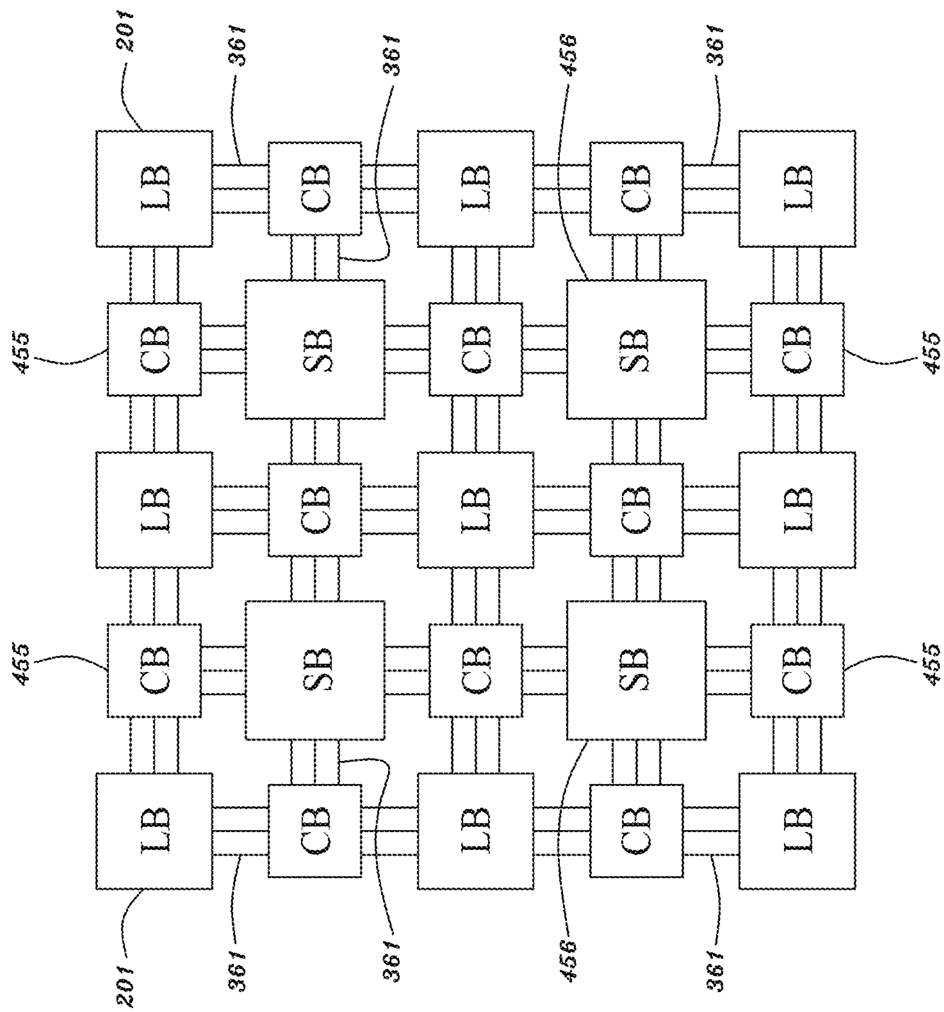

FIG. 16H is a top view showing arrangement for cross-point switches for a standard commodity FPGA IC chip in accordance with an embodiment of the present application. Referring to FIG. 16H, the standard commodity FPGA IC chip 200 may include the programmable logic blocks (LB) 201 arranged in an array, multiple connection blocks (CB) 455 each arranged between neighboring two of the programmable logic blocks (LB) 201 in the same column or row, and multiple switch blocks (SB) 456 each arranged between neighboring two of the connection blocks (CB) 455 in the same column or row. Each of the connection blocks (CB) 455 may be composed of multiple of the cross-point switches 379 of the fourth type as seen in FIGS. 11D and 15C. Each of the switch blocks (SB) 456 may be composed of multiple of the cross-point switches 379 of the third type as seen in FIGS. 11C and 14B.

Referring to FIG. 16H, for each of the connection blocks (CB) 455, each of its cross-point switches 379 of the fourth type may have its inputs, e.g., D0-D15, each coupling to one of the programmable interconnects 361 and its output, e.g., Dout, coupling to another of the programmable interconnects 361. Said one of the programmable interconnects 361 may couple one of the inputs, e.g., D0-D15, of one of the cross-point switches 379 of one of the connection blocks (CB) 455 as illustrated in FIGS. 11D and 14C to (1) the output, e.g., Dout, C0, C1, C2 or C3, of one of the programmable logic blocks (LB) 201 as illustrated in FIG. 14A or 14H or (2) one of nodes N23-N26 of one of the cross-point switches 379 of one of the switch blocks (SB) 456 as illustrated in FIGS. 11C and 15B. Alternatively, said another of the programmable interconnects 361 may couple the output, e.g., Dout, of one of the cross-point switches 379 of one of the connection blocks (CB) 455 as illustrated in FIGS. 11D and 15C to (1) one of the inputs, e.g., A0-A3 of one of the programmable logic blocks (LB) 201 as illustrated in FIG. 14A or 14H or (2) one of the nodes N23-N26 of one of the cross-point switches 379 of one of the switch blocks (SB) 456 as illustrated in FIGS. 11C and 15B.

For example, referring to FIG. 16H, one or more of the inputs, e.g., D0-D15, of the cross-point switch 379 as illustrated in FIGS. 11D and 15C for said one of the connection blocks (CB) 455 may couple to the output Dout, C0, C1, C2 or C3 of the programmable logic block (LB) 201 as illustrated in FIG. 14A or 14H at its first side through one or more of the programmable interconnects 361. Another one or more of the inputs, e.g., D0-D15, of the cross-point switch 379 as illustrated in FIGS. 11D and 15C for said one of the connection blocks (CB) 455 may couple to the output Dout, C0, C1, C2 or C3 of the programmable logic block (LB) 201 as illustrated in FIG. 14A or 14H at its second side opposite to its first side through one or more of the programmable interconnects 361. Another one or more of the inputs, e.g., D0-D15, of the cross-point switch 379 as illustrated in FIGS. 11D and 15C for said one of the connection blocks (CB) 455 may couple to one of the nodes N23-N26 of the cross-point switch 379 as illustrated in FIGS. 11C and 15B for the switch blocks (SB) 456 at its third side through one or more of the programmable interconnects 361. Another one or more of the inputs, e.g., D0-D15, of the cross-point switch 379 as illustrated in FIGS. 11D and 15C for said one of the connection blocks (CB) 455 may couple to one of the nodes N23-N26 of the cross-point switch 379 as illustrated in FIGS. 11C and 15B for the switch block (SB) 456 at its fourth side opposite to its third side through one or more of the programmable interconnects 361. The output, e.g., Dout, of the cross-point switch 379 as illustrated in FIGS. 11D and 15C for said one of the connection blocks (CB) 455 may couple to one of the nodes N23-N26 of the cross-point switch 379 as illustrated in FIGS. 11C and 15B for the switch block (SB) 456 at its third or fourth side through one or more of the programmable interconnects 361 or to one of the inputs A0-A3 of the programmable logic block (LB) 201 as illustrated in FIG. 14A or 14H at its first or second side through one or more of the programmable interconnects 361.

Referring to FIG. 16H, for each of the switch blocks (SB) 456, its cross-point switch 379 of the third type as illustrated in FIGS. 11C and 15B may have its four nodes N23-N26 coupling respectively to four of the programmable interconnects 361 in four different directions. For example, the cross-point switch 379 as illustrated in FIGS. 11C and 15B for said each of the switch blocks (SB) 456 may have its node N23 coupling to one of the inputs D0-D15 and output Dout of the cross-point switch 379 as seen in FIGS. 11D and 15C for the connection block (CB) 455 at its left side through one of said four of the programmable interconnects 361, the cross-point switch 379 as illustrated in FIGS. 11C and 15B for said each of the switch blocks (SB) 456 may have its node N24 coupling to one of the inputs D0-D15 and output Dout of the cross-point switch 379 as seen in FIGS. 11D and 15C for the connection block (CB) 455 at its top side through another of said four of the programmable interconnects 361, the cross-point switch 379 as illustrated in FIGS. 11C and 15B for said each of the switch blocks (SB) 456 may have its node N25 coupling to one of the inputs D0-D15 and output Dout of the cross-point switch 379 as seen in FIGS. 11D and 15C for the connection block (CB) 455 at its right side through another of said four of the programmable interconnects 361, and the cross-point switch 379 as illustrated in FIGS. 11C and 15B for said each of the switch blocks (SB) 456 may have its node N26 coupling to one of the inputs D0-D15 and output Dout of the cross-point switch 379 as seen in FIGS. 11D and 15C for the connection block (CB) 455 at its bottom side through the other of said four of the programmable interconnects 361.

Thereby, referring to FIG. 16H, signal transmission may be built from one of the programmable logic blocks (LB) 201 to another of the programmable logic blocks (LB) 201 through multiple of the switch blocks (SB) 456, wherein between each neighboring two of said multiple of the switch blocks (SB) 456 may be arranged one of the connection blocks (CB) 455 for the signal transmission, between said one of the programmable logic blocks (LB) 201 and one of said multiple of the switch blocks (SB) 456 may be arranged one of the connection blocks (CB) 455 for the signal transmission, and between said another of the programmable logic blocks (LB) 201 and one of said multiple of the switch blocks (SB) 456 may be one of the connection blocks (CB) 455 for the signal transmission. For example, a signal may be transmitted from an output, e.g., Dout, C0, C1, C2 or C3, of said one of the programmable logic blocks (LB) 201 as seen in FIG. 14A or 14H to one of the inputs, e.g., D0-D15, of the cross-point switches 379 of the fourth type as seen in FIG. 1*l*D and 15C for a first one of the connection blocks (CB) 455 through one of the programmable interconnects 361. Next, the cross-point switches 379 of the fourth type for the first one of the connection blocks (CB) 455 may pass the signal from said one of its inputs, e.g., D0-D15, to its output, e.g., Dout, to be transmitted to a node N23 of one of the cross-point switches 379 of the third type as seen in FIGS. 11C and 15B for one of the switch blocks (SB) 456 through another of the programmable interconnects 361. Next, said one of the cross-point switches 379 of the third type for one of the switch blocks (SB) 456 may pass the signal from its node N23 to its node N25 to be transmitted to one of the inputs, e.g., D0-D15, of the cross-point switches 379 of the fourth type as seen in FIGS. 11D and 15C for a second one of the connection blocks (CB) 455 through another of the programmable interconnects 361. Next, the cross-point switches 379 of the fourth type for the second one of the connection blocks (CB) 455 may pass the signal from said one of its inputs, e.g., D0-D15, to its output, e.g., Dout, to be transmitted to one of the inputs, e.g., A0-A3, of said another of the programmable logic blocks (LB) 201 as seen in FIG. 14A or 14H through another of the programmable interconnects 361.

IV. Repair for Standard Commodity FPGA IC Chip

Figure 16I:
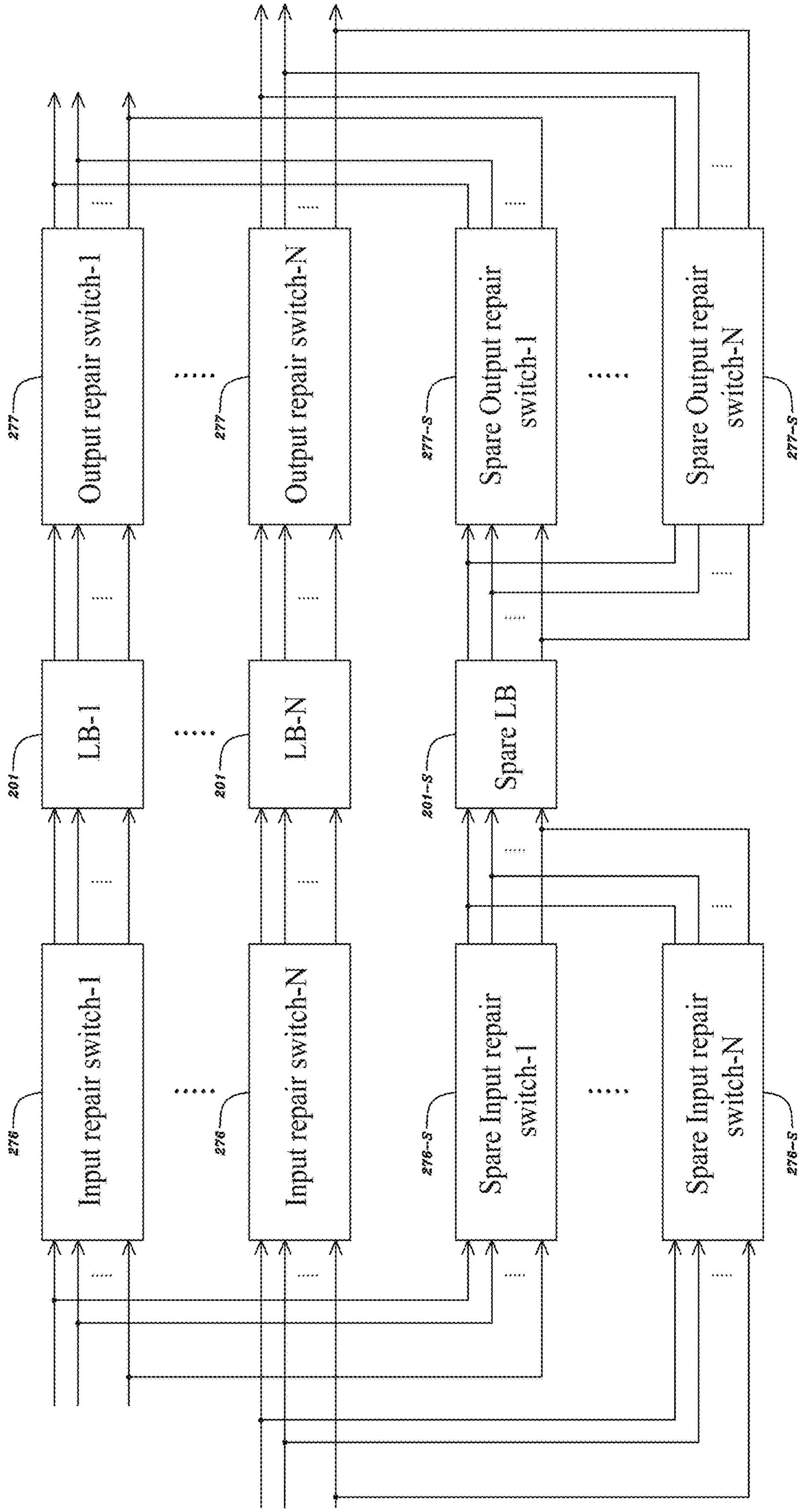
FIGS. 16I and 16J are block diagrams showing various repair algorithms in accordance with an embodiment of the present application.

FIG. 16I is a block diagram showing a repair for a standard commodity FPGA IC chip in accordance with an embodiment of the present application. Referring to FIG. 16I, the standard commodity FPGA IC chip 200 may have a spare 201-*s* for the programmable logic blocks 201 configured to replace a broken one of the programmable logic blocks 201. The standard commodity FPGA IC chip 200 may include (1) multiple input repair switch matrixes 276 each having multiple outputs each coupling in series to one of the inputs A0-A3 of one of the programmable logic blocks 201 as illustrated in FIG. 14A or 14H and (2) multiple output repair switch matrixes 277 each having one or more input(s) coupling in series to the one or more output(s) Dout, C0, C1, C2 or C3 of one of the programmable logic blocks 201 as illustrated in FIG. 14A or 14H. Furthermore, the standard commodity FPGA IC chips 200 may include (1) multiple spare input repair switch matrixes 276-*s* each having multiple outputs each coupling in parallel to one of the outputs of each of the others of the spare input repair switch matrixes 276-*s* and coupling in series to one of the inputs A0-A3 of the spare 201-*s* for the programmable logic blocks 201 as illustrated in FIG. 14A or 14H, and (2) multiple spare output repair switch matrixes 277-*s* each having one or more input(s) coupling respectively in parallel to the one or more input(s) of each of the others of the spare output repair switch matrixes 277-*s* and coupling respectively in series to the one or more output(s) Dout, C0, C1, C2 or C3 of the spare 201-*s* for the programmable logic blocks 201 as illustrated in FIG. 14A or 14H. Each of the spare input repair switch matrixes 276-*s* may have multiple inputs each coupling in parallel to one of the inputs of one of the input repair switch matrixes 276. Each of the spare output repair switch matrixes 277-*s* may have one or more outputs coupling respectively in parallel to the one or more outputs of one of the output repair switch matrixes 277.

Thereby, referring to FIG. 16I, when one of the programmable logic blocks 201 is broken, one of the input repair switch matrixes 276 and one of the output repair switch matrixes 277 coupling to the inputs and output(s) of said one of the programmable logic blocks 201 respectively may be turned off; one of the spare input repair switch matrixes 276-*s* having its inputs coupling respectively in parallel to the inputs of said one of the input repair switch matrixes 276 and one of the spare output repair switch matrixes 277-*s* having its output(s) coupling respectively in parallel to the output(s) of said one of the output repair switch matrixes 277 may be turned on; the others of the spare input repair switch matrixes 276-*s* and the others of the spare output repair switch matrixes 277-*s* may be turned off. Accordingly, the broken one of the programmable logic blocks 201 may be replaced with the spare 201-*s* for the programmable logic blocks 201.

Figure 16J:
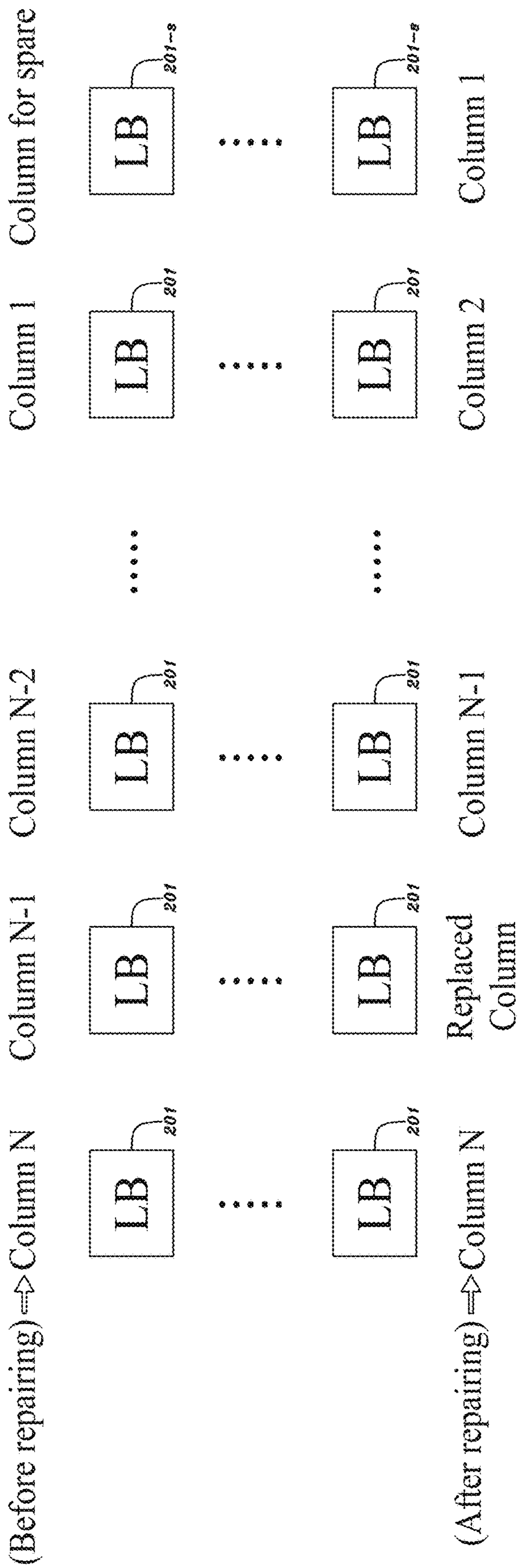

FIG. 16J is a block diagram showing a repair for a standard commodity FPGA IC chip in accordance with an embodiment of the present application. Referring to FIG. 16J, the programmable logic blocks (LB) 201 may be arranged in an array. When one of the programmable logic blocks (LB) 201 arranged in a column is broken, all of the programmable logic blocks (LB) 201 arranged in the column may be turned off and multiple spares 201-*s* for the programmable logic blocks (LB) 201 arranged in a column may be turned on. Next, the columns for the programmable logic blocks (LB) 201 and the spares 201-*s* for the programmable logic blocks (LB) 201 may be renumbered, and each of the programmable logic blocks 201 after repaired in a renumbered column and in a specific row may perform the same operations as one of the programmable logic blocks (LB) 201 before repaired in a column having the same number as the renumbered column and in the specific row. For example, when one of the programmable logic blocks (LB) 201 arranged in the column N-1 is broken, all of the programmable logic blocks (LB) 201 arranged in the column N-1 may be turned off and the spares 201-*s* for the programmable logic blocks (LB) 201 arranged in the rightmost column may be turned on. Next, the columns for the programmable logic blocks (LB) 201 and the spares 201-*s* for the programmable logic blocks (LB) 201 may be renumbered such that the rightmost column arranged for the spare 201-*s* for the programmable logic blocks (LB) 201 before repaired may be renumbered to column 1 after the programmable logic blocks (LB) 201 are repaired, the column 1 arranged for the programmable logic blocks (LB) 201 before repaired may be renumbered to column 2 after the programmable logic blocks (LB) 201 are repaired, and so on. The column n-2 arranged for the programmable logic blocks (LB) 201 before repaired may be renumbered to column n−1 after the programmable logic blocks (LB) 201 are repaired, wherein n is an integer ranging from 3 to N. Each of the programmable logic blocks (LB) 201 after repaired in the renumbered column m and in a specific row may perform the same operation as one of the programmable logic blocks 201 before repaired in the column m and in the specific row, where m is an integer ranging from 1 to N. For example, each of the programmable logic blocks (LB) 201 after repaired in the renumbered column 1 and in a specific row may perform the same operations as one of the programmable logic blocks 201 before repaired in the column 1 and in the specific row.

V. Programmable Logic Blocks for Standard Commodity FPGA IC Chip

Figure 16K:
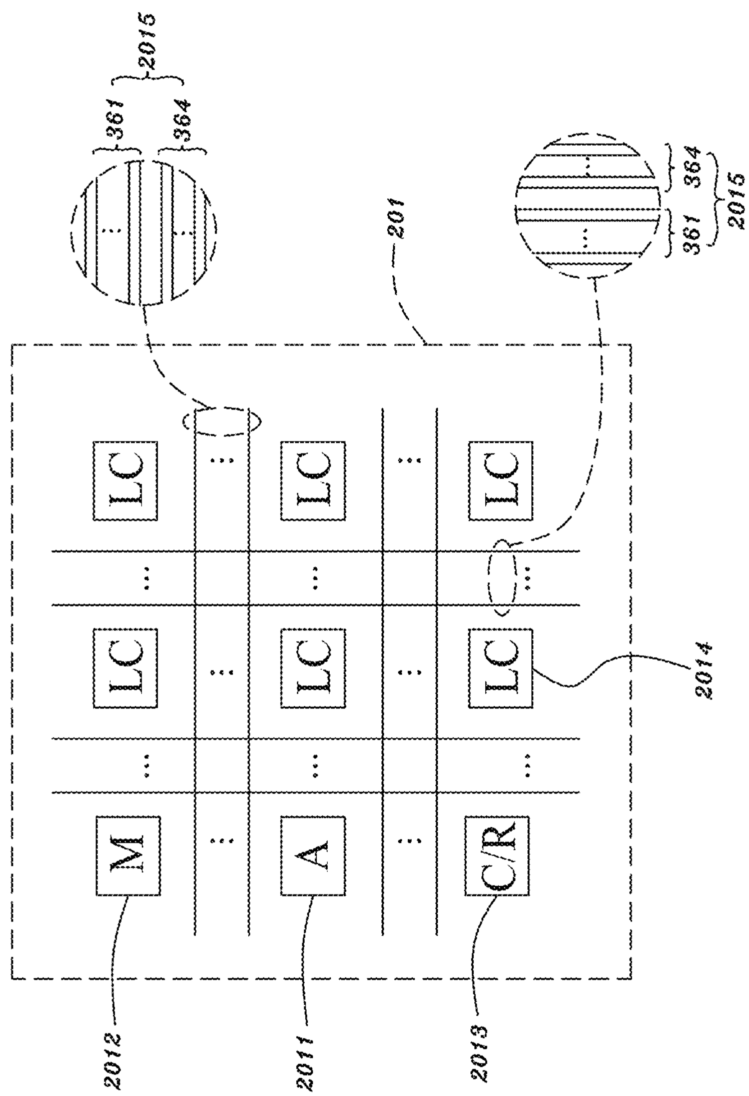
FIG. 16K is a block diagram illustrating a programmable logic block for a standard commodity FPGA IC chip in accordance with an embodiment of the present application.

Alternatively, FIG. 16K is a block diagram illustrating a programmable logic block for a standard commodity FPGA IC chip in accordance with an embodiment of the present application. Referring to FIG. 16K, each of the programmable logic blocks 201 as seen in FIG. 16A may include (1) one or more cells (A) 2011 for fixed-wired adders, having the number ranging from 1 to 16 for example, (2) one or more cells (M) 2012 for fixed-wired multipliers, having the number ranging from 1 to 16 for example, (3) one or more cells (C/R) 2013 for caches and registers, each having capacity ranging from 256 to 2048 bits for example, and (4) multiple cells (LC) 2014 for logic operation, having the number ranging from 64 to 2048 for example. Said each of the programmable logic blocks 201 as seen in FIG. 16A may further include multiple intra-block interconnects 2015 each extending over spaces between neighboring two of its cells 2011, 2012, 2013 and 2014 arranged in an array therein. For said each of the programmable logic blocks, its intra-chip interconnects 502 may be divided into the programmable interconnects 361 and fixed interconnects 364 as illustrated in FIG. 15A-15C; the programmable interconnects 361 of its intra-chip interconnects 2015 may couple to the programmable interconnects 361 of the intra-chip interconnects 502 of the FPGA IC chip 200 respectively, and the fixed interconnects 364 of its intra-chip interconnects 2015 may couple to the fixed interconnects 364 of the intra-chip interconnects 502 of the FPGA IC chip 200 respectively.

Referring to FIGS. 16A and 16K, each of the cells (LC) 2014 for logic operation may be arranged with a one, or plurality of the logic architecture as seen in FIG. 14A having its memory cells 490, having the number ranging from 4 to 256 for example, for its look-up table 210 coupling respectively to the first set of inputs of its multiplexer 211 having the number ranging from 4 to 256 for example, one from which may be selected by its multiplexer 211 into its output in accordance with the second set of inputs of its multiplexer 211 having the number ranging from 2 to 8 for example each coupling to one of the programmable interconnects 361 and fixed interconnects 364 of the intra-block interconnects 2015. For example, the logic architecture may have its 16 memory cells 490 for its look-up table 210 coupling respectively to the first set of 16 inputs of its multiplexer 211, one from which may be selected by its multiplexer 211 into its output in accordance with the second set of 4 inputs of its multiplexer 211 each coupling to one of the programmable interconnects 361 and fixed interconnects 364 of the intra-block interconnects 2015, as seen in FIG. 14A. Further, said each of the cells (LC) 2014 for logic operation may be arranged with a register configured for temporally saving the output of the logic architecture or one of the inputs of the second set of the multiplexer 211 of the logic architecture.

Figure 16L:
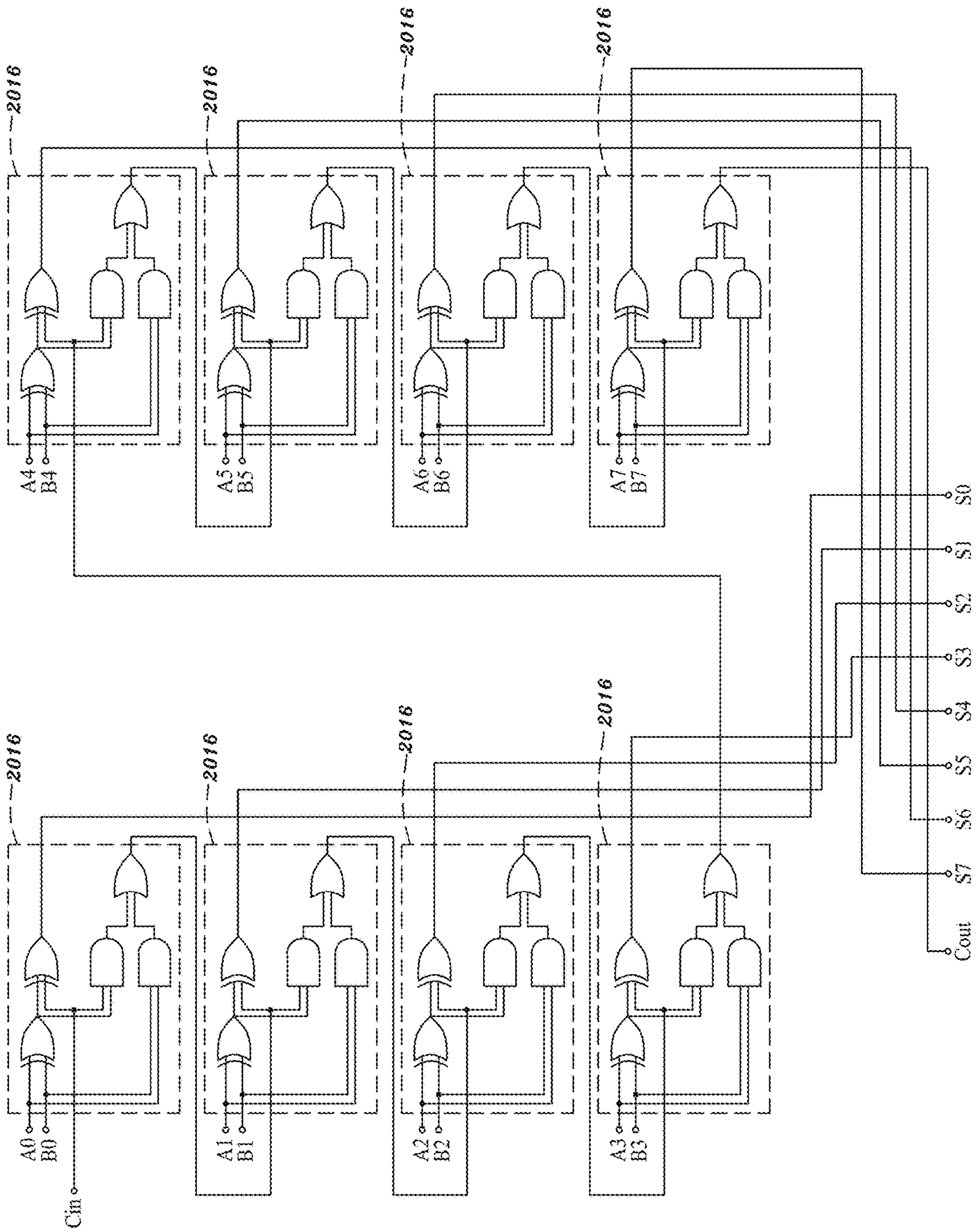
FIG. 16L is a circuit diagram illustrating a cell of an adder in accordance with an embodiment of the present application.
Figure 16M:
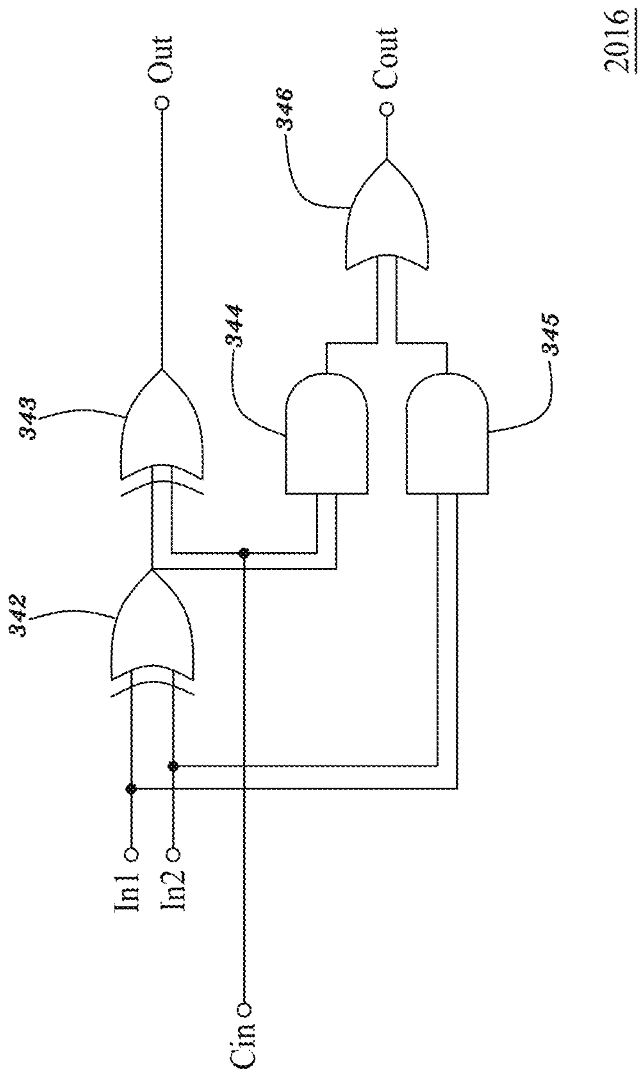
FIG. 16M is a circuit diagram illustrating an adding unit for a cell of an adder in accordance with an embodiment of the present application.

FIG. 16L is a circuit diagram illustrating a cell of an adder in accordance with an embodiment of the present application. FIG. 16M is a circuit diagram illustrating an adding unit for a cell of an adder in accordance with an embodiment of the present application. Referring to FIGS. 16A, 16L and 16M, each of the cells (A) 2011 for fixed-wired adders may include multiple adding units 2016 coupling in series and stage by stage to each other or one another. For example, said each of the cells (A) 2011 for fixed-wired adders as seen in FIG. 16K may include 8 stages of the adding unit 2016 coupling in series and stage by stage to one another as seen in FIGS. 16L and 16M to add its first 8-bit input (A7, A6, A5, A4, A3, A2, A1, A0) coupling to eight of the programmable interconnects 361 and fixed interconnects 364 of the intra-block interconnects 2015 by its second 8-bit input (B7, B6, B5, B4, B3, B2, B1, B0) coupling to another eight of the programmable interconnects 361 and fixed interconnects 364 of the intra-block interconnects 2015 into its 9-bit output (Cout, S7, S6, S5, S4, S3, S2, S1, S0) coupling to another nine of the programmable interconnects 361 and fixed interconnects 364 of the intra-block interconnects 2015. Referring to FIGS. 16L and 16M, the first stage of the adding unit 2016 may take its carry-in input Cin from a previous computation result coupling to one of the programmable interconnects 361 and fixed interconnects 364 of the intra-block interconnects 2015 into account to add its first input In1 coupling to the input A0 of said each of the cells (A) 2011 for fixed-wired adders by its second input In2 coupling to the input B0 of said each of the cells (A) 2011 into its two outputs, one of which is an output Out acting as the output S0 of said each of the cells (A) 2011 for fixed-wired adders and the other one of which is a carry-out output Cout coupling to a carry-in input Cin of the adding unit 2016 of the second stage. Each of the adding units 2016 of the second through seventh stages may take its carry-in input Cin from the carry-out output Cout of one of the adding units 2016 of the first through sixth stages previous to said each of the adding units 2016 into account to add its first input In1 coupling to one of the inputs A1, A2, A3, A4, A5 and A6 of said each of the cells (A) 2011 for fixed-wired adders by its second input In2 coupling to one of the inputs B1, B2, B3, B4, B5 and B6 of said each of the cells (A) 2011 into its two outputs, one of which is an output Out acting as one of the outputs S1, S2, S3, S4, S5 and S6 of said each of the cells (A) 2011 for fixed-wired adders and the other one of which is a carry-out output Cout coupling to a carry-in input Cin of one of the adding units 2016 of the third through eighth stages next to said each of the adding units 2016. For example, the seventh stage of adding unit 2016 may take its carry-in input Cin from a carry-out output Cout of the adding unit 2016 of the sixth stage into account to add its first input In1 coupling to the input A6 of said each of the cells (A) 2011 for fixed-wired adders by its second input In2 coupling to the input B6 of said each of the cells (A) 2011 into its two outputs, one of which is an output Out acting as the output S6 of said each of the cells (A) 2011 for fixed-wired adders and the other one of which is a carry-out output Cout coupling to a carry-in input Cin of the adding unit 2016 of the eighth stage. The eighth stage of the adding unit 2016 may take its carry-in input Cin from the carry-out output Cout of the adding unit 2016 of the seventh stage into account to add its first input In1 coupling to the input A7 of said each of the cells (A) 2011 for fixed-wired adders by its second input In2 coupling to the input B7 of said each of the cells (A) 2011 into its two outputs, one of which is an output Out acting as the output S7 of said each of the cells (A) 2011 for fixed-wired adders and the other one of which is a carry-out output Cout acting as the carry-out output Cout of said each of the cells (A) 2011 for fixed-wired adders.

Referring to FIGS. 16L and 16M, each of the adding units 2016 of the first through eighth stages may include (1) an ExOR gate 342 configured to perform Exclusive-OR operation on its first and second inputs coupling respectively to the first and second inputs In1 and In2 of said each of the adding units 2016 of the first through eighth stages into its output, (2) an ExOR gate 343 configured to perform Exclusive-OR operation on its first input coupling to the output of the ExOR gate 342 and its second input coupling to the carry-in input Cin of said each of the adding units 2016 of the first through eighth stages into its output acting as the output Out of said each of the adding units 2016 of the first through eighth stages, (3) an AND gate 344 configured to perform Exclusive-OR operation on its first input coupling to the carry-in input Cin of said each of the adding units 2016 of the first through eighth stages and its second input coupling to the output of the ExOR gate 342 into its output, (4) an AND gate 345 configured to perform Exclusive-OR operation on its first and second inputs coupling respectively to the second and first inputs In2 and In1 of said each of the adding units 2016 of the first through eighth stages into its output, and (5) an OR gate 346 configured to perform OR operation on its first input coupling to the output of the AND gate 344 and its second input coupling to the output of the AND gate 345 into its output acting the Carry-out output Cout of said each of the adding units 2016 of the first through eighth stages.

Figure 16N:
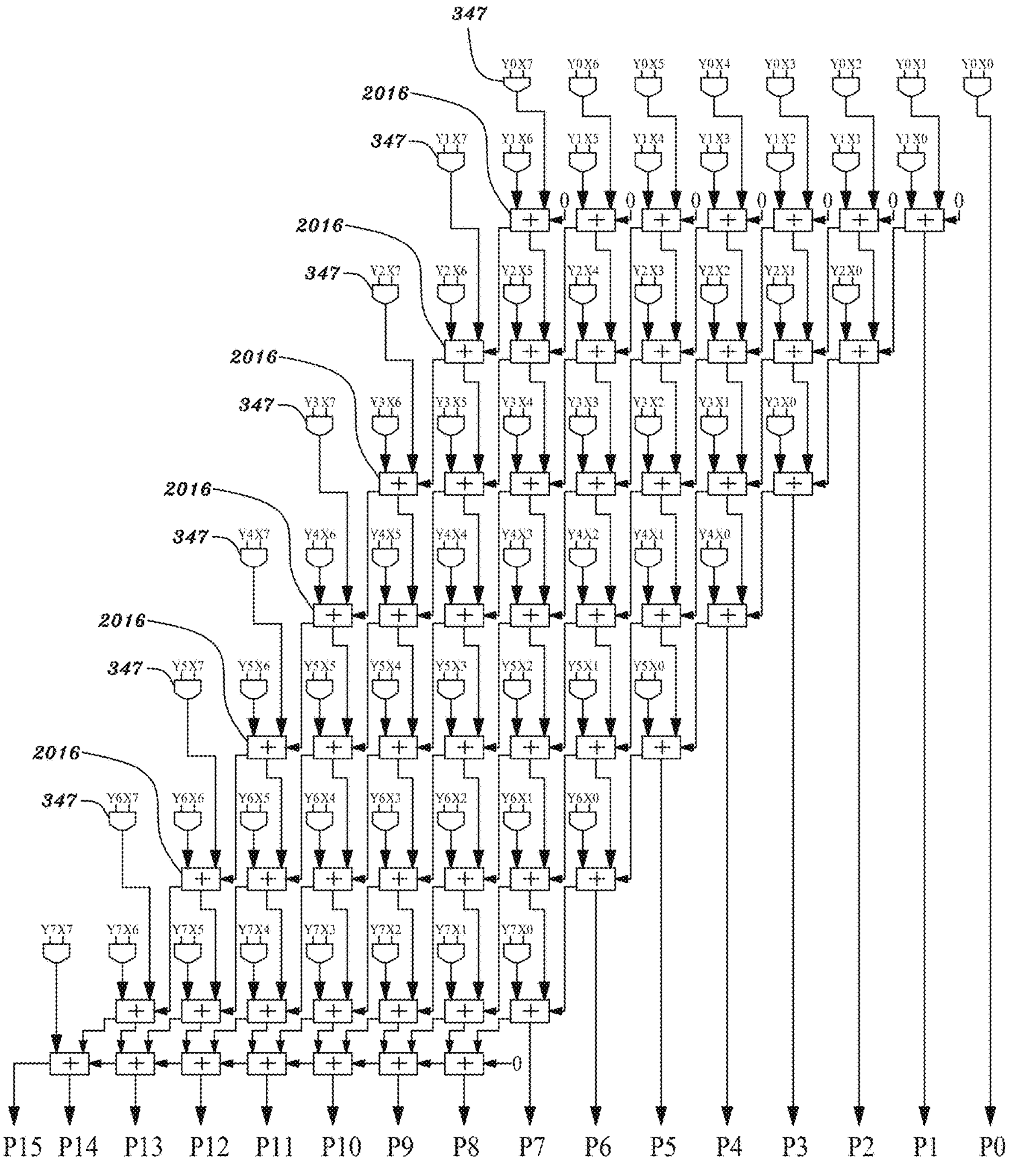
FIG. 16N is a circuit diagram illustrating a cell of a multiplier in accordance with an embodiment of the present application.

FIG. 16N is a circuit diagram illustrating a cell of a fixed-wired multiplier in accordance with an embodiment of the present application. Referring to FIGS. 16A and 16N, each of the cells (M) 2012 for fixed-wired multipliers may include multiple stages of the adding units 2016, each of which may be referred to the architecture as illustrated in FIG. 16M, coupling in series and stage by stage to each other or one another. For example, said each of the cells (M) 2012 for fixed-wired multipliers as seen in FIG. 16K may include 8 stages of the 7 adding units 2016 coupling in series and stage by stage to one another as seen in FIGS. 16N and 16M to multiplies its first 8-bit input (X7, X6, X5, X4, X3, X2, X1, X0) coupling to eight of the programmable interconnects 361 and fixed interconnects 364 of the intra-block interconnects 2015 by its second 8-bit input (Y7, Y6, Y5, Y4, Y3, Y2, Y1, Y0) coupling to another eight of the programmable interconnects 361 and fixed interconnects 364 of the intra-block interconnects 2015 into its 16-bit output (P15, P14, P13, P12, P11, P10, P9, P8, P7, P6, P5, P4, P3, P2, P1, P0) coupling to another sixteen of the programmable interconnects 361 and fixed interconnects 364 of the intra-block interconnects 2015. Referring to FIGS. 16N and 16M, said each of the cells (M) 2012 for fixed-wired multipliers may include 64 AND gates 347 each configured to perform AND operation on its first input coupling to one of the first 8 inputs X7, X6, X5, X4, X3, X2, X1 and X0 of said each of the cells (M) 2012 for fixed-wired multipliers and its second input coupling to one of the second 8 inputs Y7, Y6, Y5, Y4, Y3, Y2, Y1 and Y0 of said each of the cells (M) 2012 for fixed-wired multipliers into its output. For more elaboration, for said each of the cells (M) 2012 for fixed-wired multipliers, its 64 AND gates 347 arranged in 8 rows may have their first and second inputs coupling respectively to 64 (8-by-8) combinations of each of its first 8 inputs X7, X6, X5, X4, X3, X2, X1 and X0 and each of its second 8 inputs Y7, Y6, Y5, Y4, Y3, Y2, Y1 and Y0; its 8 AND gates 347 in the first row may perform AND operation on their first respective inputs coupling respectively to its first 8 inputs X7, X6, X5, X4, X3, X2, X1 and X0 arranged from left to right and their second respective inputs coupling to its second input Y0 into their respective outputs; its 8 AND gates 347 in the second row may perform AND operation on their first respective inputs coupling respectively to its first 8 inputs X7, X6, X5, X4, X3, X2, X1 and X0 arranged from left to right and their second respective inputs coupling to its second input Y1 into their respective outputs; its 8 AND gates 347 in the third row may perform AND operation on their first respective inputs coupling respectively to its first 8 inputs X7, X6, X5, X4, X3, X2, X1 and X0 arranged from left to right and their second respective inputs coupling to its second input Y2 into their respective outputs; its 8 AND gates 347 in the fourth row may perform AND operation on their first respective inputs coupling respectively to its first 8 inputs X7, X6, X5, X4, X3, X2, X1 and X0 arranged from left to right and their second respective inputs coupling to its second input Y3 into their respective outputs; its 8 AND gates 347 in the fifth row may perform AND operation on their first respective inputs coupling respectively to its first 8 inputs X7, X6, X5, X4, X3, X2, X1 and X0 arranged from left to right and their second respective inputs coupling to its second input Y4 into their respective outputs; its 8 AND gates 347 in the sixth row may perform AND operation on their first respective inputs coupling respectively to its first 8 inputs X7, X6, X5, X4, X3, X2, X1 and X0 arranged from left to right and their second respective inputs coupling to its second input Y5 into their respective outputs; its 8 AND gates 347 in the seventh row may perform AND operation on their first respective inputs coupling respectively to its first 8 inputs X7, X6, X5, X4, X3, X2, X1 and X0 arranged from left to right and their second respective inputs coupling to its second input Y6 into their respective outputs; its 8 AND gates 347 in the eighth row may perform AND operation on their first respective inputs coupling respectively to its first 8 inputs X7, X6, X5, X4, X3, X2, X1 and X0 arranged from left to right and their second respective inputs coupling to its second input Y7 into their respective outputs.

Referring to FIGS. 16M and 16N, for said each of the cells (M) 2012 for fixed-wired multipliers, the output of the rightmost one of its AND gates 347 in the first row may act as its output P0. For said each of the cells (M) 2012 for fixed-wired multipliers, the outputs of the left seven of its AND gates 347 in the first row may couple respectively to the first inputs In1 of its 7 adding units 2016 of the second stage. For said each of the cells (M) 2012 for fixed-wired multipliers, the outputs of the right seven of its AND gates 347 in the second row may couple respectively to the second inputs In2 of its 7 adding units 2016 of the second stage.

Referring to FIGS. 16M and 16N, for said each of the cells (M) 2012 for fixed-wired multipliers, its 7 adding units 2016 of the first stage may take their respective carry-in inputs Cin at a logic level of "0" into account to add their first respective inputs In1 by their second respective inputs In2 into their respective outputs Out, the rightmost one of which may act as its output P1 and the left six of which may couple respectively to the first inputs In1 of the right six of its 7 adding units 2016 of the second stage, and their respective carry-out outputs Cout coupling respectively to the carry-in inputs Cin of its 7 adding units 2016 of the second stage. For said each of the cells (M) 2012 for fixed-wired multipliers, the output of the leftmost one of its AND gates 347 in the second row may couple to the first input In1 of the leftmost one of its adding units 2016 of the second stage. For said each of the cells (M) 2012 for fixed-wired multipliers, the outputs of the right seven of its AND gates 347 in the third row may couple respectively to the second inputs In2 of its 7 adding units 2016 of the second stage.

Referring to FIGS. 16M and 16N, for said each of the cells (M) 2012 for fixed-wired multipliers, its 7 adding units 2016 of each of the second through sixth stages may take their respective carry-in inputs Cin into account to add their first respective inputs In1 by their second respective inputs In2 into their respective outputs Out, the rightmost one of which may act as one of its outputs P2-P6 and the left six of which may couple respectively to the first inputs In1 of the right six of its 7 adding units 2016 of next one of the third through seventh stages next to said each of the second through sixth stages, and their respective carry-out outputs Cout coupling respectively to the carry-in inputs Cin of its 7 adding units 2016 of said next one of the third through seventh stages. For said each of the cells (M) 2012 for fixed-wired multipliers, the output of the leftmost one of its AND gates 347 in each of the third through seventh rows may couple to the first input In1 of the leftmost one of its adding units 2016 of one of the third through seventh stages. For said each of the cells (M) 2012 for fixed-wired multipliers, the outputs of the right seven of its AND gates 347 in each of the fourth through eighth rows may couple respectively to the second inputs In2 of its 7 adding units 2016 of one of the third through seventh stages.

For example, referring to FIGS. 16M and 16N, for said each of the cells (M) 2012 for fixed-wired multipliers, its 7 adding units 2016 of the second stage may take their respective carry-in inputs Cin into account to add their first respective inputs In1 by their second respective inputs In2 into their respective outputs Out, the rightmost one of which may act as its output P2 and the left six of which may couple respectively to the first inputs In1 of the right six of its 7 adding units 2016 of the third stage, and their respective carry-out outputs Cout coupling respectively to the carry-in inputs Cin of its 7 adding units 2016 of the third stage. For said each of the cells (M) 2012 for fixed-wired multipliers, the output of the leftmost one of its AND gates 347 in the third row may couple to the first input In1 of the leftmost one of its adding units 2016 of the third stage. For said each of the cells (M) 2012 for fixed-wired multipliers, the outputs of the right seven of its AND gates 347 in the fourth row may couple respectively to the second inputs In2 of its 7 adding units 2016 of the third stage.

Referring to FIGS. 16M and 16N, for said each of the cells (M) 2012 for fixed-wired multipliers, its 7 adding units 2016 of the seventh stage may take their respective carry-in inputs Cin into account to add their first respective inputs In1 by their second respective inputs In2 into their respective outputs Out, the rightmost one of which may act as its output P7 and the left six of which may couple respectively to the second inputs In2 of the right six of its 7 adding units 2016 of the eighth stage, and their respective carry-out outputs Cout coupling respectively to the first inputs In1 of its 7 adding units 2016 of the eighth stage. For said each of the cells (M) 2012 for fixed-wired multipliers, the output of the leftmost one of its AND gates 347 in the eighth row may couple to the second input In2 of the leftmost one of its adding units 2016 of the eighth stage.

Referring to FIGS. 16M and 16N, the rightmost one of its 7 adding units 2016 of the eighth stage of said each of the cells (M) 2012 for fixed-wired multipliers may take its carry-in input Cin at a logic level of "0" into account to add its first input In1 by its second input In2 into its output Out acting as the output P8 of said each of the cells (M) 2012 for fixed-wired multipliers and its carry-out output Cout coupling to the carry-in input Cin of the second rightmost one of its 7 adding units 2016 of the eighth stage of said each of the cells (M) 2012 for fixed-wired multipliers left to the rightmost one thereof. Each of the second rightmost one through second leftmost one of its 7 adding units 2016 of the eighth stage of said each of the cells (M) 2012 for fixed-wired multipliers may take its respective carry-in inputs Cin into account to add its first input In1 by its second input In2 into its outputs Out acting as one of the outputs P9-P13 of said each of the cells (M) 2012 for fixed-wired multipliers and its carry-out output Cout coupling to the carry-in input Cin of one of the third rightmost one through leftmost one of its 7 adding units 2016 of the eighth stage of said each of the cells (M) 2012 for fixed-wired multipliers left to said each of the second rightmost one through second leftmost one thereof. The leftmost one of its 7 adding units 2016 of the eighth stage of said each of the cells (M) 2012 for fixed-wired multipliers may take its carry-in input Cin into account to add its first input In1 by its second input In2 into its output Out acting as the output P14 of said each of the cells (M) 2012 for fixed-wired multipliers and its carry-out output Cout acting as the output P15 thereof.

Each of the cells (C/R) 2013 for caches and registers as seen in FIG. 16K may be configured for temporally save or store (1) the inputs and outputs of the cells (A) 2011 for fixed-wired adders, such as the carry-in input Cin of its adding unit of the first stage, its first and second 8-bit inputs (A7, A6, A5, A4, A3, A2, A1, A0) and (B7, B6, B5, B4, B3, B2, B1, B0) and/or its 9-bit output (Cout, S7, S6, S5, S4, S3, S2, S1, S0) as illustrated in FIGS. 16L and 16M, (2) the inputs and outputs of the cells (M) 2012 for fixed-wired multipliers, such as its first and second 8-bit inputs (X7, X6, X5, X4, X3, X2, X1, X0) and (Y7, Y6, Y5, Y4, Y3, Y2, Y1, Y0) and/or its 16-bit output (P15, P14, P13, P12, P11, P10, P9, P8, P7, P6, P5, P4, P3, P2, P1, P0) as illustrated in FIGS. 16M and 16N, and/or (3) the inputs and outputs of the cells (LC) 2014 for logic operation, i.e., the output of its logic architecture or one of the inputs of the second set of the multiplexer 211 of its logic architecture.

Figure 17:
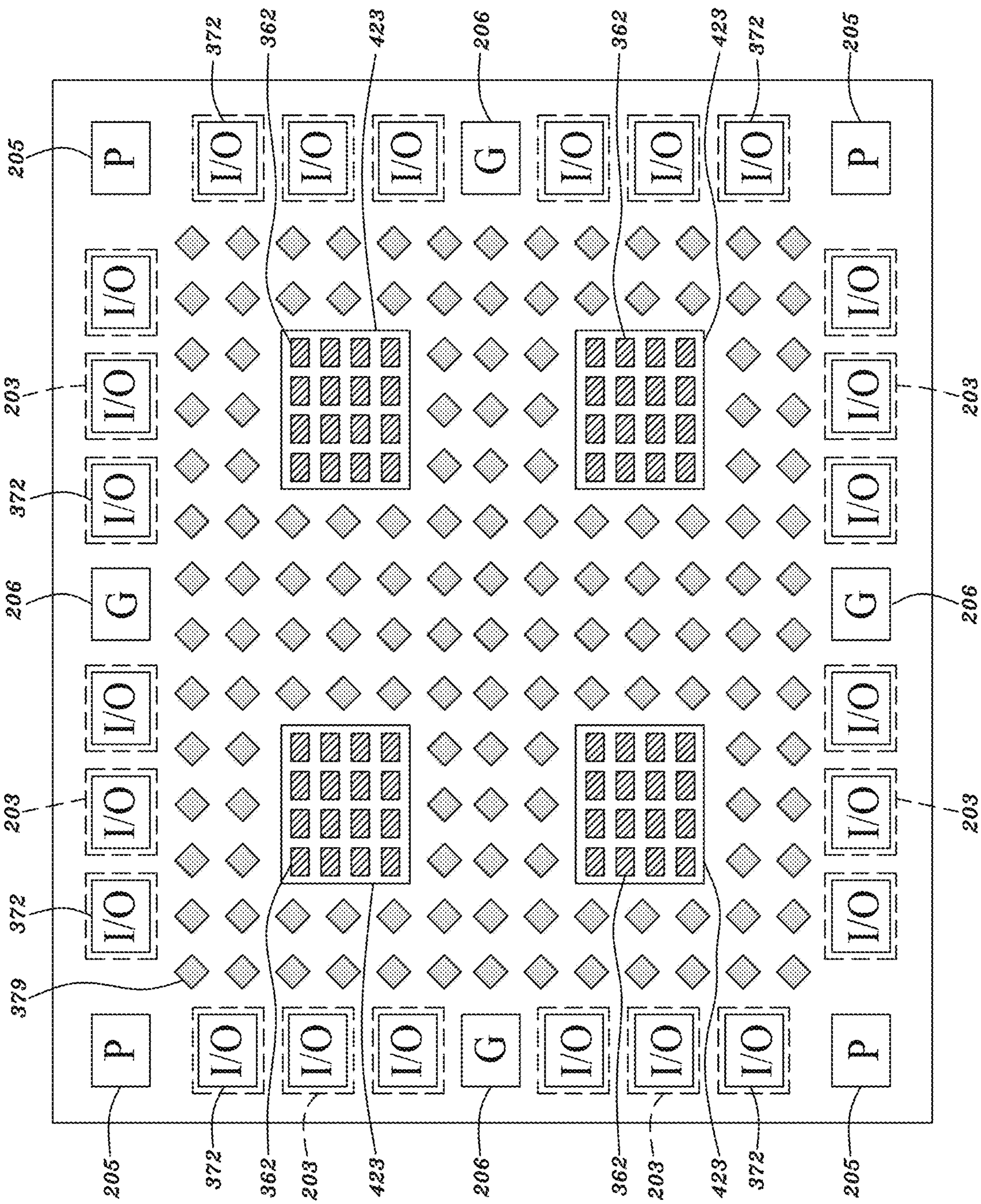
FIG. 17 is a schematically top view showing a block diagram of a dedicated programmable interconnection (DPI) integrated-circuit (IC) chip in accordance with an embodiment of the present application.

Specification for Dedicated Programmable Interconnection (DPI) Integrated-Circuit (IC) Chip FIG. 17 is a schematically top view showing a block diagram of a dedicated programmable interconnection (DPI) integrated-circuit (IC) chip in accordance with an embodiment of the present application. Referring to FIG. 17, a dedicated programmable interconnection (DPI) integrated-circuit (IC) chip 410 is designed, implemented and fabricated using varieties of semiconductor technology nodes or generations, including old or matured technology nodes or generations, for example, a semiconductor node or generation less advanced than or equal to, or more mature than 20 nm or 30 nm, and for example using the technology node of 22 nm, 28 nm, 40 nm, 90 nm, 130 nm, 180 nm, 250 nm, 350 nm or 500 nm; with a chip size and manufacturing yield optimized with the minimum manufacturing cost for the used semiconductor technology node or generation. The dedicated IP IC chip 410 may have an area between 400 $mm^2$ and 9 $mm^2$, 144 $mm^2$ and 16 $mm^2$, 75 $mm^2$ and 16 $mm^2$, or 50 $mm^2$ and 16 $mm^2$. Transistors or semiconductor devices of the dedicated IP IC chip 410 used in the advanced semiconductor technology node or generation may be a FIN Field-Effect-Transistor (FINFET), a FINFET on Silicon-On-Insulator (FINFET SOI), a Fully Depleted Silicon-On-Insulator (FDSOI) MOSFET, a Partially Depleted Silicon-On-Insulator (PDSOI) MOSFET or a conventional MOSFET.

Referring to FIG. 17, since the dedicated programmable interconnection (DPI) integrated-circuit (IC) chip 410 is a standard commodity IC chip, the number of types of products for the DPIIC chip 410 may be reduced to a small number, and therefore expensive photo masks or mask sets for fabricating the DPIIC chip 410 using advanced semiconductor nodes or generations may be reduced to a few mask sets. For example, the mask sets for a specific technology node or generation may be reduced down to between 3 and 20, 3 and 10, or 3 and 5. Its NRE and production expenses are therefore greatly reduced. With the few types of products for the DPIIC chip 410, the manufacturing processes may be optimized to achieve very high manufacturing chip yields. Furthermore, the chip inventory management becomes easy, efficient and effective, therefore resulting in a relatively short chip delivery time and becoming very cost-effective.

Referring to FIG. 17, the DPIIC chip 410 may be of various types, including (1) multiple memory-array blocks 423 arranged in an array in a central region thereof, (2) multiple groups of cross-point switches 379 as illustrated in FIG. 11A, 11B, 11C or 11D, each group of which is arranged in one or more rings around one of the memory-array blocks 423, and (3) multiple small input/output (I/O) circuits 203, as illustrated in FIG. 13B, each having the node of S_Data_in coupling to one of the nodes N23-N26 of one of its cross-point switches 379 as illustrated in FIGS. 11A-11C through one of the programmable interconnects 361 or to one of the inputs D0-D15 of one of its cross-point switches 379 as illustrated in FIG. 11D through one of the programmable interconnects 361 and the node of S_Data_out coupling to one of the nodes N23-N26 of another of its cross-point switches 379 as illustrated in FIGS. 11A-11C through another of the programmable interconnects 361 or to the output Dout of another of its cross-point switches 379 as illustrated in FIG. 11D through another of the programmable interconnects 361. In each of the memory-array blocks 423 are multiple of memory cells 362, each of which may be (1) the non-volatile memory cell 600, 650, 700, 760 or 800 as illustrated in FIG. 1A-1H, 2A-2E, 3A-3W, 4A-4S or 5A-5F having its output N0 coupling to one of the pass/no-pass switches 258 for one of the cross-point switches 379 as illustrated in FIGS. 11A, 11B and 15A close to said each of the memory-array blocks 423 to switch on or off said one of the pass/no-pass switches 258, (2) the non-volatile memory cell 900 as illustrated in FIG. 6E or 6G having its output M3 or M12 coupling to one of the pass/no-pass switches 258 for one of the cross-point switches 379 as illustrated in FIGS. 11A, 11B and 15A close to said each of the memory-array blocks 423 to switch on or off said one of the pass/no-pass switches 258, (3) the non-volatile memory cell 910 as illustrated in FIG. 7E, 7G, 7H or 7J having its output M6, M15, M9 or M18 coupling to one of the pass/no-pass switches 258 for one of the cross-point switches 379 as illustrated in FIGS. 11A, 11B and 15A close to said each of the memory-array blocks 423 to switch on or off said one of the pass/no-pass switches 258, or (4) the latched non-volatile memory cell 940 or 950 as illustrated in FIG. 9A or 9B having its output L3 or L12 coupling to one of the pass/no-pass switches 258 for one of the cross-point switches 379 as illustrated in FIGS. 11A, 11B and 15A close to said each of the memory-array blocks 423 to switch on or off said one of the pass/no-pass switches 258. Alternatively, in each of the memory-array blocks 423 are multiple of memory cells 362, each of which may be (1) the non-volatile memory cell 600, 650, 700, 760 or 800 as illustrated in FIG. 1A-1H, 2A-2E, 3A-3W, 4A-4S or 5A-5F having its output N0 coupling to one of the inputs, e.g., A0 and A1, of the second set and inputs SC-4 of one of the multiplexers 211 of one of the cross-point switches 379 as illustrated in FIGS. 11C and 15B close to said each of the memory-array blocks 423, (2) the non-volatile memory cell 900 as illustrated in FIG. 6E or 6G having its output M3 or M12 coupling to one of the inputs, e.g., A0 and A1, of the second set and inputs SC-4 of one of the multiplexers 211 of one of the cross-point switches 379 as illustrated in FIGS. 11C and 15B close to said each of the memory-array blocks 423, (3) the non-volatile memory cell 910 as illustrated in FIG. 7E, 7G, 7H or 7J having its output M6, M15, M9 or M18 coupling to one of the inputs, e.g., A0 and A1, of the second set and inputs SC-4 of one of the multiplexers 211 of one of the cross-point switches 379 as illustrated in FIGS. 11C and 15B close to said each of the memory-array blocks 423, or (4) the latched non-volatile memory cell 940 or 950 as illustrated in FIG. 9A or 9B having its output L3 or L12 coupling to one of the inputs, e.g., A0 and A1, of the second set and inputs SC-4 of one of the multiplexers 211 of one of the cross-point switches 379 as illustrated in FIGS. 11C and 15B close to said each of the memory-array blocks 423. Alternatively, in each of the memory-array blocks 423 are multiple of memory cells 362, each of which may be (1) the non-volatile memory cell 600, 650, 700, 760 or 800 as illustrated in FIG. 1A-1H, 2A-2E, 3A-3W, 4A-4S or 5A-5F having its output N0 coupling to one of the inputs, e.g., A0-A3, of the second set of the multiplexer 211 of one of the cross-point switches 379 as illustrated in FIGS. 11D and 15C close to said each of the memory-array blocks 423, (2) the non-volatile memory cell 900 as illustrated in FIG. 6E or 6G having its output M3 or M12 coupling to one of the inputs, e.g., A0-A3, of the second set of the multiplexer 211 of one of the cross-point switches 379 as illustrated in FIGS. 11D and 15C close to said each of the memory-array blocks 423, (3) the non-volatile memory cell 910 as illustrated in FIG. 7E, 7G, 7H or 7J having its output M6, M15, M9 or M18 coupling to one of the inputs, e.g., A0-A3, of the second set of the multiplexer 211 of one of the cross-point switches 379 as illustrated in FIGS. 11D and 15C close to said each of the memory-array blocks 423, or (4) the latched non-volatile memory cell 940 or 950 as illustrated in FIG. 9A or 9B having its output L3 or L12 coupling to one of the inputs, e.g., A0-A3, of the second set of the multiplexer 211 of one of the cross-point switches 379 as illustrated in FIGS. 11D and 15C close to said each of the memory-array blocks 423.

Referring to FIG. 17, the DPIIC chip 410 may include multiple intra-chip interconnects (not shown) each extending over spaces between neighboring two of the memory-array blocks 423, wherein said each of the intra-chip interconnects may be the programmable interconnect 361 or fixed interconnect 364 as illustrated in FIGS. 15A-15C. For the DPIIC chip 410, each of its small input/output (I/O) circuits 203, as illustrated in FIG. 13B, may have its output S_Data_in coupling to one or more of its programmable interconnects 361 and/or one or more of its fixed interconnects 364 and its input S_Data_out, S_Enable or S_Inhibit coupling to another one or more of its programmable interconnects 361 and/or another one or more of its fixed interconnects 364.

Referring to FIG. 17, the DPIIC chip 410 may include multiple of the I/O pads 372 as seen in FIG. 13B, each vertically over one of its small input/output (I/O) circuits 203, coupling to the node 381 of said one of its small input/output (I/O) circuits 203. In a first clock, a signal from one of the nodes N23-N26 of one of the cross-point switches 379 as illustrated in FIGS. 11A-11C, 15A and 15B, or the output Dout of one of the cross-point switches 379 as illustrated in FIGS. 11D and 15C, may be transmitted to the input S_Data_out of the small driver 374 of one of the small input/output (I/O) circuits 203 through one or more of the programmable interconnects 361, and then the small driver 374 of said one of the small input/output (I/O) circuits 203 may amplify its input S_Data_out to be transmitted to one of the I/O pads 372 vertically over said one of the small input/output (I/O) circuits 203 for external connection to circuits outside the DPIIC chip 410. In a second clock, a signal from circuits outside the DPIIC chip 410 may be transmitted to the small receiver 375 of said one of the small input/output (I/O) circuits 203 through said one of the I/O pads 372, and then the small receiver 375 of said one of the small input/output (I/O) circuits 203 may amplify the signal into its output S_Data_in to be transmitted to one of the nodes N23-N26 of another of the cross-point switches 379 as illustrated in FIGS. 11A-11C, 15A and 15B, or to one of the inputs D0-D15 of another of the cross-point switches 379 as illustrated in FIGS. 11D and 15C, through another one or more of the programmable interconnects 361. Referring to FIG. 17, the DPIIC chip 410 may further include (1) multiple power pads 205 for applying the voltage Vcc of power supply to the memory cells 362 for the cross-point switches 379 as illustrated in FIGS. 15A-15C, wherein the voltage Vcc of power supply may be between 0.2V and 2.5V, between 0.2V and 2V, between 0.2V and 1.5V, between 0.1V and 1V, or between 0.2V and 1V, or, smaller or lower than or equal to 2.5V, 2V, 1.8V, 1.5V or 1V, and (2) multiple ground pads 206 for providing the voltage Vss of ground reference to the memory cells 362 for the cross-point switches 379 as illustrated in FIGS. 15A-15C.

Specification for Dedicated Input/Output (I/O) Chip

Figure 18:
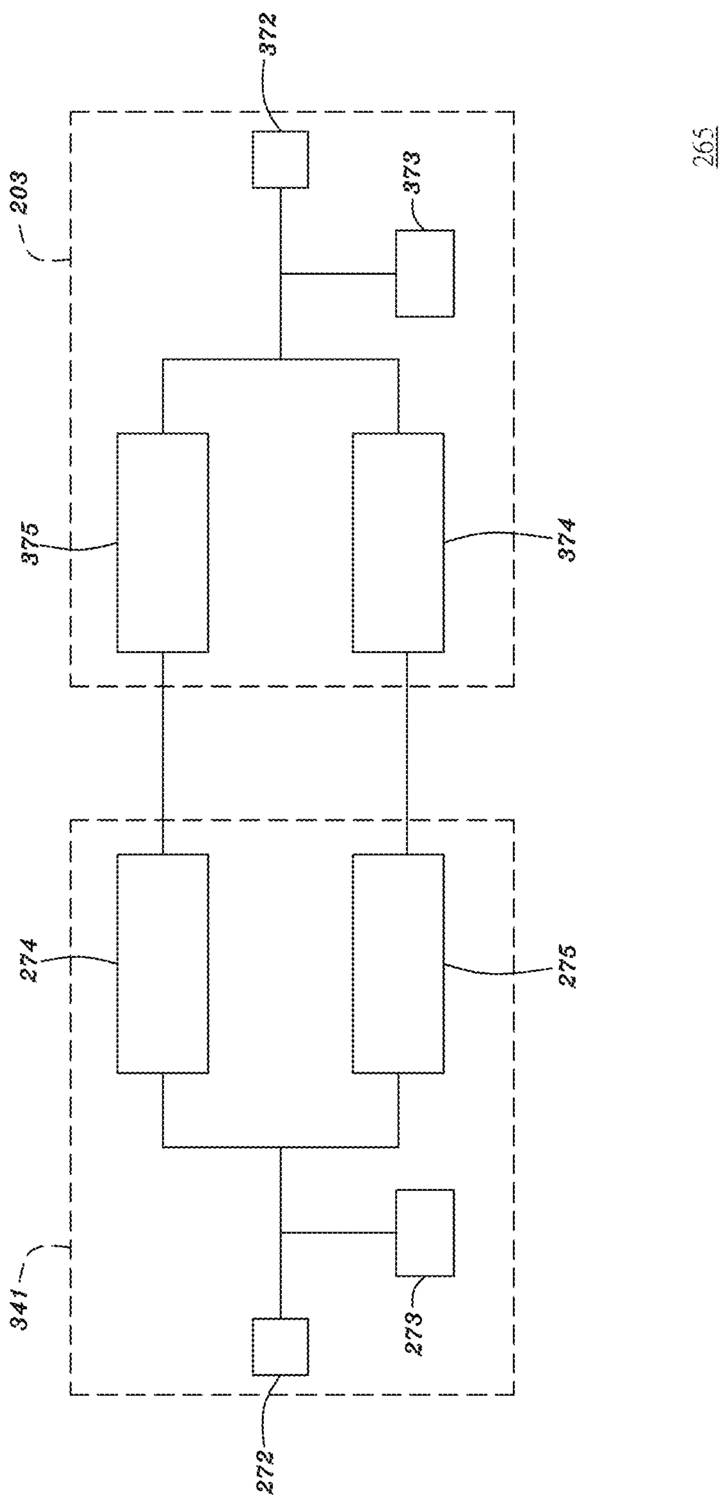
FIG. 18 is a schematically top view showing a block diagram of a dedicated input/output (I/O) chip in accordance with an embodiment of the present application.

FIG. 18 is a block diagram for a dedicated input/output (I/O) chip in accordance with an embodiment of the present application. Referring to FIG. 18, a dedicated input/output (I/O) chip 265 may include a plurality of the large I/O circuit 341 (only one is shown) and a plurality of the small I/O circuit 203 (only one is shown). The large I/O circuit 341 may be referred to one as illustrated in FIG. 13A; the small I/O circuit 203 may be referred to one as illustrated in FIG. 13B.

Referring to FIGS. 13A, 13B and 18, each of the large I/O circuits 341 may be provided with the large driver 274 having the input L_Data_out coupling to the output S_Data_in of the small receiver 375 of one of the small I/O circuits 203. Each of the large I/O circuits 341 may be provided with the large receiver 275 having the node of L_Data_in coupling to the node of S_Data_out of the small driver 374 of one of the small I/O circuits 203. When the large driver 274 is enabled by the L_Enable signal, the small receiver 375 is activated by the S_Inhibit signal, the large receiver 275 is inhibited by the L_Inhibit signal and the small driver 374 is disabled by the S_Enable signal, data from the I/O pad 372 of the small I/O circuit 203 may pass to the I/O pad 272 of the large I/O circuit 341 through, in sequence, the small receiver 375 and large driver 274. When the large receiver 275 is activated by the L_Inhibit signal, the small driver 374 is enabled by the S_Enable signal, the large driver 274 is disabled by the L_Enable signal and the small receiver 375 is inhibited by the S_Inhibit signal, data from the I/O pad 272 of the large I/O circuit 341 may pass to the I/O pad 372 of the small I/O circuit 203 through, in sequence, the large receiver 275 and small driver 374.

Specification for Logic Drive

Various types of standard commodity logic drives, packages, package drives, devices, modules, disks or disk drives (to be abbreviated as "drive" below, that is when "drive" is mentioned below, it means and reads as "drive, package, package drive, device, module, disk or disk drive") are introduced in the following paragraphs.

I. First Type of Logic Drive

Figure 19A:
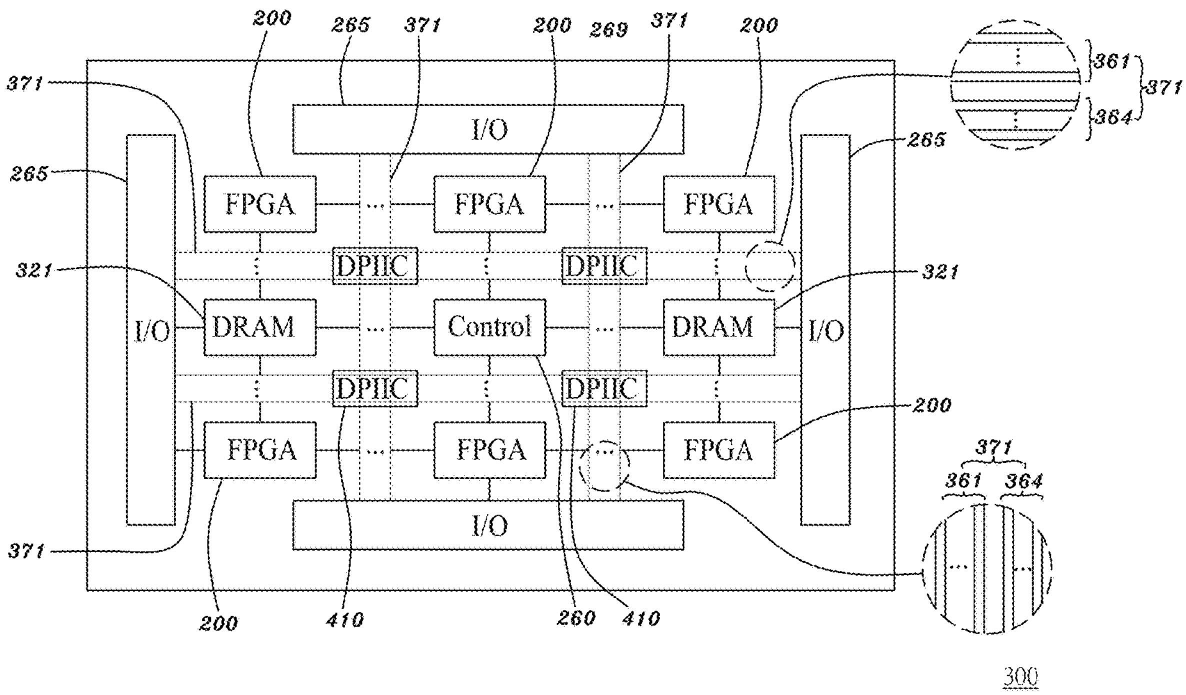
FIGS. 19A-19N are schematically top views showing various arrangement for a logic drive in accordance with an embodiment of the present application.

FIG. 19A is a schematically top view showing arrangement for various chips packaged in a first type of standard commodity logic drive in accordance with an embodiment of the present application. Referring to FIG. 19A, the standard commodity logic drive 300 may be packaged with a plurality of the standard commodity FPGA IC chip 200 as illustrated in FIGS. 16A-16J, one or more dynamic random-access memory (DRAM) chips 321 and a dedicated control chip 260, which are arranged in an array, wherein the dedicated control chip 260 may be surrounded by the standard commodity FPGA IC chips 200 and DRAM IC chips 321 and arranged between the DRAM IC chips 321 and/or between the standard commodity FPGA IC chips 200. One of the DRAM IC chips 321 at a right middle side of the logic drive 300 may be arranged between two of the standard commodity FPGA IC chips 200 at right top and right bottom sides of the logic drive 300. One of the DRAM IC chips 321 at a left middle side of the logic drive 300 may be arranged between two of the standard commodity FPGA IC chips 200 at left top and left bottom sides of the logic drive 300. Some of the FPGA IC chips 200 may be arranged in a line at a top side of the logic drive 300. Some of the FPGA IC chips 200 may be arranged in a line at a bottom side of the logic drive 300.

Referring to FIG. 19A, the logic drive 300 may include multiple inter-chip interconnects 371 each extending over spaces between neighboring two of the standard commodity FPGA IC chips 200, DRAM IC chips 321 and dedicated control chip 260. The logic drive 300 may include a plurality of the DPIIC chip 410 aligned with a cross of a vertical bundle of inter-chip interconnects 371 and a horizontal bundle of inter-chip interconnects 371. Each of the DPIIC chips 410 is at corners of four of the standard commodity FPGA IC chips 200, DRAM IC chips 321 and dedicated control chip 260 around said each of the DPIIC chips 410. For example, one of the DPIIC chips 410 at a left top corner of the dedicated control chip 260 may have a first minimum distance to a first one of the standard commodity FPGA IC chips 200 at a left top corner of said one of the DPIIC chips 410, wherein the first minimum distance is the one between the right bottom corner of the first one of the standard commodity FPGA IC chips 200 and the left top corner of said one of the DPIIC chips 410; said one of the DPIIC chips 410 may have a second minimum distance to a second one of the standard commodity FPGA IC chips 200 at a right top corner of said one of the DPIIC chips 410, wherein the second minimum distance is the one between the left bottom corner of the second one of the standard commodity FPGA IC chips 200 and the right top corner of said one of the DPIIC chips 410; said one of the DPIIC chips 410 may have a third minimum distance to one of the DRAM IC chips 321 at a left bottom corner of said one of the DPIIC chips 410, wherein the third minimum distance is the one between the right top corner of said one of the DRAM IC chips 321 and the left bottom corner of said one of the DPIIC chips 410; said one of the DPIIC chips 410 may have a fourth minimum distance to the dedicated control chip 260 at a right bottom corner of said one of the DPIIC chips 410, wherein the fourth minimum distance is the one between the left top corner of the dedicated control chip 260 and the right bottom corner of said one of the DPIIC chips 410.

Referring to FIG. 19A, each of the inter-chip interconnects 371 may be the programmable or fixed interconnect 361 or 364 as illustrated in FIGS. 15A-15F in the sections of "Specification for Programmable Interconnect" and "Specification for Fixed Interconnect". Signal transmission may be built (1) between one of the programmable interconnects 361 of the inter-chip interconnects 371 and one of the programmable interconnects 361 of the intra-chip interconnects 502 of one of the standard commodity FPGA IC chips 200 via one of the small input/output (I/O) circuits 203 of said one of the standard commodity FPGA IC chips 200 or (2) between one of the programmable interconnects 361 of the inter-chip interconnects 371 and one of the programmable interconnects 361 of the intra-chip interconnects of one of the DPIIC chips 410 via one of the small input/output (I/O) circuits 203 of said one of the DPIIC chips 410. Signal transmission may be built (1) between one of the fixed interconnects 364 of the inter-chip interconnects 371 and one of the fixed interconnects 364 of the intra-chip interconnects 502 of one of the standard commodity FPGA IC chips 200 via one of the small input/output (I/O) circuits 203 of said one of the standard commodity FPGA IC chips 200 or (2) between one of the fixed interconnects 364 of the inter-chip interconnects 371 and one of the fixed interconnects 364 of the intra-chip interconnects of one of the DPIIC chips 410 via one of the small input/output (I/O) circuits 203 of said one of the DPIIC chips 410.

Referring to FIG. 19A, one or more of the programmable or fixed interconnects 361 or 364 of the inter-chip interconnects 371 may couple from each of the standard commodity FPGA IC chips 200 to all of the DPIIC chips 410. One or more of the programmable or fixed interconnects 361 or 364 of the inter-chip interconnects 371 may couple from each of the standard commodity FPGA IC chips 200 to the dedicated control chip 260. One or more of the programmable or fixed interconnects 361 or 364 of the inter-chip interconnects 371 may couple from each of the standard commodity FPGA IC chips 200 to both of the DRAM IC chips 321. One or more of the programmable or fixed interconnects 361 or 364 of the inter-chip interconnects 371 may couple from each of the standard commodity FPGA IC chips 200 to the others of the standard commodity FPGA IC chips 200. One or more of the programmable or fixed interconnects 361 or 364 of the inter-chip interconnects 371 may couple from each of the DPIIC chips 410 to the dedicated control chip 260. One or more of the programmable or fixed interconnects 361 or 364 of the inter-chip interconnects 371 may couple from each of the DPIIC chips 410 to both of the DRAM IC chips 321. One or more of the programmable or fixed interconnects 361 or 364 of the inter-chip interconnects 371 may couple from each of the DPIIC chips 410 to the others of the DPIIC chips 410. One or more of the programmable or fixed interconnects 361 or 364 of the inter-chip interconnects 371 may couple from each of the DRAM IC chips 321 to the dedicated control chip 260. One or more of the programmable or fixed interconnects 361 or 364 of the inter-chip interconnects 371 may couple from each of the DRAM IC chips 321 to the other of the DRAM IC chips 321.

Accordingly, referring to FIG. 19A, a first one of the standard commodity FPGA IC chips 200 may have a first one of the programmable logic blocks 201, as illustrated in FIG. 14A or 14H, to transmit its output Dout, C0, C1, C2 or C3 to one of the inputs A0-A3 of a second one of the programmable logic blocks 201, as illustrated in FIG. 14A or 14H, of a second one of the standard commodity FPGA IC chips 200 through one of the cross-point switches 379 of one of the DPIIC chips 410. The output Dout of the first one of the programmable logic blocks 201 may be passed to said one of the inputs A0-A3 of the second one of the programmable logic blocks 201 through, in sequence, (1) the programmable interconnects 361 of the intra-chip interconnects 520 of the first one of the standard commodity FPGA IC chips 200, (2) a first group of programmable interconnects 361 of the inter-chip interconnects 371, (3) a first group of programmable interconnects 361 of the intra-chip interconnects of said one of the DPIIC chips 410, (4) said one of the cross-point switches 379 of said one of the DPIIC chips 410, (5) a second group of programmable interconnects 361 of the intra-chip interconnects of said one of the DPIIC chips 410, (6) a second group of programmable interconnects 361 of the inter-chip interconnects 371 and (7) the programmable interconnects 361 of the intra-chip interconnects 502 of the second one of the standard commodity FPGA IC chips 200.

Alternatively, referring to FIG. 19A, one of the standard commodity FPGA IC chips 200 may have a first one of the programmable logic blocks 201, as illustrated in FIG. 14A or 14H, to transmit its output Dout, C0, C1, C2 or C3 to one of the inputs A0-A3 of a second one of the programmable logic blocks 201, as illustrated in FIG. 14A or 14H, of said one of the standard commodity FPGA IC chips 200 through one of the cross-point switches 379 of one of the DPIIC chips 410. The output Dout of the first one of the programmable logic blocks 201 may be passed to one of the inputs A0-A3 of the second one of the programmable logic blocks 201 through, in sequence, (1) a first group of programmable interconnects 361 of the intra-chip interconnects 502 of said one of the standard commodity FPGA IC chips 200, (2) a first group of programmable interconnects 361 of the inter-chip interconnects 371, (3) a first group of programmable interconnects 361 of the intra-chip interconnects of said one of the DPIIC chips 410, (4) said one of the cross-point switches 379 of said one of DPIIC chips 410, (5) a second group of programmable interconnects 361 of the intra-chip interconnects of said one of the DPIIC chips 410, (6) a second group of programmable interconnects 361 of the inter-chip interconnects 371 and (7) a second group of programmable interconnects 361 of the intra-chip interconnects 502 of said one of the standard commodity FPGA IC chips 200.

Referring to FIG. 19A, the logic drive 300 may include multiple dedicated input/output (I/O) chips 265 in a peripheral region thereof surrounding a central region thereof having the standard commodity FPGA IC chips 200, DRAM IC chips 321, dedicated control chip 260 and DPIIC chips 410 located therein. One or more of the programmable or fixed interconnects 361 or 364 of the inter-chip interconnects 371 may couple from each of the standard commodity FPGA IC chips 200 to all of the dedicated input/output (I/O) chips 265. One or more of the programmable or fixed interconnects 361 or 364 of the inter-chip interconnects 371 may couple from one of the DPIIC chips 410 to one of the dedicated input/output (I/O) chips 265. One or more of the programmable or fixed interconnects 361 or 364 of the inter-chip interconnects 371 may couple from one of the DRAM IC chips 321 to all of the dedicated input/output (I/O) chips 265. One or more of the programmable or fixed interconnects 361 or 364 of the inter-chip interconnects 371 may couple from the dedicated control chip 260 to all of the dedicated input/output (I/O) chips 265. One or more of the programmable or fixed interconnects 361 or 364 of the inter-chip interconnects 371 may couple from each of the dedicated input/output (I/O) chips 265 to the others of the dedicated input/output (I/O) chips 265.

Referring to FIG. 19A, each of the standard commodity FPGA IC chips 200 may be referred to ones as illustrated in FIGS. 16A-16J, and each of the DPIIC chips 410 may be referred to ones as illustrated in FIG. 17.

Referring to FIG. 19A, each of the dedicated I/O chips 265 and dedicated control chip 260 may be designed, implemented and fabricated using varieties of semiconductor technology nodes or generations, including old or matured technology nodes or generations, for example, a semiconductor node or generation less advanced than or equal to, or more mature than 20 nm or 30 nm, and for example using the technology node of 22 nm, 28 nm, 40 nm, 90 nm, 130 nm, 180 nm, 250 nm, 350 nm or 500 nm. Packaged in the same logic drive 300, the semiconductor technology node or generation used in each of the dedicated I/O chip 265 and dedicated control chip 260 is 1, 2, 3, 4, 5 or greater than 5 nodes or generations older, more matured or less advanced than that used in each of the standard commodity FPGA IC chips 200 and DPIIC chips 410.

Referring to FIG. 19A, transistors or semiconductor devices used in each of the dedicated I/O chips 265 and dedicated control chip 260 may be a Fully Depleted Silicon-on-insulator (FDSOI) MOSFET, a Partially Depleted Silicon-on-insulator (PDSOI) MOSFET or a conventional MOSFET. Packaged in the same logic drive 300, transistors or semiconductor devices used in each of the dedicated I/O chips 265 and dedicated control chip 260 may be different from those used in each of the standard commodity FPGA IC chips 200 and DPIIC chips 410; for example, packaged in the same logic drive 300, each of the dedicated I/O chips 265 and dedicated control chip 260 may use the conventional MOSFET, while each of the standard commodity FPGA IC chips 200 and DPIIC chips 410 may use the FINFET; alternatively, packaged in the same logic drive 300, each of the dedicated I/O chips 265 and dedicated control chip 260 may use the Fully Depleted Silicon-on-insulator (FDSOI) MOSFET, while each of the standard commodity FPGA IC chips 200 and DPIIC chips 410 may use the FINFET.

Referring to FIG. 19A, the logic drive 300 may include a high-speed DRAM IC chip or chips 321 for fast access of data for processing and/or computing. Each of the DRAM IC chips 321 may be fabricated using a technology generation or node, for example, more advanced than or equal to 40 nm, 28 nm, 20 nm, 16 nm or 10 nm. Each of the DRAM IC chips 321 may have a standard memory density, capacity or size of greater than or equal to 64 Mb, 512 Mb, 1 Gb, 4 Gb, 16 Gb, 64 Gb, 128 Gb, 256 Gb, or 512 Gb, wherein "b" is bits. The data needed in the processing or computing may be taken or accessed from the data stored in the DRAM IC chips 321 and the resulting data from the processing or computing of the standard commodity FPGA IC chips 200 may be stored in the DRAM IC chips 321.

Referring to FIG. 19A, packaged in the same logic drive 300, the voltage Vcc of power supply used in each of the dedicated I/O chips 265 and dedicated control chip 260 may be greater than or equal to 1.5V, 2.0V, 2.5V, 3V, 3.5V, 4V, or 5V, while the voltage Vcc of power supply used in each of the standard commodity FPGA IC chips 200 and DPIIC chips 410 may be between 0.2V and 2.5V, between 0.2V and 2V, between 0.2V and 1.5V, between 0.1V and 1V, or 0.2V and 1V, or smaller or lower than or equal to 2.5V, 2V, 1.8V, 1.5V or 1V. Packaged in the same logic drive 300, the voltage Vcc of power supply used in each of the dedicated I/O chips 265 and dedicated control chip 260 may be different from that used in each of the standard commodity FPGA IC chips 200 and DPIIC chips 410; for example, packaged in the same logic drive 300, each of the dedicated I/O chips 265 and dedicated control chip 260 may use the voltage Vcc of power supply at 4V, while each of the standard commodity FPGA IC chips 200 and DPIIC chips 410 may use the voltage Vcc of power supply at 1.5V; alternatively, packaged in the same logic drive 300, each of the dedicated I/O chips 265 and dedicated control chip 260 may use the voltage Vcc of power supply at 2.5V, while each of the standard commodity FPGA IC chips 200 and DPIIC chips 410 packaged in the same logic drive 300 may use the voltage Vcc of power supply at 0.75V.

Referring to FIG. 19A, packaged in the same logic drive 300, the gate oxide (physical) thickness of the Field-Effect-Transistors (FETs) of semiconductor devices used in each of the dedicated I/O chips 265 and dedicated control chip 260 may be thicker than or equal to 5 nm, 6 nm, 7.5 nm, 10 nm, 12.5 nm, or 15 nm, while the gate oxide (physical) thickness of FETs of semiconductor devices used in each of the standard commodity FPGA IC chips 200 and DPIIC chips 410 may be thinner than 4.5 nm, 4 nm, 3 nm or 2 nm. Packaged in the same logic drive 300, the gate oxide (physical) thickness of FETs of the semiconductor devices used in each of the dedicated I/O chips 265 and dedicated control chip 260 may be different from that used in each of the standard commodity FPGA IC chips 200 and DPIIC chips 410; for example, packaged in the same logic drive 300, each of the dedicated I/O chips 265 and dedicated control chip 260 may use a gate oxide (physical) thickness of FETs of 10 nm, while each of the standard commodity FPGA IC chips 200 and DPIIC chips 410 may use a gate oxide (physical) thickness of FETs of 3 nm; alternatively, packaged in the same logic drive 300, each of the dedicated I/O chips 265 and dedicated control chip 260 may use a gate oxide (physical) thickness of FETs of 7.5 nm, while each of the standard commodity FPGA IC chips 200 and DPIIC chips 410 may use a gate oxide (physical) thickness of FETs of 2 nm.

Referring to FIG. 19A, each of the dedicated I/O chip(s) 165 in the multi-chip package of the standard commodity logic drive 300 may have the circuits as illustrated in FIG. 18. Each of the dedicated I/O chip(s) 165 may arrange a plurality of the large I/O circuit 341 and I/O pad 272, as seen in FIGS. 13A and 18, for the logic drive 300 to employ one or multiple (2, 3, 4, or more than 4) Universal Serial Bus (USB) ports, one or more IEEE 1394 ports, one or more Ethernet ports, one or more HDMI ports, one or more VGA ports, one or more audio ports or serial ports, for example, RS-232 or COM (communication) ports, wireless transceiver I/Os, and/or Bluetooth transceiver I/Os, and etc. Each of the dedicated I/O chips 165 may have a plurality of the large I/O circuit 341 and I/O pad 272, as seen in FIGS. 13A and 18, for the logic drive 300 to employ Serial Advanced Technology Attachment (SATA) ports, or Peripheral Components Interconnect express (PCIe) ports to communicate, connect or couple with a memory drive.

Referring to FIG. 19A, the standard commodity FPGA IC chips 200 may have standard common features or specifications, counts, mentioned as below: (1) programmable logic blocks (LB) 201 including (i) system gates with the count greater than or equal to 2M, 10M, 20M, 50M or 100M, (ii) logic cells or elements with the count greater than or equal to 64K, 128K, 512K, 1M, 4M or 8M, (iii) hard macros, for example DSP slices, microcontroller macros, multiplexer macros, fixed-wired adders, and/or fixed-wired multipliers and/or (iv) blocks of memory with the bit count equal to or greater than 1M, 10M, 50M, 100M, 200M or 500M bits; (2) the number of the inputs of each of its programmable logic blocks (LB) 201 for each of the standard commodity FPGA IC chips 200 may be greater or equal to 4, 8, 16, 32, 64, 128, or 256; (3) the voltage Vcc of power supply applied to the power pads 205 for each of the standard commodity FPGA IC chips 200 may be between 0.1V and 2.5V, 0.1V and 2V, 0.1V and 1.5V, or 0.1V and 1V; (4) the I/O pads 372 of the standard commodity FPGA IC chips 200 may have the same layout and number, and the I/O pads 372 at the same relative location to the respective standard commodity FPGA IC chips 200 have the same function.

II. Second Type of Logic Drive

Figure 19B:
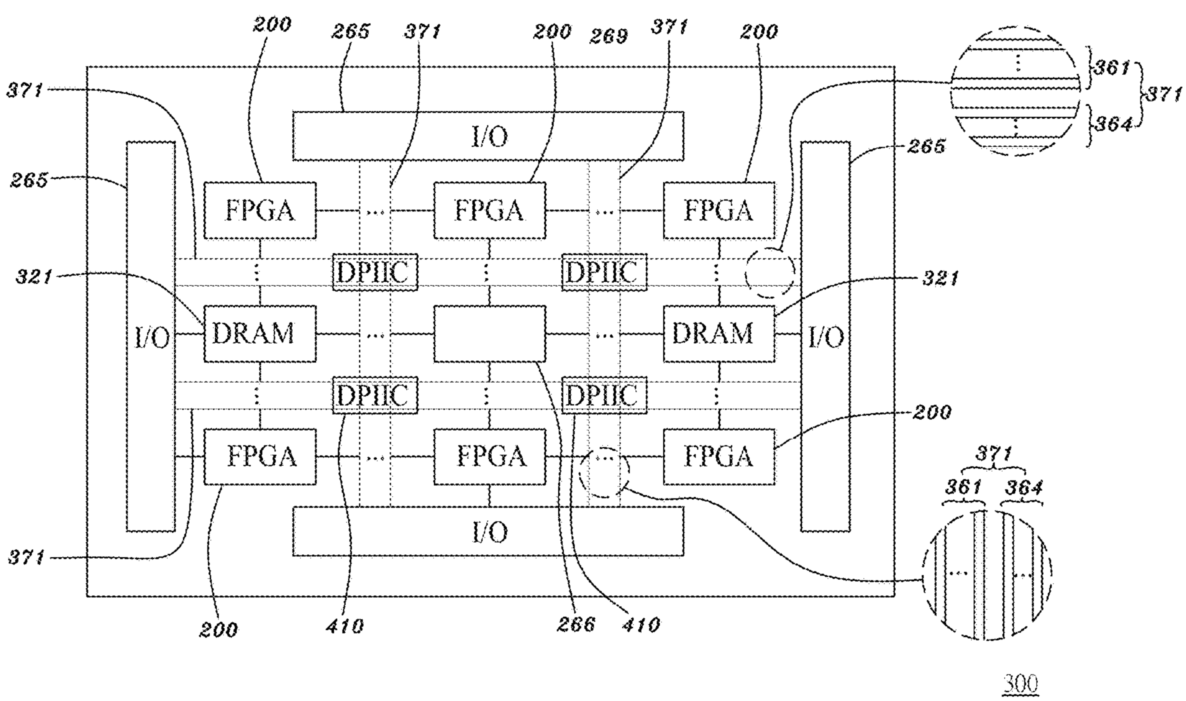

FIG. 19B is a schematically top view showing arrangement for various chips packaged in a second type of standard commodity logic drive in accordance with an embodiment of the present application. Referring to FIG. 19B, the dedicated control chip 260 and dedicated I/O chips 265 have functions that may be combined into a single chip 266, i.e., dedicated control and I/O chip, to perform above-mentioned functions of the dedicated control chip 260 and dedicated I/O chips 265. The dedicated control and I/O chip 266 may include the architecture as seen in FIG. 18. The dedicated control chip 260 as seen in FIG. 19A may be replaced with the dedicated control and I/O chip 266 to be packaged at the place where the dedicated control chip 260 is arranged. For an element indicated by the same reference number shown in FIGS. 19A and 13B, the specification of the element as seen in FIG. 19B and the process for forming the same may be referred to that of the element as illustrated in FIG. 19A and the process for forming the same.

For interconnection, referring to FIG. 19B, one or more of the programmable or fixed interconnects 361 or 364 of the inter-chip interconnects 371 may couple from each of the standard commodity FPGA IC chips 200 to the dedicated control and I/O chip 266. One or more of the programmable or fixed interconnects 361 or 364 of the inter-chip interconnects 371 may couple from each of the DPIIC chips 410 to the dedicated control and I/O chip 266. One or more of the programmable or fixed interconnects 361 or 364 of the inter-chip interconnects 371 may couple from the dedicated control and I/O chip 266 to all of the dedicated input/output (I/O) chips 265. One or more of the programmable or fixed interconnects 361 or 364 of the inter-chip interconnects 371 may couple from the dedicated control and I/O chip 266 to both of the DRAM IC chips 321.

Referring to FIG. 19B, each of the dedicated I/O chips 265 and dedicated control and I/O chip 266 is designed, implemented and fabricated using varieties of semiconductor technology nodes or generations, including old or matured technology nodes or generations, for example, a semiconductor node or generation less advanced than or equal to, or more mature than 20 nm or 30 nm, and for example using the technology node of 22 nm, 28 nm, 40 nm, 90 nm, 130 nm, 180 nm, 250 nm, 350 nm or 500 nm. Packaged in the same logic drive 300, the semiconductor technology node or generation used in each of the dedicated I/O chip 265 and dedicated control and I/O chip 266 is 1, 2, 3, 4, 5 or greater than 5 nodes or generations older, more matured or less advanced than that used in each of the standard commodity FPGA IC chips 200 and DPIIC chips 410.

Referring to FIG. 19B, transistors or semiconductor devices used in each of the dedicated I/O chips 265 and dedicated control and I/O chip 266 may be a Fully Depleted Silicon-on-insulator (FDSOI) MOSFET, a Partially Depleted Silicon-on-insulator (PDSOI) MOSFET or a conventional MOSFET. Packaged in the same logic drive 300, transistors or semiconductor devices used in each of the dedicated I/O chips 265 and dedicated control and I/O chip 266 may be different from that used in each of the standard commodity FPGA IC chips 200 and DPIIC chips 410; for example, packaged in the same logic drive 300, each of the dedicated I/O chips 265 and dedicated control and I/O chip 266 may use the conventional MOSFET, while each of the standard commodity FPGA IC chips 200 and DPIIC chips 410 may use the FINFET; alternatively, packaged in the same logic drive 300, each of the dedicated I/O chips 265 and dedicated control and I/O chip 266 may use the Fully Depleted Silicon-on-insulator (FDSOI) MOSFET, while each of the standard commodity FPGA IC chips 200 and DPIIC chips 410 may use the FINFET.

Referring to FIG. 19B, packaged in the same logic drive 300, the voltage Vcc of power supply used in each of the dedicated I/O chips 265 and dedicated control and I/O chip 266 may be greater than or equal to 1.5V, 2.0V, 2.5V, 3V, 3.5V, 4V, or 5V, while the voltage Vcc of power supply used in each of the standard commodity FPGA IC chips 200 and DPIIC chips 410 may be between 0.2V and 2.5V, between 0.2V and 2V, between 0.2V and 1.5V, between 0.1V and 1V, or between 0.2V and 1V, or smaller or lower than or equal to 2.5V, 2V, 1.8V, 1.5V or 1V. Packaged in the same logic drive 300, the voltage Vcc of power supply used in each of the dedicated I/O chips 265 and dedicated control and I/O chip 266 may be different from that used in each of the standard commodity FPGA IC chips 200 and DPIIC chips 410; for example, packaged in the same logic drive 300, each of the dedicated I/O chips 265 and dedicated control and I/O chip 266 may use a the voltage Vcc of power supply at 4V, while each of the standard commodity FPGA IC chips 200 and DPIIC chips 410 may use the voltage Vcc of power supply at 1.5V; alternatively, packaged in the same logic drive 300, each of the dedicated I/O chips 265 and dedicated control and I/O chip 266 may use the voltage Vcc of power supply at 2.5V, while each of the standard commodity FPGA IC chips 200 and DPIIC chips 410 may use the voltage Vcc of power supply at 0.75V.

Referring to FIG. 19B, packaged in the same logic drive 300, the gate oxide (physical) thickness of the Field-Effect-Transistors (FETs) of semiconductor devices used in each of the dedicated I/O chips 265 and dedicated control and I/O chip 266 may be thicker than or equal to 5 nm, 6 nm, 7.5 nm, 10 nm, 12.5 nm, or 15 nm, while the gate oxide (physical) thickness of FETs of semiconductor devices used in each of the standard commodity FPGA IC chips 200 and DPIIC chips 410 may be thinner than 4.5 nm, 4 nm, 3 nm or 2 nm. Packaged in the same logic drive 300, the gate oxide (physical) thickness of FETs of the semiconductor devices used in each of the dedicated I/O chips 265 and dedicated control and I/O chip 266 may be different from that used in each of the standard commodity FPGA IC chips 200 and DPIIC chips 410; for example, packaged in the same logic drive 300, each of the dedicated I/O chips 265 and dedicated control and I/O chip 266 may use a gate oxide (physical) thickness of FETs of 10 nm, while each of the standard commodity FPGA IC chips 200 and DPIIC chips 410 may use a gate oxide (physical) thickness of FETs of 3 nm; alternatively, packaged in the same logic drive 300, each of the dedicated I/O chips 265 and dedicated control and I/O chip 266 may use a gate oxide (physical) thickness of FETs of 7.5 nm, while each of the standard commodity FPGA IC chips 200 and DPIIC chips 410 may use a gate oxide (physical) thickness of FETs of 2 nm.

III. Third Type of Logic Drive

Figure 19C:
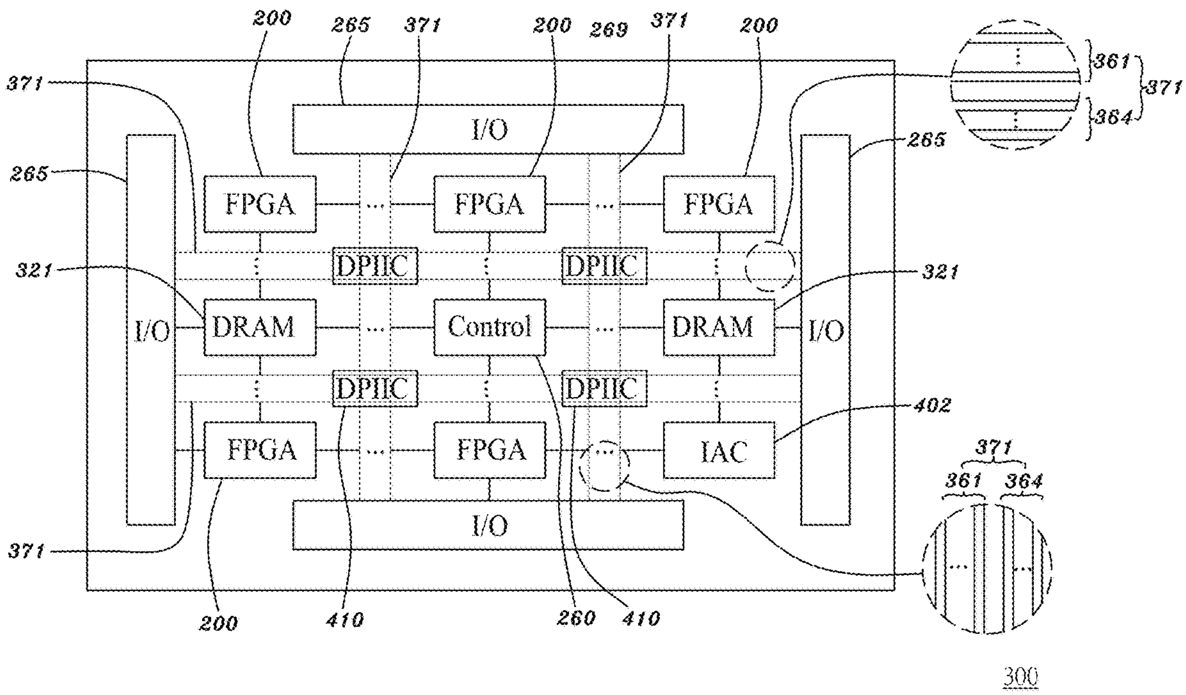

FIG. 19C is a schematically top view showing arrangement for various chips packaged in a third type of standard commodity logic drive in accordance with an embodiment of the present application. The structure shown in FIG. 19C is similar to that shown in FIG. 19A but the difference therebetween is that an Innovated ASIC or COT (abbreviated as IAC below) chip 402 may be further provided to be packaged in the logic drive 300. For an element indicated by the same reference number shown in FIGS. 19A and 19C, the specification of the element as seen in FIG. 19C and the process for forming the same may be referred to that of the element as illustrated in FIG. 19A and the process for forming the same.

Referring to FIG. 19C, the IAC chip 402 may be configured for Intellectual Property (IP) circuits, Application Specific (AS) circuits, analog circuits, mixed-mode signal circuits, Radio-Frequency (RF) circuits, and/or transmitter, receiver, transceiver circuits, etc. Each of the dedicated I/O chips 265, dedicated control chip 260 and IAC chip 402 is designed, implemented and fabricated using varieties of semiconductor technology nodes or generations, including old or matured technology nodes or generations, for example, less advanced than or equal to, or more mature than 20 nm or 30 nm, and for example using the technology node of 22 nm, 28 nm, 40 nm, 90 nm, 130 nm, 180 nm, 250 nm, 350 nm or 500 nm. Packaged in the same logic drive 300, the semiconductor technology node or generation used in each of the dedicated I/O chips 265, dedicated control chip 260 and IAC chip 402 is 1, 2, 3, 4, 5 or greater than 5 nodes or generations older, more matured or less advanced than that used in each of the standard commodity FPGA IC chips 200 and DPIIC chips 410. Transistors or semiconductor devices used in the IAC chip 402 may be a FINFET, a FINFET on Silicon-On-Insulator (FINFET SOI), a Fully Depleted Silicon-on-insulator (FDSOI) MOSFET, a Partially Depleted Silicon-on-insulator (PDSOI) MOSFET or a conventional MOSFET. Packaged in the same logic drive 300, transistors or semiconductor devices used in each of the dedicated I/O chips 265, dedicated control chip 260 and IAC chip 402 may be different from that used in each of the standard commodity FPGA IC chips 200 and DPIIC chips 410; for example, packaged in the same logic drive 300, each of the dedicated I/O chips 265, dedicated control chip 260 and IAC chip 402 may use the conventional MOSFET, while each of the standard commodity FPGA IC chips 200 and DPIIC chips 410 may use the FINFET; alternatively, packaged in the same logic drive 300, each of the dedicated I/O chips 265, dedicated control chip 260 and IAC chip 402 may use the Fully Depleted Silicon-on-insulator (FDSOI) MOSFET, while each of the standard commodity FPGA IC chips 200 and DPIIC chips 410 may use the FINFET.

Since the IAC chip 402 in this aspect of disclosure may be designed and fabricated using older or less advanced technology nodes or generations, for example, less advanced than or equal to, or more mature than 20 nm or 30 nm, and for example using the technology node of 22 nm, 28 nm, 40 nm, 90 nm, 130 nm, 180 nm, 250 nm, 350 nm or 500 nm, its NRE cost is cheaper than or less than that of the current or conventional ASIC or COT chip designed and fabricated using an advanced IC technology node or generation, for example, more advanced than or below 20 nm or 10 nm, and for example using the technology node of 16 nm, 14 nm, 12 nm, 10 nm, 7 nm, 5 nm or 3 nm. The NRE cost for designing a current or conventional ASIC or COT chip using an advanced IC technology node or generation, for example, more advanced than or below 20 nm or 10 nm, may be more than US $5M, US $10M, US $20M or even exceeding US $50M, or US $100M. The cost of a photo mask set for an ASIC or COT chip at the 16 nm technology node or generation is over US $2M, US $5M, or US $10M. Implementing the same or similar innovation and/or application using the third type of logic drive 300 including the IAC chip 402 designed and fabricated using older or less advanced technology nodes or generations, may reduce NRE cost down to less than US $10M, US $7M, US $5M, US $3M or US $1M. Compared to the implementation by developing the current or conventional ASIC or COT chip, the NRE cost of developing the IAC chip 402 for the same or similar innovation and/or application used in the third type of logic drive 300 may be reduced by a factor of larger than 2, 5, 10, 20, or 30.

For interconnection, referring to FIG. 19C, one or more of the programmable or fixed interconnects 361 or 364 of the inter-chip interconnects 371 may couple from each of the standard commodity FPGA IC chips 200 to the IAC chip 402. One or more of the programmable or fixed interconnects 361 or 364 of the inter-chip interconnects 371 may couple from each of the DPIIC chips 410 to the IAC chip 402. One or more of the programmable or fixed interconnects 361 or 364 of the inter-chip interconnects 371 may couple from the IAC chip 402 to all of the dedicated input/output (I/O) chips 265. One or more of the programmable or fixed interconnects 361 or 364 of the inter-chip interconnects 371 may couple from the IAC chip 402 to the dedicated control chip 260. One or more of the programmable or fixed interconnects 361 or 364 of the inter-chip interconnects 371 may couple from the IAC chip 402 to both of the DRAM IC chips 321.

IV. Fourth Type of Logic Drive

Figure 19D:
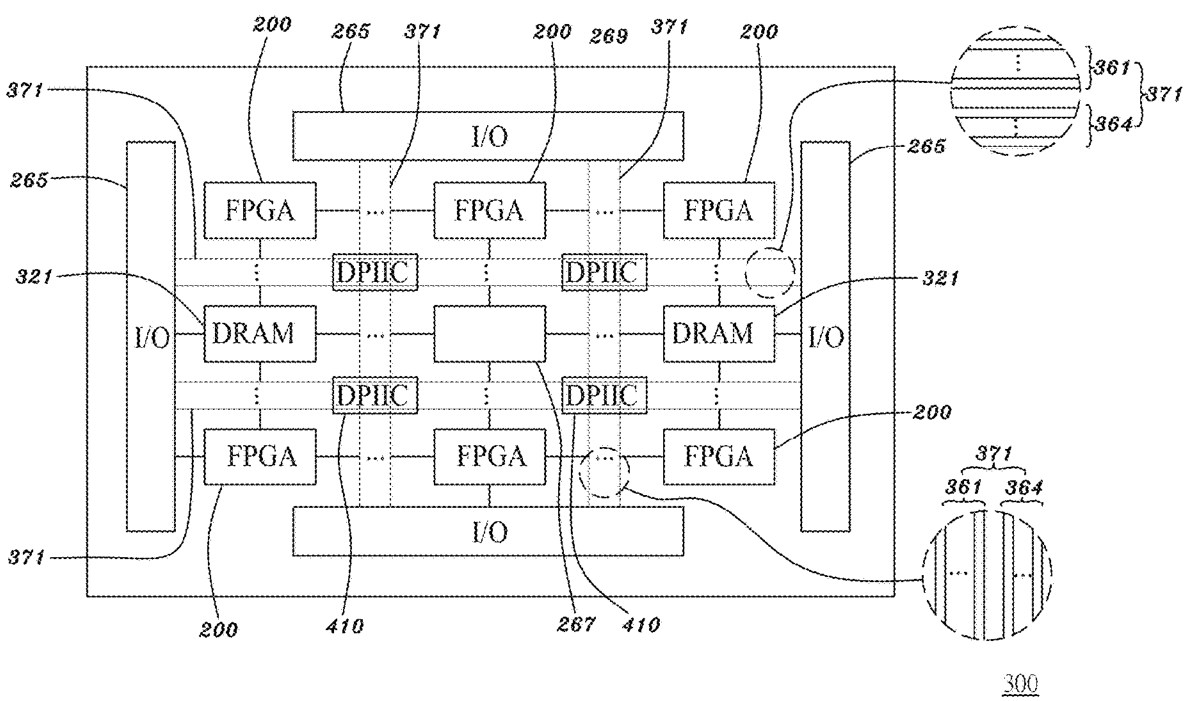

FIG. 19D is a schematically top view showing arrangement for various chips packaged in a fourth type of standard commodity logic drive in accordance with an embodiment of the present application. Referring to FIG. 19D, the functions of the dedicated control chip 260 and IAC chip 402 as seen in FIG. 19C may be incorporated into a single chip 267, i.e., dedicated control and IAC (abbreviated as DCIAC below) chip. The structure shown in FIG. 19D is similar to that shown in FIG. 19A but the difference therebetween is that the DCIAC chip 267 may be further provided to be packaged in the logic drive 300. The dedicated control chip 260 as seen in FIG. 19A may be replaced with the DCIAC chip 267 to be packaged at the place where the dedicated control chip 260 is arranged. For an element indicated by the same reference number shown in FIGS. 19A and 19D, the specification of the element as seen in FIG. 19D and the process for forming the same may be referred to that of the element as illustrated in FIG. 19A and the process for forming the same. The DCIAC chip 267 now comprises the control circuits, Intellectual Property (IP) circuits, Application Specific (AS) circuits, analog circuits, mixed-mode signal circuits, Radio-Frequency (RF) circuits, and/or transmitter, receiver, transceiver circuits, and etc.

Referring to FIG. 19D, each of the dedicated I/O chips 265 and DCIAC chip 267 is designed, implemented and fabricated using varieties of semiconductor technology nodes or generations, including old or matured technology nodes or generations, for example, less advanced than or equal to, or more mature than 20 nm or 30 nm, and for example using the technology node of 22 nm, 28 nm, 40 nm, 90 nm, 130 nm, 180 nm, 250 nm, 350 nm or 500 nm. Packaged in the same logic drive 300, the semiconductor technology node or generation used in each of the dedicated I/O chips 265 and DCIAC chip 267 is 1, 2, 3, 4, 5 or greater than 5 nodes or generations older, more matured or less advanced than that used in each of the standard commodity FPGA IC chips 200 and DPIIC chips 410. Transistors or semiconductor devices used in the DCIAC chip 267 may be a FINFET, a FINFET on Silicon-On-Insulator (FINFET SOI), a Fully Depleted Silicon-on-insulator (FDSOI) MOSFET, a Partially Depleted Silicon-on-insulator (PDSOI) MOSFET or a conventional MOSFET. Packaged in the same logic drive 300, transistors or semiconductor devices used in each of the dedicated I/O chips 265 and DCIAC chip 267 may be different from that used in each of the standard commodity FPGA IC chips 200 and DPIIC chips 410; for example, packaged in the same logic drive 300, each of the dedicated I/O chips 265 and DCIAC chip 267 may use the conventional MOSFET, while each of the standard commodity FPGA IC chips 200 and DPIIC chips 410 may use the FINFET; alternatively, packaged in the same logic drive 300, each of the dedicated I/O chips 265 and DCIAC chip 267 may use the Fully Depleted Silicon-on-insulator (FDSOI) MOSFET, while one of the standard commodity FPGA IC chips 200 and DPIIC chips 410 may use the FINFET.

Since the DCIAC chip 267 in this aspect of disclosure may be designed and fabricated using older or less advanced technology nodes or generations, for example, less advanced than or equal to, or more mature than 20 nm or 30 nm, and for example using the technology node of 22 nm, 28 nm, 40 nm, 90 nm, 130 nm, 180 nm, 250 nm, 350 nm or 500 nm, its NRE cost is cheaper than or less than that of the current or conventional ASIC or COT chip designed and fabricated using an advanced IC technology node or generation, for example, more advanced than or below 20 nm or 10 nm. The NRE cost for designing a current or conventional ASIC or COT chip using an advanced IC technology node or generation, for example, more advanced than or below 20 nm or 10 nm, may be more than US $5M, US $10M, US $20M or even exceeding US $50M, or US $100M. The cost of a photo mask set for an ASIC or COT chip at the 16 nm technology node or generation is over US $2M, US $5M or US $10M. Implementing the same or similar innovation and/or application using the fourth type of logic drive 300 including the DCIAC chip 267 designed and fabricated using older or less advanced technology nodes or generations may reduce NRE cost down to less than US $10M, US $7M, US $5M, US $3M or US $1M. Compared to the implementation by developing a current or conventional ASIC or COT chip, the NRE cost of developing the DCIAC chip 267 for the same or similar innovation and/or application used in the fourth type of logic drive 300 may be reduced by a factor of larger than 2, 5, 10, 20 or 30.

For interconnection, referring to FIG. 19D, one or more of the programmable or fixed interconnects 361 or 364 of the inter-chip interconnects 371 may couple from each of the standard commodity FPGA IC chips 200 to the DCIAC chip 267. One or more of the programmable or fixed interconnects 361 or 364 of the inter-chip interconnects 371 may couple from each of the DPIIC chips 410 to the DCIAC chip 267. One or more of the programmable or fixed interconnects 361 or 364 of the inter-chip interconnects 371 may couple from the DCIAC chip 267 to all of the dedicated input/output (I/O) chips 265. One or more of the programmable or fixed interconnects 361 or 364 of the inter-chip interconnects 371 may couple from the DCIAC chip 267 to both of the DRAM IC chips 321.

V. Fifth Type of Logic Drive

Figure 19E:
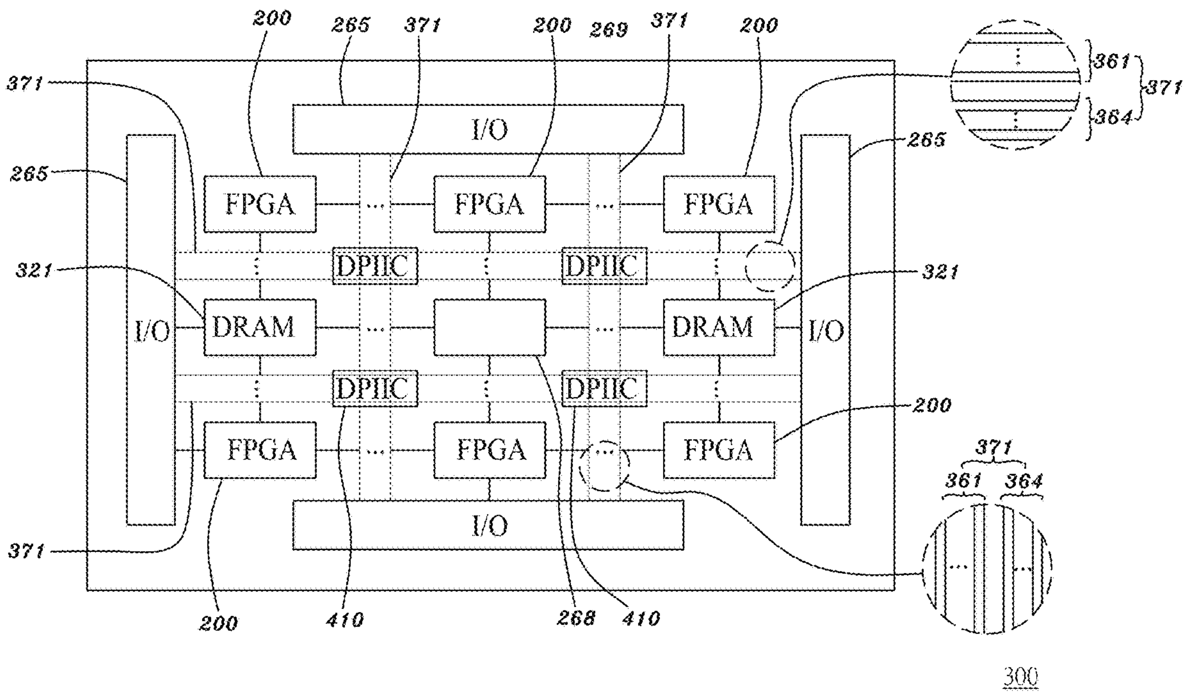

FIG. 19E is a schematically top view showing arrangement for various chips packaged in a fifth type of standard commodity logic drive in accordance with an embodiment of the present application. Referring to FIG. 19E, the functions of the dedicated control chip 260, dedicated I/O chips 265 and IAC chip 402 as seen in FIG. 19C may be incorporated into a single chip 268, i.e., dedicated control, dedicated I/O, and IAC (abbreviated as DCDI/OIAC below) chip. The structure shown in FIG. 19E is similar to that shown in FIG. 19A but the difference therebetween is that the DCDI/OIAC chip 268 may be further provided to be packaged in the logic drive 300. The dedicated control chip 260 as seen in FIG. 19A may be replaced with the DCDI/OIAC chip 268 to be packaged at the place where the dedicated control chip 260 is arranged. For an element indicated by the same reference number shown in FIGS. 19A and 19E, the specification of the element as seen in FIG. 19E and the process for forming the same may be referred to that of the element as illustrated in FIG. 19A and the process for forming the same. The DCDI/OIAC chip 268 may include the architecture as seen in FIG. 18. Further, the DCDI/OIAC chip 268 now comprises the control circuits, Intellectual Property (IP) circuits, Application Specific (AS) circuits, analog circuits, mixed-mode signal circuits, Radio-Frequency (RF) circuits, and/or transmitter, receiver, transceiver circuits, and etc.

Referring to FIG. 19E, the DCDI/OIAC chip 268 is designed, implemented and fabricated using varieties of semiconductor technology nodes or generations, including old or matured technology nodes or generations, for example, less advanced than or equal to, or more mature than 20 nm or 30 nm, and for example using the technology node of 22 nm, 28 nm, 40 nm, 90 nm, 130 nm, 180 nm, 250 nm, 350 nm or 500 nm. Packaged in the same logic drive 300, the semiconductor technology node or generation used in the DCDI/OIAC chip 268 is 1, 2, 3, 4, 5 or greater than 5 nodes or generations older, more matured or less advanced than that used in each of the standard commodity FPGA IC chips 200 and DPIIC chips 410. Transistors or semiconductor devices used in the DCDI/OIAC chip 268 may be a FINFET, a FINFET on Silicon-On-Insulator (FINFET SOI), a Fully Depleted Silicon-on-insulator (FDSOI) MOSFET, a Partially Depleted Silicon-on-insulator (PDSOI) MOSFET or a conventional MOSFET. Packaged in the same logic drive 300, transistors or semiconductor devices used in the DCDI/OIAC chip 268 may be different from that used in each of the standard commodity FPGA IC chips 200 and DPIIC chips 410; for example, packaged in the same logic drive 300, the DCDI/OIAC chip 268 may use the conventional MOSFET, while each of the standard commodity FPGA IC chips 200 and DPIIC chips 410 may use the FINFET; alternatively, packaged in the same logic drive 300, the DCDI/OIAC chip 268 may use the Fully Depleted Silicon-on-insulator (FDSOI) MOSFET, while each of the standard commodity FPGA IC chips 200 and DPIIC chips 410 may use the FINFET.

Since the DCDI/OIAC chip 268 in this aspect of disclosure may be designed and fabricated using older or less advanced technology nodes or generations, for example, less advanced than or equal to, or more mature than 20 nm or 30 nm, and for example using the technology node of 22 nm, 28 nm, 40 nm, 90 nm, 130 nm, 180 nm, 250 nm, 350 nm or 500 nm, its NRE cost is cheaper than or less than that of the current or conventional ASIC or COT chip designed and fabricated using an advanced IC technology node or generation, for example, a technology node or generation more advanced than or below 20 nm or 10 nm, and for example using the technology node of 16 nm, 14 nm, 12 nm, 10 nm, 7 nm, 5 nm or 3 nm. The NRE cost for designing an current or conventional ASIC or COT chip using an advanced IC technology node or generation, for example, a technology node or generation more advanced than or below 20 nm or 10 nm, may be more than US $5M, US $10M, US $20M or even exceeding US $50M, or US $100M. The cost of a photo mask set for an ASIC or COT chip at the 16 nm technology node or generation is over US $2M, US $5M or US $10M. Implementing the same or similar innovation and/or application using the fifth type of logic drive 300 including the DCDI/OIAC chip 268 designed and fabricated using older or less advanced technology nodes or generations, may reduce NRE cost down to less than US $10M, US $7M, US $5M, US $3M or US $1M. Compared to the implementation by developing a current or conventional ASIC or COT chip, the NRE cost of developing the DCDI/OIAC chip 268 for the same or similar innovation and/or application used in the fifth type of logic drive 300 may be reduced by a factor of larger than 2, 5, 10, 20 or 30.

For interconnection, referring to FIG. 19E, one or more of the programmable or fixed interconnects 361 or 364 of the inter-chip interconnects 371 may couple from each of the standard commodity FPGA IC chips 200 to the DCDI/OIAC chip 268. One or more of the programmable or fixed interconnects 361 or 364 of the inter-chip interconnects 371 may couple from each of the DPIIC chips 410 to the DCDI/OIAC chip 268. One or more of the programmable or fixed interconnects 361 or 364 of the inter-chip interconnects 371 may couple from the DCDI/OIAC chip 268 to all of the dedicated input/output (I/O) chips 265. One or more of the programmable or fixed interconnects 361 or 364 of the inter-chip interconnects 371 may couple from the DCDI/OIAC chip 268 to both of the DRAM IC chips 321.

VI. Sixth Type of Logic Drive

Figure 19F:
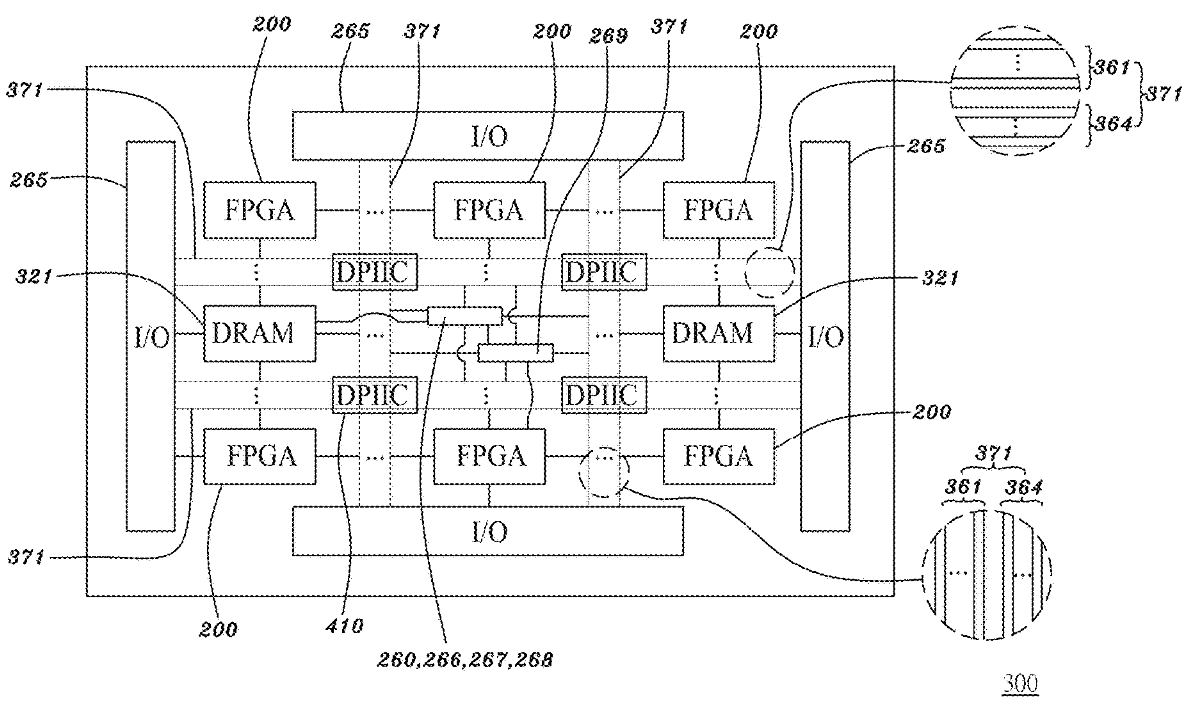
Figure 19G:
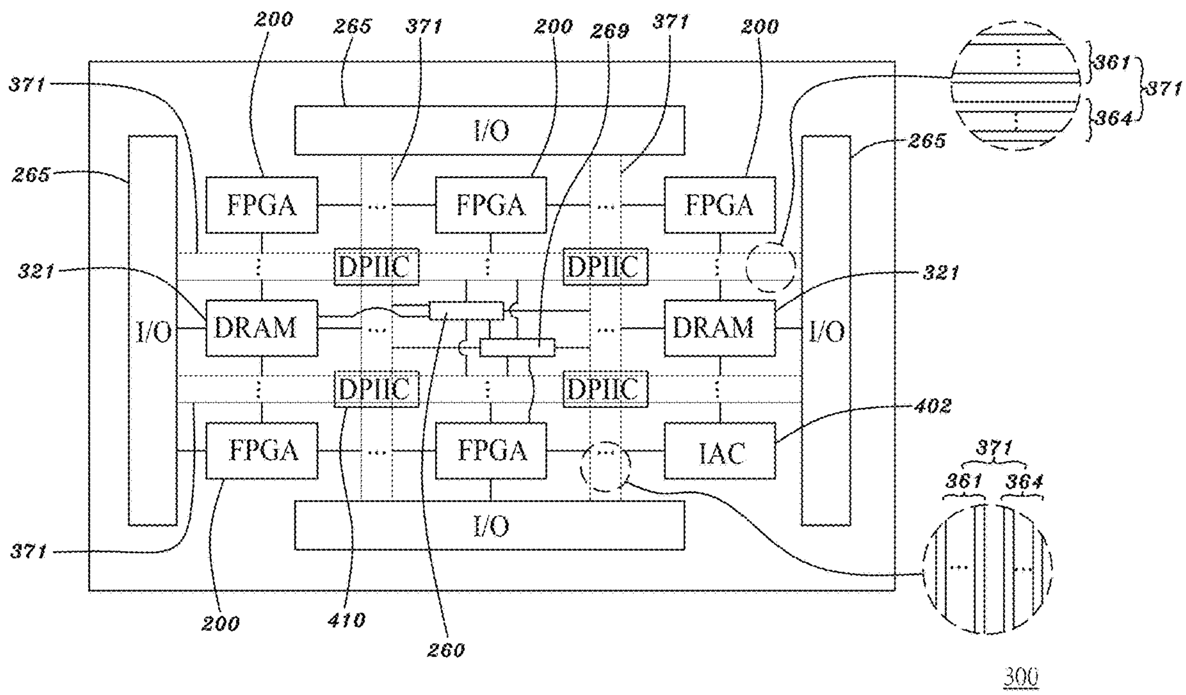

FIGS. 19F and 19G are schematically top views showing arrangement for various chips packaged in a sixth type of standard commodity logic drive in accordance with an embodiment of the present application. Referring to FIGS. 19F and 19G, the logic drive 300 as illustrated in FIGS. 19A-19E may further include a PCIC chip 269, such as central processing unit (CPU) chip, graphic processing unit (GPU) chip, digital signal processing (DSP) chip, tensor processing unit (TPU) chip or application processing unit (APU) chip. The APU chip may be (1) a combination of CPU and DSP unit operating with each other, (2) a combination of CPU and GPU operating with each other, (3) a combination of GPU and DSP unit operating with each other, or (4) a combination of CPU, GPU and DSP unit operating with one another. The structure shown in FIG. 19F is similar to those shown in FIGS. 19A, 19B, 19D and 19E but the difference therebetween is that the PCIC chip 269 may be further provided to be packaged in the logic drive 300 and close to the dedicated control chip 260 for the scheme in FIG. 19A, the dedicated control and I/O chip 266 for the scheme in FIG. 19B, the DCIAC chip 267 for the scheme in FIG. 19D or the DCDI/OIAC chip 268 for the scheme in FIG. 19E. The structure shown in FIG. 19G is similar to that shown in FIG. 19C but the difference therebetween is that the PCIC chip 269 may be further provided to be packaged in the logic drive 300 and close to the dedicated control chip 260. For an element indicated by the same reference number shown in FIGS. 19A, 19B, 19D, 19E and 19F, the specification of the element as seen in FIG. 19F and the process for forming the same may be referred to that of the element as illustrated in FIGS. 19A, 19B, 19D and 19E and the process for forming the same. For an element indicated by the same reference number shown in FIGS. 19A, 19C and 19G, the specification of the element as seen in FIG. 19G and the process for forming the same may be referred to that of the element as illustrated in FIGS. 19A and 19C and the process for forming the same.

Referring to FIGS. 19F and 19G, in a center region between neighboring two of the vertical bundles of inter-chip interconnects 371 and between neighboring two of the horizontal bundles of inter-chip interconnects 371 may be arranged the PCIC chip 269 and one of the dedicated control chip 260, dedicated control and I/O chip 266, DCIAC chip 267 and DCDI/OIAC chip 268. For interconnection, referring to FIGS. 19F and 19G, one or more of the programmable or fixed interconnects 361 or 364 of the inter-chip interconnects 371 may couple from each of the standard commodity FPGA IC chips 200 to the PCIC chip 269. One or more of the programmable or fixed interconnects 361 or 364 of the inter-chip interconnects 371 may couple from each of the DPIIC chips 410 to the PCIC chip 269. One or more of the programmable or fixed interconnects 361 or 364 of the inter-chip interconnects 371 may couple from the PCIC chip 269 to all of the dedicated input/output (I/O) chips 265. One or more of the programmable or fixed interconnects 361 or 364 of the inter-chip interconnects 371 may couple from the PCIC chip 269 to the dedicated control chip 260, dedicated control and I/O chip 266, DCIAC chip 267 or DCDI/OIAC chip 268. One or more of the programmable or fixed interconnects 361 or 364 of the inter-chip interconnects 371 may couple from the PCIC chip 269 to both of the DRAM IC chips 321. One or more of the programmable or fixed interconnects 361 or 364 of the inter-chip interconnects 371 may couple from the PCIC chip 269 to the IAC chip 260 as seen in FIG. 19G. The PCIC chip 269 is designed, implemented and fabricated using an advanced semiconductor technology node or generation, for example more advanced than or equal to, or below or equal to 30 nm, 20 nm or 10 nm, and for example using the technology node of 28 nm, 22 nm, 16 nm, 14 nm, 12 nm, 10 nm, 7 nm, 5 nm or 3 nm, which may be the same as, one or two generation or node less advanced than or one or two generation or node more advanced than that used for each of the standard commodity FPGA IC chips 200 and DPIIC chips 410. Transistors or semiconductor devices used in the PCIC chip 269 may be a FIN Field-Effect-Transistor (FINFET), a FINFET on Silicon-On-Insulator (FINFET SOI), a Fully Depleted Silicon-On-Insulator (FDSOI) MOSFET, a Partially Depleted Silicon-On-Insulator (PDSOI) MOSFET or a conventional MOSFET.

VII. Seventh Type of Logic Drive

Figure 19H:
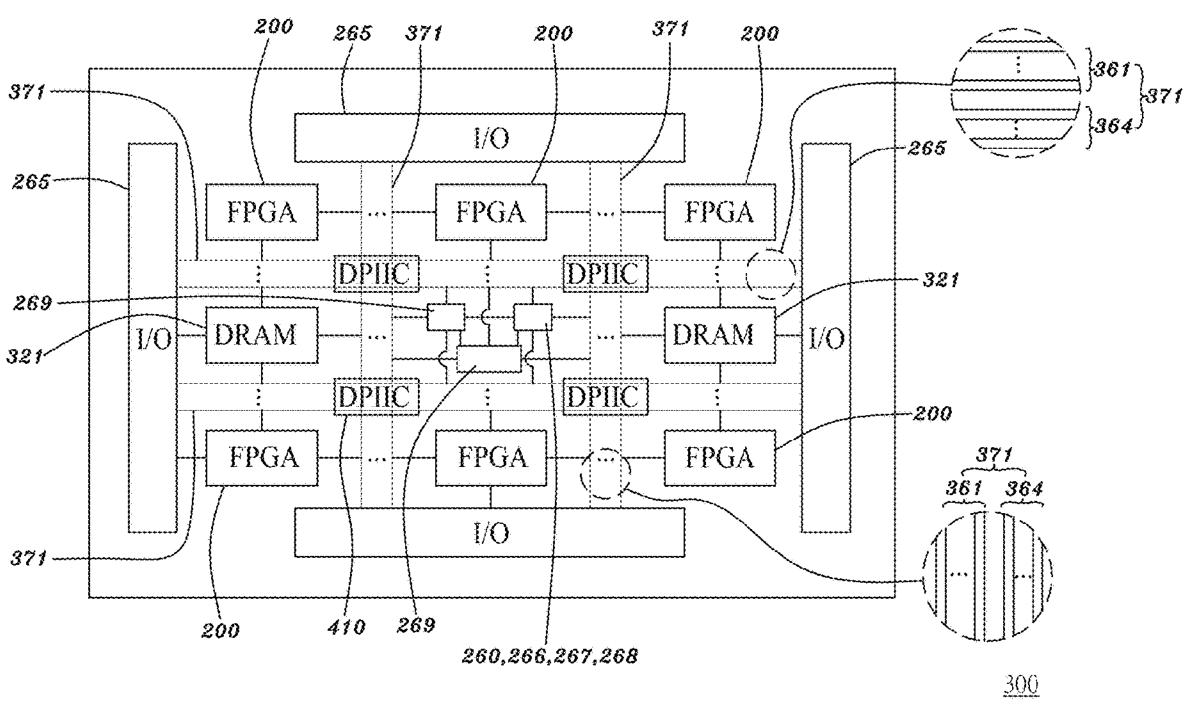
Figure 19I:
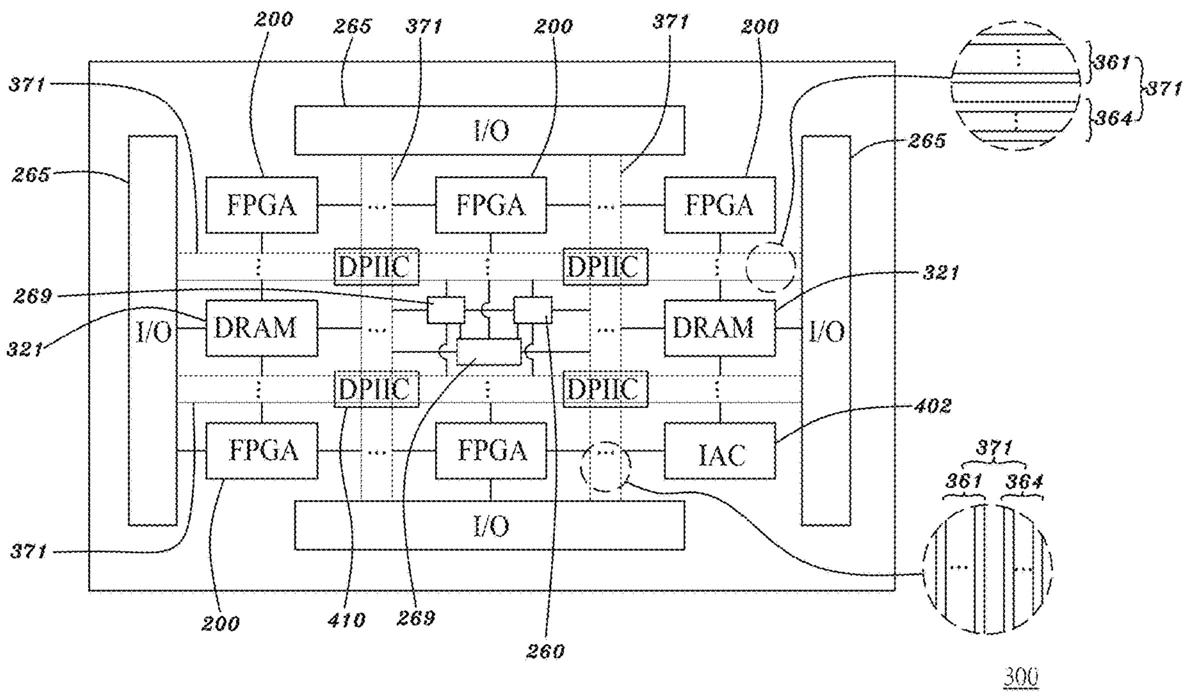

FIGS. 19H and 19I are schematically top views showing arrangement for various chips packaged in a seventh type of standard commodity logic drive in accordance with an embodiment of the present application. Referring to FIGS. 19H and 19I, the logic drive 300 as illustrated in FIGS. 19A-19E may further include two PCIC chips 269, a combination of which may be two selected from a central processing unit (CPU) chip, graphic processing unit (GPU) chip, digital signal processing (DSP) chip and tensor processing unit (TPU) chip. For example, (1) one of the two PCIC chips 269 may be a central processing unit (CPU) chip, and the other one of the two PCIC chips 269 may be a graphic processing unit (GPU) chip; (2) one of the two PCIC chips 269 may be a central processing unit (CPU) chip, and the other one of the two PCIC chips 269 may be a digital signal processing (DSP) chip; (3) one of the two PCIC chips 269 may be a central processing unit (CPU) chip, and the other one of the two PCIC chips 269 may be a tensor processing unit (TPU) chip; (4) one of the two PCIC chips 269 may be a graphic processing unit (GPU) chip, and the other one of the two PCIC chips 269 may be a digital signal processing (DSP) chip; (5) one of the two PCIC chips 269 may be a graphic processing unit (GPU) chip, and the other one of the two PCIC chips 269 may be a tensor processing unit (TPU) chip; (6) one of the two PCIC chips 269 may be a digital signal processing (DSP) chip, and the other one of the two PCIC chips 269 may be a tensor processing unit (TPU) chip. The structure shown in FIG. 19H is similar to those shown in FIGS. 19A, 19B, 19D and 19E but the difference therebetween is that the two PCIC chips 269 may be further provided to be packaged in the logic drive 300 and close to the dedicated control chip 260 for the scheme in FIG. 19A, the dedicated control and I/O chip 266 for the scheme in FIG. 19B, the DCIAC chip 267 for the scheme in FIG. 19D or the DCDI/OIAC chip 268 for the scheme in FIG. 19E. The structure shown in FIG. 19I is similar to that shown in FIG. 19C but the difference therebetween is that the two PCIC chips 269 may be further provided to be packaged in the logic drive 300 and close to the dedicated control chip 260. For an element indicated by the same reference number shown in FIGS. 19A, 19B, 19D, 19E and 19H, the specification of the element as seen in FIG. 19H and the process for forming the same may be referred to that of the element as illustrated in FIGS. 19A, 19B, 19D and 19E and the process for forming the same. For an element indicated by the same reference number shown in FIGS. 19A, 19C and 19I, the specification of the element as seen in FIG. 19I and the process for forming the same may be referred to that of the element as illustrated in FIGS. 19A and 19C and the process for forming the same.

Referring to FIGS. 19H and 19I, in a center region between neighboring two of the vertical bundles of inter-chip interconnects 371 and between neighboring two of the horizontal bundles of inter-chip interconnects 371 may be arranged the two PCIC chips 269 and one of the dedicated control chip 260, dedicated control and I/O chip 266, DCIAC chip 267 and DCDI/OIAC chip 268. For interconnection, referring to FIGS. 19H and 19I, one or more of the programmable or fixed interconnects 361 and 364 of the inter-chip interconnects 371 may couple from each of the standard commodity FPGA IC chips 200 to both of the PCIC chips 269. One or more of the programmable or fixed interconnects 361 or 364 of the inter-chip interconnects 371 may couple from each of the DPIIC chips 410 to both of the PCIC chips 269. One or more of the programmable or fixed interconnects 361 or 364 of the inter-chip interconnects 371 may couple from each of the PCIC chips 269 to all of the dedicated input/output (I/O) chips 265. One or more of the programmable or fixed interconnects 361 or 364 of the inter-chip interconnects 371 may couple from one of the PCIC chips 269 to the dedicated control chip 260, dedicated control and I/O chip 266, DCIAC chip 267 or DCDI/OIAC chip 268. One or more of the programmable or fixed interconnects 361 or 364 of the inter-chip interconnects 371 may couple from each of the PCIC chips 269 to both of the DRAM IC chips 321. One or more of the programmable or fixed interconnects 361 or 364 of the inter-chip interconnects 371 may couple from each of the PCIC chips 269 to the other of the PCIC chips 269. One or more of the programmable or fixed interconnects 361 or 364 of the inter-chip interconnects 371 may couple from each of the PCIC chips 269 to the IAC chip 260 as seen in FIG. 19G. Each of the PCIC chips 269 is designed, implemented and fabricated using an advanced semiconductor technology node or generation, for example more advanced than or equal to, or below or equal to 30 nm, 20 nm or 10 nm, and for example using the technology node of 28 nm, 22 nm, 16 nm, 14 nm, 12 nm, 10 nm, 7 nm, 5 nm or 3 nm, which may be the same as, one or two generation or node less advanced than or one or two generation or node more advanced than that used for each of the standard commodity FPGA IC chips 200 and DPIIC chips 410. Transistors or semiconductor devices used in each of the PCIC chips 269 may be a FIN Field-Effect-Transistor (FINFET), a FINFET on Silicon-On-Insulator (FINFET SOI), a Fully Depleted Silicon-On-Insulator (FDSOI) MOSFET, a Partially Depleted Silicon-On-Insulator (PDSOI) MOSFET or a conventional MOSFET.

VIII. Eighth Type of Logic Drive

Figure 19J:
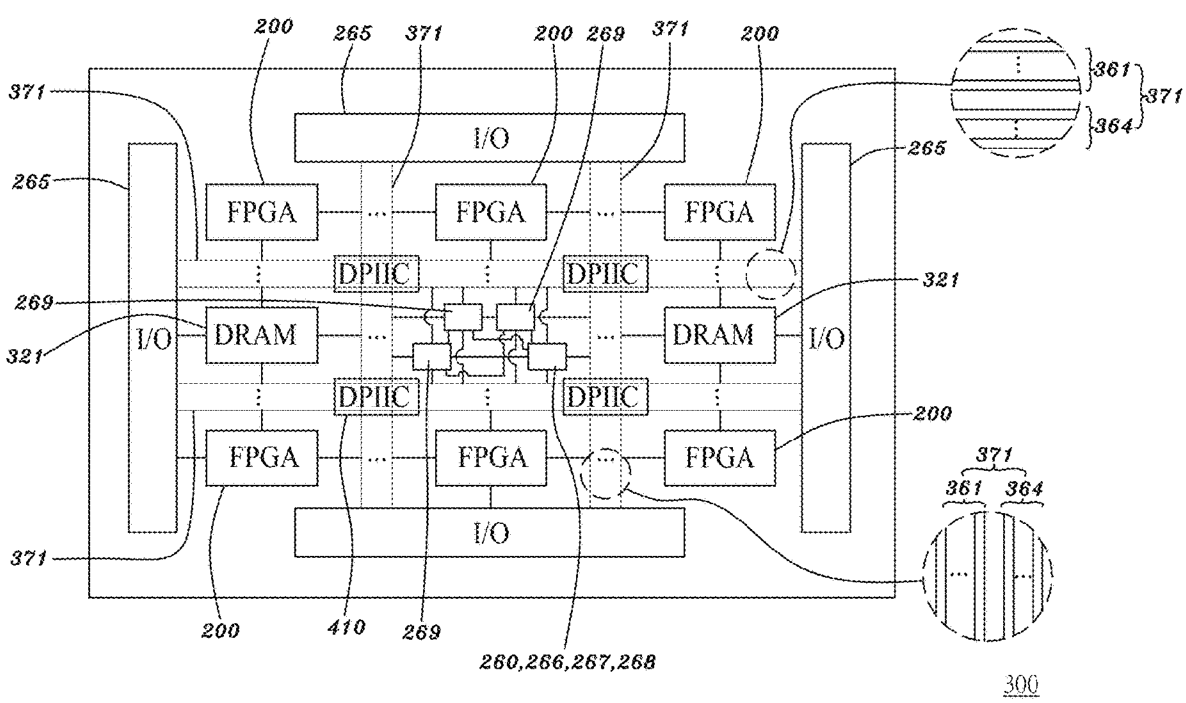
Figure 19K:
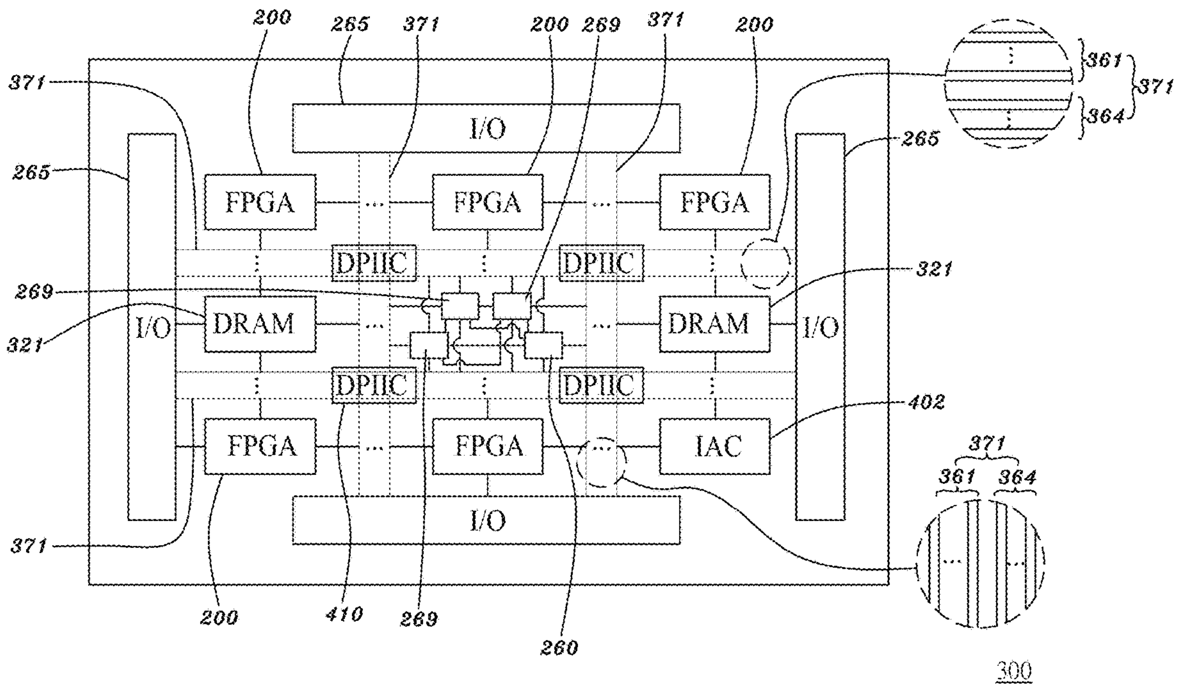

FIGS. 19J and 19K are schematically top views showing arrangement for various chips packaged in an eighth type of standard commodity logic drive in accordance with an embodiment of the present application. Referring to FIGS. 19J and 19K, the logic drive 300 as illustrated in FIGS. 19A-19E may further include three PCIC chips 269, a combination of which may be three selected from a central processing unit (CPU) chip, graphic processing unit (GPU) chip, digital signal processing (DSP) chip or tensor processing unit (TPU) chip. For example, (1) one of the three PCIC chips 269 may be a central processing unit (CPU) chip, another one of the three PCIC chips 269 may be a graphic processing unit (GPU) chip, the other one of the three PCIC chips 269 may be a digital signal processing (DSP) chip; (2) one of the three PCIC chips 269 may be a central processing unit (CPU) chip, another one of the three PCIC chips 269 may be a graphic processing unit (GPU) chip, the other one of the three PCIC chips 269 may be a tensor processing unit (TPU) chip; (3) one of the three PCIC chips 269 may be a central processing unit (CPU) chip, another one of the three PCIC chips 269 may be a digital signal processing (DSP) chip, the other one of the three PCIC chips 269 may be a tensor processing unit (TPU) chip; (4) one of the three PCIC chips 269 may be a graphic processing unit (GPU) chip, another one of the three PCIC chips 269 may be a digital signal processing (DSP) chip, the other one of the three PCIC chips 269 may be a tensor processing unit (TPU) chip. The structure shown in FIG. 19J is similar to those shown in FIGS. 19A, 19B, 19D and 19E but the difference therebetween is that the three PCIC chips 269 may be further provided to be packaged in the logic drive 300 and close to the dedicated control chip 260 for the scheme in FIG. 19A, the dedicated control and I/O chip 266 for the scheme in FIG. 19B, the DCIAC chip 267 for the scheme in FIG. 19D or the DCDI/OIAC chip 268 for the scheme in FIG. 19E. The structure shown in FIG. 19K is similar to that shown in FIG. 19C but the difference therebetween is that the three PCIC chips 269 may be further provided to be packaged in the logic drive 300 and close to the dedicated control chip 260. For an element indicated by the same reference number shown in FIGS. 19A, 19B, 19D, 19E and 19J, the specification of the element as seen in FIG. 19J and the process for forming the same may be referred to that of the element as illustrated in FIGS. 19A, 19B, 19D and 19E and the process for forming the same. For an element indicated by the same reference number shown in FIGS. 19A, 19C and 19K, the specification of the element as seen in FIG. 19K and the process for forming the same may be referred to that of the element as illustrated in FIGS. 19A and 19C and the process for forming the same.

Referring to FIGS. 19J and 19K, in a center region between neighboring two of the vertical bundles of inter-chip interconnects 371 and between neighboring two of the horizontal bundles of inter-chip interconnects 371 may be arranged the three PCIC chips 269 and one of the dedicated control chip 260, dedicated control and I/O chip 266, DCIAC chip 267 and DCDI/OIAC chip 268. For interconnection, referring to FIGS. 19J and 19K, one or more of the programmable or fixed interconnects 361 or 364 of the inter-chip interconnects 371 may couple from each of the standard commodity FPGA IC chips 200 to all of the PCIC chips 269. One or more of the programmable or fixed interconnects 361 or 364 of the inter-chip interconnects 371 may couple from each of the DPIIC chips 410 to all of the PCIC chips 269. One or more of the programmable or fixed interconnects 364 of the inter-chip interconnects 371 may couple from each of the PCIC chips 269 to all of the dedicated input/output (I/O) chips 265. One or more of the programmable or fixed interconnects 361 or 364 of the inter-chip interconnects 371 may couple from each of the PCIC chips 269 to the dedicated control chip 260, dedicated control and I/O chip 266, DCIAC chip 267 or DCDI/OIAC chip 268. One or more of the programmable or fixed interconnects 361 or 364 of the inter-chip interconnects 371 may couple from each of the PCIC chips 269 to both of the DRAM IC chips 321. One or more of the programmable or fixed interconnects 361 or 364 of the inter-chip interconnects 371 may couple from each of the PCIC chips 269 to the other two of the PCIC chips 269. One or more of the programmable or fixed interconnects 361 or 364 of the inter-chip interconnects 371 may couple from each of the PCIC chips 269 to the IAC chip 260 as seen in FIG. 19G. Each of the PCIC chips 269 is designed, implemented and fabricated using an advanced semiconductor technology node or generation, for example more advanced than or equal to, or below or equal to 30 nm, 20 nm or 10 nm, and for example using the technology node of 28 nm, 22 nm, 16 nm, 14 nm, 12 nm, 10 nm, 7 nm, 5 nm or 3 nm, which may be the same as, one or two generation or node less advanced than or one or two generation or node more advanced than that used for each of the standard commodity FPGA IC chips 200 and DPIIC chips 410. Transistors or semiconductor devices used in each of the PCIC chips 269 may be a FIN Field-Effect-Transistor (FINFET), a FINFET on Silicon-On-Insulator (FINFET SOI), a Fully Depleted Silicon-On-Insulator (FDSOI) MOSFET, a Partially Depleted Silicon-On-Insulator (PDSOI) MOSFET or a conventional MOSFET.

IX. Ninth Type of Logic Drive

Figure 19L:
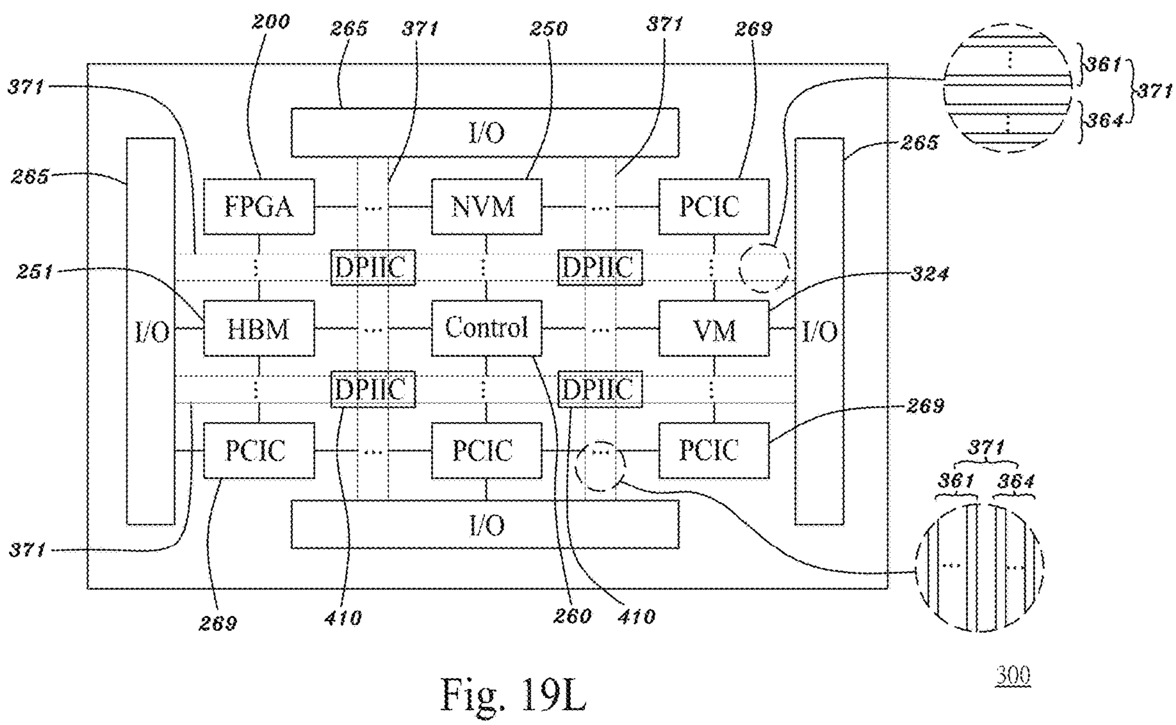

FIG. 19L is a schematically top view showing arrangement for various chips packaged in a ninth type of standard commodity logic drive in accordance with an embodiment of the present application. For an element indicated by the same reference number shown in FIGS. 19A-19L, the specification of the element as seen in FIG. 19L and the process for forming the same may be referred to that of the element as illustrated in FIGS. 19A-19K and the process for forming the same. Referring to FIG. 19L, a ninth type of standard commodity logic drive 300 may be packaged with one or more processing and/or computing (PC) integrated circuit (IC) chips 269, one or more standard commodity FPGA IC chips 200 as illustrated in FIGS. 16A-16J, one or more non-volatile memory (NVM) IC chips 250, one or more volatile memory (VM) integrated circuit (IC) chips 324, one or more high speed, high bandwidth memory (HBM) IC chips 251 and a dedicated control chip 260, which are arranged in an array, wherein the dedicated control chip 260 may be arranged in a center region surrounded by the PCIC chips 269, standard commodity FPGA IC chips 200, NVM IC chips 250 and VMIC chips 324. The combination for the PCIC chips 269 may comprise: (1) multiple GPU chips, for example 2, 3, 4 or more than 4 GPU chips, (2) one or more CPU chips and/or one or more GPU chips, (3) one or more CPU chips and/or one or more DSP chips, (4) one or more CPU chips, one or more GPU chips and/or one or more DSP chips, (5) one or more CPU chips and/or one or more TPU chips, or (6) one or more CPU chips, one or more DSP chips and/or one or more TPU chips. Each of the HBM IC chips 251 may be a high speed, high bandwidth DRAM IC chip, high speed, high bandwidth cache SRAM chip, high speed, high bandwidth NVM chip, high speed, high bandwidth magnetoresistive random-access-memory (MRAM) chip or high speed, high bandwidth resistive random-access-memory (RRAM) chip. The PCIC chips 269 and standard commodity FPGA IC chips 200 may operate with the HBM IC chips 251 for high speed, high bandwidth parallel processing and/or parallel computing.

Referring to FIG. 19L, the logic drive 300 may include the inter-chip interconnects 371 each extending over spaces between neighboring two of the standard commodity FPGA IC chip 200, NVM IC chip 250, VMIC chip 324, dedicated control chip 260, PCIC chips 269 and HBMIC chip 251. The logic drive 300 may include a plurality of the DPIIC chip 410 aligned with a cross of a vertical bundle of inter-chip interconnects 371 and a horizontal bundle of inter-chip interconnects 371. Each of the DPIIC chips 410 is at corners of four of the standard commodity FPGA IC chip 200, NVM IC chip 250, VMIC chip 324, dedicated control chip 260, PCIC chips 269 and HBMIC chip 251 around said each of the DPIIC chips 410. Each of the inter-chip interconnects 371 may be the programmable or fixed interconnect 361 or 364 as mentioned above in the sections of "Specification for Programmable Interconnect" and "Specification for Fixed Interconnect". Signal transmission may be built (1) between one of the programmable interconnects 361 of the inter-chip interconnects 371 and one of the programmable interconnects 361 of the intra-chip interconnects 371 of one of the standard commodity FPGA IC chips 200 via one of the small input/output (I/O) circuits 203 of said one of the standard commodity FPGA IC chips 200 or (2) between one of the programmable interconnects 361 of the inter-chip interconnects 371 and one of the programmable interconnects 361 of the intra-chip interconnects of one of the DPIIC chips 410 via one of the small input/output (I/O) circuits 203 of said one of the DPIIC chips 410. Signal transmission may be built (1) between one of the fixed interconnects 364 of the inter-chip interconnects 371 and one of the fixed interconnects 364 of the intra-chip interconnects 502 of one of the standard commodity FPGA IC chips 200 via one of the small input/output (I/O) circuits 203 of said one of the standard commodity FPGA IC chips 200 or (2) between one of the fixed interconnects 364 of the inter-chip interconnects 371 and one of the fixed interconnects 364 of the intra-chip interconnects of one of the DPIIC chips 410 via one of the small input/output (I/O) circuits 203 of said one of the DPIIC chips 410.

Referring to FIG. 19L, one or more of the programmable or fixed interconnects 361 or 364 of the inter-chip interconnects 371 may couple from the standard commodity FPGA IC chip 200 to all of the DPIIC chips 410. One or more of the programmable or fixed interconnects 361 or 364 of the inter-chip interconnects 371 may couple from the standard commodity FPGA IC chip 200 to the dedicated control chip 260. One or more of the programmable or fixed interconnects 361 or 364 of the inter-chip interconnects 371 may couple from the standard commodity FPGA IC chip 200 to the NVM IC chip 250. One or more of the programmable or fixed interconnects 361 or 364 of the inter-chip interconnects 371 may couple from the standard commodity FPGA IC chip 200 to the VMIC chip 324. One or more of the programmable or fixed interconnects 361 or 364 of the inter-chip interconnects 371 may couple from the standard commodity FPGA IC chip 200 to all of the PCIC chips 269. One or more of the programmable or fixed interconnects 361 or 364 of the inter-chip interconnects 371 may couple from the standard commodity FPGA IC chip 200 to the HBMIC chip 251. One or more of the programmable or fixed interconnects 361 or 364 of the inter-chip interconnects 371 may couple from each of the DPIIC chips 410 to the dedicated control chip 260. One or more of the programmable or fixed interconnects 361 or 364 of the inter-chip interconnects 371 may couple from each of the DPIIC chips 410 to the NVM IC chips 250. One or more of the programmable or fixed interconnects 361 or 364 of the inter-chip interconnects 371 may couple from each of the DPIIC chips 410 to the VMIC chip 324. One or more of the programmable or fixed interconnects 361 or 364 of the inter-chip interconnects 371 may couple from each of the DPIIC chips 410 to all of the PCIC chips 269. One or more of the programmable or fixed interconnects 361 or 364 of the inter-chip interconnects 371 may couple from each of the DPIIC chips 410 to the HBMIC chip 251. One or more of the programmable or fixed interconnects 361 or 364 of the inter-chip interconnects 371 may couple from each of the DPIIC chips 410 to the others of the DPIIC chips 410. One or more of the programmable or fixed interconnects 361 or 364 of the inter-chip interconnects 371 may couple from each of the PCIC chips 269 to the HBMIC chip 251 and the communication between said each of the PCIC chips 269 and the HBMIC chip 251 may have a data bit width of equal to or greater than 64, 128, 256, 512, 1024, 2048, 4096, 8K, or 16K. One or more of the programmable or fixed interconnects 361 or 364 of the inter-chip interconnects 371 may couple from each of the PCIC chips 269 to the dedicated control chip 260. One or more of the programmable or fixed interconnects 361 or 364 of the inter-chip interconnects 371 may couple from each of the PCIC chips 269 to the NVM IC chip 250. One or more of the programmable or fixed interconnects 361 or 364 of the inter-chip interconnects 371 may couple from each of the PCIC chips 269 to the VMIC chip 324. One or more of the programmable or fixed interconnects 361 or 364 of the inter-chip interconnects 371 may couple from the NVM IC chip 250 to the dedicated control chip 260. One or more of the programmable or fixed interconnects 361 or 364 of the inter-chip interconnects 371 may couple from the NVM IC chip 250 to the VMIC chip 324. One or more of the programmable or fixed interconnects 361 or 364 of the inter-chip interconnects 371 may couple from the NVM IC chip 250 to the HBMIC chip 251. One or more of the programmable or fixed interconnects 361 or 364 of the inter-chip interconnects 371 may couple from the VMIC chip 324 to the dedicated control chip 260. One or more of the programmable or fixed interconnects 361 or 364 of the inter-chip interconnects 371 may couple from the VMIC chip 324 to the HBMIC chip 251. One or more of the programmable or fixed interconnects 361 or 364 of the inter-chip interconnects 371 may couple from the HBMIC chip 251 to the dedicated control chip 260. One or more of the programmable or fixed interconnects 361 or 364 of the inter-chip interconnects 371 may couple from each of the PCIC chips 269 to all the others of the PCIC chips 269.

Referring to FIG. 19L, the logic drive 300 may include multiple dedicated input/output (I/O) chips 265 in a peripheral region thereof surrounding a central region thereof having the standard commodity FPGA IC chip 200, NVM IC chip 250, VMIC chip 321, dedicated control chip 260, PCIC chips 269, HBMIC chip 251 and DPIIC chips 410 located therein. One or more of the programmable or fixed interconnects 361 or 364 of the inter-chip interconnects 371 may couple from the standard commodity FPGA IC chip 200 to all of the dedicated input/output (I/O) chips 265. One or more of the programmable or fixed interconnects 361 or 364 of the inter-chip interconnects 371 may couple from each of the DPIIC chips 410 to all of the dedicated input/output (I/O) chips 265. One or more of the programmable or fixed interconnects 361 or 364 of the inter-chip interconnects 371 may couple from the NVM IC chip 250 to all of the dedicated input/output (I/O) chips 265. One or more of the programmable or fixed interconnects 361 or 364 of the inter-chip interconnects 371 may couple from the VMIC chip 321 to all of the dedicated input/output (I/O) chips 265. One or more of the programmable or fixed interconnects 361 or 364 of the inter-chip interconnects 371 may couple from the dedicated control chip 260 to all of the dedicated input/output (I/O) chips 265. One or more of the programmable or fixed interconnects 361 or 364 of the inter-chip interconnects 371 may couple from each of the PCIC chips 269 to all of the dedicated input/output (I/O) chips 265. One or more of the programmable or fixed interconnects 361 or 364 of the inter-chip interconnects 371 may couple from the HBMIC chip 251 to all of the dedicated input/output (I/O) chips 265. One or more of the programmable or fixed interconnects 361 or 364 of the inter-chip interconnects 371 may couple from each of the dedicated input/output (I/O) chips 265 to the others of the dedicated input/output (I/O) chips 265.

Referring to FIG. 19L, the standard commodity FPGA IC chip 200 may be referred to one as illustrated in FIGS. 16A-16J, and each of the DPIIC chips 410 may be referred to one as illustrated in FIG. 17. The specification of the commodity standard FPGA IC chip 200, DPIIC chips 410, dedicated I/O chips 265 and dedicated control chip 260 may be referred to that as illustrated in FIG. 19A.

For example, referring to FIG. 19L, all of the PCIC chips 269 in the logic drive 300 may be GPU chips, for example 2, 3, 4 or more than 4 GPU chips and the HBM IC chip 251 in the logic drive 300 may be a high speed, high bandwidth DRAM IC chip, high speed, high bandwidth cache SRAM chip, magnetoresistive random-access-memory (MRAM) chip or resistive random-access-memory (RRAM) chip. The communication between one of the PCIC chips 269, i.e., GPU chips, and the HBM IC chip 251 may have a data bit width of equal to or greater than 64, 128, 256, 512, 1024, 2048, 4096, 8K, or 16K.

For example, referring to FIG. 19L, all of the PCIC chips 269 in the logic drive 300 may be TPU chips, for example 2, 3, 4 or more than 4 TPU chips and the HBM IC chip 251 in the logic drive 300 may be a high speed, high bandwidth DRAM IC chip, high speed, high bandwidth cache SRAM chip, magnetoresistive random-access-memory (MRAM) chip or resistive random-access-memory (RRAM) chip. The communication between one of the PCIC chips 269, i.e., TPU chips, and the HBM IC chip 251 may have a data bit width of equal to or greater than 64, 128, 256, 512, 1024, 2048, 4096, 8K, or 16K.

Referring to FIG. 19L, the NVM IC chip 250 may be designed and fabricated using advanced NAND flash technology nodes or generations, for example, more advanced than or smaller than or equal to 40 nm, 28 nm, 20 nm, 16 nm or 10 nm, wherein the advanced NAND flash technology may comprise Single Level Cells (SLC) or multiple level cells (MLC) (for example, Double Level Cells DLC, or triple Level cells TLC), and in a 2D-NAND or a 3D NAND structure. The 3D NAND structure may comprise multiple stacked layers or levels of NAND cells, for example, greater than or equal to 4, 8, 16, 32 stacked layers or levels of NAND cells. Accordingly, the standard commodity logic drive 300 may have a standard non-volatile memory density, capacity or size of greater than or equal to 8 MB, 64 MB, 128 MB, 512 MB, 1 GB, 4 GB, 16 GB, 64 GB, 256 GB, or 512 GB, wherein"B" is bytes, each byte has 8 bits.

X. Tenth Type of Logic Drive

Figure 19M:
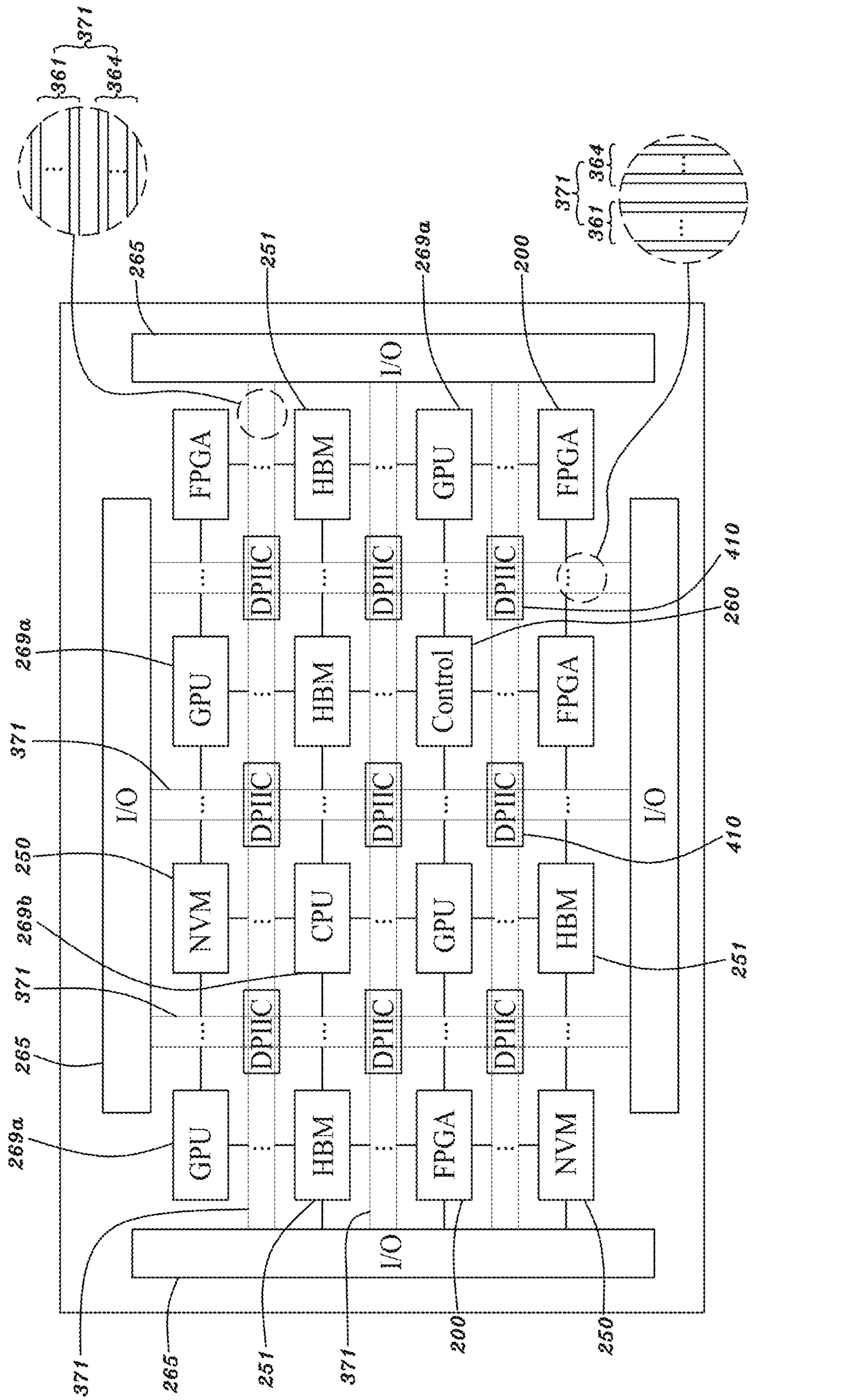

FIG. 19M is a schematically top view showing arrangement for various chips packaged in a tenth type of standard commodity logic drive in accordance with an embodiment of the present application. For an element indicated by the same reference number shown in FIGS. 19A-19M, the specification of the element as seen in FIG. 19M and the process for forming the same may be referred to that of the element as illustrated in FIGS. 19A-19L and the process for forming the same. Referring to FIG. 19M, the logic drive 300 may be packaged with multiple GPU chips 269*a* and a CPU chip 269*b* for the PCIC chips 269 as above mentioned. Further, the logic drive 300 may be packaged with multiple HBMIC chips 251 each arranged next to one of the GPU chips 269*a* for communication with said one of the GPU chips 269*a* in a high speed and high bandwidth. Each of the HBM IC chips 251 in the logic drive 300 may be a high speed, high bandwidth DRAM IC chip, high speed, high bandwidth cache SRAM chip, magnetoresistive random-access-memory (MRAM) chip or resistive random-access-memory (RRAM) chip. The CPU chip 269*b*, dedicated control chip 260, standard commodity FPGA IC chips 200, GPU chips 269*a*, NVM IC chips 250 and HBMIC chips 251 may be arranged in an array, wherein the CPU chip 269*b* and dedicated control chip 260 may be arranged in a center region surrounded by a periphery region having the standard commodity FPGA IC chips 200, GPU chips 269*a*, NVM IC chips 250 and HBMIC chips 251 mounted thereto.

Referring to FIG. 19M, the logic drive 300 may include the inter-chip interconnects 371 each extending over spaces between neighboring two of the standard commodity FPGA IC chips 200, NVM IC chips 250, dedicated control chip 260, GPU chips 269*a*, CPU chip 269*b* and HBMIC chips 251. The logic drive 300 may include a plurality of the DPIIC chip 410 aligned with a cross of a vertical bundle of inter-chip interconnects 371 and a horizontal bundle of inter-chip interconnects 371. Each of the DPIIC chips 410 is at corners of four of the standard commodity FPGA IC chips 200, NVM IC chips 250, dedicated control chip 260, GPU chips 269*a*, CPU chip 269*b* and HBMIC chips 251 around said each of the DPIIC chips 410. Each of the inter-chip interconnects 371 may be the programmable or fixed interconnect 361 or 364 as mentioned above in the sections of "Specification for Programmable Interconnect" and "Specification for Fixed Interconnect". Signal transmission may be built (1) between one of the programmable interconnects 361 of the inter-chip interconnects 371 and one of the programmable interconnects 361 of the intra-chip interconnects 371 of one of the standard commodity FPGA IC chips 200 via one of the small input/output (I/O) circuits 203 of said one of the standard commodity FPGA IC chips 200 or (2) between one of the programmable interconnects 361 of the inter-chip interconnects 371 and one of the programmable interconnects 361 of the intra-chip interconnects of one of the DPIIC chips 410 via one of the small input/output (I/O) circuits 203 of said one of the DPIIC chips 410. Signal transmission may be built (1) between one of the fixed interconnects 364 of the inter-chip interconnects 371 and one of the fixed interconnects 364 of the intra-chip interconnects 502 of one of the standard commodity FPGA IC chips 200 via one of the small input/output (I/O) circuits 203 of said one of the standard commodity FPGA IC chips 200 or (2) between one of the fixed interconnects 364 of the inter-chip interconnects 371 and one of the fixed interconnects 364 of the intra-chip interconnects of one of the DPIIC chips 410 via one of the small input/output (I/O) circuits 203 of said one of the DPIIC chips 410.

Referring to FIG. 19M, one or more of the programmable or fixed interconnects 361 or 364 of the inter-chip interconnects 371 may couple from each of the standard commodity FPGA IC chips 200 to all of the DPIIC chips 410. One or more of the programmable or fixed interconnects 361 or 364 of the inter-chip interconnects 371 may couple from each of the standard commodity FPGA IC chips 200 to the dedicated control chip 260. One or more of the programmable or fixed interconnects 361 or 364 of the inter-chip interconnects 371 may couple from each of the standard commodity FPGA IC chips 200 to both of the NVM IC chips 250. One or more of the programmable or fixed interconnects 361 or 364 of the inter-chip interconnects 371 may couple from each of the standard commodity FPGA IC chips 200 to all of the GPU chips 269*a*. One or more of the programmable or fixed interconnects 361 or 364 of the inter-chip interconnects 371 may couple from each of the standard commodity FPGA IC chips 200 to the CPU chip 269*b*. One or more of the programmable or fixed interconnects 361 or 364 of the inter-chip interconnects 371 may couple from each of the standard commodity FPGA IC chips 200 to all of the HBMIC chips 251. One or more of the programmable or fixed interconnects 361 or 364 of the inter-chip interconnects 371 may couple from each of the standard commodity FPGA IC chips 200 to the other of the standard commodity FPGA IC chips 200. One or more of the programmable or fixed interconnects 361 or 364 of the inter-chip interconnects 371 may couple from each of the DPIIC chips 410 to the dedicated control chip 260. One or more the programmable or fixed interconnects 361 or 364 of the inter-chip interconnects 371 may couple from each of the DPIIC chips 410 to both of the NVM IC chips 250. One or more of the programmable or fixed interconnects 361 or 364 of the inter-chip interconnects 371 may couple from each of the DPIIC chips 410 to all of the GPU chips 269*a*. One or more of the programmable or fixed interconnects 361 or 364 of the inter-chip interconnects 371 may couple from each of the DPIIC chips 410 to the CPU chip 269*b*. One or more of the programmable or fixed interconnects 361 or 364 of the inter-chip interconnects 371 may couple from each of the DPIIC chips 410 to all of the HBMIC chips 251. One or more of the programmable or fixed interconnects 361 or 364 of the inter-chip interconnects 371 may couple from each of the DPIIC chips 410 to the others of the DPIIC chips 410. One or more of the programmable or fixed interconnects 361 or 364 of the inter-chip interconnects 371 may couple from the CPU chip 269*b* to all of the GPU chips 269*a*. One or more of the programmable or fixed interconnects 361 or 364 of the inter-chip interconnects 371 may couple from the CPU chip 269*b* to both of the NVM IC chips 250. One or more of the programmable or fixed interconnects 361 or 364 of the inter-chip interconnects 371 may couple from the CPU chip 269*b* to all of the HBMIC chips 251. One or more of the programmable or fixed interconnects 361 or 364 of the inter-chip interconnects 371 may couple from one of the GPU chips 269*a* to one of the HBMIC chips 251 and the communication between said one of the GPU chips 269*a* and said one of the HBM IC chips 251 may have a data bit width of equal to or greater than 64, 128, 256, 512, 1024, 2048, 4096, 8K, or 16K. One or more of the programmable or fixed interconnects 361 or 364 of the inter-chip interconnects 371 may couple from each of the GPU chips 269*a* to both of the NVM IC chips 250. One or more of the programmable or fixed interconnects 361 or 364 of the inter-chip interconnects 371 may couple from each of the GPU chips 269*a* to the others of the GPU chips 269*a*. One or more of the programmable or fixed interconnects 361 or 364 of the inter-chip interconnects 371 may couple from each of the NVM IC chips 250 to the dedicated control chip 260. One or more of the programmable or fixed interconnects 361 or 364 of the inter-chip interconnects 371 may couple from each of the HBMIC chips 251 to the dedicated control chip 260. One or more of the programmable or fixed interconnects 361 or 364 of the inter-chip interconnects 371 may couple from each of the GPU chips 269*a* to the dedicated control chip 260. One or more of the programmable or fixed interconnects 361 or 364 of the inter-chip interconnects 371 may couple from the CPU chip 269*b* to the dedicated control chip 260. One or more of the programmable or fixed interconnects 361 or 364 of the inter-chip interconnects 371 may couple from each of the NVM IC chips 250 to all of the HBMIC chips 251. One or more of the programmable or fixed interconnects 361 or 364 of the inter-chip interconnects 371 may couple from each of the NVM IC chips 250 to the other of the NVM IC chips 250. One or more of the programmable or fixed interconnects 361 or 364 of the inter-chip interconnects 371 may couple from each of the HBMIC chips 251 to the others of the HBMIC chips 251.

Referring to FIG. 19M, the logic drive 300 may include multiple dedicated input/output (I/O) chips 265 in a peripheral region thereof surrounding a central region thereof having the standard commodity FPGA IC chips 200, NVM IC chips 250, dedicated control chip 260, GPU chips 269*a*, CPU chip 269*b*, HBMIC chips 251 and DPIIC chips 410 located therein. One or more of the programmable or fixed interconnects 361 or 364 of the inter-chip interconnects 371 may couple from each of the standard commodity FPGA IC chips 200 to all of the dedicated input/output (I/O) chips 265. One or more of the programmable or fixed interconnects 361 or 364 of the inter-chip interconnects 371 may couple from each of the DPIIC chips 410 to all of the dedicated input/output (I/O) chips 265. One or more of the programmable or fixed interconnects 361 or 364 of the inter-chip interconnects 371 may couple from each of the NVM IC chips 250 to all of the dedicated input/output (I/O) chips 265. One or more of the programmable or fixed interconnects 361 or 364 of the inter-chip interconnects 371 may couple from the dedicated control chip 260 to all of the dedicated input/output (I/O) chips 265. One or more of the programmable or fixed interconnects 361 or 364 of the inter-chip interconnects 371 may couple from each of the GPU chips 269*a* to all of the dedicated input/output (I/O) chips 265. One or more of the programmable or fixed interconnects 361 or 364 of the inter-chip interconnects 371 may couple from the CPU chip 269*b* to all of the dedicated input/output (I/O) chips 265. One or more of the programmable or fixed interconnects 361 or 364 of the inter-chip interconnects 371 may couple from each of the HBMIC chips 251 to all of the dedicated input/output (I/O) chips 265.

Accordingly, in the tenth type of logic drive 300, the GPU chips 269*a* may operate with the HBM IC chips 251 for high speed, high bandwidth parallel processing and/or computing. Referring to FIG. 19M, each of the standard commodity FPGA IC chips 200 may be referred to one as illustrated in FIGS. 16A-16J, and each of the DPIIC chips 410 may be referred to one as illustrated in FIG. 17. The specification of the commodity standard FPGA IC chips 200, DPIIC chips 410, dedicated I/O chips 265 and dedicated control chip 260 may be referred to that as illustrated in FIG. 19A.

Referring to FIG. 19M, each of the NVM IC chips 250 may be designed and fabricated using advanced NAND flash technology nodes or generations, for example, more advanced than or smaller than or equal to 40 nm, 28 nm, 20 nm, 16 nm or 10 nm, wherein the advanced NAND flash technology may comprise Single Level Cells (SLC) or multiple level cells (MLC) (for example, Double Level Cells DLC, or triple Level cells TLC), and in a 2D-NAND or a 3D NAND structure. The 3D NAND structure may comprise multiple stacked layers or levels of NAND cells, for example, greater than or equal to 4, 8, 16, 32 stacked layers or levels of NAND cells. Accordingly, the standard commodity logic drive 300 may have a standard non-volatile memory density, capacity or size of greater than or equal to 8 MB, 64 MB, 128 MB, 512 MB, 1 GB, 4 GB, 16 GB, 64 GB, 256 GB, or 512 GB, wherein "B" is bytes, each byte has 8 bits.

XI. Eleventh Type of Logic Drive

Figure 19N:
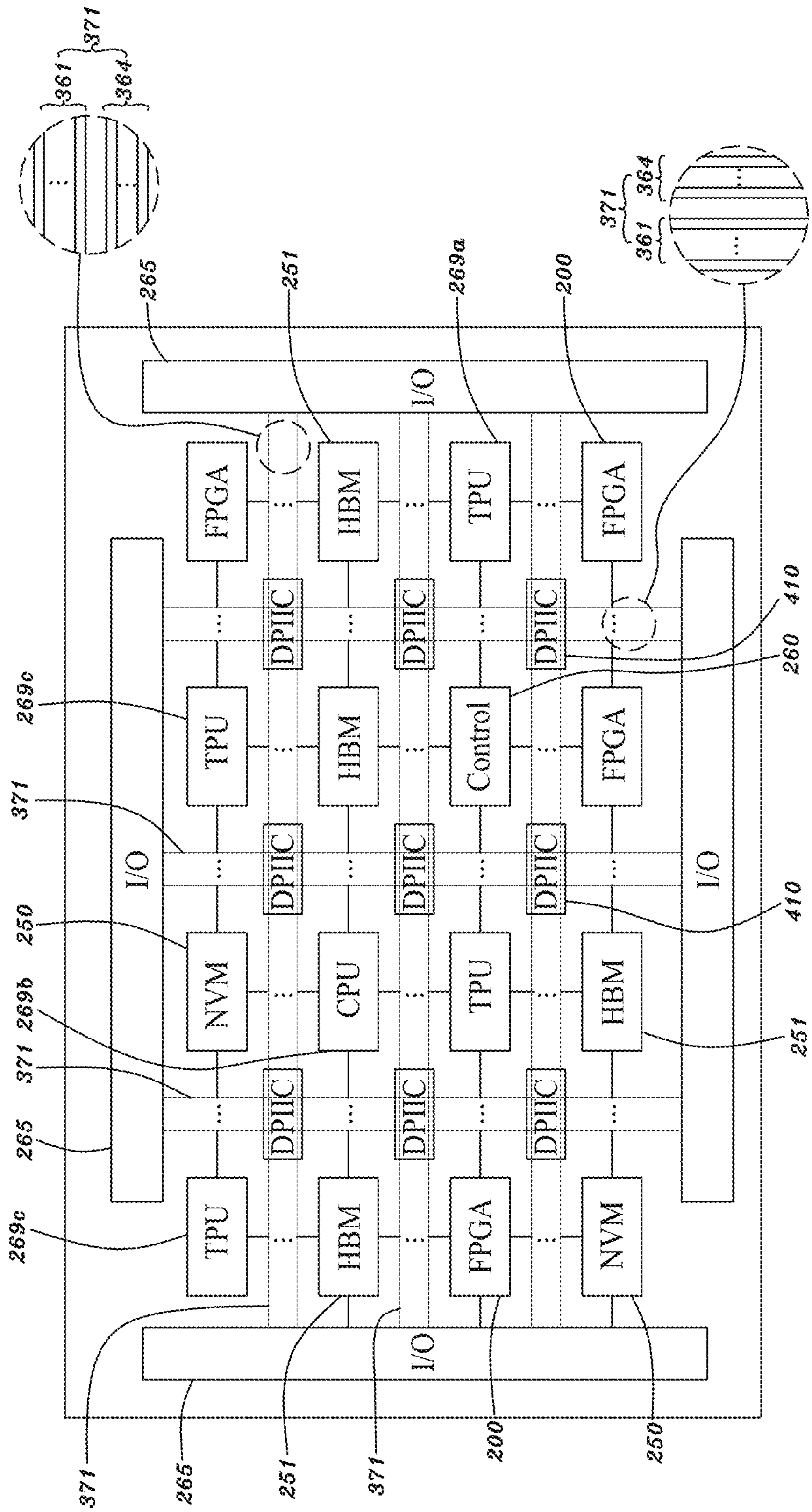

FIG. 19N is a schematically top view showing arrangement for various chips packaged in an eleventh type of standard commodity logic drive in accordance with an embodiment of the present application. For an element indicated by the same reference number shown in FIGS. 19A-19N, the specification of the element as seen in FIG. 19N and the process for forming the same may be referred to that of the element as illustrated in FIGS. 19A-19M and the process for forming the same. Referring to FIG. 19N, the logic drive 300 may be packaged with multiple TPU chips 269*c* and a CPU chip 269*b* for the PCIC chips 269 as above mentioned. Further, the logic drive 300 may be packaged with multiple HBMIC chips 251 each arranged next to one of the TPU chips 269*c* for communication with said one of the TPU chips 269*c* in a high speed and high bandwidth. Each of the HBM IC chips 251 in the logic drive 300 may be a high speed, high bandwidth DRAM IC chip, high speed, high bandwidth cache SRAM chip, magnetoresistive random-access-memory (MRAM) chip or resistive random-access-memory (RRAM) chip. The CPU chip 269*b*, dedicated control chip 260, standard commodity FPGA IC chips 200, TPU chips 269*c*, NVM IC chips 250 and HBMIC chips 251 may be arranged in an array, wherein the CPU chip 269*b* and dedicated control chip 260 may be arranged in a center region surrounded by a periphery region having the FPGA IC chips 200, TPU chips 269*c*, NVM IC chips 250 and HBMIC chips 251 mounted thereto.

Referring to FIG. 19N, the logic drive 300 may include the inter-chip interconnects 371 each extending over spaces between neighboring two of the standard commodity FPGA IC chips 200, NVM IC chips 250, dedicated control chip 260, TPU chips 269*c*, CPU chip 269*b* and HBMIC chips 251. The logic drive 300 may include a plurality of the DPIIC chip 410 aligned with a cross of a vertical bundle of inter-chip interconnects 371 and a horizontal bundle of inter-chip interconnects 371. Each of the DPIIC chips 410 is at corners of four of the standard commodity FPGA IC chips 200, NVM IC chips 250, dedicated control chip 260, TPU chips 269*c*, CPU chip 269*b* and HBMIC chips 251 around said each of the DPIIC chips 410. Each of the inter-chip interconnects 371 may be the programmable or fixed interconnect 361 or 364 as mentioned above in the sections of "Specification for Programmable Interconnect" and "Specification for Fixed Interconnect". Signal transmission may be built (1) between one of the programmable interconnects 361 of the inter-chip interconnects 371 and one of the programmable interconnects 361 of the intra-chip interconnects 371 of one of the standard commodity FPGA IC chips 200 via one of the small input/output (I/O) circuits 203 of said one of the standard commodity FPGA IC chips 200 or (2) between one of the programmable interconnects 361 of the inter-chip interconnects 371 and one of the programmable interconnects 361 of the intra-chip interconnects of one of the DPIIC chips 410 via one of the small input/output (I/O) circuits 203 of said one of the DPIIC chips 410. Signal transmission may be built (1) between one of the fixed interconnects 364 of the inter-chip interconnects 371 and one of the fixed interconnects 364 of the intra-chip interconnects 502 of one of the standard commodity FPGA IC chips 200 via one of the small input/output (I/O) circuits 203 of said one of the standard commodity FPGA IC chips 200 or (2) between one of the fixed interconnects 364 of the inter-chip interconnects 371 and one of the fixed interconnects 364 of the intra-chip interconnects of one of the DPIIC chips 410 via one of the small input/output (I/O) circuits 203 of said one of the DPIIC chips 410.

Referring to FIG. 19N, one or more of the programmable or fixed interconnects 361 or 364 of the inter-chip interconnects 371 may couple from each of the standard commodity FPGA IC chips 200 to all of the DPIIC chips 410. One or more of the programmable or fixed interconnects 361 or 364 of the inter-chip interconnects 371 may couple from each of the standard commodity FPGA IC chips 200 to the dedicated control chip 260. One or more of the programmable or fixed interconnects 361 or 364 of the inter-chip interconnects 371 may couple from each of the standard commodity FPGA IC chips 200 to both of the NVM IC chips 250. One or more of the programmable or fixed interconnects 361 or 364 of the inter-chip interconnects 371 may couple from each of the standard commodity FPGA IC chips 200 to all of the TPU chips 269*c*. One or more of the programmable or fixed interconnects 361 or 364 of the inter-chip interconnects 371 may couple from each of the standard commodity FPGA IC chips 200 to the CPU chip 269*b*. One or more of the programmable or fixed interconnects 361 or 364 of the inter-chip interconnects 371 may couple from each of the standard commodity FPGA IC chips 200 to all of the HBMIC chips 251. One or more of the programmable or fixed interconnects 361 or 364 of the inter-chip interconnects 371 may couple from each of the standard commodity FPGA IC chips 200 to the other of the standard commodity FPGA IC chips 200. One or more of the programmable or fixed interconnects 361 or 364 of the inter-chip interconnects 371 may couple from each of the DPIIC chips 410 to the dedicated control chip 260. One or more the programmable or fixed interconnects 361 or 364 of the inter-chip interconnects 371 may couple from each of the DPIIC chips 410 to both of the NVM IC chips 250. One or more of the programmable or fixed interconnects 361 or 364 of the inter-chip interconnects 371 may couple from each of the DPIIC chips 410 to all of the TPU chips 269*c*. One or more of the programmable or fixed interconnects 361 or 364 of the inter-chip interconnects 371 may couple from each of the DPIIC chips 410 to the CPU chip 269*b*. One or more of the programmable or fixed interconnects 361 or 364 of the inter-chip interconnects 371 may couple from each of the DPIIC chips 410 to all of the HBMIC chips 251. One or more of the programmable or fixed interconnects 361 or 364 of the inter-chip interconnects 371 may couple from each of the DPIIC chips 410 to the others of the DPIIC chips 410. One or more of the programmable or fixed interconnects 361 or 364 of the inter-chip interconnects 371 may couple from the CPU chip 269*b* to all of the TPU chips 269*c*. One or more of the programmable or fixed interconnects 361 or 364 of the inter-chip interconnects 371 may couple from the CPU chip 269*b* to both of the NVM IC chips 250. One or more of the programmable or fixed interconnects 361 or 364 of the inter-chip interconnects 371 may couple from the CPU chip 269*b* to all of the HBMIC chips 251. One or more of the programmable or fixed interconnects 361 or 364 of the inter-chip interconnects 371 may couple from one of the TPU chips 269*c* to one of the HBMIC chips 251 and the communication between said one of the TPU chips 269*c* and said one of the HBM IC chips 251 may have a data bit width of equal to or greater than 64, 128, 256, 512, 1024, 2048, 4096, 8K, or 16K. One or more of the programmable or fixed interconnects 361 or 364 of the inter-chip interconnects 371 may couple from each of the TPU chips 269*c* to both of the NVM IC chips 250. One or more of the programmable or fixed interconnects 361 or 364 of the inter-chip interconnects 371 may couple from each of the TPU chips 269*c* to the others of the TPU chips 269*c*. One or more of the programmable or fixed interconnects 361 or 364 of the inter-chip interconnects 371 may couple from each of the NVM IC chips 250 to the dedicated control chip 260. One or more of the programmable or fixed interconnects 361 or 364 of the inter-chip interconnects 371 may couple from each of the HBMIC chips 251 to the dedicated control chip 260. One or more of the programmable or fixed interconnects 361 or 364 of the inter-chip interconnects 371 may couple from each of the TPU chips 269*c* to the dedicated control chip 260. One or more of the programmable or fixed interconnects 361 or 364 of the inter-chip interconnects 371 may couple from the CPU chip 269*b* to the dedicated control chip 260. One or more of the programmable or fixed interconnects 361 or 364 of the inter-chip interconnects 371 may couple from each of the NVM IC chips 250 to all of the HBMIC chips 251. One or more of the programmable or fixed interconnects 361 or 364 of the inter-chip interconnects 371 may couple from each of the NVM IC chips 250 to the other of the NVM IC chips 250. One or more of the programmable or fixed interconnects 361 or 364 of the inter-chip interconnects 371 may couple from each of the HBMIC chips 251 to the others of the HBMIC chips 251.

Referring to FIG. 19N, the logic drive 300 may include multiple dedicated input/output (I/O) chips 265 in a peripheral region thereof surrounding a central region thereof having the standard commodity FPGA IC chips 200, NVM IC chips 250, dedicated control chip 260, TPU chips 269*c*, CPU chip 269*b*, HBMIC chips 251 and DPIIC chips 410 located therein. One or more of the programmable or fixed interconnects 361 or 364 of the inter-chip interconnects 371 may couple from each of the standard commodity FPGA IC chips 200 to all of the dedicated input/output (I/O) chips 265. One or more of the programmable or fixed interconnects 361 or 364 of the inter-chip interconnects 371 may couple from each of the DPIIC chips 410 to all of the dedicated input/output (I/O) chips 265. One or more of the programmable or fixed interconnects 361 or 364 of the inter-chip interconnects 371 may couple from each of the NVM IC chips 250 to all of the dedicated input/output (I/O) chips 265. One or more of the programmable or fixed interconnects 361 or 364 of the inter-chip interconnects 371 may couple from the dedicated control chip 260 to all of the dedicated input/output (I/O) chips 265. One or more of the programmable or fixed interconnects 361 or 364 of the inter-chip interconnects 371 may couple from each of the TPU chips 269*c* to all of the dedicated input/output (I/O)

chips 265. One or more of the programmable or fixed interconnects 361 or 364 of the inter-chip interconnects 371 may couple from the CPU chip 269*b* to all of the dedicated input/output (I/O) chips 265. One or more of the programmable or fixed interconnects 361 or 364 of the inter-chip interconnects 371 may couple from each of the HBMIC chips 251 to all of the dedicated input/output (I/O) chips 265.

Referring to FIG. 19N, each of the standard commodity FPGA IC chips 200 may be referred to one as illustrated in FIGS. 16A-16J, and each of the DPIIC chips 410 may be referred to one as illustrated in FIG. 17. The specification of the commodity standard FPGA IC chips 200, DPIIC chips 410, dedicated I/O chips 265 and dedicated control chip 260 may be referred to that as illustrated in FIG. 19A.

Referring to FIG. 19N, each of the NVM IC chips 250 may be designed and fabricated using advanced NAND flash technology nodes or generations, for example, more advanced than or smaller than or equal to 40 nm, 28 nm, 20 nm, 16 nm or 10 nm, wherein the advanced NAND flash technology may comprise Single Level Cells (SLC) or multiple level cells (MLC) (for example, Double Level Cells DLC, or triple Level cells TLC), and in a 2D-NAND or a 3D NAND structure. The 3D NAND structure may comprise multiple stacked layers or levels of NAND cells, for example, greater than or equal to 4, 8, 16, 32 stacked layers or levels of NAND cells. Accordingly, the standard commodity logic drive 300 may have a standard non-volatile memory density, capacity or size of greater than or equal to 8 MB, 64 MB, 128 MB, 512 MB, 1 GB, 4 GB, 16 GB, 64 GB, 256 GB, or 512 GB, wherein "B" is bytes, each byte has 8 bits.

Accordingly, referring to FIGS. 19F-19N, once the programmable interconnects 361 of the FPGA IC chips 200 and DPIIC chips 410 are programmed, the programmed programmable interconnects 361 together with the fixed interconnects 364 of the standard commodity FPGA IC chips 200 and DPIIC chips 410 may provide some specific functions for some given applications. The standard commodity FPGA IC chip or chips 200 may operate together with the PCIC chip or chips 269, e.g., GPU chip(s), CPU chip(s), TPU chip(s) or DSP chip(s), in the same logic drive 300 to provide powerful functions and operations in applications, for example, artificial intelligence (AI), machine learning, deep learning, big data, internet of things (IOT), virtual reality (VR), augmented reality (AR), driverless car electronics, graphic processing (GP), digital signal processing (DSP), micro controlling (MC), and/or central processing (CP).

Referring to FIGS. 19A-19N, the logic drive 300 and a software tool may be provided for users or software developers, in addition to current hardware developers, to easily develop their innovated or specific applications by using the standard commodity logic drive 300. The software tool provides capabilities for users or software developers to write software using popular, common, or easy-to-learn programming languages, for example, C, Java, C++, C#, Scala, Swift, Matlab, Assembly Language, Pascal, Python, Visual Basic, PL/SQL or JavaScript languages. The users or software developers may write software codes into the standard commodity logic drive 300, and the software codes may be transformed into the resulting values or programming codes to be loaded to the non-volatile memory cells 870 or 880 in or of the standard commodity logic drive 300 for their desired applications, for example, in applications of artificial intelligence (AI), machine learning, deep learning, big data, internet of things (IOT), car electronics, virtual reality (VR), augmented reality (AR), graphic processing, digital signal processing, micro controlling, and/or central processing.

The standard commodity logic drive 300 as seen in FIG. 19A-19N may have standard common features, counts or specifications: (1) programmable logic blocks (LB) 201 including (i) system gates with the count greater than or equal to 8M, 40M, 80M, 200M or 400M, (ii) logic cells or elements with the count greater than or equal to 256K, 512K, 2M, 4M, 16M or 32M, (iii) hard macros, for example DSP slices, microcontroller macros, multiplexer macros, fixed-wired adders, and/or fixed-wired multipliers and/or (iv) blocks of memory with the bit count equal to or greater than 4M, 40M, 200M, 400M, 800M or 2G bits; (2) the power supply voltage: the voltage may be between 0.1V and 12V, 0.1V and 7V, 0.1V and 3V, 0.1V and 2V, 0.1V and 1.5V, or 0.1V and 1V; (3) the I/O pads in the multi-chip package of the standard commodity logic drive, in terms of layout, location, number and function; wherein the logic drive may comprise the I/O pads, metal pillars or bumps connecting or coupling to one or multiple (2, 3, 4, or more than 4) Universal Serial Bus (USB) ports, one or more IEEE 1394 ports, one or more Ethernet ports, one or more audio ports or serial ports, for example, RS-232 or COM (communication) ports, wireless transceiver I/Os, and/or Bluetooth transceiver I/Os, and etc. The standard commodity logic drive 300 may also include the I/O pads, metal pillars or bumps connecting or coupling to Serial Advanced Technology Attachment (SATA) ports, or Peripheral Components Interconnect express (PCIe) ports for communicating, connecting or coupling with the memory drive. Since the standard commodity logic drives 300 are standard commodity products, the product inventory management becomes easy, efficient and effective, therefore resulting in a shorter logic drive delivery time and becoming cost-effective.

Interconnection for Logic drive

Figure 20A:
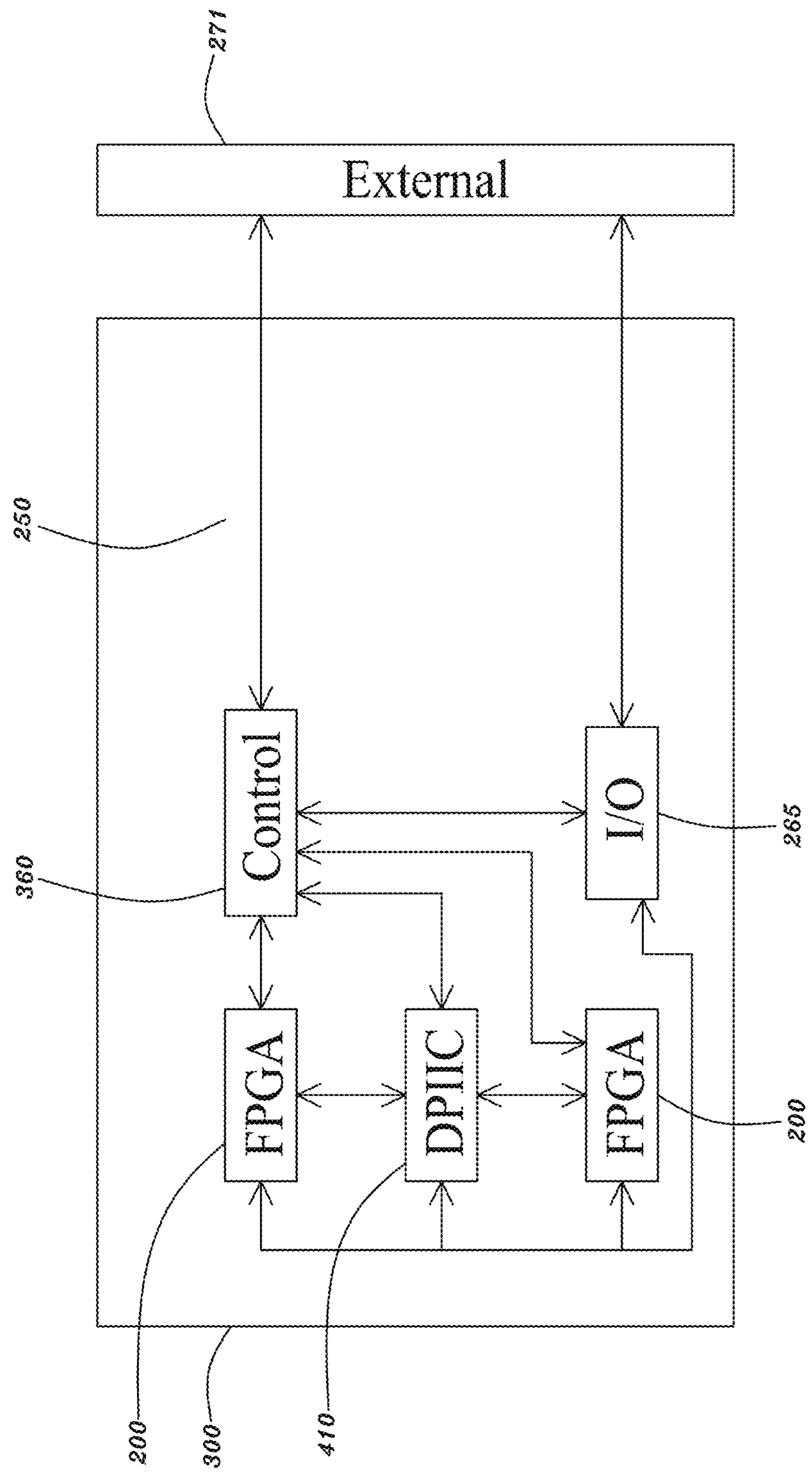
FIGS. 20A and 20B are various block diagrams showing various connections between chips in a logic drive in accordance with an embodiment of the present application.
Figure 20B:
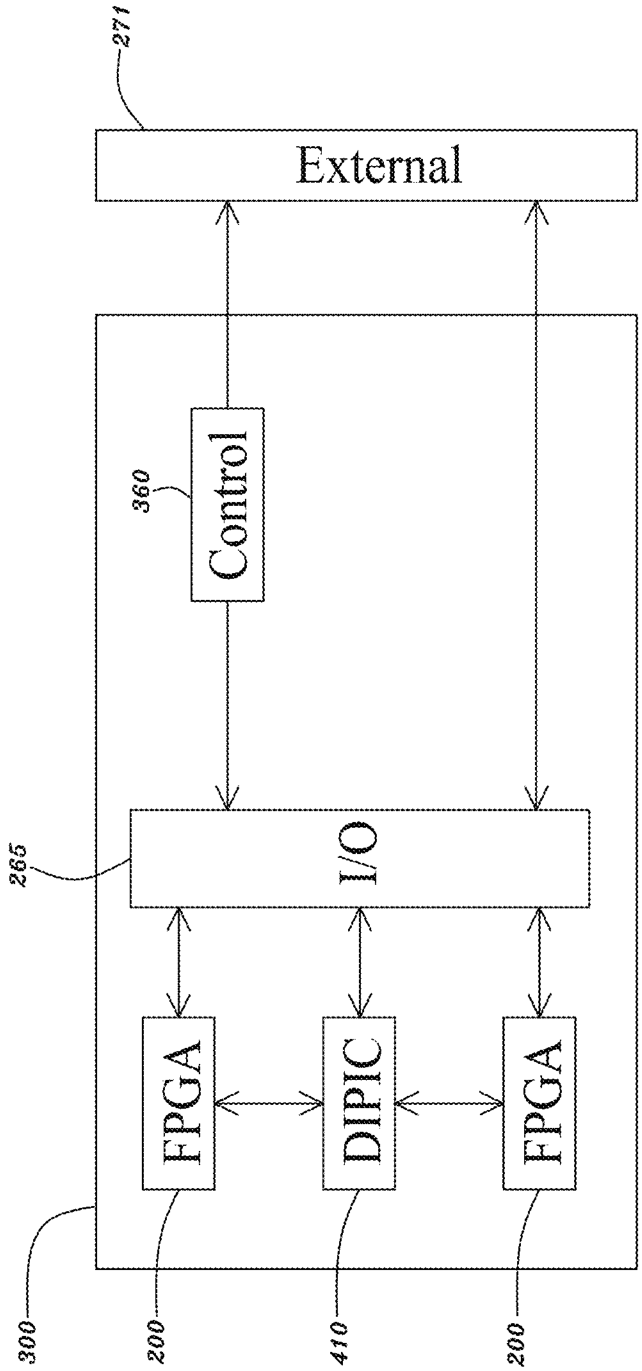

FIGS. 20A and 20B are various block diagrams showing various connections between chips in a logic drive in accordance with an embodiment of the present application. Referring to FIGS. 20A and 20B, two blocks 200 may be two different groups of the standard commodity FPGA IC chips 200 in the logic drive 300 illustrated in FIGS. 19A-19N; a block 410 may be a combination of the DPIIC chips 410 in the logic drive 300 illustrated in FIGS. 19A-19N; a block 265 may be a combination of the dedicated I/O chips 265 in the logic drive 300 illustrated in FIGS. 19A-19N; a block 360 may be the dedicated control chip 260, the dedicated control and I/O chip 266, the DCIAC chip 267 or DCDI/OIAC chip 268 in the logic drive 300 illustrated in FIGS. 19A-19N.

Referring to FIGS. 19A-19N and 20A-20B, the dedicated I/O chips 265 may reload resulting values or first programming codes from the external circuitry 271 outside the logic drive 300 to the memory cells 490 of the standard commodity FPGA IC chips 200 via the fixed interconnects 364 of the inter-chip interconnects 371 and the fixed interconnects 364 of the intra-chip interconnects 502 of the standard commodity FPGA IC chips 200 for programing one of the programmable logic blocks 201 of the standard commodity FPGA IC chips 200 as illustrated in FIGS. 14A-14J. The dedicated I/O chips 265 may reload second programming codes from the external circuitry 271 outside the logic drive 300 to the memory cells 362 of the standard commodity FPGA IC chips 200 via the fixed interconnects 364 of the inter-chip interconnects 371 and the fixed interconnects 364 of the intra-chip interconnects 502 of the standard commodity FPGA IC chips 200 for programing one of the pass/no-pass switches 258 or cross-point switches 379 of the standard commodity FPGA IC chips 200 as illustrated in FIGS. 10A-10F, 11A-11D and 15A-15F. The dedicated I/O chips 265 may reload third programming codes from the external circuitry 271 outside the logic drive 300 to the memory cells 362 of the DPIIC chips 410 via the fixed interconnects 364 of the inter-chip interconnects 371 and the fixed interconnects 364 of the intra-chip interconnects 502 of the DPIIC chips 410 for programing one of the pass/no-pass switches 258 or cross-point switches 379 of the DPIIC chips 410 as illustrated in FIGS. 10A-10F, 11A-11D and 15A-15F. The external circuitry 271 may not be allowed to reload the resulting values and first, second and third programming codes from any of the standard commodity FPGA IC chips 200 and DPIIC chips 410 in the logic drive 300. Alternatively, the external circuitry 271 may be allowed to reload the resulting values and first, second and third programming codes from one or all of the standard commodity FPGA IC chips 200 and DPIIC chips 410 in the logic drive 300.

I. First Type of Interconnection for Logic Drive

Referring to FIGS. 19A-19N and 20A, one or more of the programmable interconnects 361 of the inter-chip interconnects 371 may couple one or more of the small I/O circuits 203 of each of the dedicated I/O chips 265 to one or more of the small I/O circuits 203 of all of the standard commodity FPGA IC chips 200. One or more of the programmable interconnects 361 of the inter-chip interconnects 371 may couple one or more of the small I/O circuits 203 of each of the dedicated I/O chips 265 to one or more of the small I/O circuits 203 of all of the DPIIC chips 410. One or more of the programmable interconnects 361 of the inter-chip interconnects 371 may couple one or more of the small I/O circuits 203 of each of the dedicated I/O chips 265 to one or more of the small I/O circuits 203 of all the others of the dedicated I/O chips 265. One or more of the fixed interconnects 364 of the inter-chip interconnects 371 may couple one or more of the small I/O circuits 203 of each of the dedicated I/O chips 265 to one or more of the small I/O circuits 203 of all of the standard commodity FPGA IC chips 200. One or more of the fixed interconnects 364 of the inter-chip interconnects 371 may couple one or more of the small I/O circuits 203 of each of the dedicated I/O chips 265 to one or more of the small I/O circuits 203 of all of the DPIIC chips 410. One or more of the fixed interconnects 364 of the inter-chip interconnects 371 may couple one or more of the small I/O circuits 203 of each of the dedicated I/O chips 265 to one or more of the small I/O circuits 203 of all the others of the dedicated I/O chips 265.

Referring to FIGS. 19A-19N and 20A, one or more of the programmable interconnects 361 of the inter-chip interconnects 371 may couple one or more of the small I/O circuits 203 of each of the DPIIC chips 410 to one or more of the small I/O circuits 203 of all of the standard commodity FPGA IC chips 200. One or more of the programmable interconnects 361 of the inter-chip interconnects 371 may couple one or more of the small I/O circuits 203 of each of the DPIIC chips 410 to one or more of the small I/O circuits 203 of all the others of the DPIIC chips 410. One or more of the fixed interconnects 364 of the inter-chip interconnects 371 may couple one or more of the small I/O circuits 203 of each of the DPIIC chips 410 to one or more of the small I/O circuits 203 of all of the standard commodity FPGA IC chips 200. One or more of the fixed interconnects 364 of the inter-chip interconnects 371 may couple one or more of the small I/O circuits 203 of each of the DPIIC chips 410 to one or more of the small I/O circuits 203 of all the others of the DPIIC chips 410.

Referring to FIGS. 19A-19N and 20A, one or more of the programmable interconnects 361 of the inter-chip interconnects 371 may couple one or more of the small I/O circuits 203 of each of the standard commodity FPGA IC chips 200 to one or more of the small I/O circuits 203 of all the others of the standard commodity FPGA IC chips 200. One or more of the fixed interconnects 364 of the inter-chip interconnects 371 may couple one or more of the small I/O circuits 203 of each of the standard commodity FPGA IC chips 200 to one or more of the small I/O circuits 203 of all the others of the standard commodity FPGA IC chips 200.

Referring to FIGS. 19A-19N and 20A, one or more of the programmable interconnects 361 of the inter-chip interconnects 371 may couple one or more of the small I/O circuits 203 of the dedicated control chip 260, dedicated control and I/O chip 266, DCIAC chip 267 or DCDI/OIAC chip 268 in the control block 360 to one or more of the small I/O circuits 203 of all of the standard commodity FPGA IC chips 200. One more of the fixed interconnects 364 of the inter-chip interconnects 371 may couple one or more of the small I/O circuits 203 of the dedicated control chip 260, dedicated control and I/O chip 266, DCIAC chip 267 or DCDI/OIAC chip 268 in the control block 360 to one or more of the small I/O circuits 203 of all of the standard commodity FPGA IC chips 200. One or more of the programmable interconnects 361 of the inter-chip interconnects 371 may couple one or more of the small I/O circuits 203 of the dedicated control chip 260, dedicated control and I/O chip 266, DCIAC chip 267 or DCDI/OIAC chip 268 in the control block 360 to one or more of the small I/O circuits 203 of all of the DPIIC chips 410. One more of the fixed interconnects 364 of the inter-chip interconnects 371 may couple one or more of the small I/O circuits 203 of the dedicated control chip 260, dedicated control and I/O chip 266, DCIAC chip 267 or DCDI/OIAC chip 268 in the control block 360 to one or more of the small I/O circuits 203 of all of the DPIIC chips 410. One or more of the fixed interconnects 364 of the inter-chip interconnects 371 may couple one or more of the large I/O circuits 341 of the dedicated control chip 260, dedicated control and I/O chip 266, DCIAC chip 267 or DCDI/OIAC chip 268 in the control block 360 to one or more of the large I/O circuits 341 of all of the dedicated I/O chips 265. One or more of the large I/O circuits 341 of the dedicated control chip 260, dedicated control and I/O chip 266, DCIAC chip 267 or DCDI/OIAC chip 268 in the control block 360 may couple to the external circuitry 271 outside the logic drive 300.

Referring to FIGS. 19A-19N and 20A, one or more of the fixed interconnects 364 of the inter-chip interconnects 371 may couple one or more of the large I/O circuits 341 of each of the dedicated I/O chips 265 to one or more of the large I/O circuits 341 of the others of the dedicated I/O chips 265. One or more of the large I/O circuits 341 of each of the dedicated I/O chips 265 may couple to the external circuitry 271 outside the logic drive 300.

(1) Interconnection for Programming Memory Cells

Referring to FIGS. 19A-19N and 20A, in an aspect, one of the dedicated I/O chips 265 may have one of its large I/O circuits 341 to drive the third programming code from the external circuitry 271 outside the logic drive 300 to one of its small I/O circuits 203. For said one of the dedicated I/O chips 265, said one of its small I/O circuits 203 may drive the third programming code to one of the small I/O circuits 203 of one of the DPIIC chips 410 via one or more of the fixed interconnects 364 of the inter-chip interconnects 371. For said one of the DPIIC chips 410, said one of its small I/O circuits 203 may drive the third programming code to one of its memory cells 362 in one of its memory-array blocks 423 as seen in FIG. 17 via one or more of the fixed interconnects 364 of its intra-chip interconnects; the third programming code may be stored in said one of its memory cells 362 for programming one of its pass/no-pass switches 258 and/or cross-point switches 379 as illustrated in FIGS. 10A-10F, 11A-11D and 15A-15F.

Alternatively, referring to FIGS. 19A-19N and 20A, one of the dedicated I/O chips 265 may have one of its large I/O circuits 341 to drive the second programming code from the external circuitry 271 outside the logic drive 300 to one of its small I/O circuits 203. For said one of the dedicated I/O chips 265, said one of its small I/O circuits 203 may drive the second programming code to one of the small I/O circuits 203 of one of the standard commodity FPGA IC chips 200 via one or more of the fixed interconnects 364 of the inter-chip interconnects 371. For said one of the standard commodity FPGA IC chips 200, said one of its small I/O circuits 203 may drive the second programming code to one of its memory cells 362 via one or more of the fixed interconnects 364 of its intra-chip interconnects 502; the second programming code may be stored in said one of its memory cells 362 for programming one of its pass/no-pass switches 258 and/or cross-point switches 379 as illustrated in FIGS. 10A-10F, 11A-11D and 15A-15F.

Alternatively, referring to FIGS. 19A-19N and 20A, one of the dedicated I/O chips 265 may have one of its large I/O circuits 341 to drive the resulting value or first programming code from the external circuitry 271 outside the logic drive 300 to one of its small I/O circuits 203. For said one of the dedicated I/O chips 265, said one of its small I/O circuits 203 may drive the resulting value or first programming code to one of the small I/O circuits 203 of one of the standard commodity FPGA IC chips 200 via one or more of the fixed interconnects 364 of the inter-chip interconnects 371. For said one of the standard commodity FPGA IC chips 200, said one of its small I/O circuits 203 may drive the resulting value or first programming code to one of its memory cells 490 via one of its fixed interconnects 364; the resulting value or first programming code may be stored in said one of its memory cells 490 for programming one of its programmable logic blocks 201 as illustrated in FIGS. 14A-14J.

(2) Interconnection for Operation

Referring to FIGS. 19A-19N and 20A, in an aspect, one of the dedicated I/O chips 265 may have one of its large I/O circuits 341 to drive a signal from the external circuitry 271 outside the logic drive 300 to one of its small I/O circuits 203. For said one of the dedicated I/O chips 265, said one of its small I/O circuits 203 may drive the signal to a first one of the small I/O circuits 203 of one of the DPIIC chips 410 via one or more of the programmable interconnects 361 of the inter-chip interconnects 371. For said one of the dedicated DPIIC chips 410, the first one of its small I/O circuits 203 may drive the signal to one of its cross-point switches 379 via a first one of the programmable interconnects 361 of its intra-chip interconnects; said one of its cross-point switches 379 may switch the signal from the first one of the programmable interconnects 361 of its intra-chip interconnects to a second one of the programmable interconnects 361 of its intra-chip interconnects to be passed to a second one of its small I/O circuits 203; the second one of its small I/O circuits 203 may drive the signal to one of the small I/O circuits 203 of one of the standard commodity FPGA IC chips 200 via one or more of the programmable interconnects 361 of the inter-chip interconnects 371. For said one of the standard commodity FPGA IC chips 200, said one of its small I/O circuits 203 may drive the signal to one of its cross-point switches 379 through a first group of the programmable interconnects 361 and by-pass interconnects 279 of its intra-chip interconnects 502 as seen in FIG. 16G; said one of its cross-point switches 379 may switch the signal to pass from the first group of the programmable interconnects 361 and by-pass interconnects 279 of its intra-chip interconnects 502 to a second group of the programmable interconnects 361 and by-pass interconnects 279 of its intra-chip interconnects 502 to be passed to one of the inputs A0-A3 of one of its programmable logic blocks (LB) 201 as seen in FIG. 14A or 14H.

Referring to FIGS. 19A-19N and 20A, in another aspect, for a first one of the standard commodity FPGA IC chips 200, one of its programmable logic blocks (LB) 201 as seen in FIG. 14A or 14H may generate an output Dout, C0, C1, C2 or C3 to be passed to one of its cross-point switches 379 via a first group of the programmable interconnects 361 and by-pass interconnects 279 of its intra-chip interconnects 502; said one of its cross-point switches 379 may switch the output Dout to pass from the first group of the programmable interconnects 361 and by-pass interconnects 279 of its intra-chip interconnects 502 to a second group of the programmable interconnects 361 and by-pass interconnects 279 of its intra-chip interconnects 502 to be passed to one of its small I/O circuits 203; said one of its small I/O circuits 203 may drive the output Dout to a first one of the small I/O circuits 203 of one of the DPIIC chips 410 via one or more of the programmable interconnects 361 of the inter-chip interconnects 371. For said one of the DPIIC chips 410, the first one of its small I/O circuits 203 may drive the output Dout to one of its cross-point switches 379 via a first group of the programmable interconnects 361 of its intra-chip interconnects; said one of its cross-point switches 379 may switch the output Dout to pass from the first group of the programmable interconnects 361 of its intra-chip interconnects to a second group of the programmable interconnects 361 of its intra-chip interconnects to be passed to a second one of its small I/O circuits 203; the second one of its small I/O circuits 203 may drive the output Dout to one of the small I/O circuits 203 of a second one of the standard commodity FPGA IC chips 200 via one or more of the programmable interconnects 361 of the inter-chip interconnects 371. For the second one of the FPGA IC chips 200, said one of its small I/O circuits 203 may drive the output Dout to one of its cross-point switches 379 through a first group of the programmable interconnects 361 and by-pass interconnects 279 of its intra-chip interconnects 502 as seen in FIG. 16G; said one of its cross-point switches 379 may switch the output Dout to pass from the first group of the programmable interconnects 361 and by-pass interconnects 279 of its intra-chip interconnects 502 to a second group of the programmable interconnects 361 and by-pass interconnects 279 of its intra-chip interconnects 502 to be passed to one of the inputs A0-A3 of one of its programmable logic blocks (LB) 201 as seen in FIG. 14A or 14H.

Referring to FIGS. 19A-19N and 20A, in another aspect, for one of the standard commodity FPGA IC chips 200, one of its programmable logic blocks (LB) 201 as seen in FIG. 14A or 14H may generate an output Dout, C0, C1, C2 or C3 to be passed to one of its cross-point switches 379 via a first group of the programmable interconnects 361 and by-pass interconnects 279 of its intra-chip interconnects 502; said one of its cross-point switches 379 may switch the output Dout to pass from the first group of the programmable interconnects 361 and by-pass interconnects 279 of its intra-chip interconnects 502 to a second group of the programmable interconnects 361 and by-pass interconnects 279 of its intra-chip interconnects 502 to be passed to one of its small I/O circuits 203; said one of its small I/O circuits 203 may drive the output Dout to a first one of the small I/O circuits 203 of one of the DPIIC chips 410 via one or more of the programmable interconnects 361 of the inter-chip interconnects 371. For said one of the DPIIC chips 410, the first one of its small I/O circuits 203 may drive the output Dout to one of its cross-point switches 379 via a first group of the programmable interconnects 361 of its intra-chip interconnects; said one of its cross-point switches 379 may switch the output Dout to pass from the first group of the programmable interconnects 361 of its intra-chip interconnects to a second group of the programmable interconnects 361 of its intra-chip interconnects to be passed to a second one of its small I/O circuits 203; the second one of its small I/O circuits 203 may drive the output Dout to one of the small I/O circuits 203 of one of the dedicated I/O chips 265 via one or more of the programmable interconnects 361 of the inter-chip interconnects 371. For said one of the dedicated I/O chips 265, said one of its small I/O circuits 203 may drive the output Dout to one of its large I/O circuits 341 to be passed to the external circuitry 271 outside the logic drive 300.

(3) Interconnection for Controlling

Referring to FIGS. 19A-19N and 20A, for the dedicated control chip 260, dedicated control and I/O chip 266, DCIAC chip 267 or DCDI/OIAC chip 268 in the control block 360, one of its large I/O circuits 341 may receive or drive a control command from or to the external circuitry 271 outside the logic drive 300.

Alternatively, referring to FIGS. 19A-19N and 20A, one of the dedicated I/O chips 265 may have a first one of its large I/O circuits 341 to drive a control command from the external circuitry 271 outside the logic drive 300 to a second one of its large I/O circuits 341. For said one of the dedicated I/O chips 265, the second one of its large I/O circuits 341 may drive the control command to one of the large I/O circuits 341 of the dedicated control chip 260, dedicated control and I/O chip 266, DCIAC chip 267 or DCDI/OIAC chip 268 in the control block 360 via one or more of the fixed interconnects 364 of the inter-chip interconnects 371.

Alternatively, referring to FIGS. 19A-19N and 20A, for the dedicated control chip 260, dedicated control and I/O chip 266, DCIAC chip 267 or DCDI/OIAC chip 268 in the control block 360, one of its large I/O circuits 341 may drive a control command to a first one of the large I/O circuits 341 of one of the dedicated I/O chips 265 via one or more of the fixed interconnects 364 of the inter-chip interconnects 371. For said one of the dedicated I/O chips 265, the first one of its large I/O circuits 341 may drive the control command to a second one of its large I/O circuits 341 to be passed to the external circuitry 271 outside the logic drive 300.

Thereby, referring to FIGS. 19A-19N and 20A, a control command may be provided from the external circuitry 271 outside the logic drive 300 to the dedicated control chip 260, dedicated control and I/O chip 266, DCIAC chip 267 or DCDI/OIAC chip 268 in the control block 360 or from the dedicated control chip 260, dedicated control and I/O chip 266, DCIAC chip 267 or DCDI/OIAC chip 268 in the control block 360 to the external circuitry 271 outside the logic drive 300.

II. Second Type of Interconnection for Logic Drive

Referring to FIGS. 19A-19N and 20B, one or more of the programmable interconnects 361 of the inter-chip interconnects 371 may couple one or more of the small I/O circuits 203 of each of the dedicated I/O chips 265 to one or more of the small I/O circuits 203 of all of the standard commodity FPGA IC chips 200. One or more of the programmable interconnects 361 of the inter-chip interconnects 371 may couple one or more of the small I/O circuits 203 of each of the dedicated I/O chips 265 to one or more of the small I/O circuits 203 of all of the DPIIC chips 410. One or more of the programmable interconnects 361 of the inter-chip interconnects 371 may couple one or more of the small I/O circuits 203 of each of the dedicated I/O chips 265 to one or more of the small I/O circuits 203 of all the others of the dedicated I/O chips 265. One or more of the fixed interconnects 364 of the inter-chip interconnects 371 may couple one or more of the small I/O circuits 203 of each of the dedicated I/O chips 265 to one or more of the small I/O circuits 203 of all of the standard commodity FPGA IC chips 200. One or more of the fixed interconnects 364 of the inter-chip interconnects 371 may couple one or more of the small I/O circuits 203 of each of the dedicated I/O chips 265 to one or more of the small I/O circuits 203 of all of the DPIIC chips 410. One or more of the fixed interconnects 364 of the inter-chip interconnects 371 may couple one or more of the small I/O circuits 203 of each of the dedicated I/O chips 265 to one or more of the small I/O circuits 203 of all the others of the dedicated I/O chips 265.

Referring to FIGS. 19A-19N and 20B, one or more of the programmable interconnects 361 of the inter-chip interconnects 371 may couple one or more of the small I/O circuits 203 of each of the DPIIC chips 410 to one or more of the small I/O circuits 203 of all of the standard commodity FPGA IC chips 200. One or more of the programmable interconnects 361 of the inter-chip interconnects 371 may couple one or more of the small I/O circuits 203 of each of the DPIIC chips 410 to one or more of the small I/O circuits 203 of all the others of the DPIIC chips 410. One or more of the fixed interconnects 364 of the inter-chip interconnects 371 may couple one or more of the small I/O circuits 203 of each of the DPIIC chips 410 to one or more of the small I/O circuits 203 of all of the standard commodity FPGA IC chips 200. One or more of the fixed interconnects 364 of the inter-chip interconnects 371 may couple one or more of the small I/O circuits 203 of each of the DPIIC chips 410 to one or more of the small I/O circuits 203 of all the others of the DPIIC chips 410.

Referring to FIGS. 19A-19N and 20B, one or more of the programmable interconnects 361 of the inter-chip interconnects 371 may couple one or more of the small I/O circuits 203 of each of the standard commodity FPGA IC chips 200 to one or more of the small I/O circuits 203 of all the others of the standard commodity FPGA IC chips 200. One or more of the fixed interconnects 364 of the inter-chip interconnects 371 may couple one or more of the small I/O circuits 203 of each of the standard commodity FPGA IC chips 200 to one or more of the small I/O circuits 203 of all the others of the standard commodity FPGA IC chips 200.

Referring to FIGS. 19A-19N and 20B, one or more of the fixed interconnects 364 of the inter-chip interconnects 371 may couple one or more of the large I/O circuits 341 of the dedicated control chip 260, dedicated control and I/O chip 266, DCIAC chip 267 or DCDI/OIAC chip 268 in the control block 360 to one or more of the large I/O circuits 341 of all of the dedicated I/O chips 265. One or more of the large I/O circuits 341 of the dedicated control chip 260, dedicated control and I/O chip 266, DCIAC chip 267 or DCDI/OIAC chip 268 in the control block 360 may couple to the external circuitry 271 outside the logic drive 300.

Referring to FIGS. 19A-19N and 20B, one or more of the fixed interconnects 364 of the inter-chip interconnects 371 may couple one or more of the large I/O circuits 341 of each of the dedicated I/O chips 265 to one or more of the large I/O circuits 341 of all the others of the dedicated I/O chips 265. One or more of the large I/O circuits 341 of each of the dedicated I/O chips 265 may couple to the external circuitry 271 outside the logic drive 300.

Referring to FIGS. 19A-19N and 20B, in this case, the dedicated control chip 260, dedicated control and I/O chip 266, DCIAC chip 267 or DCDI/OIAC chip 268 in the control block 360 may not be provided with any I/O circuit having input or output capacitance, driving capability or loading smaller than 2 pF, but provided with the large I/O circuits 341 as seen in FIG. 13A to perform the above-mentioned connection. The dedicated control chip 260, dedicated control and I/O chip 266, DCIAC chip 267 or DCDI/OIAC chip 268 in the control block 360 may pass control commands or other signals to all of the standard commodity FPGA IC chips 200 through one or more of the dedicated I/O chips 265; the dedicated control chip 260, dedicated control and I/O chip 266, DCIAC chip 267 or DCDI/OIAC chip 268 in the control block 360 may pass control commands or other signals to all of the DPIIC chips 410 through one or more of the dedicated I/O chips 265; the dedicated control chip 260, dedicated control and I/O chip 266, DCIAC chip 267 or DCDI/OIAC chip 268 in the control block 360 may have no freedom to pass any control command or other signal to any of the standard commodity FPGA IC chips 200 not through any of the dedicated I/O chips 265; the dedicated control chip 260, dedicated control and I/O chip 266, DCIAC chip 267 or DCDI/OIAC chip 268 in the control block 360 may have no freedom to pass any control command or other signal to any of the DPIIC chips 410 not through any of the dedicated I/O chips 265.

(1) Interconnection for Programming Memory Cells

Referring to FIGS. 19A-19N and 20B, in an aspect, one of the dedicated I/O chips 265 may have one of its large I/O circuits 341 to drive the third programming code from the external circuitry 271 outside the logic drive 300 to one of its small I/O circuits 203. For said one of the dedicated I/O chips 265, said one of its small I/O circuits 203 may drive the third programming code to one of the small I/O circuits 203 of one of the DPIIC chips 410 via one or more of the fixed interconnects 364 of the inter-chip interconnects 371. For said one of the DPIIC chips 410, said one of its small I/O circuits 203 may drive the third programming code to one of its memory cells 362 in one of its memory-array blocks 423 as seen in FIG. 17 via one or more of the fixed interconnects 364 of its intra-chip interconnects; the third programming code may be stored in said one of its memory cells 362 for programming one of its pass/no-pass switches 258 and/or cross-point switches 379 as illustrated in FIGS. 10A-10F, 11A-11D and 15A-15F.

Alternatively, referring to FIGS. 19A-19N and 20B, one of the dedicated I/O chips 265 may have one of its large I/O circuits 341 to drive the second programming code from the external circuitry 271 outside the logic drive 300 to one of its small I/O circuits 203. For said one of the dedicated I/O chips 265, said one of its small I/O circuits 203 may drive the second programming code to one of the small I/O circuits 203 of one of the standard commodity FPGA IC chips 200 via one or more of the fixed interconnects 364 of the inter-chip interconnects 371. For said one of the standard commodity FPGA IC chips 200, said one of its small I/O circuits 203 may drive the second programming code to one of its memory cells 362 via one or more of the fixed interconnects 364 of its intra-chip interconnects 502; the second programming code may be stored in said one of its memory cells 362 for programming one of its pass/no-pass switches 258 and/or cross-point switches 379 as illustrated in FIGS. 10A-10F, 11A-11D and 15A-15F.

Alternatively, referring to FIGS. 19A-19N and 20B, one of the dedicated I/O chips 265 may have one of its large I/O circuits 341 to drive the resulting value or first programming code from the external circuitry 271 outside the logic drive 300 to one of its small I/O circuits 203. For said one of the dedicated I/O chips 265, said one of its small I/O circuits 203 may drive the resulting value or first programming code to one of the small I/O circuits 203 of one of the standard commodity FPGA IC chips 200 via one or more of the fixed interconnects 364 of the inter-chip interconnects 371. For said one of the standard commodity FPGA IC chips 200, said one of its small I/O circuits 203 may drive the resulting value or first programming code to one of its memory cells 490 via one or more of the fixed interconnects 364 of its intra-chip interconnects 502; the resulting value or first programming code may be stored in said one of its memory cells 490 for programming one of its programmable logic blocks 201 as illustrated in FIGS. 14A-14J.

(2) Interconnection for Operation

Referring to FIGS. 19A-19N and 20B, in an aspect, one of the dedicated I/O chips 265 may have one of its large I/O circuits 341 to drive a signal from the external circuitry 271 outside the logic drive 300 to one of its small I/O circuits 203. For said one of the dedicated I/O chips 265, said one of its small I/O circuits 203 may drive the signal to a first one of the small I/O circuits 203 of one of the DPIIC chips 410 via one or more of the programmable interconnects 361 of the inter-chip interconnects 371. For said one of the dedicated DPIIC chips 410, the first one of its small I/O circuits 203 may drive the signal to one of its cross-point switches 379 via a first group of the programmable interconnects 361 of its intra-chip interconnects; said one of its cross-point switches 379 may switch the signal from the first group of the programmable interconnects 361 of its intra-chip interconnects to a second group of the programmable interconnects 361 of its intra-chip interconnects to be passed to a second one of its small I/O circuits 203; the second one of its small I/O circuits 203 may drive the signal to one of the small I/O circuits 203 of one of the standard commodity FPGA IC chips 200 via one or more of the programmable interconnects 361 of the inter-chip interconnects 371. For said one of the standard commodity FPGA IC chips 200, said one of its small I/O circuits 203 may drive the signal to one of its cross-point switches 379 through a first group of the programmable interconnects 361 and by-pass interconnects 279 of its intra-chip interconnects 502 as seen in FIG. 16G; said one of its cross-point switches 379 may switch the signal to pass from the first group of the programmable interconnects 361 and by-pass interconnects 279 of its intra-chip interconnects 502 to a second group of the programmable interconnects 361 and by-pass interconnects 279 of its intra-chip interconnects 502 to be passed to one of the inputs A0-A3 of one of its programmable logic blocks (LB) 201 as seen in FIG. 14A or 14H.

Referring to FIGS. 19A-19N and 20B, in another aspect, for a first one of the standard commodity FPGA IC chips 200, one of its programmable logic blocks (LB) 201 as seen in FIG. 14A or 14H may generate an output Dout, C0, C1, C2 or C3 to be passed to one of its cross-point switches 379 via a first group of the programmable interconnects 361 and by-pass interconnects 279 of its intra-chip interconnects 502; said one of its cross-point switches 379 may switch the output Dout to pass from the first group of the programmable interconnects 361 and by-pass interconnects 279 of its intra-chip interconnects 502 to a second group of the programmable interconnects 361 and by-pass interconnects 279 of its intra-chip interconnects 502 to be passed to one of its small I/O circuits 203; said one of its small I/O circuits 203 may drive the output Dout to a first one of the small I/O circuits 203 of one of the DPIIC chips 410 via one or more of the programmable interconnects 361 of the inter-chip interconnects 371. For said one of the DPIIC chips 410, the first one of its small I/O circuits 203 may drive the output Dout to one of its cross-point switches 379 via a first group of the programmable interconnects 361 of its intra-chip interconnects; said one of its cross-point switches 379 may switch the output Dout to pass from the first group of the programmable interconnects 361 of its intra-chip interconnects to a second group of the programmable interconnects 361 of its intra-chip interconnects to be passed to a second one of its small I/O circuits 203; the second one of its small I/O circuits 203 may drive the output Dout to one of the small I/O circuits 203 of a second one of the standard commodity FPGA IC chips 200 via one or more of the programmable interconnects 361 of the inter-chip interconnects 371. For the second one of the FPGA IC chips 200, said one of its small I/O circuits 203 may drive the output Dout to one of its cross-point switches 379 through a first group of the programmable interconnects 361 and by-pass interconnects 279 of its intra-chip interconnects 502 as seen in FIG. 16G; said one of its cross-point switches 379 may switch the output Dout to pass from the first group of the programmable interconnects 361 and by-pass interconnects 279 of its intra-chip interconnects 502 to a second group of the programmable interconnects 361 and by-pass interconnects 279 of its intra-chip interconnects 502 to be passed to one of the inputs A0-A3 of one of its programmable logic blocks (LB) 201 as seen in FIG. 14A or 14H.

Referring to FIGS. 19A-19N and 20B, in another aspect, for one of the standard commodity FPGA IC chips 200, one of its programmable logic blocks (LB) 201 as seen in FIG. 14A or 14H may generate an output Dout, C0, C1, C2 or C3 to be passed to one of its cross-point switches 379 via a first group of the programmable interconnects 361 and by-pass interconnects 279 of its intra-chip interconnects 502; said one of its cross-point switches 379 may switch the output Dout to pass from the first group of the programmable interconnects 361 and by-pass interconnects 279 of its intra-chip interconnects 502 to a second group of the programmable interconnects 361 and by-pass interconnects 279 of its intra-chip interconnects 502 to be passed to one of its small I/O circuits 203; said one of its small I/O circuits 203 may drive the output Dout to a first one of the small I/O circuits 203 of one of the DPIIC chips 410 via one or more of the programmable interconnects 361 of the inter-chip interconnects 371. For said one of the DPIIC chips 410, the first one of its small I/O circuits 203 may drive the output Dout to one of its cross-point switches 379 via a first group of the programmable interconnects 361 of its intra-chip interconnects; said one of its cross-point switches 379 may switch the output Dout to pass from the first group of the programmable interconnects 361 of its intra-chip interconnects to a second group of the programmable interconnects 361 of its intra-chip interconnects to be passed to a second one of its small I/O circuits 203; the second one of its small I/O circuits 203 may drive the output Dout to one of the small I/O circuits 203 of one of the dedicated I/O chips 265 via one or more of the programmable interconnects 361 of the inter-chip interconnects 371. For said one of the dedicated I/O chips 265, said one of its small I/O circuits 203 may drive the output Dout to one of its large I/O circuits 341 to be passed to the external circuitry 271 outside the logic drive 300.

(3) Interconnection for Controlling

Referring to FIGS. 19A-19N and 20B, for the dedicated control chip 260, dedicated control and I/O chip 266, DCIAC chip 267 or DCDI/OIAC chip 268 in the control block 360, one of its large I/O circuits 341 may receive or drive a control command from or to the external circuitry 271 outside the logic drive 300.

Alternatively, referring to FIGS. 19A-19N and 20B, one of the dedicated I/O chips 265 may have a first one of its large I/O circuits 341 to drive a control command, from the external circuitry 271 outside the logic drive 300 to a second one of its large I/O circuits 341. For said one of the dedicated I/O chips 265, the second one of its large I/O circuits 341 may drive the control command to one of the large I/O circuits 341 of the dedicated control chip 260, dedicated control and I/O chip 266, DCIAC chip 267 or DCDI/OIAC chip 268 in the control block 360 via one or more of the fixed interconnects 364 of the inter-chip interconnects 371.

Alternatively, referring to FIGS. 19A-19N and 20B, for the dedicated control chip 260, dedicated control and I/O chip 266, DCIAC chip 267 or DCDI/OIAC chip 268 in the control block 360, one of its large I/O circuits 341 may drive a control command to a first one of the large I/O circuits 341 of one of the dedicated I/O chips 265 via one or more of the fixed interconnects 364 of the inter-chip interconnects 371. For said one of the dedicated I/O chips 265, the first one of its large I/O circuits 341 may drive the control command to a second one of its large I/O circuits 341 to be passed to the external circuitry 271 outside the logic drive 300.

Thereby, referring to FIGS. 19A-19N and 20B, a control command may be provided from the external circuitry 271 outside the logic drive 300 to the dedicated control chip 260, dedicated control and I/O chip 266, DCIAC chip 267 or DCDI/OIAC chip 268 in the control block 360 or from the dedicated control chip 260, dedicated control and I/O chip 266, DCIAC chip 267 or DCDI/OIAC chip 268 in the control block 360 to the external circuitry 271 outside the logic drive 300.

Figure 20C:
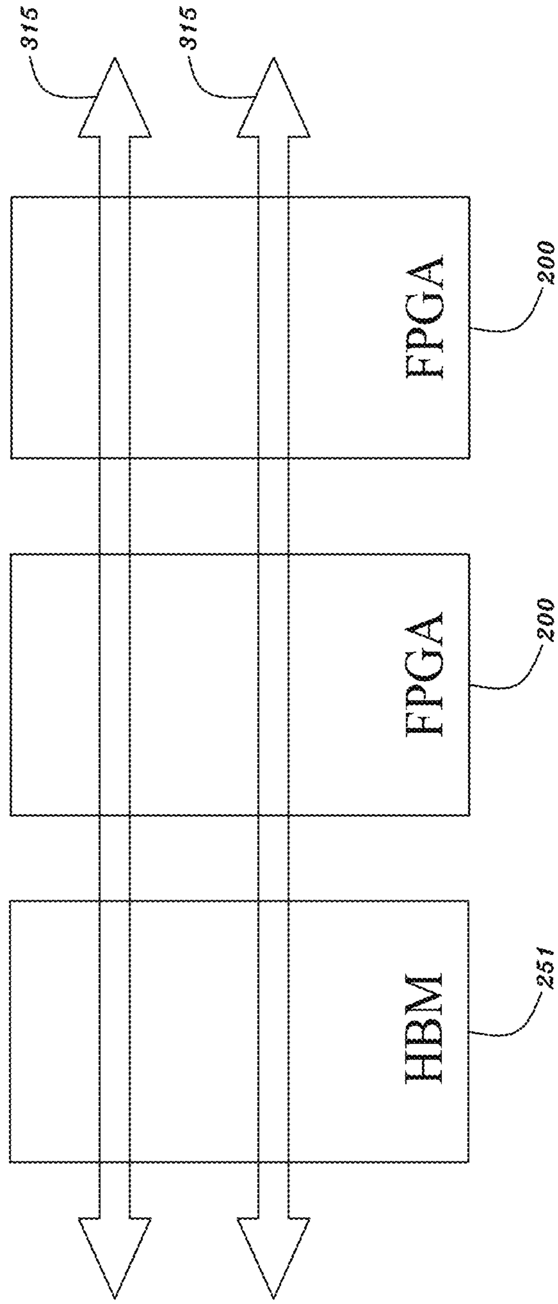
FIG. 20C is a block diagram illustrating multiple data buses for one or more standard commodity FPGA IC chips and high bandwidth memory (HBM) IC chips in accordance with the present application.

Data Buses for Standard Commodity FPGA IC Chips and High Bandwidth Memory (HBM) IC Chips FIG. 20C is a block diagram illustrating multiple data buses for one or more standard commodity FPGA IC chips and high bandwidth memory (HBM) IC chips in accordance with the present application. Referring to FIGS. 19L-19N and 20C, the logic drive 300 may be provided with multiple data buses 315 each constructed from multiple of the programmable interconnects 361 and/or multiple of the fixed interconnects 364. For example, for the logic drive 300, multiple of its programmable interconnects 361 may be programmed into one of its data buses 315. Alternatively, multiple of its programmable interconnects 361 may be programmed to be combined with multiple of its fixed interconnects 364 into one of its data buses 315. Alternatively, multiple of its fixed interconnects 364 may be combined into one of its data buses 315.

Referring to FIG. 20C, one of the data buses 315 may couples multiple of the standard commodity FPGA IC chips 200 and multiple of the high bandwidth memory (HBM) IC chips 251 (only one is shown). For example, in a first clock, said one of the data buses 315 may be switched to couple one of the I/O ports of a first one of the standard commodity FPGA IC chips 200 to one of the I/O ports of a second one of the standard commodity FPGA IC chips 200. Said one of the I/O ports of the first one of the standard commodity FPGA IC chips 200 is selected in accordance with the logic levels at the chip-enable pad 209, input-enable pad 221, input-selection pads 226 and output-enable pad 227 of the first one of the standard commodity FPGA IC chips 200 as illustrated in FIG. 16A to receive data from said one of the data buses 315; said one of the I/O ports of the second one of the standard commodity FPGA IC chips 200 is selected in accordance with the logic levels at the chip-enable pad 209, input-enable pad 221, output-enable pad 227 and output-selection pads 228 of the second one of the standard commodity FPGA IC chips 200 as illustrated in FIG. 16A to drive or pass data to said one of the data buses 315. Thereby, in the first clock, said one of the I/O ports of the second one of the standard commodity FPGA IC chips 200 may drive or pass data to said one of the I/O ports of the first one of the standard commodity FPGA IC chips 200 through said one of the data buses 315. In the first clock, said one of the data buses 315 is not used for data transmission by the other(s) of the standard commodity FPGA IC chips 200 coupling thereto or by the high bandwidth memory (HBM) IC chips 251 coupling thereto.

Further, referring to FIG. 20C, in a second clock, said one of the data buses 315 may be switched to couple said one of the I/O ports of the first one of the standard commodity FPGA IC chips 200 to one of I/O ports of a first one of the high bandwidth memory (HBM) IC chips 251. Said one of the I/O ports of the first one of the standard commodity FPGA IC chips 200 is selected in accordance with the logic levels at the chip-enable pad 209, input-enable pad 221, input-selection pads 226 and output-enable pad 227 of the first one of the standard commodity FPGA IC chips 200 as illustrated in FIG. 16A to receive data from said one of the data buses 315; said one of the I/O ports of the first one of the high bandwidth memory (HBM) IC chips 251 is selected to drive or pass data to said one of the data buses 315. Thereby, in the second clock, said one of the I/O ports of the first one of the high bandwidth memory (HBM) IC chips 251 may drive or pass data to said one of the I/O ports of the first one of the standard commodity FPGA IC chips 200 through said one of the data buses 315. In the second clock, said one of the data buses 315 is not used for data transmission by the other(s) of the standard commodity FPGA IC chips 200 coupling thereto or by the other(s) of the high bandwidth memory (HBM) IC chips 251 coupling thereto.

Further, referring to FIG. 20C, in a third clock said one of the data buses 315 may be switched to couple said one of the I/O ports of the first one of the standard commodity FPGA IC chips 200 to said one of the I/O ports of the first one of the high bandwidth memory (HBM) IC chips 251. Said one of the I/O ports of the first one of the standard commodity FPGA IC chips 200 is selected in accordance with the logic levels at the chip-enable pad 209, input-enable pad 221, output-enable pad 227 and output-selection pads 228 of the second one of the standard commodity FPGA IC chips 200 as illustrated in FIG. 16A to drive or pass data to said one of the data buses 315; said one of the I/O ports of the first one of the high bandwidth memory (HBM) IC chips 251 is selected to receive data from said one of the data buses 315. Thereby, in the third clock, said one of the I/O ports of the first one of the standard commodity FPGA IC chips 200 may drive or pass data to said one of the I/O ports of the first one of the high bandwidth memory (HBM) IC chips 251 through said one of the data buses 315. In the third clock, said one of the data buses 315 is not used for data transmission by the other(s) of the standard commodity FPGA IC chips 200 coupling thereto or by the other(s) of the high bandwidth memory (HBM) IC chips 251 coupling thereto.

Further, referring to FIG. 20C, in a fourth clock said one of the data buses 315 may be switched to couple said one of the I/O ports of the first one of the high bandwidth memory (HBM) IC chips 251 to one of I/O ports of a second one of the high bandwidth memory (HBM) IC chips 251. Said one of the I/O ports of the second one of the high bandwidth memory (HBM) IC chips 251 is selected to drive or pass data to said one of the data buses 315; said one of the I/O ports of the first one of the high bandwidth memory (HBM) IC chips 251 is selected to receive data from said one of the data buses 315. Thereby, in the fourth clock, said one of the I/O ports of the second one of the high bandwidth memory (HBM) IC chips 251 may drive or pass data to said one of the I/O ports of the first one of the high bandwidth memory (HBM) IC chips 251 through said one of the data buses 315. In the fourth clock, said one of the data buses 315 is not used for data transmission by the standard commodity FPGA IC chips 200 coupling thereto or by the other(s) of the high bandwidth memory (HBM) IC chips 251 coupling thereto.

Algorithm for Data Loading to Memory Cells

Figure 21A:
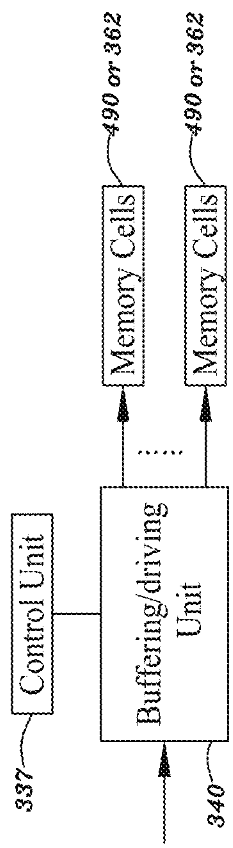
FIGS. 21A and 21B are block diagrams showing an algorithm for data loading to memory cells in accordance with an embodiment of the present application.

FIG. 21A is a block diagram showing an algorithm for data loading to memory cells in accordance with an embodiment of the present application. Referring to FIG. 21A, for loading data to the memory cells 490 or 362 of the standard commodity FPGA IC chip 200 as seen in FIGS. 16A-16J and to the memory cells 362 of the DPIIC chip 410 as seen in FIG. 17, a buffering/driving unit or buffer 340 may be provided for buffering data, such as the resulting values or programming codes, transmitted in series thereto and driving or amplifying the data in parallel to the memory cells 490 or 362 of the standard commodity FPGA IC chip 200 and/or to the memory cells 362 of the DPIIC chip 410. Furthermore, a control unit 337 may be provided for controlling the buffering/driving unit 340 to buffer the resulting values or programming codes transmitted in series to its input and drive them in parallel to its outputs. Each of the outputs of the buffering/driving unit 340 may couple to one of the memory cells 490 and 362 of the standard commodity FPGA IC chip 200 as seen in FIGS. 16A-16J and/or couple to one of the memory cells 362 of the DPIIC chip 410 as seen in FIG. 17.

Figure 21B:
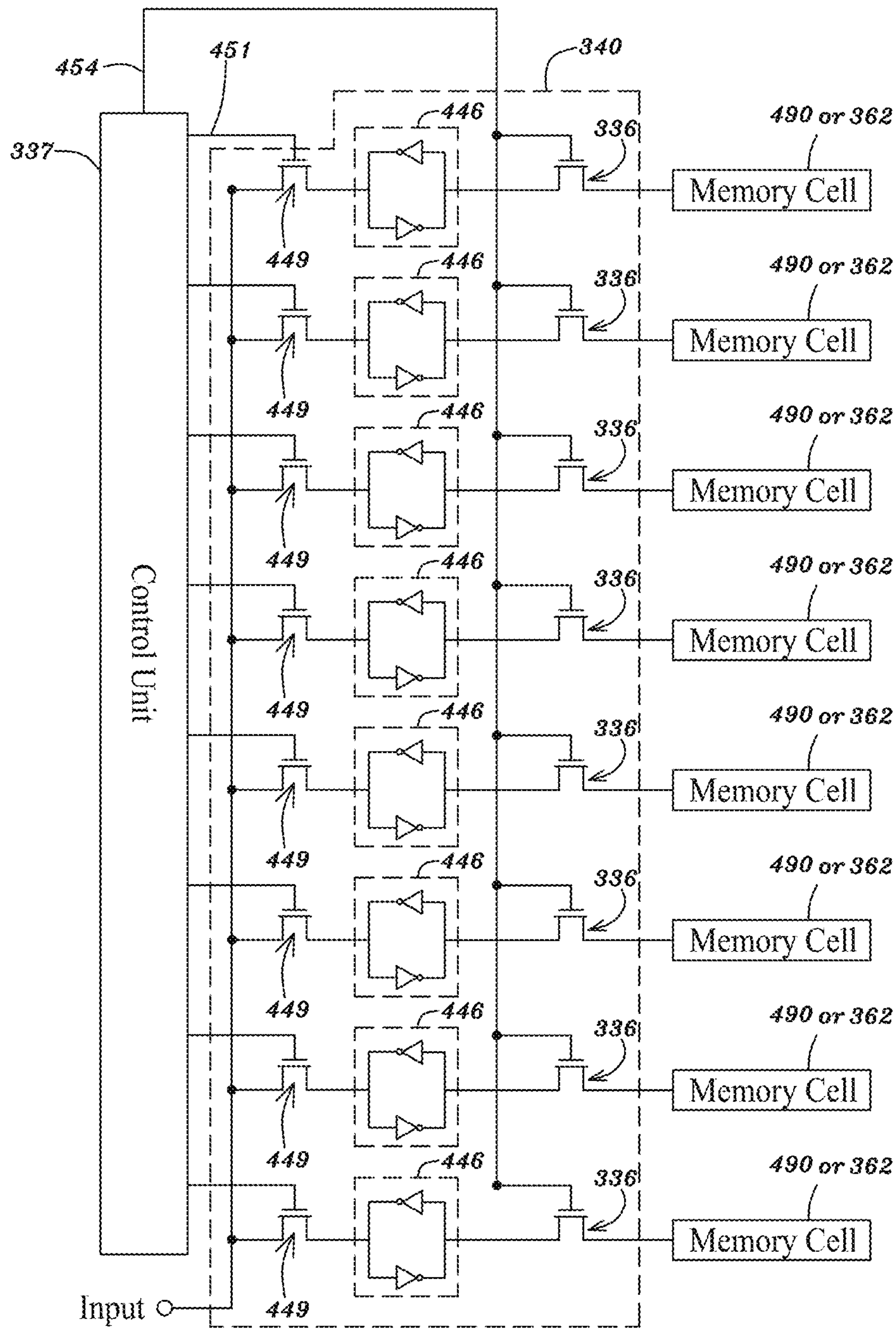

FIG. 21B is a circuit diagram showing architecture for data loading in accordance with an embodiment of the present application. Referring to FIG. 21B, in a serial-advanced-technology-attachment (SATA) standard, the buffering/driving unit 340 may include (1) multiple memory units 446, each of which may be an SRAM cell as illustrated in FIG. 8, (2) multiple switches 449 as illustrated in FIG. 8 each having a channel with an end coupling in parallel to each other or one another through a bit line 452 or bit-bar line 453 as illustrated in FIG. 8 coupling to the input of the buffering/driving unit 340 and the other end coupling in series to one of the memory units 446, and (3) multiple switches 336 each having a channel with an end coupling in series to one of the memory units 446 and the other end coupling in series to one of the memory cells 490 or 362 of the standard commodity FPGA IC chip 200 as seen in FIGS. 16A-16J or one of the memory cells 362 of the DPIIC chip 410 as seen in FIG. 17.

Referring to FIG. 21B, the control unit 337 couples to gate terminals of the switches 449 through multiple word lines 451 as illustrated in FIG. 8 and to gate terminals of the switches 336 through a word line 454. Thereby, the control unit 337 is configured in turn and one by one to turn on one of the switches 449 and off the others of the switches 449 in each of first clock periods in each of clock cycles and configured to turn off all of the switches 449 in a second clock period in said each of clock cycles. The control unit 337 is configured to turn on all of the switches 336 in the second clock period in said each of clock cycles and off all of the switches 336 in said each of first clock periods in said each of clock cycles with a data bit-width of equal to or greater than 2, 4, 8, 16, 32 or 64 between the buffering/driving unit 340 and the memory cells 490 or 362 of the standard commodity FPGA IC chip 200 or between the buffering/driving unit 340 and the memory cells 362 of the DPIIC chip 410.

For example, referring to FIG. 21B, in a first one of the first clock periods in a first one of the clock cycles, the control unit 337 may turn on the bottommost one of the switches 449 and off the others of the switches 449, and thereby first data, such as a first one of the resulting values or programming codes, from the input of the buffering/driving unit 340 may pass through the channel of the bottommost one of the switches 449 to be latched or stored in the bottommost one of the memory units 446. Next, in a second one of the first clock periods in the first one of the clock cycles, the control unit 337 may turn on the second bottom one of the switches 449 and off the others of the switches 449, and thereby second data, such as a second one of the resulting values or programming codes, from the input of the buffering/driving unit 340 may pass through the channel of the second bottom one of the switches 449 to be latched or stored in the second bottom one of the memory units 446. In the first one of the clock cycles, the control unit 337 may turn on the switches 449, in turn and one by one, and off the others of the switches 449 in the first clock periods, and thereby data, such as a first set of resulting values or programming codes, from the input of the buffering/driving unit 340 may, in turn and one by one, pass through the channels of the switches 449 to be latched or stored in the memory units 446, respectively. In the first one of the clock cycles, after the data from the input of the buffering/driving unit 340 are latched or stored, in turn and one by one, in all of the memory units 446, the control unit 337 may turn on all of the switches 336 and off all of the switches 449 in the second clock period, and thereby the data latched or stored in the memory units 446 may pass in parallel through the channels of the switches 336 to a first group of the memory cells 490 or 362 of the standard commodity FPGA IC chip 200 as seen in FIGS. 16A-16J and/or the memory cells 362 of the DPIIC chip 410 as seen in FIG. 17, respectively.

Next, referring to FIG. 21B, in a second one of the clock cycles, the control unit 337 and buffering/driving unit 340 may perform the same steps as illustrated above in the first one of the clock cycles. In the second one of the clock cycles, the control unit 337 may turn on the switches 449, in turn and one by one, and off the others of the switches 449 in the first clock periods, and thereby data, such as a second set of resulting values or programming codes, from the input of the buffering/driving unit 340 may, in turn and one by one, pass through the channels of the switches 449 to be latched or stored in the memory units 446, respectively. In the second one of the clock cycles, after the data from the input of the buffering/driving unit 340 are latched or stored, in turn and one by one, in all of the memory units 446, the control unit 337 may turn on all of the switches 336 and off all of the switches 449 in the second clock period, and thereby the data latched or stored in the memory units 446 may pass in parallel through the channels of the switches 336 to a second group of the memory cells 490 or 362 of the standard commodity FPGA IC chip 200 as seen in FIGS. 16A-16J and/or the memory cells 362 of the DPIIC chip 410 as seen in FIG. 17, respectively.

Referring to FIG. 21B, the above steps may be repeated for multiple times to have data, such as the resulting values or programming codes, from the input of the buffering/driving unit 340 to be loaded in the memory cells 490 or 362 of the standard commodity FPGA IC chip 200 as seen in FIGS. 16A-16J and/or the memory cells 362 of the DPIIC chip 410 as seen in FIG. 17. The buffering/driving unit 340 may latch the data from its single input and increase data bit-width to the memory cells 490 or 362 of the standard commodity FPGA IC chip(s) 200 as seen in FIGS. 16A-16J and/or the memory cells 362 of the memory-array blocks 423 of the DPIIC chips 410 as seen in FIG. 17 in the logic drive 300 as seen in FIGS. 19A-19N.

Alternatively, in a peripheral-component-interconnect (PCI) standard, referring to FIGS. 21A and 21B, a plurality of the buffering/driving unit 340 having the number equal to or greater than 4, 8, 16, 32, or 64, for example, may be provided in parallel to buffer data, such as the resulting values or programming codes, in parallel from its inputs and drive or amplify the data to the memory cells 490 or 362 of the standard commodity FPGA IC chip(s) 200 as seen in FIGS. 16A-16J and/or the memory cells 362 of the DPIIC chips 410 as seen in FIG. 17 in the logic drive 300 as seen in FIGS. 19A-19N. Each of the buffering/driving units 340 may perform the same function as mentioned above.

I. First Type of Arrangement for Control Unit, Buffering/Driving Unit and Non-Volatile Memory Cells for Standard Commodity FPGA IC Chip Referring to FIGS. 21A and 21B, in a case that a bit width between the standard commodity FPGA IC chip 200 as seen in FIGS. 16A-16J and an external circuitry thereof is 32 bits, the buffering/driving units 340 having the number of 32 may be set in parallel in the standard commodity FPGA IC chip 200 to buffer data, such as the resulting values or programming codes, from their 32 respective inputs coupling to the external circuitry, i.e., with a bit width of 32 bits in parallel, and drive or amplify the data to the memory cells 490 and/or 362, each of which may be referred to the non-volatile memory cell 600, 650, 700, 760, 800, 900 or 910 as illustrated in FIG. 1A-1H, 2A-2E, 3A-3W, 4A-4S, 5A-5F, 6A-6G or 7A-7J, or the latched non-volatile memory cell 940 or 950 as illustrated in FIG. 9A or 9B, of the standard commodity FPGA IC chip 200 as seen in FIGS. 16A-16J. In each of the clock cycles, the control unit 337 set in the standard commodity FPGA IC chip 200 may turn on the switches 449, in turn and one by one, of each of the 32 buffering/driving units 340 and off the others of the switches 449 of said each of the 32 buffering/driving units 340 in the first clock periods and turn off all of the switches 336 of said each of the 32 buffering/driving units 340 in the first clock periods, and thereby data, such as the resulting values or programming codes, from the input of said each of the 32 buffering/driving units 340 may, in turn and one by one, pass through the channels of the switches 449 of said each of the 32 buffering/driving units 340 to be latched or stored in the memory units 446 of said each of the 32 buffering/driving units 340, respectively. In said each of the clock cycles, after the data from their 32 respective inputs in parallel are latched or stored, in turn and one by one, in all of the memory units 446 of the 32 buffering/driving units 340, the control unit 337 may turn on all of the switches 336 of the 32 buffering/driving units 340 and off all of the switches 449 of the 32 buffering/driving units 340 in the second clock period, and thereby the data latched or stored in all of the memory units 446 of the 32 buffering/driving units 340 may pass in parallel through the channels of the switches 336 of the 32 buffering/driving units 340 to the memory cells 490 and/or 362, each of which may be referred to the non-volatile memory cell 600, 650, 700, 760, 800, 900 or 910 as illustrated in FIG. 1A-1H, 2A-2E, 3A-3W, 4A-4S, 5A-5F, 6A-6G or 7A-7J, or the latched non-volatile memory cell 940 or 950 as illustrated in FIG. 9A or 9B, of the standard commodity FPGA IC chip 200 as seen in FIGS. 16A-16J, respectively.

For each of the logic drives 300 as seen in FIGS. 19A-19N, each of the standard commodity FPGA IC chips 200 may be provided with the first arrangement for the control unit 337, buffering/driving unit 340 and memory cells 490 and 362, each of which may be referred to the non-volatile memory cell 600, 650, 700, 760, 800, 900 or 910 as illustrated in FIG. 1A-1H, 2A-2E, 3A-3W, 4A-4S, 5A-5F, 6A-6G or 7A-7J, or the latched non-volatile memory cell 940 or 950 as illustrated in FIG. 9A or 9B, as mentioned above.

II. Second Type of Arrangement for Control Unit, Buffering/Driving Unit and Non-Volatile Memory Cells for DPIIC Chip Referring to FIGS. 21A and 21B, in a case that a bit width between the DPIIC chip 410 as seen in FIG. 17 and an external circuitry thereof is 32 bits, the buffering/driving units 340 having the number of 32 may be set in parallel in the DPIIC chip 410 to buffer data, such as the programming codes, from their 32 respective inputs coupling to the external circuitry, i.e., with a bit width of 32 bits in parallel, and drive or amplify the data to the memory cells 362, each of which may be referred to the non-volatile memory cell 600, 650, 700, 760, 800, 900 or 910 as illustrated in FIG. 1A-1H, 2A-2E, 3A-3W, 4A-4S, 5A-5F, 6A-6G or 7A-7J, or the latched non-volatile memory cell 940 or 950 as illustrated in FIG. 9A or 9B, of the DPIIC chip 410 as seen in FIG. 17. In each of the clock cycles, the control unit 337 set in the DPIIC chip 410 may turn on the switches 449, in turn and one by one, of each of the 32 buffering/driving units 340 and off the others of the switches 449 of said each of the 32 buffering/driving units 340 in the first clock periods and turn off all of the switches 336 of said each of the 32 buffering/driving units 340 in the first clock periods, and thereby data, such as the programming codes, from the input of said each of the 32 buffering/driving units 340 may, in turn and one by one, pass through the channels of the switches 449 of said each of the 32 buffering/driving units 340 to be latched or stored in the memory units 446 of said each of the 32 buffering/driving units 340, respectively. In said each of the clock cycles, after the data in parallel from their 32 respective inputs are latched or stored, in turn and one by one, in all of the memory units 446 of the 32 buffering/driving units 340, the control unit 337 may turn on all of the switches 336 of the 32 buffering/driving units 340 and off all of the switches 449 of the 32 buffering/driving units 340 in the second clock period, and thereby the data latched or stored in all of the memory units 446 of the 32 buffering/driving units 340 may pass in parallel through the channels of the switches 336 of the 32 buffering/driving units 340 to the memory cells 362, each of which may be referred to the non-volatile memory cell 600, 650, 700, 760, 800, 900 or 910 as illustrated in FIG. 1A-1H, 2A-2E, 3A-3W, 4A-4S, 5A-5F, 6A-6G or 7A-7J, or the latched non-volatile memory cell 940 or 950 as illustrated in FIG. 9A or 9B, of the DPIIC chip 410 as seen in FIG. 17, respectively.

For each of the logic drives 300 as seen in FIGS. 19A-19N, each of the DPIIC chips 410 may be provided with the second arrangement for the control unit 337, buffering/driving unit 340 and memory cells 362, each of which may be referred to the non-volatile memory cell 600, 650, 700, 760, 800, 900 or 910 as illustrated in FIG. 1A-1H, 2A-2E, 3A-3W, 4A-4S, 5A-5F, 6A-6G or 7A-7J, or the latched non-volatile memory cell 940 or 950 as illustrated in FIG. 9A or 9B, as mentioned above.

III. Third Type of Arrangement for Control Unit, Buffering/Driving Unit and Non-Volatile Memory Cells for Logic Drive Referring to FIGS. 21A and 21B, the third arrangement for the control unit 337, buffering/driving unit 340 and memory cells 490 and 362, each of which may be referred to the non-volatile memory cell 600, 650, 700, 760, 800, 900 or 910 as illustrated in FIG. 1A-1H, 2A-2E, 3A-3W, 4A-4S, 5A-5F, 6A-6G or 7A-7J, or the latched non-volatile memory cell 940 or 950 as illustrated in FIG. 9A or 9B, for the logic drive 300 as seen in FIGS. 19A-19N may be similar to the first arrangement for the control unit 337, buffering/driving unit 340 and memory cells 490 and 362, each of which may be referred to the non-volatile memory cell 600, 650, 700, 760, 800, 900 or 910 as illustrated in FIG. 1A-1H, 2A-2E, 3A-3W, 4A-4S, 5A-5F, 6A-6G or 7A-7J, or the latched non-volatile memory cell 940 or 950 as illustrated in FIG. 9A or 9B, for each of the standard commodity FPGA IC chips 200 of the logic drive 300, but the difference therebetween is that the control unit 337 in the third arrangement is set in the dedicated control chip 260, dedicated control and I/O chip 266, DCIAC chip 267 or DCDI/OIAC chip 268 as seen in FIGS. 19A-19N, but instead is not set in any of the standard commodity FPGA IC chips 200 of the logic drives 300. The control unit 337 set in the dedicated control chip 260, dedicated control and I/O chip 266, DCIAC chip 267 or DCDI/OIAC chip 268 may (1) pass a control command to one of the switches 449 of the buffering/driving unit 340 in one of the standard commodity FPGA IC chips 200 through one of the word lines 451 provided by one or more of the fixed interconnects 364 of the inter-chip interconnects 371, or (2) pass a control command to the all switches 336 of the buffering/driving unit 340 in said one of the standard commodity FPGA IC chips 200 through the word line 454 provided by another of the fixed interconnects 364 of the inter-chip interconnects 371.

IV. Fourth Type of Arrangement for Control Unit, Buffering/Driving Unit and Non-Volatile Memory Cells for Logic Drive Referring to FIGS. 21A and 21B, the fourth arrangement for the control unit 337, buffering/driving unit 340 and memory cells 362, each of which may be referred to the non-volatile memory cell 600, 650, 700, 760, 800, 900 or 910 as illustrated in FIG. 1A-1H, 2A-2E, 3A-3W, 4A-4S, 5A-5F, 6A-6G or 7A-7J, or the latched non-volatile memory cell 940 or 950 as illustrated in FIG. 9A or 9B, for the logic drive 300 as seen in FIGS. 19A-19N may be similar to the second arrangement for the control unit 337, buffering/driving unit 340 and memory cells 362, each of which may be referred to the non-volatile memory cell 600, 650, 700, 760, 800, 900 or 910 as illustrated in FIG. 1A-1H, 2A-2E, 3A-3W, 4A-4S, 5A-5F, 6A-6G or 7A-7J, or the latched non-volatile memory cell 940 or 950 as illustrated in FIG. 9A or 9B, for each of the DPIIC chips 410 of the logic drive 300, but the difference therebetween is that the control unit 337 in the fourth arrangement is set in the dedicated control chip 260, dedicated control and I/O chip 266, DCIAC chip 267 or DCDI/OIAC chip 268 as seen in FIGS. 19A-19N, but instead is not set in any of the DPIIC chips 410 of the logic drives 300. The control unit 337 set in the dedicated control chip 260, dedicated control and I/O chip 266, DCIAC chip

267 or DCDI/OIAC chip 268 may (1) pass a control command to one of the switches 449 of the buffering/driving unit 340 in one of the DPIIC chips 410 through one of the word lines 451 provided by one or more of the fixed interconnects 364 of the inter-chip interconnects 371, or (2) pass a control command to the all switches 336 of the buffering/driving unit 340 in said one of the DPIIC chips 410 through the word line 454 provided by another of the fixed interconnects 364 of the inter-chip interconnects 371.

V. Fifth Type of Arrangement for Control Unit, Buffering/Driving Unit and Non-Volatile Memory Cells for Logic Drive Referring to FIGS. 21A and 21B, the fifth arrangement for the control unit 337, buffering/driving unit 340 and memory cells 490 and 362, each of which may be referred to the non-volatile memory cell 600, 650, 700, 760, 800, 900 or 910 as illustrated in FIG. 1A-1H, 2A-2E, 3A-3W, 4A-4S, 5A-5F, 6A-6G or 7A-7J, or the latched non-volatile memory cell 940 or 950 as illustrated in FIG. 9A or 9B, for the logic drive 300 as seen in FIGS. 19B, 19E, 19F. 19H and 19J may be similar to the first arrangement for the control unit 337, buffering/driving unit 340 and memory cells 490 and 362, each of which may be referred to the non-volatile memory cell 600, 650, 700, 760, 800, 900 or 910 as illustrated in FIG. 1A-1H, 2A-2E, 3A-3W, 4A-4S, 5A-5F, 6A-6G or 7A-7J, or the latched non-volatile memory cell 940 or 950 as illustrated in FIG. 9A or 9B, for each of the standard commodity FPGA IC chips 200 of the logic drive 300, but the difference therebetween is that both of the control unit 337 and buffering/driving unit 340 in the fifth arrangement are set in the dedicated control and I/O chip 266 or DCDI/OIAC chip 268 as seen in FIGS. 19B, 19E, 19F. 19H and 19J, but instead are not set in any of the standard commodity FPGA IC chips 200 of the logic drives 300. Data may be transmitted in series to the buffering/driving unit 340 in the dedicated control and I/O chip 266 or DCDI/OIAC chip 268 to be latched or stored in the memory units 446 of the buffering/driving unit 340. The buffering/driving unit 340 in the dedicated control and I/O chip 266 or DCDI/OIAC chip 268 may pass data in parallel from its memory units 446 to a group of the memory cells 490 and/or 362, each of which may be referred to the non-volatile memory cell 600, 650, 700, 760, 800, 900 or 910 as illustrated in FIG. 1A-1H, 2A-2E, 3A-3W, 4A-4S, 5A-5F, 6A-6G or 7A-7J, or the latched non-volatile memory cell 940 or 950 as illustrated in FIG. 9A or 9B, of one of the standard commodity FPGA IC chips 200 through, in sequence, the small I/O circuits 203, arranged in parallel, of the dedicated control and I/O chip 266 or DCDI/OIAC chip 268, the fixed interconnects 364, arranged in parallel, of the inter-chip interconnects 371 and the small I/O circuits 203, arranged in parallel, of said one of the standard commodity FPGA IC chips 200.

VI. Sixth Type of Arrangement for Control Unit, Buffering/Driving Unit and Non-Volatile Memory Cells for Logic Drive Referring to FIGS. 21A and 21B, the sixth arrangement for the control unit 337, buffering/driving unit 340 and memory cells 362, each of which may be referred to the non-volatile memory cell 600, 650, 700, 760, 800, 900 or 910 as illustrated in FIG. 1A-1H, 2A-2E, 3A-3W, 4A-4S, 5A-5F, 6A-6G or 7A-7J, or the latched non-volatile memory cell 940 or 950 as illustrated in FIG. 9A or 9B, for the logic drive 300 as seen in FIGS. 19B, 19E, 19F. 19H and 19J may be similar to the second arrangement for the control unit 337, buffering/driving unit 340 and memory cells 362, each of which may be referred to the non-volatile memory cell 600, 650, 700, 760, 800, 900 or 910 as illustrated in FIG. 1A-1H, 2A-2E, 3A-3W, 4A-4S, 5A-5F, 6A-6G or 7A-7J, or the latched non-volatile memory cell 940 or 950 as illustrated in FIG. 9A or 9B, for each of the DPIIC chips 410 of the logic drive 300, but the difference therebetween is that both of the control unit 337 and buffering/driving unit 340 in the sixth arrangement are set in the dedicated control and I/O chip 266 or DCDI/OIAC chip 268 as seen in FIGS. 19B, 19E, 19F. 19H and 19J, but instead are not set in any of the DPIIC chips 410 of the logic drives 300. Data may be transmitted in series to the buffering/driving unit 340 in the dedicated control and I/O chip 266 or DCDI/OIAC chip 268 to be latched or stored in the memory units 446 of the buffering/driving unit 340. The buffering/driving unit 340 in the dedicated control and I/O chip 266 or DCDI/OIAC chip 268 may pass data in parallel from its memory units 446 to a group of the memory cells 490 and 362, each of which may be referred to the non-volatile memory cell 600, 650, 700, 760, 800, 900 or 910 as illustrated in FIG. 1A-1H, 2A-2E, 3A-3W, 4A-4S, 5A-5F, 6A-6G or 7A-7J, or the latched non-volatile memory cell 940 or 950 as illustrated in FIG. 9A or 9B, of one of the DPIIC chips 410 through, in sequence, the small I/O circuits 203, arranged in parallel, of the dedicated control and I/O chip 266 or DCDI/OIAC chip 268, the fixed interconnects 364, arranged in parallel, of the inter-chip interconnects 371 and the small I/O circuits 203, arranged in parallel, of said one of the DPIIC chips 410.

VII. Seventh Type of Arrangement for Control Unit, Buffering/Driving Unit and Non-Volatile Memory Cells for Logic Drive Referring to FIGS. 21A and 21B, the seventh arrangement for the control unit 337, buffering/driving unit 340 and memory cells 490 and 362, each of which may be referred to the non-volatile memory cell 600, 650, 700, 760, 800, 900 or 910 as illustrated in FIG. 1A-1H, 2A-2E, 3A-3W, 4A-4S, 5A-5F, 6A-6G or 7A-7J, or the latched non-volatile memory cell 940 or 950 as illustrated in FIG. 9A or 9B, for the logic drive 300 as seen in FIGS. 19A-19N may be similar to the first arrangement for the control unit 337, buffering/driving unit 340 and memory cells 490 and 362, each of which may be referred to the non-volatile memory cell 600, 650, 700, 760, 800, 900 or 910 as illustrated in FIG. 1A-1H, 2A-2E, 3A-3W, 4A-4S, 5A-5F, 6A-6G or 7A-7J, or the latched non-volatile memory cell 940 or 950 as illustrated in FIG. 9A or 9B, for each of the standard commodity FPGA IC chips 200 of the logic drive 300, but the difference therebetween is that the control unit 337 in the seventh arrangement is set in the dedicated control chip 260, dedicated control and I/O chip 266, DCIAC chip 267 or DCDI/OIAC chip 268 as seen in FIGS. 19A-19N, but instead is not set in any of the standard commodity FPGA IC chips 200 of the logic drives 300. Further, the buffering/driving unit 340 in the seventh arrangement is set in one of the dedicated I/O chips 265 as seen in FIGS. 19A-19N, but instead is not set in any of the standard commodity FPGA IC chips 200 of the logic drives 300. The control unit 337 set in the dedicated control chip 260, dedicated control and I/O chip 266, DCIAC chip 267 or DCDI/OIAC chip 268 may (1) pass a control command to one of the switches 449 of the buffering/driving unit 340 in one of the dedicated I/O chips 265 through one of the word lines 451 provided by one of the fixed interconnects 364 of the inter-chip interconnects 371, and (2) pass a control command to the all switches 336 of the buffering/driving unit 340 in said one of the dedicated I/O chips 265 through the word line 454 provided by another of the fixed interconnects 364 of the inter-chip interconnects 371. Data may be transmitted in series to the buffering/driving unit 340 in said one of the dedicated I/O chips 265 to be latched or stored in the memory units 446 of the buffering/driving unit 340. The buffering/driving unit 340 in said one of the dedicated I/G chips 265 may pass data in parallel from its memory units 446 to a group of the memory cells 490 and/or 362, each of which may be referred to the non-volatile memory cell 600, 650, 700, 760, 800, 900 or 910 as illustrated in FIG. 1A-1H, 2A-2E, 3A-3W, 4A-4S, 5A-5F, 6A-6G or 7A-7J, or the latched non-volatile memory cell 940 or 950 as illustrated in FIG. 9A or 9B, of one of the standard commodity FPGA IC chips 200 through, in sequence, the small I/O circuits 203, arranged in parallel, of said one of the dedicated I/O chips 265, a group of the fixed interconnects 364, arranged in parallel, of the inter-chip interconnects 371 and the small I/G circuits 203, arranged in parallel, of said one of the standard commodity FPGA IC chips 200.

VIII. Eighth Type of Arrangement for Control Unit, Buffering/Driving Unit and Non-Volatile Memory Cells for Logic Drive Referring to FIGS. 21A and 21B, the eighth arrangement for the control unit 337, buffering/driving unit 340 and memory cells 362, each of which may be referred to the non-volatile memory cell 600, 650, 700, 760, 800, 900 or 910 as illustrated in FIG. 1A-1H, 2A-2E, 3A-3W, 4A-4S, 5A-5F, 6A-6G or 7A-7J, or the latched non-volatile memory cell 940 or 950 as illustrated in FIG. 9A or 9B, for the logic drive 300 as seen in FIGS. 19A-19N may be similar to the second arrangement for the control unit 337, buffering/driving unit 340 and memory cells 362, each of which may be referred to the non-volatile memory cell 600, 650, 700, 760, 800, 900 or 910 as illustrated in FIG. 1A-1H, 2A-2E, 3A-3W, 4A-4S, 5A-5F, 6A-6G or 7A-7J, or the latched non-volatile memory cell 940 or 950 as illustrated in FIG. 9A or 9B, for each of the DPIIC chips 410 of the logic drive 300, but the difference therebetween is that the control unit 337 in the eighth arrangement is set in the dedicated control chip 260, dedicated control and I/O chip 266, DCIAC chip 267 or DCDI/OIAC chip 268 as seen in FIGS. 19A-19N, but instead is not set in any of the DPIIC chips 410 of the logic drives 300. Further, the buffering/driving unit 340 in the eighth arrangement is set in one of the dedicated I/O chips 265 as seen in FIGS. 19A-19N, but instead is not set in any of the DPIIC chips 410 of the logic drives 300. The control unit 337 set in the dedicated control chip 260, dedicated control and I/O chip 266, DCIAC chip 267 or DCDI/OIAC chip 268 may (1) pass a control command to one of the switches 449 of the buffering/driving unit 340 in one of the dedicated I/O chips 265 through one of the word lines 451 provided by one of the fixed interconnects 364 of the inter-chip interconnects 371, and (2) pass a control command to the all switches 336 of the buffering/driving unit 340 in said one of the dedicated I/O chips 265 through the word line 454 provided by another of the fixed interconnects 364 of the inter-chip interconnects 371. Data may be transmitted in series to the buffering/driving unit 340 in said one of the dedicated I/O chips 265 to be latched or stored in the memory units 446 of the buffering/driving unit 340. The buffering/driving unit 340 in said one of the dedicated I/O chips 265 may pass data in parallel from its memory units 446 to a group of the memory cells 362, each of which may be referred to the non-volatile memory cells 600, 650, 700, 760, 800, 900 or 910 as illustrated in FIG. 1A-1H, 2A-2E, 3A-3W, 4A-4S, 5A-5F, 6A-6G or 7A-7J, or the latched non-volatile memory cell 940 or 950 as illustrated in FIG. 9A or 9B, of one of the DPIIC chips 410 through, in sequence, the small I/O circuits 203, arranged in parallel, of said one of the dedicated I/O chips 265, a group of the fixed interconnects 364, arranged in parallel, of the inter-chip interconnects 371 and the small I/O circuits 203, arranged in parallel, of said one of the DPIIC chips 410.

First Interconnection Scheme for Chip (FISC) and Process for Forming the Same

Each of the standard commodity FPGA IC chips 200, DPIIC chips 410, dedicated I/O chips 265, dedicated control chip 260, dedicated control and I/O chip 266, IAC chip 402, DCIAC chip 267, DCDI/OIAC chip 268, NVM IC chips 250, DRAM IC chips 321, HBM IC chips 251 and PCIC chips 269 may be formed by following steps.

FIG. 22A is a cross-sectional view of a semiconductor wafer in accordance with an embodiment of the present application. Referring to FIG. 22A, a semiconductor substrate or semiconductor blank wafer 2 may be a silicon substrate or silicon wafer, a GaAs substrate, GaAs wafer, a SiGe substrate, SiGe wafer, Silicon-On-Insulator (SOI) substrate with the substrate wafer size, for example 8", 12" or 18" in the diameter.

Referring to FIG. 22A, multiple semiconductor devices 4 are formed in or over a semiconductor-device area of the semiconductor substrate 2. The semiconductor devices 4 may comprise a memory cell, a logic circuit, a passive device, such as a resistor, a capacitor, an inductor or a filter, or an active device, such as p-channel MOS device, n-channel MOS device, CMOS (Complementary Metal Oxide Semiconductor) device, BJT (Bipolar Junction Transistor) device, BiCMOS (Bipolar CMOS) device or FIN Field-Effect-Transistor (FINFET), FINFET on Silicon-On-Insulator (FINFET SOI), Fully Depleted Silicon-On-Insulator (FDSOI) MOSFET, Partially Depleted Silicon-On-Insulator (PDSOI) MOSFET or conventional MOSFET, used for the transistors of the standard commodity FPGA IC chips 200, DPIIC chips 410, dedicated I/O chips 265, dedicated control chip 260, dedicated control and I/O chip 266, IAC chip 402, DCIAC chip 267, DCDI/OIAC chip 268, NVM IC chips 250, DRAM IC chips 321, HBM IC chips 251 and PCIC chips 269.

With regards to the logic drive 300 as seen in FIGS. 19A-19N, the semiconductor devices 4 may compose the multiplexer 211 of the programmable logic blocks (LB) 201, cells (A) 2011 for fixed-wired adders of the programmable logic blocks (LB) 201, cells (M) 2012 for fixed-wired multipliers of the programmable logic blocks (LB) 201, cells (C/R) 2013 for caches and registers of the programmable logic blocks (LB) 201, memory cells 490 for the look-up table 210 of the programmable logic blocks (LB) 201, memory cells 362 for the pass/no-pass switches 258, pass/no-pass switches 258, cross-point switches 379 and small I/O circuits 203, as illustrated in FIGS. 16A-16N, for each of its standard commodity FPGA IC chips 200. The semiconductor devices 4 may compose the memory cells 362 for the pass/no-pass switches 258, pass/no-pass switches 258, cross-point switches 379 and small I/O circuits 203, as illustrated in FIG. 17, for each of its DPIIC chips 410. The semiconductor devices 4 may compose the large and small I/O circuits 341 and 203, as illustrated in FIG. 18, for each of its dedicated I/O chips 265, its dedicated control and I/O chip 266 or its DCDI/OIAC chip 268. The semiconductor devices 4 may compose the control unit 337 as seen in FIGS. 21A and 21B set in each of its standard commodity FPGA IC chips 200, each of its DPIIC chips 410, its dedicated control chip 260, its dedicated control and I/O chip 266, its DCIAC chip 267 or its DCDI/OIAC chip 268. The semiconductor devices 4 may compose the buffering/driving unit 340 as seen in FIGS. 21A and 21B set in each of its standard commodity FPGA IC chips 200, each of its DPIIC chips 410, each of its dedicated I/O chips 265, its dedicated control and I/O chip 266 or its DCDI/OIAC chip 268.

Referring to FIG. 22A, a first interconnection scheme 20, connected to the semiconductor devices 4, is formed over the semiconductor substrate 2. The first interconnection scheme 20 in, on or of the Chip (FISC) is formed over the semiconductor substrate 2 by a wafer process. The FISC 20 may comprise 4 to 15 layers, or 6 to 12 layers of interconnection metal layers 6 (only three layers are shown) patterned with multiple metal pads, lines or traces 8 and multiple metal vias 10. The metal pads, lines or traces 8 and metal vias 10 of the FISC 20 may be used for the programmable and fixed interconnects 361 and 364 of the intra-chip interconnects 502, as seen in FIG. 16A, of each of the standard commodity FPGA IC chips 200. The first interconnection scheme 20 in, on or of the Chip (FISC) may include multiple insulating dielectric layers 12 and multiple interconnection metal layers 6 each in neighboring two of the insulating dielectric layers 12. Each of the interconnection metal layers 6 of the FISC 20 may include the metal pads, lines or traces 8 at a top portion thereof and the metal vias 10 at a bottom portion thereof. One of the insulating dielectric layers 12 of the FISC 20 may be between the metal pads, lines or traces 8 of neighboring two of the interconnection metal layers 6, a top one of which may have the metal vias 10 in said one of the insulating dielectric layers 12. For each of the interconnection metal layers 6 of the FISC 20, its metal pads, lines or traces 8 may have a thickness t1 of less than 3 μm (such as between 3 nm and 1,000 nm, between 10 nm and 500 nm, between 10 nm and 2,000 nm, or between 10 nm and 3,000 nm, or thinner than or equal to 5 nm, 10 nm, 30 nm, 50 nm, 100 nm, 200 nm, 300 nm, 500 nm, 1,000 nm, 1,500 nm or 2,000 nm) and may have a minimum width, for example, between 3 nm and 1,000 nm, or between 10 nm and 500 nm, or, narrower than 5 nm, 10 nm, 20 nm, 30 nm, 50 nm, 70 nm, 100 nm, 150 nm, 200 nm, 300 nm, 500 nm, 1,000 nm, 1,500 nm or 2,000 nm. For example, the metal pads, lines or traces 8 and metal vias 10 of the FISC 20 are principally made of copper by a damascene process such as single-damascene process or double-damascene process, mentioned as below. For each of the interconnection metal layers 6 of the FISC 20, its metal pads, lines or traces 8 may include a copper layer having a thickness of less than 3 μm (such as between 0.2 and 2 μm). Each of the insulating dielectric layers 12 of the FISC 20 may have a thickness between, for example, 3 nm and 1,000 nm, between 10 nm and 500 nm, between 10 nm and 2,000 nm or between 10 nm and 3,000 nm, or thinner than 5 nm, 10 nm, 30 nm, 50 nm, 100 nm, 200 nm, 300 nm, 500 nm, 1,000 nm or 2,000 nm.

I. Single Damascene Process for FISC

In the following, a single damascene process for the FISC 20 is illustrated in FIGS. 22B-22H. Referring to FIG. 22B, a first insulating dielectric layer 12 is provided and multiple metal vias 10 or metal pads, lines or traces 8 (only one is shown) having exposed top surfaces are provided in the first insulating dielectric layer 12. A top-most layer of the first insulating dielectric layer 12 may be, for example, a low k dielectric layer, such as SiOC layer.

Referring to FIG. 22C, a chemical vapor deposition (CVD) method may be performed to deposit a second insulating dielectric layer 12 (upper one) on or over the first insulating dielectric layer 12 (lower one) and on the exposed vias 10 or metal pads, lines or traces 8 in the first insulating dielectric layer 12. The second insulting dielectric layer 12 (upper one) may be formed by (a) depositing a bottom differentiate etch-stop layer 12*a*, for example, a Silicon Carbon Nitride layer (SiCN), on the top-most layer of the first insulting dielectric layer 12 (lower one) and on the exposed top surfaces of the vias 10 or metal pads, lines or traces 8 in the first insulating dielectric layer 12 (lower one), and (b) next depositing a low k dielectric layer 12*b*, for example, a SiOC layer, on the bottom differentiate etch-stop layer 12*a*. The low k dielectric layer 12*b* may have low k dielectric material having a dielectric constant smaller than that of the $SiO_2$ material. The SiCN, SiOC, and $SiO_2$ layers may be deposited by CVD methods. The material used for the first and second insulating dielectric layers 12 of the FISC 20 comprises inorganic material, or material compounds comprising silicon, nitrogen, carbon, and/or oxygen.

Next, referring to FIG. 22D, a photoresist layer 15 is coated on the second insulting dielectric layer 12 (upper one), and then the photoresist layer 15 is exposed and developed to form multiple trenches or openings 15*a* (only one is shown) in the photoresist layer 15. Next, referring to FIG. 22E, an etching process is performed to form trenches or openings 12*d* (only one is shown) in the second insulating dielectric layer 12 (upper one) and under the trenches or openings 15*a* in the photoresist layer 15. Next, referring to FIG. 22F, the photoresist layer 15 may be removed.

Next, referring to FIG. 22G, an adhesion layer 18 may be deposited on a top surface of the second insulating dielectric layer 12 (upper one), a sidewall of the trenches or openings 12*d* in the second insulating dielectric layer 12 (upper one) and a top surface of the vias 10 or metal pads, lines or traces 8 in the first insulating dielectric layer 12 (lower one) by, for example, sputtering or Chemical Vapor Depositing (CVD) a titanium (Ti) or titanium nitride (TiN) layer 18 (with thickness for example, between 1 nm and 50 nm). Next, an electroplating seed layer 22 may be deposited on the adhesion layer 18 by, for example, sputtering or CVD depositing a copper seed layer 22 (with a thickness, for example, between 3 nm and 200 nm) on the adhesion layer 18. Next, a copper layer 24 (with a thickness, for example, between 10 nm and 3,000 nm, 10 nm and 1,000 nm or 10 nm and 500 nm) may be electroplated on the copper seed layer 22.

Next, referring to FIG. 22H, a chemical-mechanical polishing (CMP) process may be applied to remove the adhesion layer 18, electroplating seed layer 22 and copper layer 24 outside the trenches or openings 12*d* in the second insulating dielectric layer 12 (upper one) until the top surface of the second insulating dielectric layer 12 (upper one) is exposed. The metals left or remained in trenches or openings 12*d* in the second insulating dielectric layer 12 (upper one) are used as the metal vias 10 or metal pads, lines or traces 8 for each of the interconnection metal layers 6 of the FISC 20.

In the single-damascene process, the copper electroplating process step and the CMP process step are performed for the metal pads, lines or traces 8 of a lower one of the interconnection metal layers 6, and are then performed sequentially again for the metal vias 10 of an upper one of the interconnection metal layers 6 in the insulating dielectric layer 12 on the lower one of the interconnection metal layers 6. In other words, in the single damascene copper process, the copper electroplating process step and the CMP process step are performed two times for forming the metal pads, lines or traces 8 of the lower one of the interconnection metal layers 6, and metal vias 10 of the upper one of the interconnection metal layers 6 in the insulating dielectric layer 12 on the lower one of interconnection metal layers 6.

II. Double Damascene Process for FISC

Alternatively, a double damascene process may be performed for fabricating the metal vias 10 and metal pads, lines or traces 8 of the FISC 20, as illustrated in FIGS. 22I-22Q. Referring to FIG. 22I, a first insulating dielectric layer 12 is provided and multiple metal pads, lines or traces 8 (only one is shown) having exposed top surfaces are provided in the first insulating dielectric layer 12. Atop-most layer of the first insulating dielectric layer 12 may be, for example, a Silicon Carbon Nitride layer (SiCN) or Silicon Nitride (SiN). Next, a dielectric stack layer comprising second and third insulating dielectric layers 12 are deposited on the top-most layer of the first insulting dielectric layer 12 and the exposed top surfaces of metal pads, lines or traces 8 in the first insulating dielectric layer 12. The dielectric stack layer comprises, from bottom to top, (a) a bottom low k dielectric layer 12*e*, such as SiOC layer, (to be used as an inter-metal dielectric layer to have the metal vias 10 formed therein) on the first insulating dielectric layer 12 (lower one), (b) a middle differentiate etch-stop layer 12*f*, such as Silicon Carbon Nitride layer (SiCN) or Silicon Nitride layer (SiN), on the bottom low k dielectric layer 12*e*, (c) a top low k SiOC layer 12*g* (to be used as the insulating dielectrics between the metal pads, lines or traces 8 in or of the same interconnection metal layer 6) on the middle differentiate etch-stop layer 12*f*, and (d) a top differentiate etch-stop layer 12*h*, such as Silicon Carbon Nitride layer (SiCN) or Silicon Nitride (SiN) layer, on the top low k SiOC layer 12*g*. All layers of SiCN, SiN or SiOC may be deposited by CVD methods. The bottom low k dielectric layer 12*e* and middle differentiate etch-stop layer 12*f* may compose the second insulating dielectric layer 12 (middle one); the top low k SiOC layer 12*g* and top differentiate etch-stop layer 12*h* may compose the third insulating dielectric layer 12 (top one).

Next, referring to FIG. 22J, a first photoresist layer 15 is coated on the top differentiate etch-stop layer 12*h* of the third insulting dielectric layer 12 (top one), and then the first photoresist layer 15 is exposed and developed to form multiple trenches or openings 15*a* (only one is shown) in the first photoresist layer 15 to expose the top differentiate etch-stop layer 12*h* of the third insulting dielectric layer 12 (top one). Next, referring to FIG. 22K, an etching process is performed to form trenches or top openings 12*i* (only one is shown) in the third insulating dielectric layer 12 (top one) and under the trenches or openings 15*a* in the first photoresist layer 15 and to stop at the middle differentiate etch-stop layer 12*f* of the second insulting dielectric layer 12 (middle one) for the later double-damascene copper process to from the metal pads, lines or traces 8 of the interconnection metal layer 6. Next, referring to FIG. 22L, the first photoresist layer 15 may be removed.

Next, referring to FIG. 22M, a second photoresist layer 17 is coated on the top differentiate etch-stop layer 12*h* of the third insulting dielectric layer 12 (top one) and the middle differentiate etch-stop layer 12*f* of the second insulting dielectric layer 12 (middle one), and then the second photoresist layer 17 is exposed and developed to form multiple trenches or openings 17*a* (only one is shown) in the second photoresist layer 17 to expose the middle differentiate etch-stop layer 12*f* of the second insulting dielectric layer 12 (middle one). Next, referring to FIG. 22N, an etching process is performed to form holes or bottom openings 12*j* (only one is shown) in the second insulating dielectric layer 12 (middle one) and under the trenches or openings 17*a* in the second photoresist layer 17 and to stop at the metal pads, lines or traces 8 (only one is shown) in the first insulating dielectric layer 12 for the later double-damascene copper process to from the metal vias 10 in the second insulating dielectric layer 12, i.e., inter-metal dielectric layer. Next, referring to FIG. 22O, the second photoresist layer 17 may be removed. The second and third insulating dielectric layers 12 (middle and upper ones) may compose a dielectric stack layer. One of the trenches or top openings 12*i* in the top portion of the dielectric stack layer, i.e., third insulating dielectric layer 12 (upper one), may overlap one of the bottom openings or holes 12*j* in the bottom portion of the dielectric stack layer, i.e., second insulating dielectric layer 12 (middle one), and have a larger size than that of said one of the bottom openings or holes 12*j*. In other words, the bottom openings or holes 12*j* in the bottom portion of the dielectric stack layer, i.e., second insulating dielectric layer 12 (middle one), are inside or enclosed by the trenches or top openings 12*i* in the top portion of the dielectric stack layer, i.e., third insulating dielectric layer 12 (upper one), from a top view.

Next, referring to FIG. 22P, an adhesion layer 18 may be deposited on top surfaces of the second and third insulating dielectric layers 12 (middle and upper ones), a sidewall of the trenches or top openings 12*i* in the third insulating dielectric layer 12 (upper one), a sidewall of the holes or bottom openings 12*j* in the second insulating dielectric layer 12 (middle one) and a top surface of the metal pads, lines or traces 8 in the first insulating dielectric layer 12 (bottom one) by, for example, sputtering or Chemical Vapor Depositing (CVD) a titanium (Ti) or titanium nitride (TiN) layer 18 (with thickness for example, between 1 nm and 50 nm). Next, an electroplating seed layer 22 may be deposited on the adhesion layer 18 by, for example, sputtering or CVD depositing a copper seed layer 22 (with a thickness, for example, between 3 nm and 200 nm) on the adhesion layer 18. Next, a copper layer 24 (with a thickness, for example, between 20 nm and 6,000 nm, 10 nm and 3,000 nm or 10 nm and 1,000 nm) may be electroplated on the copper seed layer 22.

Next, referring to FIG. 22Q, a chemical-mechanical polishing (CMP) process may be applied to remove the adhesion layer 18, electroplating seed layer 22 and copper layer 24 outside the holes or bottom openings 12*j* and trenches or top openings 12*i* in the second and third insulating dielectric layers 12 (middle and top ones) until the top surface of the third insulating dielectric layer 12 (top one) is exposed. The metals left or remained in the trenches or top openings 12*i* in the third insulating dielectric layer 12 (top one) are used as the metal pads, lines or traces 8 for each of the interconnection metal layers 6 of the FISC 20. The metals left or remained in the holes or bottom openings 12*j* in the second insulating dielectric layer 12 (middle one) are used as the metal vias 10 for each of the interconnection metal layers 6 of the FISC 20 for coupling the metal pads, lines or traces 8 below and above the metal vias 10.

In the double-damascene process, the copper electroplating process step and CMP process step are performed one time for forming the metal pads, lines or traces 8 and metal vias 10 in two of the insulating dielectric layers 12.

Accordingly, the processes for forming the metal pads, lines or traces 8 and metal vias 10 using the single damascene copper process as illustrated in FIGS. 22B-22H or the double damascene copper process as illustrated in FIGS. 22I-22Q may be repeated multiple times to form a plurality of the interconnection metal layer 6 for the FISC 20. The FISC 20 may comprise 4 to 15 layers or 6 to 12 layers of interconnection metal layers 6. The topmost one of the interconnection metal layers 6 of the FISC may have multiple metal pads 16, such as copper pads formed by the above-mentioned single or double damascene process or aluminum pads formed by a sputter process.

III. Passivation Layer for Chip

Referring to FIG. 22A, a passivation layer 14 is formed over the first interconnection scheme 20 of the chip (FISC) and over the insulating dielectric layers 12. The passivation layer 14 can protect the semiconductor devices 4 and the interconnection metal layers 6 from being damaged by moisture foreign ion contamination, or from water moisture or contamination form external environment, for example sodium mobile ions. In other words, mobile ions (such as sodium ion), transition metals (such as gold, silver and copper) and impurities may be prevented from penetrating through the passivation layer 14 to the semiconductor devices 4, such as transistors, polysilicon resistor elements and polysilicon-polysilicon capacitor elements, and to the interconnection metal layers 6.

Referring to FIG. 22A, the passivation layer 14 is commonly made of a mobile ion-catching layer or layers, for example, a combination of SiN, SiON, and/or SiCN layer or layers deposited by a chemical vapor deposition (CVD) process. The passivation layer 14 commonly has a thickness t3 of more than 0.3 μm, such as between 0.3 and 1.5 μm. In a preferred case, the passivation layer 14 may have a silicon-nitride layer having a thickness of more than 0.3 μm. The total thickness of the mobile ion catching layer or layers, i.e., a combination of SiN, SiON, and/or SiCN layer or layers, may be thicker than or equal to 100 nm, 150 nm, 200 nm, 300 nm, 450 nm or 500 nm.

Referring to FIG. 22A, an opening 14*a* in the passivation layer 14 is formed to expose a metal pad 16 of a topmost one of the interconnection metal layers 6 of the FISC 20. The metal pad 16 may be used for signal transmission or for connection to a power source or a ground reference. The metal pad 16 may have a thickness t4 of between 0.4 and 3 μm or between 0.2 and 2 μm. For example, the metal pad 16 may be composed of a sputtered aluminum layer or a sputtered aluminum-copper-alloy layer with a thickness of between 0.2 and 2 μm. Alternatively, the metal pad 16 may include the electroplated copper layer 24 formed by the single damascene process as seen in FIG. 22H or by the double damascene process as seen in FIG. 22Q.

Referring to FIG. 22A, the opening 14*a* may have a transverse dimension d, from a top view, of between 0.5 and 20 μm or between 20 and 200 μm. The shape of the opening 14*a* from a top view may be a circle, and the diameter of the circle-shaped opening 14*a* may be between 0.5 and 20 μm or between 20 and 200 μm. Alternatively, the shape of the opening 14*a* from a top view may be a square, and the width of the square-shaped opening 14*a* may be between 0.5 and 20 μm or between 20 and 200 μm. Alternatively, the shape of the opening 14*a* from a top view may be a polygon, such as hexagon or octagon, and the polygon-shaped opening 14*a* may have a width of between 0.5 and 20 μm or between 20 and 200 μm. Alternatively, the shape of the opening 14*a* from a top view may be a rectangle, and the rectangle-shaped opening 14*a* may have a shorter width of between 0.5 and 20 μm or between 20 and 200 μm. Further, there may be some of the semiconductor devices 4 under the metal pad 16 exposed by the opening 14*a*. Alternatively, there may be no active devices under the metal pad 16 exposed by the opening 14*a*.

First Type of Micro-Bump

FIGS. 23A-23H are schematically cross-sectional views showing a process for forming a chip with a first type of micro-bump or micro-pillar thereon in accordance with an embodiment of the present application. For connection to circuitry outside a chip, multiple micro-bumps may be formed over the metal pads 16 exposed by the openings 14*a* in the passivation layer 14.

Figure 23A:
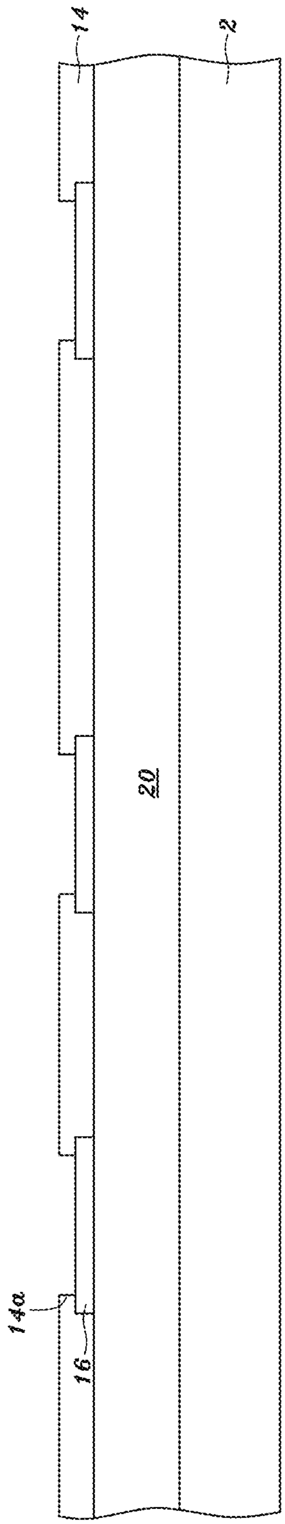
FIGS. 23A-23K are schematically cross-sectional views showing a process for forming a chip with a micro-bump or micro-pillar thereon in accordance with an embodiment of the present application.
Figure 23B:
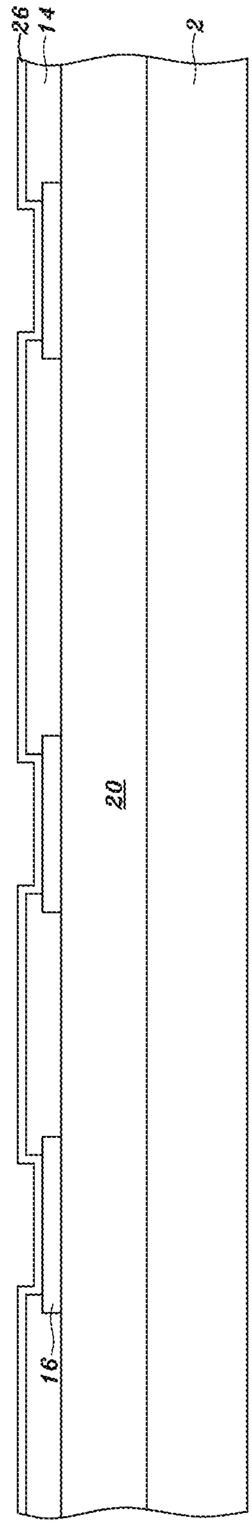

FIG. 23A is a simplified drawing from FIG. 22A. Referring to FIG. 23B, an adhesion layer 26 having a thickness of between 0.001 and 0.7 μm, between 0.01 and 0.5 μm or between 0.03 and 0.35 μm may be sputtered on the passivation layer 14 and on the metal pad 16, such as aluminum pad or copper pad, exposed by opening 14*a*. The material of the adhesion layer 26 may include titanium, a titanium-tungsten alloy, titanium nitride, chromium, titanium-tungsten-alloy layer, tantalum nitride, or a composite of the abovementioned materials. The adhesion layer 26 may be formed by an atomic-layer-deposition (ALD) process, chemical vapor deposition (CVD) process or evaporation process. For example, the adhesion layer 26 may be formed by sputtering or CVD depositing a titanium (Ti) or titanium nitride (TiN) layer (with a thickness, for example, between 1 nm and 50 nm) on the passivation layer 14 and on the metal pads 16 at a bottom of the openings 14 in the passivation layer 14.

Figure 23C:
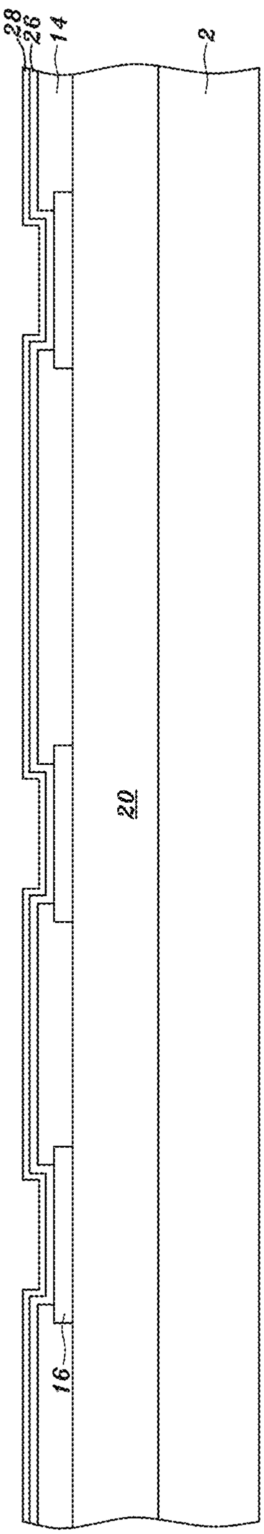

Next, referring to FIG. 23C, an electroplating seed layer 28 having a thickness of between 0.001 and 1 μm, between 0.03 and 2 μm or between 0.05 and 0.5 μm may be sputtered on the adhesion layer 26. Alternatively, the electroplating seed layer 28 may be formed by an atomic-layer-deposition (ALD) process, chemical-vapor-deposition (CVD) process, vapor deposition method, electroless plating method or PVD (Physical Vapor Deposition) method. The electroplating seed layer 28 is beneficial to electroplating a metal layer thereon. Thus, the material of the electroplating seed layer 28 varies with the material of a metal layer to be electroplated on the electroplating seed layer 28. When a copper layer is to be electroplated on the electroplating seed layer 28, copper is a preferable material to the electroplating seed layer 28. For example, the electroplating seed layer 28 may be deposited on or over the adhesion layer 26 by, for example, sputtering or CVD depositing a copper seed layer (with a thickness between, for example, 3 nm and 300 nm or 3 nm and 200 nm) on the adhesion layer 26.

Figure 23D:
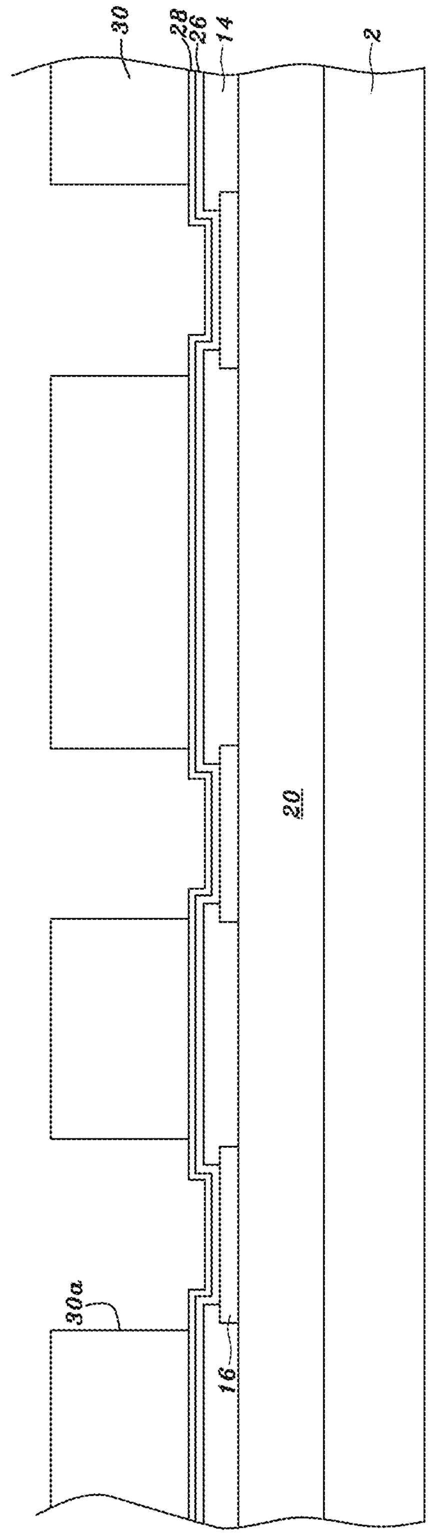

Next, referring to FIG. 23D, a photoresist layer 30, such as positive-type photoresist layer, having a thickness of between 2 μm and 60 μm, 5 μm and 50 μm, 5 μm and 40 μm, 5 μm and 30 μm, 5 μm and 20 μm, 2 μm and 15 μm, or 2 μm and 10 μm, between 5 and 300 μm or between 20 and 50 μm, or smaller than or equal to 60 μm, 30 μm, 20 μm, 15 μm, 10 μm or 5 μm is spin-on coated on the electroplating seed layer 28. The photoresist layer 30 is patterned with the processes of exposure, development, etc., to form an opening 30*a* in the photoresist layer 30 exposing the electroplating seed layer 28 over the pad 16. A 1× stepper, 1× contact aligner or laser scanner may be used to expose the photoresist layer 30 during the process of exposure.

For example, the photoresist layer 30 may be formed by spin-on coating a positive-type photosensitive polymer layer having a thickness of between 5 and 100 μm on the electroplating seed layer 28, then exposing the photosensitive polymer layer by using a 1× stepper, 1× contact aligner or laser scanner with at least two of G-line having a wavelength ranging from 434 to 438 nm, H-line having a wavelength ranging from 403 to 407 nm, and I-line having a wavelength ranging from 363 to 367 nm, to illuminate the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the electroplating seed layer 28 with an $O_2$ plasma or a plasma containing fluorine of below 200 PPM and oxygen, such that the photoresist layer 30 may be patterned with multiple openings 30*a* in the photoresist layer 30 exposing the electroplating seed layer 28 over the pad 16.

Referring to FIG. 23D, each of the openings 30*a* in the photoresist layer 30 may overlap one of the openings 14*a* in the passivation layer 14 for forming one of micro-pillars or micro-bumps in said one of the openings 30*a* by following processes to be performed later, exposing the electroplating seed layer 28 at the bottom of said one of the openings 30*a*, and may extend out of said one of the openings 14*a* to an area or ring of the passivation layer 14 around said one of the openings 14*a*.

Figure 23E:
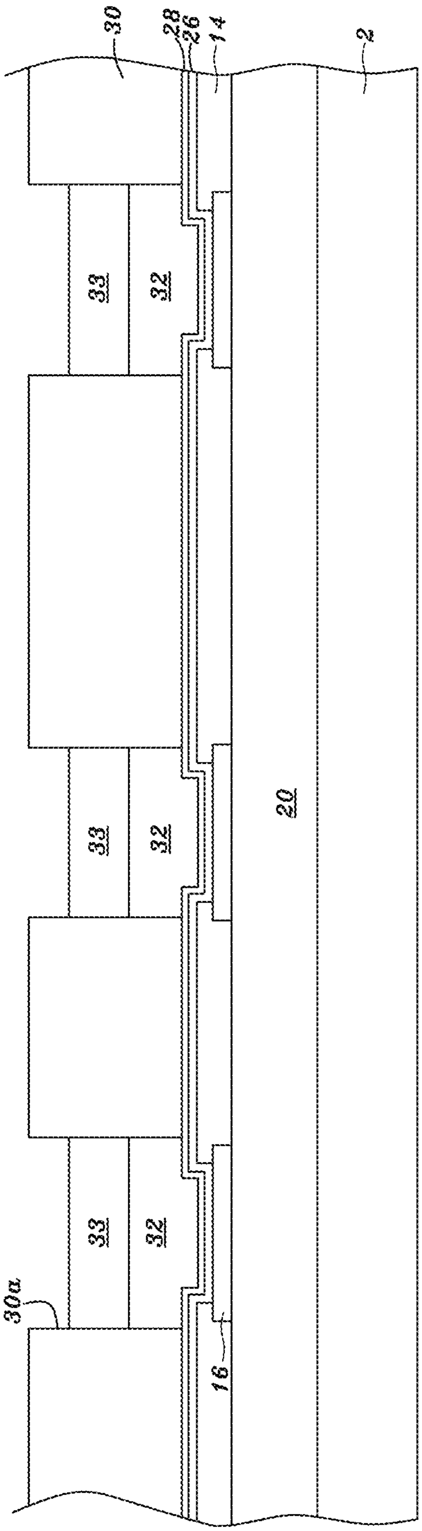

Next, referring to FIG. 23E, a metal layer 32, such as copper, may be electroplated on the electroplating seed layer 28 exposed by the trenches or openings 30*a*. For example, in a first aspect, the metal layer 32 may be formed by electroplating a copper layer with a thickness between 1 μm and 60 μm, 3 μm and 60 μm, 5 μm and 50 μm, 5 μm and 40 μm, 5 μm and 30 μm, 5 μm and 20 μm, 1 μm and 15 μm, 5 μm and 15 μm, 1 μm and 10 μm or 3 μm and 10 μm, or greater than or equal to 60 μm, 50 μm, 40 μm, 30 μm, 20 μm, 15 μm, 10 μm, 5 μm or 3 μm on the electroplating seed layer 28, made of copper, exposed by the trenches or openings 30*a*. In another example for the first aspect, the metal layer 32 may be formed by electroplating a copper layer with a thickness smaller than or equal to 60 μm, 50 μm, 40 μm, 30 μm, 20 μm, 15 μm, 10 μm, 5 μm or 3 μm on the electroplating seed layer 28, made of copper, exposed by the trenches or openings 30*a*. Alternatively, in a second aspect, the metal layer 32 may be formed by electroplating a copper layer with a thickness between 1 μm and 60 μm, 3 μm and 60 μm, 5 μm and 50 μm, 5 μm and 40 μm, 5 μm and 30 μm, 5 μm and 20 μm, 1 μm and 15 μm, 5 μm and 15 μm, 1 μm and 10 μm or 3 μm and 10 μm, or greater than or equal to 60 μm, 50 μm, 40 μm, 30 μm, 20 μm, 15 μm, 10 μm, 5 μm or 3 μm on the electroplating seed layer 28, made of copper, exposed by the trenches or openings 30*a* and then electroplating a nickel layer with a thickness between 0.5 μm and 3 μm on the electroplated copper layer in the trenches or openings 30*a*. In another example for the second aspect, the metal layer 32 may be formed by electroplating a copper layer with a thickness smaller than or equal to 60 μm, 50 μm, 40 μm, 30 μm, 20 μm, 15 μm, 10 μm, 5 μm or 3 μm on the electroplating seed layer 28, made of copper, exposed by the trenches or openings 30*a* and then electroplating a nickel layer with a thickness between 0.5 μm and 3 μm on the electroplated copper layer in the trenches or openings 30*a*. Next, a solder cap or layer 33, such as tin, a tin-lead alloy, tin-copper alloy, tin-silver alloy, tin-silver-copper alloy (SAC) or tin-silver-copper-zin alloy, having a thickness, for example, between 1 μm and 50 μm, 1 μm and 30 μm, 5 μm and 30 μm, 5 μm and 20 μm, 5 μm and 15 μm, 5 μm and 10 μm, 5 μm and 10 μm, 1 μm and 10 μm, or 1 μm and 3 μm may be electroplated on the metal layer 32 in the trenches or openings 30*a*. For example, the solder cap 33 may be electroplated on the copper layer of the metal layer 32 for the first aspect or on the nickel layer of the metal layer 32 for the second aspect. The solder cap or layer 33 may be a lead-free solder containing tin, copper, silver, bismuth, indium, zinc and/or antimony.

Figure 23F:
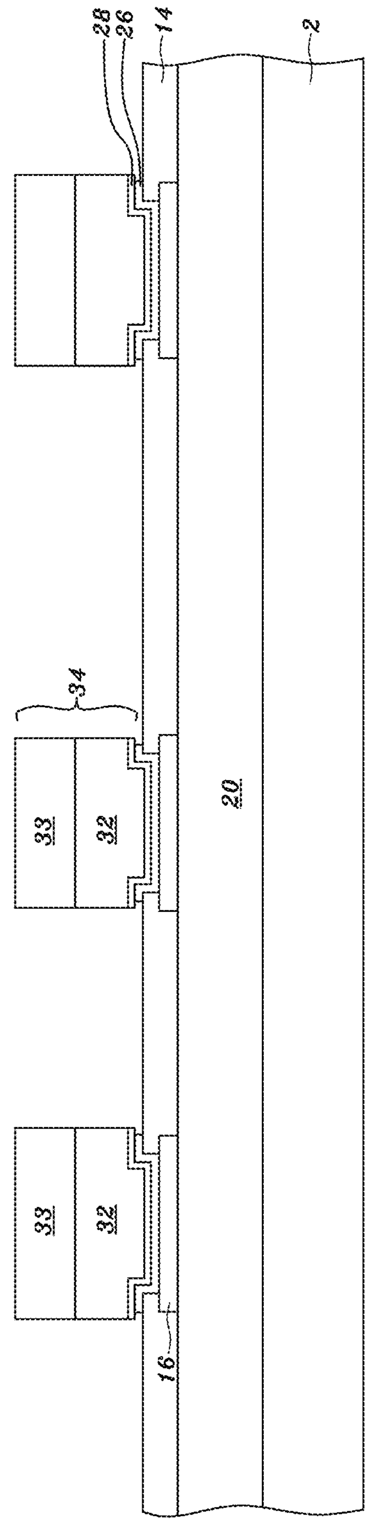

Referring to FIG. 23F, after the solder cap 33 is formed, most of the photoresist layer 30 may be removed using an organic solution with amide. However, some residuals from the photoresist layer 30 could remain on the metal layer 32 and/or solder cap 33 and on the electroplating seed layer 28. Thereafter, the residuals may be removed from the metal layer 32 and/or solder cap 33 and from the electroplating seed layer 28 with a plasma, such as $O_2$ plasma or plasma containing fluorine of below 200 PPM and oxygen. Next, the electroplating seed layer 28 and adhesion layer 26 not under the metal layer 32 are subsequently removed with a dry etching method or a wet etching method. As to the wet etching method, when the adhesion layer 26 is a titanium-tungsten-alloy layer, it may be etched with a solution containing hydrogen peroxide; when the adhesion layer 26 is a titanium layer, it may be etched with a solution containing hydrogen fluoride; when the electroplating seed layer 28 is a copper layer, it may be etched with a solution containing $NH_4OH$. As to the dry etching method, when the adhesion layer 26 is a titanium layer or a titanium-tungsten-alloy layer, it may be etched with a chlorine-containing plasma etching process or with an RIE process. Generally, the dry etching method to etch the electroplating seed layer 28 and the adhesion layer 26 not under the metal layer 32 may include a chemical plasma etching process, a sputtering etching process, such as argon sputter process, or a chemical vapor etching process.

Figure 23G:
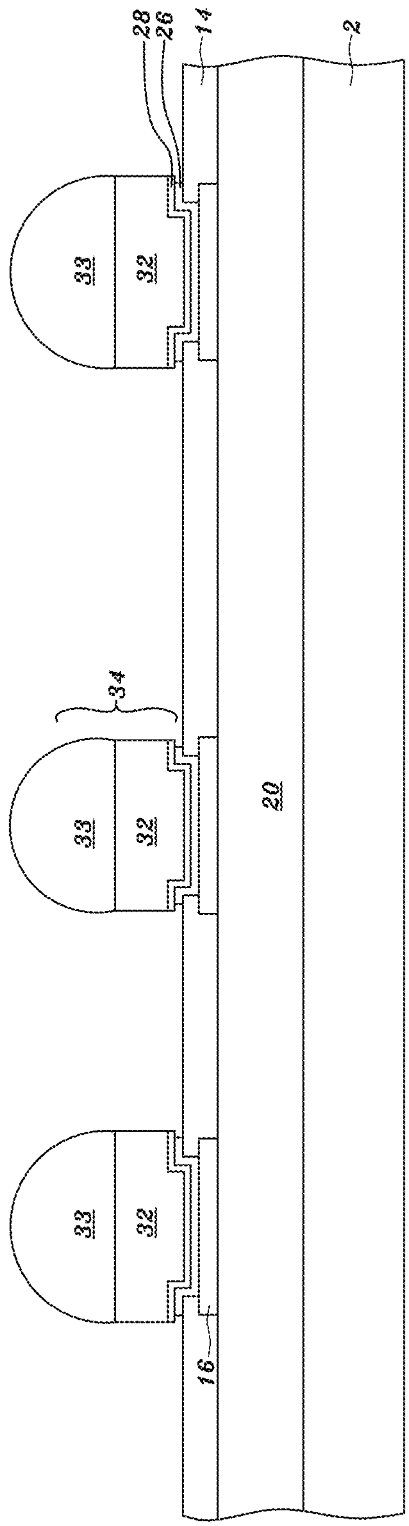

Next, referring to FIG. 23G, the solder cap or layer 33 may be reflowed into multiple solder bumps. Thereby, the adhesion layer 26, electroplating seed layer 28, electroplated metal layer 32 and solder bumps 33 may compose a first type of micro-pillars or micro-bumps 34 on the metal pads 16 at bottoms of the openings 14*a* in the passivation layer 14. Each of the micro-bumps 34 of the first type may have a height, protruding from a top surface of the passivation layer 14, between 1 μm and 60 μm, 3 μm and 60 μm, 5 μm and 50 μm, 5 μm and 40 μm, 5 μm and 30 μm, 5 μm and 20 μm, 1 μm and 15 μm, 5 μm and 15 μm, 1 μm and 10 μm or 3 μm and 10 μm, or greater than or equal to 60 μm, 50 μm, 40 μm, 30 μm, 20 μm, 15 μm, 10 μm, 5 μm or 3 μm, and a largest dimension in a horizontal cross-section (for example, the diameter of a circle shape, or the diagonal length of a square or rectangle shape) between, for example, 1 μm and 60 μm, 3 μm and 60 μm, 5 μm and 50 μm, 5 μm and 40 μm, 5 μm and 30 μm, 5 μm and 20 μm, 5 μm and 15 μm, 3 μm and 10 μm, 1 μm and 15 μm or 1 μm and 10 μm, or smaller than or equal to 60 μm, 50 μm, 40 μm, 30 μm, 20 μm, 15 μm, 10 μm or 5 μm. The space from one of the micro-pillars or micro-bumps 34 of the first type to its nearest neighboring one of the micro-pillars or micro-bumps 34 is between, for example, 1 μm and 60 μm, 3 μm and 60 μm, 5 μm and 50 μm, 5 μm and 40 μm, 5 μm and 30 μm, 5 μm and 20 μm, 5 μm and 15 μm, 3 μm and 10 μm, 1 μm and 15 μm or 1 μm and 10 μm or smaller than or equal to 60 μm, 50 μm, 40 μm, 30 μm, 20 μm, 15 μm, 10 μm or 5 μm. Alternatively, each of the micro-bumps 34 of the first type may have a height, protruding from a top surface of the passivation layer 14, smaller than or equal to 60 μm, 50 μm, 40 μm, 30 μm, 20 μm, 15 μm, 10 μm, 5 μm or 3 μm, and a largest dimension in a horizontal cross-section (for example, the diameter of a circle shape, or the diagonal length of a square or rectangle shape) between, for example, 1 μm and 60 μm, 3 μm and 60 μm, 5 μm and 50 μm, 5 μm and 40 μm, 5 μm and 30 μm, 5 μm and 20 μm, 5 μm and 15 μm, 3 μm and 10 μm, 1 μm and 15 μm or 1 μm and 10 μm, or smaller than or equal to 60 μm, 50 μm, 40 μm, 30 μm, 20 μm, 15 μm, 10 μm or 5 μm.

Figure 23H:
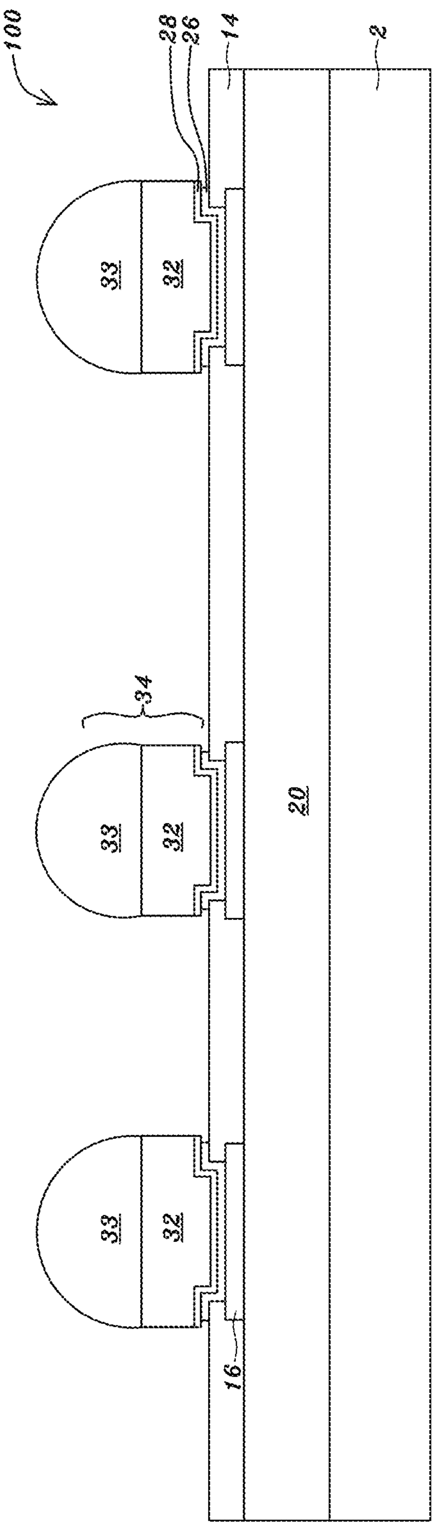

Referring to FIG. 23H, after the first type of micro-pillars or micro-bumps 34 are formed over the semiconductor wafer as seen in FIG. 23G, the semiconductor wafer may be separated, cut or diced into multiple individual semiconductor chips 100, integrated circuit chips, by a laser cutting process or by a mechanical cutting process. These semiconductor chips 100 may be packaged using the following steps as shown in FIGS. 25L-25W, 26N-26T, 27A, 27B, 28A, 28B, 29G-29O, 30A-30C, 31A-31F, 33A-33M, 34A-34D, 35A-35C, 36A-36F, 37A-37C and 42A-42D.

Figure 23I:
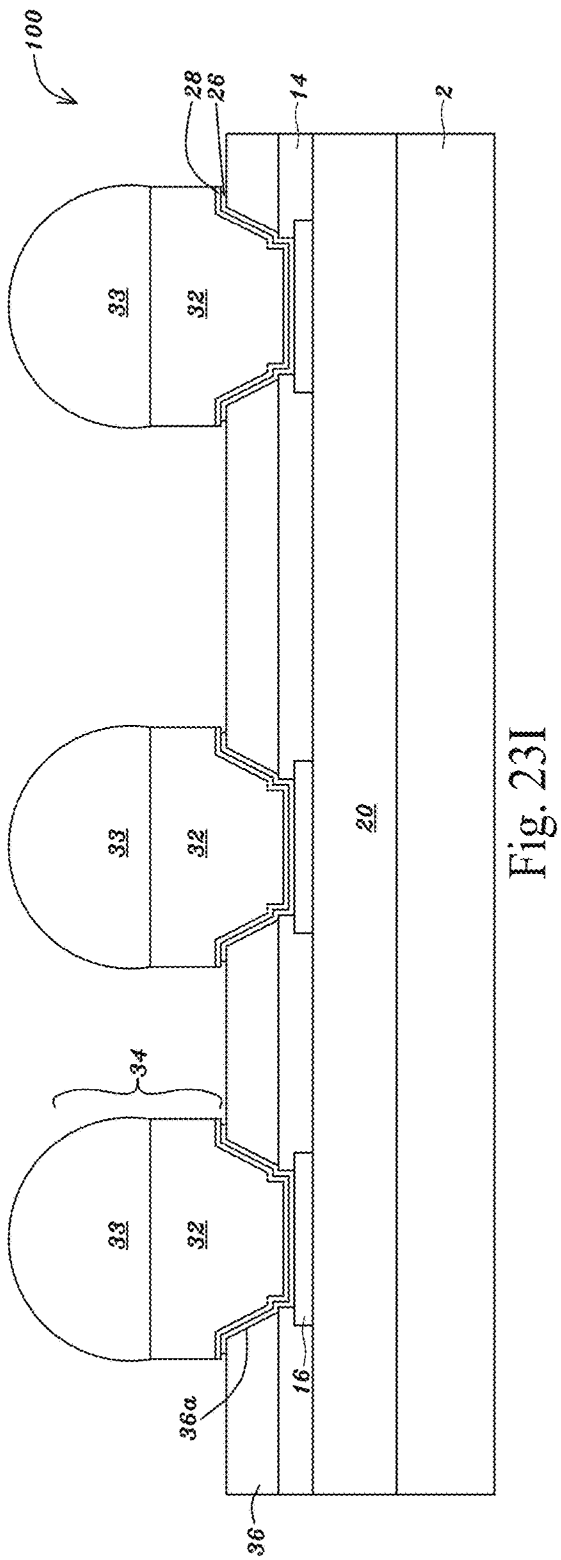

Alternatively, FIG. 23I is a schematically cross-sectional view showing a second type of micro-bump or micro-pillar on a chip in accordance with an embodiment of the present application; Referring to FIG. 23I, before the adhesion layer 26 is formed as shown in FIG. 23B, a polymer layer 36, that is, an insulating dielectric layer contains an organic material, for example, a polymer, or material compounds comprising carbon, may be formed on the passivation layer 14 by a process including a spin-on coating process, a lamination process, a screen-printing process, a spraying process or a molding process, and multiple openings in the polymer layer 36 are formed over the metal pads 16. The polymer layer 36 has a thickness between 3 and 30 micrometers or between 5 and 15 micrometers and the material of the polymer layer 36 may include benzocyclobutane (BCB), parylene, photoepoxy SU-8, elastomer, silicone, polyimide (PI), polybenzoxazole (PBO) or epoxy resin.

In a case, the polymer layer 36 may be formed by spin-on coating a negative-type photosensitive polyimide layer having a thickness between 6 and 50 micrometers on the passivation layer 14 and on the pads 16, then baking the spin-on coated polyimide layer, then exposing the baked polyimide layer using a 1× stepper, 1× contact aligner or laser scanner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer to form multiple openings exposing the pads 16, then curing or heating the developed polyimide layer at a temperature between 180 and 400° C. or higher than or equal to 100° C., 125° C., 150° C., 175° C., 200° C., 225° C., 250° C., 275° C. or 300° C. for a time between 20 and 150 minutes in a nitrogen ambient or in an oxygen-free ambient, the cured polyimide layer having a thickness between 3 and 30 micrometers, and then removing the residual polymeric material or other contaminants from the pads 16 with an $O_2$ plasma or a plasma containing fluorine of below 200 PPM and oxygen.

Thereby, referring to FIG. 23I, the first type of micro-pillars or micro-bumps 34 may be formed on the metal pads 16 at bottoms of the openings 14*a* in the passivation layer 14 and on the polymer layer 26 around the metal pads 16. The specification of the micro-pillars or micro-bumps 34 as seen in FIG. 23I may be referred to that of the micro-pillars or micro-bumps 34 as illustrated in FIG. 23G. Each of the micro-bumps 34 of the first type may have a height, protruding from a top surface of the polymer layer 26, between 1 μm and 60 μm, 3 μm and 60 μm, 5 μm and 50 μm, 5 μm and 40 μm, 5 μm and 30 μm, 5 μm and 20 μm, 1 μm and 15 μm, 5 μm and 15 μm, 1 μm and 10 μm or 3 μm and 10 μm, or greater than or equal to 60 μm, 50 μm, 40 μm, 30 μm, 20 μm, 15 μm, 10 μm, 5 μm or 3 μm, and a largest dimension in a horizontal cross-section (for example, the diameter of a circle shape, or the diagonal length of a square or rectangle shape) between, for example, 1 μm and 60 μm, 3 μm and 60 μm, 5 μm and 50 μm, 5 μm and 40 μm, 5 μm and 30 μm, 5 μm and 20 μm, 5 μm and 15 μm, 3 μm and 10 μm, 1 μm and 15 μm or 1 μm and 10 μm, or smaller than or equal to 60 μm, 50 μm, 40 μm, 30 μm, 20 μm, 15 μm, 10 μm or 5 μm. The space from one of the micro-pillars or micro-bumps 34 of the first type to its nearest neighboring one of the micro-pillars or micro-bumps 34 is between, for example, 1 μm and 60 μm, 3 μm and 60 μm, 5 μm and 50 μm, 5 μm and 40 μm, 5 μm and 30 μm, 5 μm and 20 μm, 5 μm and 15 μm, 3 μm and 10 μm, 1 μm and 15 μm or 1 μm and 10 μm or smaller than or equal to 60 μm, 50 μm, 40 μm, 30 μm, 20 μm, 15 μm, 10 μm or 5 μm. Alternatively, each of the micro-bumps 34 of the first type may have a height, protruding from a top surface of the polymer layer 26, smaller than or equal to 60 μm, 50 μm, 40 μm, 30 μm, 20 μm, 15 μm, 10 μm, 5 μm or 3 μm, and a largest dimension in a horizontal cross-section (for example, the diameter of a circle shape, or the diagonal length of a square or rectangle shape) between, for example, 1 μm and 60 μm, 3 μm and 60 μm, 5 μm and 50 μm, 5 μm and 40 μm, 5 μm and 30 μm, 5 μm and 20 μm, 5 μm and 15 μm, 3 μm and 10 μm, 1 μm and 15 μm or 1 μm and 10 μm, or smaller than or equal to 60 μm, 50 μm, 40 μm, 30 μm, 20 μm, 15 μm, 10 μm or 5 μm.

Second Type of Micro-Bumps

Figure 23J:
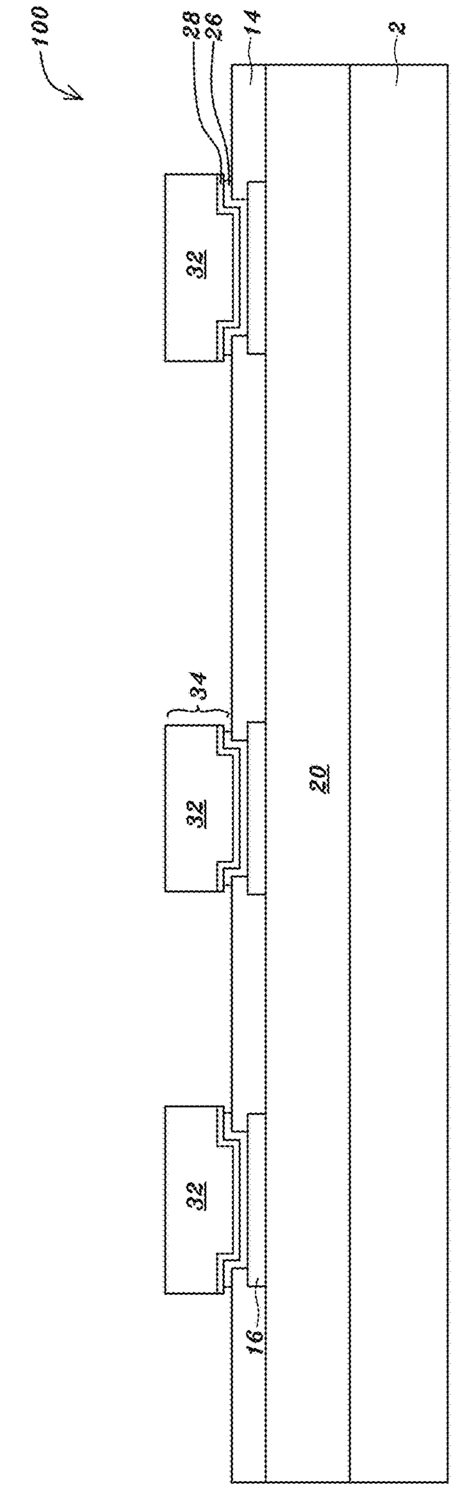
Figure 23K:
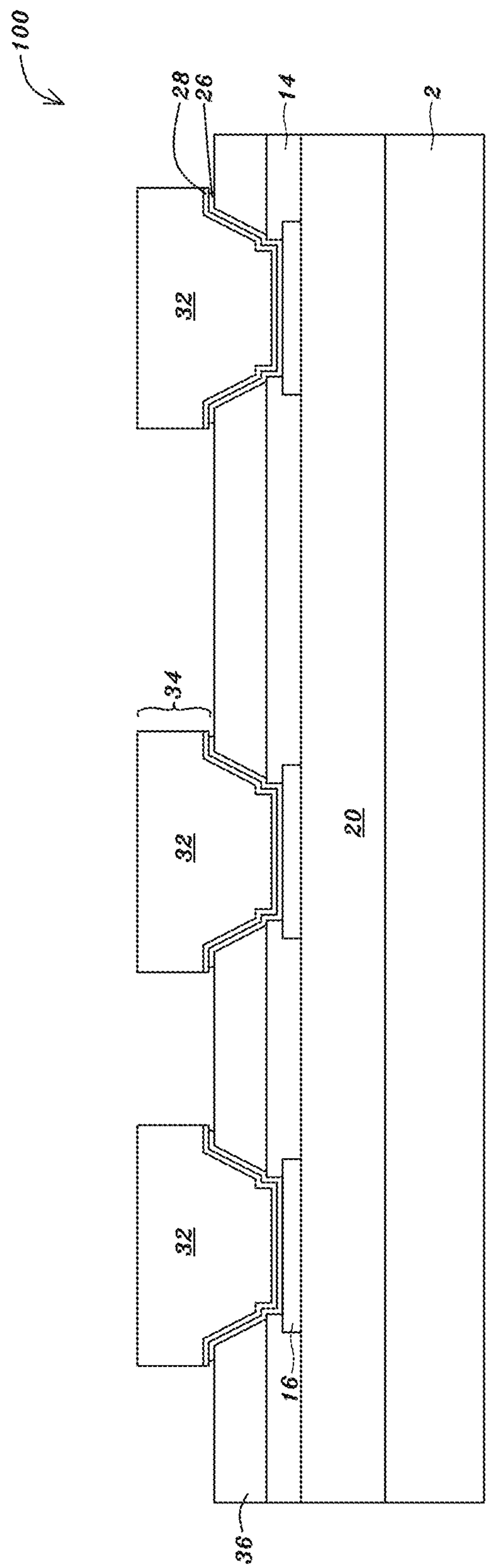

Alternatively, FIGS. 23J and 23K are schematically cross-sectional views showing a second type of micro-bump or micro-pillar on chip in accordance with an embodiment of the present application. Referring to FIGS. 23J and 23K, the process for forming the second type of micro-bump or micro-pillar 34 may be referred to that for forming the first type of micro-bump or micro-pillar 34 as seen in FIGS. 23A-23I, but the difference therebetween is that the solder cap 33 formed for the first type of micro-bump or micro-pillar 34 as seen in FIGS. 23E-23I is skipped not to be formed for the second type of micro-bump or micro-pillar 34. Thus, the reflowing process for the first type of micro-bump or micro-pillar 34 as seen in FIG. 23G may be skipped in the process for forming the second type of micro-bump or micro-pillar 34 as seen in FIGS. 23J and 23K.

Referring to FIG. 23J, the adhesion layer 26, electroplating seed layer 28, electroplated metal layer 32 may compose the second type of micro-pillars or micro-bumps 34 on the metal pads 16 at bottoms of the openings 14*a* in the passivation layer 14. Each of the micro-bumps 34 of the second type may have a height, protruding from a top surface of the passivation layer 14, between 1 μm and 60 μm, 3 μm and 60 μm, 5 μm and 50 μm, 5 μm and 40 μm, 5 μm and 30 μm, 5 μm and 20 μm, 1 μm and 15 μm, 5 μm and 15 μm, 1 μm and 10 μm or 3 μm and 10 μm, or greater than or equal to 60 μm, 50 μm, 40 μm, 30 μm, 20 μm, 15 μm, 10 μm, 5 μm or 3 μm, and a largest dimension in a horizontal cross-section (for example, the diameter of a circle shape, or the diagonal length of a square or rectangle shape) between, for example, 1 μm and 60 μm, 3 μm and 60 μm, 5 μm and 50 μm, 5 μm and 40 μm, 5 μm and 30 μm, 5 μm and 20 μm, 5 μm and 15 μm, 3 μm and 10 μm, 1 μm and 15 μm or 1 μm and 10 μm, or smaller than or equal to 60 μm, 50 μm, 40 μm, 30 μm, 20 μm, 15 μm, 10 μm or 5 μm. The space from one of the micro-pillars or micro-bumps 34 of the second type to its nearest neighboring one of the micro-pillars or micro-bumps 34 is between, for example, 1 μm and 60 μm, 3 μm and 60 μm, 5 μm and 50 μm, 5 μm and 40 μm, 5 μm and 30 μm, 5 μm and 20 μm, 5 μm and 15 μm, 3 μm and 10 μm, 1 μm and 15 μm or 1 μm and 10 μm or smaller than or equal to 60 μm, 50 μm, 40 μm, 30 μm, 20 μm, 15 μm, 10 μm or 5 μm. Alternatively, each of the micro-bumps 34 of the second type may have a height, protruding from a top surface of the passivation layer 14, smaller than or equal to 60 μm, 50 μm, 40 μm, 30 μm, 20 μm, 15 μm, 10 μm, 5 μm or 3 μm, and a largest dimension in a horizontal cross-section (for example, the diameter of a circle shape, or the diagonal length of a square or rectangle shape) between, for example, 1 μm and 60 μm, 3 μm and 60 μm, 5 μm and 50 μm, 5 μm and 40 μm, 5 μm and 30 μm, 5 μm and 20 μm, 5

μm and 15 μm, 3 μm and 10 μm, 1 μm and 15 μm or 1 μm and 10 μm, or smaller than or equal to 60 μm, 50 μm, 40 μm, 30 μm, 20 μm, 15 μm, 10 μm or 5 μm.

Referring to FIG. 23K, the second type of micro-pillars or micro-bumps 34 may be formed on the metal pads 16 at bottoms of the openings 14*a* in the passivation layer 14 and on the polymer layer 26 around the metal pads 16. Each of the micro-bumps 34 of the second type may have a height, protruding from a top surface of the polymer layer 26, between 1 μm and 60 μm, 3 μm and 60 μm, 5 μm and 50 μm, 5 μm and 40 μm, 5 μm and 30 μm, 5 μm and 20 μm, 1 μm and 15 μm, 5 μm and 15 μm, 1 μm and 10 μm or 3 μm and 10 μm, or greater than or equal to 60 μm, 50 μm, 40 μm, 30 μm, 20 μm, 15 μm, 10 μm, 5 μm or 3 μm, and a largest dimension in a horizontal cross-section (for example, the diameter of a circle shape, or the diagonal length of a square or rectangle shape) between, for example, 1 μm and 60 μm, 3 μm and 60 μm, 5 μm and 50 μm, 5 μm and 40 μm, 5 μm and 30 μm, 5 μm and 20 μm, 5 μm and 15 μm, 3 μm and 10 μm, 1 μm and 15 μm or 1 μm and 10 μm, or smaller than or equal to 60 μm, 50 μm, 40 μm, 30 μm, 20 μm, 15 μm, 10 μm or 5 μm. The space from one of the micro-pillars or micro-bumps 34 of the second type to its nearest neighboring one of the micro-pillars or micro-bumps 34 is between, for example, 1 μm and 60 μm, 3 μm and 60 μm, 5 μm and 50 μm, 5 μm and 40 μm, 5 μm and 30 μm, 5 μm and 20 μm, 5 μm and 15 μm, 3 μm and 10 μm, 1 μm and 15 μm or 1 μm and 10 μm or smaller than or equal to 60 μm, 50 μm, 40 μm, 30 μm, 20 μm, 15 μm, 10 μm or 5 μm. Alternatively, each of the micro-bumps 34 of the second type may have a height, protruding from a top surface of the polymer layer 26, smaller than or equal to 60 μm, 50 μm, 40 μm, 30 μm, 20 μm, 15 μm, 10 μm, 5 μm or 3 μm, and a largest dimension in a horizontal cross-section (for example, the diameter of a circle shape, or the diagonal length of a square or rectangle shape) between, for example, 1 μm and 60 μm, 3 μm and 60 μm, 5 μm and 50 μm, 5 μm and 40 μm, 5 μm and 30 μm, 5 μm and 20 μm, 5 μm and 5 μm, 3 μm and 10 μm, 1 μm and 15 μm or 1 μm and 10 μm, or smaller than or equal to 60 μm, 50 μm, 40 μm, 30 μm, 20 μm, 15 μm, 10 μm or 5 μm.

Embodiment for SISC Over Passivation Layer

Alternatively, before the micro-bumps 34 are formed, a Second Interconnection Scheme in, on or of the Chip (SISC) may be formed on or over the passivation layer 14 and the FISC 20. FIGS. 24A-24D are schematically cross-sectional views showing a process for forming an interconnection metal layer over a passivation layer in accordance with an embodiment of the present application.

Figure 24A:
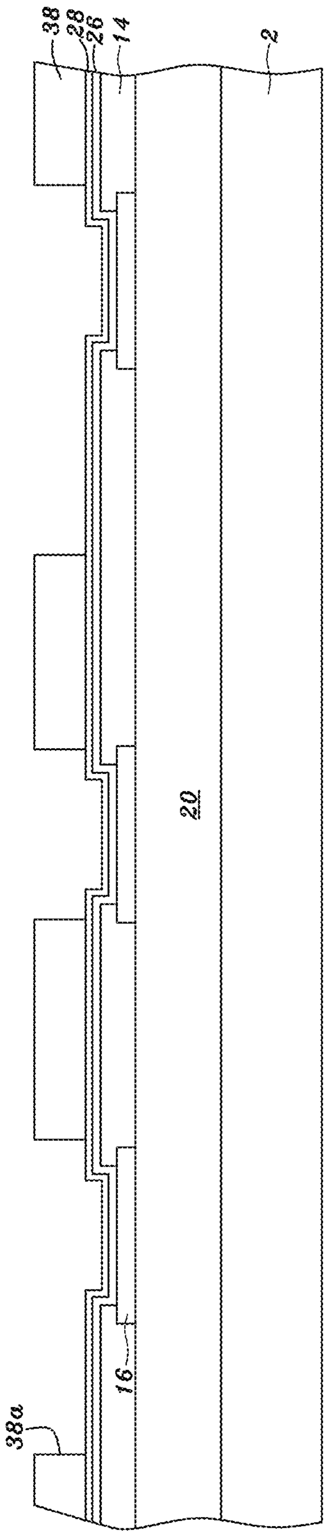
FIGS. 24A-24O are schematically cross-sectional views showing a process for forming a second interconnection scheme over a passivation layer and forming multiple micro-pillars or micro-bumps on the second interconnection metal layer in accordance with an embodiment of the present application.

Referring to FIG. 24A, the process for fabricating the SISC over the passivation layer 14 may continue from the step shown in FIG. 23C. A photoresist layer 38, such as positive-type photoresist layer, having a thickness of between 1 and 50 μm is spin-on coated or laminated on the electroplating seed layer 28. The photoresist layer 38 is patterned with the processes of exposure, development, etc., to form multiple trenches or openings 38*a* in the photoresist layer 38 exposing the electroplating seed layer 28. A 1× stepper, 1× contact aligner or laser scanner may be used to expose the photoresist layer 38 with at least two of G-line having a wavelength ranging from 434 to 438 nm, H-line having a wavelength ranging from 403 to 407 nm, and I-line having a wavelength ranging from 363 to 367 nm, illuminating the photoresist layer 96, that is, G-line and H-line, G-line and I-line, H-line and I-line, or G-line, H-line and I-line illuminate the photoresist layer 38, then developing the exposed photoresist layer 38, and then removing the residual polymeric material or other contaminants on the electroplating seed layer 28 with an $O_2$ plasma or a plasma containing fluorine of below 200 PPM and oxygen, such that the photoresist layer 38 may be patterned with multiple trenches or openings 38*a* in the photoresist layer 38 exposing the electroplating seed layer 28 for forming metal pads, lines or traces in the trenches or openings 38*a* and on the electroplating seed layer 28 by following processes to be performed later. One of the trenches or openings 38*a* in the photoresist layer 38 may overlap the whole area of one of the openings 14*a* in the passivation layer 14.

Figure 24B:
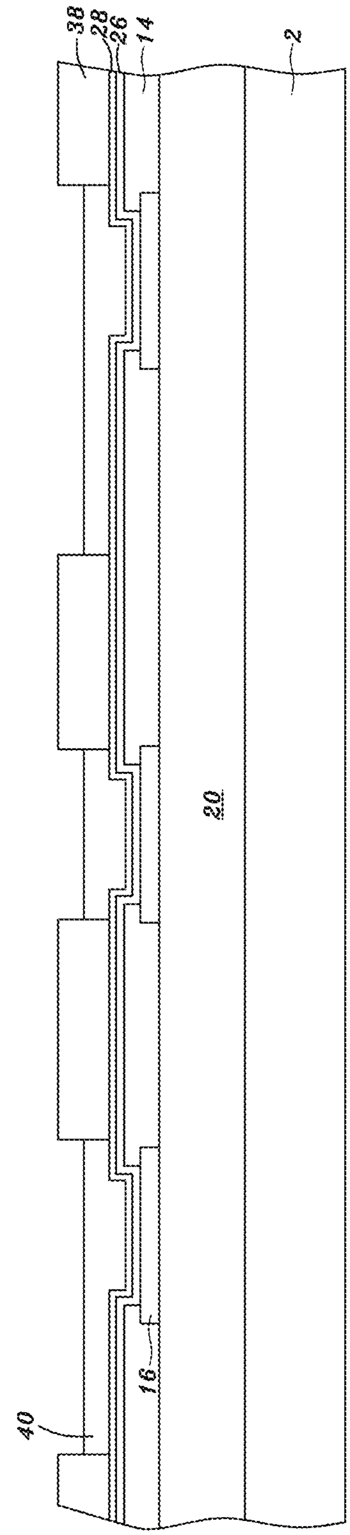

Next, referring to FIG. 24B, a metal layer 40, such as copper, may be electroplated on the electroplating seed layer 28 exposed by the trenches or openings 38*a*. For example, the metal layer 40 may be formed by electroplating a copper layer with a thickness of between 0.3 and 20 μm, 0.5 and 5 μm, 1 μm and 10 μm or 2 μm and 10 μm on the electroplating seed layer 28, made of copper, exposed by the trenches or openings 38*a*.

Figure 24C:
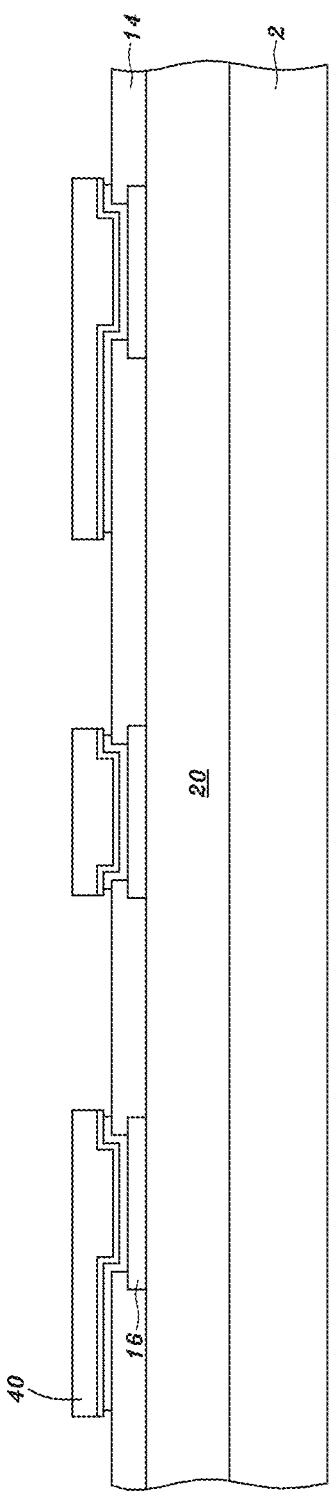

Referring to FIG. 24C, after the metal layer 40 is formed, most of the photoresist layer 38 may be removed and then the electroplating seed layer 28 and adhesion layer 26 not under the metal layer 40 may be etched. The removing and etching processes may be referred respectively to the process for removing the photoresist layer 30 and etching the electroplating seed layer 28 and adhesion layer 26 as illustrated in FIG. 23F. Thereby, the adhesion layer 26, electroplating seed layer 28 and electroplated metal layer 40 may be patterned to form an interconnection metal layer 27 over the passivation layer 14.

Figure 24D:
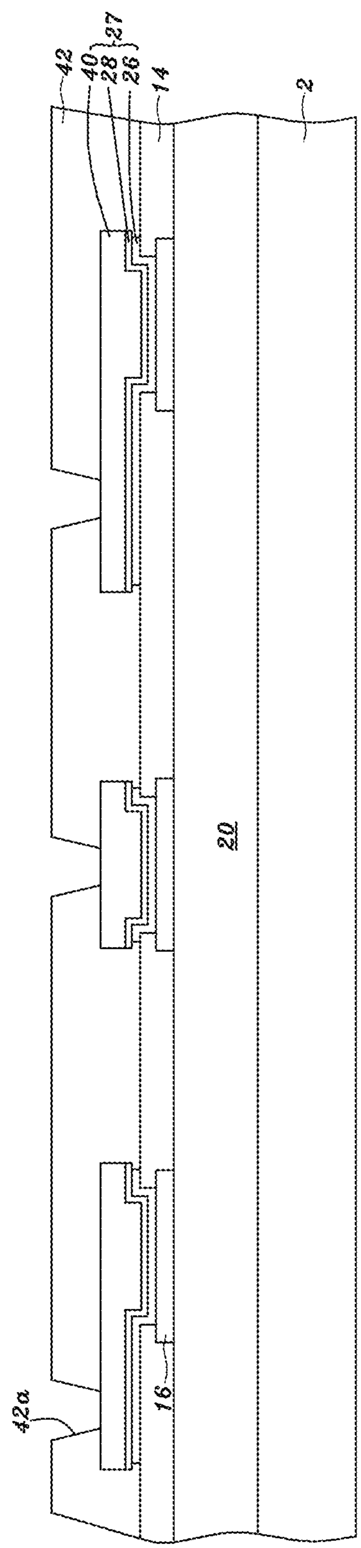

Next, referring to FIG. 24D, a polymer layer 42, i.e., insulting or inter-metal dielectric layer, is formed on the passivation layer 14 and metal layer 40 and multiple openings 42*a* in the polymer layer 42 are over multiple contact points of the interconnection metal layer 27. The material of the polymer layer 42 and the process for forming the same may be referred to that of the polymer layer 36 and the process for forming the same as illustrated in FIG. 23I.

The process for forming the interconnection metal layer 27 as illustrated in FIGS. 23A, 23B and 24A-24C and the process for forming the polymer layer 42 as seen in FIG. 24D may be alternately performed more than one times to fabricate the SISC 29 as seen in FIG. 24O. FIG. 24O is a cross-sectional view showing a second interconnection scheme of a chip (SISC) is formed with multiple interconnection metal layers 27 and multiple polymer layers 42 and 51, i.e., insulating or inter-metal dielectric layers, alternatively arranged in accordance with an embodiment of the present application. Referring to FIG. 24O, the SISC 29 may include an upper one of the interconnection metal layers 27 formed with multiple metal vias 27*a* in the openings 42*a* in one of the polymer layers 42 and multiple metal pads, lines or traces 27*b* on said one of the polymer layers 42. The upper one of the interconnection metal layers 27 may be connected to a lower one of the interconnection metal layers 27 through the metal vias 27*a* of the upper one of the interconnection metal layers 27 in the openings 42*a* in said one of the polymer layers 42. The SISC 29 may include the bottommost one of the interconnection metal layers 27 formed with multiple metal vias 27*a* in the openings 14*a* in the passivation layer 14 and multiple metal pads, lines or traces 27*b* on the passivation layer 14. The bottommost one of the interconnection metal layers 27 may be connected to the interconnection metal layers 6 of the FISC 20 through the metal vias 27*a* of the bottommost one of the interconnection metal layers 27 in the openings 14*a* in the passivation layer 14.

Figure 24E:
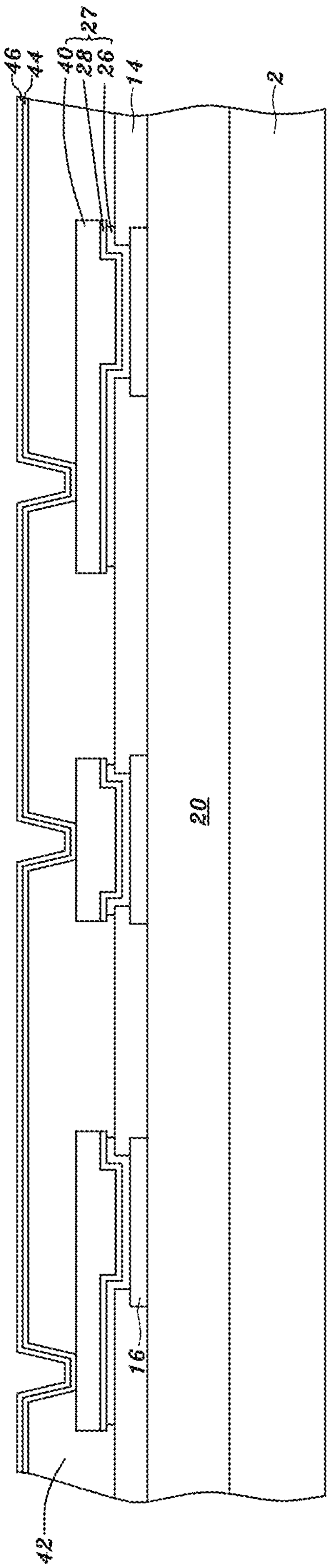
Figure 24F:
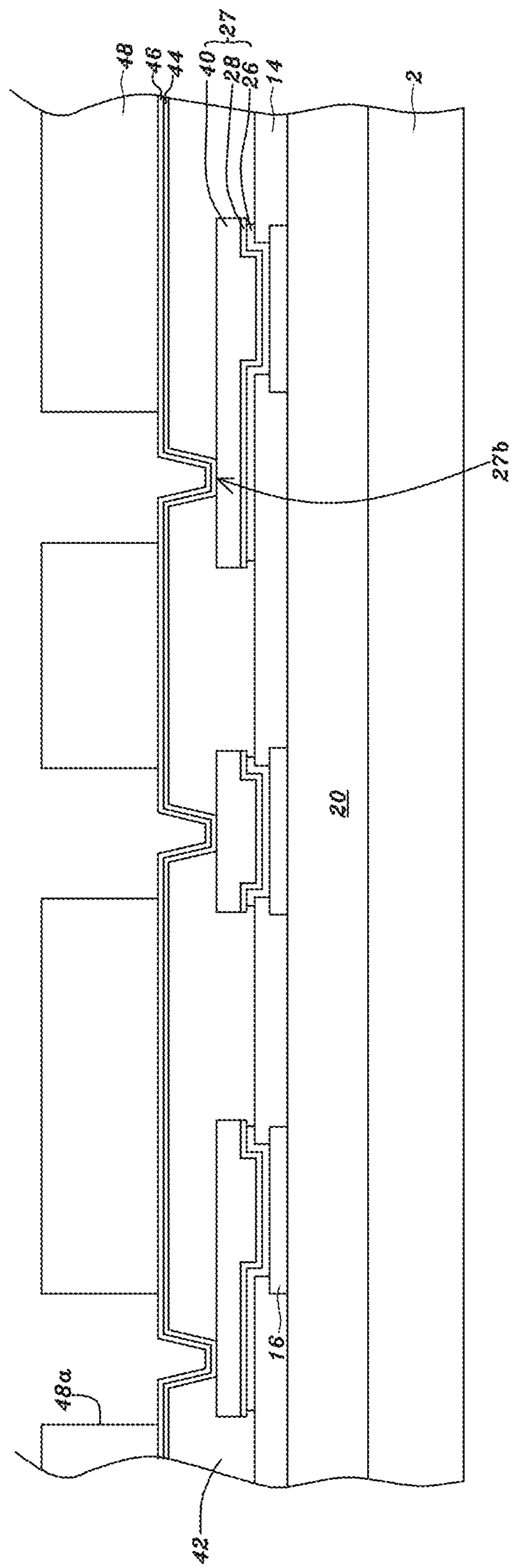
Figure 24G:
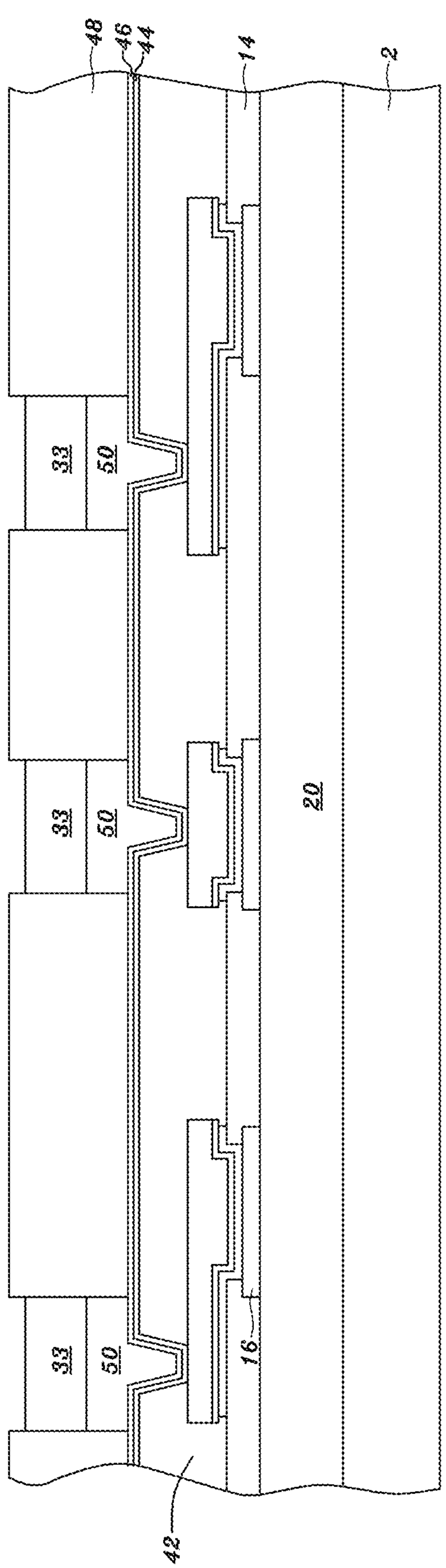
Figure 24H:
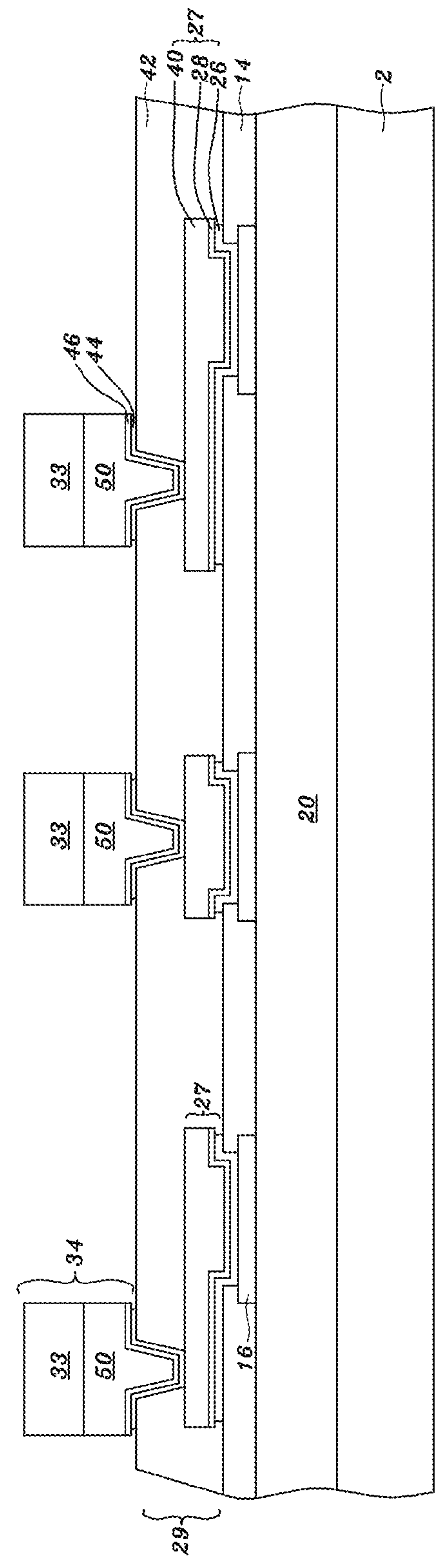
Figure 24I:
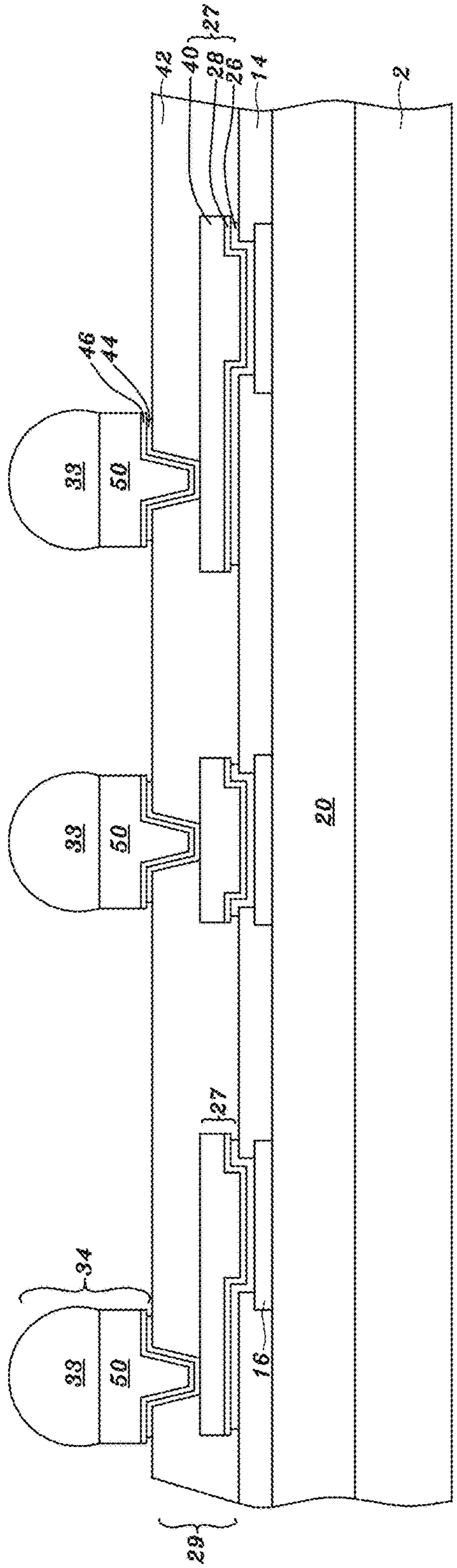
Figure 24J:
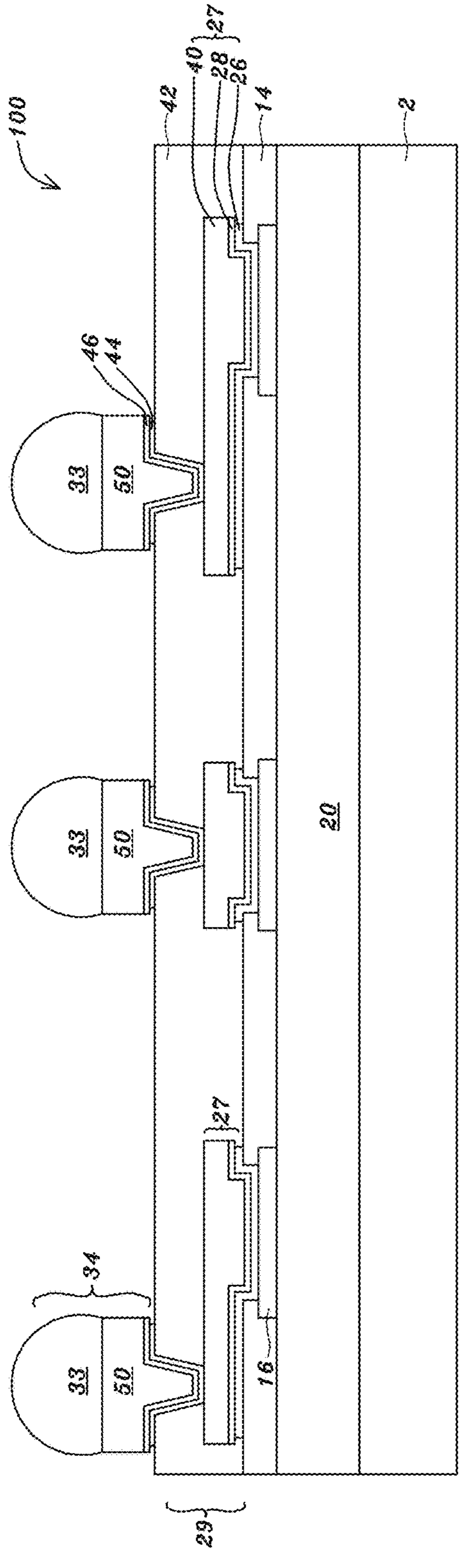
Figure 24K:
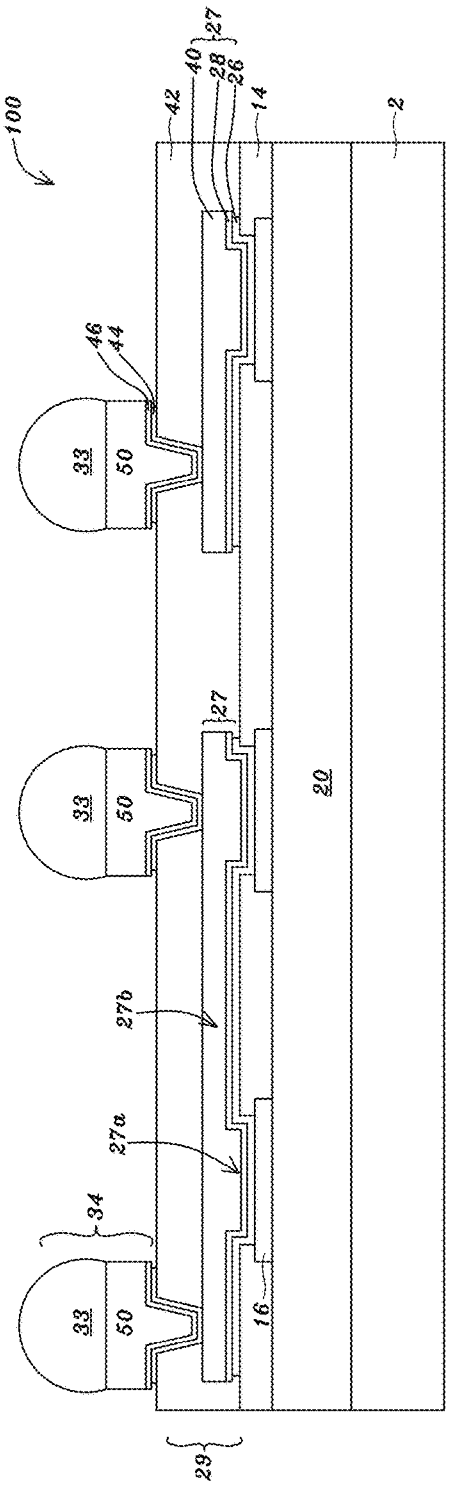
Figure 24L:
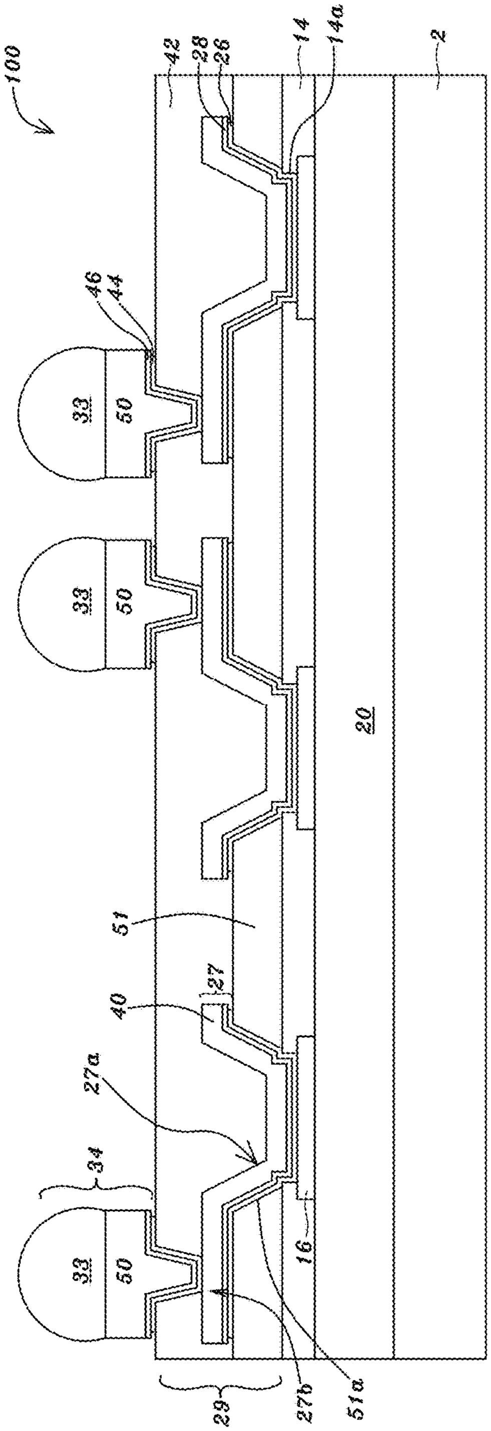
Figure 24M:
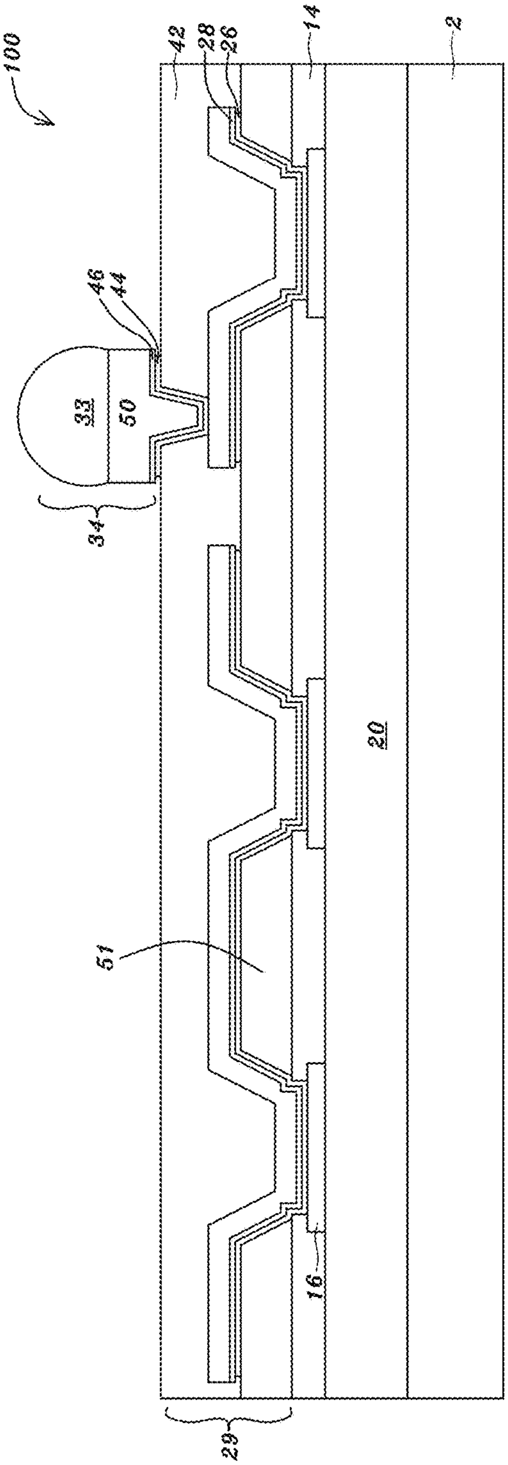

Alternatively, referring to FIGS. 24L, 24M and 24O, a polymer layer 51 may be formed on the passivation layer 14 before the bottommost one of the interconnection metal layers 27 is formed. The material of the polymer layer 51 and the process for forming the same may be referred to the polymer layer 36 and the process for forming the same as shown in FIG. 23I. In this case, the SISC 29 may include the bottommost one of the interconnection metal layers 27 formed with multiple metal vias 27*a* in the openings 51*a* in the polymer layer 51 and multiple metal pads, lines or traces 27*b* on the polymer layer 51. The bottommost one of the interconnection metal layers 27 may be connected to the interconnection metal layers 6 of the FISC 20 through the metal vias 27*a* of the bottommost one of the interconnection metal layers 27 in the openings 14*a* in the passivation layer 14 and in the openings 51*a* in the polymer layer 51.

Accordingly, the SISC 29 may be optionally formed with 2 to 6 layers or 3 to 5 layers of interconnection metal layers 27 over the passivation layer 14. For each of the interconnection metal layers 27 of the SISC 29, its metal pads, line or traces 27*b* may have a thickness between, for example, 0.3 μm and 20 μm, 0.5 μm and 10 μm, 1 μm and 5 μm, 1 μm and 10 μm or 2 μm and 10 μm, or thicker than or equal to 0.3 μm, 0.5 μm, 0.7 μm, 1 μm, 1.5 μm, 2 μm or 3 μm and a width between, for example, 0.3 μm and 20 μm, 0.5 μm and 10 μm, 1 μm and 5 μm, 1 μm and 10 μm or 2 μm and 10 μm, or wider than or equal to 0.3 μm, 0.5 μm, 0.7 μm, 1 μm, 1.5 μm, 2 μm or 3 μm. Each of the polymer layers 42 and 51 may have a thickness between, for example, 0.3 μm and 20 μm, 0.5 μm and 10 μm, 1 μm and 5 μm, or 1 μm and 10 μm, or thicker than or equal to 0.3 μm, 0.5 μm, 0.7 μm, 1 μm, 1.5 μm, 2 μm or 3 μm. The metal pads, lines or traces 27*b* of the interconnection metal layers 27 of the SISC 29 may be used for the programmable interconnects 202.

FIGS. 24E-24J are schematically cross-sectional views showing a process for forming a first type of micro-pillars or micro-bumps on an interconnection metal layer over a passivation layer in accordance with an embodiment of the present application. Referring to FIG. 24E, an adhesion layer 44 may be sputtered on the polymer layer 42 and on the metal layer 40 exposed by the opening 42*a*. The specification of the adhesion layer 44 and the process for forming the same may be referred to that of the adhesion layer 26 and the process for forming the same as illustrated in FIG. 23B. An electroplating seed layer 46 may be sputtered on the adhesion layer 44. The specification of the electroplating seed layer 46 and the process for forming the same may be referred to that of the electroplating seed layer 28 and the process for forming the same as illustrated in FIG. 23C.

Next, referring to FIG. 24F, a photoresist layer 48 is formed on the electroplating seed layer 46. The photoresist layer 48 is patterned with the processes of exposure, development, etc., to form an opening 48*a* in the photoresist layer 48 exposing the electroplating seed layer 46. The specification of the photoresist layer 48 and the process for forming the same may be referred to that of the photoresist layer 48 and the process for forming the same as illustrated in FIG. 23D.

Next, referring to FIG. 24G, a metal layer 50 is electroplated on the electroplating seed layer 46 exposed by the opening 48*a*. The specification of the metal layer 50 and the process for forming the same may be referred to that of the metal layer 32 and the process for forming the same as illustrated in FIG. 23E. Next, a solder cap or layer 33 is electroplated on the metal layer 50 in the opening 48*a*. The specification of the solder cap 33 and the process for forming the same as illustrated herein may be referred to that of the solder cap 33 and the process for forming the same as illustrated in FIG. 23E.

Next, referring to FIG. 24H, most of the photoresist layer 48 may be removed and then the electroplating seed layer 46 and adhesion layer 44 not under the metal layer 50 may be etched. The processes for removing the photoresist layer 48 and etching electroplating seed layer 46 and adhesion layer 44 may be referred respectively to the processes for removing the photoresist layer 30 and etching the electroplating seed layer 28 and adhesion layer 26 as illustrated in FIG. 23F.

Next, referring to FIG. 24I, the solder cap or layer 33 may be reflowed into multiple solder bumps. Thereby, the adhesion layer 44, electroplating seed layer 46, electroplated metal layer 50 and solder bumps 33 may compose the first type of micro-pillars or micro-bumps 34 on the topmost one of the interconnection metal layers 27 of the SISC 29 at bottoms of the openings 42*a* in the topmost one of the polymer layers 42 of the SISC 29. The specification of the micro-pillars or micro-bumps 34 of the first type as seen in FIG. 24I may be referred to that as illustrated in FIG. 23G. Each of the micro-bumps 34 of the first type may have a height, protruding from a top surface of a topmost one of the polymer layers 42 of the SISC 29, between 1 μm and 60 μm, 3 μm and 60 μm, 5 μm and 50 μm, 5 μm and 40 μm, 5 μm and 30 μm, 5 μm and 20 μm, 1 μm and 15 μm, 5 μm and 15 μm, 1 μm and 10 μm or 3 μm and 10 μm, or greater than or equal to 60 μm, 50 μm, 40 μm, 30 μm, 20 μm, 15 μm, 10 μm, 5 μm or 3 μm, and a largest dimension in a horizontal cross-section (for example, the diameter of a circle shape, or the diagonal length of a square or rectangle shape) between, for example, 1 μm and 60 μm, 3 μm and 60 μm, 5 μm and 50 μm, 5 μm and 40 μm, 5 μm and 30 μm, 5 μm and 20 μm, 5 μm and 15 μm, 3 μm and 10 μm, 1 μm and 15 μm or 1 μm and 10 μm, or smaller than or equal to 60 μm, 50 μm, 40 μm, 30 μm, 20 μm, 15 μm, 10 μm or 5 μm. The space from one of the micro-pillars or micro-bumps 34 of the first type to its nearest neighboring one of the micro-pillars or micro-bumps 34 is between, for example, 1 μm and 60 μm, 3 μm and 60 μm, 5 μm and 50 μm, 5 μm and 40 μm, 5 μm and 30 μm, 5 μm and 20 μm, 5 μm and 15 μm, 3 μm and 10 μm, 1 μm and 15 μm or 1 μm and 10 μm or smaller than or equal to 60 μm, 50 μm, 40 μm, 30 μm, 20 μm, 15 μm, 10 μm or 5 μm. Alternatively, each of the micro-bumps 34 of the first type may have a height, protruding from a top surface of a topmost one of the polymer layers 42 of the SISC 29, smaller than or equal to 60 μm, 50 μm, 40 μm, 30 μm, 20 μm, 15 μm, 10 μm, 5 μm or 3 μm, and a largest dimension in a horizontal cross-section (for example, the diameter of a circle shape, or the diagonal length of a square or rectangle shape) between, for example, 1 μm and 60 μm, 3 μm and 60 μm, 5 μm and 50 μm, 5 μm and 40 μm, 5 μm and 30 μm, 5 μm and 20 μm, 5 μm and 15 μm, 3 μm and 10 μm, 1 μm and 15 μm or 1 μm and 10 μm, or smaller than or equal to 60 μm, 50 μm, 40 μm, 30 μm, 20 μm, 15 μm, 10 μm or 5 μm.

Figure 24N:
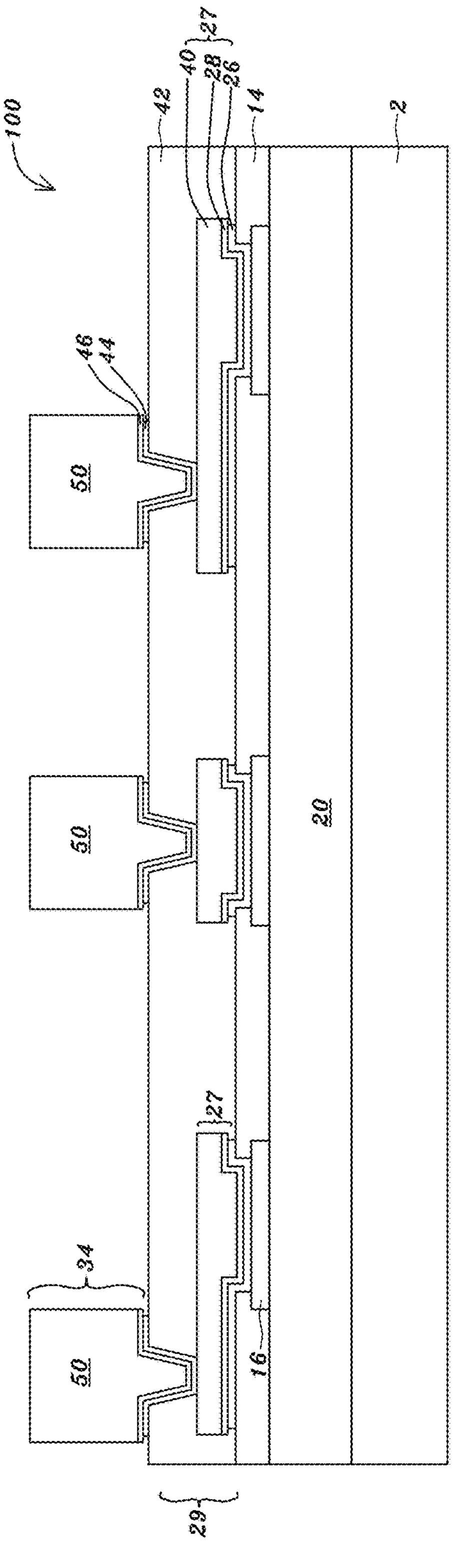
Figure 240:
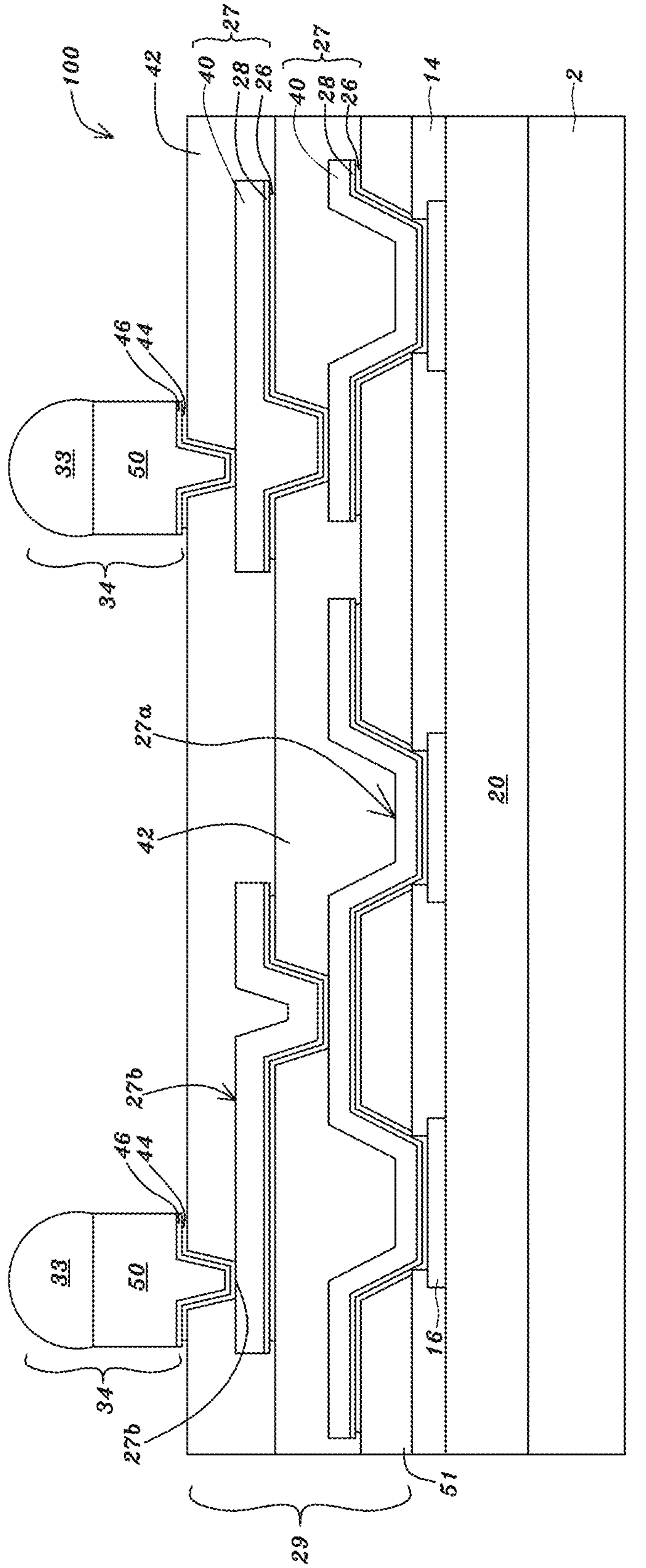

Alternatively, referring to FIG. 24N, the second type of micro-bump or micro-pillar 34 as seen in FIG. 23J or 23K may be formed on the topmost one of the interconnection metal layers 27 of the SISC 29 at bottoms of the openings 42*a* in the topmost one of the polymer layers 42 of the SISC 29. The adhesion layer 26, electroplating seed layer 28, electroplated metal layer 32 as seen in FIG. 23J or 23K may compose the second type of micro-pillars or micro-bumps 34. Each of the micro-bumps 34 of the second type may have a height, protruding from a top surface of a topmost one of the polymer layers 42 of the SISC 29, between 1 μm and 60 μm, 3 μm and 60 μm, 5 μm and 50 μm, 5 μm and 40 μm, 5 μm and 30 μm, 5 μm and 20 μm, 1 μm and 15 μm, 5 μm and 15 μm, 1 μm and 10 μm or 3 μm and 10 μm, or greater than or equal to 60 μm, 50 μm, 40 μm, 30 μm, 20 μm, 15 μm, 10 μm, 5 μm or 3 μm, and a largest dimension in a horizontal cross-section (for example, the diameter of a circle shape, or the diagonal length of a square or rectangle shape) between, for example, 1 μm and 60 μm, 3 μm and 60 μm, 5 μm and 50 μm, 5 μm and 40 μm, 5 μm and 30 μm, 5 μm and 20 μm, 5 μm and 15 μm, 3 μm and 10 μm, 1 μm and 15 μm or 1 μm and 10 μm, or smaller than or equal to 60 μm, 50 μm, 40 μm, 30 μm, 20 μm, 15 μm, 10 μm or 5 μm. The space from one of the micro-pillars or micro-bumps 34 of the second type to its nearest neighboring one of the micro-pillars or micro-bumps 34 is between, for example, 1 μm and 60 μm, 3 μm and 60 μm, 5 μm and 50 μm, 5 μm and 40 μm, 5 μm and 30 μm, 5 μm and 20 μm, 5 μm and 15 μm, 3 μm and 10 μm, 1 μm and 15 μm or 1 μm and 10 μm or smaller than or equal to 60 μm, 50 μm, 40 μm, 30 μm, 20 μm, 15 μm, 10 μm or 5 μm. Alternatively, each of the micro-bumps 34 of the second type may have a height, protruding from a top surface of a topmost one of the polymer layers 42 of the SISC 29, smaller than or equal to 60 μm, 50 μm, 40 μm, 30 μm, 20 μm, 15 μm, 10 μm, 5 μm or 3 μm, and a largest dimension in a horizontal cross-section (for example, the diameter of a circle shape, or the diagonal length of a square or rectangle shape) between, for example, 1 μm and 60 μm, 3 μm and 60 μm, 5 μm and 50 μm, 5 μm and 40 μm, 5 μm and 30 μm, 5 μm and 20 μm, 5 μm and 15 μm, 3 μm and 10 μm, 1 μm and 15 μm or 1 μm and 10 μm, or smaller than or equal to 60 μm, 50 μm, 40 μm, 30 μm, 20 μm, 15 μm, 10 μm or 5 μm.

Referring to FIG. 24J, after the micro-pillars or micro-bumps 34 of the first or second type are formed over the semiconductor wafer as shown in FIG. 24I, the semiconductor wafer may be separated, cut or diced into multiple individual semiconductor chips 100, integrated circuit chips, by a laser cutting process or by a mechanical cutting process. These semiconductor chips 100 may be packaged using the following steps as shown in FIGS. 25L-25W, 26N-26T, 27A, 27B, 28A, 28B, 29G-29O, 30A-30C, 31A-31F, 33A-33M, 34A-34D, 35A-35C, 36A-36F, 37A-37C and 43A-43D.

Referring to FIG. 24K, the above-mentioned interconnection metal layers 27 may comprise a power interconnection metal trace or a ground interconnection metal trace to connect multiple of the metal pads 16 and to have the micro-pillars or micro-bumps 34 formed thereon. Referring to FIG. 24M, the above-mentioned interconnection metal layers 27 may comprise an interconnection metal trace to connect multiple of the metal pads 16 and to have no micro-pillar or micro-bump formed thereon.

Referring to FIGS. 24J-24O, the interconnection metal layers 27 of the FISC 29 may be used for the programmable and fixed interconnects 361 and 364 of the intra-chip interconnects 502, as seen in FIG. 16A, of each of the standard commodity FPGA IC chips 200.

Embodiment for Interposer for Multi-Chip-On-Interposer (COIP) Flip-chip Packaging Method Multiple semiconductor chips 100 as seen in FIGS. 23H-23K and 24J-24O may be mounted on an interposer. The interposer may be provided with high density interconnects for fan-out of the semiconductor chips 100 and interconnection between the semiconductor chips 100.

FIGS. 25A-25H are schematically cross-sectional views showing a process for forming a first type of vias in accordance with an embodiment of the present application. FIGS. 26A-26J are schematically cross-sectional views showing a process for forming a second type of vias in accordance with an embodiment of the present application.

Figure 25A:
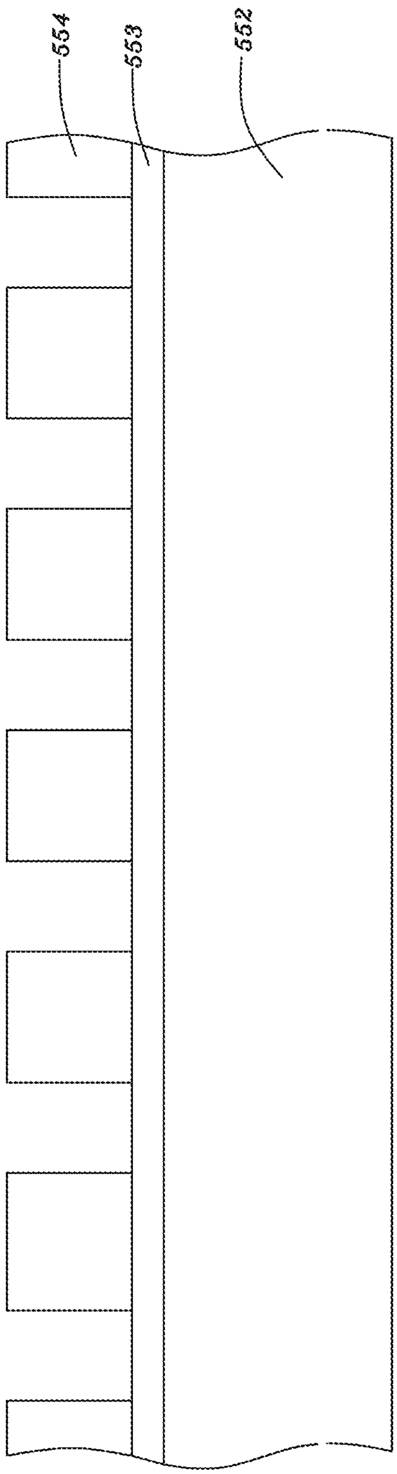
FIGS. 25A-25K are schematically cross-sectional views showing a process for forming an interposer with a first type of vias in accordance with an embodiment of the present application.
Figure 26A:
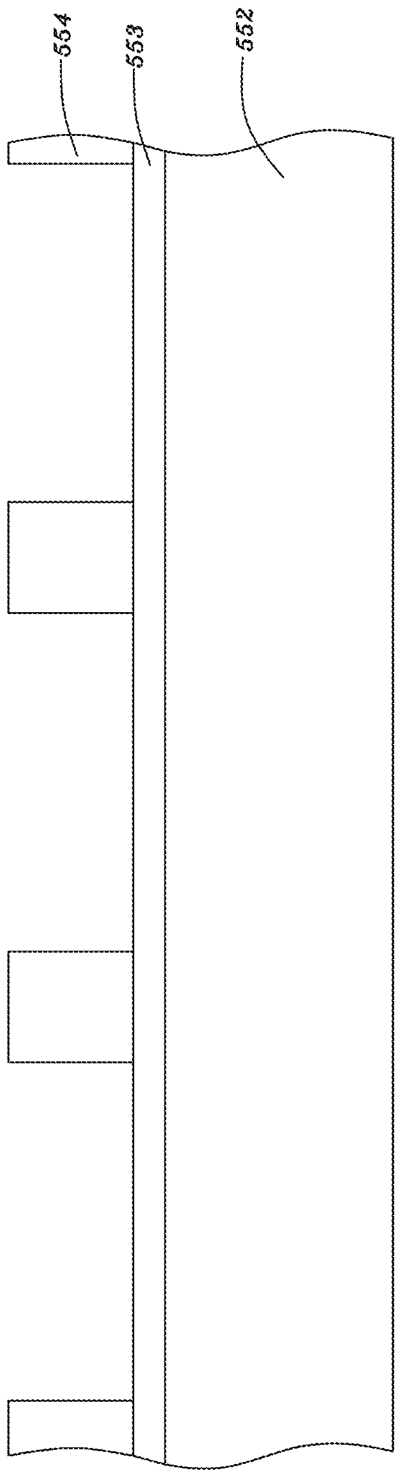
FIGS. 26A-26M are schematically cross-sectional views showing a process for forming an interposer with a second type of vias in accordance with an embodiment of the present application.

Referring to FIG. 25A for forming the first type of vias, i.e., deep vias, or FIG. 26A for forming the second type of vias, i.e., shallow vias, a substrate 552 may be provided in a wafer format with 8 inches, 12 inches or 18 inches in diameter or in a panel format having a square or rectangle shape with a width or a length greater than or equal to 20 cm, 30 cm, 50 cm, 75 cm, 100 cm, 150 cm, 200 cm or 300 cm. The substrate 552 may be a substrate of silicon, metal, ceramics, glass, steel, plastics, polymer, epoxy-based polymer, or epoxy-based compound. As an example, a silicon wafer may be used as the substrate 552 in forming the interposer.

Next, referring to FIG. 25A or 26A, a masking insulting layer 553 may be deposited on the substrate 552, e.g., silicon wafer. The masking insulting layer 553 may include a thermally grown silicon oxide ($SiO_2$) and/or a CVD silicon nitride ($Si_3N_4$), for example. Subsequently, a photoresist layer 554, such as positive-type photoresist layer, is spin-on coated on the masking insulting layer 553. The photoresist layer 554 is patterned with the processes of exposure, development, etc., to form multiple openings **554*a* in the photoresist layer 554 exposing the masking insulting layer 553**.

Figure 25B:
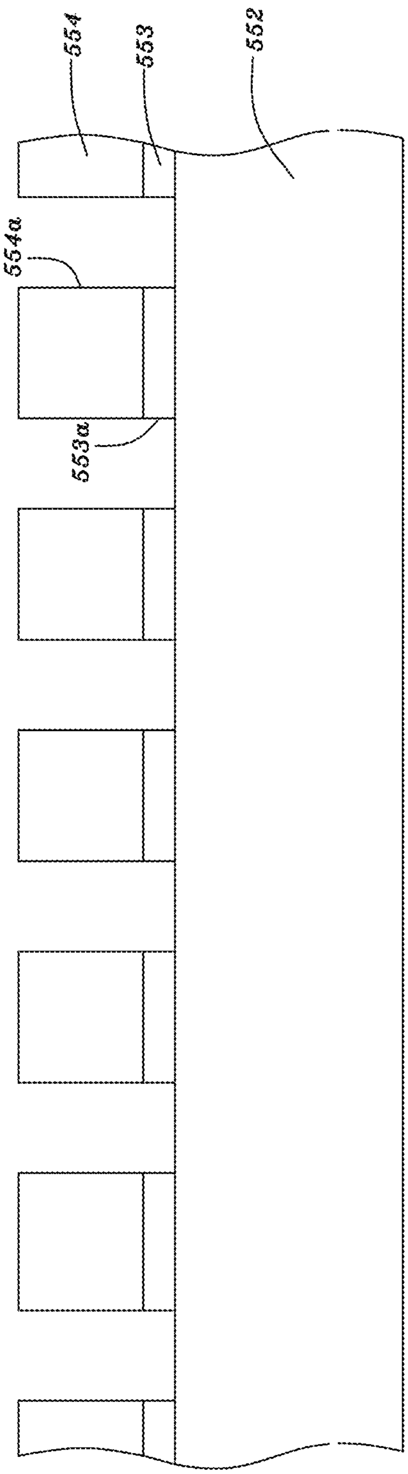
Figure 26B:
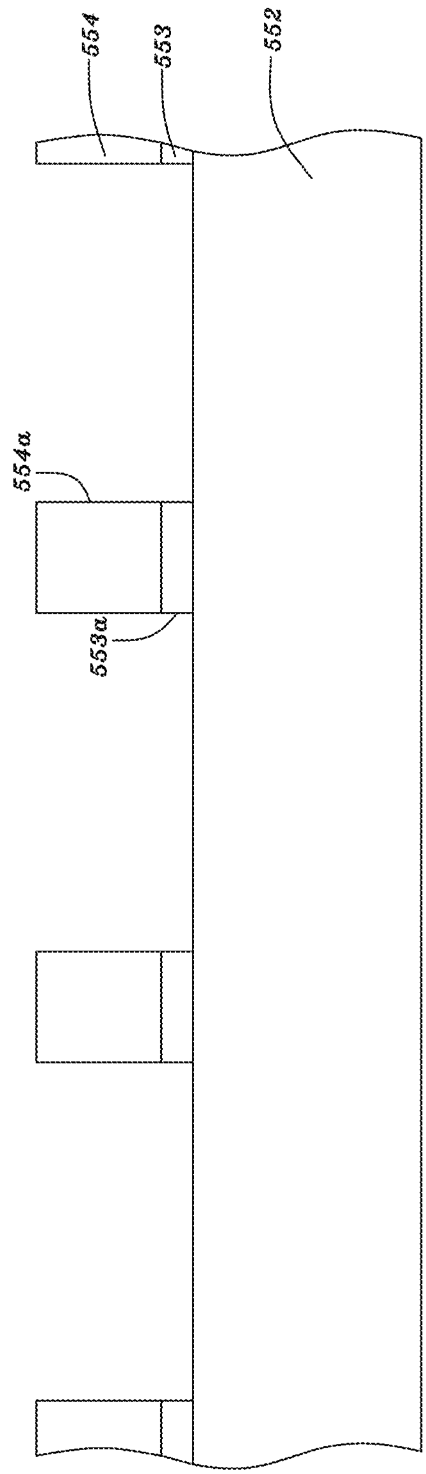

Next, referring to FIG. 25B for forming the first type of vias or FIG. 26B for forming the second type of vias, the masking insulting layer 553 under the openings **554*a* may be removed with a dry etching method or a wet etching method to form multiple openings or holes 553*a* in the masking insulting layer 553 and under the openings 554*a*. For forming the first type of vias, each of the openings 553*a* as shown in FIG. 25B may have a depth, in the masking insulting layer 553, between 30 μm and 150 μm, or 50 μm and 100 μm, and a diameter or largest transverse size between 5 μm and 50 μm, or 5 μm and 15 μm. For forming the second type of vias, each of the openings 553*a* as shown in FIG. 26B may have a depth, in the masking insulting layer 553**, between 5 μm and 50 μm, or 5 μm and 30 μm, and a diameter or largest transverse size between 20 μm and 150 μm or 30 μm and 80 μm.

Figure 25C:
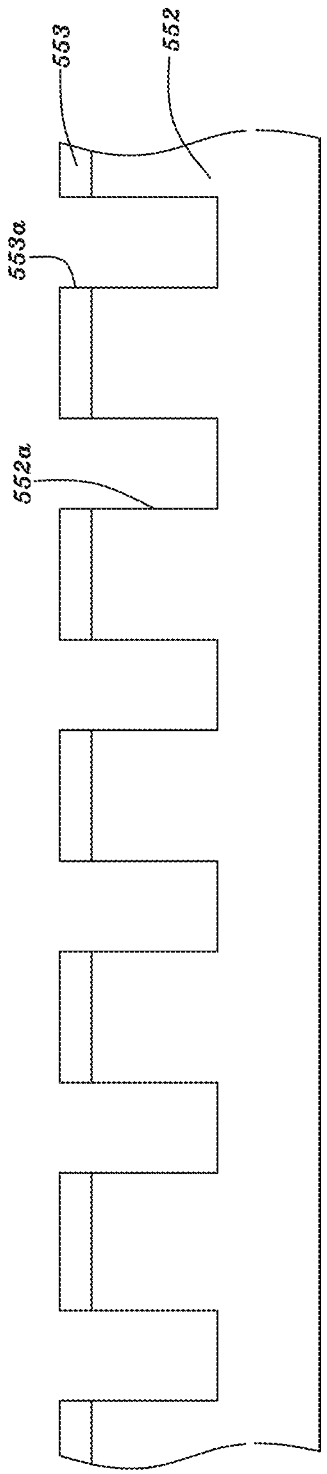
Figure 26C:
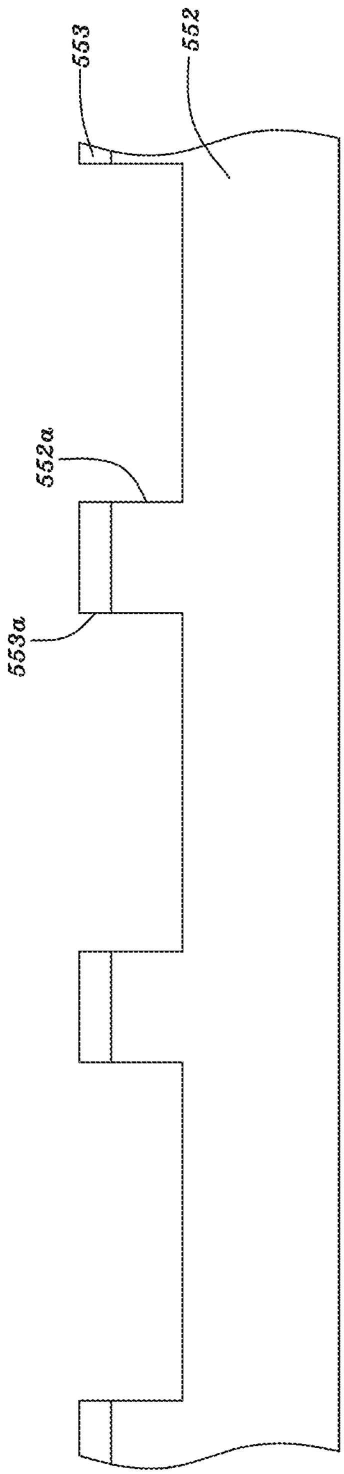

Referring to FIG. 25C for forming the first type of vias or FIG. 26C for forming the second type of vias, the photoresist layer 554 is then removed. Next, using the masking insulting layer 553 as a mask, the substrate 552 under the openings **553*a* may be then removed with a dry etching method or a wet etching method to form multiple holes 552*a* in the substrate 552 and under the openings 553*a*, as seen in FIG. 25C or 26**C.

For the first type of vias, referring to FIG. 25C, each of the holes **552*a* may be a deep hole with a depth of between 30 μm and 150 μm or between 50 μm and 100 μm and with a diameter or size of between 5 μm and 50 μm or between 5 μm and 15 μm. For the second type of vias, referring to FIG. 26C, each of the holes 552*a*** may be a shallow hole with a depth of between 5 μm and 50 μm or between 5 μm and 30 μm and with a diameter or size of between 20 μm and 120 μm or between 20 μm and 80 μm.

Figure 25D:
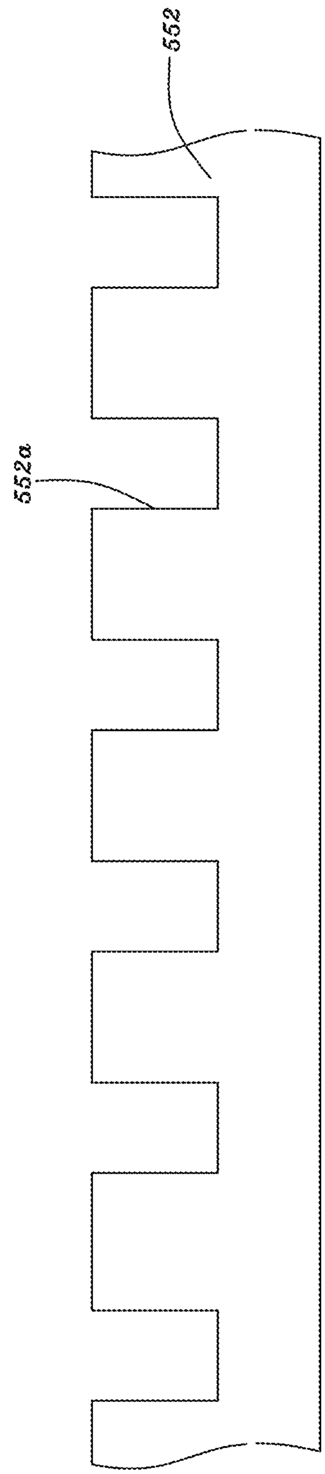
Figure 25E:
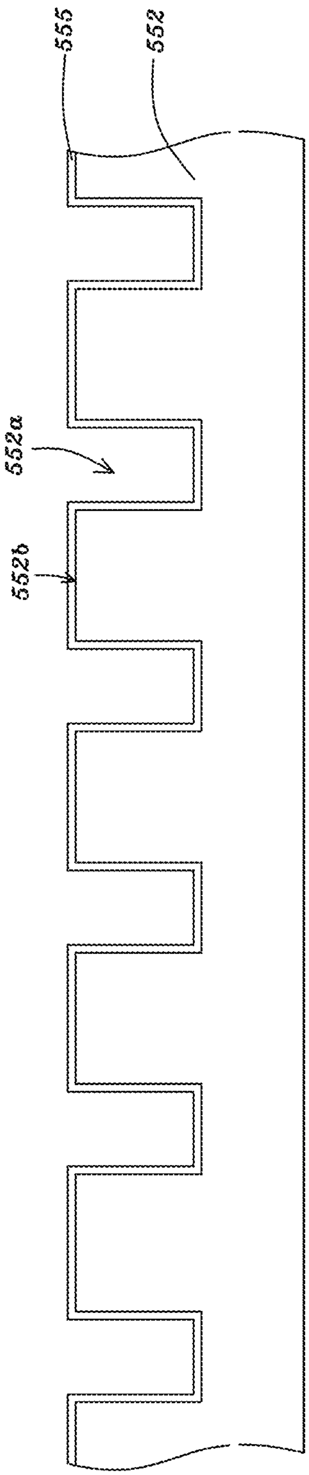
Figure 26D:
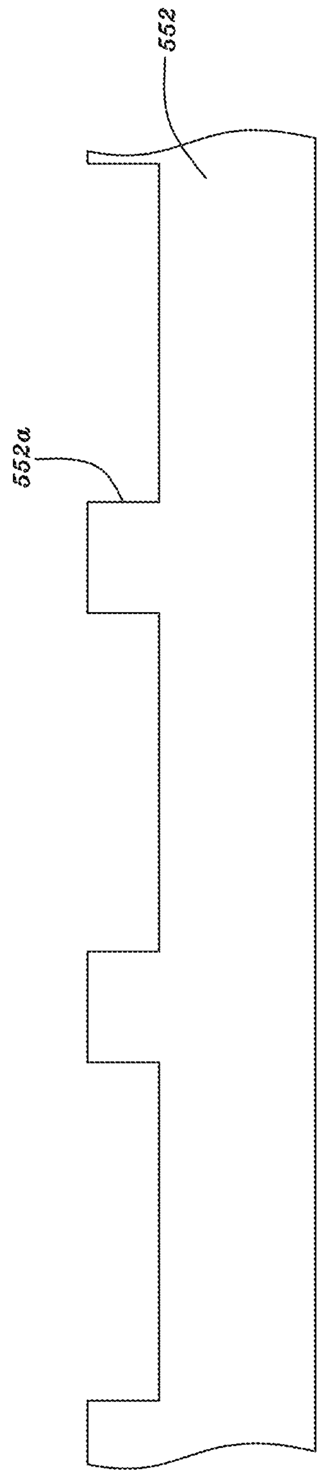
Figure 26E:
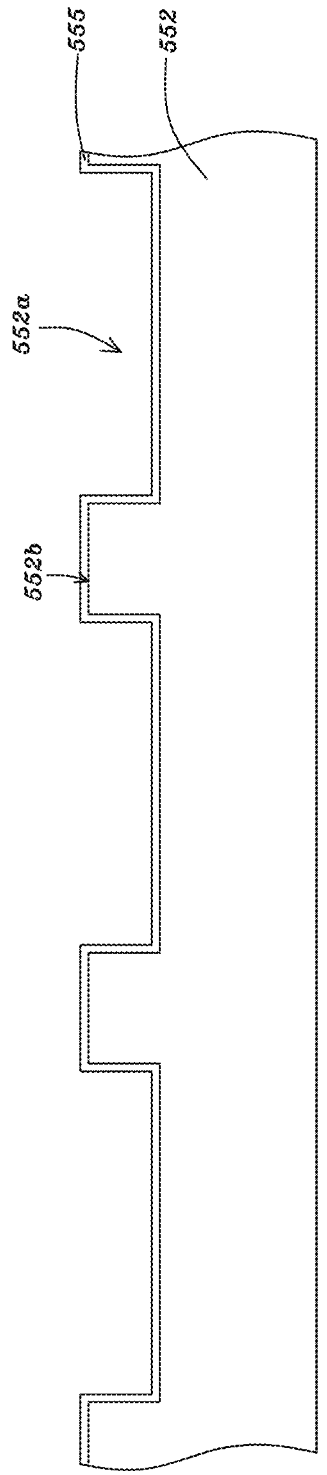

Next, the masking insulting layer 553 may be removed as seen in FIG. 25D for forming the first type of vias or FIG. 26D for forming the second type of vias. Referring to FIG. 25E for forming the first type of vias or FIG. 26E for forming the second type of vias, an insulating layer 555 may be then formed on a sidewall and bottom of each of the holes **552*a* and a top surface 552*b* of the substrate 552. The insulating layer 555** may include a thermally grown silicon oxide ($SiO_2$) and/or a CVD silicon nitride ($Si_3N_4$), for example.

Figure 25F:
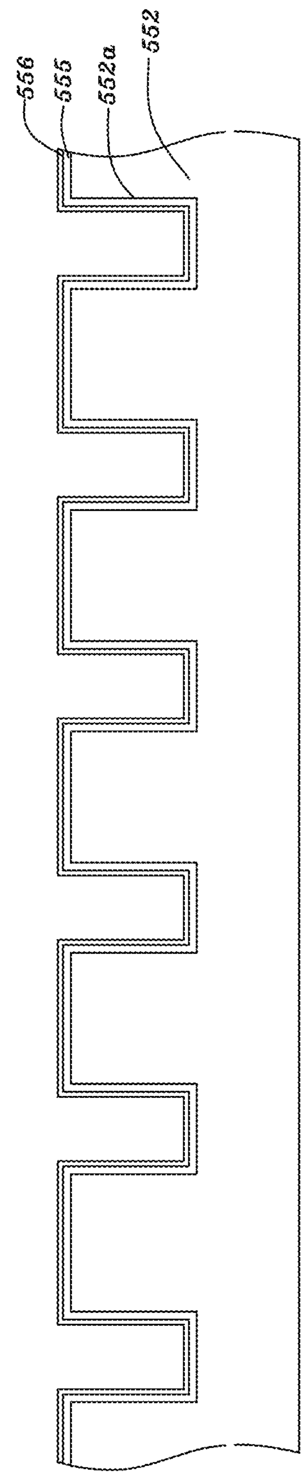
Figure 26F:
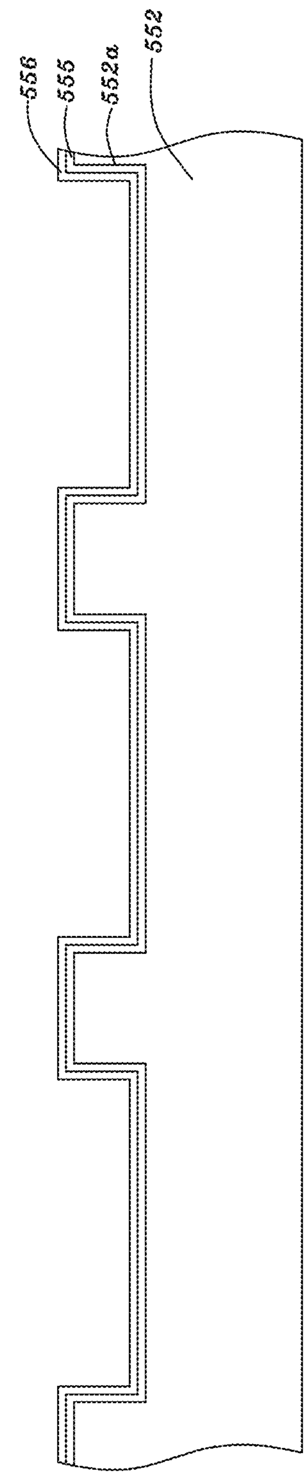

Next, referring to FIG. 25F for forming the first type of vias or FIG. 26F for forming the second type of vias, an adhesion/seed layer 556 may be deposited on the insulating layer 555. For forming the adhesion/seed layer 556, an adhesion layer may be first formed by, for example, sputtering or Chemical Vapor Depositing (CVD) a titanium (Ti) or titanium nitride (TiN) layer (with thickness for example, between 1 nm and 50 nm) on the insulating layer 555; next, an electroplating seed layer may be deposited on the adhesion layer by, for example, sputtering or CVD depositing a copper layer (with a thickness, for example, between 3 nm and 200 nm) on the adhesion layer. The adhesion layer and electroplating seed layer may compose the adhesion/seed layer 556.

Figure 25G:
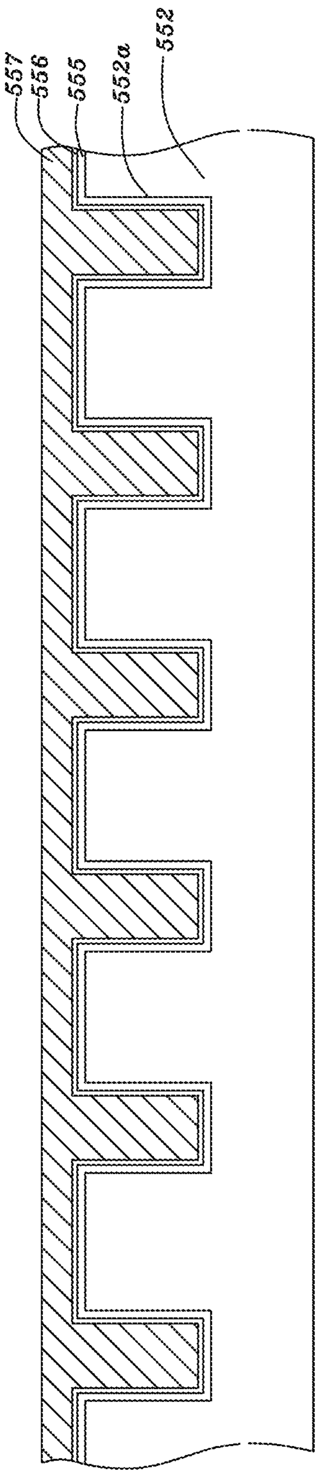
Figure 25H:
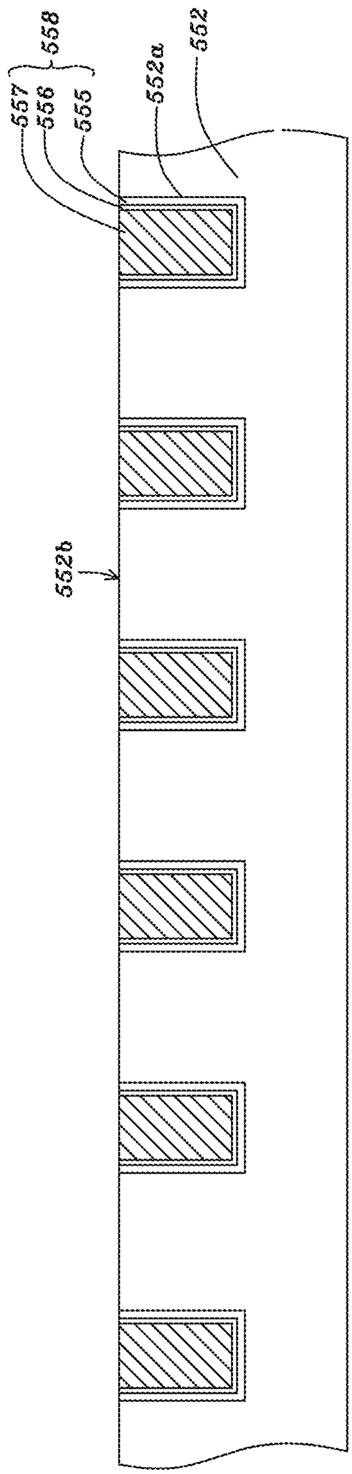

For the first type of vias, referring to FIG. 25G, a copper layer 557 is then electroplated on the electroplating seed layer of the adhesion/seed layer 556 until the holes 552*a* are filled up with the copper layer 557. Referring to FIG. 25H, a chemical-mechanical polishing (CMP) process or mechanical polishing process may be applied to remove the copper layer 557, adhesion/seed layer 556 and insulating layer 555 outside the holes 552*a* until the top surface 552*b* of the substrate 552 is exposed. Referring to FIG. 25H, the remaining copper layer 557, adhesion/seed layer 556 and insulating layer 555 in each of the holes 552*a* may compose one of the vias 558 of the first type. Each of the vias 558 of the first type may have a depth, in the substrate 552, between 30 μm and 150 μm, or 50 μm and 100 μm, and a diameter or largest transverse size between 5 μm and 50 μm, or 5 μm and 15 μm.

Figure 26G:
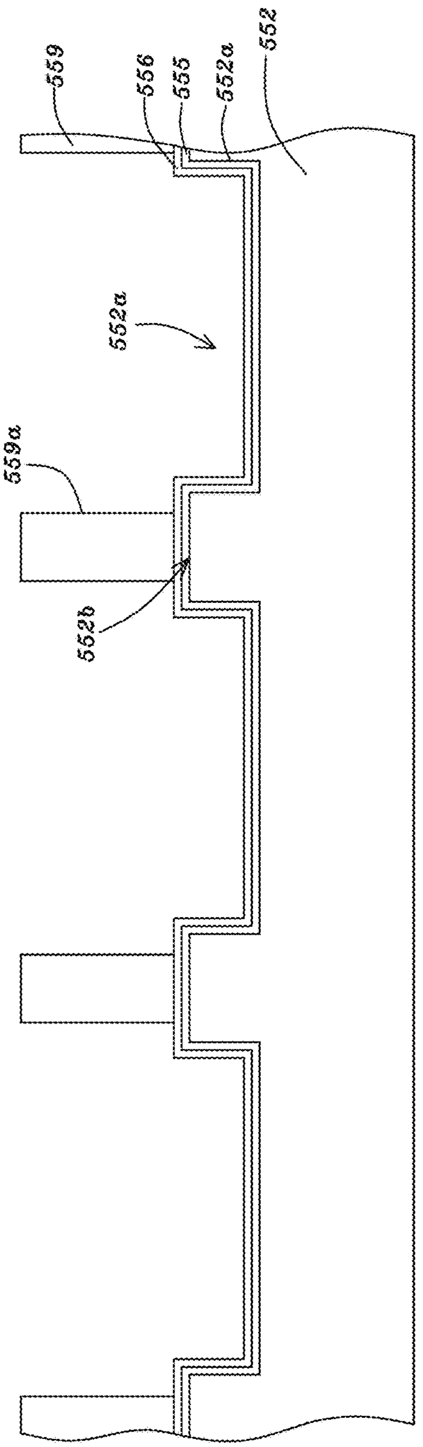
Figure 26H:
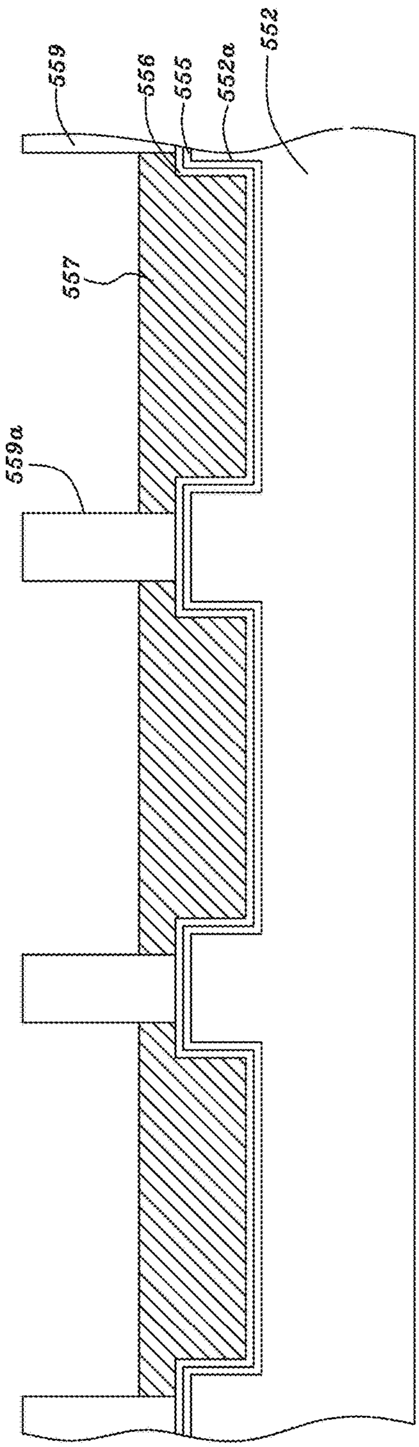
Figure 26I:
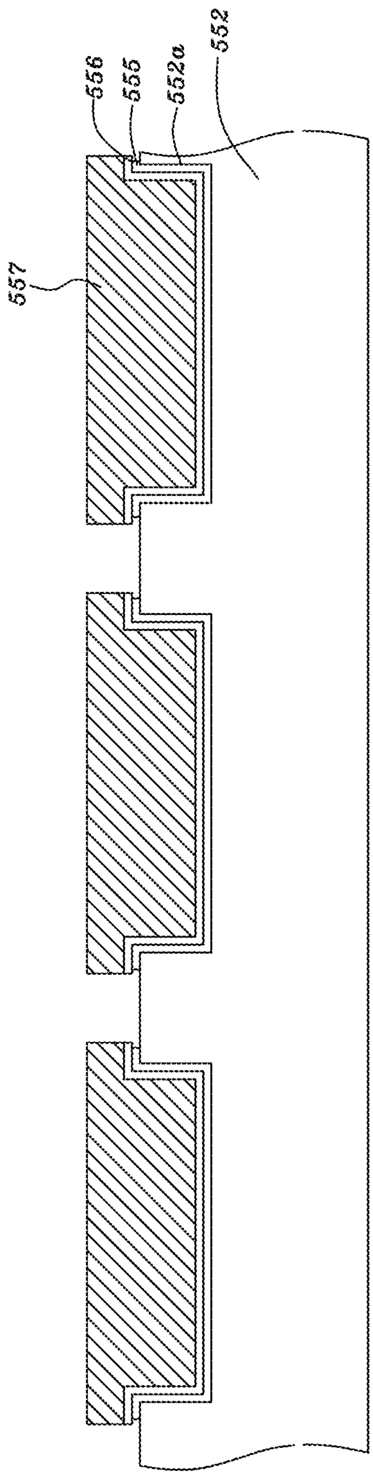
Figure 26J:
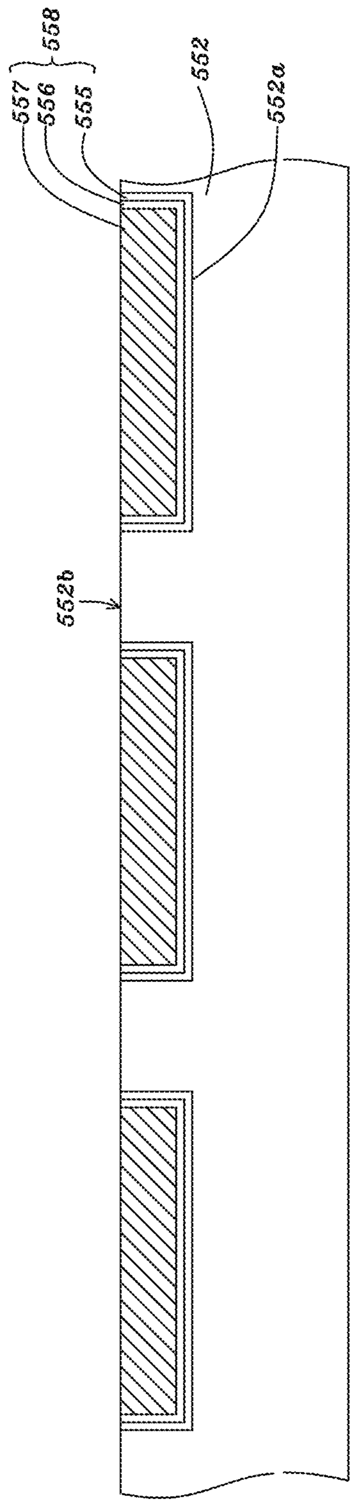

For the second type of vias, referring to FIG. 26G, a photoresist layer 559, such as positive-type photoresist layer, is spin-on coated on the adhesion/seed layer 556. The photoresist layer 559 is patterned with the processes of exposure, development, etc., to form multiple openings 559*a* in the photoresist layer 559 exposing the electroplating seed layer of the adhesion/seed layer 556 at a sidewall and bottom of each of the holes 552*a* and at an annular region of the top surface 552*b* around said each of the holes 552*a*. Next, referring to FIG. 26H, a copper layer 557 is then electroplated on the electroplating seed layer of the adhesion/seed layer 556 until the holes 552*a* are filled up with the copper layer 557. Next, the photoresist layer 559 is removed as seen in FIG. 26I. Next, referring to FIG. 26J, a chemical-mechanical polishing (CMP) process or mechanical polishing process may be applied to remove the copper layer 557, adhesion/seed layer 556 and insulating layer 555 outside the holes 552*a* until the top surface 552*b* of the substrate 552 is exposed. Referring to FIG. 26J, the remaining copper layer 557, adhesion/seed layer 556 and insulating layer 555 in each of the holes 552*a* may compose one of the vias 558 of the second type. Each of the vias 558 of the second type may have a depth, in the substrate 552, between 5 μm and 50 μm, or 5 μm and 30 μm, and a diameter or largest transverse size between 20 μm and 150 μm or 30 μm and 80 μm.

Figure 25I:
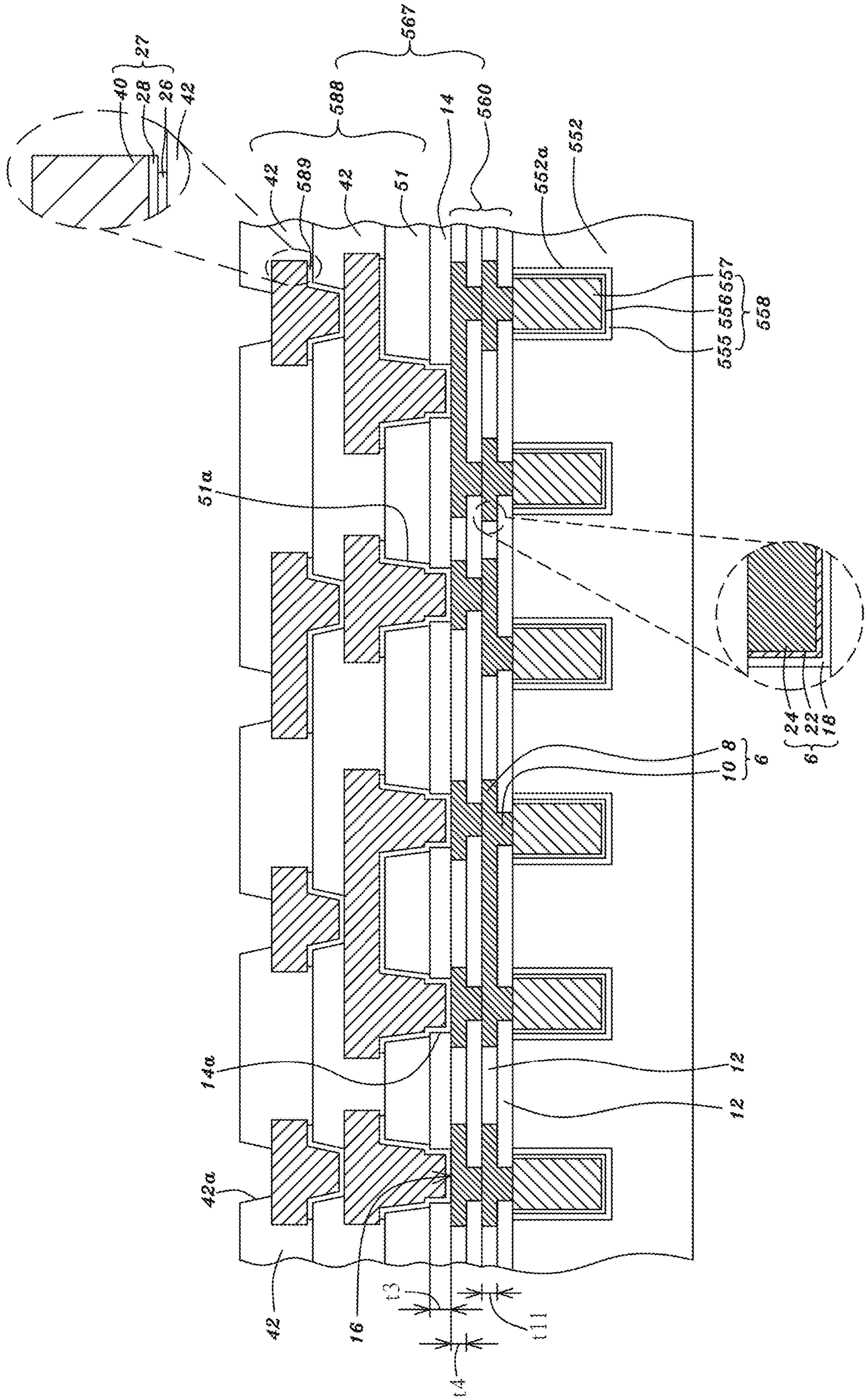
Figure 26K:
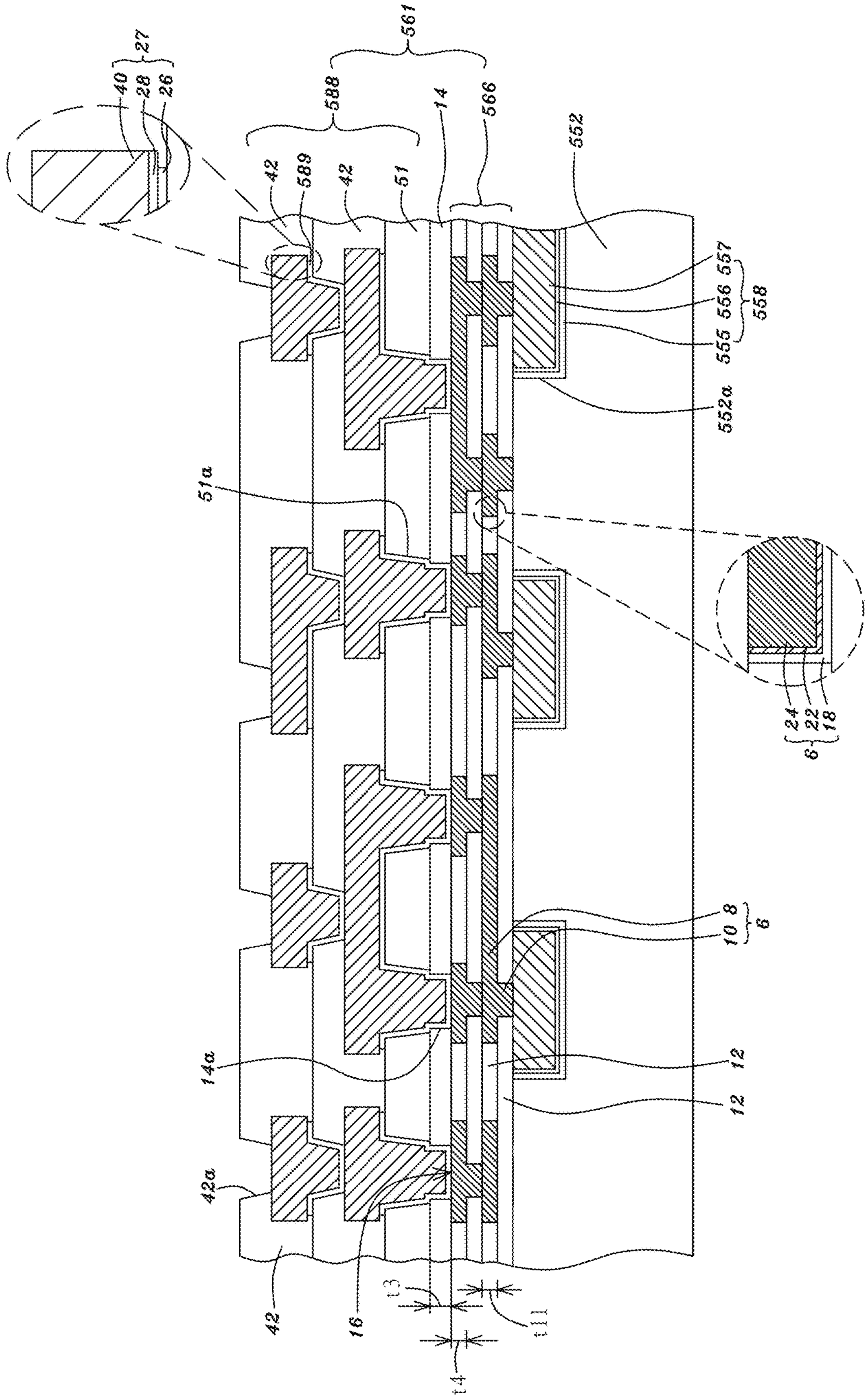

Next, referring to FIG. 25I for forming an interposer with the first type of vias 558 or FIG. 26K for forming an interposer with the second type of vias 558, a first interconnection scheme 560 for an interposer (FISIP) may formed over the substrate 552 by a wafer process. The FISIP 560 may comprise 2 to 10 layers, or 3 to 6 layers of interconnection metal layers 6 (only two layers are shown) patterned with multiple metal pads, lines or traces 8 and multiple metal vias 10 as illustrated in FIG. 22A. The metal pads, lines or traces 8 and metal vias 10 of the FISIP 560 may be used for the programmable and fixed interconnects 361 and 364 of the inter-chip interconnects 371 as seen in FIGS. 19A-19N. The FISIP 560 may include multiple insulating dielectric layers 12 and multiple interconnection metal layers 6 each in neighboring two of the insulating dielectric layers 12 as illustrated in FIG. 22A. Each of the interconnection metal layers 6 of the FISIP 560 may include the metal pads, lines or traces 8 at a top portion thereof and the metal vias 10 at a bottom portion thereof. One of the insulating dielectric layers 12 of the FISIP 560 may be between the metal pads, lines or traces 8 of neighboring two of the interconnection metal layers 6, a top one of which may have the metal vias 10 in said one of the insulating dielectric layers 12. For each of the interconnection metal layers 6 of the FISIP 560, its metal pads, lines or traces 8 may have a thickness t11 of between 3 nm and 500 nm, between 10 nm and 1,000 nm, between 10 nm and 2,000 nm or between 10 nm and 3,000 nm, or thinner than or equal to 10 nm, 30 nm, 50 nm, 100 nm, 200 nm, 300 nm, 500 nm, 1,000 nm, 1,500 nm or 2,000 nm and may have a minimum width equal to or smaller than 10 nm, 50 nm, 100 nm, 150 nm, 200 nm, 300 nm, 500 nm, 1,000 nm, 1,500 nm or 2,000 nm; a minimum space between neighboring two of its metal pads, lines or traces 8 may be equal to or smaller than 10 nm, 50 nm, 100 nm, 150 nm, 200 nm, 300 nm, 500 nm, 1,000 nm, 1,500 nm or 2,000 nm; a minimum pitch of neighboring two of its metal pads, lines or traces 8 may be equal to or smaller than 20 nm, 100 nm, 200 nm, 300 nm, 400 nm, 600 nm, 1,000 nm, 3,000 nm or 4,000 nm. For example, the metal pads, lines or traces 8 and metal vias 10 are principally made of copper by a damascene process such as single-damascene process as mentioned in FIGS. 22B-22H or double-damascene process as mentioned in FIGS. 22I-22Q. For each of the interconnection metal layers 6 of the FISIP 560, its metal pads, lines or traces 8 may include a copper layer having a thickness of less than 3 μm (such as between 0.2 and 2 μm). Each of the insulating dielectric layers 12 of the FISIP 560 may have a thickness, for example, between 3 nm and 500 nm, between 10 nm and 1,000 nm, between 10 nm and 2,000 nm or between 10 nm and 3,000 nm, or thinner than or equal to 10 nm, 30 nm, 50 nm, 100 nm, 200 nm, 300 nm, 500 nm, 1,000 nm or 2,000 nm.

The process for forming the FISIP 560 may be referred to the process for forming the FISC 20 as illustrated in FIGS. 22B-22H for the single-damascene process. Alternatively, the process for forming the FISIP 560 may be referred to the process for forming the FISC 20 as illustrated in FIGS. 22I-22Q for the double-damascene process.

Referring to FIG. 25I or 26K, a passivation layer 14 as illustrated in FIG. 22A may be formed over the FISIP 560. The passivation layer 14 may protect the interconnection metal layers 6 of the FISIP 560 from being damaged by moisture foreign ion contamination, or from water moisture or contamination form external environment, for example sodium mobile ions. In other words, mobile ions (such as sodium ion), transition metals (such as gold, silver and copper) and impurities may be prevented from penetrating through the passivation layer 14 to the interconnection metal layers 6 of the FISIP 560.

Referring to FIG. 25I or 26K, the specification for the passivation layer 14 for the interposer and the process for forming the same may be referred to those for the semiconductor chip 100 as illustrated in FIG. 22A. An opening 14*a* in the passivation layer 14 is formed to expose a metal pad 16 of a topmost one of the interconnection metal layers 6 of the FISIP 560. The metal pad 16 of the FISIP 560 may be used for signal transmission or for connection to a power source or a ground reference. The specification for the openings 14*a* and metal pad 16 for the interposer and the process for forming the same may be referred to those for the semiconductor chip 100 as illustrated in FIG. 22A. Further, there may be one of the vias 558 vertically under one of the metal pad 16 exposed by one of the openings 14*a*.

Optionally, referring to FIG. 25I or 26K, a polymer layer, like the one 36 as illustrated in FIG. 23I, may be formed on the passivation layer 14. Each opening in the polymer layer may expose one of the metal pads 16 at bottoms of the openings 14*a*.

Optionally, referring to FIG. 25I or 26K, a second interconnection scheme 588 for the interposer (SISIP) may be formed over the passivation layer 14 for the interposer as seen in FIG. 25I or 26K. The specification for the SISIP 588 and the process for forming the same may be referred to the specification for the SISC 29 and the process for forming the same as illustrated in FIGS. 24A-24O. The SISIP 588 may include one or more interconnection metal layers 27 as illustrated in FIGS. 24J-24O and one or more dielectric or polymer layers 42 and/or 51 as illustrated in FIGS. 24J-24O. For example, the SISIP 588 may include the polymer layer 51 as illustrated in FIGS. 24L, 24M and 24O directly on the passivation layer 14 and under the bottommost one of its one or more interconnection metal layers 27. The SISIP 588 may include one of the polymer layers 42 as illustrated in FIG. 24O between neighboring two of its interconnection metal layers 27. The SISIP 588 may include one of the polymer layers 42 as illustrated in FIGS. 24J-24O on the topmost one of its one or more interconnection metal layers 27. Each of the interconnection metal layers 27 of the SISIP 588 may include the adhesion layer 26, the electroplating seed layer 28 on the adhesion layer 26 and the metal layer 40 on the electroplating seed layer 28 as illustrated in FIGS. 24J-24O, wherein an adhesion/seed layer 589 herein may represent a combination of the adhesion layer 26 and the electroplating seed layer 28. The interconnection metal layers 27 of the SISIP 588 may be used for the programmable and fixed interconnects 361 and 364 of the inter-chip interconnects 371 as seen in FIGS. 19A-19N. The SISIP 588 may include 1 to 5 layers, or 1 to 3 layers, of interconnection metal layers.

Micro-Bumps at Front Side of Interposer

Figure 25J:
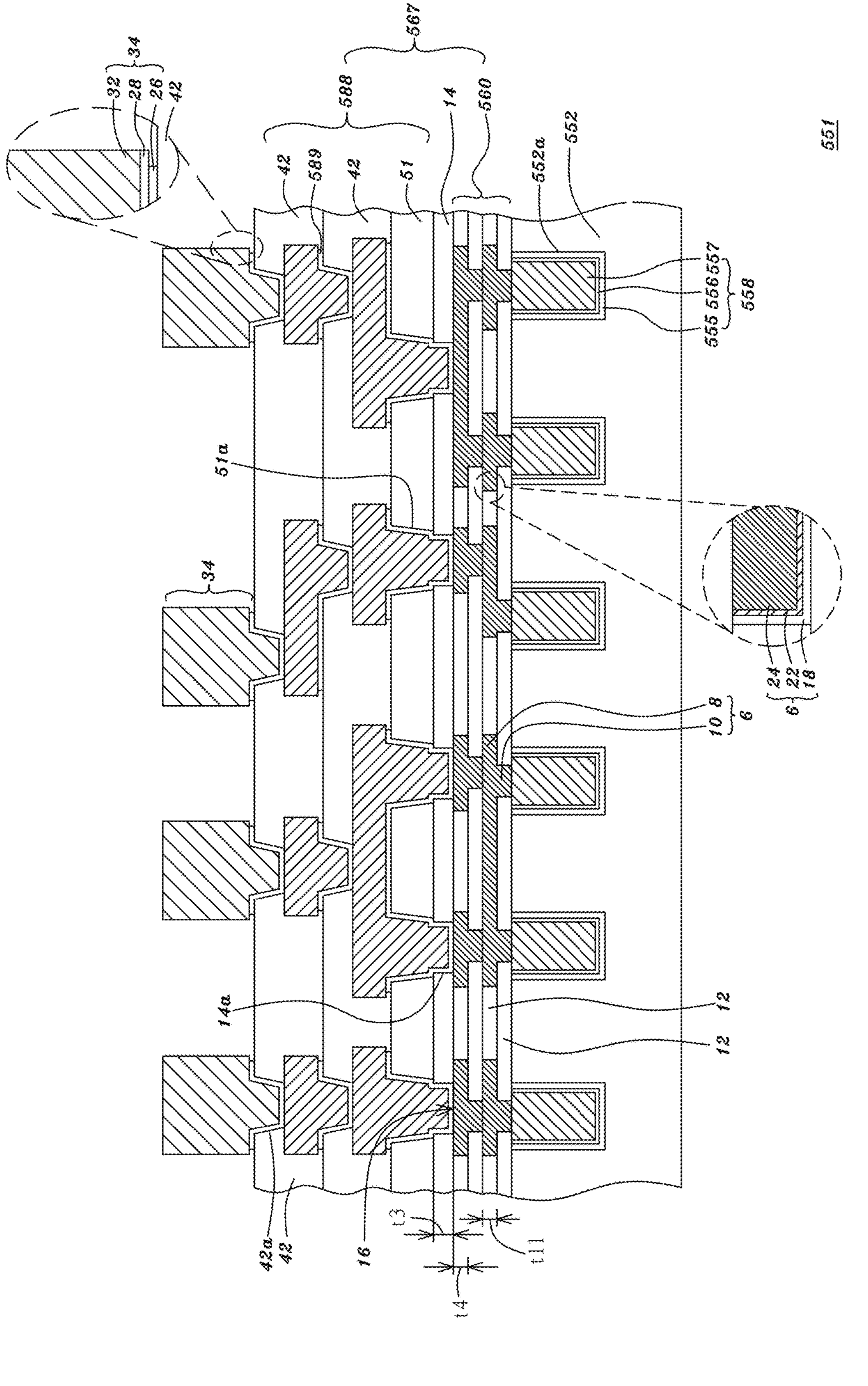
Figure 26L:
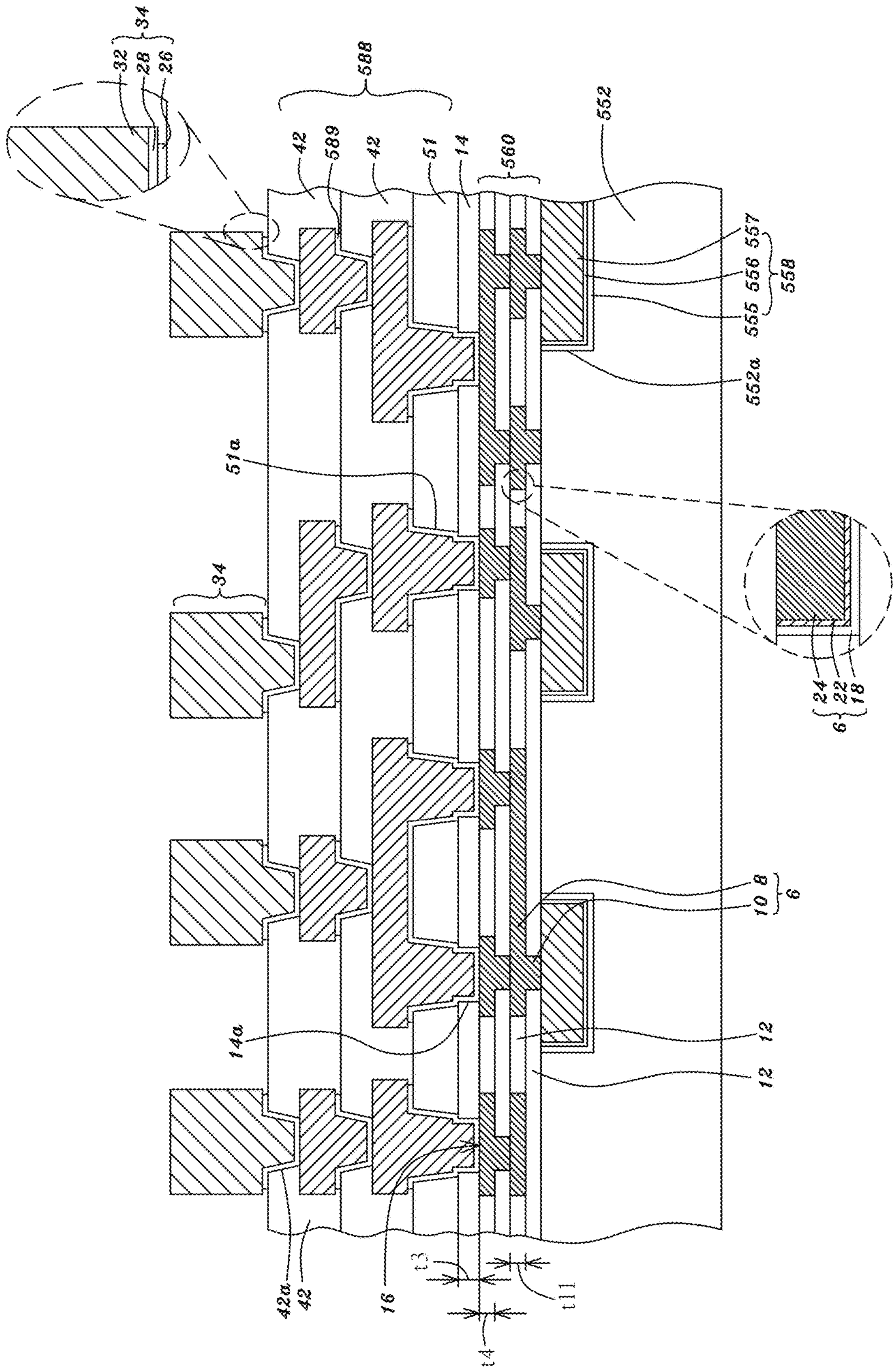

Next, referring to FIG. 25J for forming an interposer 551 with the first type of vias 558 or FIG. 26L for forming an interposer 551 with the second type of vias 558, multiple micro-bumps 34 of the first or second type as illustrated in FIGS. 23A-23K and 24E-24O may be formed on the topmost one of the interconnection metal layers 27 of the SISIP 588 or the topmost one of the interconnection metal layers 6 of the FISIP 560. The specification for the micro bumps 34 of the first or second type for the interposer 551 and the process for forming the same may be referred to those for the semiconductor chip 100 as illustrated in FIGS. 23A-23K and 24E-24O.

Figure 25K:
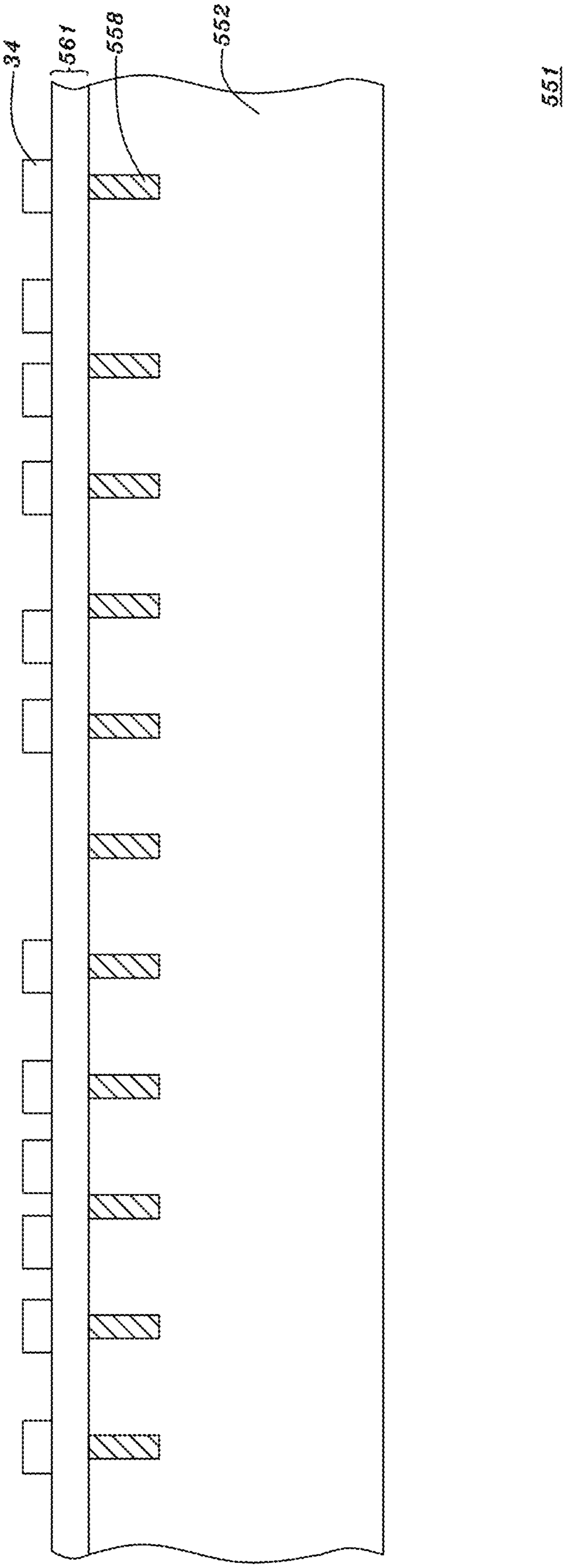
Figure 26M:
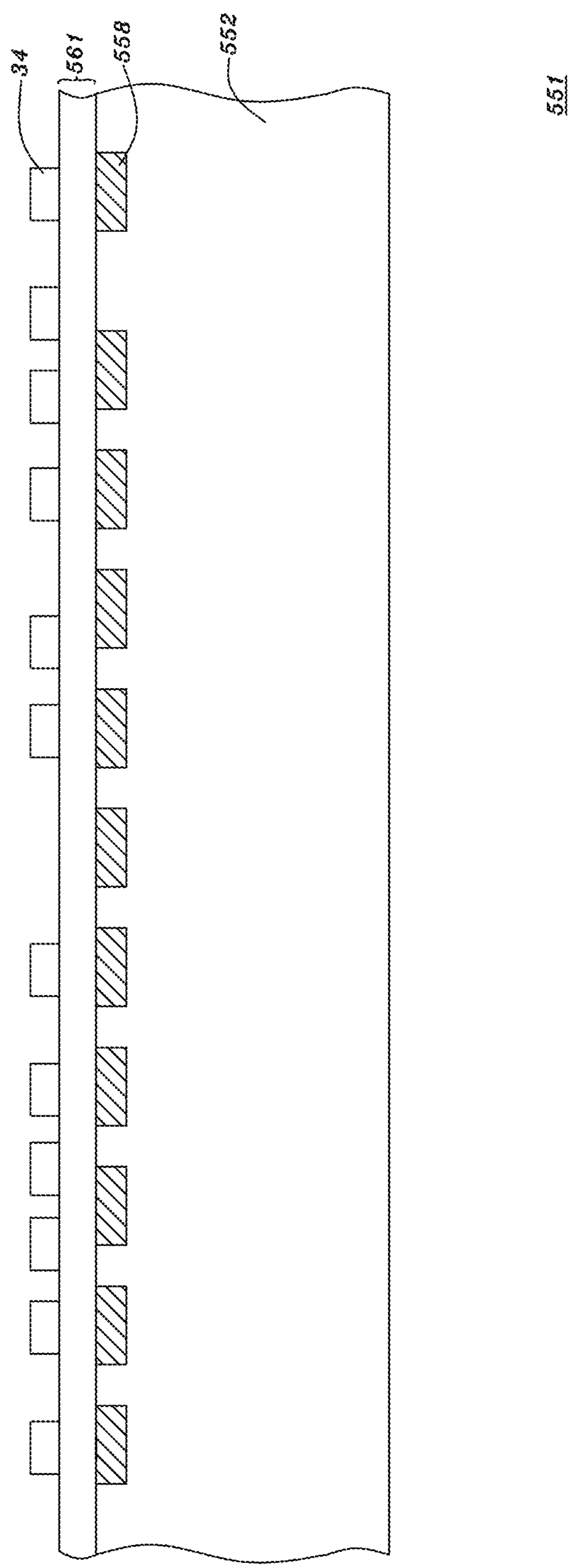

Referring to FIG. 25K or 26M, an interconnection scheme 561 may be composed of the FISIP 560 and passivation layer 14 as illustrated in FIG. 25I or 26K, and each of the micro-bumps 34 of the first or second type as illustrated in FIGS. 23A-23K and 24E-24O may have the adhesion layer 26 formed on one of the metal pads 16 and on the passivation layer 14 around one of the openings 14*a*.

Alternatively, referring to FIG. 25K or 26M, the interconnection scheme 561 may be composed of the FISIP 560 and passivation layer 14 as illustrated in FIG. 25I or 26K and further of a polymer layer, like the one 36 as seen in FIG. 23I, on the passivation layer 14, wherein each opening in the polymer layer, like the one 36*a* as seen in FIG. 23I, may expose one of the metal pads 16, and each of the micro-bumps 34 of the first or second type as illustrated in FIGS. 23A-23K and 24E-24O may have the adhesion layer 26 formed on one of the metal pads 16 and on the polymer layer around one of the openings in the polymer layer.

Alternatively, referring to FIG. 25K or 26M, the interconnection scheme 561 may be composed of the FISIP 560 and passivation layer 14 as illustrated in FIG. 25I or 26K and further of the SISIP 588 as illustrated in FIGS. 24J-24O over the passivation layer 14, wherein each opening 42*a* in a topmost one of the polymer layers 42 of the SISIP 588 may expose a metal pad of a topmost one of the interconnection metal layers 27 of the SISIP 588 and each of the micro-bumps 34 of the first or second type as illustrated in FIGS. 23A-23K and 24E-24O may have the adhesion layer 26 formed on one of the metal pad and on the topmost one of the polymer layers 42 around one of the openings 42*a* in the topmost one of the polymer layers 42.

In FIG. 25J or 26L, the second type of micro-bumps 34 are shown to be formed on the topmost one of the interconnection metal layers 27 of the SISIP 588 of the interconnection scheme 561. For explaining the subsequent processes, the interconnection scheme 561 is simplified as seen in FIG. 25K or 26M.

Chip-to-Interposer Assembly for Multi-Chip-On-Interposer (COIP) Flip-Chip Packaging Method FIGS. 25K-25W and 26M-26T are schematic views showing two processes for forming a COIP logic drive in accordance with two embodiments of the present application. Next, each of the semiconductor chips 100 as seen in FIG. 23H-23K or 24J-24O may have the micro-bumps 34 of the first or second type to be bonded to the first or second type of micro-bumps 34 of the interposer 551 as seen in FIG. 25K or 26M.

Figure 25L:
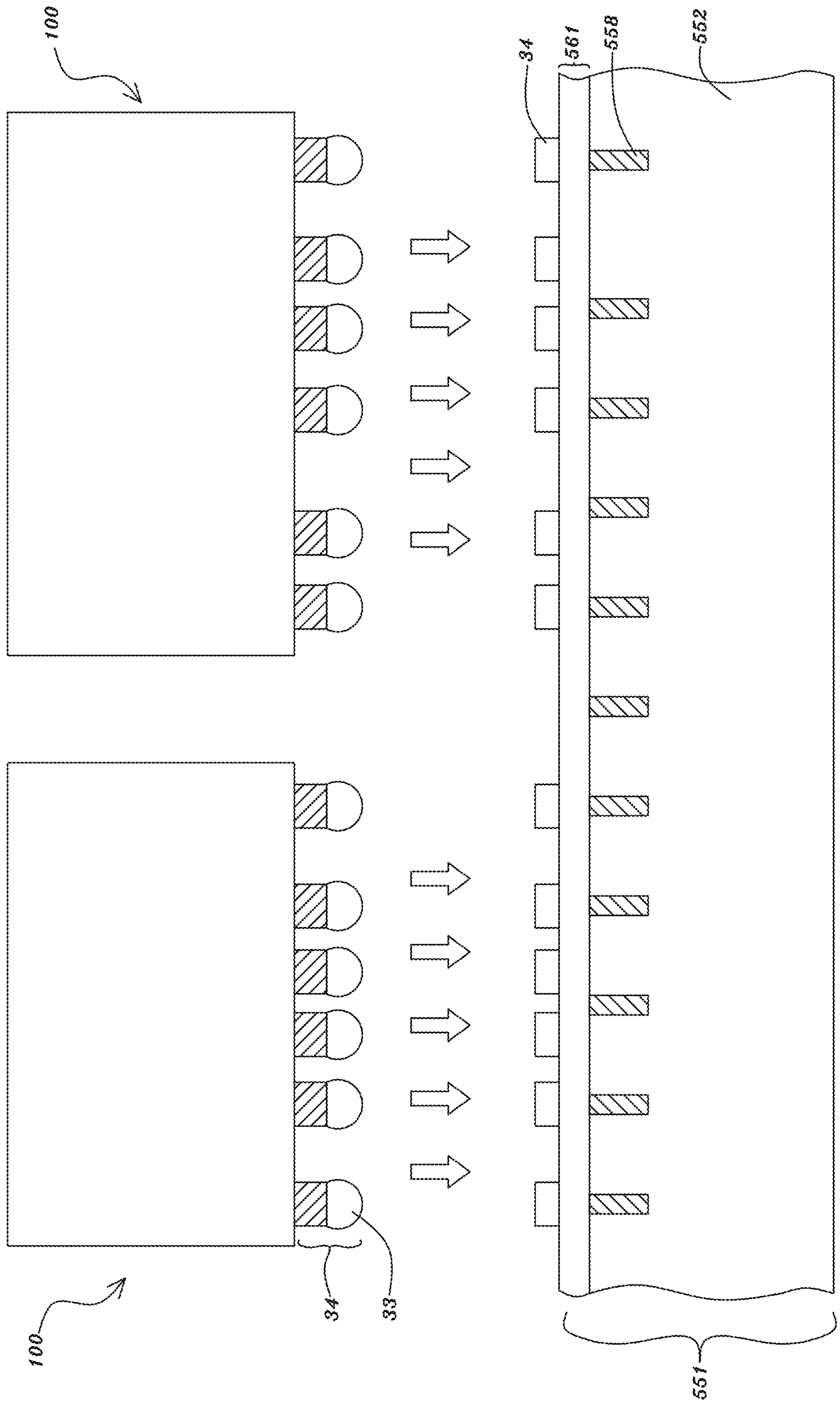
FIGS. 25L-25W are schematically cross-sectional views showing a process for forming a multi-chip-on-interposer (COIP) logic drive in accordance with an embodiment of the present application.
Figure 25M:
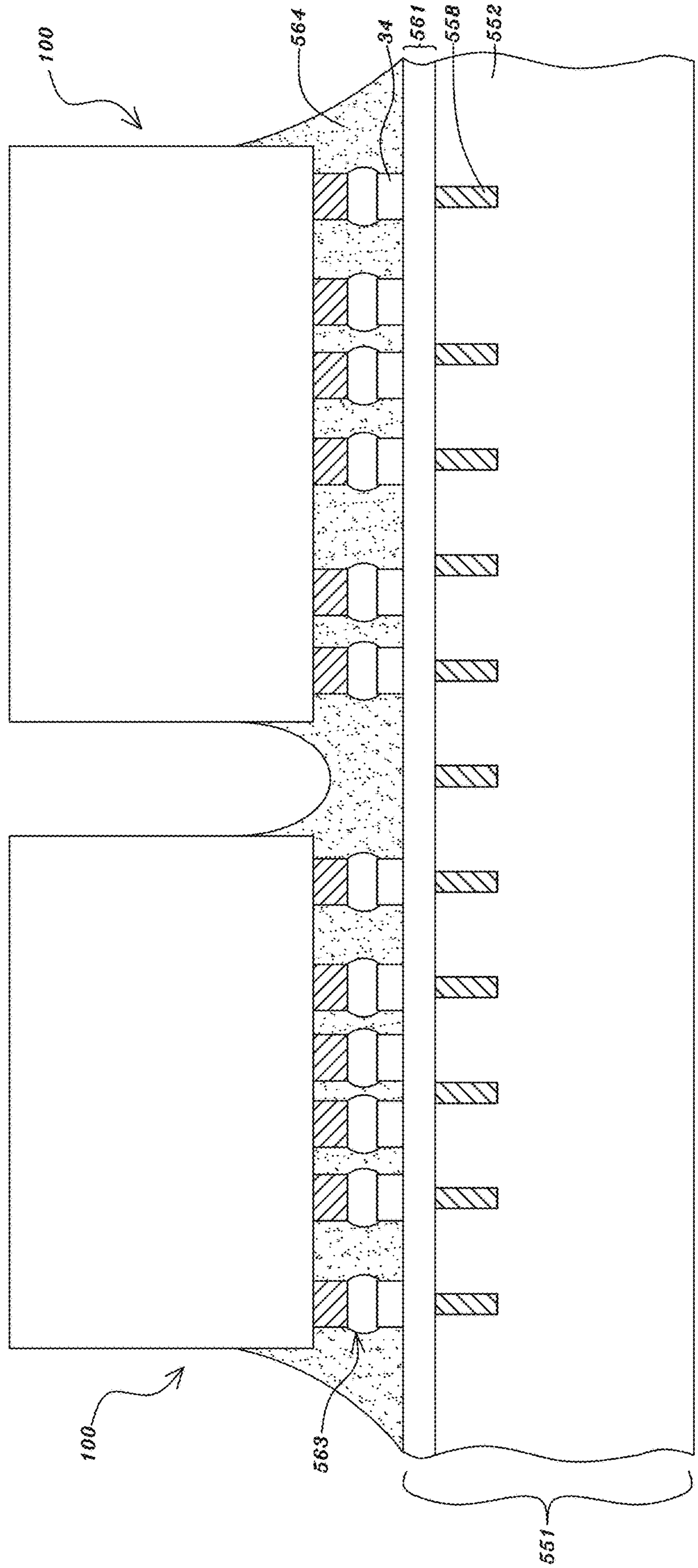
Figure 26N:
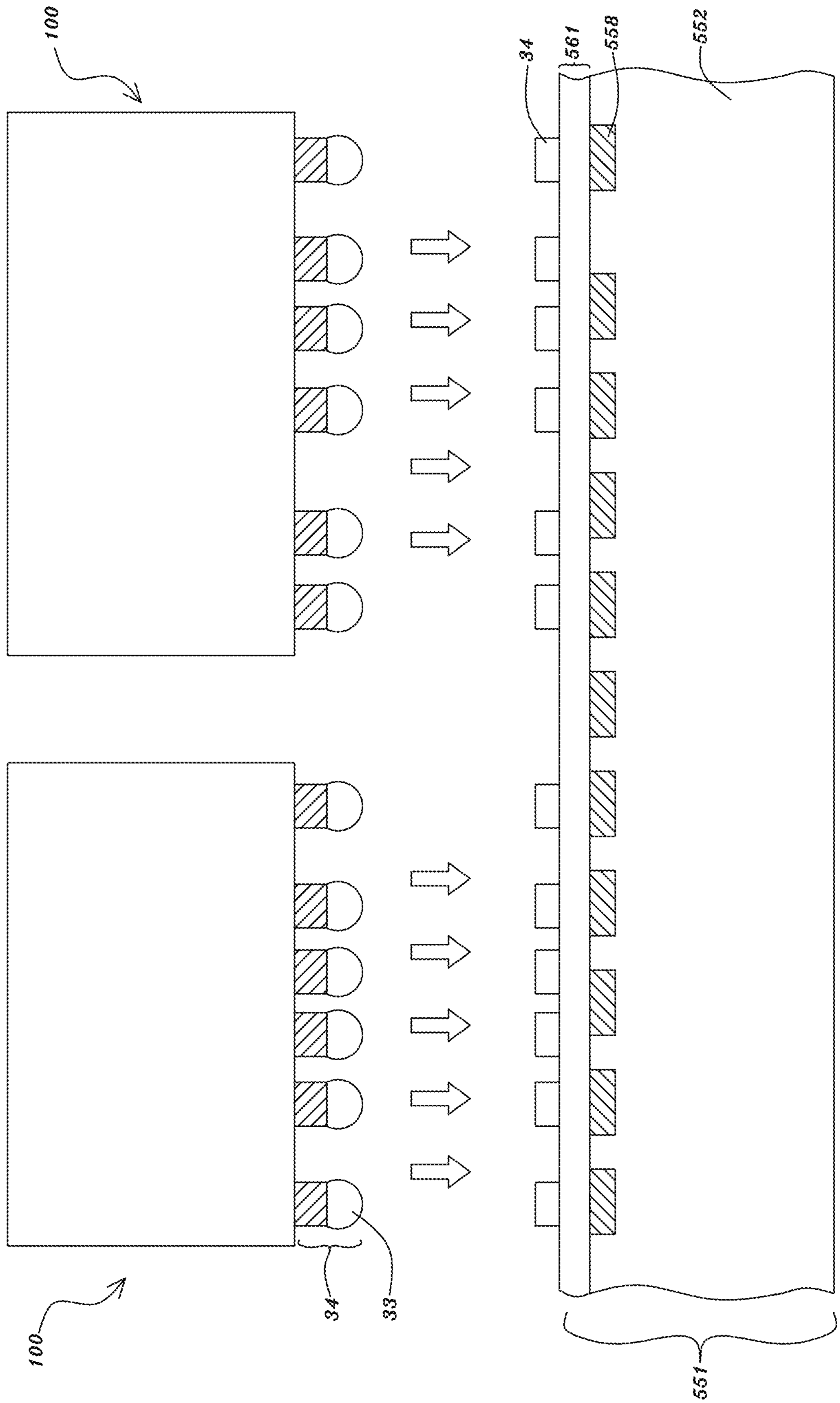
FIGS. 26N-26T are schematically cross-sectional views showing a process for forming a multi-chip-on-interposer (COIP) logic drive in accordance with an embodiment of the present application.
Figure 26O:
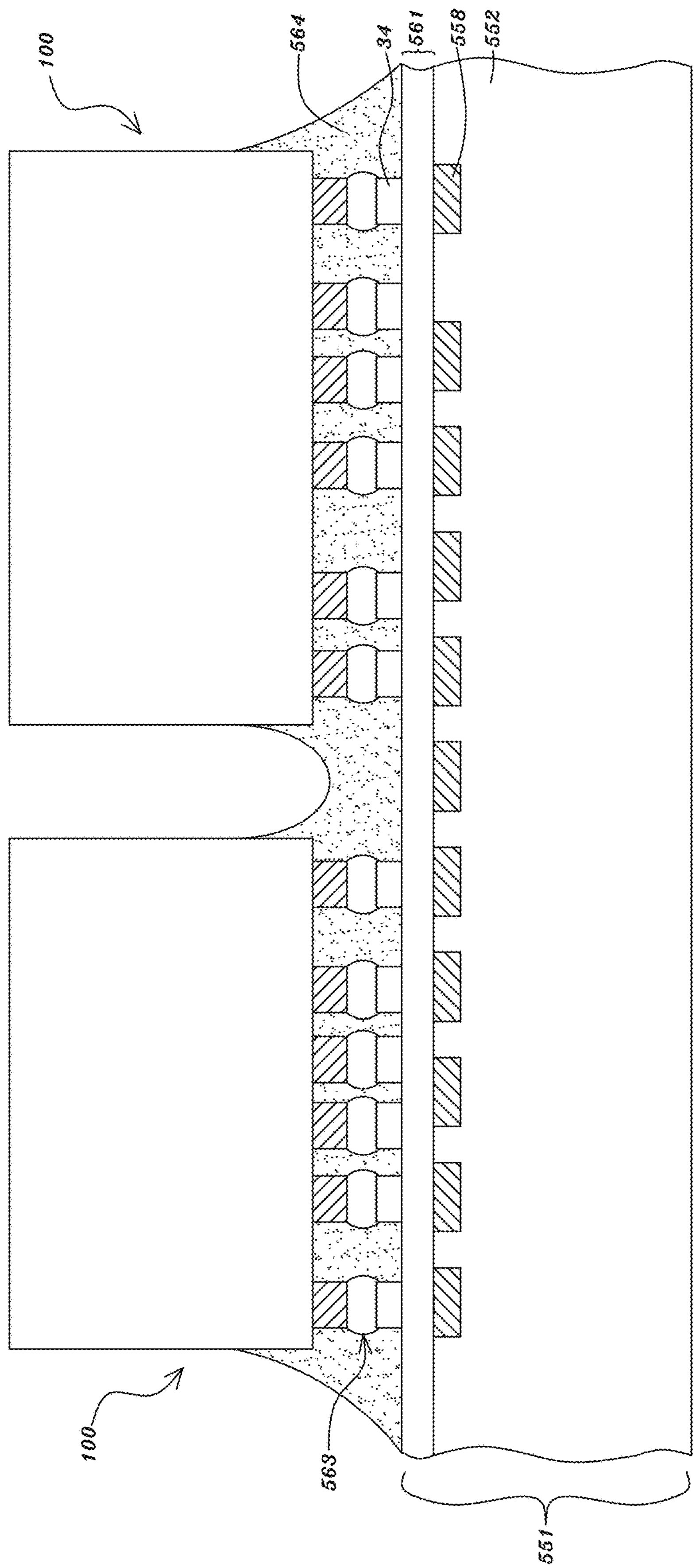

For a first case, referring to FIG. 25L or 26N, each of the semiconductor chips 100 as seen in FIG. 23H, 23I, 24J-24M or 24O may have the micro-bumps 34 of the first type to be bonded to the second type of micro-bumps 34 of the interposer 551. For example, the first type of micro-bumps 34 of said each of the semiconductor chips 100 may have the solder bumps 33 to be bonded onto the electroplated copper layer of the micro-bumps 34 of the second type of the interposer 551 into multiple bonded contacts 563 as seen in FIG. 25M or 26O, wherein each of micro-bumps 34 of the first type of said each of the semiconductor chips 100 may have its metal layer 32 formed with the electroplated copper layer having a thickness greater than that of the electroplated copper layer of the metal layer 32 of each of the micro-bumps 34 of the second type of the interposer 551.

For a second case, each of the semiconductor chips 100 as seen in FIG. 23J, 23K or 24N may have the micro-bumps 34 of the second type to be bonded to the first type of micro-bumps 34 of the interposer 551. For example, the second type of micro-bumps 34 of said each of the semiconductor chips 100 may have the electroplated metal layer 32, e.g. copper layer, to be bonded onto the solder caps 33 of the micro-bumps 34 of the first type of the interposer 551 into multiple bonded contacts 563 as seen in FIG. 25M or 26O, wherein each of micro-bumps 34 of the second type of said each of the semiconductor chips 100 may have its metal layer 32 formed with the electroplated copper layer having a thickness greater than that of the electroplated copper layer of the metal layer 32 of each of the micro-bumps 34 of the first type of the interposer 551.

For a third case, referring to FIG. 25L or 26N, each of the semiconductor chips 100 as seen in FIG. 23H, 23I, 24J-24M or 24O may have the micro-bumps 34 of the first type to be bonded to the first type of micro-bumps 34 of the interposer 551. For example, the first type of micro-bumps 34 of said each of the semiconductor chips 100 may have the solder bumps 33 to be bonded onto the solder caps 33 of the micro-bumps 34 of the first type of the interposer 551 into multiple bonded contacts 563 as seen in FIG. 25M or 26O, wherein each of micro-bumps 34 of the first type of said each of the semiconductor chips 100 may have its metal layer 32 formed with the electroplated copper layer having a thickness greater than that of the electroplated copper layer of the metal layer 32 of each of the micro-bumps 34 of the first type of the interposer 551.

In view of the logic drives 300 shown in FIGS. 19A-19N, each of the semiconductor chips 100 may be one of the standard commodity FPGA IC chips 200, DPIIC chips 410, NVM IC chips 250, HBM IC chips 251, dedicated I/O chips 265, PCIC chips 269 (such as CPU chips, GPU chips, TPU chips or APU chips), DRAM IC chips 321, dedicated control chips 260, dedicated control and I/O chips 266, IAC chips 402, DCIAC chips 267 and DCDI/OIAC chips 268. For example, the two semiconductor chips 100 shown in FIG. 25L or 26N may be the standard commodity FPGA IC chip 200 and the GPU chip 269 arranged respectively from left to right. For example, the two semiconductor chips 100 shown in FIG. 25L or 26N may be the standard commodity FPGA IC chip 200 and the CPU chip 269 arranged respectively from left to right. For example, the two semiconductor chips 100 shown in FIG. 25L or 26N may be the standard commodity FPGA IC chip 200 and the dedicated control chip 260 arranged respectively from left to right. For example, the two semiconductor chips 100 shown in FIG. 25L or 26N may be two of the standard commodity FPGA IC chips 200 respectively. For example, the two semiconductor chips 100 shown in FIG. 25L or 26N may be the standard commodity FPGA IC chip 200 and the NVM IC chip 250 arranged respectively from left to right. For example, the two semiconductor chips 100 shown in FIG. 25L or 26N may be the standard commodity FPGA IC chip 200 and the DRAM IC chip 321 arranged respectively from left to right. For example, the two semiconductor chips 100 shown in FIG. 25L or 26N may be the standard commodity FPGA IC chip 200 and the HBM IC chip 251 arranged respectively from left to right.

Next, referring to FIG. 25M or 26O, an underfill 564, such as epoxy resins or compounds, may be filled into a gap between each of the semiconductor chips 100 and the interposer 551 by a dispensing method performed using a dispenser. The underfill 564 may then be cured at temperature equal to or above 100° C., 120° C., or 150° C.

Figure 25N:
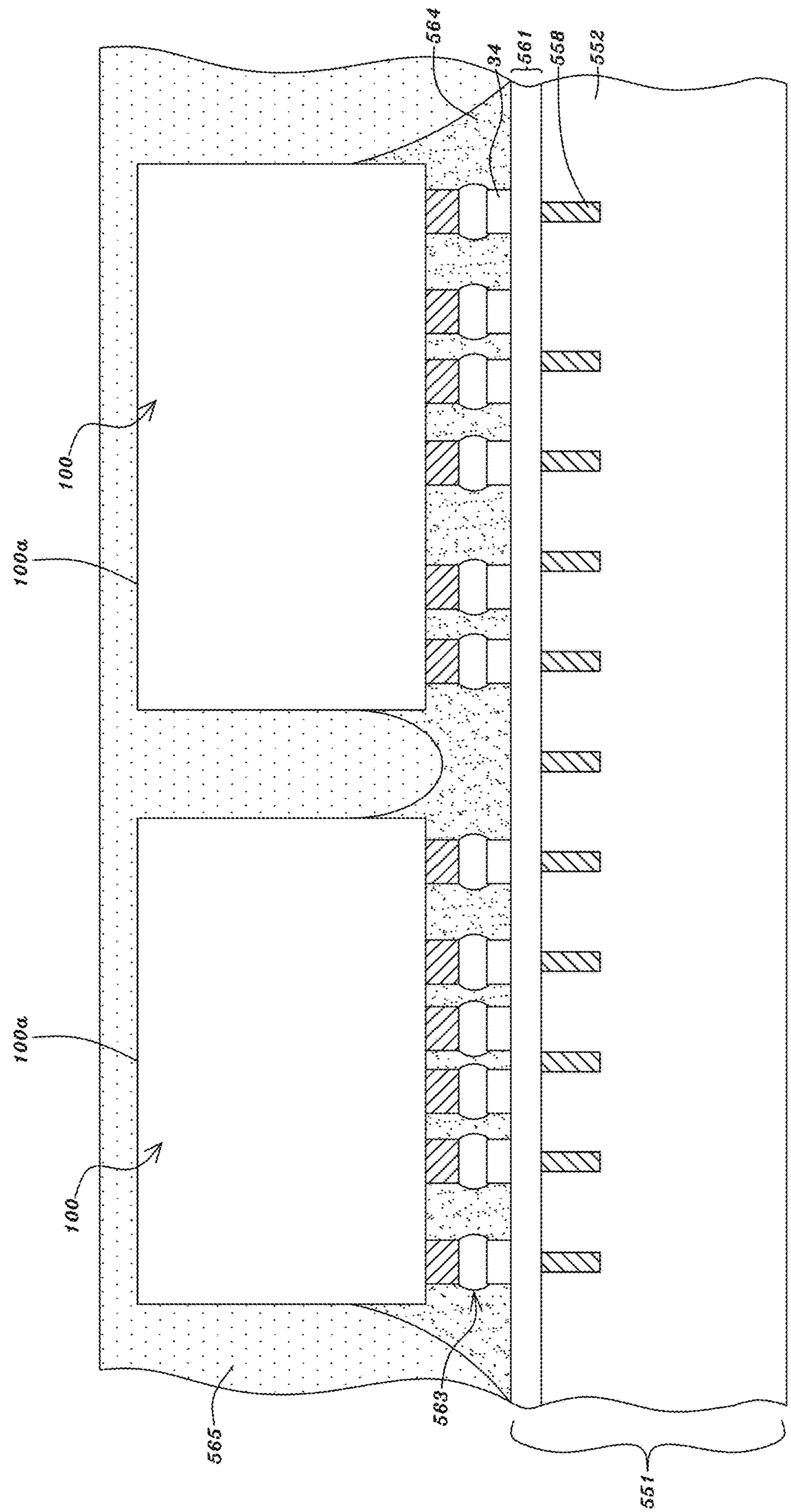
Figure 26P:
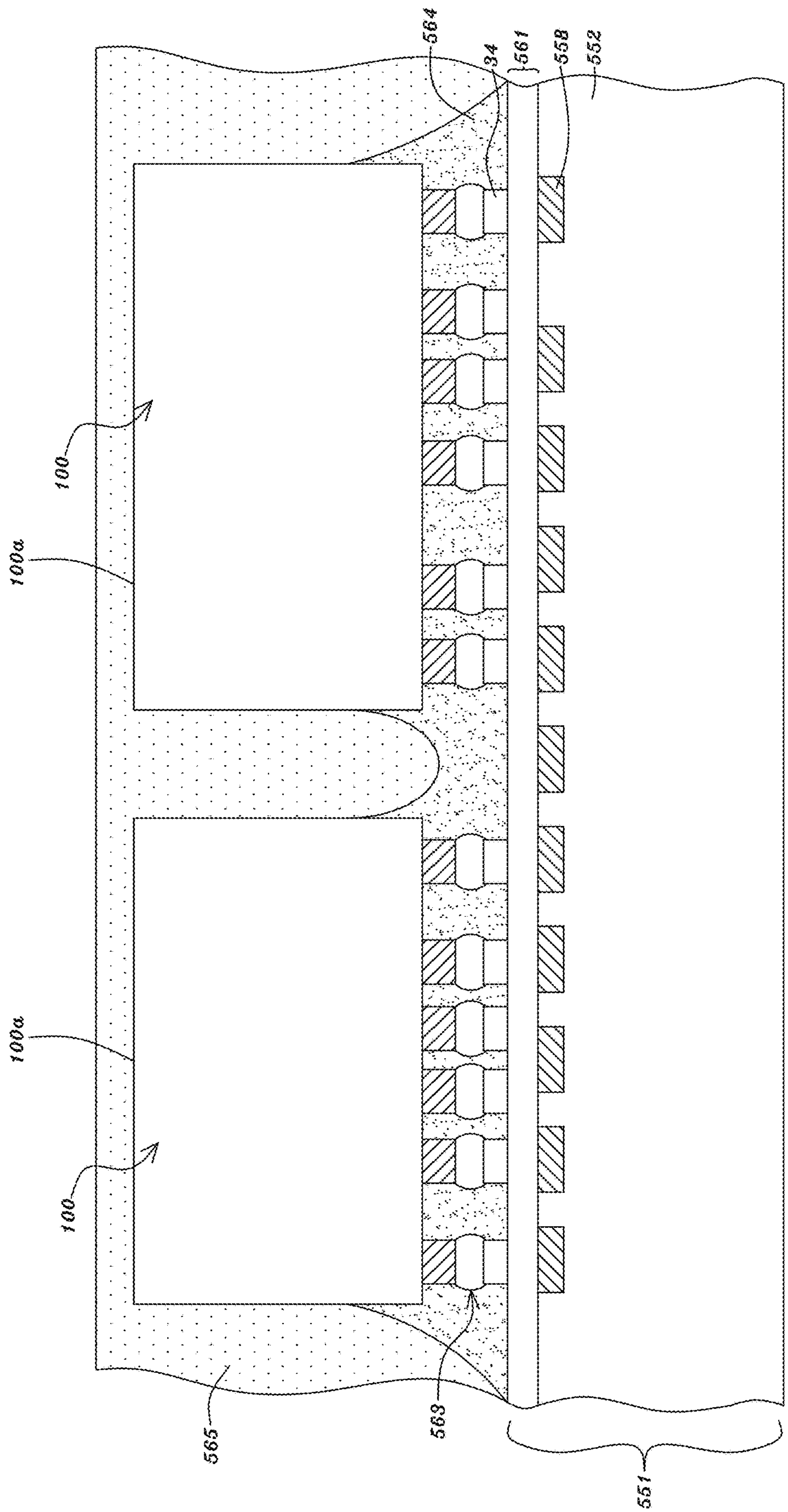

Next, referring to FIG. 25N following the step of FIG. 25M or FIG. 26P following the step of FIG. 26O, a polymer layer 565, e.g., resin or compound, may be applied to fill the gaps between the semiconductor chips 100 and cover the backsides 100*a* of the semiconductor chips 100 by methods, for example, spin-on coating, screen-printing, dispensing or molding in a wafer or panel format. For the molding method, a compress molding method (using top and bottom pieces of molds) or casting molding (using a dispenser) may be employed. The polymer layer 565 may be, for example, polyimide, BenzoCycloButene (BCB), parylene, epoxy-based material or compound, photo epoxy SU-8, elastomer, or silicone. For more elaboration, the polymer layer 565 may be, for example, photosensitive polyimide/PBO PIMEL™ supplied by Asahi Kasei Corporation, Japan, or epoxy-based molding compounds, resins or sealants provided by Nagase ChemteX Corporation, Japan. The polymer layer 565 may be then cured or cross-linked by raising a temperature to a certain temperature degree, for example, higher than or equal to 50° C., 70° C., 90° C., 100° C., 125° C., 150° C., 175° C., 200° C., 225° C., 250° C., 275° C. or 300° C.

Figure 25O:
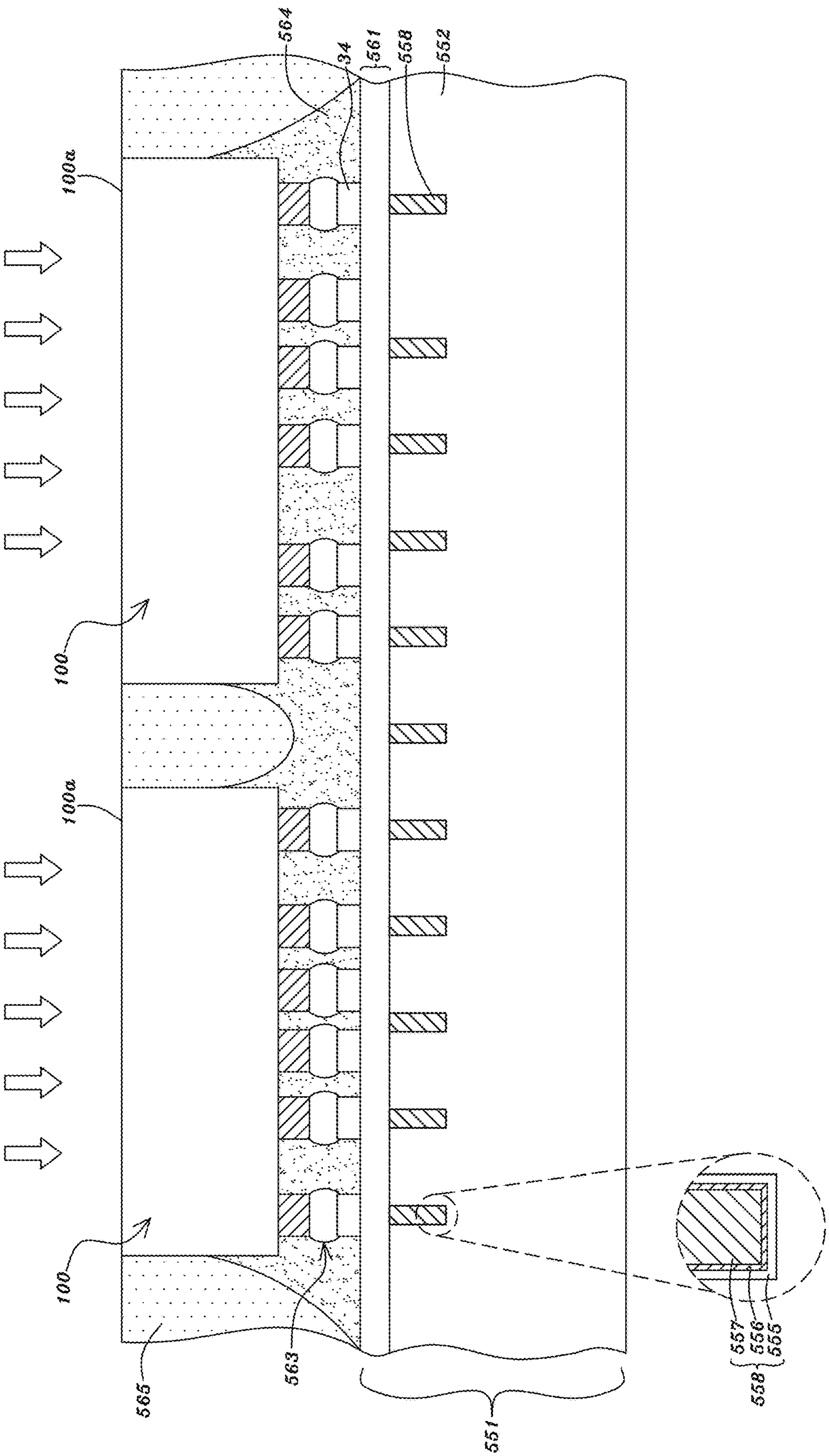
Figure 26Q:
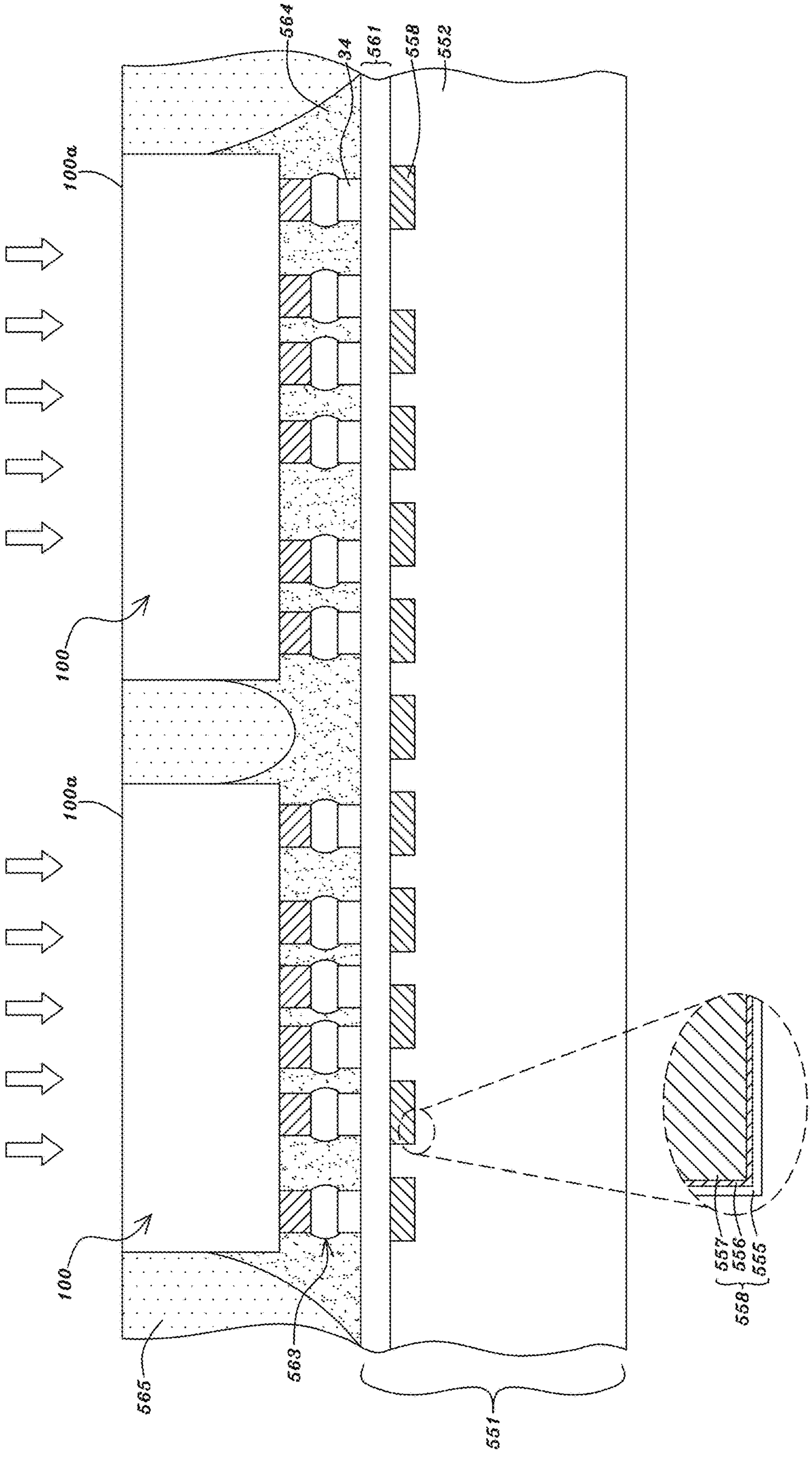

Next, referring to FIG. 25O following the step of FIG. 25N or FIG. 26Q following the step of FIG. 26P, a chemical mechanical polishing (CMP), polishing or grinding process may be applied to remove a top portion of the polymer layer 565 and top portions of the semiconductor chips 100 and to planarize a top surface of the polymer layer 565 until all of the backsides 100*a* of the semiconductor chips 100 are fully exposed or until the backside 100*a* of one of the semiconductor chips 100 is exposed.

Figure 25P:
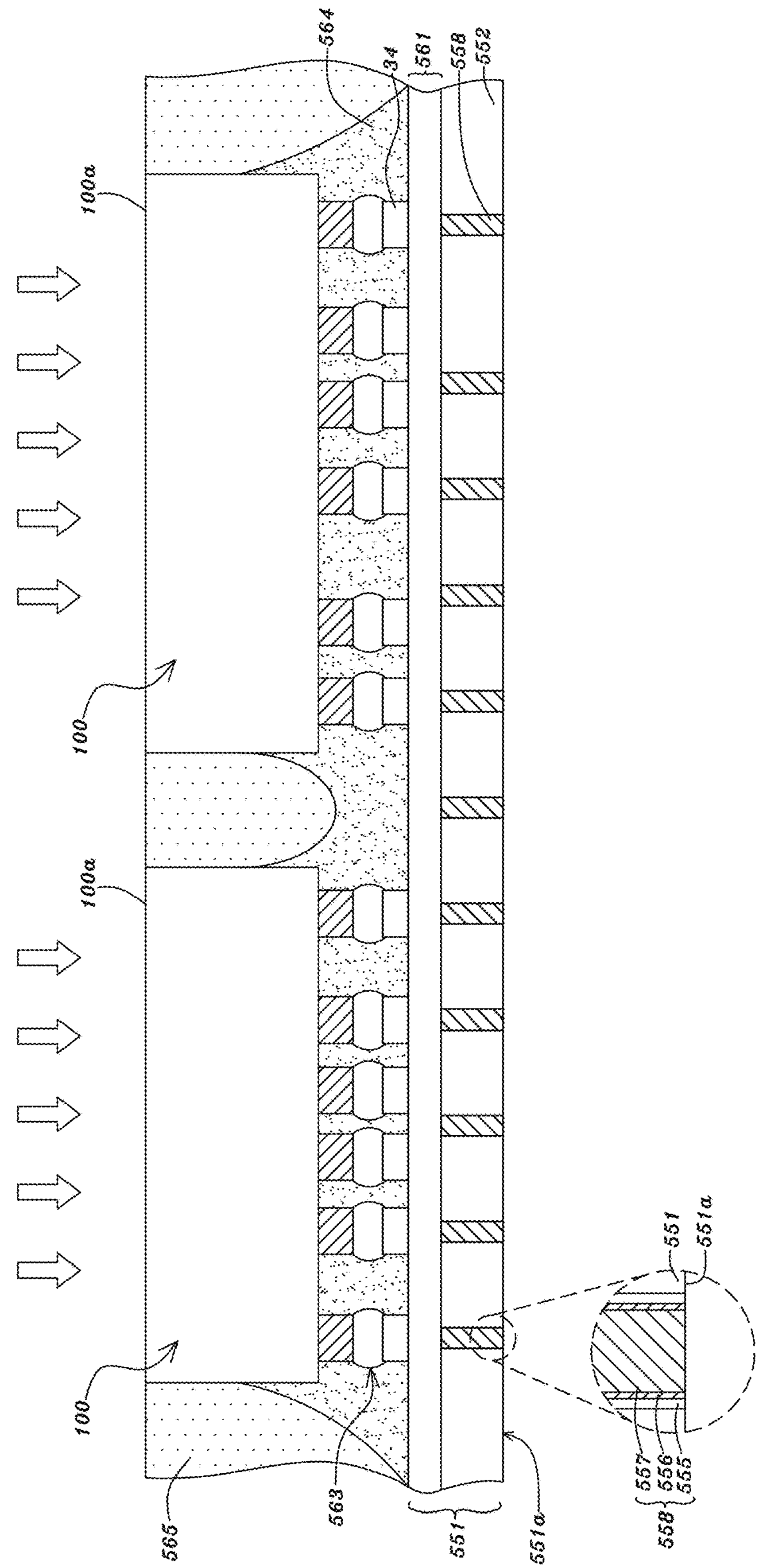
Figure 26R:
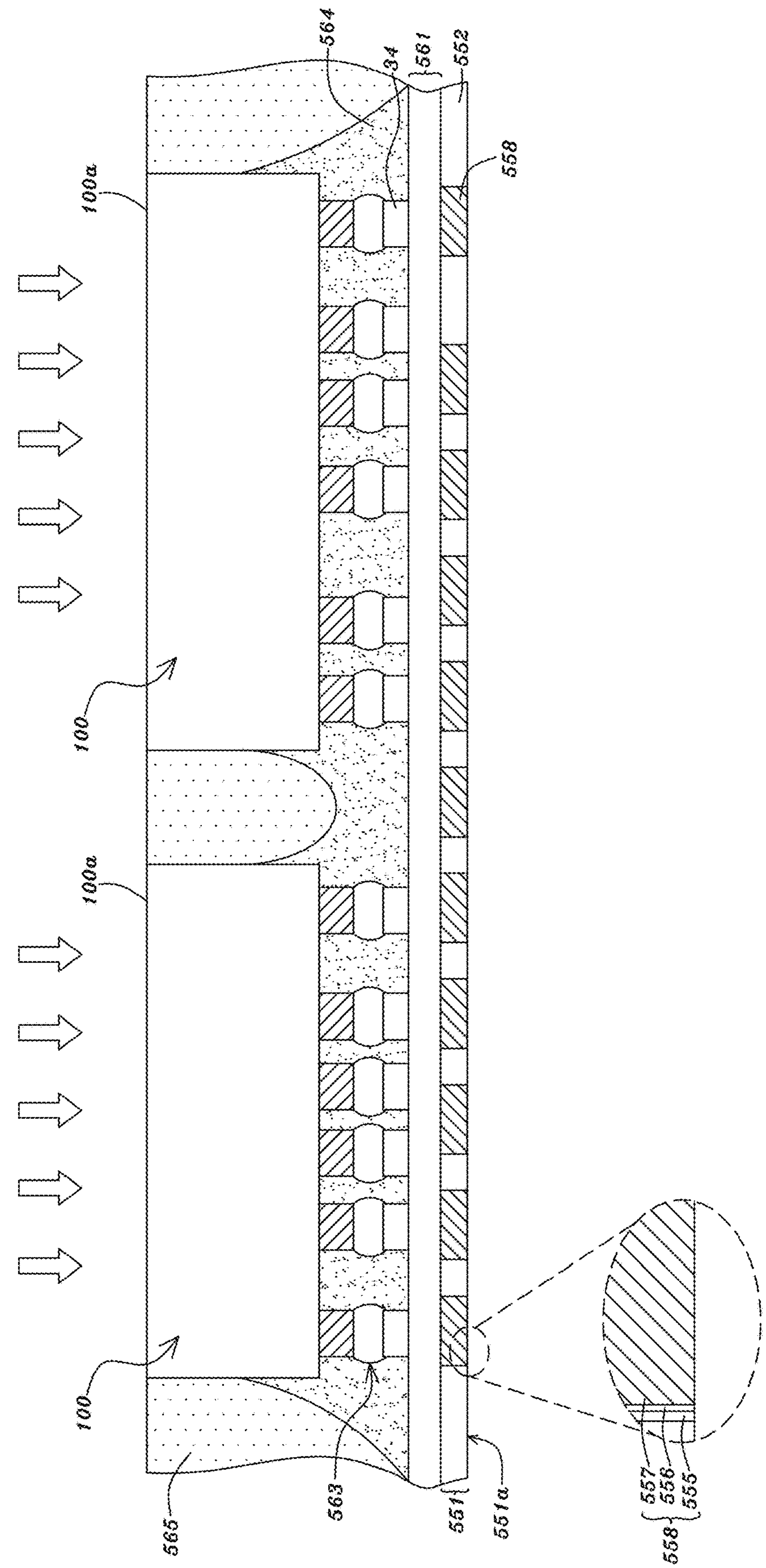

Next, referring to FIG. 25P following the step of FIG. 25O or FIG. 26R following the step of FIG. 26Q, the interposer 551 has a backside 551*a* to be polished by a CMP process or a wafer backside grinding process until each of the vias 558 is exposed, that is, its insulating layer 555 at its backside is removed into an insulating lining surrounding its adhesion/seed layer 556 and copper layer 557, and a backside of its copper layer 557 or a backside of the adhesion layer or electroplating seed layer of its adhesion/seed layer 556 is exposed.

Figure 25Q:
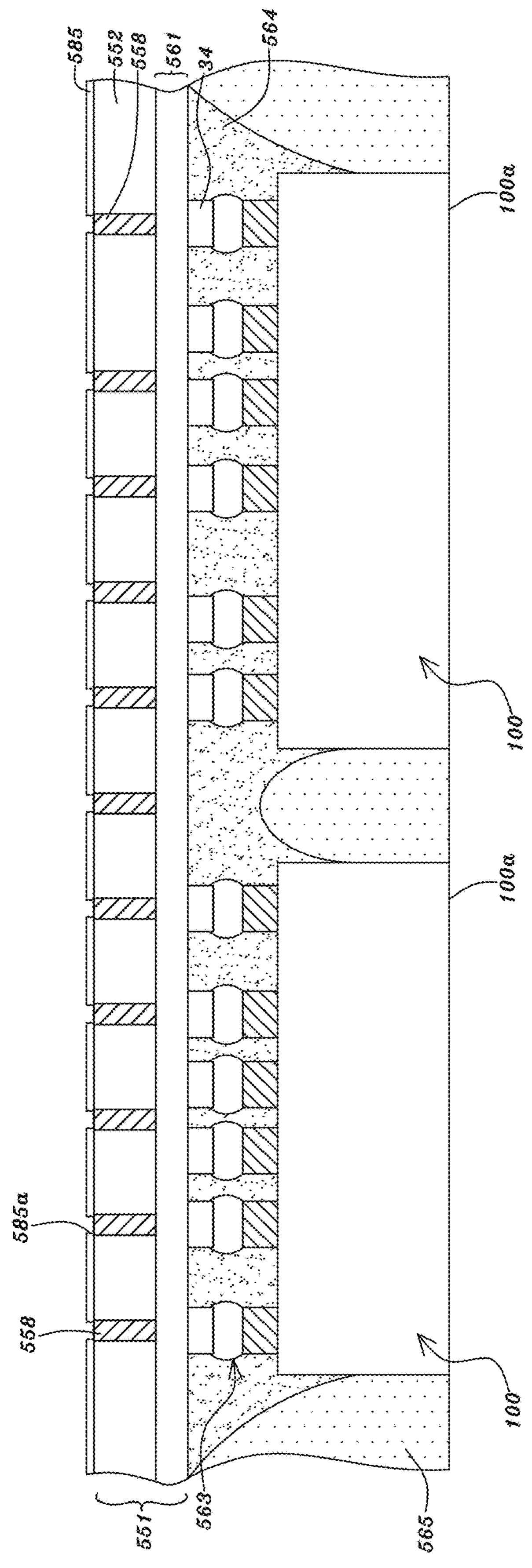

Referring to FIG. 25Q following the step of FIG. 25P, a polymer layer 585, i.e., insulating dielectric layer, may be formed on the backside 551*a* of the interposer 551 and the backsides of the vias 558 by a method of spin-on coating, screen-printing, dispensing or molding, and multiple openings 585*a* in the polymer layer 585 may be formed over the vias 558 to be exposed by the openings 585*a*. The polymer layer 585 may contain, for example, polyimide, BenzoCycloButene (BCB), parylene, epoxy-based material or compound, photo epoxy SU-8, elastomer or silicone. The polymer layer 585 may comprise organic material, for example, a polymer, or materials or compounds comprising carbon. The polymer layer 585 may be photosensitive, and may be used as photoresist as well for patterning multiple openings 585*a* therein to expose the vias 558. That is, the polymer layer 585 may be coated, exposed to light through a photomask, and then developed to form the openings 585*a* therein. The openings 585*a* in the polymer layer 585 overlap the top surfaces of the vias 558 respectively to be exposed by the openings 585*a*. In some applications or designs, the size or transverse largest dimension of one of the openings 585*a* in the polymer layer 585 may be smaller than that of the area of the backside of one of the vias 558 under said one of the openings 585*a*. In other applications or designs, the size or transverse largest dimension of one of the openings 585*a* in the polymer layer 585 may be greater than that of the area of the backside of one of the vias 558 under said one of the openings 585*a*. Next, the polymer layer 585, i.e., insulating dielectric layer, is cured at a temperature, for example, equal to or higher than 100° C., 125° C., 150° C., 175° C., 200° C., 225° C., 250° C., 275° C. or 300° C. The polymer layer 585 has a thickness between 3 and 30 micrometers or between 5 and 15 micrometers. The polymer layer 585 may be added with some dielectric particles or glass fibers. The material of the polymer layer 585 and the process for forming the same may be referred to that of the polymer layer 36 and the process for forming the same as illustrated in FIG. 23I.

Metal Bumps at Backside of Interposer for Multi-Chip-On-Interposer (COIP) Flip-chip Packaging Method Next, multiple metal pads, pillars or bumps may be formed on a backside of the interposer 551, as seen in FIGS. 25R-25V. FIGS. 25R-25V are schematically cross-sectional views showing a process for forming metal pads, pillars or bumps on vias in an interposer in accordance with an embodiment of the present application.

Figure 25R:
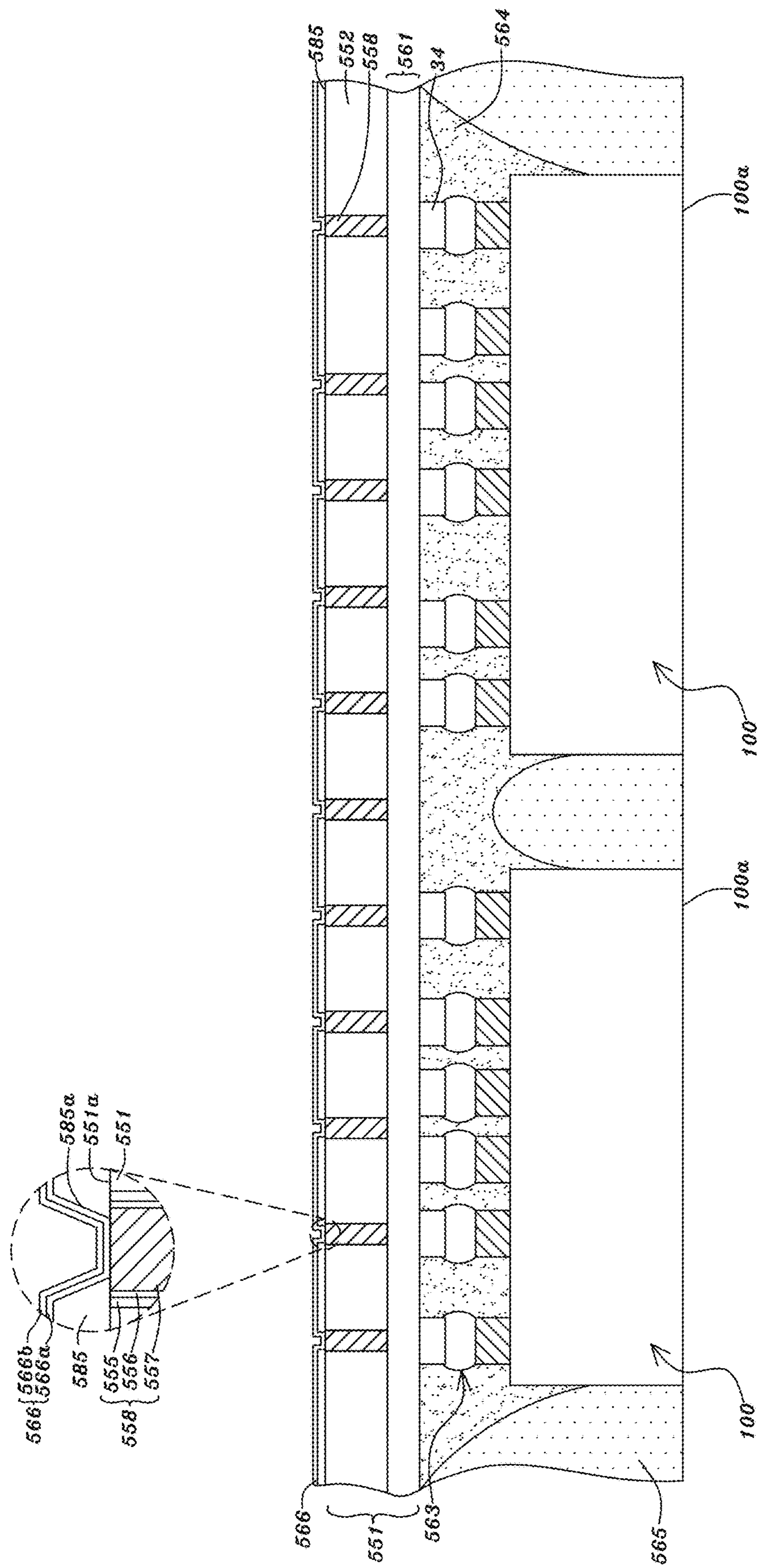

Referring to FIG. 25R, an adhesion/seed layer 566 is formed on the polymer layer 585 and on the backside of the vias 558. With regard to the adhesion/seed layer 566, an adhesion layer 566*a* having a thickness of between 0.001 and 0.7 μm, between 0.01 and 0.5 μm or between 0.03 and 0.35 μm may be first sputtered on the polymer layer 585 and on the copper layer 557, or the adhesion layer or electroplating seed layer of the adhesion/seed layer 556, at the backsides of the vias 558. With regard to the adhesion/seed layer 566, the material of its adhesion layer 566*a* may include titanium, a titanium-tungsten alloy, titanium nitride, chromium, titanium-tungsten-alloy layer, tantalum nitride, or a composite of the abovementioned materials. The adhesion layer 566*a* may be formed by an atomic-layer-deposition (ALD) process, chemical vapor deposition (CVD) process or evaporation process. For example, its adhesion layer 566*a* may be formed by sputtering or CVD depositing a titanium (Ti) or titanium nitride (TiN) layer (with a thickness, for example, between 1 nm and 200 nm or between 5 nm and 50 nm) on the polymer layer 585 and on the copper layer 557, or the adhesion layer or electroplating seed layer of the adhesion/seed layer 556, at the backsides of the vias 558.

Next, with regard to the adhesion/seed layer 566, an electroplating seed layer 566*b* having a thickness of between 0.001 and 1 μm, between 0.03 and 2 μm or between 0.05 and 0.5 μm may be sputtered on a whole top surface of its adhesion layer 566*a*. Alternatively, the electroplating seed layer 566*b* may be formed by an atomic-layer-deposition (ALD) process, chemical-vapor-deposition (CVD) process, vapor deposition method, electroless plating method or PVD (Physical Vapor Deposition) method. The electroplating seed layer 566*b* is beneficial to electroplating a metal layer thereon. Thus, the material of the electroplating seed layer 566*b* varies with the material of a metal layer to be electroplated on the electroplating seed layer 566*b*. When a copper layer, for a first type of metal bumps 570 to be formed in the following steps, is to be electroplated on the electroplating seed layer 566*b*, copper is a preferable material to the electroplating seed layer 566*b*. When a copper barrier layer, for multiple metal pads 571 to be formed in the following steps or for a second type of metal bumps 570 to be formed in the following steps, is to be electroplated on the electroplating seed layer 566*b*, copper is a preferable material to the electroplating seed layer 566*b*. When a gold layer, for a third type of metal bumps 570 to be formed in the following steps, is to be electroplated on the electroplating seed layer 566*b*, gold is a preferable material to the electroplating seed layer 566*b*. For example, the electroplating seed layer 566*b*, for the metal pads 571 or first or second type of metal bumps 570 to be formed in the following steps, may be deposited on or over the adhesion layer 566*a* by, for example, sputtering or CVD depositing a copper seed layer (with a thickness between, for example, 3 nm and 400 nm or 10 nm and 200 nm) on the adhesion layer 566*a*. The electroplating seed layer 566*b*, for the third type of metal bumps 570 to be formed in the following steps, may be deposited on or over the adhesion layer 566*a* by, for example, sputtering or CVD depositing a gold seed layer (with a thickness between, for example, 1 nm and 300 nm or 1 nm and 50 nm) on the adhesion layer 566*a*. The adhesion layer 566*a* and electroplating seed layer 566*b* compose the adhesion/seed layer 566 as seen in FIG. 25Q.

Next, referring to 18S, a photoresist layer 567, such as positive-type photoresist layer, having a thickness of between 5 and 500 μm is spin-on coated or laminated on the electroplating seed layer 566*b* of the adhesion/seed layer 566. The photoresist layer 567 is patterned with the processes of exposure, development, etc., to form multiple openings 567*a* in the photoresist layer 567 exposing the electroplating seed layer 566*b* of the adhesion/seed layer 566. A 1× stepper, 1× contact aligner or laser scanner may be used to expose the photoresist layer 567 with at least two of G-line having a wavelength ranging from 434 to 438 nm, H-line having a wavelength ranging from 403 to 407 nm, and I-line having a wavelength ranging from 363 to 367 nm, illuminating the photoresist layer 567, that is, G-line and H-line, G-line and I-line, H-line and I-line, or G-line, H-line and I-line illuminate the photoresist layer 567, then developing the exposed photoresist layer 567, and then removing the residual polymeric material or other contaminants on the electroplating seed layer 566*b* of the adhesion/seed layer 566 with an $O_2$ plasma or a plasma containing fluorine of below 200 PPM and oxygen, such that the photoresist layer 567 may be patterned with multiple openings 567*a* in the photoresist layer 567 exposing the electroplating seed layer 566*b* of the adhesion/seed layer 566 over the vias 558.

Figure 25S:
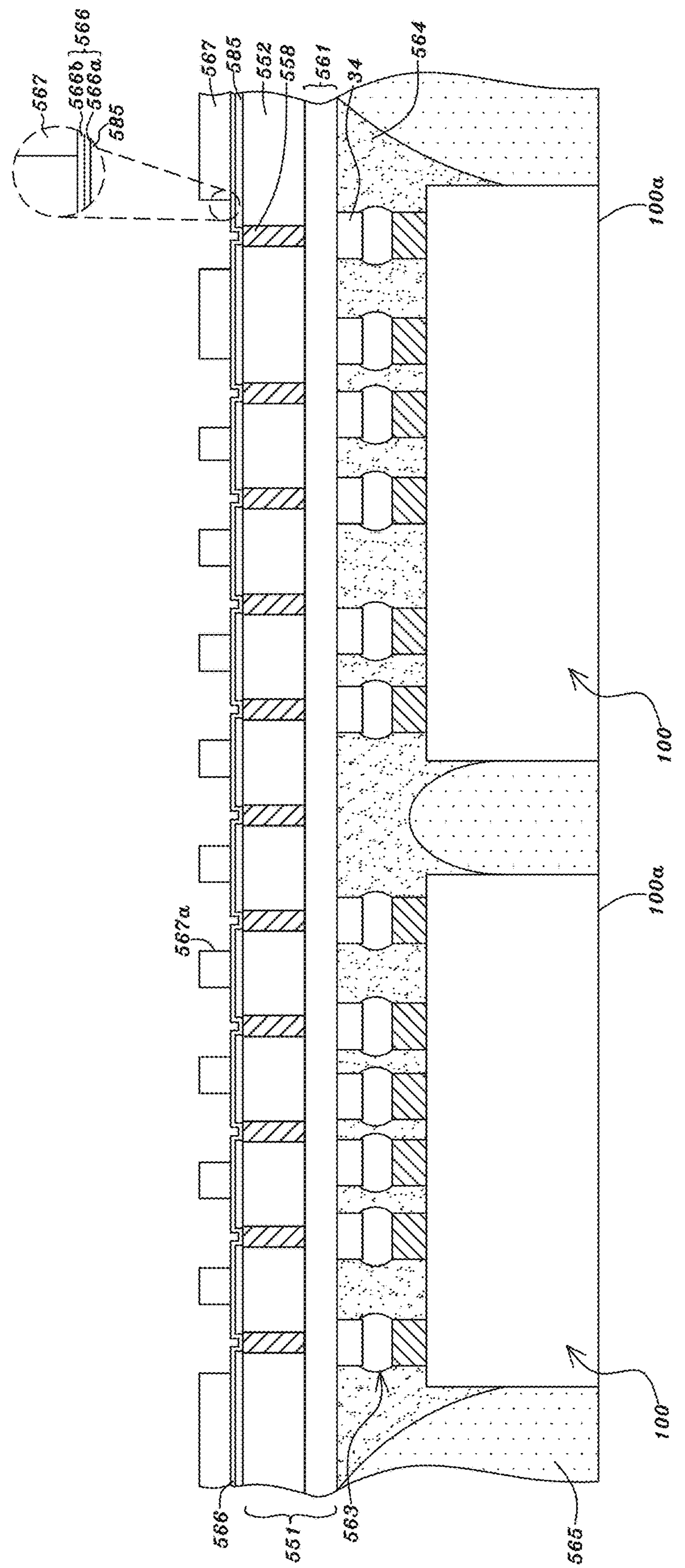

Referring to FIG. 25S, one of the openings 567*a* in the photoresist layer 567 may overlap one of the openings 585*a* in the polymer layer 585 for forming one of metal pads or bumps by following processes to be performed later, exposing the electroplating seed layer 566*b* of the adhesion/seed layer 566 at the bottom of said one of the openings 567*a*, and may extend out of said one of the openings 585*a* to an area or ring of the polymer layer 585 around said one of the openings 585*a*.

Figure 25T:
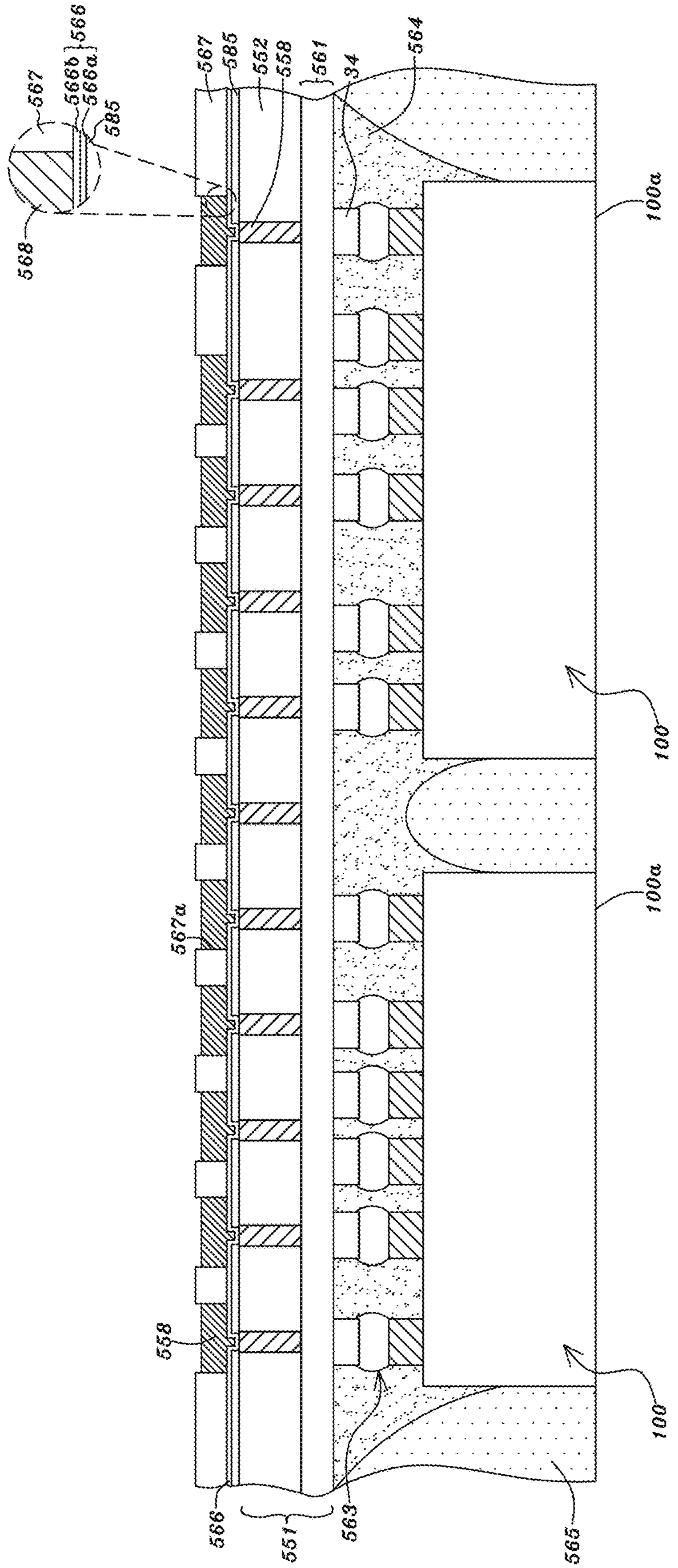

Referring to FIG. 25T, a metal layer 568 is electroplated on the electroplating seed layer 566*b* of the adhesion/seed layer 566 exposed by the openings 567*a*. For forming multiple metal pads, the metal layer 568 may be formed by electroplating a copper barrier layer, such as nickel layer, with a thickness, for example, between 1 μm and 50 μm, 1 μm and 40 μm, 1 μm and 30 μm, 1 μm and 20 μm, 1 μm and 10 μm, 1 μm and 5 μm or 1 μm and 3 μm on the electroplating seed layer 566*b*, made of copper, exposed by the openings 567*a*.

Figure 25U:
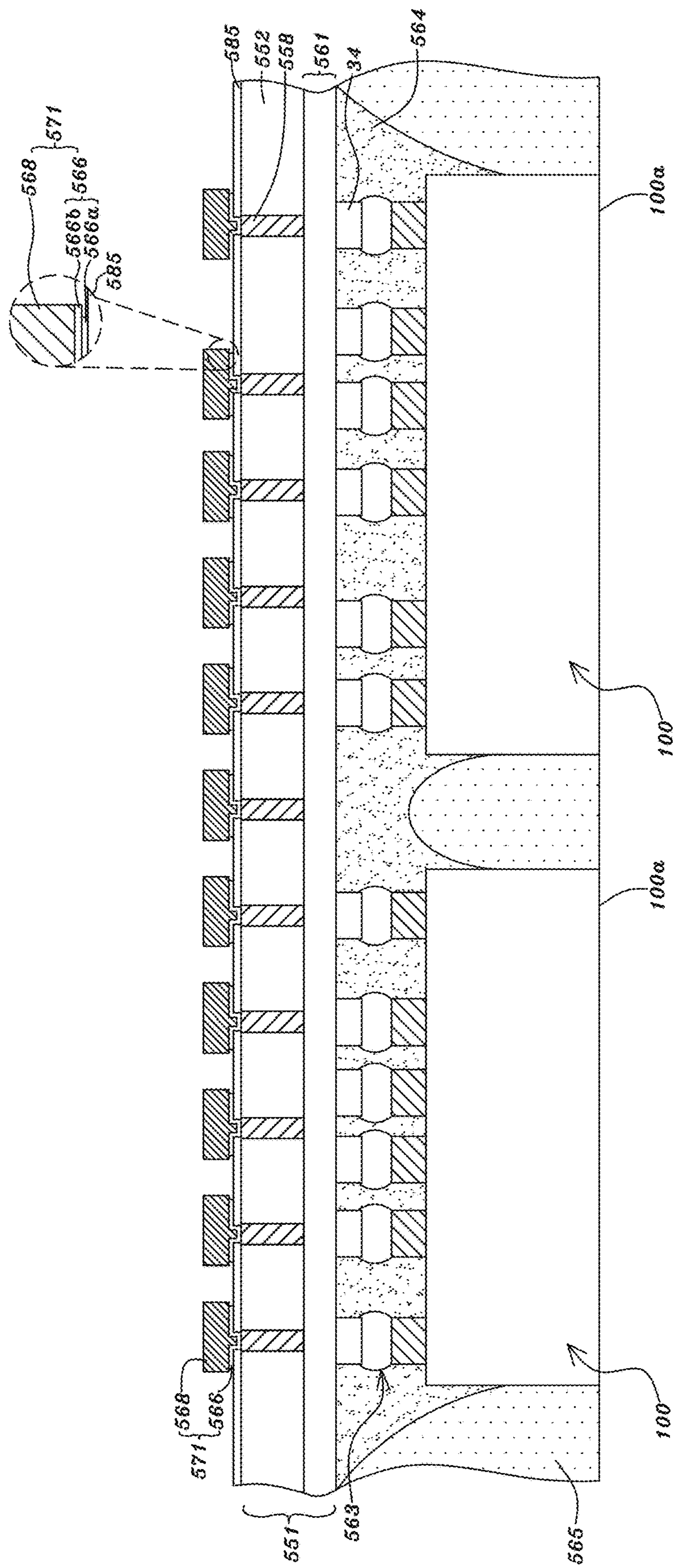

Referring to FIG. 25U, after the metal layer 568 is formed, most of the photoresist layer 567 may be removed and then the adhesion/seed layer 566 not under the metal layer 568 may be etched. The removing and etching processes may be referred respectively to the processes for removing the photoresist layer 30 and etching the electroplating seed layer 28 and adhesion layer 26 as illustrated in FIG. 23F. Thereby, the adhesion/seed layer 566 and electroplated metal layer 568 may be patterned to form multiple metal pads 571 on the vias 558 and on the polymer layer 585. Each of the metal pads 571 may be composed of the adhesion/seed layer 566 and the electroplated metal layer 568 on the electroplating seed layer 566*b* of the adhesion/seed layer 566.

Figure 25V:
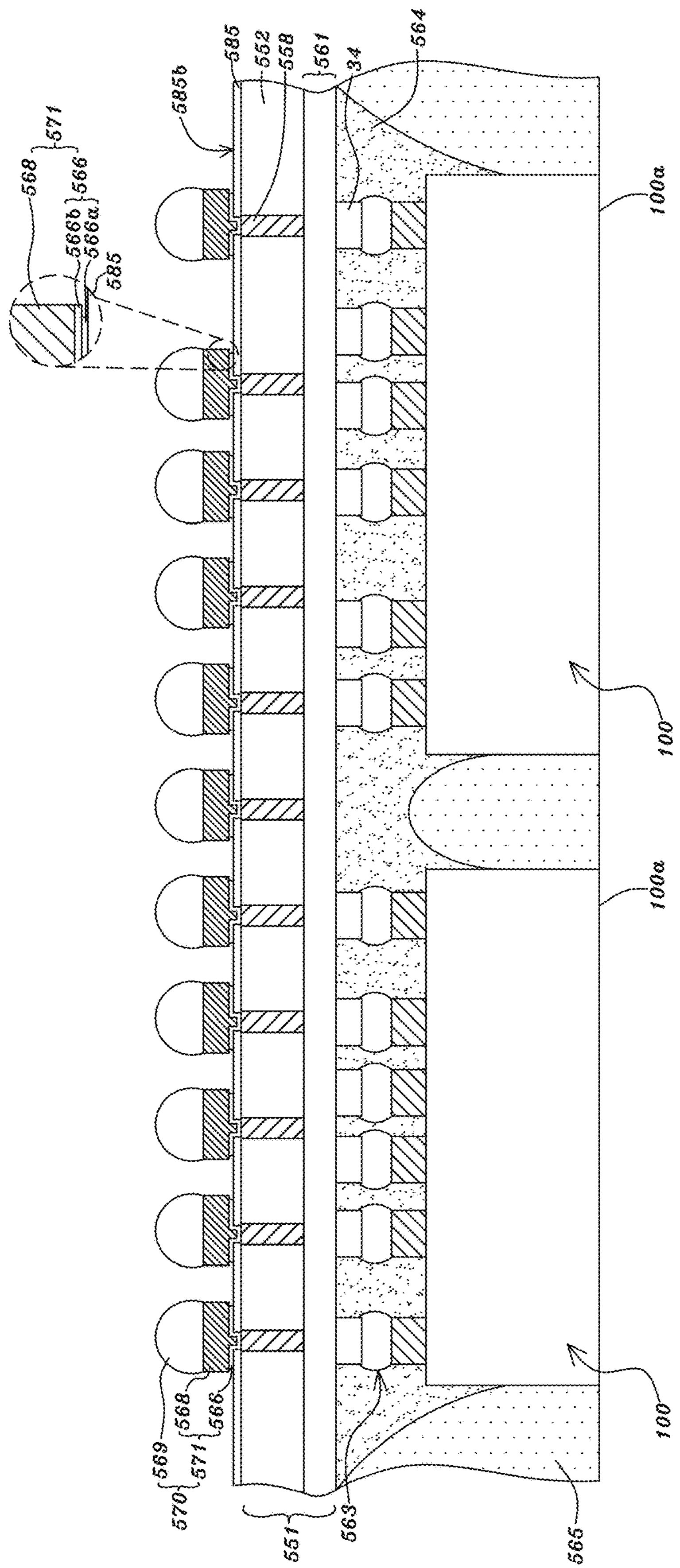

Next, referring to FIG. 25V, multiple solder bumps 569 may be formed on the metal pads 571 by a screen printing method or a solder-ball mounting method, and then by a solder reflow process. The solder bumps 569 may be a lead-free solder containing tin, copper, silver, bismuth, indium, zinc, antimony, and/or traces of other metals, for example, Sn—Ag—Cu (SAC) solder, Sn—Ag solder, or Sn—Ag—Cu—Zn solder. The solder bumps 569 and metal pads 571 may compose a fourth type of metal bumps 570. One of the metal bumps 570 of the fourth type are used for connecting or coupling one of the semiconductor chips 100, such as the dedicated I/O chip 265 as seen in FIGS. 19A-19N, of the logic drive 300 to the external circuits or components outside of the logic drive 300 through one of the bonded contacts 563, the interconnection metal layers 27 and/or 6 of the SISIP 588 and/or FISIP 560 of the interconnection scheme 561 of the interposer 551 and one of the vias 558 of the interposer 551 in sequence. Each of the metal bumps 570 of the fourth type may have a height, protruding from a backside surface of the interposer 551 or a backside surface 585*b* of the polymer layer 585, between 5 μm and 150 μm, between 5 μm and 120 μm, between 10 μm and 100 μm, between 10 μm and 60 μm, between 10 μm and 40 μm or between 10 μm and 30 μm, or greater or taller than or equal to 75 μm, 50 μm, 30 μm, 20 μm, 15 μm or 10 μm, for example, and a largest dimension in cross-sections, such as a diameter of a circle shape or a diagonal length of a square or rectangle shape, between 5 μm and 200 μm, between 5 μm and 150 μm, between 5 μm and 120 μm, between 10 μm and 100 μm, between 10 μm and 60 μm, between 10 μm and 40 μm, or between 10 μm and 30 μm, or greater than or equal to 100 μm, 60 μm, 50 μm, 40 μm, 30 μm, 20 μm, 15 μm or 10 μm, for example. The smallest space from one of the solder bumps 569 to its nearest neighboring one of the solder bumps 569 is, for example, between 5 μm and 150 μm, between 5 μm and 120 μm, between 10 μm and 100 μm, between 10 μm and 60 μm, between 10 μm and 40 μm, or between 10 μm and 30 μm, or greater than or equal to 60 μm, 50 μm, 40 μm, 30 μm, 20 μm, 15 μm or 10 μm.

Alternatively, for the first type of metal pillars or bumps 570, the metal layer 568 as seen in FIG. 25T may be formed by electroplating a copper layer with a thickness of between 5 μm and 120 μm, 10 μm and 100 μm, 10 μm and 60 μm, 10 μm and 40 μm, or 10 μm and 30 μm on the electroplating seed layer 566*b*, made of copper, exposed by the openings 567*a*.

Referring to FIG. 25U, after the metal layer 568 is formed, most of the photoresist layer 567 may be removed and then the adhesion/seed layer 566 not under the metal layer 568 may be etched. The removing and etching processes may be referred respectively to the processes for removing the photoresist layer 30 and etching the electroplating seed layer 28 and adhesion layer 26 as illustrated in FIG. 23F. Thereby, the adhesion/seed layer 566 and electroplated metal layer 568 may be patterned to form the first type of metal bumps 570 on the vias 558 and on the polymer layer 585. Each of the metal pillars or bumps 570 of the first type may be composed of the adhesion/seed layer 566 and the electroplated metal layer 568 on the adhesion/seed layer 566.

The first type of metal pillars or bumps 570 may have a height, protruding from a backside surface of the interposer 551 or a backside surface 585*b* of the polymer layer 585, between 5 μm and 120 μm, 10 μm and 100 μm, 10 μm and 60 μm, 10 μm and 40 μm or 10 μm and 30 μm, or greater or taller than or equal to 50 μm, 30 μm, 20 μm, 15 μm, or 5 μm, and a largest dimension in a cross-section (for example, the diameter of a circle shape or the diagonal length of a square or rectangle shape), for example, between 5 μm and 120 μm, 10 μm and 100 μm, 10 μm and 60 μm, 10 μm and 40 μm or 10 μm and 30 μm, or greater than or equal to 60 μm, 50 μm, 40 μm, 30 μm, 20 μm, 15 μm or 10 μm. The smallest space between neighboring two of the metal pillars or bumps 570 of the first type may be, for example, between 5 μm and 120 μm, 10 μm and 100 μm, 10 μm and 60 μm, 10 μm and 40 μm or 10 μm and 30 μm, or greater than or equal to 60 μm, 50 μm, 40 μm, 30 μm, 20 μm, 15 μm or 10 μm.

Alternatively, for a second type of metal pillars or bumps 570, the metal layer 568 as seen in FIG. 25T may be formed by electroplating a copper barrier layer, such as nickel layer, with a thickness, for example, between 1 μm and 50 μm, 1 μm and 40 μm, 1 μm and 30 μm, 1 μm and 20 μm, 1 μm and 10 μm, 1 μm and 5 μm or 1 μm and 3 μm on the electroplating seed layer 566*b*, made of copper, exposed by the openings 657*a*, and then electroplating a solder layer with a thickness, for example, between 1 μm and 150 μm, 1 μm and 120 μm, 5 μm and 120 μm, 5 μm and 100 μm, 5 μm and 75 μm, 5 μm and 50 μm, 5 μm and 40 μm, 5 μm and 30 μm, 5 μm and 20 μm, 5 μm and 10 μm, 1 μm and 5 μm, or 1 μm and 3 μm on the copper barrier layer in the openings 657*a*. The solder layer may be a lead-free solder containing tin, copper, silver, bismuth, indium, zinc, antimony, and/or traces of other metals, for example, Sn—Ag—Cu (SAC) solder, Sn—Ag solder, or Sn—Ag—Cu—Zn solder. Furthermore, after most of the photoresist layer 567 is removed and the adhesion/seed layer 566 not under the metal layer 568 is etched as seen in FIG. 25U, a reflow process may be performed to reflow the solder layer into multiple solder balls or bumps in a circular shape for the second type of metal bumps. Thereby, each of the metal pillars or bumps 570 of the second type formed on one of the vias 558 and on the polymer layer 585 may be composed of the adhesion/seed layer 566, the copper barrier layer on the adhesion/seed layer 566 and one of the solder balls or bumps on the copper barrier layer.

The second type of metal pillars or bumps 570 may have a height, protruding from a backside surface of the interposer 551 or a backside surface 585*b* of the polymer layer 585, between 5 μm and 150 μm, 5 μm and 120 μm, 10 μm and 100 μm, 10 μm and 60 μm, 10 μm and 40 μm, or 10 μm and 30 μm, or greater or taller than or equal to 75 μm, 50 μm, 30 μm, 20 μm, 15 μm, or 10 μm and a largest dimension in a cross-section (for example, the diameter of a circle shape or the diagonal length of a square or rectangle shape), for example, between 5 μm and 200 μm, 5 μm and 150 μm, 5 μm and 120 μm, 10 μm and 100 μm, 10 μm and 60 μm, 10 μm and 40 μm, or 10 μm and 30 μm, or greater than or equal to 100 μm, 60 μm, 50 μm, 40 μm, 30 μm, 20 μm, 15 μm, or 10 μm. The smallest space between neighboring two of the metal pillars or bumps 570 of the second type may be, for example, between 5 μm and 150 μm, 5 μm and 120 μm, 10 μm and 100 μm, 10 μm and 60 μm, 10 μm and 40 μm, or 10 μm and 30 μm, or greater than or equal to 60 μm, 50 μm, 40 μm, 30 μm, 20 μm, 15 μm or 10 μm.

Alternatively, for a third type of metal pillars or bumps 570, the electroplating seed layer 566*b* as illustrated in FIG. 25R may be formed by sputtering or CVD depositing a gold seed layer (with a thickness, for example, between 1 nm and 300 nm, or 1 nm and 100 nm) on the adhesion layer 566*a* as illustrated in FIG. 25R. The adhesion layer 566*a* and electroplating seed layer 566*b* compose the adhesion/seed layer 566 as seen in FIG. 25R. The metal layer 568, as seen in FIG. 25T, may be formed by electroplating a gold layer with a thickness, for example, between 3 μm and 40 μm, 3 μm and 30 μm, 3 μm and 20 μm, 3 μm and 15 μm, or 3 μm and 10 μm on the electroplating seed layer 566*b*, made of gold, exposed by the openings 567*a*. Next, most of the photoresist layer 567 may be removed and then the adhesion/seed layer 566 not under the metal layer 568 may be etched to form the third type of metal bumps on the vias 558 and on the polymer layer 585. Each of the metal pillars or bumps 570 of the third type may be composed of the adhesion/seed layer 566 and the electroplated gold layer 568 on the adhesion/seed layer 566.

The third type of metal pillars or bumps 570 may have a height, protruding from a backside surface of the interposer 551 or a backside surface 585*b* of the polymer layer 585, between 3 μm and 40 μm, 3 μm and 30 μm, 3 μm and 20 μm, 3 μm and 15 μm, or 3 μm and 10 μm, or smaller or shorter than or equal to 40 μm, 30 μm, 20 μm, 15 μm, or 10 μm and a largest dimension in a cross-section (for example, the diameter of a circle shape or the diagonal length of a square or rectangle shape), for example, between 3 μm and 40 μm, 3 μm and 30 μm, 3 μm and 20 μm, 3 μm and 15 μm, or 3 μm and 10 μm, or smaller than or equal to 40 μm, 30 μm, 20 μm, 15 μm, or 10 μm. The smallest space between neighboring two of the metal pillars or bumps 570 of the third type may be, for example, between 3 μm and 40 μm, 3 μm and 30 μm, 3 μm and 20 μm, 3 μm and 15 μm, or 3 μm and 10 μm, or smaller than or equal to 40 μm, 30 μm, 20 μm, 15 μm, or 10 μm.

One of the metal bumps of the first, second or third type may be used for connecting or coupling one of the semiconductor chips 100, such as the dedicated I/O chip 265 as seen in FIGS. 19A-19N, of the logic drive 300 to the external circuits or components outside of the logic drive 300 through one of the bonded contacts 563, the interconnection metal layers 27 and/or 6 of the SISIP 588 and/or FISIP 560 of the interconnection scheme 561 of the interposer 551 and one of the vias 558 of the interposer 551 in sequence.

Figure 26S:
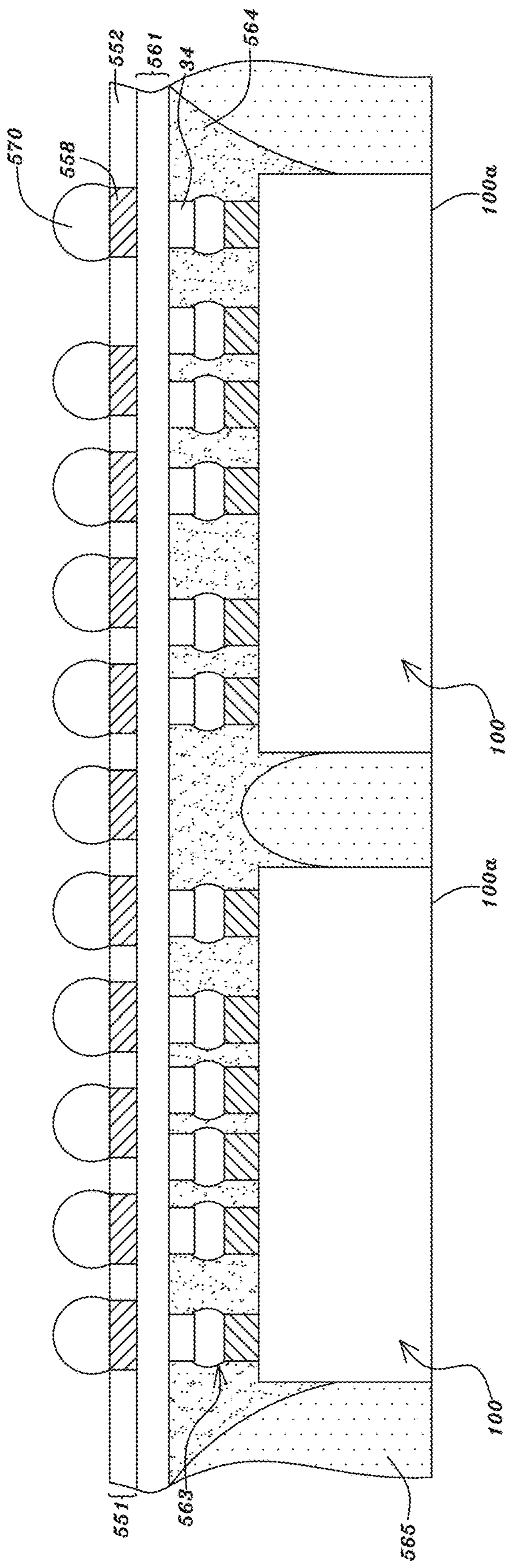

Besides, FIG. 26S is a schematically cross-sectional view showing a process for forming metal pillars or bumps on backsides of vias of a second type in an interposer in accordance with an embodiment of the present application. Referring to FIG. 26S following the step of FIG. 26R, multiple solder bumps may be formed into a fifth type of metal bumps 570 on the backside surfaces of the vias 558 by a screen printing method or a solder-ball mounting method, and then by a solder reflow process. The material used for forming the solder bumps for the fifth type of metal bumps 570 may be a lead-free solder containing tin, copper, silver, bismuth, indium, zinc, antimony, and/or traces of other metals, for example, Sn—Ag—Cu (SAC) solder, Sn—Ag solder, or Sn—Ag—Cu—Zn solder. One of the metal bumps 570 of the fifth type may be used for connecting or coupling one of the semiconductor chips 100, such as the dedicated I/O chip 265 as seen in FIGS. 19A-19N, of the logic drive 300 to the external circuits or components outside of the logic drive 300 through one of the bonded contacts 563, the interconnection metal layers 27 and/or 6 of the SISIP 588 and/or FISIP 560 of the interconnection scheme 561 of the interposer 551 and one of the vias 558 of the interposer 551 in sequence. Each of the metal bumps 570 of the fifth type may have a height, from a backside surface of the interposer 551, between 5 μm and 150 μm, between 5 μm and 120 μm, between 10 μm and 100 μm, between 10 μm and 60 μm, between 10 μm and 40 μm or between 10 μm and 30 μm, or greater or taller than or equal to 75 μm, 50 μm, 30 μm, 20 μm, 15 μm or 10 μm, for example, and a largest dimension in cross-sections, such as a diameter of a circle shape or a diagonal length of a square or rectangle shape, between 5 μm and 200 μm, between 5 μm and 150 μm, between 5 μm and 120 μm, between 10 μm and 100 μm, between 10 μm and 60 μm, between 10 μm and 40 μm, or between 10 μm and 30 μm, or greater than or equal to 100 μm, 60 μm, 50 μm, 40 μm, 30 μm, 20 μm, 15 μm or 10 μm, for example. The smallest space from one of the metal bumps 570 of the fifth type to its nearest neighboring one of the metal bumps 570 of the fifth type is, for example, between 5 μm and 150 μm, between 5 μm and 120 μm, between 10 μm and 100 μm, between 10 μm and 60 μm, between 10 μm and 40 μm, or between 10 μm and 30 μm, or greater than or equal to 60 μm, 50 μm, 40 μm, 30 μm, 20 μm, 15 μm or 10 μm.

Singulation for Multi-Chip-On-Interposer (COIP) Flip-chip Packaging Method

Figure 25W:
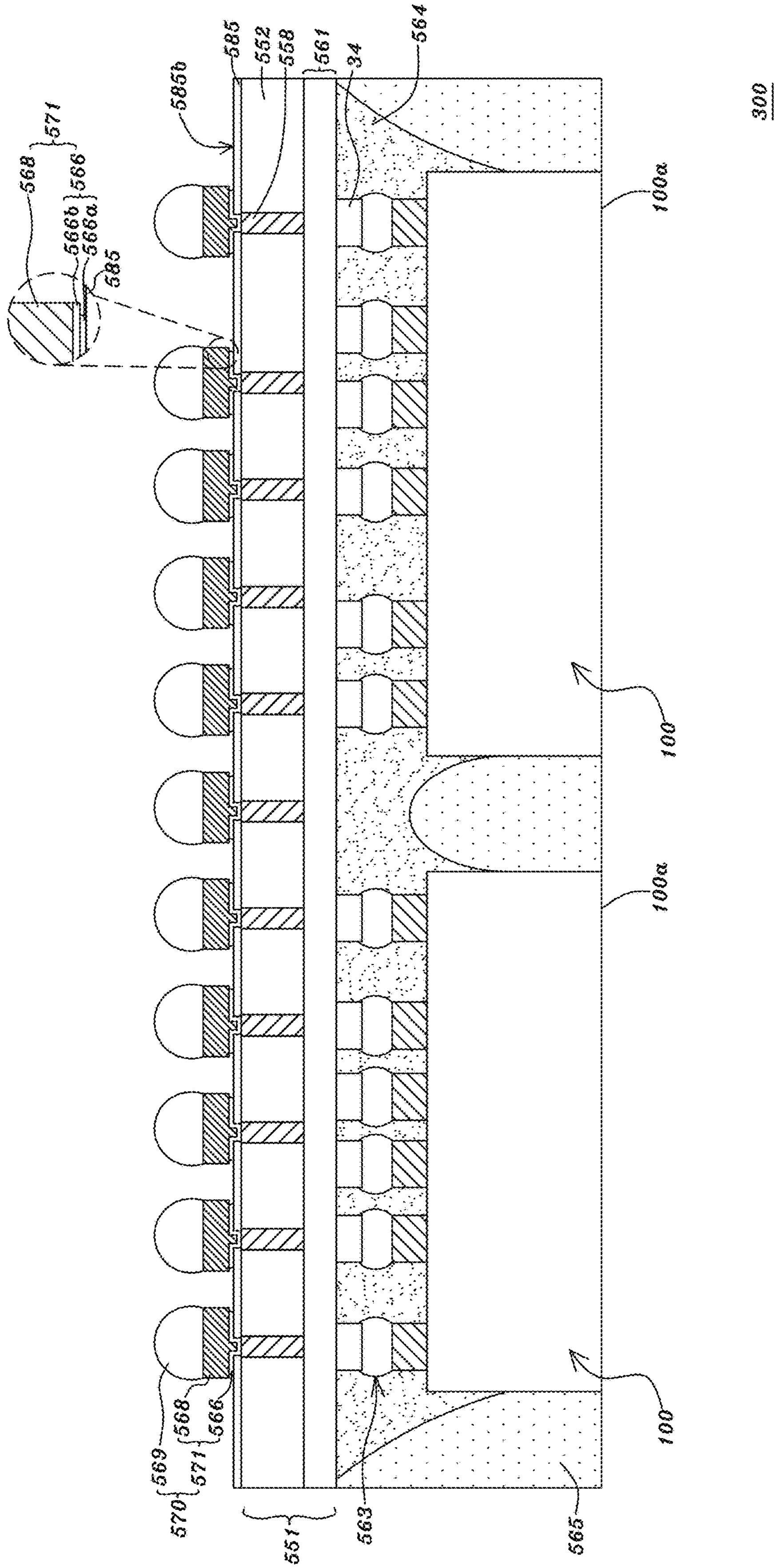
Figure 26T:
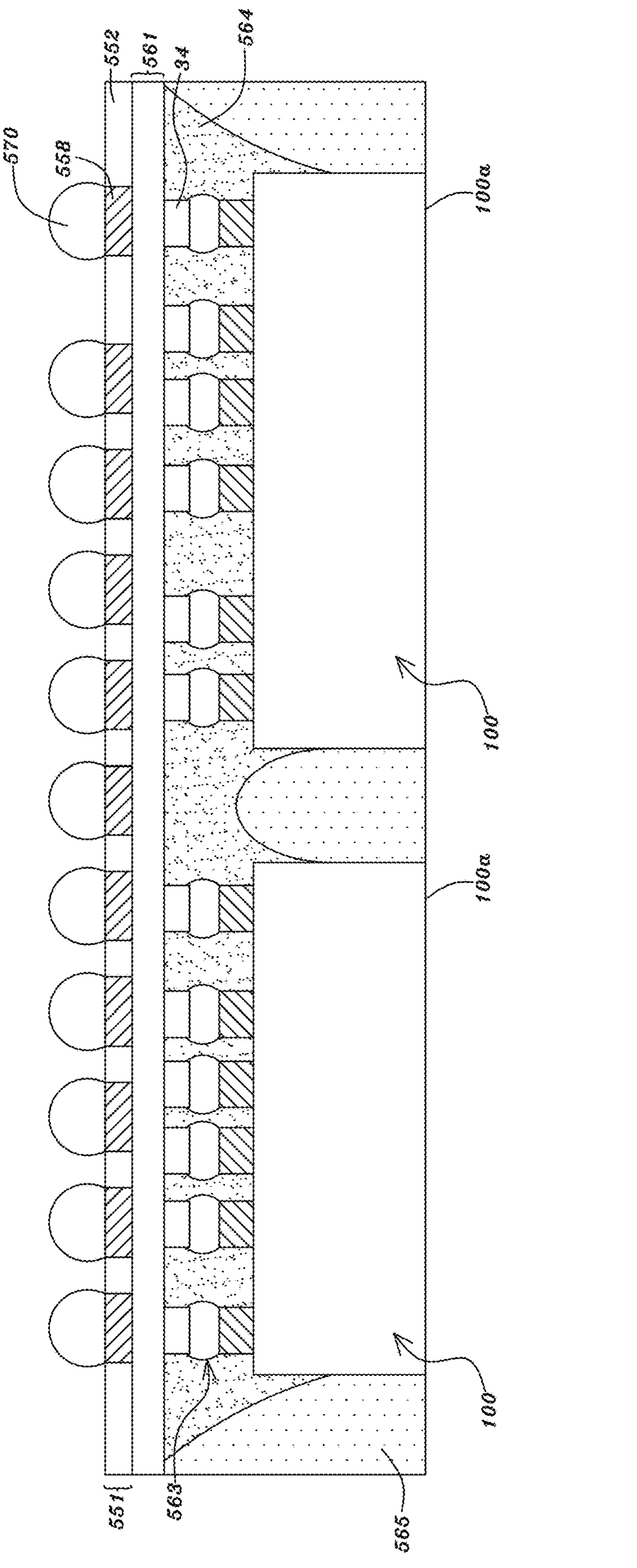

Next, the package structure shown in FIG. 25V or 26S may be separated, cut or diced into multiple individual chip packages, i.e., standard commodity COIP logic drives 300 or single-layer-packaged logic drive, as shown in FIG. 25W or 26T by a laser cutting process or by a mechanical cutting process.

The standard commodity COIP logic drive 300 may be in a shape of square or rectangle with a certain widths, lengths and thicknesses. An industry standard may be set for the shape and dimensions of the standard commodity COIP logic drive 300. For example, the standard shape of the COIP logic drive 300 may be a square with a width greater than or equal to 4 mm, 7 mm, 10 mm, 12 mm, 15 mm, 20 mm, 25 mm, 30 mm, 35 mm or 40 mm, and a thickness greater than or equal to 0.03 mm, 0.05 mm, 0.1 mm, 0.3 mm, 0.5 mm, 1 mm, 2 mm, 3 mm, 4 mm, or 5 mm. Alternatively, the standard shape of the standard commodity COIP logic drive 300 may be a rectangle with a width greater than or equal to 3 mm, 5 mm, 7 mm, 10 mm, 12 mm, 15 mm, 20 mm, 25 mm, 30 mm, 35 mm or 40 mm, a length greater than or equal to 5 mm, 7 mm, 10 mm, 12 mm, 15 mm, 20 mm, 25 mm, 30 mm, 35 mm, 40 mm, 45 mm or 50 mm, and a thickness greater than or equal to 0.03 mm, 0.05 mm, 0.1 mm, 0.3 mm, 0.5 mm, 1 mm, 2 mm, 3 mm, 4 mm, or 5 mm. Furthermore, the metal bumps or pillars 570 at a backside of the interposer 551 in the logic drive 300 may be in a standard footprint, for example, in an area array of M×N with a standard dimension of pitch and space between neighboring two of the metal bumps or pillars 570. The locations of the metal bumps or pillars 570 are also at a standard location.

Interconnection for COIP Logic Drive

Figure 27A:
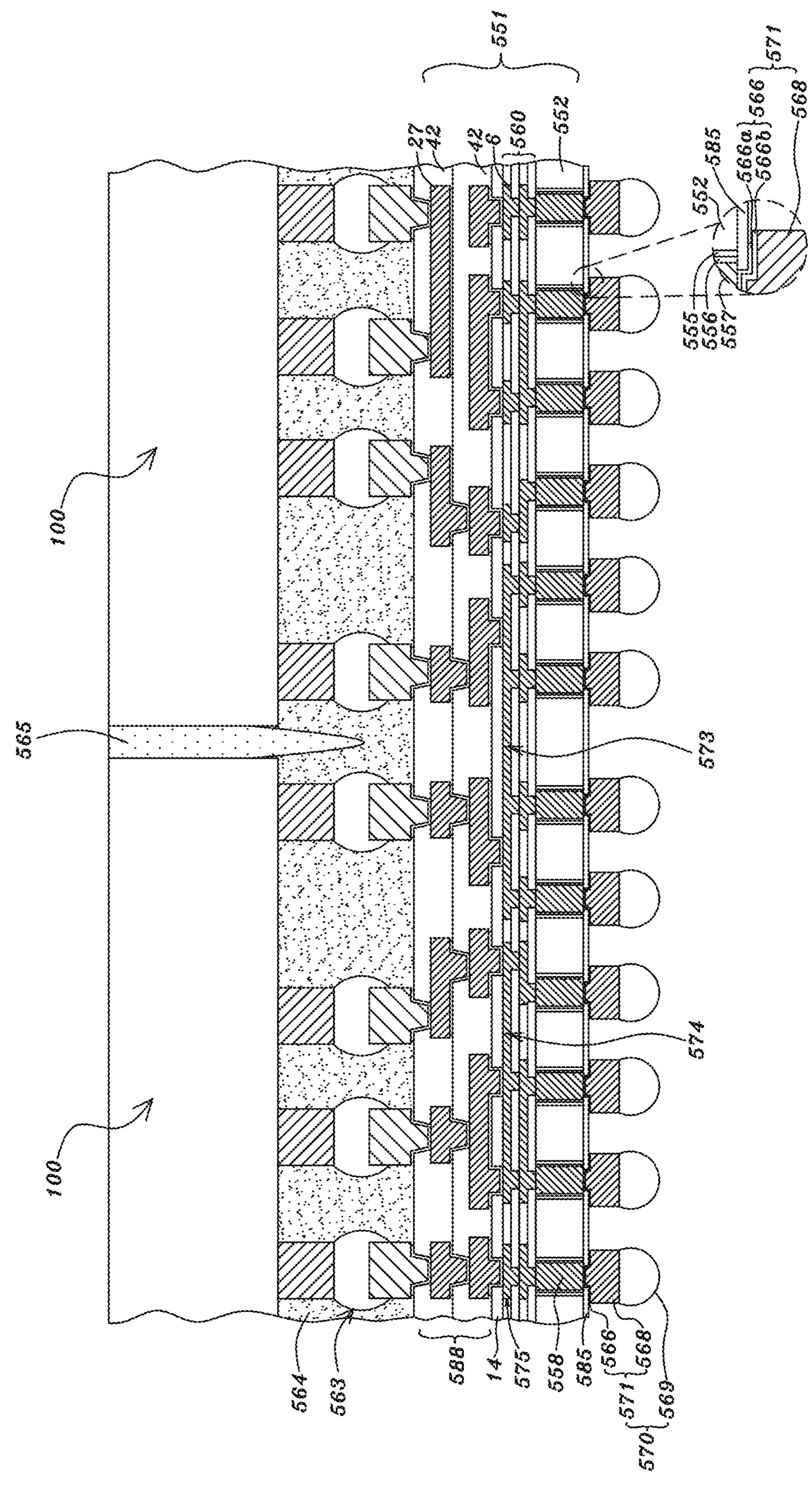
FIGS. 27A and 27B are schematically cross-sectional views showing various interconnection for an interposer arranged with a first type of vias in accordance with an embodiment of the present application.
Figure 27B:
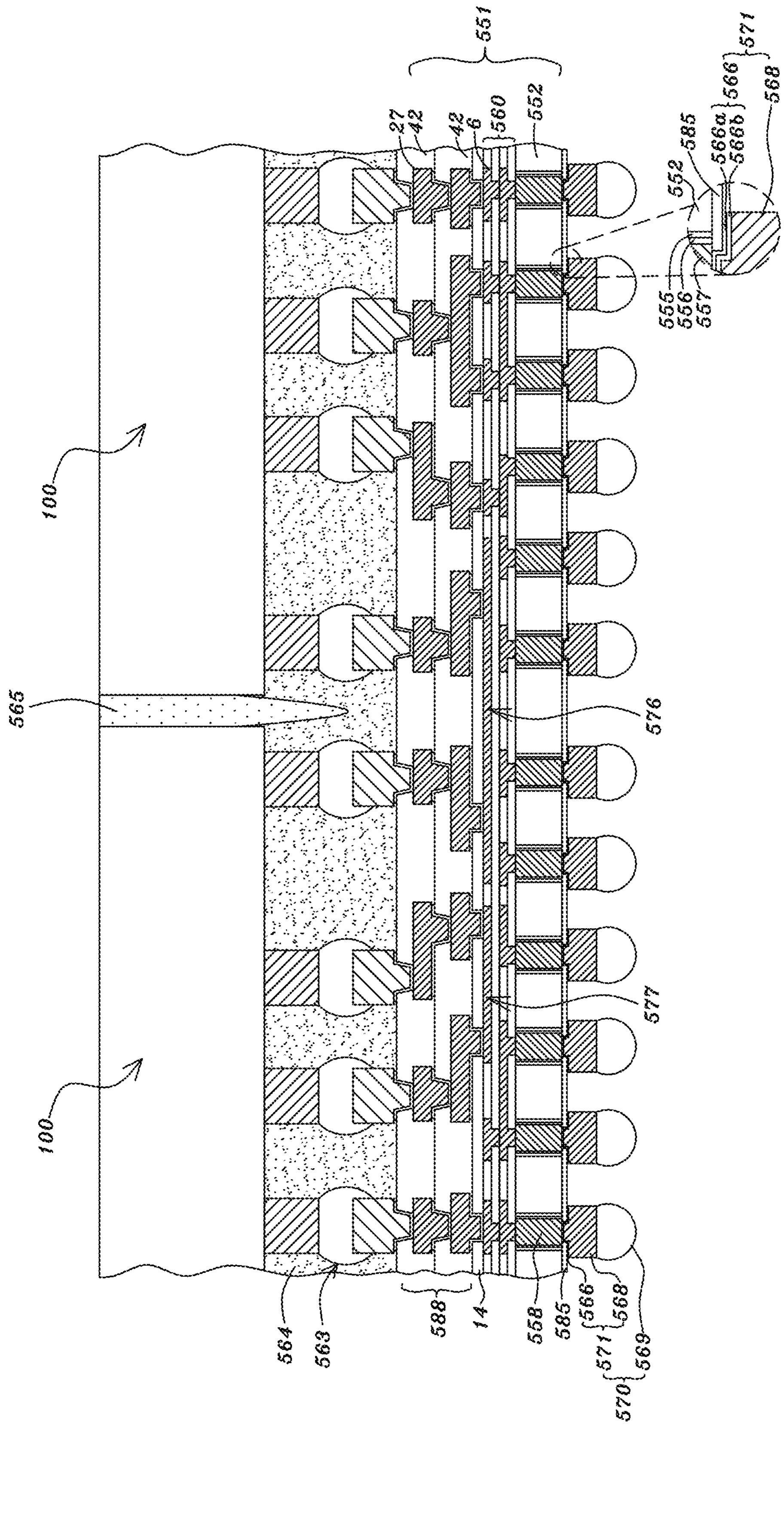
Figure 28A:
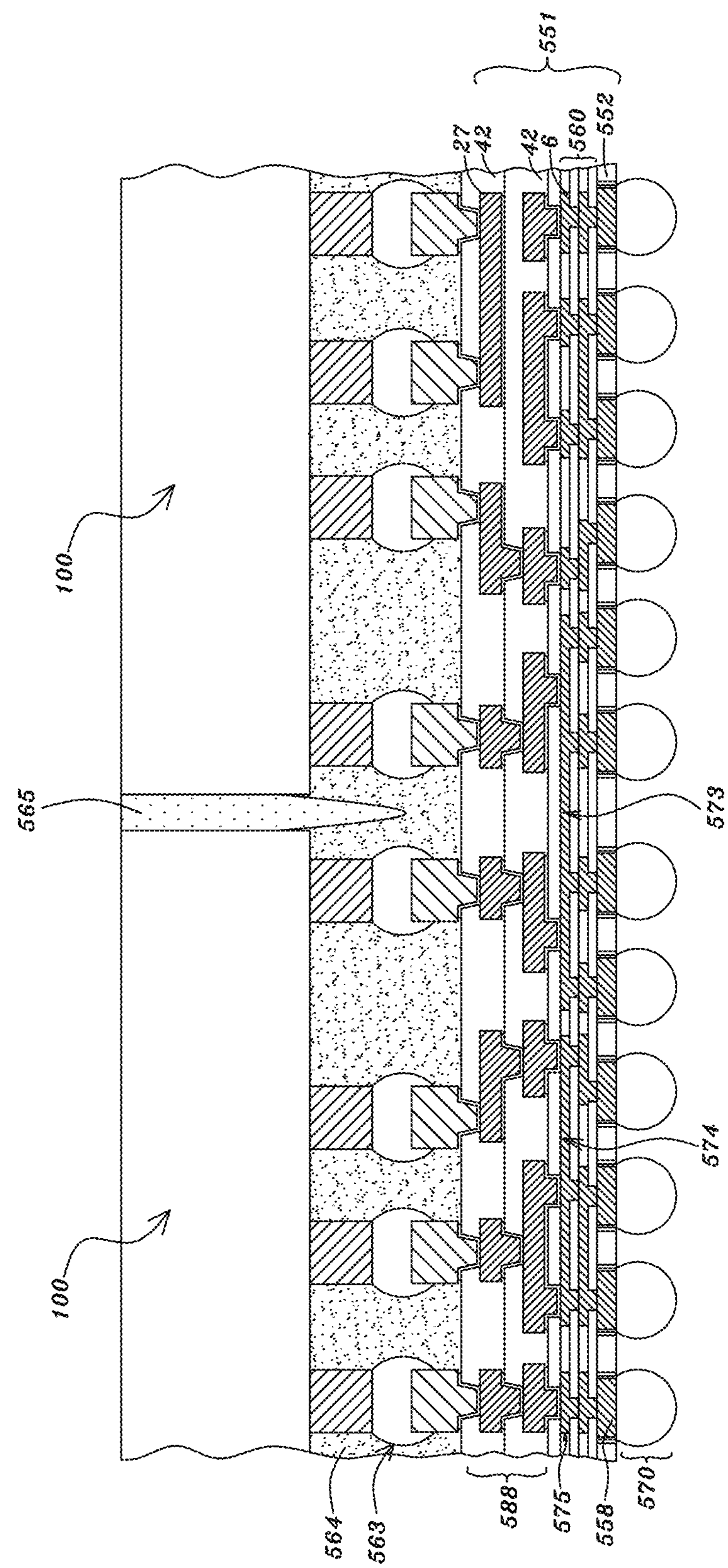
FIGS. 28A and 28B are schematically cross-sectional views showing various interconnection for an interposer arranged with a second type of vias in accordance with an embodiment of the present application.
Figure 28B:
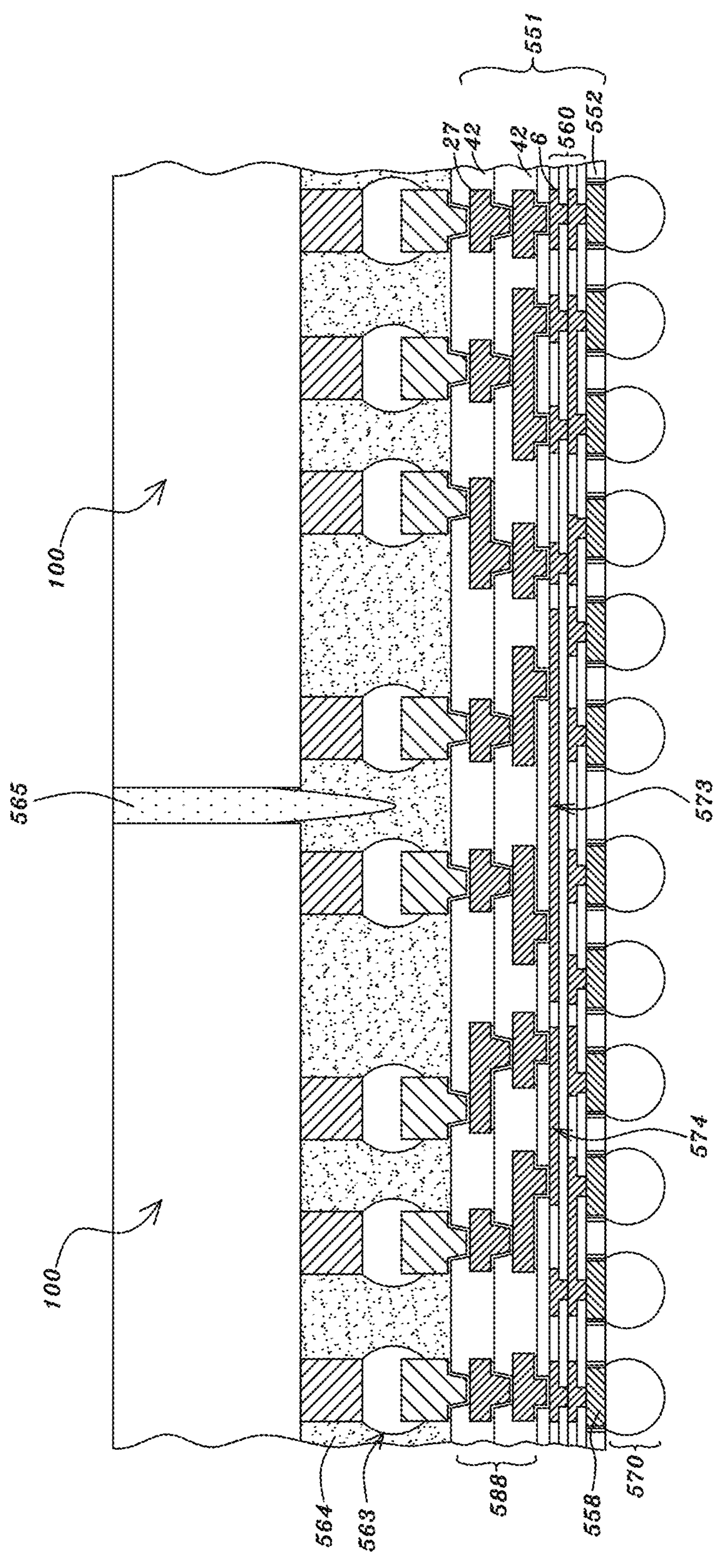

FIGS. 27A and 27B are schematically cross-sectional views showing various interconnection for an interposer arranged with a first type of vias in accordance with an embodiment of the present application; the first, second, third, fourth or fifth type of metal bumps 570 may be formed on the first type of vias 558 of the interposer 551. For illustration, the fourth type of metal bumps 570 is taken as an example in FIGS. 27A and 27B. FIGS. 28A and 28B are schematically cross-sectional views showing various interconnection for an interposer arranged with a second type of vias in accordance with an embodiment of the present application; the first, second, third, fourth or fifth type of metal bumps 570 may be formed on the second type of vias 558 of the interposer 551. For illustration, the fifth type of metal bumps 570 is taken as an example in FIGS. 28A and 28B.

Referring to FIGS. 27A and 28A, the interconnection metal layers 27 and/or 6 of the SISIP 588 and/or FISIP 560 of the interposer 551 and one or more of the vias 558 of the interposer 551 may connect one or more of the metal pillars or bumps 570 to one of the semiconductor chips 100 and connect one of the semiconductor chips 100 to another of the semiconductor chips 100. For a first case, the interconnection metal layers 6 and/or 27 of the FISIP 560 and/or SISIP 588 of the interposer 551 may compose a first interconnection net 573 connecting multiple of the metal pillars or bumps 570 to each other or one another and connecting multiple of the semiconductor chips 100 to each other or one another. Said multiple of the metal pillars or bumps 570 and said multiple of the semiconductor chips 100 may be connected together by the first interconnection net 573. The first interconnection net 573 may be a power or ground plane or bus for delivering power or ground supply.

Referring to FIGS. 27A and 28A, for a second case, the interconnection metal layers 6 and/or 27 of the FISIP 560 and/or SISIP 588 of the interposer 551 and one or more of the vias 558 of the interposer 551 may compose a second interconnection net 574 connecting one or more of the metal pillars or bumps 570 to each other or one another and connecting multiple of the bonded contacts 563 between one of the semiconductor chips 100 and the interposer 551 to each other or one another. Said multiple of the metal pillars or bumps 570 and said multiple of the bonded contacts 563 may be connected together by the second interconnection net 574. The second interconnection net 574 may be a power or ground plane or bus for delivering power or ground supply.

Referring to FIGS. 27A and 28A, for a third case, the interconnection metal layers 6 and/or 27 of the FISIP 560 and/or SISIP 588 of the interposer 551 and one of the vias 558 of the interposer 551 may compose a third interconnection net 575 connecting one of the metal pillars or bumps 570 to one of the bonded contacts 563 between one of the semiconductor chips 100 and the interposer 551. The third interconnection net 575 may be a signal bus or trace for signal transmission or a power or ground plane or bus for delivering power or ground supply. For example, the third interconnection net 575 may be a signal bus or trace coupling to one of the large I/O circuits 341, as seen in FIG. 13A, of said one of the semiconductor chips 100 via said one of the bonded contacts 563.

Referring to FIGS. 27B and 28B, for a fourth case, the interconnection metal layers 6 and/or 27 of the FISIP 560 and/or SISIP 588 of the interposer 551 may compose a fourth interconnection net 576 not connecting to any of the metal pillars or bumps 570 of the COIP logic drive 300 but connecting multiple of the semiconductor chips 100 to each other or one another. The fourth interconnection net 576 may be one of the programmable interconnects 361 of the inter-chip interconnects 371 for signal transmission. For example, the fourth interconnection net 576 may be a signal bus or trace coupling one of the small I/O circuits 203, as seen in FIG. 13B, of one of the semiconductor chips 100 to one of the small I/O circuits 203 of another of the semiconductor chips 100.

Referring to FIGS. 27B and 28B, for a fifth case, the interconnection metal layers 6 and/or 27 of the FISIP 560 and/or SISIP 588 of the interposer 551 may compose a fifth interconnection net 577 not connecting to any of the metal pillars or bumps 570 of the COIP logic drive 300 but connecting multiple of the bonded contacts 563 between one of the semiconductor chips 100 and the interposer 551 to each other or one another. The fifth interconnection net 577 may be a signal bus or trace for signal transmission.

Figure 29A:
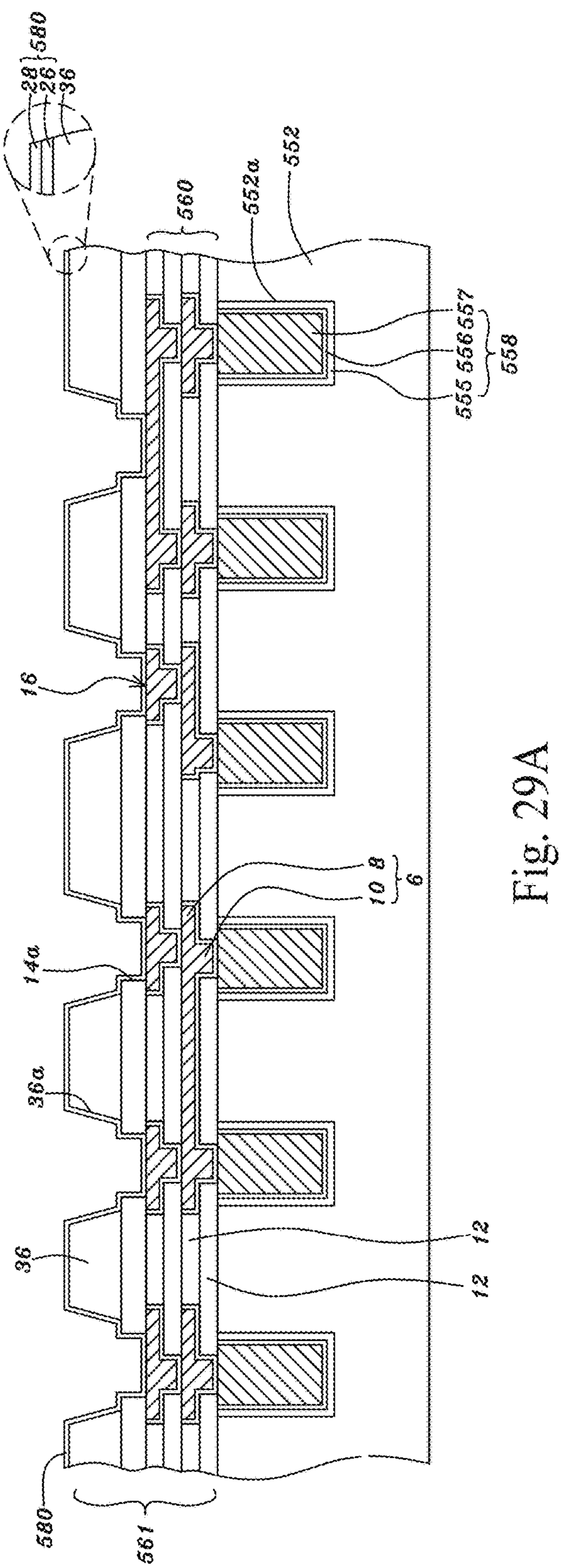
FIGS. 29A-29O are cross-sectional views showing a process for forming a multi-chip-on-interposer (COIP) logic drive with multiple through package vias in accordance with the present application.

Embodiment for Chip Package with TPVs (1) First Embodiment for Forming TPVs and Micro-Bumps on Interposer Alternatively, the COIP logic drive 300 may be provided with multiple through package vias, or through polymer vias (TPVs) in the polymer layer 565 on a front side of the interposer 551. FIGS. 29A-29O are cross-sectional views showing a process for forming a multi-chip-on-interposer (COIP) logic drive with multiple through package vias (TPVs) in accordance with the present application. Referring to FIG. 29A, the through package vias (TPVs) 582 may be formed on the front side of the interposer 551 using the same adhesion/seed layer 580, composed of an adhesion layer 26 and a seed layer 28 on the adhesion layer 26 as illustrated in FIGS. 23B and 23C, for forming the micro-bumps 34 as seen in FIG. 25J or 26L. For more elaboration, after the step as illustrated in FIG. 25I or 26K, the adhesion/seed layer 580 used for forming the micro-bumps 34 and the through package vias (TPVs) may be first formed on the interconnection scheme 561, i.e., on its polymer layer 42 and its interconnection metal layer 27 at the bottoms of its openings **42*a*. In this case, the interconnection scheme 561 includes the FISIP 560, the passivation layer 14 on the FISIP 560 and a polymer layer 36 as seen in FIG. 23I on the passivation layer 14, wherein each opening 36*a* in the polymer layer 36 may overlay one of the openings 14*a* and one of the metal pads 16. The specification of the adhesion layer 26 and seed layer 28 as seen in FIG. 29A and the process for forming the same may be referred to those as illustrated in FIGS. 23B and 23C. The specification of the polymer layer 36 as seen in FIG. 29A and the process for forming the same may be referred to those as illustrated in FIG. 23I. During the process for forming the interposer 551, the adhesion layer 26 of the adhesion/seed layer 580 may be formed on its metal pads 16 at bottoms of the openings 14*a* in its passivation layer 14, on its passivation layer 14 around the metal pads 16 and on its polymer layer 36; next, the seed layer 28 of the adhesion/seed layer 580 may be formed on the adhesion layer 26 of the adhesion/seed layer 580**.

Figure 29B:
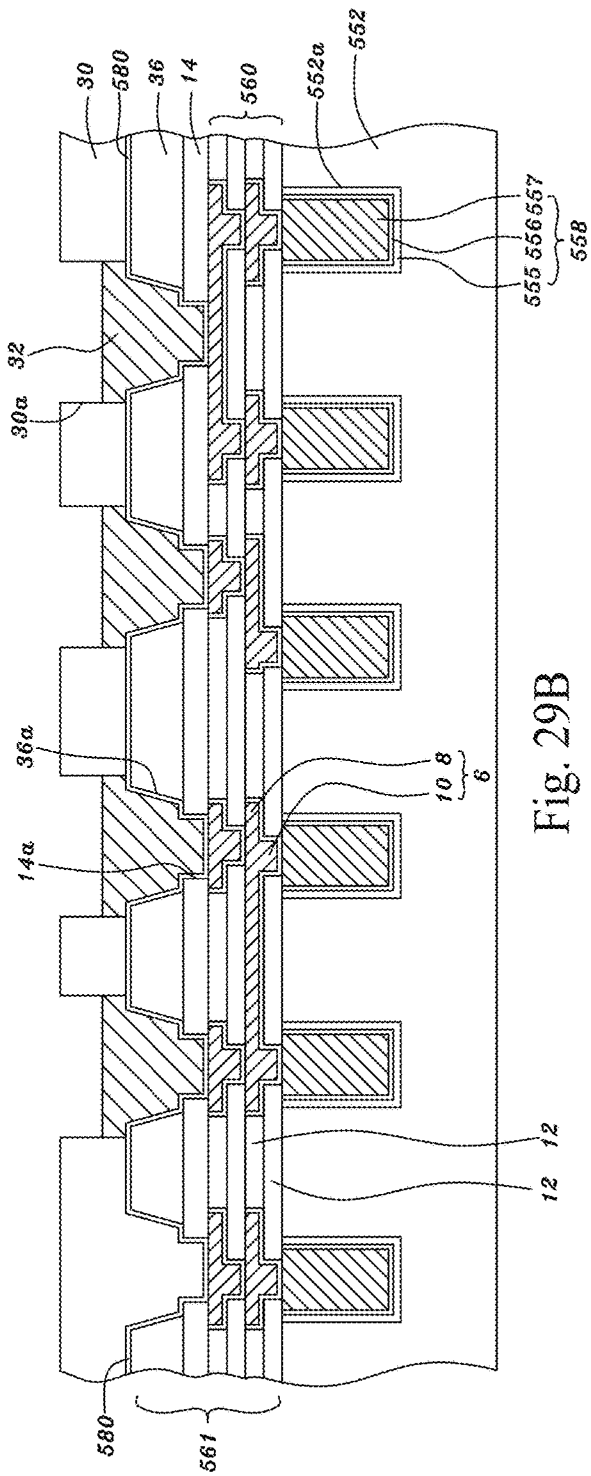

Next, referring to FIG. 29B, a photoresist layer 30 is formed on the seed layer 28 of the adhesion/seed layer 580. The specification of the photoresist layer 30 as seen in FIG. 29B and the process for forming the same may be referred to those as illustrated in FIG. 23D. Each of openings **30*a* in the photoresist layer 30 may overlap one of the openings 36*a* and one of the openings 14*a* for forming one of micro-pillars or micro-bumps in said each of the openings 30*a* by following processes to be performed later, exposing the electroplating seed layer 28 of the adhesion/seed layer 580 at the bottom of said each of the openings 30*a*, and may extend out of said one of the openings 36*a* to an area or ring of the polymer layer 36 around said one of the openings 36*a***.

Next, referring to FIG. 29B, for forming the second type of micro-pillars or micro-bumps, a metal layer 32, such as copper, may be electroplated on the electroplating seed layer 28 exposed by the openings **30*a*. The specification of the metal layer 32 as seen in FIG. 29B and the process for forming the same may be referred to those as illustrated in FIGS. 23E, 23J and 23K. Alternatively, for forming the first type of micro-pillars or micro-bumps, a metal layer 32, such as copper, may be electroplated on the electroplating seed layer 28 exposed by the openings 30*a*, and a solder cap 33 may be electroplated on the metal layer 32. The specification of the metal layer 32 and solder cap 33 as illustrated herein and the process for forming the same may be referred to those as illustrated in FIG. 23**E.

Figure 29C:
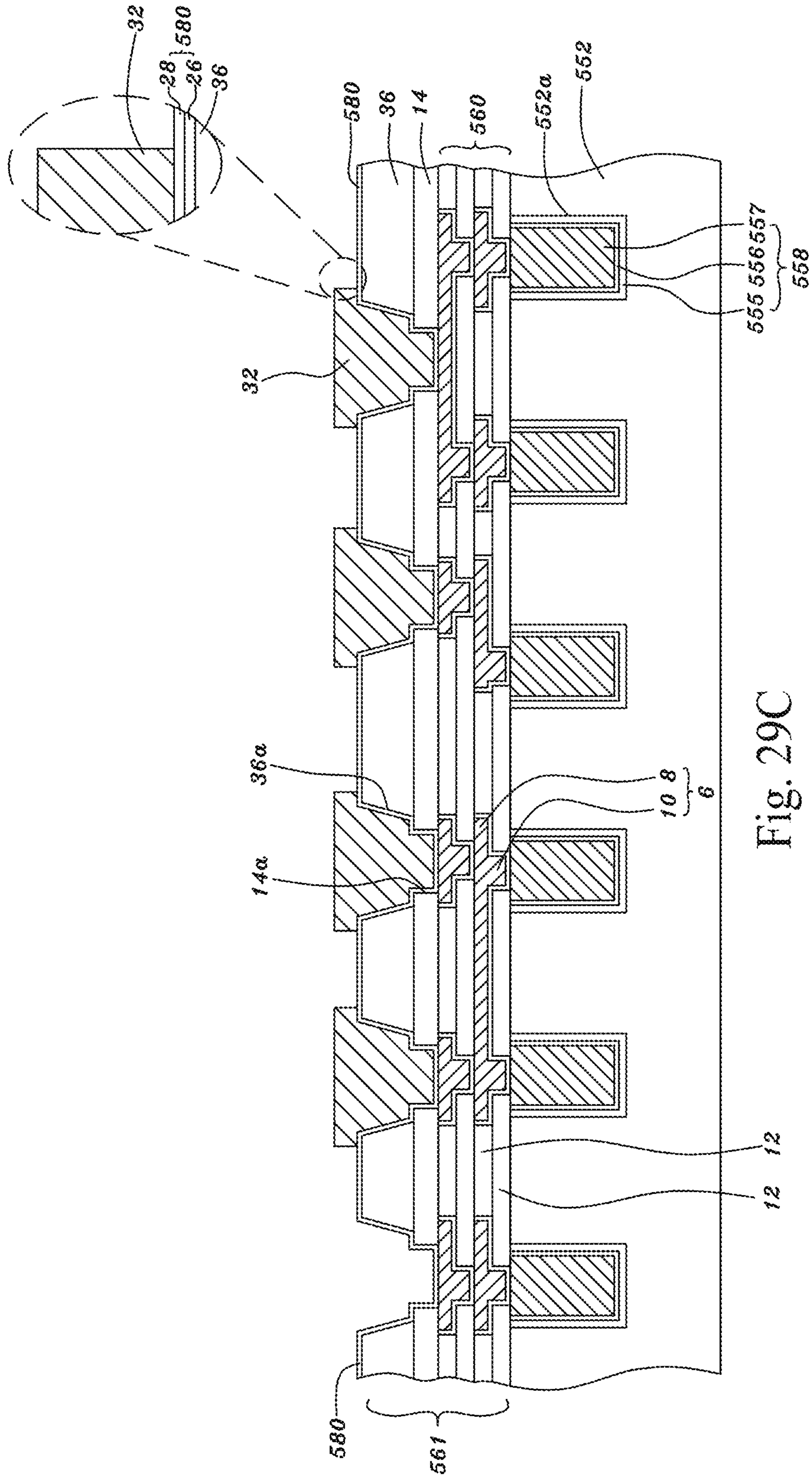

Next, referring to FIG. 29C, most of the photoresist layer 30 may be removed using an organic solution with amide. The process for removing the photoresist layer 30 may be referred to that as illustrated in FIG. 23F.

Figure 29D:
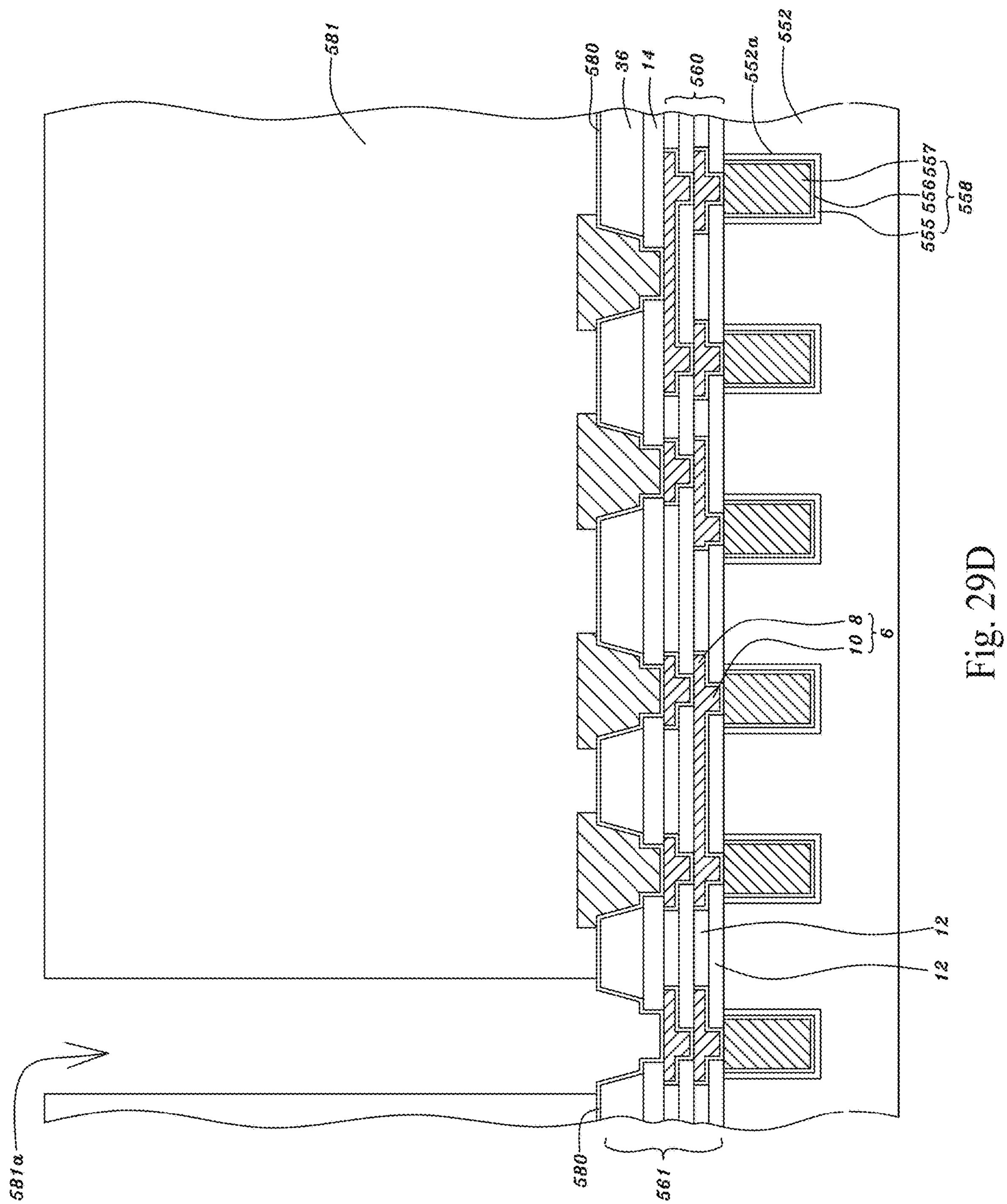

Next, referring to FIG. 29D, a photoresist layer 581 is formed on the electroplating seed layer 28 of the adhesion/seed layer 580 and on the metal layer 32 for forming the second type of micro-pillars or micro-bumps or metal cap 33 for forming the first type of micro-pillars or micro-bumps. The specification of the photoresist layer 581 as seen in FIG. 29D and the process for forming the same may be referred to the specification of the photoresist layer 30 as illustrated in FIG. 23D. Each of openings **581*a* in the photoresist layer 581 may overlap one of the openings 36*a* and one of the openings 14*a* for forming one of the through package vias (TPV) in said one of the openings 581*a* by following processes to be performed later, exposing the electroplating seed layer 28 of the adhesion/seed layer 580 at the bottom of said one of the openings 581***a*, and may extend out of said one of the openings 36*a* to an area or ring of the polymer layer 36 around said one of the openings 36*a*. For example, the photoresist layer 581 may have a thickness between 5 μm and 300 μm, 5 μm and 200 μm, 5 μm and 150 μm, 5 μm and 120 μm, 10 μm and 100 μm, 10 μm and 60 μm, 10 μm and 40 μm, or 10 μm and 30 μm.

Figure 29E:
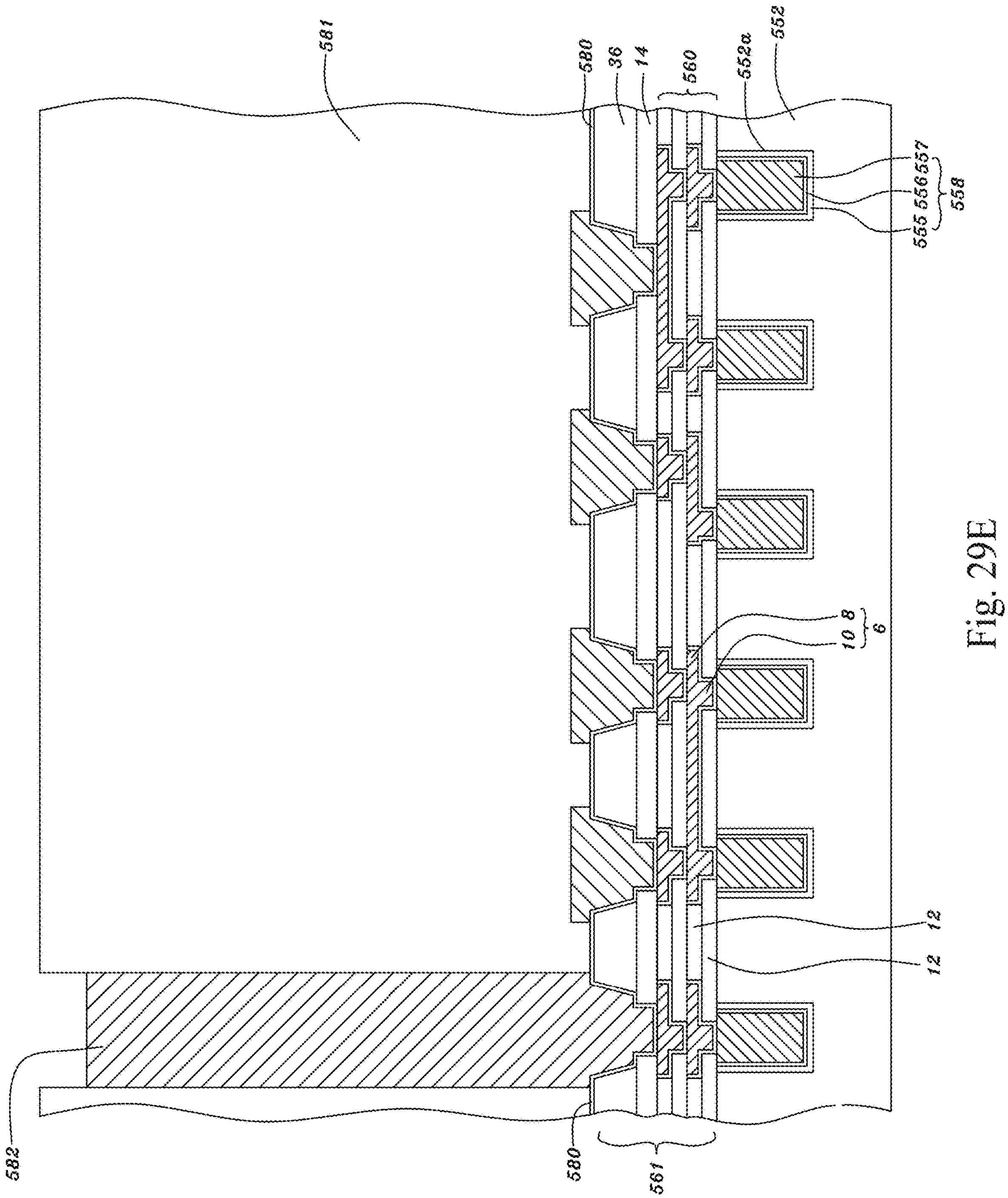

Next, referring to FIG. 29E, a metal layer 582, such as copper, may be electroplated on the electroplating seed layer 28 exposed by the openings 581*a*. For example, the metal layer 582 may be formed by electroplating a copper layer with a thickness between 5 μm and 300 μm, 5 μm and 200 μm, 5 μm and 150 μm, 5 μm and 120 μm, 10 μm and 100 μm, 10 μm and 60 μm, 10 μm and 40 μm, or 10 μm and 30 μm on the electroplating seed layer 28, made of copper, of the adhesion/seed layer 580 exposed by the openings 581*a*.

Figure 29F:
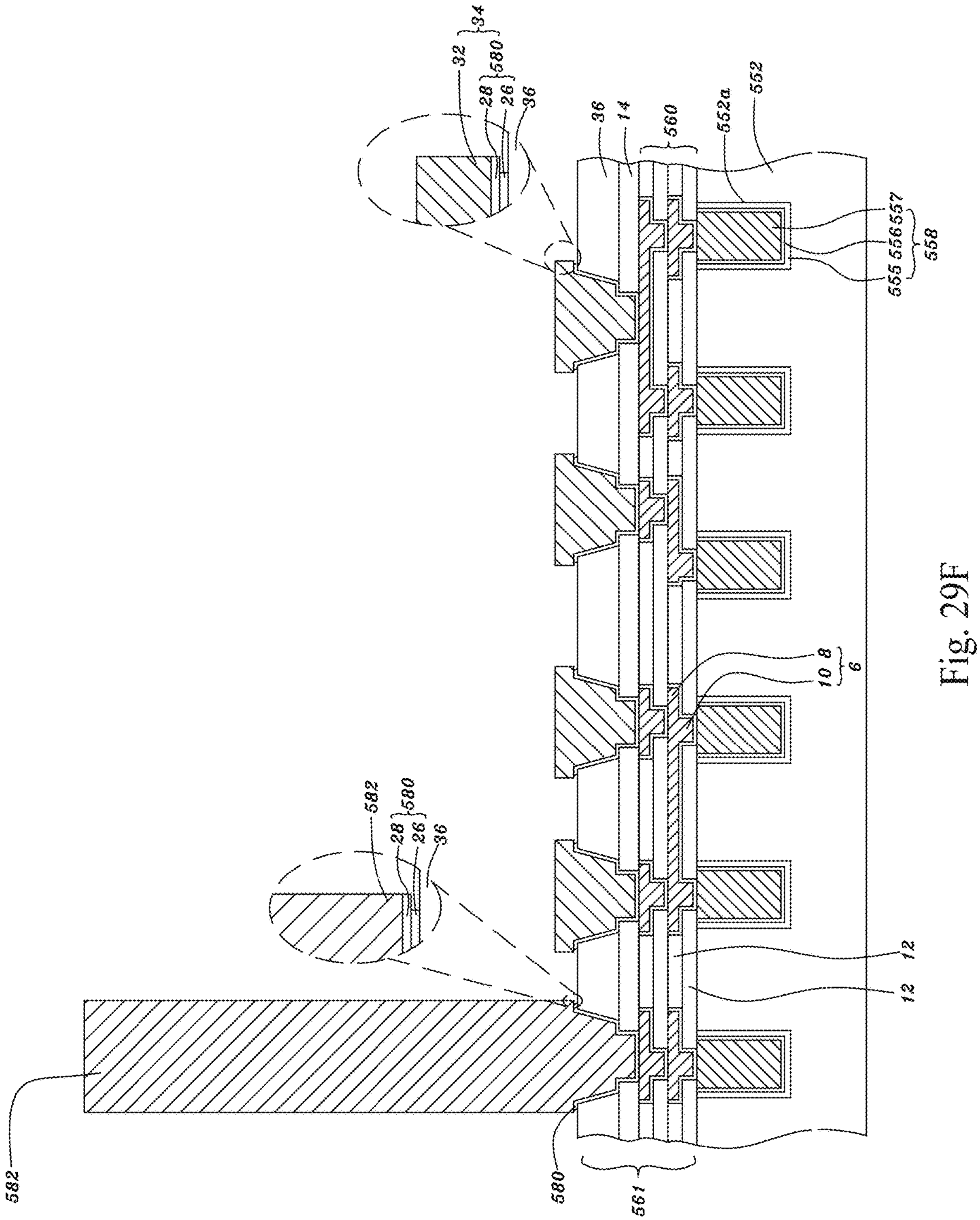

Next, referring to FIG. 29F, most of the photoresist layer 581 may be removed using an organic solution with amide and then the electroplating seed layer 28 and adhesion layer 26 of the adhesion/seed layer 580 not under the metal layers 32 and 582 may be etched. The removing and etching processes may be referred respectively to the process for removing the photoresist layer 30 and etching the electroplating seed layer 28 and adhesion layer 26 as illustrated in FIG. 23F. Thereby, the micro-bumps 34 and through package vias (TPVs) 582 may be formed on the interposer 551.

(2) Second Embodiment for Forming TPVs and Micro-Bumps on Interposer

Figure 32A:
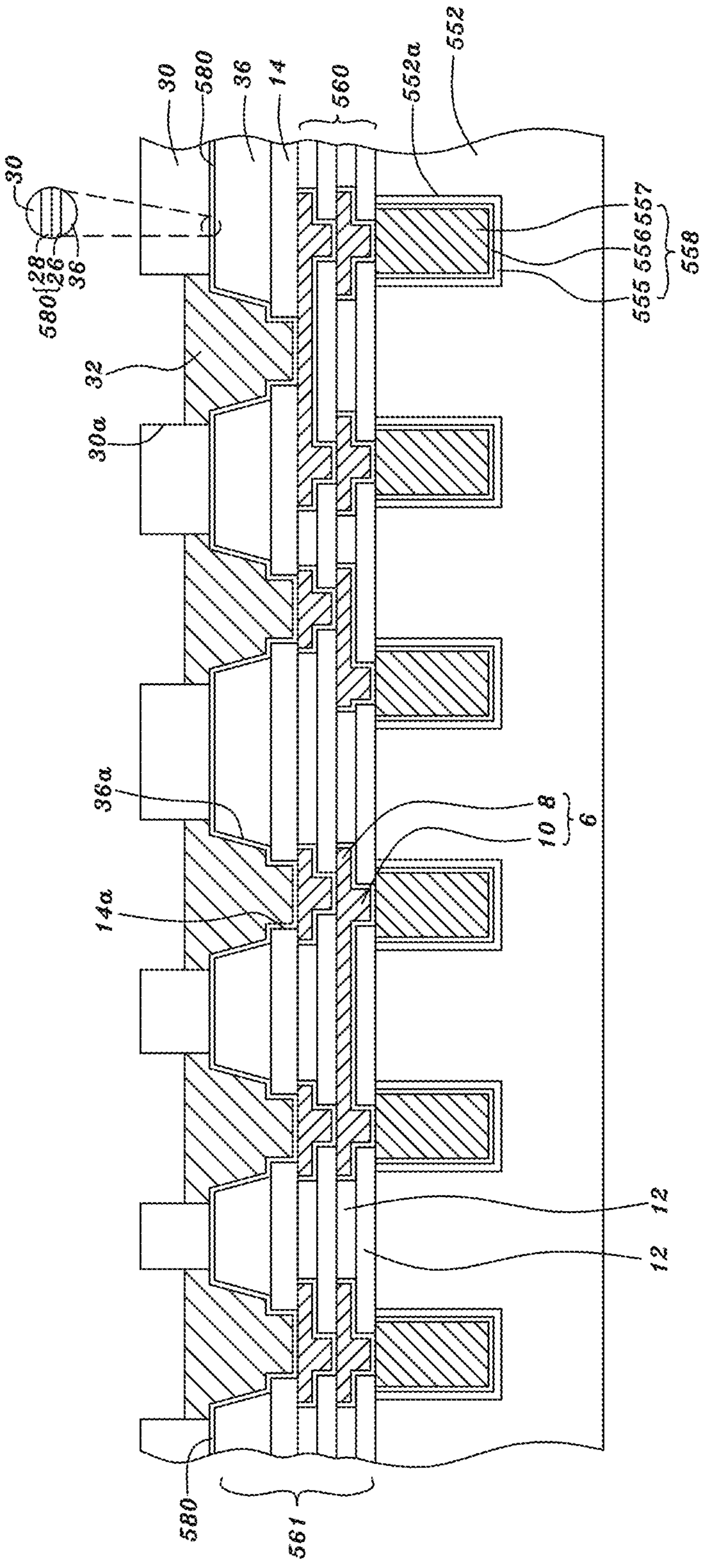
FIGS. 32A-32E are cross-sectional views showing a process for forming TPVs and micro-bumps on an interposer in accordance with the present application.

Alternatively, the TPVs 582 may be formed on the micro-pillars or micro-bumps 34. FIGS. 32A-32E are cross-sectional views showing a process for forming TPVs and micro-bumps on an interposer in accordance with the present application. Referring to FIG. 32A following the step as illustrated in FIG. 29A, a photoresist layer 30 is formed on the electroplating seed layer 28 of the adhesion/seed layer 580. The specification of the photoresist layer 30 as seen in FIG. 32A and the process for forming the same may be referred to those as illustrated in FIG. 23D. Each of openings 30*a* in the photoresist layer 30 may overlap one of the openings 36*a* and one of the openings 14*a* for forming one of the micro-pillars or micro-bumps or one of multiple pads for the TPVs in said one of the openings 30*a* by following processes to be performed later, exposing the electroplating seed layer 28 of the adhesion/seed layer 580 at the bottom of said one of the openings 30*a*, and may extend out of said one of the openings 36*a* to an area or ring of the polymer layer 36 around said one of the openings 36*a*.

Next, referring to FIG. 32A, for forming the second type of micro-pillars or micro-bumps, a metal layer 32, such as copper, may be electroplated on the electroplating seed layer 28 of the adhesion/seed layer 580 exposed by the openings 30*a* for forming the micro-pillars or micro-bumps and the pads for the TPVs. The specification of the metal layer 32 as seen in FIG. 32A and the process for forming the same may be referred to those as illustrated in FIGS. 23E, 23J and 23K.

Figure 32B:
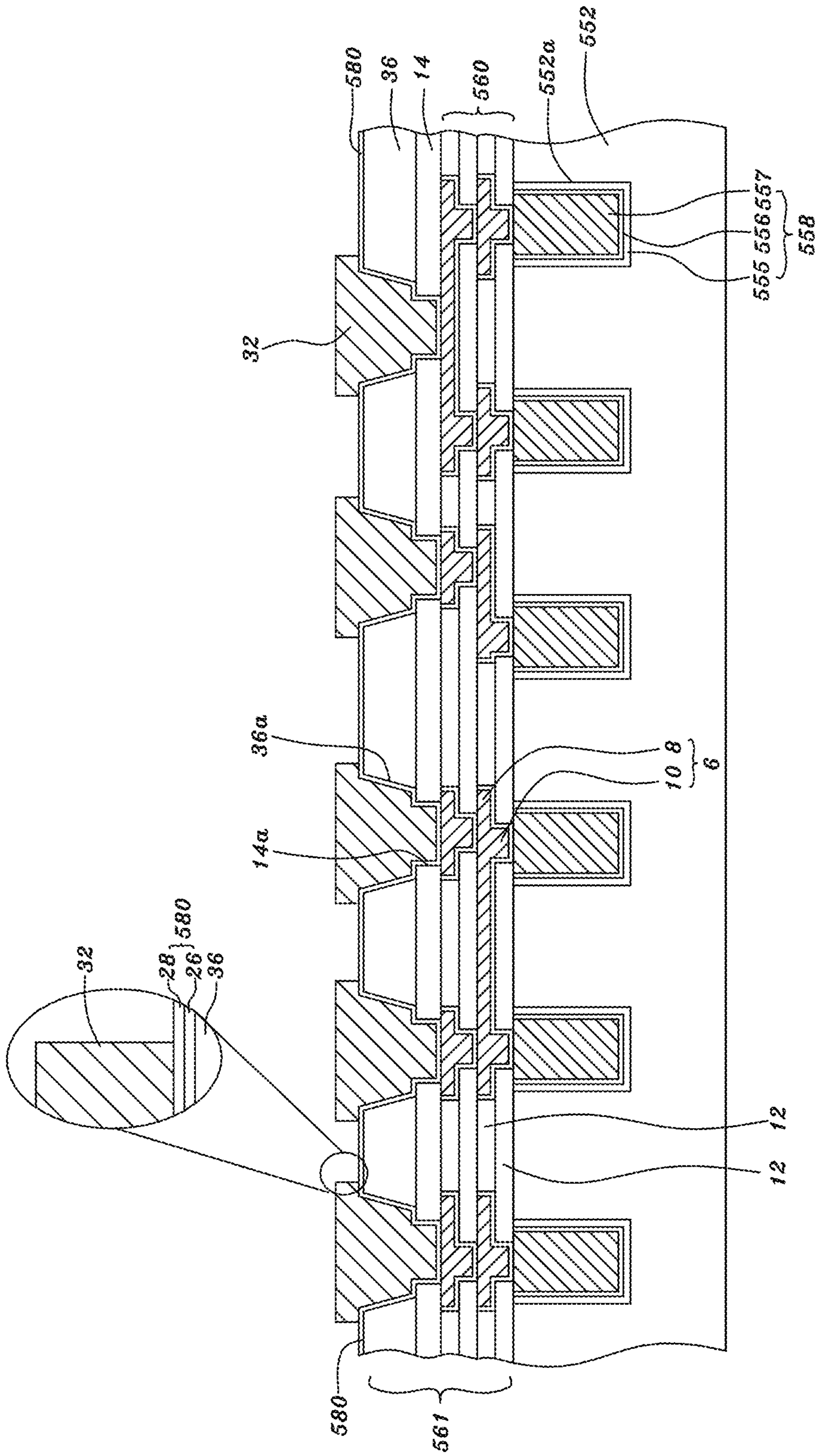

Next, referring to FIG. 32B, most of the photoresist layer 30 may be removed using an organic solution with amide. The process for removing the photoresist layer 30 may be referred to that as illustrated in FIG. 23F.

Figure 32C:
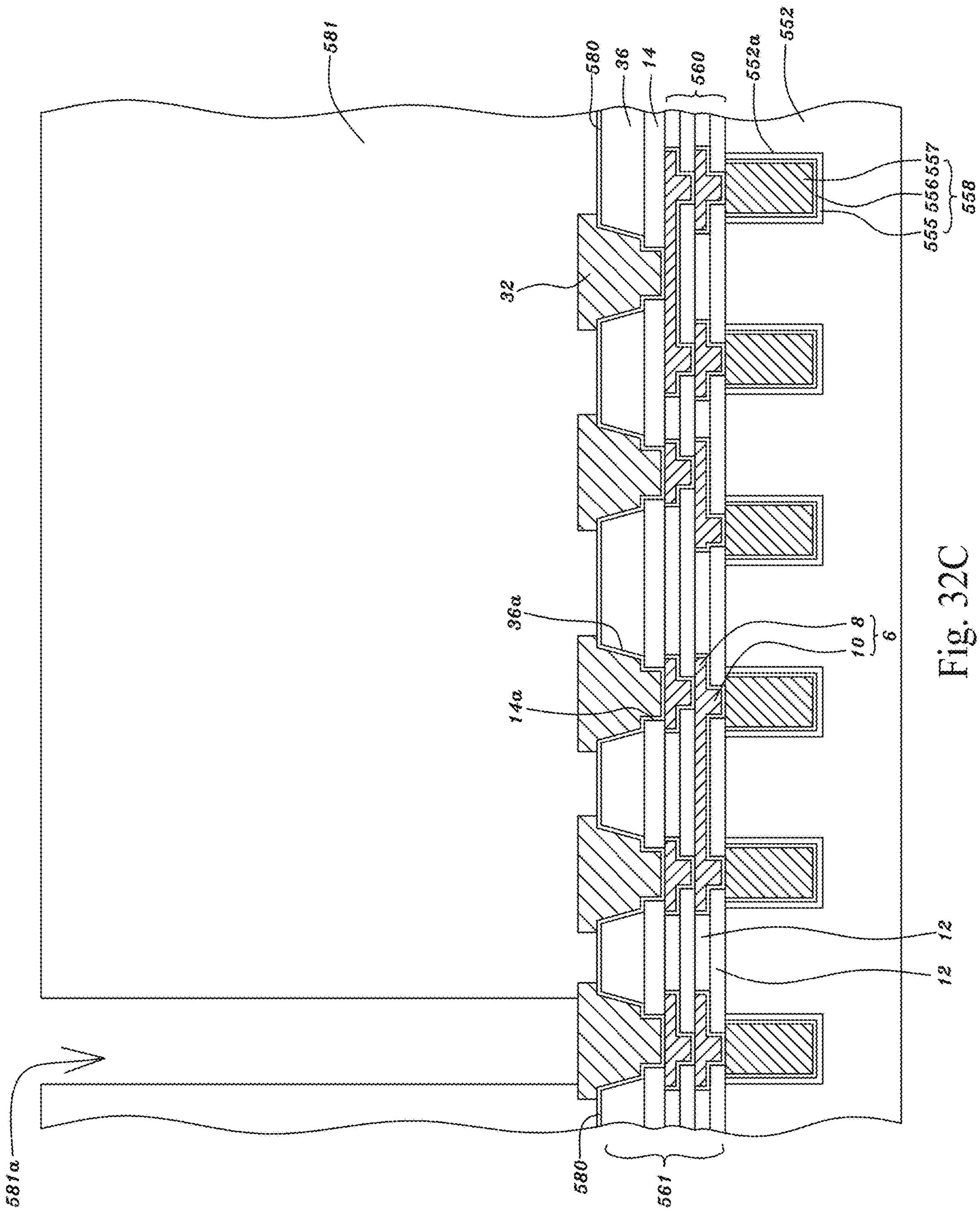

Next, referring to FIG. 32C, a photoresist layer 581 is formed on the electroplating seed layer 28 of the adhesion/seed layer 580 and on the metal layer 32. The specification of the photoresist layer 581 as seen in FIG. 32C and the process for forming the same may be referred to the specification of the photoresist layer 30 as illustrated in FIG. 23D. Each of openings 581*a* in the photoresist layer 581 may overlap the metal layer 32 for one of the pads for the TPVs and may expose the metal layer 32 for said one of the pads for the TPVs at the bottom of said one of the openings 581*a*. For example, the photoresist layer 581 may have a thickness between 5 μm and 300 μm, 5 μm and 200 μm, 5 μm and 150 μm, 5 μm and 120 μm, 10 μm and 100 μm, 10 μm and 60 μm, 10 μm and 40 μm, or 10 μm and 30 μm.

Figure 32D:
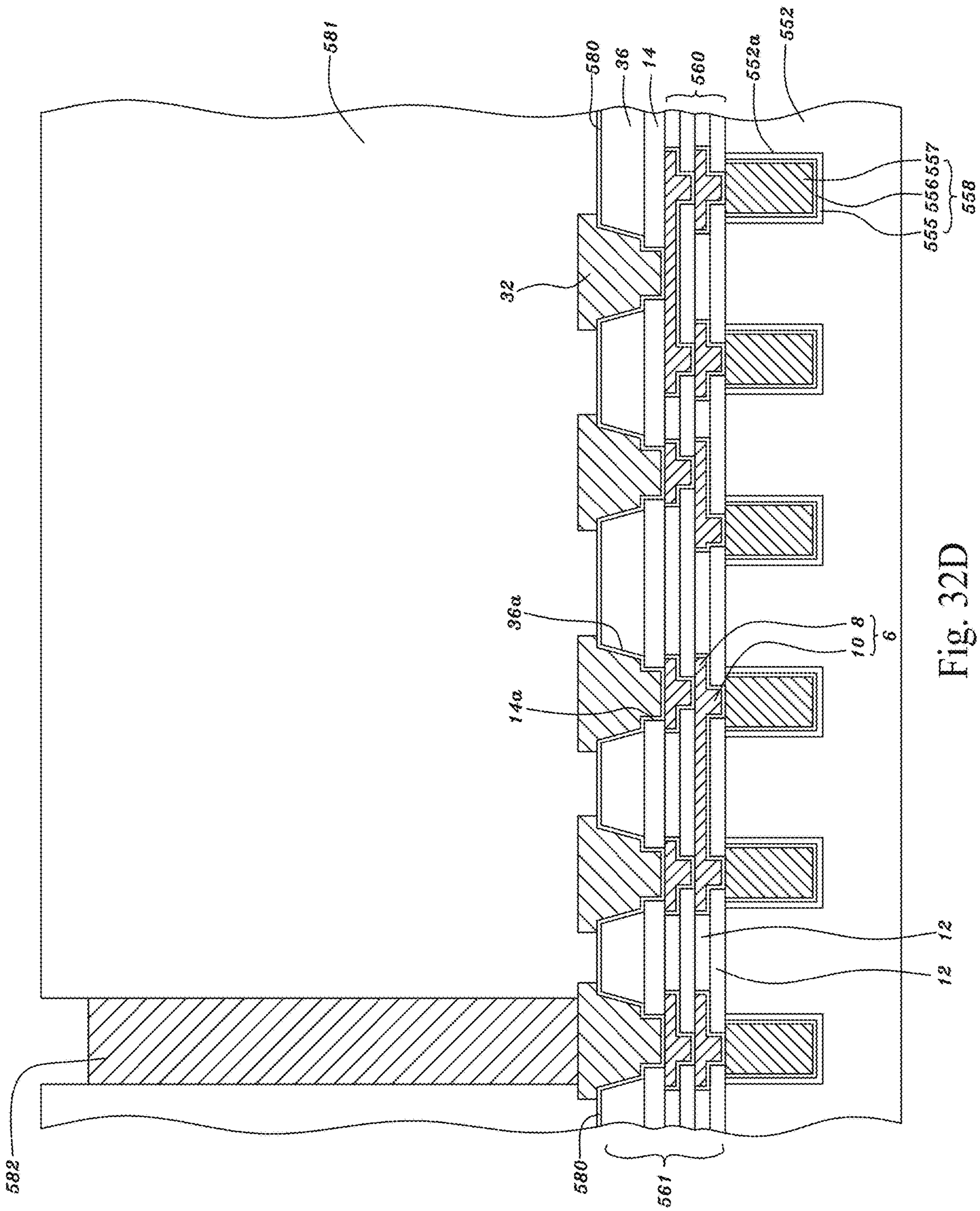

Next, referring to FIG. 32D, a metal layer 582, such as copper, may be electroplated on the metal layer 32 for the pads for the TPVs exposed by the openings 581*a*. For example, the metal layer 582 may be formed by electroplating a copper layer with a thickness between 5 μm and 300 μm, 5 μm and 200 μm, 5 μm and 150 μm, 5 μm and 120 μm, 10 μm and 100 μm, 10 μm and 60 μm, 10 μm and 40 μm, or 10 μm and 30 μm on the metal layer 32 for the pads for the TPVs, made of copper, exposed by the openings 581*a*.

Figure 32E:
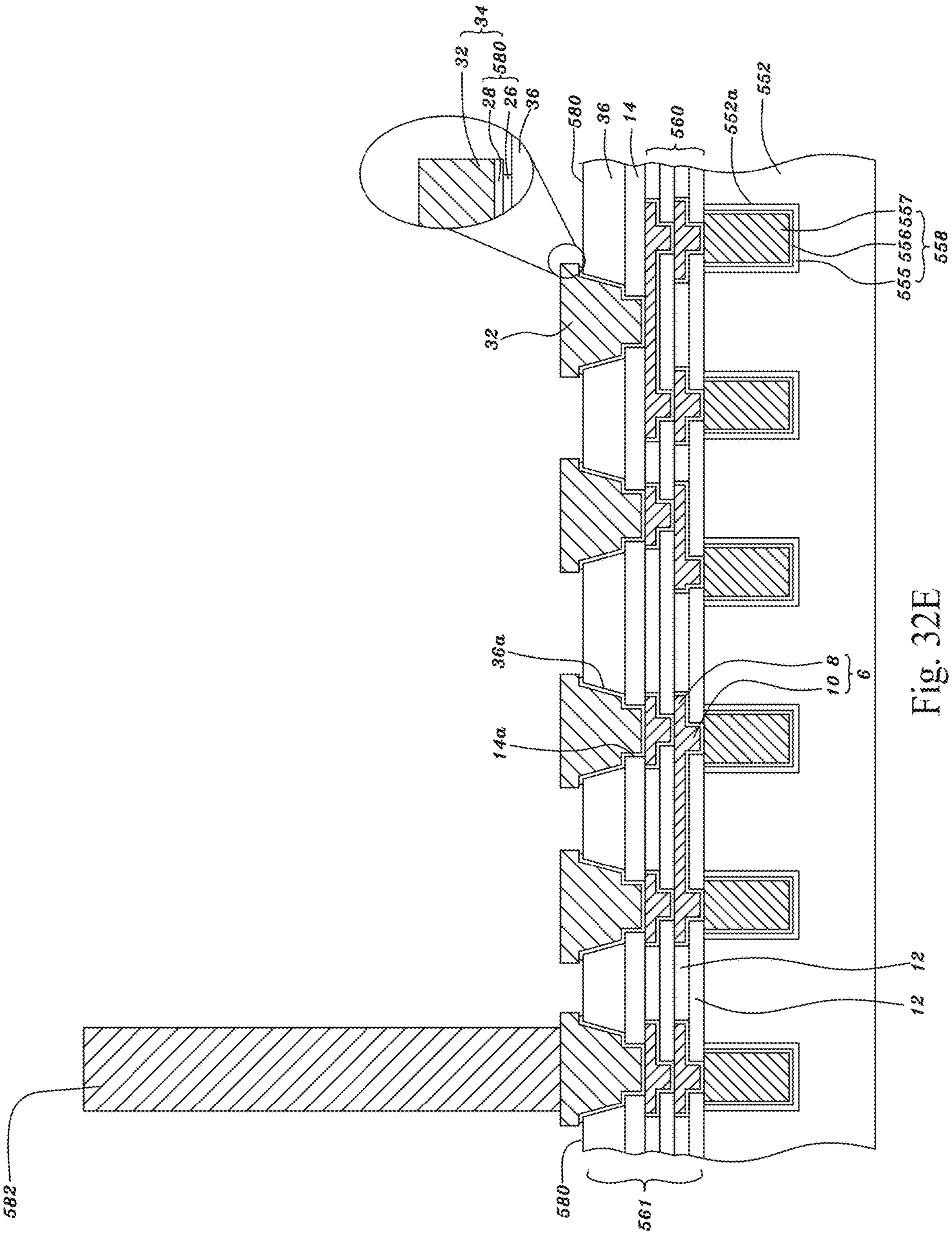

Next, referring to FIG. 32E, most of the photoresist layer 581 may be removed using an organic solution with amide and then the electroplating seed layer 28 and adhesion layer 26 of the adhesion/seed layer 580 not under the metal layer 32 may be etched. The removing and etching processes may be referred respectively to the process for removing the photoresist layer 30 and etching the electroplating seed layer 28 and adhesion layer 26 as illustrated in FIG. 23F. Thereby, the micro-bumps 34 and through package vias (TPVs) 582 may be formed on the interposer 551.

(3) Package for COIP Logic Drive

Figure 29G:
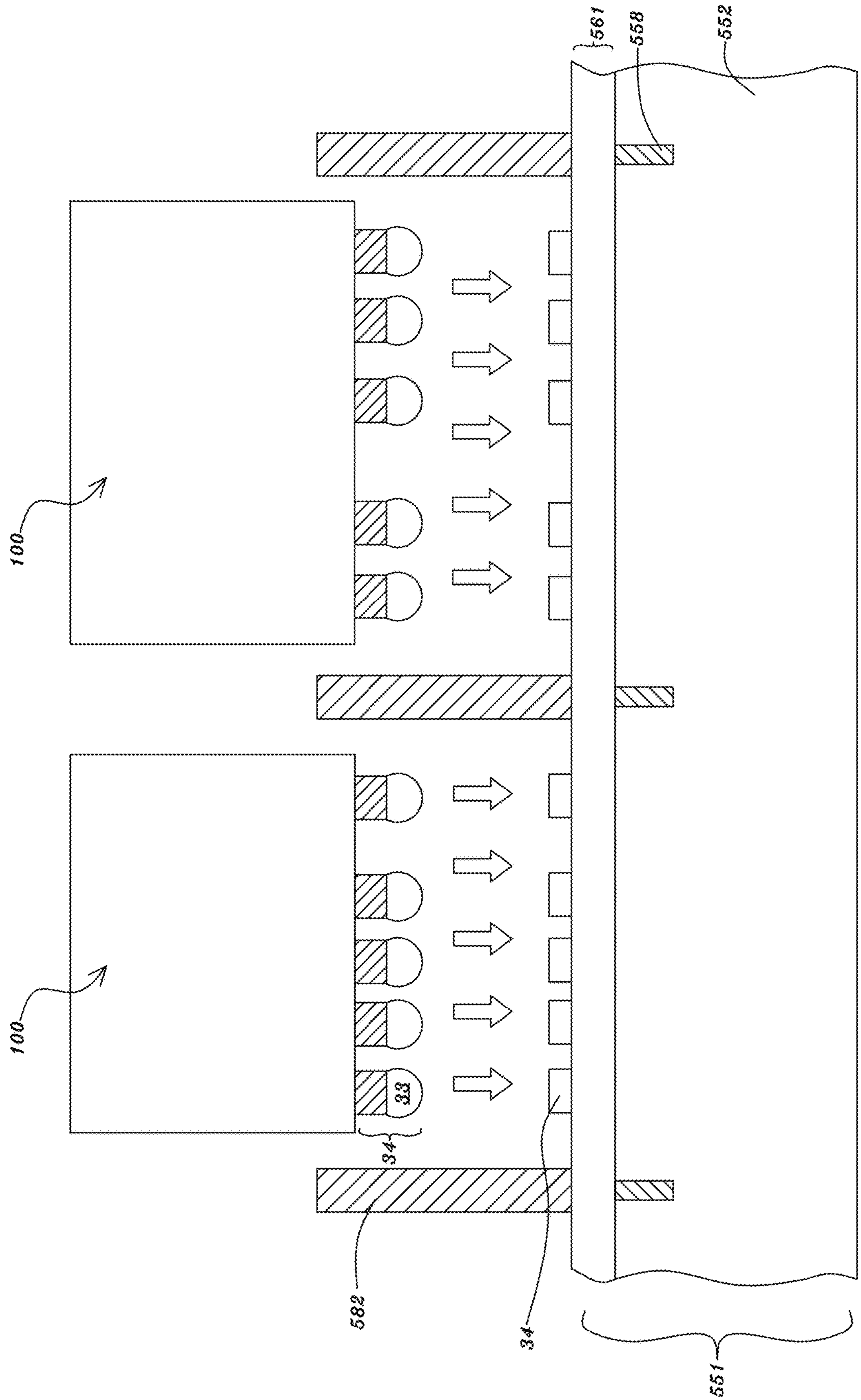
Figure 29H:
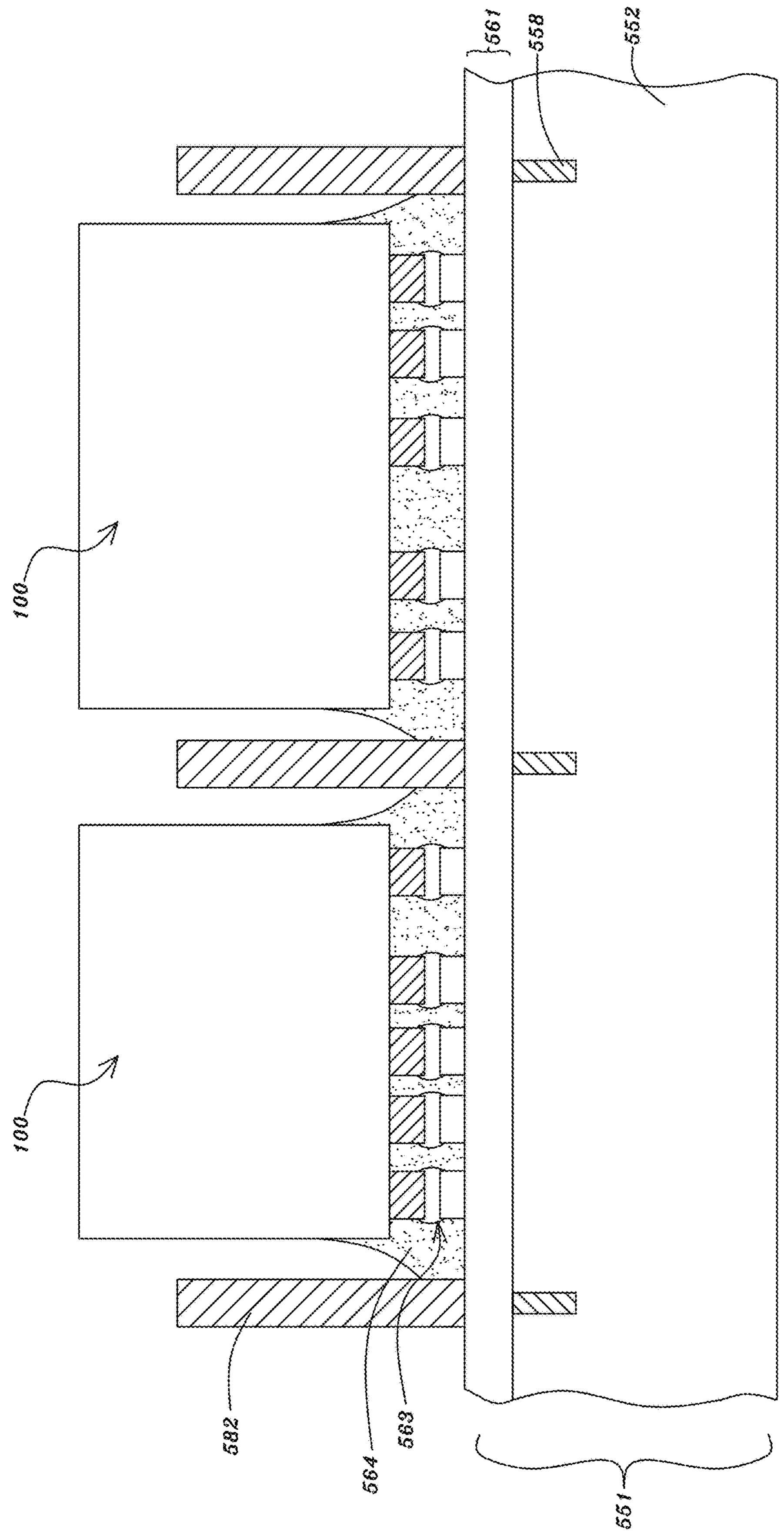
Figure 30A:
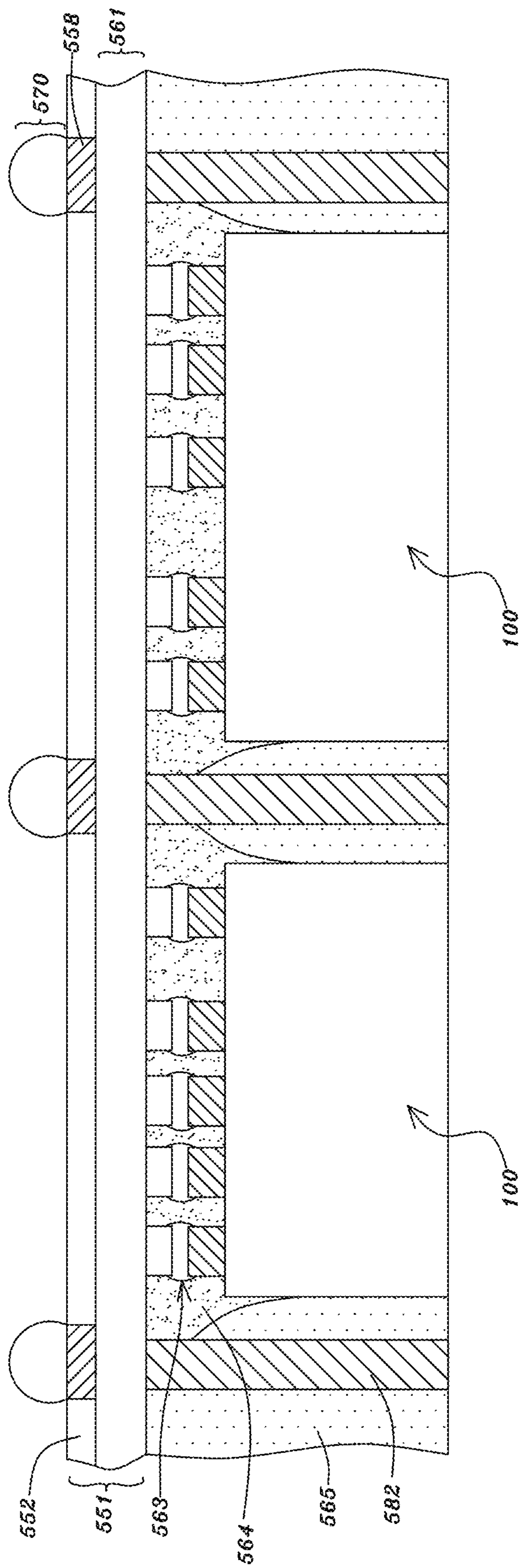

Next, referring to FIG. 29G or 30A, each of the semiconductor chips 100 as seen in FIGS. 23H, 23I, 24J-24M or 24O may have its micro-bumps 34 of the first type to be bonded to the second type of micro-bumps 34 of the interposer 551 as illustrated in FIG. 29F or 32E into multiple bonded contacts 563 as seen in FIG. 29H or 30A. Alternatively, each of the semiconductor chips 100 as seen in FIG. 23H, 23I, 24J-24M or 24O may have its micro-bumps 34 of the first type to be bonded to be bonded to the first type of micro-bumps 34 as illustrated in FIG. 29F into multiple bonded contacts 563 as seen in FIG. 29H or 30A. Alternatively, each of the semiconductor chips 100 as seen in FIG. 23J, 23K or 24N may have its micro-bumps 34 of the second type to be bonded to the first type of micro-bumps 34 of the interposer 551 as illustrated in FIG. 29F into multiple bonded contacts 563 as seen in FIG. 29H or 30A. The bonding process may be referred to the process for bonding the micro-bumps 34 of the semiconductor chips 100 to the micro-bumps 34 of the interposer 551 as illustrated in FIG. 25K or 26M.

Figure 29I:
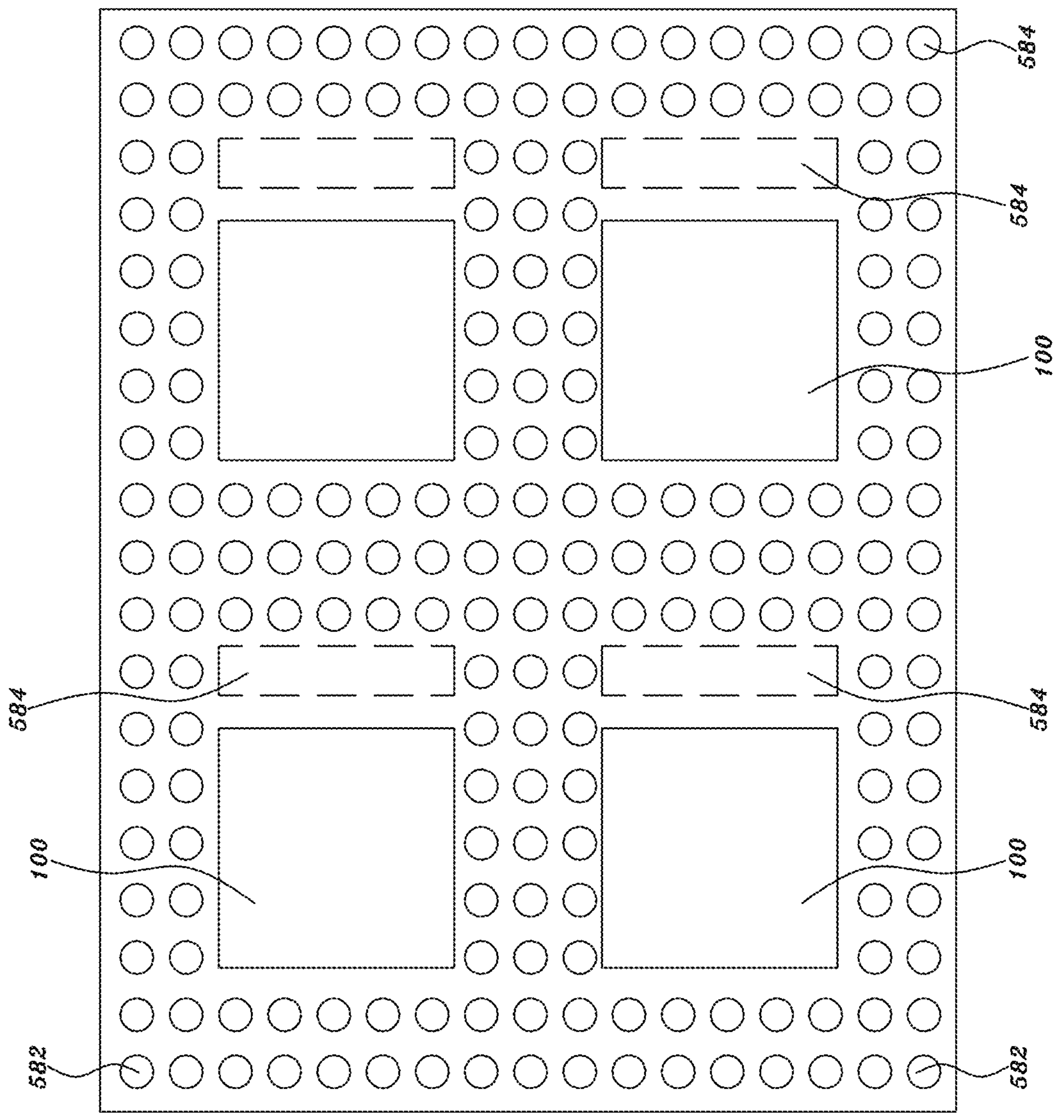

Next, referring to FIGS. 29H and 29I or to FIG. 30A, an underfill 564, such as epoxy resins or compounds, may be filled into a gap between each of the semiconductor chips 100 and the interposer 551 as illustrated in FIG. 29F or 32E by a dispensing method performed using a dispenser. The underfill 564 may then be cured at temperature equal to or above 100° C., 120° C., or 150° C. FIG. 29I is a top view showing a path for a dispenser moving to fill an underfill into a gap between a semiconductor chip and an interposer in accordance with the present application. Referring to FIG. 29I, a dispenser may move along multiple paths or clearness 584 each arranged between multiple of the TPVs 582 arranged in a line and one of the semiconductor chips 100 to dispense the underfill 564 into the gap between said one of the semiconductor chips 100 and the interposer 551 as illustrated in FIG. 29H or 30A.

Figure 29J:
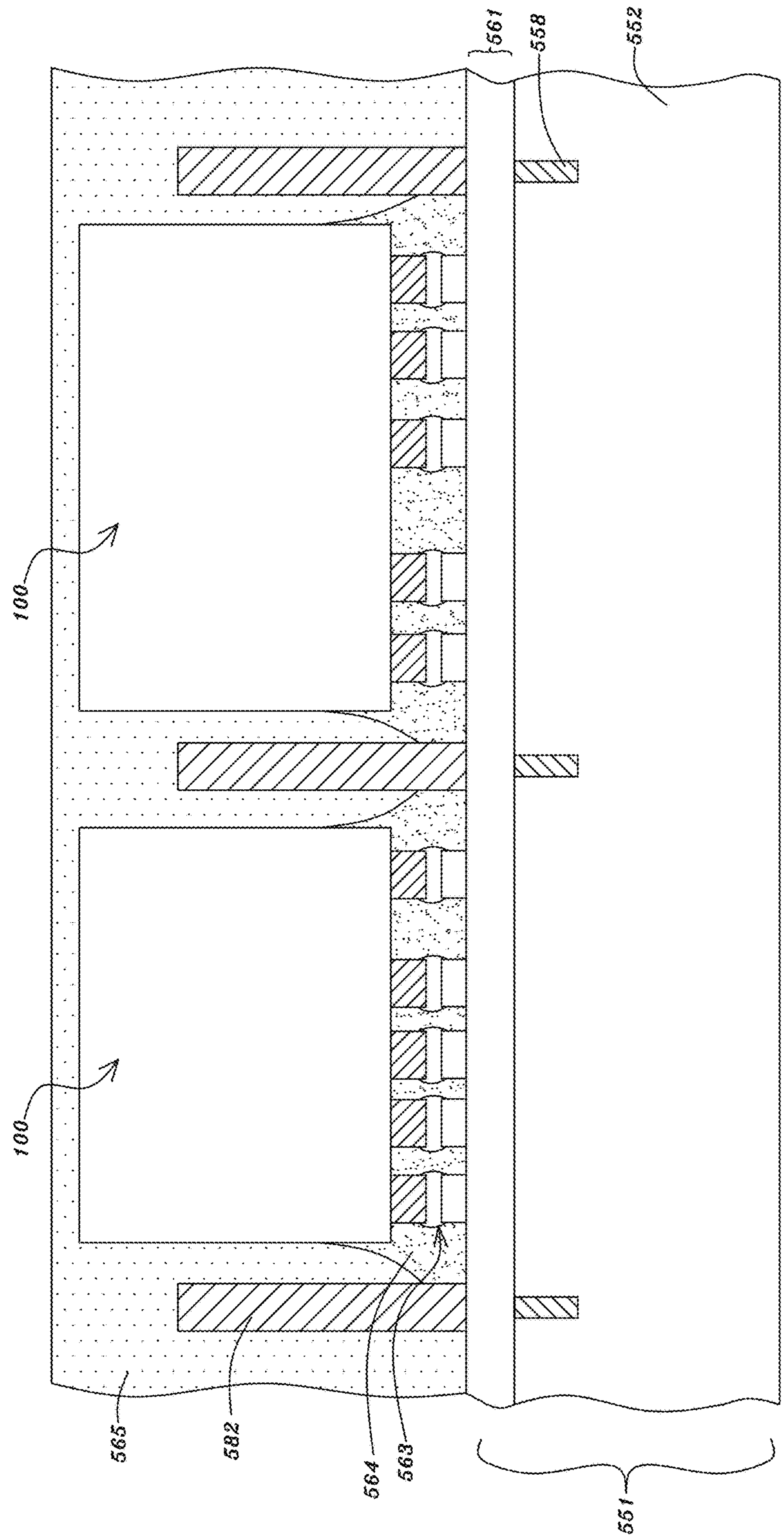

Next, referring to FIG. 29J or FIG. 30A, a polymer layer 565, e.g., resin or compound, may be applied to fill the gaps each between neighboring two of the semiconductor chips 100 and the gaps each between neighboring two of the TPVs 582 and cover the backsides 100*a* of the semiconductor chips 100 and the tips of the TPVs 582 by methods, for example, spin-on coating, screen-printing, dispensing or molding in a wafer or panel format. The specification of the polymer layer 565 and the process for forming the same may be referred to those as illustrated in FIG. 25N or 26P.

Figure 29K:
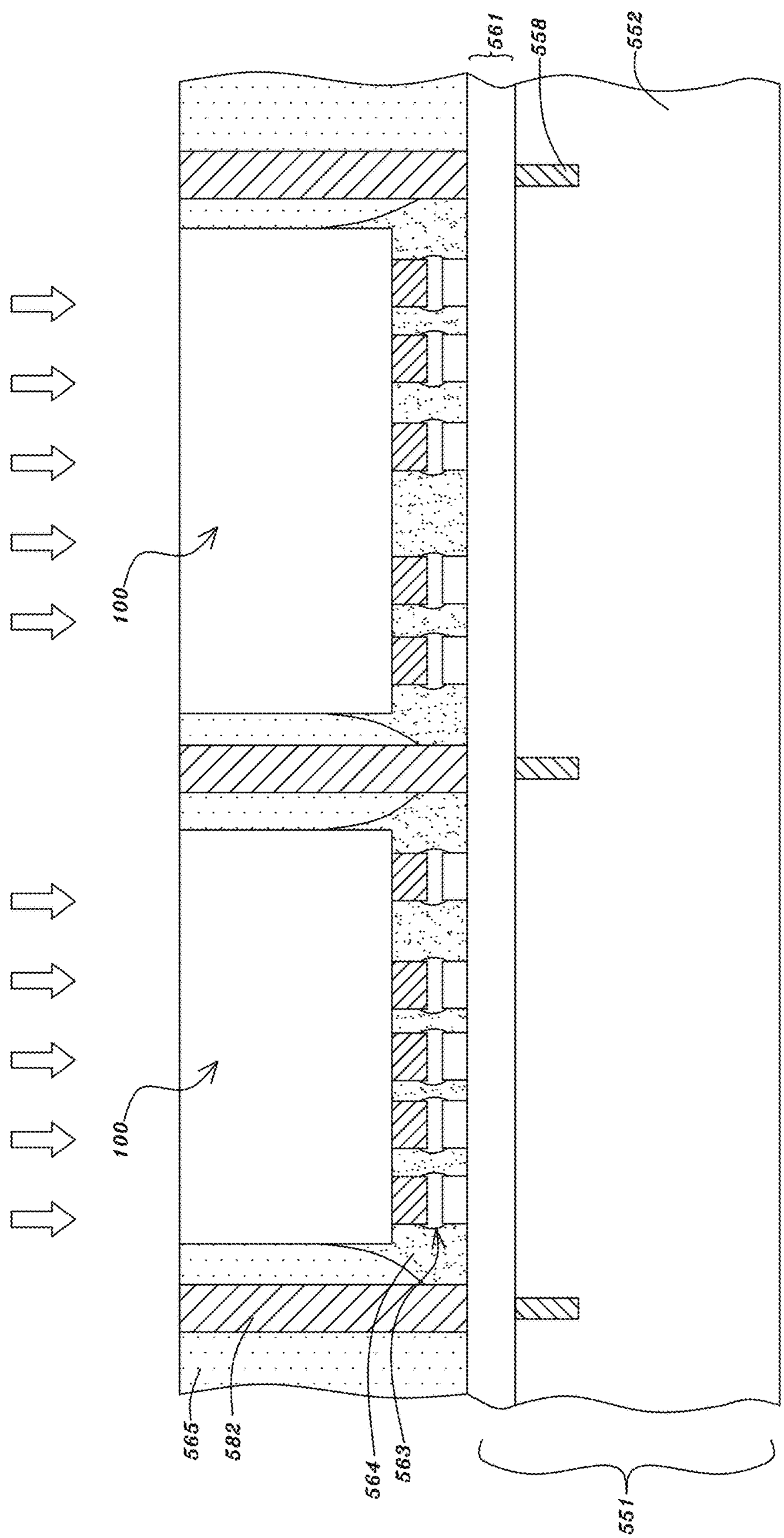

Next, referring to FIG. 29K or FIG. 30A, a chemical mechanical polishing (CMP), polishing or grinding process may be applied to remove a top portion of the polymer layer 565 and top portions of the semiconductor chips 100 and to planarize a top surface of the polymer layer 565 until all of the tips of the TPVs 582 are fully exposed.

Figure 29L:
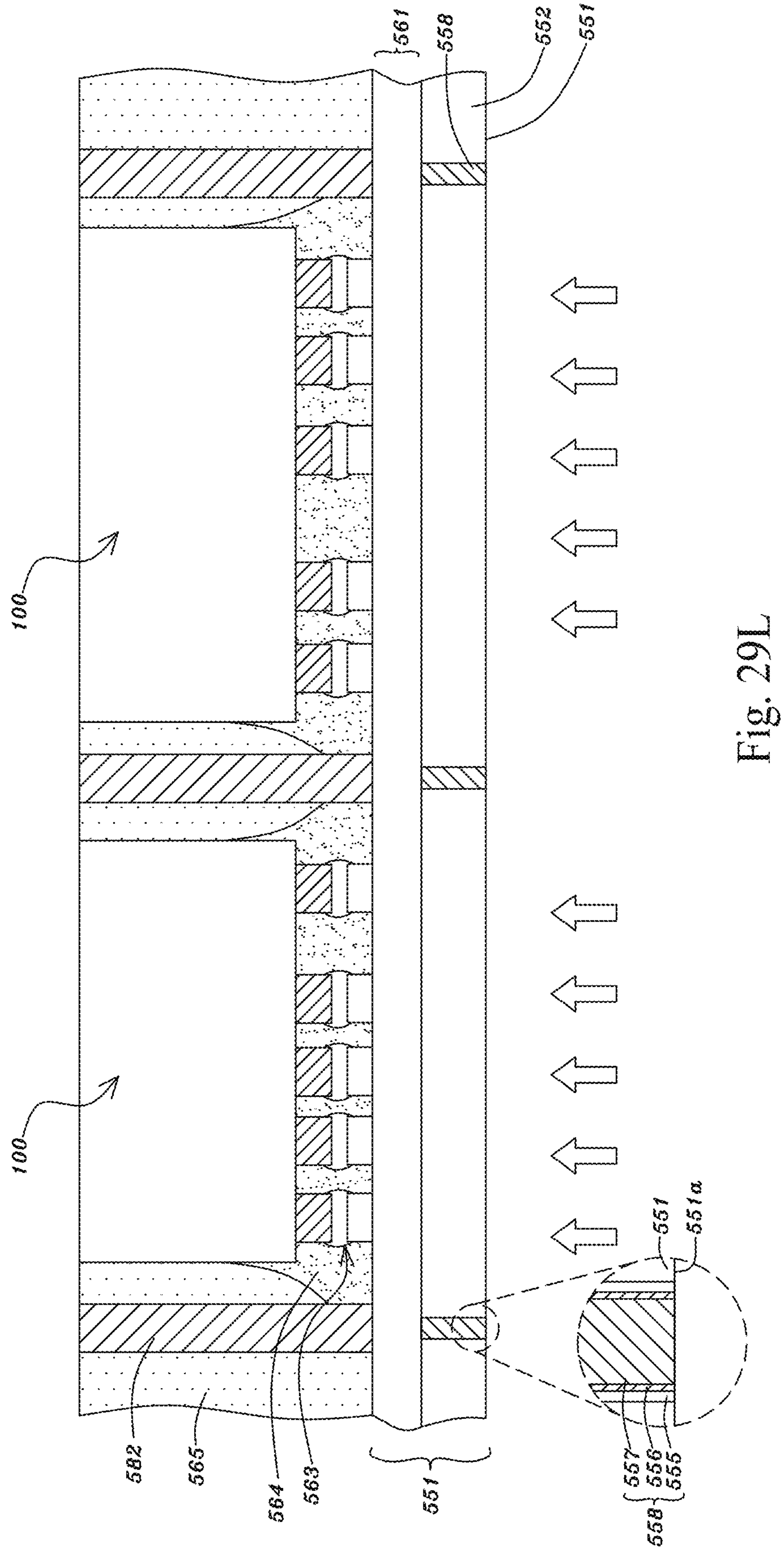

Next, referring to FIG. 29L or FIG. 30A, the interposer 551 as illustrated in FIG. 29F or 32E has a backside 551*a* to be polished by a CMP process or a wafer backside grinding process until each of the vias 558 is exposed, that is, its insulating layer 555 at its backside is removed into an insulating lining surrounding its adhesion/seed layer 556 and copper layer 557, and a backside of its copper layer 557 or a backside of the adhesion layer or electroplating seed layer of its adhesion/seed layer 556 is exposed.

Figure 29M:
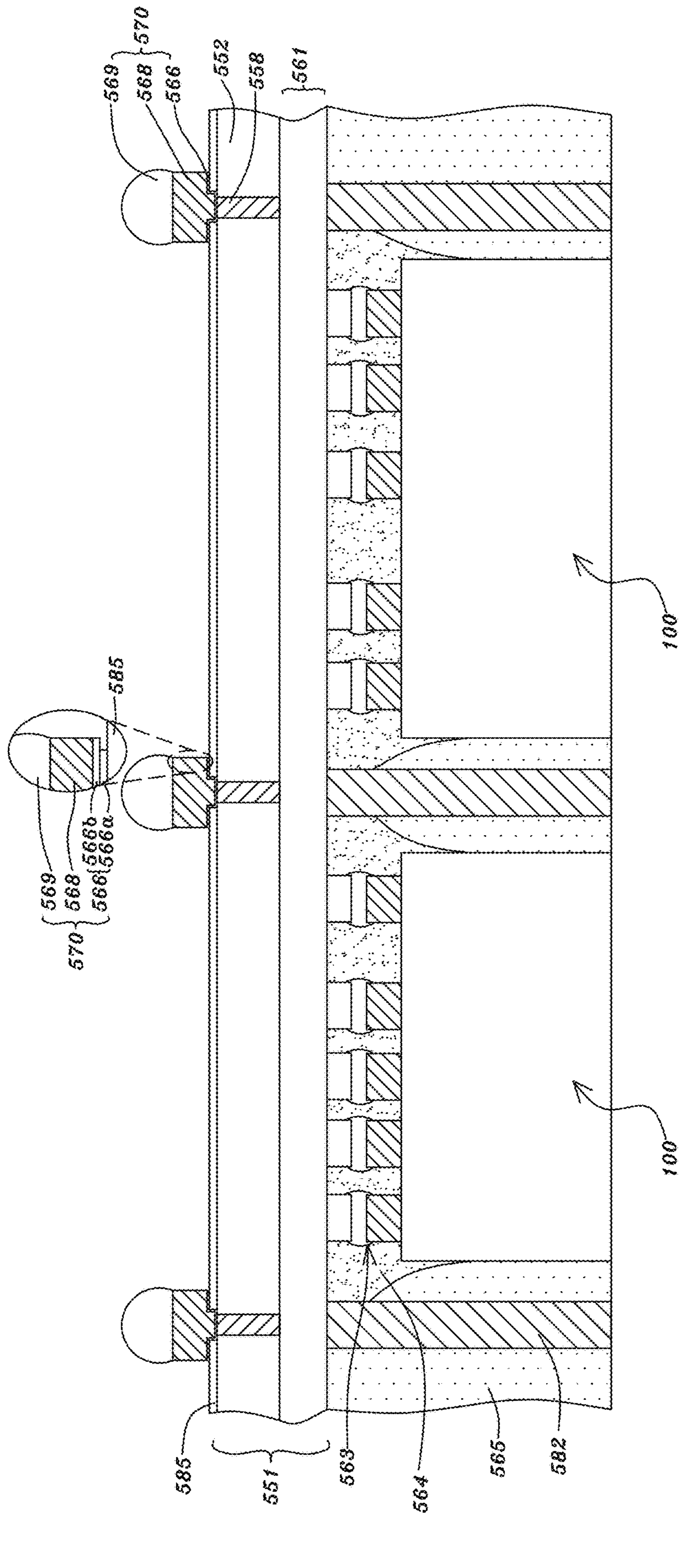

Next, referring to FIG. 29M, the polymer layer 585 as illustrated in FIG. 25Q may be formed on a backside of the interposer 551 formed with the first type of vias 558 and the metal bumps or pillars 570 as illustrated in FIGS. 25R-25V may be formed on the backside of the interposer 551 formed with the first type of vias 558. The specification of the polymer layer 585 and the process for forming the same may be referred to those as illustrated in FIG. 25Q. The specification of the metal bumps or pillars 570 and the process for forming the same may be referred to those as illustrated in FIGS. 25R-25V. In this case, the TPVs 582 is formed on the polymer layer 36 and topmost one of the interconnection metal layers 8 of the FISIP 560 as illustrated in FIG. 29F; alternatively, the TPVs 582 may be formed on the metal layer 32 for the pads for the TPVs as seen in FIG. 32E.

Alternatively, referring to FIG. 30A, the metal bumps or pillars 570 as illustrated in FIG. 26S may be formed on a backside of the interposer 551 formed with the second type of vias 558. The specification of the metal bumps or pillars 570 and the process for forming the same may be referred to those as illustrated in FIG. 26S. In this case, the TPVs 582 is formed on the polymer layer 36 and topmost one of the interconnection metal layers 8 of the FISIP 560 as illustrated in FIG. 29F; alternatively, the TPVs 582 may be formed on the metal layer 32 for the pads for the TPVs as seen in FIG. 32E.

Figure 29N:
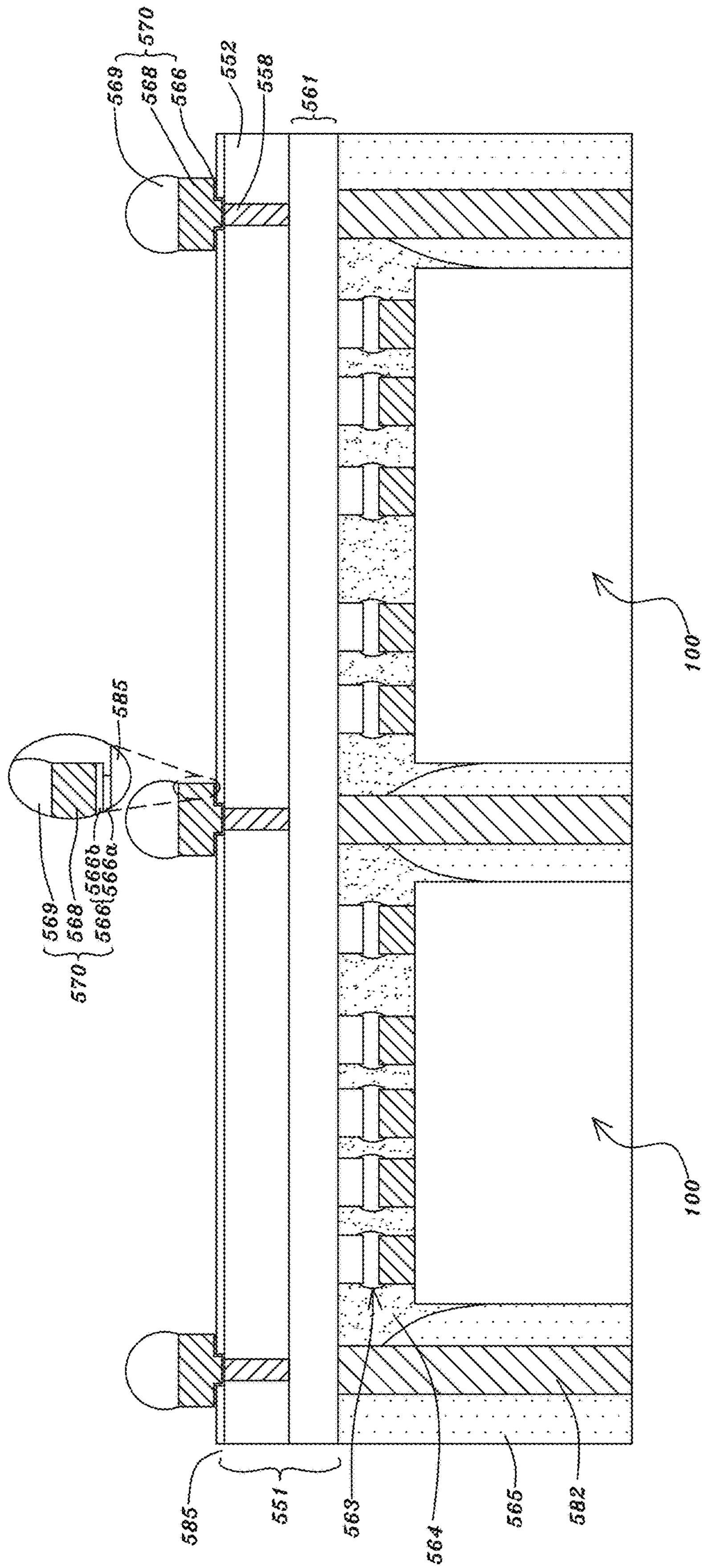
Figure 290:
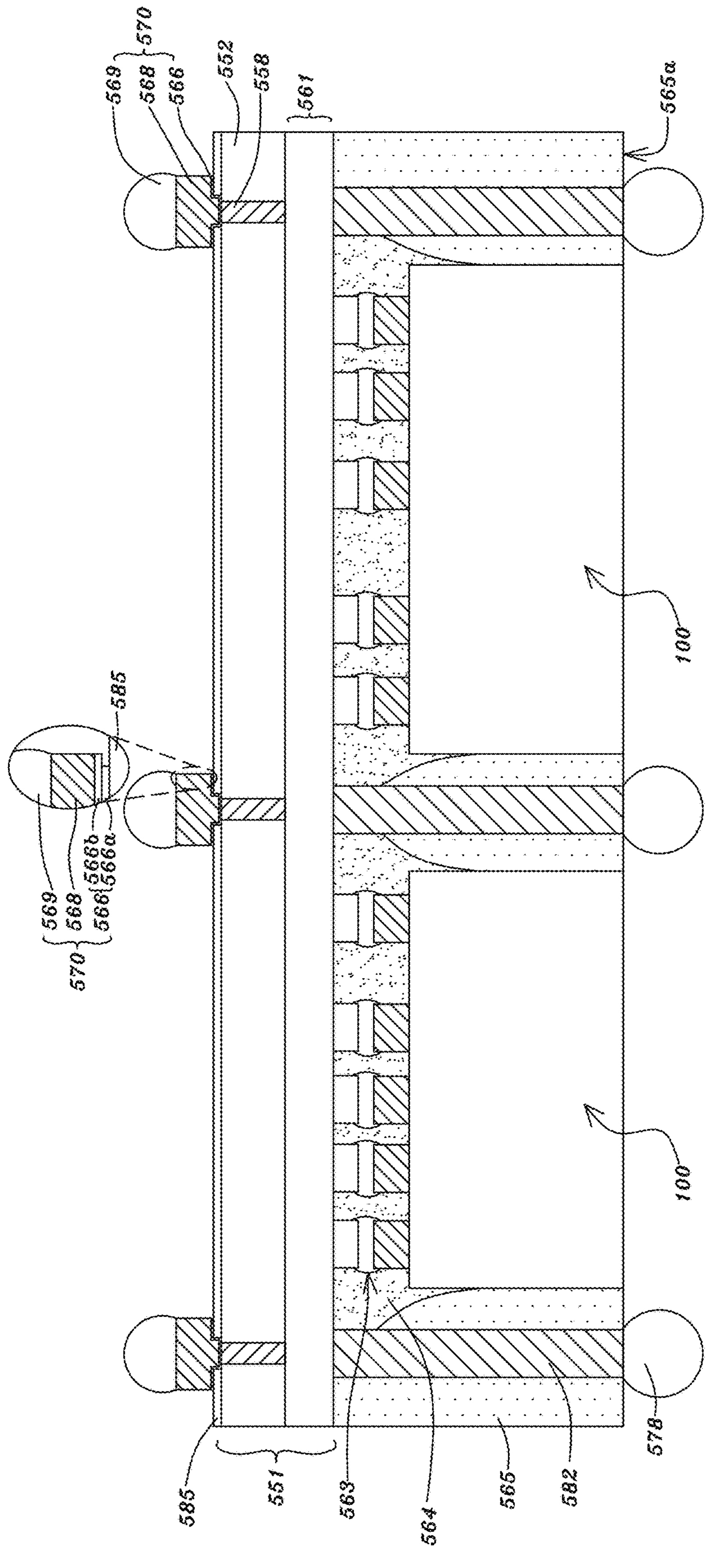
Figure 30B:
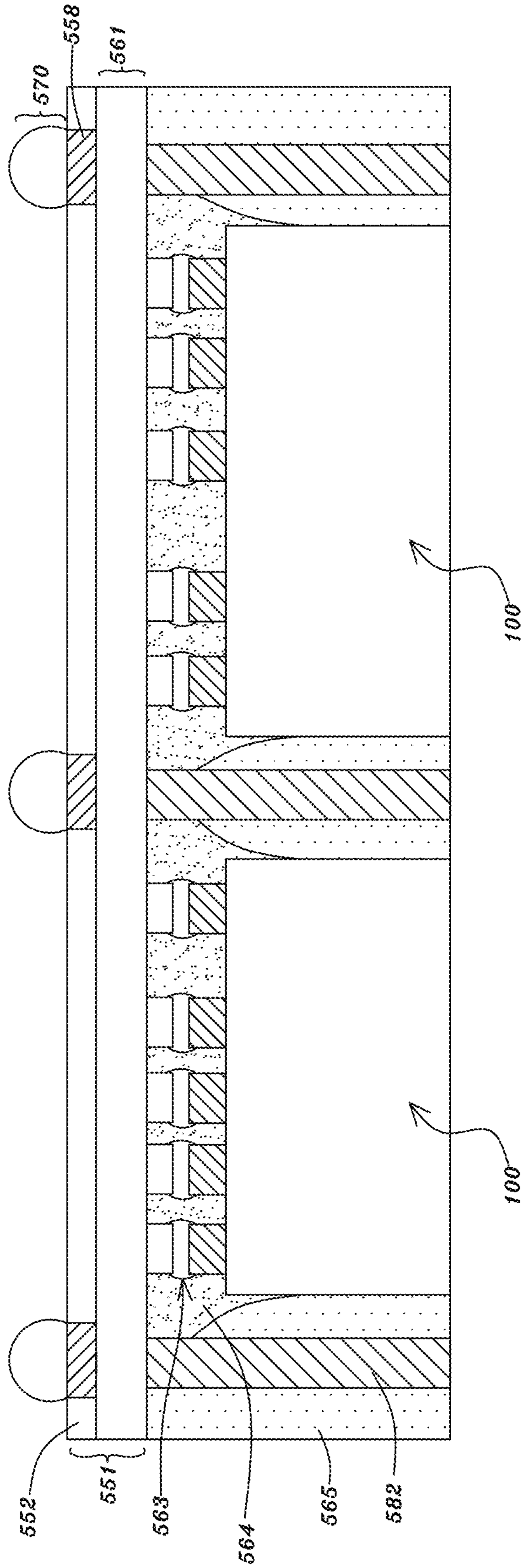

Next, the package structure shown in FIG. 29M or 30A may be separated, cut or diced into multiple individual chip packages, i.e., standard commodity COIP logic drives 300 or single-layer-packaged logic drive as shown in FIG. 29N or 30B by a laser cutting process or by a mechanical cutting process.

Figure 30C:
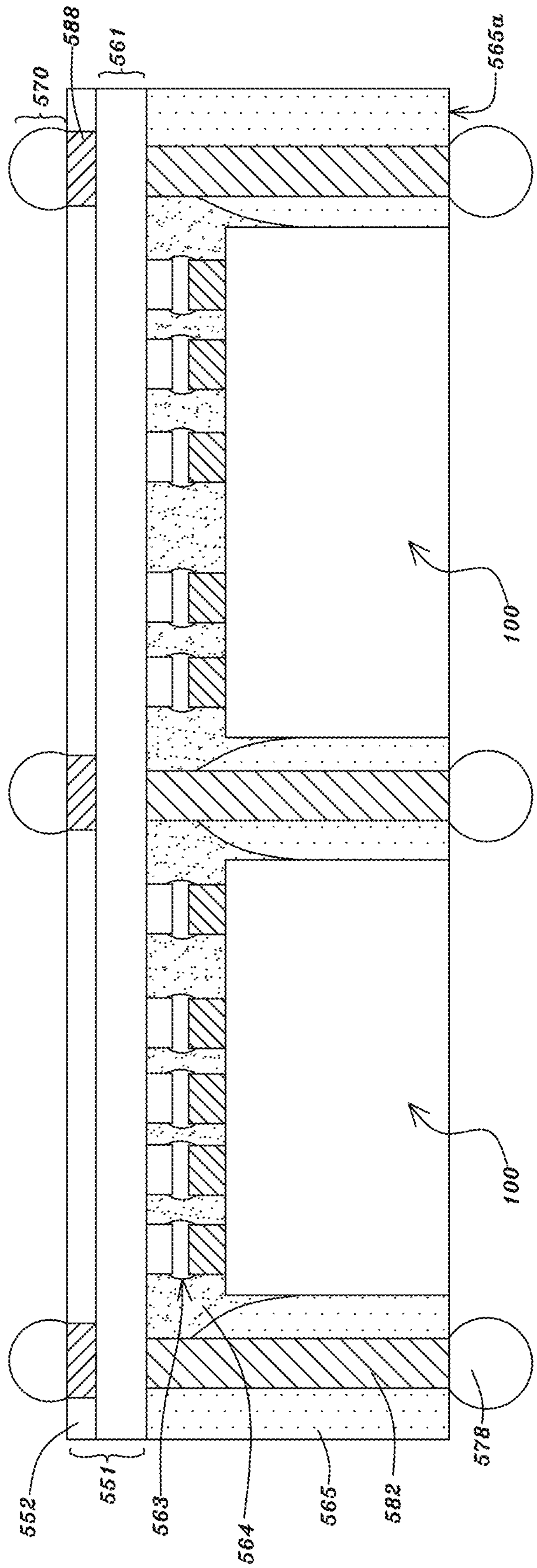

Alternatively, referring to FIGS. 29O and 30C, after the metal bumps 34 are formed on the backside of the interposer 551 as seen in FIG. 29M or 30B, multiple solder bumps 578 may be formed on the exposed tips of the TPVs 582 by a method of screen printing or solder ball mounting. Next, the package structure formed with the solder bumps 578 may be separated, cut or diced into multiple individual chip packages, i.e., standard commodity COIP logic drives 300 or single-layer-packaged logic drive as shown in FIG. 29O or 30C, by a laser cutting process or by a mechanical cutting process. The solder bumps 578 may join an external electronic component to connect the COIP logic drive 300 to the external electronic component. The material used for forming the solder bumps 578 may be a lead-free solder containing tin, copper, silver, bismuth, indium, zinc, antimony, and/or traces of other metals, for example, Sn—Ag—Cu (SAC) solder, Sn—Ag solder, or Sn—Ag—Cu—Zn solder. Each of the solder bumps 578 may have a height, from a backside surface 565*a* of the polymer layer 565, between 5 μm and 150 μm, between 5 μm and 120 μm, between 10 μm and 100 μm, between 10 μm and 60 μm, between 10 μm and 40 μm or between 10 μm and 30 μm, or greater or taller than or equal to 75 μm, 50 μm, 30 μm, 20 μm, 15 μm or 10 μm, for example, and a largest dimension in cross-sections, such as a diameter of a circle shape or a diagonal length of a square or rectangle shape, between 5 μm and 200 μm, between 5 μm and 150 μm, between 5 μm and 120 μm, between 10 μm and 100 μm, between 10 μm and 60 μm, between 10 μm and 40 μm, or between 10 μm and 30 μm, or greater than or equal to 100 μm, 60 μm, 50 μm, 40 μm, 30 μm, 20 μm, 15 μm or 10 μm, for example. The smallest space from one of the solder bumps 578 to its nearest neighboring one of the solder bumps 578 is, for example, between 5 μm and 150 μm, between 5 μm and 120 μm, between 10 μm and 100 μm, between 10 μm and 60 μm, between 10 μm and 40 μm, or between 10 μm and 30 μm, or greater than or equal to 60 μm, 50 μm, 40 μm, 30 μm, 20 μm, 15 μm or 10 μm.

The standard commodity COIP logic drive 300 as shown in FIG. 29N, 29O, 30B or 30C may be in a shape of square or rectangle with a certain widths, lengths and thicknesses. An industry standard may be set for the shape and dimensions of the standard commodity COIP logic drive 300. For example, the standard shape of the COIP logic drive 300 may be a square with a width greater than or equal to 4 mm, 7 mm, 10 mm, 12 mm, 15 mm, 20 mm, 25 mm, 30 mm, 35 mm or 40 mm, and a thickness greater than or equal to 0.03 mm, 0.05 mm, 0.1 mm, 0.3 mm, 0.5 mm, 1 mm, 2 mm, 3 mm, 4 mm, or 5 mm. Alternatively, the standard shape of the standard commodity COIP logic drive 300 may be a rectangle with a width greater than or equal to 3 mm, 5 mm, 7 mm, 10 mm, 12 mm, 15 mm, 20 mm, 25 mm, 30 mm, 35 mm or 40 mm, a length greater than or equal to 5 mm, 7 mm, 10 mm, 12 mm, 15 mm, 20 mm, 25 mm, 30 mm, 35 mm, 40 mm, 45 mm or 50 mm, and a thickness greater than or equal to 0.03 mm, 0.05 mm, 0.1 mm, 0.3 mm, 0.5 mm, 1 mm, 2 mm, 3 mm, 4 mm, or 5 mm. Furthermore, the metal bumps or pillars 570 at a backside of the interposer 551 in the logic drive 300 may be in a standard footprint, for example, in an area array of M×N with a standard dimension of pitch and space between neighboring two of the metal bumps or pillars 570. The locations of the metal bumps or pillars 570 are also at a standard location.

Package-On-Package (POP) Assembly for COIP LOGIC Drives

Figure 31A:
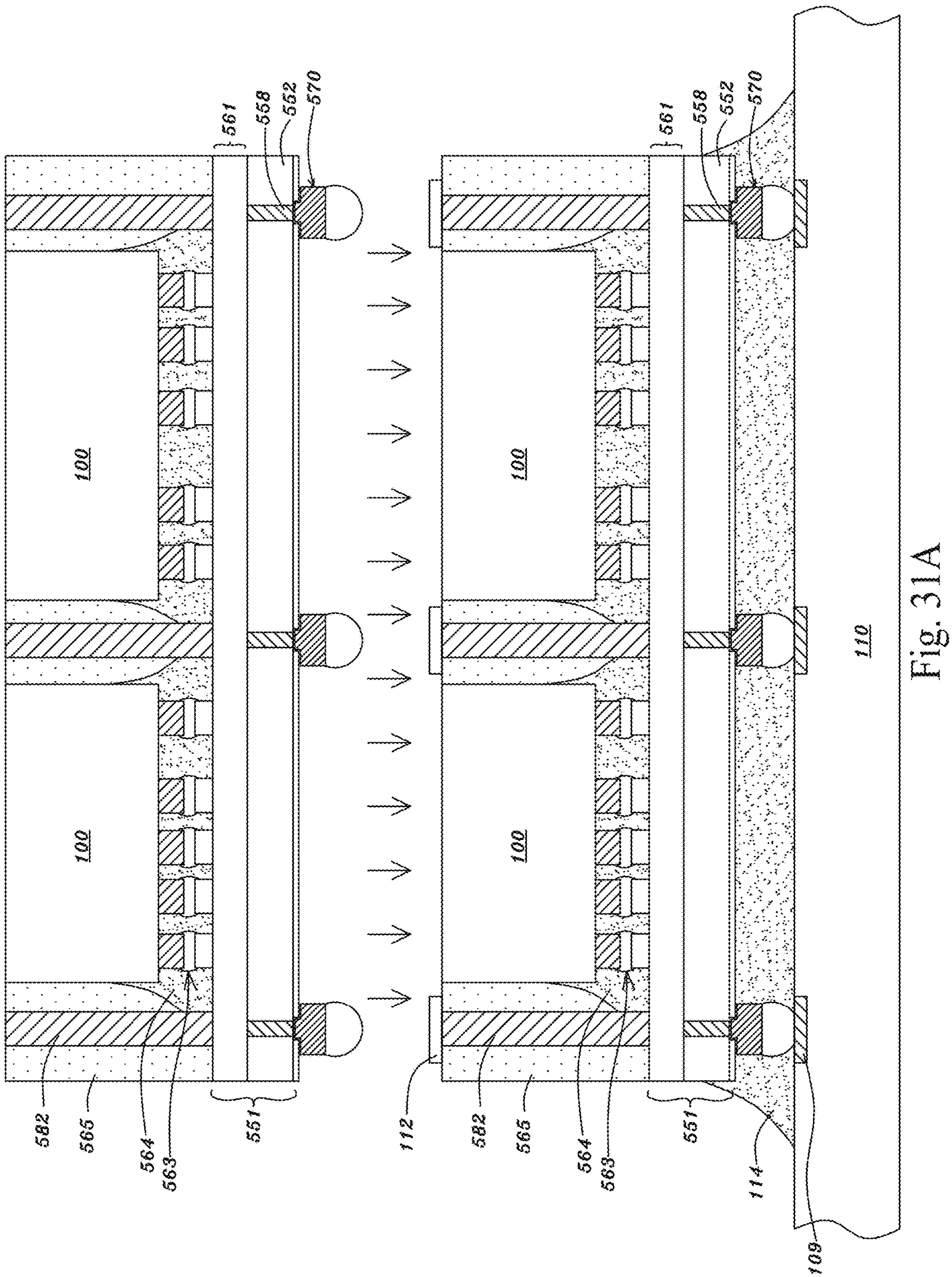
FIGS. 31A-31F are schematically views showing a process for fabricating a package-on-package assembly in accordance with an embodiment of the present application.
Figure 31B:
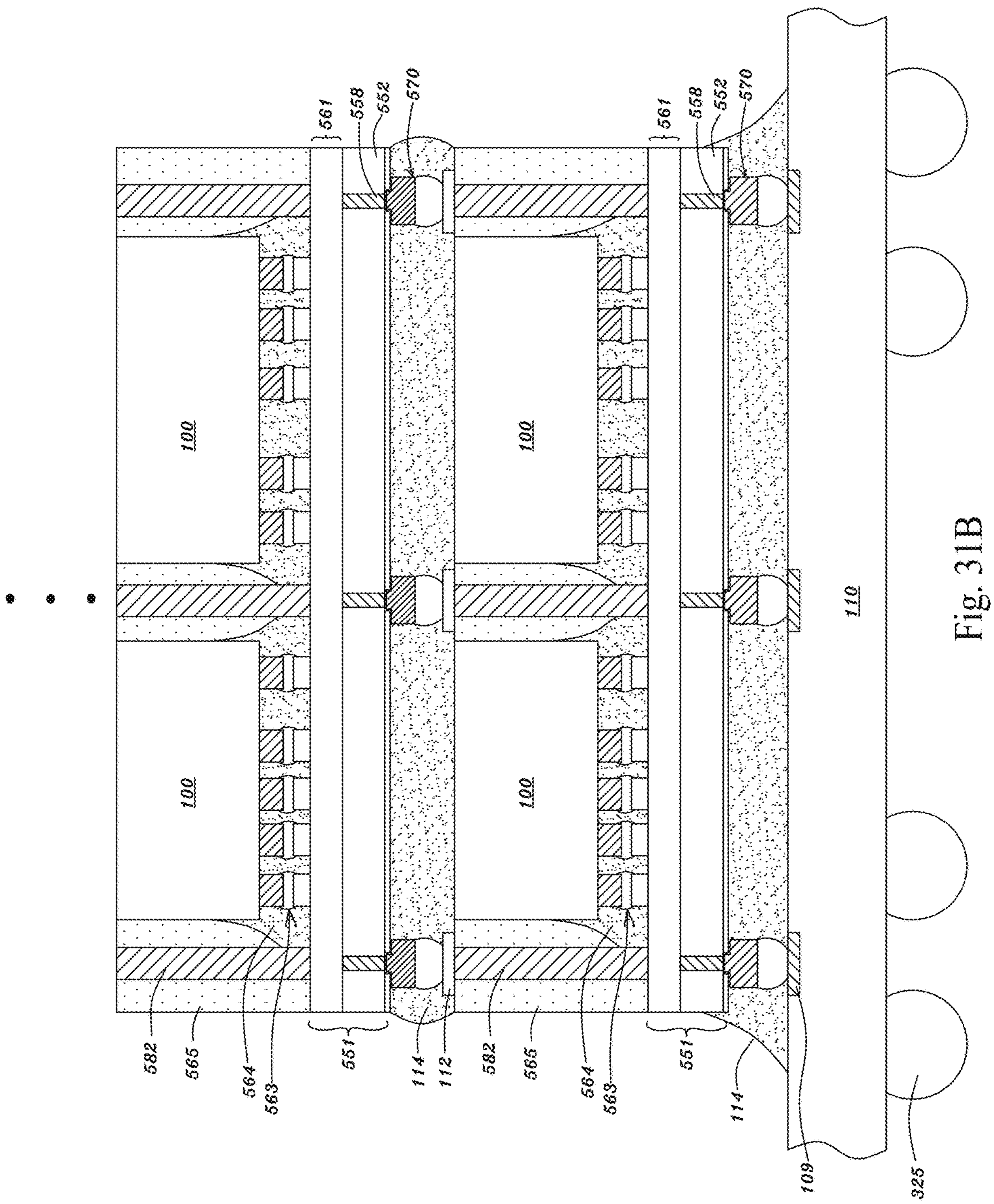
Figure 31C:
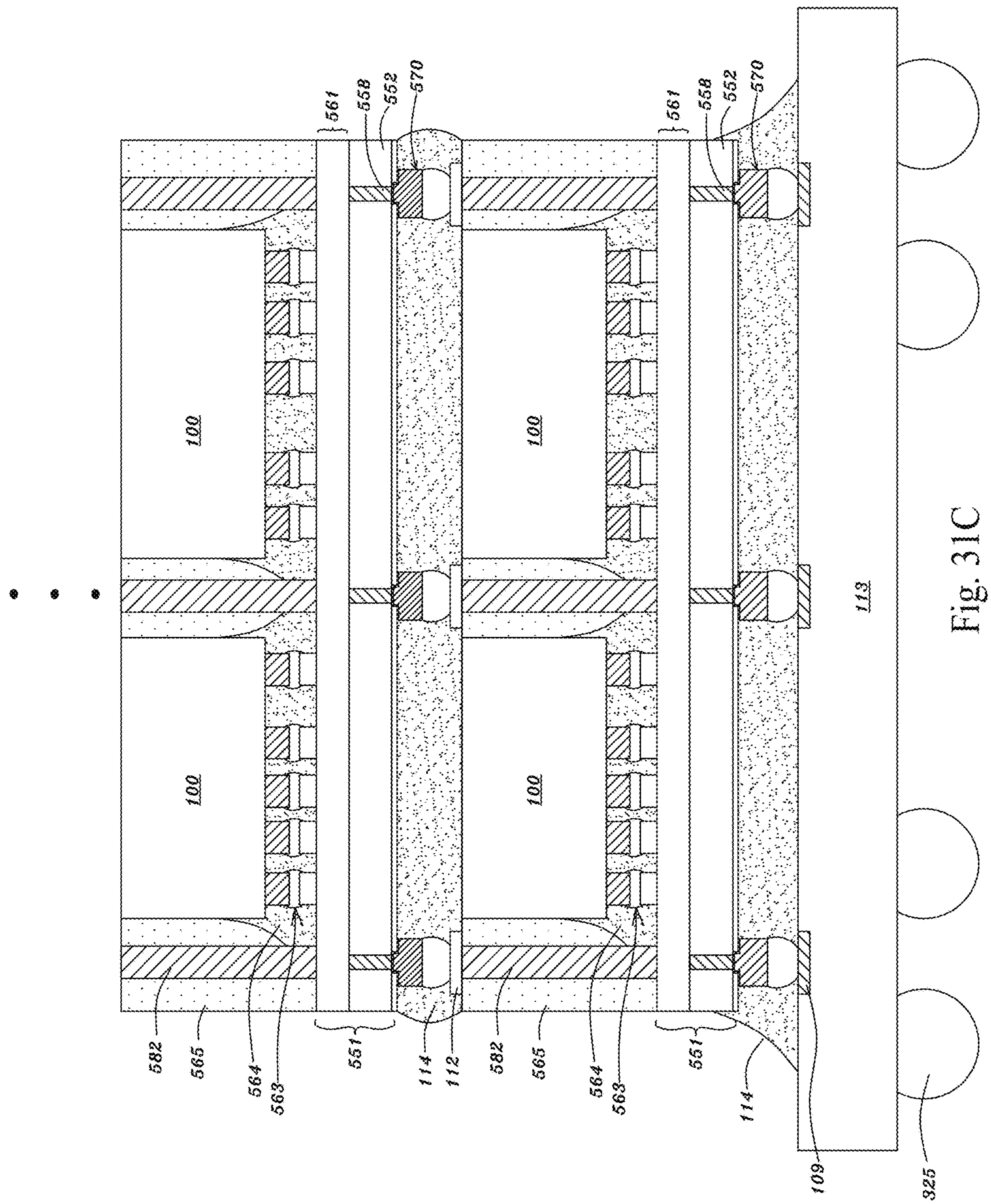

FIGS. 31A-31C are schematically views showing a process for fabricating a package-on-package assembly in accordance with an embodiment of the present application. Referring to FIGS. 31A-31C, when a top one of the COIP logic drives as seen in FIG. 29N or 30B is mounted onto a bottom one of the COIP logic drives 300, the bottom one of the COIP logic drives 300 may have its TPVs 582 in its polymer layer 565 to couple to circuits, interconnection metal schemes, metal pads, metal pillars or bumps, and/or components of the top one of the COIP logic drives 300 at the backside of the bottom one of the COIP logic drives 300. The process for fabricating a package-on-package assembly is mentioned as below:

First, referring to FIG. 31A, a plurality of the bottom one of the COIP logic drives 300 (only one is shown) may have its metal pillars or bumps 570 mounted onto multiple metal pads 109 of a circuit carrier or substrate 110 at a topside thereof, such as printed circuit board (PCB), ball-grid-array (BGA) substrate, flexible circuit film or tape, or ceramic circuit substrate. An underfill 114 may be filled into a gap between the circuit carrier or substrate 110 and the bottom one of the COIP logic drives 300. Alternatively, the underfill 114 between the circuit carrier or substrate 110 and the bottom one of the COIP logic drives 300 may be skipped. Next, a surface-mount technology (SMT) may be used to mount a plurality of the top one of the COIP logic drives 300 (only one is shown) onto the plurality of the bottom one of the COIP logic drives 300, respectively.

For the surface-mount technology (SMT), solder or solder cream or flux 112 may be first printed on the backside surface 582*a* of the TPVs 582 of the bottom one of the COIP logic drives 300. Next, referring to FIG. 31B, the top one of the COIP logic drives 300 may have its metal pillars or bumps 570 placed on the solder or solder cream or flux 112. Next, a reflowing or heating process may be performed to fix the metal pillars or bumps 570 of the top one of the COIP logic drives 300 to the TPVs 582 of the bottom one of the COIP logic drives 300. Next, an underfill 114 may be filled into a gap between the top and bottom ones of the COIP logic drives 300. Alternatively, the underfill 114 between the top and bottom ones of the COIP logic drives 300 may be skipped.

In the next optional step, referring to FIG. 31B, other multiple of the COIP logic drives 300 as seen in FIG. 29N or 30B may have its metal pillars or bumps 570 mounted onto the TSVs 582 of the plurality of the top one of the COIP logic drives 300 using the surface-mount technology (SMT) and the underfill 114 is then optionally formed therebetween. The step may be repeated by multiple times to form three or more than three of the COIP logic drives 300 stacked on the circuit carrier or substrate 110.

Next, referring to FIG. 31B, multiple solder balls 325 are planted on a backside of the circuit carrier or substrate 110. Next, referring to FIG. 31C, the circuit carrier or structure 110 may be separated, cut or diced into multiple individual substrate units 113, such as printed circuit boards (PCBs), ball-grid-array (BGA) substrates, flexible circuit films or tapes, or ceramic circuit substrates, by a laser cutting process or by a mechanical cutting process. Thereby, the number i of the COIP logic drives 300 may be stacked on one of the substrate units 113, wherein the number i may be equal to or greater than 2, 3, 4, 5, 6, 7 or 8.

Figure 31D:
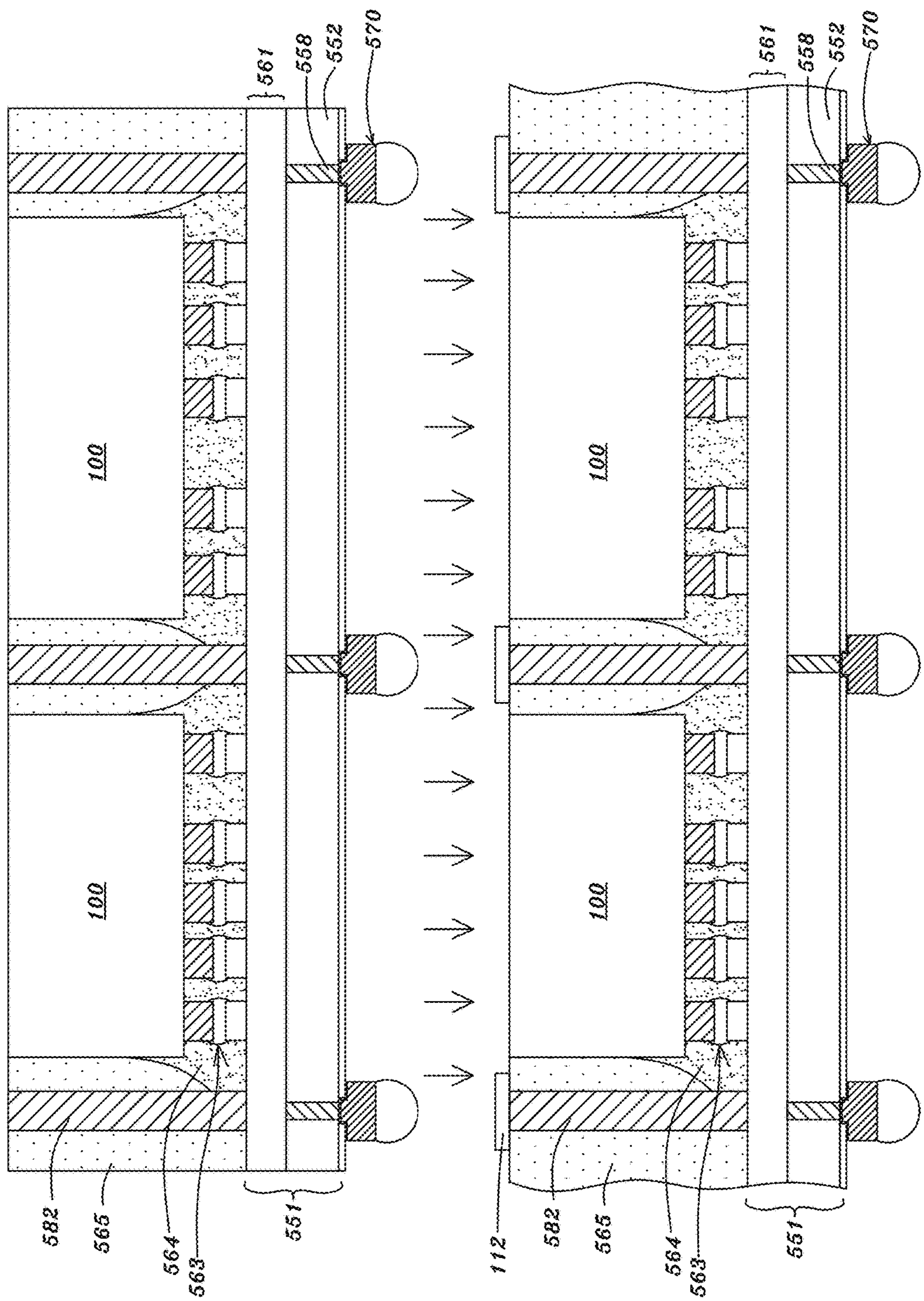
Figure 31E:
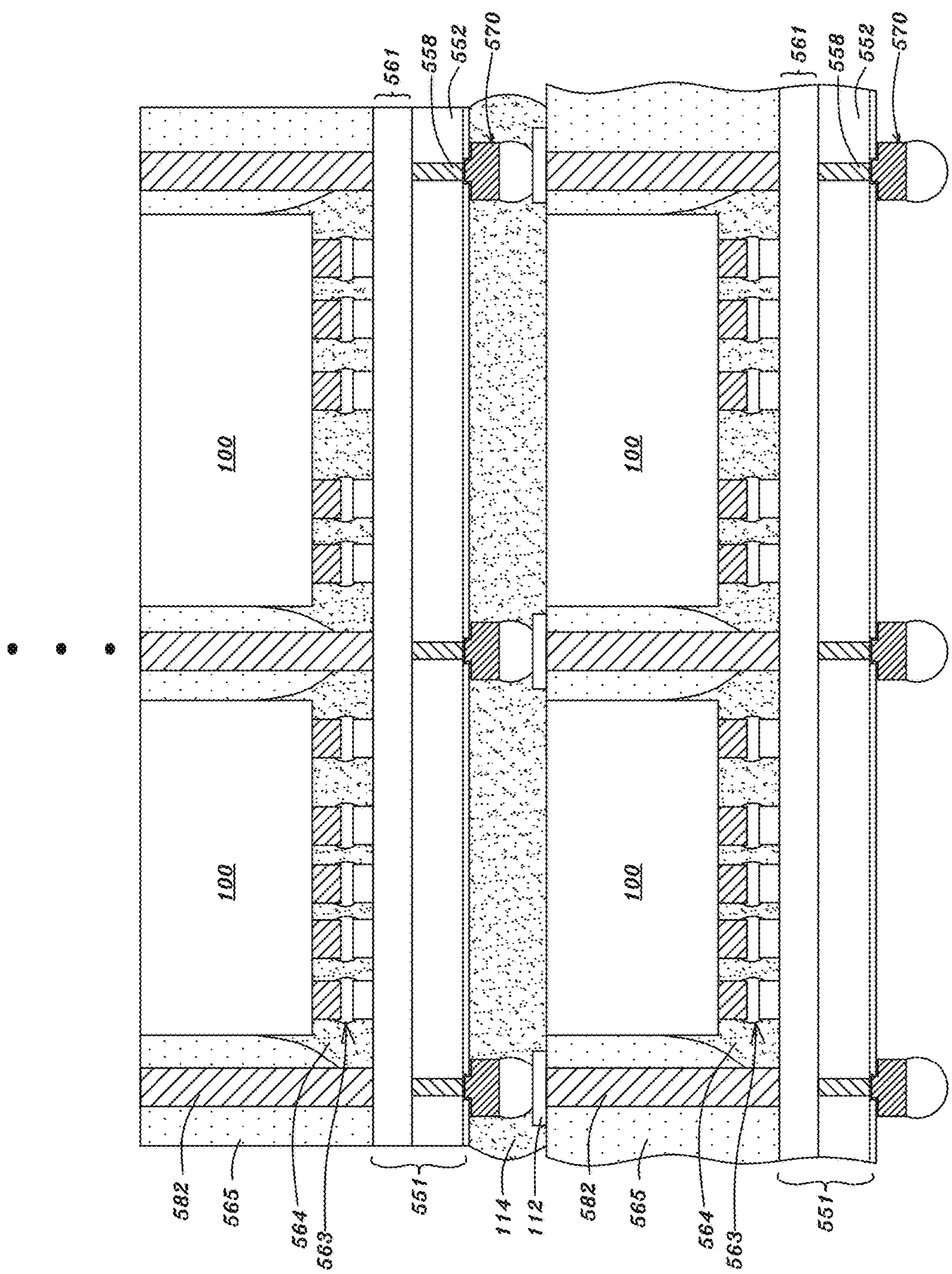
Figure 31F:
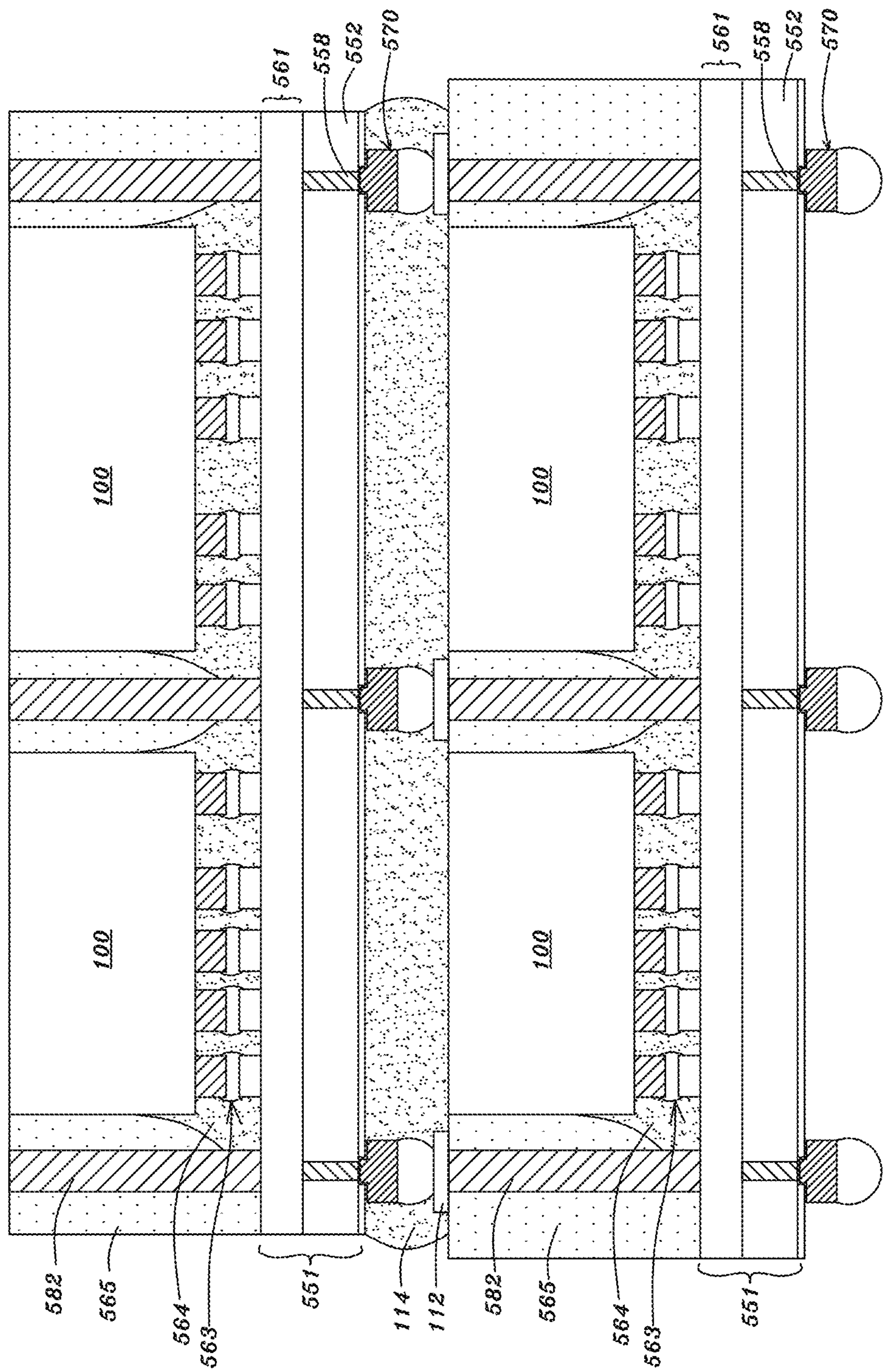

Alternatively, FIGS. 31D-31F are schematically views showing a process for fabricating a package-on-package assembly in accordance with an embodiment of the present application. Referring to FIGS. 31D and 31E, a plurality of the top one of the COIP logic drives 300 as seen in FIG. 29N or 30B may have its metal pillars or bumps 570 fixed or mounted, using the SMT technology, to the TPVs 582 of the structure in a wafer or panel level as seen in FIG. 29M or 30A before being separated into a plurality of the bottom one of the COIP logic drives 300.

Next, referring to FIG. 31E, the underfill 114 may be filled into a gap between each of the top ones of the COIP logic drives 300 as seen in FIG. 29N or 30B and the structure in a wafer or panel level as seen in FIG. 29M or 30A. Alternatively, the underfill 114 between each of the top ones of the COIP logic drives 300 as seen in FIG. 29N or 30B and the structure in a wafer or panel level as seen in FIG. 29M or 30A may be skipped.

In the next optional step, referring to FIG. 31E, other multiple of the COIP logic drives 300 as seen in FIG. 29N or 30B may have its metal pillars or bumps 570 mounted onto the TSVs 582 of the top ones of the COIP logic drives 300 using the surface-mount technology (SMT) and the underfill 114 is then optionally formed therebetween. The step may be repeated by multiple times to form two or more than two of the COIP logic drives 300 stacked on the structure in a wafer or panel level as seen in FIG. 29M or 30A.

Next, referring to FIG. 31F, the structure in a wafer or panel level as seen in FIG. 29M or 30A may be separated, cut or diced into a plurality of the bottom one of the COIP logic drives 300 by a laser cutting process or by a mechanical cutting process. Thereby, the number i of the COIP logic drives 300 may be stacked together, wherein the number i may be equal to or greater than 2, 3, 4, 5, 6, 7 or 8. Next, the COIP logic drives 300 stacked together may have a bottommost one provided with the metal pillars or bumps 570 to be mounted onto the multiple metal pads 109 of the circuit carrier or substrate 110 as seen in FIG. 31B, such as ball-grid-array substrate, at the topside thereof. Next, an underfill 114 may be filled into a gap between the circuit carrier or substrate 110 and the bottommost one of the COIP logic drives 300. Alternatively, the underfill 114 between the circuit carrier or substrate 110 and the bottommost one of the COIP logic drives 300 may be skipped. Next, multiple solder balls 325 are planted on a backside of the circuit carrier or substrate 110. Next, the circuit carrier or structure 110 may be separated, cut or diced into multiple individual substrate units 113, such as printed circuit boards (PCB) or BGA (Ball-Grid-array) substrates, by a laser cutting process or by a mechanical cutting process, as seen in FIG. 31C. Thereby, the number i of the COIP logic drives 300 may be stacked on one of the substrate units 113, wherein the number i may be equal to or greater than 2, 3, 4, 5, 6, 7 or 8.

The COIP logic drives 300 with the TPVs 582 to be stacked in a vertical direction to form the POP assembly may be in a standard format or have standard sizes. For example, the COIP logic drives 300 and their combination as mentioned below may be in a shape of square or rectangle, with a certain widths, lengths and thicknesses. An industry standard may be set for the shape and dimensions of the COIP logic drives 300. For example, the standard shape of the COIP logic drives 300 may be a square, with a width greater than or equal to 4 mm, 7 mm, 10 mm, 12 mm, 15 mm, 20 mm, 25 mm, 30 mm, 35 mm or 40 mm, and having a thickness greater than or equal to 0.03 mm, 0.05 mm, 0.1 mm, 0.3 mm, 0.5 mm, 1 mm, 2 mm, 3 mm, 4 mm or 5 mm. Alternatively, the standard shape of the COIP logic drives 300 and their combination as mentioned below may be a rectangle, with a width greater than or equal to 3 mm, 5 mm, 7 mm, 10 mm, 12 mm, 15 mm, 20 mm, 25 mm, 30 mm, 35 mm or 40 mm, and a length greater than or equal to 5 mm, 7 mm, 10 mm, 12 mm, 15 mm, 20 mm, 25 mm, 30 mm, 35 mm, 40 mm, 45 mm or 50 mm; and having a thickness greater than or equal to 0.03 mm, 0.05 mm, 0.1 mm, 0.3 mm, 0.5 mm, 1 mm, 2 mm, 3 mm, 4 mm or 5 mm.

Embodiment for Chip Package with TPVs and BISD

Alternatively, a backside metal interconnection scheme for the COIP logic Drive 300 (BISD) may be formed for interconnection at backsides of the semiconductor chips 100. FIGS. 33A-33M are schematic views showing a process for forming a backside metal interconnection scheme for a COIP logic drive (BISD) in accordance with the present application.

Figure 33A:
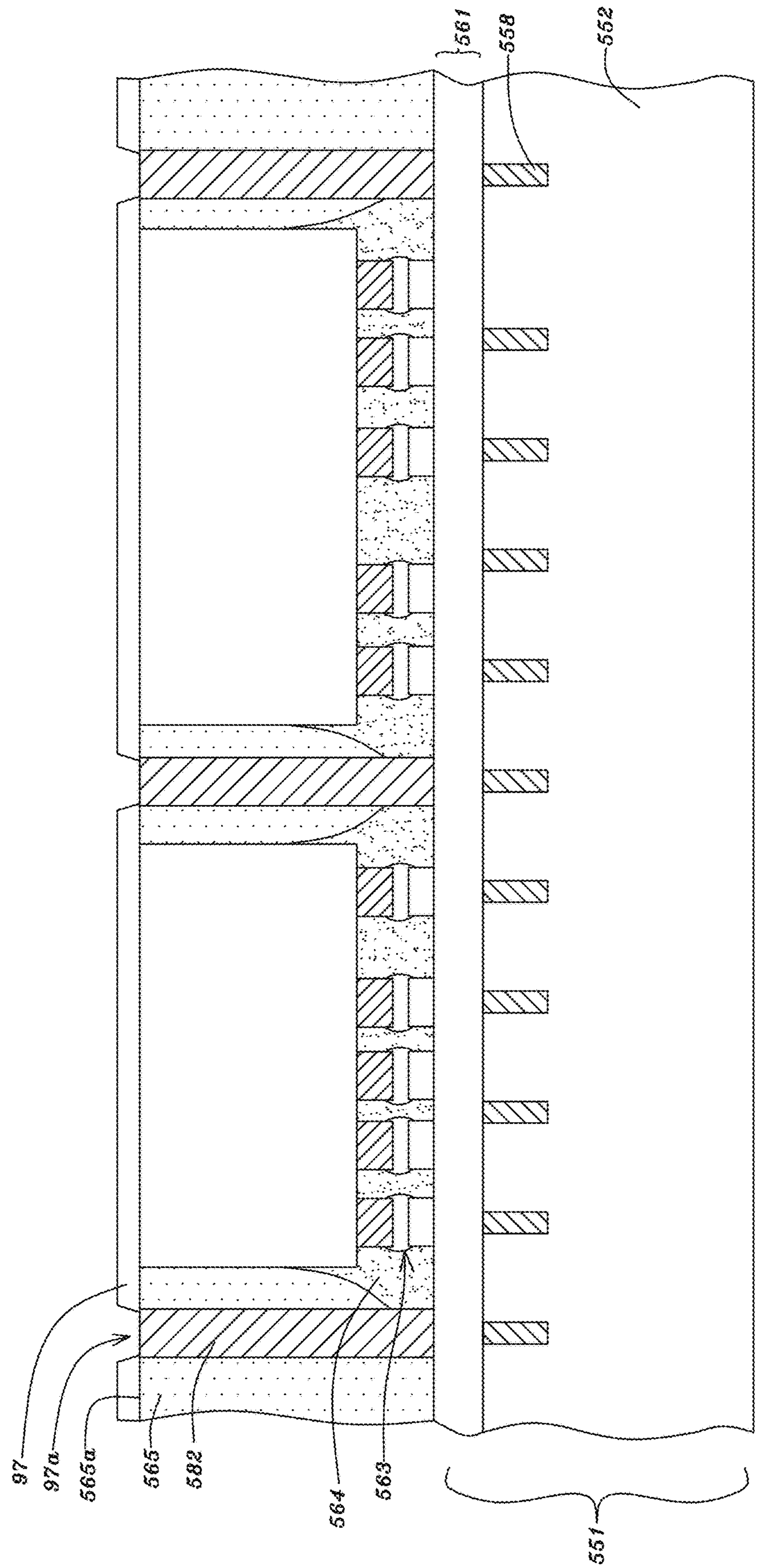
FIGS. 33A-33M are schematic views showing a process for forming a multi-chip-on-interposer (COIP) logic drive with a backside metal interconnection scheme in accordance with the present application.

Referring to FIG. 33A following the step as illustrated in FIG. 29K, a polymer layer 97, i.e., insulating dielectric layer, is formed on the backsides of the semiconductor chips 100 and on the backside surface 565*a* of the polymer layer 565 by a method of spin-on coating, screen-printing, dispensing or molding, and openings 97*a* in the polymer layer 97 are formed over the tips of the TPVs 582 to expose the tips of the TPVs 582. The polymer layer 97 may contain, for example, polyimide, BenzoCycloButene (BCB), parylene, epoxy-based material or compound, photo epoxy SU-8, elastomer or silicone. The polymer layer 97 may comprise organic material, for example, a polymer, or material compounds comprising carbon. The polymer layer 97 may be photosensitive, and may be used as photoresist as well for patterning multiple openings 97*a* therein to have metal vias formed therein by following processes to be performed later. The polymer layer 97 may be coated, exposed to light through a photomask, and then developed to form the openings 97*a* therein. Next, the polymer layer 97, i.e., insulating dielectric layer, is cured at a temperature, for example, at or higher than 100° C., 125° C., 150° C., 175° C., 200° C., 225° C., 250° C., 275° C. or 300° C. The polymer layer 97 after cured may have a thickness between, for example, 3 μm and 50 μm, 3 μm and 30 μm, 3 μm and 20 μm, or 3 μm and 15 μm, or thicker than or equal to 3 μm, 5 μm, 10 μm, 20 μm, or 30 μm. The polymer layer 97 may be added with some dielectric particles or glass fibers. The material of the polymer layer 97 and the process for forming the same may be referred to that of the polymer layer 36 and the process for forming the same as illustrated in FIG. 23I.

Figure 33B:
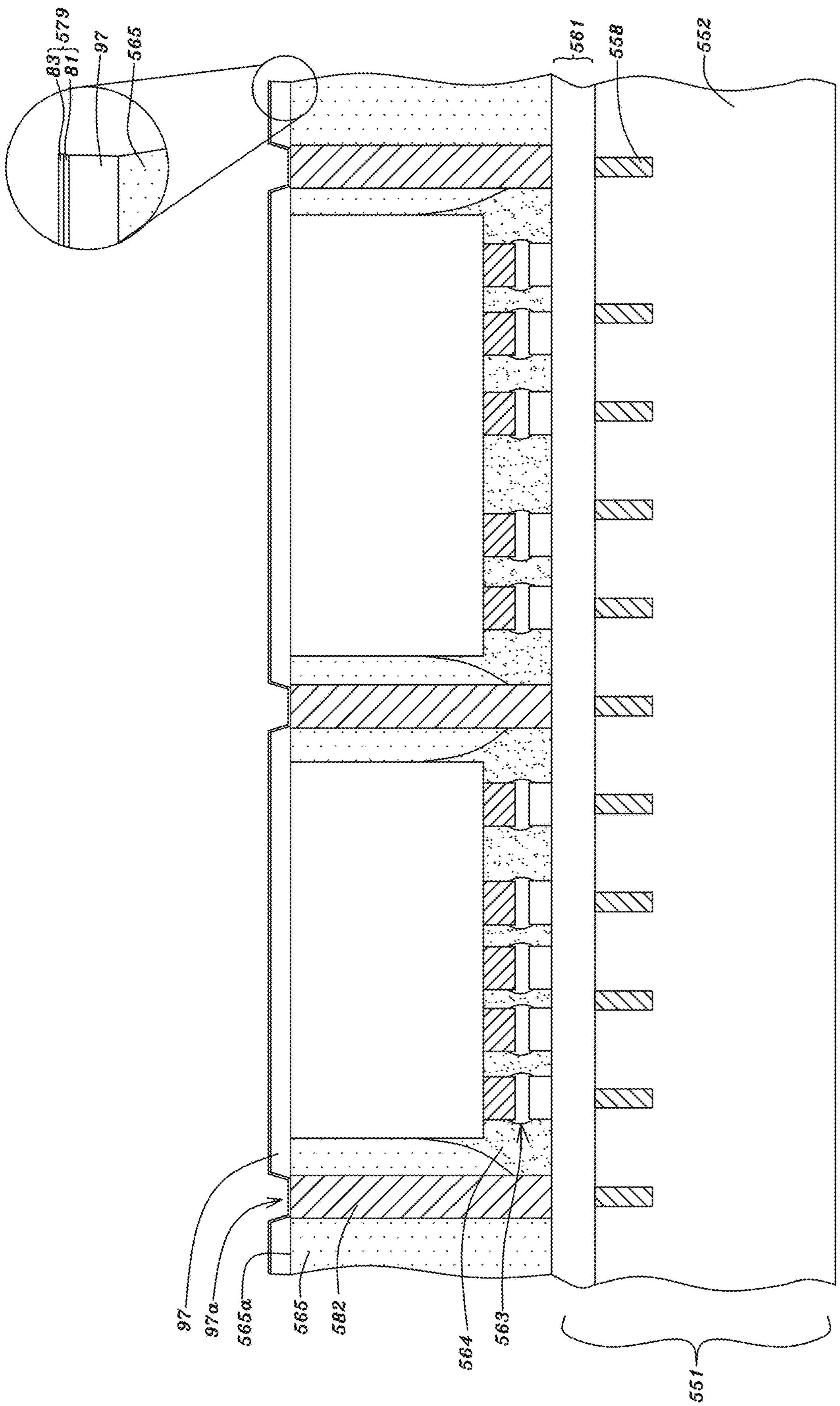
Figure 33C:
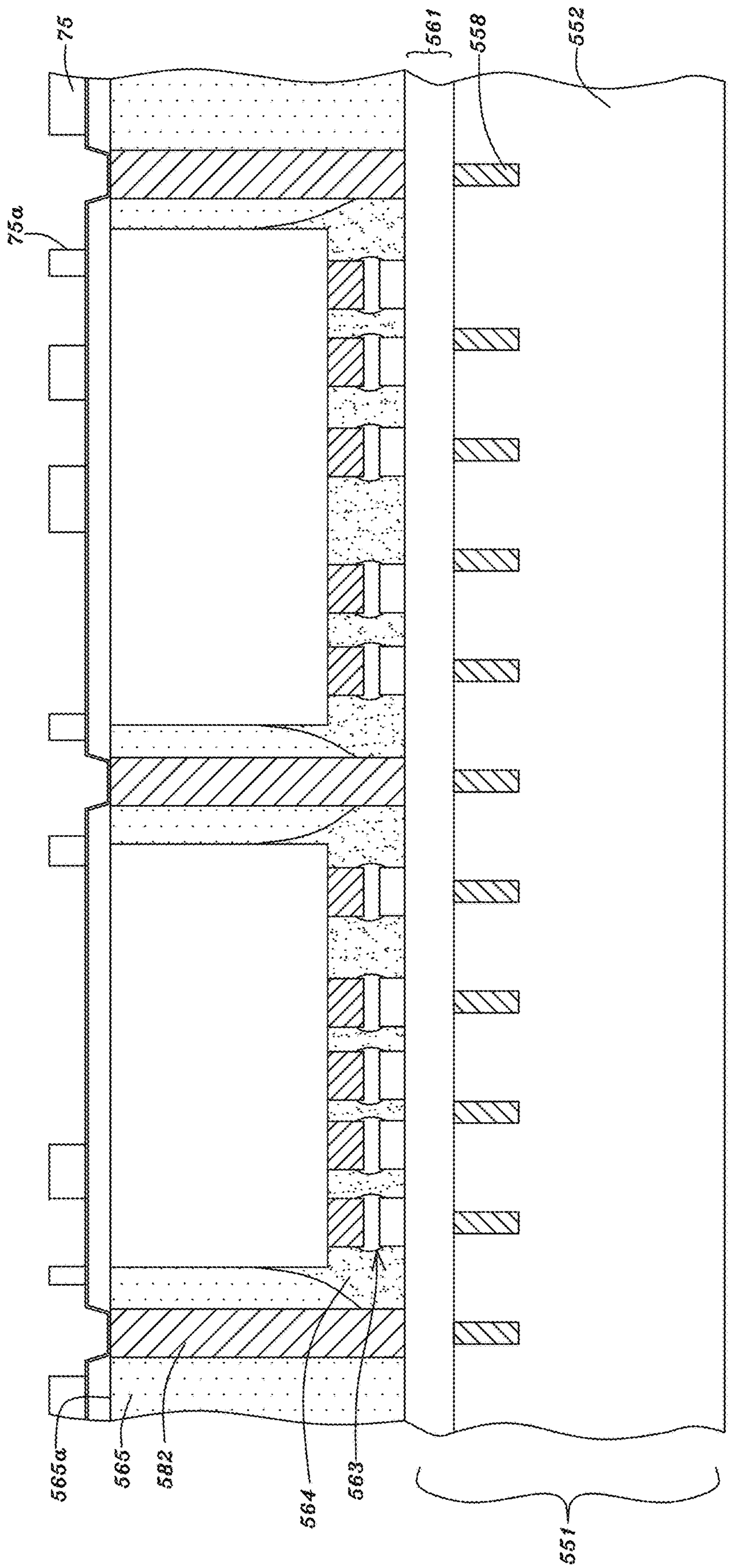

Next, an emboss process is performed on the polymer layer 97 and on the exposed tips of the TPVs 582 to form the BISD 79. Referring to FIG. 33B, an adhesion layer 81 having a thickness of between 0.001 and 0.7 μm, between 0.01 and 0.5 μm or between 0.03 and 0.35 μm may be sputtered on the polymer layer 97 and on the tips of the TPVs 582. The material of the adhesion layer 81 may include titanium, a titanium-tungsten alloy, titanium nitride, chromium, titanium-tungsten-alloy layer, tantalum nitride, or a composite of the abovementioned materials. The adhesion layer 81 may be formed by an atomic-layer-deposition (ALD) process, chemical vapor deposition (CVD) process or evaporation process. For example, the adhesion layer 81 may be formed by sputtering or CVD depositing a titanium (Ti) or titanium nitride (TiN) layer (with a thickness, for example, between 1 nm and 200 nm or between 5 nm and 50 nm) on the polymer layer 97 and on the tips of the TPVs 582.

Next, referring to FIG. 33B, an electroplating seed layer 83 having a thickness of between 0.001 and 1 μm, between 0.03 and 2 μm or between 0.05 and 0.5 μm may be sputtered on a whole top surface of the adhesion layer 81. Alternatively, the electroplating seed layer 83 may be formed by an atomic-layer-deposition (ALD) process, chemical-vapor-deposition (CVD) process, vapor deposition method, electroless plating method or PVD (Physical Vapor Deposition) method. The electroplating seed layer 83 is beneficial to electroplating a metal layer thereon. Thus, the material of the electroplating seed layer 83 varies with the material of a metal layer to be electroplated on the electroplating seed layer 83. When a copper layer is to be electroplated on the electroplating seed layer 83, copper is a preferable material to the electroplating seed layer 83. For example, the electroplating seed layer may be deposited on or over the adhesion layer 81 by, for example, sputtering or CVD depositing a copper seed layer (with a thickness between, for example, 3 nm and 300 nm or 10 nm and 120 nm) on the adhesion layer 81. The adhesion layer 81 and electroplating seed layer 83 may compose the adhesion/seed layer 579.

Next, referring to 26C, a photoresist layer 75, such as positive-type photoresist layer, having a thickness of between 5 and 50 μm is spin-on coated or laminated on the electroplating seed layer 83 of the adhesion/seed layer 579. The photoresist layer 75 is patterned with the processes of exposure, development and etc., to form multiple trenches or openings 75*a* in the photoresist layer 75 exposing the electroplating seed layer 83. A 1× stepper, 1× contact aligner or laser scanner may be used to expose the photoresist layer 75 with at least two of G-line having a wavelength ranging from 434 to 438 nm, H-line having a wavelength ranging from 403 to 407 nm, and I-line having a wavelength ranging from 363 to 367 nm, illuminating the photoresist layer 75, that is, G-line and H-line, G-line and I-line, H-line and I-line, or G-line, H-line and I-line illuminate the photoresist layer 75, then developing the exposed polymer layer 75, and then removing the residual polymeric material or other contaminants on the electroplating seed layer 83 of the adhesion/seed layer 579 with an $O_2$ plasma or a plasma containing fluorine of below 200 PPM and oxygen, such that the photoresist layer 75 may be patterned with multiple openings 75*a* in the photoresist layer 75 exposing the electroplating seed layer 83 of the adhesion/seed layer 579 for forming metal pads, lines or traces in the trenches or openings 75*a* and on the electroplating seed layer 83 of the adhesion/seed layer 579 by following processes to be performed later. One of the trenches or openings 75*a* in the photoresist layer 75 may overlap the whole area of one of the openings 97*a* in the polymer layer 97.

Figure 33D:
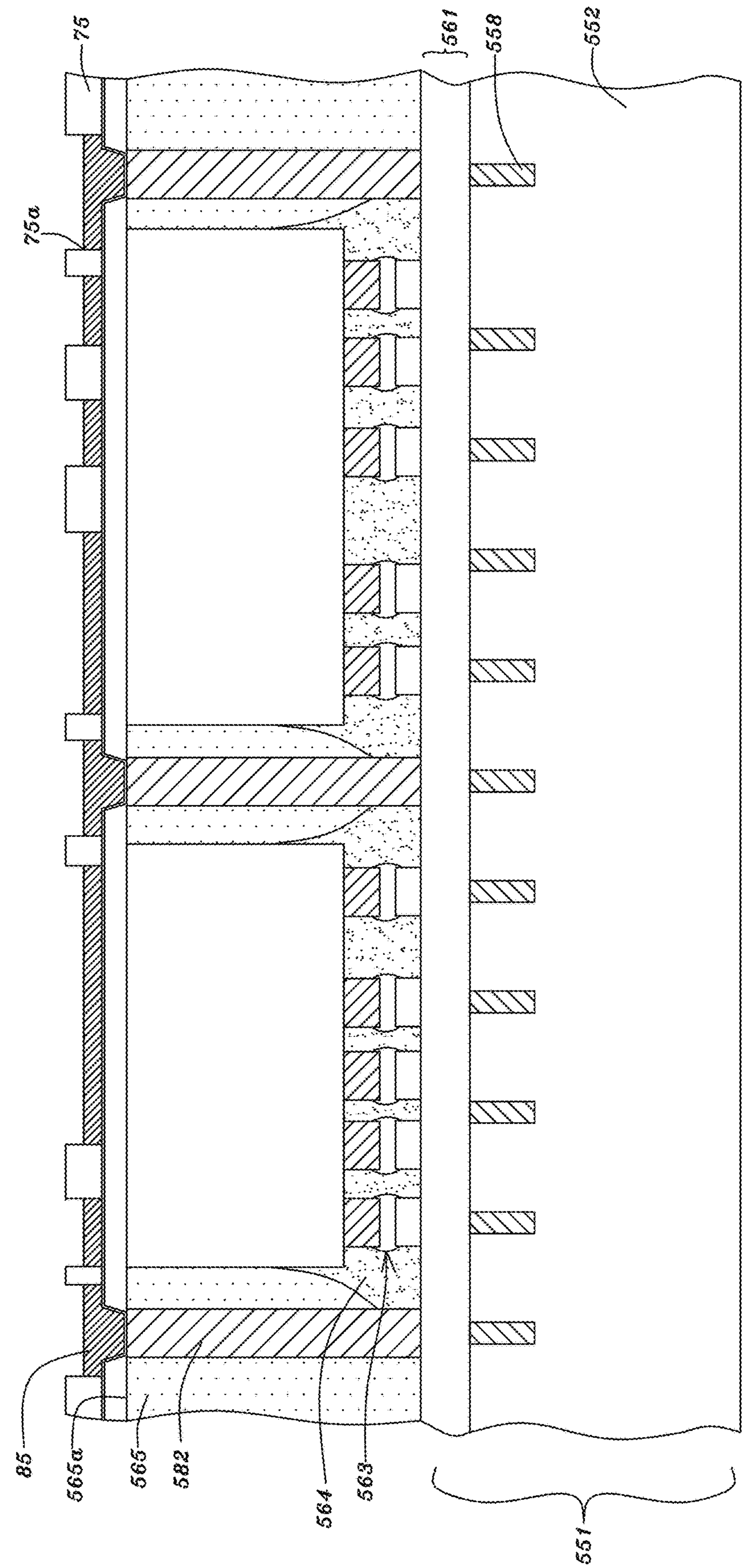

Next, referring to FIG. 33D, a metal layer 85, such as copper, is electroplated on the electroplating seed layer 83 of the adhesion/seed layer 579 exposed by the trenches or openings 75*a*. For example, the metal layer 85 may be formed by electroplating a copper layer with a thickness between 5 μm and 80 μm, 5 μm and 50 μm, 5 μm and 40 μm, 5 μm and 30 μm, 3 μm and 20 μm, 3 μm and 15 μm, or 3 μm and 10 μm on the electroplating seed layer 83, made of copper, of the adhesion/seed layer 579 exposed by the trenches or openings 75*a*.

Figure 33E:
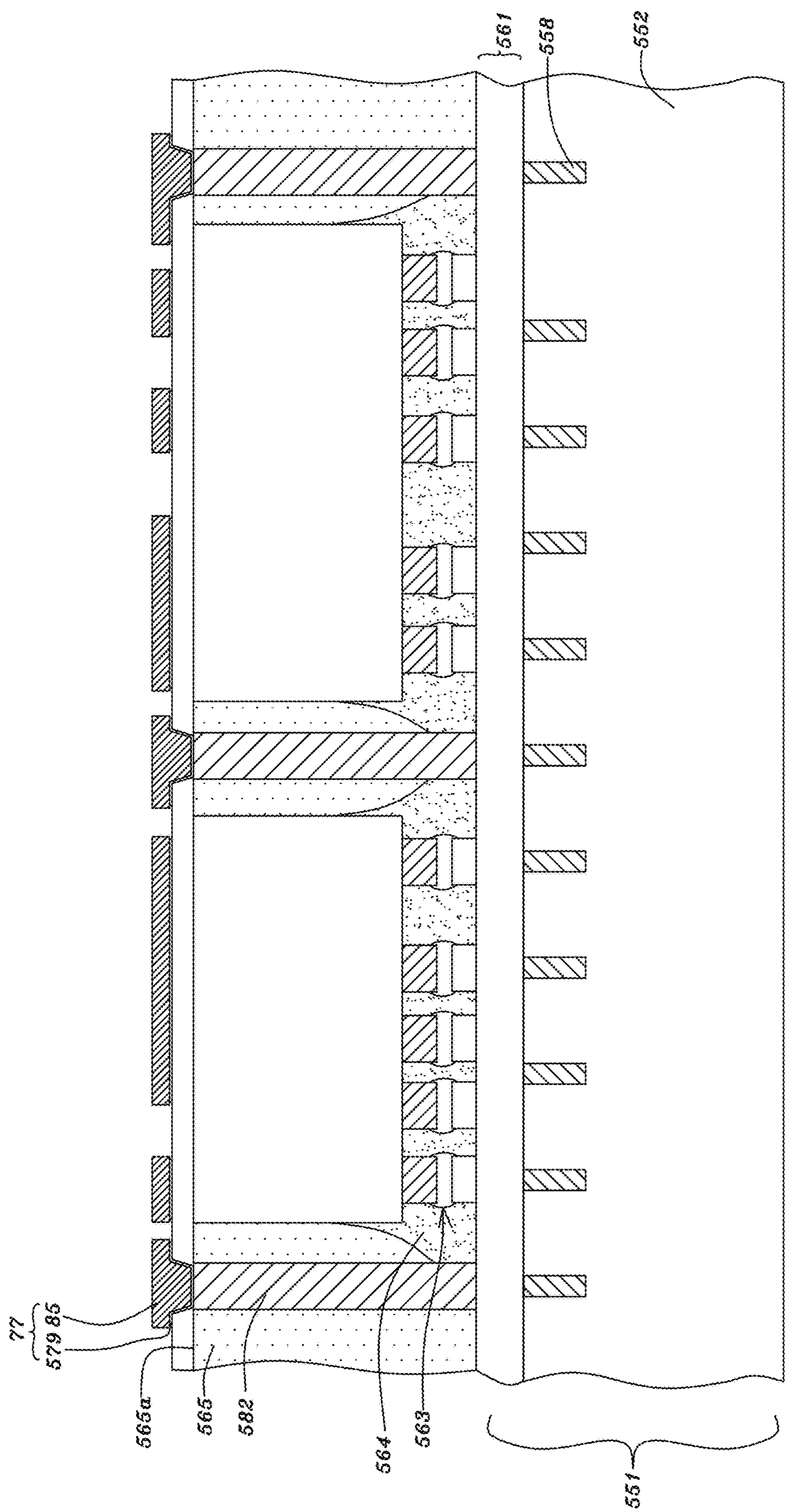

Referring to FIG. 33E, after the metal layer 85 is formed, most of the photoresist layer 75 may be removed and then the adhesion layer 81 and electroplating seed layer 83 not under the metal layer 85 may be etched. The removing and etching processes may be referred respectively to the processes for removing the photoresist layer 30 and etching the electroplating seed layer 28 and adhesion layer 26 as illustrated in FIG. 23F. Thereby, the adhesion layer 81, electroplating seed layer 83 and electroplated metal layer 85 may be patterned to form an interconnection metal layer 77 on the polymer layer 97 and in the openings 97*a* in the polymer layer 97. The interconnection metal layer 77 may be formed with multiple metal vias 77*a* in the openings 97*a* in the polymer layer 97 and multiple metal pads, lines or traces 77*b* on the polymer layer 97.

Figure 33F:
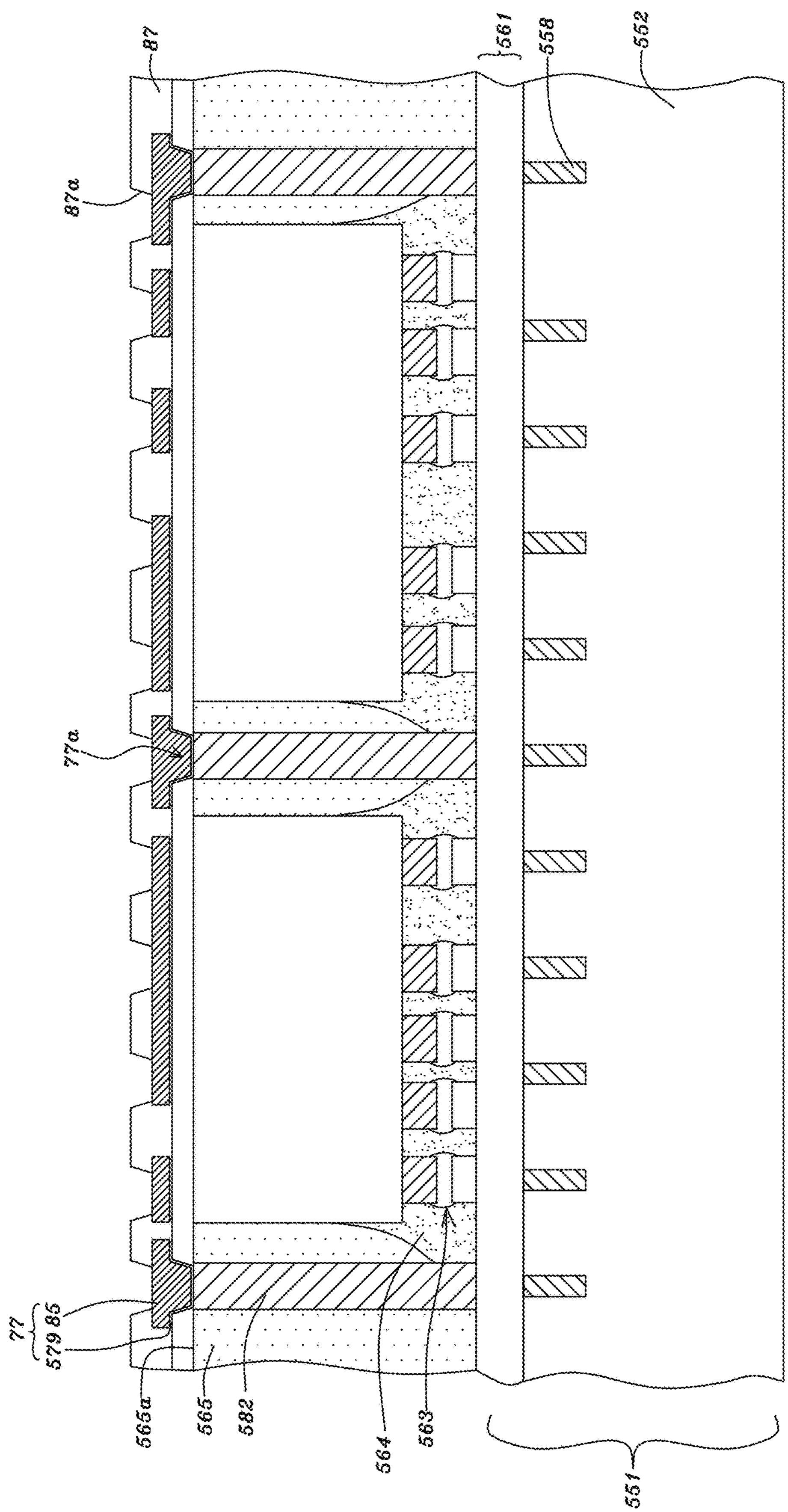

Next, referring to FIG. 33F, a polymer layer 87, i.e., insulting or inter-metal dielectric layer, is formed on the polymer layer 97 and metal layer 85 and multiple openings 87*a* in the polymer layer 87 are over multiple contact points of the interconnection metal layer 77. The polymer layer 87 has a thickness between 3 and 30 micrometers or between 5 and 15 micrometers. The polymer layer 87 may be added with some dielectric particles or glass fibers. The material of the polymer layer 87 and the process for forming the same may be referred to that of the polymer layer 97 or 36 and the process for forming the same as illustrated in FIG. 33A or 23I.

The process for forming the interconnection metal layer 77 as illustrated in FIGS. 33B-33E and the process for forming the polymer layer 87 may be alternately performed more than one times to fabricate the BISD 79 as seen in FIG.

Figure 33G:
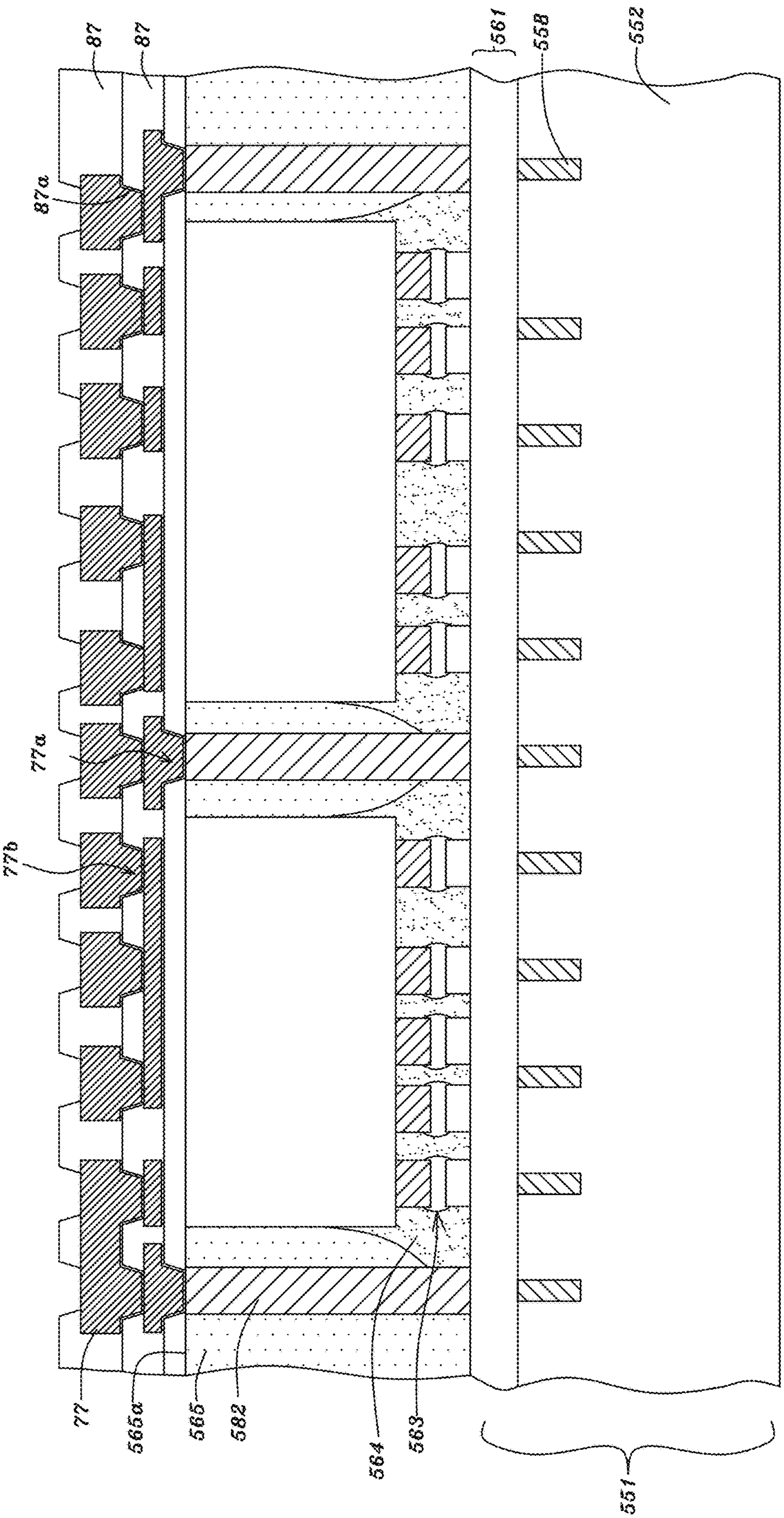

33G. Referring to FIG. 33G, the BISD 79 may include an upper one of the interconnection metal layers 77 formed with multiple metal vias 77*a* in the openings 87*a* in one of the polymer layers 87 and multiple metal pads, lines or traces 77*b* on said one of the polymer layers 87. The upper one of the interconnection metal layers 77 may be connected to a lower one of the interconnection metal layers 77 through the metal vias 77*a* of the upper one of the interconnection metal layers 77 in the openings 87*a* in said one of the polymer layers 87. The BISD 79 may include the bottom-most one of the interconnection metal layers 77 formed with multiple metal vias 77*a* in the openings 97*a* in the polymer layer 97 and on the TPVs 582 and multiple metal pads, lines or traces 77*b* on the polymer layer 97.

Figure 33H:
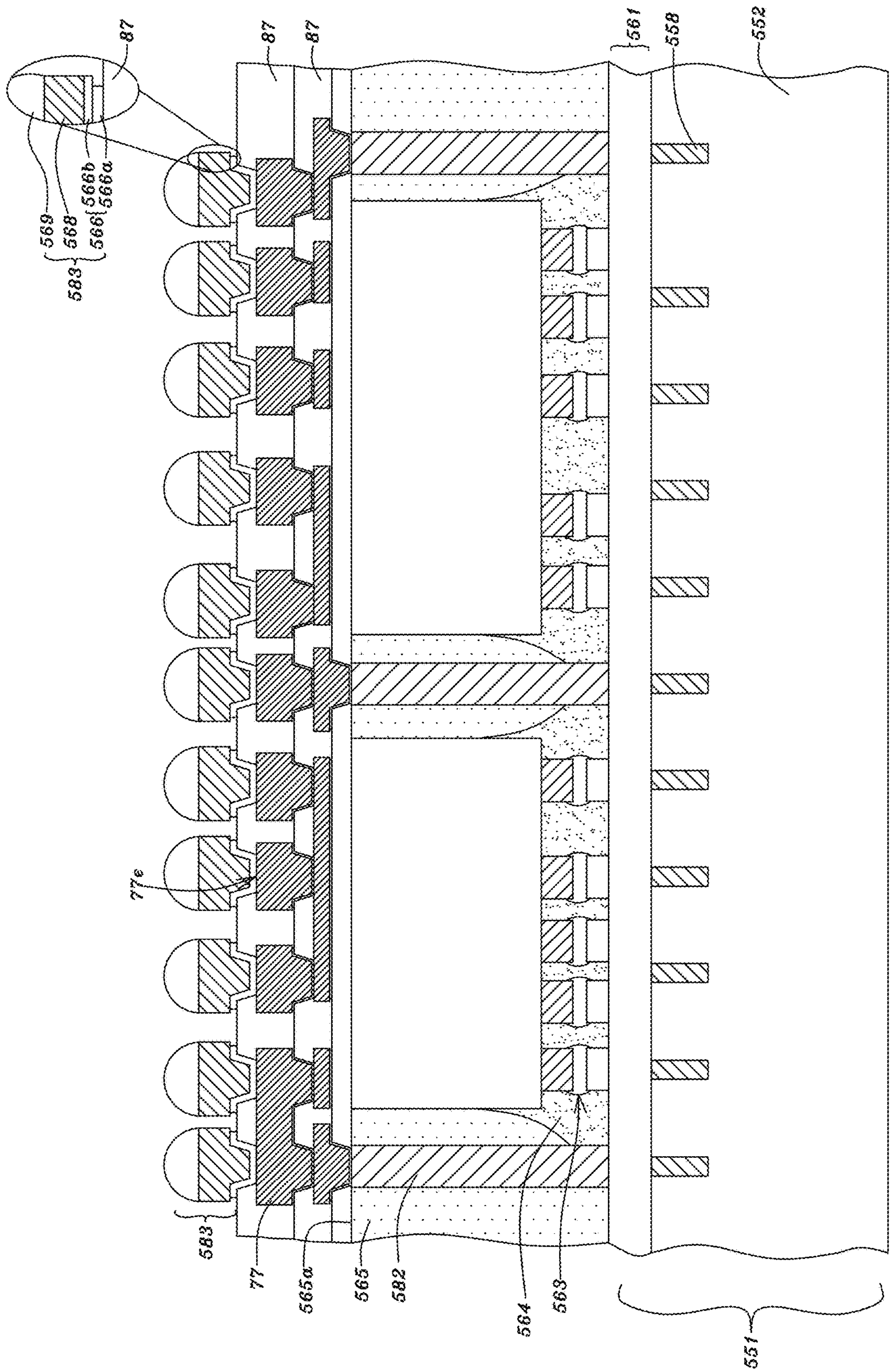

Next, referring to FIG. 33H, multiple metal bumps 583 may be optionally formed on metal pads 77*e* of the topmost one of the interconnection metal layers 77 exposed by the topmost one of the polymer layer 87 of the BISD 79. The metal bumps 583 may have five types like the first through fifth types of metal bumps 570 as illustrated in FIGS. 25R-25V and 19S respectively. The specification of the metal bumps 583 and the process for forming the same may be referred to the specification of the metal bumps 570 of any type and the process for forming the same as illustrated in FIGS. 25R-25V and 26S.

Each of the first through third types of metal bumps 583, which can be referred to the first through third types of metal bumps 570 as illustrated in FIGS. 25R-25U respectively, may have the adhesion/seed layer 566 formed with the adhesion layer 566*a* on one of the metal pads 77*e* of the topmost one of the interconnection metal layers 77 and the electroplating seed layer 566*b* on the adhesion layer 566*a*, and the metal layer 568 on the seed layer of the adhesion/seed layer 566. Each of the fourth type of metal bumps 583, which can be referred to the fourth type of metal bumps 570 as illustrated in FIGS. 25R-25V, may have the adhesion/seed layer 566 formed with the adhesion layer 566*a* on one of the metal pads 77*e* of the topmost one of the interconnection metal layers 77 and the electroplating seed layer 566*b* on the adhesion layer 566*a*, the metal layer 568 on the electroplating seed layer 566*b* of the adhesion/seed layer 566 and the solder bumps 569 on the metal layer 568. Each of the fifth type of metal bumps 583, which can be referred to the fifth type of metal bumps 570 as illustrated in 19S, may have the solder bumps formed directly on one of the metal pads 77*e* of the topmost one of the interconnection metal layers 77.

Alternatively, the metal bumps 583 may be skipped not to be formed on the metal pads 77*e* of the topmost one of the interconnection metal layers 77.

Figure 33I:
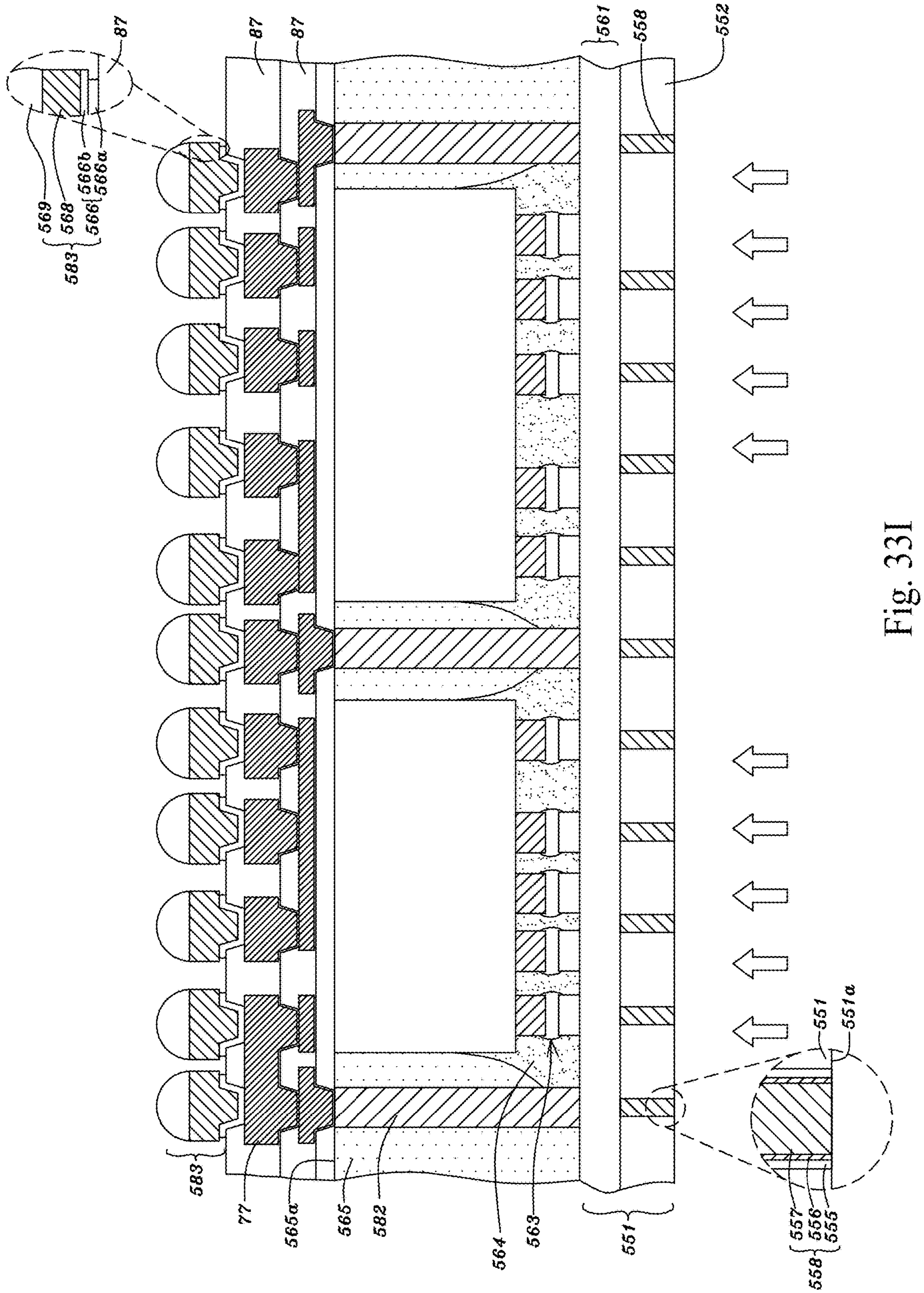

Next, referring to FIG. 33I, the interposer 551 as illustrated in FIG. 29F or 25D has a backside 551*a* to be polished by a CMP process or a wafer backside grinding process until each of the vias 558 is exposed, that is, its insulating layer 555 at its backside is removed into an insulating lining surrounding its adhesion/seed layer 556 and copper layer 557, and a backside of its copper layer 557 or a backside of the adhesion layer or electroplating seed layer of its adhesion/seed layer 556 is exposed.

Figure 33J:
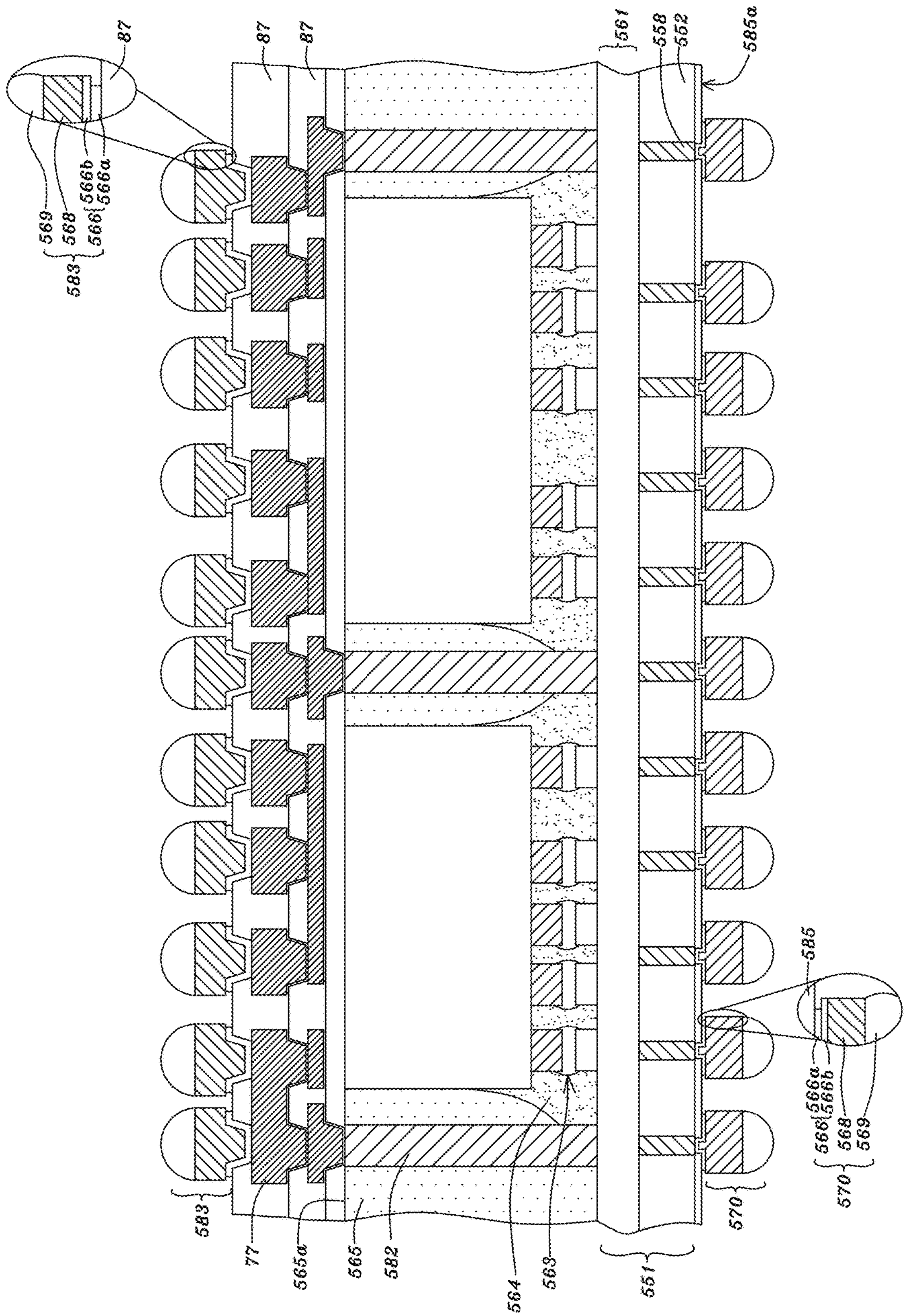

Next, referring to FIG. 33J, multiple metal bumps or pillars 570 as illustrated in FIGS. 25R-25V may be formed on a backside of the interposer 551 formed with the first type of vias 558 as illustrated in FIG. 29F or 32E. The specification of the metal bumps or pillars 570 and the process for forming the same may be referred to those as illustrated in FIGS. 25R-25V. In the case that none of the metal bumps 583 as seen in FIG. 33J are formed on the metal pads 77*e* of the topmost one of the interconnection metal layers 77, the resulting structure may be seen in FIG. 33L.

Figure 34A:
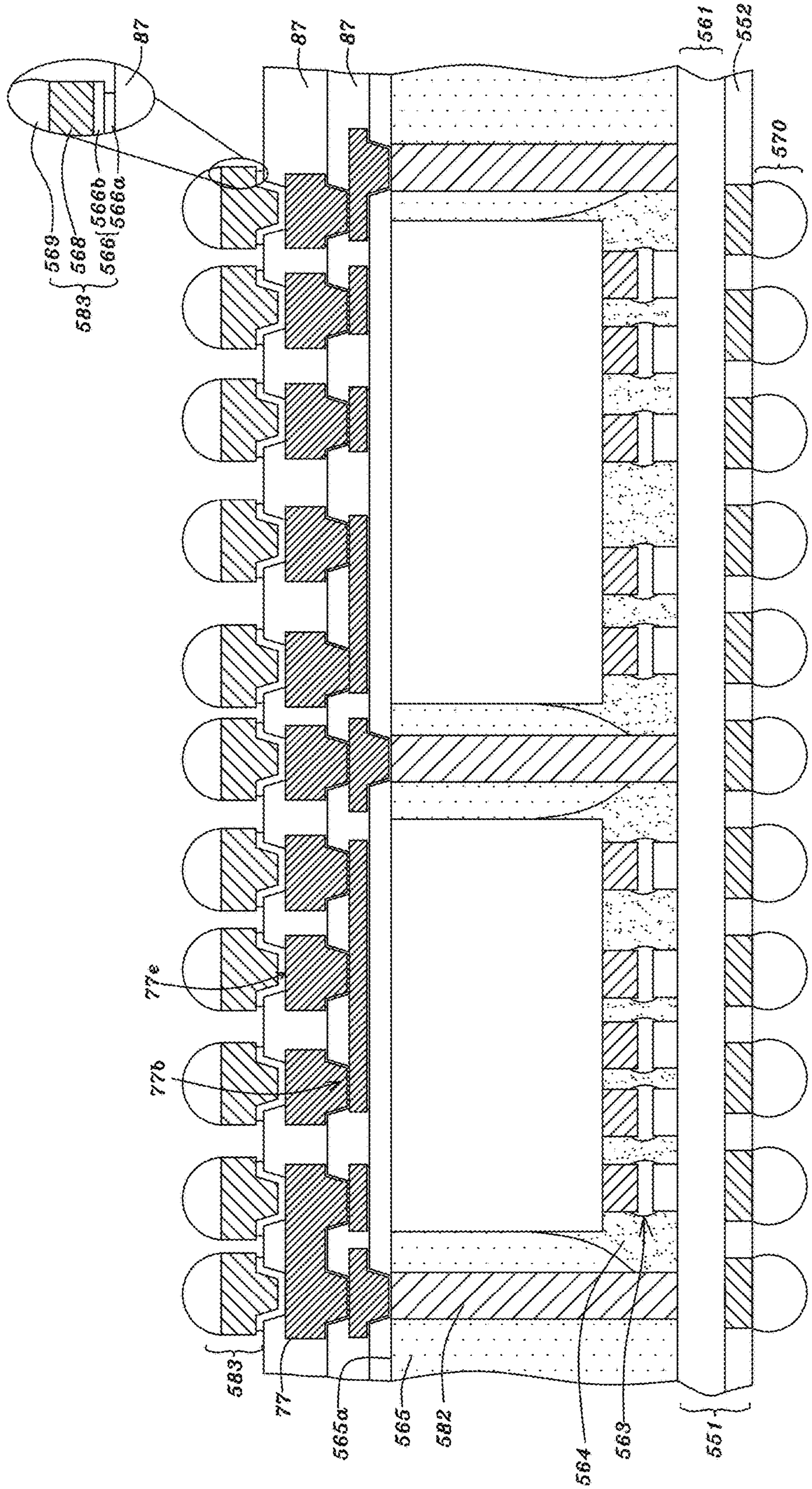
FIGS. 34A-34D are schematic views showing a process for forming a multi-chip-on-interposer (COIP) logic drive with a backside metal interconnection scheme in accordance with the present application.

Alternatively, referring to FIG. 34A, multiple metal bumps or pillars 570 as illustrated in FIG. 26R may be formed on a backside of the interposer 551 formed with the second type of vias 558. The specification of the metal bumps or pillars 570 and the process for forming the same may be referred to those as illustrated in FIG. 26R. Alternatively, the TPVs 582 may be formed on the metal layer 32 as seen in FIG. 32E. In the case that none of the metal bumps 583 as seen in FIG. 33J are formed on the metal pads 77*b* of the topmost one of the interconnection metal layers 77, the resulting structure may be seen in FIG. 34C.

Figure 33K:
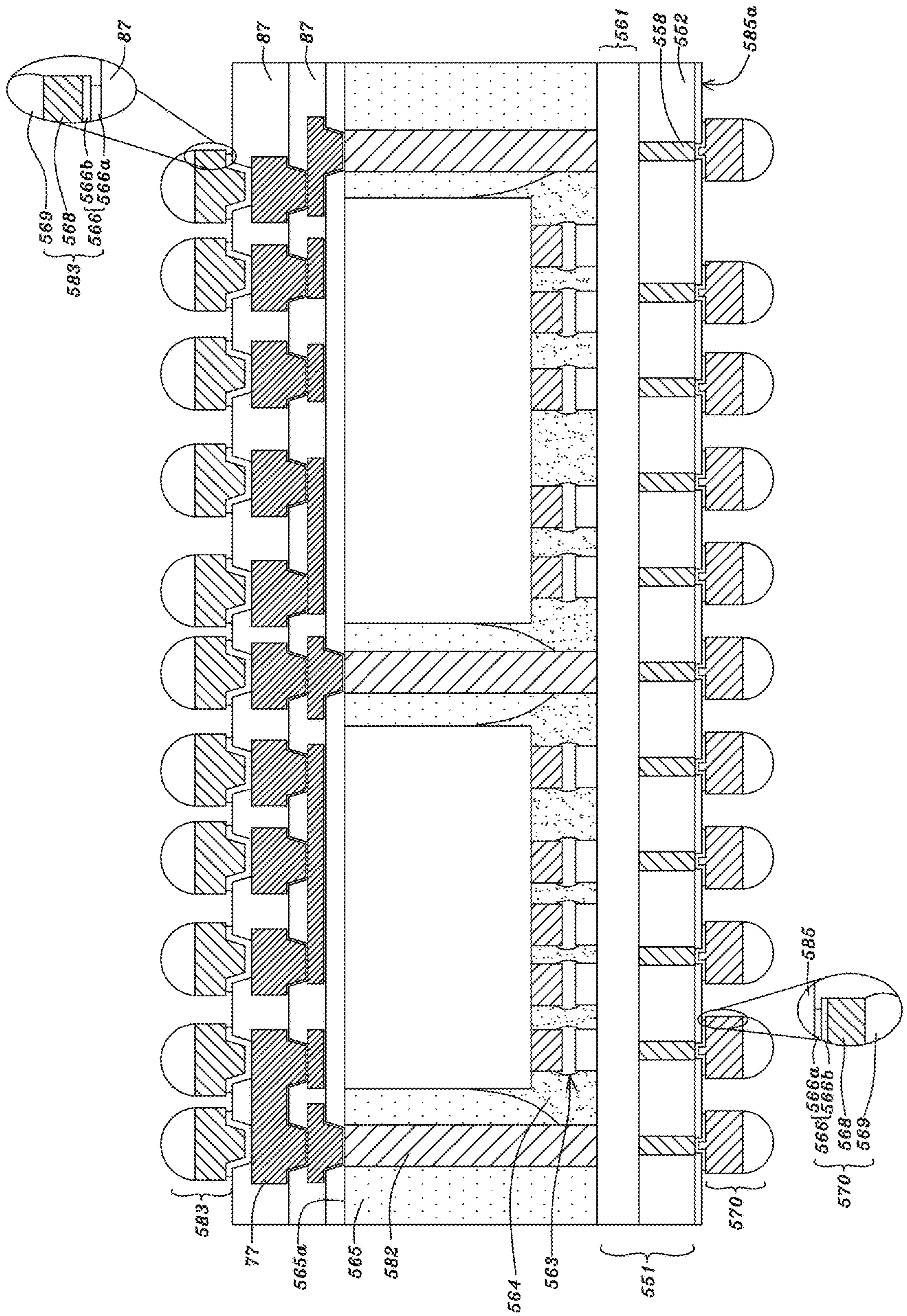
Figure 33L:
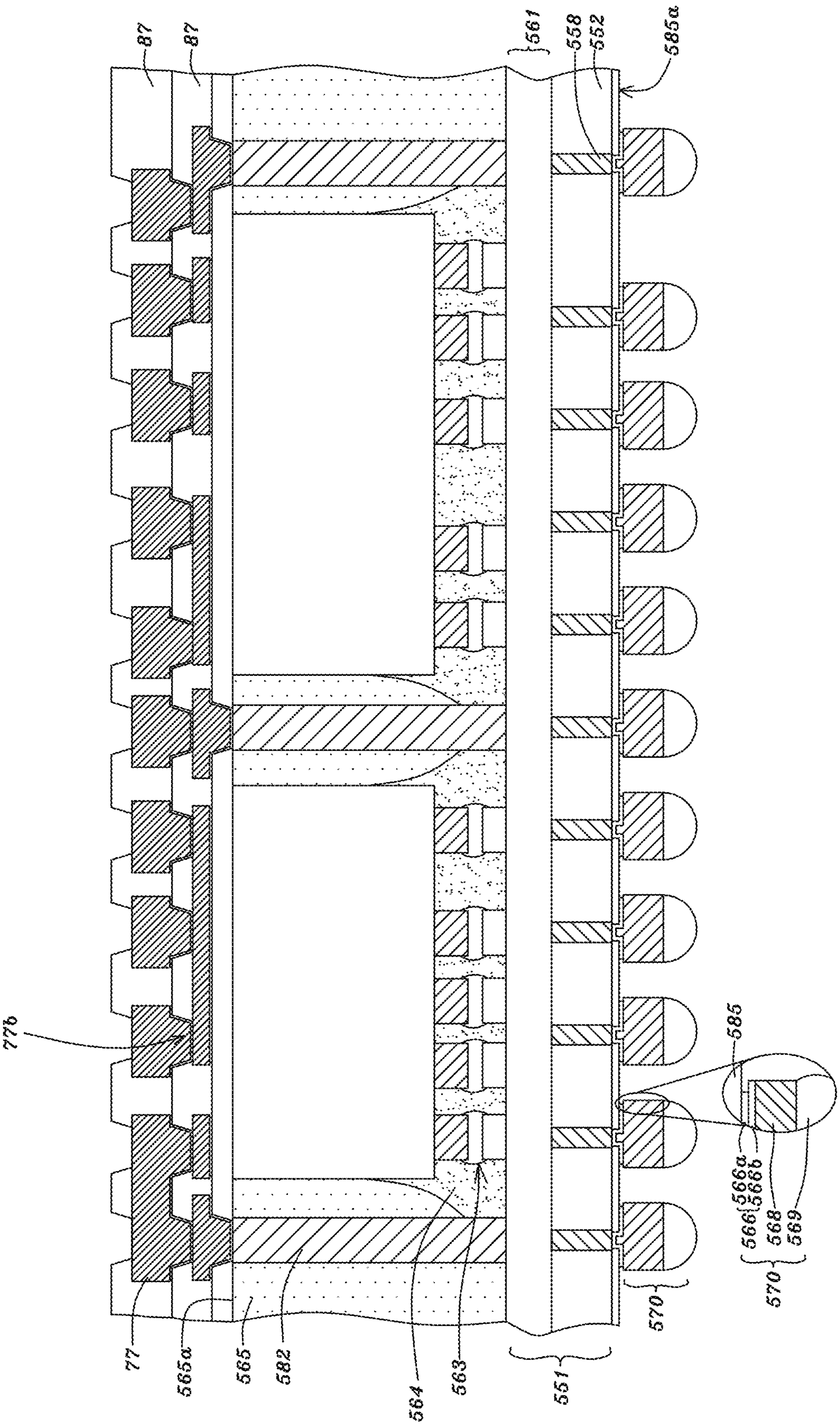
Figure 33M:
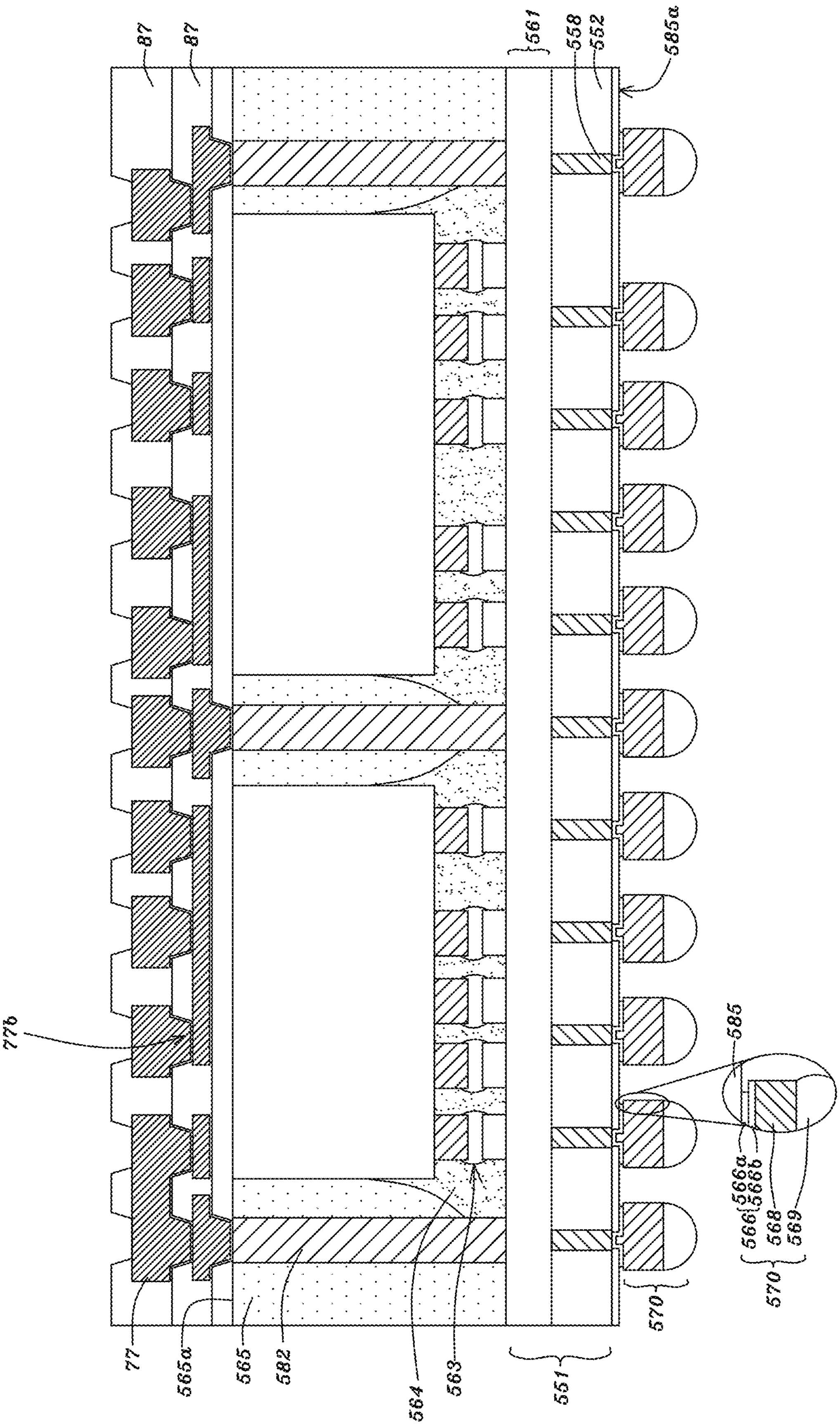
Figure 34B:
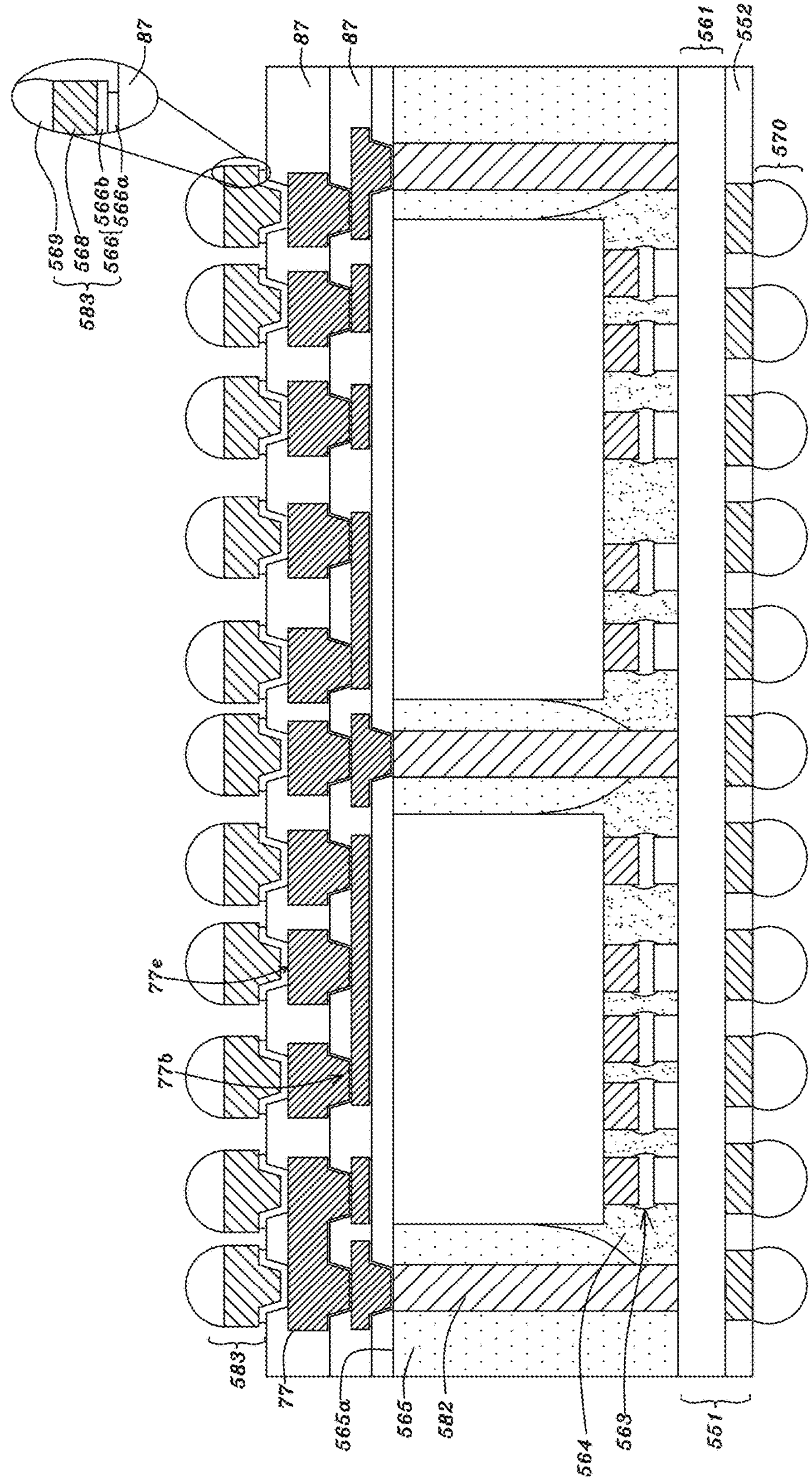

Next, the package structure shown in FIG. 33J or 34A may be separated, cut or diced into multiple individual chip packages, i.e., standard commodity COIP logic drives 300 or single-layer-packaged logic drive as shown in FIG. 33K or 34B by a laser cutting process or by a mechanical cutting process. In the case that none of the metal bumps 583 as seen in FIGS. 33K and 34B are formed on the metal pads 77*b* of the topmost one of the interconnection metal layers 77, the resulting structures may be seen in FIGS. 33M and 34D respectively.

Referring to FIGS. 33K and 34B, the metal bumps 583 or metal pads 77*e* may be formed over (1) multiple gaps each between neighboring two of the semiconductor chips 100 in or of the COIP logic drive 300, (2) a peripheral area of the COIP logic drive 300 and outside the edges of the semiconductor chips 100 of the COIP logic drive 300, and (3) the backsides of the semiconductor chips 100. The BISD 79 may comprise 1 to 6 layers, or 2 to 5 layers of interconnection metal layers 77. One of the metal pads, lines or traces 77*b* of each of the interconnection metal layers 77 of the BISD 79 may have the adhesion layer 81 and electroplating seed layer 83 of the adhesion/seed layer 579 only at the bottom thereof, but not at the sidewalls thereof.

Referring to FIGS. 33K and 34B, one of the metal pads, lines or traces 77*b* of each of the interconnection metal layers 77 of the BISD 79 may have a thickness between, for example, 0.3 μm and 40 μm, 0.5 μm and 30 μm, 1 μm and 20 μm, 1 μm and 15 μm, 1 μm and 10 μm, or 0.5 μm and 5 μm, or thicker than or equal to 0.3 μm, 0.7 μm, 1 μm, 2 μm, 3 μm, 5 μm, 7 μm or 10 μm, and a width between, for example, 0.3 μm and 40 μm, 0.5 μm and 30 μm, 1 μm and 20 μm, 1 μm and 15 μm, 1 μm and 10 μm, or 0.5 μm and 5 μm, or wider than or equal to 0.3 μm, 0.7 μm, 1 μm, 2 μm, 3 μm, 5 μm, 7 μm or 10 μm. The polymer layer 87 between neighboring two of the interconnection metal layers 77 of the BISD 79 may have a thickness between, for example, 0.3 μm and 50 μm, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm.

Figure 33N:
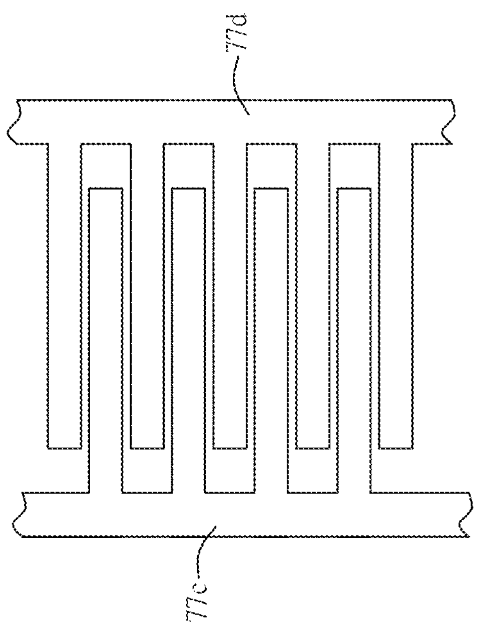
FIG. 33N is a top view showing a metal plane in accordance with an embodiment of the present application.

FIG. 33N is a top view showing a metal plane in accordance with an embodiment of the present application. Referring to FIG. 33N, one of the interconnection metal layers 77 may include two metal planes 77*c* and 77*d* used as a power plane and ground plane respectively, wherein the metal planes 77*c* and 77*d* may have a thickness, for example, between 5 μm and 50 μm, 5 μm and 30 μm, 5 μm and 20 μm or 5 μm and 15 μm, or thicker than or equal to 5 μm, 10 μm, 20 μm or 30 μm. Each of the metal planes 77*c* and 77*d* may be layout as an interlaced or interleaved shaped structure or fork-shaped structure, that is, each of the metal planes 77*c* and 77*d* may have multiple parallel-extension sections and a transverse connection section coupling the parallel-extension sections. One of the metal planes 77*c* and 77*d* may have one of the parallel-extension sections arranged between neighboring two of the parallel-extension sections of the other of the metal planes 77*c* and 77*d*.

Alternatively, referring to FIGS. 33K and 34B, one of the interconnection metal layers 77, e.g., the topmost one, may include a metal plane, used as a heat dissipater or spreader for heat dissipation or spreading, having a thickness, for example, between 5 μm and 50 μm, 5 μm and 30 μm, 5 μm and 20 μm or 5 μm and 15 μm, or thicker than or equal to 5 μm, 10 μm, 20 μm or 30 μm.

Programing for TSVs, Metal Pads and Metal Pillars or Bumps

Referring to FIGS. 33K, 33M, 34B and 34D, one of the TPVs 582 may be programmed by one or more of the memory cells 362 in one or more of the DPIIC chips 410, wherein said one or more of the memory cells 362 may be programmed to switch on or off one or more of the cross-point switches 379 distributed in said one or more of the DPIIC chips 410 as seen in FIGS. 11A-11C and 17 to form a signal path from said one of the TPVs 582 to any of the standard commodity FPGA IC chips 200, dedicated I/O chips 265, VMIC chip 324, NVM IC chips 250, HBM IC chips 251, DRAM IC chips 321, PCIC chips 269, dedicated control chip 260, dedicated control and I/O chip 266, DCIAC chip 267 or DCDI/OIAC chip 268 in the logic drive 300 as seen in FIGS. 19A-19N through one or more of the programmable interconnects 361 of the inter-chip interconnects 371 provided by the interconnection metal layers 6 and/or 27 of the FISIP 560 and/or SISIP 588 of the interposer 551 and/or the interconnection metal layers 77 of the BISD 79. Thereby, the TPVs 582 may be programmable.

Furthermore, referring to FIGS. 33K, 33M, 34B and 34D, one of the metal bumps or pillars 570 may be programmed by one or more of the memory cells 362 in one or more of the DPIIC chips 410, wherein said one or more of the memory cells 362 may switch on or off one or more of the cross-point switches 379 distributed in said one or more of the DPIIC chips 410 as seen in FIGS. 11A-11C and 17 to form a signal path from said one of the metal bumps or pillars 570 to any of the standard commodity FPGA IC chips 200, dedicated I/O chips 265, VMIC chip 324, NVM IC chips 250, HBM IC chips 251, DRAM IC chips 321, PCIC chips 269, dedicated control chip 260, dedicated control and I/O chip 266, DCIAC chip 267 or DCDI/OIAC chip 268 in the logic drive 300 as seen in FIGS. 19A-19N through one or more of the programmable interconnects 361 of the inter-chip interconnects 371 provided by the interconnection metal layers 6 and/or 27 of the FISIP 560 and/or SISIP 588 of the interposer 551 and/or the interconnection metal layers 77 of the BISD 79. Thereby, the metal bumps or pillars 570 may be programmable.

Figure 34C:
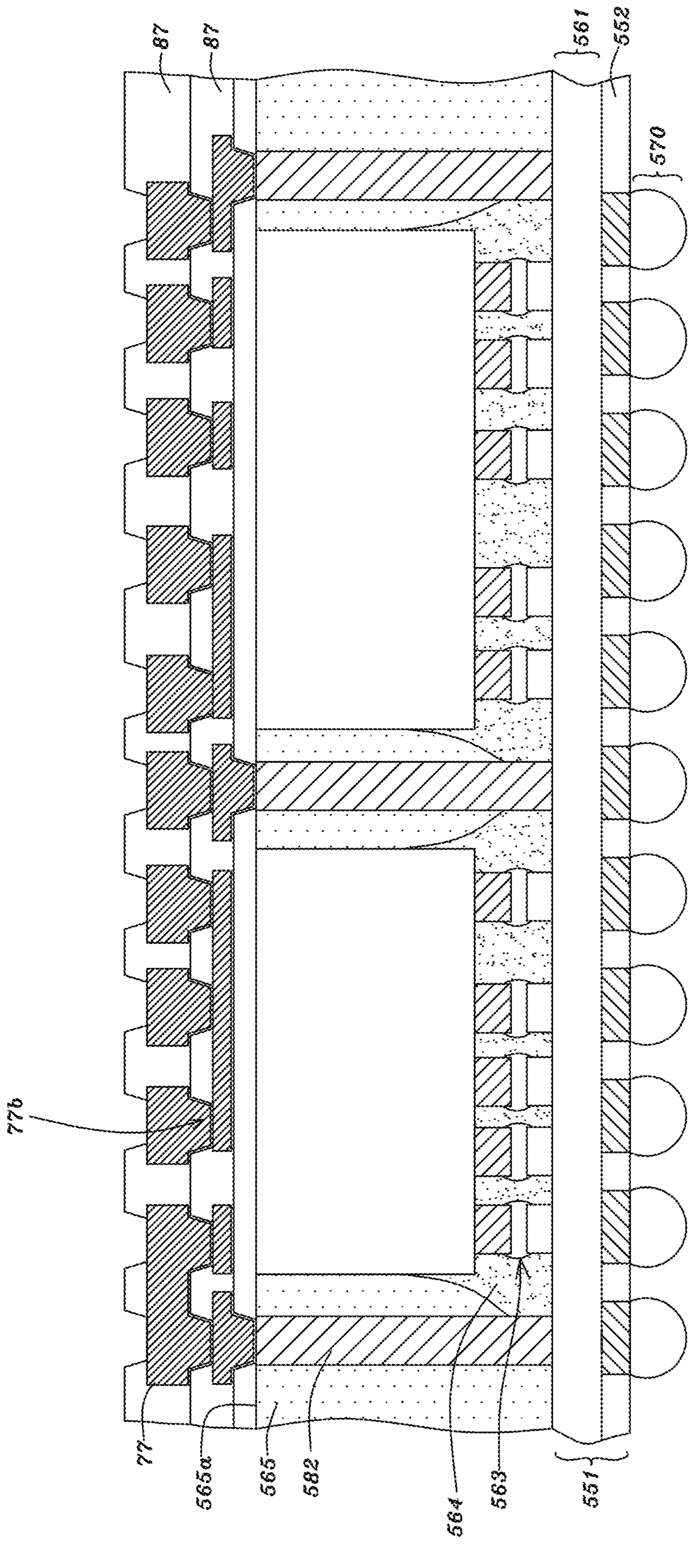
Figure 34D:
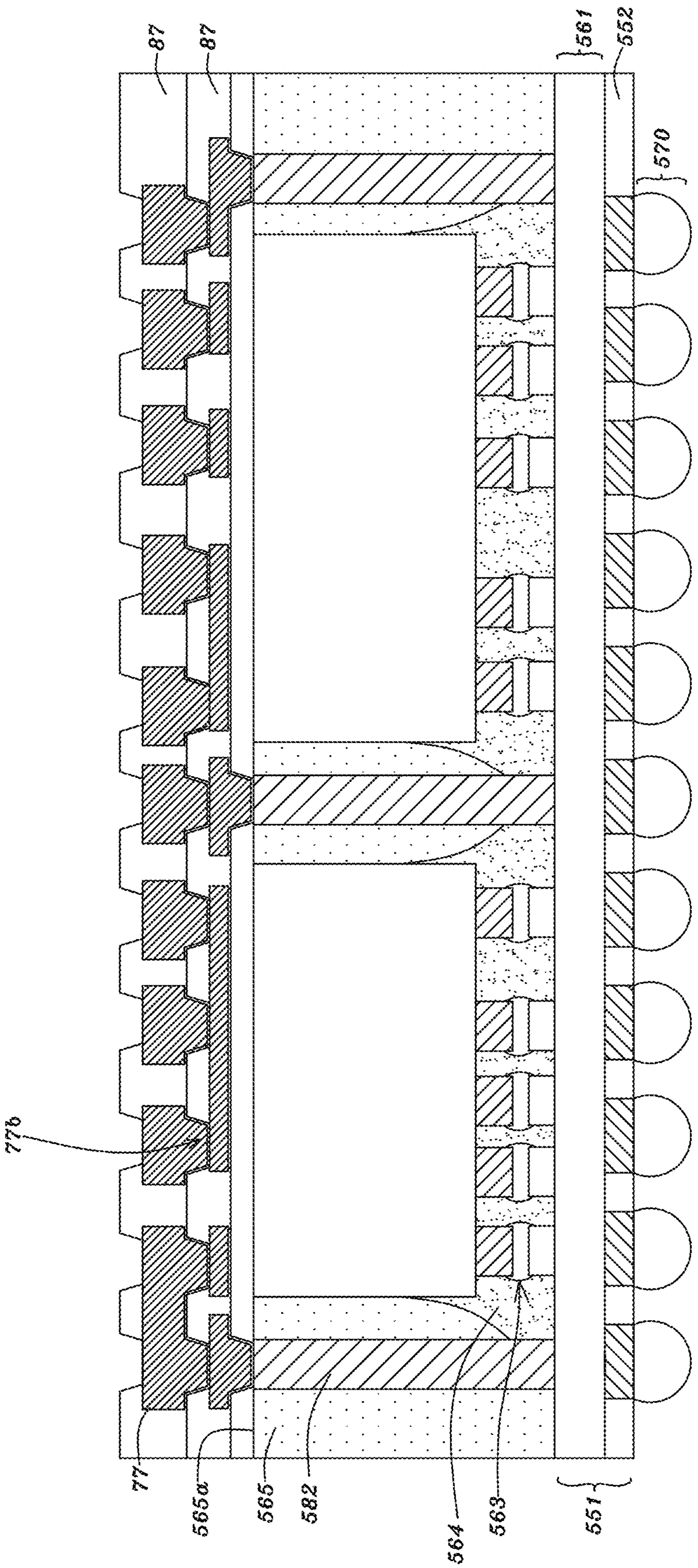

Furthermore, referring to FIGS. 33M and 34D, one of the metal pads 77*e* may be programmed by one or more of the memory cells 362 in one or more of the DPIIC chips 410, wherein said one or more of the memory cells 362 may switch on or off one or more of the cross-point switches 379 distributed in said one or more of the DPIIC chips 410 as seen in FIGS. 11A-11C and 17 to form a signal path from said one of the metal pads 77*e* to any of the standard commodity FPGA IC chips 200, dedicated I/O chips 265, VMIC chip 324, NVM IC chips 250, HBM IC chips 251, DRAM IC chips 321, PCIC chips 269, dedicated control chip 260, dedicated control and I/O chip 266, DCIAC chip 267 or DCDI/OIAC chip 268 in the logic drive 300 as seen in FIGS. 19A-19N through one or more of the programmable interconnects 361 of the inter-chip interconnects 371 provided by the interconnection metal layers 6 and/or 27 of the FISIP 560 and/or SISIP 588 of the interposer 551 and/or the interconnection metal layers 77 of the BISD 79. Thereby, the metal pads 77*e* may be programmable.

Interconnection for Logic Drive with Interposer and BISD

Figure 35A:
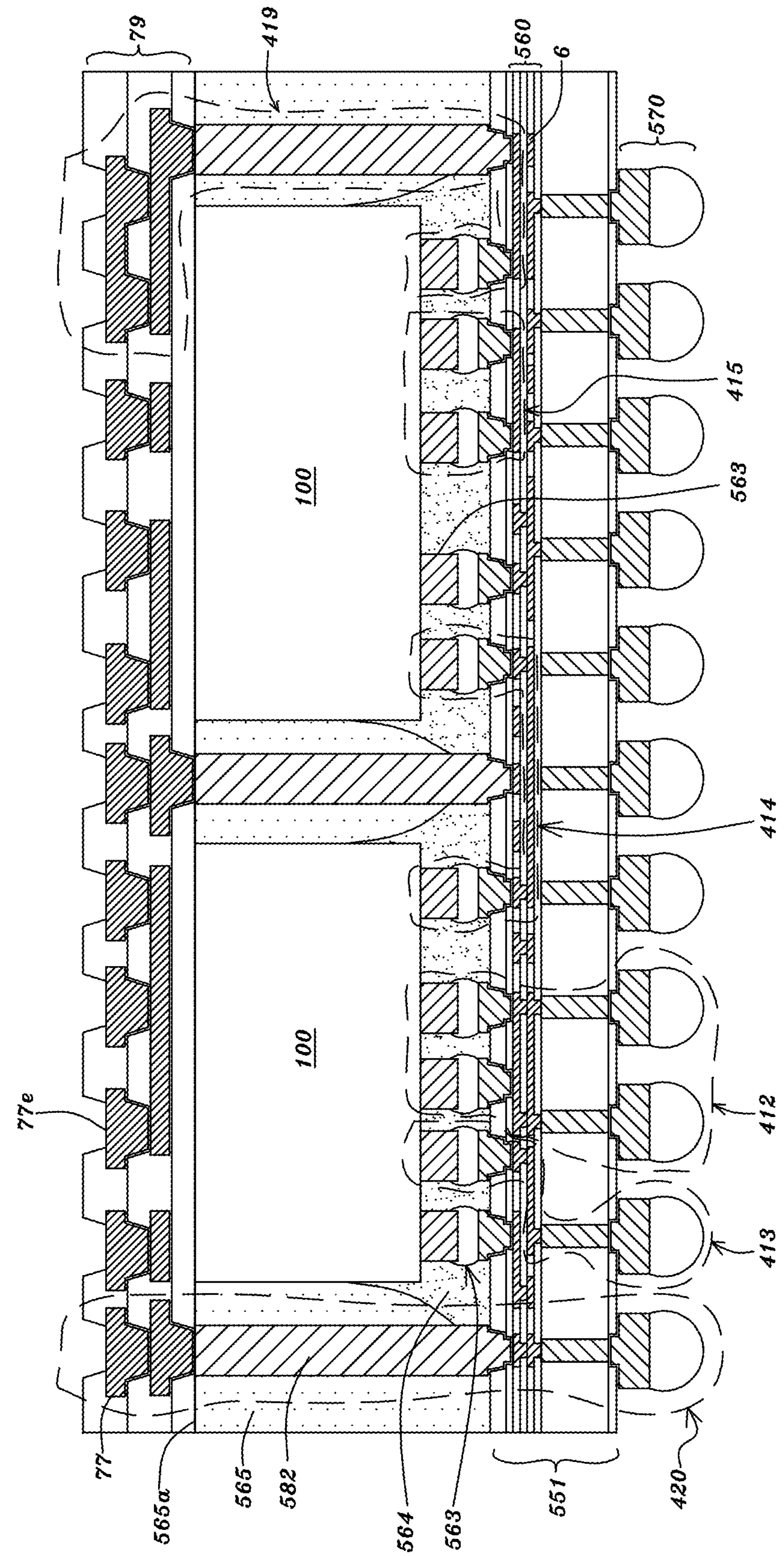
FIGS. 35A-35C are cross-sectional views showing various interconnection nets in a COIP logic drive in accordance with embodiments of the present application.
Figure 35B:
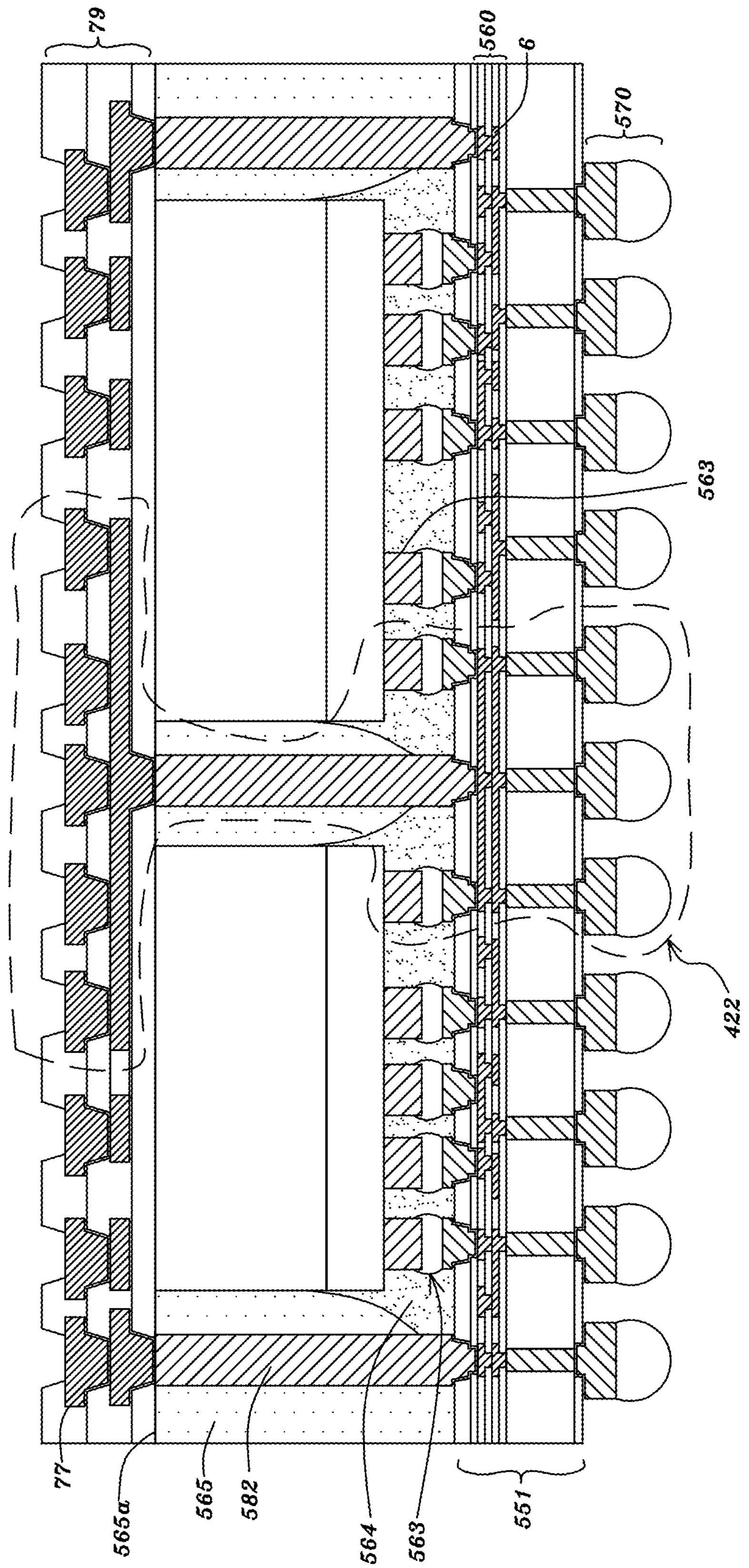
Figure 35C:
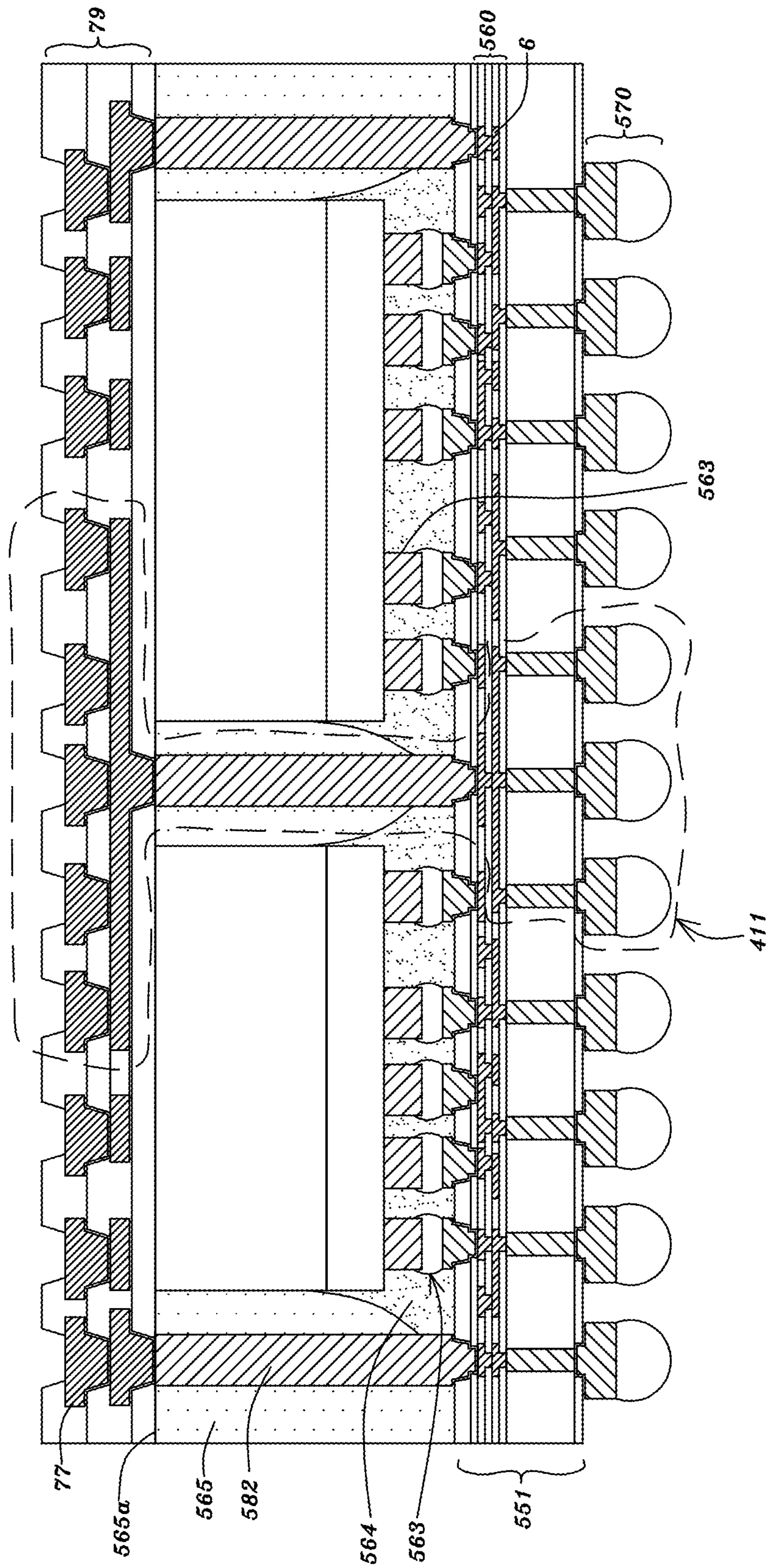

FIGS. 35A-35C are cross-sectional views showing various interconnection nets in a COIP logic drive in accordance with embodiments of the present application.

Referring to FIG. 35C, the interconnection metal layers 6 and/or 27 of the FISIP 560 and/or SISIP 588 of the interposer 551 may connect one or more of the metal pillars or bumps 570 to one of the semiconductor chips 100 and connect one of the semiconductor chips 100 to another of the semiconductor chips 100. For a first case, the interconnection metal layers 6 and/or 27 of the FISIP 560 and/or SISIP 588 of the interposer 551, the interconnection metal layers 77 of the BISD 79 and the TPVs 582 may compose a first interconnection net 411 connecting multiple of the metal pillars or bumps 570 to each other or one another, connecting multiple of the semiconductor chips 100 to each other or one another and connecting multiple of the metal pads 77*e* to each other or one another. Said multiple of the metal pillars or bumps 570, said multiple of the semiconductor chips 100 and said multiple of the metal pads 77*e* may be connected together by the first interconnection net 411. The first interconnection net 411 may be a signal bus for delivering signals or a power or ground plane or bus for delivering power or ground supply.

Referring to FIG. 35A, for a second case, the interconnection metal layers 6 and/or 27 of the FISIP 560 and/or SISIP 588 of the interposer 551 may compose a second interconnection net 412 connecting multiple of the metal pillars or bumps 570 to each other or one another and connecting multiple of the bonded contacts 563 between one of the semiconductor chips and the interposer 551 to each other or one another. Said multiple of the metal pillars or bumps 570 and said multiple of the bonded contacts 563 may be connected together by the second interconnection net 412. The second interconnection net 412 may be a signal bus for delivering signals or a power or ground plane or bus for delivering power or ground supply.

Referring to FIG. 35A, for a third case, the interconnection metal layers 6 and/or 27 of the FISIP 560 and/or SISIP 588 of the interposer 551 may compose a third interconnection net 413 connecting one of the metal pillars or bumps 570 to one of the bonded contacts 563. The third interconnection net 413 may be a signal bus or trace for signal transmission or a power or ground plane or bus for delivering power or ground supply.

Referring to FIG. 35A, for a fourth case, the interconnection metal layers 6 and/or 27 of the FISIP 560 and/or SISIP 588 of the interposer 551 may compose a fourth interconnection net 414 not connecting to any of the metal pillars or bumps 570 of the COIP logic drive 300 but connecting multiple of the semiconductor chips 100 to each other or one another. The fourth interconnection net 414 may be one of the programmable interconnects 361 of the inter-chip interconnects 371 for signal transmission.

Referring to FIG. 35A, for a fifth case, the interconnection metal layers 6 and/or 27 of the FISIP 560 and/or SISIP 588 of the interposer 551 may compose a fifth interconnection net 415 not connecting to any of the metal pillars or bumps 570 of the COIP logic drive 300 but connecting multiple of the bonded contacts 563 between one of the semiconductor chips 100 and the interposer 551 to each other or one another. The fifth interconnection net 415 may be a signal bus or trace for signal transmission or a power or ground plane or bus for delivering power or ground supply.

Referring to FIG. 35A-35C, the interconnection metal layers 77 of the BISD 79 may be connected to the interconnection metal layers 6 and/or 27 of the FISIP 560 and/or SISIP 588 of the interposer 551 through the TPVs 582. For example, each of the metal pads 77*e* of the BISD 79 in a first group may be connected to one of the semiconductor chips 100 through the interconnection metal layers 77 of the BISD 79, one or more of the TPVs 582 and the interconnection metal layers 27 and/or 6 of the SISIP 588 and/or FISIP 560 of the interposer 551, in sequence, as provided by the first interconnection net 411. Furthermore, one of the metal pads 77*e* in the first group may be further connected to one or more of the metal pillars or bumps 570 through, in sequence, the interconnection metal layers 77 of the BISD 79, one or more of the TPVs 582 and the interconnection metal layers 27 and/or 6 of the SISIP 588 and/or FISIP 560 of the interposer 551, as provided by the first interconnection net 411. Alternatively, multiple of the metal pads 77*e* in the first group may be connected to each other or one another through the interconnection metal layers 77 of the BISD 79 and to one or more of the metal pillars or bumps 570 through, in sequence, the interconnection metal layers 77 of the BISD 79, one or more of the TPVs 582 and the interconnection metal layers 27 and/or 6 of the SISIP 588 and/or FISIP 560 of the interposer 551, wherein said multiple of the metal pads 77*e* in the first group may be divided into a first subset of one or ones over a backside of one of the semiconductor chips 100 and a second subset of one or ones over a backside of another of the semiconductor chips 100, as provided by the first interconnection net 411. Alternatively, one or multiple of the metal pads 77*e* in the first group may not be connected to any of the metal pillars or bumps 570 of the COIP logic drive 300, as provided by a sixth interconnection net 419 in FIG. 35A.

Referring to FIGS. 35A-35C, each of the metal pads 77*e* of the BISD 79 in a second group may not be connected to any of the semiconductor chips 100 of the COIP logic drive 300 but connected to one or more of the metal pillars or bumps 570 through the interconnection metal layers 77 of the BISD 79, one or more of the TPVs 582 and the interconnection metal layers 27 and/or 6 of the SISIP 588 and/or FISIP 560 of the interposer 551, in sequence, as provided by a seventh interconnection net 420 in FIG. 35A and an eighth interconnection net 422 in FIG. 35B. Alternatively, multiple of the metal pads 77*e* of the BISD 79 in the second group may not be connected to any of the semiconductor chips 100 of the COIP logic drive 300 but connected to each other or one another through the interconnection metal layers 77 of the BISD 79 and to one or more of the metal pillars or bumps 570 through, in sequence, the interconnection metal layers 77 of the BISD 79, one or more of the TPVs 582 and the interconnection metal layers 27 and/or 6 of the SISIP 588 and/or FISIP 560 of the interposer 551, wherein said multiple of the metal pads 77*e* in the second group may be divided into a first subset of one or ones over a backside of one of the semiconductor chips 100 and a second subset of one or ones over a backside of another of the semiconductor chips 100, as provided by the eighth interconnection net 422 in FIG. 35B.

Figure 35D:
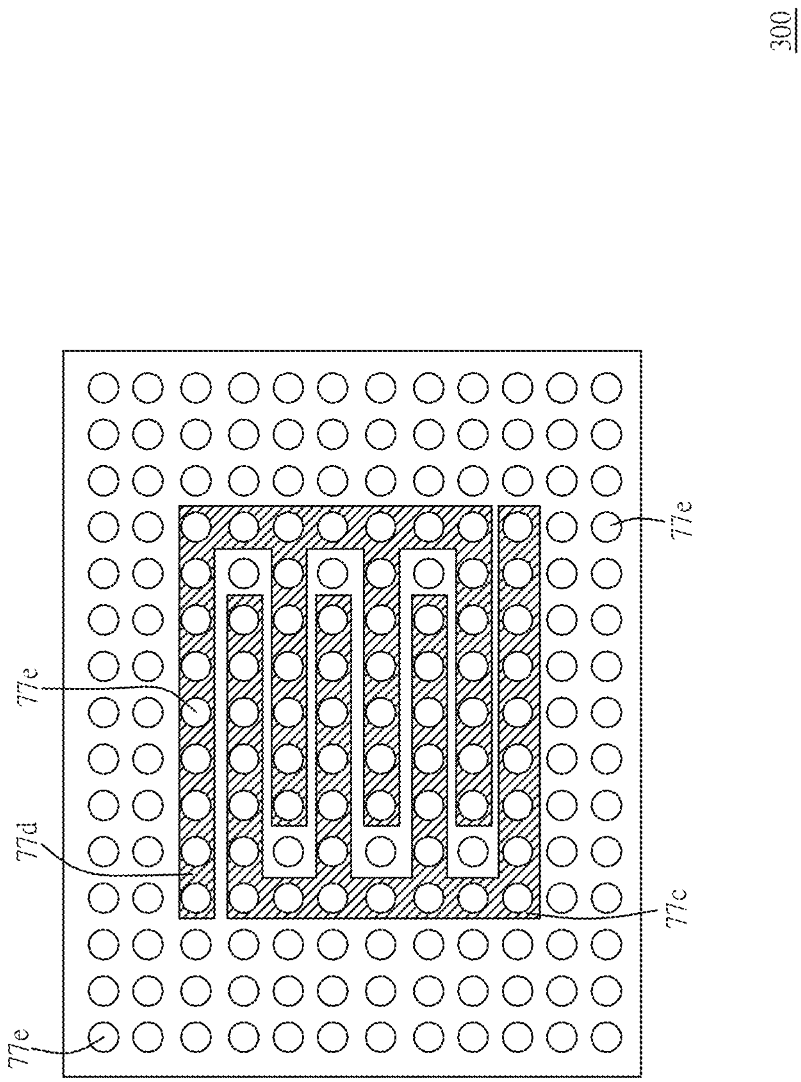
FIG. 35D is a top view of FIGS. 35A-35C, showing a layout of metal pads of a logic drive in accordance with an embodiment of the present application.

Referring to FIG. 35A-35C, one of the interconnection metal layers 77 in the BISD 79 may include the power plane 77*c* and ground plane 77*d* of a power supply as shown in FIG. 35D. FIG. 35D is a top view of FIGS. 35A-35C, showing a layout of metal pads of a logic drive in accordance with an embodiment of the present application. Referring to FIG. 35D, the metal pads 77*e* may be layout in an array at a backside of the COIP logic drive 300. Some of the metal pads 77*e* may be vertically aligned with the semiconductor chips 100. A first group of the metal pads 77*e* is arranged in an array in a central region of a backside surface of the chip package, i.e., logic drive 300, and a second group of the metal pads 77*e* may be arranged in an array in a peripheral region, surrounding the central region, of the backside surface of the chip package, i.e., logic drive 300. More than 90% or 80% of the metal pads 77*e* in the first group may be used for power supply or ground reference. More than 50% or 60% of the metal pads 77*e* in the second group may be used for signal transmission. The metal pads 77*e* in the second group may be arranged from one or more rings, such as 1 2, 3, 4, 5 or 6 rings, along the edges of the backside surface of the chip package, i.e., logic drive 300. The minimum pitch of the metal pads 77*e* in the second group may be smaller than that of the metal pads 77*e* in the first group.

Alternatively, referring to FIGS. 35A-35C, one of the interconnection metal layers 77 of the BISD 79, such as the topmost one, may include a thermal plane for heat dispassion and one or more of the TPVs 582 may be provided as thermal vias formed under the thermal plane for heat dispassion.

Package-On-Package (POP) Assembly for COIP Logic Drives

Figure 36A:
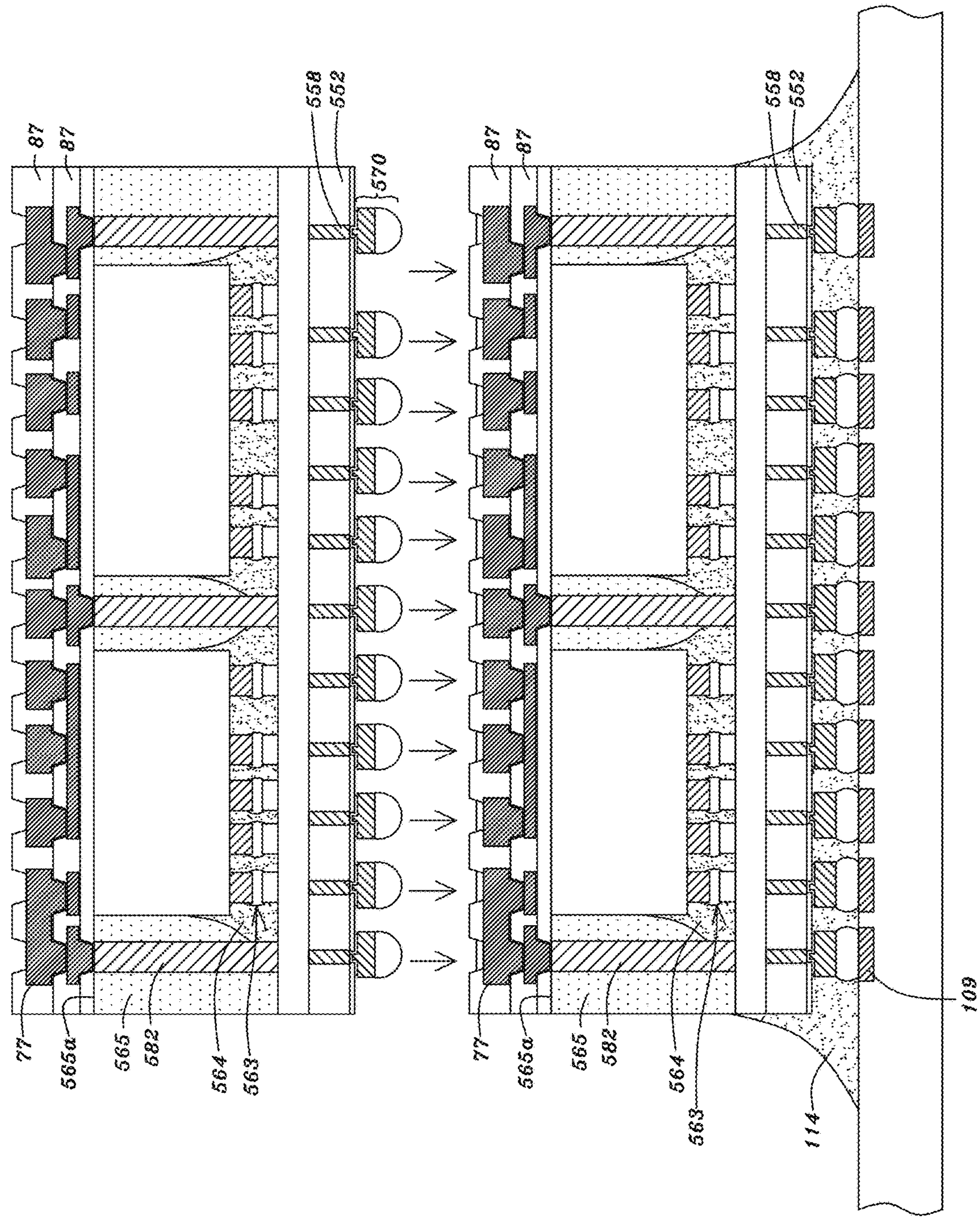
FIGS. 36A-36F are schematically views showing a process for fabricating a package-on-package assembly in accordance with an embodiment of the present application.

FIGS. 36A-36F are schematically views showing a process for fabricating a package-on-package assembly in accordance with an embodiment of the present application. Referring to FIG. 36A, when a top one of the COIP logic drives 300 as seen in FIG. 33M or 34D is mounted onto a bottom one of the COIP logic drives 300 as seen in FIG. 33M or 34D, the bottom one of the COIP logic drives 300 may have its BISD 79 to couple the interposer 551 of the top one of the COIP logic drives 300 via the metal pillars or bumps 570 provided from the top one of the COIP logic drives 300. The process for fabricating a package-on-package assembly is mentioned as below:

First, referring to FIG. 36A, a plurality of the bottom one of the COIP logic drive 300 (only one is shown) as seen in FIG. 33M or 34D may have its metal pillars or bumps 570 mounted onto multiple metal pads 109 of a circuit carrier or substrate 110 at a topside thereof, such as Printed Circuit Board (PCB), Ball-Grid-Array (BGA) substrate, flexible circuit film or tape, or ceramic circuit substrate. An underfill 114 may be filled into a gap between the circuit carrier or substrate 110 and the bottom one of the COIP logic drives 300. Alternatively, the underfill 114 may be skipped. Next, a surface-mount technology (SMT) may be used to mount a plurality of the top one of the COIP logic drives 300 (only one is shown) as seen in FIG. 33M or 34D onto the plurality of the bottom one of the COIP logic drives 300. Solder or solder cream or flux 112 may be first printed on the metal pads 77*e* of the BISD 79 of the bottom one of the COIP logic drives 300.

Figure 36B:
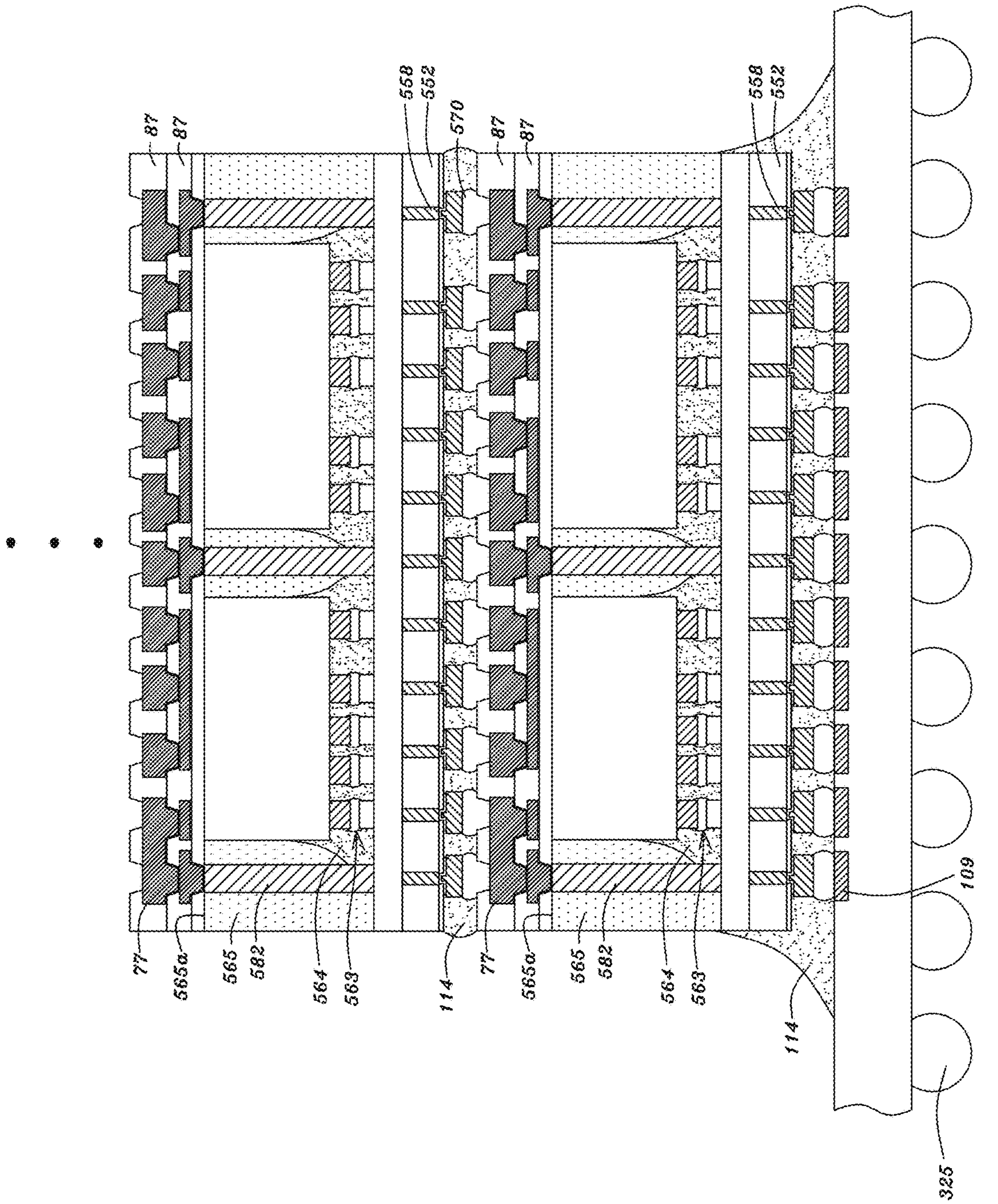

Next, referring to FIGS. 36A and 36B, the top one of the COIP logic drives 300 may have its metal pillars or bumps 570 placed on the solder or solder cream or flux 112. Next, referring to FIG. 29B, a reflowing or heating process may be performed to fix the metal pillars or bumps 570 of the top one of the COIP logic drives 300 to the metal pads 77*e* of the BISD 79 of the bottom one of the COIP logic drives 300. Next, an underfill 114 may be filled into a gap between the top and bottom ones of the COIP logic drives 300. Alternatively, the underfill 114 may be skipped.

In the next optional step, referring to FIG. 36B, other multiple of the COIP logic drives 300 as seen in FIG. 33M or 34D may have its metal pillars or bumps 570 to be mounted onto the metal pads 77*e* of the BISD 79 of the plurality of the top one of the COIP logic drives 300 using the surface-mount technology (SMT) and the underfill 114 is then optionally formed therebetween. The step may be repeated by multiple times to form the COIP logic drives 300 stacked in three-layered fashion or more-than-three-layered fashion on the circuit carrier or substrate 110.

Next, referring to FIG. 36B, multiple solder balls 325 are planted on a backside of the circuit carrier or substrate 110. Next, referring to FIG. 36C, the circuit carrier or structure 110 may be separated, cut or diced into multiple individual substrate units 113, such as Printed Circuit Boards (PCBs), Ball-Grid-Array (BGA) substrates, flexible circuit films or tapes, or ceramic circuit substrates, by a laser cutting process or by a mechanical cutting process. Thereby, the number i of the COIP logic drives 300 may be stacked on one of the substrate units 113, wherein the number i may be equal to or greater than 2, 3, 4, 5, 6, 7 or 8.

Figure 36C:
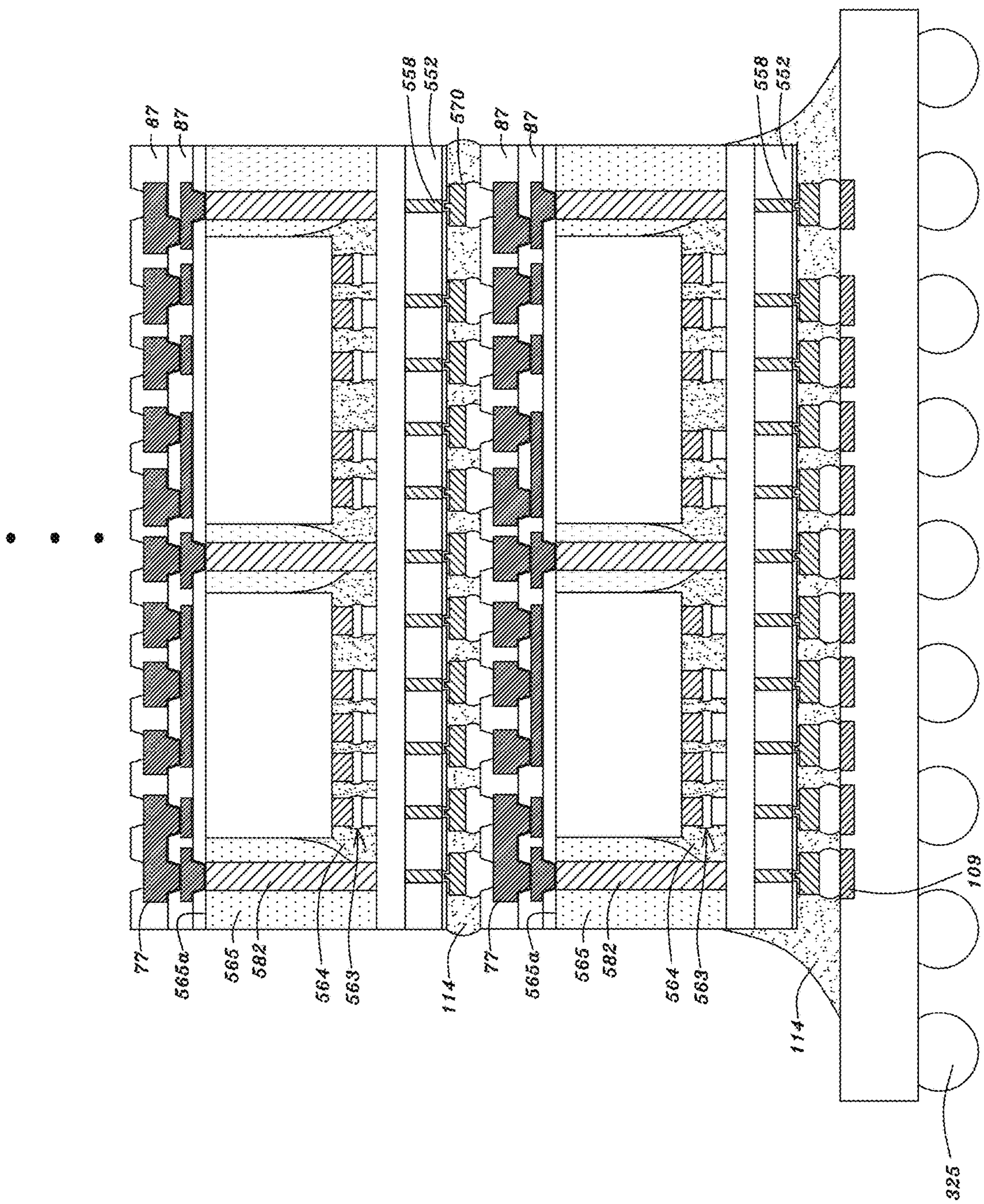
Figure 36D:
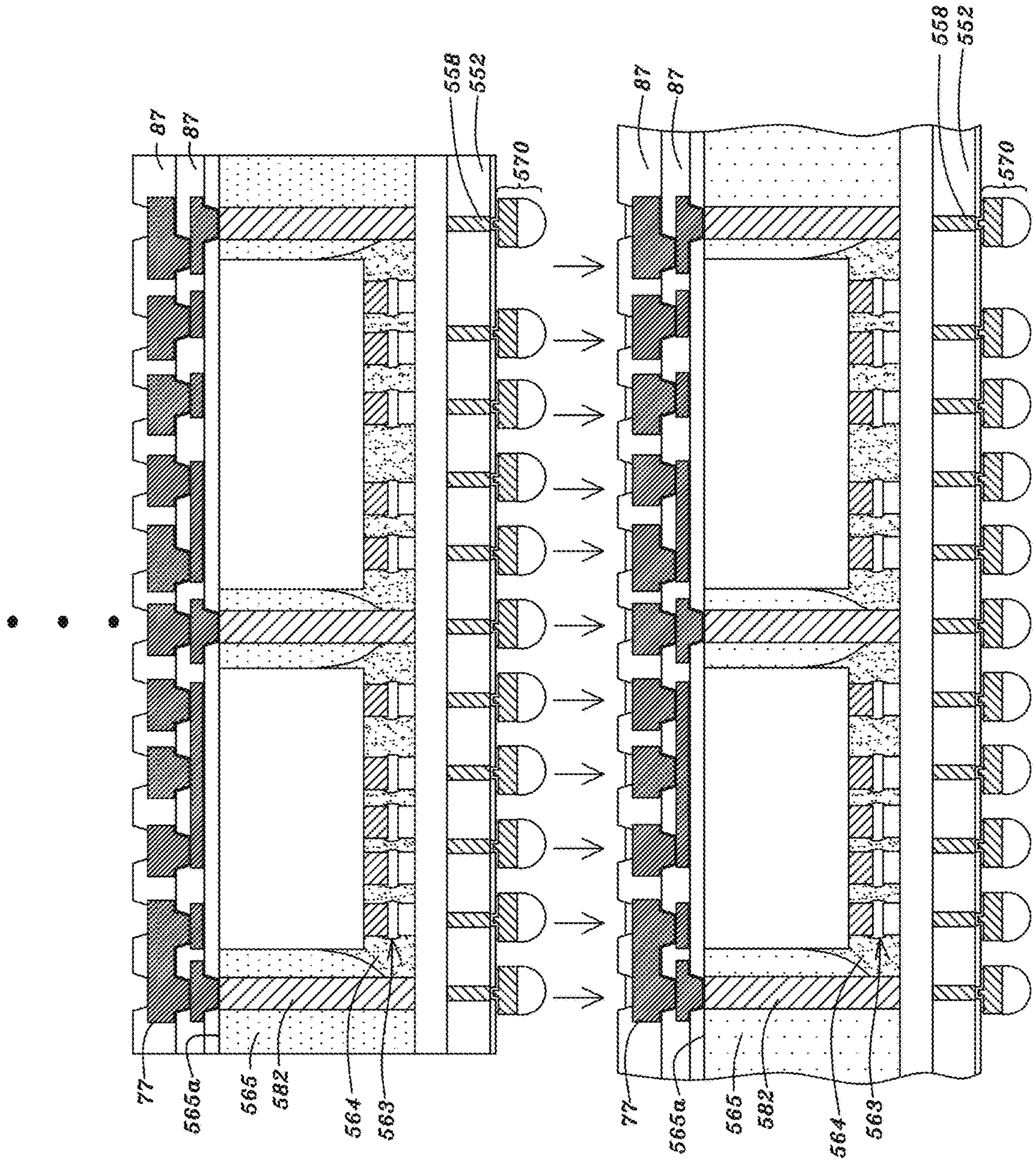
Figure 36E:
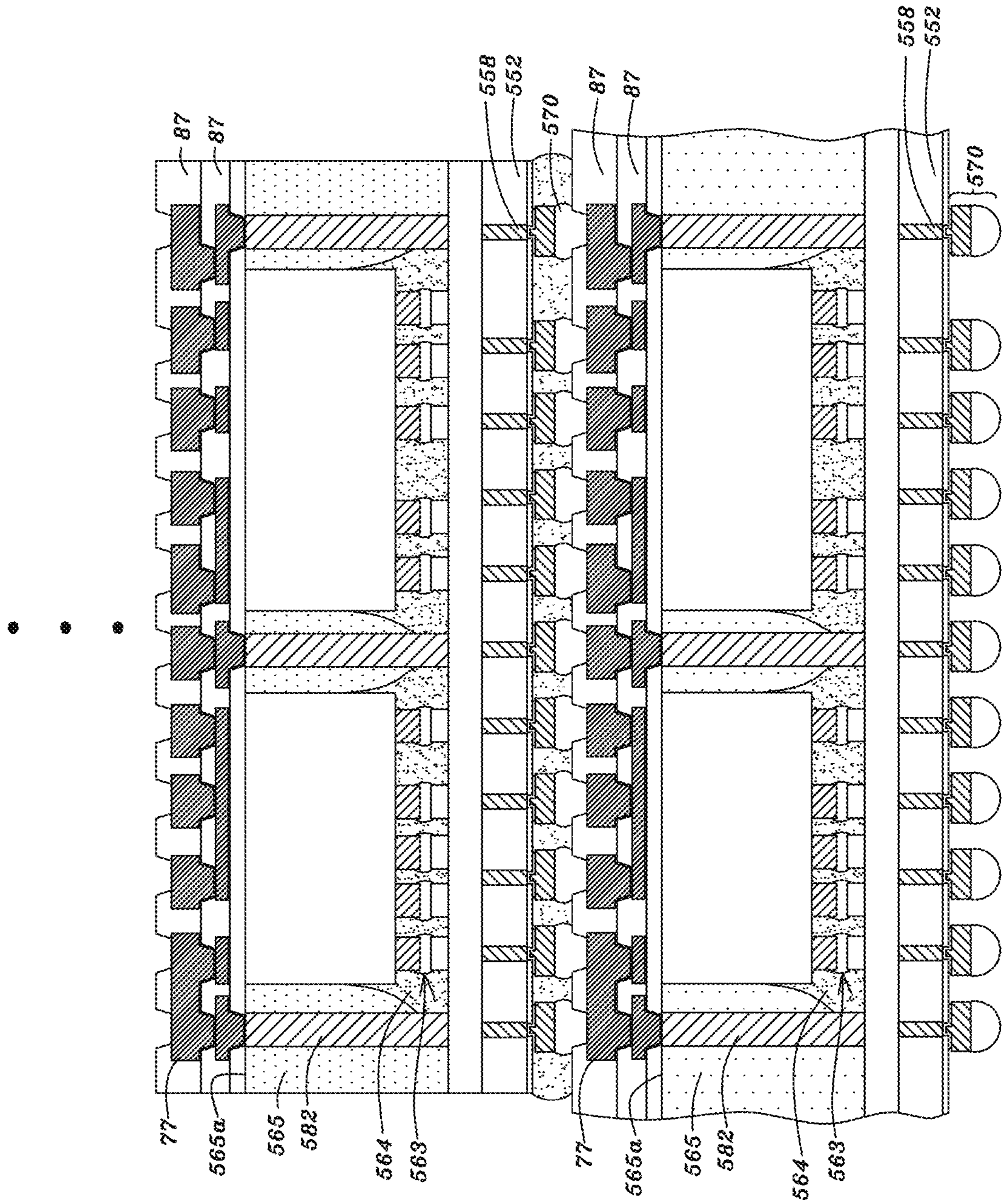

Alternatively, FIGS. 36D through 29F are schematically views showing a process for fabricating a package-on-package assembly in accordance with an embodiment of the present application. Referring to FIGS. 36D and 36E, a plurality of the top one of the COIP logic drive 300 as seen in FIG. 33M or 34D may have its metal pillars or bumps 570 fixed or mounted, using the SMT technology, to the metal pads 77*e* of the BISD 79 of the structure in a wafer or panel level as seen in FIG. 33M or 34C before being separated into a plurality of the bottom one of the COIP logic drives 300.

Next, referring to FIG. 36E, the underfill 114 may be filled into a gap between each of the top ones of the COIP logic drives 300 and the structure in a wafer or panel level as seen in FIG. 33M or 34C. Alternatively, the underfill 114 may be skipped.

In the next optional step, referring to FIG. 36E, other multiple of the COIP logic drives 300 as seen in FIG. 33M or 34D may have its metal pillars or bumps 570 to be mounted onto the metal pads 77*e* of the BISD 79 of the plurality of the top one of the COIP logic drives 300 using the surface-mount technology (SMT) and the underfill 114 is then optionally formed therebetween. The step may be repeated by multiple times to form the COIP logic drives 300 stacked in two-layered fashion or more-than-two-layered fashion on the structure in a wafer or panel level as seen in FIG. 33M or 34C.

Figure 36F:
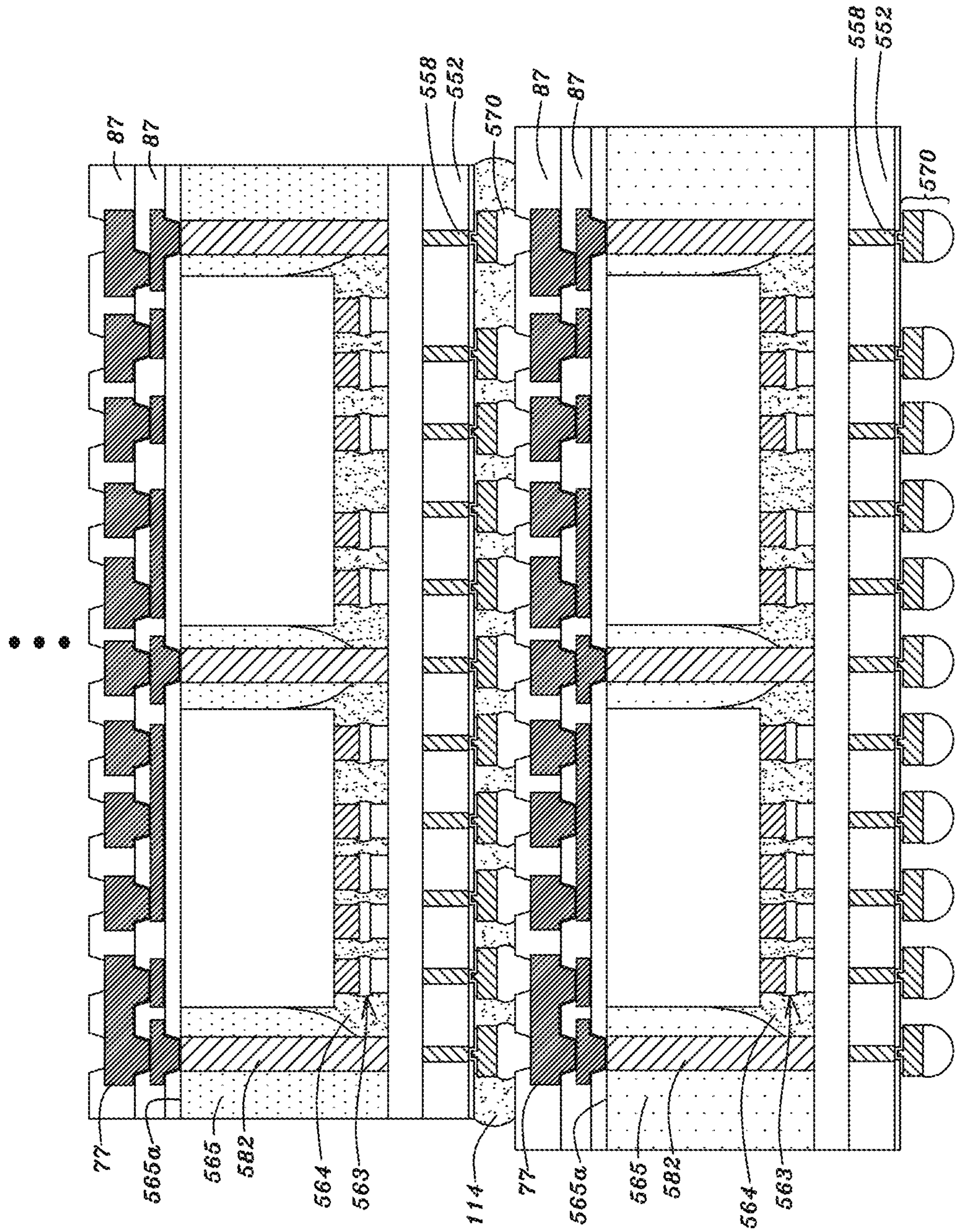

Next, referring to FIG. 36F, the structure in a wafer or panel level as seen in FIG. 33M or 34C may be separated, cut or diced into a plurality of the bottom one of the COIP logic drives 300 by a laser cutting process or by a mechanical cutting process. Thereby, the number i of the COIP logic drives 300 may be stacked together, wherein the number i may be equal to or greater than 2, 3, 4, 5, 6, 7 or 8. Next, the COIP logic drives 300 stacked together may have a bottommost one provided with the metal pillars or bumps 570 to be mounted onto the multiple metal pads 109 of the circuit carrier or substrate 110 as seen in FIG. 29A, such as ball-grid-array substrate, at a topside thereof. Next, an underfill 114 may be filled into a gap between the circuit carrier or substrate 110 and the bottommost one of the COIP logic drives 300. Alternatively, the underfill 114 may be skipped. Next, multiple solder balls 325 are planted on a backside of the circuit carrier or substrate 110. Next, the circuit carrier or structure 110 may be separated, cut or diced into multiple individual substrate units 113, such as printed circuit boards (PCB) or BGA (Ball-Grid-array) substrates, by a laser cutting process or by a mechanical cutting process, as seen in FIG. 36C. Thereby, the number i of the COIP logic drives 300 may be stacked on one of the substrate units 113, wherein the number i may be equal to or greater than 2, 3, 4, 5, 6, 7 or 8.

The COIP logic drives 300 with the TPVs 582 to be stacked in a vertical direction to form the POP assembly may be in a standard format or have standard sizes. For example, the COIP logic drives 300 may be in a shape of square or rectangle, with a certain widths, lengths and thicknesses. An industry standard may be set for the shape and dimensions of the COIP logic drives 300. For example, the standard shape of each of the COIP logic drives 300 may be a square, with a width greater than or equal to 4 mm, 7 mm, 10 mm, 12 mm, 15 mm, 20 mm, 25 mm, 30 mm, 35 mm or 40 mm, and having a thickness greater than or equal to 0.03 mm, 0.05 mm, 0.1 mm, 0.3 mm, 0.5 mm, 1 mm, 2 mm, 3 mm, 4 mm or 5 mm. Alternatively, the standard shape of each of the COIP logic drives 300 may be a rectangle, with a width greater than or equal to 3 mm, 5 mm, 7 mm, 10 mm, 12 mm, 15 mm, 20 mm, 25 mm, 30 mm, 35 mm or 40 mm, and a length greater than or equal to 5 mm, 7 mm, 10 mm, 12 mm, 15 mm, 20 mm, 25 mm, 30 mm, 35 mm, 40 mm, 45 mm or 50 mm; and having a thickness greater than or equal to 0.03 mm, 0.05 mm, 0.1 mm, 0.3 mm, 0.5 mm, 1 mm, 2 mm, 3 mm, 4 mm or 5 mm.

Interconnection for Multiple COIP Drives Stacked Together

Figure 37A:
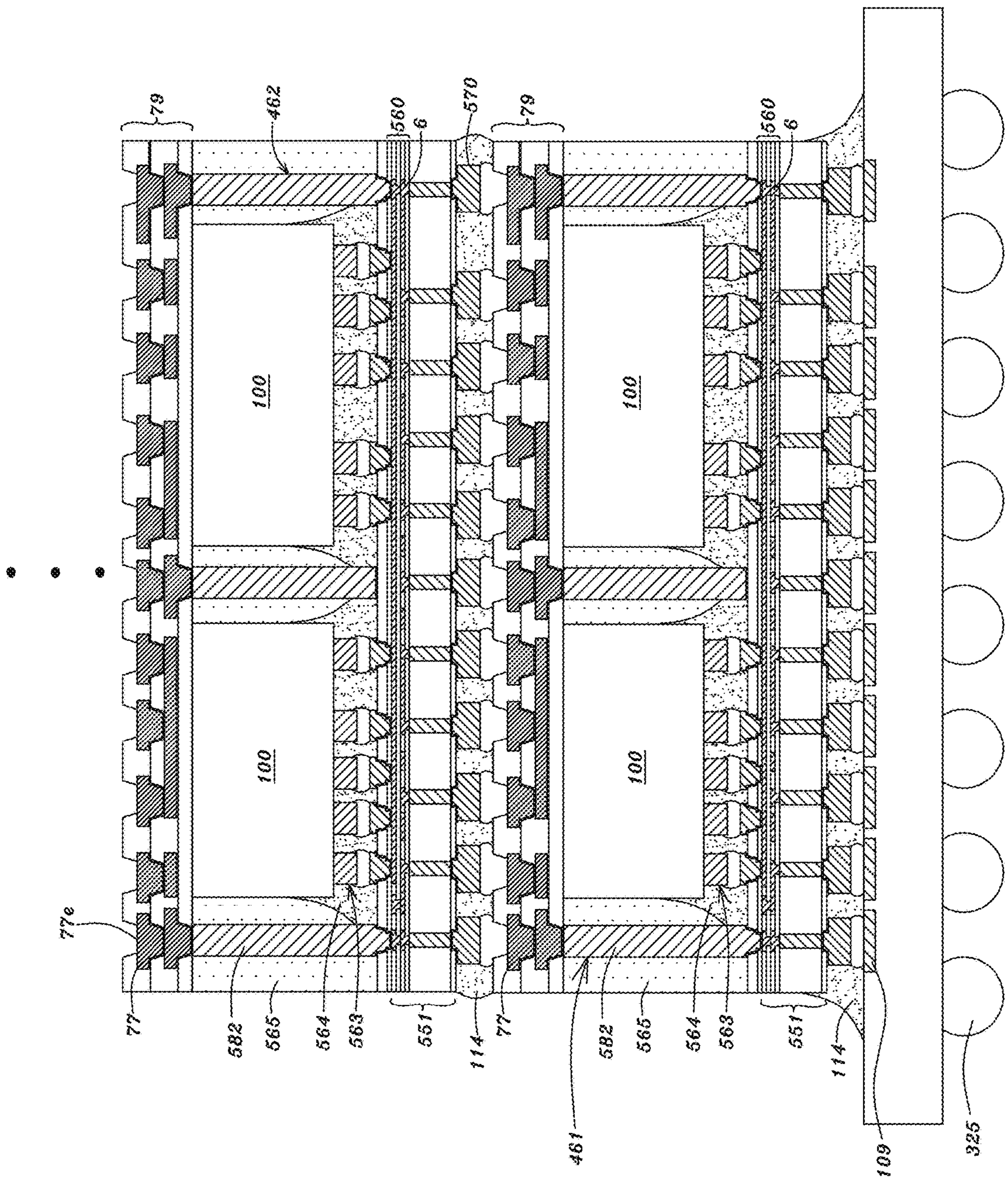
FIGS. 37A-37C are cross-sectional views showing various connection of multiple logic drives in POP assembly in accordance with embodiment of the present application.
Figure 37B:
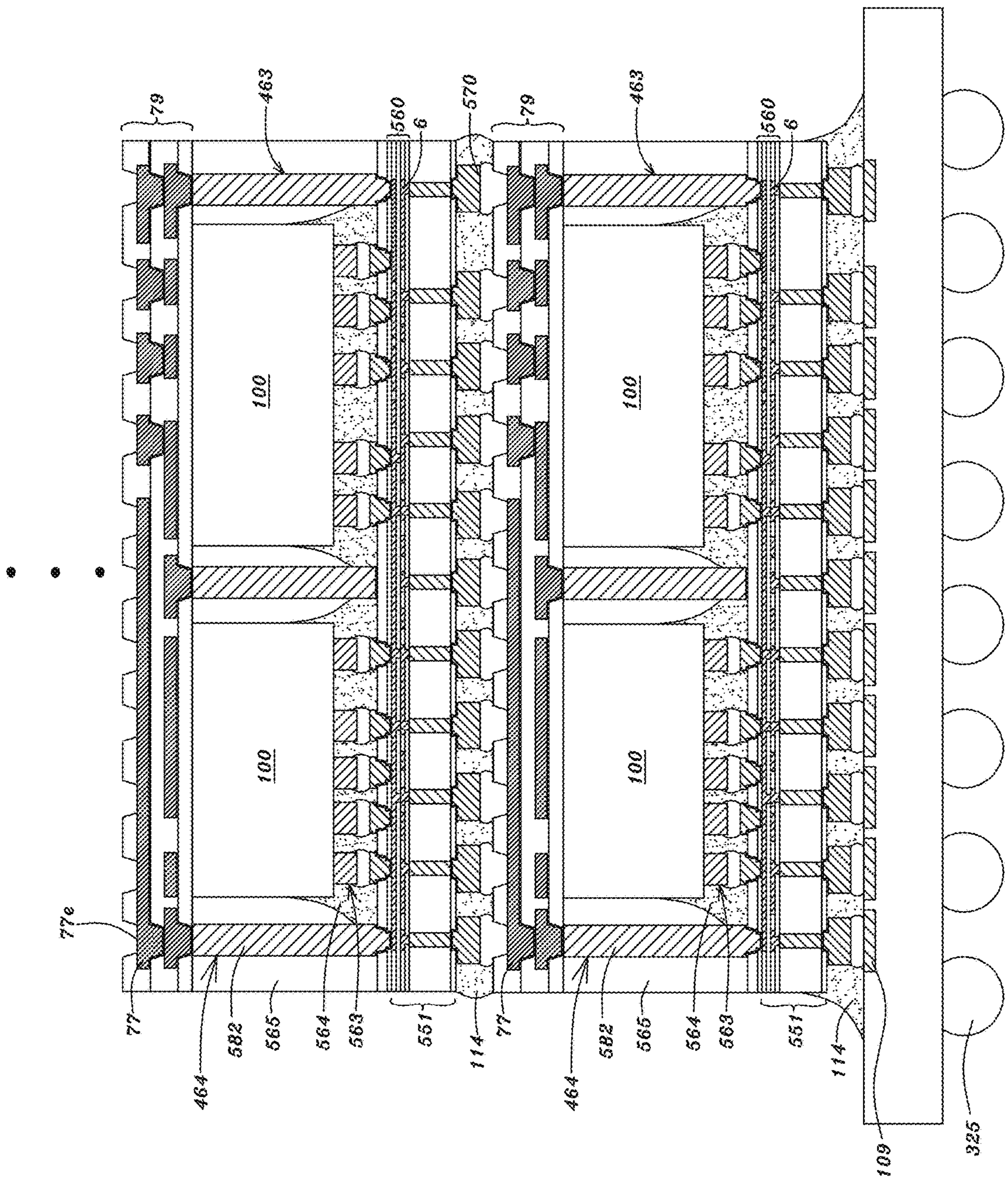
Figure 37C:
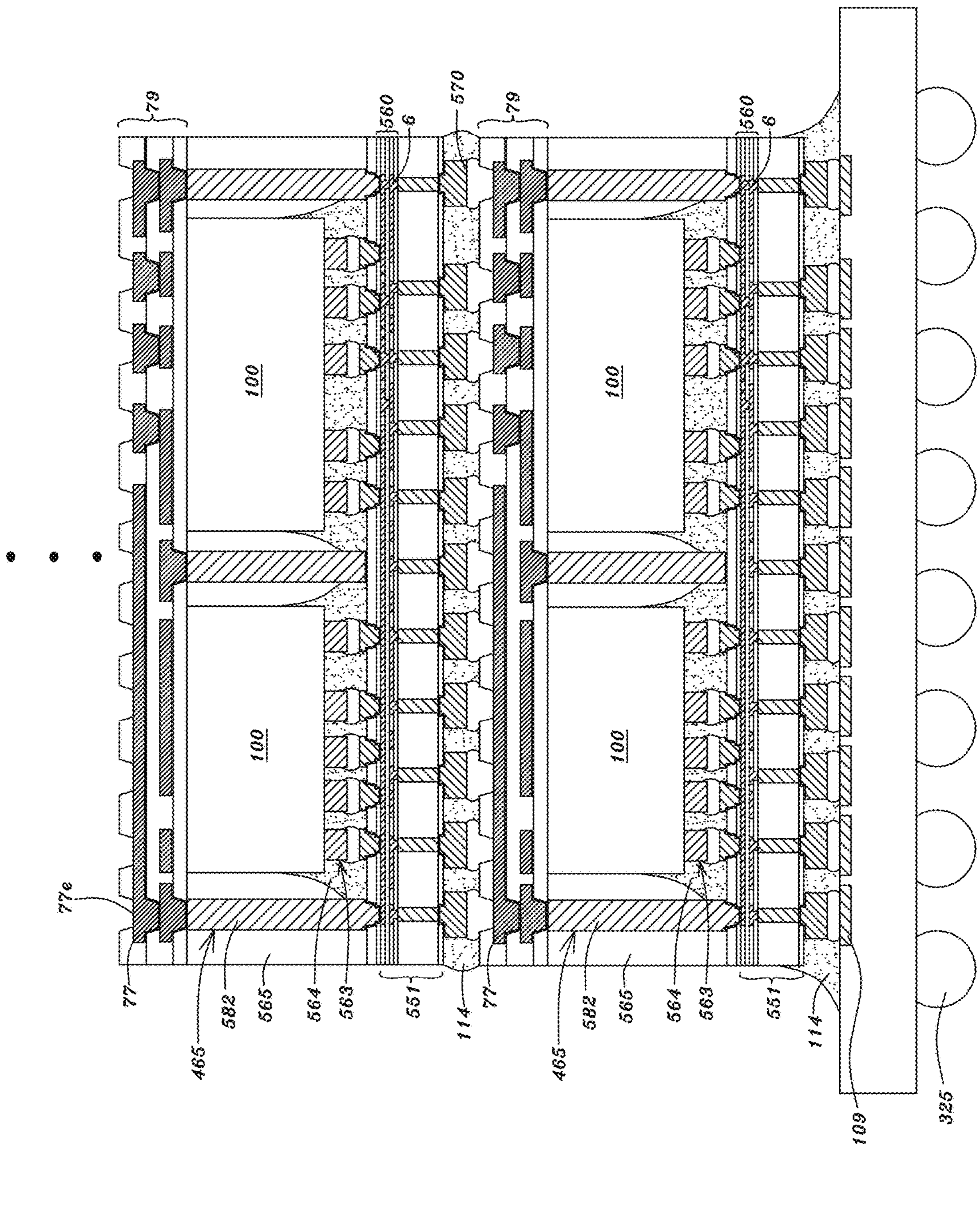

FIGS. 37A-37C are cross-sectional views showing various connection of multiple logic drives in POP assembly in accordance with embodiment of the present application. Referring to FIG. 37A, in the POP assembly, each of the COIP logic drives 300 may include one or more of the TPVs 582 used as first inter-drive interconnects 461 stacked and coupled to each other or one another for connecting to an upper one of the COIP logic drives 300 and/or to a lower one of the COIP logic drives 300, without connecting or coupling to any of the semiconductor chips 100 in the POP assembly. In each of the COIP logic drives 300, each of the first inter-drive interconnects 461 is formed, from top to bottom, of: (i) one of the metal pads 77*e* of the BISD 79, (ii) a stacked portion of the interconnection metal layers 77 of the BISD 79, (iii) one of the TPVs 582, (iv) a stacked portion of the interconnection metal layers 27 and/or 6 of the SISIP 588 and/or FISIP 560 of the interposer 551, (v) one of the vias 558 of the interposer 551, and (vi) one of the metal pillars or bumps 570.

Alternatively, referring to FIG. 37A, a second inter-drive interconnect 462 in the POP assembly may be provided like the first inter-drive interconnect 461, but the second inter-drive interconnect 462 may connect or couple to one or more of the semiconductor chips 100 through the interconnection metal layers 6 and/or 27 of the FISIP 560 and/or SISIP 588 of the interposer 551.

Alternatively, referring to FIG. 37B, each of the COIP logic drives 300 may provide a third inter-drive interconnect 463 like the first inter-drive interconnect 461 in FIG. 37A, but the third inter-drive interconnect 463 is not stacked down to one of the metal pillars or bumps 570, which are positioned vertically under the third inter-drive interconnect 463, joining a lower one of the COIP logic drives 300 or the substrate unit 113. Its third inter-drive interconnect 463 may couple to another one or more of its metal pillars or bumps 570, which are positioned not vertically under its TPVs 582 but vertically under one of its semiconductor chips 100, joining a lower one of the COIP logic drives 300 or the substrate unit 113.

Alternatively, referring to FIG. 37B, each of the COIP logic drives 300 may provide a fourth inter-drive interconnect 464 composed of (i) a first horizontally-distributed portion of the interconnection metal layers 77 of its BISD 79, (ii) one of its TPVs 582 coupling to one or more of the metal pads 77*e* of the first horizontally-distributed portion vertically over one or more of its semiconductor chips 100, and (iii) a second horizontally-distributed portion of the interconnection metal layers 6 of its interposer 551 connecting or coupling said one of its TPVs 582 to one or more of its semiconductor chips 100. The second horizontally-distributed portion of its fourth inter-drive interconnect 464 may couple to its metal pillars or bumps 570, which are positioned not vertically under said one of its TPVs 582 but vertically under said one or more of its semiconductor chips 100, joining a lower one of the COIP logic drives 300 or the substrate unit 113.

Alternatively, referring to FIG. 37C, each of the COIP logic drives 300 may provide a fifth inter-drive interconnect 465 composed of (i) a first horizontally-distributed portion of the interconnection metal layers 77 of its BISD 79, (ii) one of its TPVs 582 coupling to one or more of the metal pads 77*e* of the first horizontally-distributed portion vertically over one or more of its semiconductor chips 100, and (iii) a second horizontally-distributed portion of the interconnection metal layers 6 and/or 27 of the FISIP 560 and/or SISIP 588 of its interposer 551 connecting or coupling said one of its TPVs 582 to one or more of its semiconductor chips 100. The second horizontally-distributed portion of its fifth inter-drive interconnect 465 may not couple to any of its metal pillars or bumps 570 joining a lower one of the COIP logic drives 300 or the substrate unit 113.

Immersive IC Interconnection Environment (IIIE)

Referring to FIGS. 37A-37C, the COIP logic drives 300 may be stacked to form a super-rich interconnection scheme or environment, wherein their semiconductor chips 100 represented for the standard commodity FPGA IC chips 200, provided with the programmable logic blocks 201 as illustrated in FIGS. 14A-14J and the cross-point switches 379 as illustrated in FIGS. 11A-11D, immerses in the super-rich interconnection scheme or environment, i.e., programmable 3D Immersive IC Interconnection Environment (IIIE). For one of the standard commodity FPGA IC chips 200 in one of the COIP drives 300, (1) the interconnection metal layers 6 of the FISC 20 of said one of the standard commodity FPGA IC chips 200, interconnection metal layers 27 of the SISC 29 of said one of the standard commodity FPGA IC chips 200, bonded contacts 563 between said one of the standard commodity FPGA IC chips 200 and the interposer 551 of said one of the COIP drives 300, the interconnection metal layers 6 and/or 27, i.e., inter-chip interconnects 371, of the FISIP 560 and/or SISIP 588 of the interposer 551 of said one of the COIP drives 300, and the metal pillars or bumps 570 between a lower one and said one of the COIP logic drives 300 are provided under the programmable logic blocks 201 and cross-point switches 379 of said one of the standard commodity FPGA IC chips 200; (2) the interconnection metal layers 77 of the BISD 79 of said one of the COIP logic drives 300 and the copper pads 77*e* of the BISD 79 of said one of the COIP logic drives 300 are provided over the programmable logic blocks 201 and cross-point switches 379 of said one of the standard commodity FPGA IC chips 200; and (3) the TPVs 582 of said one of the COIP logic drives 300 are provided surrounding the programmable logic blocks 201 and cross-point switches 379 of said one of the standard commodity FPGA IC chips 200. The programmable 3D IIIE provides the super-rich interconnection scheme or environment, comprising the FISC 20 of each of the semiconductor chips 100, SISC 29 of each of the semiconductor chips 100, bonded contacts 563 between each of the semiconductor chips 100 and one of the interposers 551, the interposers 551, BISD 79 of each of the COIP logic drives, TPVs 582 of each of the COIP logic drives 300 and metal pillars or bumps 570 between each two of the COIP logic drives 300, for constructing an interconnection scheme or system in three dimensions (3D). The interconnection scheme or system in a horizontal direction may be programmed by the cross-point switches 379 of each of the standard commodity FPGA IC chips 200 and DPIIC chips 410 of each of the COIP drives 300. Also, the interconnection scheme or system in a vertical direction may be programmed by the cross-point switches 379 of each of the standard commodity FPGA IC chips 200 and DPIIC chips 410 of each of the COIP logic drives 300.

Figure 38A:
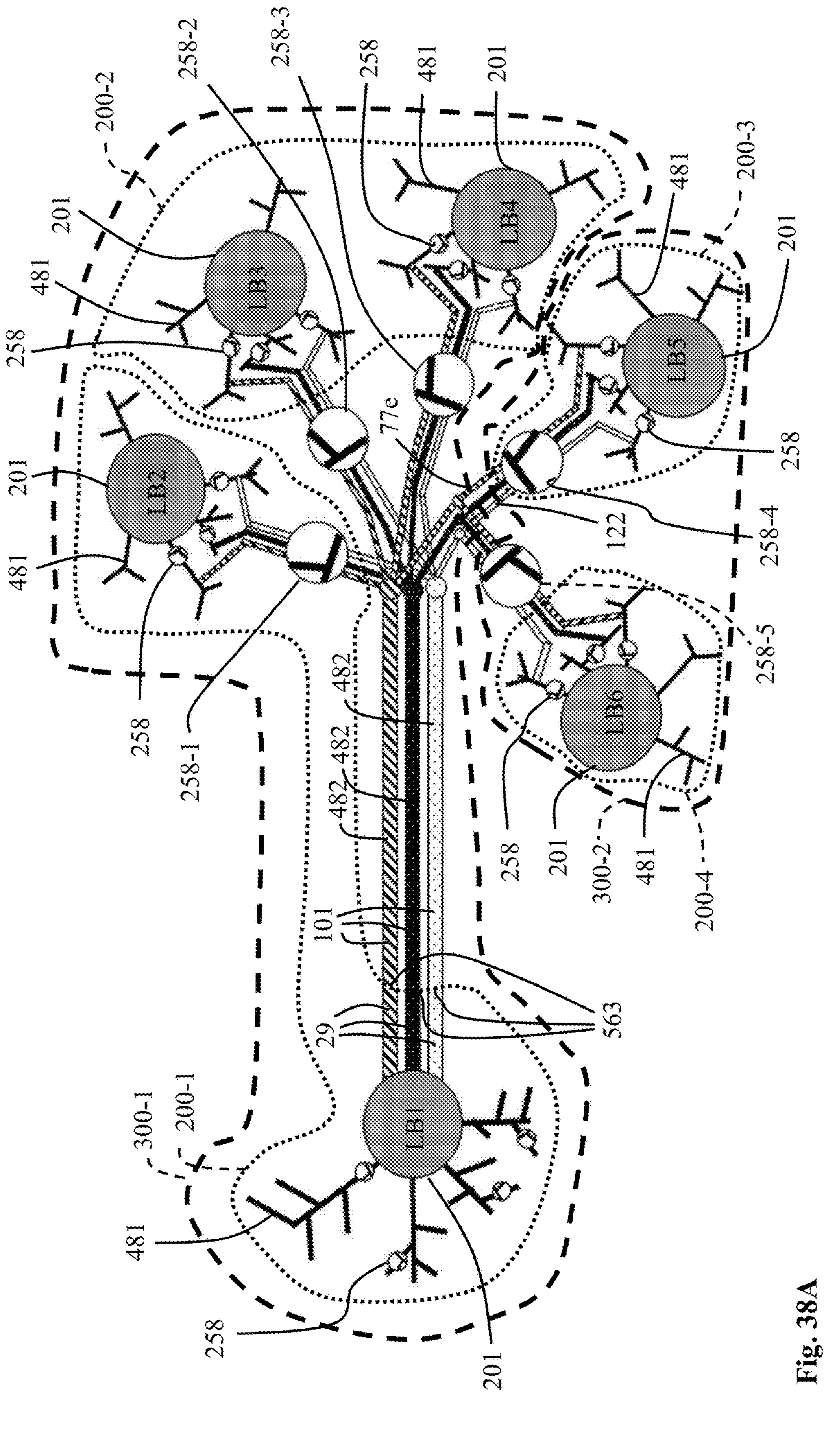
FIGS. 38A and 38B are conceptual views showing interconnection between multiple programmable logic blocks from an aspect of human's nerve system in accordance with an embodiment of the present application.
Figure 38B:
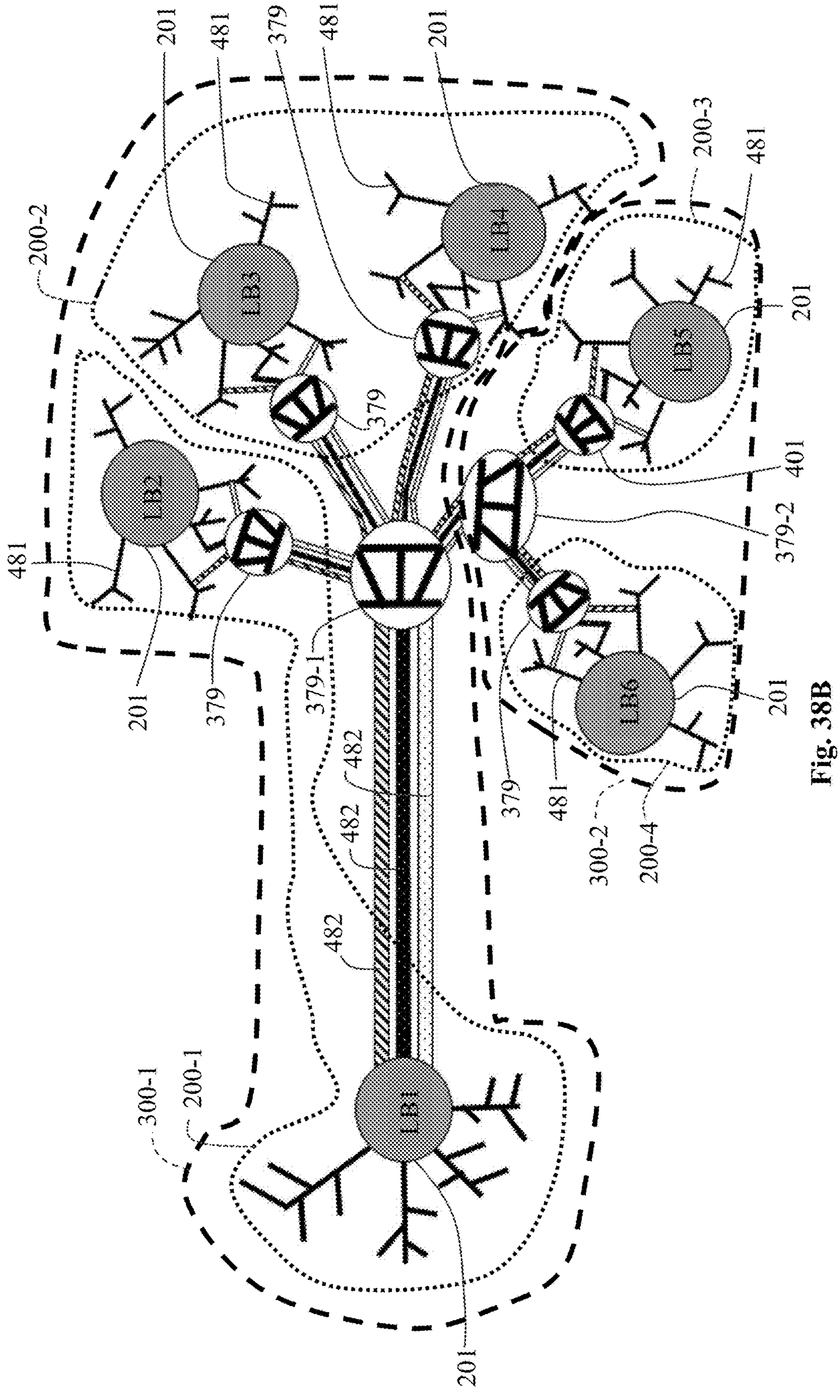

FIGS. 38A and 38B are conceptual views showing interconnection between multiple programmable logic blocks from an aspect of human's nerve system in accordance with an embodiment of the present application. For an element indicated by the same reference number shown in FIGS. 38A and 38B and in above-illustrated figures, the specification of the element as seen in FIGS. 38A and 38B may be referred to that of the element as above illustrated in the figures. Referring to FIG. 38A, the programmable 3D IIIE is similar or analogous to a human brain. The programmable logic blocks 201 as seen in FIG. 14A or 14H are similar or analogous to neurons or nerve cells; the interconnection metal layers 6 of the FISC 20 and/or the interconnection metal layers 27 of the SISC 29 are similar or analogous to the dendrites connecting to the neurons or nerve cells 201. The bonded contacts 563 connecting to the small receivers 375 of the small I/O circuits 203 of said one of the standard commodity FPGA IC chips 200 for the inputs of the programmable logic blocks 201 of said one of the standard commodity FPGA IC chips 200 are similar or analogous to post-synaptic cells at ends of the dendrites. For a short distance between two of the programmable logic blocks 201 in one of the standard commodity FPGA IC chips 200, the interconnection metal layers 6 of its FISC 20 and the interconnection metal layers 27 of its SISC 29 may construct an interconnect 482 like an axon connecting from one of the neurons or nerve cells 201 to another of the neurons or nerve cells 201. For a long distance between two of the standard commodity FPGA IC chips 200, the interconnection metal layers 6 and/or 27 of the FISIP 560 and/or SISIP 588 of the interposers 551 of the COIP logic drives 300, the interconnection metal layers 77 of the BISDs 79 of the COIP logic drives 300 and the TPVs 582 of the COIP logic drives 300 may construct the axon-like interconnect 482 connecting from one of the neurons or nerve cells 201 to another of the neurons or nerve cells 201. One of the bonded contacts 563 physically between a first one of the standard commodity FPGA IC chips 200 and one of the interposers 551 for physically connecting to the axon-like interconnect 482 may be programmed to connect to the small drivers 374 of the small I/O circuits 203 of a second one of the standard commodity FPGA IC chips 200 is similar or analogous to pre-synaptic cells at a terminal of the axon 482.

For more elaboration, referring to FIG. 38A, a first one 200-1 of the standard commodity FPGA IC chips 200 may include first and second ones LB1 and LB2 of the programmable logic blocks 201 like the neurons, the FISC 20 and SISC 29 like the dendrites 481 coupled to the first and second ones LB1 and LB2 of the programmable logic blocks 201 and the cross-point switches 379 programmed for connection of its FISC 20 and SISC 29 to the first and second ones LB1 and LB2 of the programmable logic blocks 201. A second one 200-2 of the standard commodity FPGA IC chips 200 may include third and fourth ones LB3 and LB4 of the programmable logic blocks 210 like the neurons, the FISC 20 and SISC 29 like the dendrites 481 coupled to the third and fourth ones LB3 and LB4 of the programmable logic blocks 210 and the cross-point switches 379 programmed for connection of its FISC 20 and SISC 29 to the third and fourth ones LB3 and LB4 of the programmable logic blocks 210. A first one 300-1 of the COIP logic drives 300 may include the first and second ones 200-1 and 200-2 of the standard commodity FPGA IC chips 200. A third one 200-3 of the standard commodity FPGA IC chips 200 may include a fifth one LB5 of the programmable logic blocks 201 like the neurons, the FISC 20 and SISC 29 like the dendrites 481 coupled to the fifth one LB5 of the programmable logic blocks 201 and its cross-point switches 379 programmed for connection of its FISC 20 and SISC 29 to the fifth one LB5 of the programmable logic blocks 201. A fourth one 200-4 of the standard commodity FPGA IC chips 200 may include a sixth one LB6 of the programmable logic blocks 201 like the neurons, the FISC 20 and SISC 29 like the dendrites 481 coupled to the sixth one LB6 of the programmable logic blocks 201 and the cross-point switches 379 programmed for connection of its FISC 20 and SISC 29 to the sixth one LB6 of the programmable logic blocks 201. A second one 300-2 of the COIP logic drives 300 may include the third and fourth ones 200-3 and 200-4 of the standard commodity FPGA IC chips 200. (1) A first portion, which is provided by the interconnection metal layers 6 and 27 of the FISC 20 and SISC 29, extending from the programmable logic block LB1, (2) one of the bonded contacts 563 extending from the first portion, (3) a second portion, which is provided by the interconnection metal layers 6 and/or 27 of the FISIP 560 and/or SISIP 588 of the interposer 551 and/or the TPVs 582 of the first one 300-1 of the COIP logic drives 300 and/or the interconnection metal layers 77 of the BISD 79 of the first one 300-1 of the COIP logic drives 300, extending from said one of the bonded contacts 563, (4) the other one of the bonded contacts 563 extending from the second portion, and (5) a third portion, which is provided by the interconnection metal layers 6 and 27 of the FISC 20 and SISC 29, extending from the other one of the bonded contacts 563 to the programmable logic block LB2 may compose the axon-like interconnect 482. The axon-like interconnect 482 may be programmed to connect the first one LB1 of the programmable logic block 201 to either of the second through sixth ones LB2, LB3, LB4, LB5 and LB6 of the programmable logic blocks 201 according to switching of first through fifth ones 258-1 through 258-5 of the pass/no-pass switches 258 of the cross-point switches 379 set on the axon-like interconnect 482. The first one 258-1 of the pass/no-pass switches 258 may be arranged in the first one 200-1 of the standard commodity FPGA IC chips 200. The second and third ones 258-2 and 258-3 of the pass/no-pass switches 258 may be arranged in one of the DPIIC chips 410 in the first one 300-1 of the COIP logic drives 300. The fourth one 258-4 of the pass/no-pass switches 258 may be arranged in the third one 200-3 of the standard commodity FPGA IC chips 200. The fifth one 258-5 of the pass/no-pass switches 258 may be arranged in one of the DPIIC chips 410 in the second one 300-2 of the COIP logic drives 300. The first one 300-1 of the COIP logic drives 300 may have the metal pads 77*e* coupling to the second one 300-2 of the COIP logic drives 300 through the metal bumps or pillars 570. Alternatively, the first through fifth ones 258-1 through 258-5 of the pass/no-pass switches 258 set on the axon-like interconnect 482 may be omitted. Alternatively, the pass/no-pass switches 258 set on the dendrites-like interconnect 481 may be omitted.

Furthermore, referring to FIG. 38B, the axon-like interconnect 482 may be considered as a scheme or structure of a tree including (i) a trunk or stem connecting to the first one LB1 of the programmable logic blocks 201, (ii) multiple branches branching from the trunk or stem for connecting its trunk or stem to one of the second and sixth ones LB2-LB6 of the programmable logic blocks 201, (iii) a first one 379-1 of the cross-point switches 379 set between its trunk or stem and each of its branches for switching the connection between its trunk or stem and one of its branches, (iv) multiple sub-branches branching from one of its branches for connecting said one of its branches to one of the fifth and sixth ones LB5 and LB6 of the programmable logic blocks 201, and (v) a second one 379-2 of the cross-point switches 379 set between said one of its branches and each of its sub-branches for switching the connection between said one of its branches and one of its sub-branches. The first one 379-1 of the cross-point switches 379 may be provided in one of the DPIIC chips 410 in the first one 300-1 of the COIP logic drives 300, and the second one 379-2 of the cross-point switches 379 may be provided in one of the DPIIC chips 410 in the second one 300-2 of the COIP logic drives 300. Each of the dendrite-like interconnects 481 may include (i) a stem connecting to one of the first through sixth ones LB1-LB6 of the programmable logic blocks 201, (ii) multiple branches branching from the stem, (iii) a cross-point switch 379 set between its stem and each of its branches for switching the connection between its stem and one of its branches. Each of the programmable logic blocks 201 may couple to multiple of the dendrite-like interconnects 481 composed of the interconnection metal layers 6 of the FISC 20 and the interconnection metal layers 27 of the SISC 29. Each of the programmable logic blocks 201 may be coupled to a distal terminal of one or more of the axon-like interconnects 482, extending from others of the programmable logic blocks 201, through the dendrite-like interconnects 481 extending from said each of the programmable logic blocks 201.

Referring to FIGS. 38A and 38B, each of the COIP logic drives 300-1 and 300-2 may provide a reconfigurable plastic, elastic and/or integral architecture for system/machine computing or processing using integral and alterable memory units and logic units in each of the programmable logic blocks 201, in addition to the sequential, parallel, pipelined or Von Neumann computing or processing system architecture and/or algorithm. Each of the COIP logic devices 300-1 and 300-2 with plasticity, elasticity and integrality may include integral and alterable memory units and logic units to alter or reconfigure logic functions and/or computing (or processing) architecture (or algorithm) and/or memories (data or information) in the memory units. The properties of the plasticity, elasticity and integrality of the COIP logic drive 300-1 or 300-2 is similar or analogous to that of a human brain. The brain or nerves have plasticity, elasticity and integrality. Many aspects of brain or nerves can be altered (or are "plastic" or "elastic") and reconfigured through adulthood. The COIP logic drives 300-1 and 300-2, or standard commodity FPGA IC chips 200-1, 200-2, 200-3 and 200-4, described and specified above provide capabilities to alter or reconfigure the logic functions and/or computing (or processing) architecture (or algorithm) for a given fixed hardware using the memories (data or information) stored in the near-by programing memory cells (PM), e.g., programming codes stored in the memory cells 362 for the cross-point switches 379 or pass/no-pass switches 258 as seen in FIGS. 15A-15C. In the COIP logic drives 300-1 and

300-2, or standard commodity FPGA IC chips 200-1, 200-2, 200-3 and 200-4, the memories (data or information) stored in the memory cells of PM are used for altering or reconfiguring the logic functions and/or computing/processing architecture (or algorithm), while some other memories stored in the memory cells are just used for data or information (Data Memory cells, DM), e.g., data in each event or programming codes or resulting values stored in the memory cells 490 for the look-up tables 210 as seen in FIG. 14A or 14H.

Figure 38C:
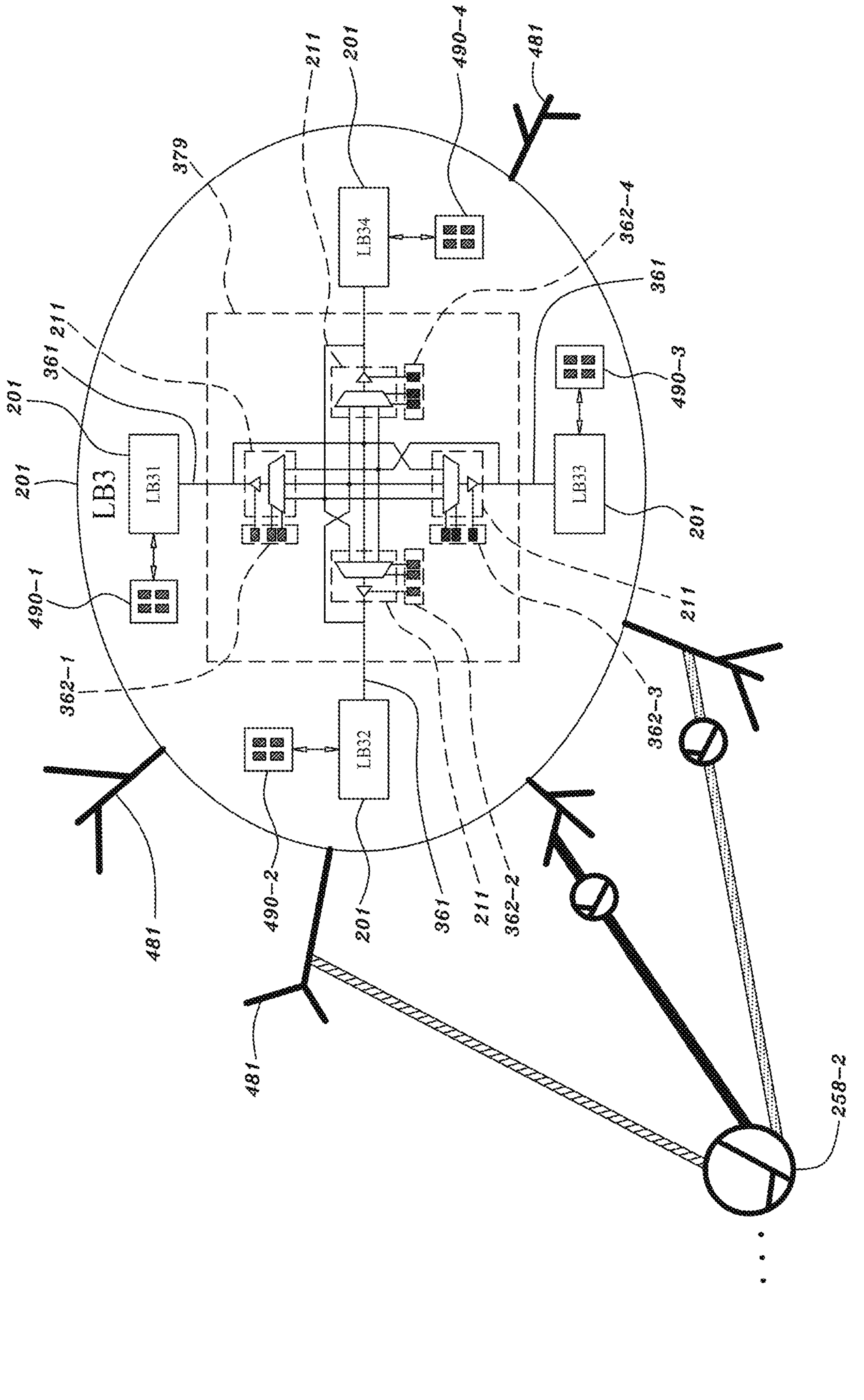
FIG. 38C is a schematic diagram for a reconfigurable plastic, elastic and/or integral architecture in accordance with an embodiment of the present application.

For example, FIG. 38C is a schematic diagram for a reconfigurable plastic, elastic and/or integral architecture in accordance with an embodiment of the present application. Referring to FIG. 38C, the third one LB3 of the programmable logic blocks 201 may include four logic units LB31, LB32, LB33 and LB34, a cross-point switch 379, four sets of programing memory (PM) cells 362-1, 362-2, 362-3 and 362-4, and four sets of data memory (DM) cells 490-1, 490-2, 490-3 and 490-4. The cross-point switch 379 may be referred to one as illustrated in FIG. 15B. For an element indicated by the same reference number shown in FIGS. 38C and 15B, the specification of the element as seen in FIG. 38C may be referred to that of the element as illustrated in FIG. 15B. The four programmable interconnects 361 at four ends of the cross-point switch 379 may couple to the four logic units LB31, LB32, LB33 and LB34. Each of the logic units LB31, LB32, LB33 and LB34 may have the same architecture as the logic block 201 illustrated in FIG. 14A or 14H with its output Dout or one of its inputs A0-A3 coupling to one of the four programmable interconnects 361 at the four ends of the cross-point switch 379. Each of the logic units LB31, LB32, LB33 and LB34 may couple to one of the four sets of data memory (DM) cells 490-1, 490-2, 490-3 and 490-4 for storing data in each event and/or storing resulting values or programming codes acting as its look-up table 210 for example. Thereby, the logic functions and/or computing/processing architecture or algorithm of the programmable logic block LB3 may be altered or reconfigured.

The plasticity, elasticity and integrality of the COIP logic drive are based on events. For the $n^{th}$ event ($E_n$), the $n^{th}$ state ($S_n$) of the $n^{th}$ integral unit ($IU_n$) after the $n^{th}$ event of the COIP logic drive may include the logic, PM and DM at the $n^{th}$ States, $L_n$, $PM_n$ and $DM_n$, wherein n is a positive integer, 1, 2, 3, . . . . $S_n$ is a function of $IU_n$, $L_n$, $PM_n$ and $DM_n$, that is $S_n$ ($IU_n$, $L_n$, $PM_n$, $DM_n$). The $n^{th}$ integral unit $IU_n$ may comprise various logic blocks, various PM memory cells (in terms of number, quantity and address/location) with various memories (in terms of content, data or information), and various DM memory cells (in terms of number, quantity and address/location) with various memories (in terms of content, data or information) for a specific logic function, a specific set of PM and DM, different from other integral units. The $n^{th}$ state ($S_n$) and the $n^{th}$ integral unit ($IU_n$) are generated based on previous events occurred before the $n^{th}$ event ($E_n$).

Some events may be with great magnitude and are categorized as Grand Events (GE). If the $n^{th}$ event is characterized as a GE, the $n^{th}$ state $S_n$ ($IU_n$, $L_n$, $PM_n$, $DM_n$) may be reconfigured into a new state $S_{n+1}$($IU_{n+1}$, $L_{n+1}$, $PM_{n+1}$, $DM_{n+1}$), just like the human brain reconfigures the brain during the deep sleep. The newly generated states may become long term memories. The new $(n+1)^{th}$ state ($S_{n+1}$) for a new $(n+1)^{th}$ integral unit ($IU_{n+1}$) are generated based on algorithm and criteria for a grand reconfiguration after a Grand Event. As an example, the algorithm and criteria are described as follows: When the Event n (E) is quite different in magnitude from previous n−1 events, the $E_n$ is categorized as a Grand Event, and resulted in a $(n+1)^{th}$ state $S_{n+1}$($IU_{n+1}$, $L_{n+1}$, $PM_{n+1}$, $DM_{n+1}$) from the $n^{th}$ state $S_n$ ($IU_n$, $L_n$, $PM_n$, $DM_n$). After the Grand Event $E_n$, the machine/system performs a Grand Reconfiguration with some certain given criteria. The Grand Reconfiguration comprises condense or concise processes and learning processes:

I. Condense or Concise Processes:

(A) DM reconfiguration: (1) The machine/system checks the $DM_n$, e.g., resulting values or programming codes in the data memory cells 490 as illustrated in FIGS. 38C, 6A and 6H, to find identical memories, and then keeping only one memory of all identical memories, deleting all other identical memories; and (2) The machine/system checks the $DM_n$, e.g., resulting values or programming codes in the data memory cells 490 as illustrated in FIGS. 38C, 14A and 14H, to find similar memories (similarity within a given percentage x %, for example, x is equal to or smaller than 2%, 3%, 5% or 10%), and keeping only one or two memories of all similar memories, deleting all other similar memories; alternatively, a representative memory (data or information) of all similar memories may be generated and kept, while deleting all similar memories.

(B) Logic reconfiguration: (1) The machine/system checks the $PM_n$, e.g., programming codes in the programming memory cells 362 as illustrated in FIGS. 38C and 15B, for corresponding logic functions to find identical logics (PMs), and keeping only one logic (PMs) of all identical logics (PMs), deleting all other identical logics (PMs); (2) The machine/system checks the $PM_n$, e.g., programming codes in the programming memory cells 362 as illustrated in FIGS. 38C and 15B, for corresponding logic functions to find similar logics (PMs) (similarity with a given percentage x % of difference, for example, x is equal to or smaller than 2%, 3%, 5% or 10%), and keeping only one or two logics (PMs) of all similar logics (PMs), deleting all other similar logics (PMs). Alternatively, a representative logic (PMs) (data or information in PM for the corresponding representative logic) of all similar logics (PMs) may be generated and kept, while deleting all similar logics (PMs).

II. Learning Processes:

Based on $S_n$ ($IU_n$, $L_n$, $PM_n$, $DM_n$), performing a logarithm to select or screen (memorize) useful, significant and important integral units, logics, PMs, e.g., programming codes in the programming memory cells 362 as illustrated in FIGS. 38C and 15B, and DMs, e.g., resulting values or programming codes in the data memory cells 490 as illustrated in FIGS. 38C, 14A and 14H, and delete (forget) non-useful, non-significant or non-important integral units, logics, PMs, e.g., programming codes in the programming memory cells 362 as illustrated in FIGS. 38C and 15B, or DMs, e.g., resulting values or programming codes in the data memory cells 490 as illustrated in FIGS. 38C, 14A and 14H. The selection or screening algorithm may be based on a given statistical method, for example, based on the frequency of use of integral units, logics, PMs, e.g., programming codes in the programming memory cells 362 as illustrated in FIGS. 38C and 15B, and/or DMs, e.g., resulting values or programming codes in the data memory cells 490 as illustrated in FIGS. 38C, 14A and 14H, in the previous n events. Another example, the Bayesian inference may be used for generating $S_{n+1}$($IU_{n+1}$, $L_{n+1}$, $PM_{n+1}$, $DM_{n+1}$).

The algorithm and criteria provide learning processes for the system/machine states after events. The plasticity, elasticity and integrality of the COIP logic drive provide capabilities suitable for applications in machine learning and artificial intelligence.

An example of plasticity, elasticity and integrality is taken using the programmable logic block LB3, as illustrated in FIGS. 38A-38C, as GPS (Global Positioning System) functions, as below:

The programmable logic block LB3 is, for example, functioning as GPS, remembering routes and enabling to drive to various locations. A driver and/or machine/system was planning to drive from San Francisco to San Jose, and the programmable logic block LB3 may functions as:

(1) In a first event E1, the driver and/or machine/system looked up a map and found two Freeways 101 and 280 to get to San Jose from San Francisco. The machine/system used the logic units LB31 and LB32 for computing and processing the first event E1 and memorized a first logic configuration L1 for the first event E1 and the related data, information or outcomes of the first event E1. That was: the machine/system (a) formulated the logic units LB31 and LB32 at the first logic configuration L1 based on a first set of programming memories (PM1) in the programming memory cells 362-1, 362-2, 362-3 and 362-4 of the programmable logic block LB3 and (b) stored a first set of data memories (DM1) in the data memory cells 490-1 and 490-2 of the programmable logic block LB3. The integral state of GPS functions in the programmable logic block LB3 after the first event E1 may be defined as S1LB3 relating to the first logic configuration L1 for the first event E1, the first set of programming memories PM1 and the first set of data memories DM1.

(2) In a second event E2, the driver and/or machine/system decided to take Freeway 101 to get to San Jose from San Francisco. The machine/system used the logic units LB31 and LB33 for computing and processing the second event E2 and memorized a second logic configuration L2 for the second event E2 and the related data, information or outcomes of the second event E2. That was: the machine/system (a) formulated the logic units LB31 and LB33 at the second logic configuration L2 based on a second set of programming memories (PM2) in the programming memory cells 362-1, 362-2, 362-3 and 362-4 of the programmable logic block LB3 and/or the first set of data memories DM1 and (b) stored a second set of data memories (DM2) in the data memory cells 490-1 and 490-3 of the programmable logic block LB3. The integral state of GPS functions in the programmable logic block LB3 after the second event E2 may be defined as S2LB3 relating to the second logic configuration L2 for the second event E2, the second set of programming memories PM2 and the second set of data memories DM2. The second set of data memories DM2 may include newly added information relating to the second event E2 and the data and information reorganized based on the first set of data memories DM1, and thereby keeps useful and important information of the first event E1.

(3) In a third event E3, the driver and/or machine/system drove from San Francisco to San Jose through Freeway 101. The machine/system used the logic units LB31, LB32 and LB33 for computing and processing the third event E3 and memorized a third logic configuration L3 for the third event E3 and the related data, information or outcomes of the third event E3. That was: the machine/system (a) formulated the logic units LB331, LB32 and LB33 at the third logic configuration L3 based on a third set of programming memories (PM3) in the programming memory cells 362-1, 362-2, 362-3 and 362-4 of the programmable logic block LB3 and/or the second set of data memories DM2 and (b) stored a third set of data memories (DM3) in the data memory cells 490-1, 490-2 and 490-3 of the programmable logic block LB3. The integral state of GPS functions in the programmable logic block LB3 after the third event E3 may be defined as S3LB3 relating to the third logic configuration L3 for the third event E3, the third set of programming memories PM3 and the third set of data memories DM3. The third set of data memories DM3 may include newly added information relating to the third event E3 and the data and information reorganized based on the first and second sets of data memories DM1 and DM2, and thereby keeps useful and important information of the first and second events E1 and E2.

(4) In a fourth event E4 after two months of the third event E3, the driver and/or machine/system drove from San Francisco to San Jose through Freeway 280. The machine/system used the logic units LB331, LB32, LB33 and LB34 for computing and processing the fourth event E4 and memorized a fourth logic configuration L4 for the fourth event E4 and the related data, information or outcomes of the fourth event E4. That was: the machine/system (a) formulated the logic units LB31, LB32, LB33 and LB34 at the fourth logic configuration L4 based on a fourth set of programming memories (PM4) in the programming memory cells 362-1, 362-2, 362-3 and 362-4 of the programmable logic block LB3 and/or the third set of data memories DM3 and (b) stored a fourth set of data memories (DM4) in the data memory cells 490-1, 490-2, 490-3 and 490-4 of the programmable logic block LB3. The integral state of GPS functions in the programmable logic block LB3 after the fourth event E4 may be defined as S4LB3 relating to the fourth logic configuration L4 for the fourth event E4, the fourth set of programming memories PM4 and the fourth set of data memories DM4. The fourth set of data memories DM4 may include newly added information relating to the fourth event E4 and the data and information reorganized based on the first, second and third sets of data memories DM1, DM2 and DM3, and thereby keeps useful and important information of the first, second and third events E1, E2 and E3.

(5) In a fifth event E5 after one week of the fourth event E4, the driver and/or machine/system drove from San Francisco to Cupertino through Freeway 280. Cupertino was in the middle way of the route in the fourth event E4. The machine/system used the logic units LB31, LB32, LB33 and LB34 at the fourth logic configuration L4 for computing and processing the fifth event E5 and memorized the fourth logic configuration L4 for the fifth event E5 and the related data, information or outcomes of the fifth event E5. That was: the machine/system (a) formulated the logic units LB31, LB32, LB33 and LB34 at the fourth logic configuration L4 based on the fourth set of programming memories (PM4) in the programming memory cells 362-1, 362-2, 362-3 and 362-4 of the programmable logic block LB3 and/or the fourth set of data memories DM4 and (b) stored a fifth set of data memories (DM5) in the data memory cells 490-1, 490-2, 490-3 and 490-4 of the programmable logic block LB3. The integral state of GPS functions in the programmable logic block LB3 after the fifth event E5 may be defined as S5LB3 relating to the fourth logic configuration L4 for the fifth event E5, the fourth set of programming memories PM4 and the fifth set of data memories DM5. The fifth set of data memories DM5 may include newly added information relating to the fifth event E5 and the data and information reorganized based on the first through fourth sets of data memories DM1-DM4, and thereby keeps useful and important information of the first through fourth events E1-E4.

(6) In a sixth event E6 after six months of the fifth event E5, the driver and/or machine/system was planning to drive from San Francisco to Los Angeles. The driver and/or machine/system looked up a map and found two Freeways 101 and 5 to get to Los Angeles from San Francisco. The machine/system used the logic unit LB31 of the programmable logic block LB3 and the logic unit LB41 of the programmable logic block LB4 for computing and processing the sixth event E6 and memorized a sixth logic configuration L6 for the sixth event E6 and the related data, information or outcomes of the sixth event E6. The programmable logic block LB4 may have the same architecture as the programmable logic block LB3 illustrated in FIG. 38C, but the four logic units LB31, LB32, LB33 and LB34 in the programmable logic block LB3 are renumbered as LB41, LB42, LB43 and LB44 in the programmable logic block LB4 respectively. That was: the machine/system (a) formulated the logic units LB31 and LB41 at the sixth logic configuration L6 based on a sixth set of programming memories PM6 in the programming memory cells 362-1, 362-2, 362-3 and 362-4 of the programmable logic block LB3 and those of the programmable logic block LB4 and/or the fifth set of data memories DM5 and (b) stored a sixth set of data memories DM6 in the data memory cell 490-1 of the programmable logic block LB3 and that of the programmable logic block LB4. The integral state of GPS functions in the programmable logic blocks LB3 and LB4 after the sixth event E6 may be defined as S6LB3&4 relating to the sixth logic configuration L6 for the sixth event E6, the sixth set of programming memories PM6 and the sixth set of data memories DM6. The sixth set of data memories DM6 may include newly added information relating to the sixth event E6 and the data and information reorganized based on the first through fifth sets of data memories DM1-DM5, and thereby keeps useful and important information of the first through fifth events E1-E5.

(7) In a seventh event E7, the driver and/or machine/system decided to take Freeway 5 to get to Los Angeles from San Francisco. The machine/system used the logic units LB31 and LB33 at the second logic configuration L2 and/or the sixth set of data memories DM6 for computing and processing the seventh event E7 and memorized the second logic configuration L2 for the seventh event E7 and the related data, information or outcomes of the seventh event E7. That was: the machine/system (a) used the sixth set of data memories DM6 for logic processing with the logic units LB31 and LB33 at the second logic configuration L2 based on the second set of programming memories PM2 in the programming memory cells 362-1, 362-2, 362-3 and 362-4 of the programmable logic block LB3 and (b) stored a seventh set of data memories DM7 in the data memory cells 490-1 and 490-3 of the programmable logic block LB3. The integral state of GPS functions in the programmable logic block LB3 after the seventh event E7 may be defined as S7LB3 relating to the second logic configuration L2 for the seventh event E7, the second set of programming memories PM2 and the seventh set of data memories DM7. The seventh set of data memories DM7 may include newly added information relating to the seventh event E7 and the data and information reorganized based on the first through sixth sets of data memories DM1-DM6, and thereby keeps useful and important information of the first through sixth events E1-E6.

Figure 38D:
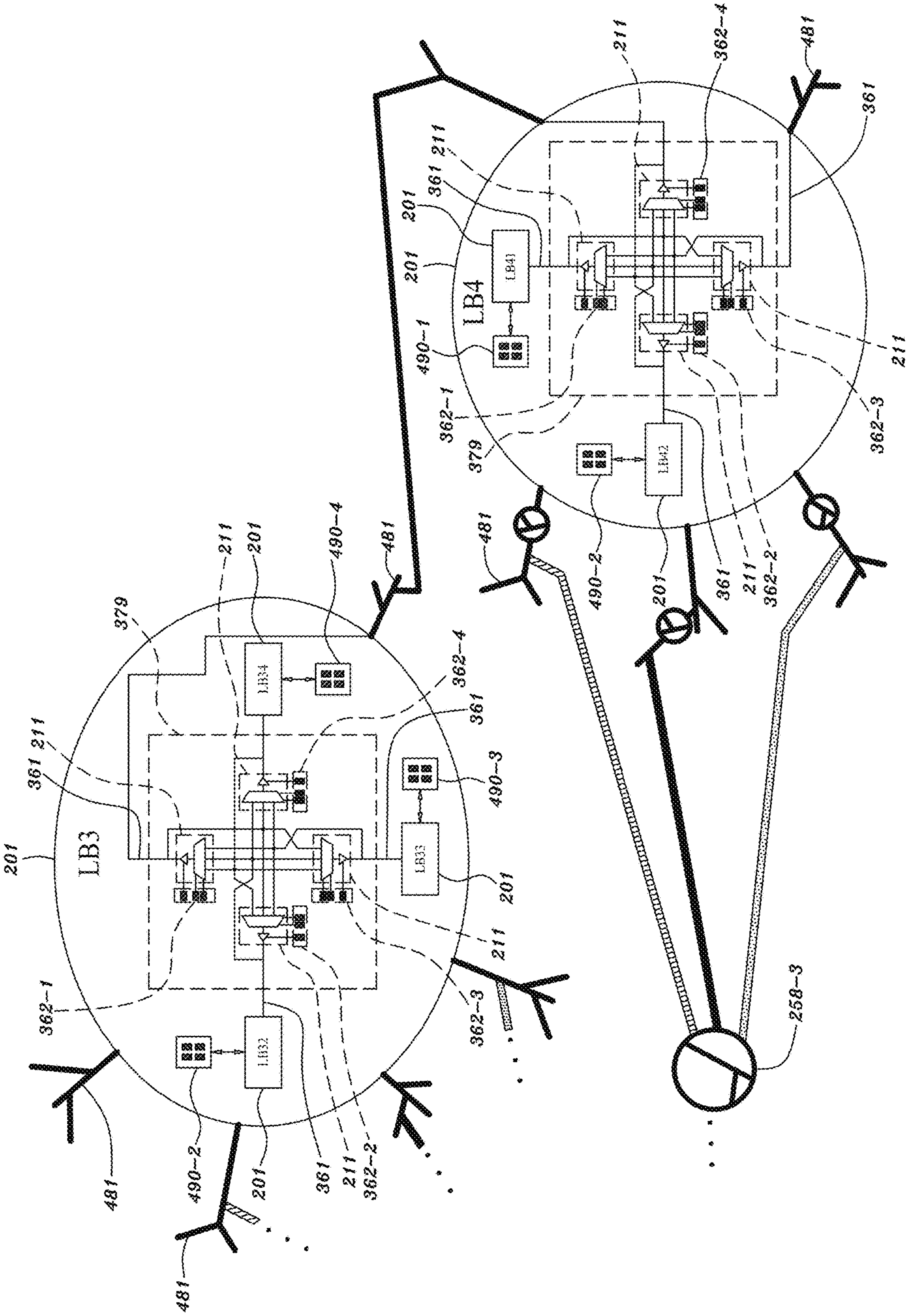
FIG. 38D is a schematic diagram for a reconfigurable plastic, elastic and/or integral architecture for the eighth event E8 in accordance with an embodiment of the present application.

(8) In an eighth event E8 after two weeks of the seventh event E7, the driver and/or machine/system drove from San Francisco to Los Angeles through Freeway 5. The machine/system used the logic units LB32, LB33 and LB34 of the programmable logic block LB3 and the logic units LB41 and LB42 of the programmable logic block LB4 for computing and processing the eighth event E8 and memorized an eighth logic configuration L8 of the eighth event E8 and the related data, information or outcomes of the eighth event E8. The machine/system used the logic units LB32, LB33 and LB34 of the programmable logic block LB3 and the logic units LB41 and LB42 of the programmable logic block LB4 for computing and processing the eighth event E8 and memorized the eighth logic configuration L8 for the eighth event E8 and the related data, information or outcomes of the eighth event E8. The programmable logic block LB4 may have the same architecture as the programmable logic block LB3 illustrated in FIG. 38C, but the four logic units LB31, LB32, LB33 and LB34 in the programmable logic block LB3 are renumbered as LB41, LB42, LB43 and LB44 in the programmable logic block LB4 respectively. FIG. 38D is a schematic diagram for a reconfigurable plastic, elastic and/or integral architecture for the eighth event E8 in accordance with an embodiment of the present application. Referring to FIGS. 38A-38D, the cross-point switch 379 of the programmable logic block LB3 may have its top terminal switched not to couple to the logic unit LB31 (not shown in FIG. 38D but shown in FIG. 38C) but to a first portion of the FISC 20 and SISC 29 of the second semiconductor chip 200-2, like one of the dendrites 481 of the neurons for the programmable logic block LB3. The cross-point switch 379 of the programmable logic block LB4 may have its right terminal switched not to couple to the logic unit LB44 (not shown) but to a second portion of the FISC 20 and SISC 29 of the second semiconductor chip 200-2, like one of the dendrites 481 of the neurons for the programmable logic block LB4, connecting to the first portion of the FISC 20 and SISC 29 of the second semiconductor chip 200-2 through a third portion of the FISC 20 and SISC 29 of the second semiconductor chip 200-2. The cross-point switch 379 of the programmable logic block LB4 may have its bottom terminal switched not to couple to the logic unit LB43 (now shown) but to a fourth portion of the FISC 20 and SISC 29 of the second semiconductor chip 200-2, like one of the dendrites 481 of the neurons for the programmable logic block LB4. That was: the machine/system (a) formulated the logic units LB32, LB33, LB34, LB41 and LB42 at the eighth logic configuration L8 based on an eighth set of programming memories PM8 in the programming memory cells 362-1, 362-2, 362-3 and 362-4 of the programmable logic block LB3 and those of the programmable logic block LB4 and/or the seventh set of data memories DM7 and (b) stored an eighth set of data memories (DM8) in the data memory cells 490-1, 490-2 and 490-3 of the programmable logic block LB3 and the data memory cells 490-1 and 490-2 of the programmable logic block LB4. The integral state of GPS functions in the programmable logic blocks LB3 and LB4 after the eighth event E8 may be defined as S8LB3&4 relating to the eighth logic configuration L8 for the eighth event E8, the eighth set of programming memories PM8 and the eighth set of data memories DM8. The eighth set of data memories DM8 may include newly added information relating to the eighth event E8 and the data and information reorganized based on the first through seventh sets of data memories DM1-DM7, and thereby keeps useful and important information of the first through seventh events E1-E7.

(9) The event E8 is quite different from the previous first through seventh events E1-E7, and is categorized as a grand event E9, resulting in an integral state S9LB3. In the grand event E9 for grand reconfiguration after the first through eighth events E1-E8, the driver and/or machine/system may reconfigure the first through eighth logic configurations L1-L8 into a ninth logic configuration L9 (1) to formulate the logic units LB31, LB32, LB33 and LB34 of the programmable logic block LB3 at the ninth logic configuration L9 based on a ninth set of programming memories PM9 in the programming memory cells 362-1, 362-2, 362-3 and 362-4 of the programmable logic block LB3 and/or the first through eighth sets of data memories DM1-DM8 for the GPS functions for the locations in the California area between San Francisco and Los Angeles and (2) to store a ninth set of data memories DM9 in the data memory cells 490-1, 490-2, 490-3 and 490-4 of the programmable logic block LB3.

The machine/system may perform the grand reconfiguration with a certain given criteria. The grand reconfiguration is like the human brain reconfiguration after a deep sleep. The grand reconfiguration comprises condense or concise processes and learning processes, mentioned as below:

In the condense or concise processes for reconfiguration of data memories (DM) in the event E9, the machine/system may check the eighth set of data memories DM8 to find identical data memories, and keep only one of the identical data memories in the programmable logic block LB3; alternatively, the machine/system may check the eighth set of data memories DM8 to find similar data memories with more than 70%, e.g., between 80% and 99%, of similarity among them, and select only one or two from the similar data memories as representative data memories for the similar data memories.

In the condense or concise processes for reconfiguration of programming memories (PM) in the event E9, the machine/system may check the eighth set of programming memories PM8 for corresponding logic functions to find identical programming memories for the corresponding logic functions, and keep only one of the identical programming memories in the programmable logic block LB3 for the corresponding logic functions; alternatively, the machine/system may check the eighth set of programming memories PM8 for the corresponding logic functions to find similar programming memories with 70%, e.g., between 80% and 99%, of similarity among them, for the corresponding logic functions and keep only one or two from the similar programming memories for the corresponding logic functions as representative programming memories for the similar programming memories for the corresponding logic functions.

In the learning processes in the event E9, an algorithm may be performed to (1) the programming memories PM1-PM4, PM6 and PM8 for the logic configurations L1-L4, L6 and L8 and (2) the data memories DM1-DM8, for optimizing, e.g., selecting or screening, the programming memories PM1-PM4, PM6 and PM8 into useful, significant and important ones as the ninth set of programming memories PM9 and optimizing, e.g., selecting or screening, the data memories DM1-DM8 into useful, significant and important ones as the ninth set of data memories DM9. Further, the algorithm may be performed to (1) the programming memories PM1-PM4, PM6 and PM8 for the logic configurations L1-L4, L6 and L8 and (2) the data memories DM1-DM8 for deleting non-useful, non-significant or non-important ones of the programming memories PM1-PM4, PM6 and PM8 and deleting non-useful, non-significant or non-important ones of the data memories DM1-DM8. The algorithm may be performed based on a statistical method, e.g., the frequency of use of the programming memories PM1-PM4, PM6 and PM8 in the events E1-E8 and/or the frequency of use of the data memories DM1-DM8 in the events E1-E8.

Combinations of POP Assembly for Logic Drive and Memory Drive

As mentioned above, the COIP logic drive 300 may be packaged with the semiconductor chips 100 as illustrated in FIGS. 19A-19N. A plurality of the logic drive 300 may be incorporated with one or more memory drives 310 into a module. The memory drives 310 are configured to store data or applications. The memory drives 310 may be divided into two types, one of which is a non-volatile memory drive 322, and the other one of which is a volatile memory drive 323, as seen in FIGS. 39A-39K. FIGS. 39A-39K are schematically views showing multiple combinations of POP assemblies for logic and memory drives in accordance with embodiments of the present application. The structure for the memory drives 310 and the process for forming the same may be referred to the illustration for FIGS. 22A through 30C but the semiconductor chips 100 are non-volatile memory chips for the non-volatile memory drive 322; the semiconductor chips 100 are volatile memory chips for the volatile memory drive 323.

Figure 39A:
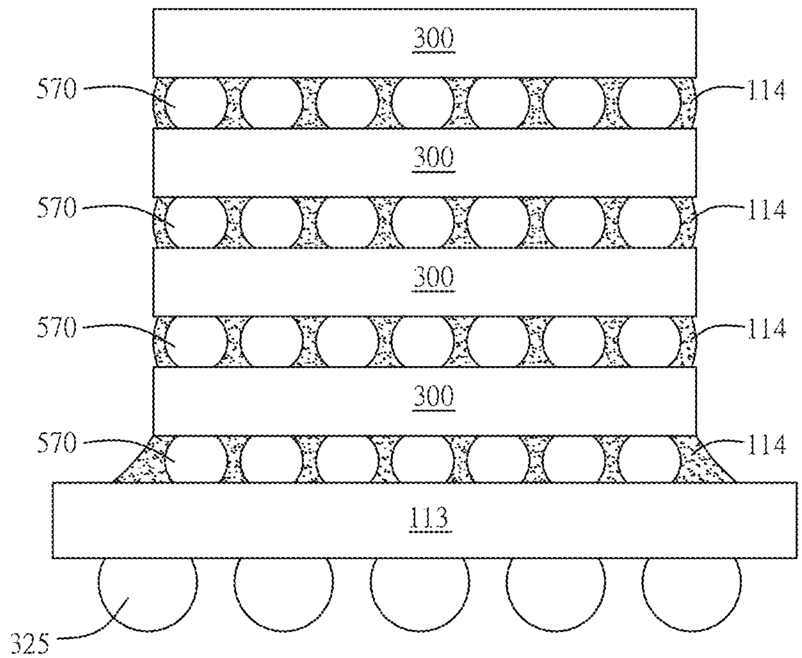
FIGS. 39A-39K are schematically views showing multiple combinations of POP assemblies for logic and memory drives in accordance with embodiments of the present application.

Referring to FIG. 39A, the POP assembly may be stacked with only the COIP logic drives 300 on the substrate unit 113 in accordance with the process as illustrated in FIGS. 22A through 37C. An upper one of the COIP logic drives 300 may have the metal pillars or bumps 570 mounted onto its metal pads 77*e* of a lower one of the COIP logic drives 300 at the backside thereof, but a bottommost one of the COIP logic drives 300 may have the metal pillars or bumps 570 mounted onto its metal pads 109 of the substrate unit 113 at the topside thereof.

Figure 39B:
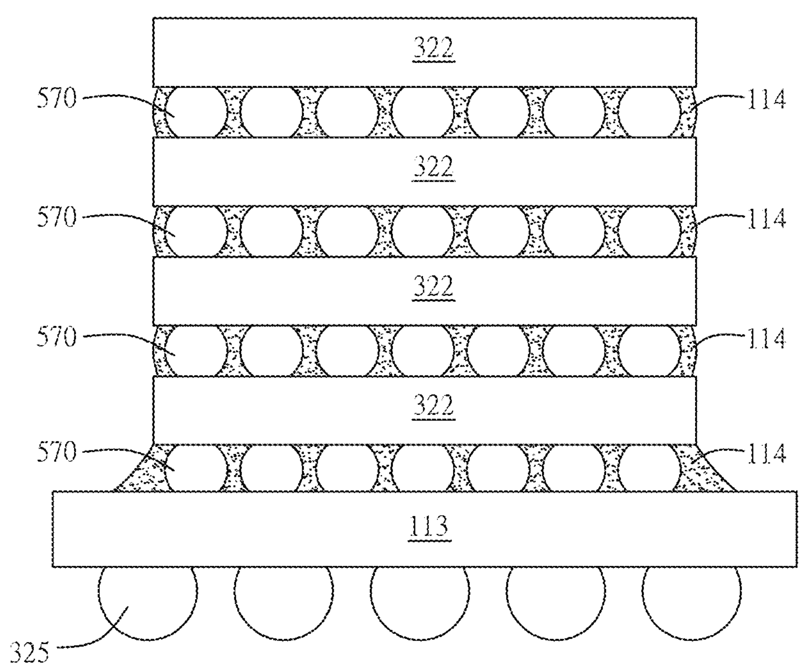

Referring to FIG. 39B, the POP assembly may be stacked with only the COIP non-volatile memory drives 322 on the substrate unit 113 in accordance with the process as illustrated in FIGS. 22A through 37C. An upper one of the COIP non-volatile memory drives 322 may have its metal pillars or bumps 570 mounted onto the metal pads 77*e* of a lower one of the COIP non-volatile memory drives 322 at the backside thereof, but a bottommost one of the COIP non-volatile memory drives 322 may have its metal pillars or bumps 570 mounted onto the metal pads 109 of the substrate unit 113 at the topside thereof.

Figure 39C:
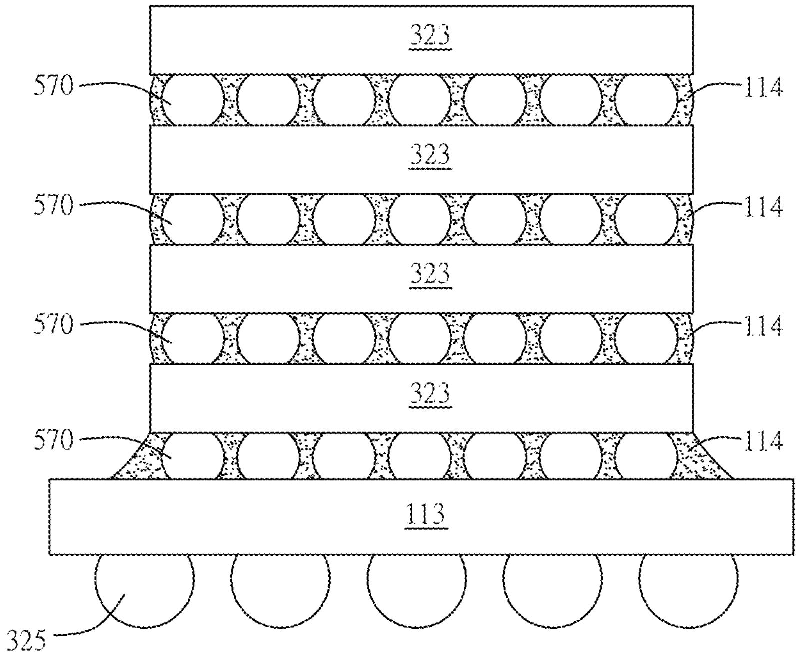

Referring to FIG. 39C, the POP assembly may be stacked with only the COIP volatile memory drives 323 on the substrate unit 113 in accordance with the process as illustrated in FIGS. 22A through 37C. An upper one of the COIP volatile memory drives 323 may have its metal pillars or bumps 570 mounted onto the metal pads 77*e* of a lower one of the COIP volatile memory drives 323 at the backside thereof, but a bottommost one of the COIP volatile memory drives 323 may have its metal pillars or bumps 570 mounted onto the metal pads 109 of the substrate unit 113 at the topside thereof.

Figure 39D:
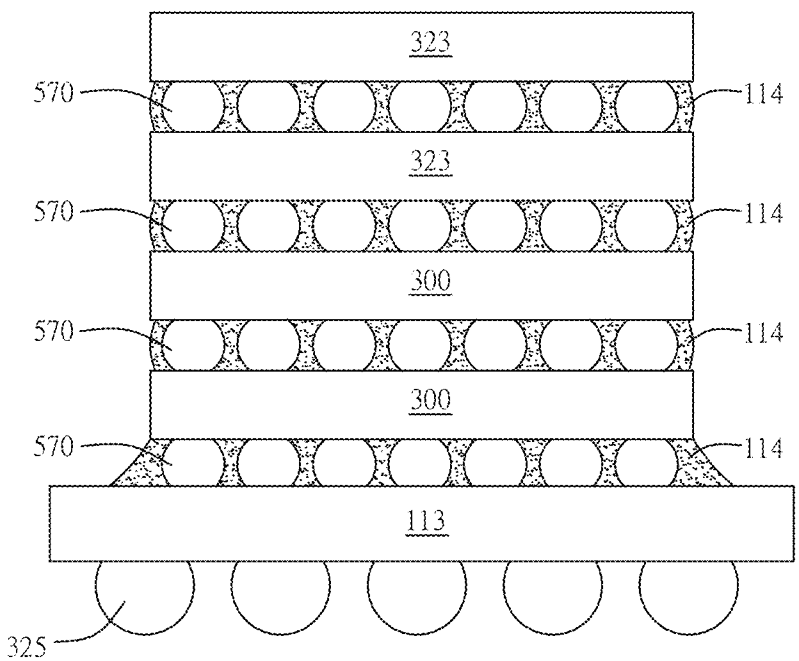

Referring to FIG. 39D, the POP assembly may be stacked with a group of the COIP logic drives 300 and a group of the COIP volatile memory drives 323 in accordance with the process as illustrated in FIGS. 22A through 37C. The group of the COIP logic drives 300 may be arranged over the substrate unit 113 and under the group of the COIP volatile memory drives 323. For example, a group of two COIP logic drives 300 may be arranged over the substrate unit 113 and under a group of two COIP volatile memory drives 323. A first one of the COIP logic drives 300 may have its metal pillars or bumps 570 mounted onto the metal pads 109 of the substrate unit 113 at the topside thereof, a second one of the COIP logic drives 300 may have its metal pillars or bumps 570 mounted onto the metal pads 77*e* of the first one of the COIP logic drives 300 at the backside thereof, a first one of the COIP volatile memory drives 323 may have its metal pillars or bumps 570 mounted onto the metal pads 77*e* of the second one of the COIP logic drives 300 at the backside thereof, and a second one of the COIP volatile memory drives 323 may have its metal pillars or bumps 570 mounted onto the metal pads 77*e* of the first one of the COIP volatile memory drives 323 at the backside thereof.

Figure 39E:
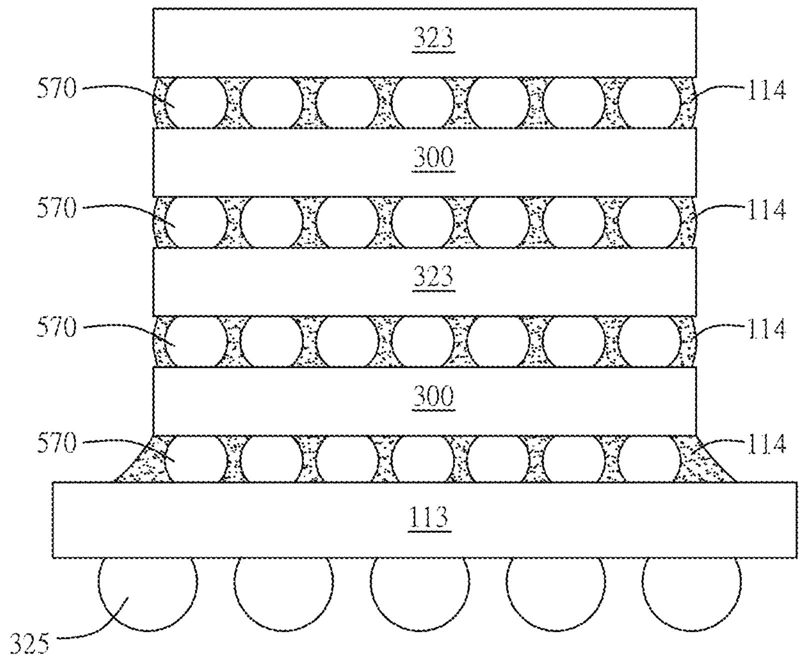

Referring to FIG. 39E, the POP assembly may be alternately stacked with the COIP logic drives 300 and the COIP volatile memory drives 323 in accordance with the process as illustrated in FIGS. 22A through 37C. For example, a first one of the COIP logic drives 300 may have its metal pillars or bumps 570 mounted onto the metal pads 109 of the substrate unit 113 at the topside thereof, a first one of the COIP volatile memory drives 323 may have its metal pillars or bumps 570 mounted onto the metal pads 77*e* of the first one of the COIP logic drives 300 at the backside thereof, a second one of the COIP logic drives 300 may have its metal pillars or bumps 570 mounted onto the metal pads 77*e* of the first one of the COIP volatile memory drives 323 at the backside thereof, and a second one of the COIP volatile memory drives 323 may have its metal pillars or bumps 570 mounted onto the metal pads 77*e* of the second one of the COIP logic drives 300 at the backside thereof.

Figure 39F:
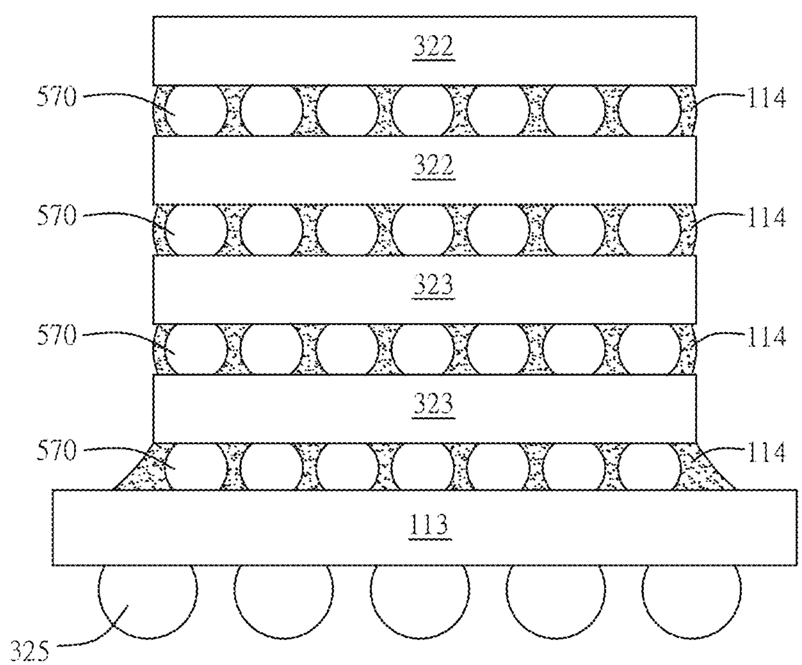

Referring to FIG. 39F, the POP assembly may be stacked with a group of the COIP non-volatile memory drives 322 and a group of the COIP volatile memory drives 323 in accordance with the process as illustrated in FIGS. 22A through 37C. The group of the COIP volatile memory drives 323 may be arranged over the substrate unit 113 and under the group of the COIP non-volatile memory drives 322. For example, a group of two COIP volatile memory drives 323 may be arranged over the substrate unit 113 and under a group of two COIP non-volatile memory drives 322. A first one of the COIP volatile memory drives 323 may have its metal pillars or bumps 570 mounted onto the metal pads 109 of the substrate unit 113 at the topside thereof, a second one of the COIP volatile memory drives 323 may have its metal pillars or bumps 570 mounted onto the metal pads 77*e* of the first one of the COIP volatile memory drives 323 at the backside thereof, a first one of the COIP non-volatile memory drives 322 may have its metal pillars or bumps 570 mounted onto the metal pads 77*e* of the second one of the COIP volatile memory drives 323 at the backside thereof, and a second one of the COIP non-volatile memory drives 322 may have its metal pillars or bumps 570 mounted onto the metal pads 77*e* of the first one of the COIP non-volatile memory drives 322 at the backside thereof.

Figure 39G:
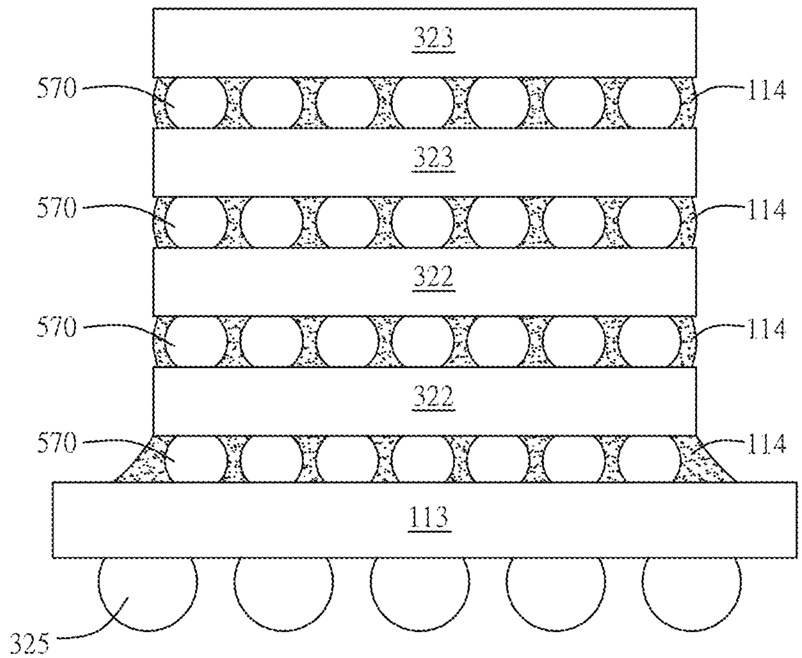

Referring to FIG. 39G, the POP assembly may be stacked with a group of the COIP non-volatile memory drives 322 and a group of the COIP volatile memory drives 323 in accordance with the process as illustrated in FIGS. 22A through 37C. The group of the COIP non-volatile memory drives 322 may be arranged over the substrate unit 113 and under the group of the COIP volatile memory drives 323. For example, a group of two COIP non-volatile memory drives 322 may be arranged over the substrate unit 113 and under a group of two COIP volatile memory drives 323. A first one of the COIP non-volatile memory drives 322 may have its metal pillars or bumps 570 mounted onto the metal pads 109 of the substrate unit 113 at the topside thereof, a second one of the COIP non-volatile memory drives 322 may have its metal pillars or bumps 570 mounted onto the metal pads 77*e* of the first one of the COIP non-volatile memory drives 322 at the backside thereof, a first one of the COIP volatile memory drives 323 may have its metal pillars or bumps 570 mounted onto the metal pads 77*e* of the second one of the COIP non-volatile memory drives 322 at the backside thereof, and a second one of the COIP volatile memory drives 323 may have its metal pillars or bumps 570 mounted onto the metal pads 77*e* of the first one of the COIP volatile memory drives 323 at the backside thereof.

Figure 39H:
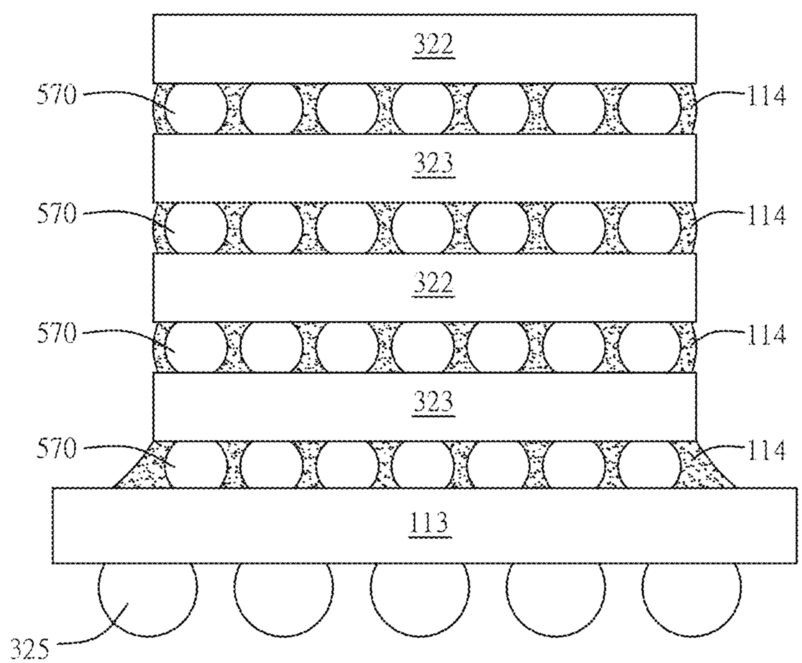

Referring to FIG. 39H, the POP assembly may be alternately stacked with the COIP volatile memory drives 323 and the COIP non-volatile memory drives 322 in accordance with the process as illustrated in FIGS. 22A through 37C. For example, a first one of the COIP volatile memory drives 323 may have its metal pillars or bumps 570 mounted onto the metal pads 109 of the substrate unit 113 at the topside thereof, a first one of the COIP non-volatile memory drives 322 may have its metal pillars or bumps 570 mounted onto the metal pads 77*e* of the first one of the COIP volatile memory drives 323 at the backside thereof, a second one of the COIP volatile memory drives 323 may have its metal pillars or bumps 570 mounted onto the metal pads 77*e* of the first one of the COIP non-volatile memory drives 322 at the backside thereof, and a second one of the COIP non-volatile memory drives 322 may have its metal pillars or bumps 570 mounted onto the metal pads 77*e* of the second one of the COIP volatile memory drives 323 at the backside thereof.

Figure 39I:
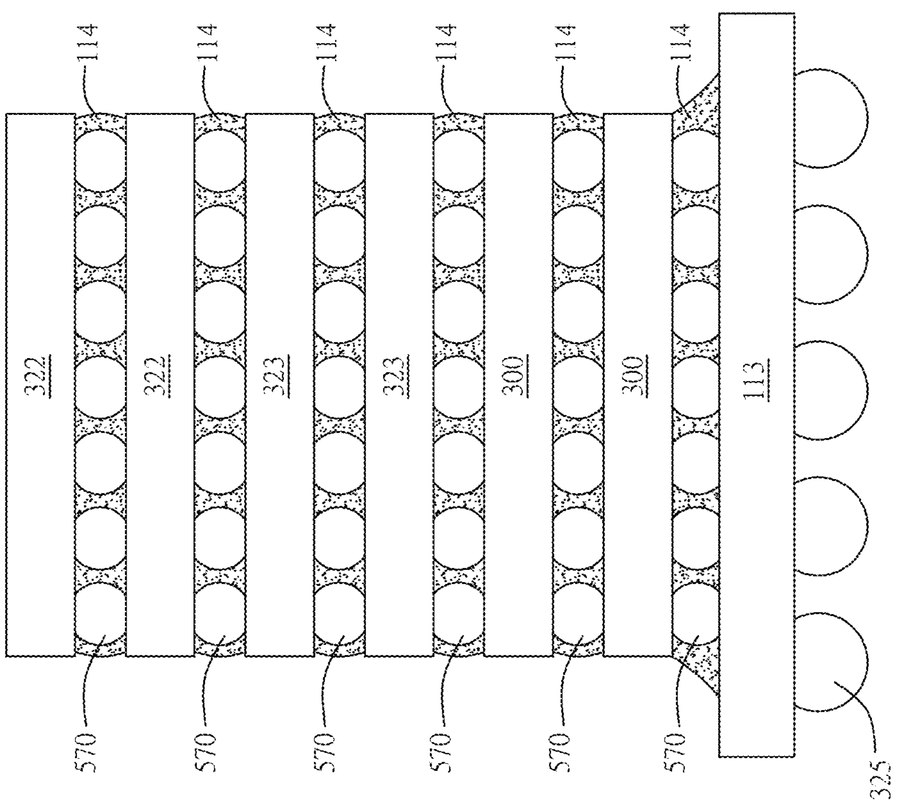

Referring to FIG. 39I, the POP assembly may be stacked with a group of the COIP logic drives 300, a group of the COIP non-volatile memory drives 322 and a group of the COIP volatile memory drives 323 in accordance with the process as illustrated in FIGS. 22A through 37C. The group of the COIP logic drives 300 may be arranged over the substrate unit 113 and under the group of the COIP volatile memory drives 323, and the group of the COIP volatile memory drives 323 may be arranged over the group of the COIP logic drives 300 and under the group of the COIP non-volatile memory drives 322. For example, a group of two COIP logic drives 300 may be arranged over the substrate unit 113 and under a group of two COIP volatile memory drives 323, and the group of two COIP volatile memory drives 323 may be arranged over the group of two COIP logic drives 300 and under a group of two COIP non-volatile memory drives 322. A first one of the COIP logic drives 300 may have its metal pillars or bumps 570 mounted onto the metal pads 109 of the substrate unit 113 at the topside thereof, a second one of the COIP logic drives 300 may have its metal pillars or bumps 570 mounted onto the metal pads 77*e* of the first one of the COIP logic drives 300 at the backside thereof, a first one of the COIP volatile memory drives 323 may have its metal pillars or bumps 570 mounted onto the metal pads 77*e* of the second one of the COIP logic drives 300 at the backside thereof, a second one of the COIP volatile memory drives 323 may have its metal pillars or bumps 570 mounted onto the metal pads 77*e* of the first one of the COIP volatile memory drives 323 at the backside thereof, a first one of the COIP non-volatile memory drives 322 may have its metal pillars or bumps 570 mounted onto the metal pads 77*e* of the second one of the COIP volatile memory drives 323 at the backside thereof, and a second one of the COIP non-volatile memory drives 322 may have its metal pillars or bumps 570 mounted onto the metal pads 77*e* of the first one of the COIP non-volatile memory drives 322 at the backside thereof.

Figure 39J:
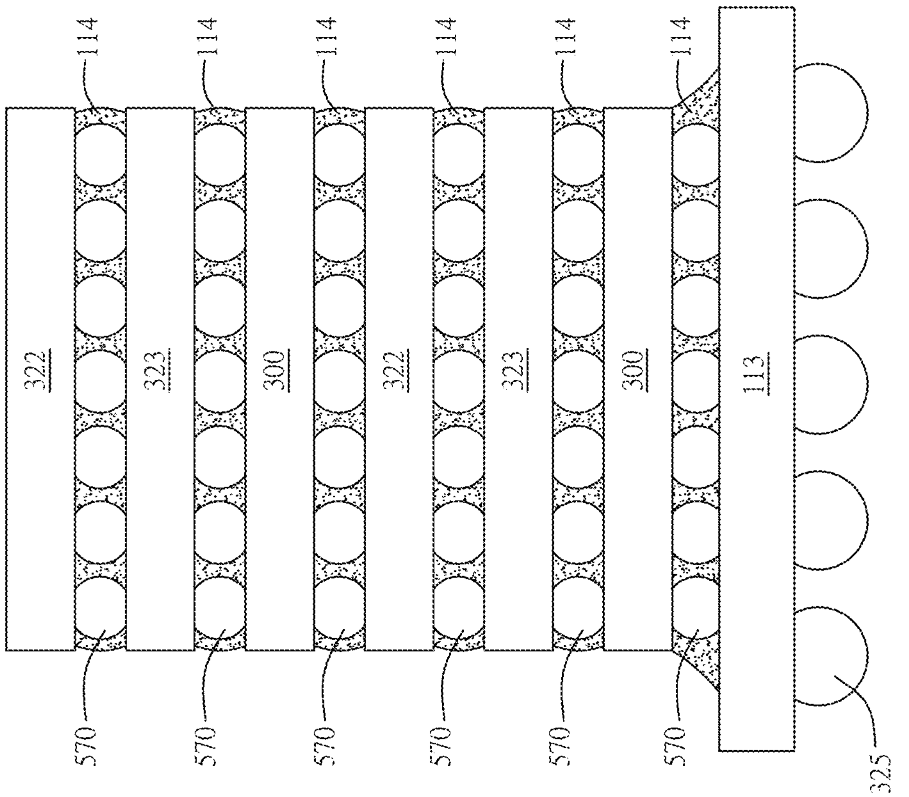

Referring to FIG. 39J, the POP assembly may be alternately stacked with the COIP logic drives 300, the COIP volatile memory drives 323 and the COIP non-volatile memory drives 322 in accordance with the process as illustrated in 14A through 30C. For example, a first one of the COIP logic drives 300 may have its metal pillars or bumps 570 mounted onto the metal pads 109 of the substrate unit 113 at the topside thereof, a first one of the COIP volatile memory drives 323 may have its metal pillars or bumps 570 mounted onto the metal pads 77*e* of the first one of the COIP logic drives 300 at the backside thereof, a first one of the COIP non-volatile memory drives 322 may have its metal pillars or bumps 570 mounted onto the metal pads 77*e* of the first one of the COIP volatile memory drives 323 at the backside thereof, a second one of the COIP logic drives 300 may have its metal pillars or bumps 570 mounted onto the metal pads 77*e* of the first one of the COIP non-volatile memory drives 322 at the backside thereof, a second one of the COIP volatile memory drives 323 may have its metal pillars or bumps 570 mounted onto the metal pads 77*e* of the second one of the COIP logic drives 300 at the backside thereof, and a second one of the COIP non-volatile memory drives 322 may have its metal pillars or bumps 570 mounted onto the metal pads 77*e* of the second one of the COIP volatile memory drives 323 at the backside thereof.

Figure 39K:
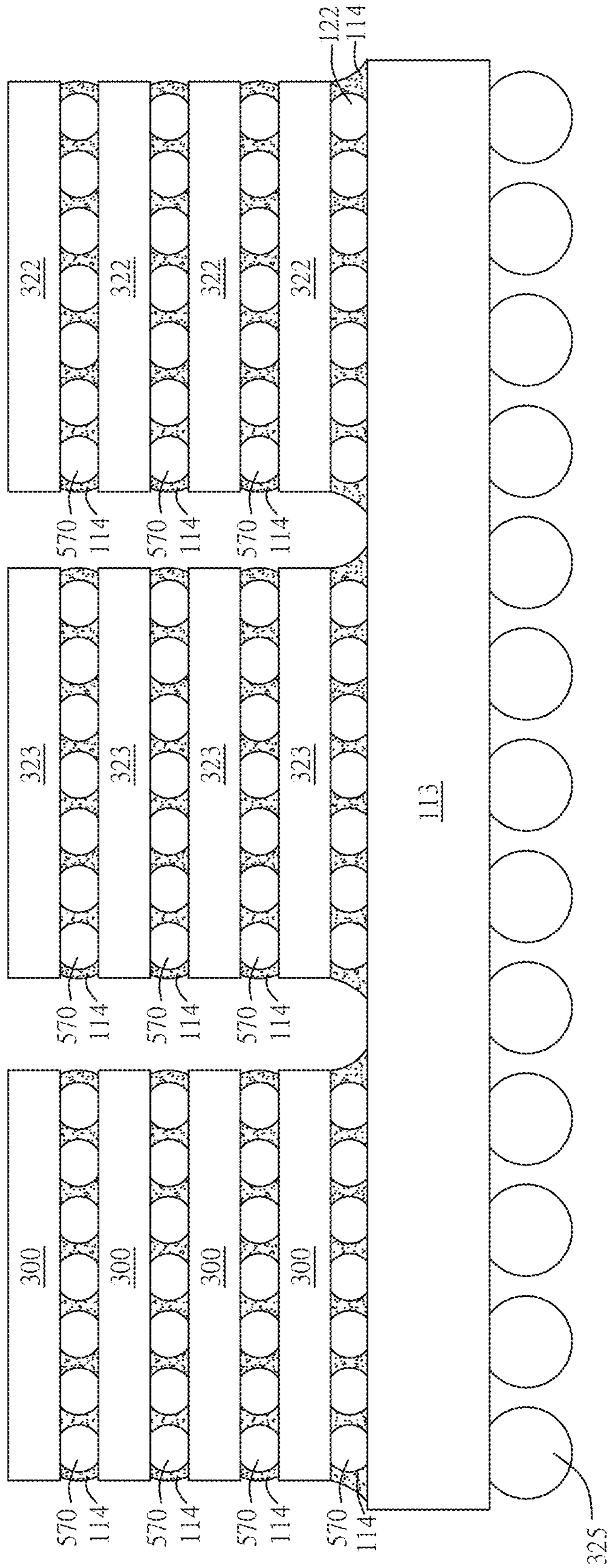

Referring to FIG. 39K, the POP assembly may be stacked with three stacks, one of which is stacked with only the COIP logic drives 300 on the substrate unit 113 in accordance with the process as illustrated in FIGS. 22A through 37C, another of which is stacked with only the COIP non-volatile memory drives 322 on the substrate unit 113 in accordance with the process as illustrated in FIGS. 22A through 37C, and the other of which is stacked with only the COIP volatile memory drives 323 on the substrate unit 113 in accordance with the process as illustrated in FIGS. 22A through 37C. With respect to the process for forming the same, after the three stacks of the COIP logic drives 300, the COIP non-volatile memory drives 322 and the COIP volatile memory drives 323 are stacked on a circuit carrier or substrate, like the one 110 as seen in FIG. 36A, the solder balls 325 are planted on a backside of the circuit carrier or substrate and then the circuit carrier or structure 110 may be separated, cut or diced into multiple individual substrate units 113, such as printed circuit boards (PCB) or BGA (Ball-Grid-array) substrates, by a laser cutting process or by a mechanical cutting process.

Figure 39L:
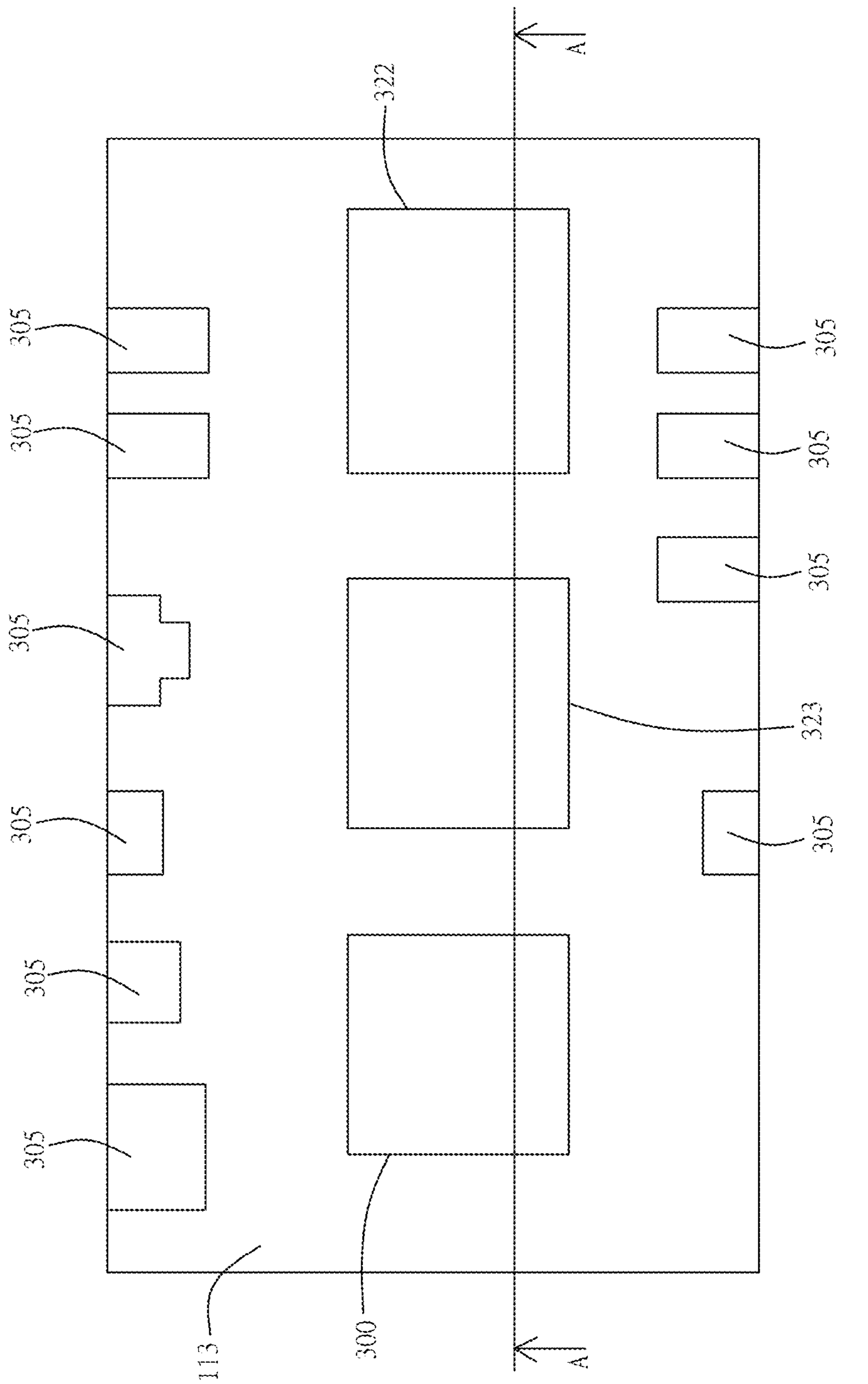
FIG. 39L is a schematically top view of multiple POP assemblies, which is a schematically cross-sectional view along a cut line A-A shown in FIG. 32K.

FIG. 39L is a schematically top view of multiple POP assemblies, which is a schematically cross-sectional view along a cut line A-A shown in FIG. 39K. Furthermore, multiple I/O ports 305 may be mounted onto the substrate unit 113 to have one or more universal-serial-bus (USB) plugs, high-definition-multimedia-interface (HDMI) plugs, audio plugs, internet plugs, power plugs and/or video-graphic-array (VGA) plugs inserted therein.

Application for Logic Drive

Figure 40A:
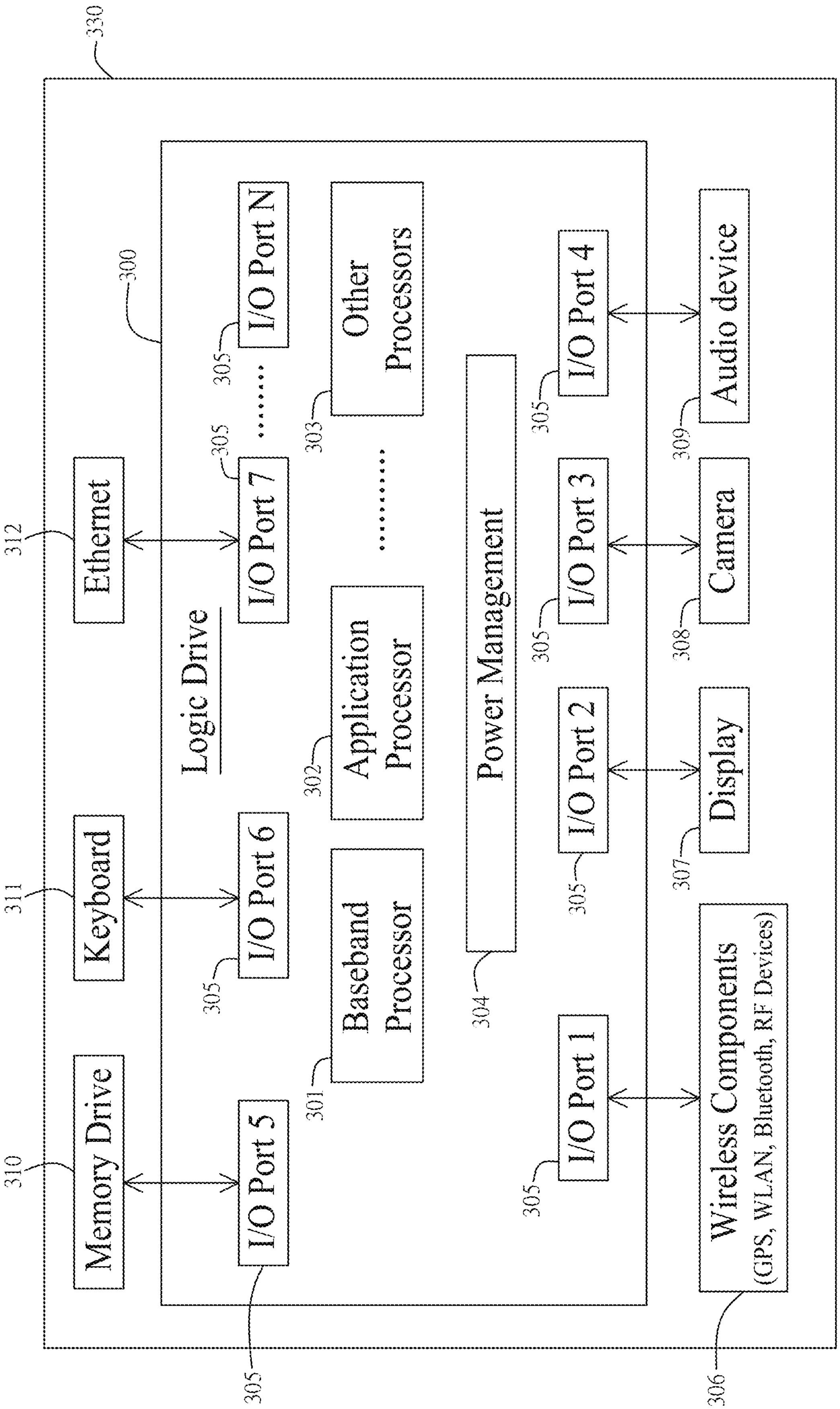
FIGS. 40A-40C are schematically views showing various applications for logic and memory drives in accordance with multiple embodiments of the present application.
Figure 40B:
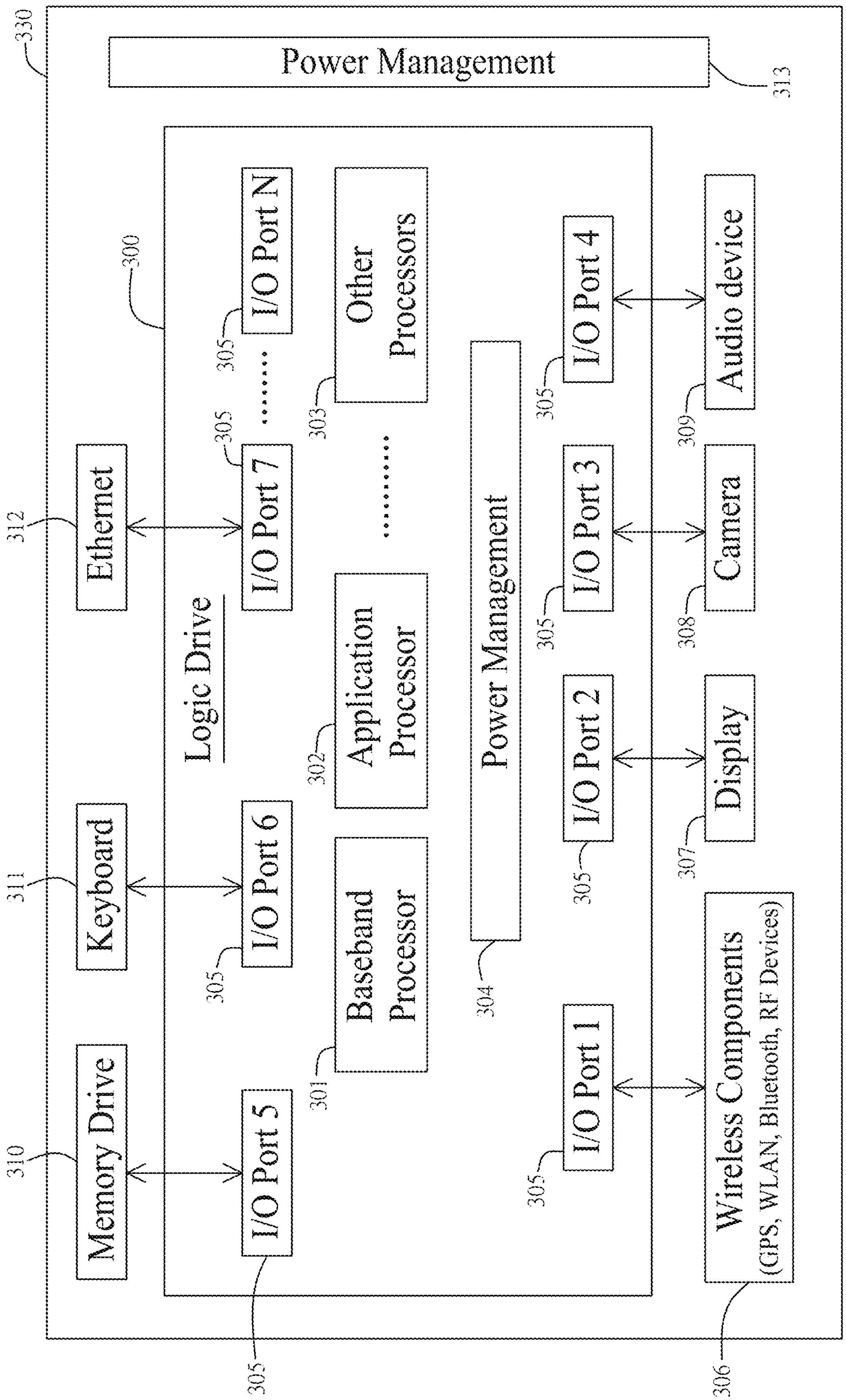
Figure 40C:
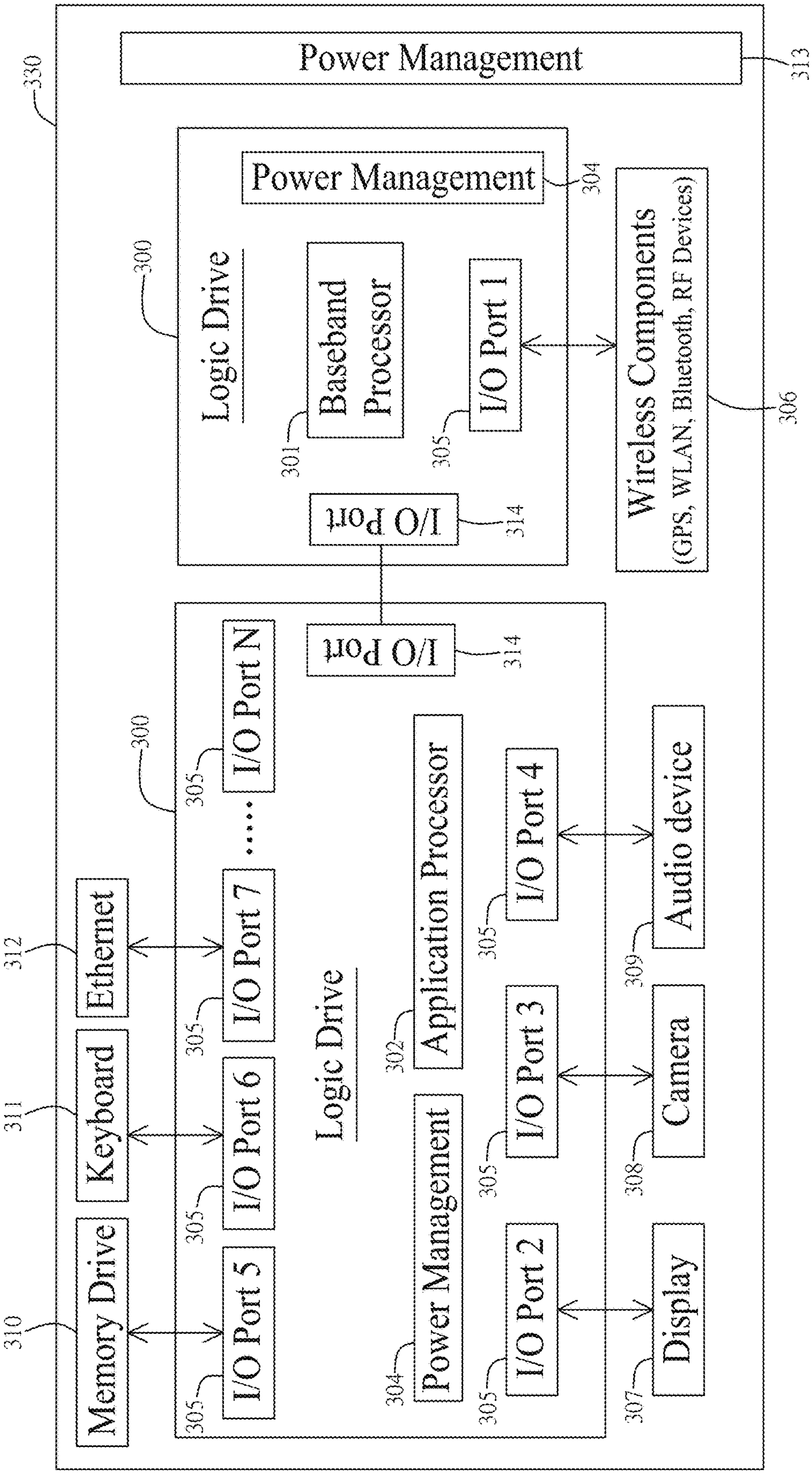

The current system design, manufactures and/or product business may be changed into a commodity system/product business, like current commodity DRAM, or flash memory business, by using the standard commodity logic drive 300. A system, computer, processor, smart-phone, or electronic equipment or device may become a standard commodity hardware comprises mainly the memory drive 310 and the logic drive 300. FIGS. 40A-40C are schematically views showing various applications for logic and memory drives in accordance with multiple embodiments of the present application. Referring to FIGS. 40A-40C, the logic drive 300 in the aspect of the disclosure may have big enough or adequate number of inputs/outputs (I/Os) to support multiple I/O ports 305 used for programming all or most applications. The logic drive 300 may have I/Os, provided by the metal bumps 570, to support required I/O ports for programming, for example, to perform all or any combinations of functions of Artificial Intelligence (AI), machine learning, deep learning, big data, Internet Of Things (JOT), industry computing, Virtual Reality (VR), Augmented Reality (AR), car electronics, Graphic Processing (GP), Digital Signal Processing (DSP), Micro Controlling (MC), and/or Central Processing (CP), and etc. The logic drive 300 may be configured for (1) programming or configuring Inputs/Outputs (I/Os) for software or application developers to load application software or program codes stored in the memory drive 310 to program or configure the logic drive 300 through the I/O ports 305 or connectors connecting or coupling to the I/Os of the logic drive 300; and (2) executing the I/Os for the users to perform their instructions through the I/O ports 305 or connectors connecting or coupling to the I/Os of the logic drive 300, for example, generating a Microsoft Word file, or a PowerPoint presentation file, or an Excel file. The I/O ports 305 or connectors connecting or coupling to the corresponding I/Os of the logic drive 300 may comprise one or multiple (2, 3, 4, or more than 4) Universal Serial Bus (USB) ports, one or more IEEE 1394 ports, one or more Ethernet ports, one or more high-definition-multimedia-interface (HDMI) ports, one or more video-graphic-array (VGA) ports, one or more power-supply ports, one or more audio ports or serial ports, for example, RS-232 or COM (communication) ports, wireless transceiver I/Os, and/or Bluetooth transceiver I/Os, and etc. The I/O ports 305 or connector may be placed, located, assembled, or connected onto a substrate, film or board, such as printed circuit board (PCB), silicon substrate with interconnection schemes, metal substrate with interconnection schemes, glass substrate with interconnection schemes, ceramic substrate with interconnection schemes, or the flexible film 126 with interconnection schemes. The logic drive 300 is assembled on the substrate, film or board using its metal pillars or bumps 570, similar to the flip-chip assembly of the chip packaging technology, or the Chip-On-Film (COF) assembly technology used in the LCD driver packaging technology.

FIG. 40A is a schematically view showing an application for logic and memory drives in accordance with an embodiment of the present application. Referring to FIG. 40A, a laptop or desktop computer, mobile or smart phone or artificial-intelligence (AI) robot 330 may include the logic drive 300 that may be programmed for multiple processors including a baseband processor 301, application processor 302 and other processors 303, wherein the application processor 302 may include a central processing unit (CPU), southbridge, northbridge and graphical processing unit (GPU), and the other processors 303 may include a radio frequency (RF) processor, wireless connectivity processor and/or liquid-crystal-display (LCD) control module. The logic drive 300 may further include a function of power management 304 to put each of the processors 301, 302 and 303 into the lowest power demand state available via software. Each of the I/O ports 305 may connect a subset of the metal pillars or bumps 570 of the logic drive 300 to various external devices. For example, these I/O ports 305 may include I/O port 1 for connection to wireless communication components 306, such as global-positioning-system (GPS) component, wireless-local-area-network (WLAN) component, bluetooth components or RF devices, of the computer, phone or robot 330. These I/O ports 305 may include I/O port 2 for connection to various display devices 307, such as LCD display device or organic-light-emitting-diode (OLED) display device, of the computer, phone or robot 330. These I/O ports 305 may include I/O port 3 for connection to a camera 308 of the computer, phone or robot 330. These I/O ports 305 may include I/O port 4 for connection to various audio devices 309, such as microphone or speaker, of the computer, phone or robot 330. These I/O ports 305 or connectors connecting or coupling to the corresponding I/Os of the logic drive may include I/O port 5, such as Serial Advanced Technology Attachment (SATA) ports or Peripheral Components Interconnect express (PCIe) ports, for communication with the memory drive, disk or device 310, such as hard disk drive, flash drive and/or solid-state drive, of the computer, phone or robot 330. These I/O ports 305 may include I/O port 6 for connection to a keyboard 311 of the computer, phone or robot 330. These I/O ports 305 may include I/O port 7 for connection to Ethernet networking 312 of the computer, phone or robot 330.

Alternatively, FIG. 40B is a schematically view showing an application for logic and memory drives in accordance with an embodiment of the present application. The scheme shown in FIG. 40B is similar to that illustrated in FIG. 40A, but the difference therebetween is that the computer, phone or robot 330 is further provided with a power-management chip 313 therein but outside the logic drive 300, wherein the power-management chip 313 is configured to put each of the logic drive 300, wireless communication components 306, display devices 307, camera 308, audio devices 309, memory drive, disk or device 310, keyboard 311 and Ethernet networking 312 into the lowest power demand state available via software.

Alternatively, FIG. 40C is a schematically view showing an application for logic and memory drives in accordance with an embodiment of the present application. Referring to FIG. 40C, a laptop or desktop computer, mobile or smart phone or artificial-intelligence (AI) robot 331 in another embodiment may include a plurality of the logic drive 300 that may be programmed for multiple processors. For example, a first one, i.e., left one, of the logic drives 300 may be programmed for the baseband processor 301; a second one, i.e., right one, of the logic drives 300 may be programmed for the application processor 302 including a central processing unit (CPU), southbridge, northbridge and graphical processing unit (GPU). The first one of the logic drives 300 may further include a function of power management 304 to put the baseband processor 301 into the lowest power demand state available via software. The second one of the logic drives 300 may further include a function of power management 304 to put the application processor 302 into the lowest power demand state available via software. The first and second ones of the logic drives 300 may further include various I/O ports 305 for various connections to various devices. For example, these I/O ports 305 may include I/O port 1 set on the first one of the logic drives 300 for connection to wireless communication components 306, such as global-positioning-system (GPS) component, wireless-local-area-network (WLAN) component, bluetooth components or RF devices, of the computer, phone or robot 330. These I/O ports 305 may include I/O port 2 set on the second one of the logic drives 300 for connection to various display devices 307, such as LCD display device or organic-light-emitting-diode (OLED) display device, of the computer, phone or robot 330. These I/O ports 305 may include I/O port 3 set on the second one of the logic drives 300 for connection to a camera 308 of the computer, phone or robot 330. These I/O ports 305 may include I/O port 4 set on the second one of the logic drives 300 for connection to various audio devices 309, such as microphone or speaker, of the computer, phone or robot 330. These I/O ports 305 may include I/O port 5 set on the second one of the logic drives 300 for connection to a memory drive, disk or device 310, such as hard disk or solid-state disk or drive (SSD), of the computer, phone or robot 330. These I/O ports 305 may include I/O port 6 set on the second one of the logic drives 300 for connection to a keyboard 311 of the computer, phone or robot 330. These I/O ports 305 may include I/O port 7 set on the second one of the logic drives 300 for connection to Ethernet networking 312 of the computer, phone or robot 330. Each of the first and second ones of the logic drives 300 may have dedicated I/O ports 314 for data transmission between the first and second ones of the logic drives 300. The computer, phone or robot 330 is further provided with a power-management chip 313 therein but outside the first and second ones of the logic drives 300, wherein the power-management chip 313 is configured to put each of the first and second ones of the logic drives 300, wireless communication components 306, display devices 307, camera 308, audio devices 309, memory drive, disk or device 310, keyboard 311 and Ethernet networking 312 into the lowest power demand state available via software.

Memory Drive

Figure 41A:
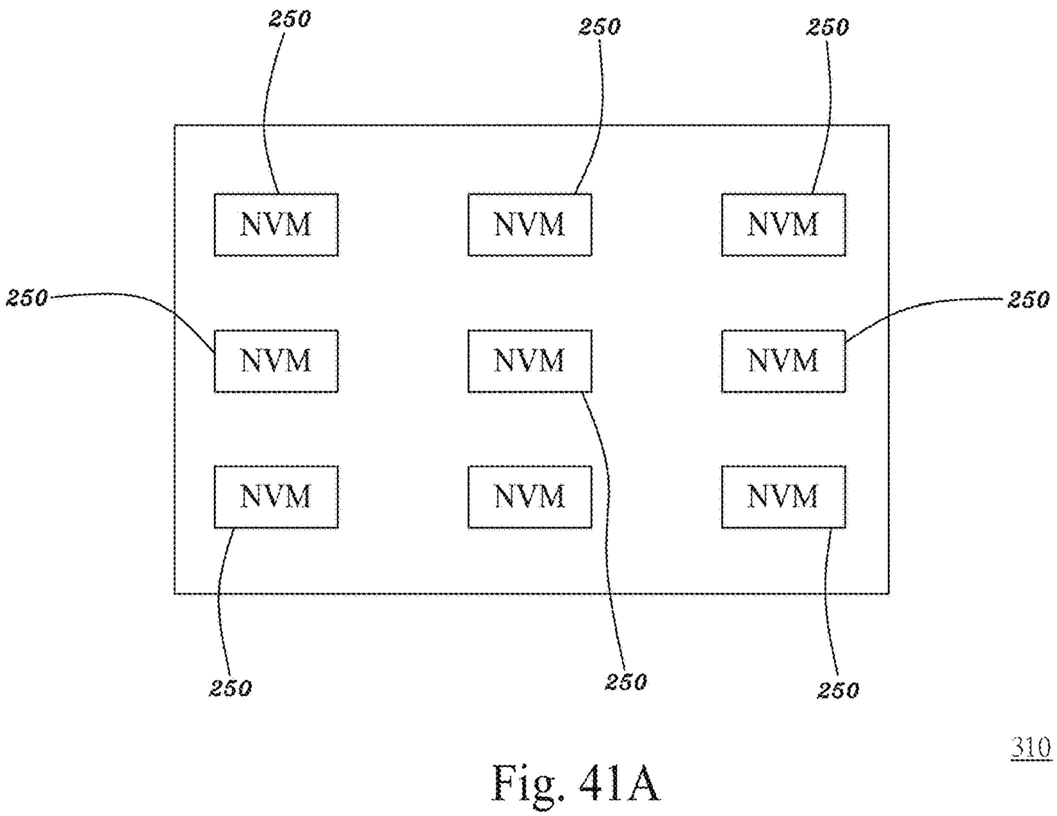
FIGS. 41A-41F are schematically top views showing various standard commodity memory drives in accordance with an embodiment of the present application.

The disclosure also relates to a standard commodity memory drive, package, package drive, device, module, disk, disk drive, solid-state disk, or solid-state drive 310 (to be abbreviated as "drive" below, that is when "drive" is mentioned below, it means and reads as "drive, package, package drive, device, module, disk, disk drive, solid-state disk, or solid-state drive"), in a multi-chip package comprising plural standard commodity non-volatile memory IC chips 250 for use in data storage, as seen in FIG. 41A. FIG. 41A is a schematically top view showing a standard commodity memory drive in accordance with an embodiment of the present application. Referring to FIG. 41A, a first type of memory drive 310 may be a non-volatile memory drive 322, which may be used for the drive-to-drive assembly as seen in FIGS. 39A-39K, packaged with multiple high speed, high bandwidth, wide bitwidth non-volatile memory (NVM) IC chips 250 for the semiconductor chips 100 arranged in an array, wherein the architecture of the memory drive 310 and the process for forming the same may be referred to that of the logic drive 300 and the process for forming the same, but the difference therebetween is the semiconductor chips 100 are arranged as shown in FIG. 41A. Each of the high speed, high bandwidth, wide bitwidth non-volatile memory IC chips 250 may be NAND flash chip in a bare-die format or in a multi-chip flash package format. Data stored in the non-volatile memory IC chips 250 of the standard commodity memory drive 310 are kept even if the memory drive 310 is powered off. Alternatively, the high speed, high bandwidth, wide bitwidth non-volatile memory IC chips 250 may be Non-Volatile Radom-Access-Memory (NVRAM) IC chips in a bare-die format or in a package format. The NVRAM may be a Ferroelectric RAM (FRAM), Magnetoresistive RAM (MRAM), Resistive RAM (RRAM) or Phase-change RAM (PRAM). Each of the NAND flash chips 250 may have a standard memory density, capacity or size of greater than or equal to 64 Mb, 512 Mb, 1 Gb, 4 Gb, 16 Gb, 64 Gb, 128 Gb, 256 Gb, or 512 Gb, wherein "b" is bits. Each of the NAND flash chips 250 may be designed and fabricated using advanced NAND flash technology nodes or generations, for example, more advanced than or equal to 40 nm, 28 nm, 20 nm, 16 nm, and/or 10 nm, wherein the advanced NAND flash technology may comprise Single Level Cells (SLC) or multiple level cells (MLC) (for example, Double Level Cells DLC, or triple Level cells TLC) in a 2D-NAND or a 3D NAND structure. The 3D NAND structures may comprise multiple stacked layers or levels of NAND cells, for example, greater than or equal to 4, 8, 16, 32 stacked layers or levels of NAND cells. Accordingly, the standard commodity memory drive 310 may have a standard non-volatile memory density, capacity or size of greater than or equal to 8 MB, 64 MB, 128 GB, 512 GB, 1 GB, 4 GB, 16 GB, 64 GB, 256 GB, or 512 GB, wherein "B" is bytes, each byte has 8 bits.

Figure 41B:
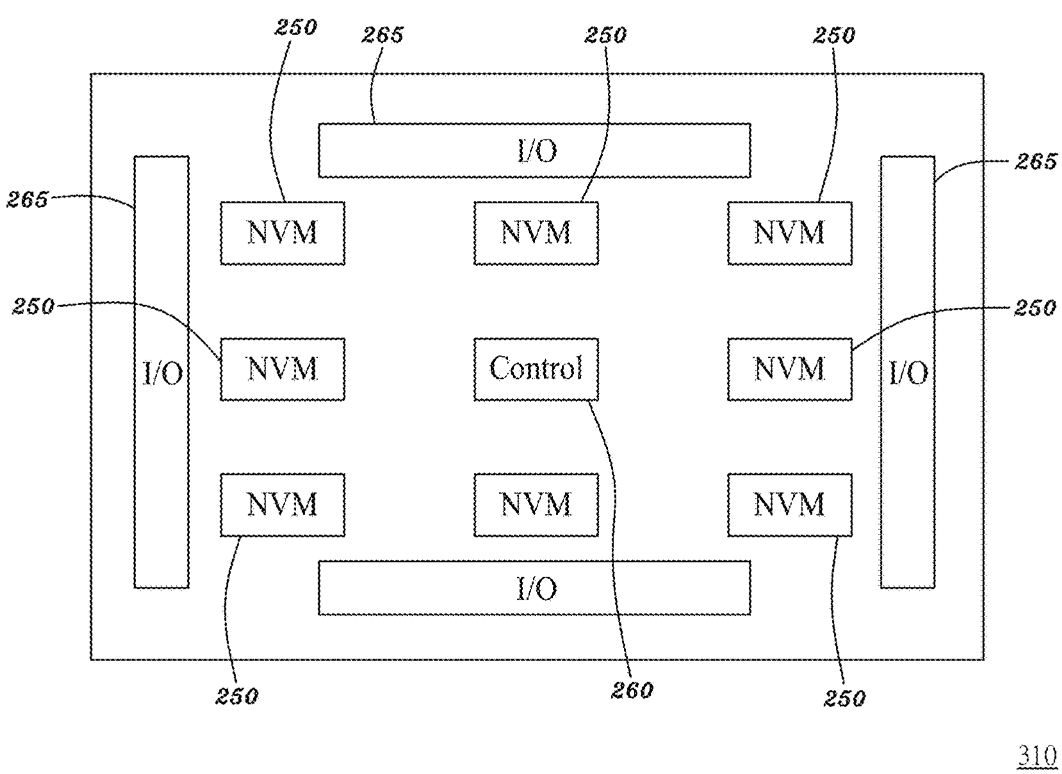

FIG. 41B is a schematically top view showing another standard commodity memory drive in accordance with an embodiment of the present application. Referring to FIG. 41B, a second type of memory drive 310 may be a non-volatile memory drive 322, which may be used for the drive-to-drive assembly as seen in FIGS. 39A-39K, packaged with multiple non-volatile memory IC chips 250 as illustrated in FIG. 41A, multiple dedicated I/O chips 265 and a dedicated control chip 260 for the semiconductor chips 100, wherein the non-volatile memory IC chips 250 and dedicated control chip 260 may be arranged in an array. The architecture of the memory drive 310 and the process for forming the same may be referred to that of the logic drive 300 and the process for forming the same, but the difference therebetween is the semiconductor chips 100 are arranged as shown in FIG. 41B. The dedicated control chip 260 may be surrounded by the non-volatile memory IC chips 250. Each of the dedicated I/O chips 265 may be arranged along a side of the memory drive 310. The specification of the non-volatile memory IC chip 250 may be referred to that as illustrated in FIG. 41A. The specification of the dedicated control chip 260 packaged in the memory drive 310 may be referred to that of the dedicated control chip 260 packaged in the logic drive 300 as illustrated in FIG. 19A. The specification of the dedicated I/O chip 265 packaged in the memory drive 310 may be referred to that of the dedicated I/G chip 265 packaged in the logic drive 300 as illustrated in FIGS. 19A-19N.

Figure 41C:
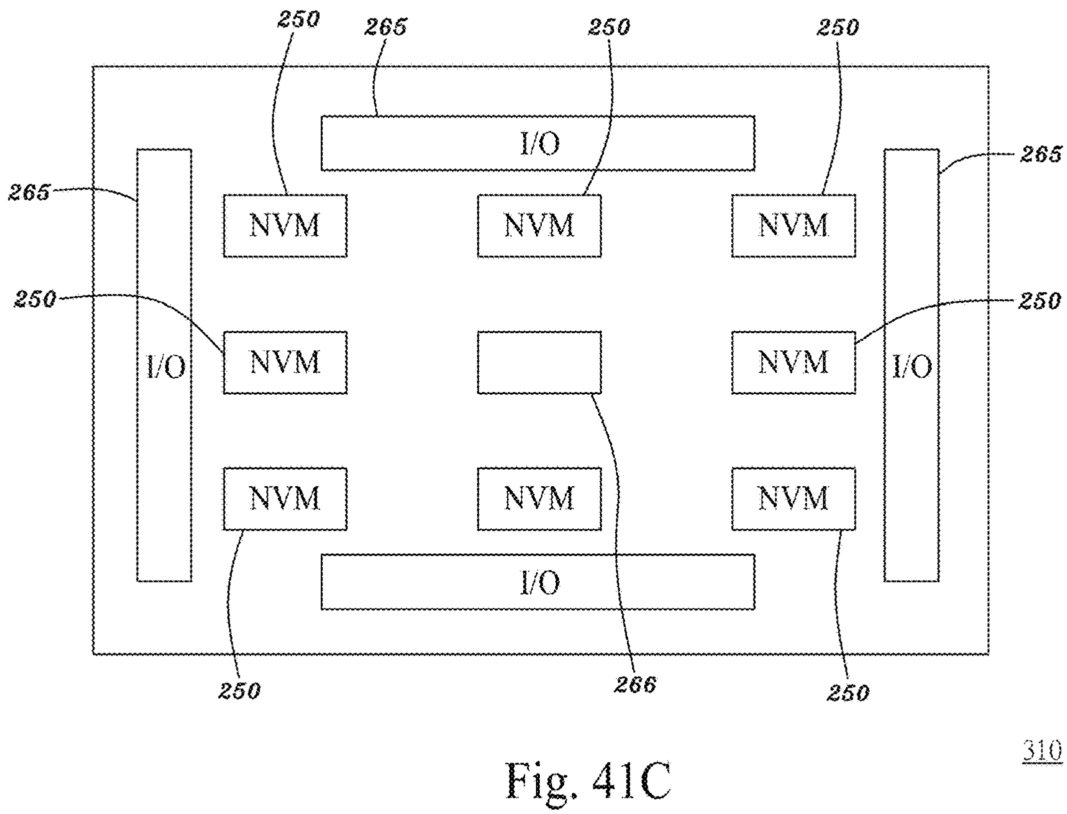

FIG. 41C is a schematically top view showing another standard commodity memory drive in accordance with an embodiment of the present application. Referring to FIG. 41C, the dedicated control chip 260 and dedicated I/O chips 265 have functions that may be combined into a single chip 266, i.e., dedicated control and I/O chip, to perform above-mentioned functions of the control and I/O chips 260 and 265. A third type of memory drive 310 may be a non-volatile memory drive 322, which may be used for the drive-to-drive assembly as seen in FIGS. 39A-39K, packaged with multiple non-volatile memory IC chips 250 as illustrated in FIG. 41A, multiple dedicated I/O chips 265 and a dedicated control and I/O chip 266 for the semiconductor chips 100, wherein the non-volatile memory IC chips 250 and dedicated control and I/O chip 266 may be arranged in an array. The architecture of the memory drive 310 and the process for forming the same may be referred to that of the logic drive 300 and the process for forming the same, but the difference therebetween is the semiconductor chips 100 are arranged as shown in FIG. 41C. The dedicated control and I/O chip 266 may be surrounded by the non-volatile memory IC chips 250. Each of the dedicated I/O chips 265 may be arranged along a side of the memory drive 310. The specification of the non-volatile memory IC chip 250 may be referred to that as illustrated in FIG. 41A. The specification of the dedicated control and I/O chip 266 packaged in the memory drive 310 may be referred to that of the dedicated control and I/O chip 266 packaged in the logic drive 300 as illustrated in FIG. 19B. The specification of the dedicated I/O chip 265 packaged in the memory drive 310 may be referred to that of the dedicated I/O chip 265 packaged in the logic drive 300 as illustrated in FIGS. 19A-19N.

Figure 41D:
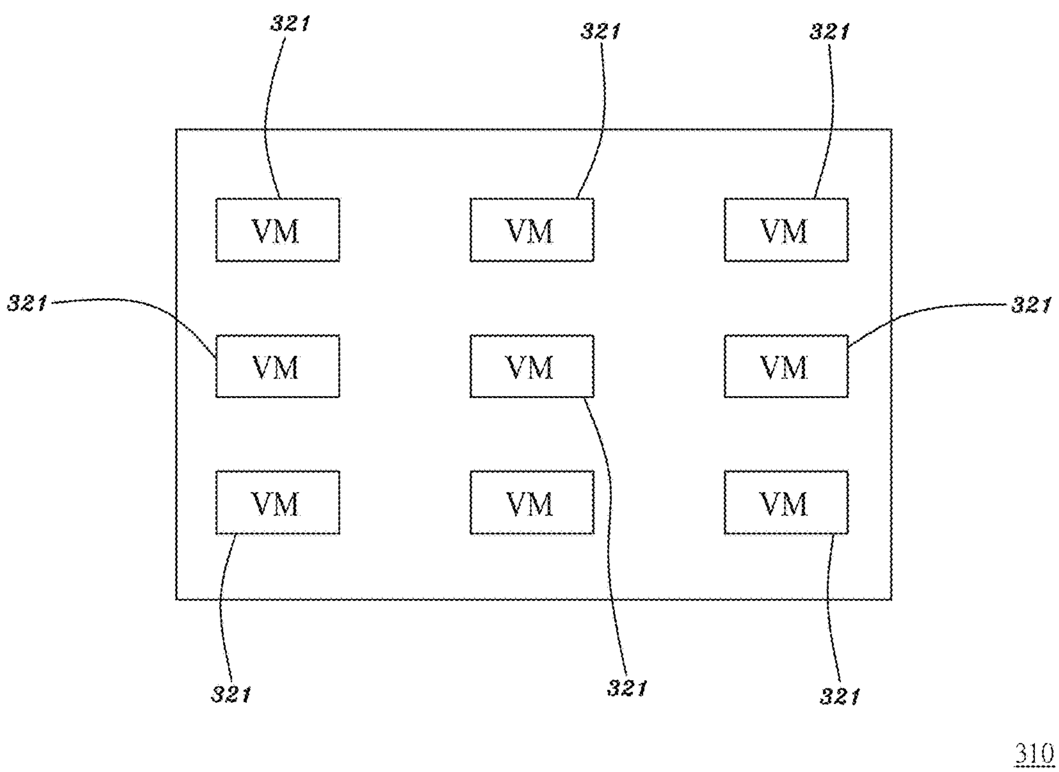

FIG. 41D is a schematically top view showing a standard commodity memory drive in accordance with an embodiment of the present application. Referring to FIG. 41D, a fourth type of memory drive 310 may be a volatile memory drive 323, which may be used for the drive-to-drive assembly as seen in FIGS. 39A-39K, packaged with multiple volatile memory (VM) IC chips 324, such as high speed, high bandwidth, wide bitwidth DRAM IC chips as illustrated for the one 321 packaged in the logic drive 300 as illustrated in FIGS. 19A-19N or high speed, high bandwidth, wide bitwidth cache SRAM chips, for the semiconductor chips 100 arranged in an array, wherein the architecture of the memory drive 310 and the process for forming the same may be referred to that of the logic drive 300 and the process for forming the same, but the difference therebetween is the semiconductor chips 100 are arranged as shown in FIG. 41D. In a case, all of the volatile memory (VM) IC chips 324 of the memory drive 310 may be DRAM IC chips 321. Alternatively, all of the volatile memory (VM) IC chips 324 of the memory drive 310 may be SRAM chips. Alternatively, all of the volatile memory (VM) IC chips 324 of the memory drive 310 may be a combination of DRAM IC chips and SRAM chips.

Figure 41E:
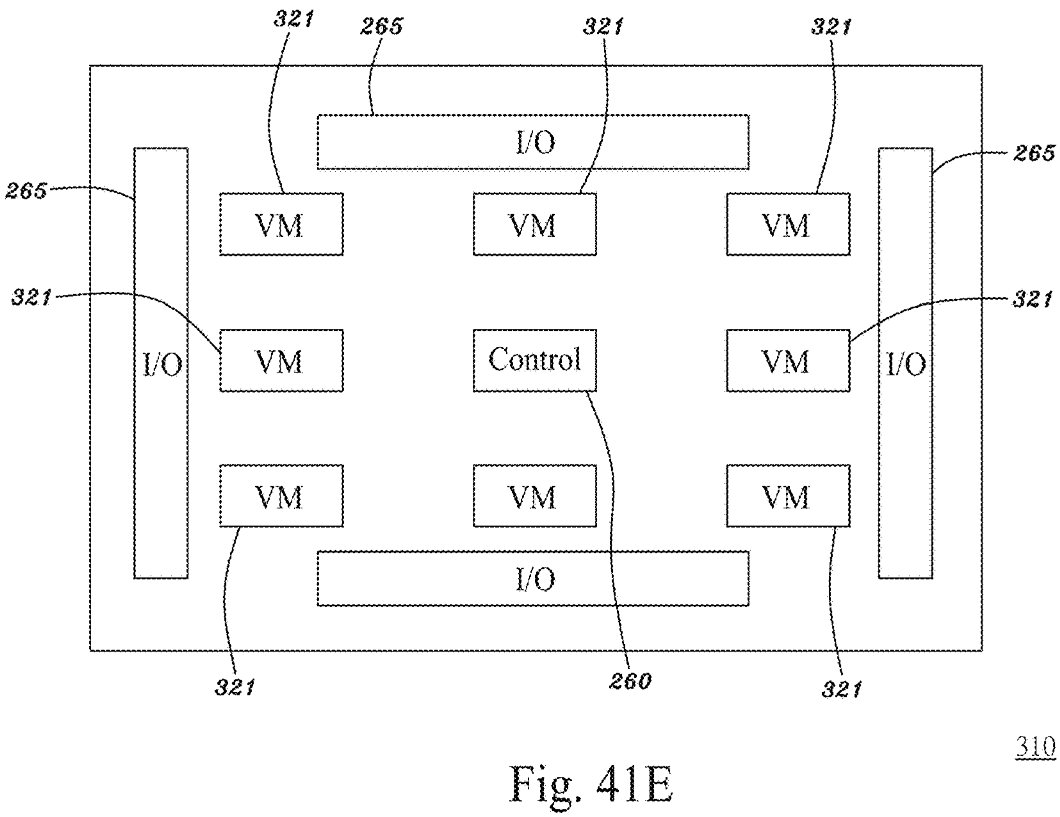

FIG. 41E is a schematically top view showing another standard commodity memory drive in accordance with an embodiment of the present application. Referring to FIG. 41E, a fifth type of memory drive 310 may be a volatile memory drive 323, which may be used for the drive-to-drive assembly as seen in FIGS. 39A-39K, packaged with multiple volatile memory (VM) IC chips 324, such as high speed, high bandwidth, wide bitwidth DRAM IC chips or high speed, high bandwidth, wide bitwidth cache SRAM chips, multiple dedicated I/O chips 265 and a dedicated control chip 260 for the semiconductor chips 100, wherein the volatile memory (VM) IC chips 324 and dedicated control chip 260 may be arranged in an array, wherein the architecture of the memory drive 310 and the process for forming the same may be referred to that of the logic drive 300 and the process for forming the same, but the difference therebetween is the semiconductor chips 100 are arranged as shown in FIG. 41E. In this case, the locations for mounting each of the DRAM IC chips 321 may be changed for mounting a SRAM chip. The dedicated control chip 260 may be surrounded by the volatile memory chips such as DRAM IC chips 321 or SRAM chips. Each of the dedicated I/O chips 265 may be arranged along a side of the memory drive 310. In a case, all of the volatile memory (VM) IC chips 324 of the memory drive 310 may be DRAM IC chips 321. Alternatively, all of the volatile memory (VM) IC chips 324 of the memory drive 310 may be SRAM chips. Alternatively, all of the volatile memory (VM) IC chips 324 of the memory drive 310 may be a combination of DRAM IC chips and SRAM chips. The specification of the dedicated control chip 260 packaged in the memory drive 310 may be referred to that of the dedicated control chip 260 packaged in the logic drive 300 as illustrated in FIG. 19A. The specification of the dedicated I/O chip 265 packaged in the memory drive 310 may be referred to that of the dedicated I/O chip 265 packaged in the logic drive 300 as illustrated in FIGS. 19A-19N.

Figure 41F:
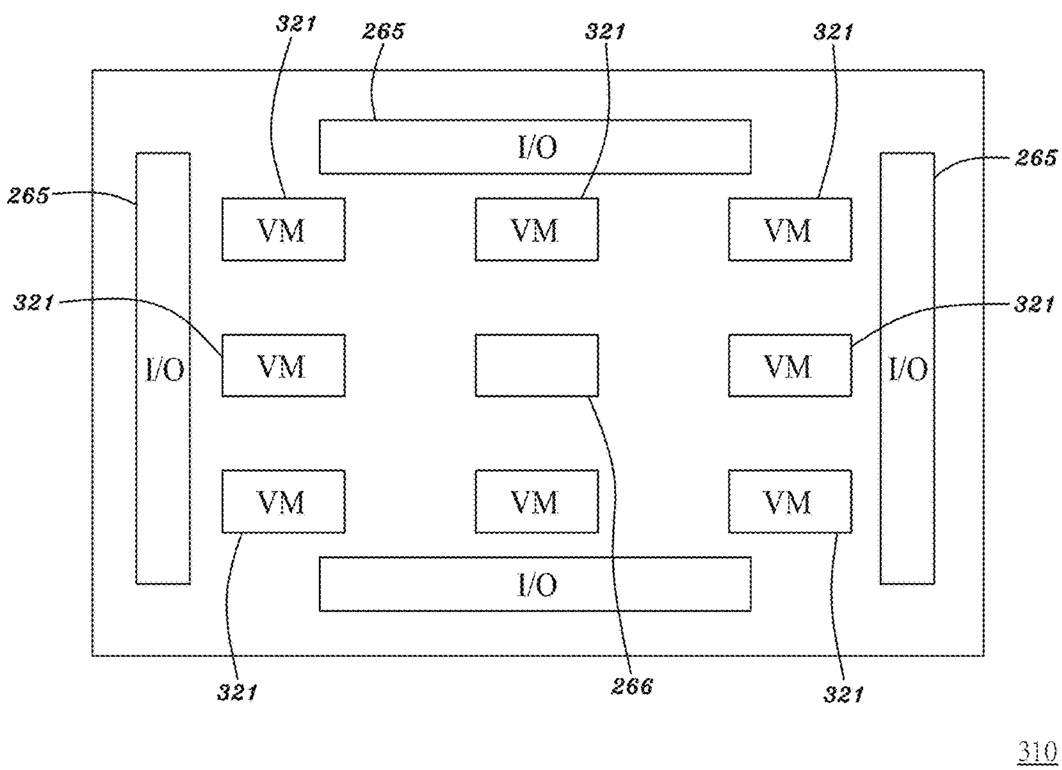

FIG. 41F is a schematically top view showing another standard commodity memory drive in accordance with an embodiment of the present application. Referring to FIG. 41F, the dedicated control chip 260 and dedicated I/O chips 265 have functions that may be combined into a single chip 266, i.e., dedicated control and I/O chip, to perform above-mentioned functions of the control and I/O chips 260 and 265. A sixth type of memory drive 310 may be a volatile memory drive 323, which may be used for the drive-to-drive assembly as seen in FIGS. 39A-39K, packaged with multiple volatile memory (VM) IC chips 324, such as high speed, high bandwidth, wide bitwidth DRAM IC chips as illustrated for the one 321 packaged in the logic drive 300 as illustrated in FIGS. 19A-19N or high speed, high bandwidth, wide bitwidth cache SRAM chips, multiple dedicated I/O chips 265 and the dedicated control and I/O chip 266 for the semiconductor chips 100, wherein the volatile memory (VM) IC chips 324 and dedicated control and I/O chip 266 may be arranged in an array as shown in FIG. 41F. The dedicated control and I/O chip 266 may be surrounded by the volatile memory chips such as DRAM IC chips 321 or SRAM chips. In a case, all of the volatile memory (VM) IC chips 324 of the memory drive 310 may be DRAM IC chips 321. Alternatively, all of the volatile memory (VM) IC chips 324 of the memory drive 310 may be SRAM chips. Alternatively, all of the volatile memory (VM) IC chips 324 of the memory drive 310 may be a combination of DRAM IC chips and SRAM chips. The architecture of the memory drive 310 and the process for forming the same may be referred to that of the logic drive 300 and the process for forming the same, but the difference therebetween is the semiconductor chips 100 are arranged as shown in FIG. 41F. Each of the dedicated I/O chips 265 may be arranged along a side of the memory drive 310. The specification of the dedicated control and I/O chip 266 packaged in the memory drive 310 may be referred to that of the dedicated control and I/O chip 266 packaged in the logic drive 300 as illustrated in FIG. 19B. The specification of the dedicated I/O chip 265 packaged in the memory drive 310 may be referred to that of the dedicated I/O chip 265 packaged in the logic drive 300 as illustrated in FIGS. 19A-19N. The specification of the DRAM IC chips 321 packaged in the memory drive 310 may be referred to that of the DRAM IC chips 321 packaged in the logic drive 300 as illustrated in FIGS. 19A-19N.

Alternatively, another type of memory drive 310 may include a combination of non-volatile memory (NVM) IC chips 250 and volatile memory chips. For example, referring to FIGS. 33A-33C, some of the locations for mounting the NVMIC chips 250 may be changed for mounting the volatile memory chips, such as high speed, high bandwidth, wide bitwidth DRAM IC chips 321 or high speed, high bandwidth, wide bitwidth SRAM chips.

Interposer-to-Interposer Assembly for Logic and Memory Drives

Figure 42A:
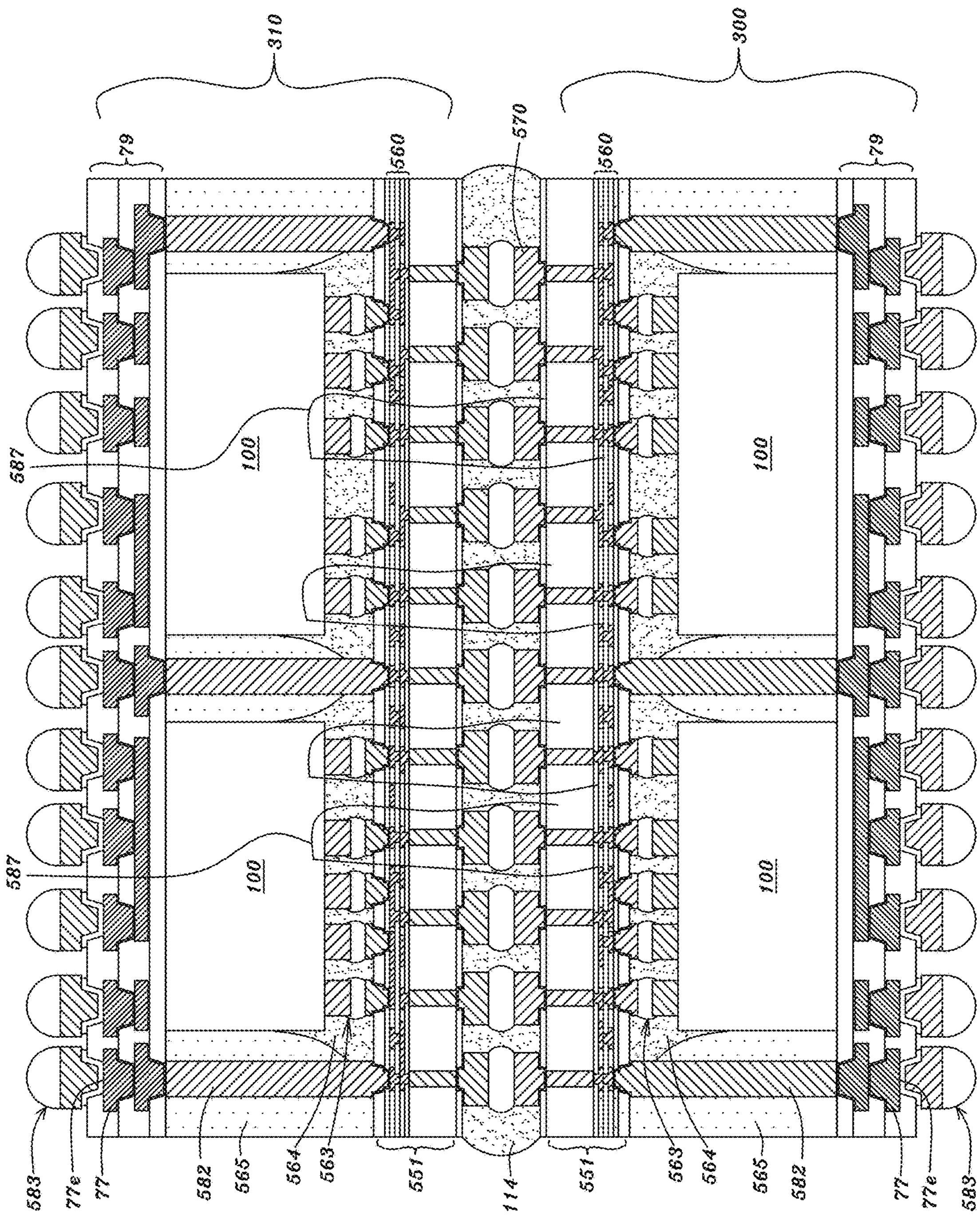
FIGS. 42A-42E are cross-sectional views showing various assemblies for multiple COIP logic and memory drives in accordance with an embodiment of the present application.

Alternatively, FIGS. 42A-42E are cross-sectional views showing various assemblies for COIP logic and memory drives in accordance with an embodiment of the present application. Referring to FIGS. 42A and 35D, the COIP memory drive 310 may have the metal bumps 570 provided with the solder bumps 569 to be bonded respectively to the solder bumps 569 of the metal bumps 570 of the COIP logic drive 300 to form multiple bonded contacts 586 between the COIP memory and logic drives 310 and 300. For example, one of the logic and memory drives 300 and 310 may be provided with the metal pillars or bumps 570 of the fourth type having the solder balls or bumps 569 as illustrated in FIG. 25W, or the metal pillars or bumps 570 as illustrated in 19T, to be bonded to the copper layer 568, as seen in FIG. 25U, of the metal pillars or bumps 570 of the first type of the other of the logic and memory drives 300 and 310 or to an exposed surface of the via 558, as seen in FIG. 26R, of the other of the logic and memory drives 300 and 310 so as to form the bonded contacts 586 between the memory and logic drives 310 and 300.

For high speed, high bandwidth and wide bitwidth communications between one of the semiconductor chips 100, e.g., non-volatile or volatile memory chip 250 or 324 as illustrated in FIGS. 41A-41F, of the COIP memory drive 310 and one of the semiconductor chips 100, e.g., FPGA IC chip 200 or PCIC chip 269 as illustrated in FIGS. 19A-19N, of the COIP logic drive 300, said one of the semiconductor chips 100 of the COIP memory drive 310 may be aligned with and positioned vertically over said one of the semiconductor chips 100 of the COIP logic drive 300.

Referring to FIGS. 42A and 35D, the COIP memory drive 310 may include multiple first stacked portions provided by the vias 558 and interconnection metal layers 6 and/or 27 of its interposer 551, wherein each of the first stacked portions may be aligned with and positioned vertically over one of the bonded contacts 586 and positioned between said one of its semiconductor chips 100 and said one of the bonded contacts 586. Further, for the COIP memory drive 310, multiple of its bonded contacts 563 may be aligned with and stacked on or over its first stacked portions respectively and positioned between said one of its semiconductor chips 100 and its first stacked portions to connect said one of its semiconductor chips 100 to its first stacked portions respectively.

Referring to FIGS. 42A and 35D, the COIP logic drive 300 may include multiple second stacked portions provided by the vias 558 and interconnection metal layers 6 and/or 27 of its interposer 551, wherein each of the second stacked portions may be aligned with and stacked under or below one of the bonded contacts 586 and positioned between said one of its semiconductor chips 100 and said one of the bonded contacts 586. Further, for the COIP logic drive 300, multiple of its bonded contacts 563 may be aligned with and stacked under or below its second stacked portions respectively and positioned between said one of its semiconductor chips 100 and its second stacked portions to connect said one of its semiconductor chips 100 to its second stacked portions respectively.

Figure 42B:
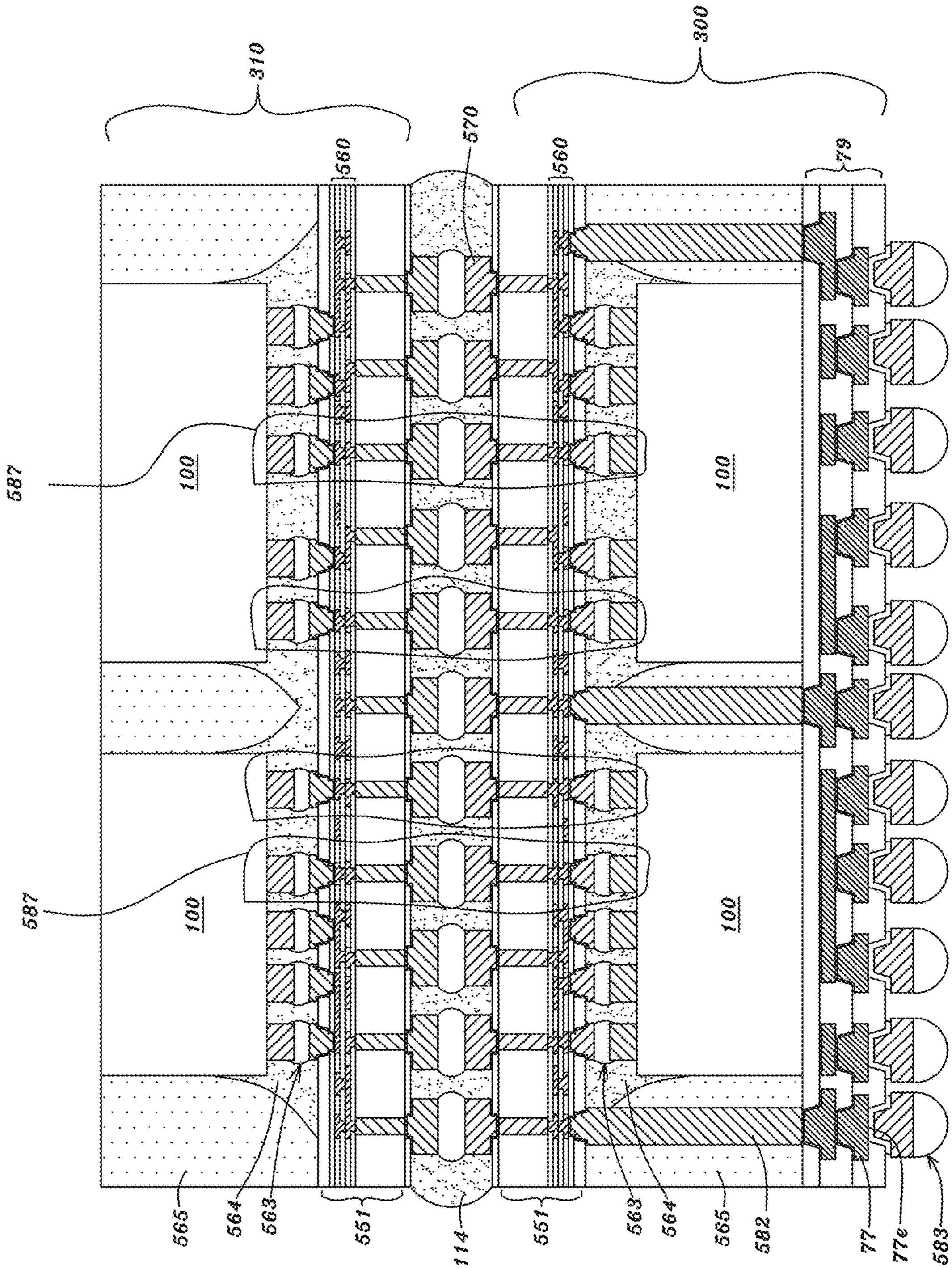
Figure 42C:
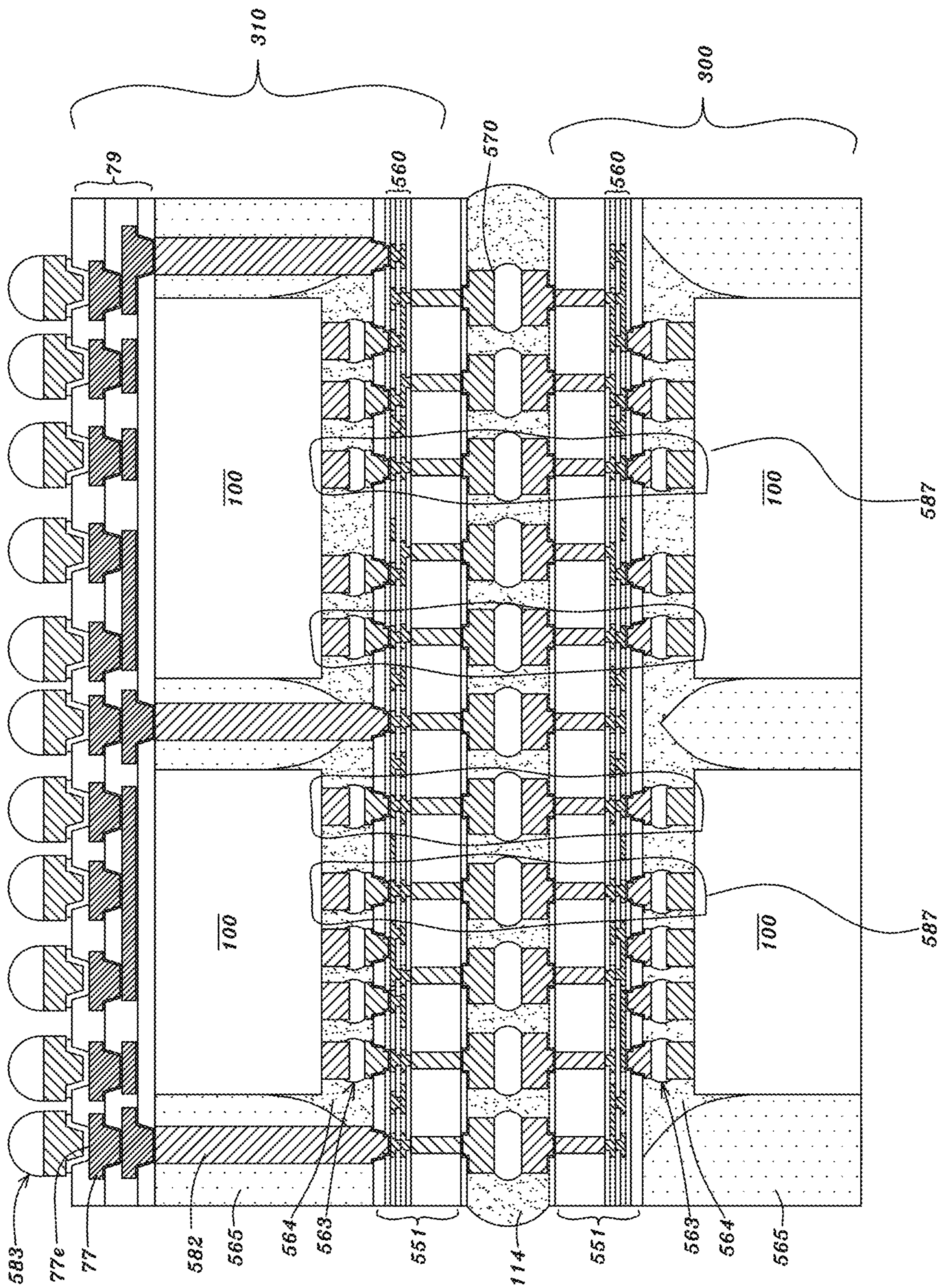
Figure 42D:
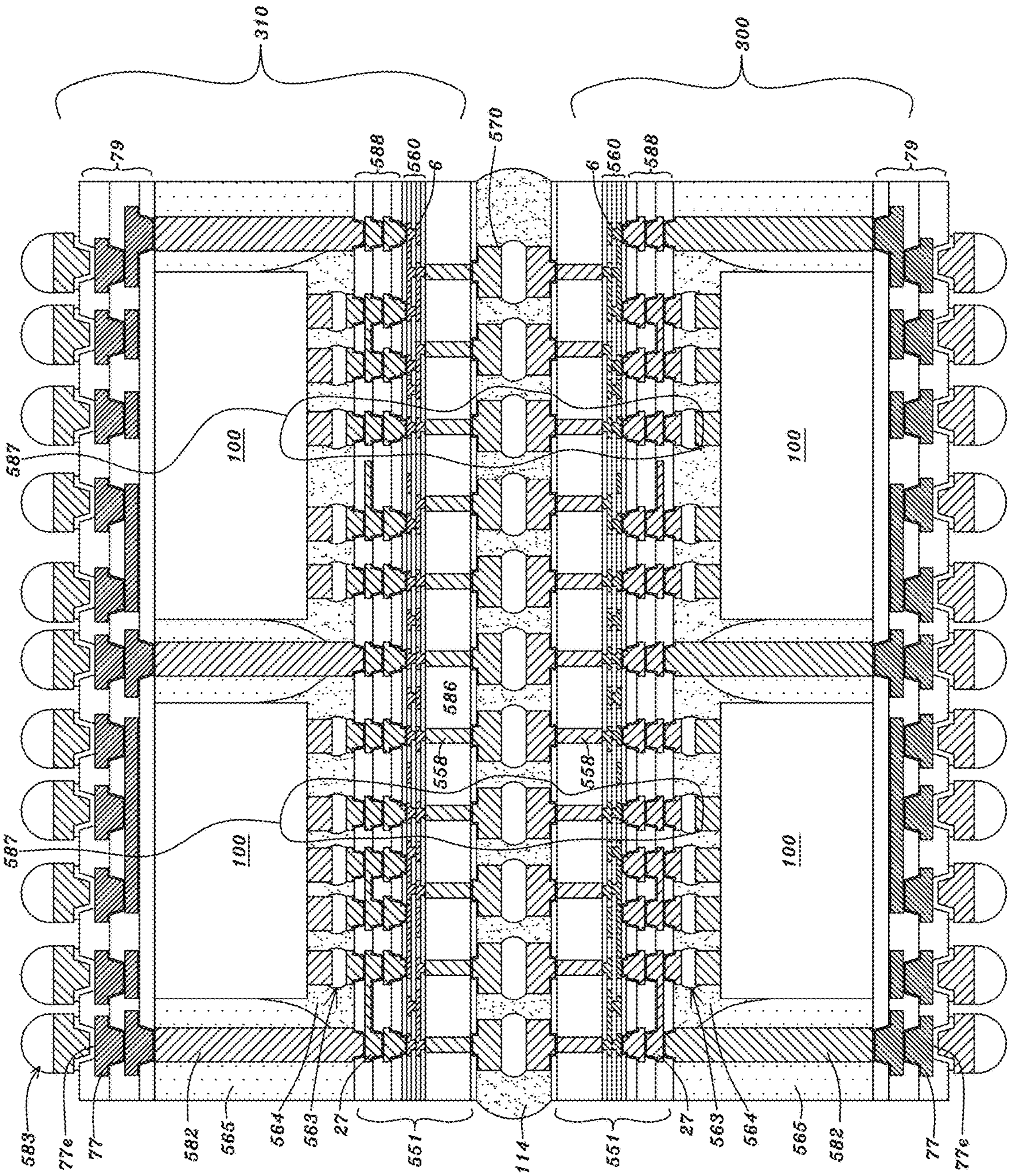

Accordingly, referring to FIGS. 42A and 42D, from bottom to top, one of the bonded contacts 563 of the COIP logic drive 300, one of the second stacked portions of the interposer 551 of the COIP logic drive 300, one of the bonded contacts 586, one of the first stacked portions of the interposer 551 of the COIP memory drive 310 and one of the bonded contacts 563 of the COIP memory drive 310 may be stacked together in a vertical direction to form a vertical stacked path 587 between said one of the semiconductor chips 100 of the COIP logic drive 300 and said one of the semiconductor chips 100 of the COIP memory drive 310 for signal transmission or power or ground delivery. In an aspect, a plurality of the vertical stacked path 587 having the number equal to or greater than 64, 128, 256, 512, 1024, 2048, 4096, 8K, or 16K, for example, may be connected between said one of the semiconductor chips 100 of the COIP logic drive 300 and said one of the semiconductor chips 100 of the COIP memory drive 310 for parallel signal transmission or power or ground delivery.

Referring to FIGS. 42A and 42D, said one of the semiconductor chips 100 of the COIP logic drive 300 may include the small I/O circuits 203 as seen in FIG. 13B having the driving capability, loading, output capacitance or input capacitance between 0.1 pF and 2 pF or 0.1 pF and 1 pF, each of which may couple to one of the vertical stacked paths 587 through one of its I/O pads 372, and said one of the semiconductor chips 100 of the COIP memory drive 310 may include the small I/O circuits 203 as seen in FIG. 13B having the driving capability, loading, output capacitance or input capacitance between 0.1 pF and 2 pF or 0.1 pF and 1 pF, each of which may couple to said one of the vertical stacked paths 587 through one of its I/O pads 372. For example, each of the small I/O circuits 203 may be composed of the small ESD protection circuit 373, small receiver 375, and small driver 374.

Referring to FIGS. 42A and 42D, each of the COIP logic and memory drives 300 and 310 may have the metal bumps 583 formed on the metal pads 77*e* of its BISD 79 for connecting said each of the COIP logic and memory drives 300 and 310 to an external circuitry. For each of the COIP logic and memory drives 300 and 310, one of its metal bumps 583 may (1) couple to one of its semiconductor chips 100 through the interconnection metal layers 77 of its BISD 79, one or more of its TPVs 582, the interconnection metal layers 27 and/or 6 of the SISIP 588 and/or FISIP 560 of its interposer 551 and one or more of its bonded contacts 563 in sequence, (2) couple to one of the semiconductor chips 100 of the other of the COIP logic and memory drives 300 and 310 through the interconnection metal layers 77 of its BISD 79, one or more of its TPVs 582, the interconnection metal layers 27 and/or 6 of the SISIP 588 and FISIP 560 of its interposer 551, one or more of the vias 558 of its interposer 551, one or more of the bonded contacts 586, one or more of the vias 558 of the interposer 551 of the other of the COIP logic and memory drives 300 and 310, the interconnection metal layers 6 and/or 27 of the FISIP 560 and/or SISIP 577 of the interposer 551 of the other of the COIP logic and memory drives 300 and 310, and one or more of the bonded contacts 563 of the other of the COIP logic and memory drives 300 and 310 in sequence, or (3) couple to one of the metal bumps 583 of the other of the COIP logic and memory drives 300 and 310 through the interconnection metal layers 77 of its BISD 79, one or more of its TPVs 582, the interconnection metal layers 27 and/or 6 of the SISIP 588 and FISIP 560 of its interposer 551, one or more of the vias 558 of its interposer 551, one or more of the bonded contacts 586, one or more of the vias 558 of the interposer 551 of the other of the COIP logic and memory drives 300 and 310, the interconnection metal layers 6 and/or 27 of the FISIP 560 and/or SISIP 588 of the interposer 551 of the other of the COIP logic and memory drives 300 and 310, one or more of the TPVs 582 of the other of the COIP logic and memory drives 300 and 310, and the interconnection metal layers 77 of the BISD 79 of the other of the COIP logic and memory drives 300 and 310 in sequence.

Figure 42E:
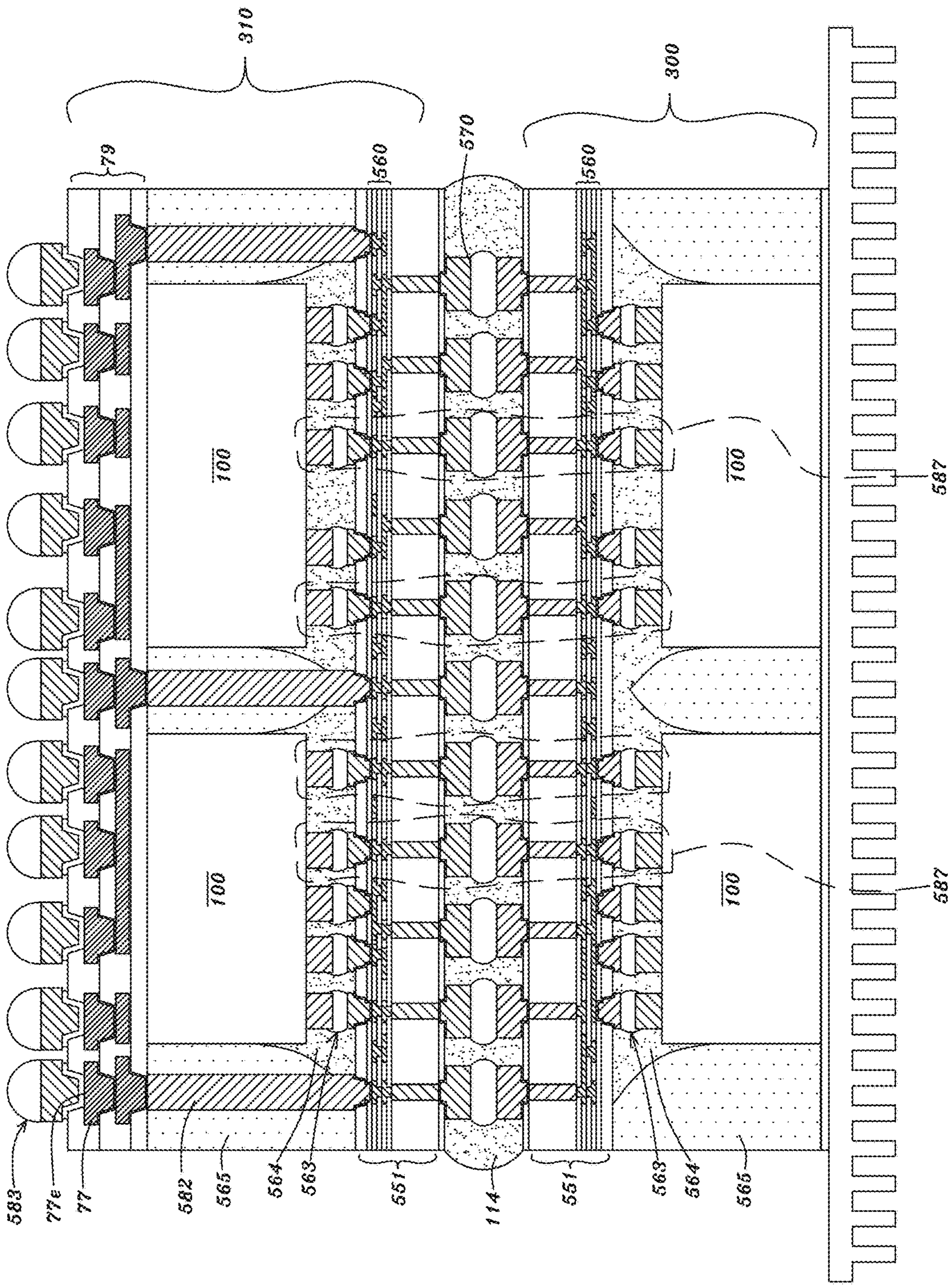

Alternatively, referring to FIGS. 42B, 42C and 42E, their structures are similar to that shown in FIG. 42A. For an element indicated by the same reference number shown in FIGS. 42A-42E, the specification of the element as seen in FIGS. 42B, 42C and 42E may be referred to that of the element as illustrated in FIG. 42A. The difference between the structures shown in FIGS. 42A and 42B is that the COIP memory drive 310 may not be provided with the metal bumps 583, BISD 79 and TPVs 582 for external connection and each of the semiconductor chips 100 of the COIP memory drive 310 may have a backside exposed to the ambient of the COIP memory drive 310. The difference between the structures shown in FIGS. 42A and 42C is that the COIP logic drive 300 may not be provided with the metal bumps 583, BISD 79 and TPVs 582 for external connection and each of the semiconductor chips 100 of the COIP logic drive 300 may have a backside exposed to the ambient of the COIP logic drive 300. The difference between the structures shown in FIGS. 42A and 42E is that the COIP logic drive 300 may not be provided with the metal bumps 583, BISD 79 and TPVs 582 for external connection and each of the semiconductor chips 100 of the COIP logic drive 300 may have a backside joining a heat sink 316 made of copper or aluminum for example.

Referring to FIGS. 42A-42E, for an example of parallel signal transmission, the vertical stacked paths 587 in parallel may be arranged between said one of the semiconductor chip 100, e.g. graphic-procession-unit (GPU) chip as illustrated in FIGS. 19F-19N, of the COIP logic drive 300 and one of the semiconductor chips 100, e.g., high speed, high bandwidth, wide bitwidth cache SRAM chip, DRAM IC chip, or NVMIC chip for MRAM or RRAM as illustrated in FIGS. 41A-41F, of the COIP memory drive 310 with a data bit width of equal to or greater than 64, 128, 256, 512, 1024, 2048, 4096, 8K, or 16K. Alternatively, for an example of parallel signal transmission, the vertical stacked paths 587 in parallel may be arranged between one of the semiconductor chip 100, e.g. tensor-procession-unit (TPU) chip as illustrated in FIGS. 19F-19N, of the COIP logic drive 300 and one of the semiconductor chips 100, e.g., high speed, high bandwidth, wide bitwidth cache SRAM chip, DRAM IC chip, or NVM chip for MRAM or RRAM as illustrated in FIGS. 41A-41F, of the COIP memory drive 310 with a data bit width of equal to or greater than 64, 128, 256, 512, 1024, 2048, 4096, 8K, or 16K.

Figure 42F:
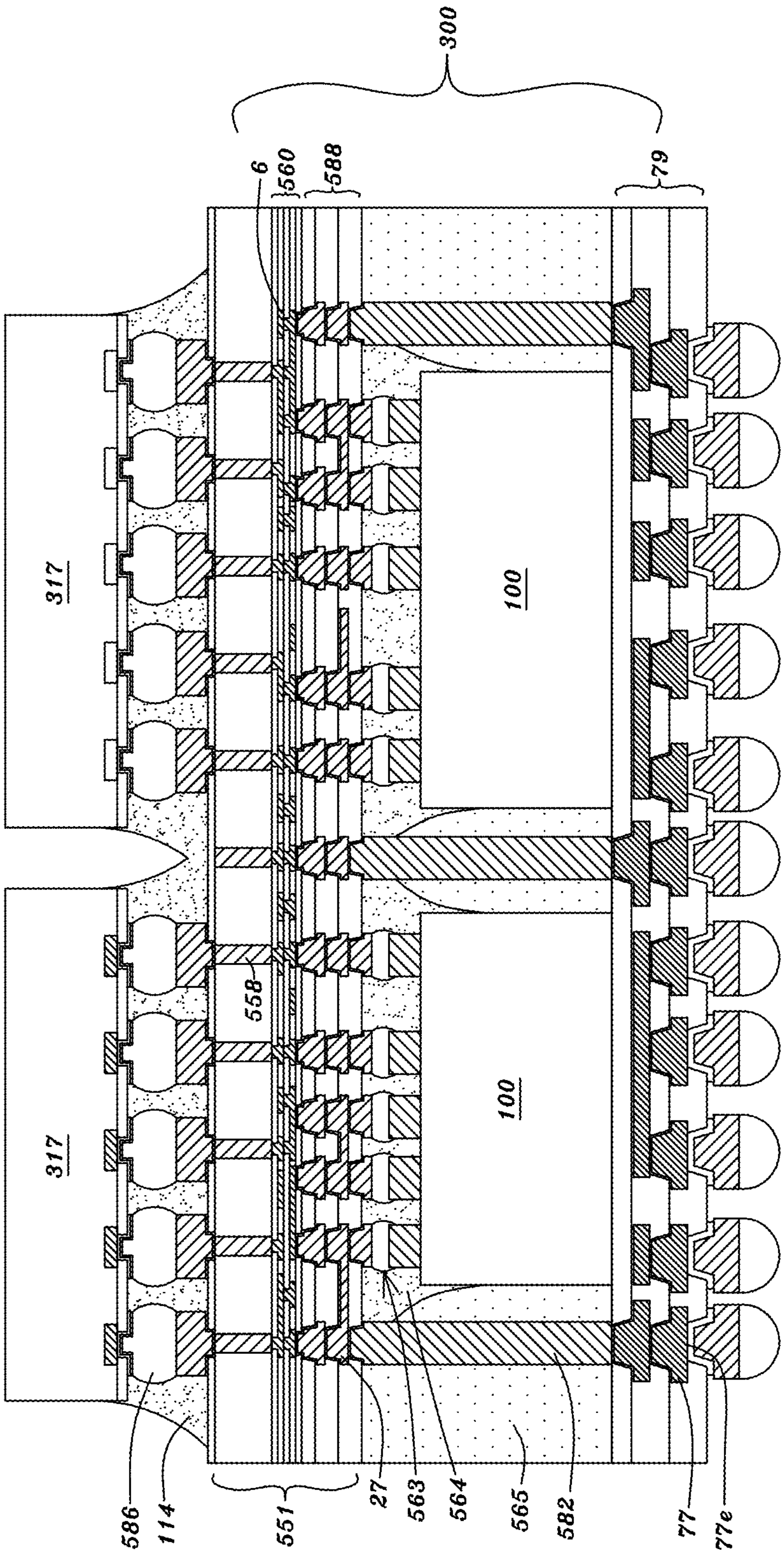
FIGS. 42F and 42G are cross-sectional views showing a COIP logic drive assembled with one or more memory IC chips in accordance with an embodiment of the present application.
Figure 42G:
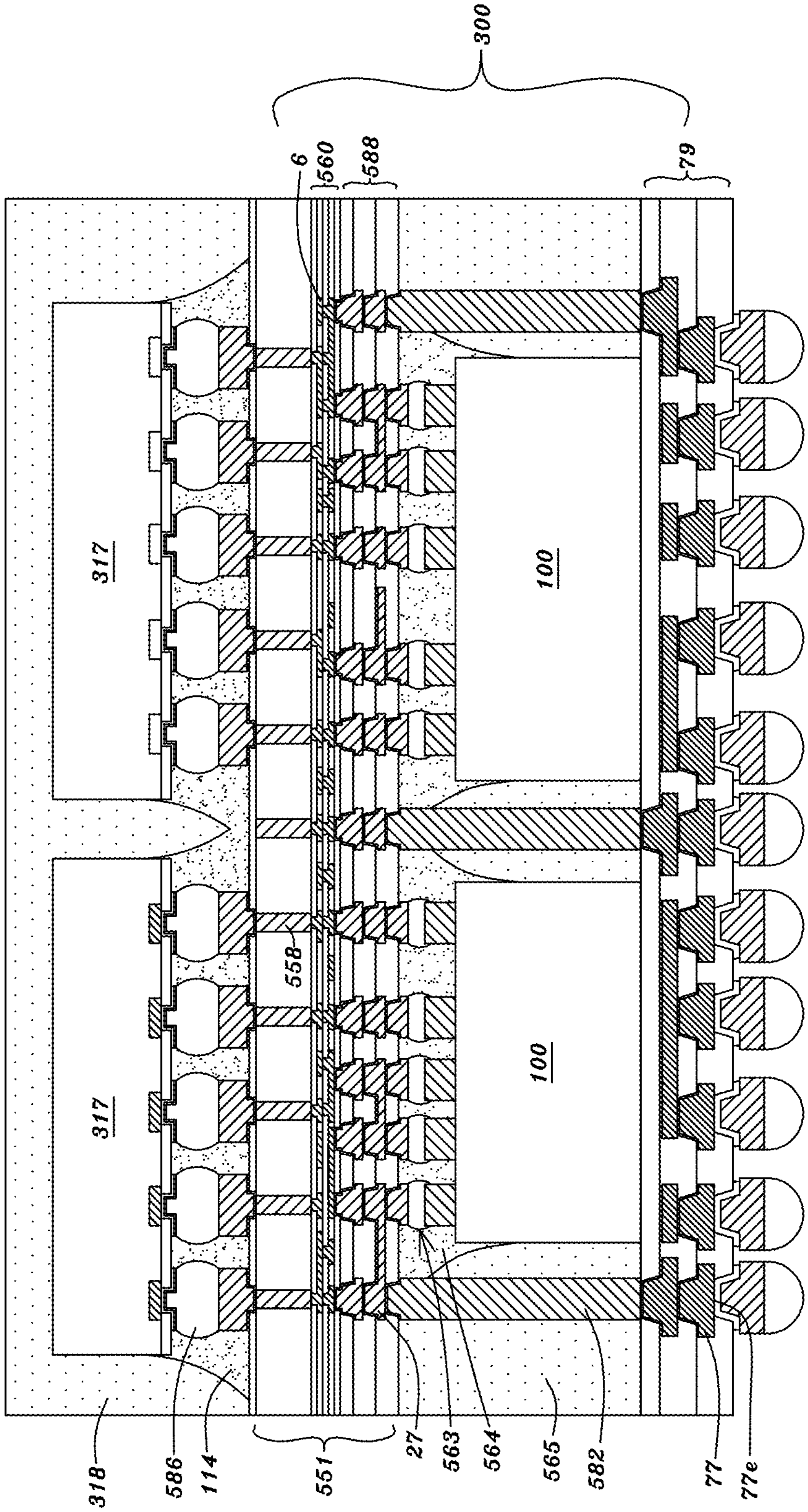

Alternatively, FIGS. 42F and 42G are cross-sectional views showing a COIP logic drive assembled with one or more memory IC chips in accordance with an embodiment of the present application. Referring to FIG. 42F, each of one or more memory IC chips 317, such as high speed, high bandwidth, wide bitwidth cache SRAM chip, DRAM IC chip, or NVM IC chip for MRAM or RRAM, may be provided with multiple electrical contacts, such as tin-containing bumps or pads or copper bumps or pads, on an active surface thereof to be bonded to the solder bumps 569 of the solder bumps 570 of the COIP logic drive 300 to form multiple bonded contacts 586 between the COIP logic drive 300 and said each of the one or more memory IC chips 317. For an example, the COIP logic drive 300 may be provided with the metal pillars or bumps 570 of the fourth type having the solder balls or bumps 569 as illustrated in FIG. 25W, or the metal pillars or bumps 570 as illustrated in 19T, to be bonded to a copper layer of the electrical contacts of each of the memory IC chips 317 so as to form the bonded contacts 586 between the COIP logic drive 300 and said each of the memory IC chips 317. For another example, the COIP logic drive 300 may be provided with the metal pillars or bumps 570 of the first type having the copper layer as illustrated in FIG. 25U to be bonded to a tin-containing layer or bumps of the electrical contacts of each of the memory IC chips 317 so as to form the bonded contacts 586 between the COIP logic drive 300 and said each of the memory IC chips 317. Next, an underfill 114, such as polymer, may be filled into a gap between the COIP logic drive 300 and each of the memory IC chips 317, covering a sidewall of each of the bonded contacts 586.

For high speed, high bandwidth and wide bitwidth communications between one of the memory IC chips 317 and one of the semiconductor chips 100, e.g., FPGA IC chip 200 or PCIC chip 269 as illustrated in FIGS. 19A-19N, of the COIP logic drive 300, said one of the memory IC chips 317 may be aligned with and positioned vertically over said one of the semiconductor chips 100 of the COIP logic drive 300. Said one of the memory IC chips 317 may have a group of the electrical contacts aligned with and positioned vertically over the second stacked portions of the COIP logic drive 300 respectively for data or signal transmission or power/ground delivery between said one of the memory IC chips 317 and said one of the semiconductor chips 100 of the COIP logic drive 300, wherein each of the second stacked portions is positioned between said one of the memory IC chips 317 and said one of the semiconductor chips 100 of the COIP logic drive 300. Each of the memory IC chips 317 may have the group of the electrical contacts each positioned vertically over one of the second stacked portions and connected to said one of the second stacked portions through one of the bonded contacts 586 between said each of the electrical contacts in the group and said one of the second stacked portions. Thus, said each of the electrical contacts in the group, said one of the bonded contacts 586 and said one of the second stacked portions may be stacked together to form a stacked path 587.

In an aspect, referring to FIG. 42F, a plurality of the vertical stacked path 587 having the number equal to or greater than 64, 128, 256, 512, 1024, 2048, 4096, 8K, or 16K, for example, may be connected between said one of the semiconductor chips 100 of the COIP logic drive 300 and said one of the memory IC chips 317 for parallel signal transmission or power or ground delivery. In an aspect, said one of the semiconductor chips 100 of the COIP logic drive 300 may include the small I/O circuits 203 as seen in FIG. 13B having the driving capability, loading, output capacitance or input capacitance between 0.1 pF and 2 pF or 0.1 pF and 1 pF, each of which may couple to one of the vertical stacked paths 587 through one of its I/O pads 372, and said one of the memory IC chips 317 may include the small I/O circuits 203 as seen in FIG. 13B having the driving capability, loading, output capacitance or input capacitance between 0.1 pF and 2 pF or 0.1 pF and 1 pF, each of which may couple to said one of the vertical stacked paths 587 through one of its I/O pads 372. For example, each of the small I/O circuits 203 may be composed of the small ESD protection circuit 373, small receiver 375, and small driver 374.

Referring to FIG. 42F, the COIP logic drive 300 may have the metal bumps 583 formed on the metal pads 77*e* of its BISD 79 for connecting the COIP logic drive 300 to an external circuitry. For the COIP logic drive 300, one of its metal bumps 583 may (1) couple to one of its semiconductor chips 100 through the interconnection metal layers 77 of its BISD 79, one or more of its TPVs 582, the interconnection metal layers 27 and/or 6 of the SISIP 588 and/or FISIP 560 of its interposer 551 and one or more of its bonded contacts 563 in sequence, or (2) couple to one of the memory IC chips 317 through the interconnection metal layers 77 of its BISD 79, one or more of its TPVs 582, the interconnection metal layers 27 and/or 6 of the SISIP 588 and/or FISIP 560 of its interposer 551 and one or more of the bonded contacts 586 in sequence.

Alternatively, referring to FIG. 42G, its structure is similar to that shown in FIG. 42F. For an element indicated by the same reference number shown in FIGS. 42F and 42G, the specification of the element as seen in FIG. 42G may be referred to that of the element as illustrated in FIG. 42F. The difference between the structures shown in FIGS. 42F and 42G is that a polymer layer 318, such as resin, is formed by molding to cover the memory IC chips 317. Alternatively, the underfill 114 may be skipped and the polymer layer 318 may be further filled into a gap between the logic drive 300 and each of the memory IC chips 317, covering a sidewall of each of the bonded contacts 586.

Referring to FIGS. 42F and 42G, for an example of parallel signal transmission, the vertical stacked paths 587 in parallel may be arranged between said one of the semiconductor chip 100, e.g. GPU chip as illustrated in FIGS. 19F-19N, of the COIP logic drive 300 and one of the memory IC chips 317, e.g., high speed, high bandwidth, wide bitwidth cache SRAM chip, DRAM IC chip, or NVM IC chip for MRAM or RRAM, with a data bit width of equal to or greater than 64, 128, 256, 512, 1024, 2048, 4096, 8K, or 16K. Alternatively, for an example of parallel signal transmission, the vertical stacked paths 587 in parallel may be arranged between one of the semiconductor chip 100, e.g. tensor-procession-unit (TPU) chip as illustrated in FIGS. 19F-19N, of the COIP logic drive 300 and one of the memory IC chips 317, e.g., high speed, high bandwidth, wide bitwidth cache SRAM chip, DRAM IC chip, or NVM IC chip for MRAM or RRAM, with a data bit width of equal to or greater than 64, 128, 256, 512, 1024, 2048, 4096, 8K, or 16K.

Internet or Network Between Data Centers and Users

Figure 43:
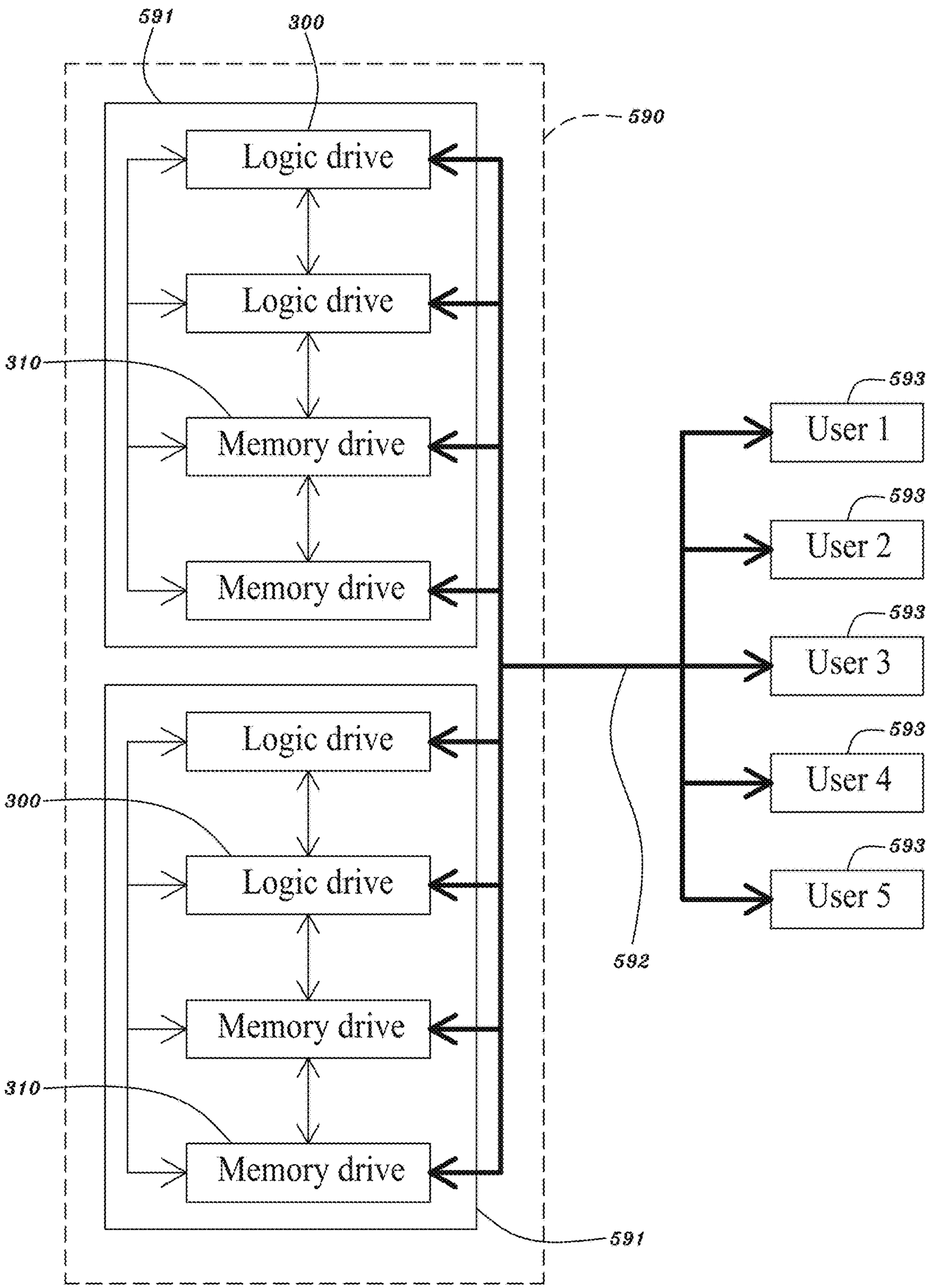
FIG. 43 is a block diagram illustrating networks between multiple data centers and multiple users in accordance with an embodiment of the present application.

FIG. 43 is a block diagram illustrating networks between multiple data centers and multiple users in accordance with an embodiment of the present application. Referring to FIG. 43, in the cloud 590 are multiple data centers 591 connected to each other or one another via the internet or networks 592. In each of the data centers 591 may be a plurality of one of the above-mentioned standard commodity logic drives 300 and/or a plurality of one of the above-mentioned memory drives 310 allowed for one or more of user devices 593, such as computers, smart phones or laptops, to offload and/or accelerate service-oriented functions of all or any combinations of functions of artificial intelligence (AI), machine learning, deep learning, big data, internet of things (IOT), industry computing, virtual reality (VR), augmented reality (AR), car electronics, graphic processing (GP), video streaming, digital signal processing (DSP), micro controlling (MC), and/or central processing (CP) when said one or more of the user devices 593 is connected via the internet or networks to the standard commodity logic drives 300 and/or memory drives 310 in one of the data centers 591 in the cloud 590. In each of the data centers 591, the standard commodity logic drives 300 may couple to each other or one another via local circuits of said each of the data centers 591 and/or the internet or networks 592 and to the memory drives 310 via local circuits of said each of the data centers 591 and/or the internet or networks 592, wherein the memory drives 310 may couple to each other or one another via local circuits of said each of the data centers 591 and/or the internet or networks 592. Accordingly, the standard commodity logic drives 300 and memory drives 310 in the data centers 591 in the cloud 590 may be used as an infrastructure-as-a-service (IaaS) resource for the user devices 593. Similarly to renting virtual memories (VMs) in a cloud, the field programmable gate arrays (FPGAs), which may be considered as virtual logics (VL), may be rented by users. In a case, each of the standard commodity logic drives 300 in one or more of the data centers 591 may include the FPGA IC chips 200 fabricated using a semiconductor IC process more advanced than a technology node of 20 nm. A software program may be written on the user devices 593 in a common programing language, such as Java, C++, C#, Scala, Swift, Matlab, Assembly Language, Pascal, Python, Visual Basic, PL/SQL or JavaScript language. The software program may be uploaded by one of the user devices 590 via the internet or networks 592 to the cloud 590 to program the standard commodity logic drives 300 in the data centers 591 or cloud 590. The programmed logic drives 300 in the cloud 590 may be used by said one or another of the user devices 593 for an application via the internet or networks 592.

CONCLUSION AND ADVANTAGES

Accordingly, the current logic ASIC or COT IC chip business may be changed into a commodity logic IC chip business, like the current commodity DRAM, or commodity flash memory IC chip business, by using the standard commodity logic drive 300. Since the performance, power consumption, and engineering and manufacturing costs of the standard commodity logic drive 300 may be better or equal to that of the ASIC or COT IC chip for a same innovation and/or application, the standard commodity logic drive 300 may be used as an alternative for designing an ASIC or COT IC chip. The current logic ASIC or COT IC chip design, manufacturing and/or product companies (including fabless IC design and product companies, IC foundry or contracted manufactures (may be product-less), and/or vertically-integrated IC design, manufacturing and product companies) may become companies like the current commodity DRAM, or flash memory IC chip design, manufacturing, and/or product companies; or like the current DRAM module design, manufacturing, and/or product companies; or like the current flash memory module, flash USB stick or drive, or flash solid-state drive or disk drive design, manufacturing, and/or product companies. The current logic ASIC or COT IC chip design and/or manufacturing companies (including fabless IC design and product companies, IC foundry or contracted manufactures (may be product-less), vertically-integrated IC design, manufacturing and product companies) may become companies in the following business models: (1) designing, manufacturing, and/or selling the standard commodity FPGA IC chips 200; and/or (2) designing, manufacture, and/or selling the standard commodity logic drives 300. A person, user, customer, or software developer, or application developer may purchase the standard commodity logic drive 300 and write software codes to program them for his/her desired applications, for example, in applications of Artificial Intelligence (AI), machine learning, deep learning, big data, Internet Of Things (IOT), industry computing, Virtual Reality (VR), Augmented Reality (AR), car electronics, Graphic Processing (GP), Digital Signal Processing (DSP), Micro Controlling (MC), and/or Central Processing (CP). The logic drive 300 may be programed to perform functions like a graphic chip, or a baseband chip, or an Ethernet chip, or a wireless (for example, 802.11ac) chip, or an AI chip. The logic drive 300 may be alternatively programmed to perform functions of all or any combinations of functions of Artificial Intelligence (AI), machine learning, deep learning, big data, Internet Of Things (IOT), industry computing, Virtual Reality (VR), Augmented Reality (AR), car electronics, Graphic Processing (GP), Digital Signal Processing (DSP), Micro Controlling (MC), and/or Central Processing (CP).

The disclosure provides a standard commodity logic drive in a multi-chip package comprising plural FPGA IC chips and one or more non-volatile memory IC chips for use in different applications requiring logic, computing and/or processing functions by field programming. Uses of the standard commodity logic drive is analogues to uses of a standard commodity data storage solid-state disk (drive), data storage hard disk (drive), data storage floppy disk, Universal Serial Bus (USB) flash drive, USB drive, USB stick, flash-disk, or USB memory, and differs in that the latter has memory functions for data storage, while the former has logic functions for processing and/or computing.

For another aspect, in accordance with the disclosure, the standard commodity logic drive may be arranged in a hot-pluggable device to be inserted into and couple to a host device in a power-on mode such that the logic drive in the hot-pluggable device may operate with the host device.

For another aspect, the disclosure provides the method to reduce Non-Recurring Engineering (NRE) expenses for implementing an innovation and/or an application in semiconductor IC chips or to accelerate workload processing by using the standard commodity logic drive. A person, user, or developer with an innovation and/or an application concept or idea or an aim for accelerating workload processing needs to purchase the standard commodity logic drive and develops or writes software codes or programs to load into the standard commodity logic drive to implement his/her innovation and/or application concept or idea. Compared to the implementation by developing a logic ASIC or COT IC chip, the NRE cost may be reduced by a factor of larger than 2, 5, or 10. For advanced semiconductor technology nodes or generations (for example more advanced than or below 20 nm), the NRE cost for designing an ASIC or COT chip increases greatly, more than US $5M, US $10M or even exceeding US $20M, US $50M, or US $100M. The cost of a photo mask set for an ASIC or COT chip at the 16 nm technology node or generation may be over US $2M, US$5M, or US $10M. Implementing the same or similar innovation and/or application using the logic drive may reduce the NRE cost down to smaller than US $10M or even less than US $7M, US $5M, US $3M or US $1M. The aspect of the disclosure inspires the innovation and lowers the barrier for implementing the innovation in IC chips designed and fabricated using an advanced IC technology node or generation, for example, a technology node or generation more advanced than or below 20 nm or 10 nm.

For another aspect, the disclosure provides the method to change the current logic ASIC or COT IC chip business into a commodity logic IC chip business, like the current commodity DRAM, or commodity flash memory IC chip business, by using the standardized commodity logic drive. Since the performance, power consumption, and engineering and manufacturing costs of the standardized commodity logic drive may be better or equal to that of the ASIC or COT IC chip for a same innovation and/or application or an aim for accelerating workload processing, the standardized commodity logic drive may be used as an alternative for designing an ASIC or COT IC chip. The current logic ASIC or COT IC chip design, manufacturing and/or product companies (including fabless IC design and product companies, IC foundry or contracted manufactures (may be product-less), and/or vertically-integrated IC design, manufacturing and product companies) may become companies like the current commodity DRAM, or flash memory IC chip design, manufacturing, and/or product companies; or like the current DRAM module design, manufacturing, and/or product companies; or like the current flash memory module, flash USB stick or drive, or flash solid-state drive or disk drive design, manufacturing, and/or product companies. The current logic ASIC or COT IC chip design and/or manufacturing companies (including fabless IC design and product companies, IC foundry or contracted manufactures (may be productless), vertically-integrated IC design, manufacturing and product companies) may become companies in the following business models: (1) designing, manufacturing, and/or selling the standard commodity FPGA IC chips; and/or (2) designing, manufacture, and/or selling the standard commodity logic drives. A person, user, customer, or software developer, or application developer may purchase the standardized commodity logic drive and write software codes to program them for his/her desired applications, for example, in applications of Artificial Intelligence (AI), machine learning, deep learning, big data, Internet Of Things (IOT), industry computing, Virtual Reality (VR), Augmented Reality (AR), car electronics, Graphic Processing (GP), Digital Signal Processing (DSP), Micro Controlling (MC), and/or Central Processing (CP). The logic drive may be programed to perform functions like a graphic chip, or a baseband chip, or an Ethernet chip, or a wireless (for example, 802.11ac) chip, or an AI chip. The logic drive may be alternatively programmed to perform functions of all or any combinations of functions of Artificial Intelligence (AI), machine learning, deep learning, big data, Internet Of Things (IOT), industry computing, Virtual Reality (VR), Augmented Reality (AR), car electronics, Graphic Processing (GP), Digital Signal Processing (DSP), Micro Controlling (MC), and/or Central Processing (CP).

For another aspect, the disclosure provides the method to change the logic ASIC or COT IC chip hardware business into a software business by using the standard commodity logic drive. Since the performance, power consumption, and engineering and manufacturing costs of the standard commodity logic drive may be better or equal to that of the ASIC or COT IC chip for a same innovation and/or application or an aim for accelerating workload processing, the current ASIC or COT IC chip design companies or suppliers may become software developers or suppliers; they may adapt the following business models: (1) become software companies to develop and sell software for their innovation and/or application, and let their customers to install software in the customers' own standard commodity logic drive; and/or (2) still hardware companies by selling hardware without performing ASIC or COT IC chip design and production. They may install their in-house developed software for the innovation and/or application in the non-volatile memory chips in the purchased standard commodity logic drive; and sell the program-installed logic drive to their customers. They may write software codes into the standard commodity logic drive (that is, loading the software codes in the non-volatile memory IC chip or chips in or of the standard commodity logic drive) for their desired applications, for example, in applications of Artificial Intelligence (AI), machine learning, Internet Of Things (IOT), industry computing, Virtual Reality (VR), Augmented Reality (AR), Graphic Processing, Digital Signal Processing, micro controlling, and/or Central Processing. A design, manufacturing, and/or product companies for a system, computer, processor, smart-phone, or electronic equipment or device may become companies to (1) design, manufacture and/or sell the standard commodity hardware comprising the memory drive and the logic drive; in this case, the companies are still hardware companies; (2) develop system and application software for users to install in the users' own standard commodity hardware; in this case, the companies become software companies; (3) install the third party's developed system and application software or programs in the standard commodity hardware and sell the software-loaded hardware; and in this case, the companies are still hardware companies.

For another aspect, the disclosure provides the method to change the current logic ASIC or COT IC chip hardware business into a network business by using the standardized commodity logic drive. Since the performance, power consumption, and engineering and manufacturing costs of the standardized commodity logic drive may be better or equal to that of the ASIC or COT IC chip for a same innovation and/or application or an aim for accelerating workload processing, the standardized commodity logic drive may be used as an alternative for designing an ASIC or COT IC chip. The commodity logic drive comprising standard commodity FPGA chips may be used in a datacenter or cloud in networks for innovation and/or application or an aim for accelerating workload processing. The commodity logic drive attached to the networks may serve to offload and accelerate service-oriented functions of all or any combinations of functions of Artificial Intelligence (AI), machine learning, deep learning, big data, Internet Of Things (IOT), industry computing, Virtual Reality (VR), Augmented Reality (AR), car electronics, Graphic Processing (GP), Video Streaming, Digital Signal Processing (DSP), Micro Controlling (MC), and/or Central Processing (CP). The commodity logic drive used in the data center or cloud in the networks offers FPGAs as an IaaS resource to cloud users. Using the commodity logic drive in the data center or cloud, users can rent FPGAs, similarly to renting Virtual Memories (VMs) in the cloud. The commodity logic drive used in the data center or cloud is the Virtual Logics (VLs) just like Virtual Memories (VMs).

For another aspect, the disclosure provides a development kit or tool for a user or developer to implement an innovation and/or an application using the standard commodity logic drive. The user or developer with innovation and/or application concept or idea may purchase the standard commodity logic drive and use the corresponding development kit or tool to develop or to write software codes or programs to load into the non-volatile memory of the standard commodity logic drive for implementing his/her innovation and/or application concept or idea.

For another aspect, the disclosure provides a "public innovation platform" for innovators to easily and cheaply implement or realize their innovation (algorithms, architectures and/or applications) in semiconductor IC chips using advanced IC technology nodes more advanced than 20 nm, and for example using a technology node of 16 nm, 10 nm, 7 nm, 5 nm or 3 nm. In early days, 1990's, innovators could implement their innovation (algorithms, architectures and/or applications) by designing IC chips and fabricate the IC chips in a semiconductor foundry fab using technology nodes at 1 μm, 0.8 μm, 0.5 μm, 0.35 μm, 0.18 μm or 0.13 μm, at a cost of about several hundred thousands of US dollars. The IC foundry fab was then the "public innovation platform". However, when IC technology nodes migrate to a technology node more advanced than 20 nm, and for example to the technology node of 16 nm, 10 nm, 7 nm, 5 nm or 3 nm, only a few giant system or IC design companies, not the public innovators, can afford to use the semiconductor IC foundry fab. It costs about or over 10 million US dollars to develop and implement an IC chip using these advanced technology nodes. The semiconductor IC foundry fab is now not "public innovation platform" anymore, they are "club innovation platform" for club innovators. The concept of the disclosed logic drives, comprising standard commodity FPGA IC chips, provides public innovators "public innovation platform" back to semiconductor IC industry again; just as in 1990's. The innovators can implement or realize their innovation (algorithms, architectures and/or applications) by using logic drives and writing software programs in common programing languages, for example, C, Java, C++, C#, Scala, Swift, Matlab, Assembly Language, Pascal, Python, Visual Basic, PL/SQL or JavaScript languages, at cost of less than 500K or 300K US dollars. The innovators can use their own commodity logic drives or they can rent logic drives in data centers or clouds through networks.

The components, steps, features, benefits and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, benefits and advantages. These also include embodiments in which the components and/or steps are arranged and/or ordered differently.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain. Furthermore, unless stated otherwise, the numerical ranges provided are intended to be inclusive of the stated lower and upper values. Moreover, unless stated otherwise, all material selections and numerical values are representative of preferred embodiments and other ranges and/or materials may be used.

The scope of protection is limited solely by the claims, and such scope is intended and should be interpreted to be as broad as is consistent with the ordinary meaning of the language that is used in the claims when interpreted in light of this specification and the prosecution history that follows, and to encompass all structural and functional equivalents thereof.

What is claimed is:

1. A semiconductor integrated-circuit (IC) chip comprising:

a data-latched circuit comprising a first node for latching a piece of first data therein and a second node for latching therein a piece of second data opposite to the piece of first data, a first transistor having a gate terminal coupling to the first node, a second transistor having a gate terminal coupling to the first node, a third transistor having a drain terminal coupling to the first node and a gate terminal coupling to the second node, and a fourth transistor having a drain terminal coupling to the first node and a gate terminal coupling to the second node; and a memory cell array comprising a plurality of non-volatile memory cells, wherein the plurality of non-volatile memory cells comprise a non-volatile memory cell having an output terminal for a piece of first output data, wherein the piece of second data is associated with the piece of first output data, wherein the memory cell array comprises a first magnetoresistive-random-access-memory (MRAM) cell and a second magnetoresistive-random-access-memory (MRAM) cell coupling to the first magnetoresistive-random-access-memory (MRAM) cell, wherein the first magnetoresistive-random-access-memory (MRAM) cell comprises a first magnetic layer, a second magnetic layer and an oxide layer between the first and second magnetic layers.

2. The semiconductor integrated-circuit (IC) chip of claim 1, wherein each of the first and third transistors is a P-type metal-oxide-semiconductor (MOS) transistor and each of the second and fourth transistors is a N-type metal-oxide-semiconductor (MOS) transistor.

3. The semiconductor integrated-circuit (IC) chip of claim 1 further comprising a fifth transistor and a sixth transistor each configured for programming the non-volatile memory cell, wherein the fifth transistor has a channel coupling to the non-volatile memory cell and a drain terminal of the first transistor, and the sixth transistor has a channel coupling to the non-volatile memory cell and a drain terminal of the second transistor.

4. The semiconductor integrated-circuit (IC) chip of claim 3, wherein the fifth transistor is turned on for coupling the non-volatile memory cell to a programming voltage through the channel of the fifth transistor for programming the non-volatile memory cell, and the sixth transistor is turned on for coupling the non-volatile memory cell to a voltage of ground reference through the channel of the sixth transistor for programming the non-volatile memory cell.

5. The semiconductor integrated-circuit (IC) chip of claim 4, wherein the fifth transistor is a P-type metal-oxide-semiconductor (MOS) transistor, and the sixth transistor is a N-type metal-oxide-semiconductor (MOS) transistor.

6. The semiconductor integrated-circuit (IC) chip of claim 1 further comprising a fifth transistor and a sixth transistor, wherein the fifth transistor has a source terminal coupling to a source terminal of the first transistor and a source terminal of the third transistor and a drain terminal coupling to the non-volatile memory cell and a drain terminal of the first transistor, and the sixth transistor has a source terminal coupling to a source terminal of the second transistor and a source terminal of the fourth transistor and a drain terminal coupling to the non-volatile memory cell and a drain terminal of the second transistor, wherein the fifth and sixth transistors are turned on for initializing the data-latched circuit.

7. The semiconductor integrated-circuit (IC) chip of claim 6, wherein the fifth transistor is a P-type metal-oxide-semiconductor (MOS) transistor and the sixth transistor is a N-type metal-oxide-semiconductor (MOS) transistor.

8. The semiconductor integrated-circuit (IC) chip of claim 1, wherein the first transistor has a source terminal coupling to a source terminal of the third transistor and the second transistor has a source terminal coupling to a source terminal of the fourth transistor.

9. The semiconductor integrated-circuit (IC) chip of claim 1, wherein the oxide layer comprises magnesium oxide.

10. The semiconductor integrated-circuit (IC) chip of claim 1, wherein the first magnetic layer comprises cobalt (Co), iron (Fe) and boron (B).

11. The semiconductor integrated-circuit (IC) chip of claim 1, wherein the first magnetoresistive-random-access-memory (MRAM) cell further comprises an antiferromagnetic layer in contact with the first magnetic layer, wherein the first magnetic layer is between the oxide layer and the antiferromagnetic layer.

12. The semiconductor integrated-circuit (IC) chip of claim 11, wherein the antiferromagnetic layer comprises chromium.

13. The semiconductor integrated-circuit (IC) chip of claim 11, wherein the antiferromagnetic layer comprises iron.

14. The semiconductor integrated-circuit (IC) chip of claim 1, wherein the non-volatile memory cell has a first terminal coupling to a drain terminal of the first transistor and a second terminal coupling to a drain terminal of the second transistor and comprises the first magnetoresistive-random-access-memory (MRAM) cell between the first terminal and output terminal of the non-volatile memory cell and the second magnetoresistive-random-access-memory (MRAM) cell between the second terminal and output terminal of the non-volatile memory cell.

15. The semiconductor integrated-circuit (IC) chip of claim 14, wherein the first magnetoresistive-random-access-memory (MRAM) cell is programmed at a first resistance, and the second magnetoresistive-random-access-memory (MRAM) cell is programmed at a second resistance lower than the first resistance.

16. The semiconductor integrated-circuit (IC) chip of claim 14, wherein the first magnetoresistive-random-access-memory (MRAM) cell further comprises a first electrode at an end thereof and a first antiferromagnetic layer in contact with the first magnetic layer and between the first magnetic layer and first electrode, wherein the first antiferromagnetic layer is configured for pinning a magnetization direction of the first magnetic layer, and wherein the second magnetoresistive-random-access-memory (MRAM) cell comprises a third magnetic layer, a second electrode at an end thereof and a second antiferromagnetic layer in contact with the third magnetic layer and between the third magnetic layer and second electrode, wherein the second antiferromagnetic layer is configured for pinning a magnetization direction of the third magnetic layer, wherein the first electrode couples the first magnetoresistive-random-access-memory (MRAM) cell to the output terminal of the non-volatile memory cell and the second electrode couples the second magnetoresistive-random-access-memory (MRAM) cell to the output terminal of the non-volatile memory cell.

17. The semiconductor integrated-circuit (IC) chip of claim 14, wherein the first magnetoresistive-random-access-memory (MRAM) cell further comprises a first electrode at an end thereof and a first antiferromagnetic layer in contact with the first magnetic layer and between the first magnetic layer and first electrode, wherein the first antiferromagnetic layer is configured for pinning a magnetization direction of the first magnetic layer, and wherein the second magnetoresistive-random-access-memory (MRAM) cell comprises a third magnetic layer, a second electrode at an end thereof and a second antiferromagnetic layer in contact with the third magnetic layer and between the third magnetic layer and second electrode, wherein the second antiferromagnetic layer is configured for pinning a magnetization direction of the third magnetic layer, wherein the first electrode couples the first magnetoresistive-random-access-memory (MRAM) cell to a drain terminal of the first transistor and the second electrode couples the second magnetoresistive-random-access-memory (MRAM) cell to a drain terminal of the second transistor.

18. The semiconductor integrated-circuit (IC) chip of claim 1 further comprising a switch having an input node for a piece of input data associated with the piece of first output data at the output terminal of the non-volatile memory cell, a first interconnect coupling to the switch and a second interconnect coupling to the switch, wherein the switch is configured to control, in accordance with the piece of input data, coupling between the first and second interconnects.

19. The semiconductor integrated-circuit (IC) chip of claim 1 further comprising a selection circuit having a plurality of first input points for an input data set thereof and a plurality of second input points for a selecting data set thereof, wherein the selection circuit is configured to select, in accordance with the selecting data set, a piece of input data from the input data set as a piece of second output data thereof at an output point thereof, wherein the selecting data set has a piece of selecting data associated with the piece of first output data at the output terminal of the non-volatile memory cell.

20. The semiconductor integrated-circuit (IC) chip of claim 19, wherein the selection circuit comprises a multiplexer.

21. The semiconductor integrated-circuit (IC) chip of claim 1 further comprising a selection circuit having a plurality of first input points for a selecting data set thereof and a plurality of second input points for an input data set thereof for a look-up table (LUT), wherein the selection circuit is configured to select, in accordance with the selecting data set, a piece of input data from the input data set as a piece of second output data thereof at an output point thereof, wherein the input data set has a piece of input data associated with the piece of first output data at the output terminal of the non-volatile memory cell.

22. The semiconductor integrated-circuit (IC) chip of claim 21, wherein the selection circuit comprises a multiplexer.

23. The semiconductor integrated-circuit (IC) chip of claim 1 is a field-programmable-gate-array (FPGA) integrated-circuit (IC) chip.

24. The semiconductor integrated-circuit (IC) chip of claim 1 further comprising a fifth transistor configured for programming the non-volatile memory cell, wherein the fifth transistor has a channel coupling to the non-volatile memory cell.

25. The semiconductor integrated-circuit (IC) chip of claim 1 further comprising a selection circuit having a plurality of input points for an input data set thereof, wherein the selection circuit is configured to select a piece of input data from the input data set as a piece of second output data thereof at an output point thereof, wherein the input data set has a piece of input data associated with the piece of first output data at the output terminal of the non-volatile memory cell.

26. The semiconductor integrated-circuit (IC) chip of claim 1 further comprising a logic circuit having a plurality of first input points for a logic data set thereof, wherein the logic circuit is configured for a logic operation based on the logic data set, wherein the logic data set has a piece of logic data associated with the piece of first output data at the output terminal of the non-volatile memory cell.

* * * * *